US011877506B2

(12) United States Patent
Hatakeyama et al.

(10) Patent No.: US 11,877,506 B2
(45) Date of Patent: Jan. 16, 2024

(54) POLYCYCLIC AROMATIC COMPOUND

(71) Applicants: KWANSEI GAKUIN EDUCATIONAL FOUNDATION, Nishinomiya (JP); SK Materials JNC Co., Ltd., Hwaseong-si (KR)

(72) Inventors: Takuji Hatakeyama, Sanda (JP); Bungo Kawakami, Sanda (JP); Susumu Oda, Sanda (JP); Yasuyuki Sasada, Ichihara (JP); Yasuhiro Kondo, Ichihara (JP)

(73) Assignees: KWANSEI GAKUIN EDUCATIONAL FOUNDATION, Nishinomiya (JP); SK MATERIALS JNC CO., LTD., Hwaseong-si (KR)

( * ) Notice: Subject to any disclaimer, the term of this patent is extended or adjusted under 35 U.S.C. 154(b) by 87 days.

(21) Appl. No.: 17/429,023

(22) PCT Filed: Feb. 7, 2020

(86) PCT No.: PCT/JP2020/004829

§ 371 (c)(1),
(2) Date: Aug. 6, 2021

(87) PCT Pub. No.: WO2020/162600

PCT Pub. Date: Aug. 13, 2020

(65) Prior Publication Data

US 2022/0037591 A1 Feb. 3, 2022

(30) Foreign Application Priority Data

Feb. 7, 2019 (JP) ................................ 2019-021051
Aug. 21, 2019 (JP) ................................ 2019-151120

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/027* (2013.01); *C08G 61/10* (2013.01); *C08G 61/122* (2013.01);
(Continued)

(58) Field of Classification Search
CPC ............... H10K 85/322; H10K 50/121; H10K 2101/10; H10K 50/11; C07F 5/027;
(Continued)

(56) References Cited

U.S. PATENT DOCUMENTS

2015/0236274 A1 8/2015 Hatakeyama et al.
2019/0058124 A1 2/2019 Hatakeyama et al.
(Continued)

FOREIGN PATENT DOCUMENTS

CN 105431439 A 3/2016
CN 109192874 A 1/2019
(Continued)

OTHER PUBLICATIONS

Office Action and Search Report dated Mar. 24, 2023 issued in the corresponding Chinese patent application No. 202080013183.4 with its English Translation.
(Continued)

*Primary Examiner* — Shane Fang
(74) *Attorney, Agent, or Firm* — BROWDY AND NEIMARK, PLLC

(57) ABSTRACT

A polycyclic aromatic compound represented by Formula (1) is provided by the invention:
(Continued)

(1)

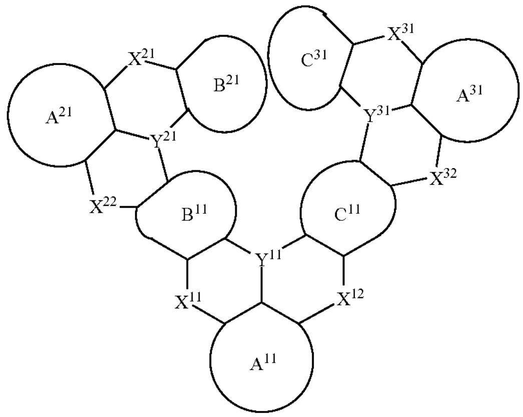

wherein $A^{11}$ ring, $A^{21}$ ring, $A^{31}$ ring, $B^{11}$ ring, $B^{21}$ ring, $C^{11}$ ring, and $C^{31}$ ring are an aryl or heteroaryl ring which may be substituted, $Y^{11}$, $Y^{21}$, $Y^{31}$ are B or the like, $X^{11}$, $X^{12}$, $X^{21}$, $X^{22}$, $X^{31}$, $X^{32}$ are >O or >N—R, R in the above >N—R is an and which may be substituted or the like, R in the above >N—R or the like may be bonded to $A^{11}$ ring, $A^{21}$ ring, $A^{31}$ ring, $B^{11}$ ring, $B^{21}$ ring, $C^{11}$ ring, and/or $C^{31}$ ring by a linking group or a single bond; and at least one hydrogen in the compound represented by Formula (1) may be replaced with deuterium, cyano, or a halogen.

23 Claims, 15 Drawing Sheets

(51) Int. Cl.

| | |
|---|---|
| ***C08G 61/10*** | (2006.01) |
| ***C08G 61/12*** | (2006.01) |
| ***C09K 11/06*** | (2006.01) |
| ***H10K 85/10*** | (2023.01) |
| ***H10K 50/11*** | (2023.01) |
| ***H10K 50/12*** | (2023.01) |
| ***H10K 101/10*** | (2023.01) |

(52) U.S. Cl.
CPC ............ *C09K 11/06* (2013.01); *H10K 85/111* (2023.02); *H10K 85/151* (2023.02); *C08G 2261/124* (2013.01); *C08G 2261/148* (2013.01); *C08G 2261/1412* (2013.01); *C08G 2261/1414* (2013.01); *C08G 2261/18* (2013.01); *C08G 2261/228* (2013.01); *C08G 2261/312* (2013.01); *C08G 2261/3142* (2013.01); *C08G 2261/3162* (2013.01); *C08G 2261/3221* (2013.01); *C08G 2261/95* (2013.01); *C09K 2211/1018* (2013.01); *H10K 50/11* (2023.02); *H10K 50/121* (2023.02); *H10K 2101/10* (2023.02)

(58) Field of Classification Search
CPC .................. C08G 61/10; C08G 61/122; C08G 2261/124; C08G 2261/1412; C08G 2261/1414; C08G 2261/148; C08G 2261/18; C08G 2261/228; C08G 2261/312; C08G 2261/3142; C08G 2261/3162; C08G 2261/3221; C08G 2261/95; C09K 11/06; C09K 2211/1018
See application file for complete search history.

(56) References Cited

U.S. PATENT DOCUMENTS

2019/0256538 A1 8/2019 Hatakeyama et al.
2020/0190115 A1 6/2020 Hatakeyama et al.
2020/0203651 A1 6/2020 Duan et al.

FOREIGN PATENT DOCUMENTS

WO 2015/102118 A1 7/2015
WO 2017/138526 A1 8/2017
WO 2018/047639 A1 3/2018
WO 2018/212169 A1 11/2018

OTHER PUBLICATIONS

Uoyama et al., Highly efficient organic light-emitting diodes from delayed fluorescence, Nature, 492, 234-238, 2012.
Nakanotani et al., High-efficiency organic light-emitting diodes with fluorescent emitters, Nature Communications, 5:4016, Published May 30, 2014, DOI: 10. 1038/ncomms5016 pp. 1-7.
Hatakeyama et al., Ultrapure Blue Thermally Activated Delayed Fluorescence Molecules: Efficient HOMO-LUMO Separation by the Multiple Resonance Effect, Advanced Materials, vol. 28, Issue 14, Apr. 13, 2016, 2777-2781.
International Search Report and Written Opinion issued in PCT/JP2020/004829, dated Apr. 21, 2020.
Japanese International Preliminary Report on Patentability of Chapter issued in PCT/JP2020/004829, with English translation, dated Aug. 10, 2021.
Office Action dated Oct. 31, 2023 issued in the corresponding Japanese patent application No. JP2020-571293.
Chinese Office Action dated Nov. 6, 2023, from Chinese patent application No. 202080013183.4, and machine translation.

POLYCYCLIC AROMATIC COMPOUND

TECHNICAL FIELD

The present invention relates to a novel polycyclic aromatic compound. The present invention also relates to an material for an organic device such as an organic electroluminescent element (organic EL element), which is produced by using the polycyclic aromatic compound, and to a display device and a lighting device equipped with the organic electroluminescent element. The present invention further relates to a composition for forming a light-emitting layer in an organic electroluminescent element.

BACKGROUND ART

Heretofore, a display device using an electroluminescent light-emitting device enables power-saving and thinning, and is variously studied, and further, an organic electroluminescent element (organic EL element) using an organic material can be readily lightened and large-sized and is therefore actively investigated. In particular, for development of an organic material having a light-emitting characteristic of emitting a blue color, one of light's three primary colors, as well as development of an organic material having a charge transport performance for holes and electrons, various studies have heretofore been actively made irrespective of high-molecular compounds and low-molecular compounds.

An organic EL element has a structure that contains a pair of electrodes of an anode and a cathode, and one or multiple layers containing an organic compound arranged between the pair of electrodes. The organic compound-containing layer includes a light-emitting layer, and a charge transport/injection layer that transport or inject charges such as holes or electrons, and various types of organic materials suitable for these layers have been developed.

The light-emitting mechanism of an organic EL element is principally grouped into two, fluorescence emission using light emission from an excited singlet state, and phosphorescence emission using light emission from an excited triplet state. A general fluorescent light-emitting material has a low exciton utilization efficiency, about 25%; and even though using triplet-triplet fusion (TTF) or triplet-triplet annihilation (TTA), the exciton utilization efficiency is only 62.5%. On the other hand, a phosphorescent material may have an exciton utilization efficiency that reaches 100% as the case may be, but can hardly realize deep blue light emission and, in addition, another problem thereof is that the color purity is low since the width of the light emission spectrum thereof is broad.

Thermally activated delayed fluorescence fluorescent (TADF: Thermally Assisting Delayed Fluorescence)) mechanisms are proposed in Non-Patent Document 1. By using TADF compound, the exciton utilization of luminescence reaches 100%. A conventional TADF compound gives a broad emission spectrum having a low color purity owing to the structure thereof, but the speed of reverse intersystem is extremely high.

Furthermore, Non-Patent Document 2 proposes a Hyper Fluorescence™ (TADF Assisting Fluorescence, also referred to as TAF) in which a TADF compound is used as an assisting dopant (Assisting Dopant. AD) and a dopant having a narrow half width is used as an emitting dopant (Emitting Dopant: ED,) and discloses organic EL elements emitting red and green light, which have a high-efficiency, high-color-purity, and long-life. However, deep blue emission has been problematic in efficiency, color purity and lifetime because both the emitting dopant and assisting dopant require high energy.

In Non-Patent Document 3, a new molecular design is proposed which dramatically improves the color purity of a TADF material. In addition, in Patent Document 1, a blue emission spectrum having a high color purity, which has a small Stokes shift of peaks of absorption and emission as a result, has been successfully obtained by a robust planar structure utilizing a multiple resonance effect of boron (electron-donating) and nitrogen (electron-withdrawing), for example, of Compound (1-401). In addition, in a dimeric compound such as Formula (1-422), two borons and two nitrogens are bonded to the central benzene ring, thereby further enhancing the multiple resonance effect in the central benzene ring, and as a result, light emission having an extremely nan-ow emission peak width is enabled.

CITATION LIST

Patent Literature

Patent literature No. 1: WO2015/102118 A

Non-Patent Literature

Non-Patent literature No. 1: Nature 492, 234-238, 2012

Non-Patent literature No. 2: NATURE COMMUNICATIONS, 5:4016, Published 30 May 2014, DOI: 10.1038/ncomms5016

Non-Patent literature No. 3: Advanced Materials, Volume 28, Issue 14, Apr. 13, 2016, 2777-2781

SUMMARY OF INVENTION

Technical Problem

It is an object of the present invention to provide a novel compound as a light-emitting material. It is another object of the present invention to provide an organic device such as an organic EL element having high energy efficiency.

Solution to Problem

As a result of extensive studies to achieve the above objects, the present inventors have found a novel polycyclic aromatic compound in which a plurality of aromatic rings are linked by a boron atom, a nitrogen atom, or the like, and has succeeded in producing the same. Further, it has been found that this compound exhibits high light emission with high color purity with high emission efficiency and has excellent properties as a material of an organic device such as an organic EL element, and further studies have been conducted to complete the present invention. Specifically, the present invention has the following configurations.

<1> A polycyclic aromatic compound represented by Formula (1).

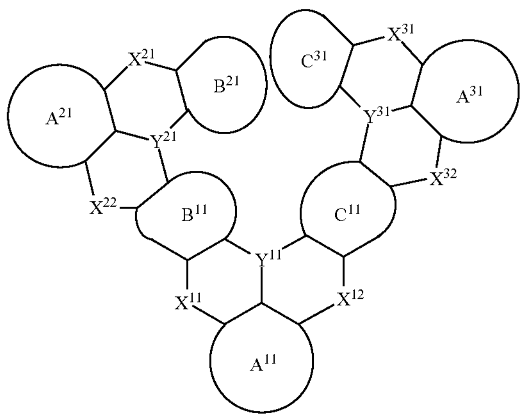

(1)

(In Formula (1), $A^{11}$ ring, $A^{21}$ ring, $A^{31}$ ring, $B^{11}$ ring, $B^{21}$ ring, $C^{11}$ ring, and $C^{31}$ ring are each independently an aryl ring or a heteroaryl ring, and at least one hydrogen in these rings may be replaced, $Y^{11}$, $Y^{21}$, $Y^{31}$ are each independently B, P, P═O, P═S, Al, Ga, As, Si—R, or Ge—R, and R in the above Si—R and Ge—R is an aryl, an alkyl, or a cycloalkyl;

$X^{11}$, $X^{12}$, $X^{21}$, $X^{22}$, $X^{31}$, $X^{32}$ are each independently >O, >N—R, >C(—R)$_2$, >S, or >Se, wherein R in the above >N—R is an aryl which may be substituted, a heteroaryl which may be substituted, an alkyl which may be substituted, or a cycloalkyl which may be substituted, R in the above >C(—R)$_2$ is hydrogen, an aryl which may be substituted, an alkyl which may be substituted, or a cycloalkyl which may be substituted, and R in the above >N—R and/or in the above >C(—R)$_2$ may be bonded to $A^{11}$ ring, $A^{21}$ ring, $A^{31}$ ring, $B^{11}$ ring, $B^{21}$ ring, $C^{11}$ ring, and/or $C^{31}$ ring by a linking group or a single bond; and at least one hydrogen in the compound represented by Formula (1) may be replaced with deuterium, cyano, or a halogen.)

<2> The polycyclic aromatic compound according to <1>, wherein $A^{11}$ ring, $A^{21}$ ring, $A^{31}$ ring, $B^{11}$ ring, $B^{21}$ ring, $C^{11}$ ring, and $C^{31}$ ring are each independently an aryl ring or a heteroaryl ring, and at least one hydrogen in these rings may be replaced with a substituted or unsubstituted aryl, a substituted or unsubstituted heteroaryl, a substituted or unsubstituted diarylamino (the two aryls may be bonded to each other by a single bond or a linking group), a substituted or unsubstituted diheteroarylamino, a substituted or unsubstituted arylheteroarylamino, a substituted or unsubstituted diarylboryl, a substituted or unsubstituted alkyl, a substituted or unsubstituted cycloalkyl, a substituted or unsubstituted alkoxy, a substituted or unsubstituted aryloxy, a substituted silyl, or $SF_5$;

$X^{11}$, $X^{12}$, $X^{21}$, $X^{22}$, $X^{31}$, $X^{32}$ are each independently >O, >N—R, >C(—R)$_2$, >S, or >Se, wherein R in the above >N—R is an aryl which may be substituted by an alkyl or a cycloalkyl, a heteroaryl which may be substituted by an alkyl or a cycloalkyl, an alkyl, or a cycloalkyl, R in the above >C(—R)$_2$ is hydrogen, an alkyl, a cycloalkyl, or an aryl which may be substituted by an alkyl or a cycloalkyl, and R in the above >N—R and/or above >C(—R)$_2$ may be bonded to $A^{11}$ ring, $A^{21}$ ring, $A^{31}$ ring, $B^{11}$ ring, $B^{21}$ ring, $C^{11}$ ring, and/or $C^{31}$ ring by —O—, —S—, —C(—R)$_2$—, —Si(—R)$_2$— or a single bond, and R in the above —C(—R)$_2$— and —Si(—R)$_2$— is hydrogen, an alkyl or a cycloalkyl.

<3> The polycyclic aromatic compound according to <1>, which is represented by Formula (2).

(2)

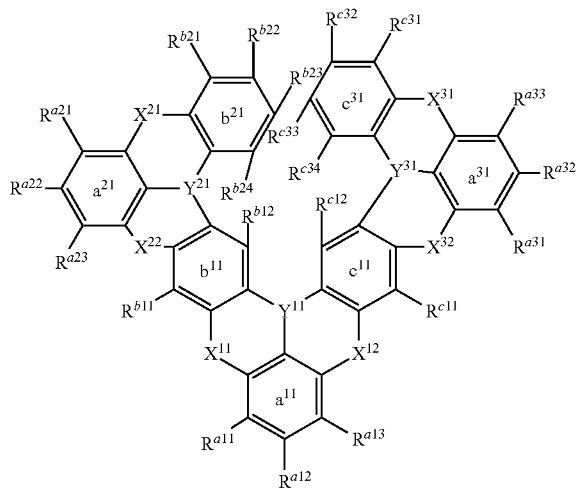

(In Formula (2), $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl, a heteroaryl, a diarylamino (the two aryls may be bonded to each other by a single bond or a linking group), a diheteroarylamino, an arylheteroarylamino, a diarylboryl, an alkyl, a cycloalkyl, an alkoxy, an aryloxy, or a substituted silyl, wherein at least one hydrogen in these may be replaced with an aryl, a heteroaryl, an alkyl, or a cycloalkyl, and any adjacent groups of $R^{a11}$, $R^{a12}$, $R^{a13}$ may be bonded to form an aryl or heteroaryl ring with $a^{11}$ ring, any adjacent groups of $R^{a21}$, $R^{a22}$, $R^{a23}$ may be bonded to form an aryl or heteroaryl ring with $a^{21}$ ring, any adjacent groups of $R^{a31}$, $R^{a32}$, $R^{a33}$ may be bonded to form an aryl or heteroaryl ring with $a^{31}$ ring, any adjacent groups of $R^{b21}$, $R^{b22}$, $R^{b23}$, $R^{b24}$ may be bonded to form an aryl or heteroaryl ring with $b^{21}$ ring, and/or any adjacent groups of $R^{c31}$, $R^{c32}$, $R^{c33}$, $R^{c34}$ may be bonded to form an aryl or heteroaryl ring with $c^{31}$ ring, in any of the aryl rings or heteroaryl rings formed, at least one hydrogen may be replaced with an aryl, a heteroaryl, a diaryl amino (two aryls may be bonded to each other by a single bond or a linking group), a diheteroarylamino, an arylheteroarylamino, a diarylboryl, an alkyl, a cycloalkyl, an alkoxy, an aryloxy or a substituted silyl, and at least one hydrogen in these may be replaced with an aryl, a heteroaryl, an alkyl or a cycloalkyl;

$Y^{11}$, $Y^{21}$, $Y^{31}$ are each independently B, P, P═O, P═S, Al, Ga, As, Si—R, or Ge—R, wherein R in the above Si—R and Ge—R is an aryl having 6 to 12 carbons, an alkyl having 1 to 6 carbons, or a cycloalkyl having 3 to 14 carbons;

$X^{11}$, $X^{12}$, $X^{21}$, $X^{22}$, $X^{31}$, $X^{32}$ are each independently >O, >N—R, >C(—R)$_2$, >S, or >Se, wherein R in the above >N—R is an aryl having 6 to 12 carbons, a heteroaryl having 2 to 15 carbons, an alkyl having 1 to 6 carbons, or a cycloalkyl having 3 to 14 carbons; and the above aryl or heteroaryl may have an alkyl having 1 to 6 carbons or a cycloalkyl having 3 to 14 carbons as a substituent, R in the above >C(—R)$_2$ is hydrogen, an aryl having 6 to 12 carbons, an alkyl having 1 to 6 carbons, or a cycloalkyl having 3 to 14 carbons; and the above aryl may have an alkyl having 1 to 6 carbons or a cycloalkyl having 3 to 14 carbons as a substituent, R in the above >N—R and/or >C(—R)$_2$ may be bonded to a$^{11}$ ring, a$^{21}$ ring, a$^{31}$ ring, b$^{11}$ ring, b$^{21}$ ring, c$^{11}$ ring, and/or c$^{31}$ ring by —O—, —S—, —C(—R)$_2$—, —Si(—R)$_2$—, or a single bond, and the R in the above —C(—R)$_2$— and —Si(—R)$_2$— is hydrogen, an alkyl having 1 to 6 carbons, or a cycloalkyl having 3 to 14 carbons, and at least one hydrogen in the compound represented by Formula (2) may be replaced with deuterium, cyano, or a halogen.)

<4> The polycyclic aromatic compound according to <3>, wherein $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl having 6 to 30 carbons, a heteroaryl having 2 to 30 carbons, a diarylamino (provided that the aryl is an aryl having 6 to 12 carbons), an alkyl having 1 to 24 carbons or a cycloalkyl having 3 to 24 carbons, wherein the aryl or the heteroaryl may have an alkyl having 1 to 6 carbons or a cycloalkyl having 3 to 14 carbons as a substituent, wherein at least one hydrogen in these may be replaced with an aryl, a heteroaryl, an alkyl, or a cycloalkyl, and any adjacent groups of $R^{a11}$, $R^{a12}$, $R^{a13}$ may be bonded to form an aryl having 9 to 16 carbons or a heteroaryl ring having 6 to 15 carbons with a$^{11}$ ring, any adjacent groups of $R^{a21}$, $R^{a22}$, $R^{a23}$ may be bonded to form an aryl having 9 to 16 carbons or a heteroaryl ring having 6 to 15 carbons with a$^{21}$ ring, any adjacent groups of $R^{a31}$. $R^{a32}$, $R^{a33}$ may be bonded to form an aryl having 9 to 16 carbons or a heteroaryl ring having 6 to 15 carbons with a$^{31}$ ring, any adjacent groups of $R^{b21}$, $R^{b22}$, $R^{b23}$, $R^{b24}$ may be bonded to form an aryl having 9 to 16 carbons or a heteroaryl ring having 6 to 15 carbons with b$^{21}$ ring, and/or any adjacent groups of $R^{c31}$, $R^{c32}$, $R^{c33}$, $R^{c34}$ may be bonded to form an aryl having 9 to 16 carbons or a heteroaryl ring having 6 to 15 carbons with c$^{31}$ ring, in any of the aryl rings or heteroaryl rings formed, at least one hydrogen may be replaced with an aryl having 6 to 30 carbons, a heteroaryl having 2 to 30 carbons, a diarylamino (provided that the aryl is an aryl having 6 to 12 carbons), an alkyl having 1 to 24 carbons or a cycloalkyl having 3 to 24 carbons, and the above aryl or heteroaryl may have an alkyl having 1 to 6 carbons or a cycloalkyl having 3 to 14 carbons as a substituent;

$Y^{11}$, $Y^{21}$, $Y^{31}$ are each independently B, P, P═O, P═S, or Si—R, and R in the above Si—R is an aryl having 6 to 10 carbons, an alkyl having 1 to 4 carbons, or a cycloalkyl having 5 to 10 carbons:

$X^{11}$, $X^{12}$, $X^{21}$, $X^{22}$, $X^{31}$, $X^{32}$ are each independently >O, >N—R, >C(—R)$_2$, or >S, wherein R in the above >N—R is an aryl having 6 to 10 carbons, an alkyl having 1 to 4 carbons, or a cycloalkyl having 5 to 10 carbons, and the above aryl may have an alkyl having 1 to 4 carbons or a cycloalkyl having 5 to 10 carbons as a substituent, R in the above >C(—R)$_2$ is hydrogen, an aryl having 6 to 10 carbons, an alkyl having 1 to 4 carbons, or a cycloalkyl having 5 to 10 carbons and the above aryl may have an alkyl having 1 to 4 carbons or a cycloalkyl having 5 to 10 carbons as a substituent.

<5> The polycyclic aromatic compound according to <3>, wherein $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl having 6 to 16 carbons, a heteroaryl having 2 to 20 carbons, a diarylamino (provided that the aryl is an aryl having 6 to 10 carbons), an alkyl having 1 to 12 carbons or a cycloalkyl having 3 to 16 carbons, wherein the aryl or the heteroaryl may have an alkyl having 1 to 6 carbons or a cycloalkyl having 3 to 14 carbons as a substituent;

$Y^{11}$, $Y^{21}$, $Y^{31}$ are each independently B, P, P═O, or P═S;

$X^{11}$, $X^{12}$, $X^{21}$, $X^{22}$, $X^{31}$, $X^{32}$ are each independently >O, >N—R, or >C(—R)$_2$, wherein R in the above >N—R is an aryl having 6 to 10 carbons, an alkyl having 1 to 4 carbons, or a cycloalkyl having 5 to 10 carbons, and the above aryl may have an alkyl having 1 to 4 carbons or a cycloalkyl having 5 to 10 carbons as a substituent, R in the above >C(—R)$_2$ is hydrogen, an aryl having 6 to 10 carbons, an alkyl having 1 to 4 carbons, or a cycloalkyl having 5 to 10 carbons and the above aryl may have an alkyl having 1 to 4 carbons or a cycloalkyl having 5 to 10 carbons as a substituent.

<6> The polycyclic aromatic compound according to <3>, wherein $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl having 6 to 16 carbons, a heteroaryl having 2 to 20 carbons, a diarylamino (provided that the aryl is an aryl having 6 to 10 carbons), an alkyl having 1 to 12 carbons or a cycloalkyl having 3 to 16 carbons, wherein the aryl or the heteroaryl may have an alkyl having 1 to 4 carbons or a cycloalkyl having 5 to 10 carbons as a substituent;

$Y^{11}$, $Y^{21}$, $Y^{31}$ are each B;

$X^{11}$, $X^{12}$, $X^{21}$, $X^{22}$, $X^{31}$, $X^{32}$ are each independently >O or >N—R, wherein R in the above >N—R is an aryl having 6 to 10 carbons, an alkyl having 1 to 4 carbons, or a cycloalkyl having 5 to 10 carbons, and the above aryl may have an alkyl having 1 to 4 carbons or a cycloalkyl having 5 to 10 carbons as a substituent.

<7> The polycyclic aromatic compound according to <1>, which is represented by Formula (1-1-1), Formula (1-1-5), Formula (1-1-10), Formula (1-1-61), or Formula (1-1-105).

(1-1-1)
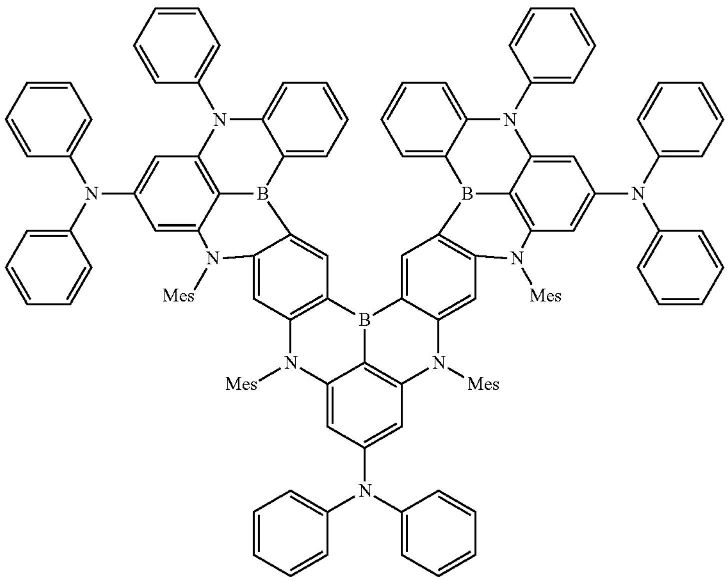
(1-1-5)
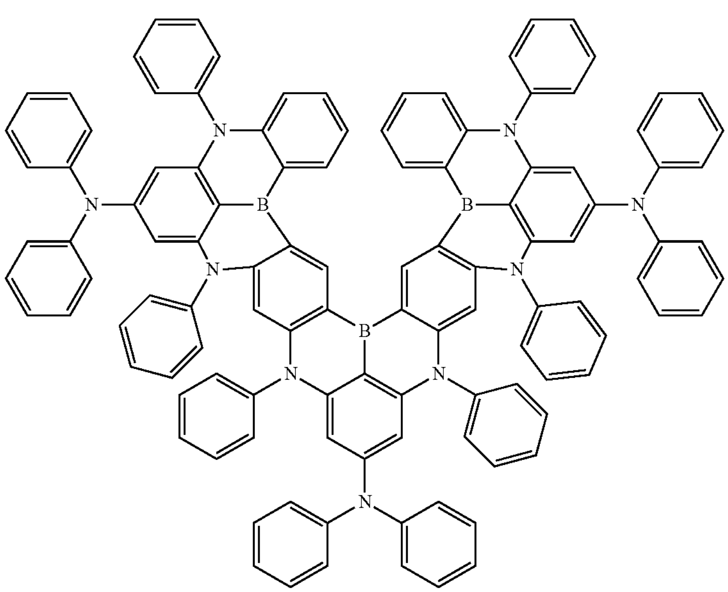

-continued
(1-1-10)
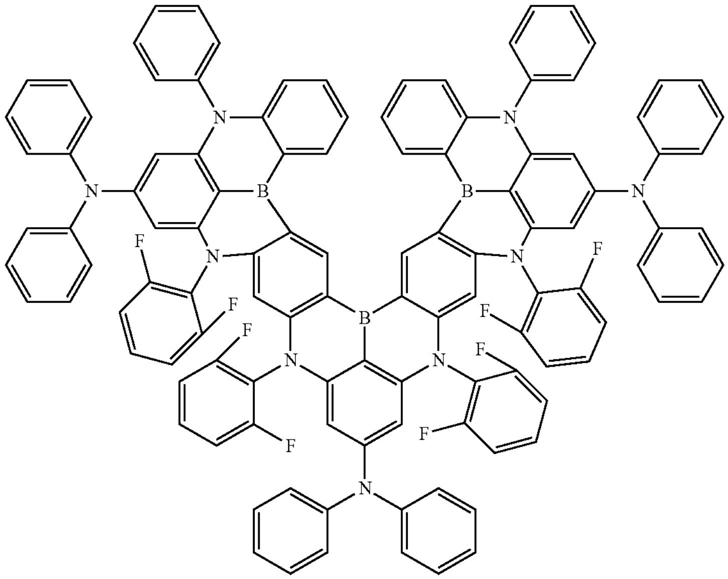
(1-1-61)
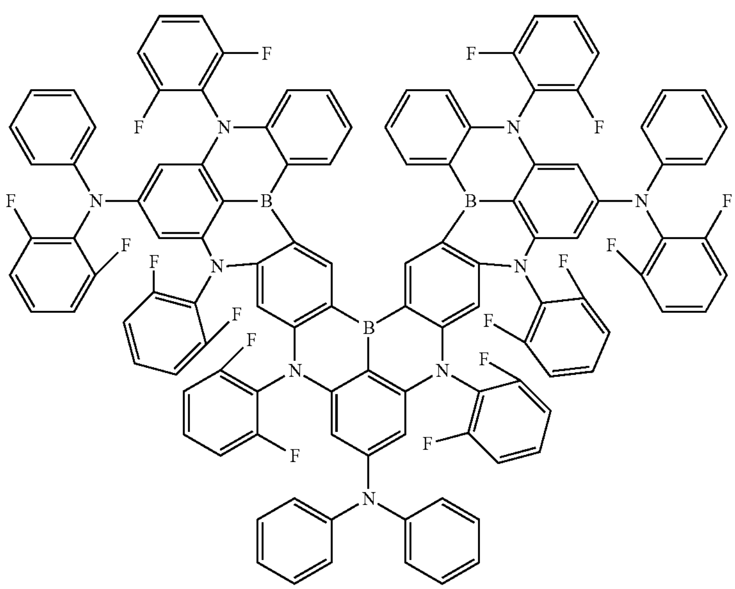

-continued (1-1-105)

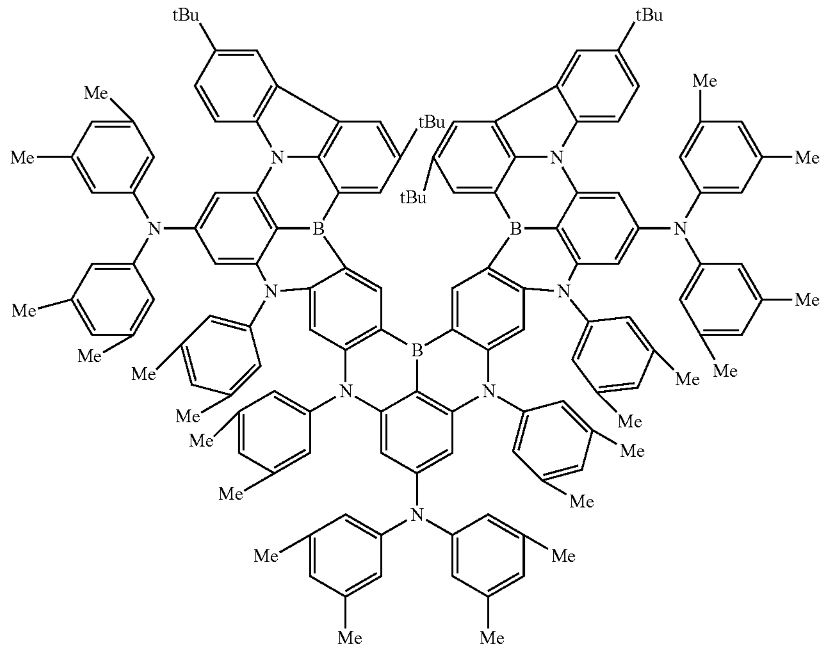

(In the formulas, Me represents methyl, tBu represents t-butyl, Mes represents mesityl.)

<8> A material for an organic device, comprising at least one polycyclic aromatic compound according to any one of <1> to <7>.

<9> The material for an organic device according to <8>, which is a material for an organic electroluminescent element, a material for an organic field effect transistor, or a material for an organic thin film solar cell.

<10> An organic electroluminescent element comprising a pair of electrodes composed of an anode and a cathode, and a light-emitting layer disposed between the pair of electrodes, wherein the light-emitting layer comprises at least one polycyclic aromatic compound according to any one of <1> to <7>.

<11> The organic electroluminescent element according to <10>, wherein the light-emitting layer comprises the polycyclic aromatic compound as a dopant, and further comprises at least one host material.

<12> The organic electroluminescent element according to <11>, wherein the host material is one or more compounds selected from the group consisting of an anthracene derivative, a boron derivative, a dibenzofuran derivative, a carbazole derivative, a triazine derivative, and a fluorene or triarylamine-based polymeric compound.

<13> The organic electroluminescent element according to <11>, wherein the host material is a compound represented by Formula (SPH-1).

(SPH-1)

$$EC \text{—}(MU)_k\text{—} EC$$

(In Formula (SPH-1), each MU is independently a divalent group obtained by removing any two hydrogens from an aromatic compound, each EC is independently a monovalent group obtained by removing any-one hydrogen from an aromatic compound and k is an integer of 2 to 50000.)

<14> The organic electroluminescent element according to any one of <10> to <13>, wherein the light-emitting layer comprises at least one assisting dopant, the assisting dopant is a thermally assisting delayed fluorescent material that has an electron-donating substituent and an electron-accepting substituent, and the assisting dopant has an energy difference (ΔE(ST)) between the singlet energy ($S^1$) and the triplet energy ($T^1$) of 0.2 eV or less.

<15> The organic electroluminescent element according to any one of <10> to <14>, comprising an organic layer which comprises a crosslinked product of a polymer compound containing a structural unit having a crosslinking group represented by any of the following structures.

(PG-1)

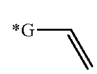

(PG-2)

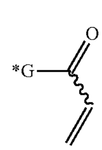

(PG-3)

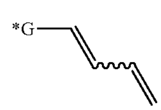

-continued (PG-4)

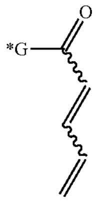

(PG-5)

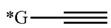

(PG-6)

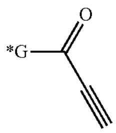

(PG-7)

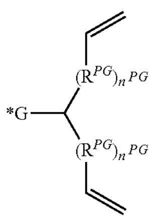

(PG-8)

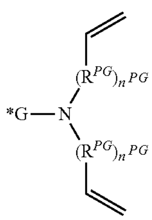

(PG-9)

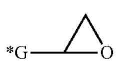

(PG-10)

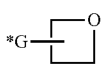

(PG-11)

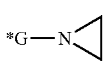

(PG-12)

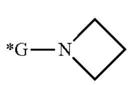

(PG-13)

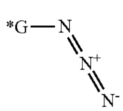

(PG-14)

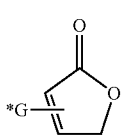

(PG-15)

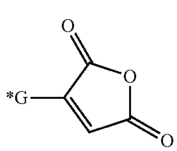

-continued (PG-16)

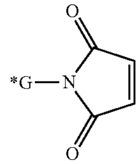

(PG-17)

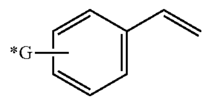

(PG-18)

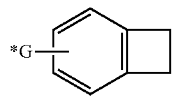

(In the formulas, represents methylene, an oxygen atom, or a sulfur atom, $n^{PG}$ represents an integer of 0 to 5, and when a plurality of $R^{PG}$s are present, those may be identical to or different from one another, and when a plurality of $n^{PG}$s are present, those may be identical to or different from one another; and *G represents a bonding position, and a cross-linking group represented by each formula may have one or more substituents.)

<16> The organic electroluminescent element according to any one of <10> to <15>, comprising an electron transport layer and/or electron injection layer disposed between the cathode and the light-emitting layer, wherein at least one electron transport layer and/or electron injection layer comprises at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, an aryl nitrile derivative, a triazine derivative, a benzimidazole derivative, a phenanthroline derivative, a quinolinol metal complex, a thiazole derivative, a benzothiazole derivative, a silole derivative and an azoline derivative.

<17> The organic electroluminescent element according to <16>, wherein the electron transport layer and/or the electron injection layer further comprises at least one selected from the group consisting of an alkali metal, an alkaline earth metal, a rare earth metal, an oxide of alkali metal, a halide of alkali metal, an oxide of alkaline earth metal, a halide of alkaline earth metal, an oxide of rare earth metal, a halide of rare earth metal, an organic complex of alkali metal, an organic complex of alkaline earth metal and an organic complex of rare earth metal.

<18> A display device equipped with the organic electroluminescent element according to any one of <10> to <17>.

<19> A lighting device equipped with the organic electroluminescent element according to any one of <10> to <17>.

<20> A light-emitting layer forming composition for forming a light-emitting layer in an organic electroluminescent element, which comprises at least one the polycyclic aromatic compound according to any one of <1> to <7> as a dopant material, at least one host material, and an organic solvent.

<21> The light-emitting layer forming composition according to <20>, wherein the host material is one or more compounds selected from the group consisting of an anthracene derivative, a boron derivative, a dibenzofuran derivative, a carbazole derivative, a triazine derivative, and a fluorene or triarylamine-based polymeric compound.

<22> The light-emitting layer forming composition according to <20> or <21>, wherein the host material is a compound represented by Formula (SPH-1).

$$EC\text{—}\left(MU\right)_k\text{—}EC \quad \text{(SPH-1)}$$

(In Formula (SPH-1), each MU is independently a divalent group obtained by removing any two hydrogens from an aromatic compound, each EC is independently a monovalent group obtained by removing any-one hydrogen from an aromatic compound and k is an integer of 2 to 50000.)

<23> The light-emitting layer forming composition according to any one of <20> to <22>, comprising at least one assisting dopant, wherein the assisting dopant is a thermally assisting delayed fluorescent material that has an electron-donating substituent and an electron-accepting substituent, and the assisting dopant has an energy difference (ΔE(ST)) between the singlet energy ($S^1$) and the triplet energy ($T^1$) of 0.2 eV or less.

<24> A wavelength conversion material, comprising at least one polycyclic aromatic compound according to any one of <1> to <7>.

Advantageous Effects of Invention

According to the present invention, there is provided a novel compound as a light-emitting material which can be used in an organic device or the like such as an organic EL element. The compounds of the present invention exhibit high emission efficiency and high color purity By using the compound of the present invention, it is possible to provide an organic device such as an organic EL element having excellent characteristics such as emission characteristics. Further, it is possible to increase the choice of materials for organic devices such as materials for light emitting layers and wavelength conversion materials.

DESCRIPTION OF EMBODIMENTS

Figure 1:
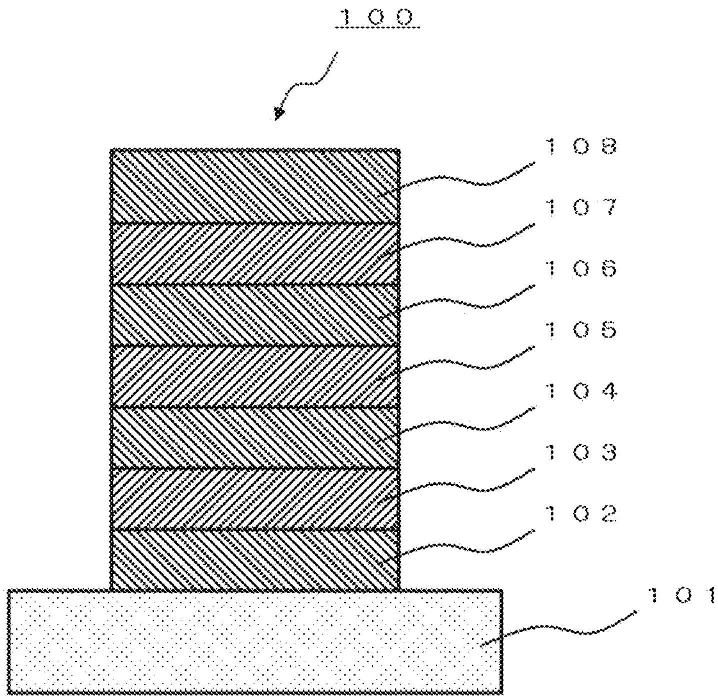
FIG. 1 This is a schematic cross-sectional view showing an organic EL element.

Hereinafter, the invention will be described in detail. Description of constituent features described below is made on the basis of typified embodiments or specific examples in several cases, but the invention is not limited to such embodiments. The numerical range represented by using "to" in the specification means a range including numerical values described before and after "to" as a lower limit and an upper limit. Moreover, "hydrogen" as used herein in description of a structural formula means a "hydrogen atom."

A chemical structure or a substituent is represented herein by using the number of carbon atoms in several cases. However, the number of carbon atoms when an atom of the chemical structure is replaced with the substituent in, when an atom of the substituent is further replaced with a substituent, or the like means the number of carbon atoms of each chemical structure or each substituent and does not mean the total number of carbon atoms of each chemical structure and the substituent thereof or the total number of carbon atoms of each substituent and the substituent thereof. For example, an expression "substituent B having Y carbons which is subjected to substitution for substituent A having X carbons" means that hydrogen of "substituent B having Y carbons" is replaced with "substituent A having X carbons," and the Y carbons do not represent the number of carbon atoms of a total of the substituent A and the substituent B For example, an expression "substituent B having Y carbons which is subjected to substitution for substituent A" means that hydrogen of "substituent B having Y carbons" is replaced with "substituent A (in which the number of carbon atoms is not specified), and the Y carbons do not mean the number of carbon atoms of a total of the substituent A and the substituent B.

1. Polycycle Aromatic Compound

The polycyclic aromatic compound of the present invention is represented by the following Formula (1).

(1)

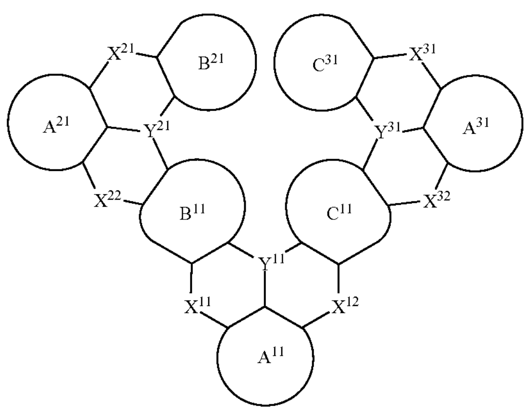

In Formula (1), $A^{11}$ ring, $A^{21}$ ring, $A^{31}$ ring, $B^{11}$ ring, $B^{21}$ ring, $C^{11}$ ring, and $C^{31}$ ring are each independently an aryl ring or a heteroaryl ring (as shown in Formula (1), an aryl ring or a heteroaryl ring bonded to two or three selected from the group consisting of $Y^{11}$, $Y^{21}$, $Y^{31}$, $X^{11}$, $X^{12}$, $X^{21}$, $X^{22}$, $X^{31}$ and $X^{32}$), and at least one of the hydrogens in these rings may be replaced That is, the aryl ring or the heteroaryl ring may have substituents at positions other than a position where the aryl ring or the heteroaryl ring binds to two or three selected from the group consisting of $Y^{11}$, $Y^{21}$, $Y^{31}$, $X^{11}$, $X^{12}$, $X^{21}$, $X^{22}$, $X^{31}$ and $X^{32}$.

It is preferable that at least one of $A^{11}$ ring, $A^{21}$ ring, $A^{31}$ ring, $B^{11}$ ring, $B^{21}$ ring, $C^{11}$ ring, and $C^{31}$ ring is an aryl ring having at least one substituent or a heteroaryl ring having at least one substituent, it is more preferable that each of $A^{11}$ ring, $A^{21}$ ring, $A^{31}$ ring, $B^{11}$ ring, $B^{21}$ ring, $C^{11}$ ring, and $C^{31}$ ring is an aryl ring having at least one substituent or a heteroaryl ring having at least one substituent; and it is further preferable that each of $A^{11}$ ring, $A^{21}$ ring, $A^{31}$ ring, $B^{21}$ ring, $C^{11}$ ring, and $C^{31}$ ring is an aryl ring having one substituent or a heteroaryl ring having one substituent.

Preferable examples of the substituents are a substituted or unsubstituted aryl, a substituted or unsubstituted heteroaryl, a substituted or unsubstituted diarylamino, a substituted or unsubstituted diheteroarylamino, a substituted or unsubstituted aryl heteroarylamino (amino having aryl and heteroaryl), a substituted or unsubstituted diarylboryl (the two aryls may be linked via a single bond or a linking group), a substituted or unsubstituted alkyl, a substituted or unsubstituted cycloalkyl, a substituted or unsubstituted alkoxy, a substituted or unsubstituted aryloxy, a substituted silyl, or $SF_5$. Examples of the substituent when these groups have one or more substituent include an aryl, a heteroaryl, an alkyl, a cycloalkyl, a diarylamino, and a substituted silyl.

Particularly preferred as the substituent are a substituted or unsubstituted alkyl (particularly neopentyl), a cycloalkyl such as adamanthyl, mesityl, and the like. Also preferred is a tertiary-alkyl (tR). This is because deactivation due to aggregation of molecules is prevented by such a bulky substituent, and light emission quantum efficiency (PLQY) is improved. Also preferred as the substituent is a substituted or unsubstituted diarylamino.

The above tertiary-alkyl is represented by the following Formula (tR).

(tR)

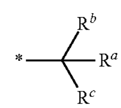

In Formula (tR), $R^a$, $R^b$ and $R^c$ are each independently an alkyl having 1 to 24 carbons, any —$CH_2$— in the alkyl may be replaced with —O—, and the group represented by Formula (tR) replaces at least one hydrogen in the compound or structures represented by Formula (1) at *.

"Alkyl having 1 to 24 carbons" as $R^a$, $R^b$, and $R^c$ may be either a straight chain or a branched chain, for example, a straight chain alkyl having 1-24 carbons or a branch chain alkyl having 3 to 24 carbons. Examples include an alkyl having 1 to 18 carbons (a branch chain alkyl having of 3-18 carbons), an alkyl having 1 to 12 carbons (a branch chain alkyl having 3-12 carbons), an alkyl having 1 to 6 carbons (a branch chain alkyl having 3 to 6 carbons), or an alkyl having 1 to 4 carbons (a branch chain alkyl having 3 to 4 carbons).

The sum of the number of carbons in $R^a$, $R^b$, and $R^c$ in Formula (tR) is preferably from 3 to 20, and particularly preferably from 3 to 10.

Specific alkyls of $R^a$, $R^b$ and $R^c$ include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, 2-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, n-eicosyl, and the like.

Examples of a group represented by Formula (tR) include t-butyl, t-amyl, 1-ethyl-1-methylpropyl, 1,1-diethylpropyl, 1,1-diethylbutyl, 1-ethyl-1-methylbutyl, 1,1,3,3-tetramethylbutyl, 1,1,4-trimethylpentyl, 1,1,2-trimethylpropyl, 1,1-dimethyloctyl, 1,1-dimethylpentyl, 1,1-dimethylheptyl, 1,1,5-trimethylhexyl, 1-ethyl-1-methylhexyl, 1-ethyl-1,3-dimethylbutyl, 1,1,2,2-tetramethylpropyl, 1-butyl-1-methylpentyl, 1,1-diethylbutyl, 1-ethyl-1-methylpentyl, 1,1,3-trimethylbutyl, 1-propyl-1-methylpentyl, 1,1,2-trimethylpropyl, 1-ethyl-1,2,2-trimethylpropyl, 1-propyl-1-methylbutyl, 1,1-dimethylhexyl, and the like. Of these, t-butyl and t-amyl are preferred.

Other preferred examples of substituents in $A^{11}$ ring, $A^{21}$ ring, $A^{31}$ ring, $B^{11}$ ring, $B^{21}$ ring, $C^{11}$ ring, and $C^{31}$ ring include, for example, a diarylamino substituted with a group of Formula (tR), a carbazolyl substituted with a group of Formula (tR), or a benzocarbazolyl substituted with a group of Formula (tR). Examples of the "diarylamino" include groups described as the following "first substituent." Substituted forms of groups of Formula (tR) to diarylamino, carbazolyl and benzocarbazolyl include examples in which a part or all of hydrogens in the aryl ring or benzene ring in these groups are replaced with groups of Formula (tR)

In Formula (1), $Y^{11}$, $Y^{21}$, $Y^{31}$ are each independently B, P, P═O, P═S, Al, Ga, As, Si—R, or Ge—R, and R in the above Si—R and Ge—R is an aryl, an alkyl, or a cycloalkyl. $X^{11}$, $X^{12}$, $X^{21}$, $X^{22}$, $X^{31}$, $X^{32}$ each independently represent >O, >N—R, >C(—R)$_2$, >S, or >Se. R in the above >N—R represents an aryl which may be substituted, a heteroaryl which may be substituted, an alkyl which may be substituted or a cycloalkyl which may be substituted. R in the above >C(—R)$_2$ represents hydrogen, an aryl which may be substituted, an alkyl which may be substituted or a cycloalkyl which may be substituted, and R in the above >N—R and/or above >C(—R)$_2$ may be bonded to a $A^{11}$ ring, $A^{21}$ ring, $A^{31}$ ring, $B^{11}$ ring, $B^{21}$ ring, $C^{11}$ ring, and/or $C^{31}$ ring by a linking group or a single bond. At least one hydrogen in the compound represented by Formula (1) may be replaced with deuterium, cyano, or a halogen.

The compound represented by Formula (1) is preferably a compound represented by the following Formula (2).

(2)

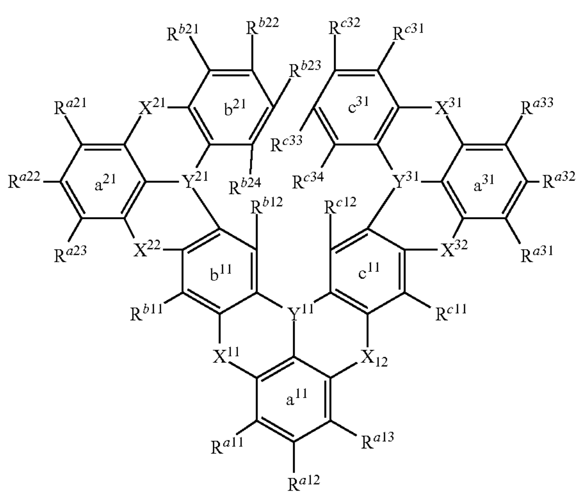

In Formula (2) above, each $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl, a heteroaryl, a diarylamino (the two aryls may be bonded to each other by a single bond or a linking group), a diheteroarylamino, an arylheteroarylamino, a diarylboryl, an alkyl, a cycloalkyl, an alkoxy, an aryloxy, or a substituted silyl, wherein at least one hydrogen in these may be replaced with an aryl, a heteroaryl, an alkyl, or a cycloalkyl. Any adjacent groups of $R^{a11}$, $R^{a12}$, $R^{a13}$ may also be bonded to form an aryl or heteroaryl ring with $a^{11}$ ring, any adjacent groups of $R^{a21}$, $R^{a22}$, $R^{33}$ may be bonded to form an aryl or heteroaryl ring with $a^{21}$ ring, any adjacent groups of $R^{a31}$, $R^{a32}$, $R^{a33}$ may be bonded to form an aryl or heteroaryl ring with $a^{31}$ ring, any adjacent groups of $R^{b21}$, $R^{b22}$, $R^{b23}$, $R^{b24}$ may be bonded to form an aryl or heteroaryl ring with $b^{21}$ ring, and/or any adjacent groups of $R^{c31}$, $R^{c32}$, $R^{c33}$, $R^{c34}$ may be bonded to form an aryl or heteroaryl ring with $c^{31}$ ring. At least one hydrogen in any of the aryl rings or heteroaryl rings formed may be replaced with an aryl, a heteroaryl, a diarylamino (the two aryls may be bonded to each other by a single bond or a linking group), a diheteroarylamino, an arylheteroarylamino, a diarylboryl, an alkyl, a cycloalkyl, an alkoxy, or an aryloxy. Also, at least one hydrogen in these may be replaced with an aryl, a heteroaryl, an alkyl or a cycloalkyl. $Y^{11}$, $Y^{21}$, $Y^{31}$ are each independently B, P, P═O, P═S, Al, Ga, As, Si—R, or Ge—R. R of the above Si—R and Ge—R is an aryl having 6 to 12 carbons, an alkyl having 1 to 6 carbons, or a cycloalkyl having 3 to 14 carbons. $X^{11}$, $X^{12}$, $X^{21}$, $X^{22}$, $X^{31}$, $X^{32}$ are each independently >O, >N—R, >C(—R)$_2$, >S, or >Se. R of the above >N—R is an aryl having 6 to 12 carbons, a heteroaryl having 2 to 15 carbons, an alkyl having 1 to 6 carbons, or a cycloalkyl having 3 to 14 carbons; and the above aryl or heteroaryl may be substituted with an alkyl having 1 to 6 carbons or a cycloalkyl having 3 to 14 carbons, R in the above >C(—R)$_2$ is hydrogen, an aryl having 6 to 12 carbons, an alkyl having 1 to 6 carbons, or a cycloalkyl having 3 to 14 carbons; and the above aryl may be substituted with an alkyl having 1 to 6 carbons or a cycloalkyl having 3 to 14 carbons. R in the above >N—R and/or >C(—R)$_2$ may be bonded to $a^{11}$ ring, $a^{21}$ ring, $a^{31}$ ring, $b^{11}$ ring, $b^{21}$ ring, $c^{11}$ ring, and/or $c^{31}$ ring by —O—, —S—, —C(—R)$_2$—, —Si(—R)$_2$—, or a single bond, and the R in the above —C(—R)$_2$— and —Si(—R)$_2$— is hydrogen, an alkyl having 1 to 6 carbons, or a cycloalkyl having 3 to 14 carbons. At least one hydrogen in the compound represented by Formula (2) may be replaced with deuterium, cyano, or a halogen.

$A^{11}$ ring, $A^{21}$ ring, $A^{31}$ ring, $B^{11}$ ring, $B^{21}$ ring, $C^{11}$ ring, and $C^{31}$ ring in Formula (1) are each independently an aryl ring or a heteroaryl ring, and at least one of the hydrogens in these rings may be replaced with a substituent. The substituent is preferably a substituted or unsubstituted aryl, a substituted or unsubstituted heteroaryl, a substituted or unsubstituted diarylamino (the two aryls may be bonded to each other by a single bond or a linking group), a substituted or unsubstituted diheteroarylamino, a substituted or unsubstituted arylheteroarylamino (an amino group having aryl and heteroaryl), a substituted or unsubstituted diarylboryl, a substituted or unsubstituted alkyl, a substituted or unsubstituted cycloalkyl, a substituted or unsubstituted alkoxy, a substituted or unsubstituted aryloxy, or a substituted silyl. Examples of the substituent when these groups have one or more substituent include an aryl, a heteroaryl, or an alkyl. It is preferable that each of $A^{11}$ ring, $B^{11}$ ring, and $C^{11}$ ring, which is an aryl ring or a heteroaryl ring, has a 5-membered ring or a 6-membered ring sharing a bond with a fused bicyclic structure composed of $Y^{11}$, $X^{11}$ and $X^{12}$. It is preferable that each of $A^{21}$ ring, $B^{11}$ ring, and $B^{21}$ ring, which is an aryl ring or a heteroaryl ring, has a 5-membered ring or a 6-membered ring sharing a bond with a fused bicyclic structure composed of $Y^{21}$, $X^{21}$ and $X^{22}$. It is preferable that each of $A^{31}$ ring, $C^{11}$ ring, and $C^{31}$ ring, which is an aryl ring or a heteroaryl ring, has a 5-membered ring or a 6-membered ring sharing a bond with the fused bicyclic structures composed of $Y^{31}$, $X^{31}$ and $X^{32}$.

Here, the "fused bicyclic structure" means a structure in which two rings each composed of "$Y^{11}$, $X^{11}$, and $X^{12}$", "$Y^{21}$, $X^{21}$, and $X^{22}$", "$Y^{31}$, $X^{31}$, and $X^{32}$" shown in the center of Formula (1) are fused. Further, "a six-membered ring sharing a bond with the fused bicyclic structure" means, for example, $a^{11}$ ring, $a^{21}$ ring, $a^{31}$ ring, $b^{11}$ ring, $b^{21}$ ring, $c^{11}$ ring, and $c^{31}$ ring (benzene ring (six-membered ring)) which are fused to the fused bicyclic structure as shown in Equation (2). In addition, "having a 6 membered ring" means that an aryl ring or a heteroaryl ring is formed only by this 6 membered ring, or further other rings or the like are fused to this 6 membered ring so as to include this 6 membered ring to form an aryl ring or a heteroaryl ring. In other words, it means that a 6 membered ring constituting all or a part of an aryl ring or a heteroaryl ring is fused to the above-mentioned fused bicyclic structure. The same explanation applies to the "five-membered ring".

$A^{11}$ ring, $A^{21}$ ring, and $A^{31}$ ring in Formula (1) correspond to $a^{11}$ ring and its substituent $R^{a11}$, $R^{a12}$, $R^{a13}$, $a^{21}$ ring substituent $R^{a21}$, $R^{a22}$, $R^{a23}$, and $a^{31}$ ring and its substituent $R^{a31}$, $R^{a32}$, $R^{a33}$ in Formula (2), respectively;

- $B^{11}$ ring and $B^{21}$ ring in Formula (1) correspond to $b^{11}$ ring and its substituent $R^{b11}$, $R^{b12}$, and $b^{21}$ ring and its substituent $R^{b21}$, $R^{b22}$, $R^{b23}$, $R^{b24}$ in Formula (2), respectively; and
- $C^{11}$ ring and $C^{31}$ ring in Formula (1) correspond to $c^{11}$ ring and the substituent $R^{c11}$, $R^{c12}$, and $c^{31}$ ring and the substituent $R^{c31}$, $R^{c32}$, $R^{c33}$, $R^{c34}$ in Formula (2), respectively.

That is, Formula (2) corresponds to the one in which "a ring containing a six-membered ring (benzene ring)" is selected as each of $A^{11}$ ring, $A^{21}$ ring, $A^{31}$ ring, $B^{11}$ ring, $B^{21}$ ring, $C^{11}$ ring, and $C^{31}$ ring in Formula (1). In this sense, for A to C in Formula (1), each ring in Formula (2) is represented by a to c in lowercase.

In Formula (2), any adjacent groups of $R^{a11}$, $R^{a12}$, $R^{a13}$ may be bonded to form an aryl or heteroaryl ring together with $a^{11}$ ring, any adjacent groups of $R^{a21}$, $R^{a22}$, $R^{a23}$ may be bonded to form an aryl or heteroaryl ring together with $a^{21}$ ring, any adjacent groups of $R^{a31}$, $R^{a32}$, $R^{a33}$ may be bonded to form an aryl or heteroaryl ring together with $a^{31}$ ring, any adjacent groups of $R^{b21}$, $R^{b22}$, $R^{b23}$, $R^{b24}$ may be bonded to form an aryl or heteroaryl ring together with $b^{21}$ ring, and/or any adjacent groups of $R^{c31}$, $R^{c32}$, $R^{c33}$, $R^{c34}$ may be bonded to form an aryl or heteroaryl ring together with $c^{11}$ ring Examples of the ring to be formed include, a benzene ring, an indole ring, a pyrrole ring, a furan ring, a thiophene ring, a benzofuran ring, a benzothiophene ring, a cyclopentadiene ring, or an indene ring, and are fused with the benzene ring that are each of $a^{11}$ ring, $a^{21}$ ring, $a^{31}$ ring $b^{21}$ rings, or $c^{31}$ ring to form a naphthalene ring, a carbazole ring, an indole ring, a benzofuran ring, a benzothiophene ring, a dibenzofuran ring, a dibenzothiophene ring, an indene ring, or a fluorene ring, respectively. At least one hydrogen in the ring formed may be replaced with an aryl, a heteroaryl, a diaryl amino (the two aryls may be bonded to each other by a single bond or linking group), a diheteroarylamino, an arylheteroarylamino, a diarylboryl, an alkyl, a cycloalkyl, an alkoxy, an aryloxy, or a substituted silyl, and at least one hydrogen in these may be replaced with an aryl, a heteroaryl, or an alkyl.

$Y^{11}$, $Y^{21}$, $Y^{31}$ in Formula (1) is B, P, P═O, P═S, Al, Ga, As, Si—R, or Ge—R, respectively, and R of the above Si—R and Ge—R is an aryl, an alkyl, or a cycloalkyl. When P═O, P═S, Si—R or Ge—R, the atoms bonded to $A^{11}$ ring, $A^{21}$ ring, $A^{31}$ ring, $B^{11}$ ring, $B^{21}$ ring, $C^{11}$ ring or $C^{31}$ ring are P, Si or Ge. $Y^{11}$, $Y^{21}$, $Y^{31}$ is preferably B, P, P═O, P═S, or Si—R, with B being particularly preferred. The same explanation applies to $Y^{11}$, $Y^{21}$, $Y^{31}$ in Formula (2).

$X^{11}$, $X^{12}$, $X^{21}$, $X^{22}$, $X^{31}$, $X^{32}$ in Formula (1) are each independently >O, >N—R, >C(—R)$_2$, >S, or >Se. R in the above >N—R is an aryl which may be substituted, a heteroaryl which may be substituted, an alkyl which may be substituted, or a cycloalkyl which may be substituted, and R in the above >C(—R)$_2$ is hydrogen, an aryl which may be substituted, an alkyl which may be substituted, or a cycloalkyl which may be substituted. Each R in N—R and >C(—R)$_2$ may be bonded to $A^{11}$ ring, $A^{21}$ ring, $A^{31}$ ring, $B^{11}$ ring, $B^{21}$ ring, $C^{11}$ ring, and/or $C^{31}$ ring by a linking group or a single linking group. The linking group is preferably —O—, —S—, —C(—R)$_2$—, or —Si(—R)$_2$—. R in the above "—C(—R)$_2$—" and "—Si(—R)$_2$—" is hydrogen, an aryl which may be substituted, an alkyl which may be substituted, or a cycloalkyl which may be substituted. The same explanation applies to $X^{11}$, $X^{12}$, $X^{21}$, $X^{22}$, $X^{31}$, $X^{32}$ in Formula (2).

Here, the provision of Formula (1) that each R in >N—R and >C(—R)$_2$ is bonded to $A^{11}$ ring, $A^{21}$ ring, $B^{21}$ ring, $C^{11}$ ring, and/or $C^{31}$ ring by a linking group or a single bond corresponds to the provision of Formula (2) that each R in >N—R and >C(—R)$_2$ is bonded to $a^{11}$ ring, $a^{21}$ ring, $a^{31}$ ring, $b^{11}$ ring, $b^{21}$ ring, $c^{11}$ ring, and/or $c^{31}$ ring by —O—, —S—, —C(—R)$_2$—, —Si(—R)$_2$—, or a single bond. This provision can be expressed in terms of compounds in which $a^{11}$ ring, $a^{21}$ ring, $a^{31}$ ring, $b^{11}$ ring, $b^{21}$ ring, $c^{11}$ ring, and/or $c^{31}$ ring have a ring-structure incorporated into a fused ring.

The fused ring formed is, for example, a carbazole ring, a 9H acridine ring, a phenoxazine ring, a phenothiazine ring or an acridine ring. The fused ring formed may be further substituted with an alkyl (specific examples will be described later) (e.g., a 9,9-dimethylacridine ring).

An example of such a compound includes a compound represented by the following Formula (2-x-1). In Formula (2-x-1), N—R (R is an aryl which may have one or more substituent) which is $X^{22}$ or $X^{31}$ in Formula (2) is bonded to $b^{21}$ ring and $c^{31}$ ring by a single bond to form a carbazole ring, respectively (2-x-1)

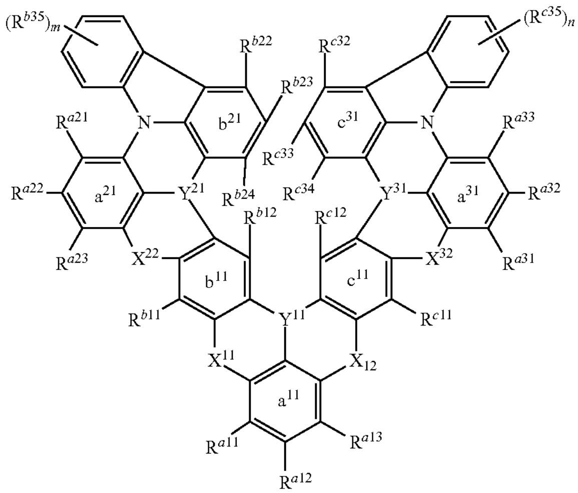

In Formula (2-x-1), each $R^{b35}$, $R^{c35}$ are each independently synonymous with $R^{a21}$ and the like, and is preferably an alkyl, more preferably methyl or t-butyl. m and n are each independently integers from 0 to 4, preferably 0 or 1. The other symbols of Formula (2-x-1) are respectively synonymous with the same symbols in Formula (2).

As the "aryl ring" which is $A^{11}$ ring, $A^{21}$ ring, $A^{31}$ ring, $B^{11}$ ring, $B^{21}$ ring, $C^{11}$ ring, or $C^{31}$ ring in Formula (1), an aryl ring having 6 to 30 carbons is exemplified, an aryl ring having 6 to 16 carbons is preferable, an aryl ring having 6 to 12 carbons is more preferable, and an aryl ring having 6 to 10 carbons is particularly preferable. The "aryl ring" may correspond to an "aryl ring" formed "together with $a^{11}$ ring by binding any of the adjacent groups of $R^{a11}$, $R^{a12}$, $R^{a13}$, together with $a^{21}$ ring by binding any of the adjacent groups of $R^{a21}$, $R^{a22}$, $R^{a23}$, together with $a^{31}$ ring by binding any of the adjacent groups of $R^{a31}$, $R^{a32}$, $R^{a33}$, together with $b^{21}$ ring by binding any of the adjacent groups of $R^{b21}$, $R^{b22}$, $R^{b23}$, $R^{b24}$ bonded, and/or together with $c^{31}$ ring by binding any of the adjacent groups of $R^{c31}$, $R^{c32}$, $R^{c33}$, $R^{c34}$" as defined in Formula (2). Since each of $a^{11}$ ring, $a^{21}$ ring, $b^{11}$ ring, $b^{21}$ ring, $c^{11}$ ring, and $c^{31}$ ring is already composed of a benzene ring having a carbon number of 6, the total carbon number of 9 of the fused ring formed with a five-membered ring is the lower limit carbon number.

Specific examples of the "aryl ring" include a monocyclic benzene ring, a bicyclic biphenyl ring, a fused bicyclic naphthalene ring, a tricyclic terphenyl ring (m-terphenyl, o-terphenyl, p-terphenyl), a fused tricyclic acenaphthylene ring, fluorene ring, phenalene ring and phenanthrene ring, a fused tetracyclic triphenylene ring, pyrene ring and naphthacene ring, a fused pentacyclic perylene ring and pentacene ring.

As the "heteroaryl ring" which is $A^{11}$ ring, $A^{21}$ ring, $A^{31}$ ring, $B^{11}$ ring, $B^{21}$ ring, $C^{11}$ ring, or $C^{31}$ ring in Formula (1), a heteroaryl ring having 2 to 30 carbons is exemplified, a heteroaryl ring having 2 to 25 carbons is preferable, a heteroaryl ring having 2 to 20 carbons is more preferable, a heteroaryl ring having 2 to 15 carbons is more preferable, and a heteroaryl ring having 2 to 10 carbons is particularly preferable. Moreover, specific examples of the "heteroaryl ring" include a heterocyclic ring containing, in addition to carbon, 1 to 5 hetero atoms selected from oxygen, sulfur and nitrogen as a ring-forming atom. The "heteroaryl ring" may correspond to a "heteroaryl ring" formed "together with $a^{11}$ ring by binding any of the adjacent groups of $R^{a11}$, $R^{a12}$, $R^{a13}$, together with $a^{21}$ ring by binding any of the adjacent groups of $R^{a21}$, $R^{a22}$, $R^{a23}$, together with $a^{31}$ ring by binding any of the adjacent groups of $R^{a31}$, $R^{a32}$, $R^{a33}$, together with $b^{21}$ ring by binding any of the adjacent groups of $R^{b21}$, $R^{b22}$, $R^{b23}$, $R^{b24}$ bonded, and/or together with $c^{31}$ ring by binding any of the adjacent groups of $R^{c31}$, $R^{c32}$, $R^{c33}$, $R^{c34}$" defined by Formula (2) Since each of $a^{11}$ ring, $a^{21}$ ring, $b^{11}$ ring, $b^{21}$ ring, $c^{11}$ ring, and $c^{31}$ ring is already composed of a benzene ring having 6 carbons, the total carbon number of 6 of the fused rings formed by the five-membered rings is the lower limit carbon number.

Specific examples of the "heteroaryl ring" include a pyrrole ring, an oxazole ring, an isoxazol ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzooxazole ring, a benzothiazole ring, a 1H-benzotriazol ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazan ring, an oxadiazole ring and a thianthrene ring.

The bonding positions of the "aryl ring" and the "heteroaryl ring" which are $A^{11}$ ring, $A^{21}$ ring, $A^{31}$ ring, $B^{21}$ ring, or $C^{31}$ ring in Formula (1) to two or three selected from the group consisting of $Y^{11}$, $Y^{21}$, $Y^{31}$, $X^{11}$, $X^{12}$, $X^{21}$, $X^{22}$, $X^{31}$ and $X^{32}$ in Formula (1) are not particularly limited, but two or three contiguous carbons on the ring may be directly bonded to two or three selected from the group consisting of $Y^{11}$, $Y^{21}$, $Y^{31}$, $X^{11}$, $X^{12}$, $X^{21}$, $X^{22}$, $X^{31}$ and $X^{32}$, respectively.

When the "aryl ring" and the "heteroaryl ring" which are $A^{11}$ ring, $A^{21}$ ring, $A^{31}$ ring, $B^{21}$ ring, or $C^{31}$ ring in Formula (1) are fused rings in which two or more rings are fused, any ring may be bonded to $Y^{11}$, $Y^{21}$ or $Y^{31}$, but the ring bonded to $Y^{11}$, $Y^{21}$ or $Y^{31}$ is preferably a 5-membered ring or a 6-membered ring as described above. The ring bonded to $Y^{11}$ in $A^{11}$ ring may be bonded to $X^{11}$ and $X^{12}$, the ring bonded to $Y^{21}$ in $A^{21}$ ring may be bonded to $X^{21}$ and $X^{22}$, the ring bonded to $Y^{31}$ in $A^{31}$ ring may be bonded to $X^{31}$ and $X^{32}$, the ring bonded to $Y^{21}$ in $B^{21}$ ring may be bonded to $X^{21}$, and the ring bonded to $Y^{31}$ in $C^{31}$ ring may be bonded to $X^{31}$ (i.e, the ring bonded to $Y^{11}$, $Y^{21}$ or $Y^{31}$ may share a bond with the fused bicyclic structure described above). For example, in Formula (2), when an aryl ring or a heteroaryl ring is formed "together with a" ring by binding any of the adjacent groups of $R^{a11}$, $R^{a12}$, $R^{a13}$, together with $a^{21}$ ring by binding any of the adjacent groups of $R^{a21}$, $R^{a22}$, $R^{a23}$, together with $a^{31}$ ring by binding any of the adjacent groups of $R^{a31}$, $R^{a32}$, $R^{a33}$, together with $b^{21}$ ring by binding any of the adjacent groups of $R^{b21}$, $R^{b22}$, $R^{b23}$, $R^{b24}$ bonded, and/or together with $c^{31}$ ring by binding any of the adjacent groups of $R^{c31}$, $R^{c32}$, $R^{c33}$, $R^{c34}$" the benzene ring, which is a six-membered ring is bonded to $Y^{11}$, $Y^{21}$ or $Y^{31}$, which is preferable. It is also preferable that, for example, an indole ring, a benzofuran ring, and a benzothiophene ring are bonded to $Y^{11}$, $Y^{21}$ or $Y^{31}$ by a pyrrole ring, a furan ring, and a thiophene ring which are 5-membered rings, respectively. Examples of such a structure include a structure represented by the following Formula (1-y-1) corresponding to a structure in which a benzene ring which is a $b^{21}$ ring and a $c^{31}$ ring in Formula (2) is an indole ring, a benzofuran ring, or a benzothiophene ring.

(1-y-1)

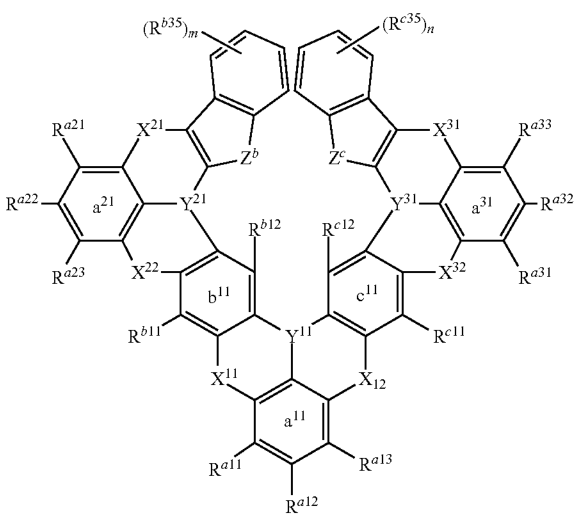

In Formula (1-y-1), $Z^b$ and $Z^c$ are each independently —S—, —O—, or >N—$R^{29}$, and $R^{29}$ is hydrogen or an aryl which may have one or more substituent. $R^{29}$ is preferably phenyl which may be substituted with an alkyl, more preferably unsubstituted phenyl. $Z^b$ and $Z^c$ are preferably the same as the other. Each of $R^{b35}$ and $R^{c35}$ is independently synonymous with $R^{a21}$ and the like and is preferably an alkyl, more preferably methyl or t-butyl m and n are each independently integers from 0 to 4, preferably 0 or 1. The other symbols in Formula (1-y-1) are respectively synonymous with the same symbol in Formula (2).

Each of $A^{11}$ ring, $A^{21}$ ring, and $A^{31}$ ring in Formula (1) is preferably benzene ring, a pyridine ring, a pyrimidine ring, or an indolocarbazole (Indolo[3,2,1-jk]carbazole) ring, and more preferably all are benzene rings.

$B^{21}$ ring and $C^{31}$ ring in Formula (1) are each benzene ring, indole ring, benzofuran ring, benzothiophene ring, pyrrole ring, furan ring, thiophene ring, pyridine ring, or pyrimidine ring, preferably benzene ring, indole ring, benzofuran ring, or benzothiophene ring.

The "aryl ring" and "heteroaryl ring" as $B^{11}$ ring may be bonded at any position to $Y^{11}$, $X^{22}$, $Y^{21}$ and $X^{11}$ in Formula (1), provided that two adjacent carbons on the ring are directly bonded to $Y^{11}$ and $X^{22}$, and two other adjacent carbons are directly bonded to $Y^{21}$ and $X^{11}$. The "aryl ring" and "heteroaryl ring" as $C^{11}$ ring may be bonded at any position to $Y^{11}$, $X^{12}$, $Y^{31}$ and $X^{32}$ in Formula (1), provided that two adjacent carbons on the ring are directly bonded to $Y^{11}$ and $X^{12}$, and two other adjacent carbons are directly bonded to $Y^{31}$ and $X^{32}$. When the "aryl ring" and the "heteroaryl ring" which are a $B^{11}$ ring or a $C^{11}$ ring are fused rings in which two or more rings are fused, any ring may be bonded to $Y^{11}$, $Y^{21}$ or $Y^{31}$. In $B^{11}$ ring, the ring bonded to $Y^{11}$ is also bonded to $X^{11}$, the ring bonded to $Y^{21}$ is also bonded to $X^{22}$, the ring bonded to $Y^{11}$ is also bonded to $X^{12}$, and the ring bonded to $Y^{31}$ is also bonded to $X^{32}$. Preferably, $B^{11}$ ring is monocyclic, and the monocycle is bonded to $Y^{11}$, $Y^{21}$, $X^{11}$ and $X^{22}$. In addition, it is preferable that $C^{11}$ ring is monocyclic, and the monocycle is bonded to $Y^{11}$, $Y^{31}$, $X^{12}$ and $X^{32}$. It is preferable that each of $B^{11}$ ring and $C^{11}$ ring is monocyclic. Each of $B^{11}$ ring and $C^{11}$ ring is preferably a benzene ring or a thiophene ring, and more preferably both are benzene rings.

At least one of the hydrogens in the "aryl ring" or "heteroaryl ring" which is a $A^{11}$ ring, $A^{21}$ ring, $A^{31}$ ring, $B^{11}$ ring, $B^{21}$ ring, $C^{11}$ ring, or $C^{31}$ ring in Formula (1) may be replaced with a first substituent, which is a substituted or unsubstituted "aryl", a substituted or unsubstituted "heteroaryl", a substituted or unsubstituted "diarylamino" (the two aryls may be bonded to each other by a single bond or linking group), a substituted or unsubstituted "diheteroarylamino", a substituted or unsubstituted "arylheteroarylamino", a substituted or unsubstituted "diarylboryl", a substituted or unsubstituted "alkyl", a substituted or unsubstituted "cycloalkyl", a substituted or unsubstituted "alkoxy", a substituted or unsubstituted "aryloxy", "substituted silyl" or $SF_5$, and examples of "aryl" or "heteraryl", as the first substituent, aryl in "diarylamino", heteroaryl in "diheteroarylamino", aryl and heteroaryl in "arylheteroarylamino", aryl in "diarylboryl", and aryl in "aryloxy" include the above-mentioned monovalent groups of "aryl ring" or "heteroaryl ring".

Specific examples of the "aryl" include phenyl as monocyclic aryl, biphenylyl as bicyclic aryl, naphthyl as fused bicyclic aryl, terphenylyl (m-terphenylyl, o-terphenylyl, p-terphenylyl) as tricyclic aryl, acenaphthylenyl, fluorenyl, phenalenyl and phenanthrenyl as fused tricyclic aryl, triphenylenyl, pyrenyl and naphthacenyl as fused tetracyclic aryl, and perylenyl and pentacenyl as fused pentacyclic aryl.

Specific examples of the "heteroaryl" include pyrrolyl, oxazolyl, isoxazolyl, thiazolyl, isothiazolyl, imidazolyl, oxadiazolyl, thiadiazolyl, triazoryl, tetrazoryl, pyrazolyl, pyridyl, pyrimidinyl, pyridazinyl, pyrazinyl, triazinyl, indolyl, isoindolyl, 1H-indazolyl, ben/imidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxathiinyl, phenoxazinyl, phenothiazinyl, phenazinyl, indolizinyl, furyl, benzofuranyl, isobenzofuranyl, dibenzofuranyl, thienyl, benzo[b]thienyl, dibenzothienyl, furazanyl, oxadiazolyl, thianthrenyl, naphthobenzofuranyl and naphthobenzothienyl.

"Alkyl" as a first substituent may be either a straight chain or a branched chain, and specific examples thereof include a straight-chain alkyl having 1 to 24 carbons or branched-chain alkyl having 3 to 24 carbons. An alkyl having 1 to 18 carbons (a branched-chain alkyl having 3 to 18 carbons) is preferred, and an alkyl having 1 to 12 carbons (a branched-chain alkyl having 3 to 12 carbons) is further preferred, and an alkyl having 1 to 6 carbons (a branched-chain alkyl having 3 to 6 carbons) is still further preferred, and an alkyl having 1 to 4 carbons (a branched-chain alkyl having 3 to 4 carbons) is particularly preferred.

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl and n-eicosyl.

"Cycloalkyl" (first substituent) as a first substituent may be any of cycloalkyl formed of one ring, a cycloalkyl formed of a plurality of rings, a cycloalkyl containing a nonconjugated double bond in the ring and cycloalkyl containing a branched chain outside the ring, and is a cycloalkyl having 3 to 14 carbons, for example A cycloalkyl having 5 to 10 carbons is preferred, and a cycloalkyl having 6 to 10 carbons is further preferred.

Specific examples of the cycloalkyl include cyclopropyl, cyclobutyl, cyclopentyl, cyclohexyl, cycloheptyl, cyclooctyl, cyclononyl, cyclodecyl, norbornenyl, bicyclo[1.0.1]butyl, bicyclo[1.1.1]pentyl, bicyclo[2.0.1]pentyl, bicyclo[1.2.1]hexyl, bicyclo[3.0.1]hexyl, bicyclo[2.2.1]heptyl, bicyclo[2.2.2]octyl, decahydronaphthyl, decahydronaphthalenyl, adamanthyl (particularly, 1-adamanthyl), diamantyl and decahydroazulenyl. In addition, specific examples of cycloalkyl which is subjected to substitution for a second substituent described later include methylcyclopropyl, methyl cyclobutyl, methylcyclopentyl, methylcyclohexyl, methylcycloheptyl methylcyclooctyl and methylcyclodecanyl.

Moreover, specific examples of "alkoxy" as a first substituent include a straight-chain alkoxy having 1 to 24 carbons or a branched-chain alkoxy having 3 to 34 carbons. An alkoxy having 1 to 18 carbons (a branched-chain alkoxy having 3 to 18 carbons), and an alkoxy having 1 to 12 carbons (a branched-chain alkoxy having 3 to 12 carbons) is further preferred, and an alkoxy having 1 to 6 carbons (a branched-chain alkoxy having 3 to 6 carbons) is still further preferred, and an alkoxy having 1 to 4 carbons (a branched-chain alkoxy having 3 to 4 carbons) is particularly preferred.

Specific examples of the alkoxy include methoxy, ethoxy, propoxy, isopropoxy, butoxy, isobutoxy, s-butoxy, t-butoxy, pentyloxy, hexyloxy, heptyloxy and octyloxy.

Examples of the "substituted silyl" as the first substituent include a silyl substituted with 3 substituents selected from the group consisting of alkyl, cycloalkyl, and aryl. Examples thereof include trialkylsilyl, tricycloalkylsilyl, dialkylcycloalkylsilyl, alkyldicycloalkylsilyl, triarylsilyl, dialkylarylsilyl, and alkyldiarylsilyl.

Examples of "trialkylsilyl" include a group in which 3 hydrogens in silyl are each independently replaced with an alkyl. As this alkyl, the groups described as "alkyl" in the first substituent described above can be referred to. Alkyl by which hydrogen is preferably replaced is an alkyl having 1 to 5 carbons, and specific examples thereof include methyl, ethyl, propyl, i-propyl, butyl, sec-butyl, t-butyl and t-amyl.

Specific examples of the trialkylsilyl include trimethylsilyl, triethylsilyl, tripropylsilyl, triisopropylsilyl, tributylsilyl, trisec-butylsilyl, trit-butylsilyl, trit-amylsilyl, ethyldimethylsilyl, propyldimethylsilyl, i-propyldimethylsilyl, butyldimethylsilyl, sec-butyldimethylsilyl, t-butyldimethylsilyl, t-amyldimethylsilyl, ethyldiethylsilyl, propyldiethylsilyl, i-propyldiethylsilyl, butyldiethylsilyl, sec-butyldiethylsilyl, t-butyldiethylsilyl, t-amyldiethylsilyl, methyldipropylsilyl, ethyldipropylsilyl, butyldipropylsilyl, sec-butyldipropylsilyl, t-butyldipropylsilyl, t-amyldipropylsilyl, methyldiisopropylsilyl, ethyldiisopropylsilyl, butyldiisopropylsilyl, sec-butyldiisopropylsilyl t-butyldiisopropylsilyl and t-amyldiisopropylsilyl.

Examples of "tricycloalkylsilyl" include a group in which 3 hydrogens in silyl are each independently replaced with cycloalkyl. As this cycloalkyl, the groups described as "cycloalkyl" in the first substituent described above can be referred to. A preferred example of acycloalkyl for substitution includes a cycloalkyl having 5 to 10 carbons. Specific examples include cyclopentyl, cyclohexyl, cycloheptyl, cyclooctyl, cyclononyl, cyclodecyl, bicyclo[1.1.1]pentyl, bicyclo[2.0.1]pentyl, bicyclo[1.2.1]hexyl, bicyclo[3.0.1]hexyl, bicyclo[2.1.2]heptyl], bicyclo[2.2.2]octyl, adamantyl, decahydronaphthalenenyl, decahydroazurenyl, and the like.

Specific examples of tricycloalkylsilyl include tricyclopentylsilyl, tricyclohexylsilyl, and the like.

Specific examples of dialkylcycloalkylsilyl in which two alkyls and one cycloalkyl are substituted and alkyldicycloalkylsilyl in which one alkyl and two cycloalkyls are substituted include silyl in which groups selected from the specific alkyl and cycloalkyl described above are substituted.

Specific examples of dialkylarylsilyl substituted with two alkyls and one aryl, alkyldiarylsilyl substituted with one alkyl and two aryls, and triarylsilyl substituted with three aryls include silyl substituted with groups selected from the specific alkyl and aryl described above. A specific example of the triarylsilyl includes triphenylsilyl.

The two aryls in the diarylamino may be bonded via a single bond or a linking group. Examples of the linking groups include $>Si(-CH_3)_2$, $>C(-CH_3)_2$, >O, and >S.

The first substituent, a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "diarylboryl", a substituted or unsubstituted "alkyl", a substituted or unsubstituted "cycloalkyl", a substituted or unsubstituted "alkoxy", a substituted or unsubstituted "aryloxy", may be substituted with a second substituent as described as "substituted or unsubstituted". Examples of the second substituent include an aryl, a heteroaryl, an alkyl, or a cycloalkyl, and for specific examples thereof, explanations of the monovalent group of an "aryl ring" or a "heteroaryl ring" described above and a description of "alkyl" or "cycloalkyl" as a first substituent may be referred to. In addition, in aryl or heteroaryl as a second substituent, at least one hydrogen in them may be replaced with an aryl such as phenyl (specific examples are those described above) or an alkyl such as methyl (specific examples are those described above). As an example thereof, at least one hydrogen at position 9 of carbazolyl as the second substituent may be replaced with an aryl such as phenyl or an alkyl such as methyl.

Examples of aryl, heteroaryl, aryl of diarylamino, heteroaryl of diheteroarylamino, aryl and heteroaryl of arylheteroarylamino, aryl of diarylboryl, or aryl of aryloxy in $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ in Formula (2) include "aryl" or "heteroaryl" as the first substituent described in Formula (1). For alkyl, cycloalkyl, or alkoxy in $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$. $R^{b21}$, $R^{b22}$, $R^{b23}$, $R^{b24}$, $R^{c11}$, $R^{c12}$, $R^{c31}$, $R^{c32}$, $R^{c33}$, $R^{c34}$, the description of "alkyl", "cycloalkyl", or "alkoxy" as the first substituent in the description of the above Formula (1) can be referred to. Further, the same applies also to aryl, heteroaryl, alkyl or cycloalkyl as a substituent to the above groups. The same also applies to heteroaryl, diarylamino, diheteroarylamino, arylheteroarylamino, alkyl, cycloalkyl, alkoxy, or aryloxy, and further substituents, aryl, heteroaryl, or alkyl, as a substituent to an aryl ring or a heteroaryl ring, when any of the adjacent groups of $R^{a11}$, $R^{a12}$, $R^{a13}$ are bonded to form the aryl ring or the heteroaryl ring together with $a^{11}$ ring, any of the adjacent groups of $R^{a21}$, $R^{a22}$, $R^{a23}$ are bonded to form an aryl or heteroaryl ring together with $a^{21}$ ring, any of the adjacent groups are bonded to form the aryl ring or the heteroaryl ring together with $a^{31}$ ring, any of the adjacent groups of $R^{a31}$, $R^{a32}$, $R^{a33}$ are bonded to form the aryl ring or the heteroaryl ring together with $b^{21}$ ring, and/or any of the adjacent groups of $R^{c31}$, $R^{c32}$, $R^{c33}$, $R^{c34}$ are bonded to form the aryl ring or the heteroaryl ring together with $c^{31}$ ring.

The emission wavelengths can be adjusted by the steric hindrance, electron donating property, and electron withdrawing property of $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ (first substituent). It is preferably a group represented by any of the following substituent group X as $R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, and $R^{c34}$, and more preferably, methyl, t-butyl, bicyclooctyl, bicyclohexyl, 1-adamantyl, phenyl, o-tolyl, p-tolyl, 2,4-xylyl, 2,5-xylyl, 2,6-xylyl, mesityl(2,4,6-trimethylphenyl), diphenylamino, di-p-tolylamino, bis (p-(t-butyl)phenyl)amino, diphenylboryl, dimesitylboryl, dibenzoxabolinyl, phenyldibenzodiborynyl, carbazolyl, 3,6-dimethylcarbazolyl, 3,6-di-t-butylcarbazolyl and phenoxy, and more preferably, methyl, t-butyl, 1-adamantyl, phenyl, o-tolyl, 2,6-xylyl, mesityl, diphenylamino, di-p-tolylamino, bis(p-(t-butyl)phenyl)amino, carbazolyl, 3,6-dimethylcarbazolyl, and 3,6-di-t-butyl carbazolyl. From the viewpoint of ease of synthesis, a larger steric hindrance is preferred for selective synthesis, and specifically, t-butyl, 1-adamanthyl, o-tolyl, 2,6-xylyl, mesityl, 3,6-dimethylcarbazolyl, and 3,6-di-t-butylcarbazolyl are preferred.

(Substituent Group X)

In the formulas, Me represents methyl, tBu represents t-butyl, tAm represents t-amyl (1-methyl-2-butyl), tOct represents tertiary octyl, and a wavy line represent a binding position.

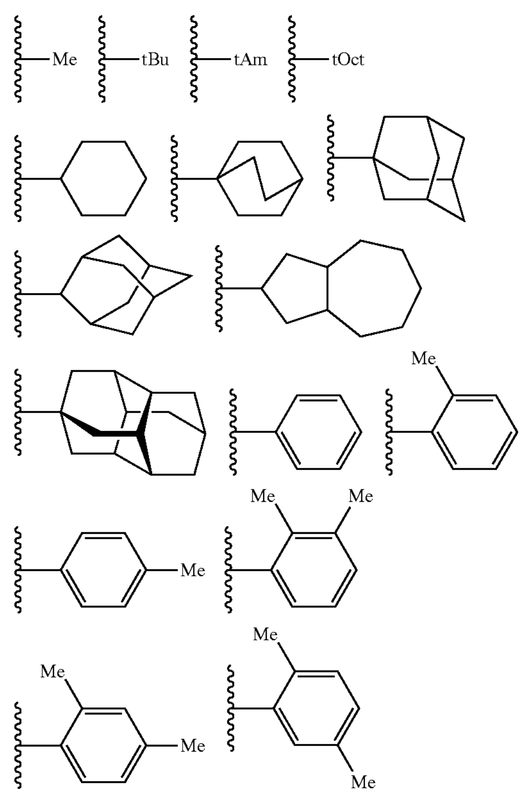

-continued

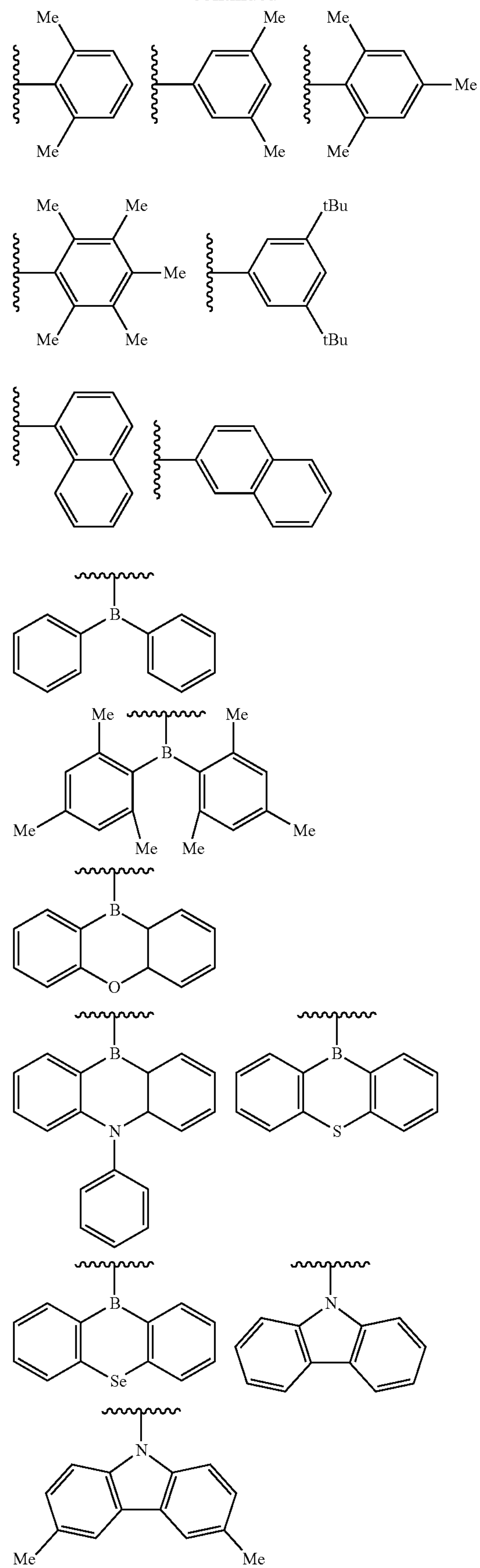

-continued
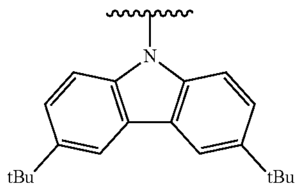
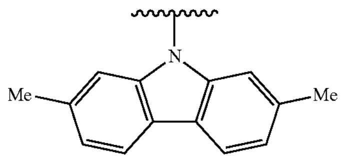
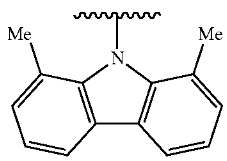
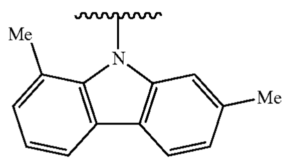
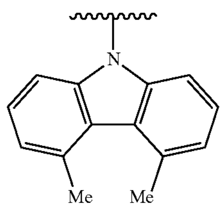
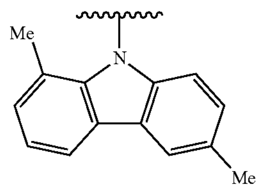
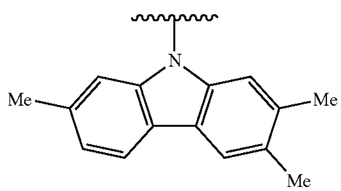
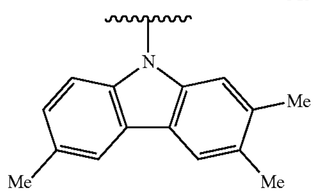
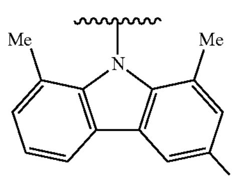
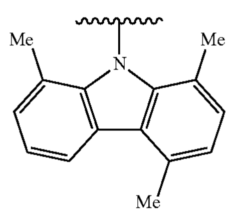
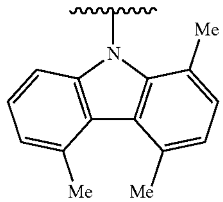
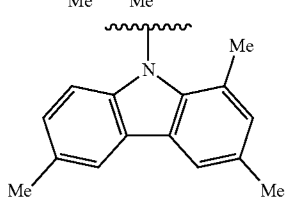
-continued
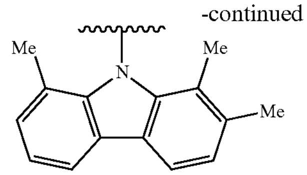
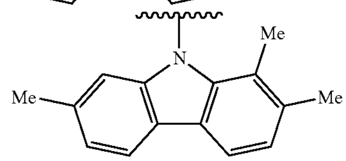
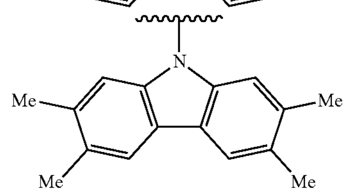
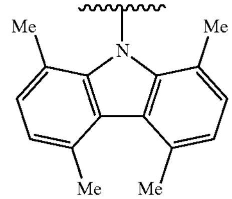
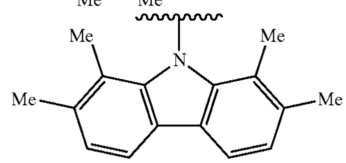
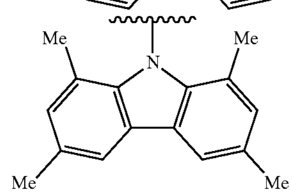
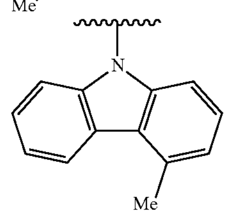
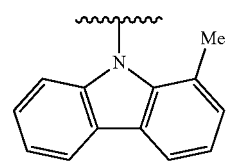
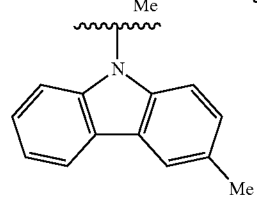
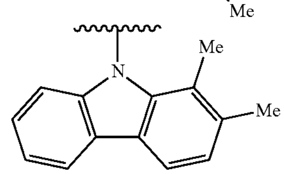
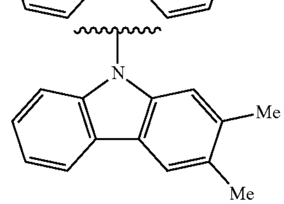

-continued
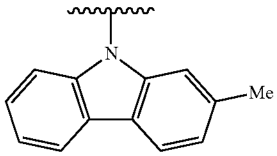
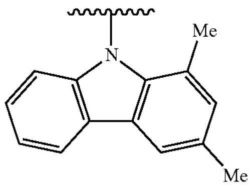
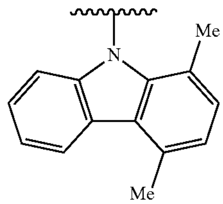
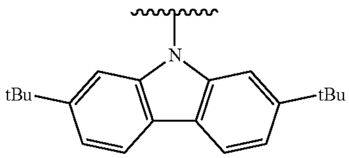
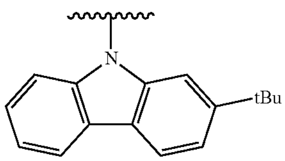
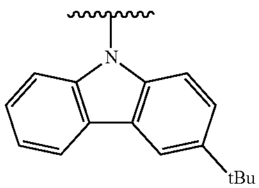
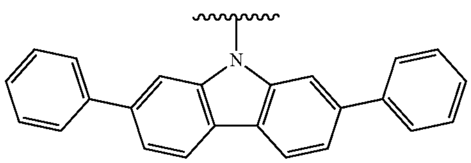
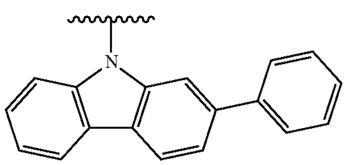
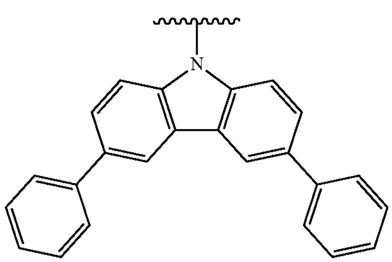
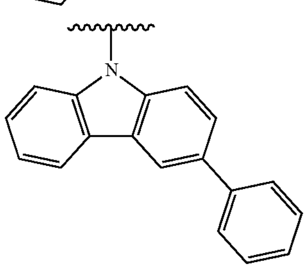
-continued
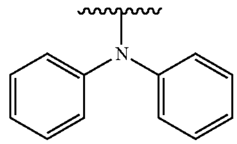
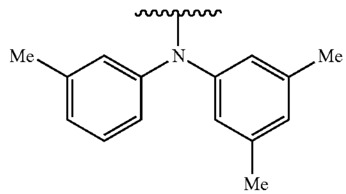
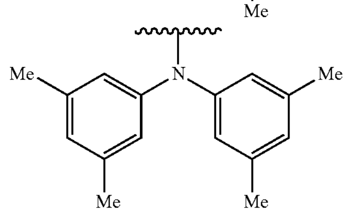
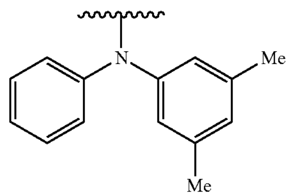
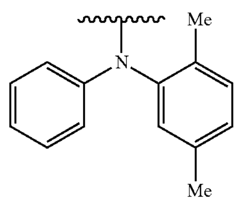
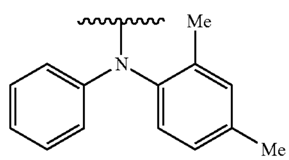
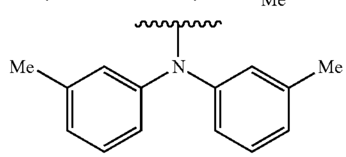
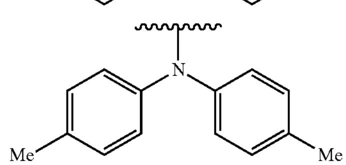
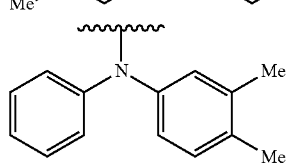
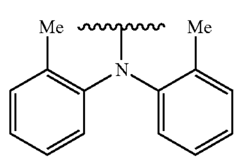
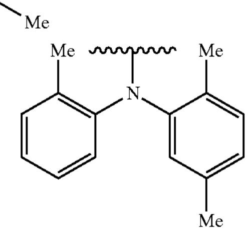

-continued
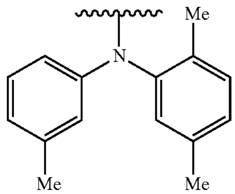
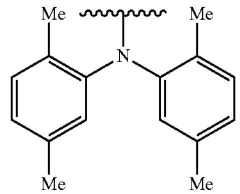
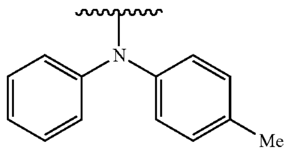
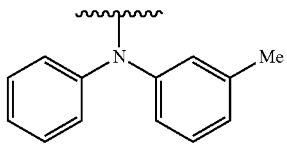
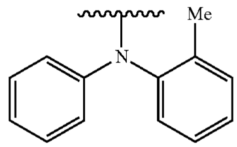
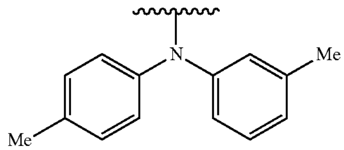
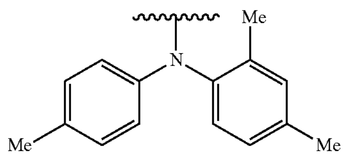
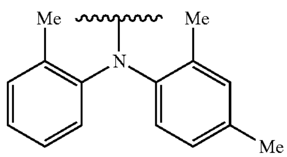
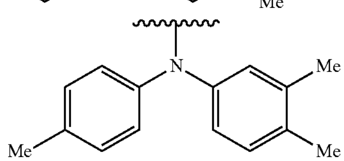
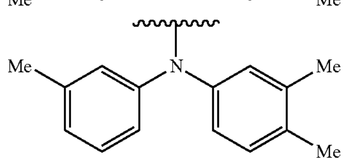
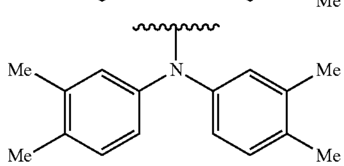
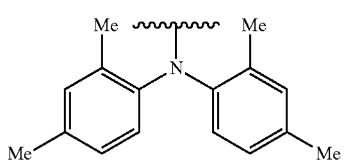
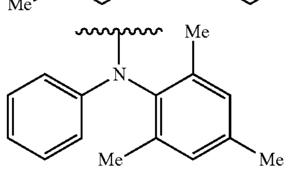
-continued
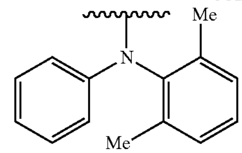
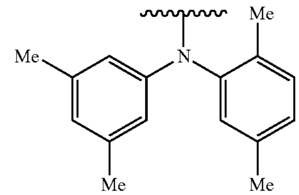
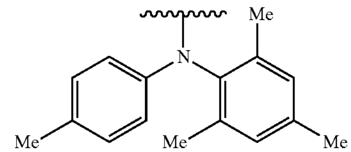
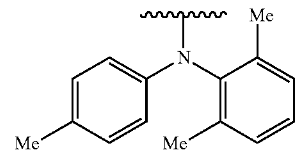
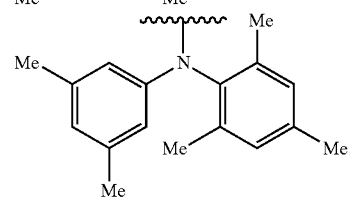
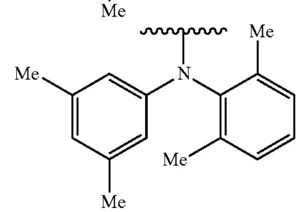
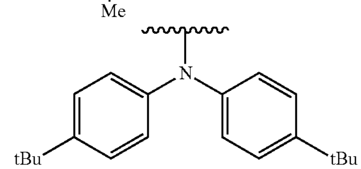
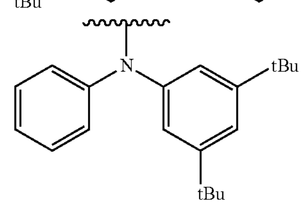
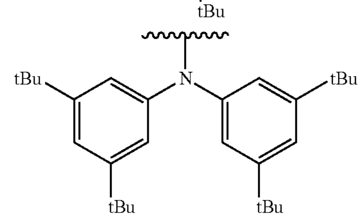
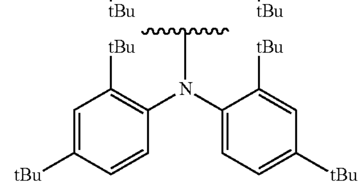

-continued

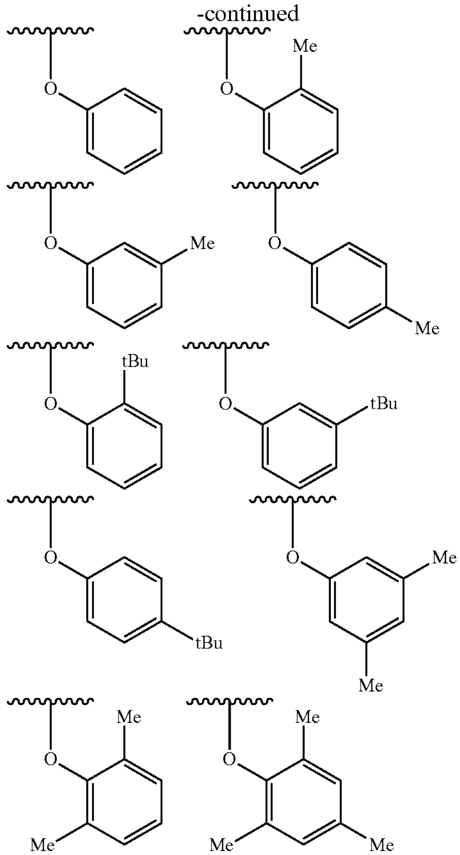

R in Si—R and Ge—R in $Y^{11}$, $Y^{21}$, $Y^{31}$ in Formula (1) is an aryl or an alkyl, and examples of such aryl or alkyl include those described above. Particularly preferred are an aryl having 6 to 10 carbons (e.g., phenyl, naphthyl, etc), an alkyl having 1 to 4 carbons (e.g., methyl, ethyl, etc.) Preferred examples of R include cyclohexyl, 1-adamanthyl, phenyl, o-tolyl, p-tolyl, 2,4-xylyl, 2,5-xylyl, 2,6-xylyl, 2,4,6-mesityl, diphenylamino, di-p-tolylamino, bis(p-(t-butyl)phenyl)amino, diphenylboryl, dimesitylboryl, dibenzoxaborinyl, phenyldibenzodiborinyl, carbazolyl, 3,6-dimethylcarbazolyl, 3,6-di-t-butylcarbazolyl and phenoxy. The same explanation applies to $Y^{11}$, $Y^{21}$, $Y^{31}$ in Formula (2).

$X^{11}$, $X^{12}$, $X^{21}$, $X^{22}$, $X^{31}$, $X^{32}$ in Formula (1) are each independently >O, >N—R, >C(—R)$_2$, >S or >Se, preferably >O or >N—R.

R in the above N—R in $X^{11}$, $X^{12}$, $X^{21}$, $X^{22}$, $X^{31}$, $X^{32}$ in Formula (1) is an aryl which may be substituted, a heteroaryl which may be substituted, an alkyl which may be substituted, or a cycloalkyl which may be substituted. Examples of the and, heteroaryl, alkyl, or cycloalkyl include those described above, and examples of the substituent in "which may be substituted" include the above-described second substituent. Particularly preferred are an aryl having 6 to 10 carbons (e.g., phenyl, naphthyl, etc.) which may be substituted with a substituent, a heteroaryl having 2 to 15 carbons (e.g., carbazolyl, etc.) which may be substituted with a substituent, an alkyl having 1 to 4 carbons (e.g., methyl, ethyl, etc.) which may be substituted with a substituent, a cycloalkyl having 5 to 10 carbons (e.g., cyclohexyl, bicyclooctyl, 1-adamantyl, etc.) which may be substituted with a substituent. Preferred examples of R include cyclohexyl, 1-adamanthyl, phenyl, o-tolyl, p-tolyl, 2,4-xylyl, 2,5-xylyl, 2,6-xylyl, mesityl, diphenylamino, di-p-tolylamino, bis(p-(t-butyl)phenyl)amino, diphenylboryl, dimesitylboryl, dibenzoxaborinyl, phenyldibenzodiborinyl, carbazolyl, 3,6-dimethylcarbazolyl, 3,6-di-t-butylcarbazolyl and phenoxy. The same explanation applies to $X^{11}$, $X^{12}$, $X^{21}$, $X^{22}$, $X^{31}$, $X^{32}$ in Formula (2).

R in N—R may be bonded to $A^{11}$ ring, $A^{21}$ ring, $A^{31}$ ring, $B^{11}$ ring, $B^{21}$ ring, $C^{11}$ ring, or $C^{31}$ ring by a linking group or a single bond, and as the linking group, —O—, —S—, or —C(—R)$_2$— is preferable. It is preferable that R in the linking group "—C(—R)$_2$—" in Formula (1) is hydrogen or an alkyl, and examples of the alkyl include those described above. An alkyl having 1 to 4 carbons (for example, methyl, ethyl or the like) is particularly preferred. The same explanation applies to the linking group "—C(—R)$_2$—" in Formula (2).

In addition, all or a part of hydrogens in the chemical structure of the polycyclic aromatic compound represented by Formula (1) or (2) may be deuterium.

In addition, all or a part of hydrogens in the chemical structure of the polycyclic aromatic compound represented by Formula (1) or (2) may be halogens. For example, in Formula (1), the hydrogen in $A^{11}$ ring, $A^{21}$ ring, $A^{31}$ ring, $B^{11}$ ring, $B^{21}$ ring, $C^{11}$ ring, or $C^{31}$ ring (aryl ring or heteroaryl ring), substituents to $A^{11}$ ring, $A^{21}$ ring, $A^{31}$ ring, $B^{11}$ ring, $B^{21}$ ring, $C^{11}$ ring, or $C^{31}$ ring, R (=alkyl, aryl) when $Y^{11}$, $Y^{21}$, $Y^{31}$ is Si—R or Ge—R, and R (=alkyl, aryl) when $X^{11}$, $X^{12}$, $X^{21}$, $X^{22}$, $X^{31}$, $X^{32}$ is N—R may be replaced with a halogen, of which all or part of the hydrogens in the aryl or the heteroaryl are replaced with halogens. The halogen includes fluorine, chlorine, bromine and iodine, and is preferably fluorine, chlorine or bromine, more preferably fluorine. Examples thereof include an aryl substituted with fluorine (2,6-difluorophenyl, and the like) and trifluoromethyl.

Further, the polycyclic aromatic compound according to the present invention can be used as a material for an organic device. Examples of the organic device include an organic electroluminescent element, an organic field effect transistor, and an organic thin film solar cell. In particular, in an organic electroluminescent element, a compound having each $Y^{11}$, $Y^{21}$, $Y^{31}$ as B and each $X^{11}$, $X^{12}$, $X^{21}$, $X^{22}$, $X^{31}$, $X^{32}$ as N—R, a compound having each $Y^{11}$, $Y^{21}$, $Y^{31}$ as B, each $X^{11}$, $X^{21}$, $X^{31}$ as O, and each $X^{12}$, $X^{22}$, $X^{32}$ as N—R, a compound having each $Y^{11}$, $Y^{21}$, $Y^{31}$ as B and each $X^{11}$, $X^{12}$, $X^{21}$, $X^{22}$, $X^{31}$, $X^{32}$ as O are preferable as a dopant material in the light-emitting layer, a compound having each $Y^{11}$, $Y^{21}$, $Y^{31}$ as B, each $X^{11}$, $X^{21}$, $X^{31}$ as O, each $X^{12}$, $X^{22}$, $X^{32}$ as N—R, a compound having each $Y^{11}$, $Y^{21}$, $Y^{31}$ as B and each $X^{11}$, $X^{12}$, $X^{21}$, $X^{22}$, $X^{31}$, $X^{32}$ as O is preferable as a host material in the light-emitting layer, a compound having each $Y^{11}$, $Y^{21}$, $Y^{31}$ as B and each $X^{11}$, $X^{12}$, $X^{21}$, $X^{22}$, $X^{31}$, $X^{32}$ as O, a compound having each $Y^{11}$, $Y^{21}$, $Y^{31}$ as P═O and each $X^{11}$, $X^{12}$, $X^{21}$, $X^{22}$, $X^{31}$, $X^{32}$ as O is preferable as an electron-transporting material.

Further, the polycyclic aromatic compound of the present invention, at least one of $A^{11}$ ring, $A^{21}$ ring, $A^{31}$ ring, $B^{11}$ ring, $B^{21}$ ring, $C^{11}$ ring, and $C^{31}$ ring ($a^{11}$ ring, $a^{31}$ ring, $b^{21}$ ring, $c^{11}$ ring, $c^{31}$ ring) by introducing phenyloxy group, carbazolyl or diphenylamino to the para-position to $Y^{11}$, $Y^{21}$, $Y^{31}$, T1 energy improvement (approximately 0.01 to 0.1 eV improvement) can be expected. In particular, when each of $Y^{11}$, $Y^{21}$, $Y^{31}$ is B (boron) and each of $X^{11}$, $X^{12}$, $X^{21}$, $X^{22}$, $X^{31}$, $X^{32}$ is O or N—R (R is as described above), by introducing a phenyloxy group in the para position with respect to B (boron), HOMO on the benzene ring, which is $A^{11}$ ring, $A^{21}$ ring, $A^{31}$ ring, $B^{21}$ ring, $C^{11}$ ring, and $C^{31}$ ring ($a^{11}$ ring, $a^{21}$ ring, $a^{31}$ ring, $b^{11}$ ring, $b^{21}$ ring, $B^{11}$ ring, and $c^{31}$ ring), is more localized in the meta position with respect to boron, and LUMO is localized in the ortho and para positions with respect to boron, therefore, the improvement in T1 energies can be particularly expected.

Next, a specific structure will be described. In the following formula, Me represents methyl, Mes represents mesityl(2,4,6-trimethylphenyl), tBu represents t-butyl, respectively, O-Xyl represents 2,6-dimethyl phenyl (xylyl), tAm represents t-amyl (1-methyl-2-butyl), Ph represents phenyl, and D represents deuterium.

(1-1-1)

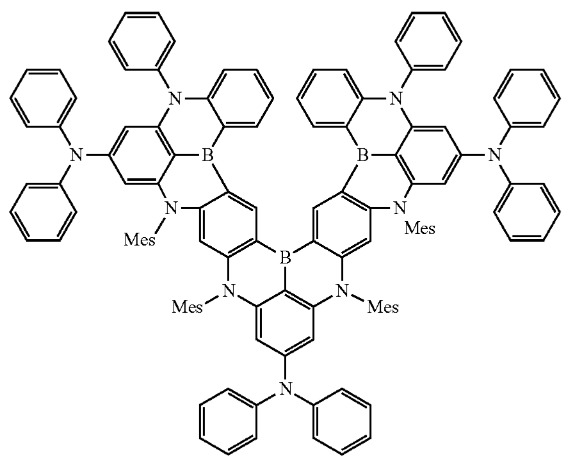

(1-1-2)

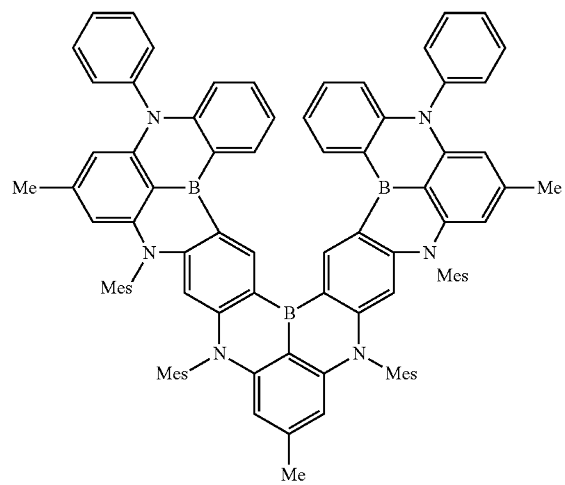

(1-1-3)

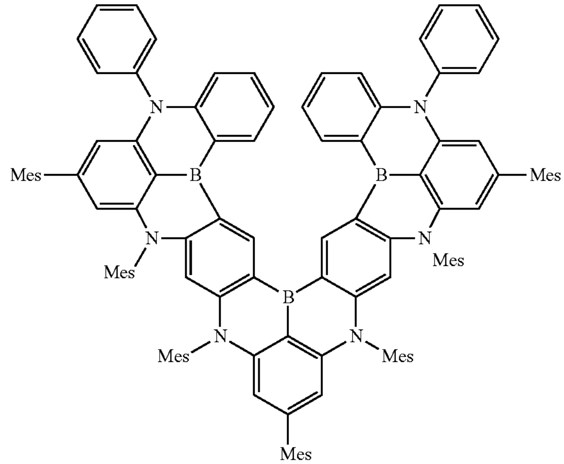

-continued
(1-1-4)
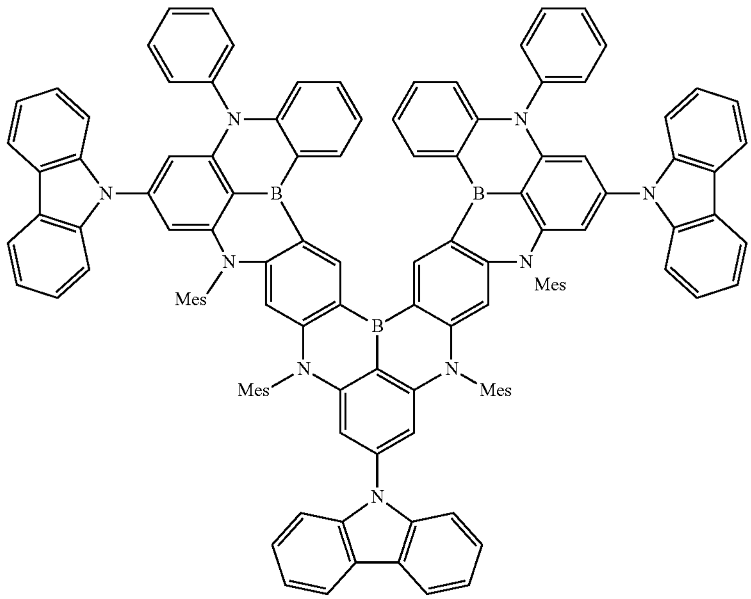
(1-1-5)
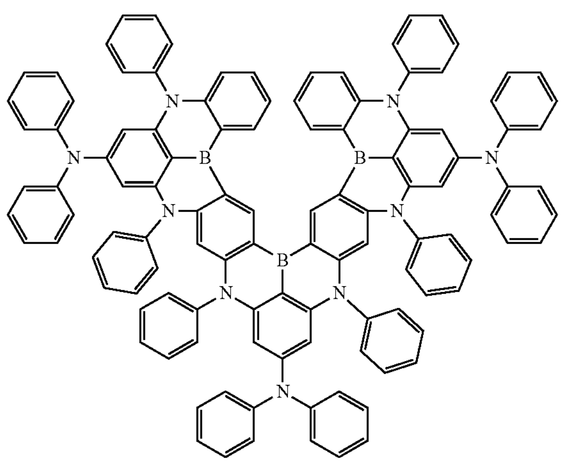
(1-1-6)
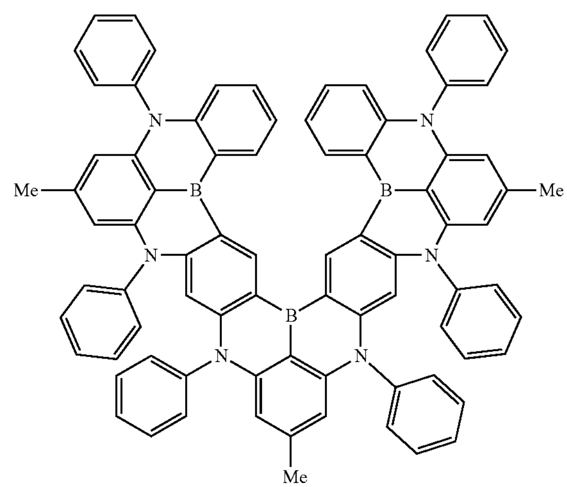
(1-1-7)
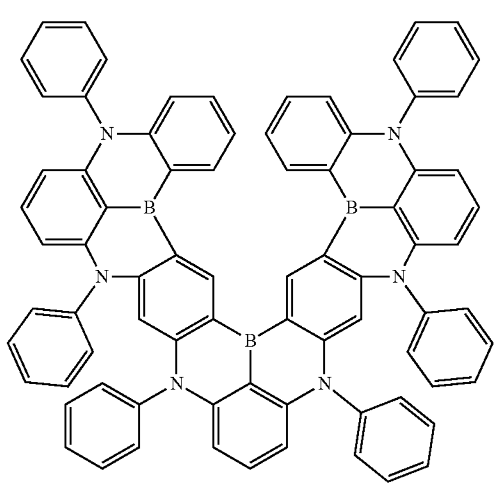
(1-1-8)
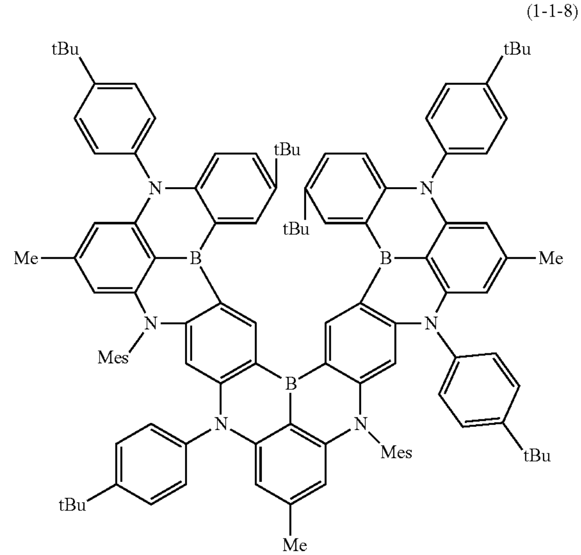

-continued
(1-1-9)
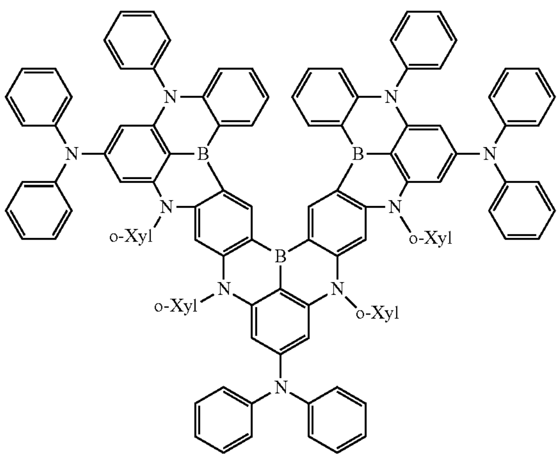
(1-1-10)
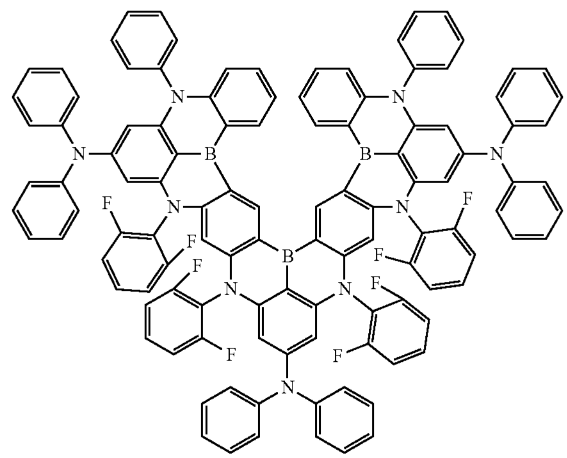
(1-1-21)
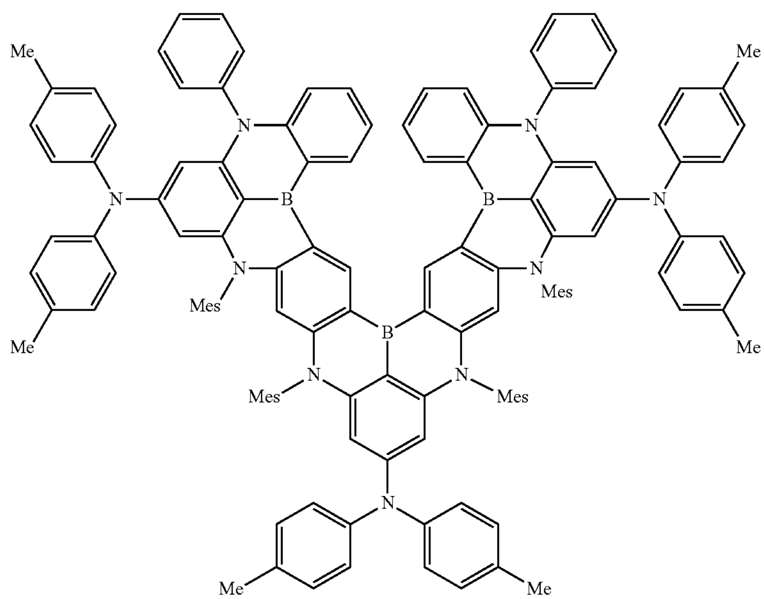
(1-1-22)
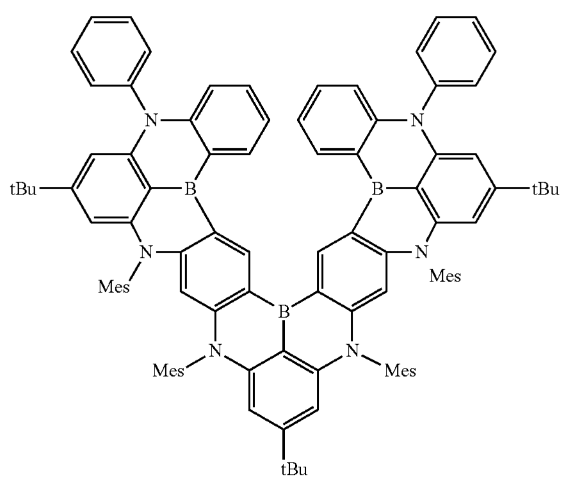
(1-1-23)
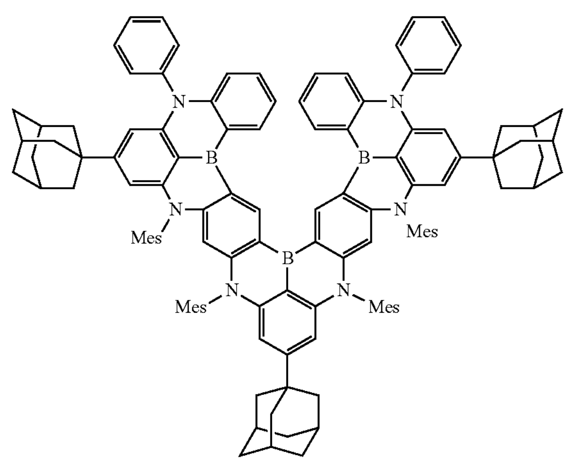

-continued
(1-1-24)
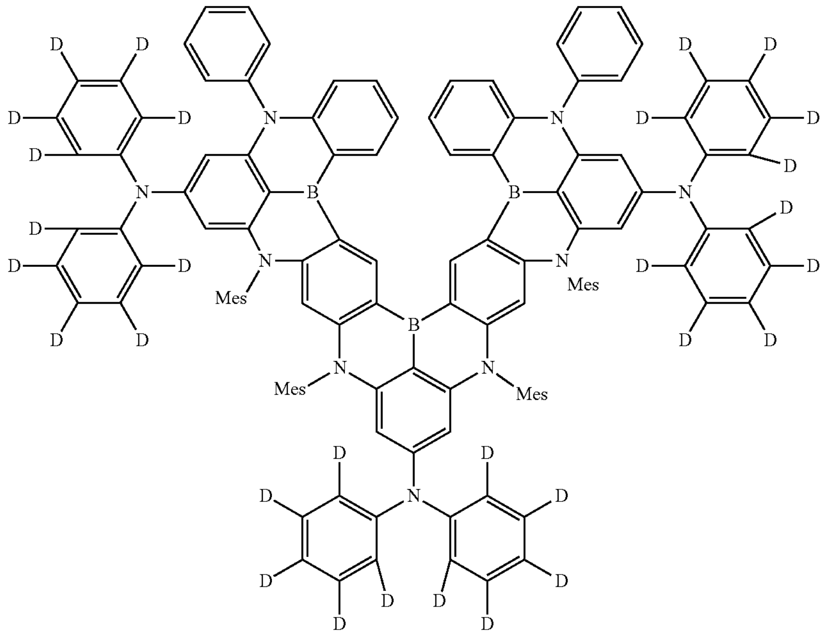
(1-1-25)
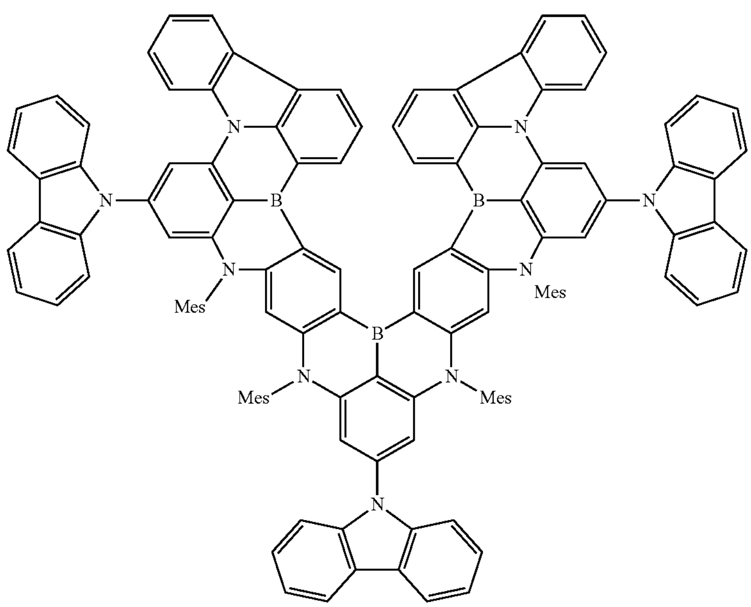

-continued
(1-1-26)
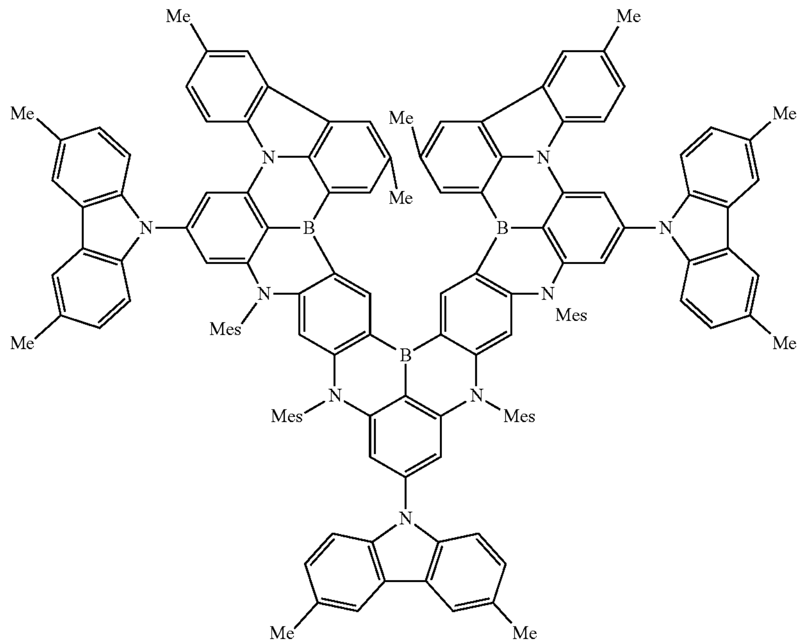
(1-1-27)
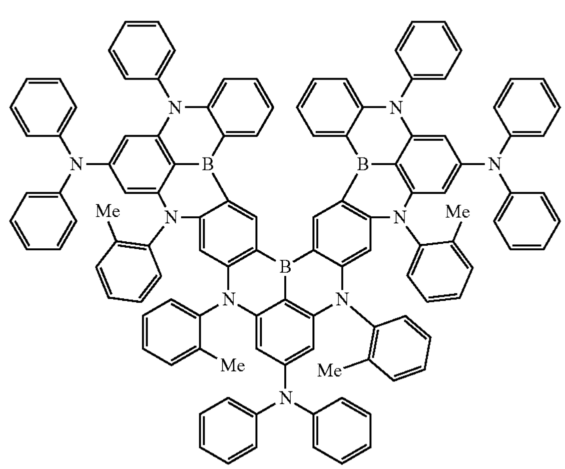
(1-1-28)
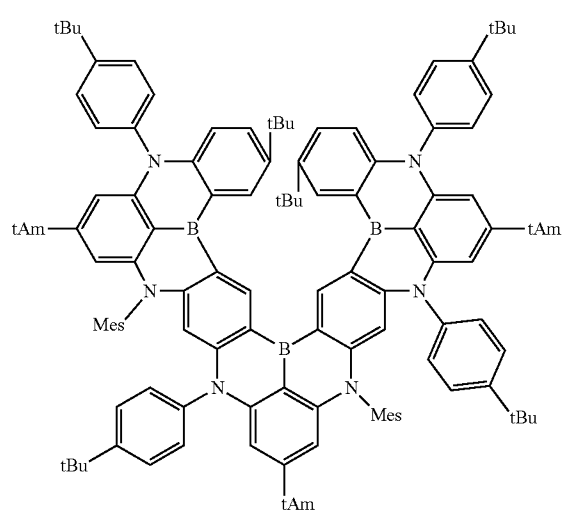

-continued
(1-1-29)
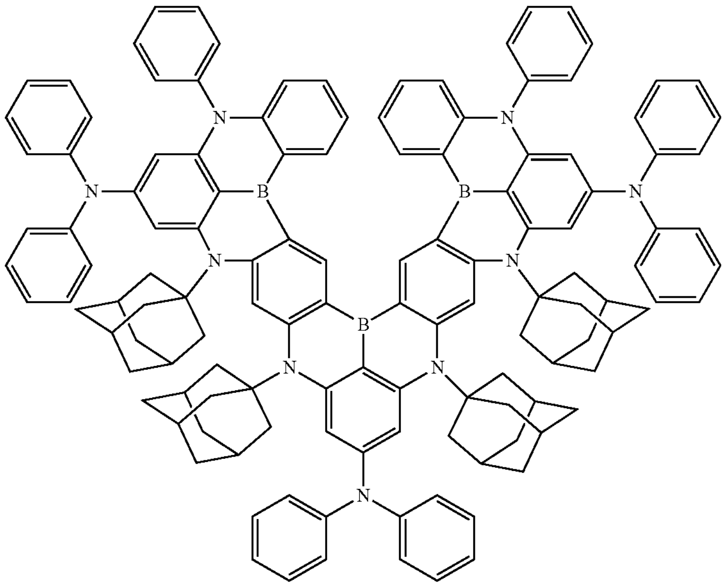
(1-1-30)
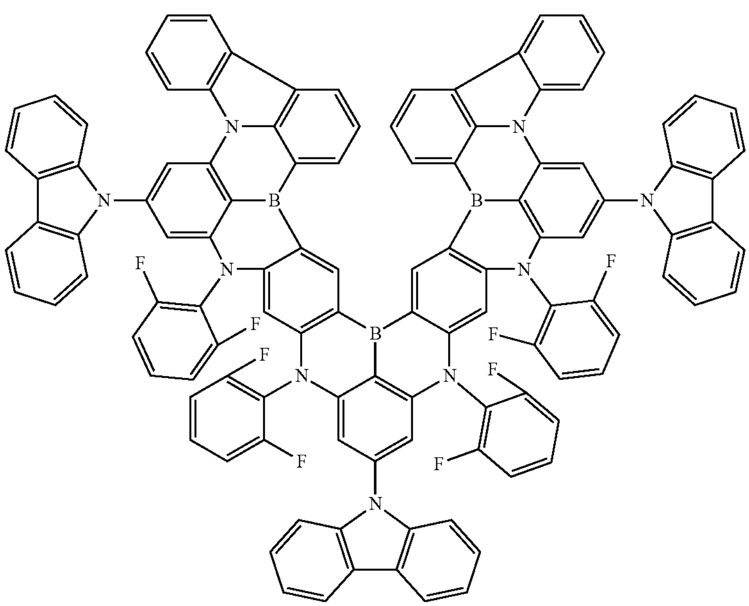

-continued
(1-1-41)
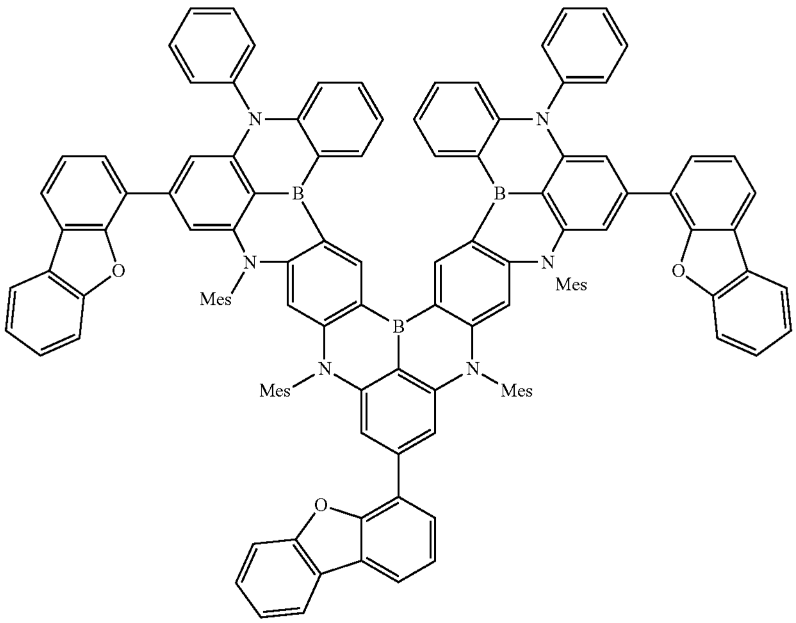
(1-1-42)
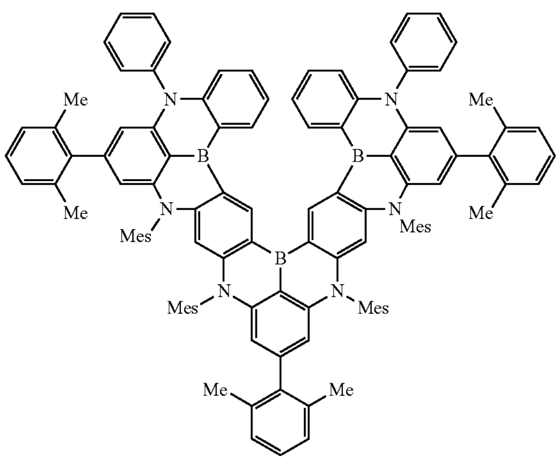
(1-1-43)
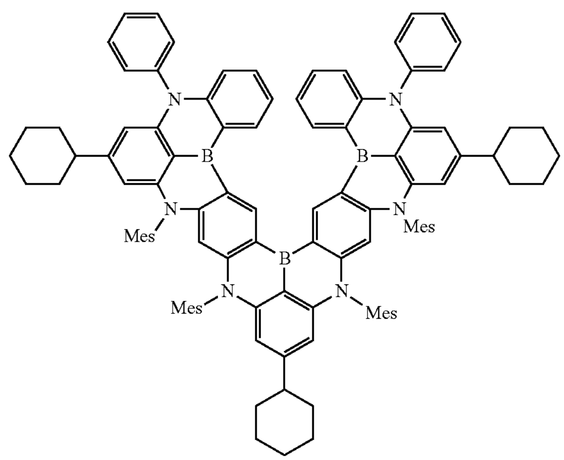
(1-1-44)
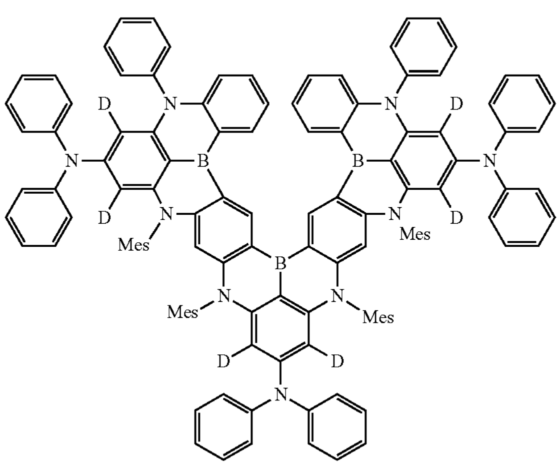
(1-1-45)
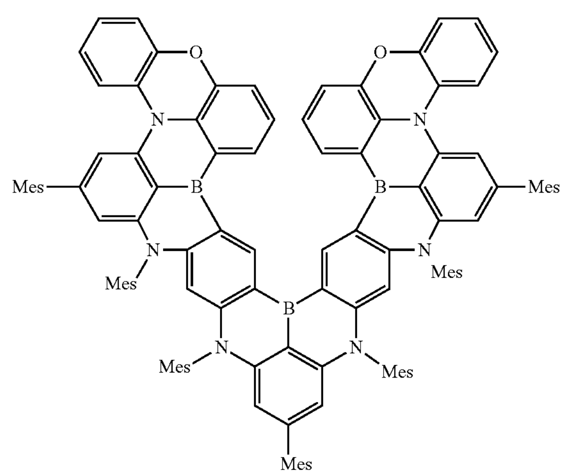

-continued
(1-1-46)
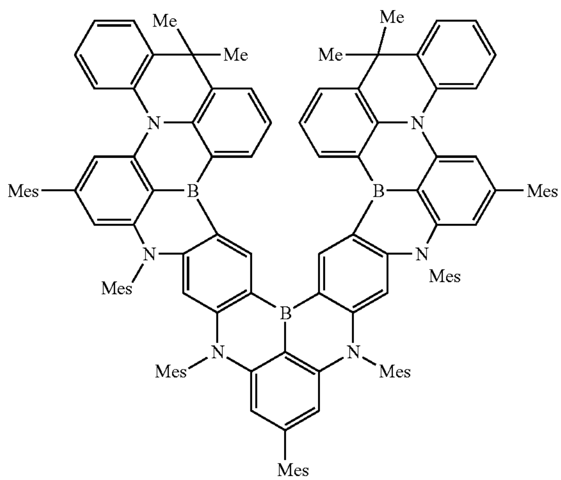
(1-1-47)
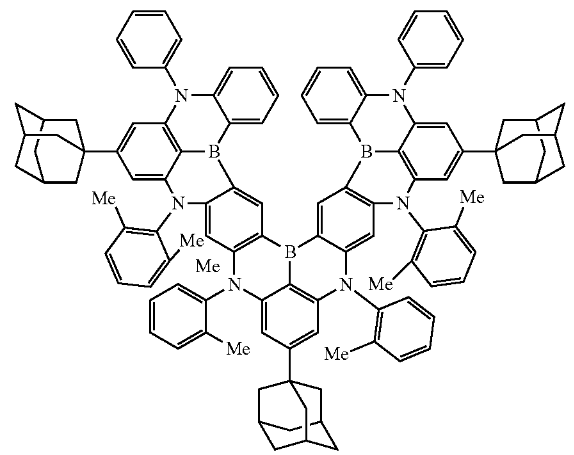
(1-1-48)
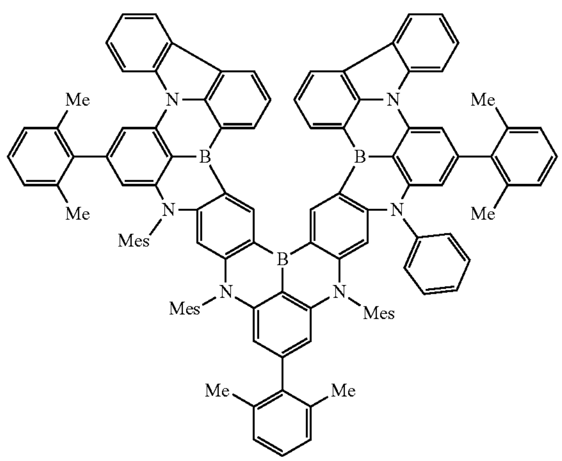
(1-1-49)
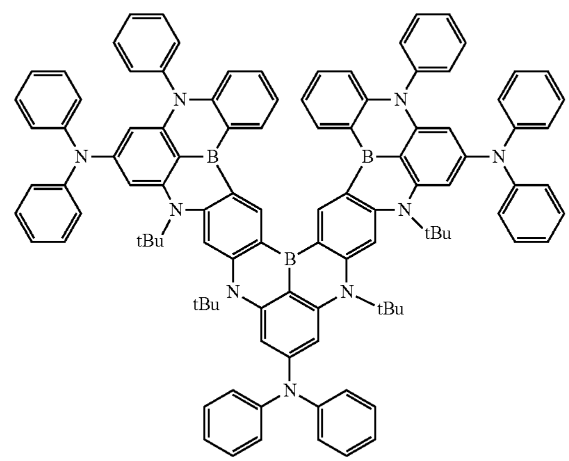
(1-1-50)
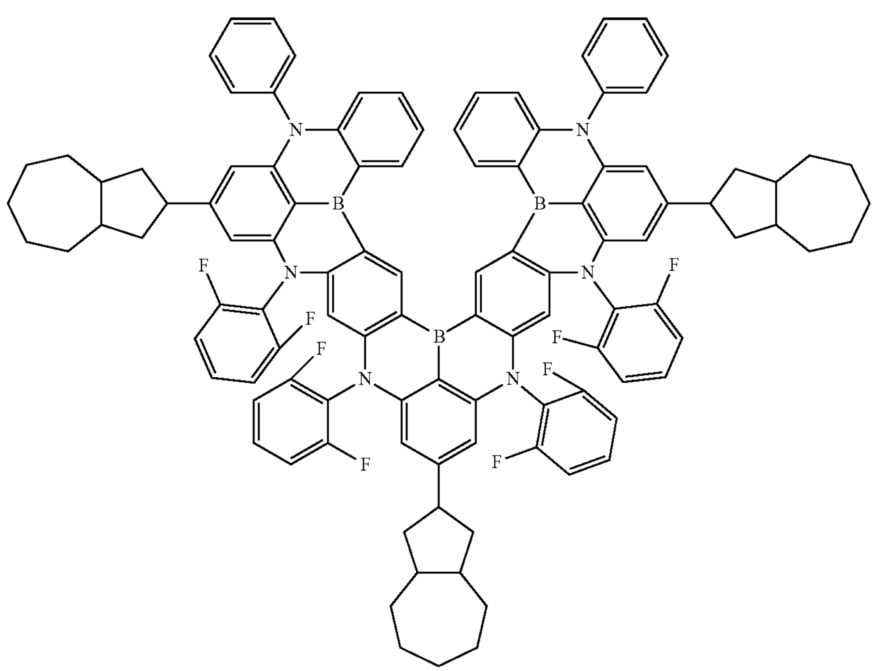

-continued
(1-1-61)
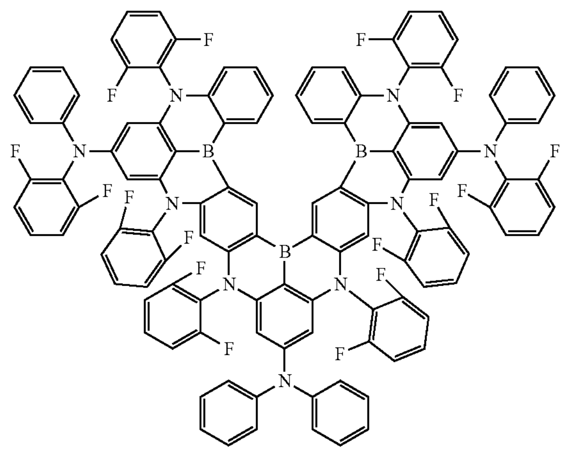
(1-1-62)
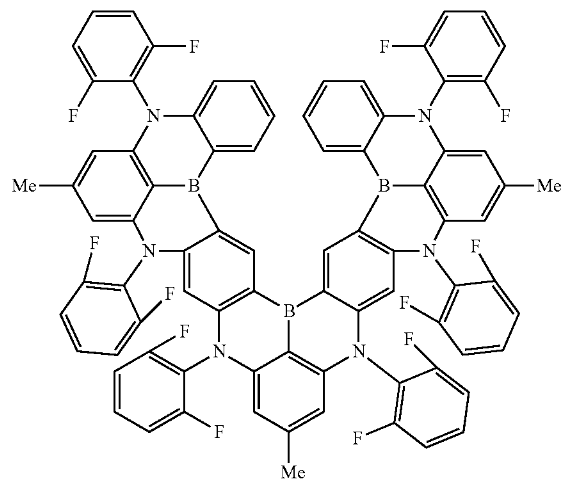
(1-1-63)
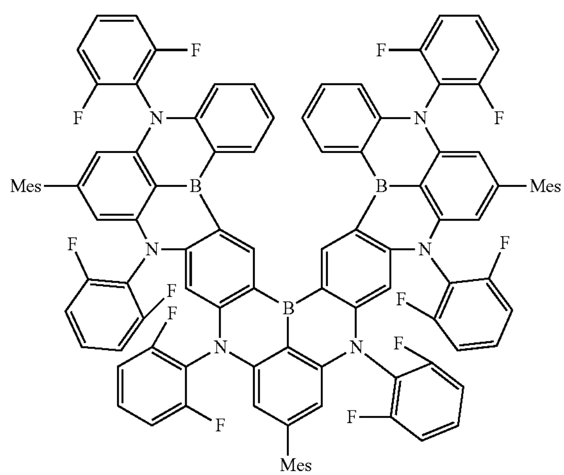
(1-1-64)
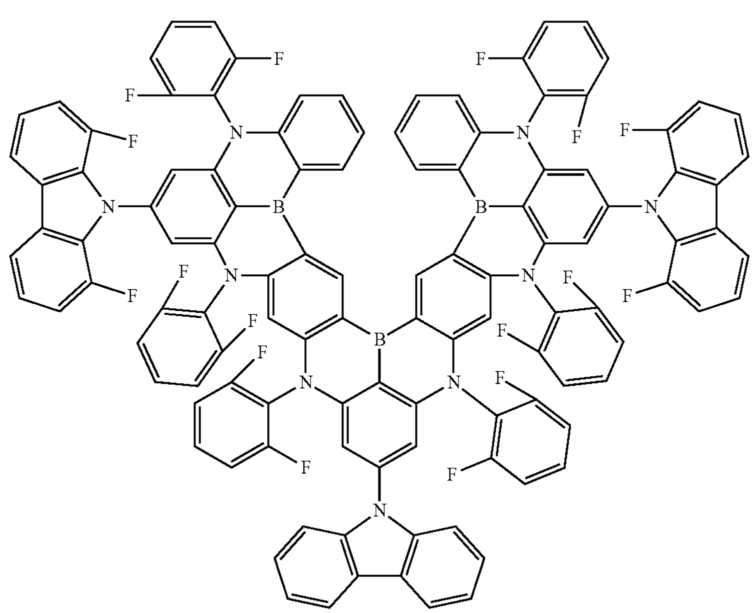

-continued
(1-1-65)
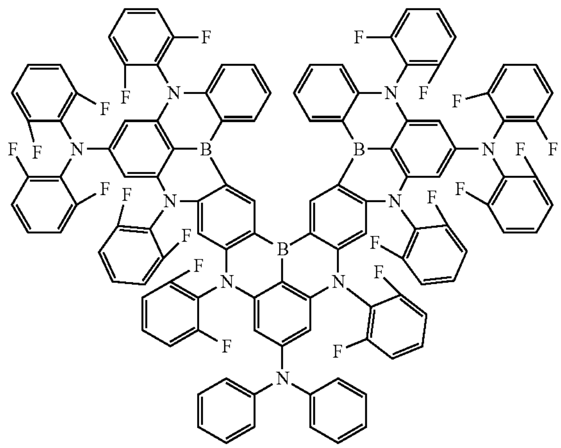
(1-1-66)
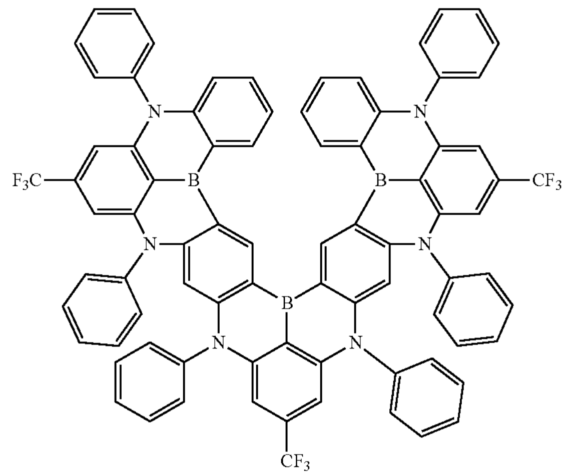
(1-1-67)
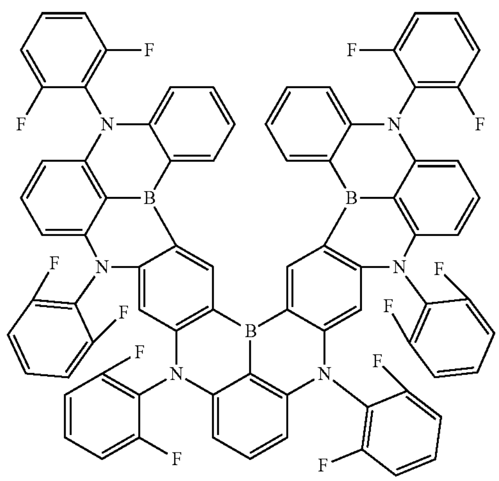
(1-1-68)
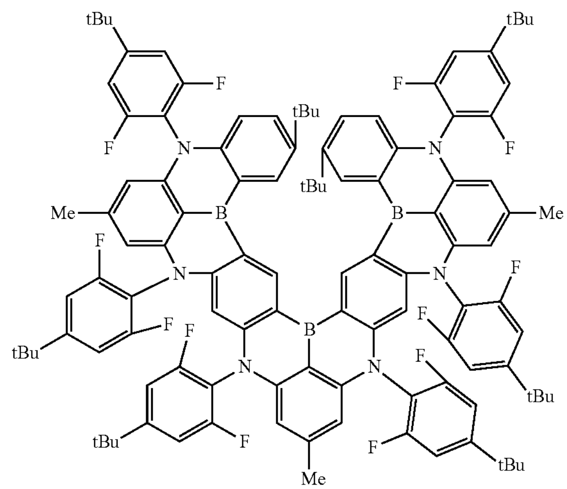
(1-1-69)
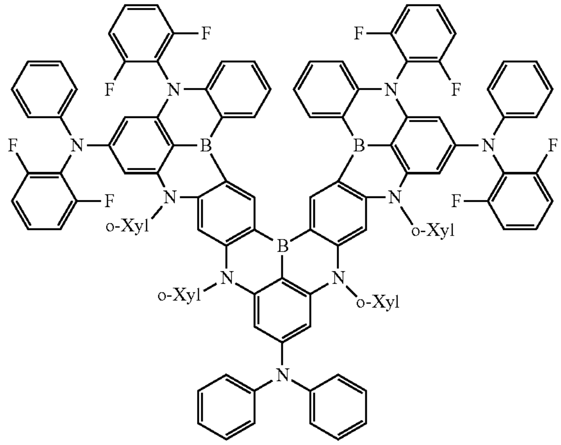

-continued
(1-1-70)
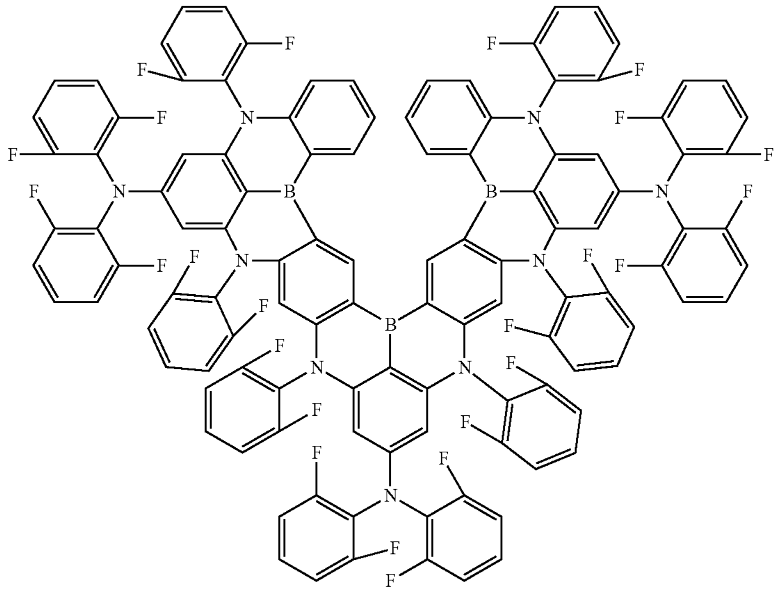
(1-1-101)
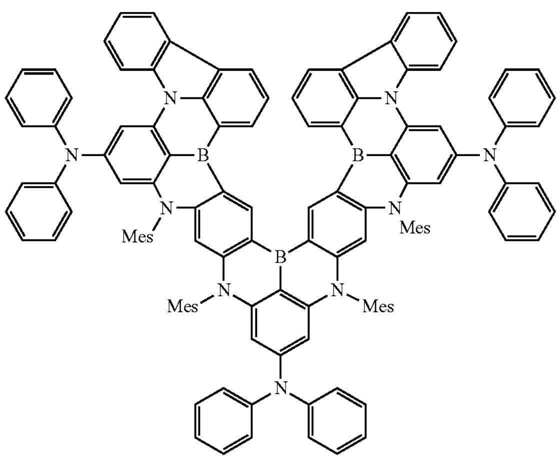
(1-1-102)
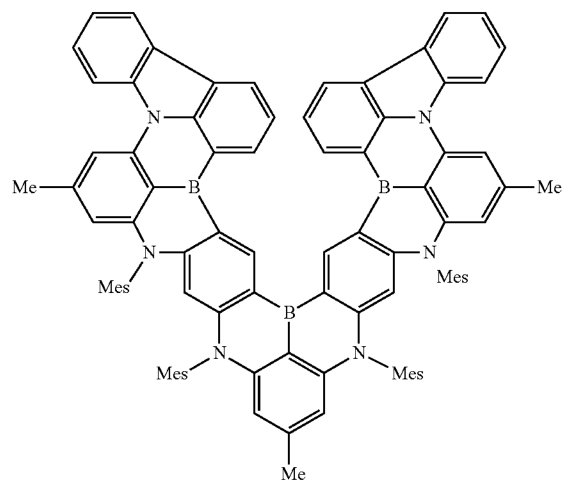
(1-1-103)
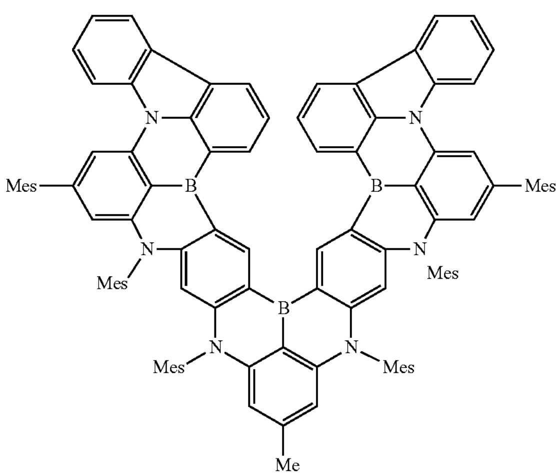
(1-1-104)
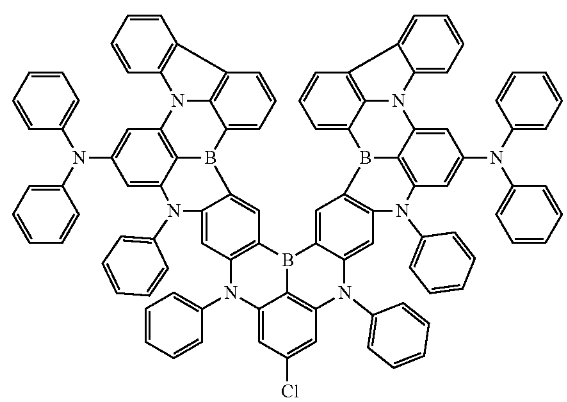

-continued
(1-1-105)
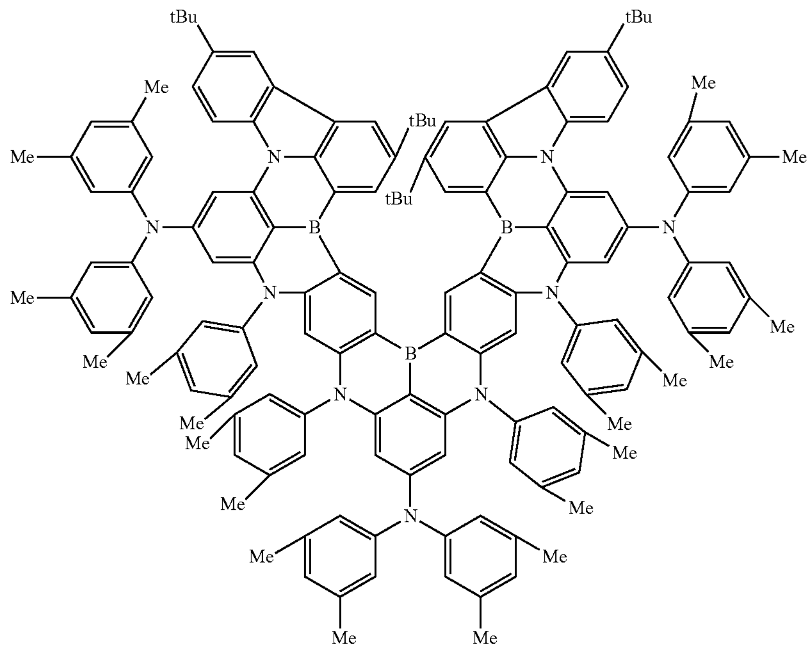
(1-1-106)
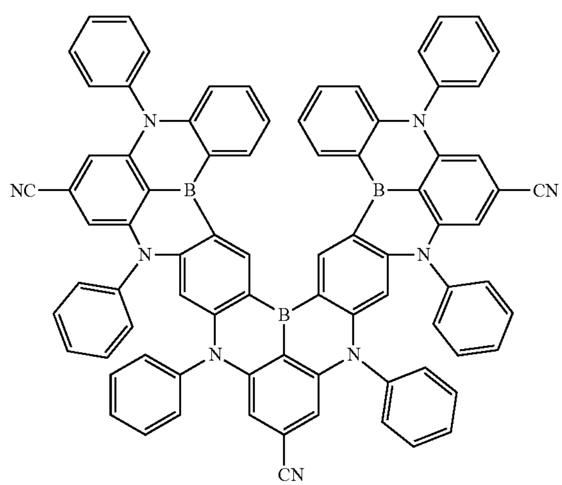
(1-1-107)
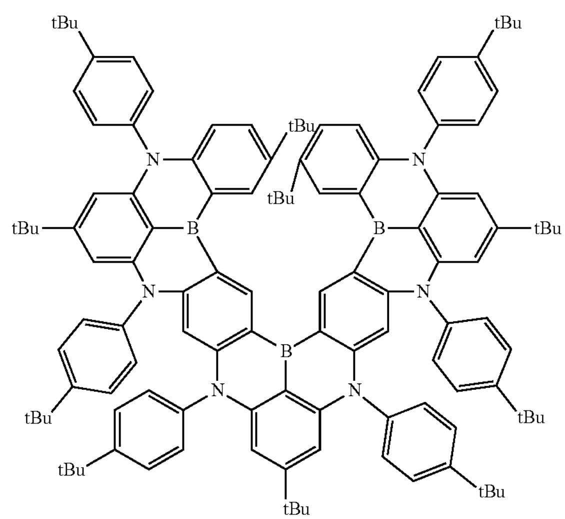

-continued
(1-1-108)
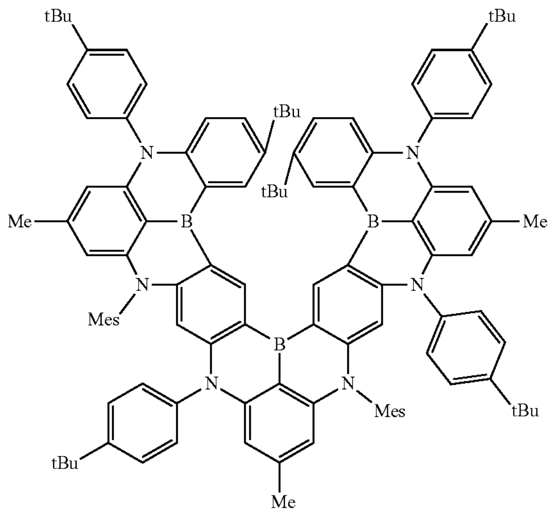
(1-1-109)
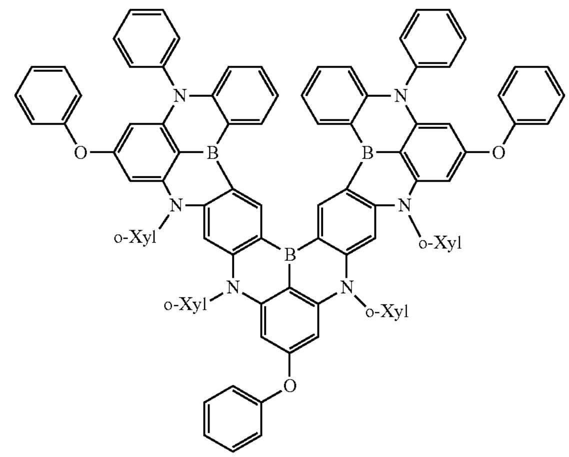
(1-1-110)
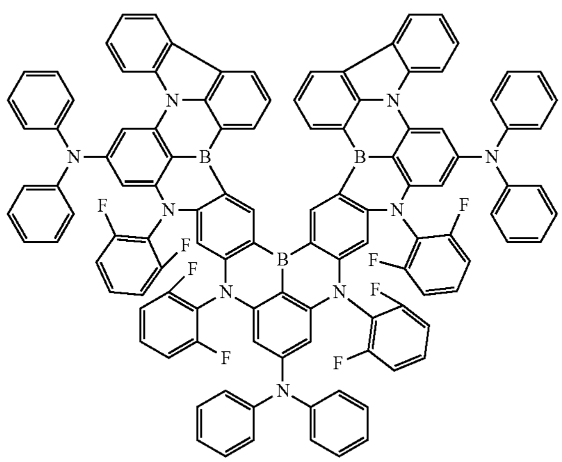
(1-1-121)
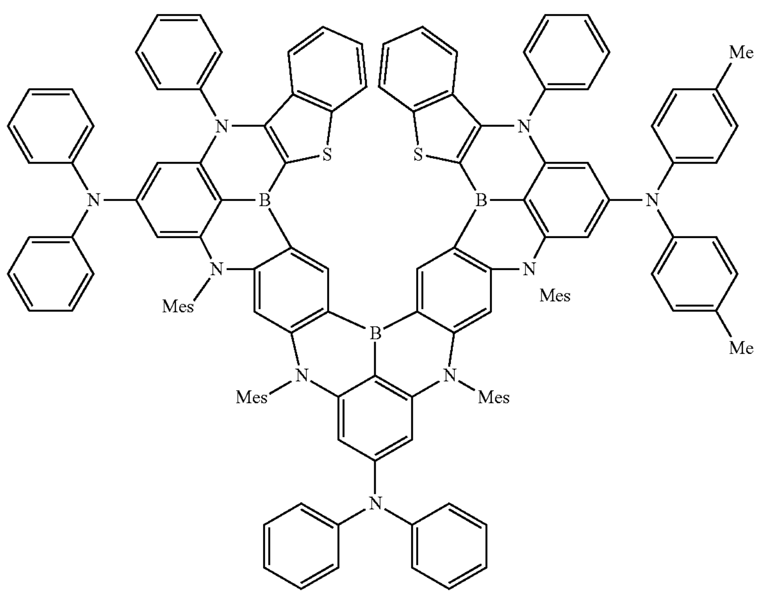

-continued
(1-1-122)
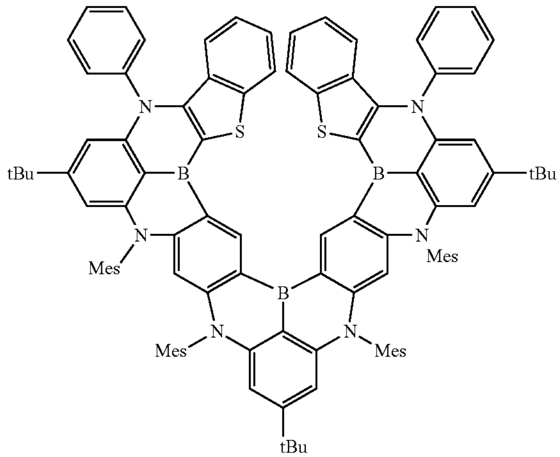
(1-1-123)
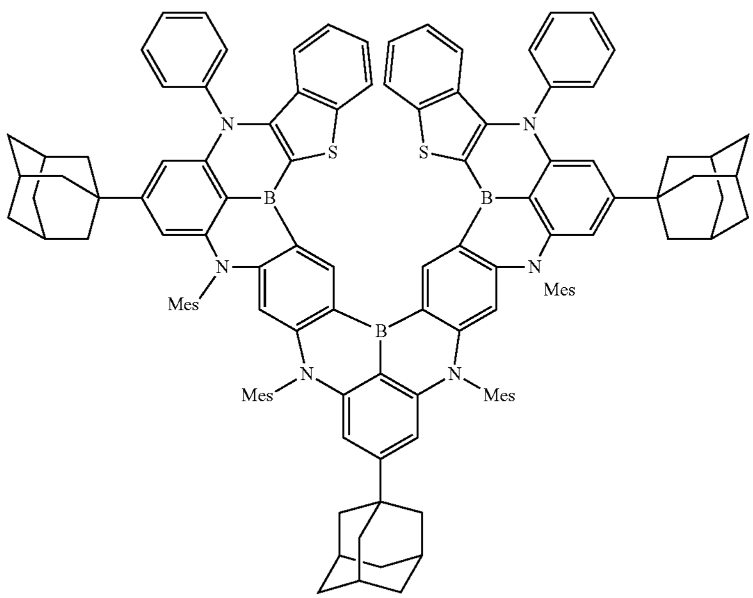
(1-1-124)
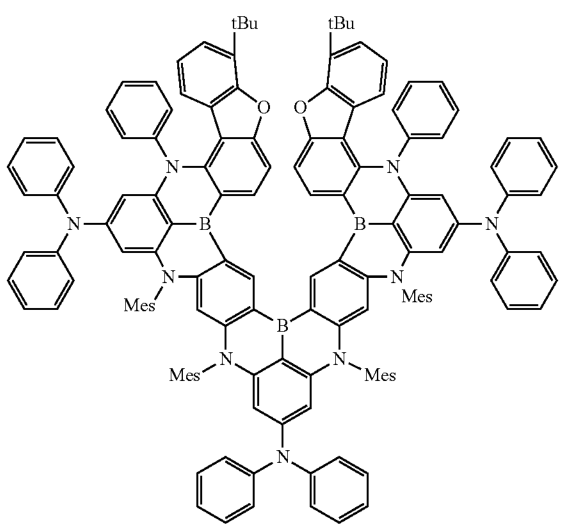
(1-1-125)
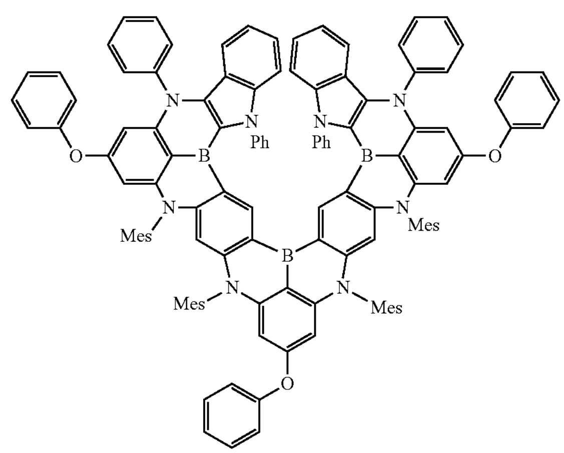

-continued
(1-1-126)
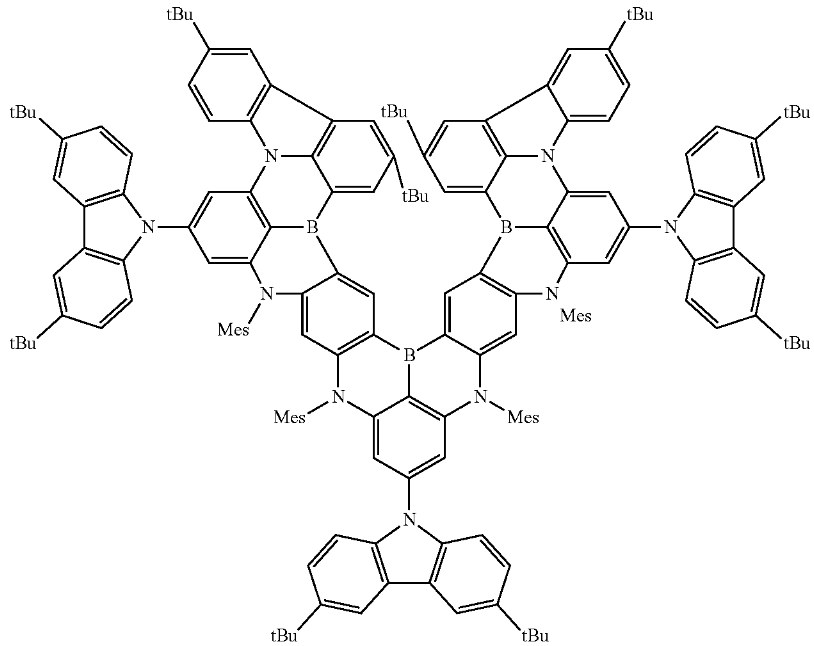
(1-1-127)
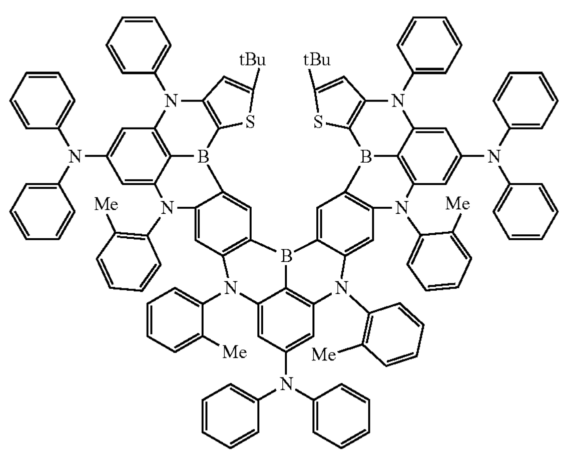
(1-1-128)
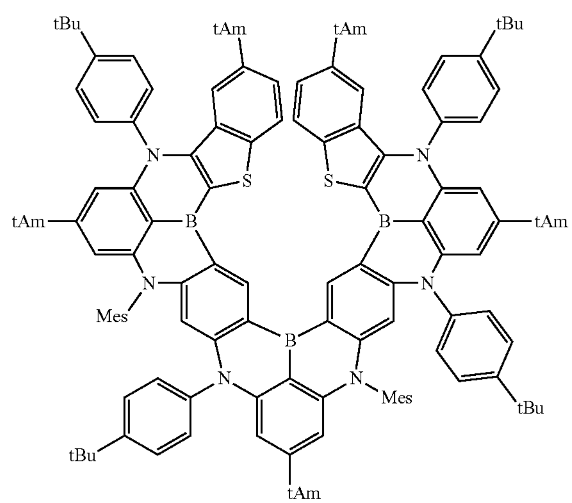

-continued
(1-1-129)
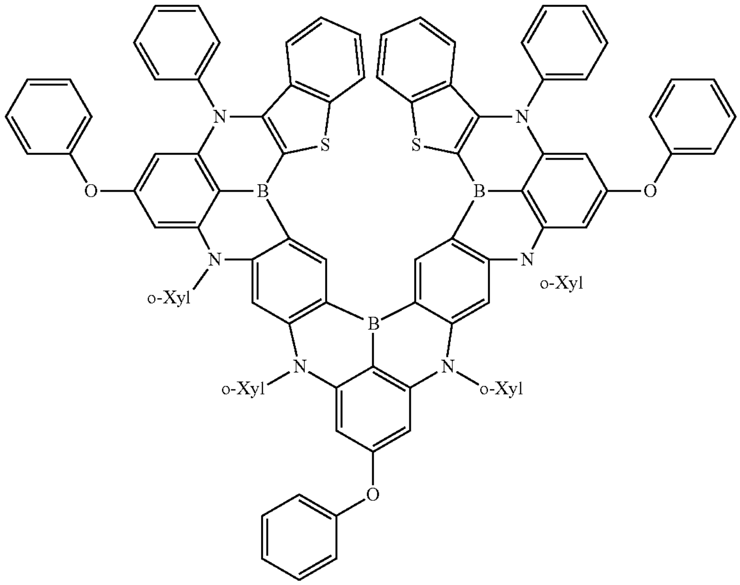
(1-1-130)
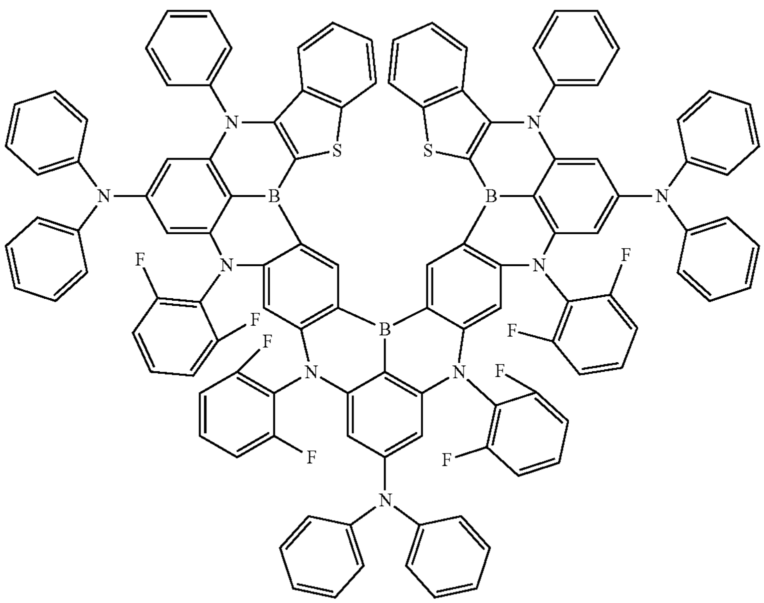
(1-1-141)
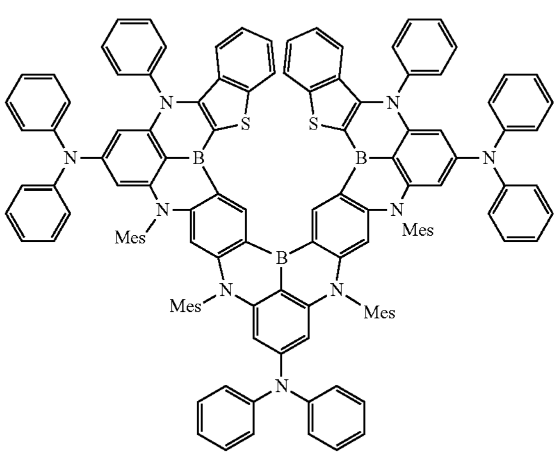
(1-1-142)
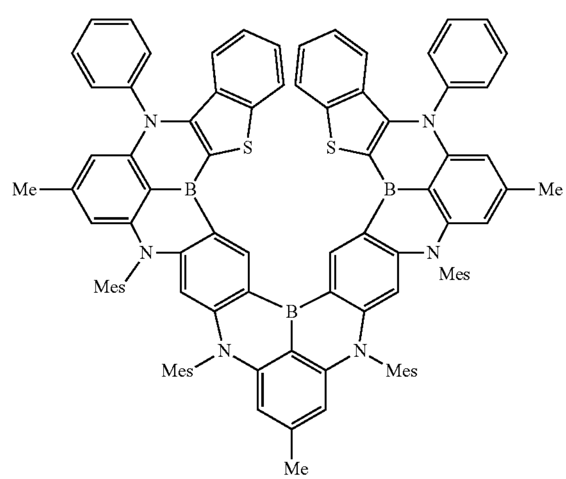

-continued
(1-1-143)
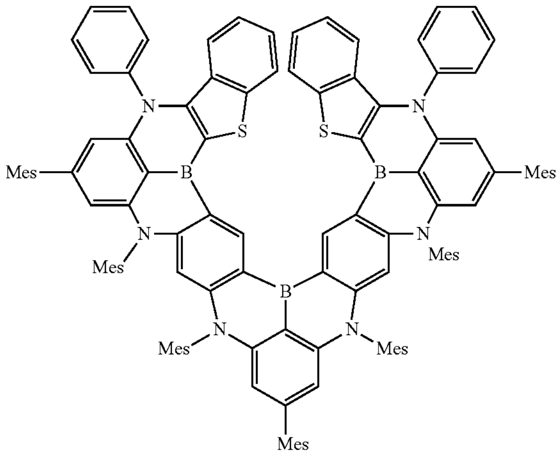
(1-1-144)
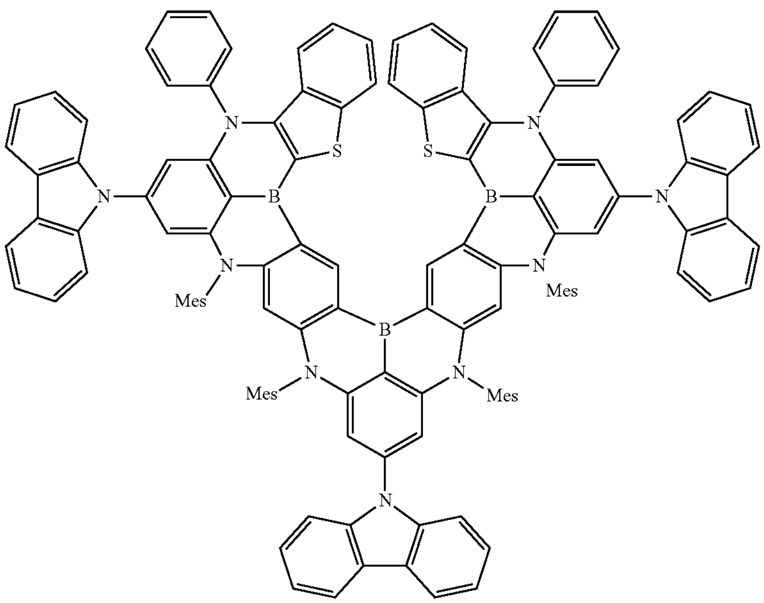
(1-1-145)
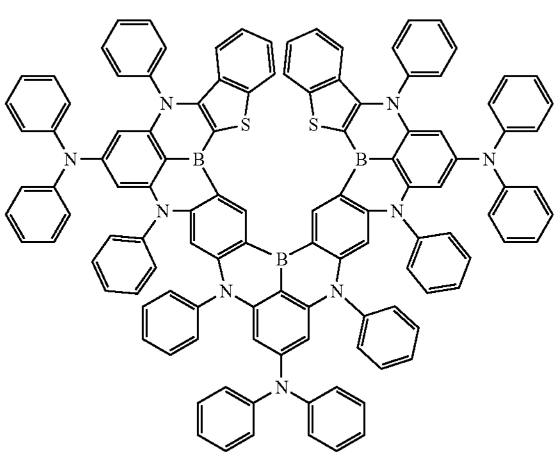
(1-1-146)
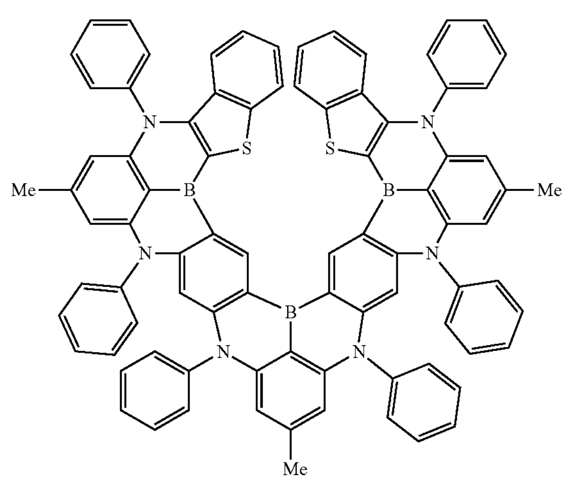

-continued
(1-1-147)
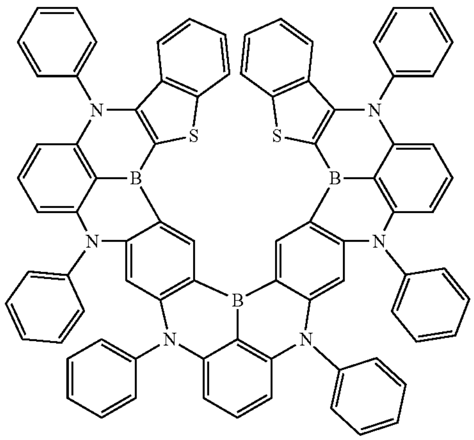
(1-1-148)
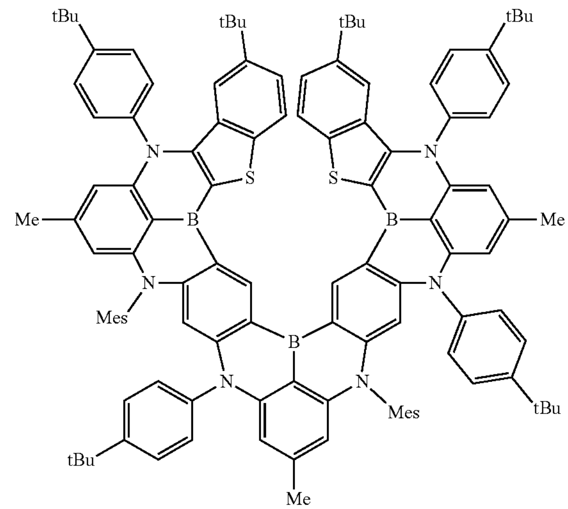
(1-1-149)
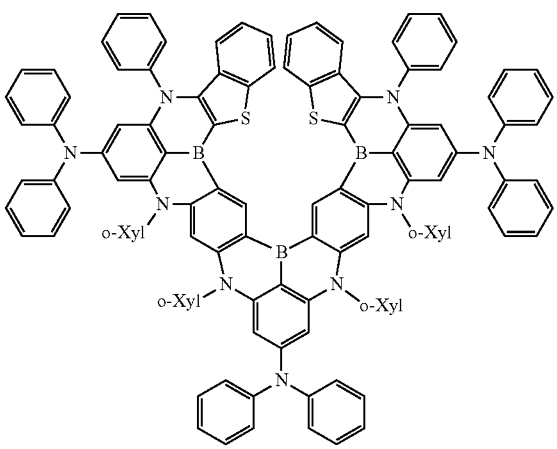
(1-1-150)
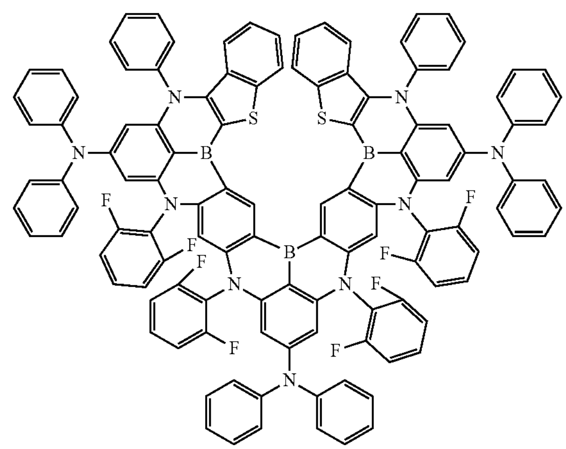
(1-1-161)
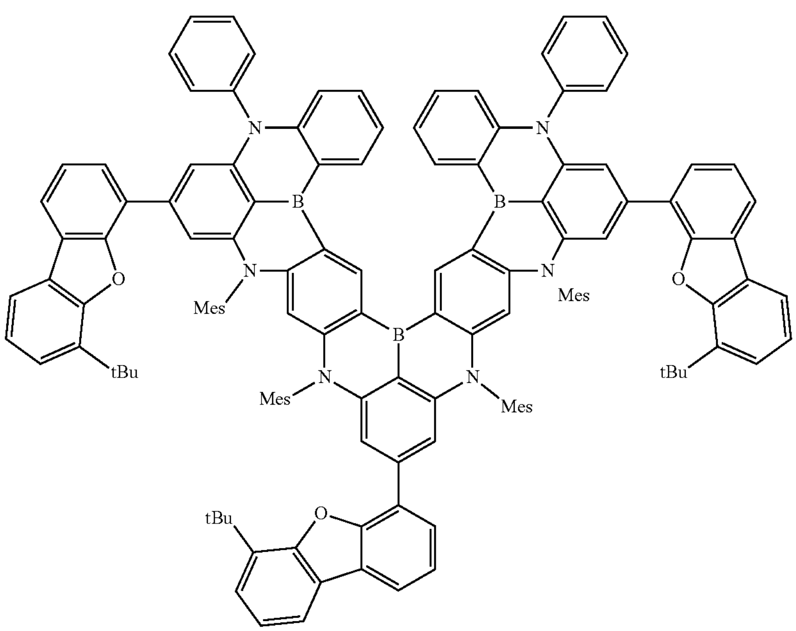

-continued
(1-1-162)
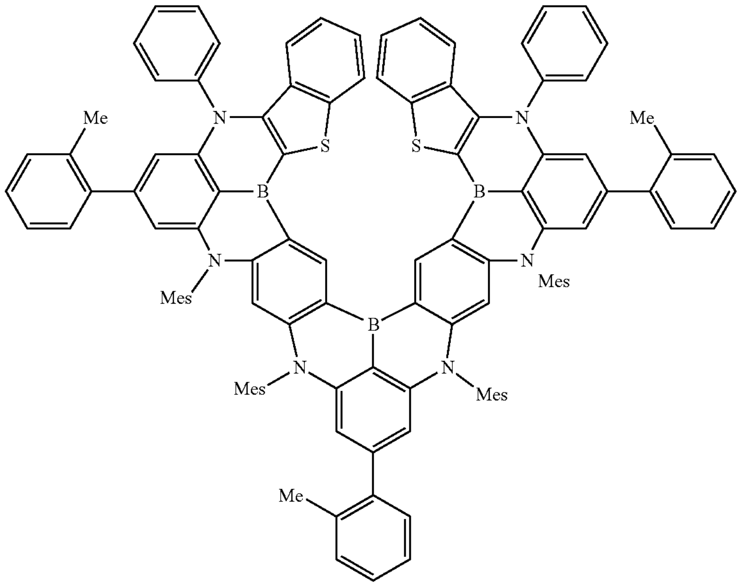
(1-1-163)
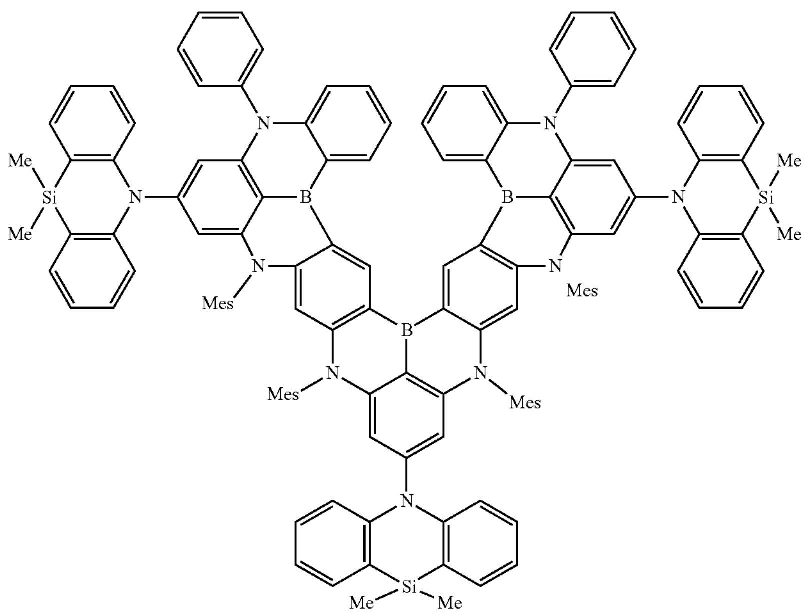
(1-1-164)
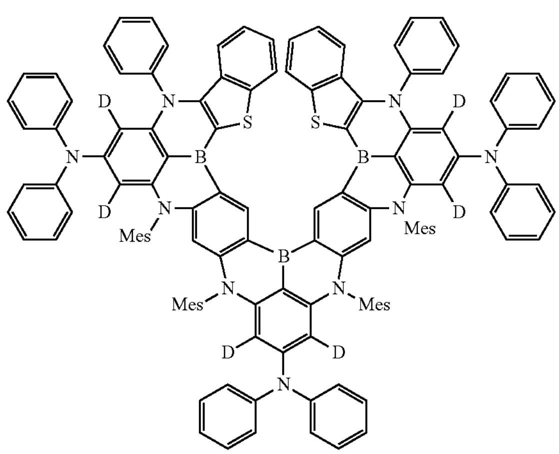
(1-1-165)
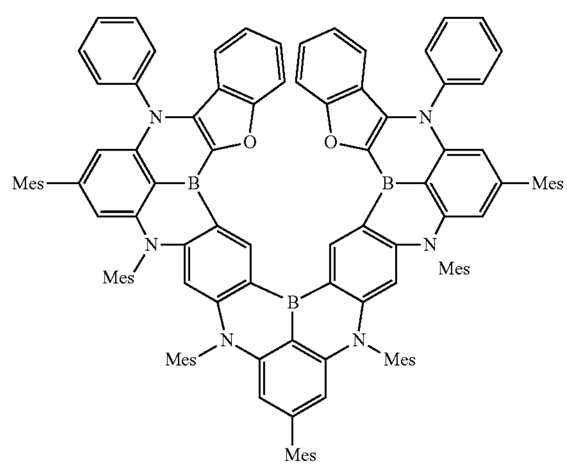

-continued
(1-1-166)
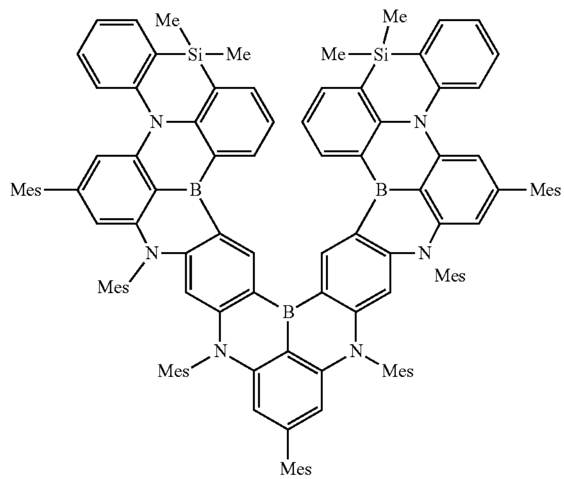
(1-1-167)
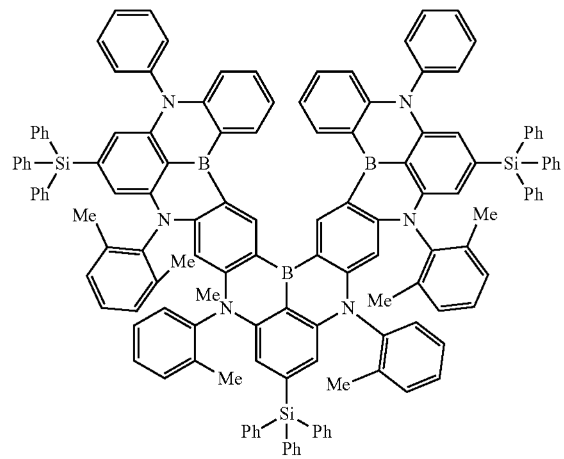
(1-1-168)
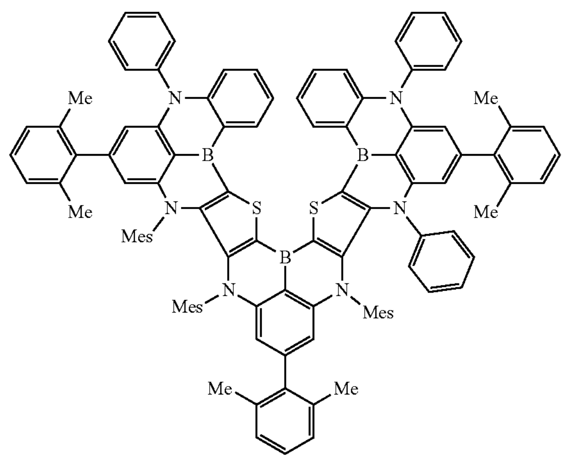
(1-1-169)
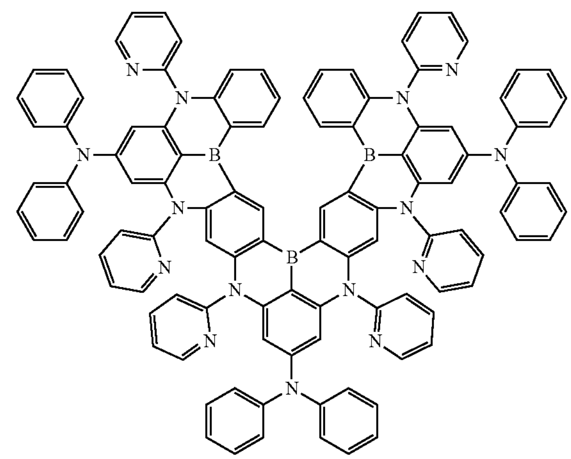
(1-170)
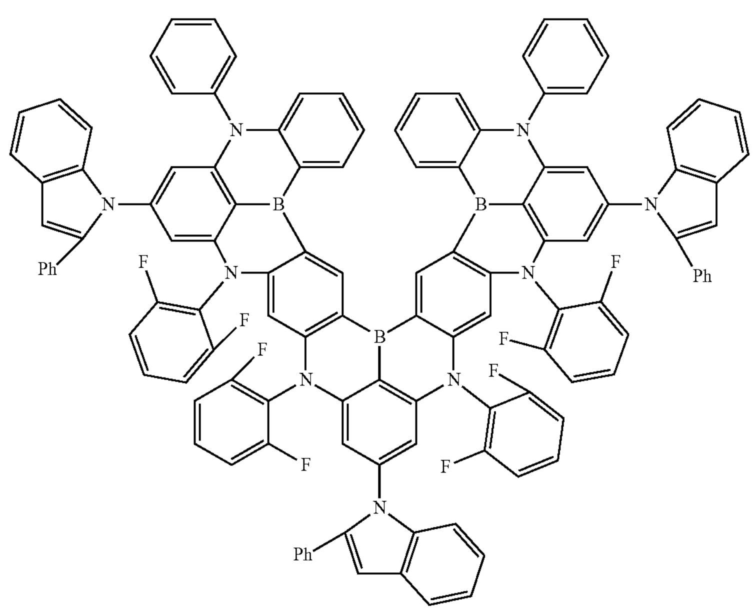

-continued
(1-1-191)
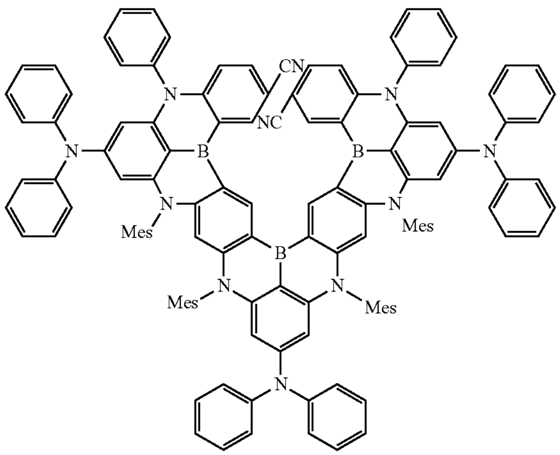
(1-1-192)
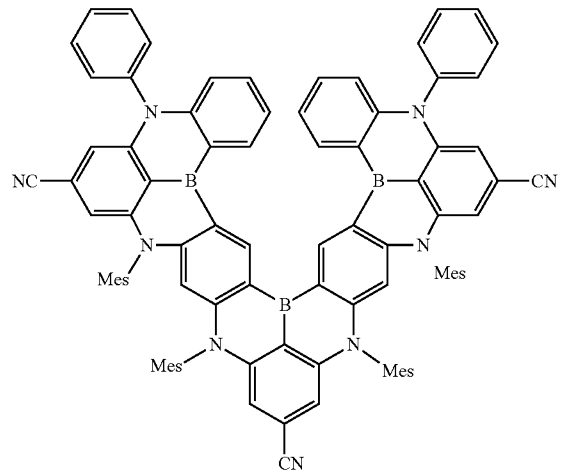
(1-1-193)
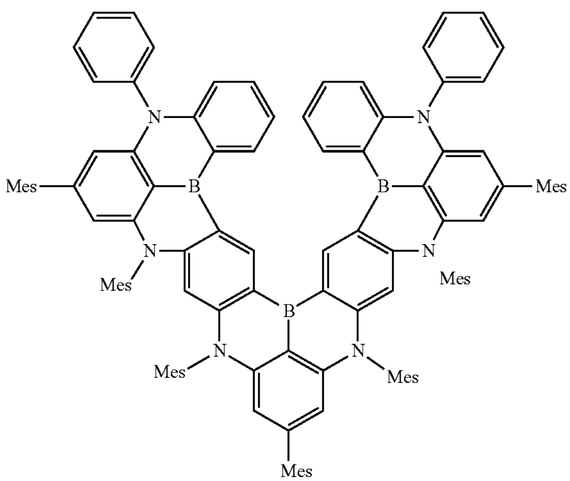
(1-1-194)
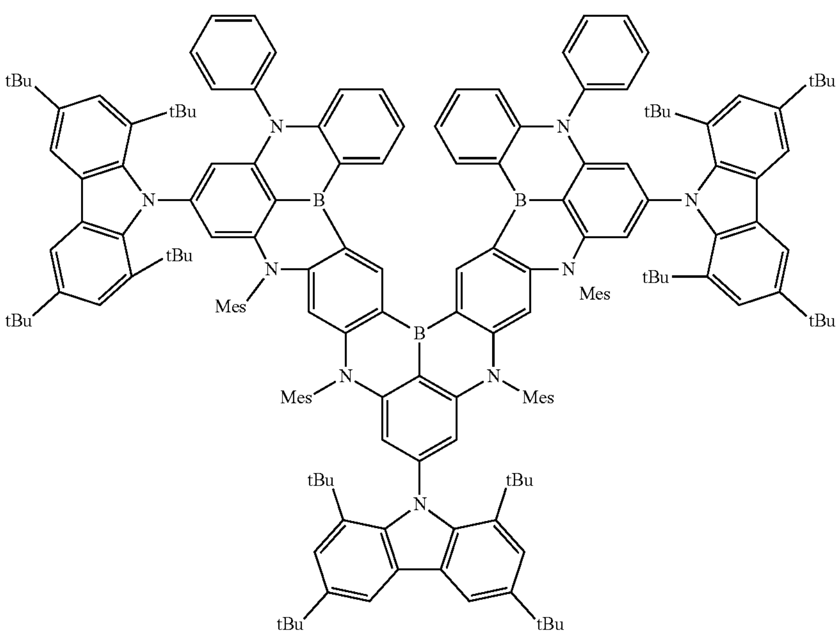

-continued
(1-1-195)
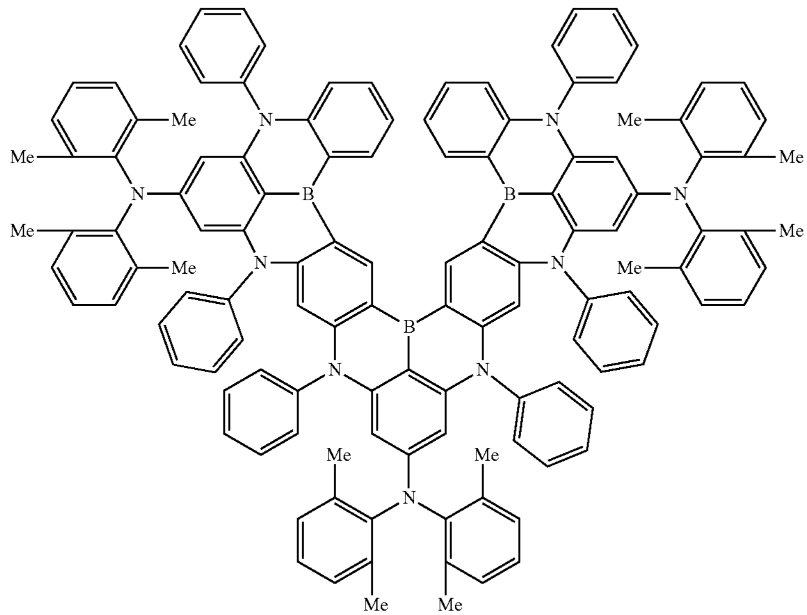
(1-1-196)
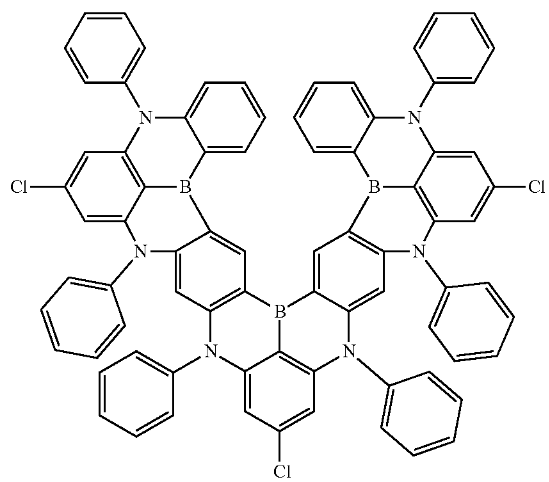
(1-1-197)
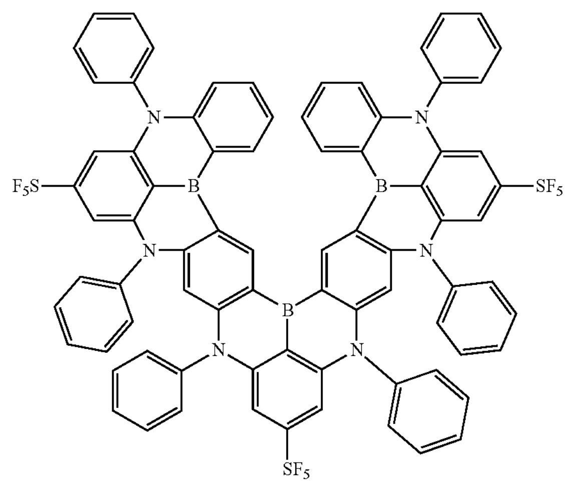
(1-1-198)
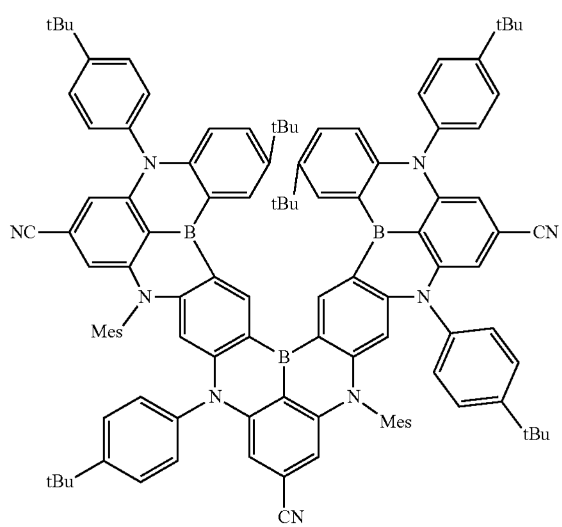
(1-1-199)
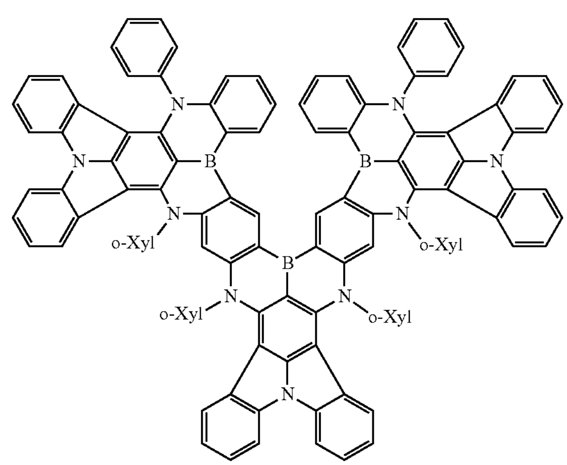

-continued
(1-1-200)
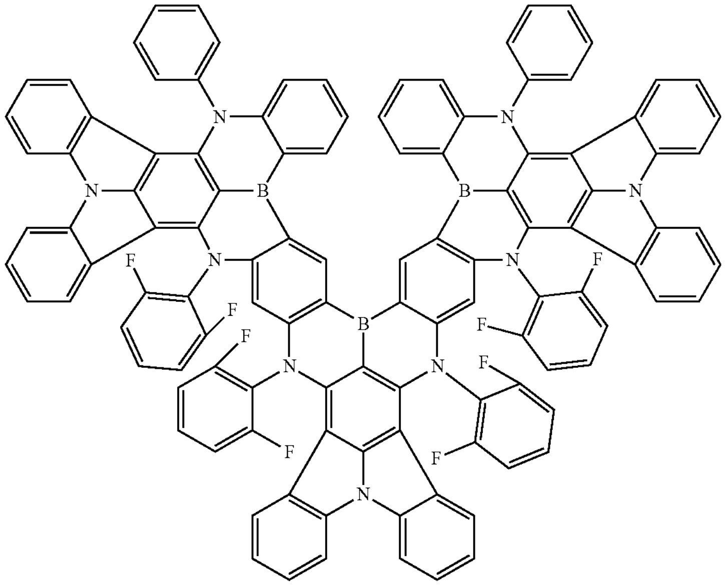
(1-1-221)
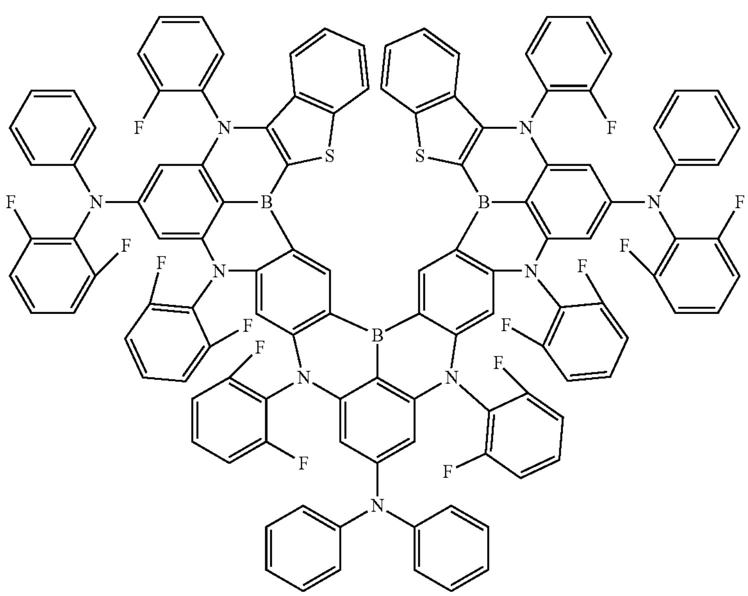

-continued
(1-1-222)
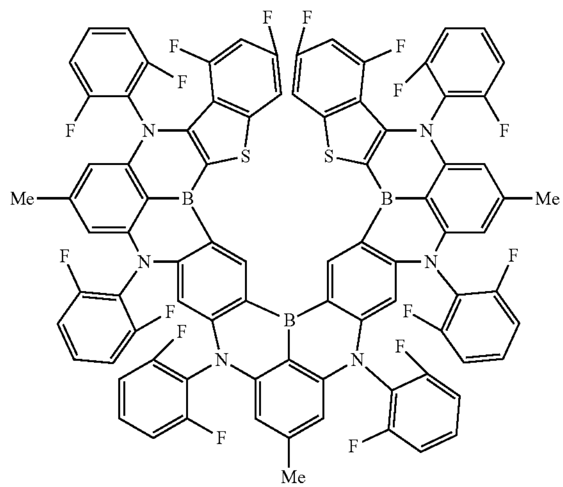
(1-1-223)
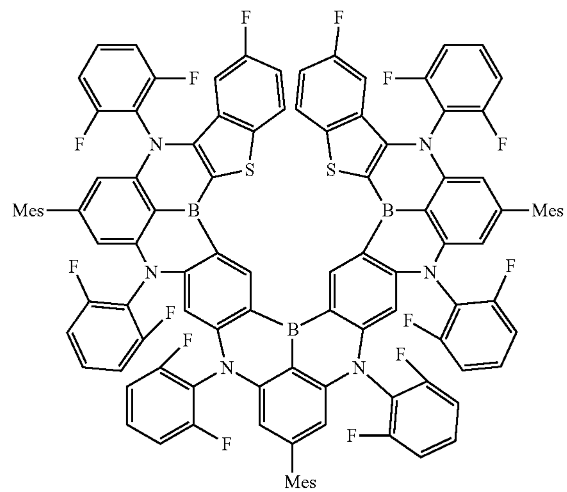
(1-1-224)
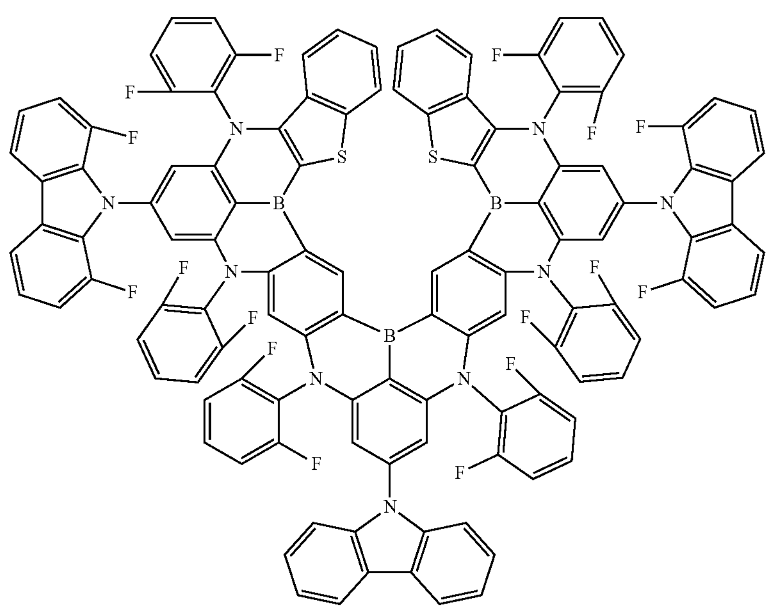

-continued
(1-1-225)
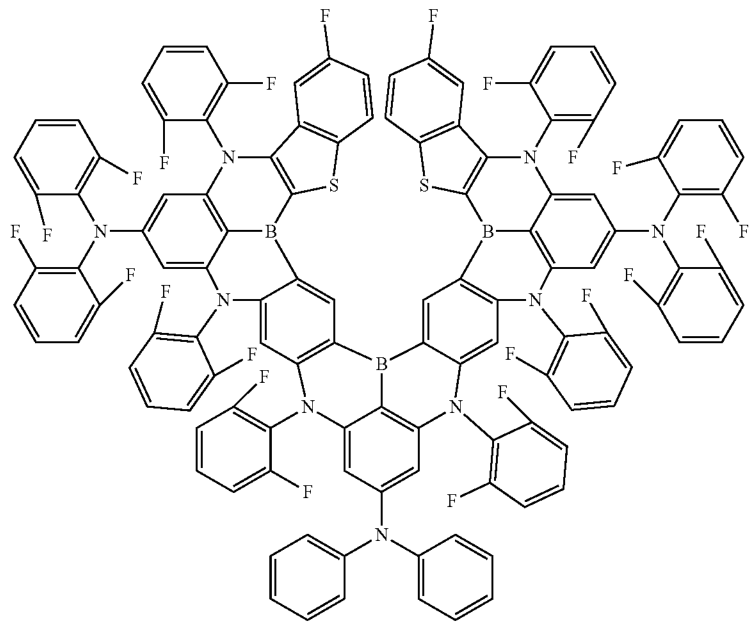
(1-1-226)
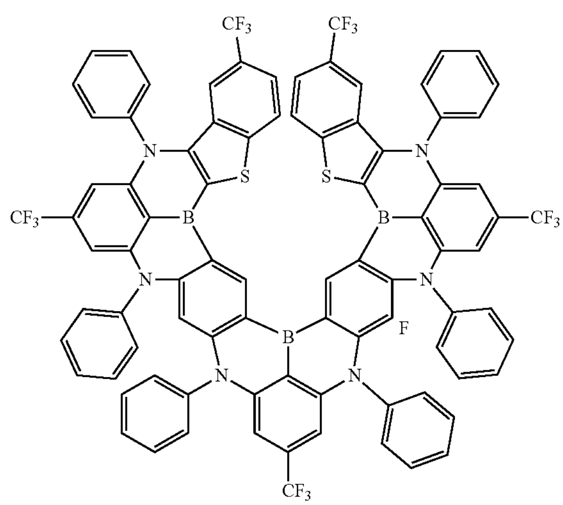
(1-1-227)
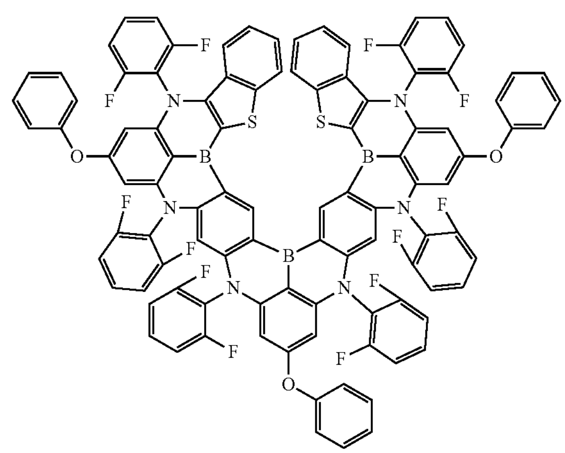
(1-1-228)
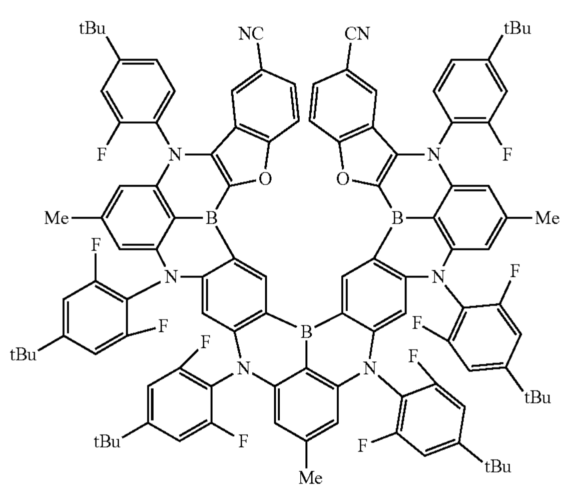
(1-1-229)
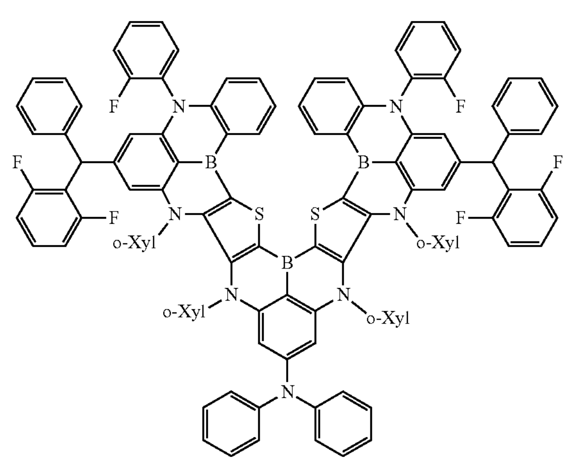

-continued
(1-1-230)
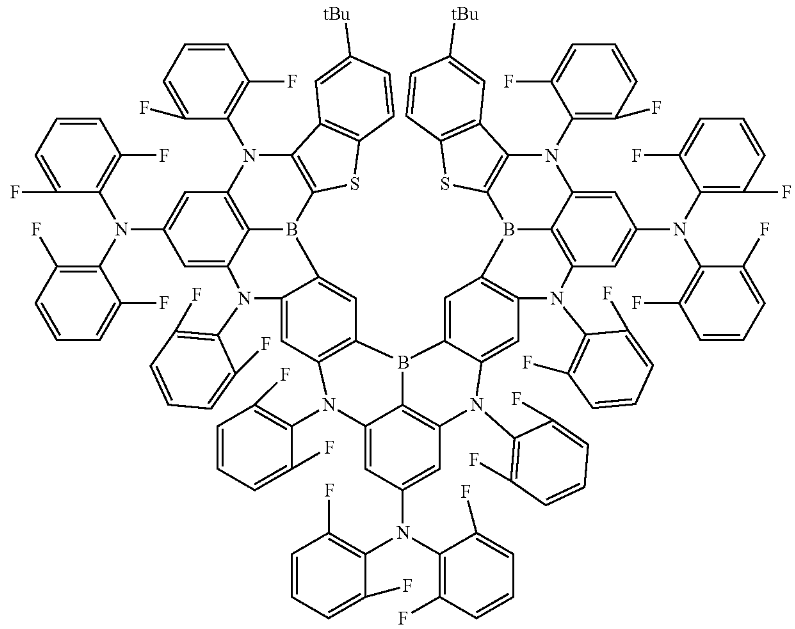
(1-2-1)
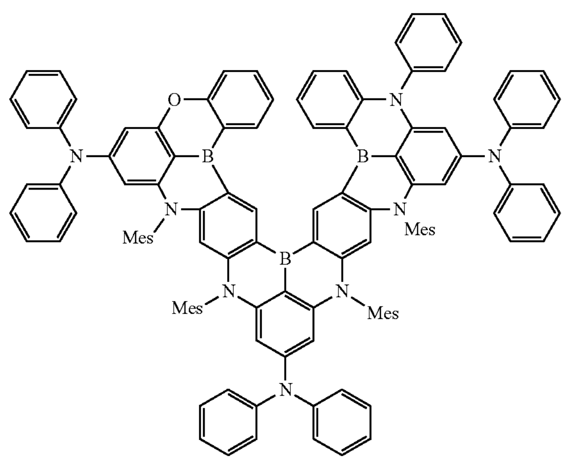
(1-2-2)
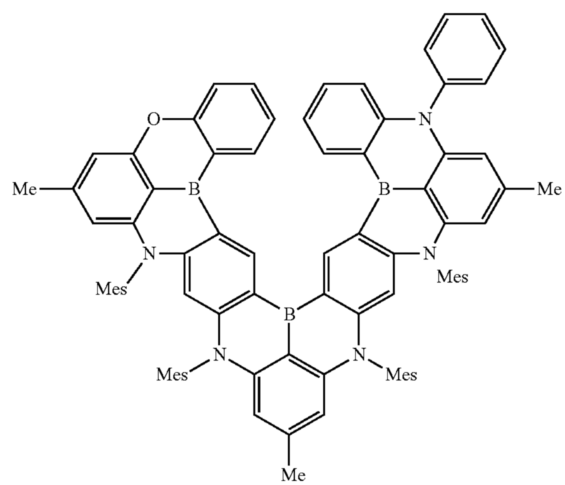
(1-2-3)
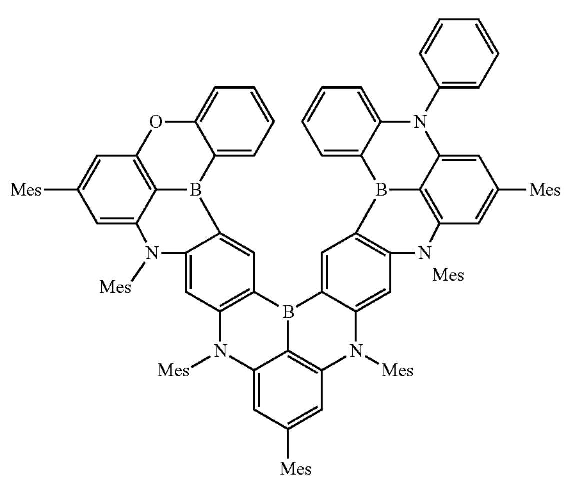

-continued
(1-2-4)
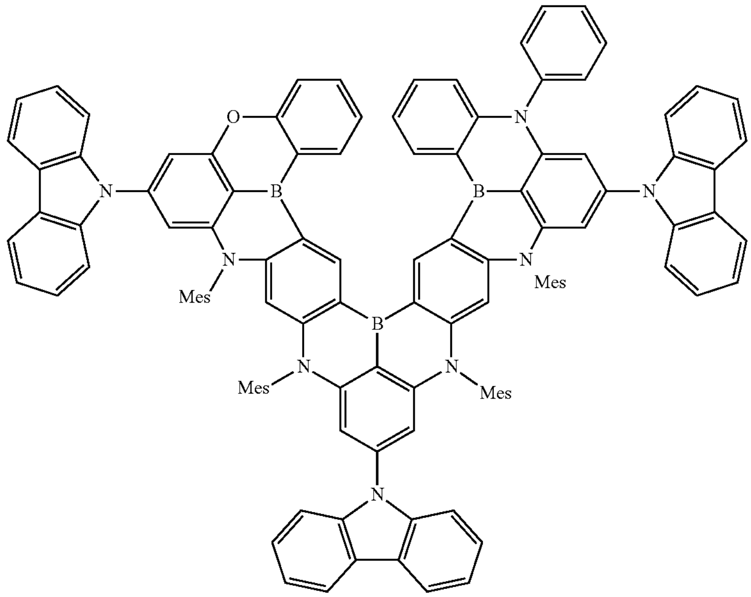
(1-2-5)
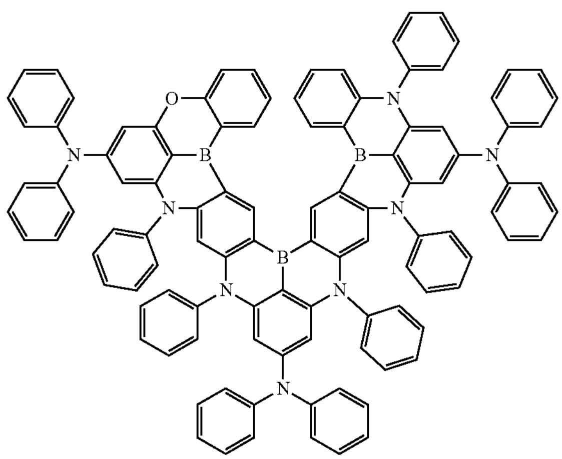
(1-2-6)
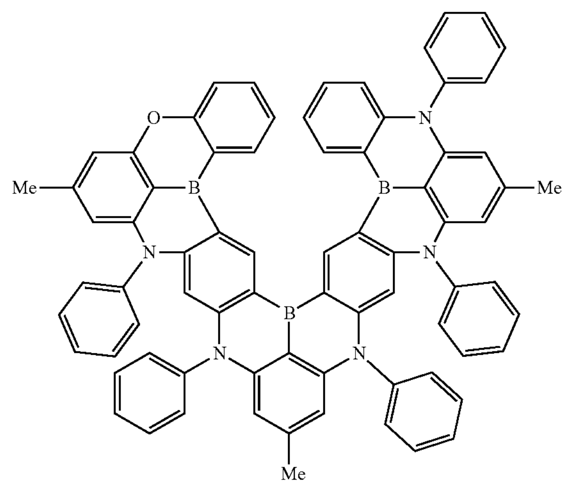
(1-2-7)
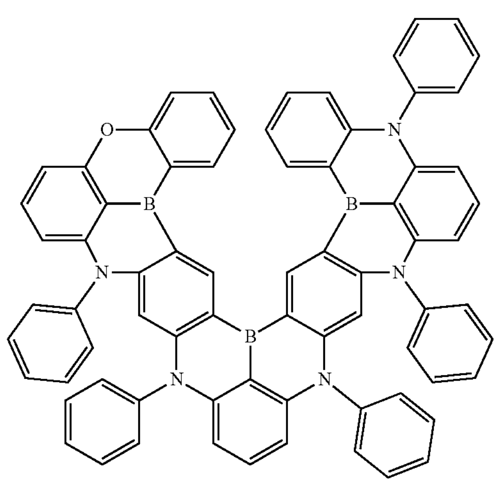
(1-2-8)
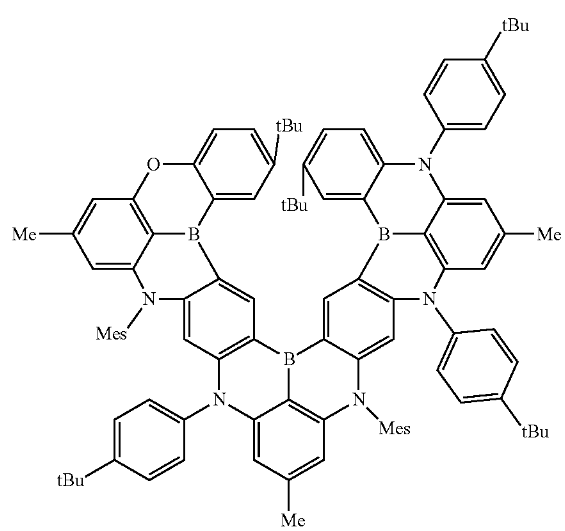

-continued
(1-2-9)
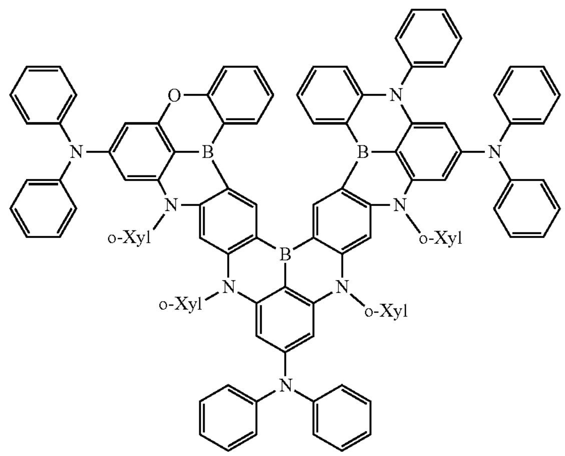
(1-2-10)
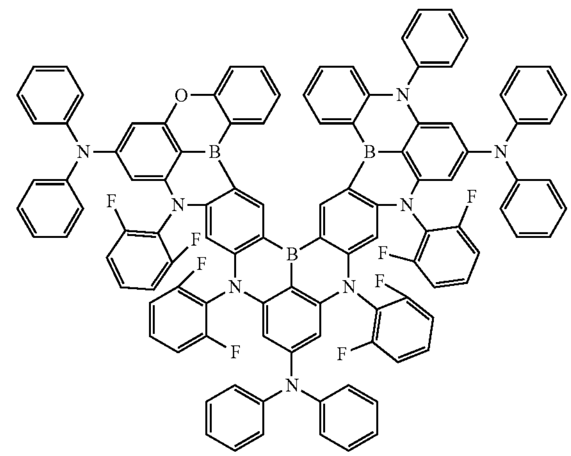
(1-2-21)
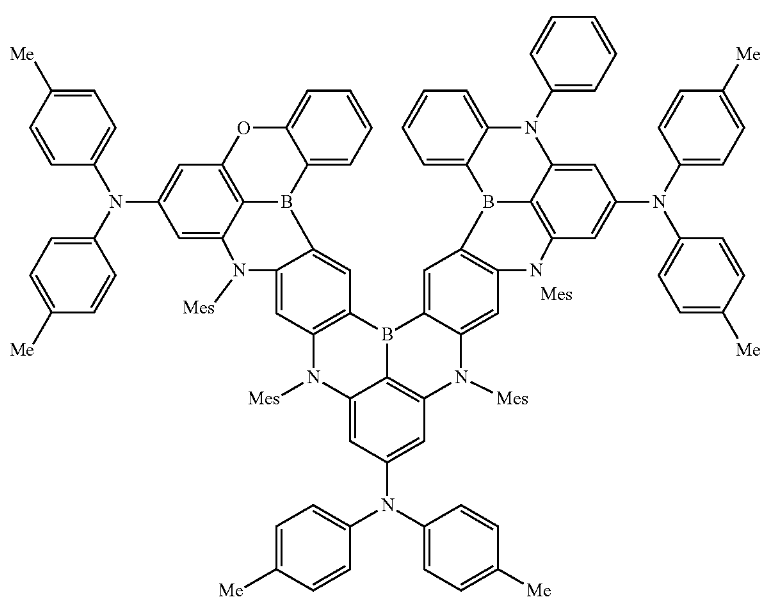
(1-2-22)
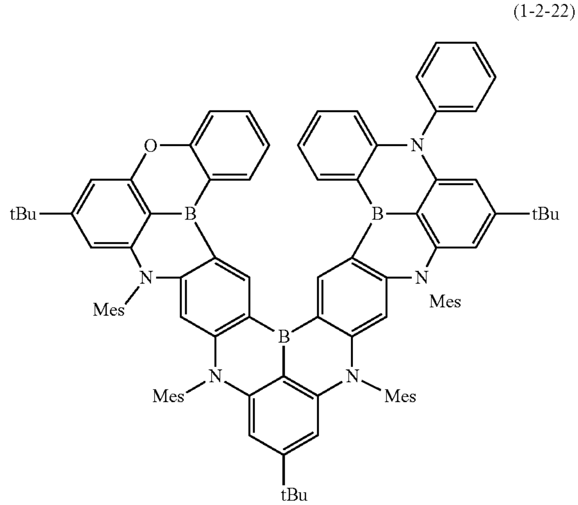
(1-2-23)
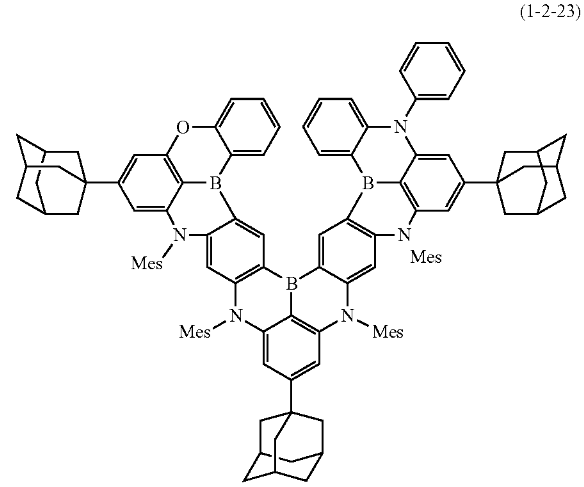

-continued
(1-2-24)
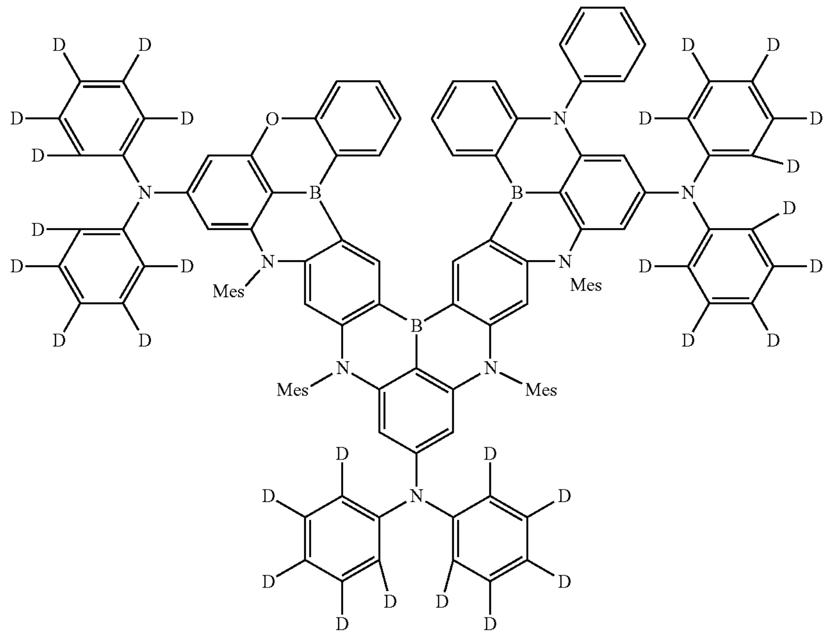
(1-2-25)
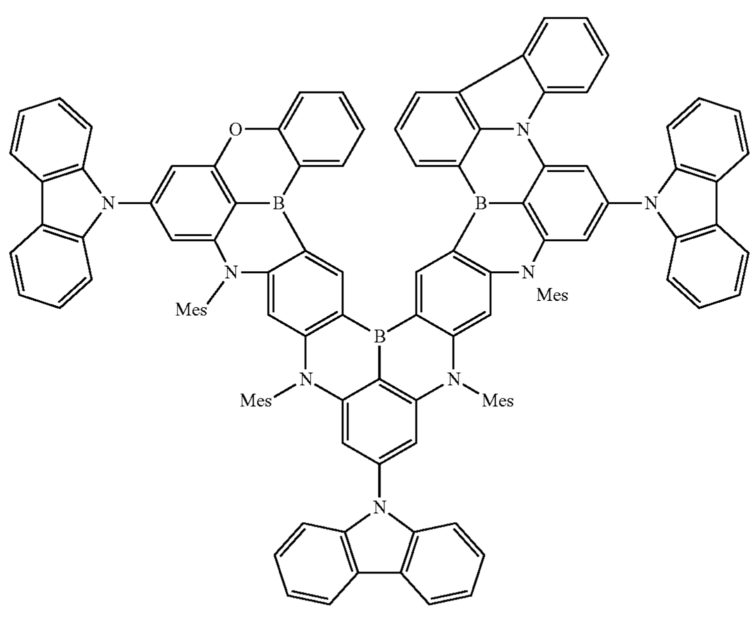

-continued
(1-2-26)
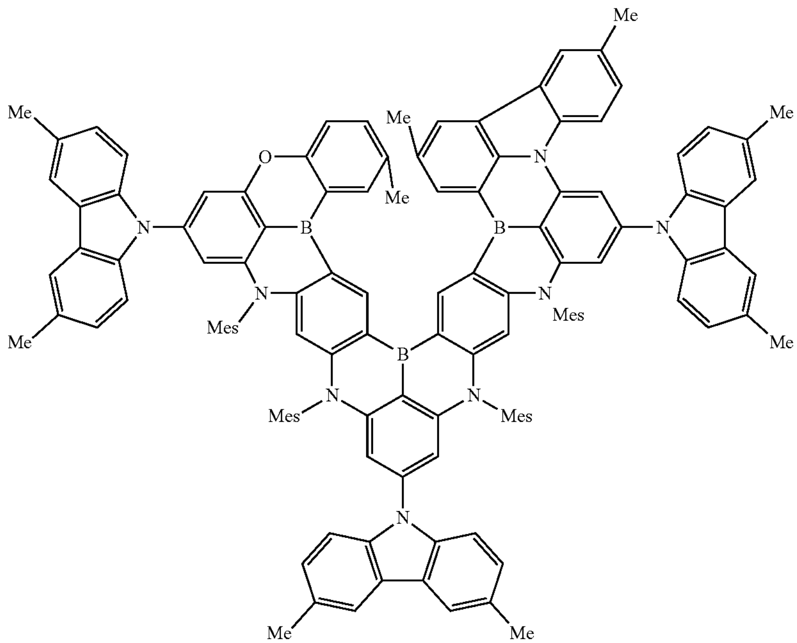
(1-2-27)
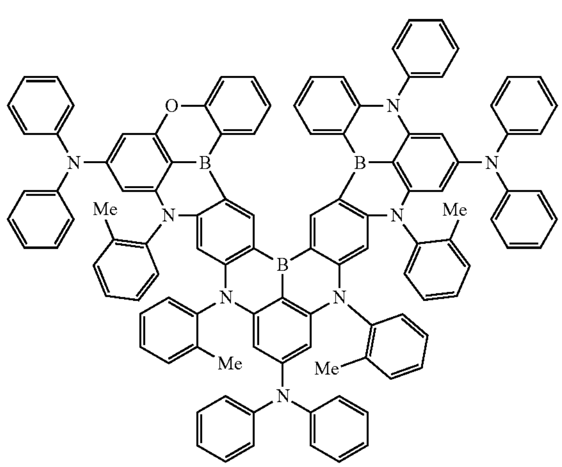
(1-2-28)
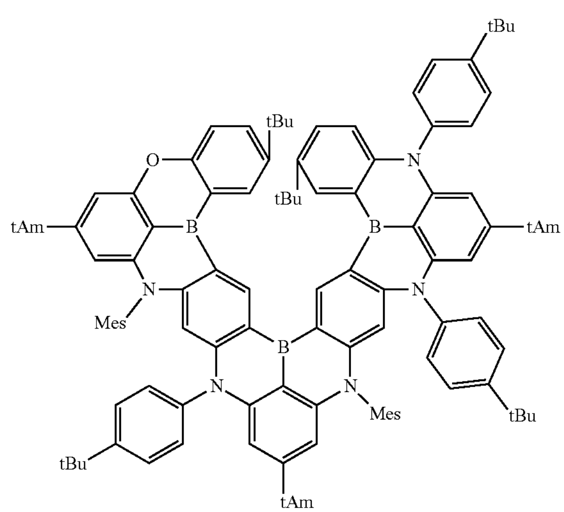

-continued
(1-2-29)
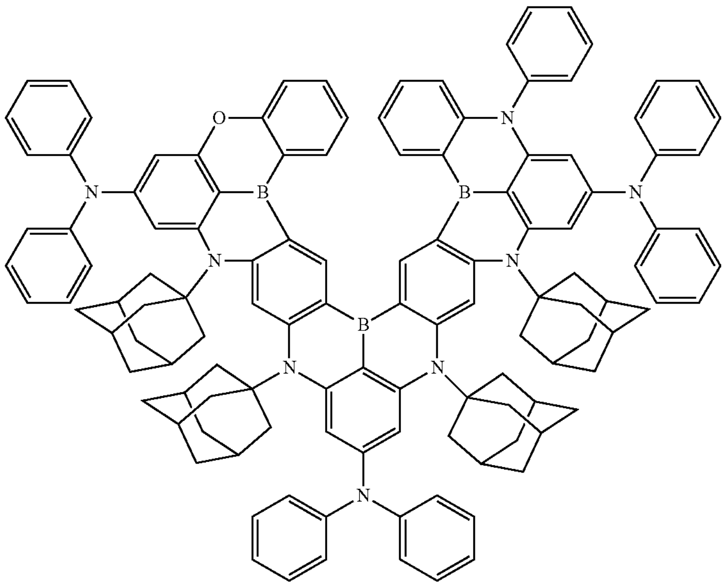
(1-2-30)
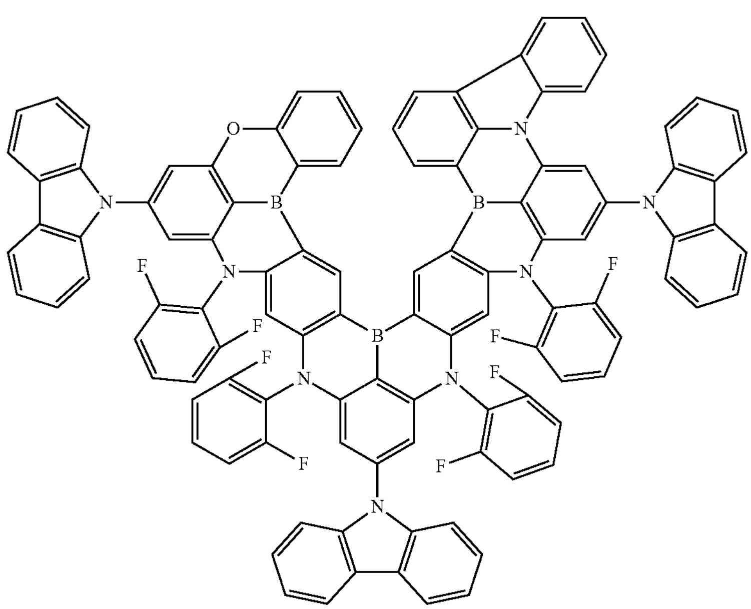

-continued
(1-2-41)
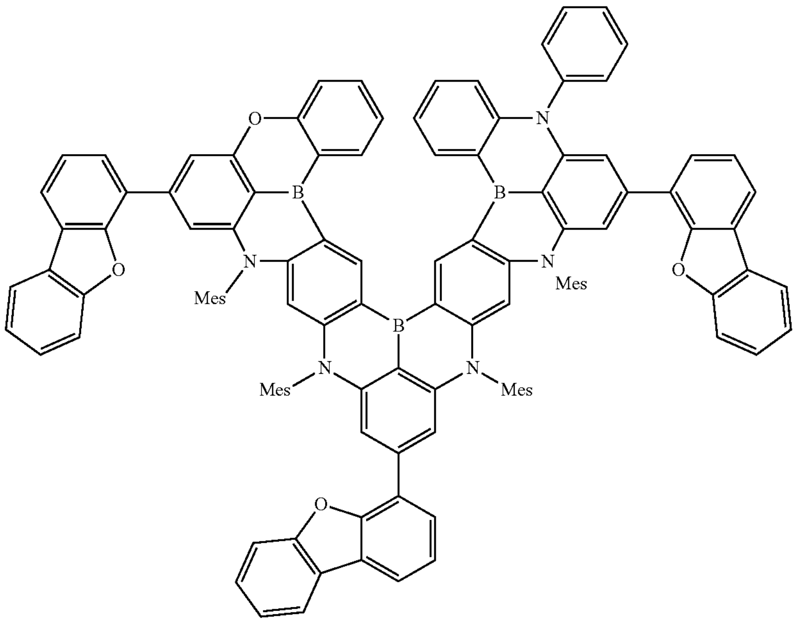
(1-2-42)
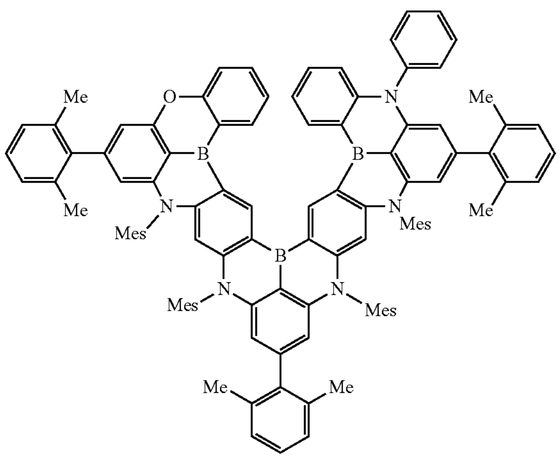
(1-2-43)
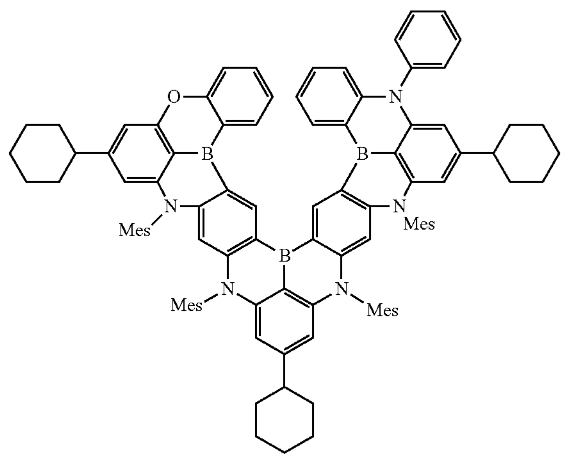
(1-2-44)
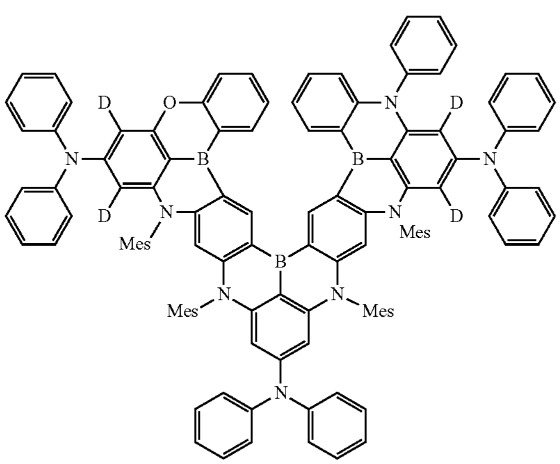
(1-2-45)
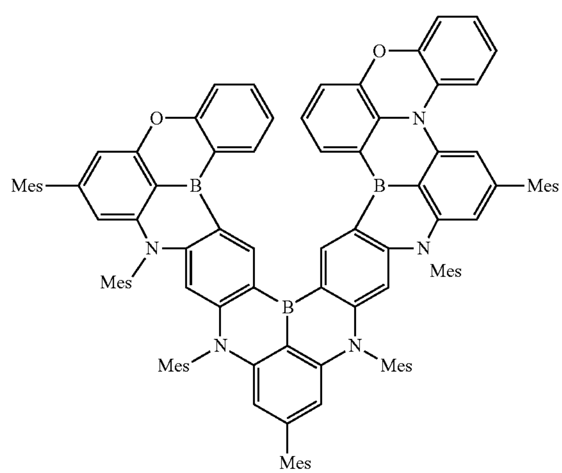

-continued
(1-2-46)
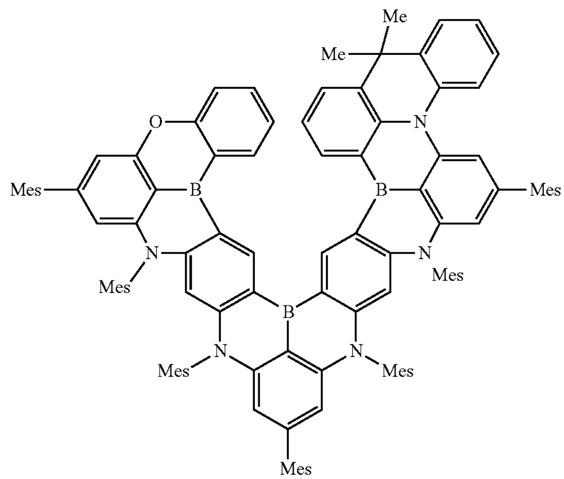
(1-2-47)
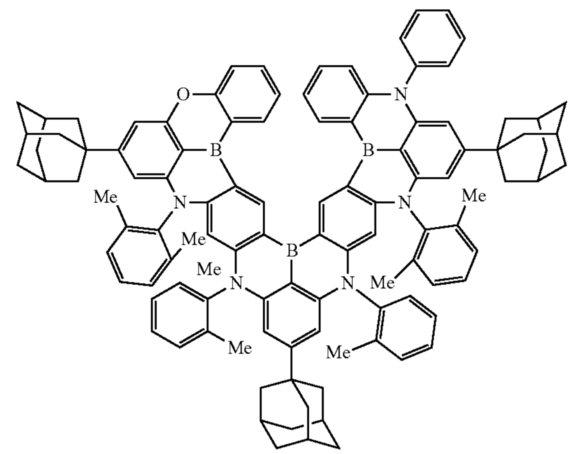
(1-2-48)
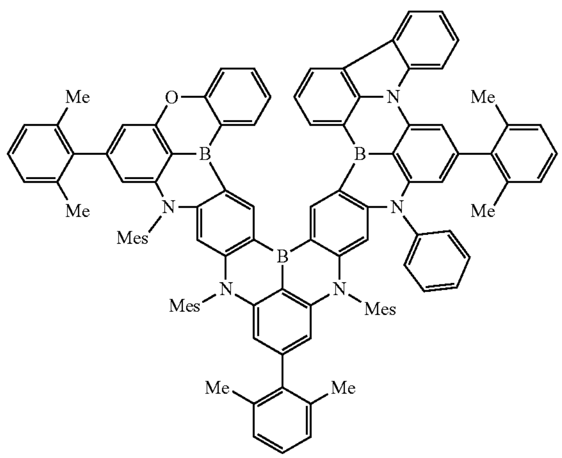
(1-2-49)
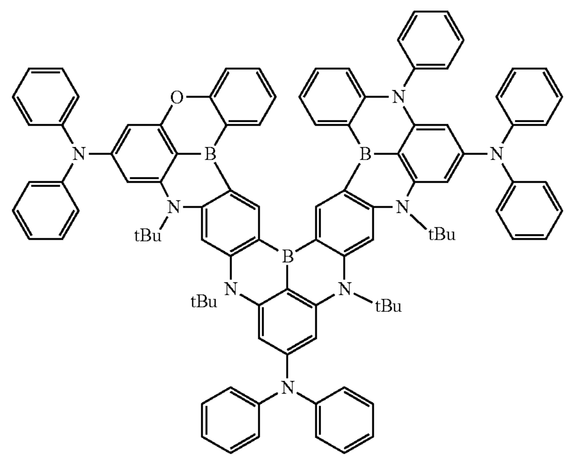
(1-2-50)
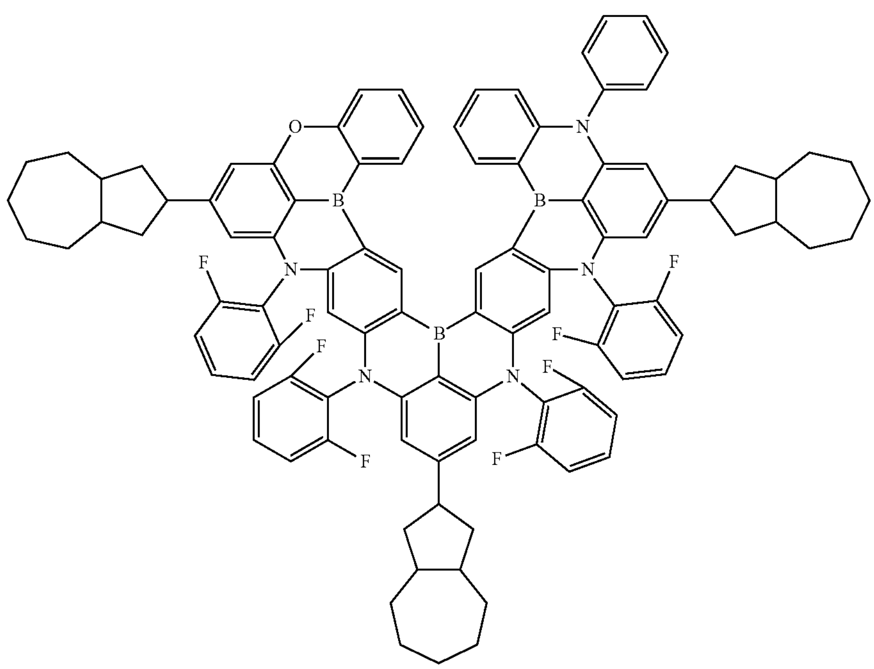

-continued
(1-2-101)
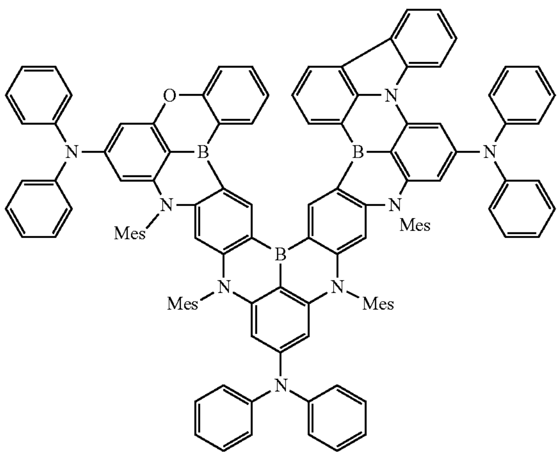
(1-2-102)
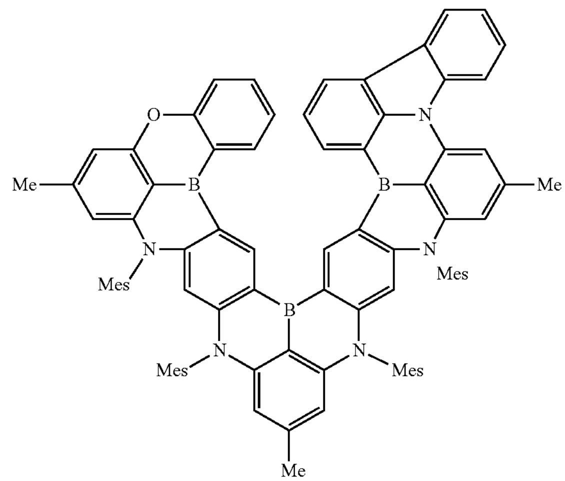
(1-2-103)
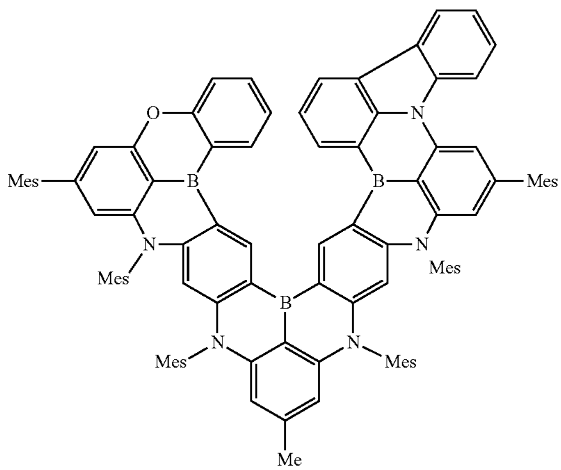
(1-2-104)
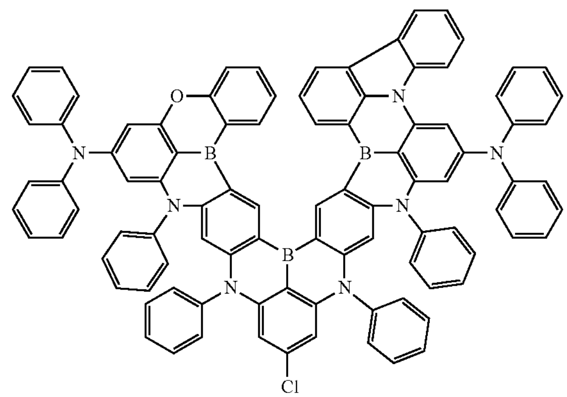
(1-1-105)
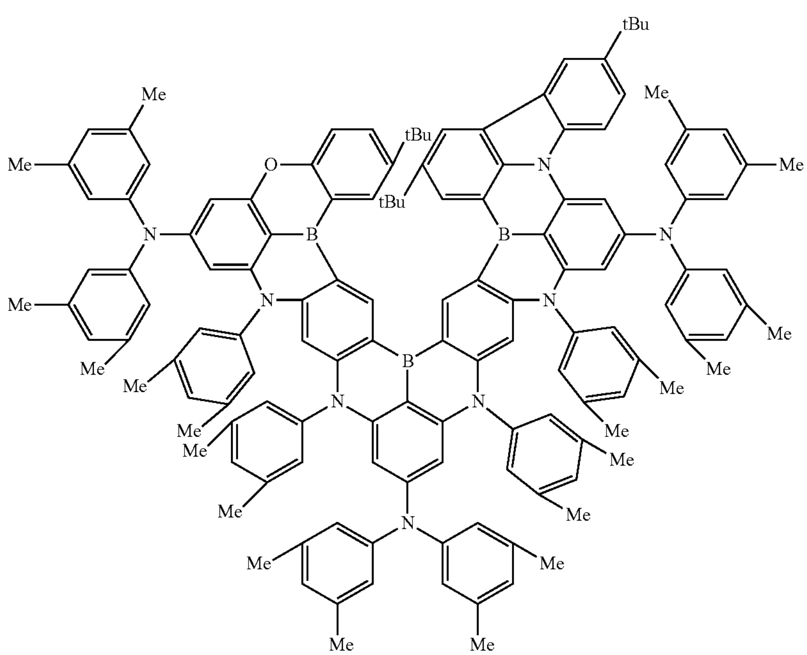

-continued
(1-2-106)
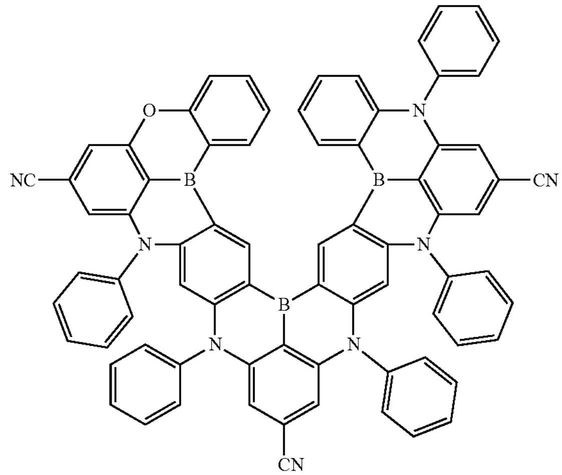
(1-2-107)
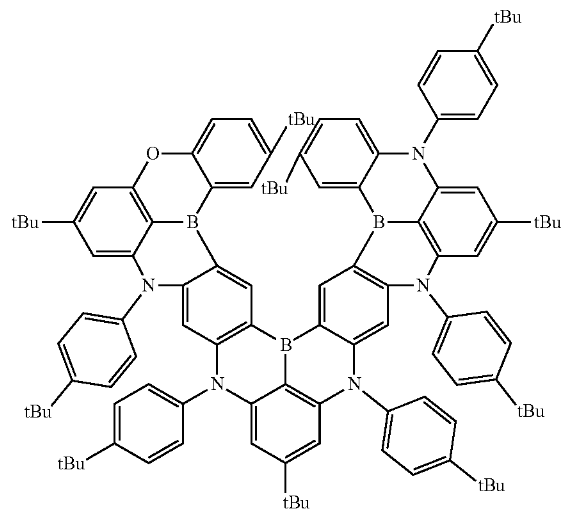
(1-2-108)
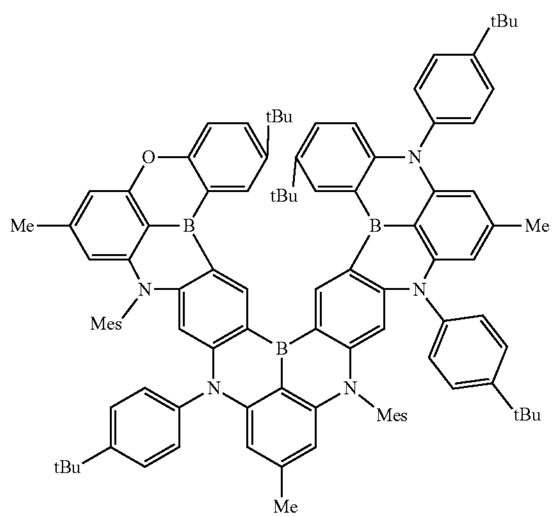
(1-2-109)
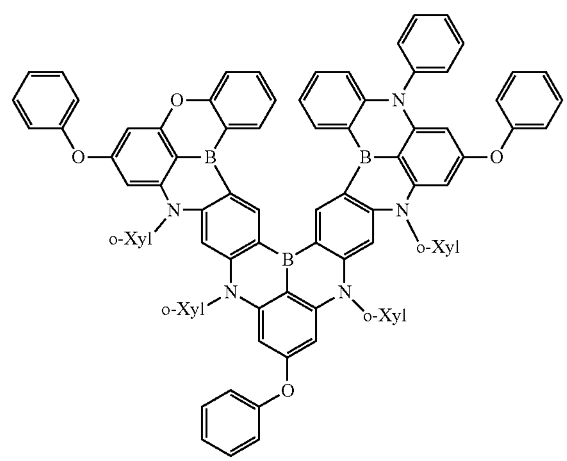
(1-2-120)
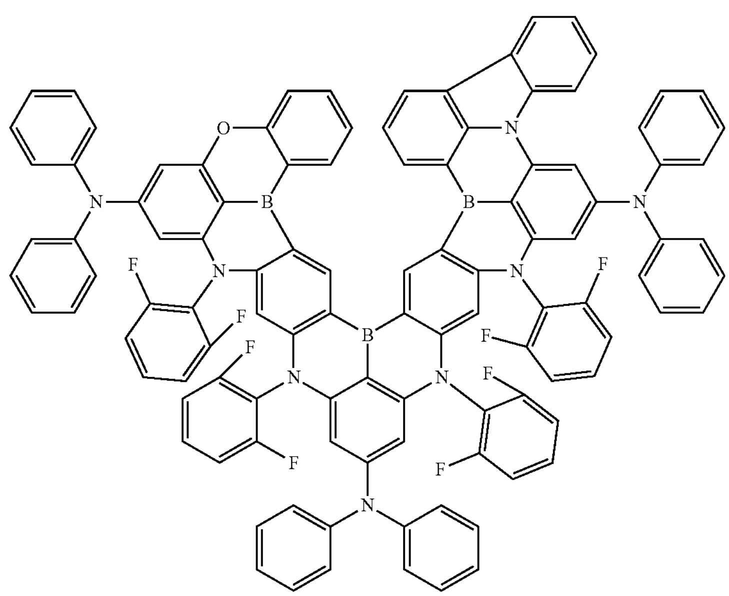

-continued
(1-2-121)
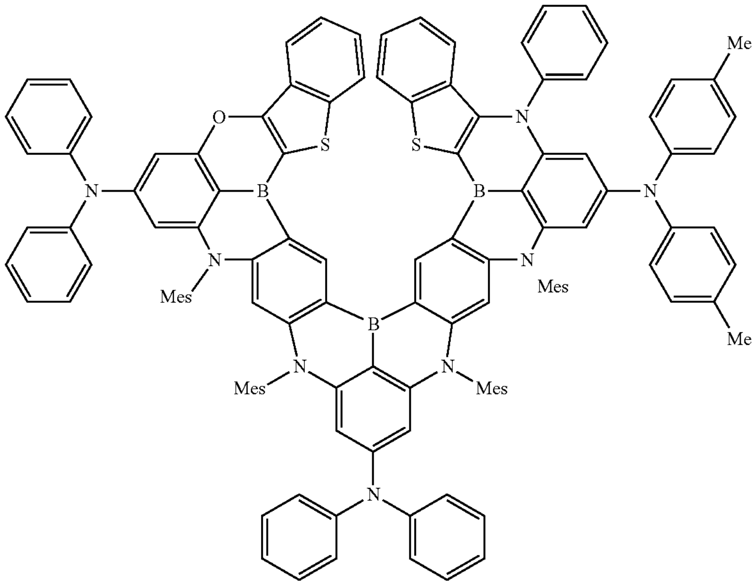
(1-2-122)
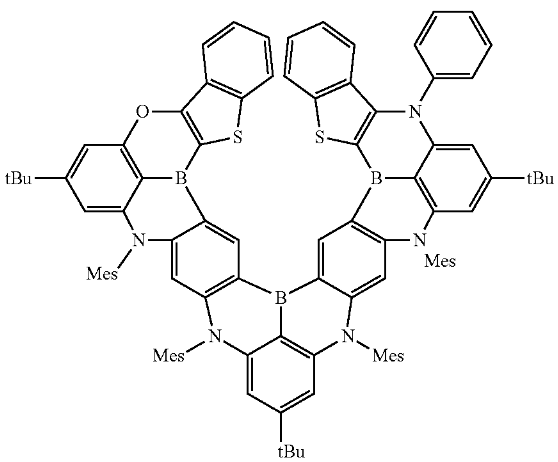
(1-2-123)
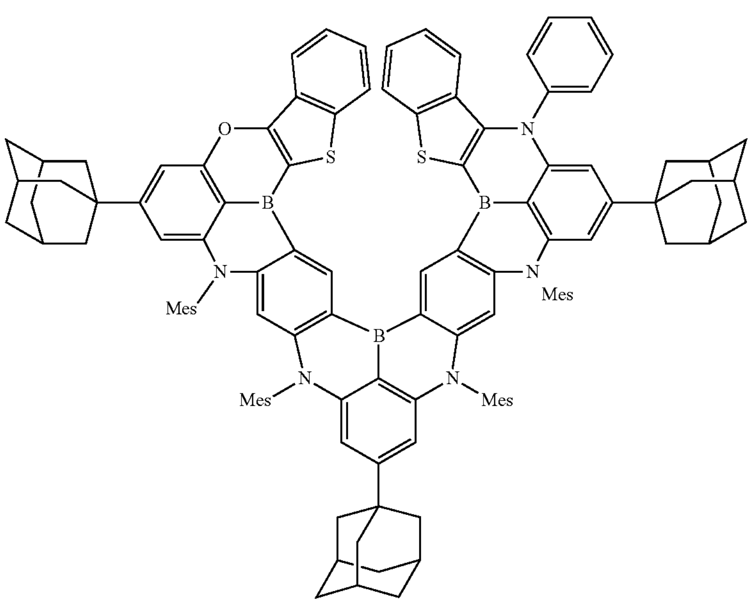

-continued
(1-2-124)
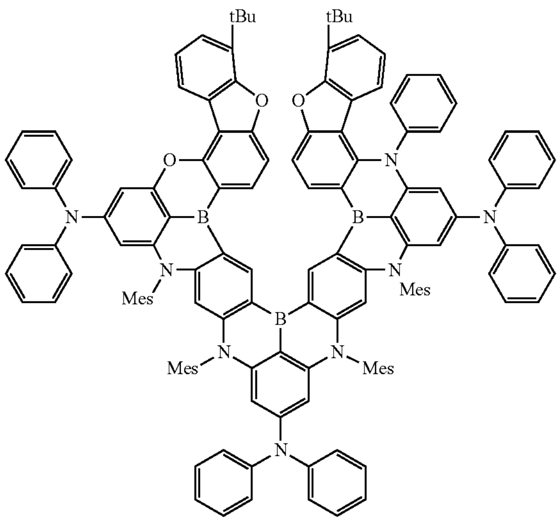
(1-2-125)
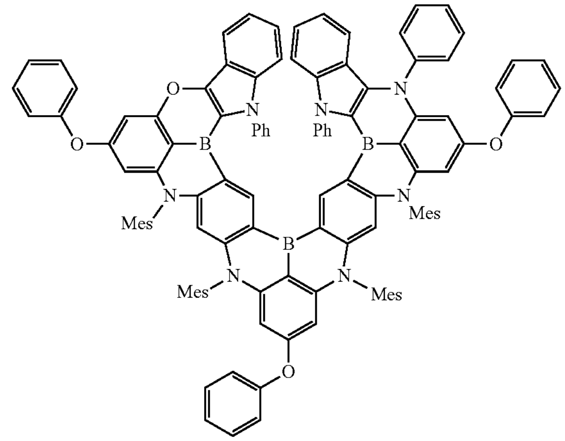
(1-2-126)
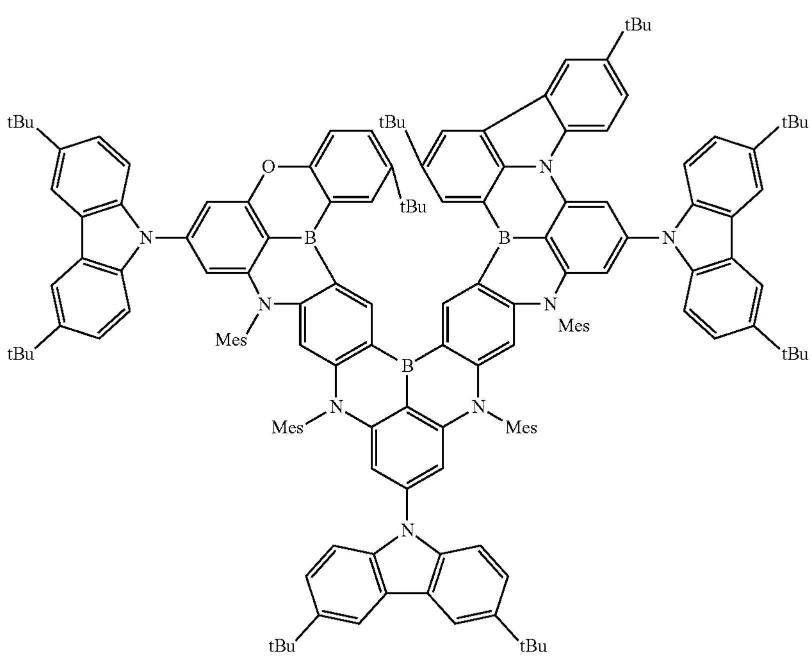

-continued
(1-2-127)
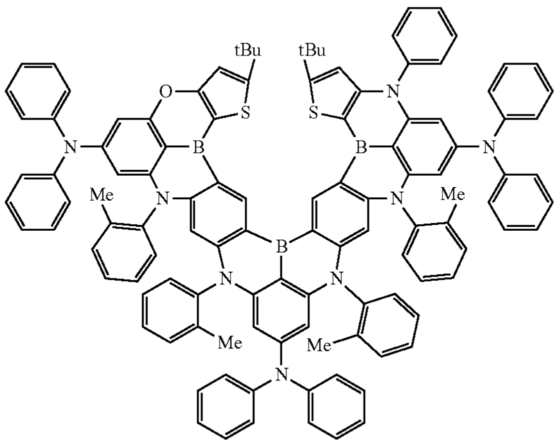
(1-2-128)
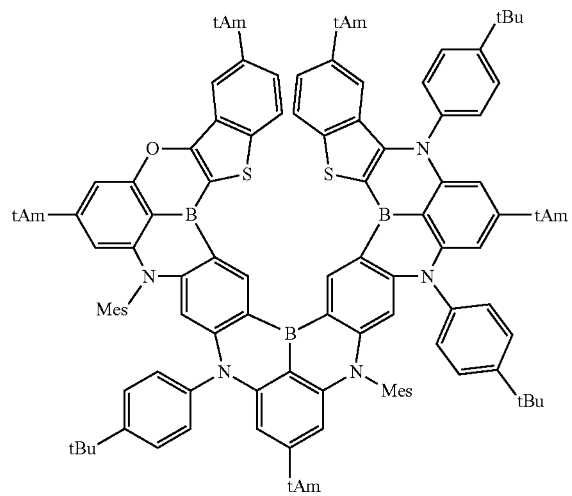
(1-2-129)
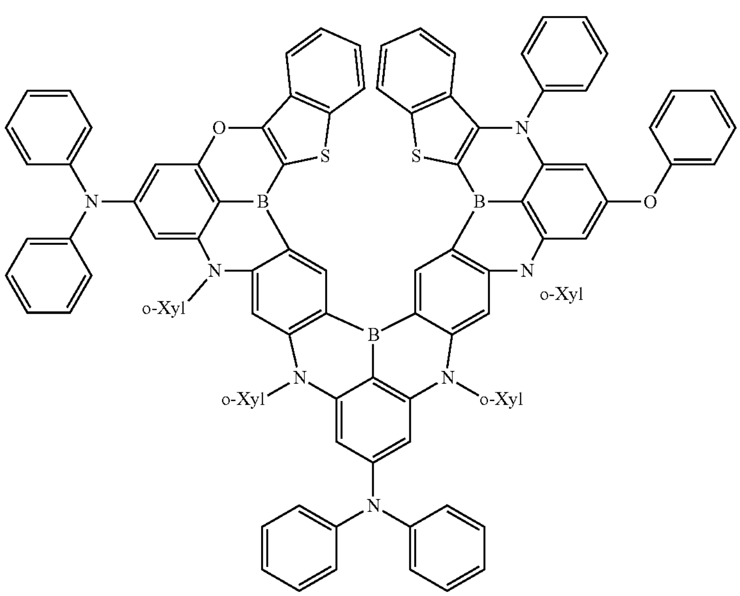

-continued
(1-2-130)
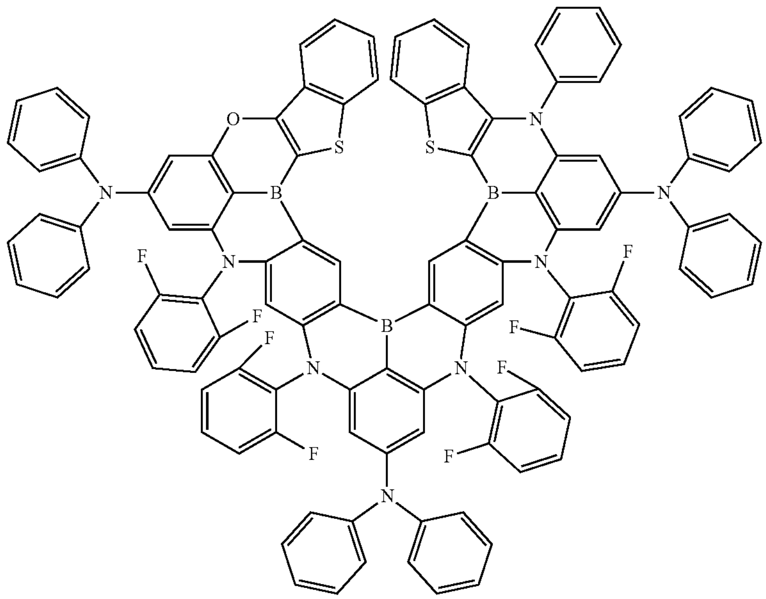
(1-2-141)
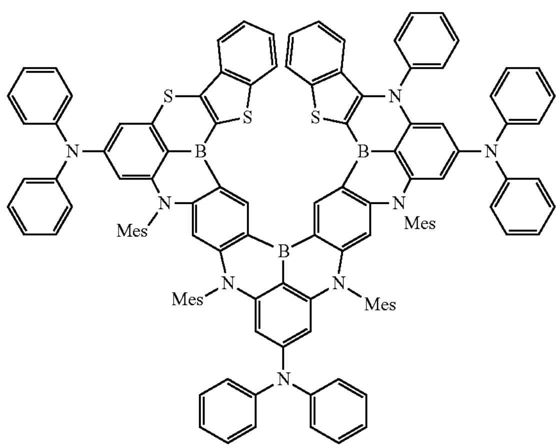
(1-2-142)
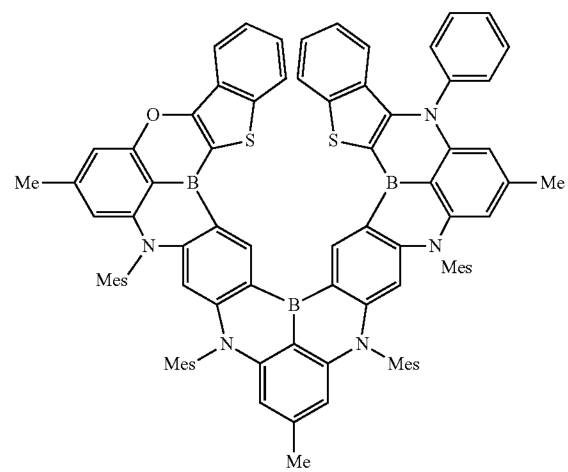
(1-2-143)
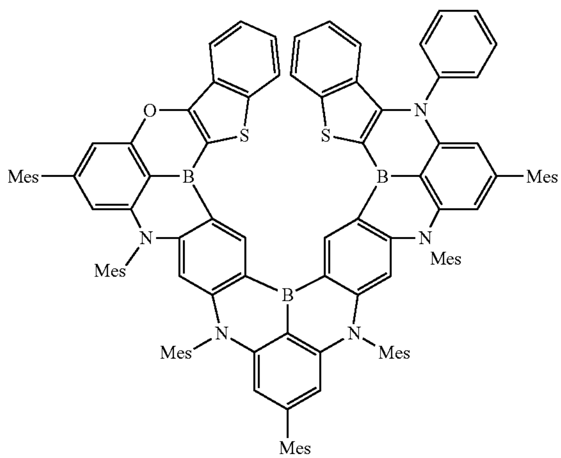

-continued
(1-2-144)
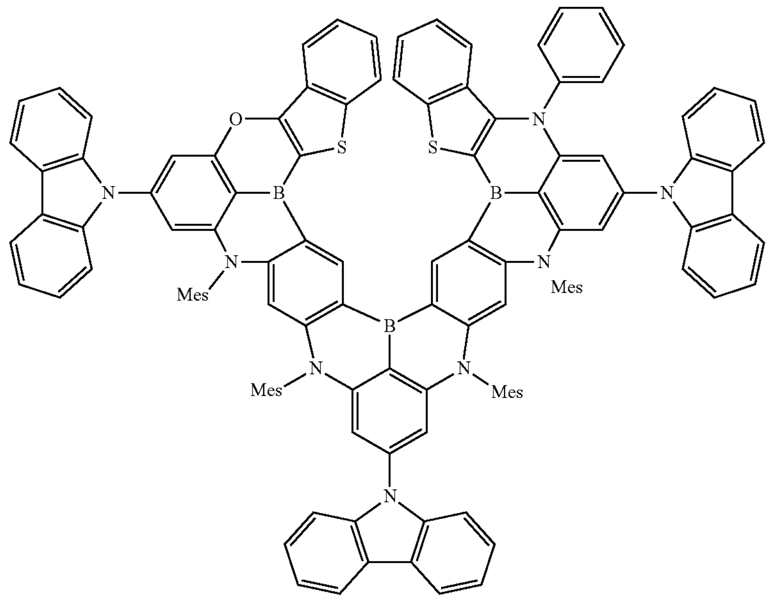
(1-2-145)
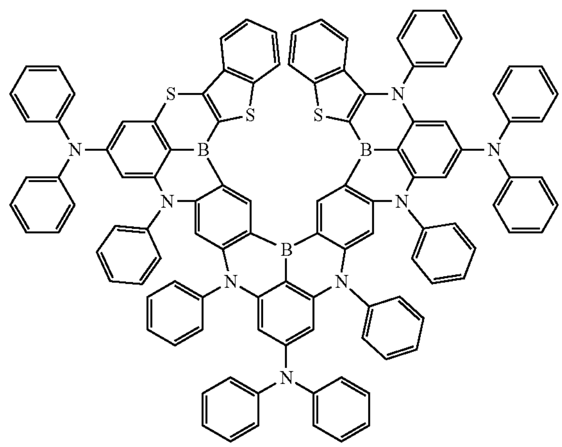
(1-2-146)
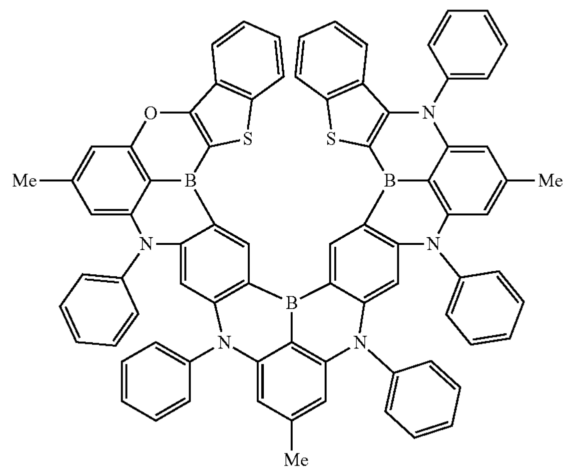
(1-2-147)
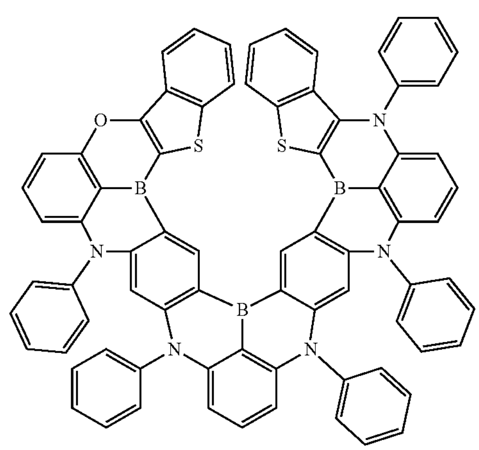
(1-2-148)
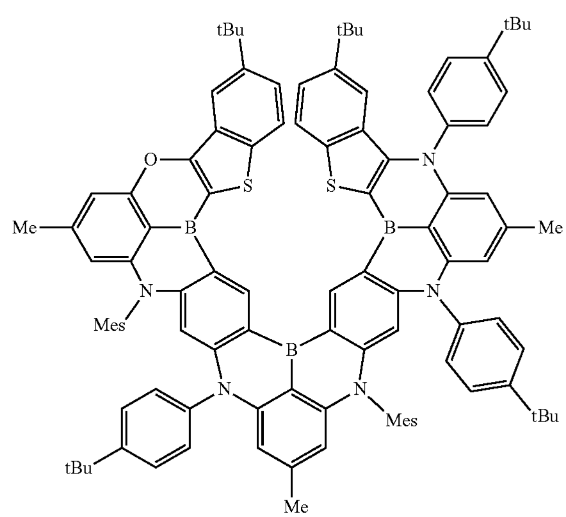

-continued
(1-2-149)
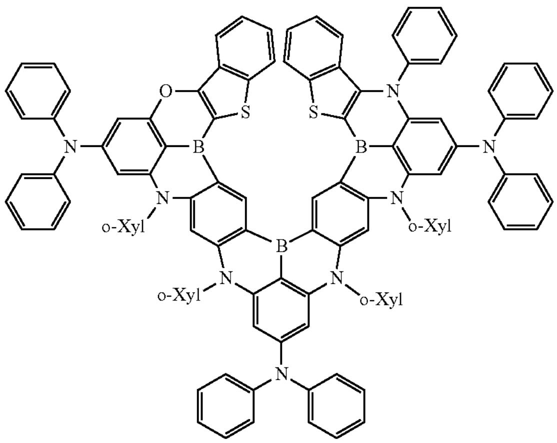
(1-2-150)
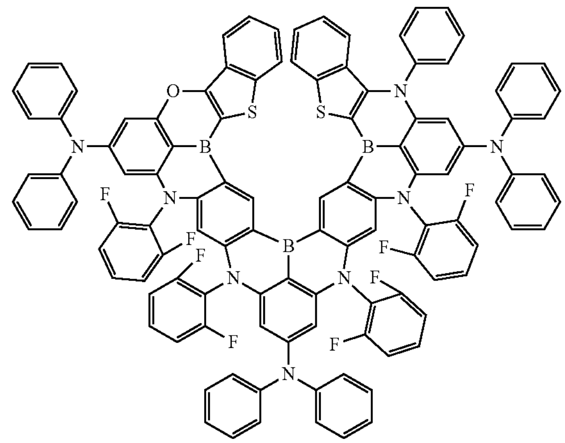
(1-2-161)
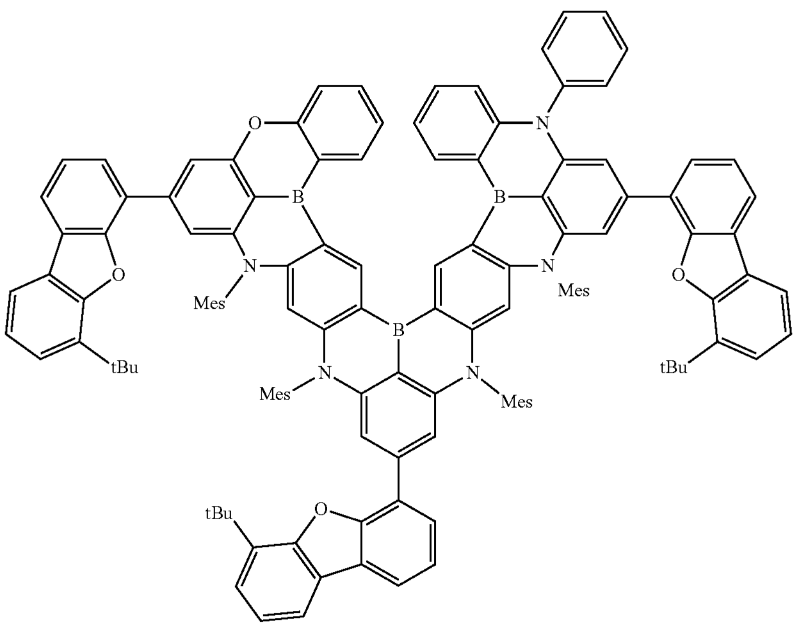
(1-2-162)
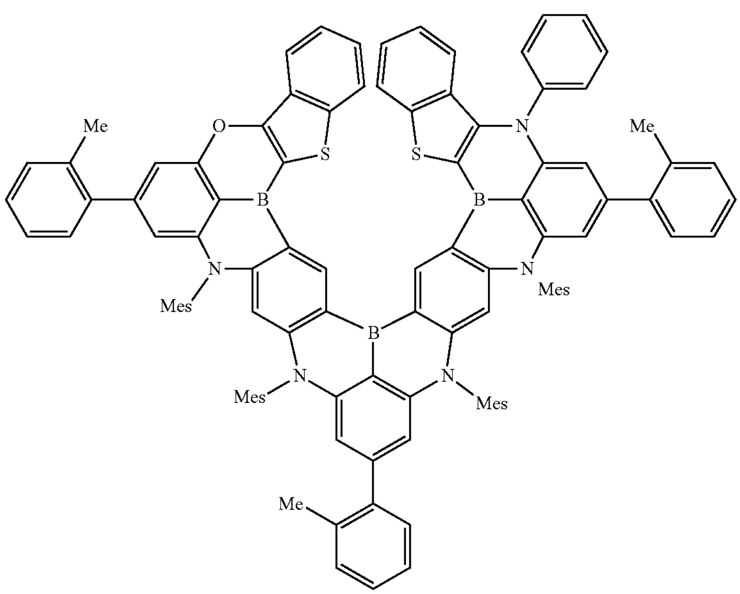

-continued
(1-2-163)
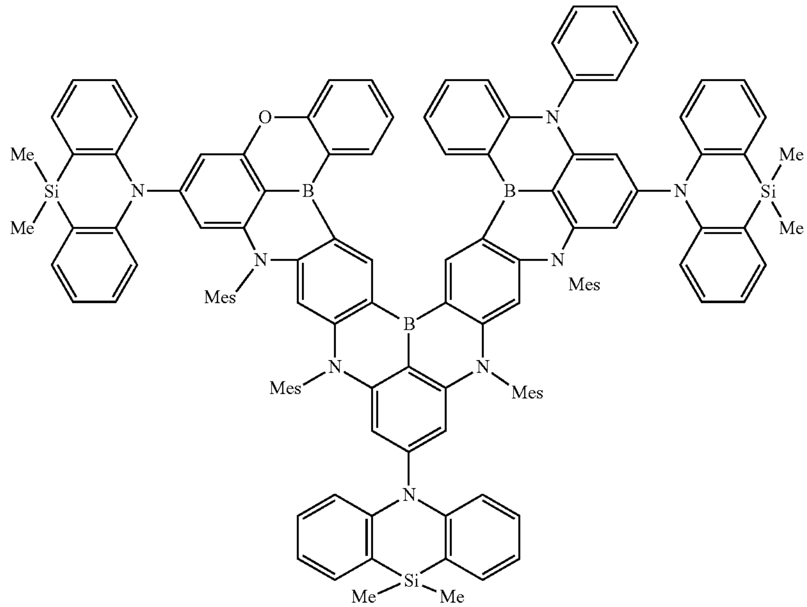
(1-2-164)
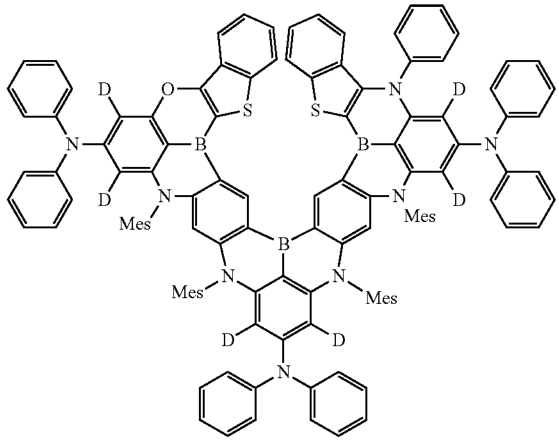
(1-2-165)
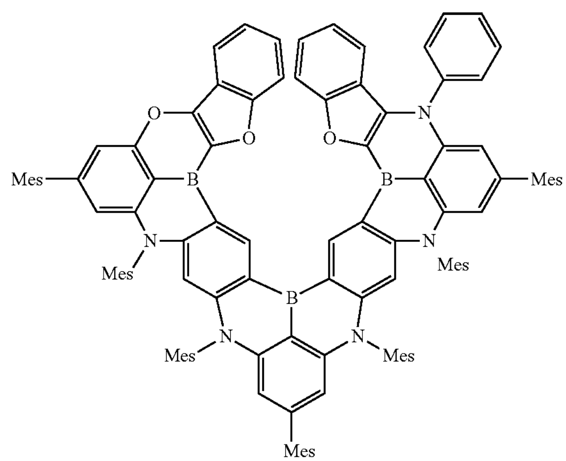
(1-2-166)
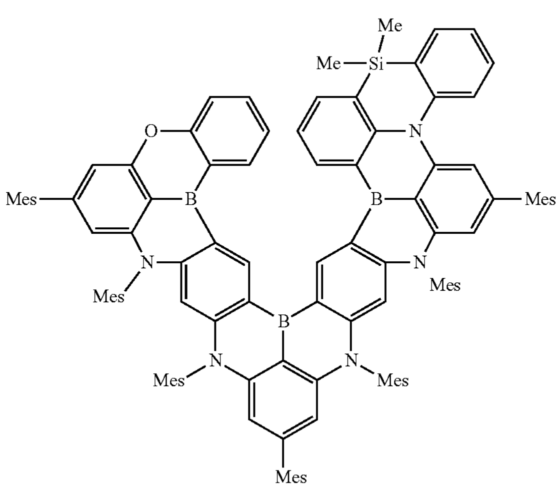
(1-2-167)
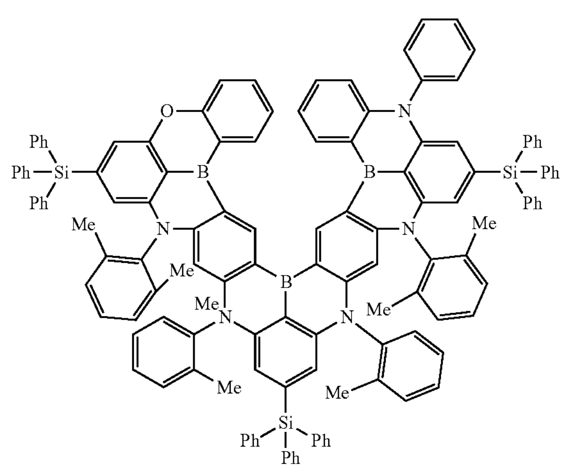

-continued
(1-2-168)
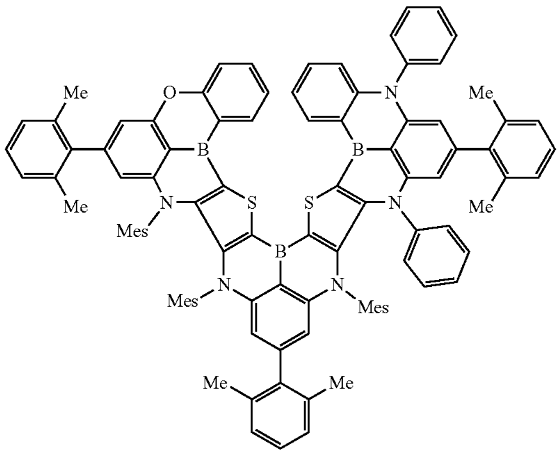
(1-2-169)
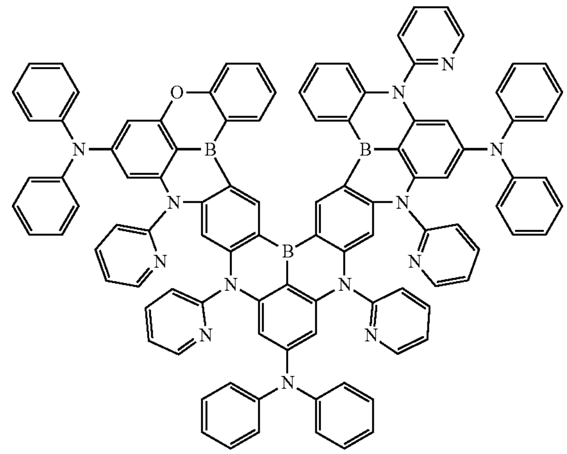
(1-2-170)
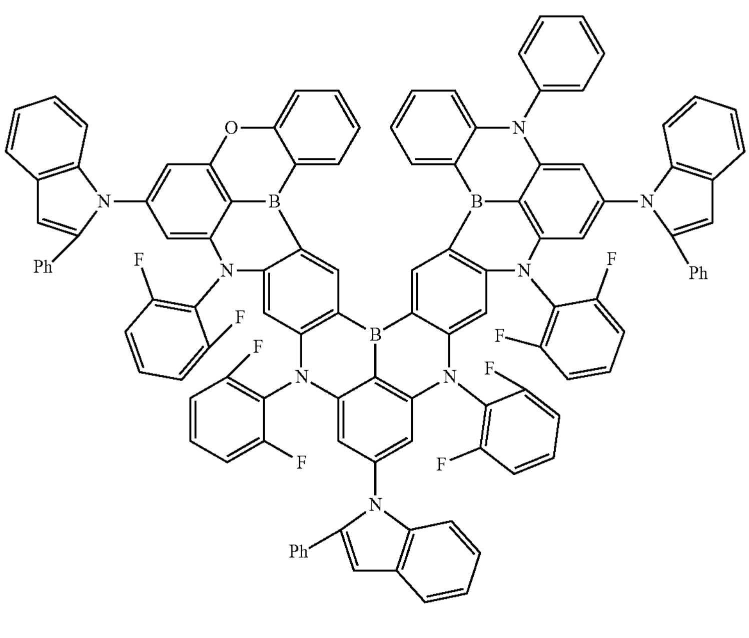

(1-2-191)
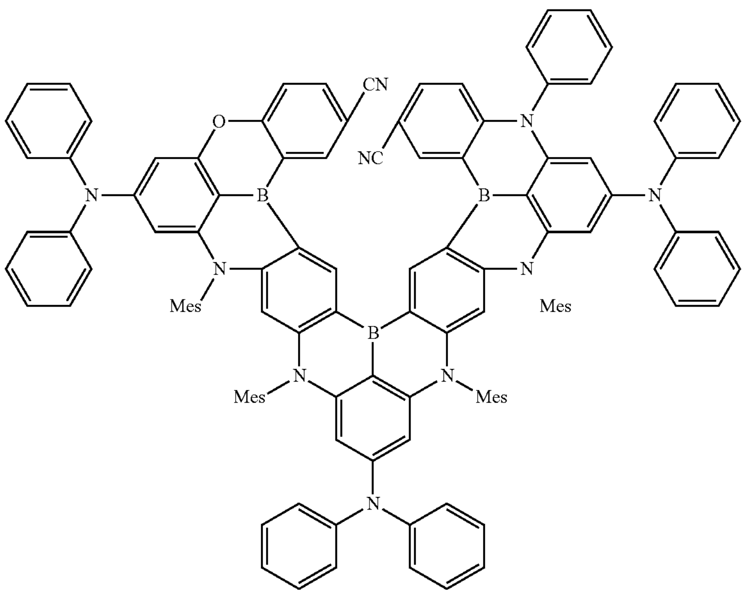
(1-2-192)
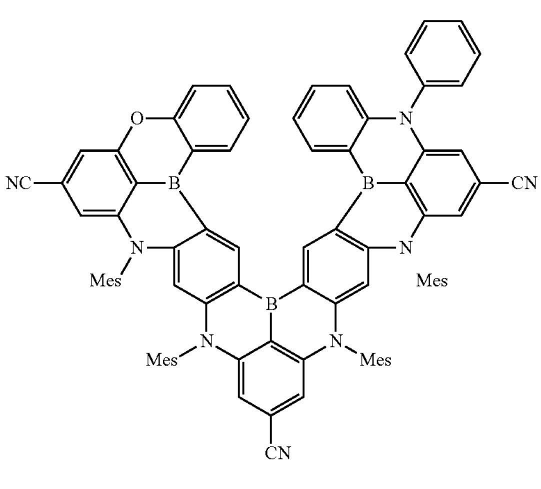
(1-2-193)
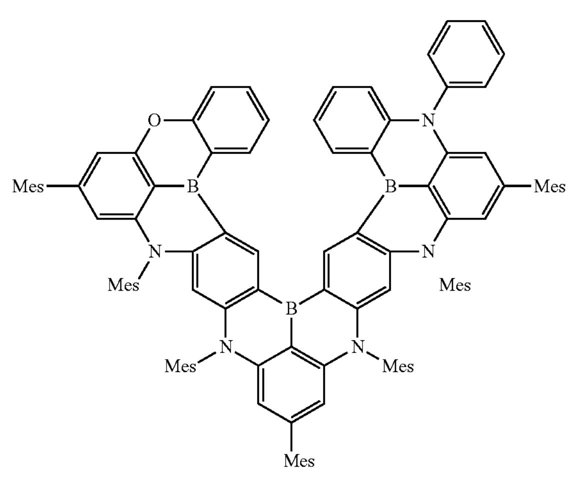

-continued
(1-2-194)
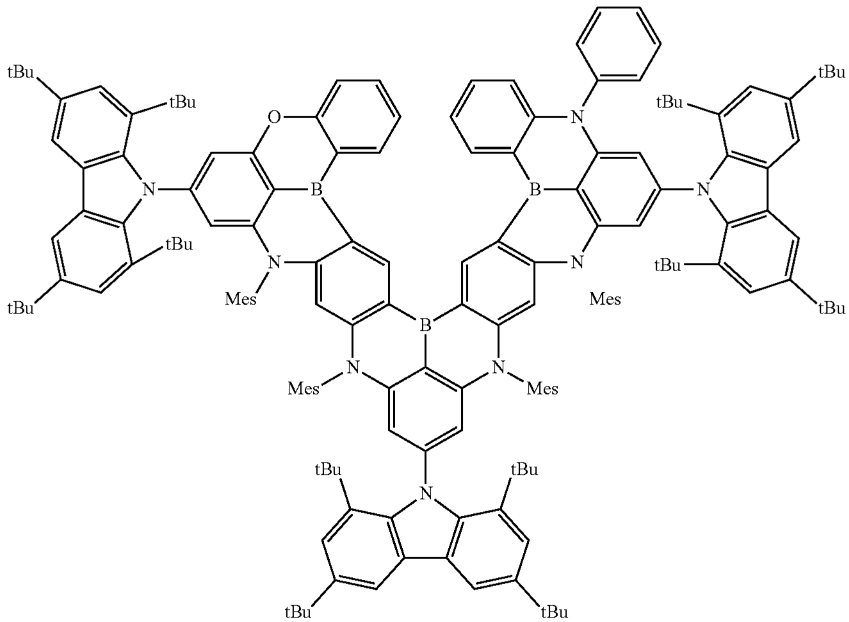
(1-2-195)
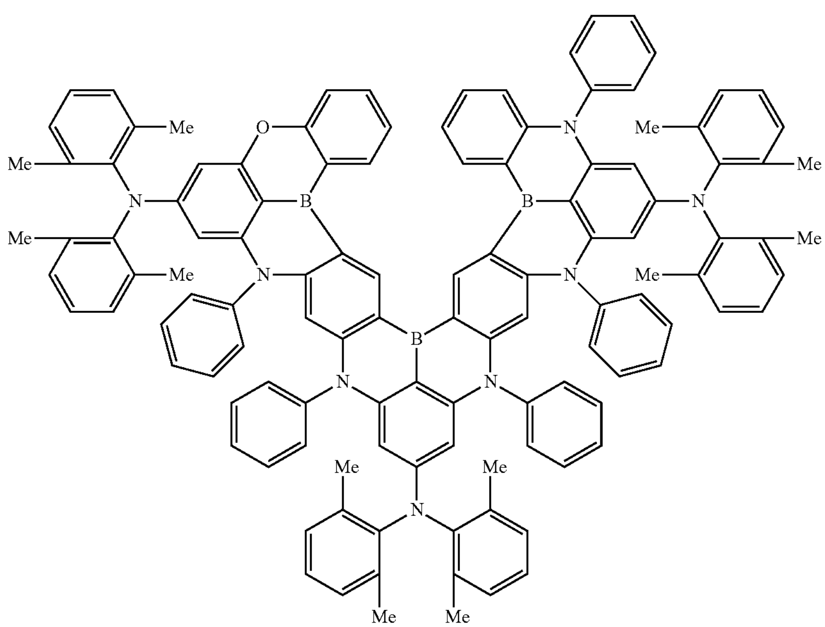

-continued
(1-2-196)
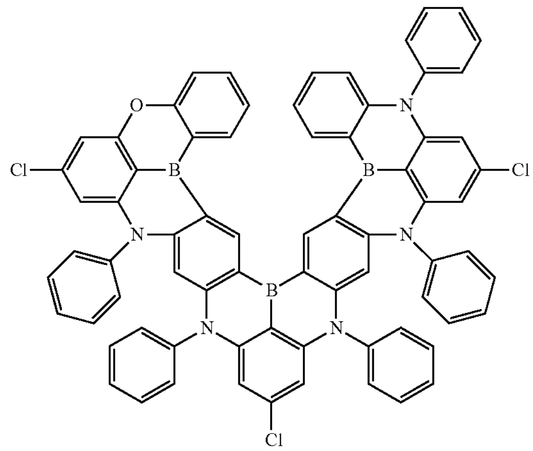
(1-2-197)
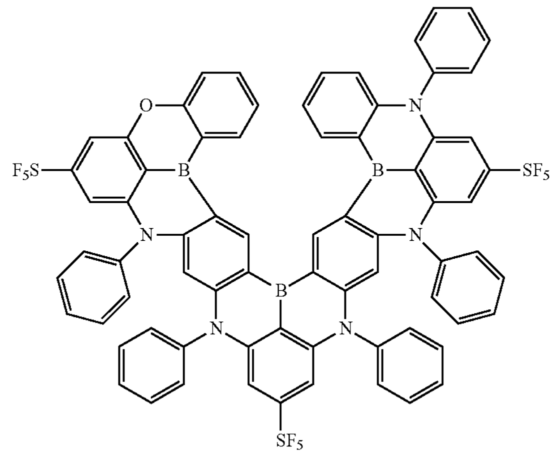
(1-2-198)
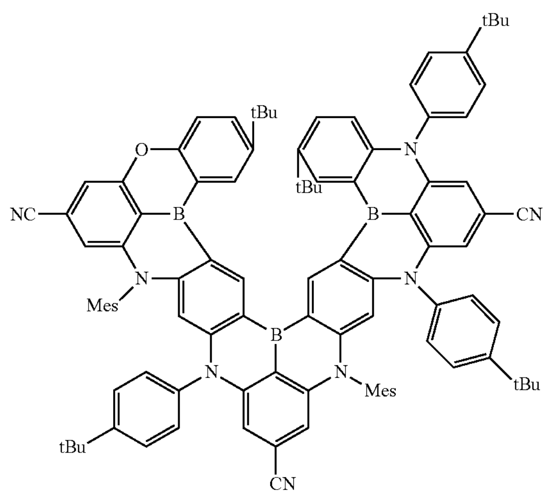
(1-2-199)
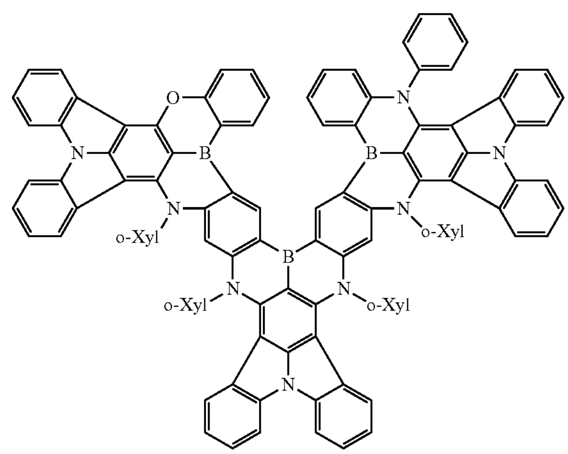
(1-2-200)
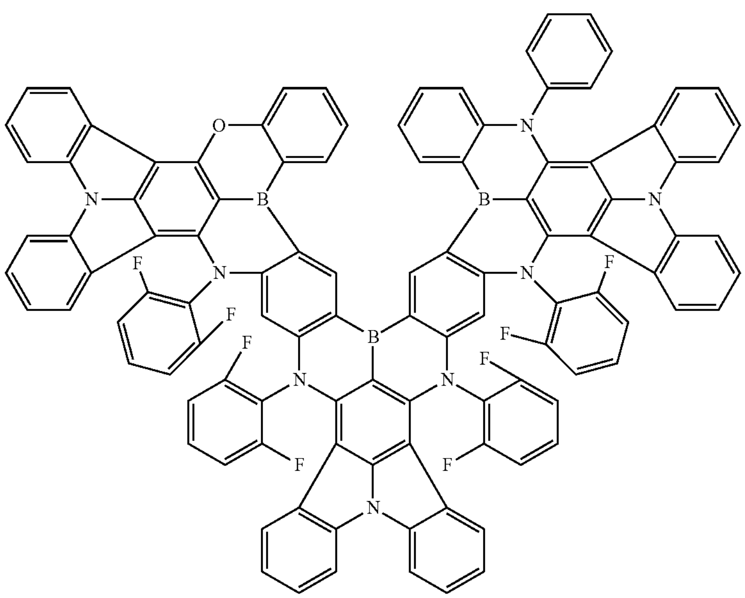

-continued
(1-2-221)
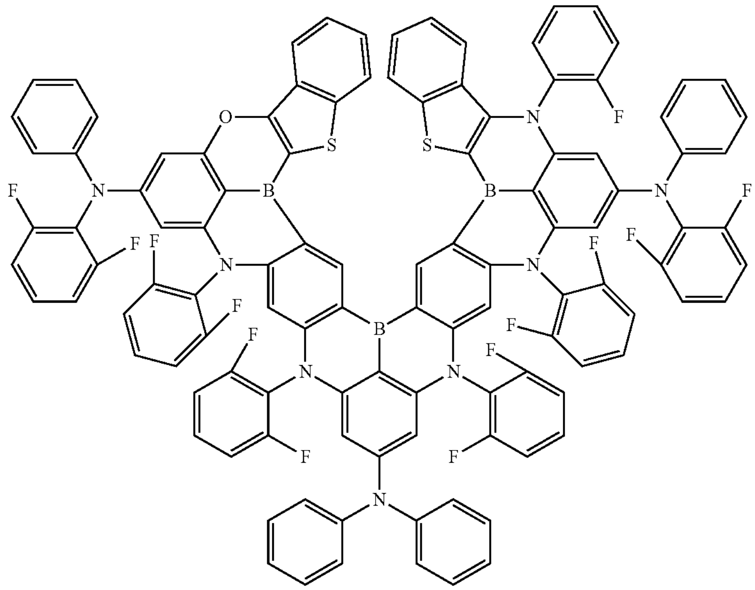
(1-2-222)
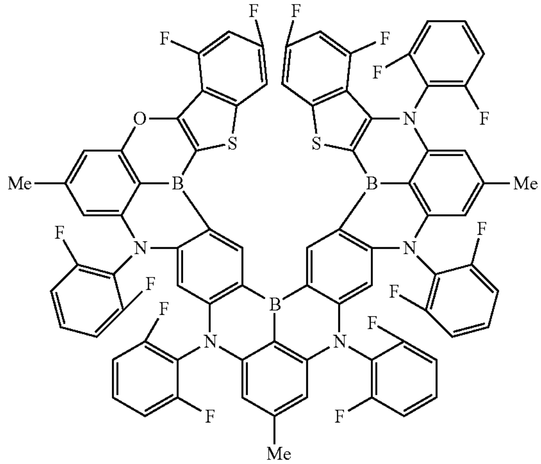
(1-2-223)
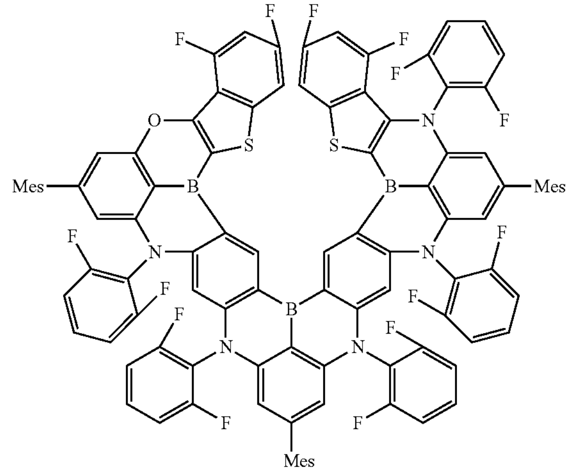

-continued
(1-2-224)
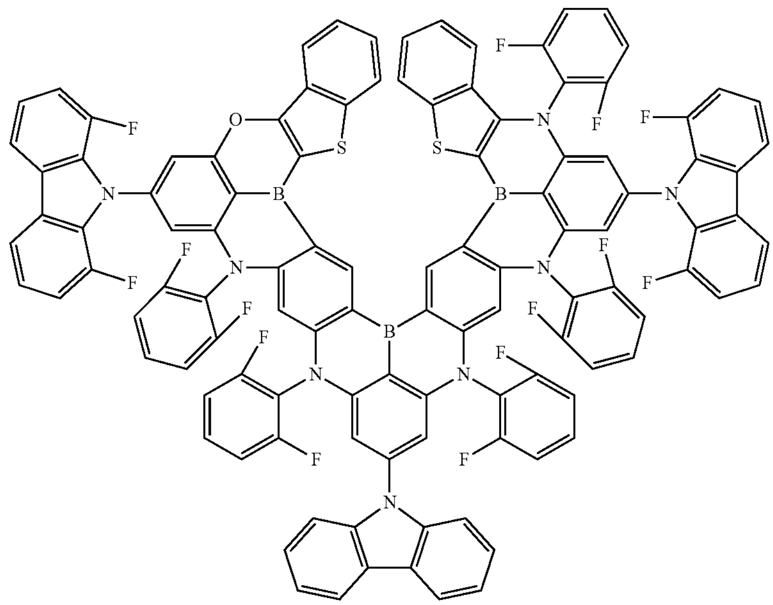
(1-2-225)
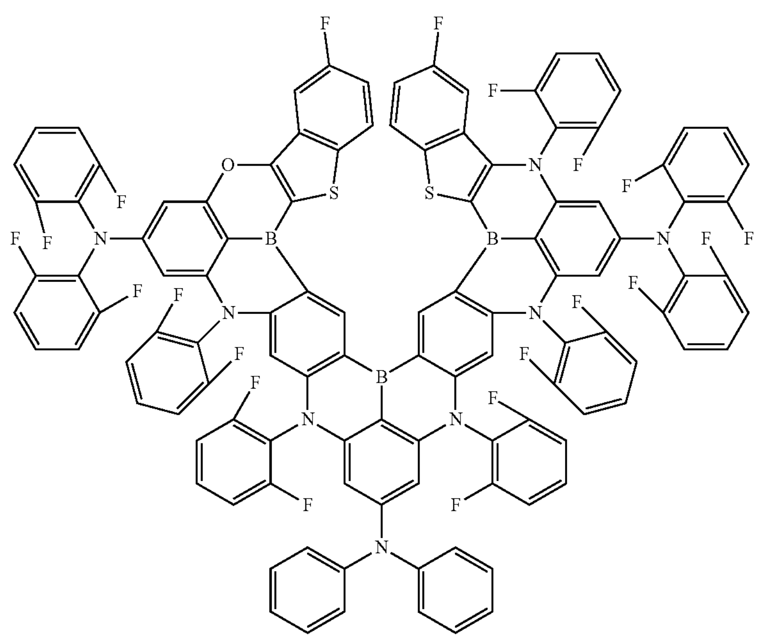

-continued
(1-2-226)
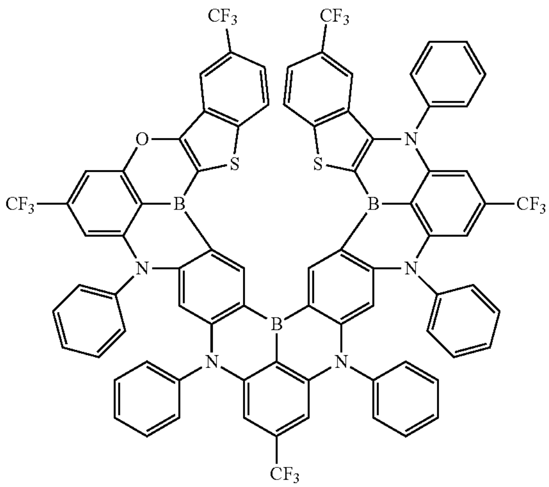
(1-2-227)
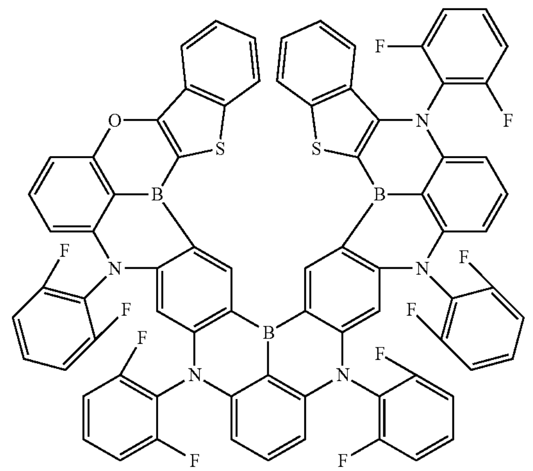
(1-2-228)
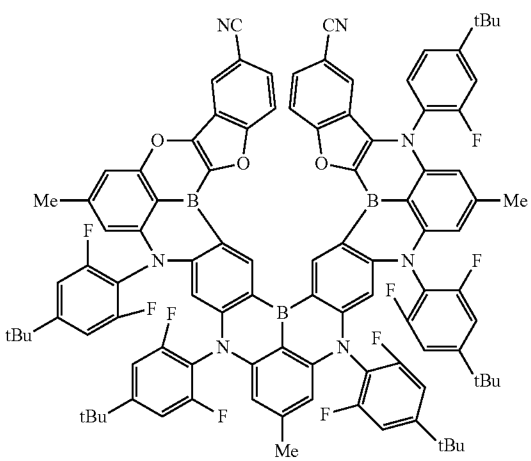
(1-2-229)
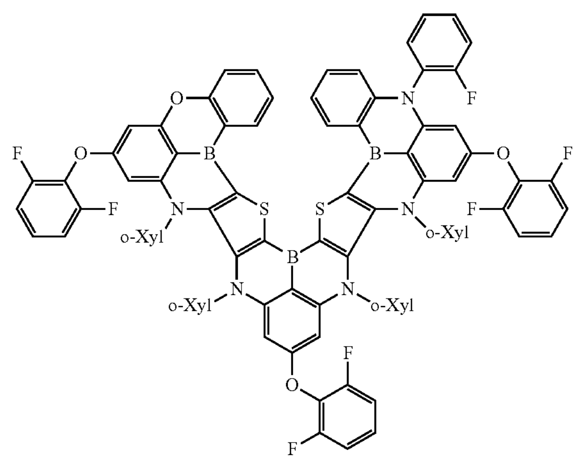
(1-2-230)
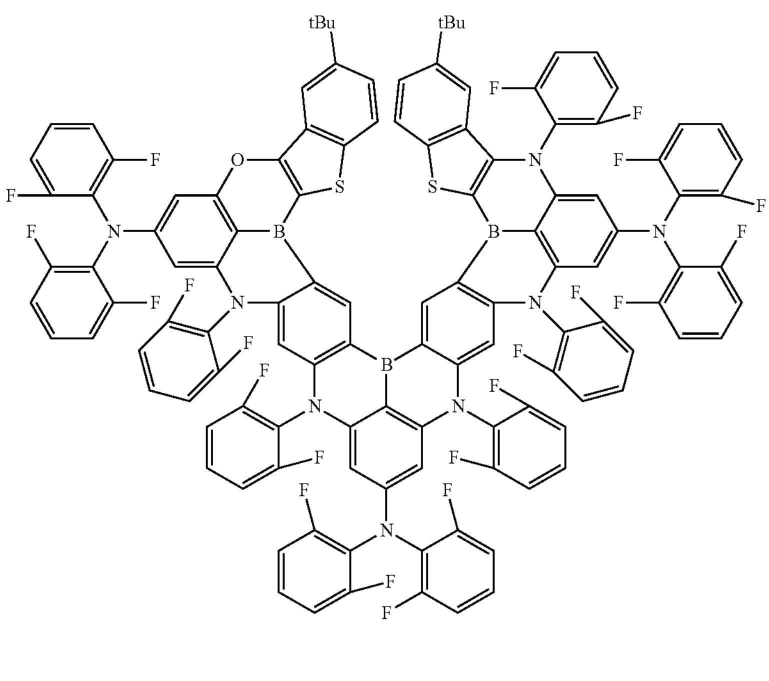

-continued
(1-3-1)
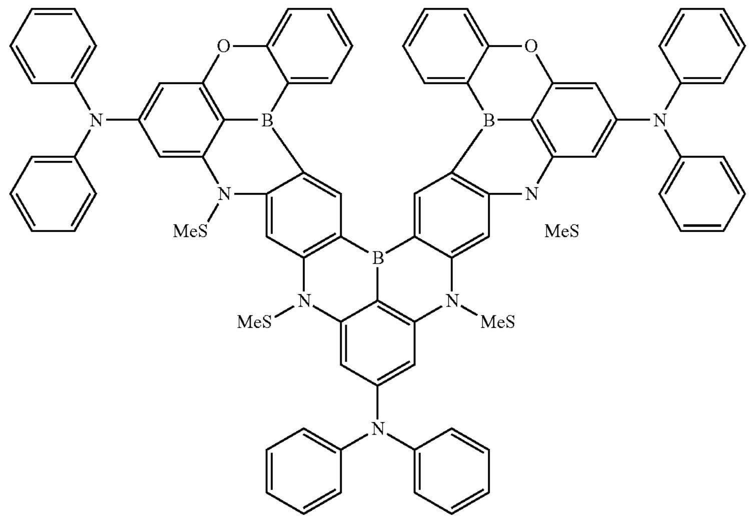
(1-3-2)
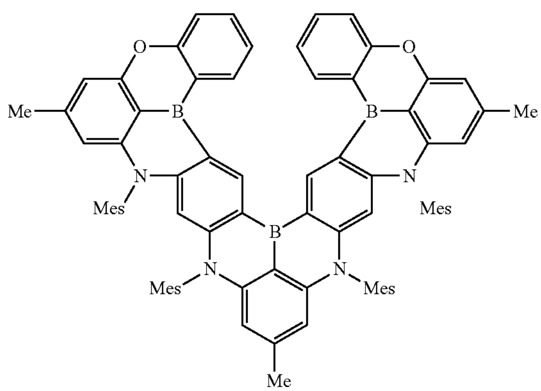
(1-3-3)
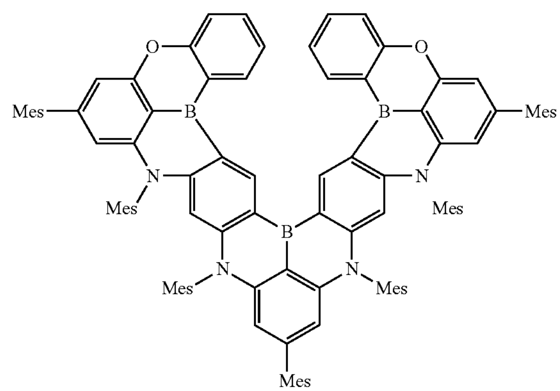
(1-3-4)
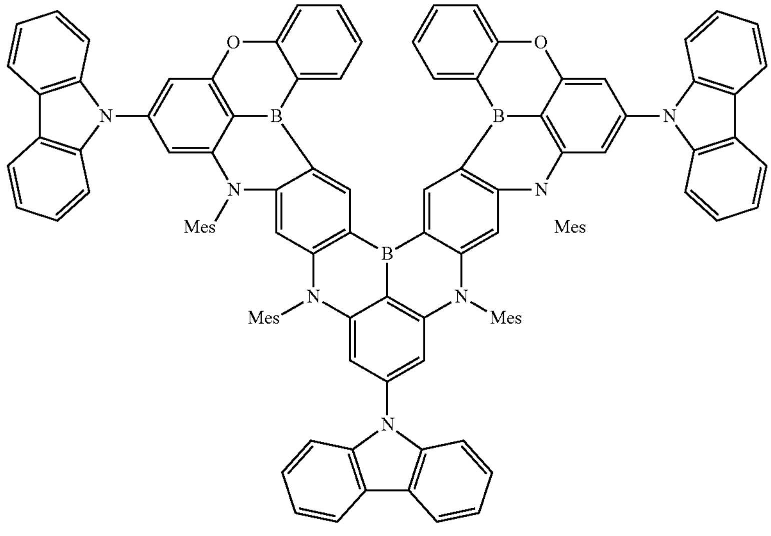

-continued
(1-3-5)
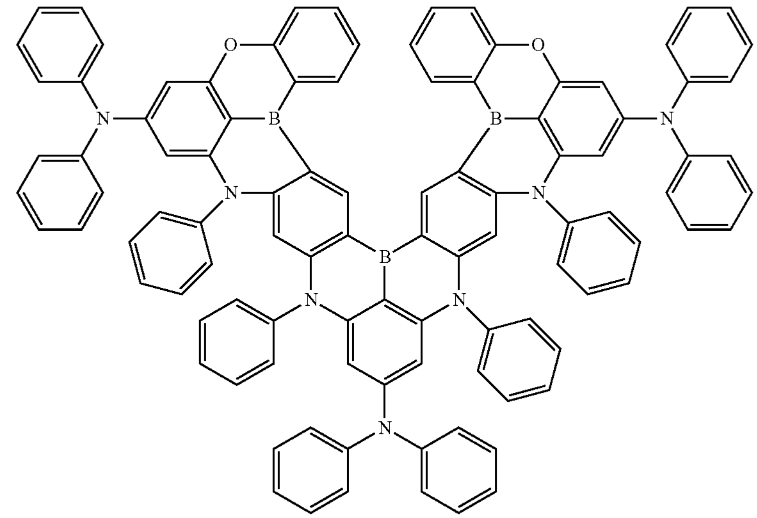
(1-3-6)
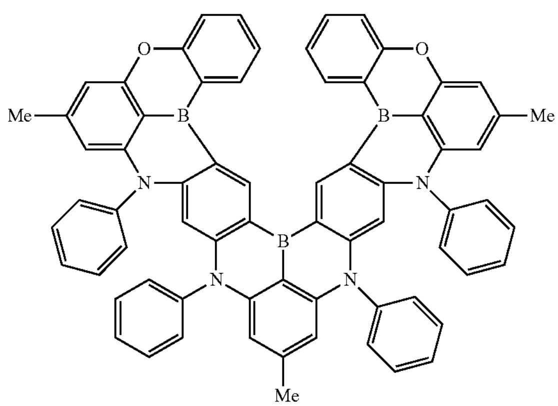
(1-3-7)
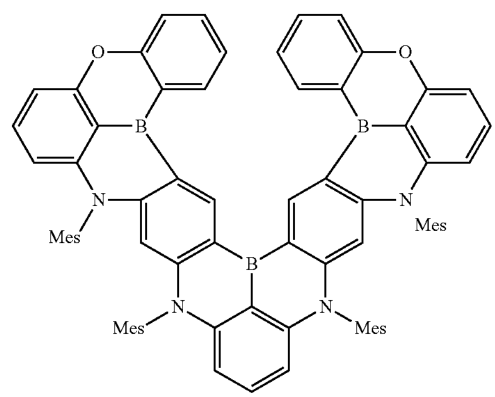
(1-3-8)
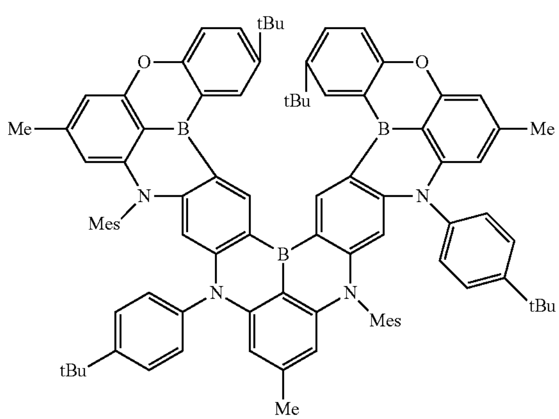
(1-3-9)
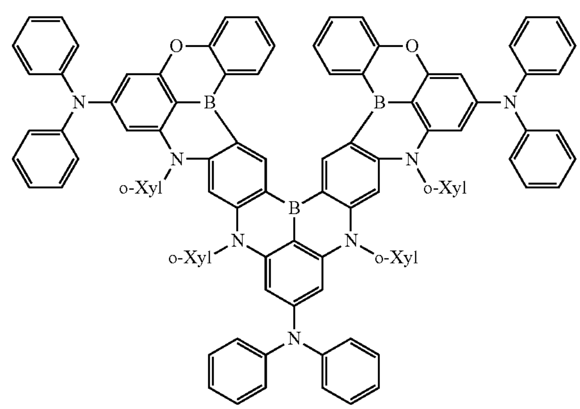

-continued
(1-3-10)
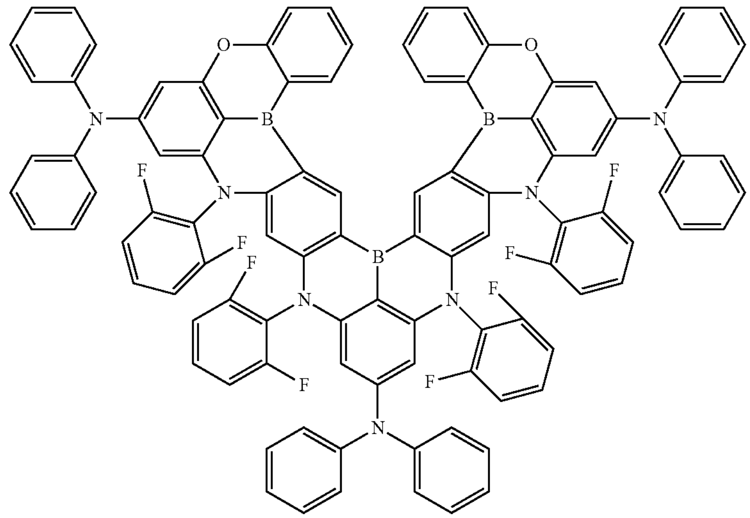
(1-3-21)
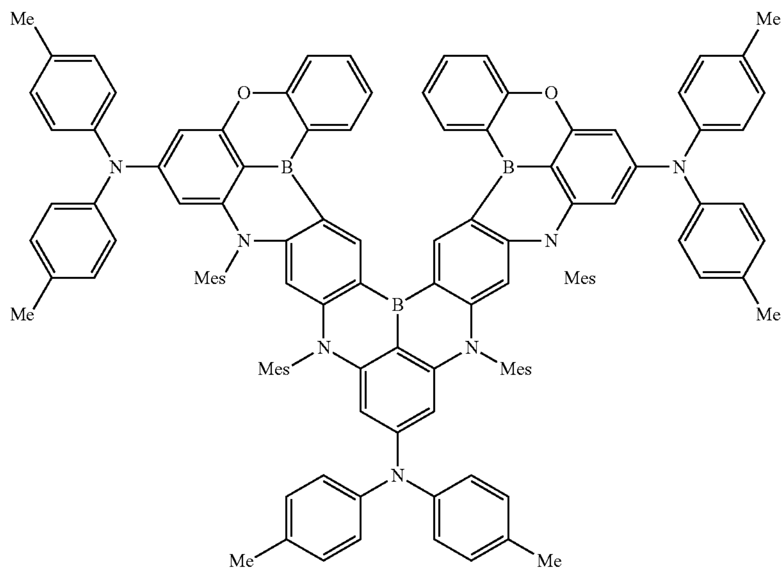
(1-3-22)
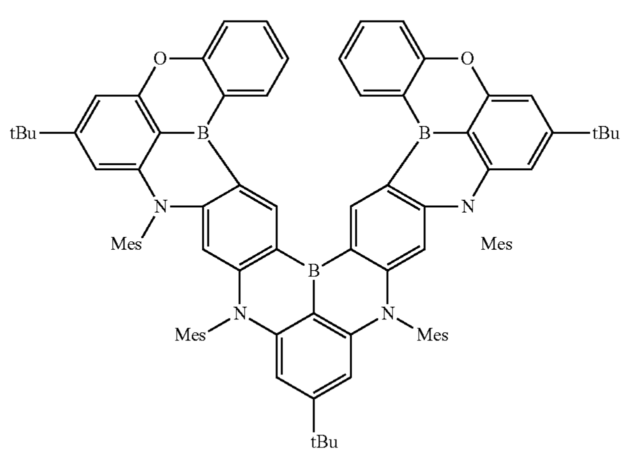

-continued
(1-3-23)
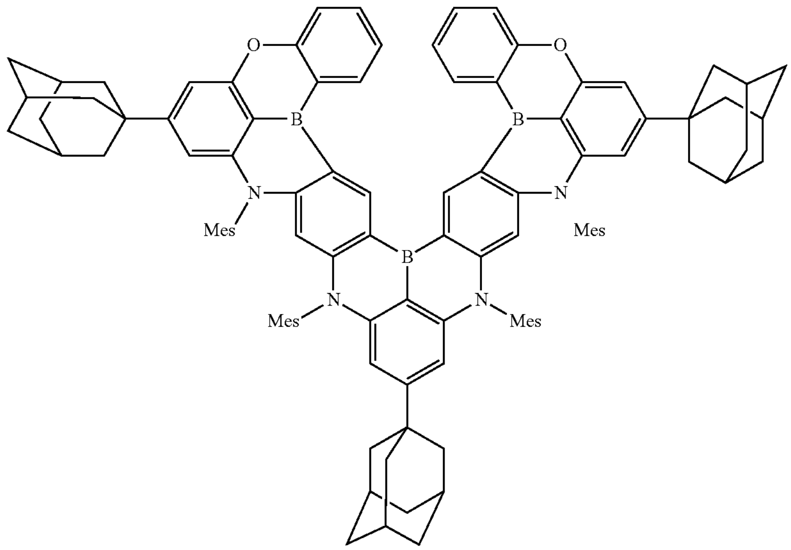
(1-3-24)
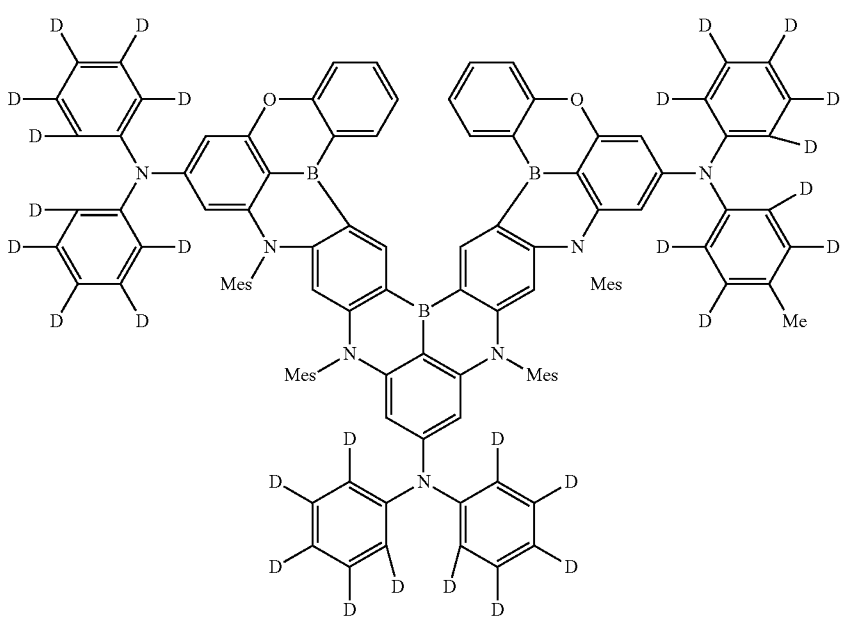

-continued
(1-3-25)
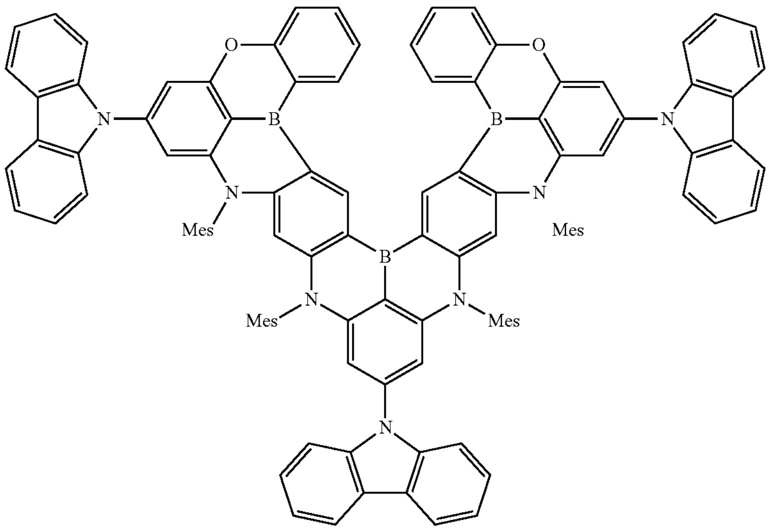
(1-3-26)
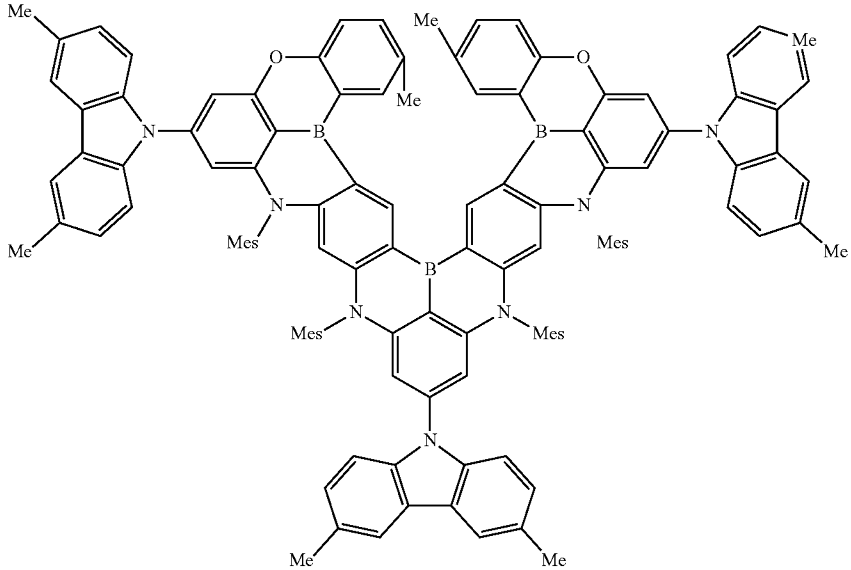
(1-3-27)
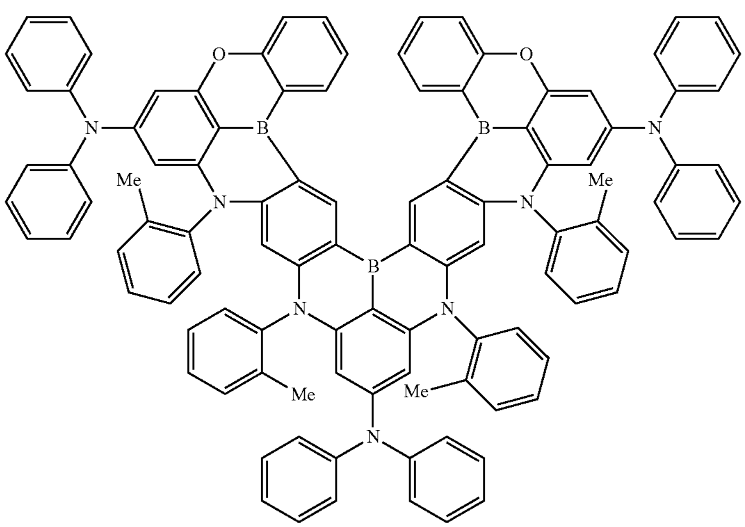

-continued
(1-3-28)
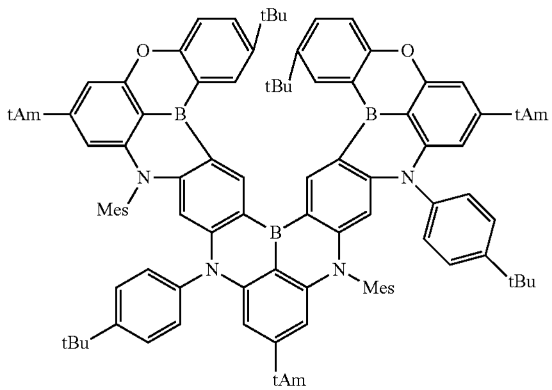
(1-3-29)
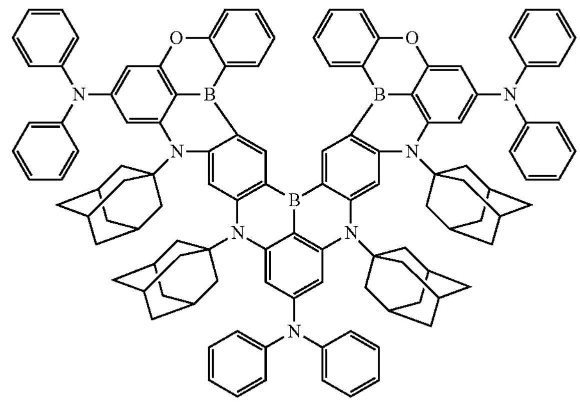
(1-3-30)
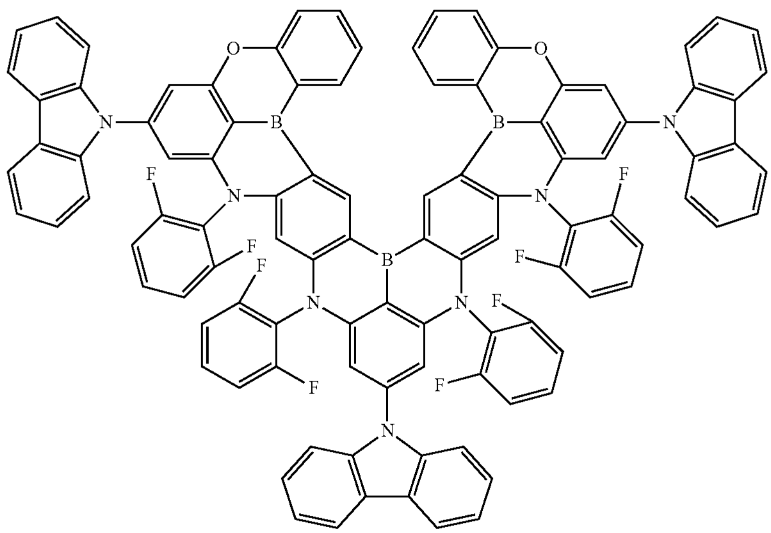
(1-3-41)
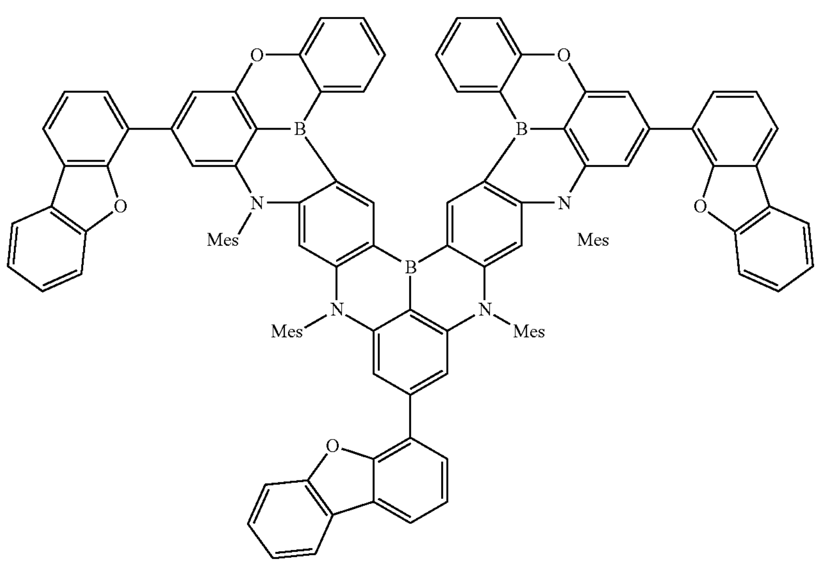

-continued
(1-3-42)
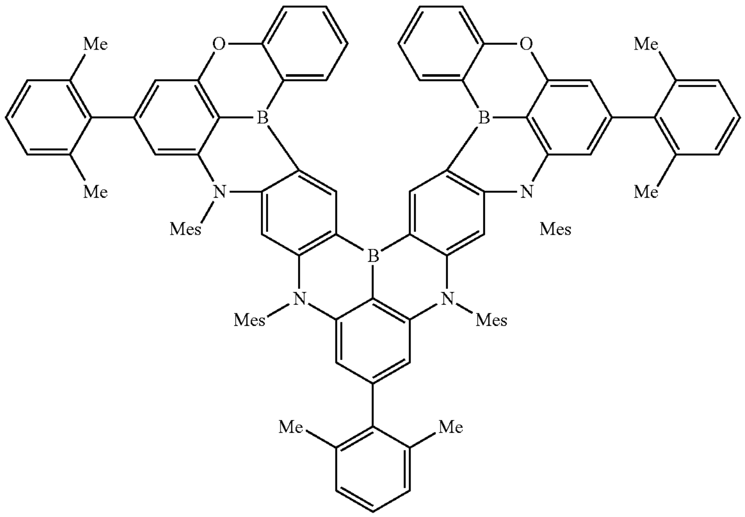
(1-3-43)
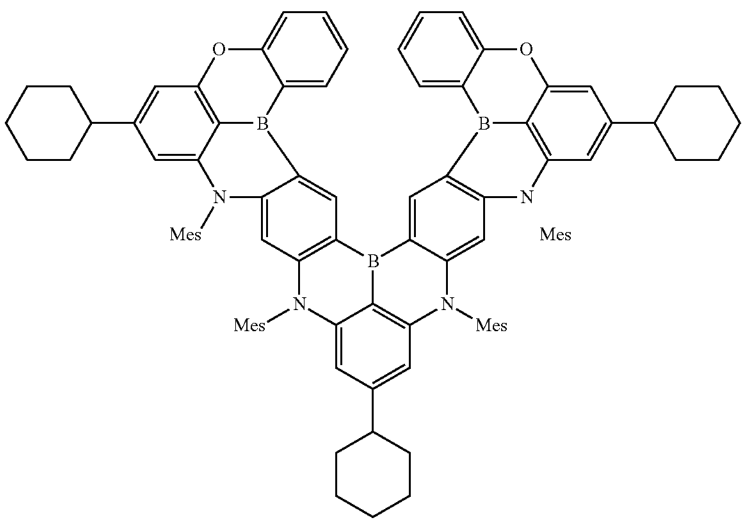
(1-3-44)
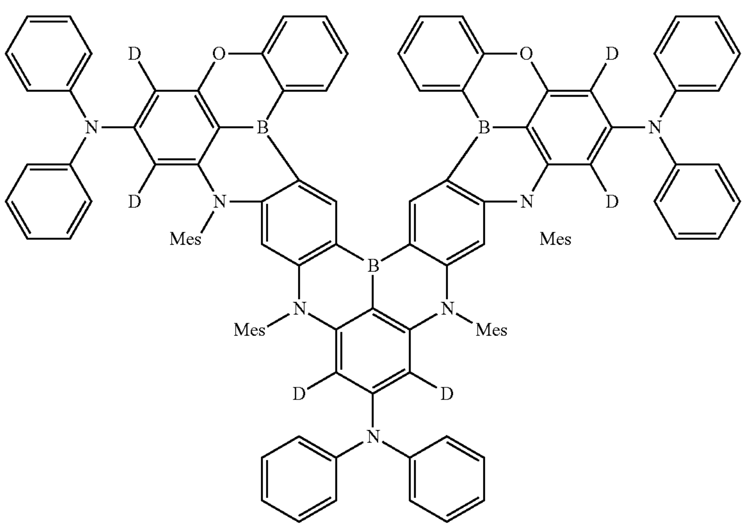

-continued
(1-3-45)
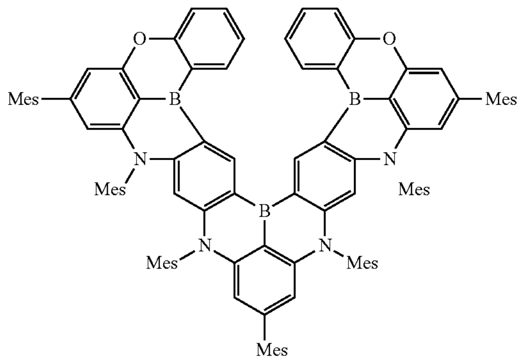
(1-3-46)
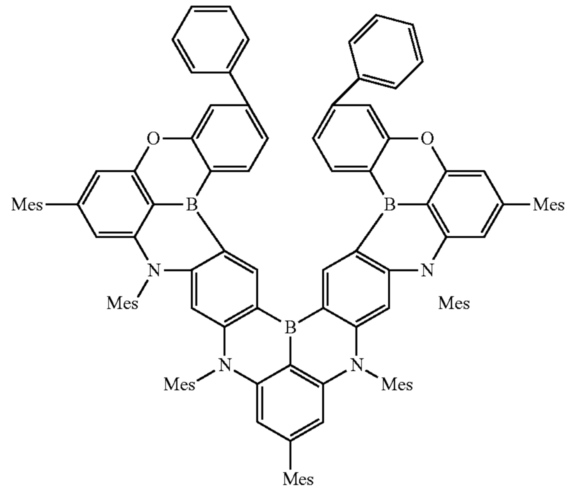
(1-3-47)
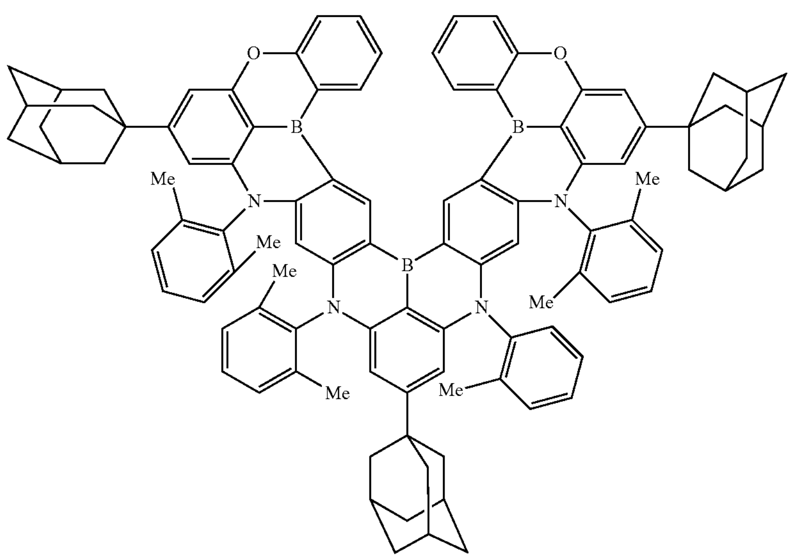

-continued
(1-3-48)
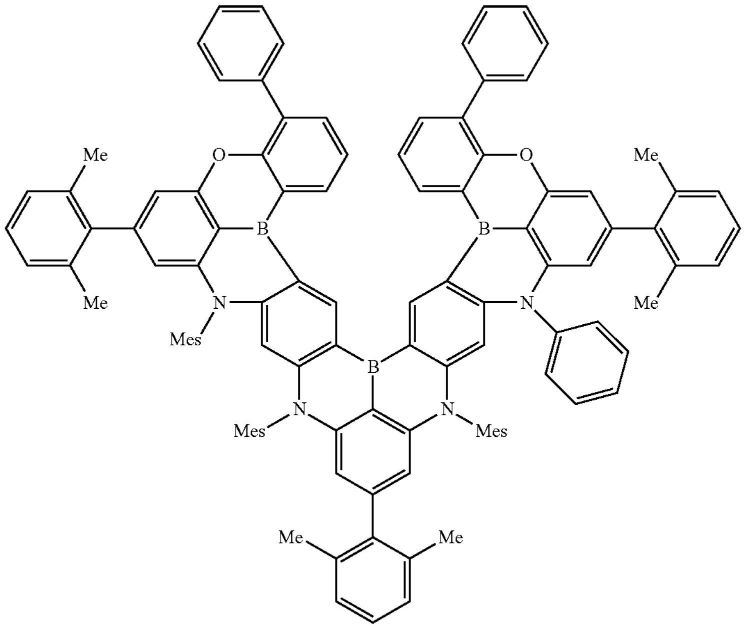
(1-3-49)
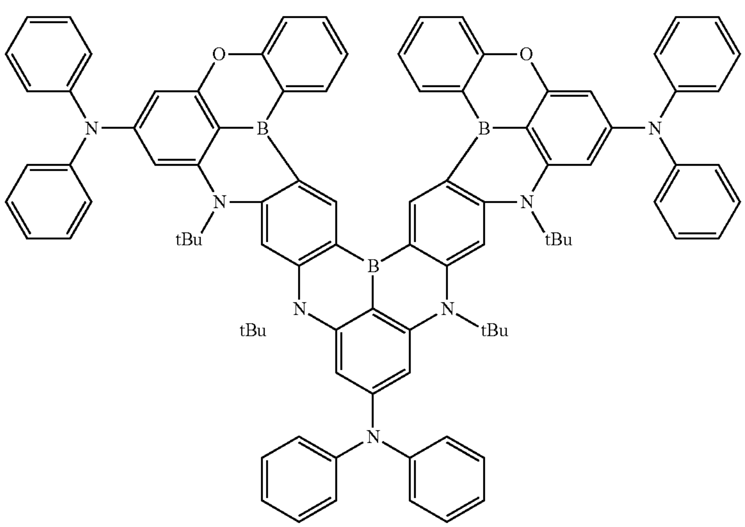

-continued
(1-3-50)
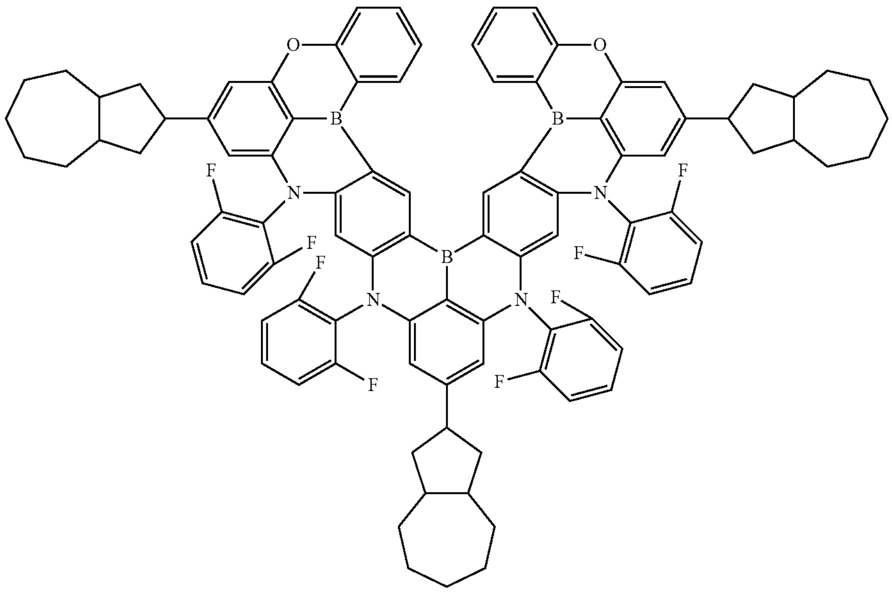
(1-3-101)
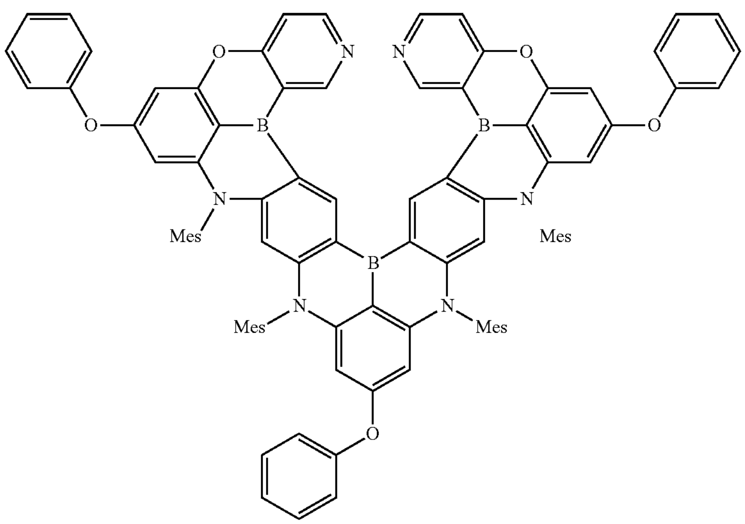
(1-3-102)
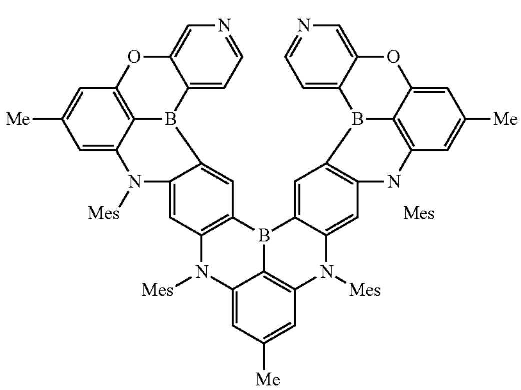
(1-3-103)
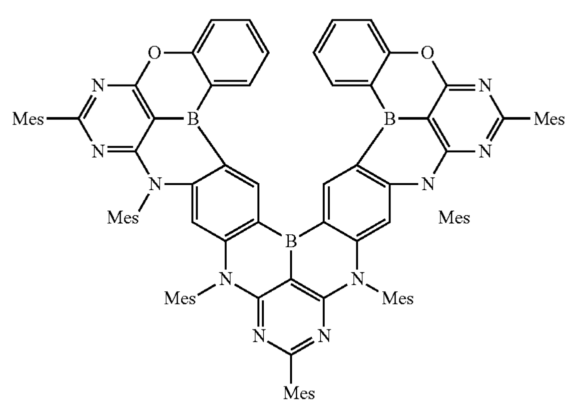

-continued
(1-3-104)
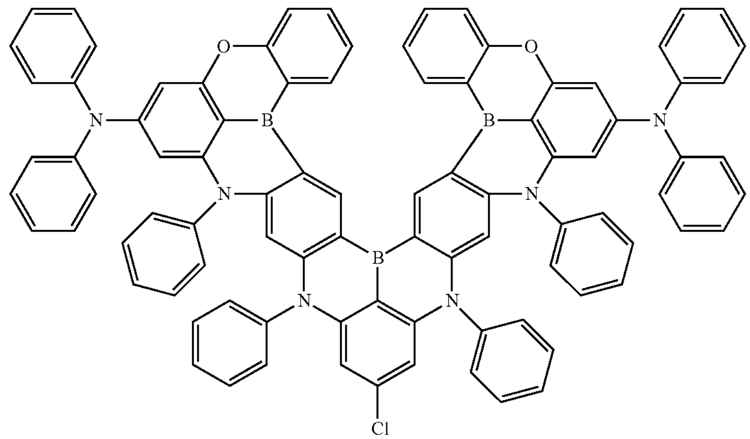
(1-3-105)
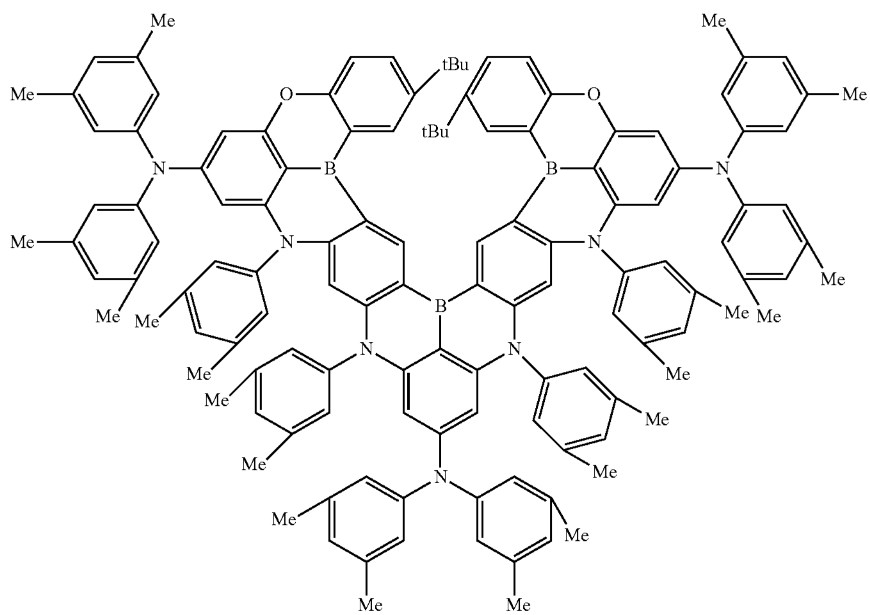
(1-3-106)
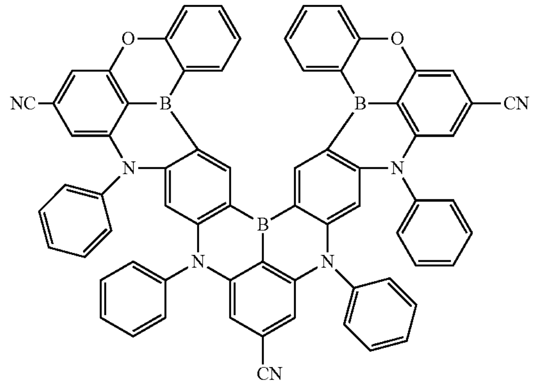
(1-3-107)
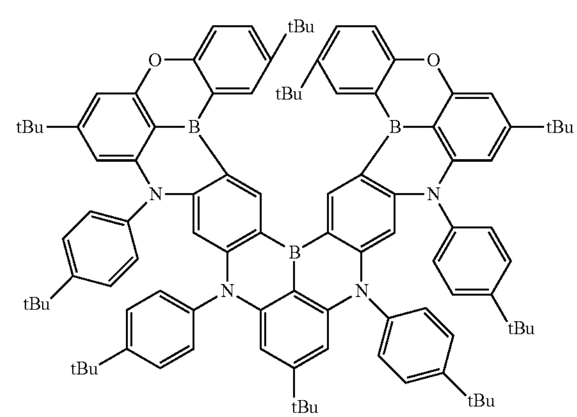

-continued
(1-3-108)
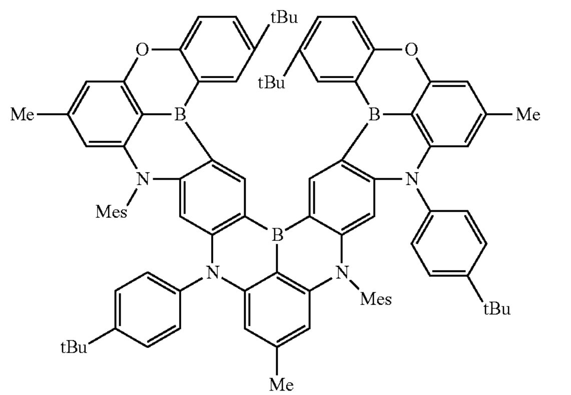
(1-3-109)
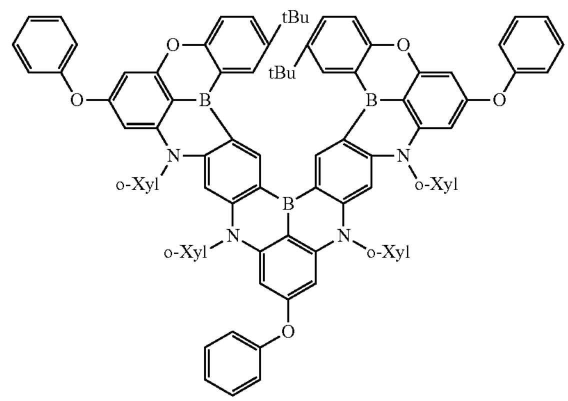
(1-3-110)
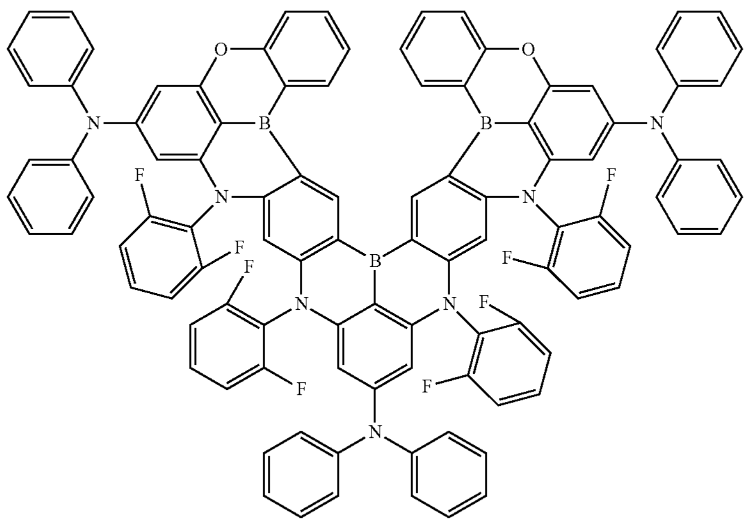
(1-3-121)
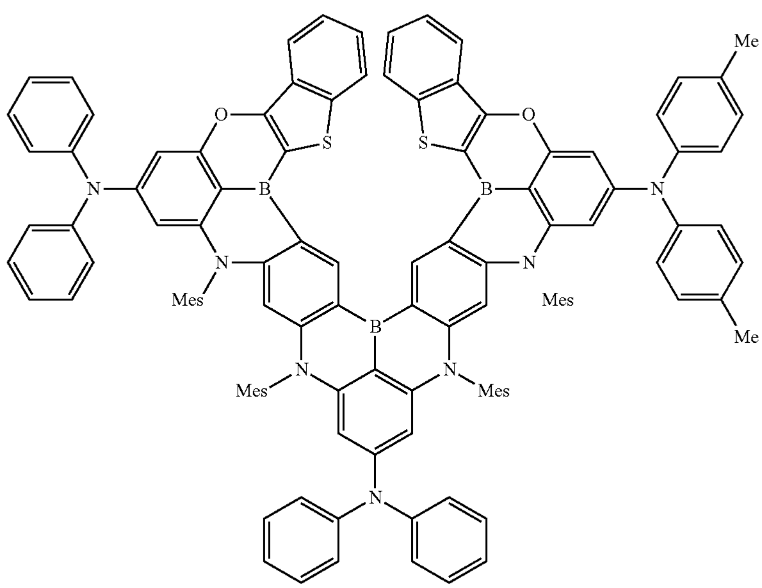

-continued
(1-3-122)
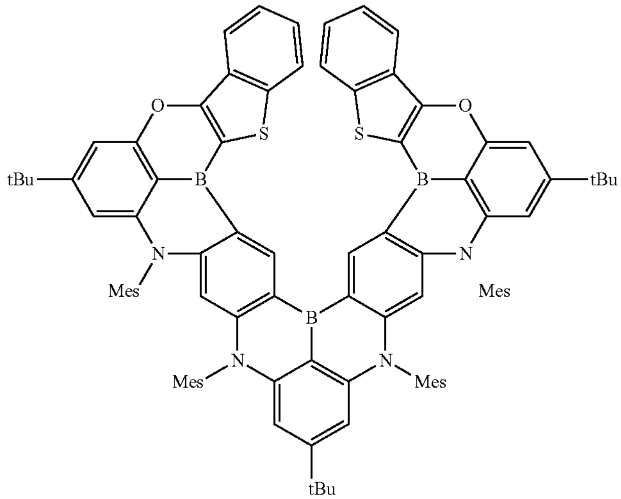
(1-3-123)
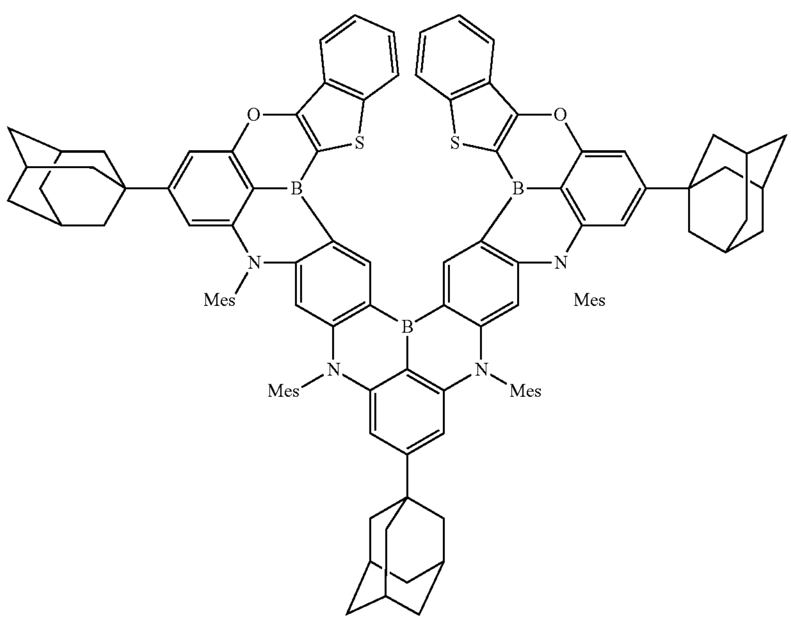

-continued
(1-3-124)
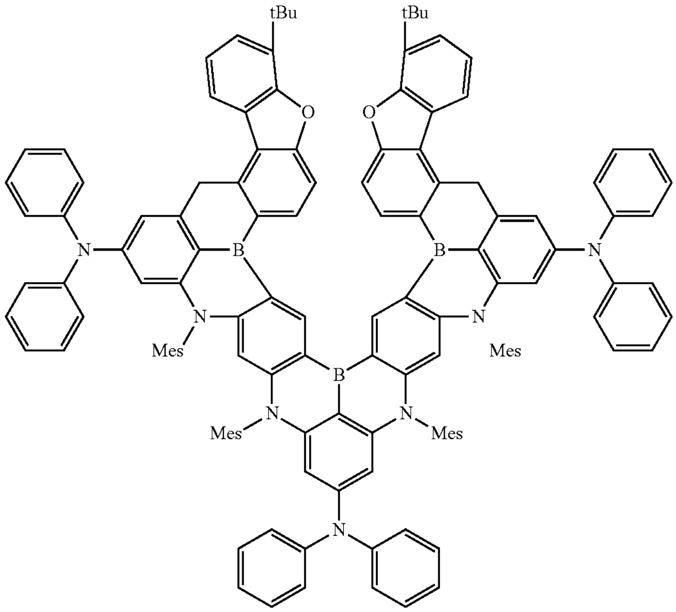
(1-3-125)
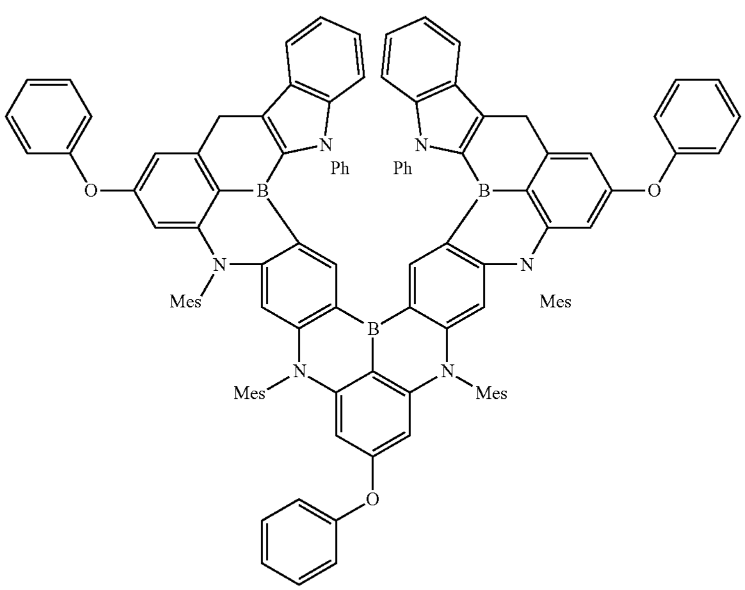

-continued
(1-3-126)
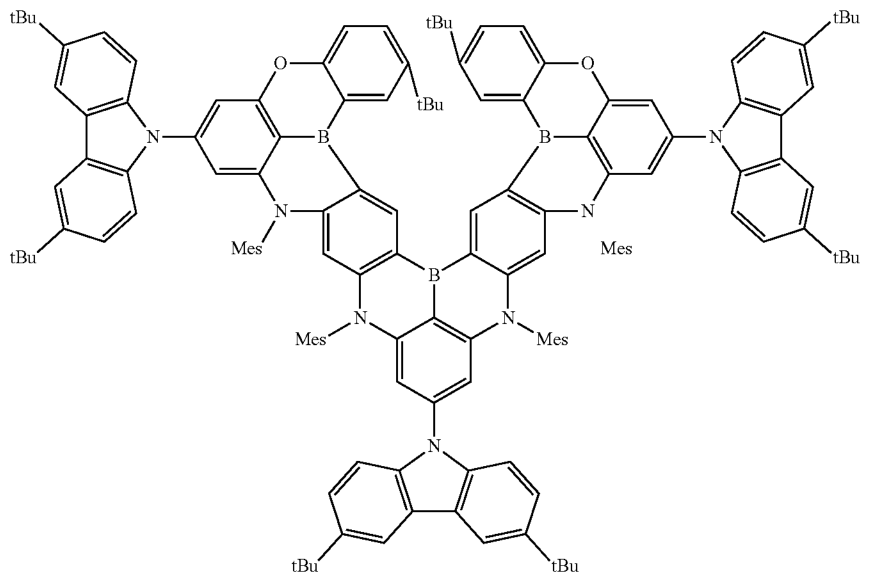
(1-3-127)
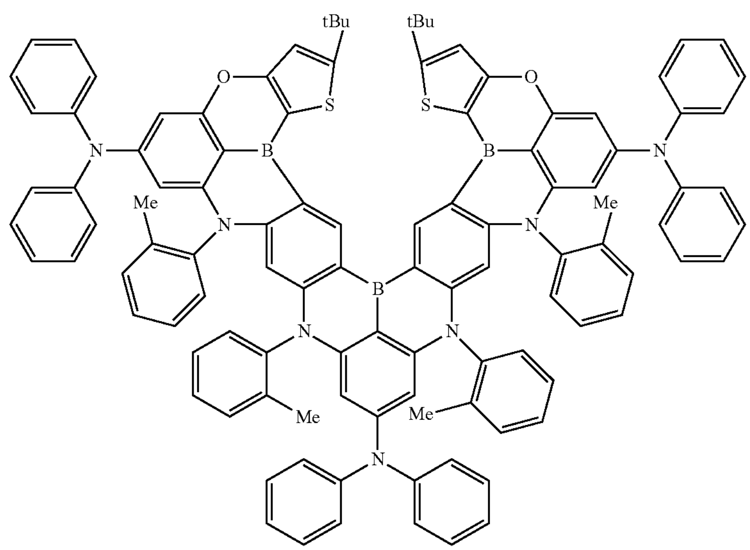
(1-3-128)
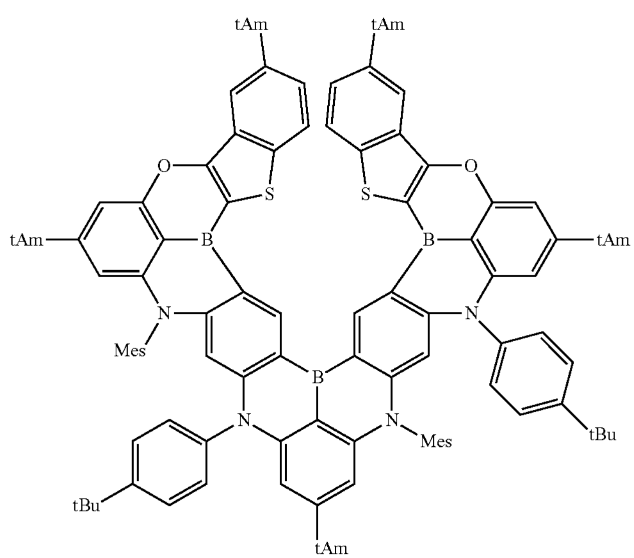

-continued
(1-3-129)
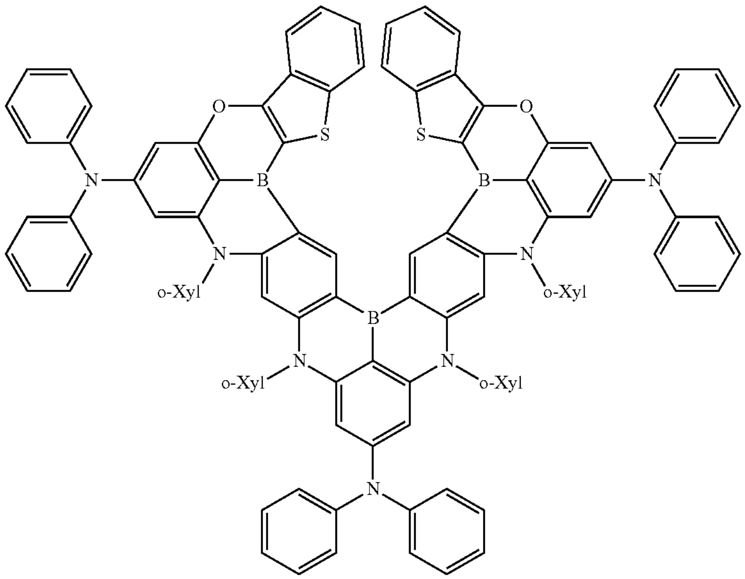
(1-3-130)
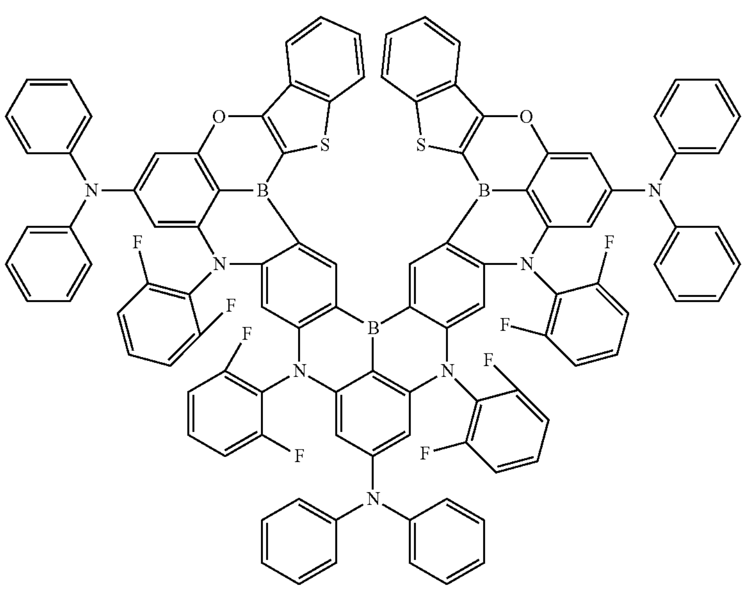

-continued
(1-3-141)
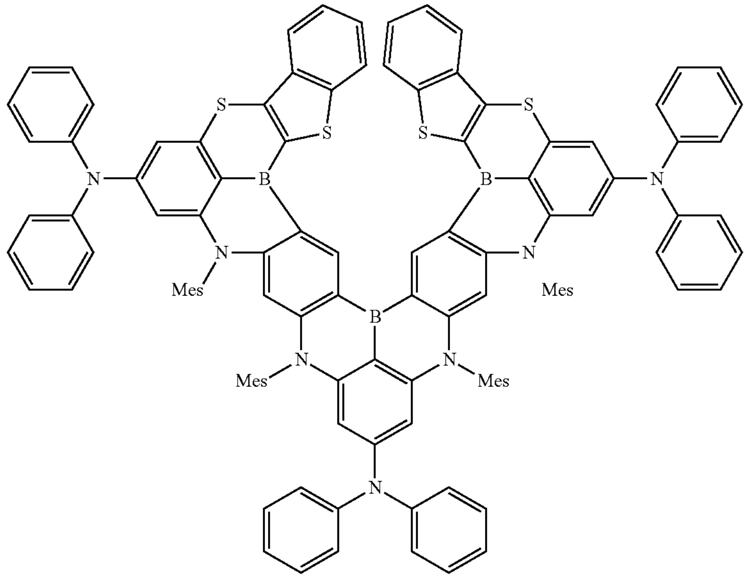
(1-3-142)
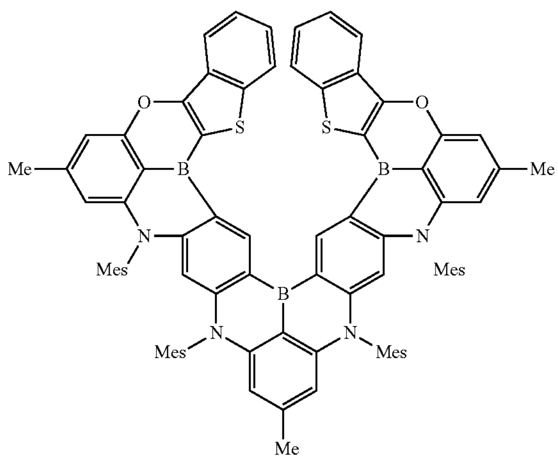
(1-3-143)
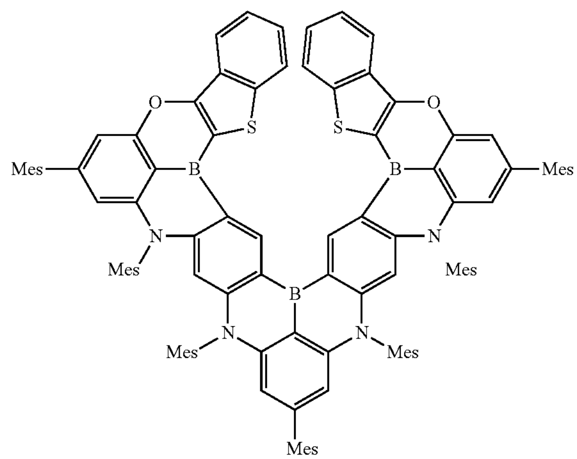
(1-3-144)
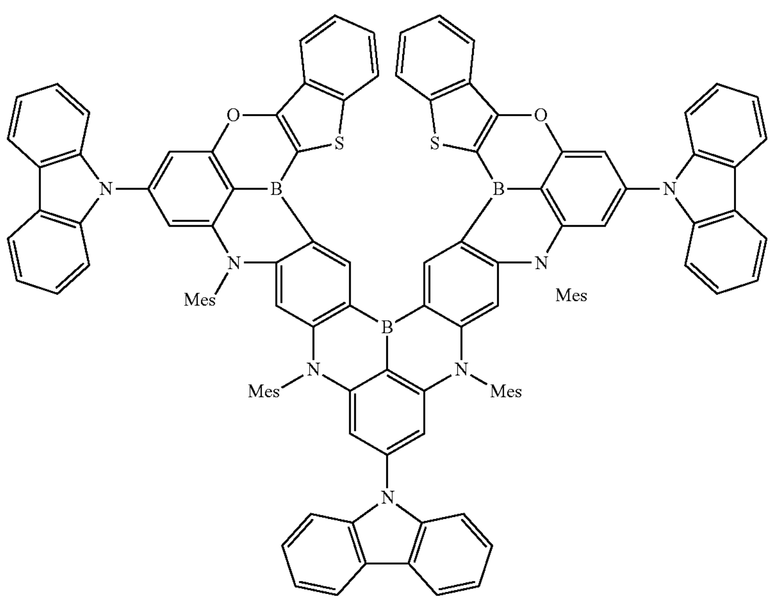

-continued
(1-3-145)
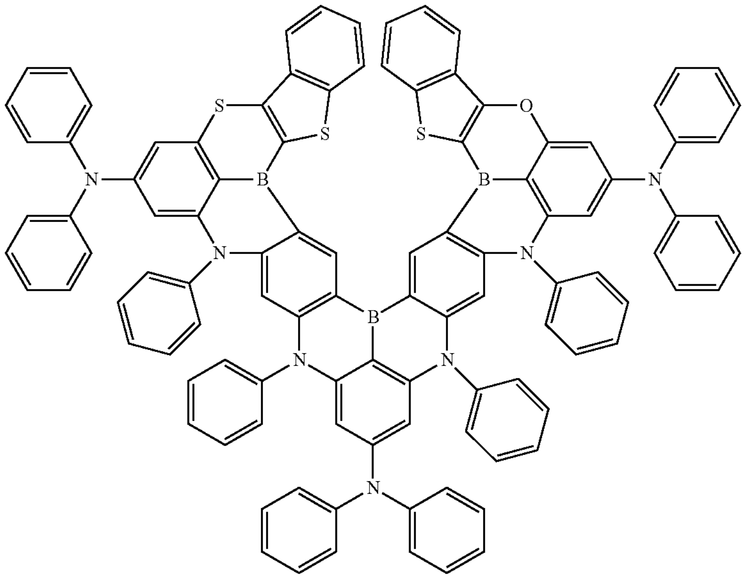
(1-3-146)
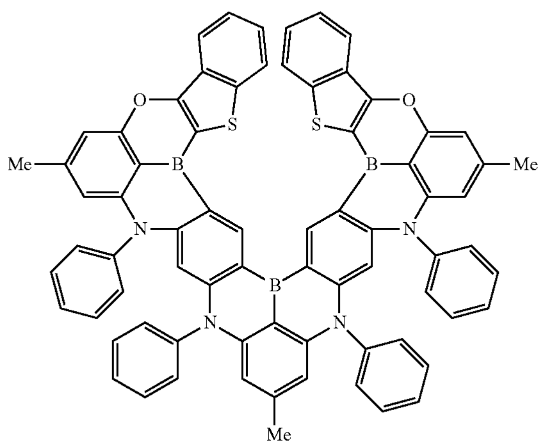
(1-3-147)
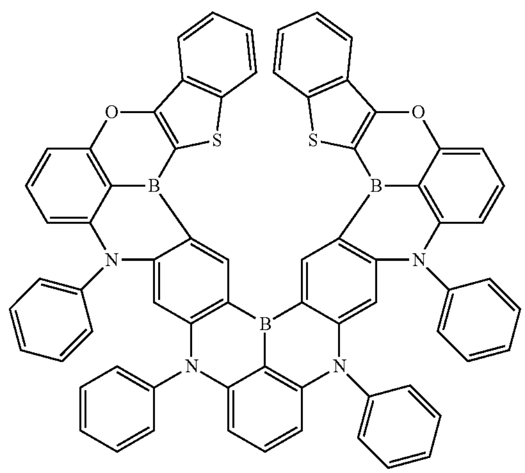
(1-3-148)
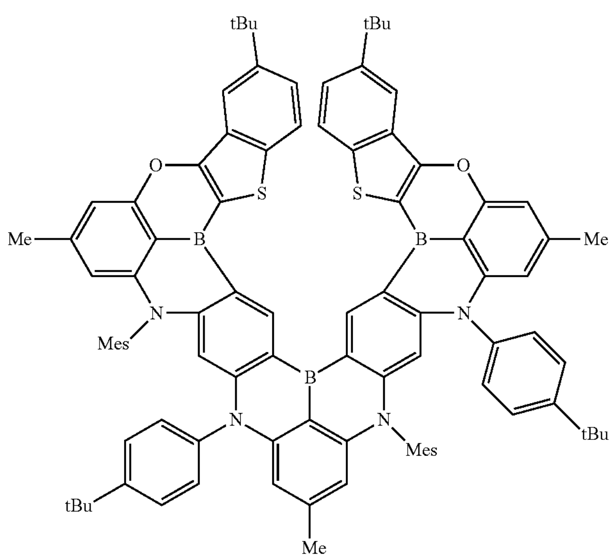

-continued
(1-3-149)
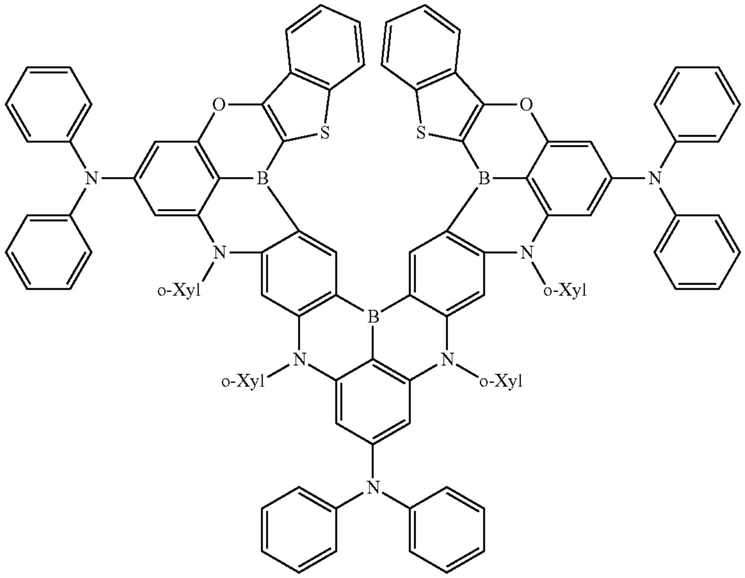
(1-3-150)
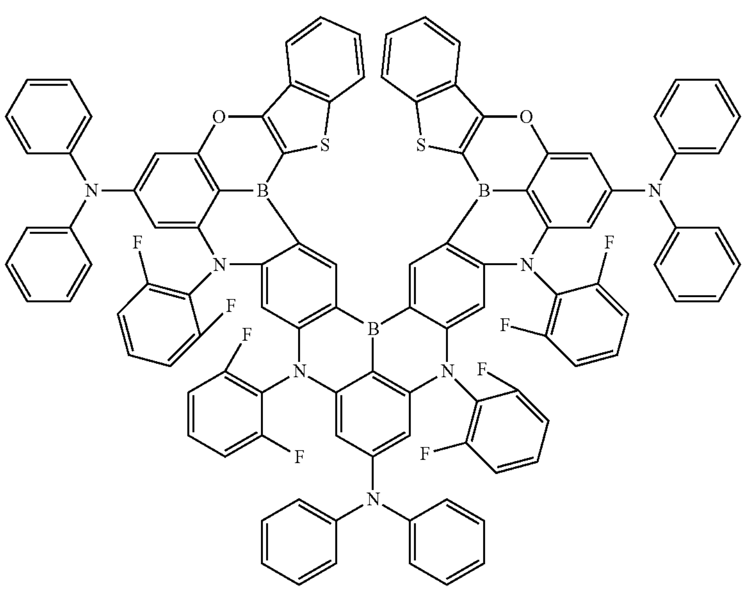

-continued
(1-3-161)
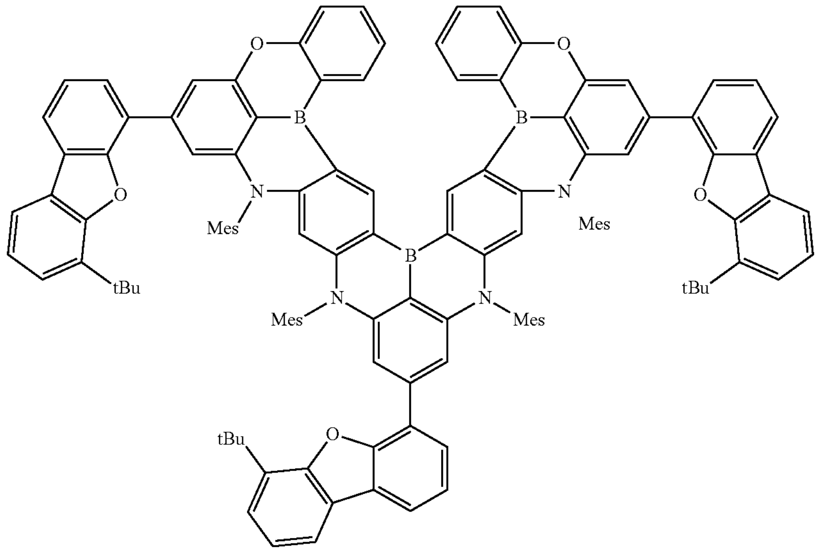
(1-3-162)
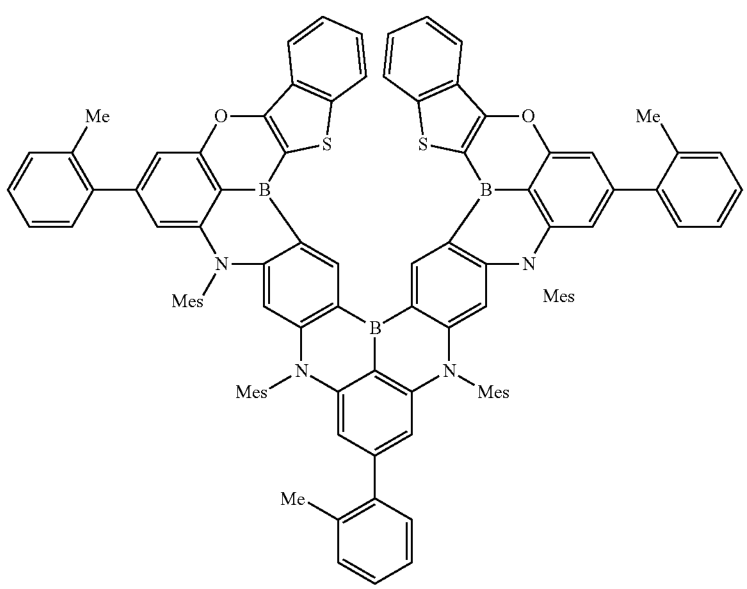

-continued
(1-3-163)
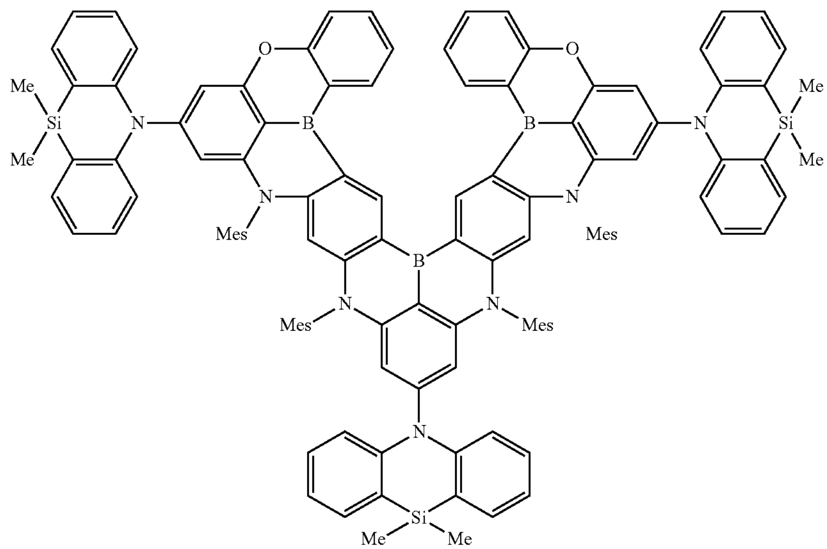
(1-3-164)
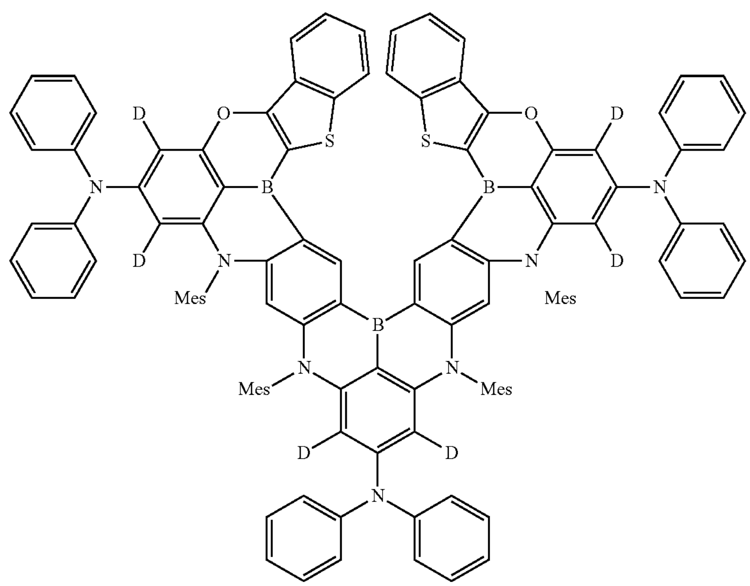
(1-3-165)
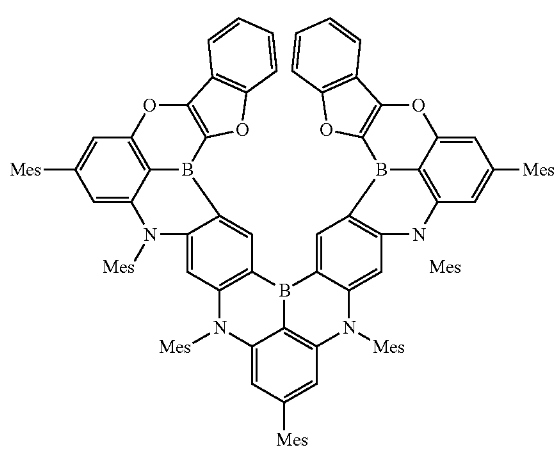
(1-3-166)
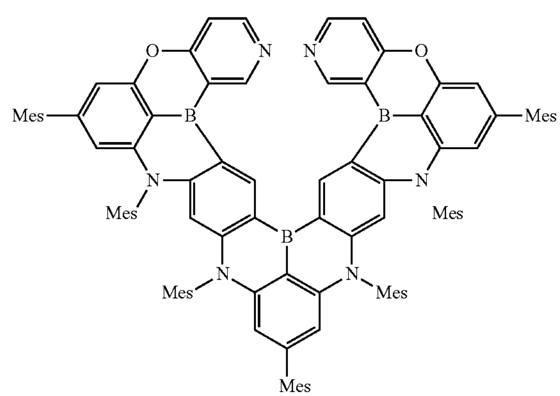

-continued
(1-3-167)
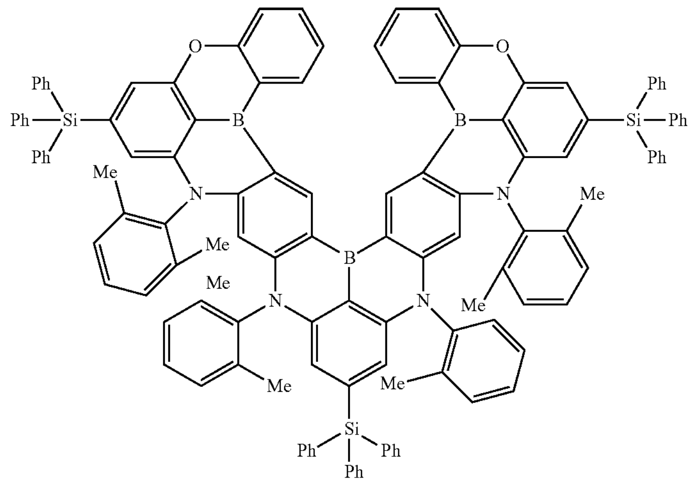
(1-3-168)
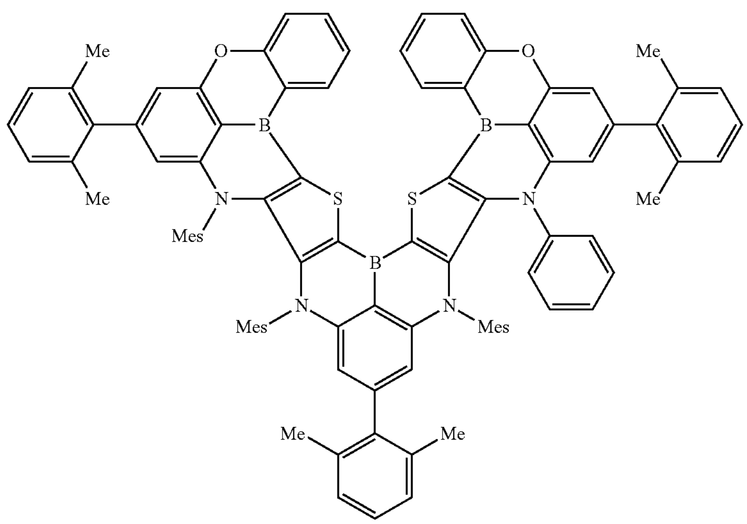
(1-3-169)
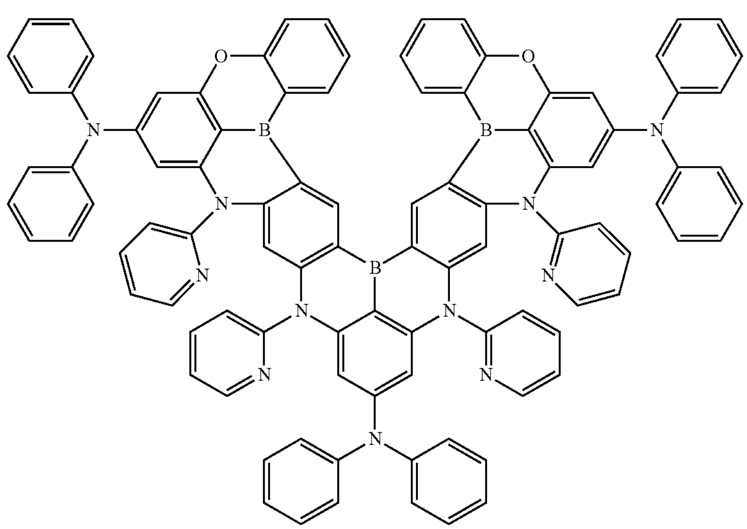

-continued
(1-3-170)
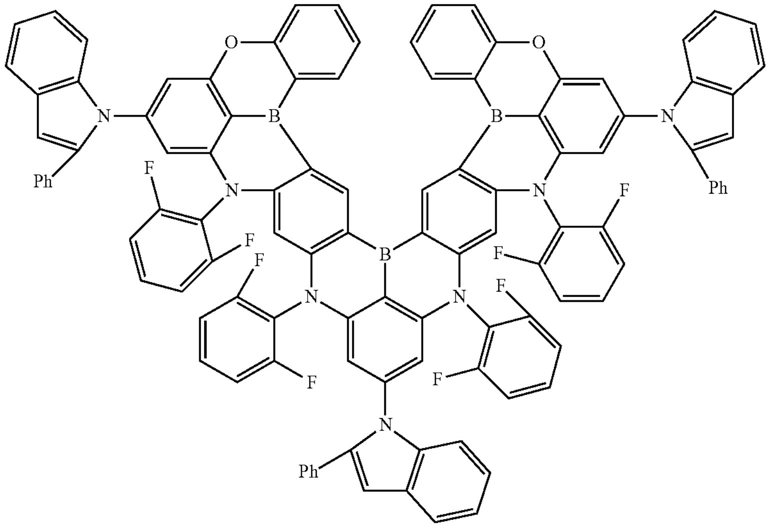
(1-3-191)
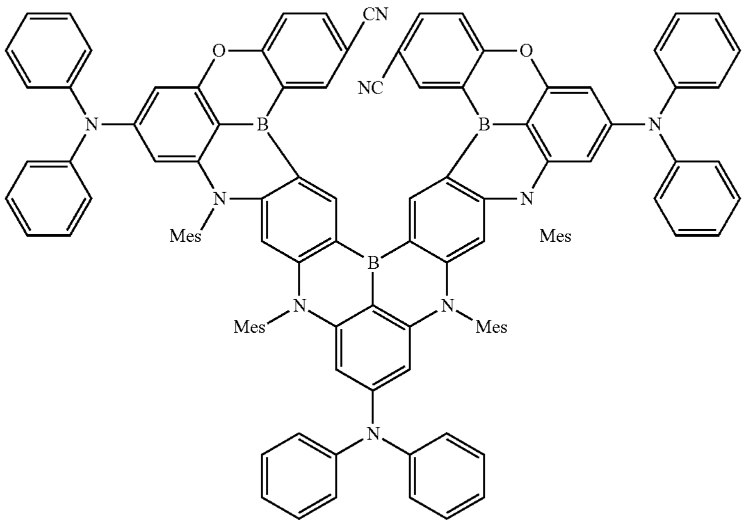
(1-3-192)
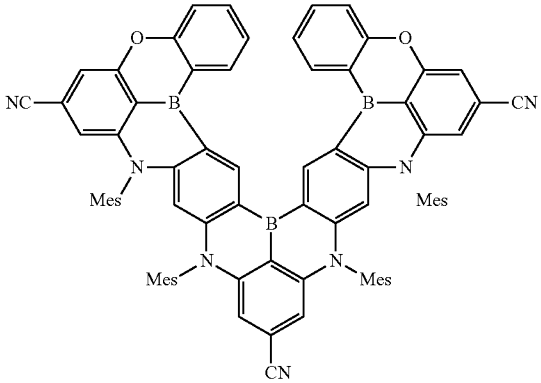
(1-3-193)
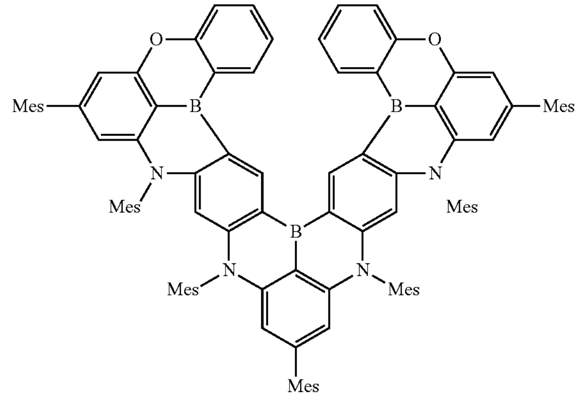

-continued
(1-3-194)
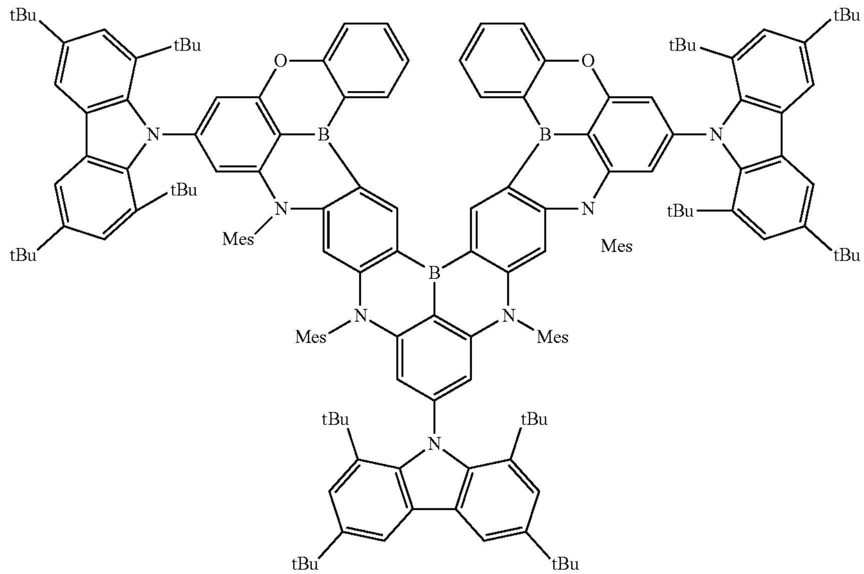
(1-3-195)
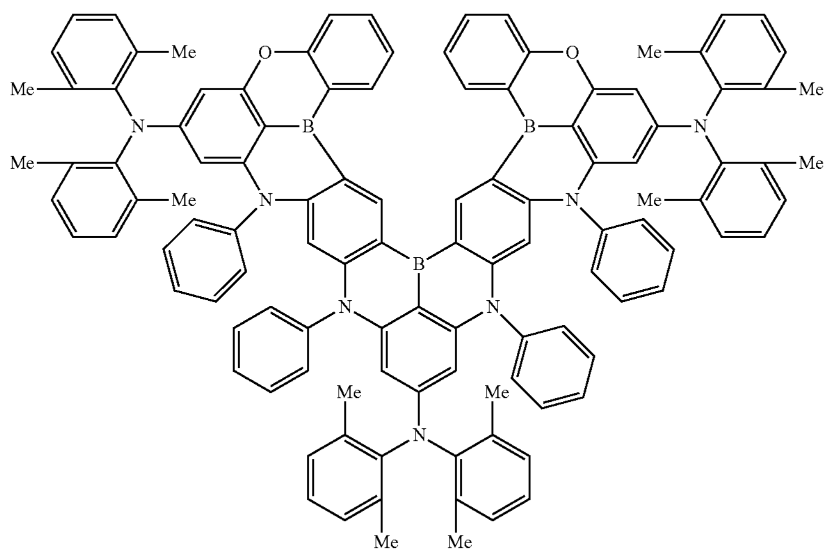
(1-3-196)
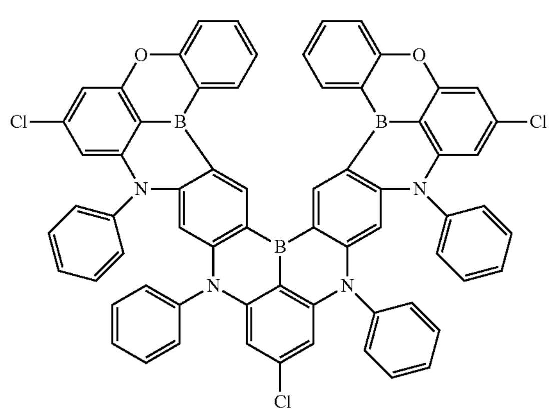
(1-3-197)
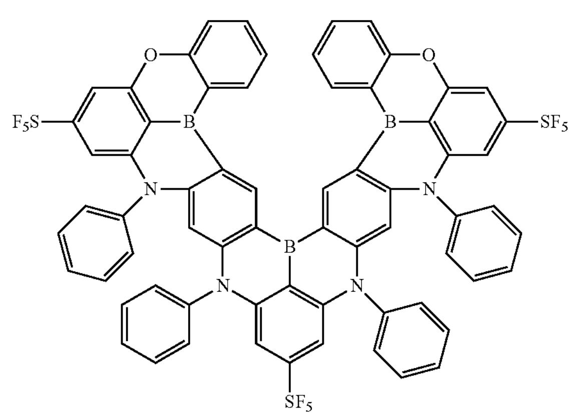

-continued
(1-3-198)
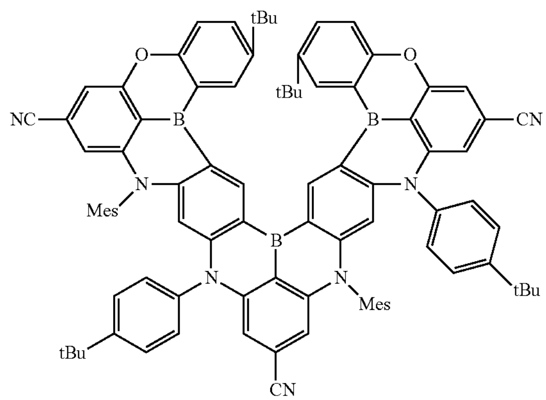
(1-3-199)
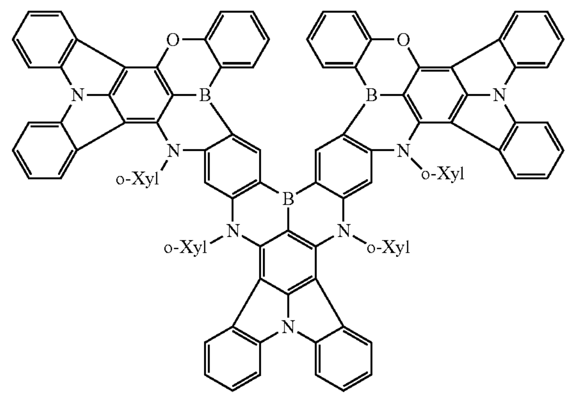
(1-3-200)
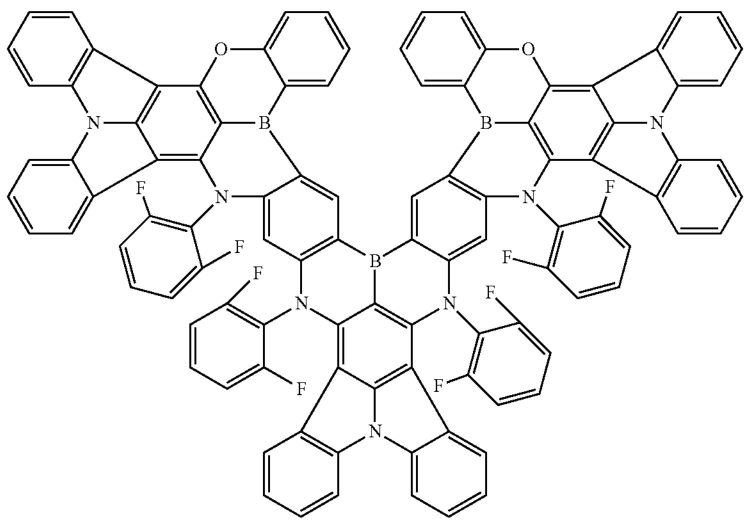
(1-3-221)
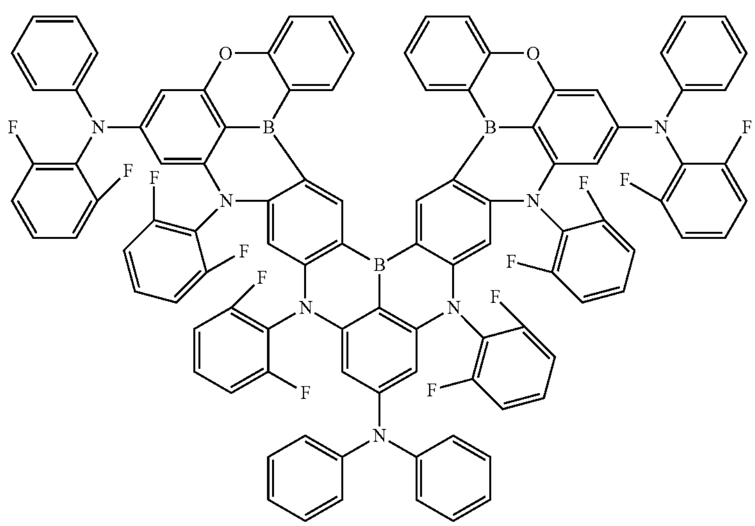

-continued
(1-3-222)
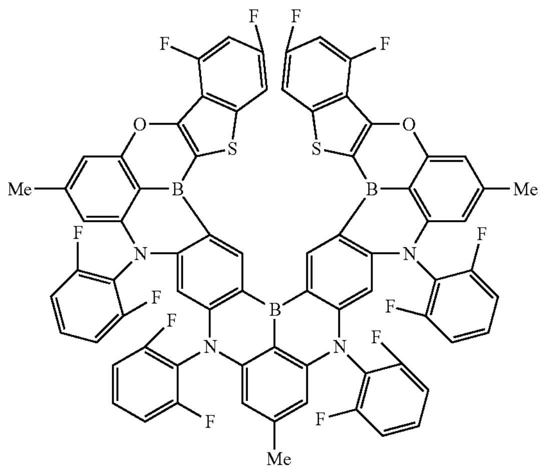
(1-3-223)
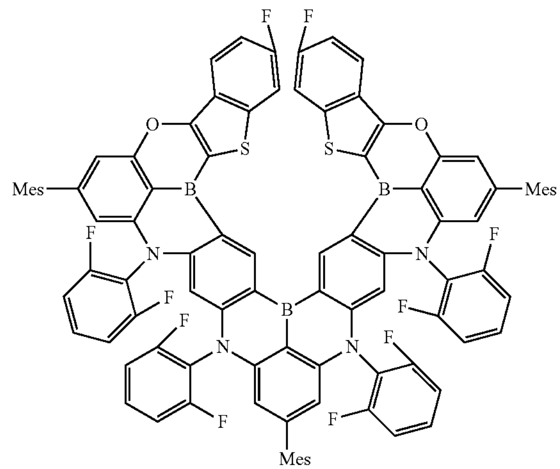
(1-3-224)
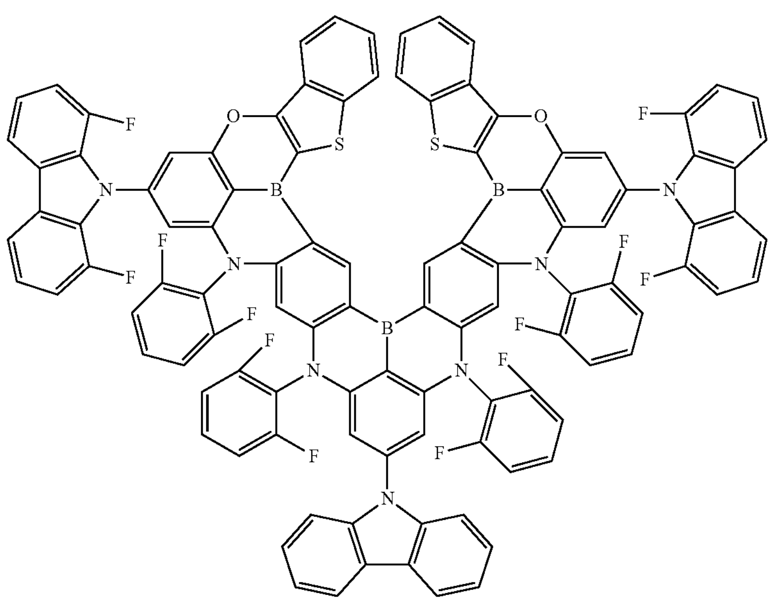

-continued
(1-3-225)
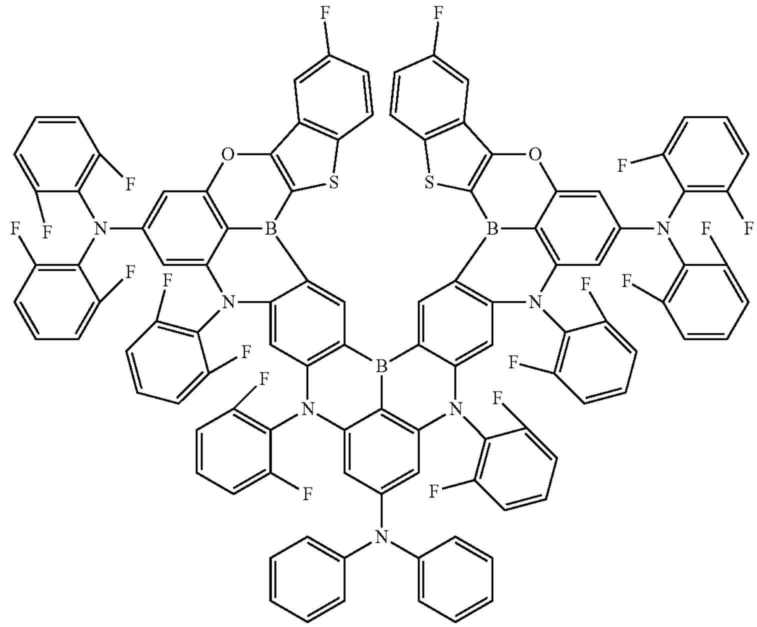
(1-3-226)
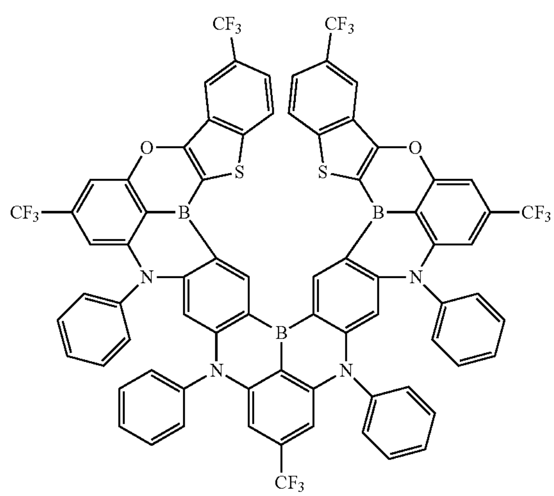
(1-3-227)
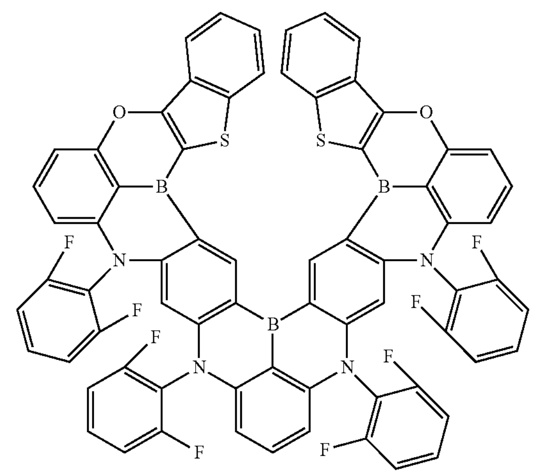
(1-3-228)
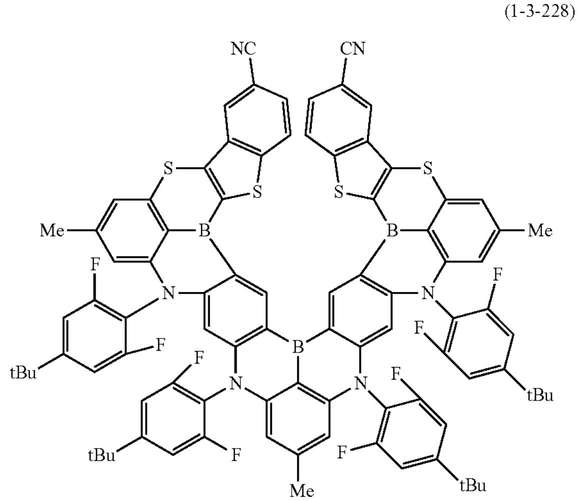
(1-3-229)
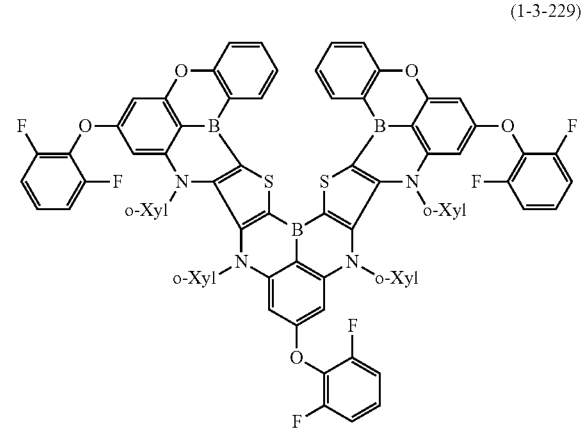

-continued
(1-3-230)
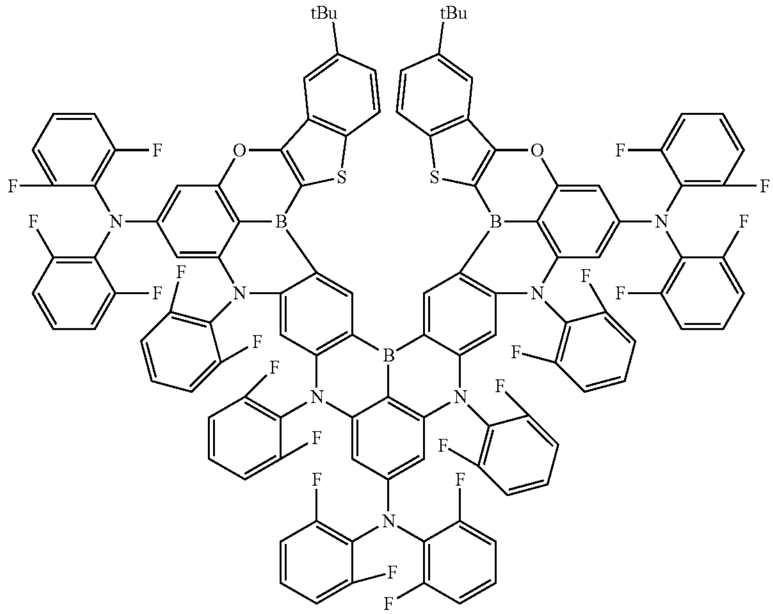
(1-4-1)
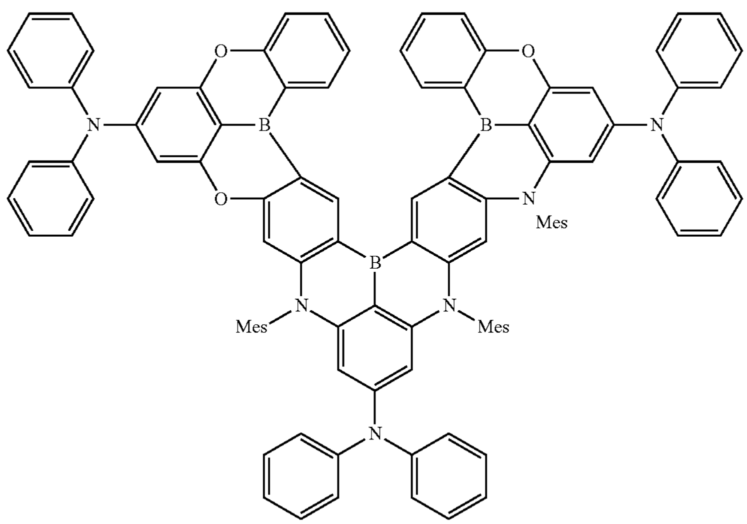
(1-4-2)
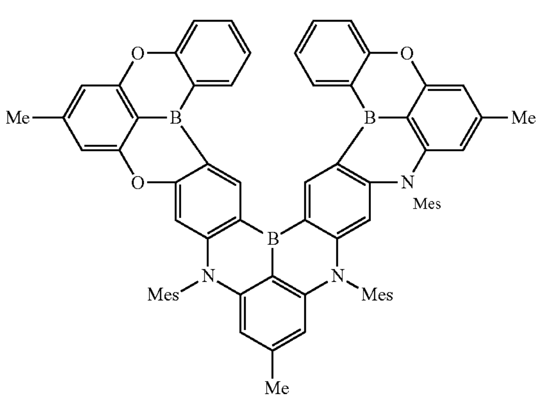
(1-4-3)
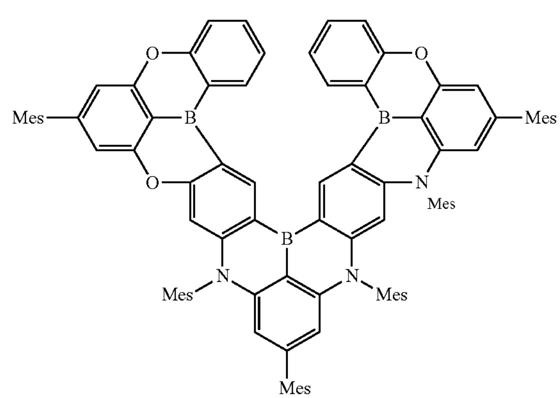

-continued
(1-4-4)
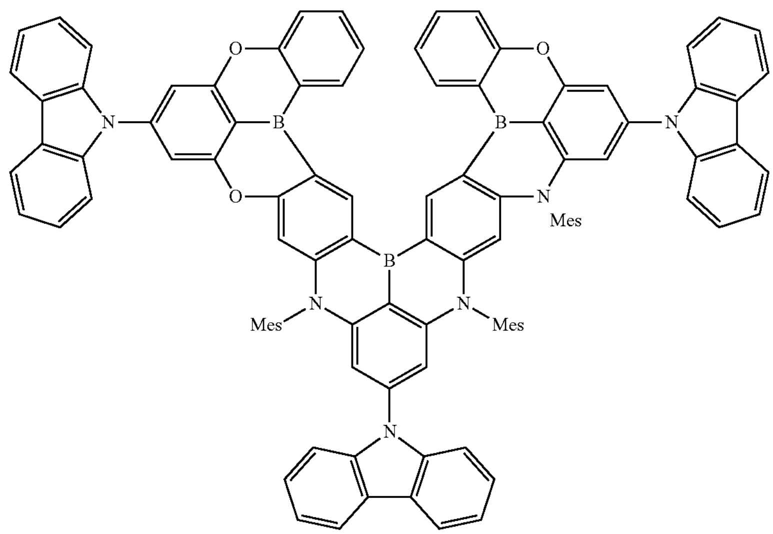
(1-4-5)
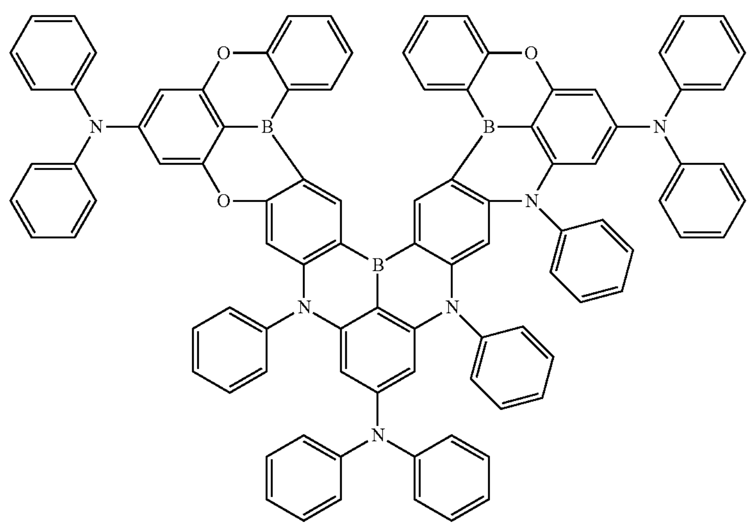
(1-4-6)
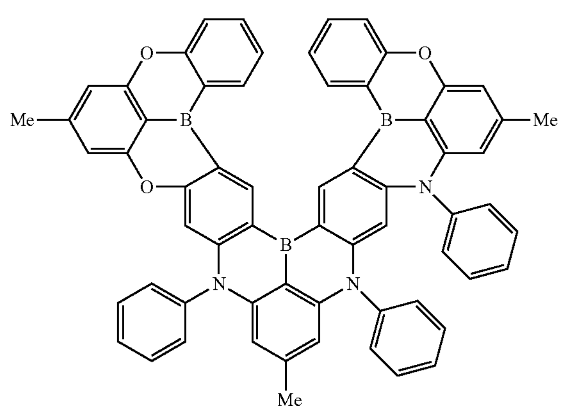
(1-4-7)
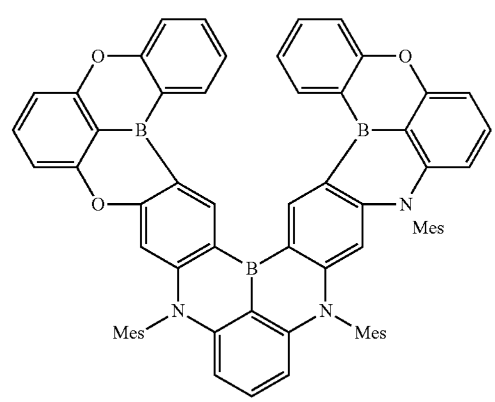

-continued
(1-4-8)
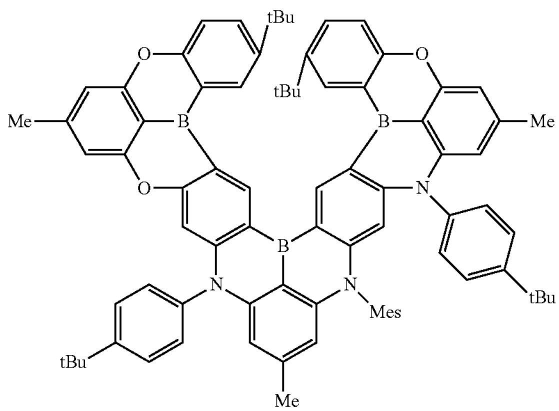
(1-4-9)
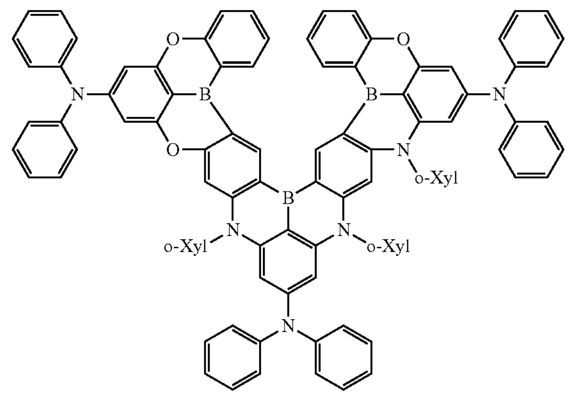
(1-4-10)
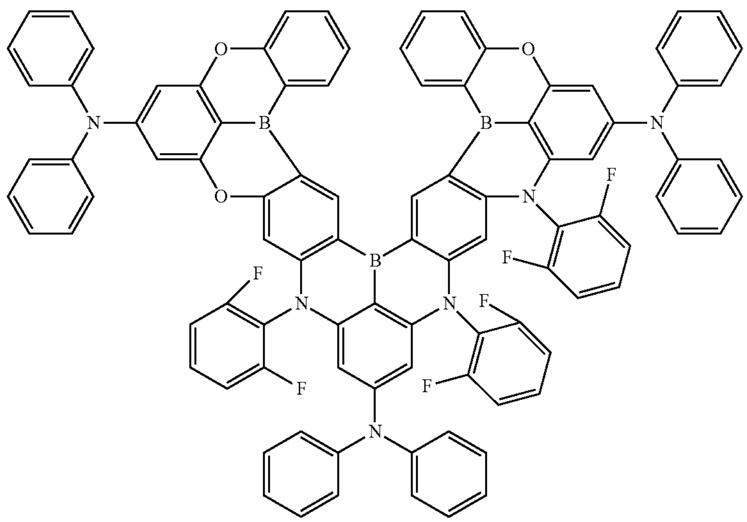
(1-4-21)
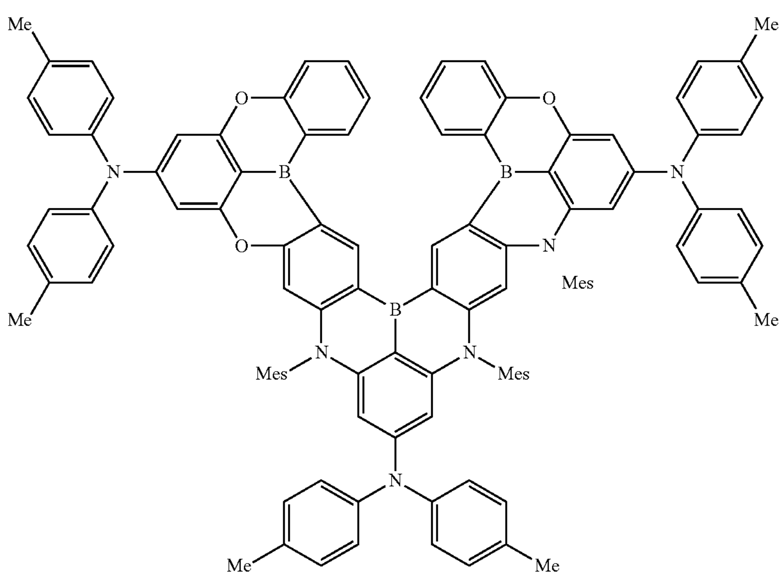

-continued
(1-4-22)
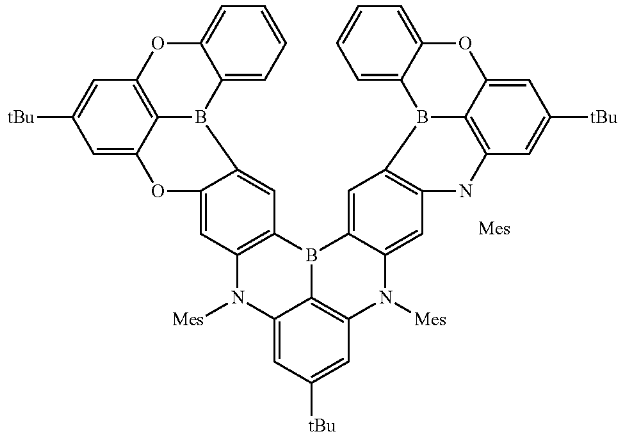
(1-4-23)
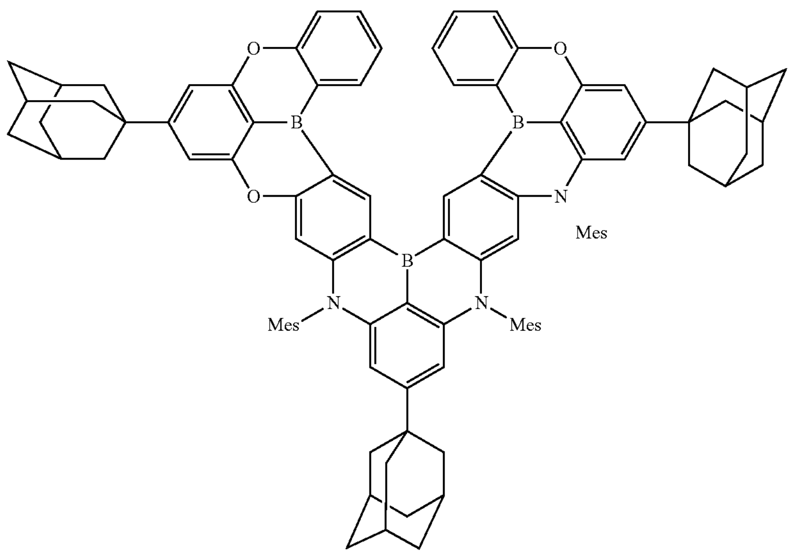
(1-4-24)
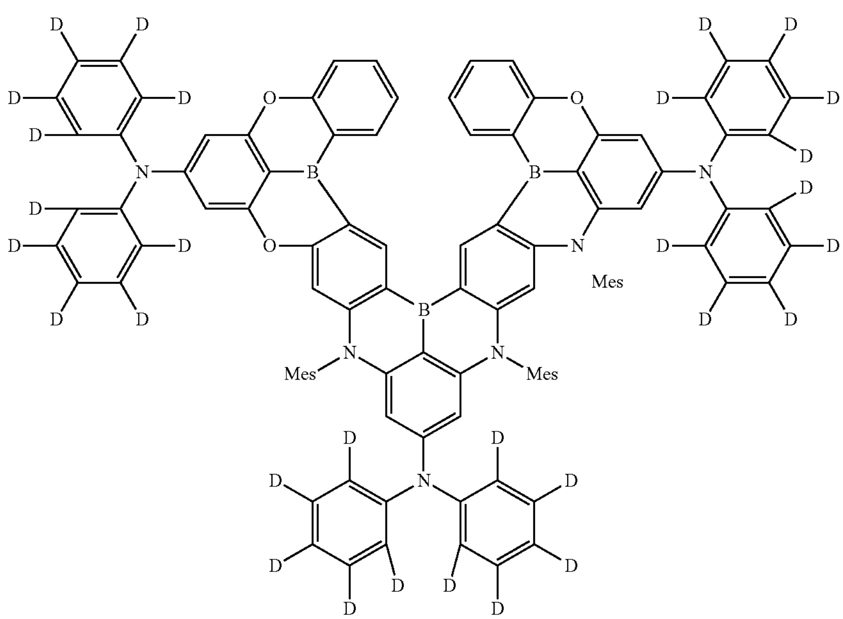

-continued
(1-4-25)
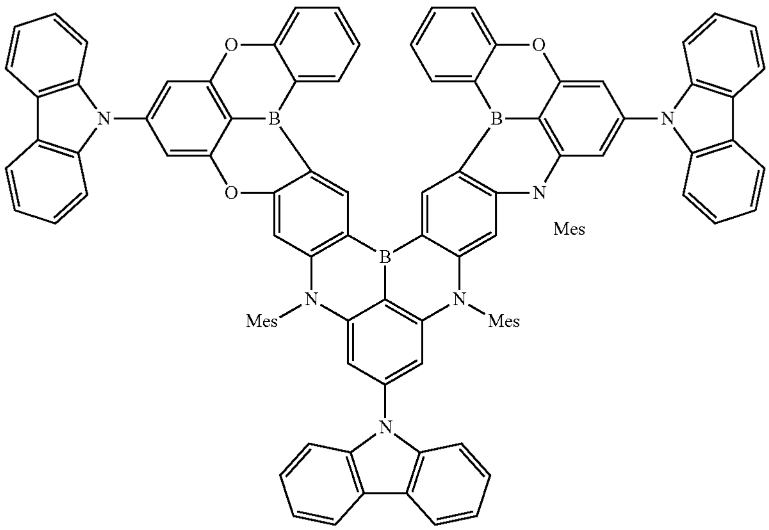
(1-4-26)
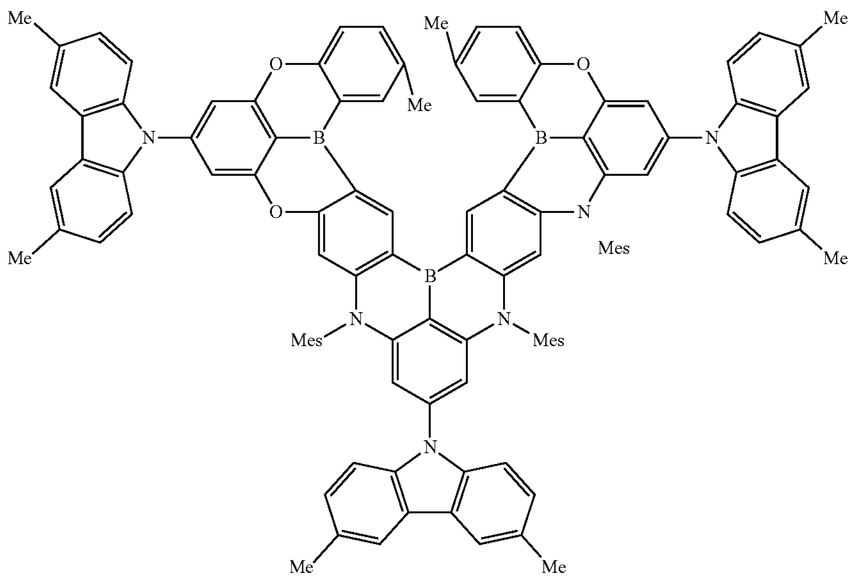
(1-4-27)
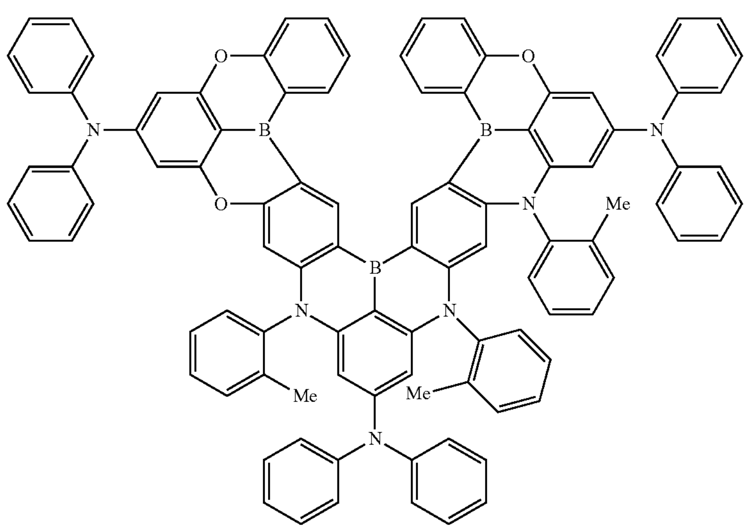

-continued
(1-4-28)
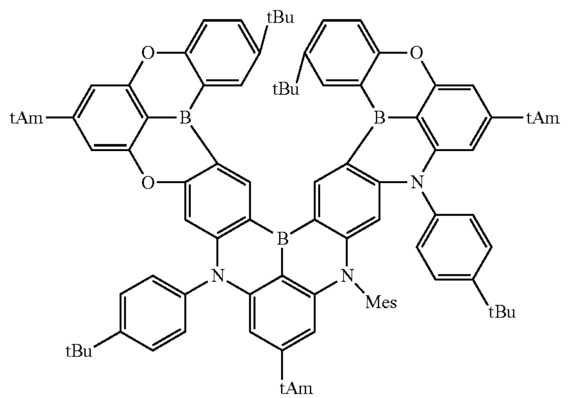
(1-4-29)
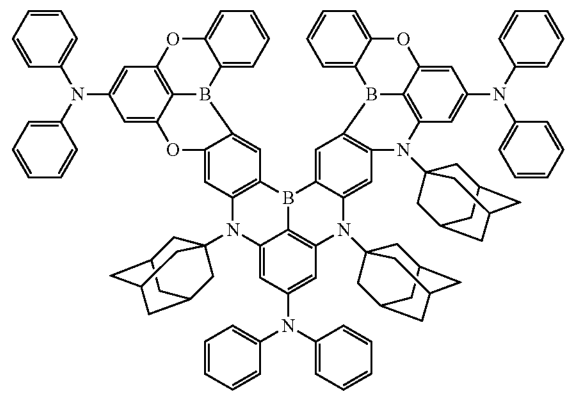
(1-4-30)
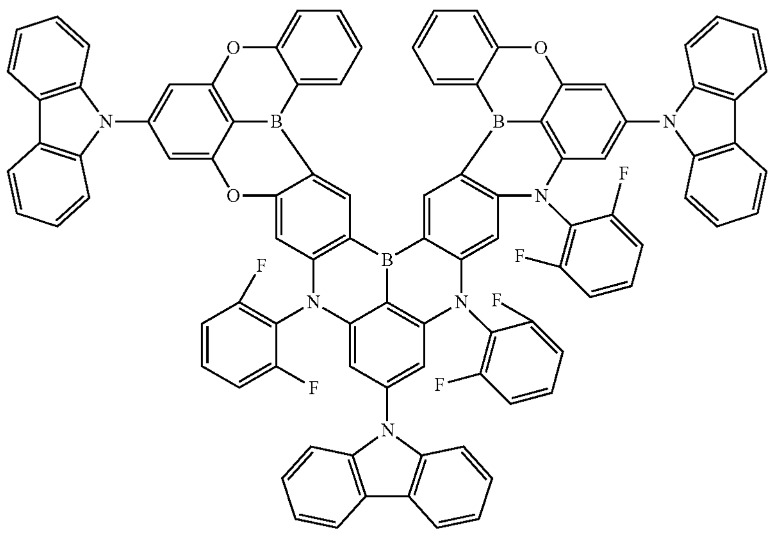
(1-4-41)
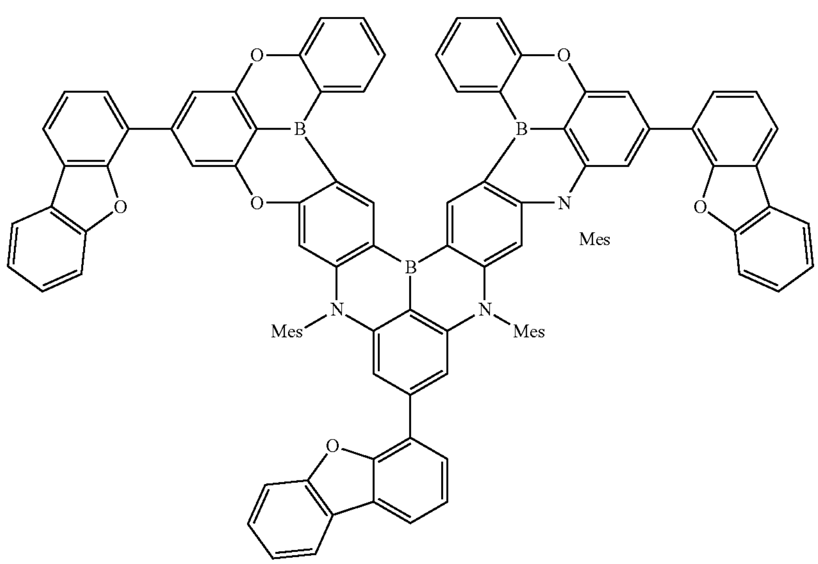

-continued
(1-4-42)
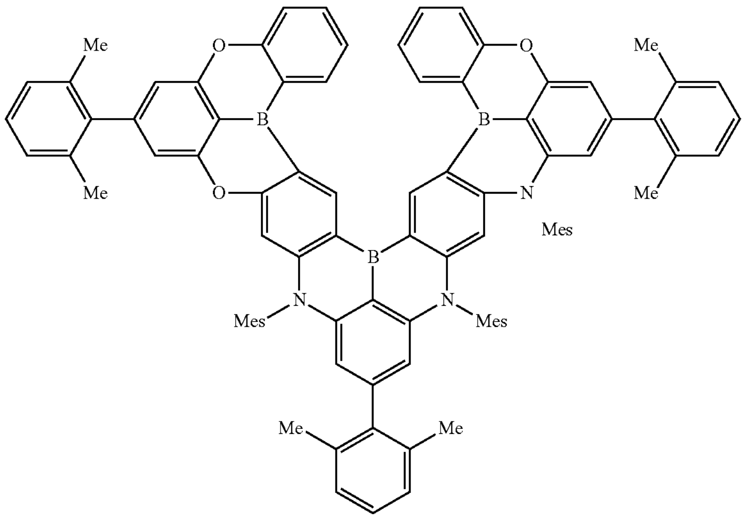
(1-4-43)
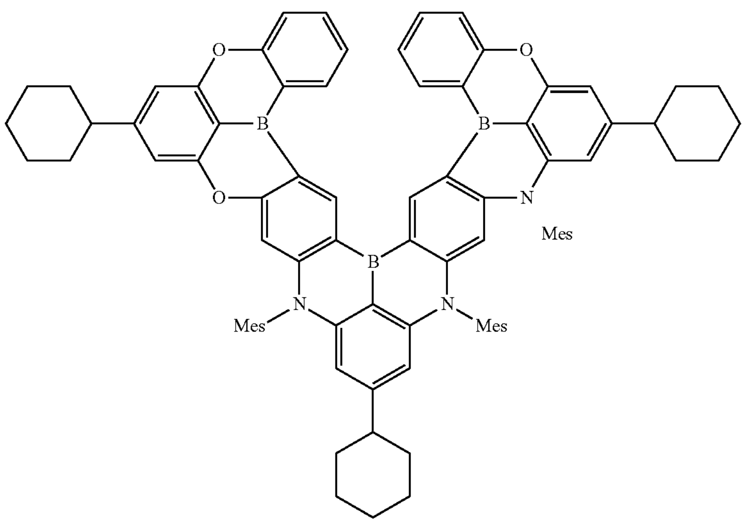
(1-4-44)
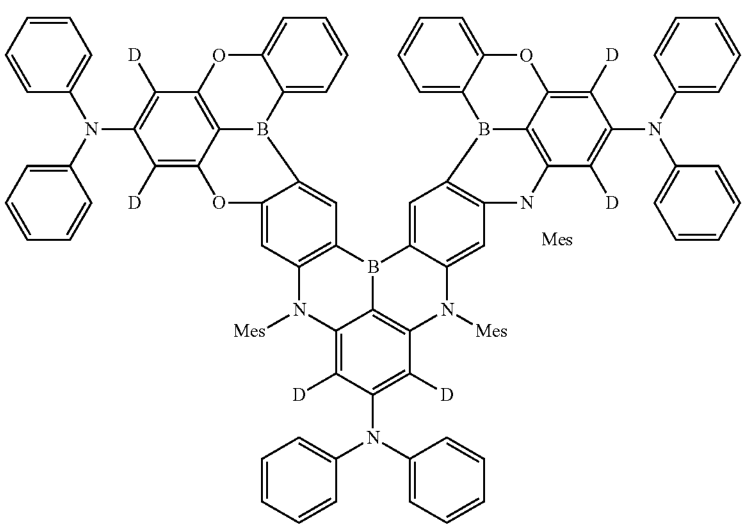

-continued
(1-4-45)
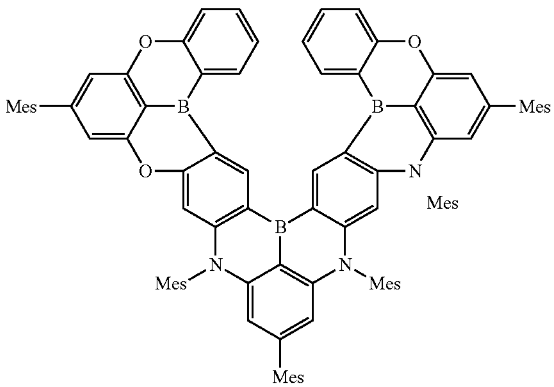
(1-4-46)
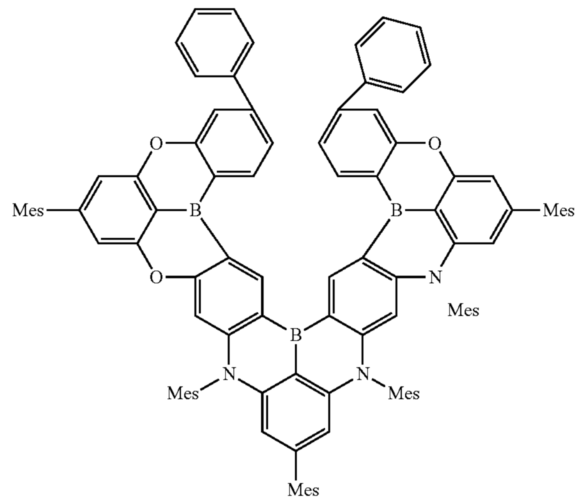
(1-4-47)
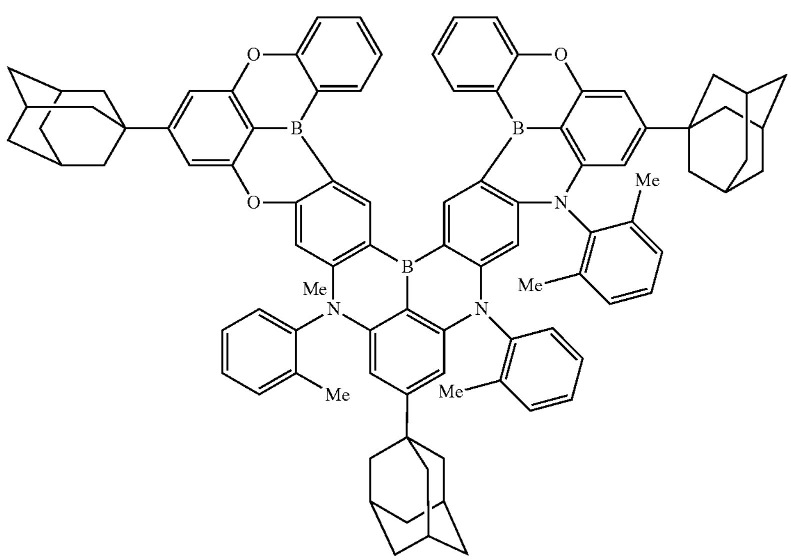

-continued
(1-4-48)
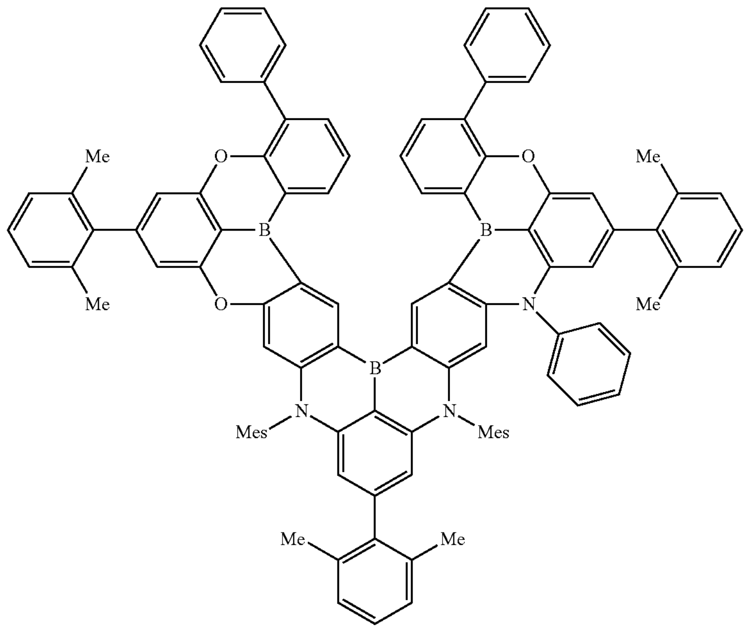
(1-4-49)
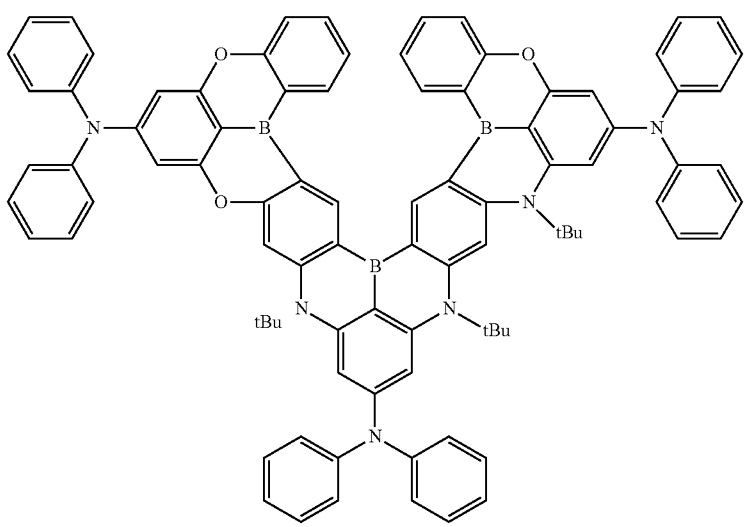

-continued
(1-4-50)
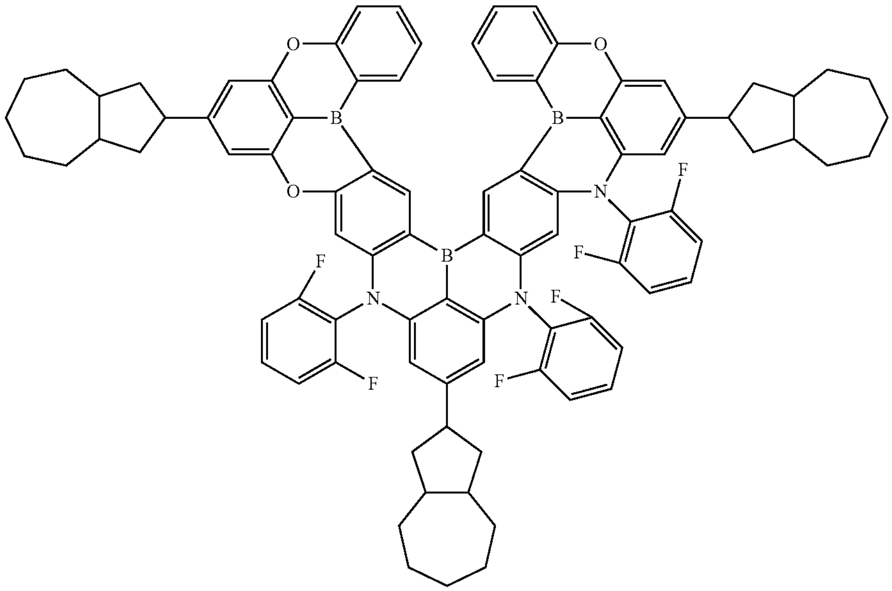
(1-4-101)
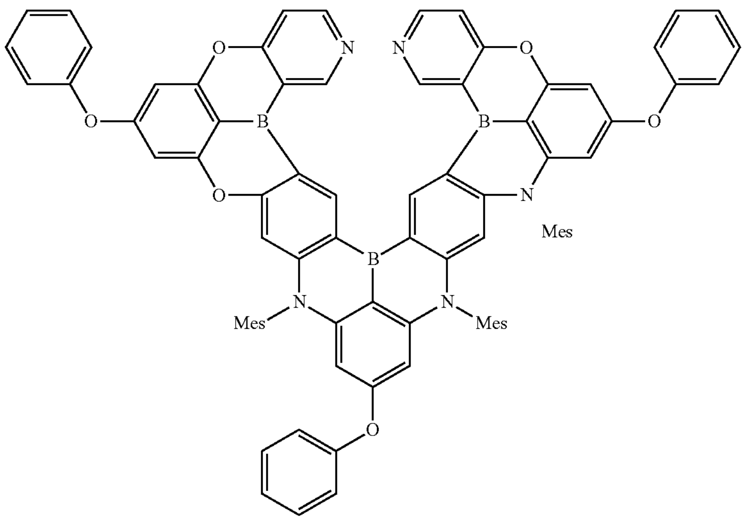
(1-4-102)
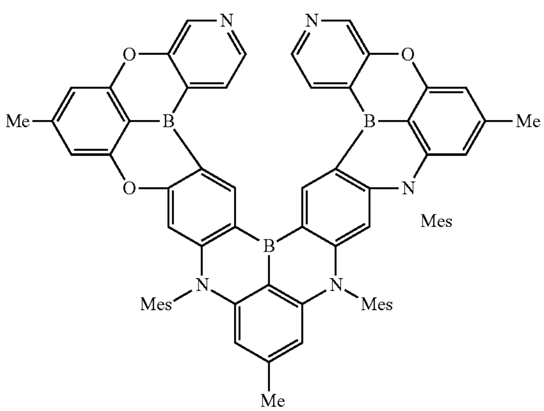
(1-4-103)
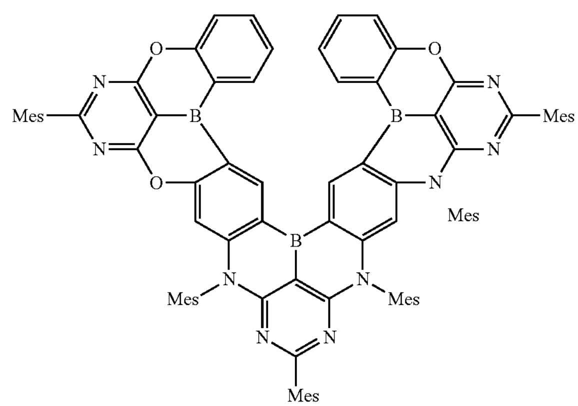

-continued
(1-4-104)
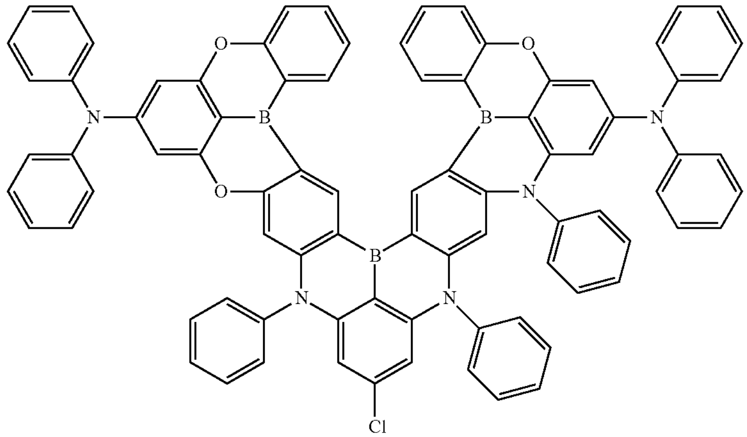
(1-4-105)
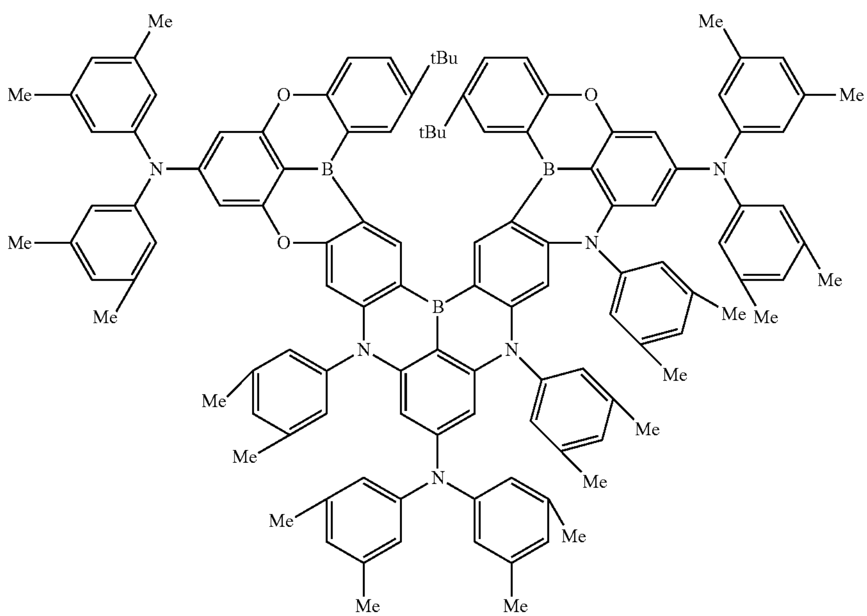
(1-4-106)
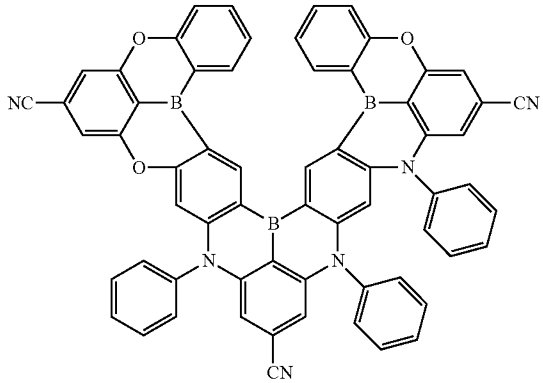
(1-4-107)
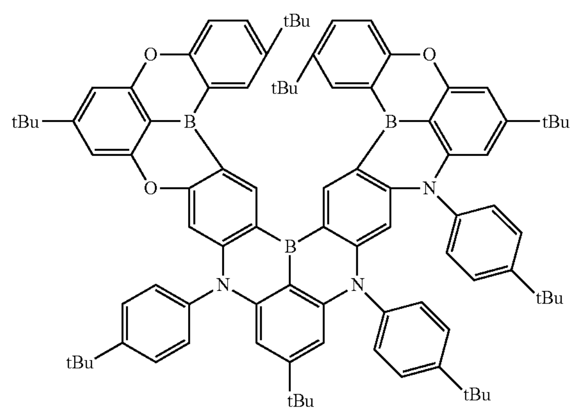

-continued
(1-4-108)
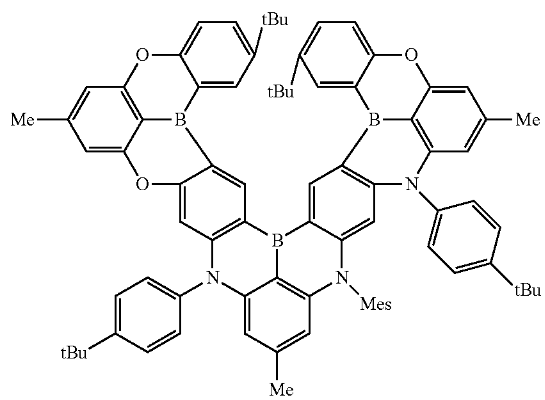
(1-4-109)
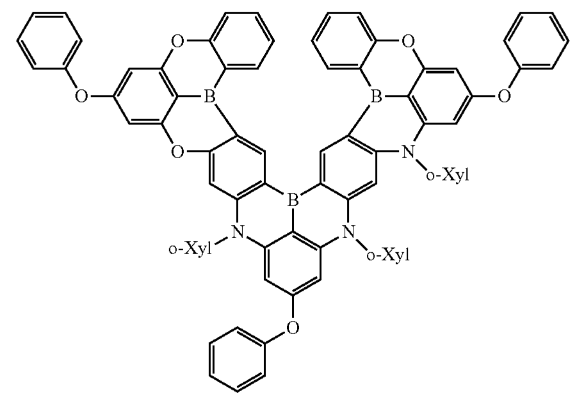
(1-4-110)
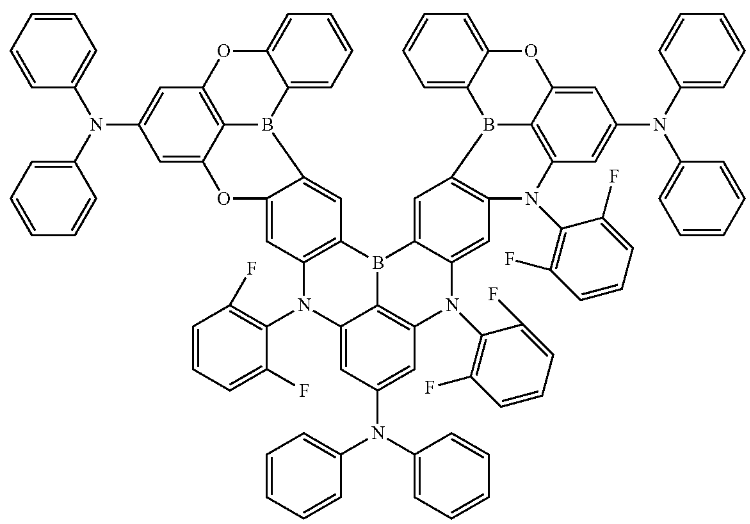
(1-4-121)
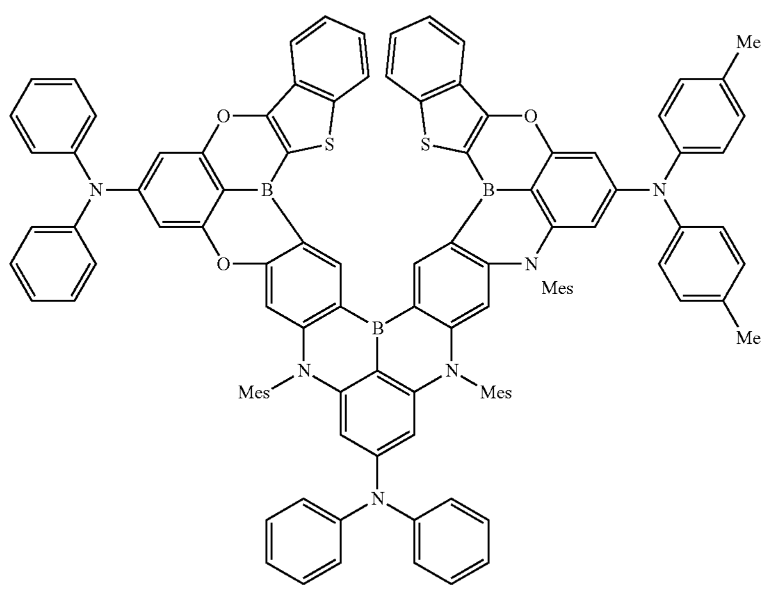

-continued
(1-4-122)
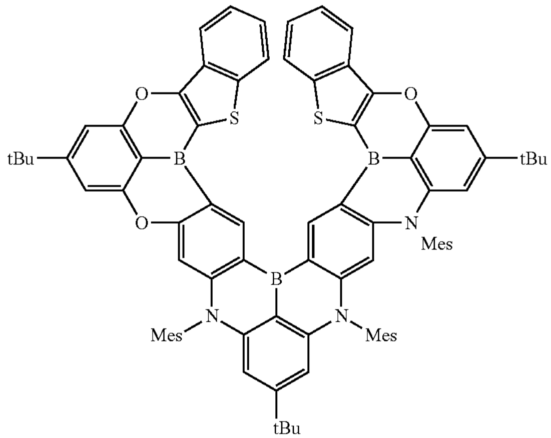
(1-4-123)
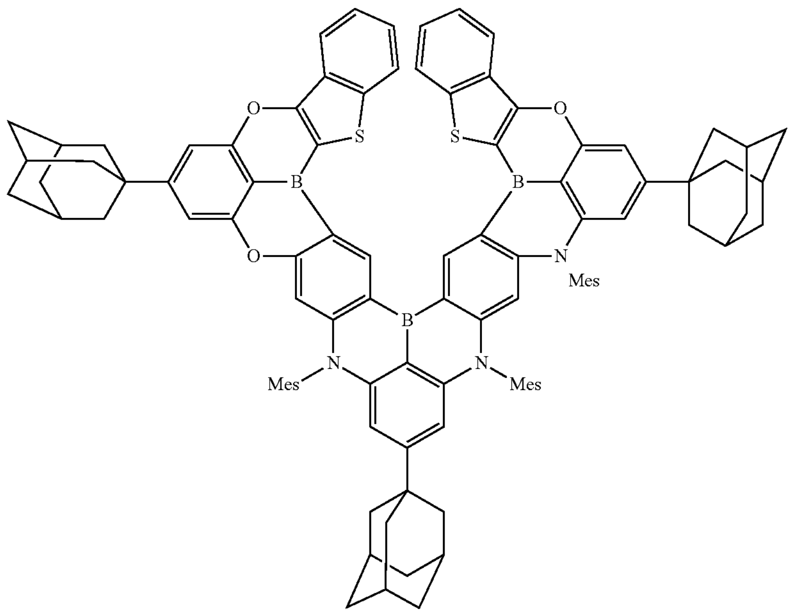
(1-4-124)
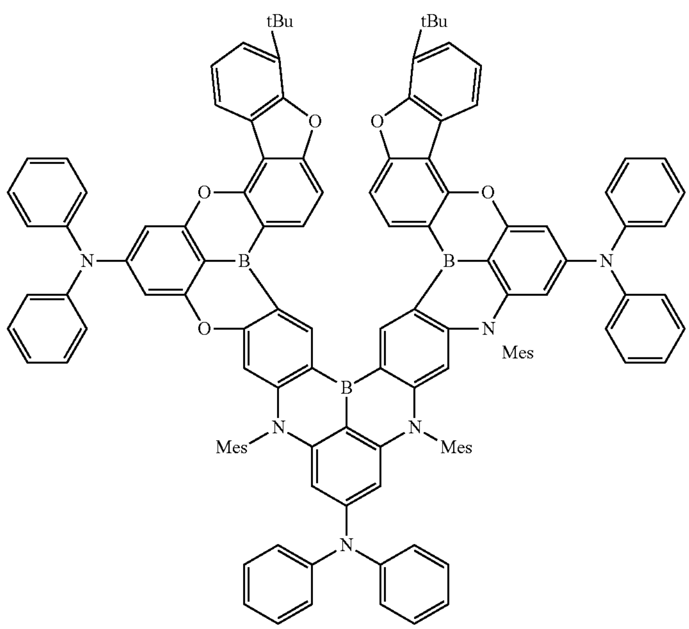

-continued
(1-4-125)
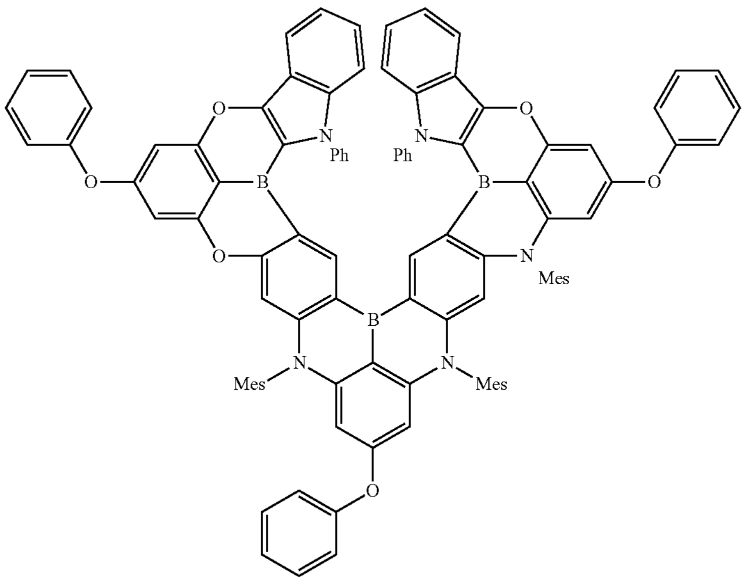
(1-4-126)
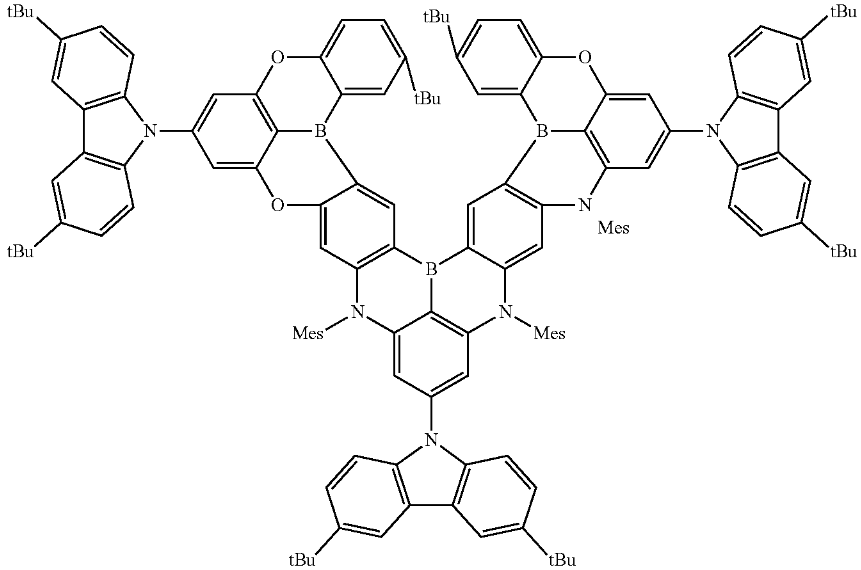

-continued
(1-4-127)
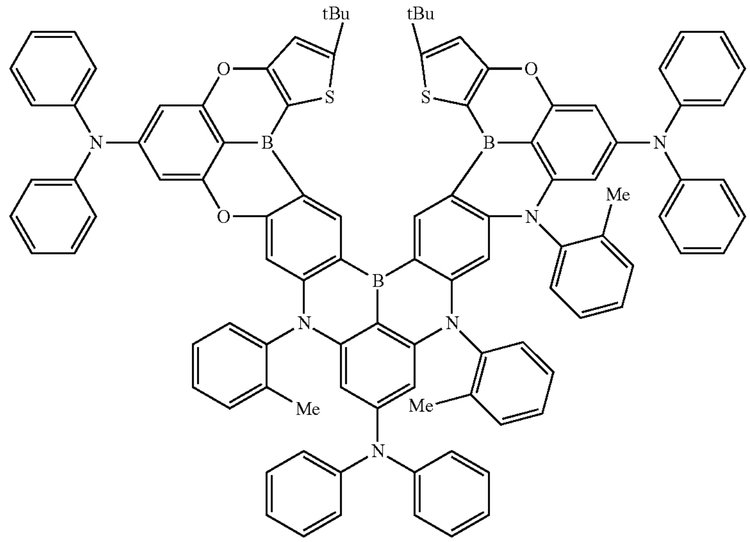
(1-4-128)
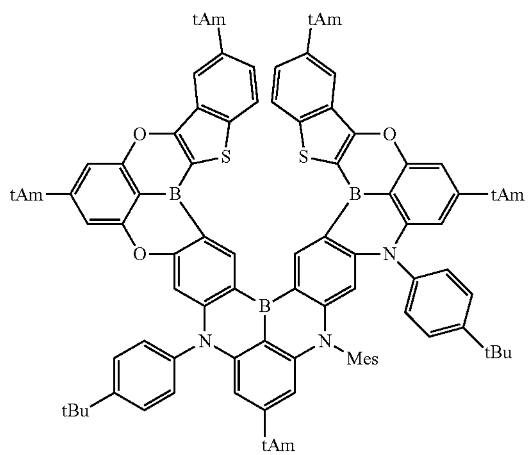
(1-4-129)
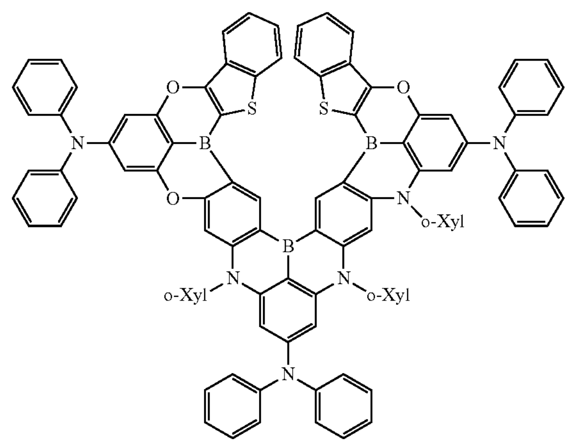
(1-4-130)
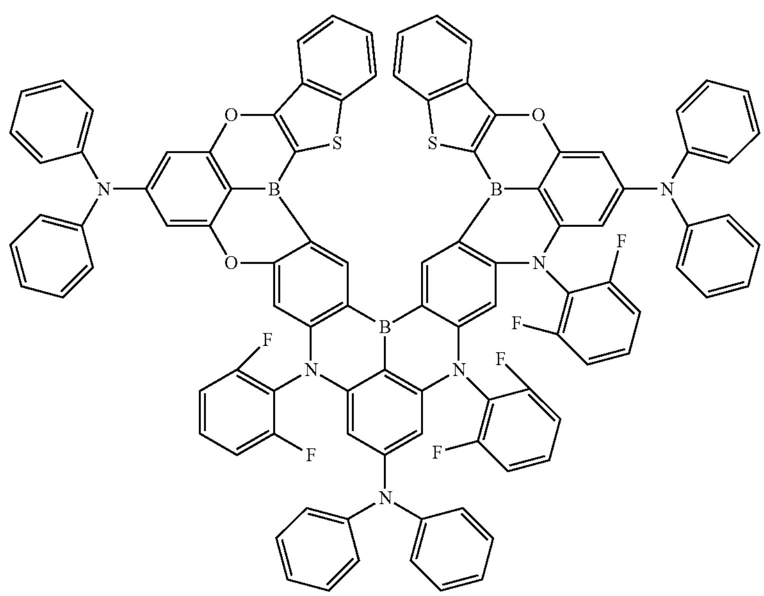

-continued
(1-4-141)
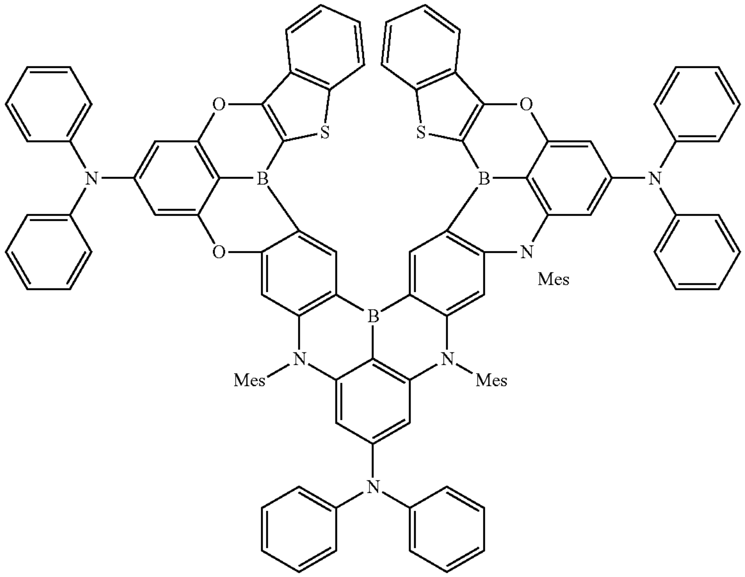
(1-4-142)
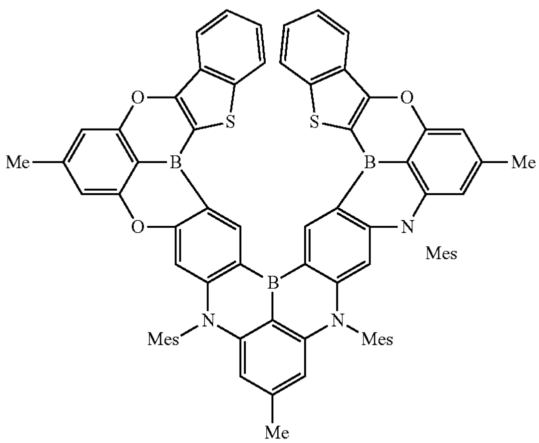
(1-4-143)
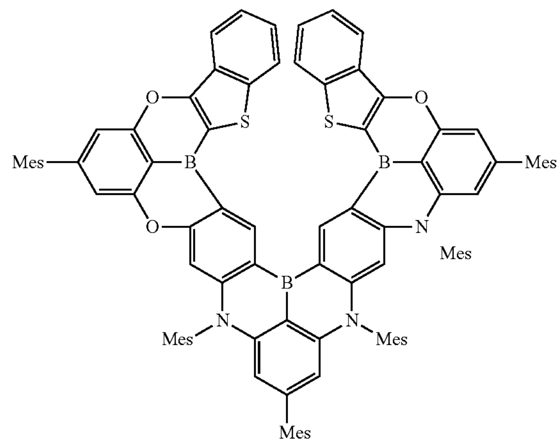
(1-4-144)
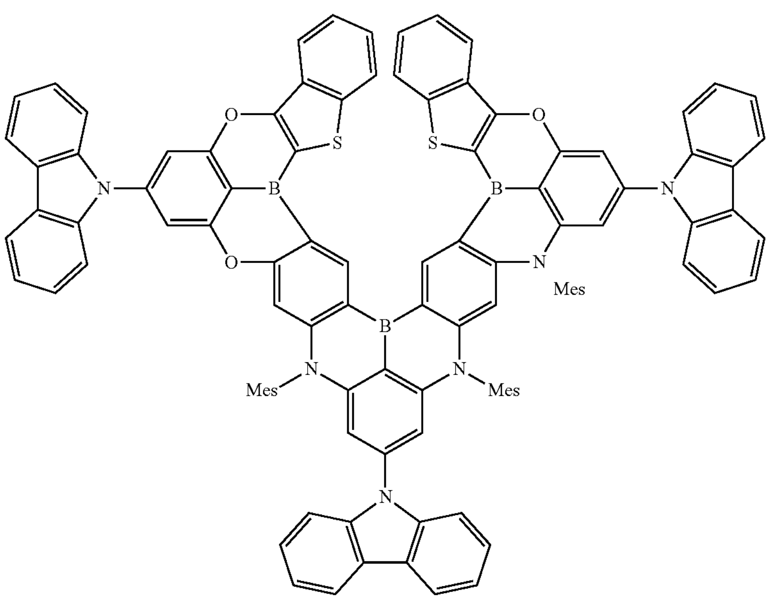

-continued
(1-4-145)
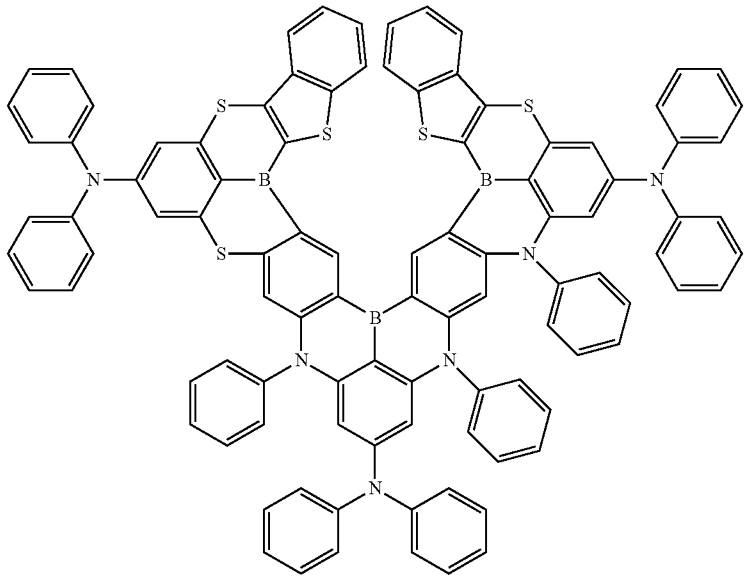
(1-4-146)
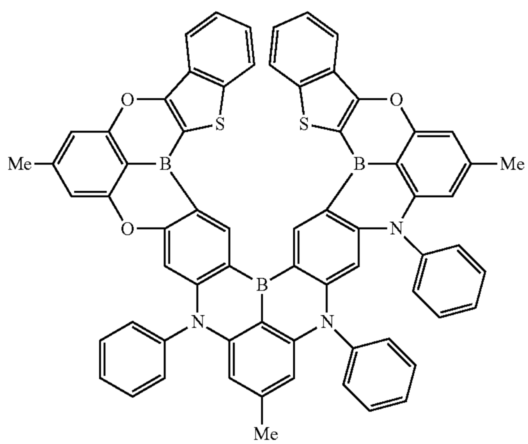
(1-4-147)
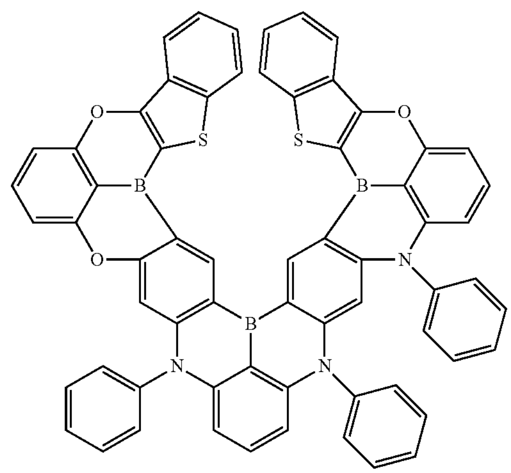
(1-4-148)
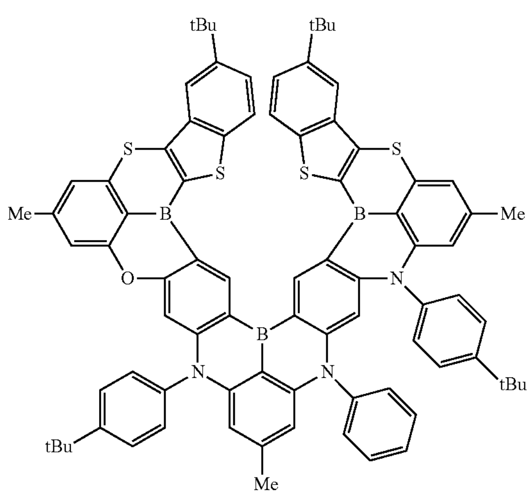
(1-4-149)
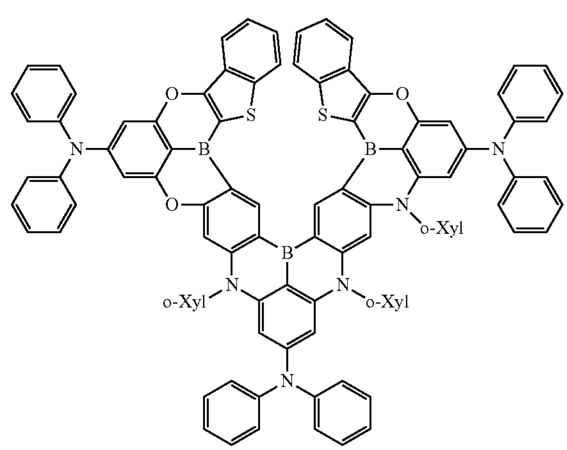

-continued
(1-4-150)
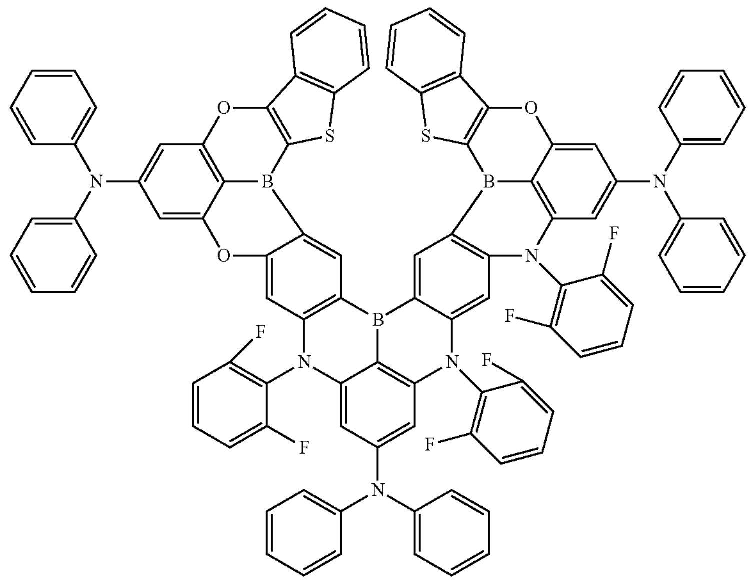
(1-4-161)
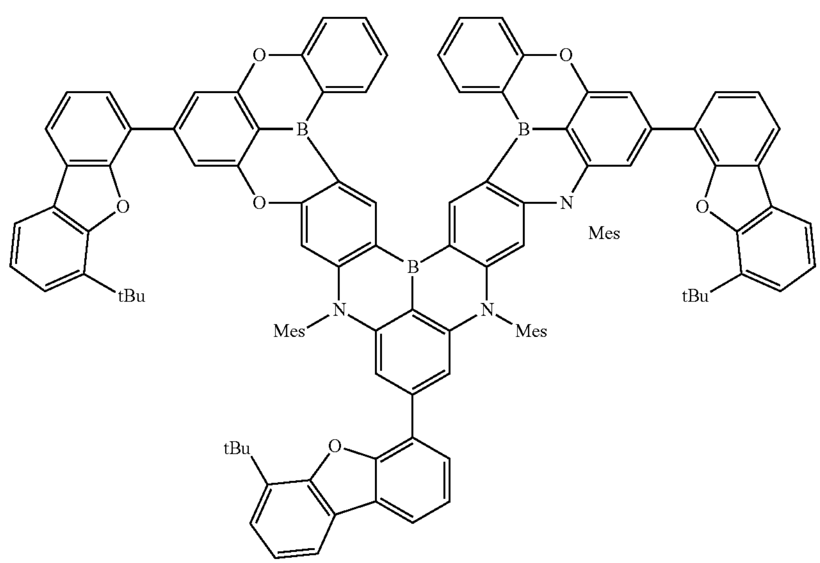

-continued
(1-4-162)
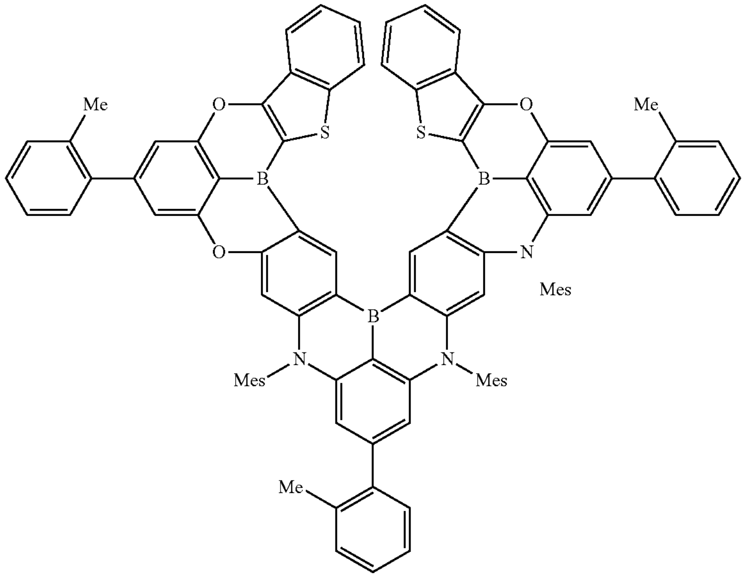
(1-4-163)
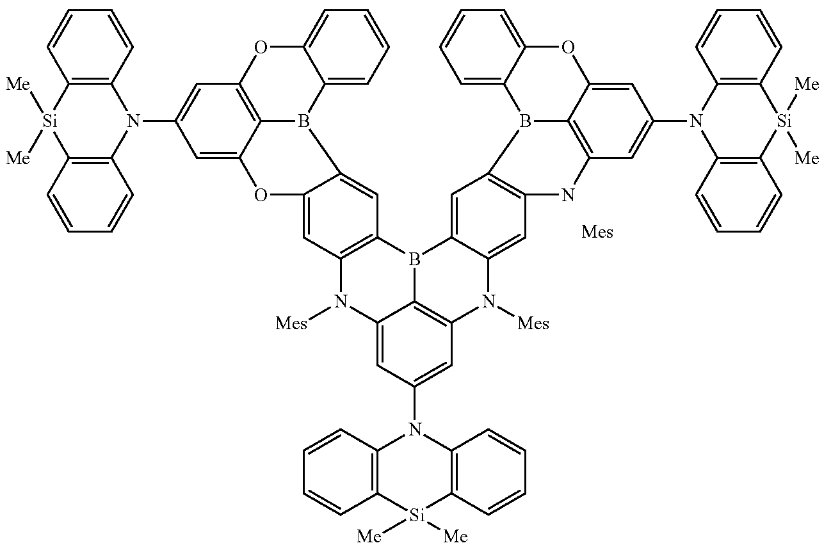
(1-4-164)
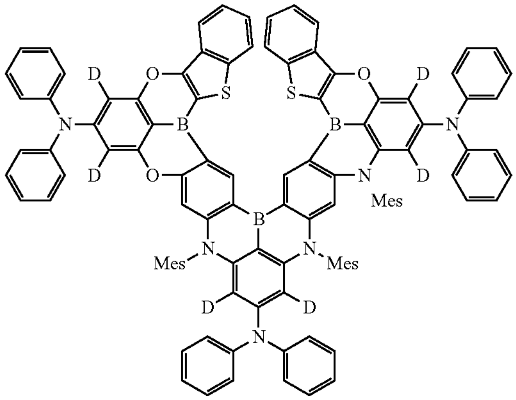
(1-4-165)
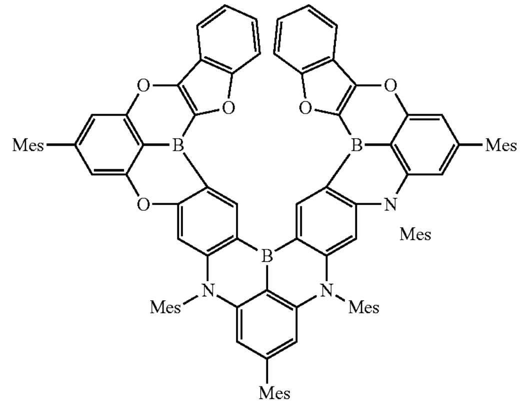

-continued
(1-4-166)
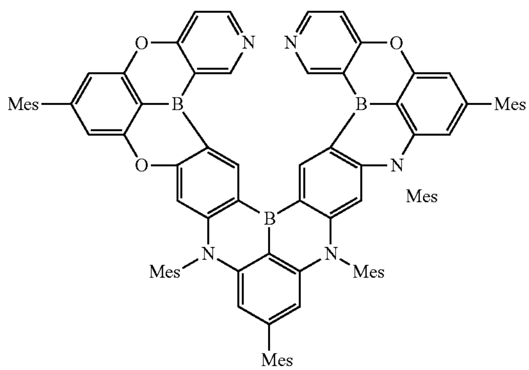
(1-4-167)
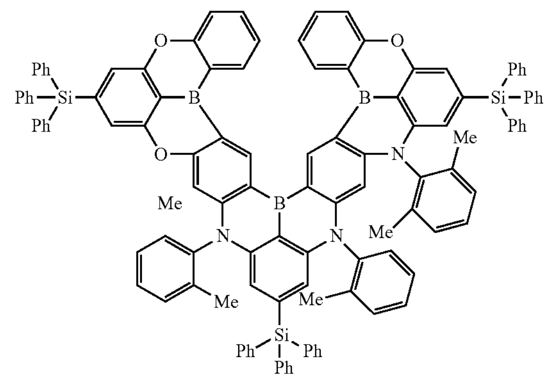
(1-4-168)
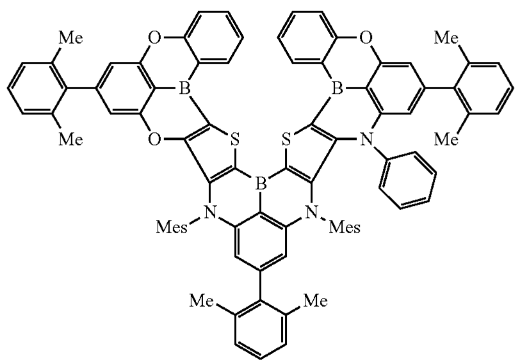
(1-4-169)
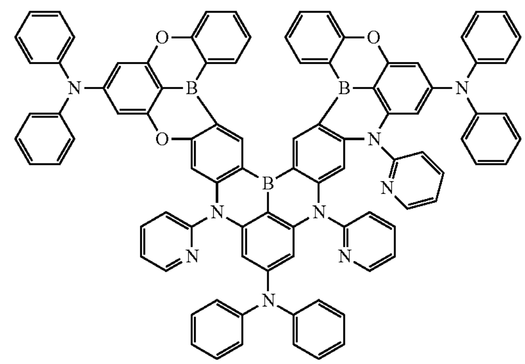
(1-4-170)
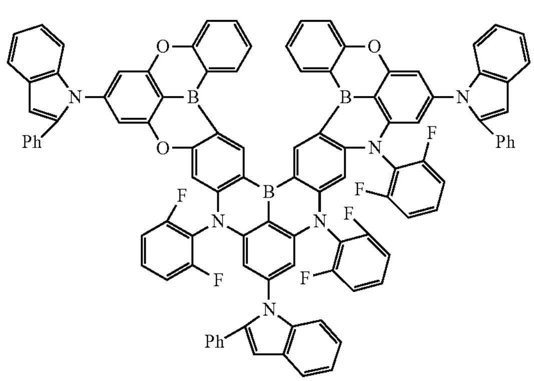
(1-4-191)
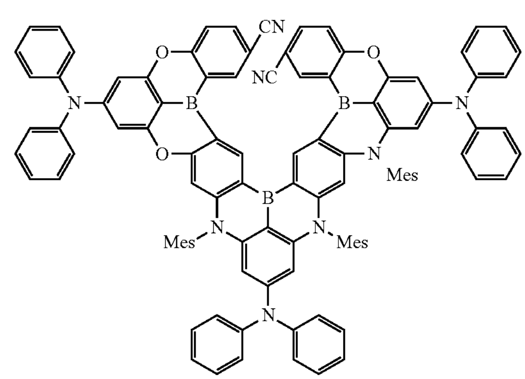
(1-4-192)
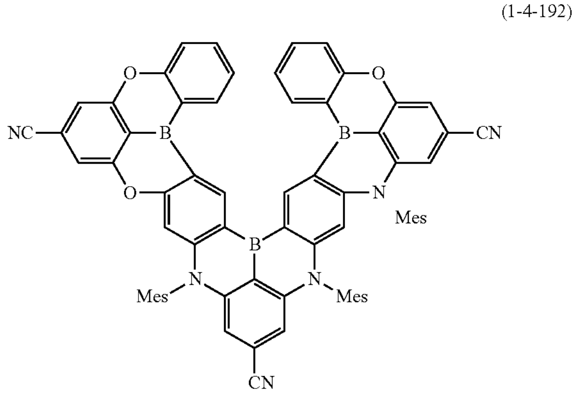
(1-4-193)
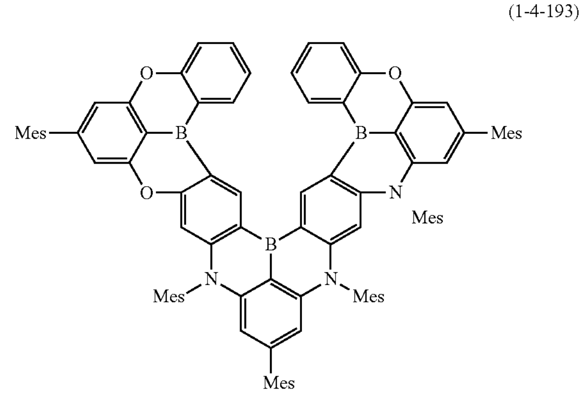

-continued
(1-4-194)
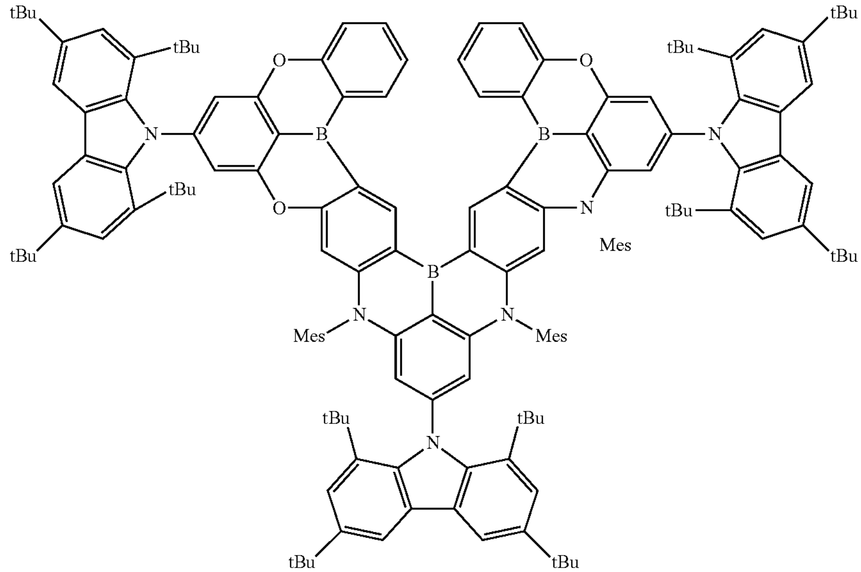
(1-4-195)
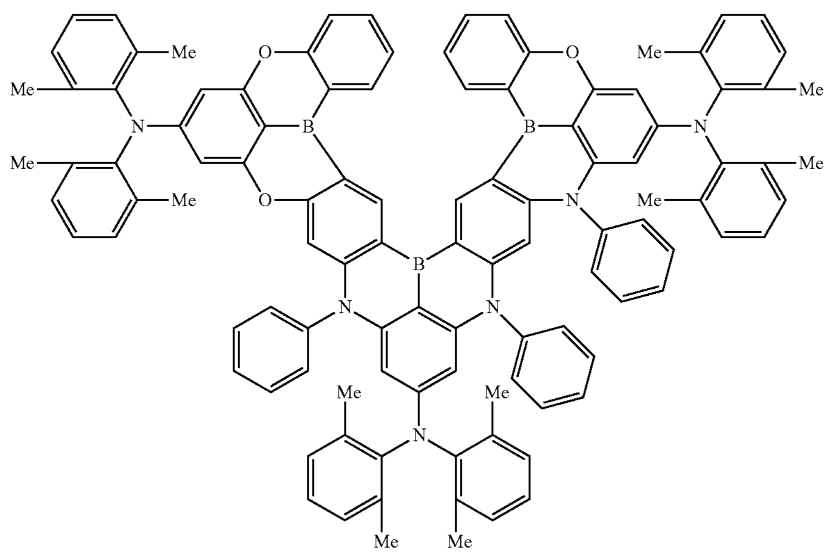
(1-4-196)
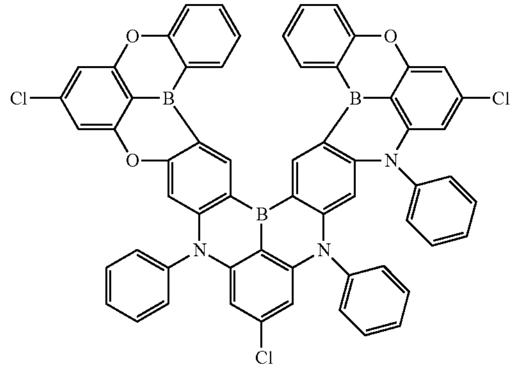
(1-4-197)
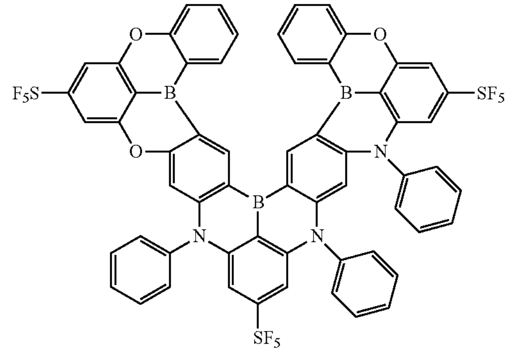

-continued
(1-4-198)
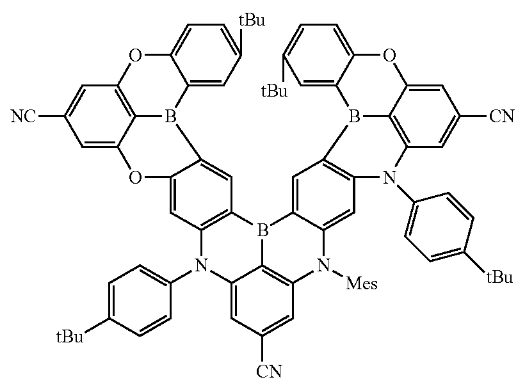
(1-4-199)
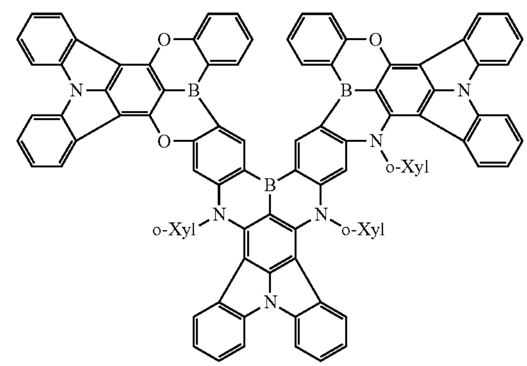
(1-4-200)
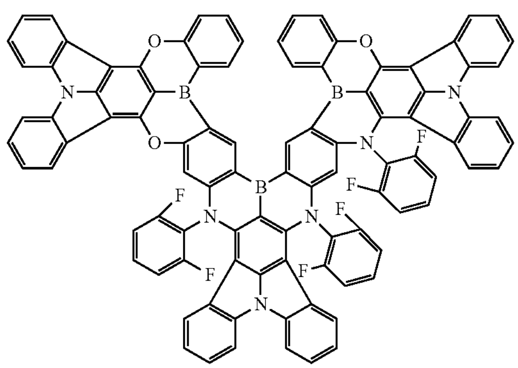
(1-4-221)
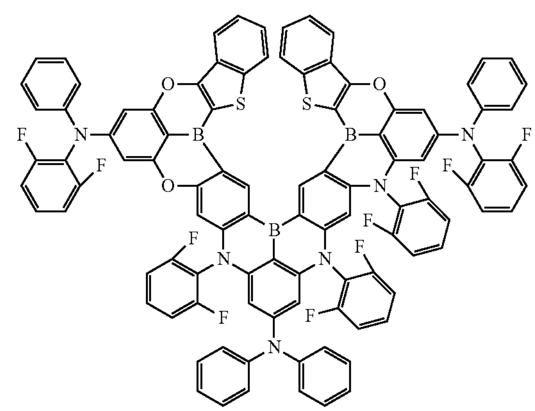
(1-4-222)
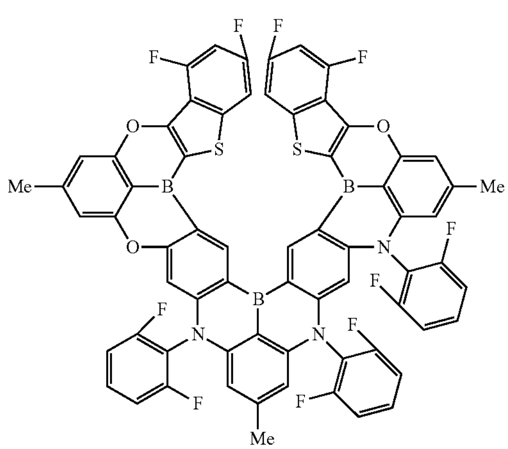
(1-4-223)
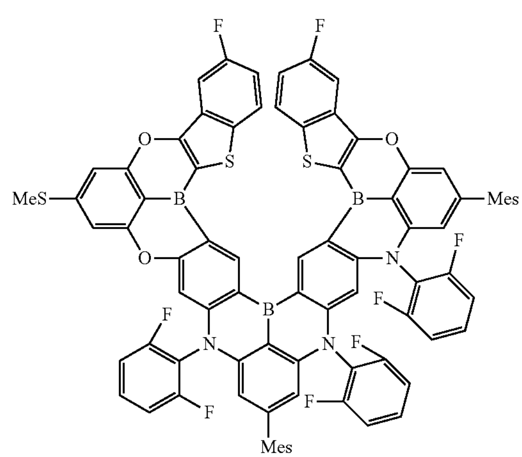

-continued
(1-4-224)
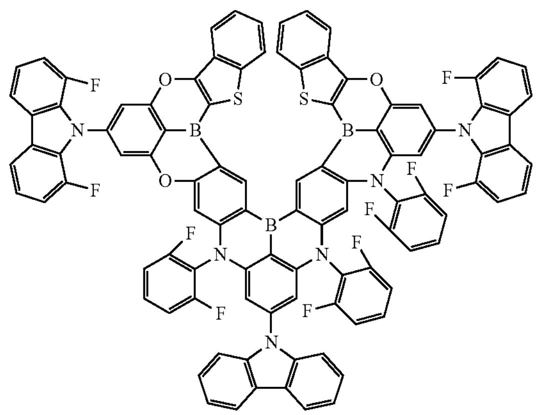
(1-4-225)
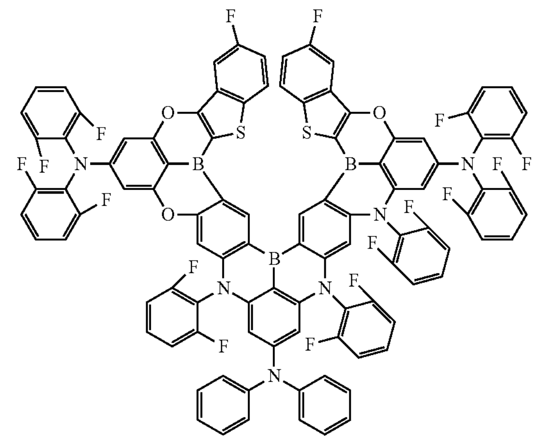
(1-4-226)
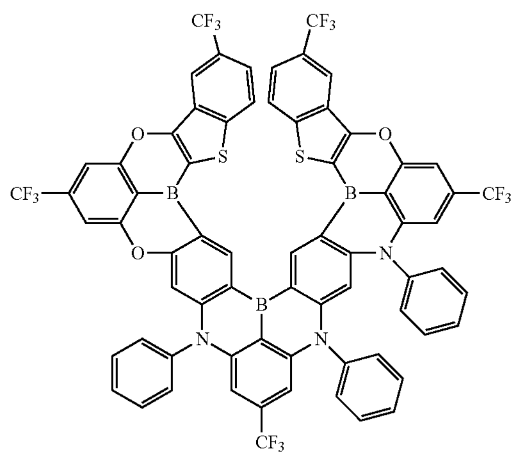
(1-4-227)
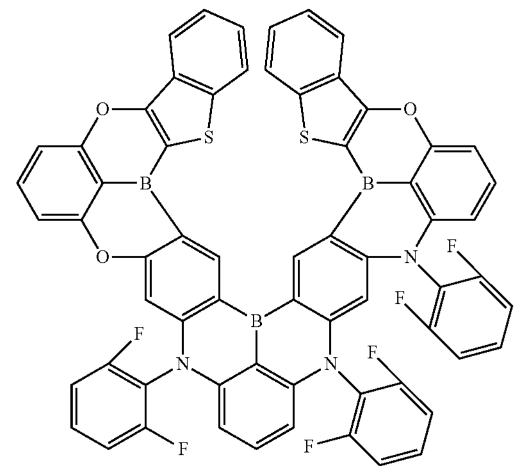
(1-4-228)
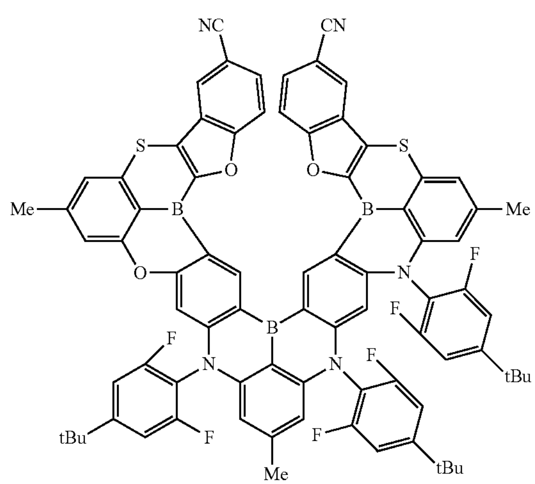
(1-4-229)
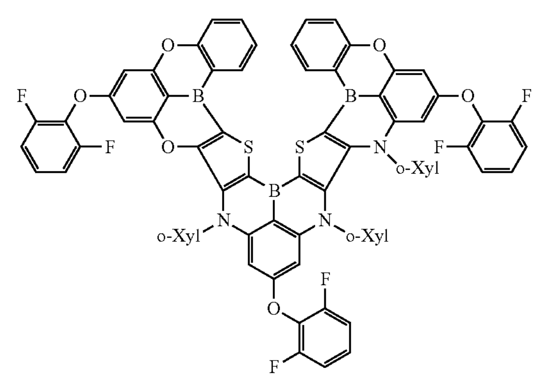

-continued
(1-4-230)
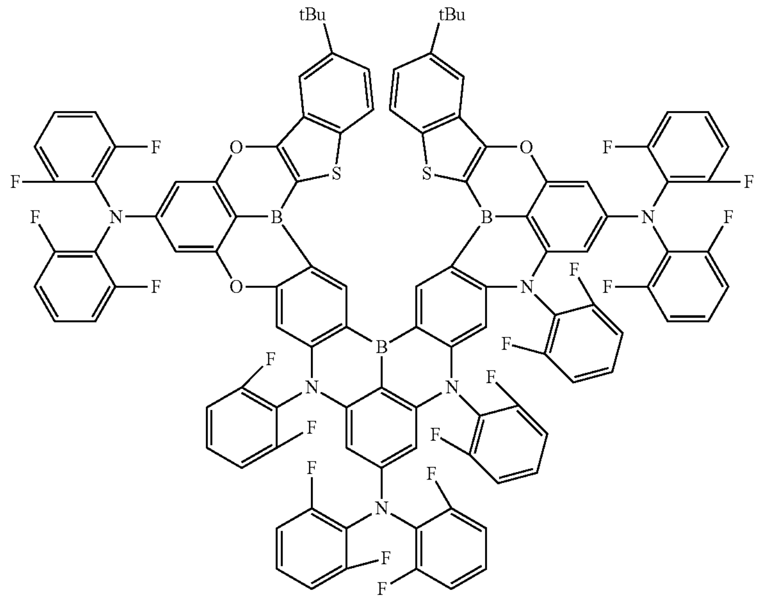
(1-5-1)
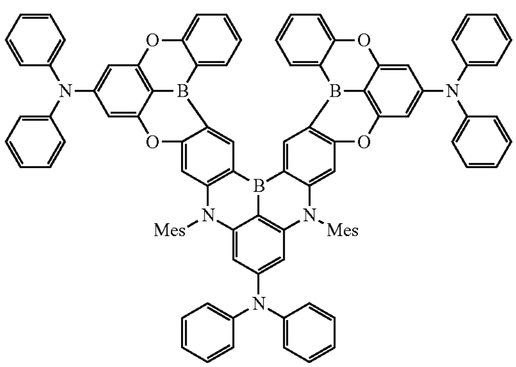
(1-5-2)
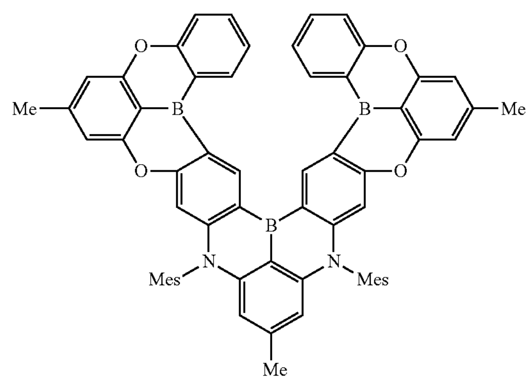
(1-5-3)
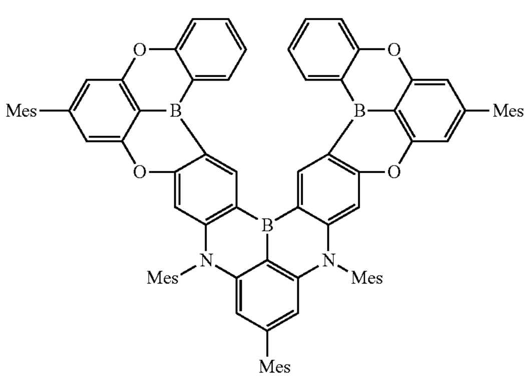
(1-5-4)
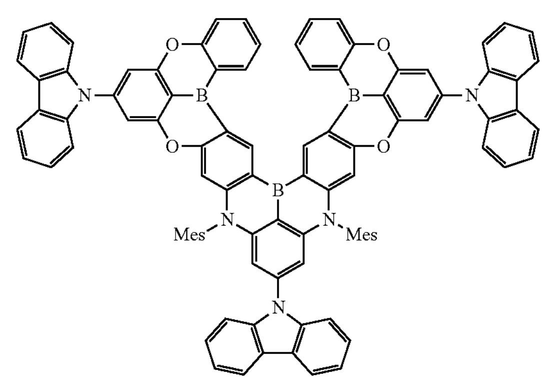

-continued
(1-5-5)
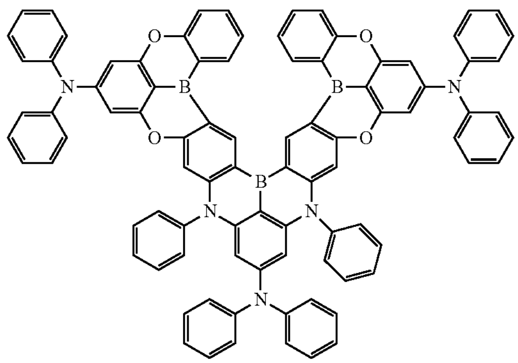
(1-5-6)
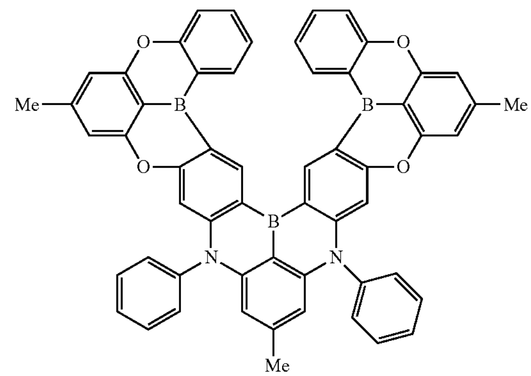
(1-5-7)
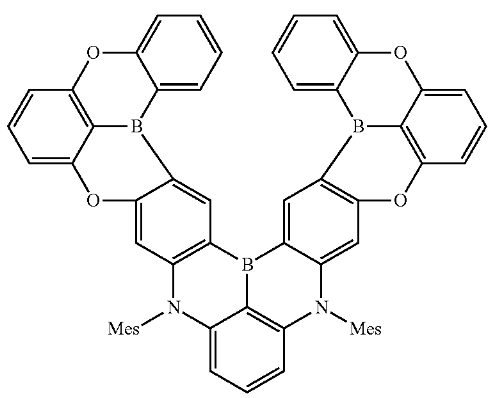
(1-5-8)
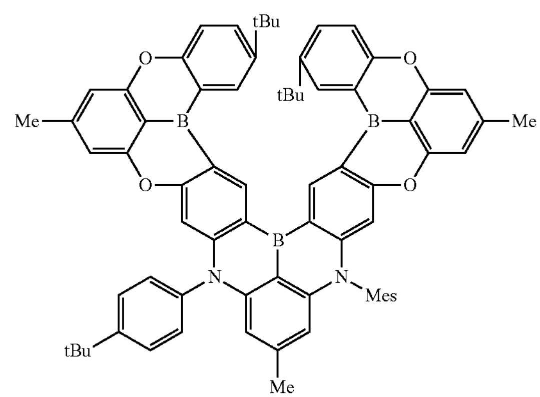
(1-5-9)
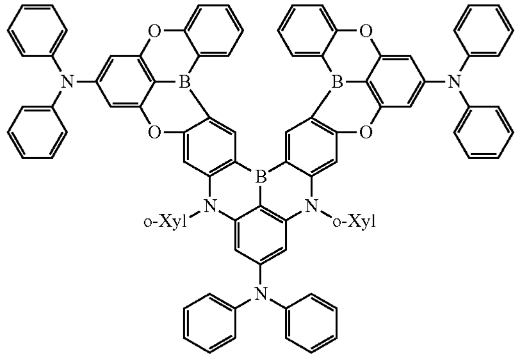
(1-5-10)
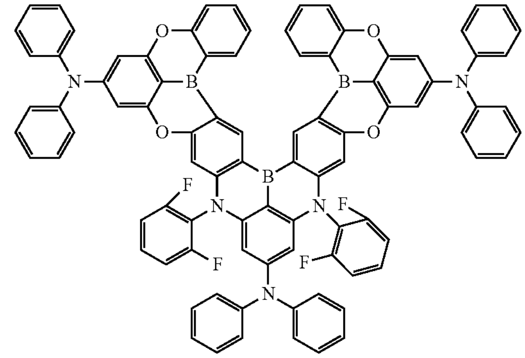

-continued
(1-5-21)
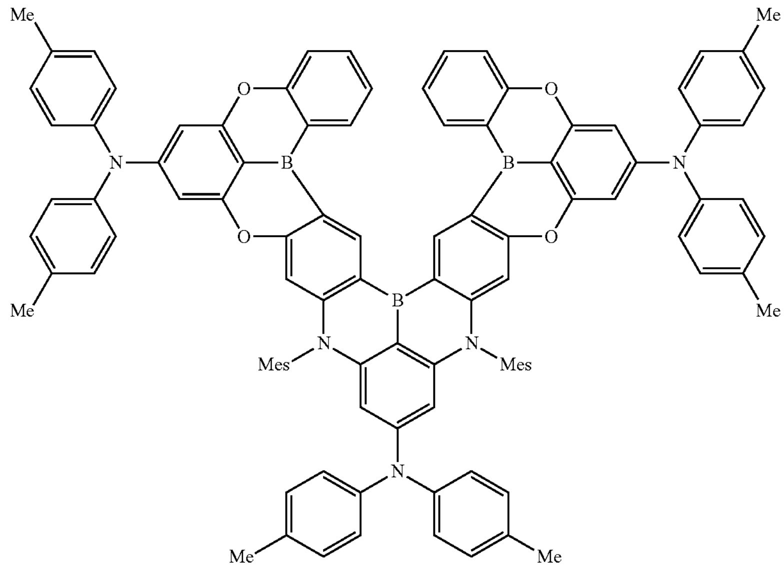
(1-5-22)
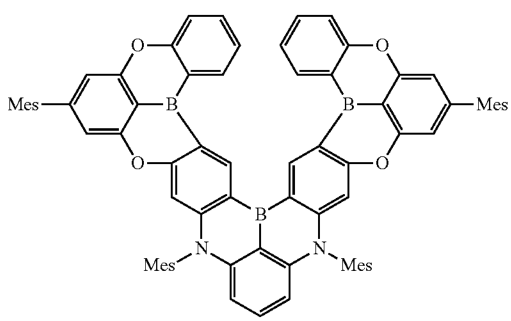
(1-5-23)
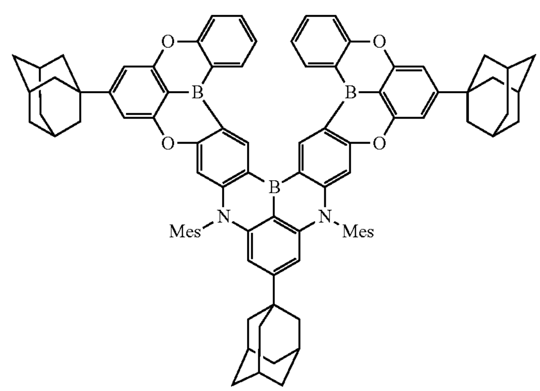
(1-5-24)
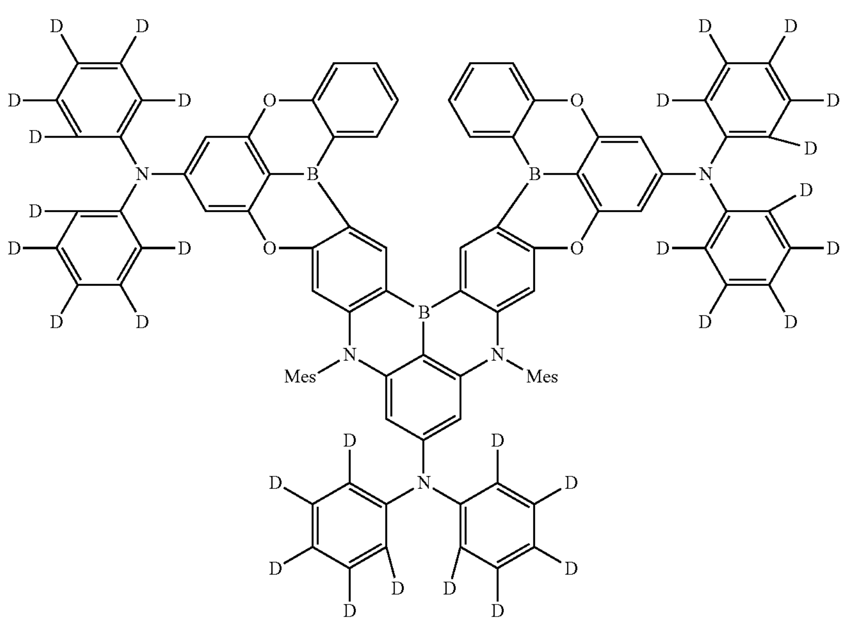

-continued
(1-5-25)
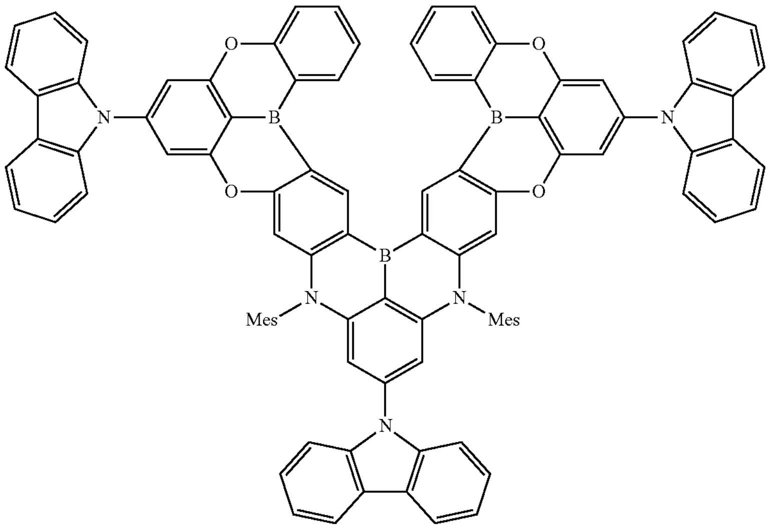
(1-5-26)
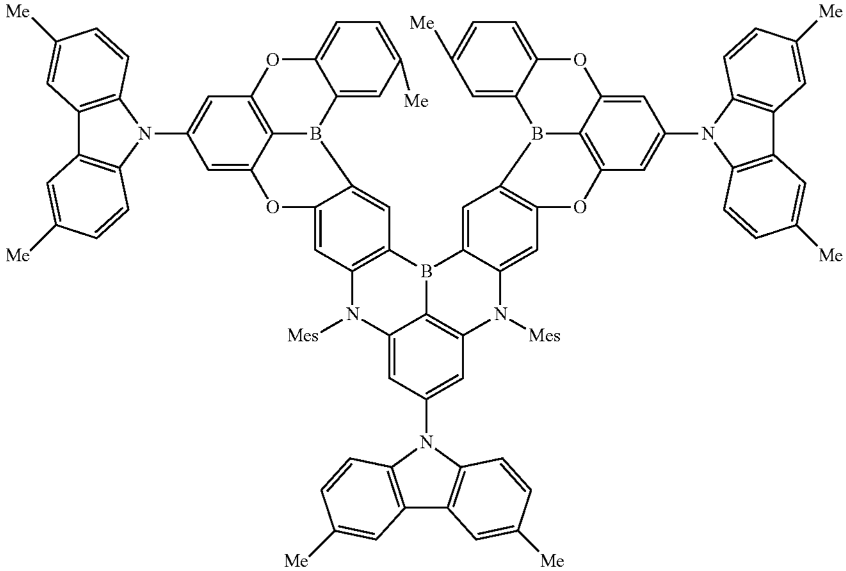
(1-5-27)
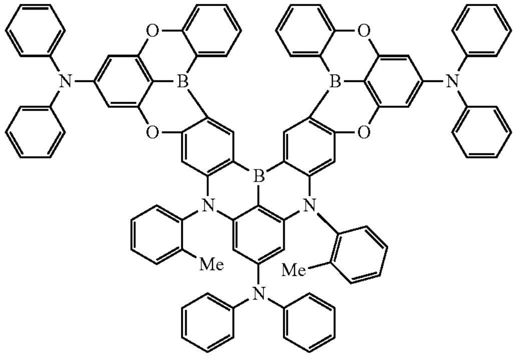
(1-5-28)
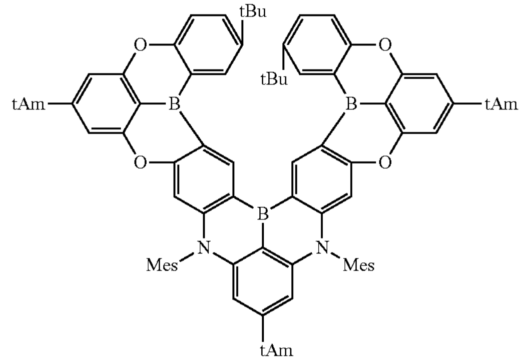

-continued
(1-5-29)
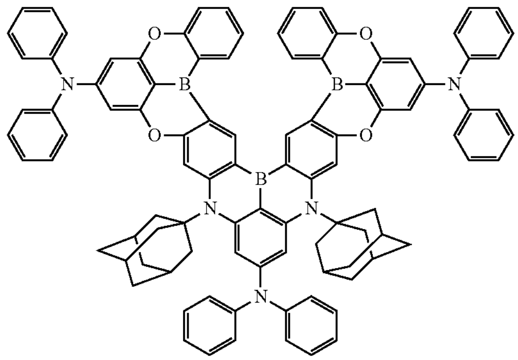
(1-5-30)
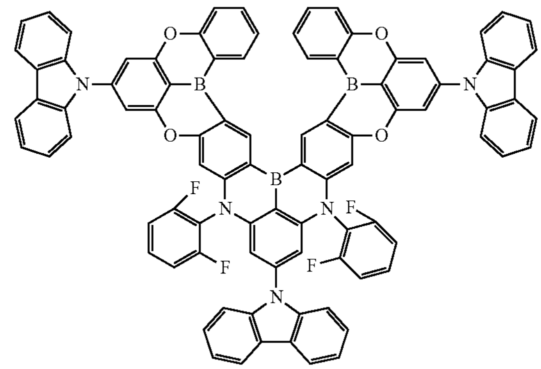
(1-5-41)
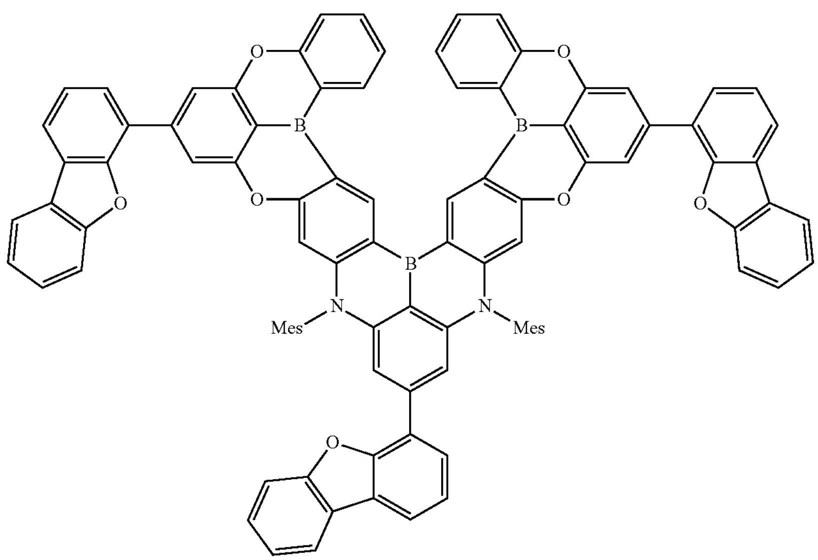
(1-5-42)
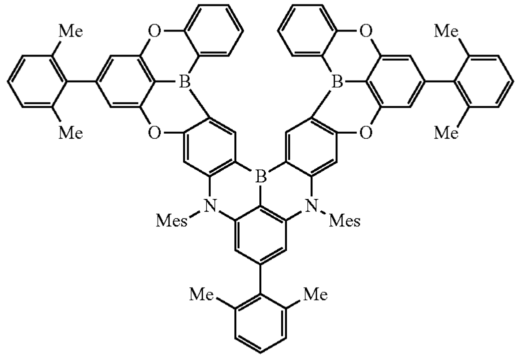
(1-5-43)
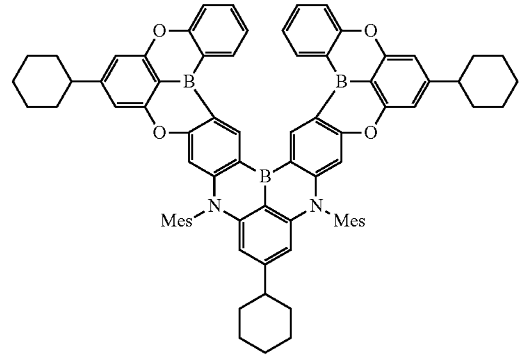

-continued
(1-5-44)
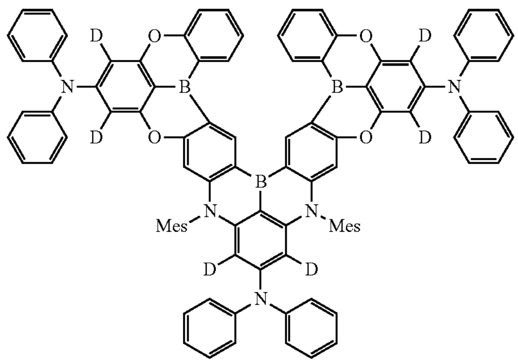
(1-5-45)
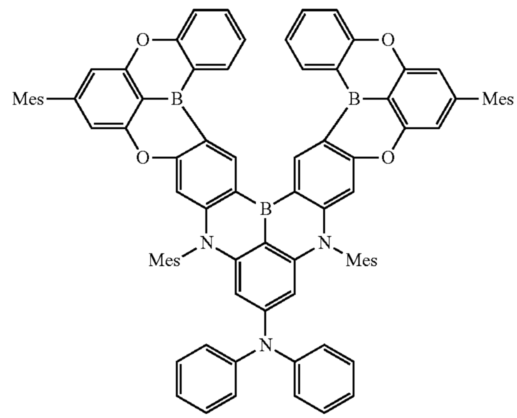
(1-5-46)
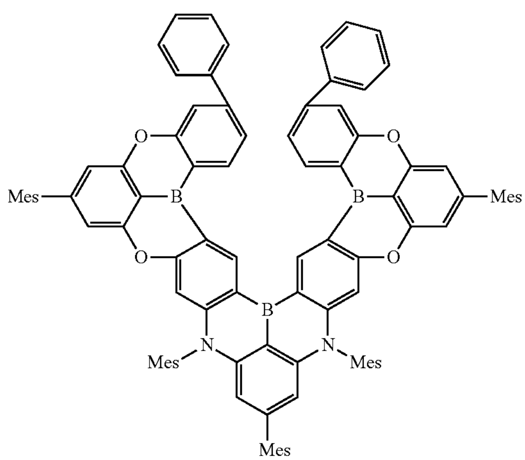
(1-5-47)
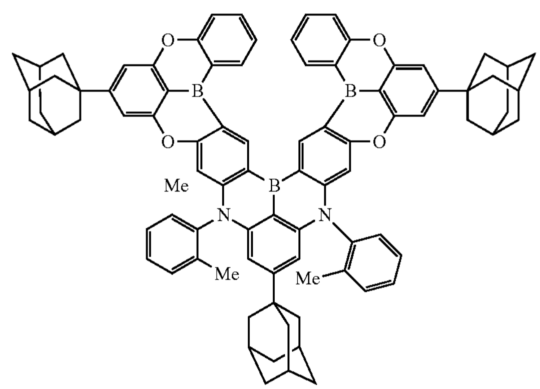
(1-5-48)
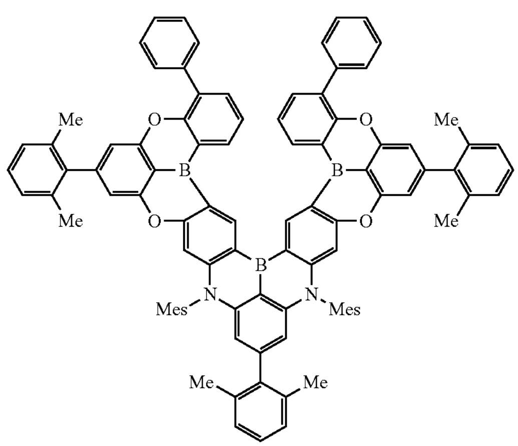
(1-5-49)
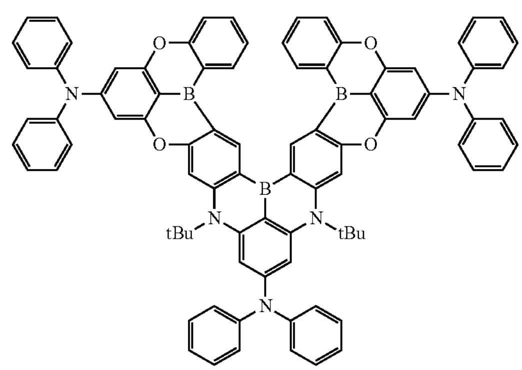

-continued
(1-5-50)
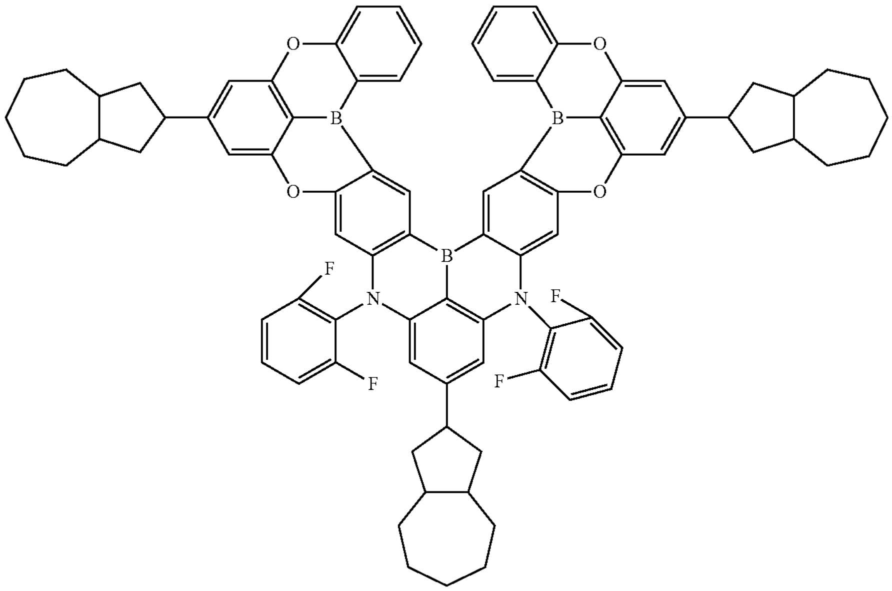
(1-5-101)
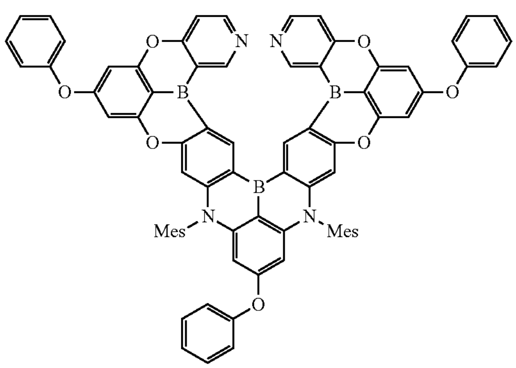
(1-5-102)
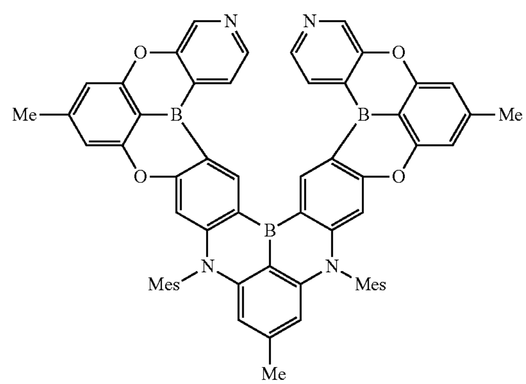
(1-5-103)
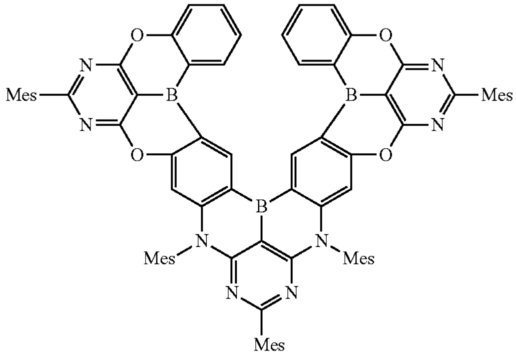
(1-5-104)
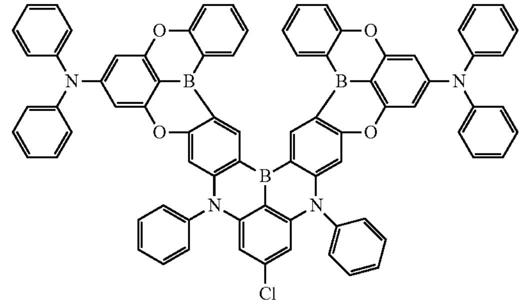

-continued
(1-5-105)
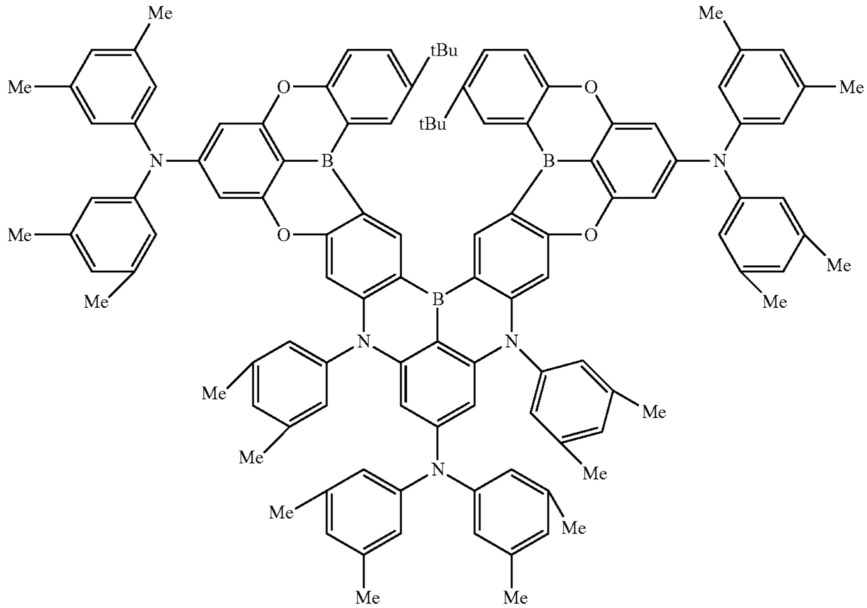
(1-5-106)
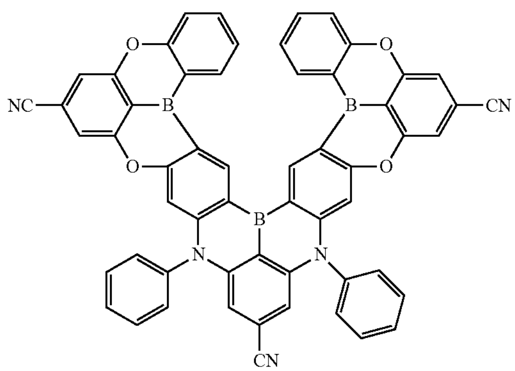
(1-5-107)
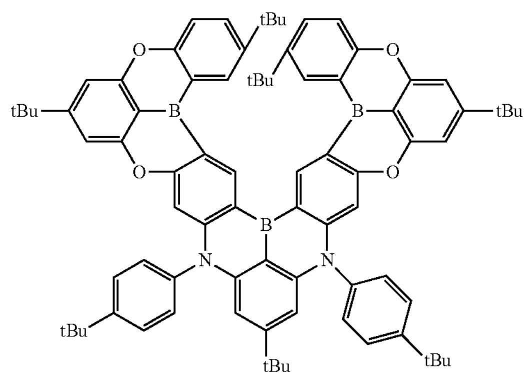
(1-5-108)
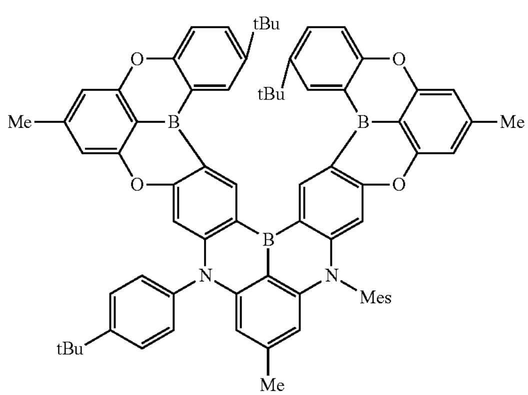
(1-5-109)
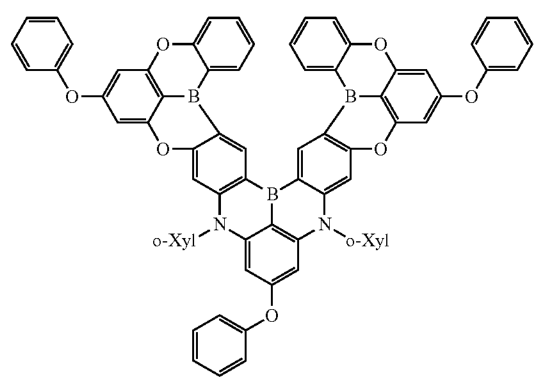

-continued
(1-5-110)
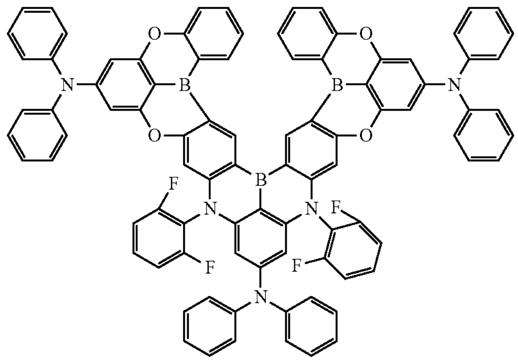
(1-5-121)
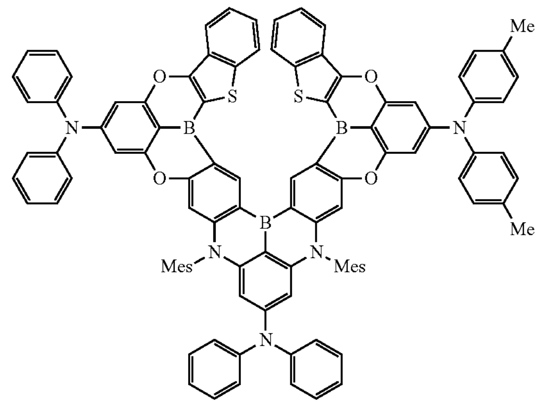
(1-5-122)
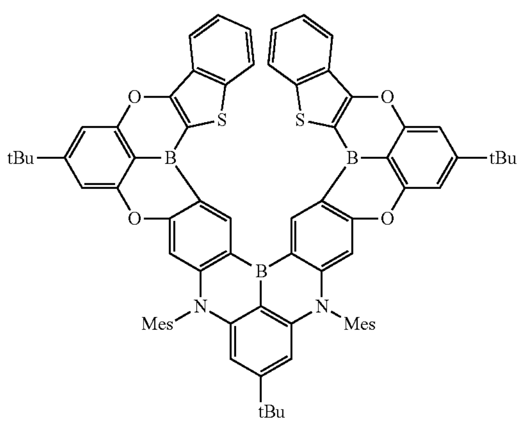
(1-5-123)
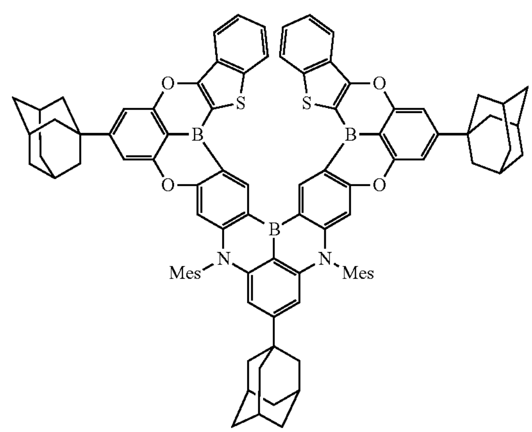
(1-5-124)
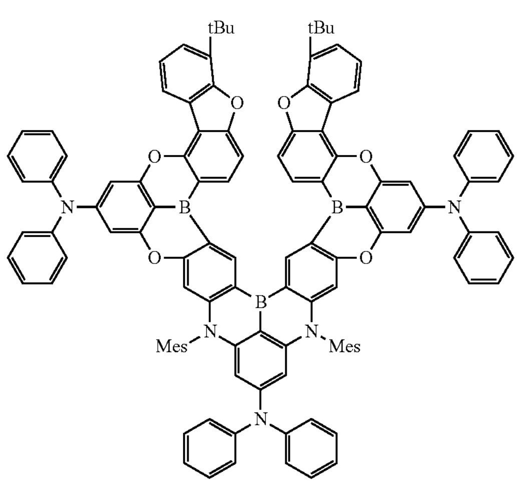
(1-5-125)
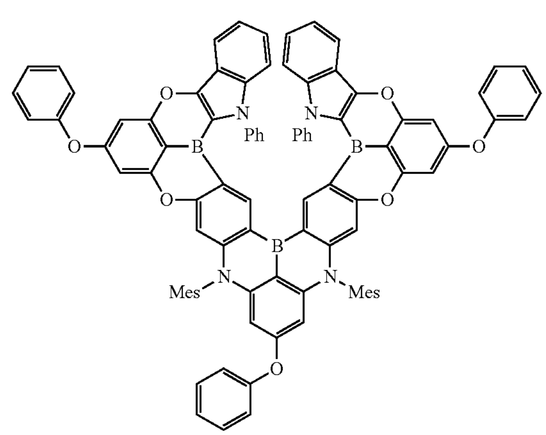

-continued
(1-5-126)
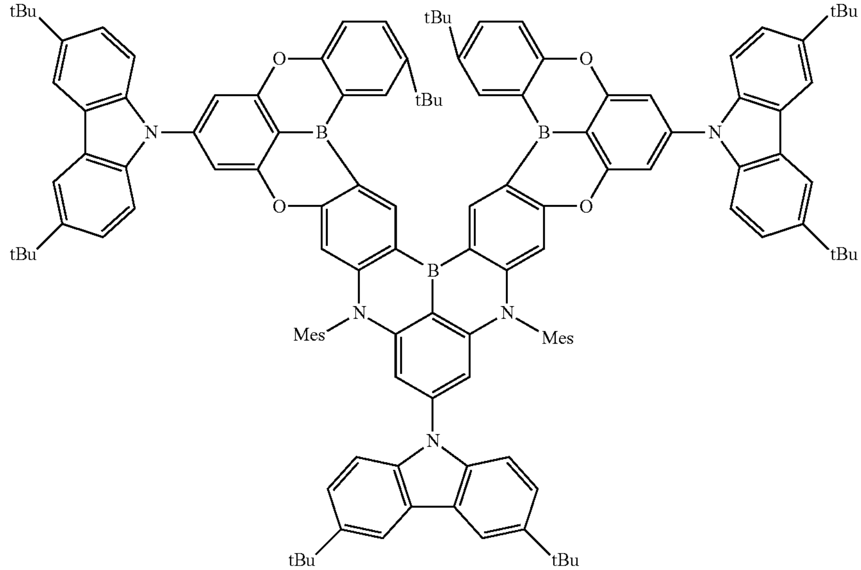
(1-5-127)
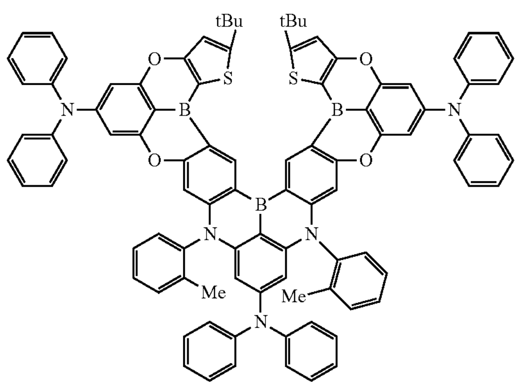
(1-5-128)
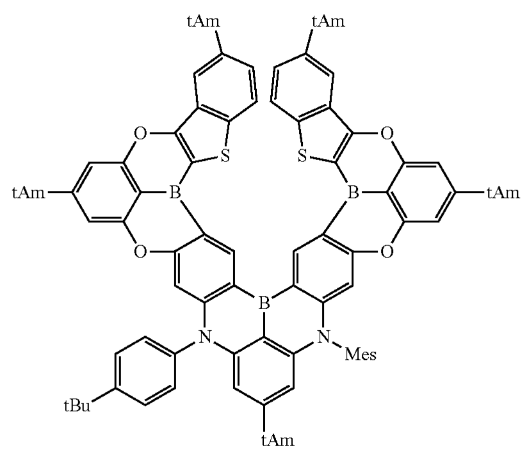
(1-5-129)
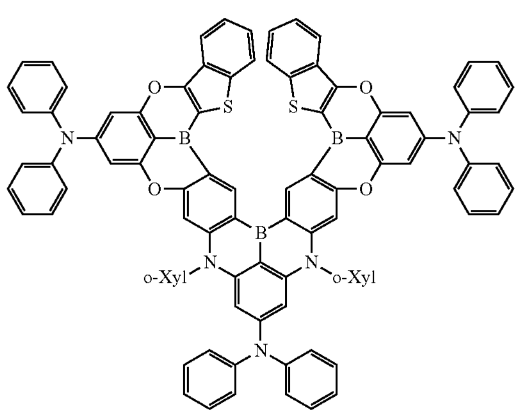
(1-5-130)
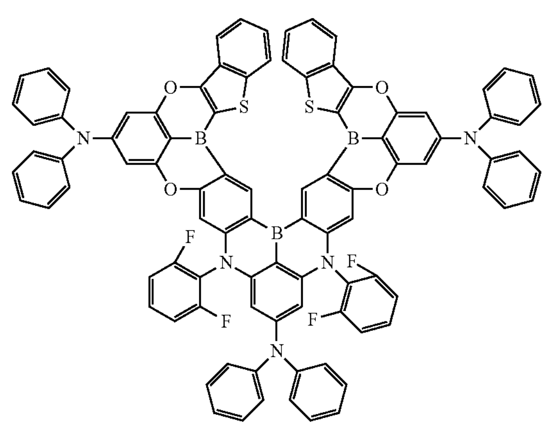

-continued
(1-5-141)
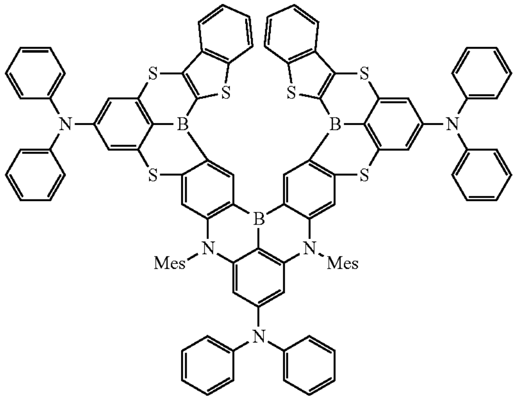
(1-5-142)
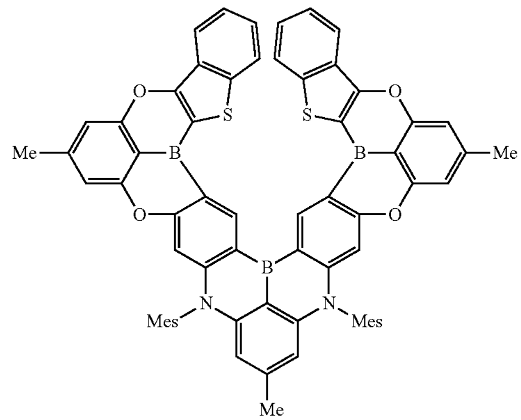
(1-5-143)
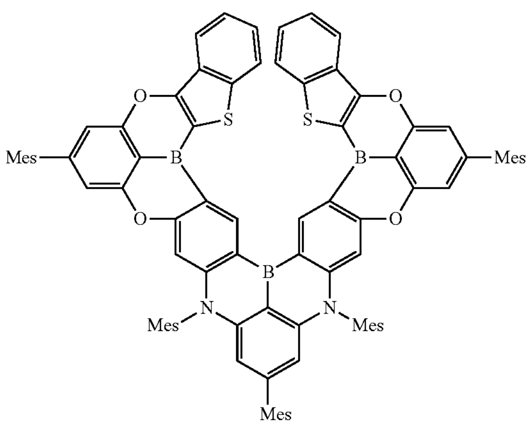
(1-5-144)
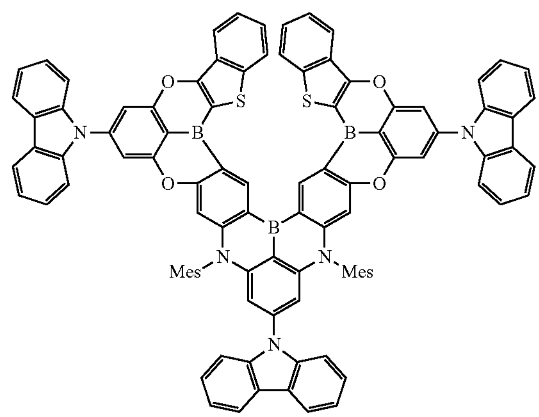
(1-5-145)
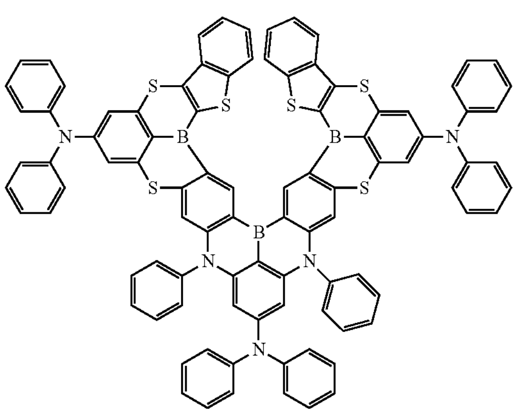
(1-5-146)
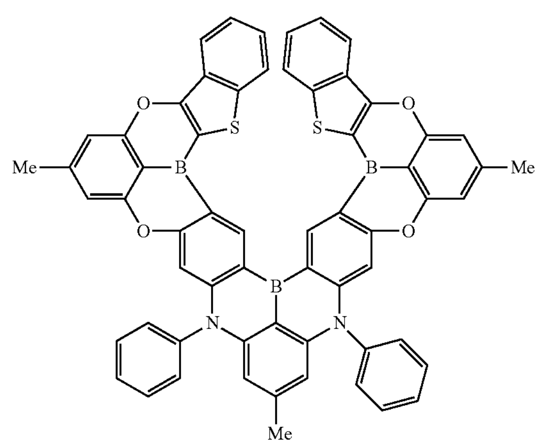

-continued
(1-5-147)
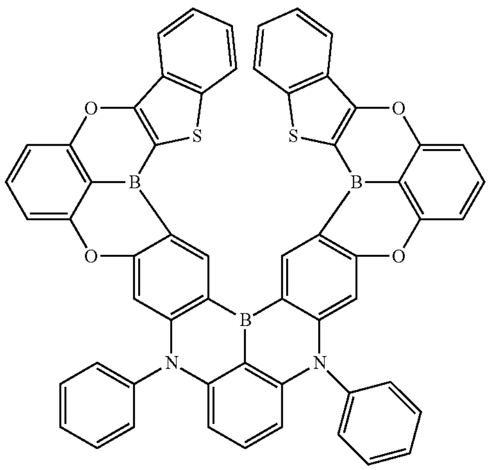
(1-5-148)
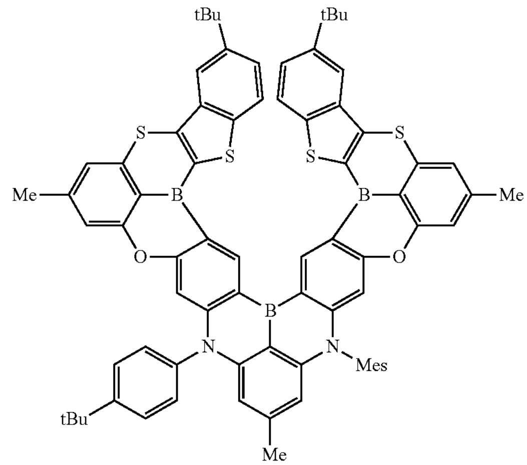
(1-5-149)
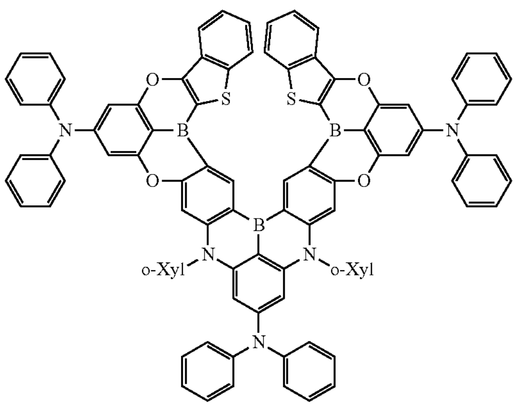
(1-5-150)
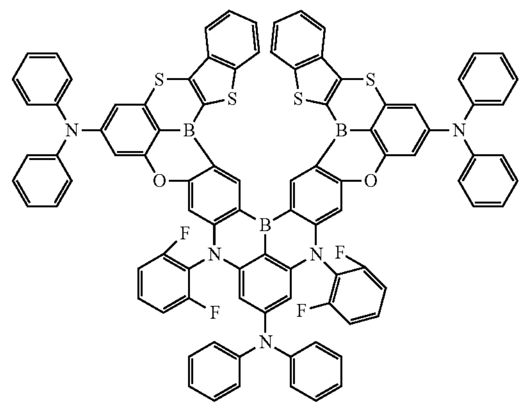
(1-5-161)
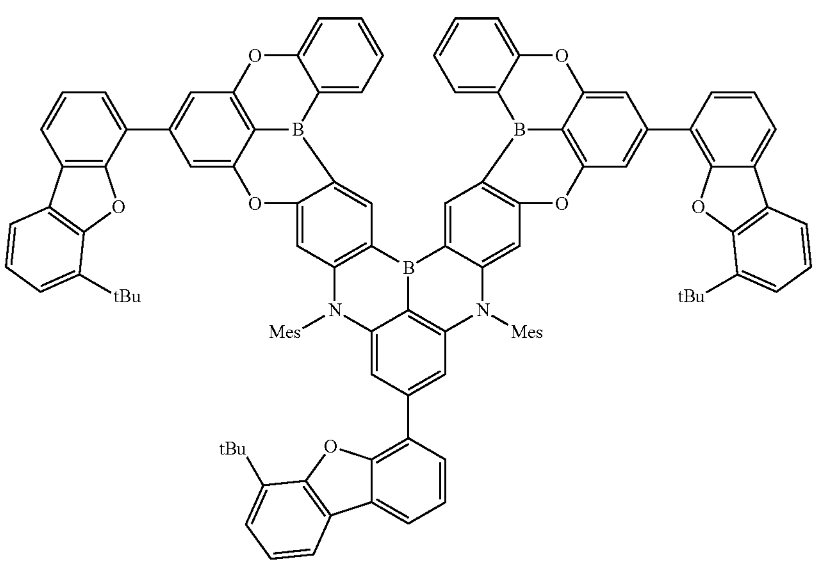

-continued
(1-5-162)
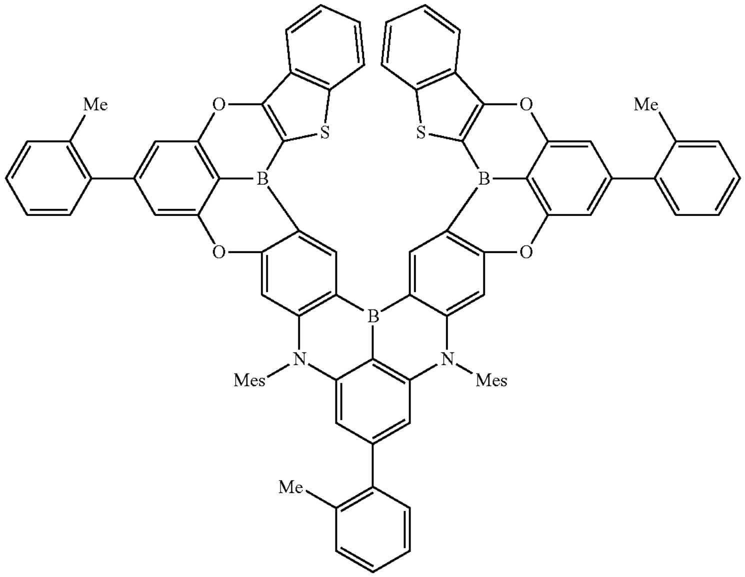
(1-5-163)
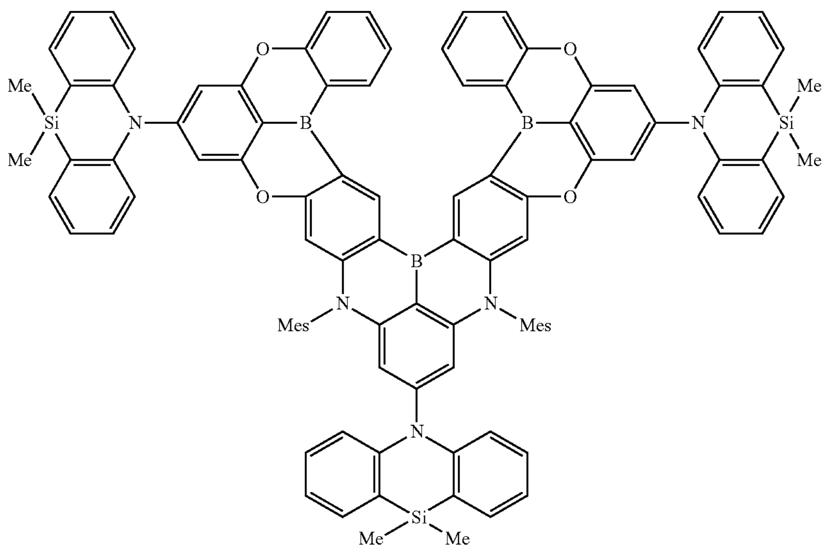
(1-5-164)
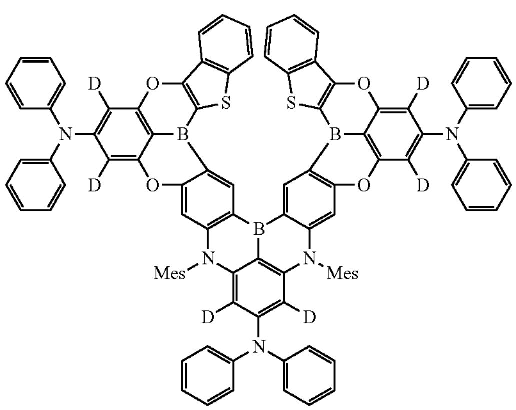
(1-5-165)
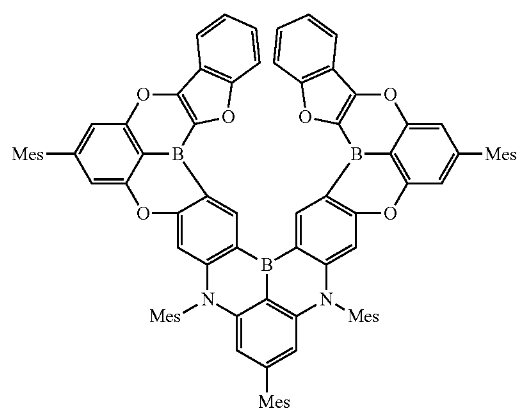

-continued
(1-5-166)
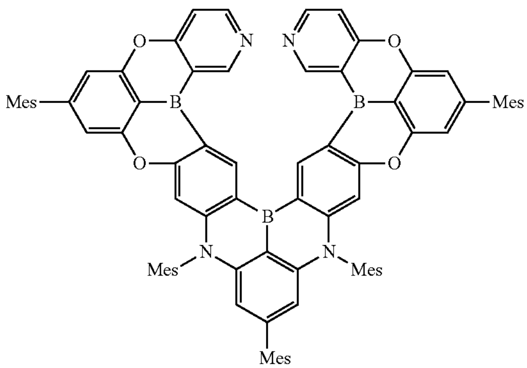
(1-5-167)
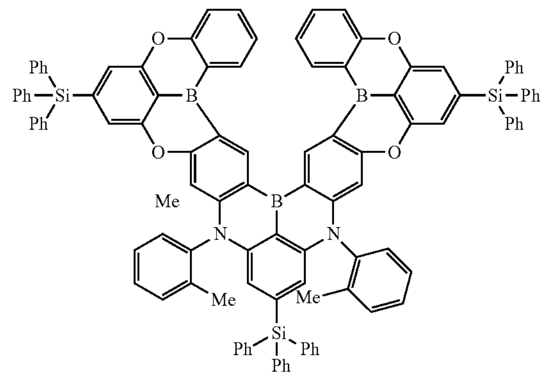
(1-5-168)
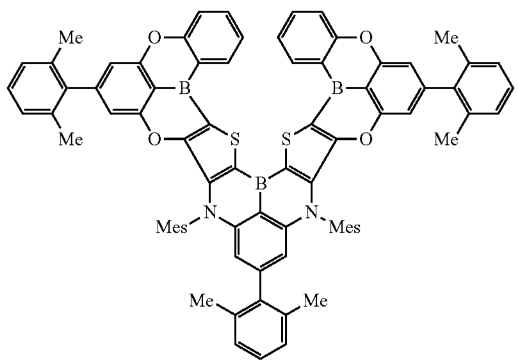
(1-5-169)
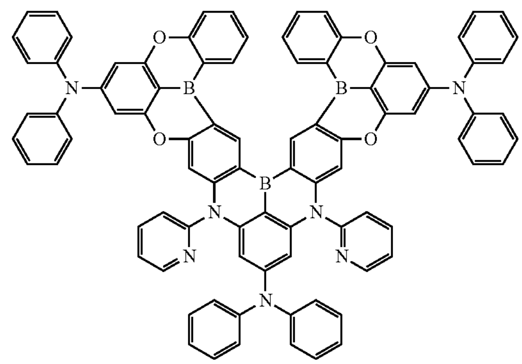
(1-5-170)
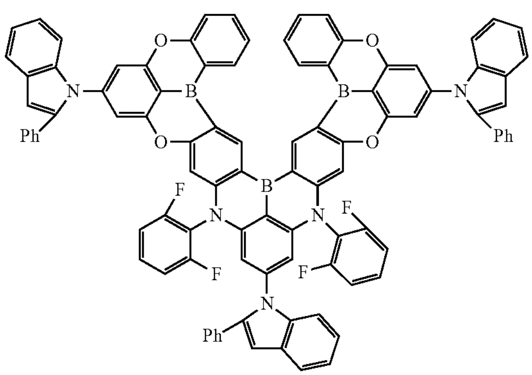
(1-5-191)
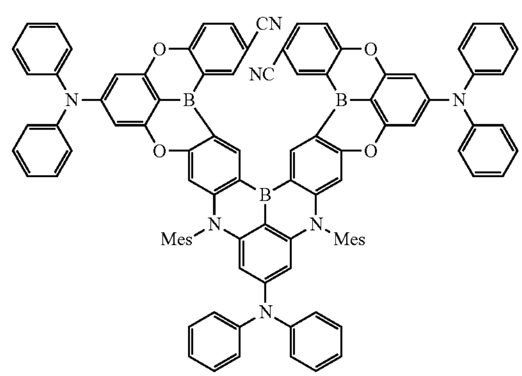
(1-5-192)
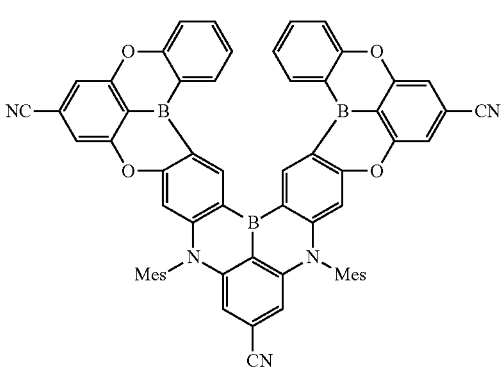
(1-5-193)
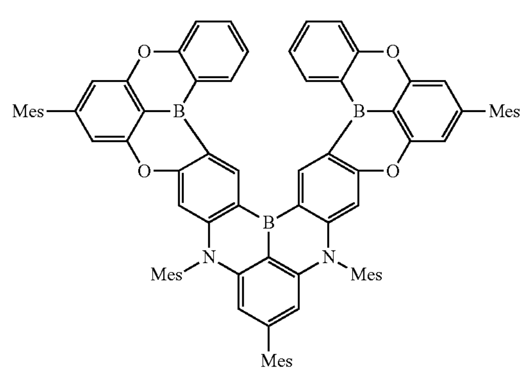

-continued
(1-5-194)
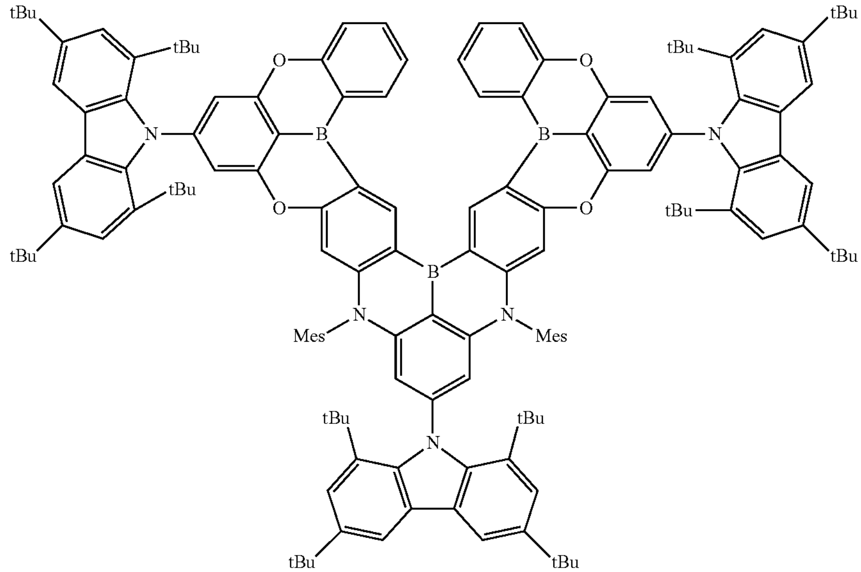
(1-5-195)
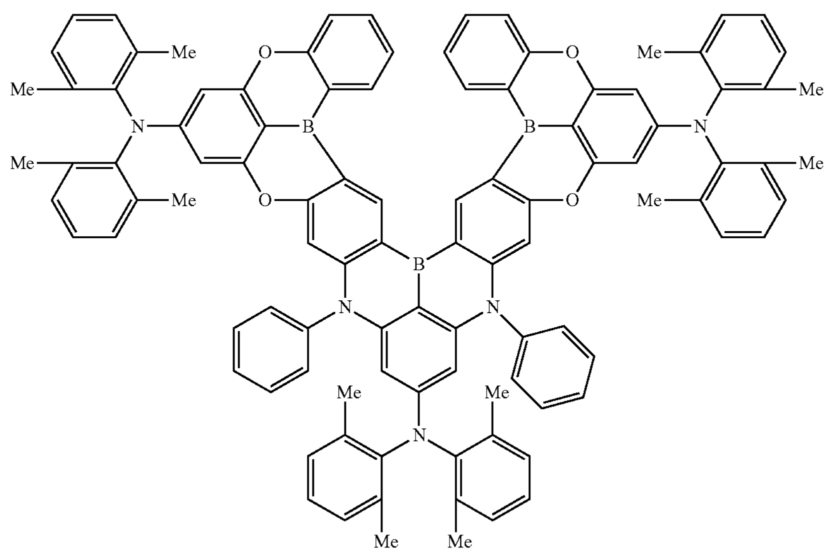
(1-5-196)
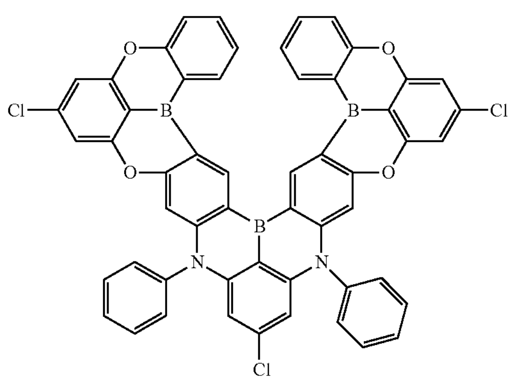
(1-5-197)
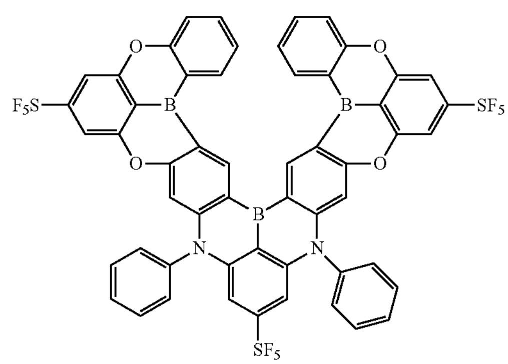

-continued
(1-5-198)
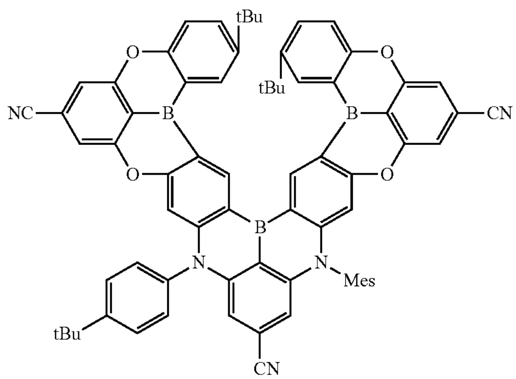
(1-5-199)
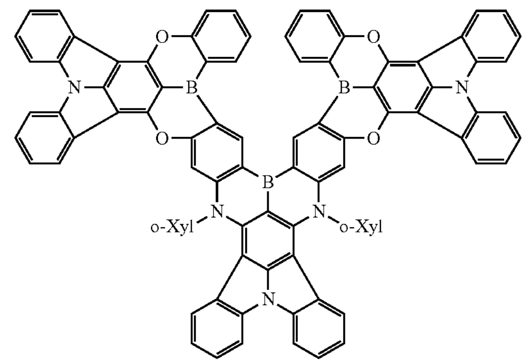
(1-5-200)
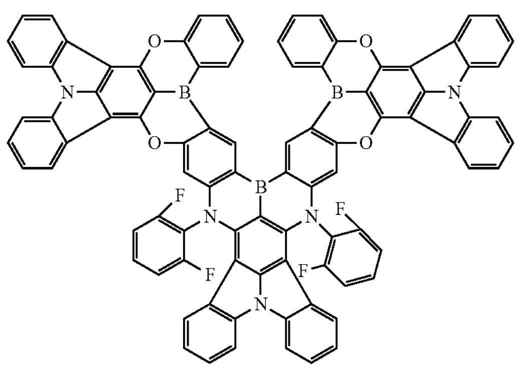
(1-5-221)
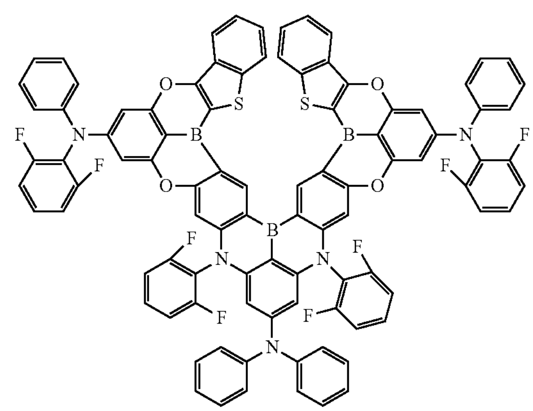
(1-5-222)
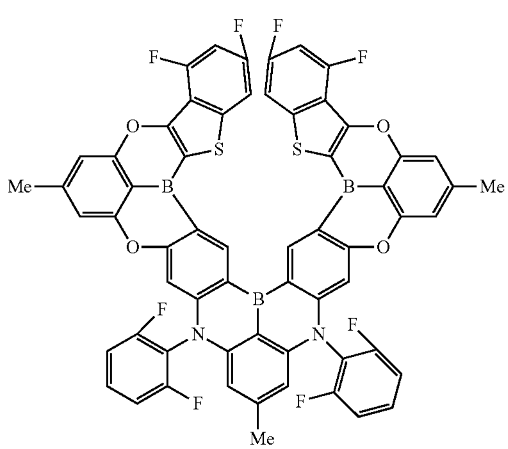
(1-5-223)
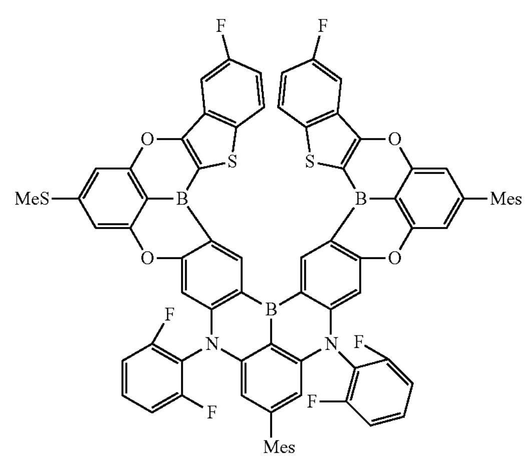

-continued
(1-5-224)
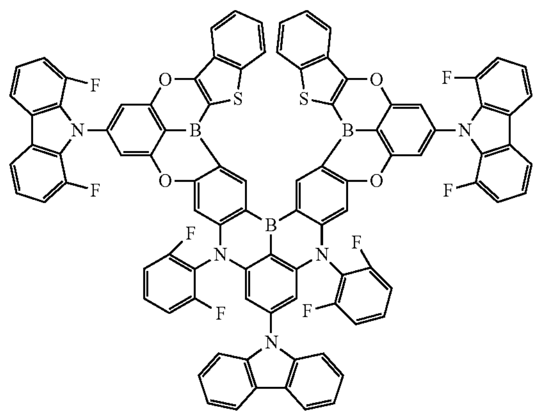
(1-5-225)
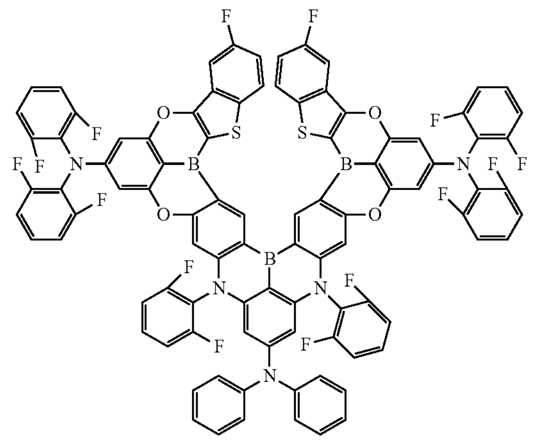
(1-5-226)
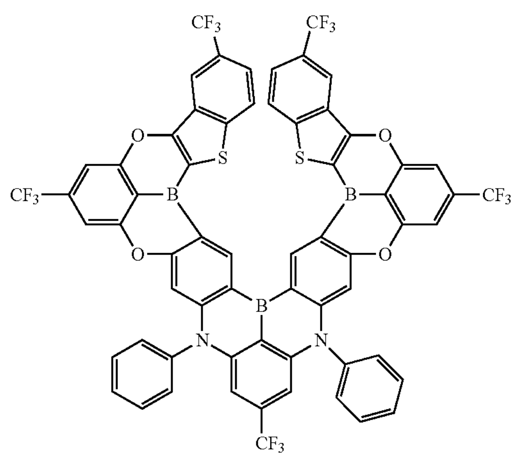
(1-5-227)
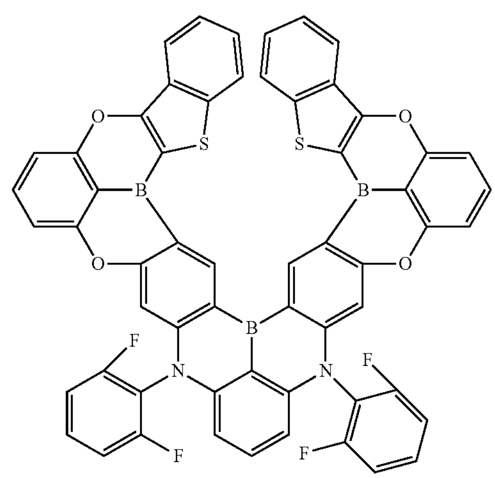
(1-5-228)
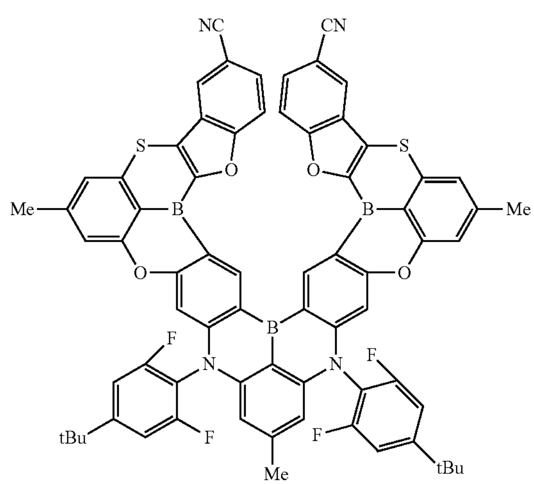
(1-5-229)
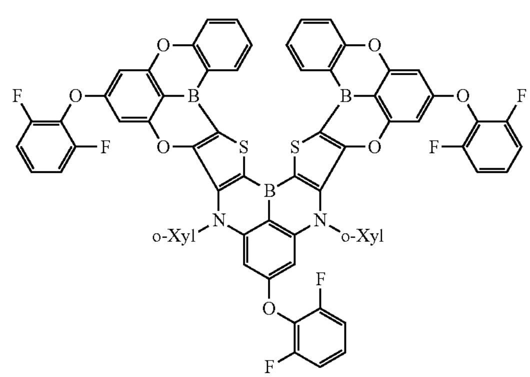

-continued
(1-5-230)
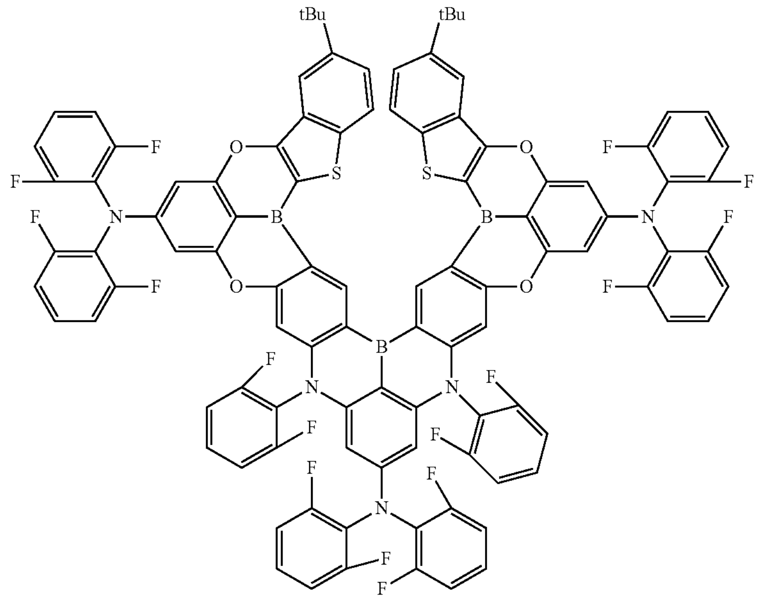
(1-6-1)
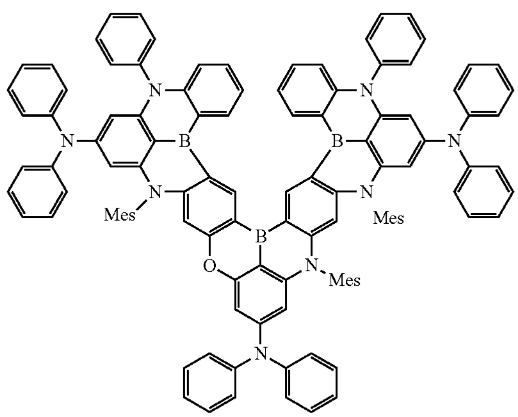
(1-6-2)
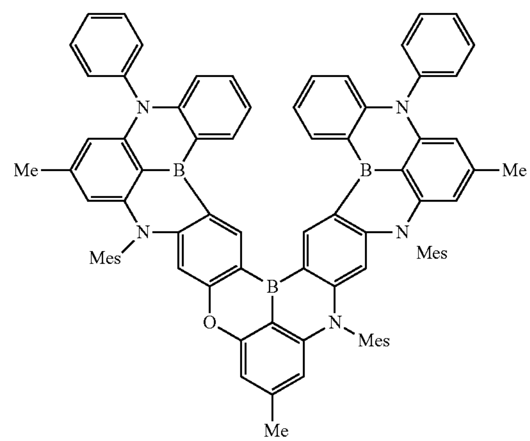
(1-6-3)
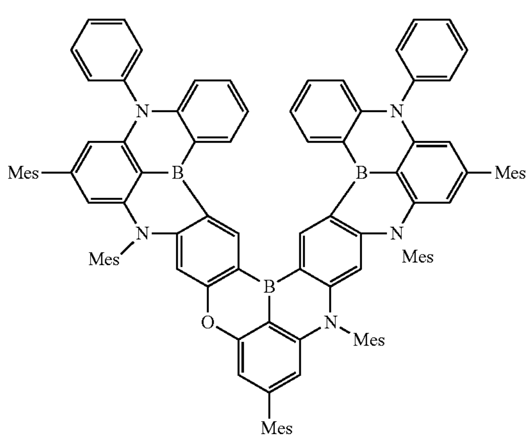
(1-6-4)
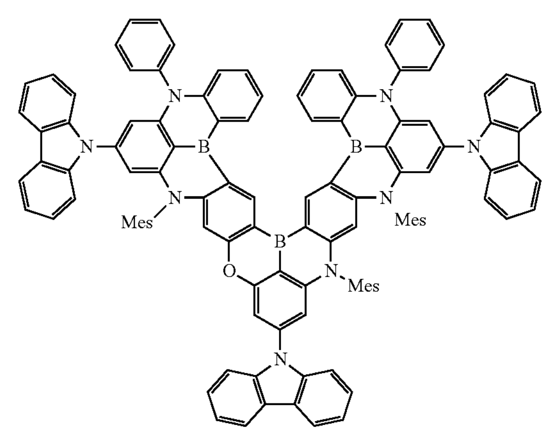

-continued
(1-6-5)
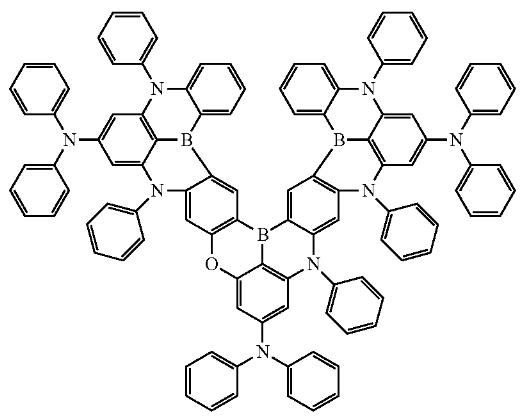
(1-6-6)
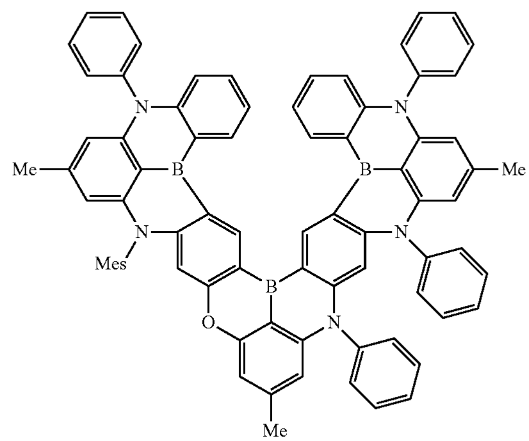
(1-6-7)
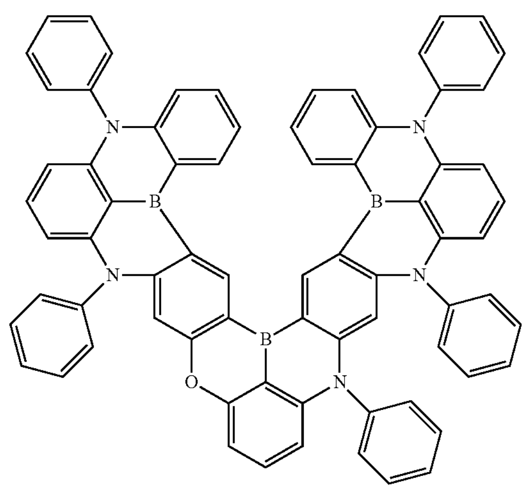
(1-6-8)
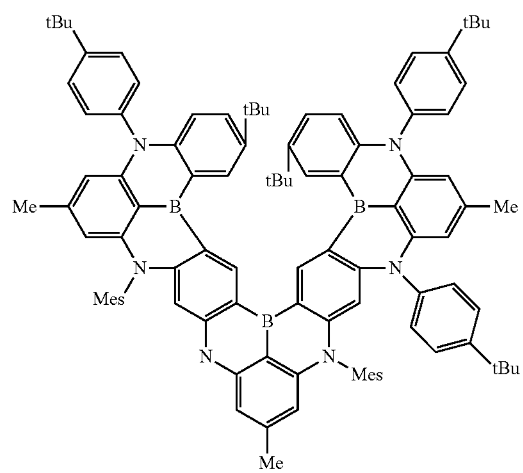
(1-6-9)
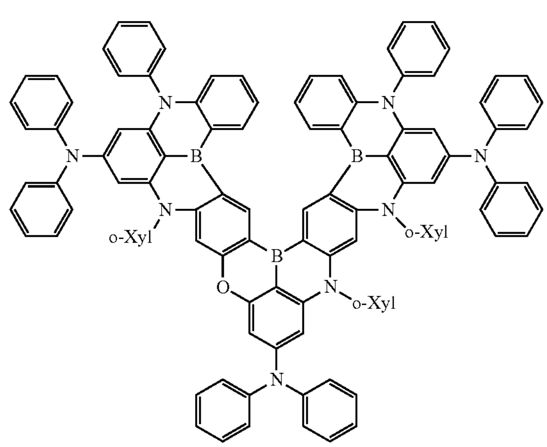
(1-6-10)
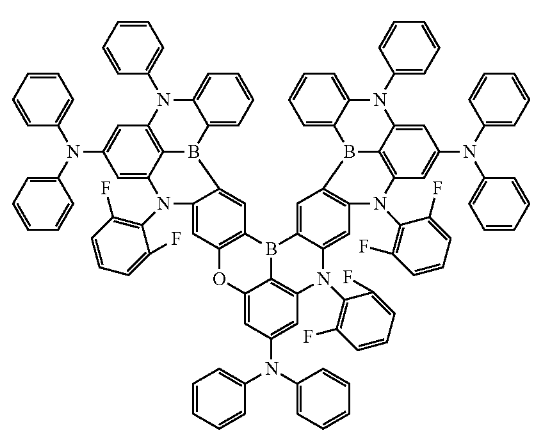

-continued
(1-6-21)
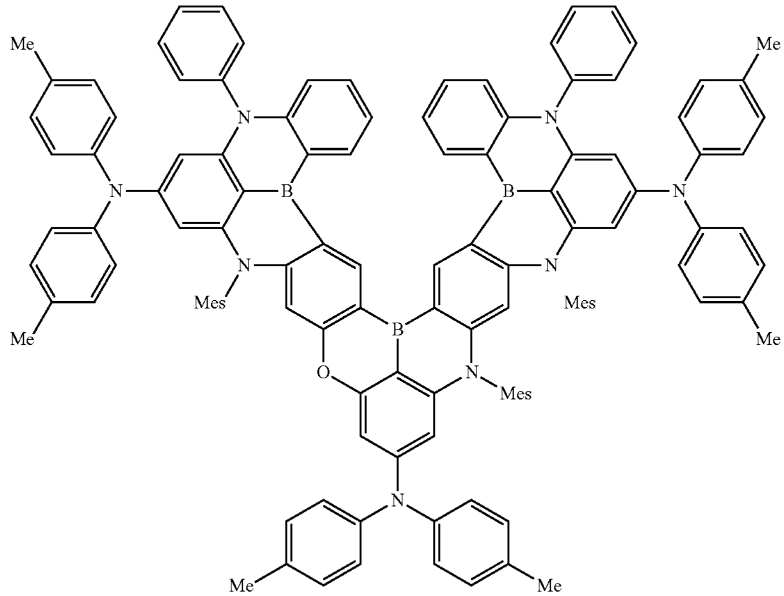
(1-6-22)
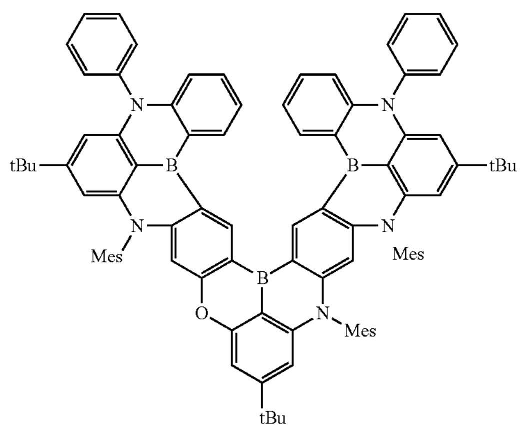
(1-6-23)
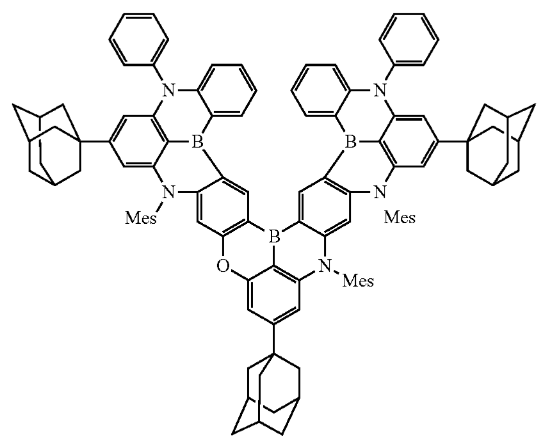
(1-6-24)
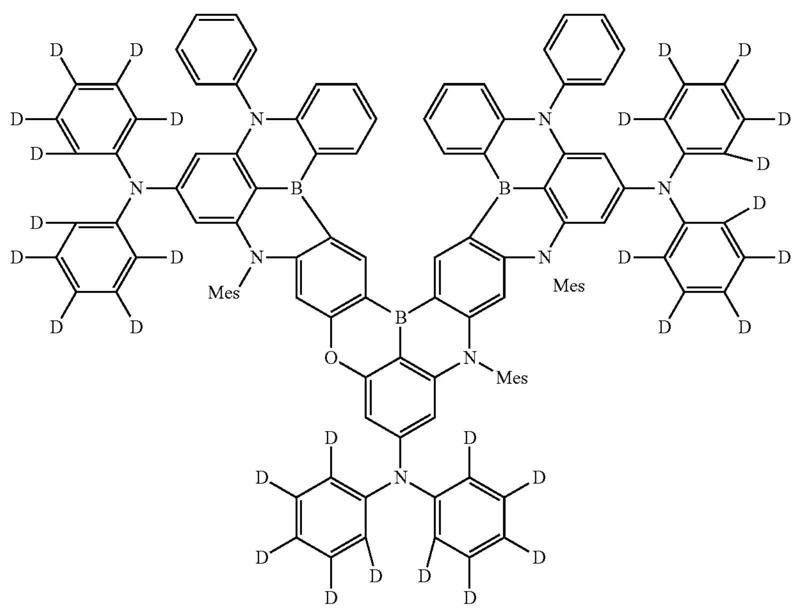

-continued
(1-6-25)
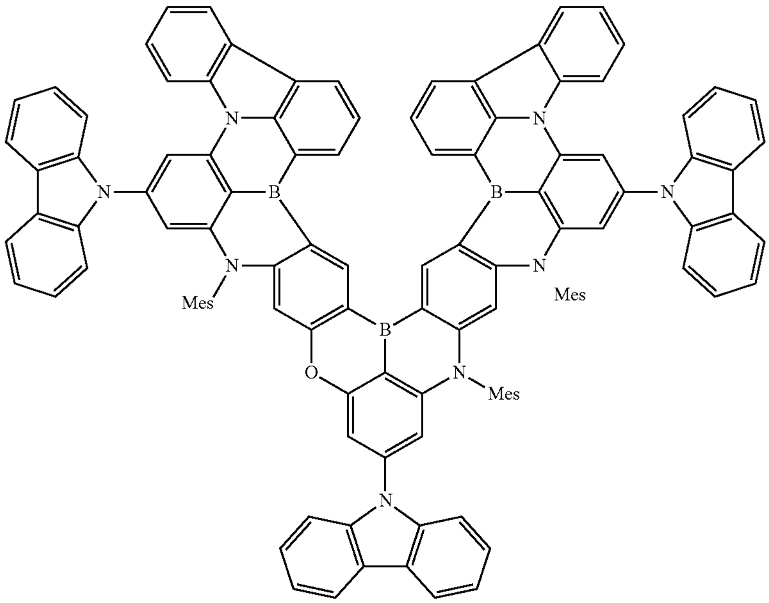
(1-6-26)
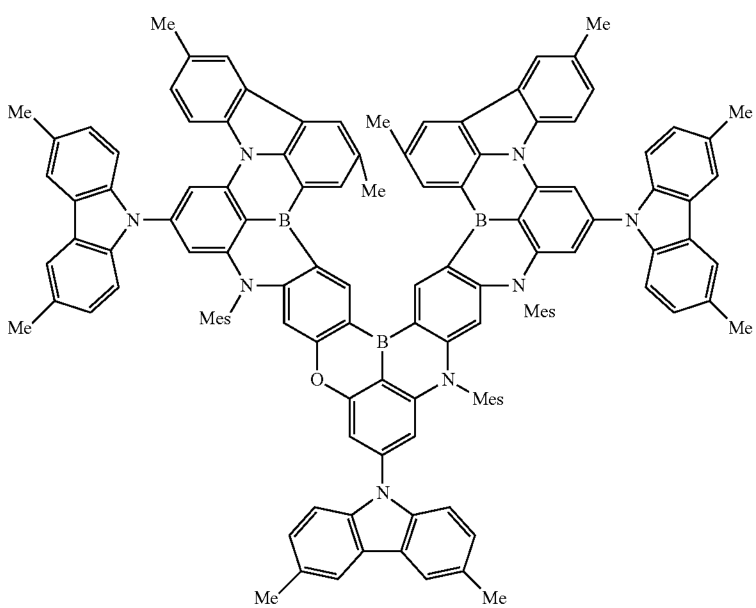

-continued
(1-6-27)
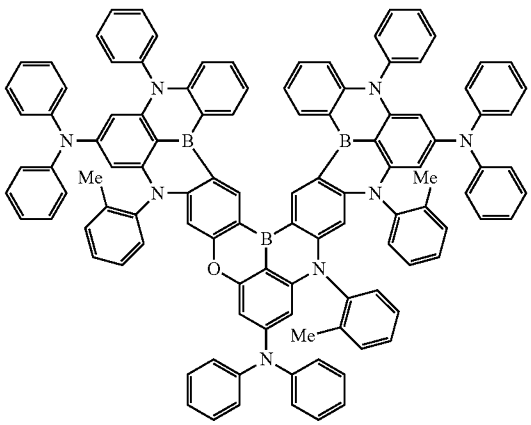
(1-6-28)
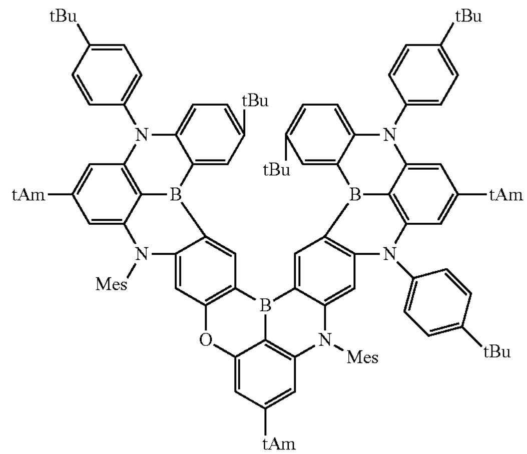
(1-6-29)
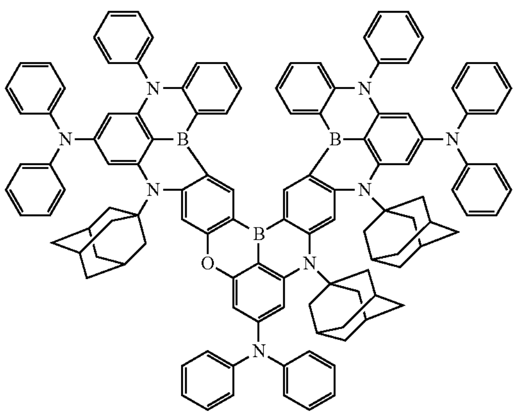
(1-6-30)
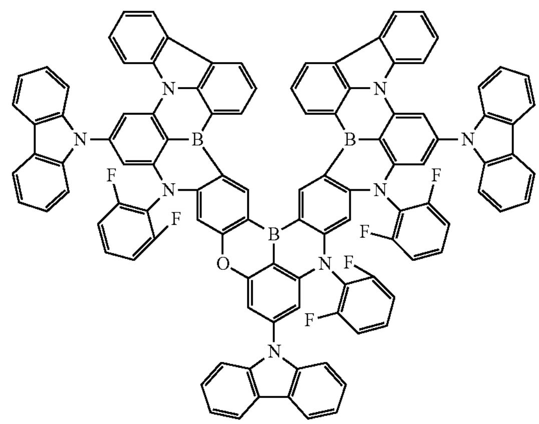
(1-6-41)
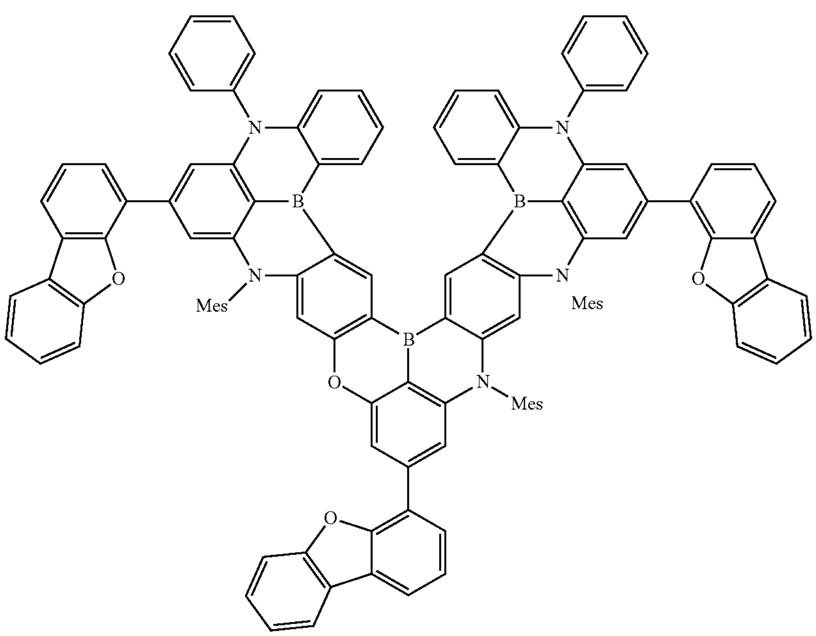

-continued
(1-6-42)
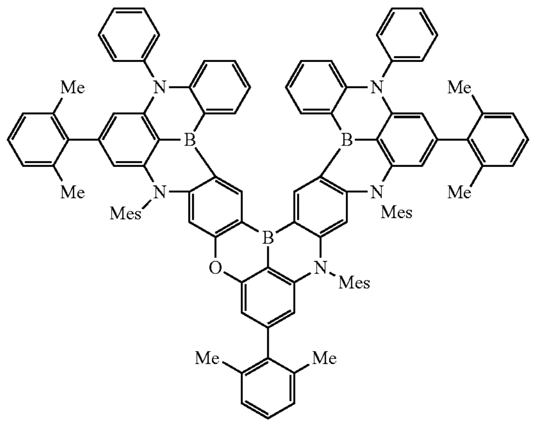
(1-6-43)
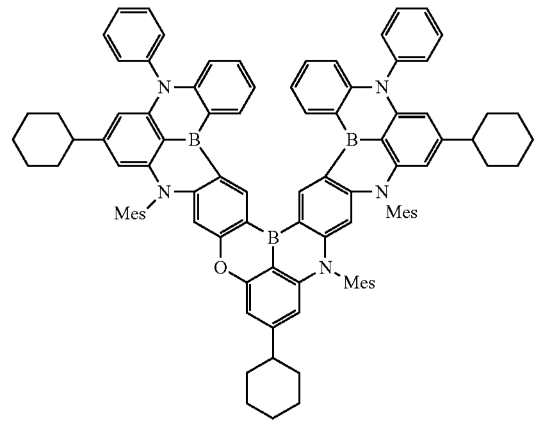
(1-6-44)
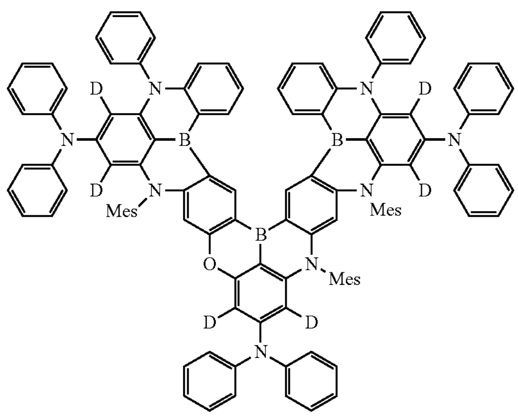
(1-6-45)
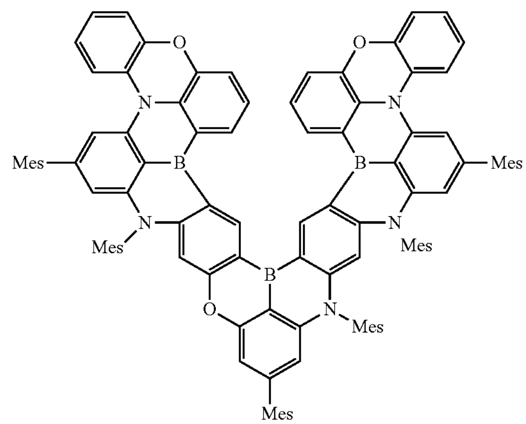
(1-6-46)
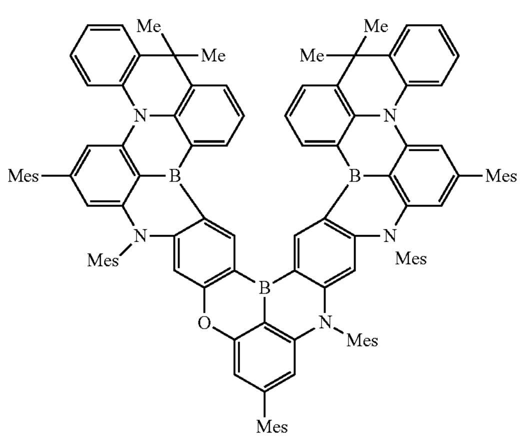
(1-6-47)
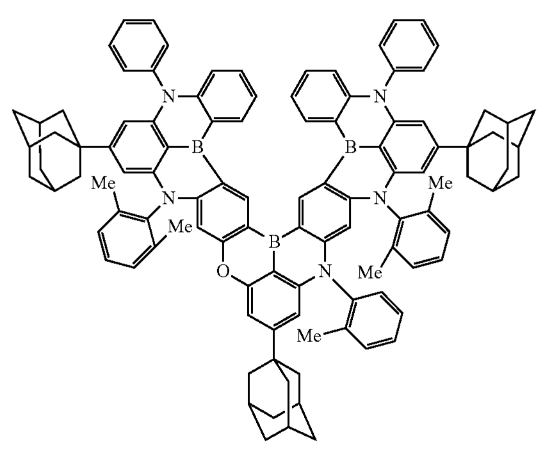

-continued
(1-6-48)
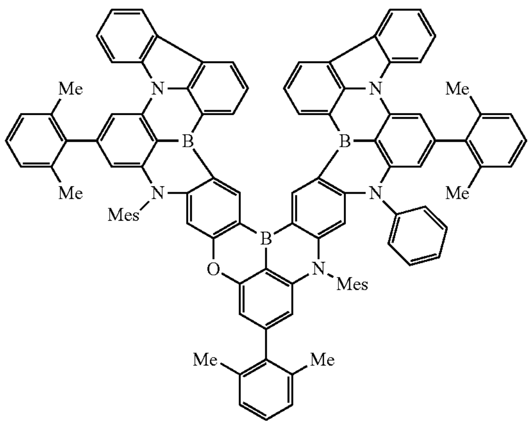
(1-6-49)
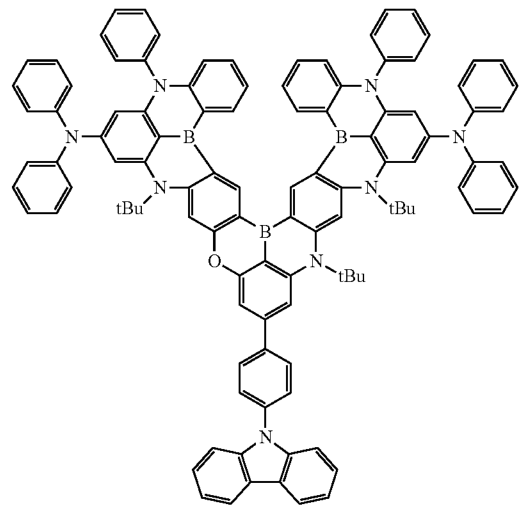
(1-6-50)
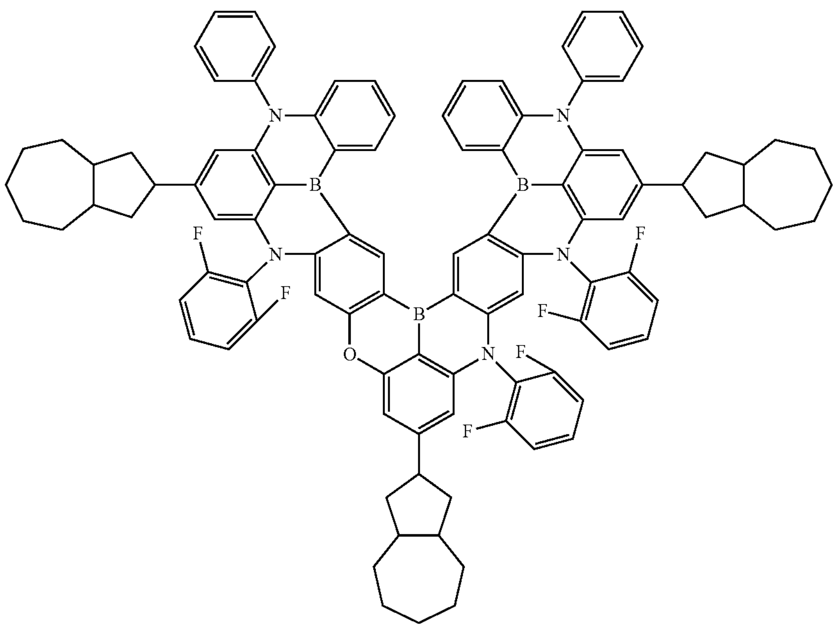
(1-6-101)
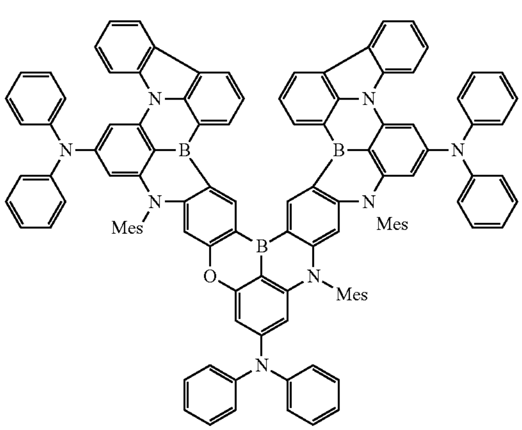
(1-6-102)
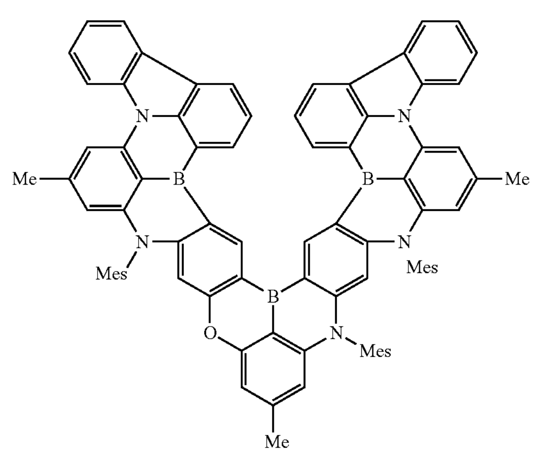

-continued
(1-6-103)
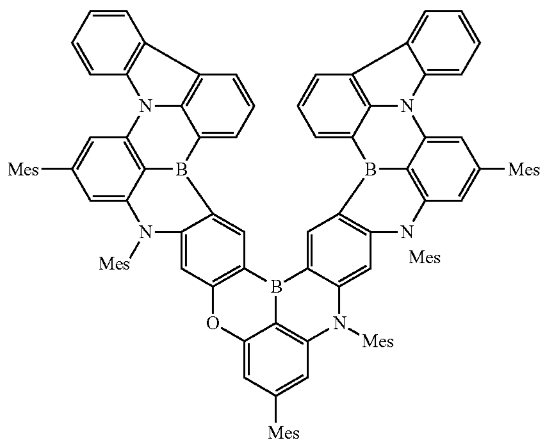
(1-6-104)
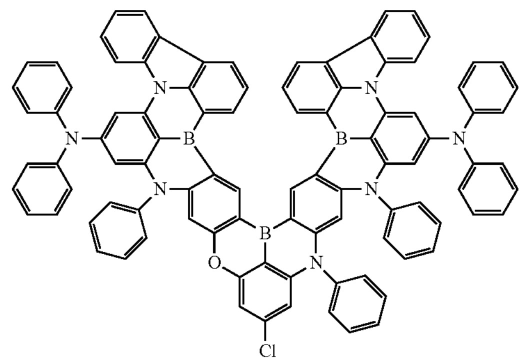
(1-6-105)
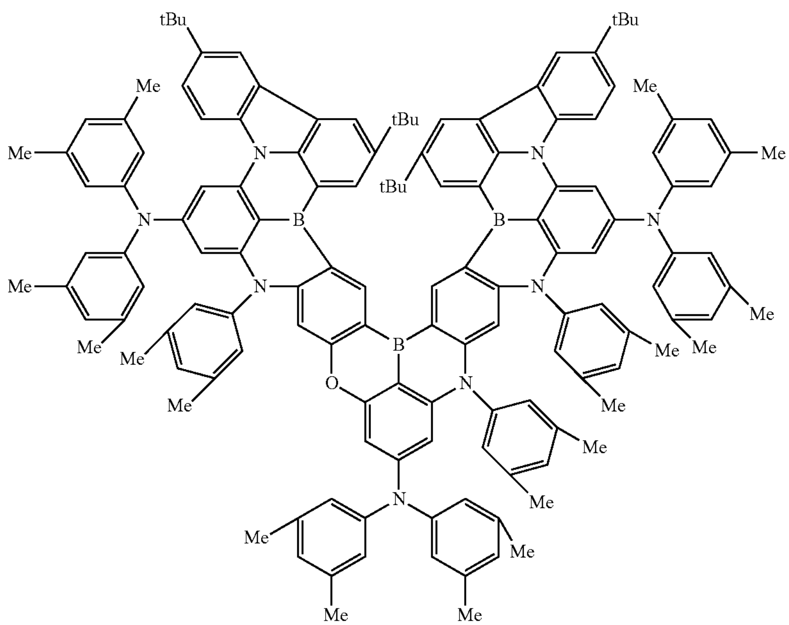
(1-6-106)
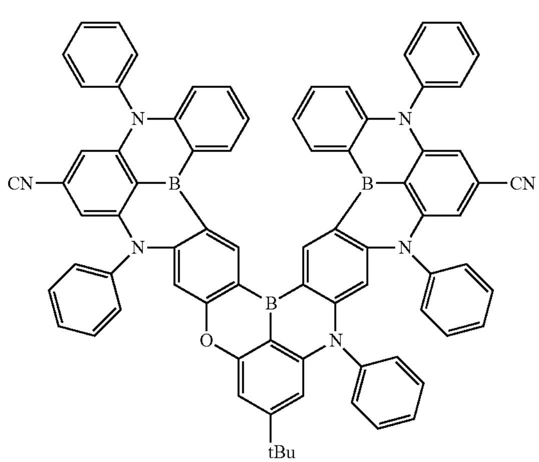
(1-6-107)
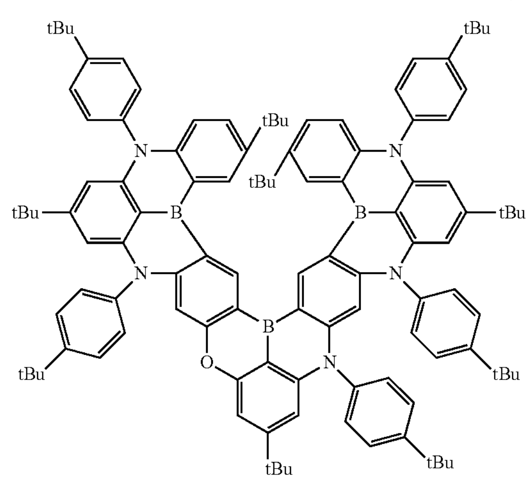

-continued
(1-6-108)
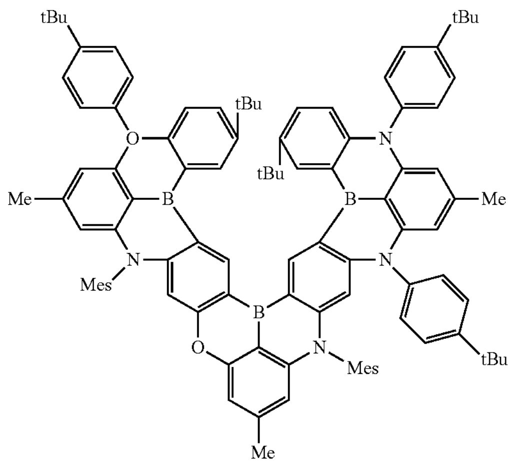
(1-6-109)
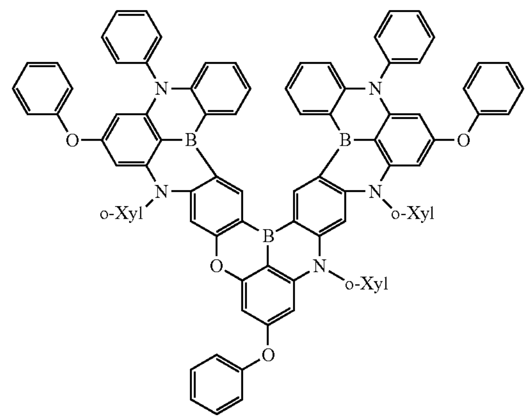
(1-6-110)
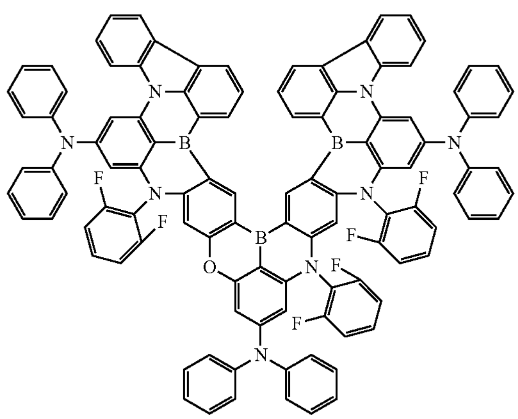
(1-6-121)
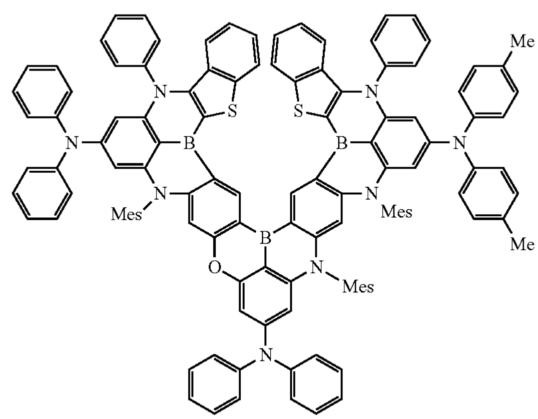
(1-6-122)
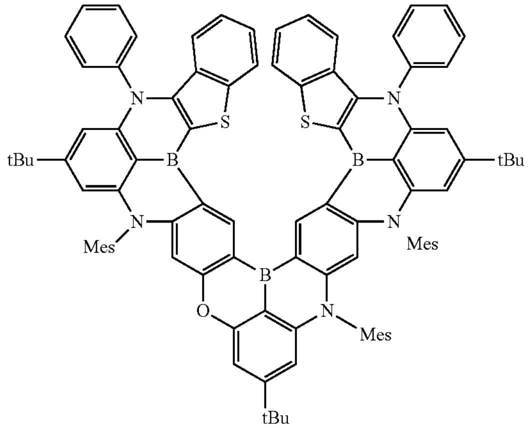
(1-6-123)
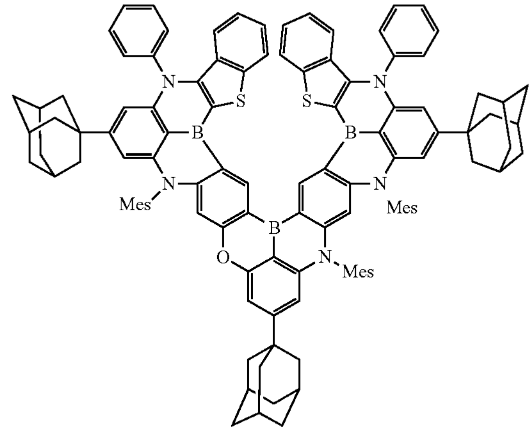

-continued
(1-6-124)
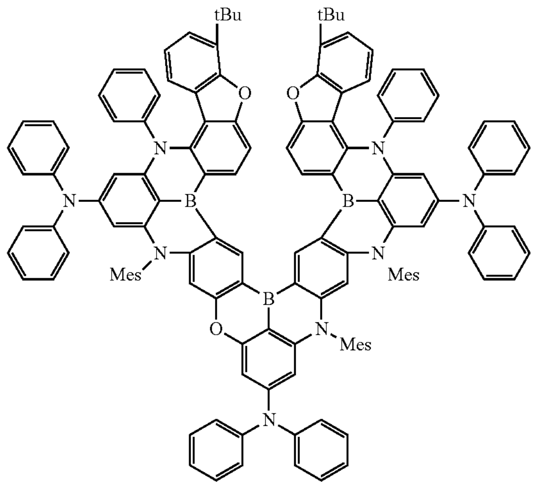
(1-6-125)
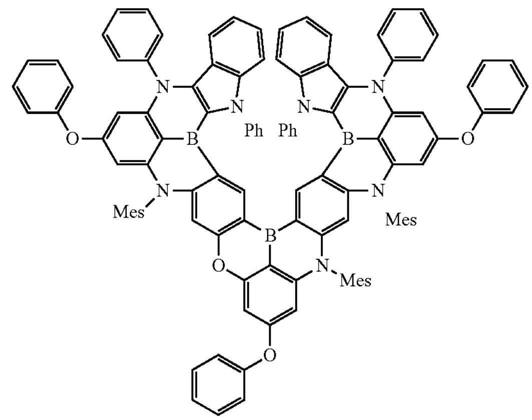
(1-6-126)
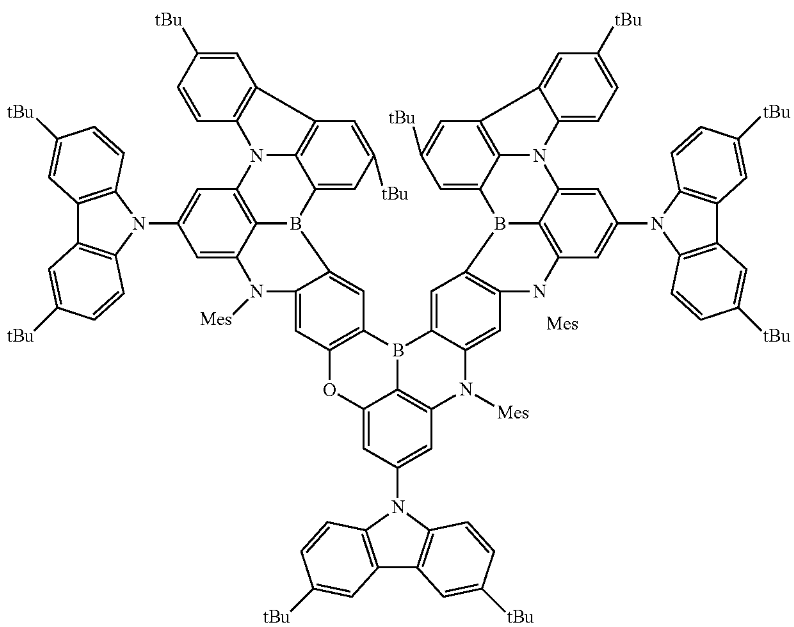
(1-6-127)
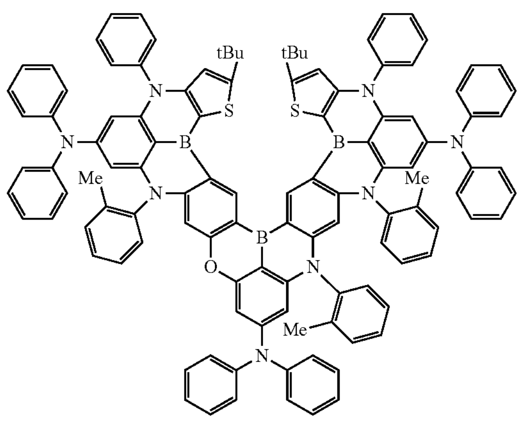
(1-6-128)
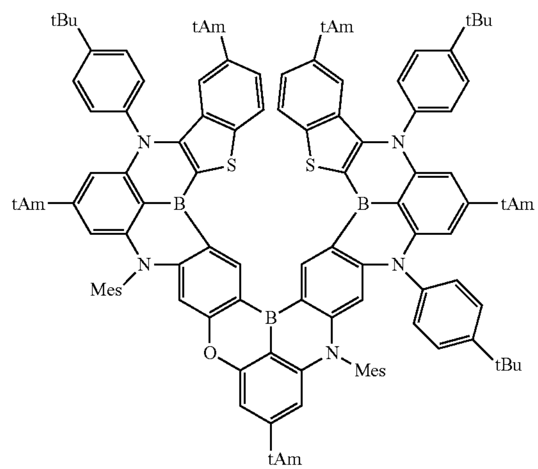

-continued
(1-6-129)
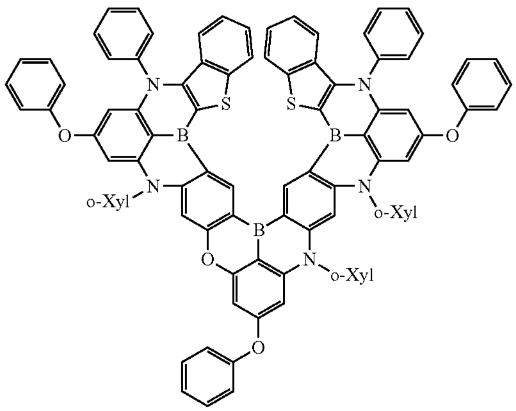
(1-6-130)
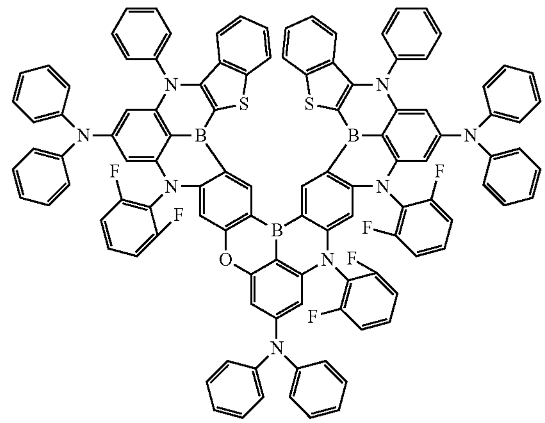
(1-6-141)
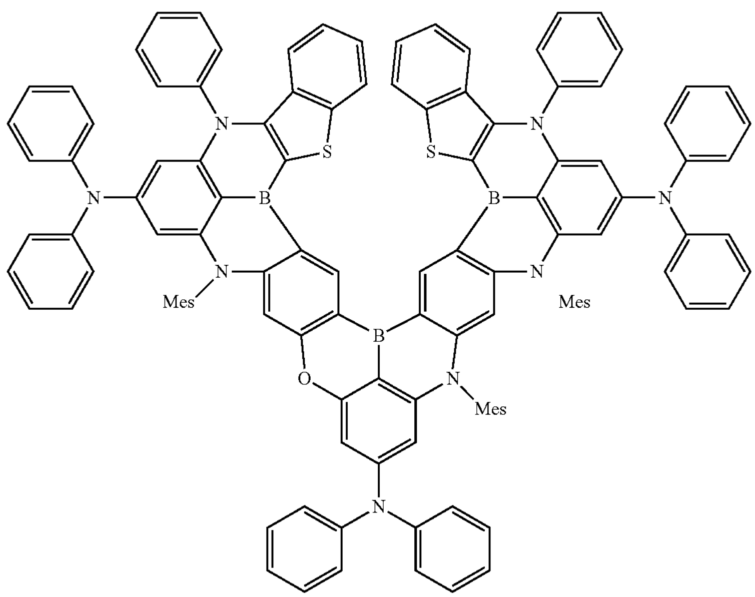
(1-6-142)
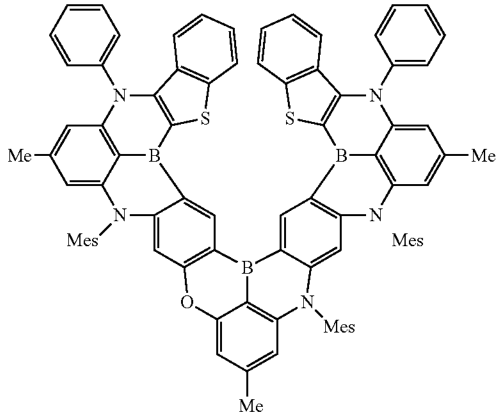
(1-6-143)
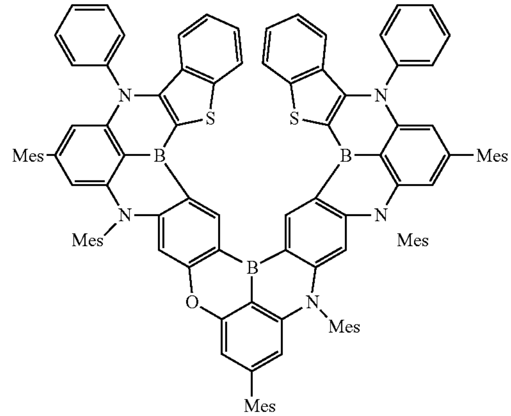

-continued
(1-6-144)
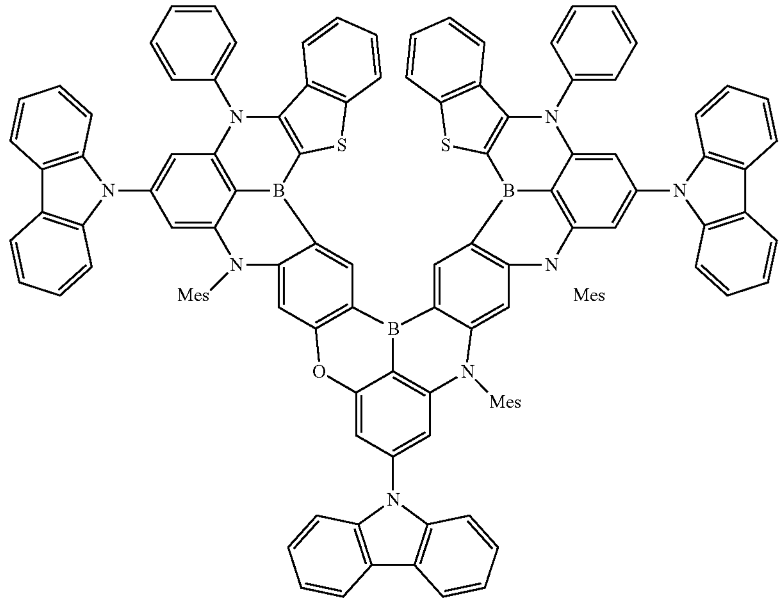
(1-6-145)
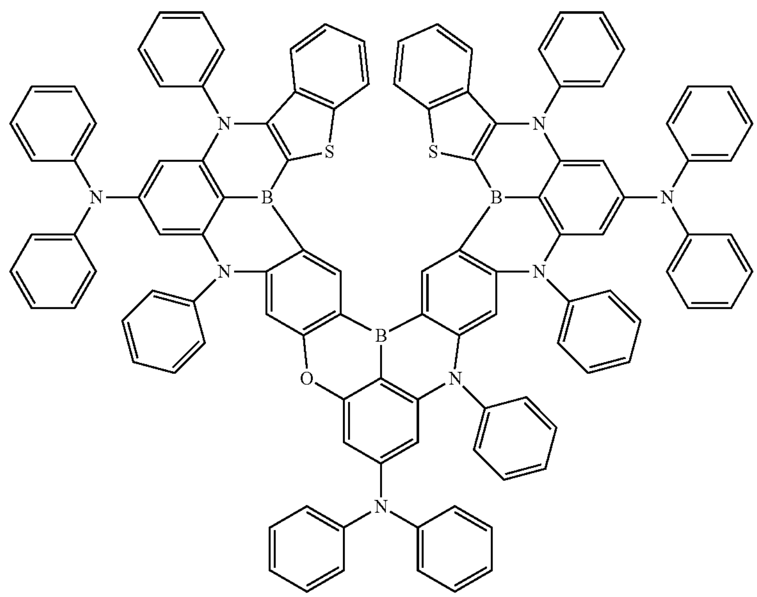
(1-6-146)
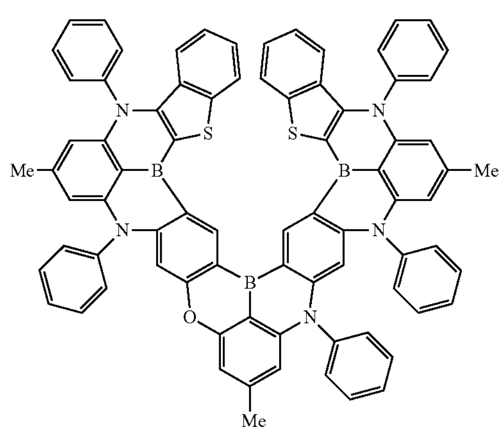
(1-6-147)
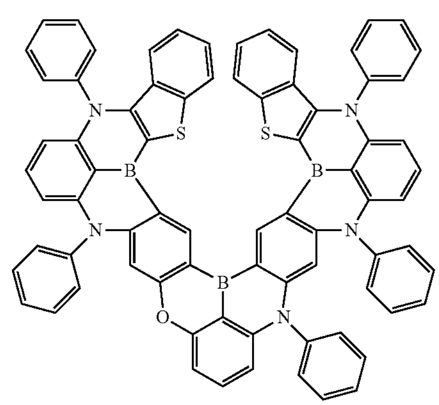

-continued
(1-6-148)
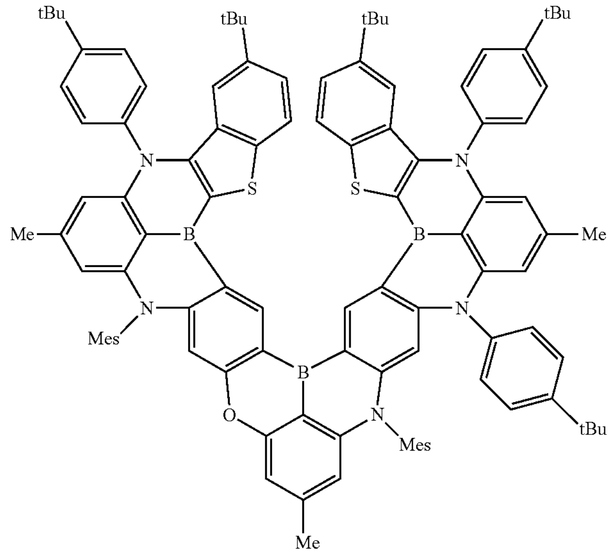
(1-6-149)
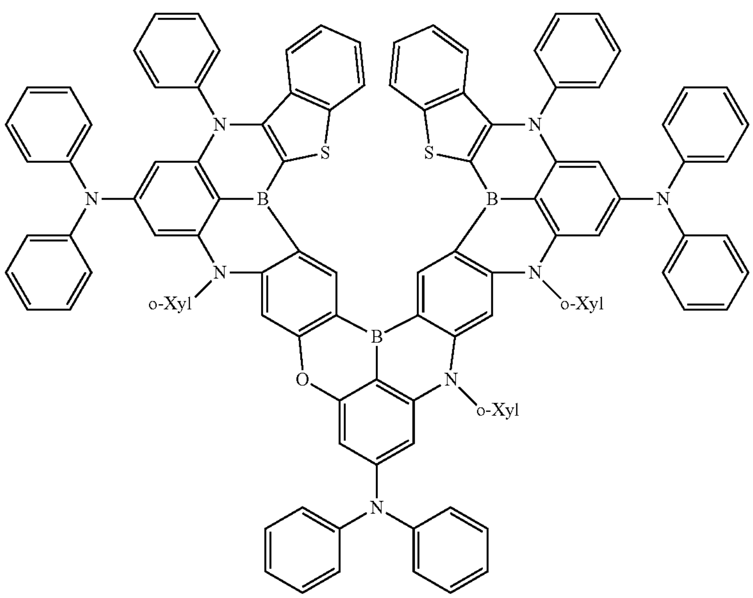

-continued
(1-6-150)
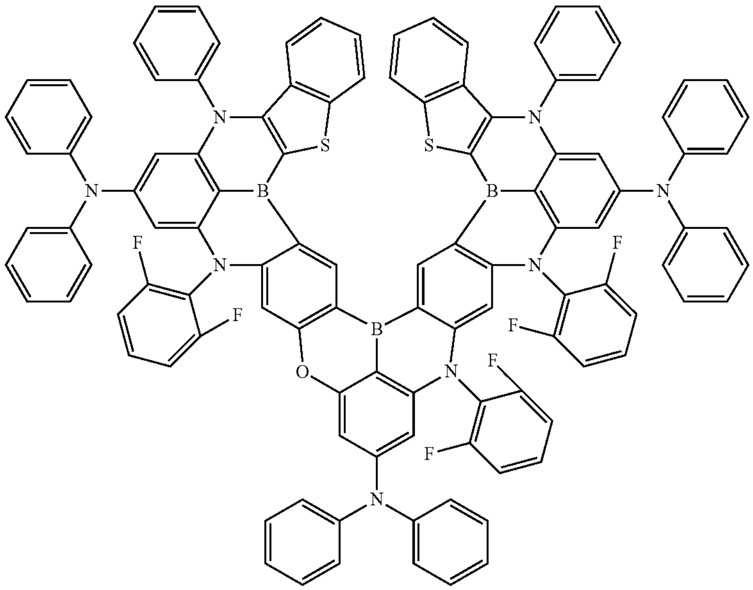
(1-6-161)
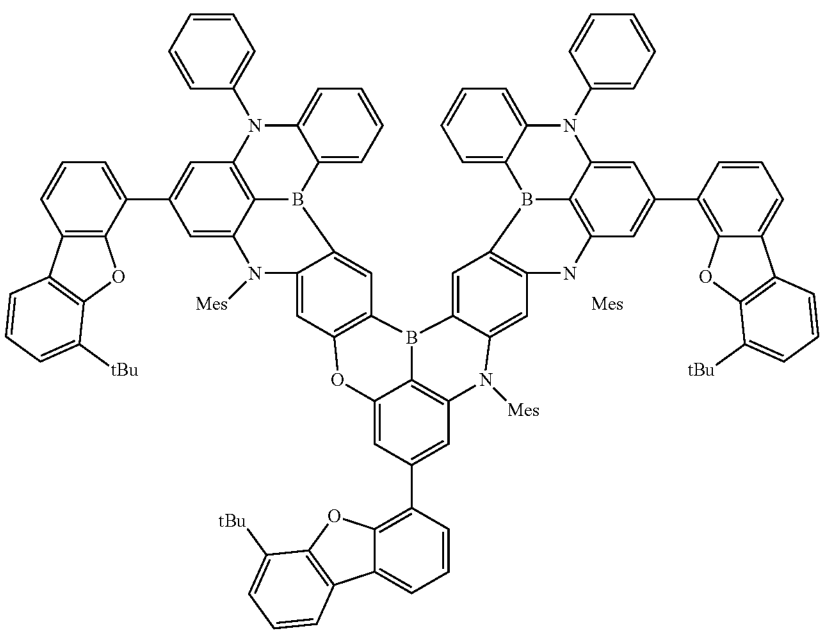

-continued
(1-6-162)
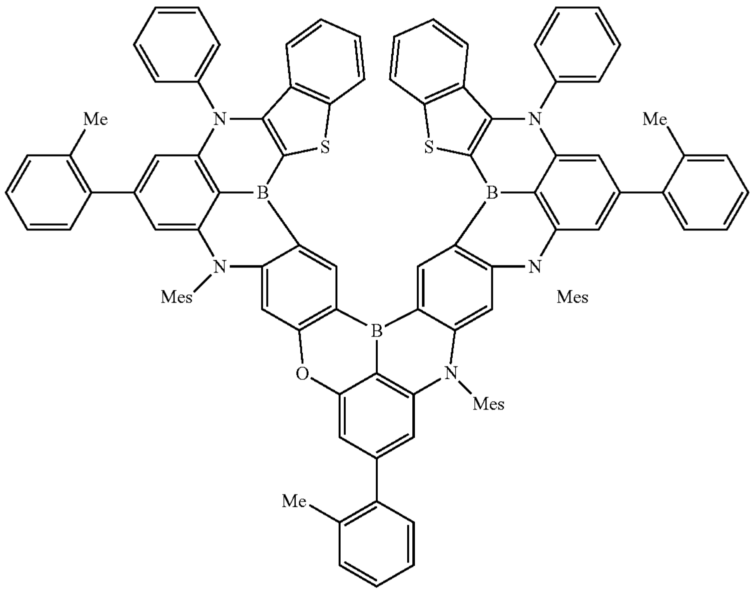
(1-6-163)
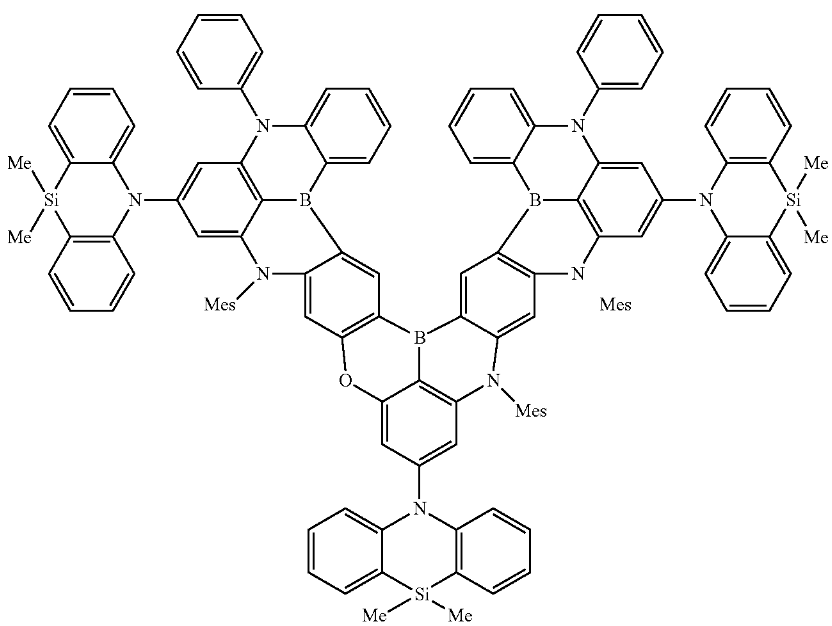

-continued
(1-6-164)
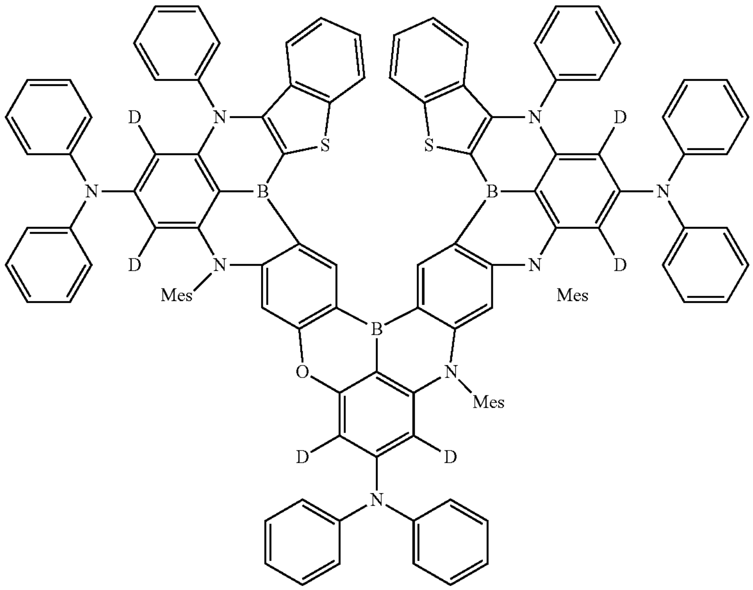
(1-6-165)
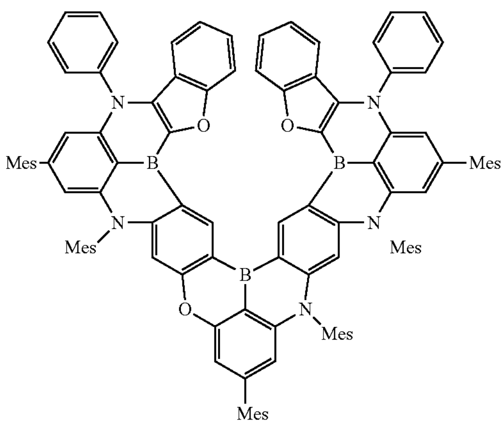
(1-6-166)
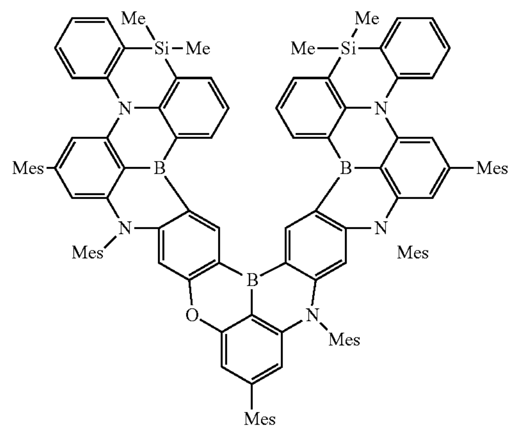
(1-6-167)
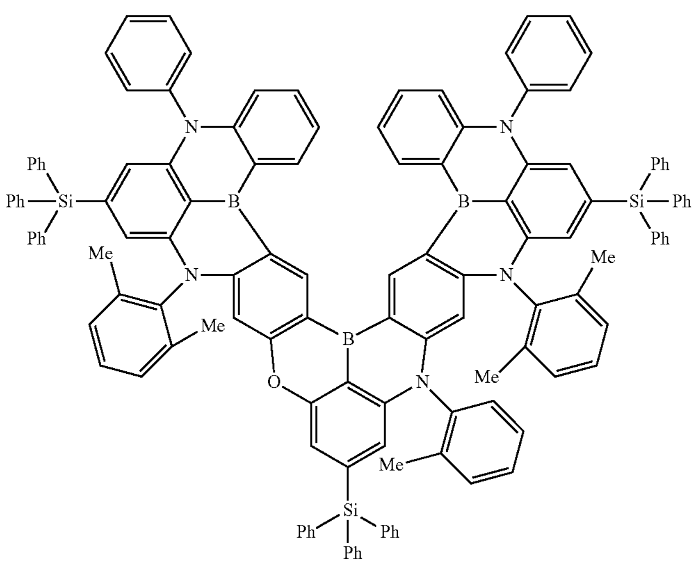

-continued
(1-6-168)
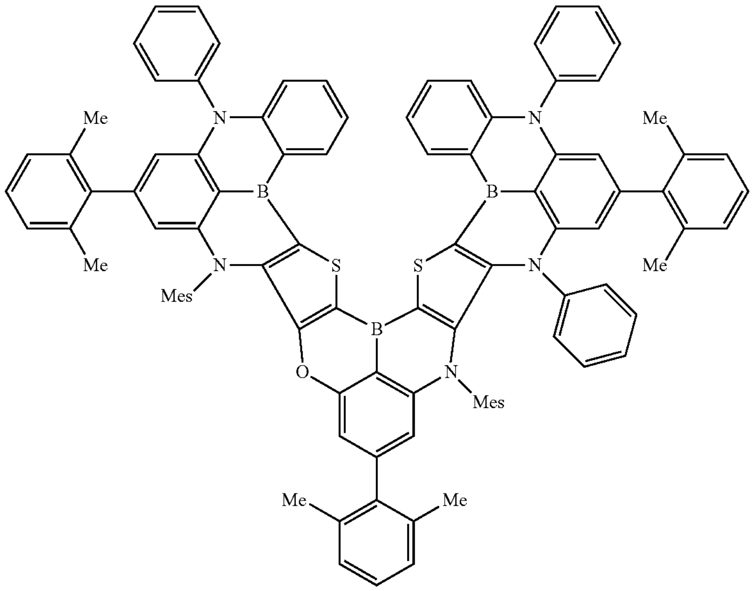
(1-6-169)
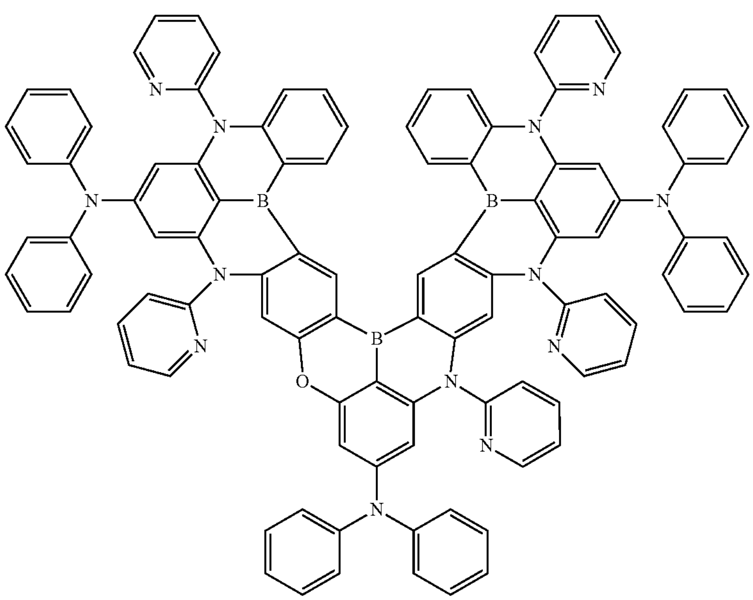

-continued
(1-6-170)
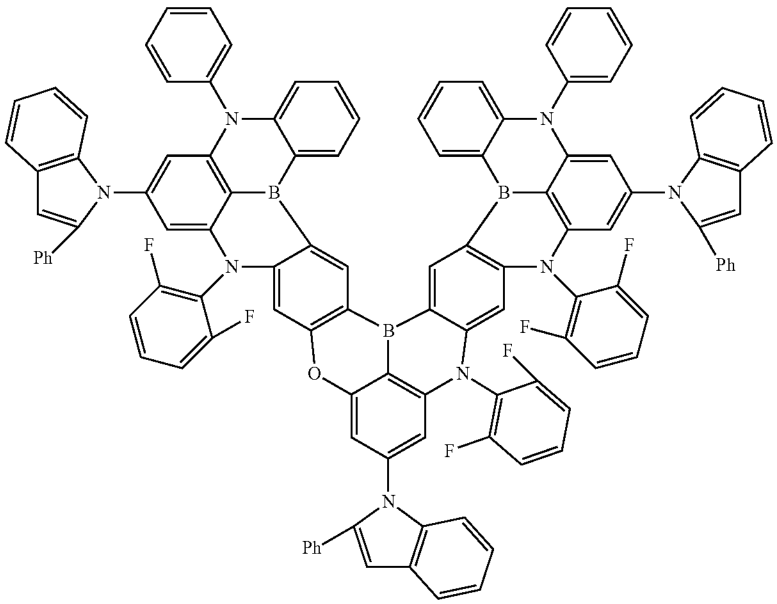
(1-6-191)
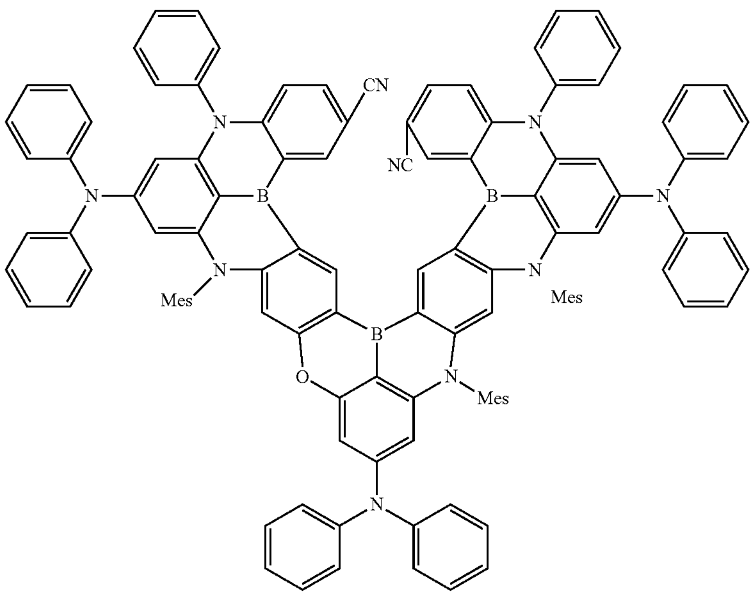
(1-6-192)
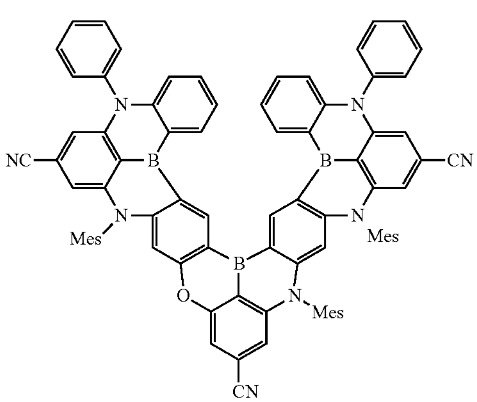
(1-6-193)
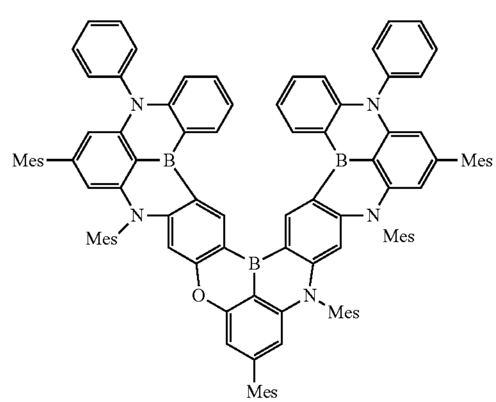

-continued
(1-6-194)
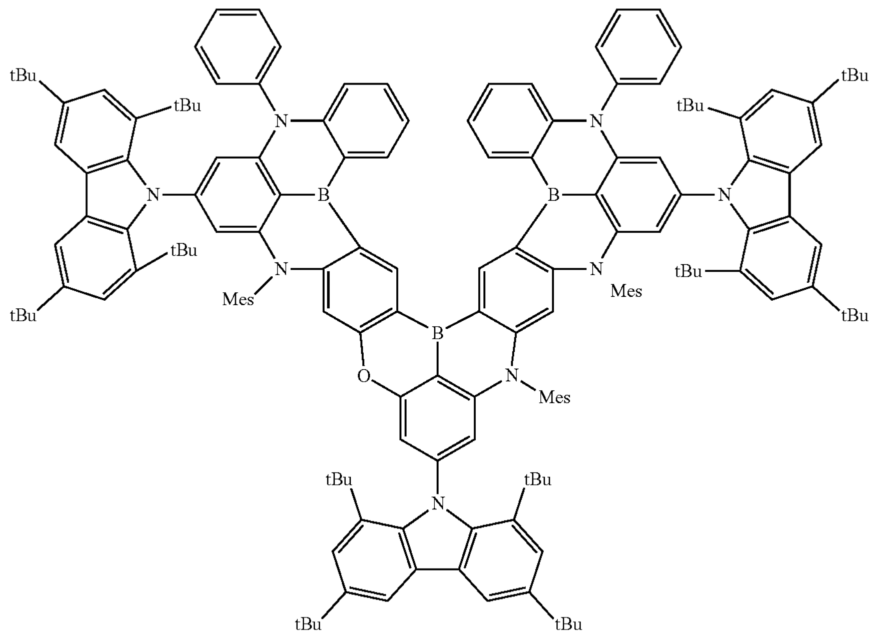
(1-6-195)
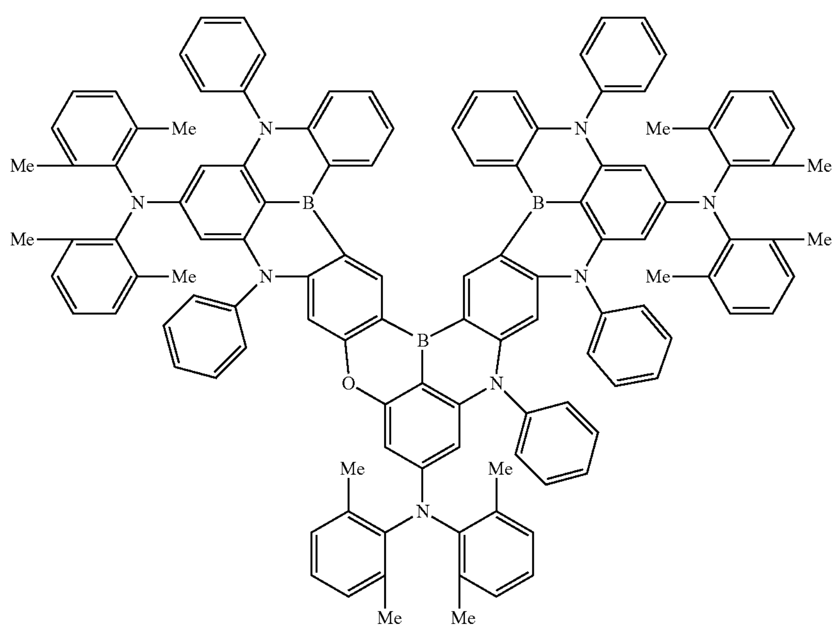

-continued
(1-6-196)
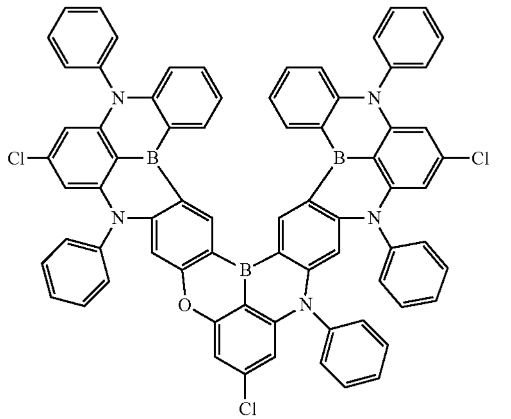
(1-6-197)
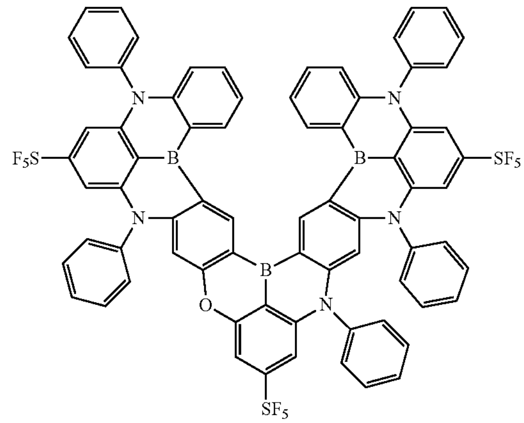
(1-6-198)
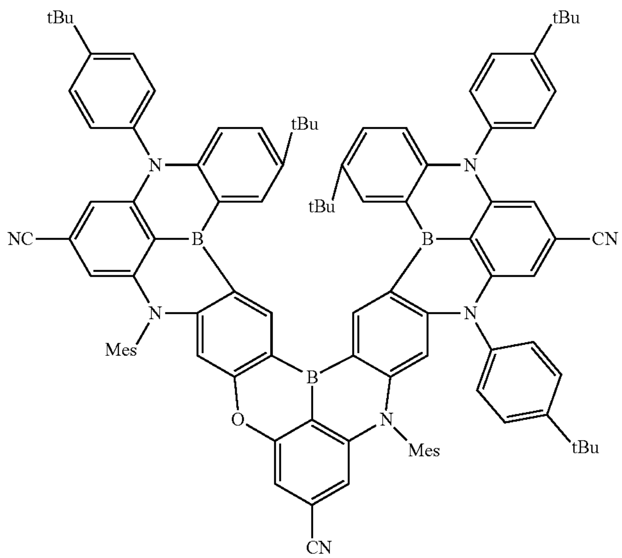
(1-6-199)
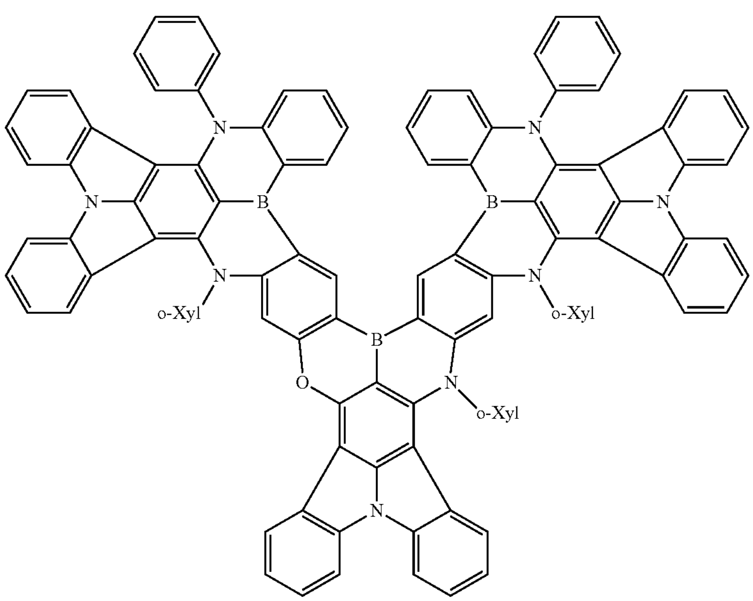

-continued
(1-6-200)
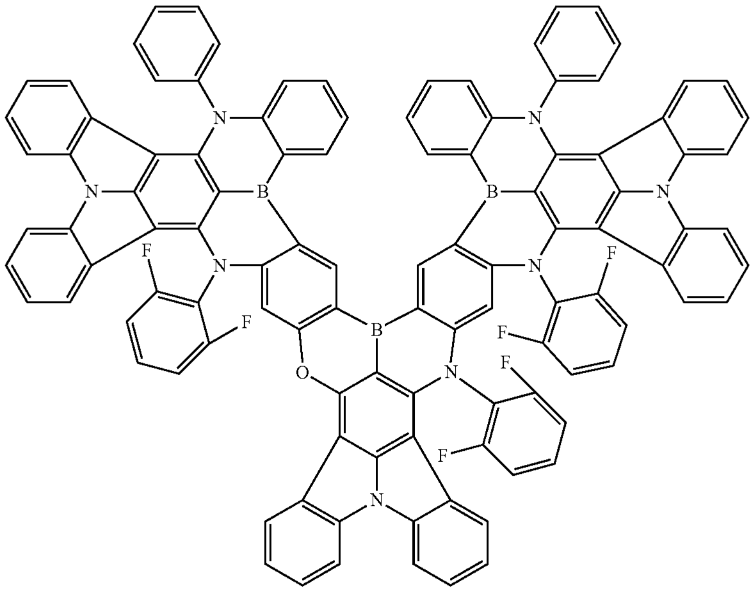
(1-6-221)
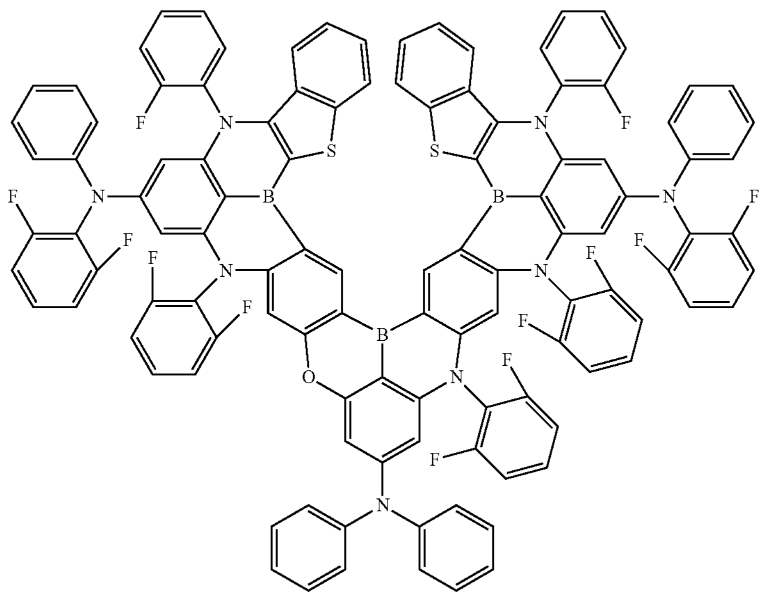
(1-6-222)
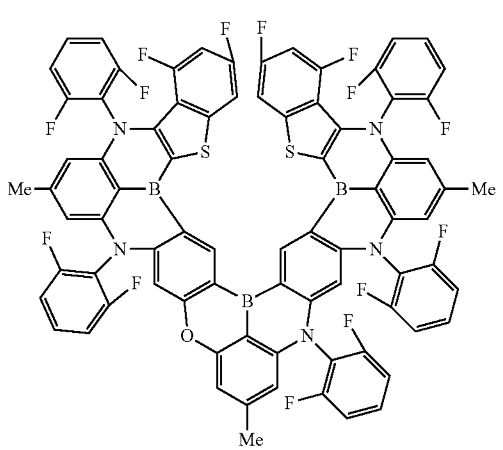
(1-6-223)
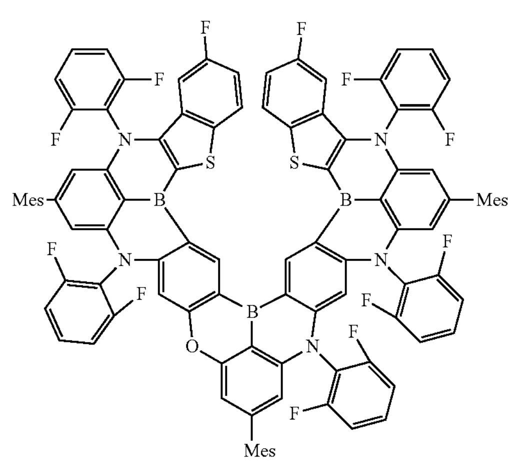

-continued
(1-6-224)
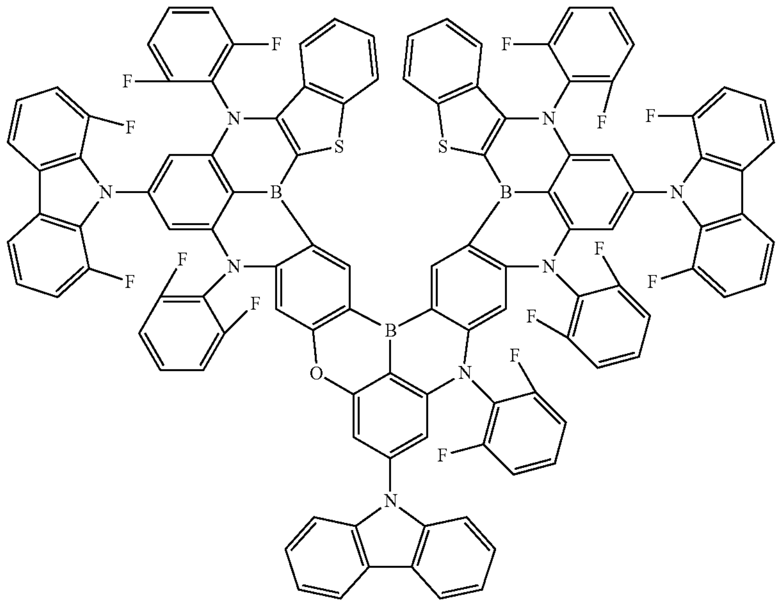
(1-6-225)
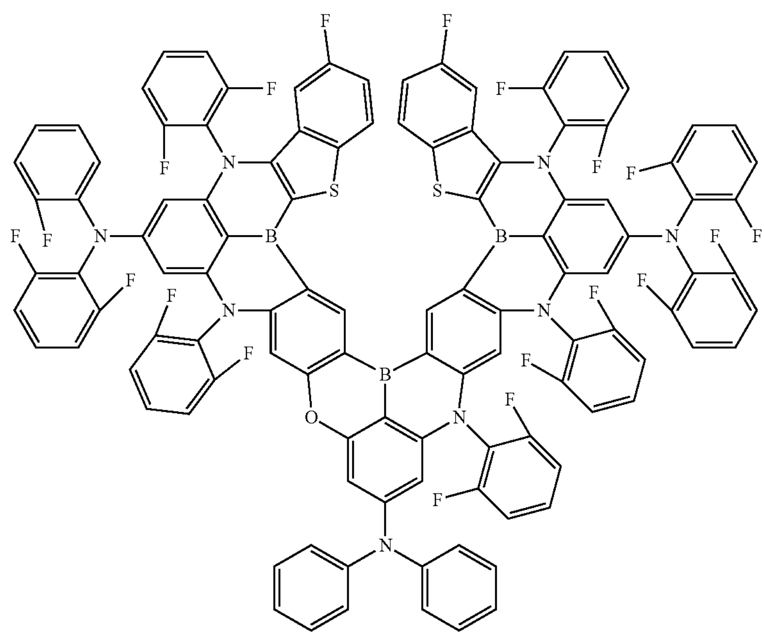

-continued
(1-6-226)
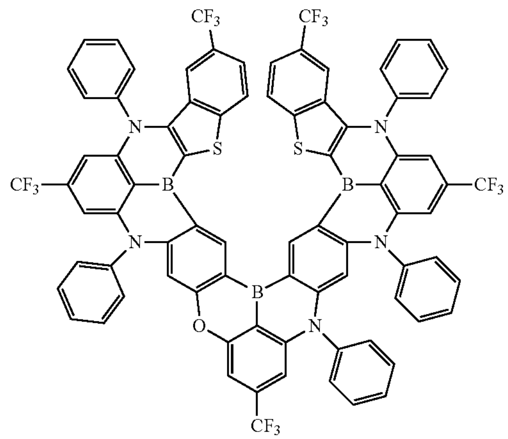
(1-6-227)
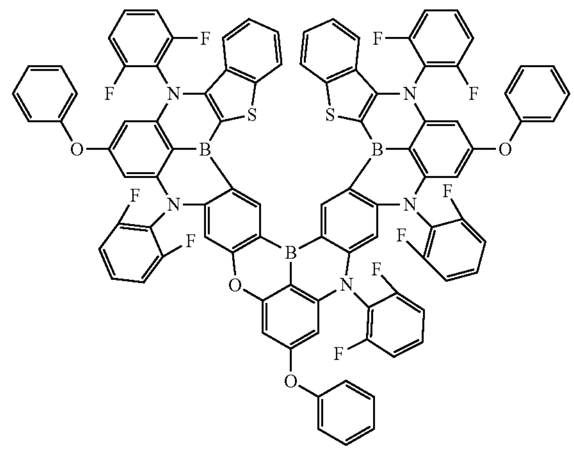
(1-6-228)
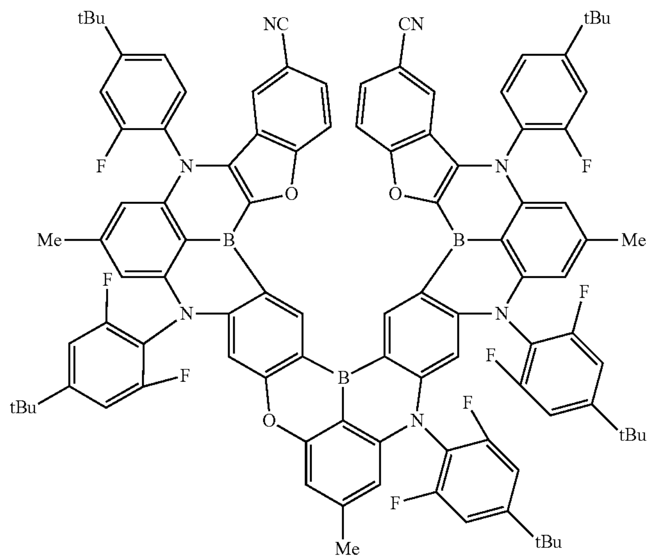
(1-6-229)
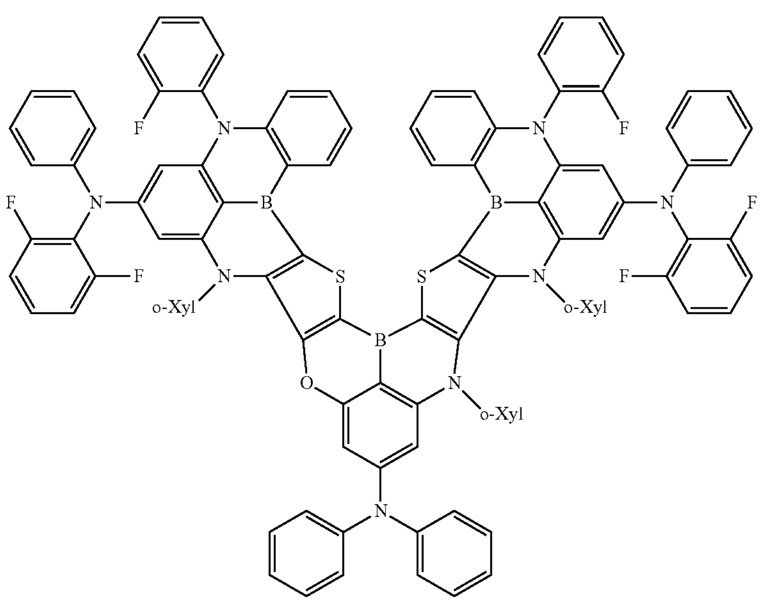

-continued
(1-6-230)
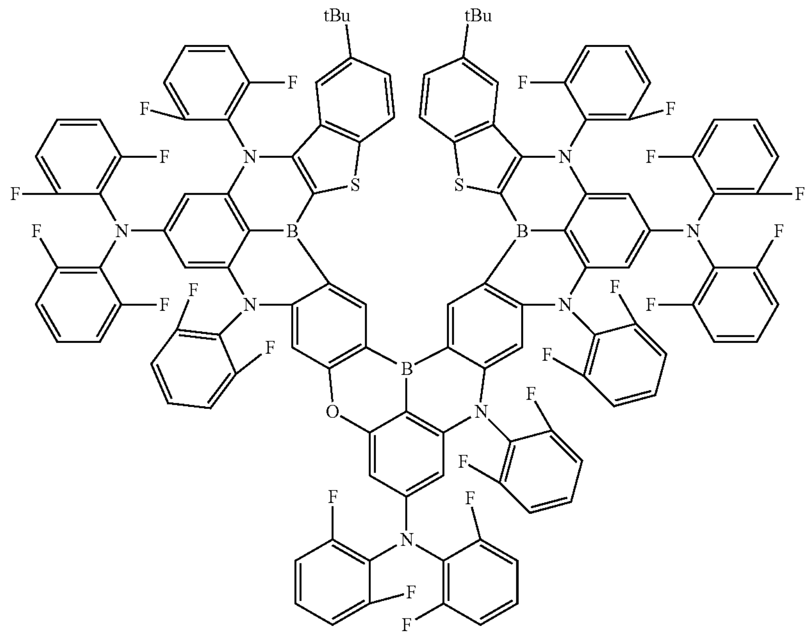
(1-7-1)
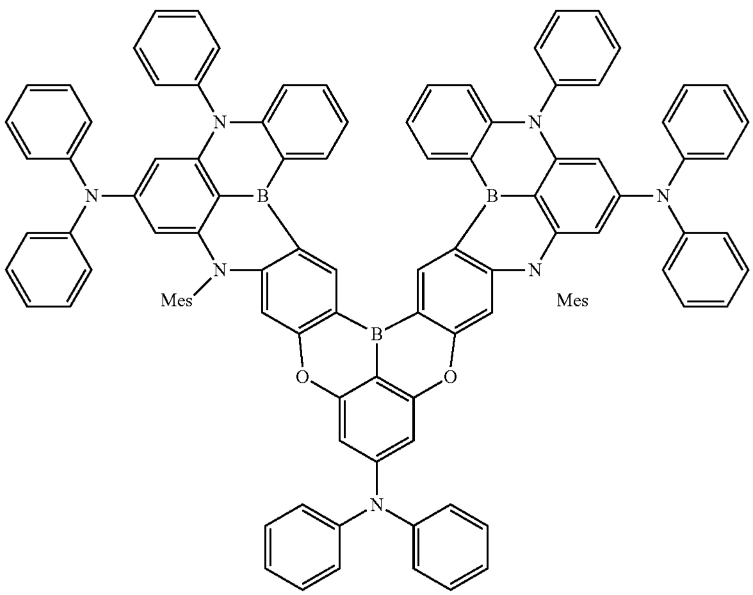
(1-7-2)
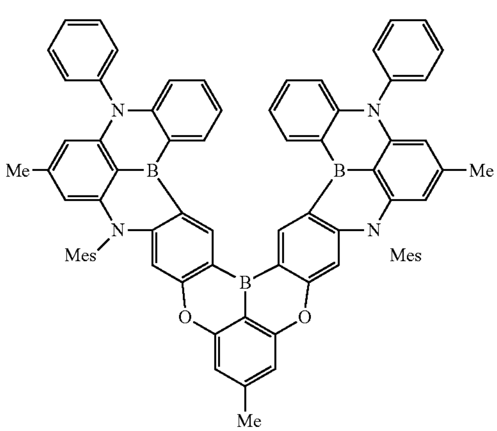
(1-7-3)
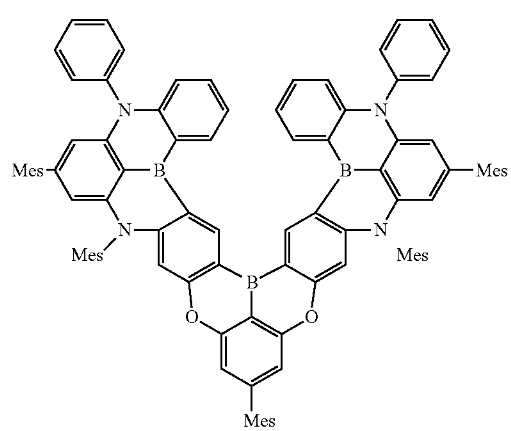

-continued
(1-7-4)
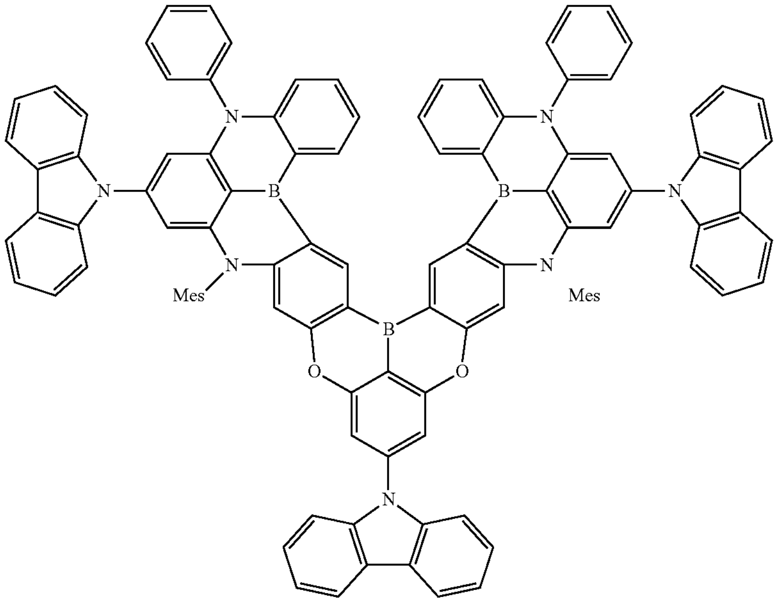
(1-7-5)
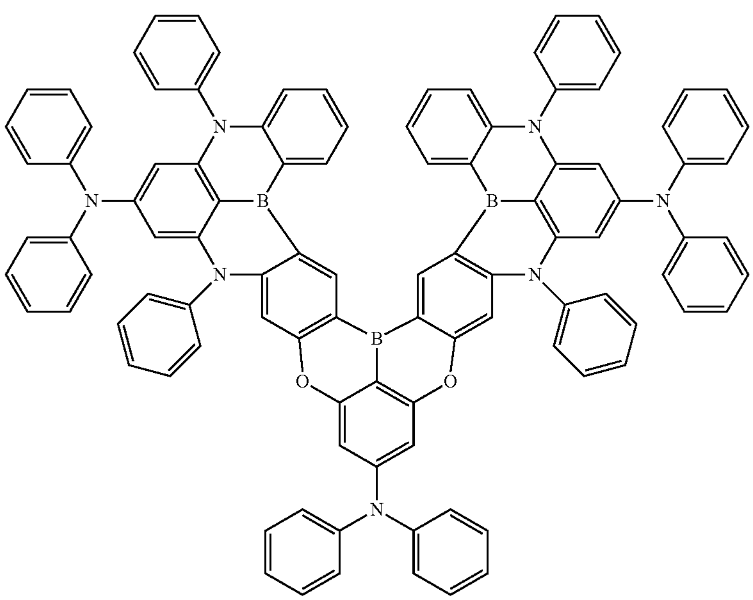

-continued
(1-7-6)
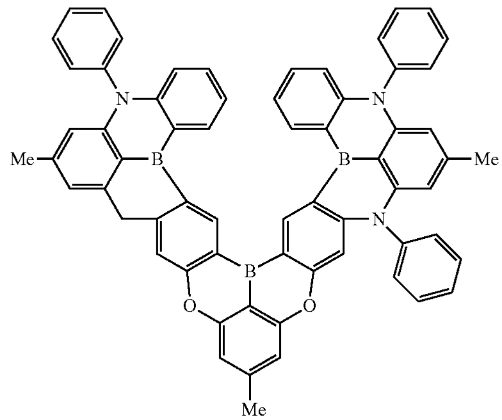
(1-7-7)
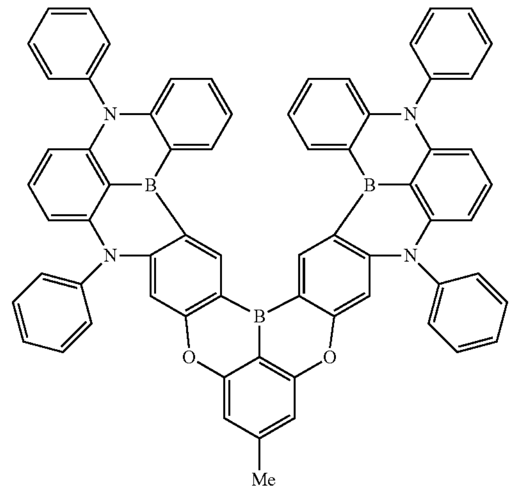
(1-7-8)
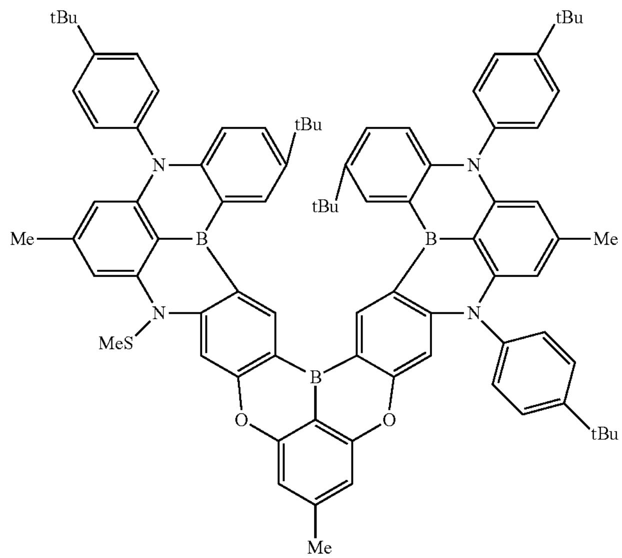
(1-7-9)
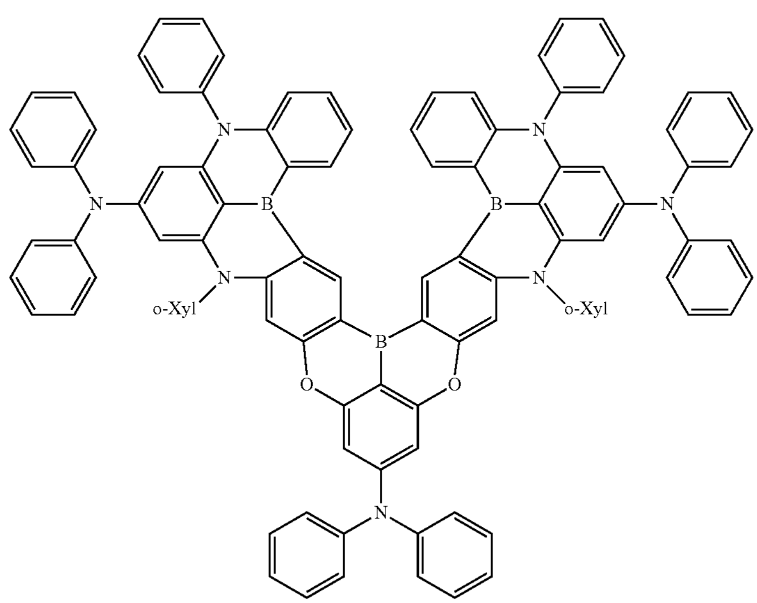

-continued
(1-7-10)
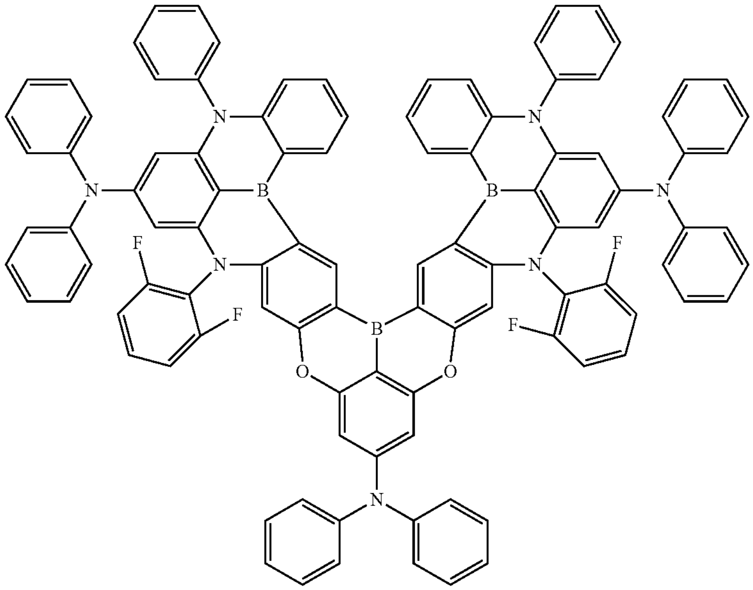
(1-7-21)
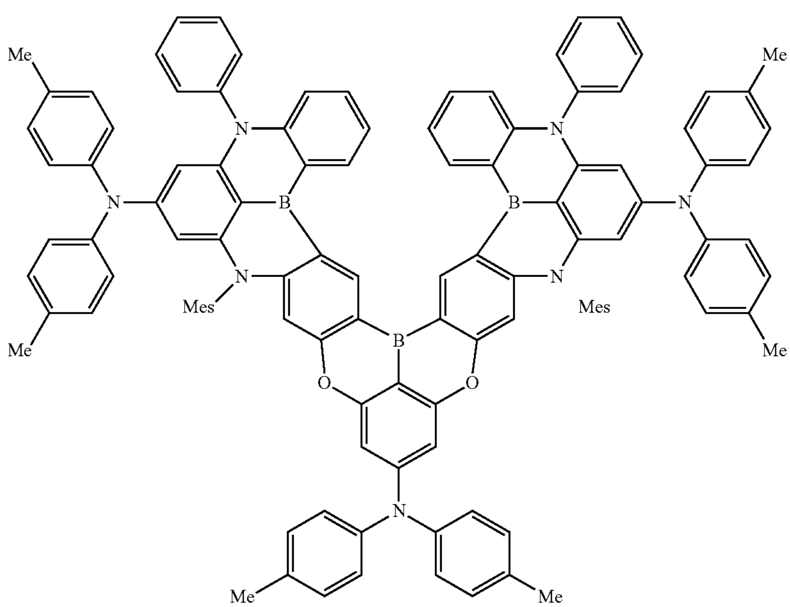

-continued
(1-7-22)
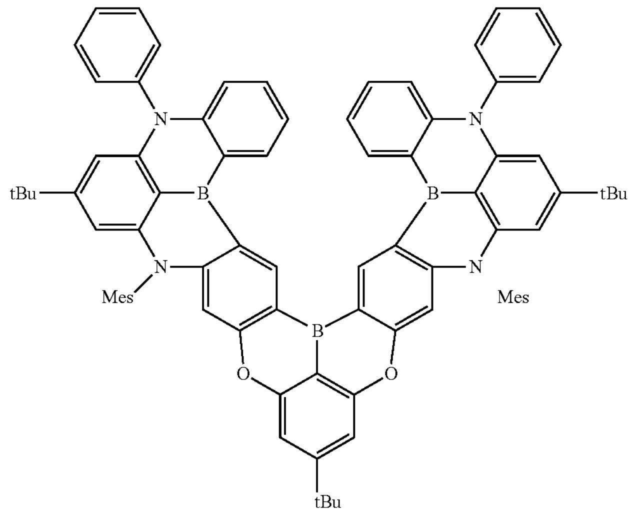
(1-7-23)
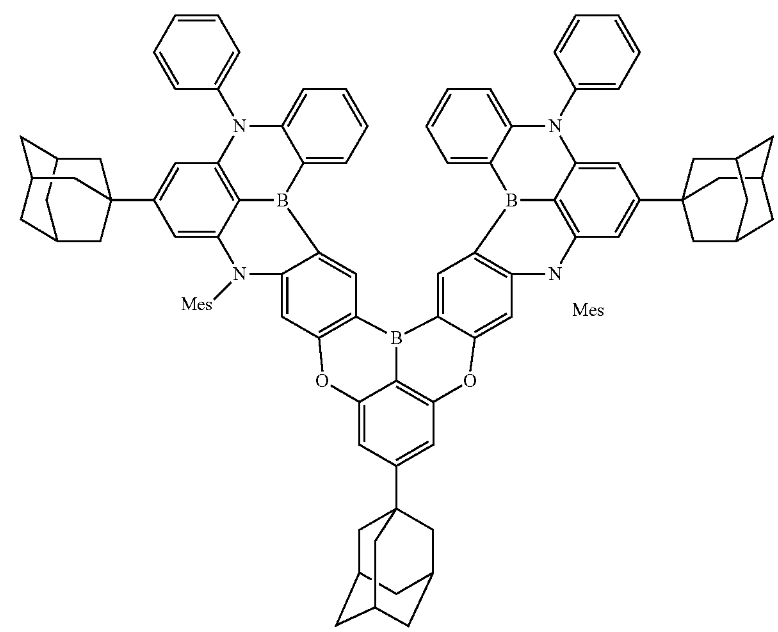

-continued
(1-7-24)
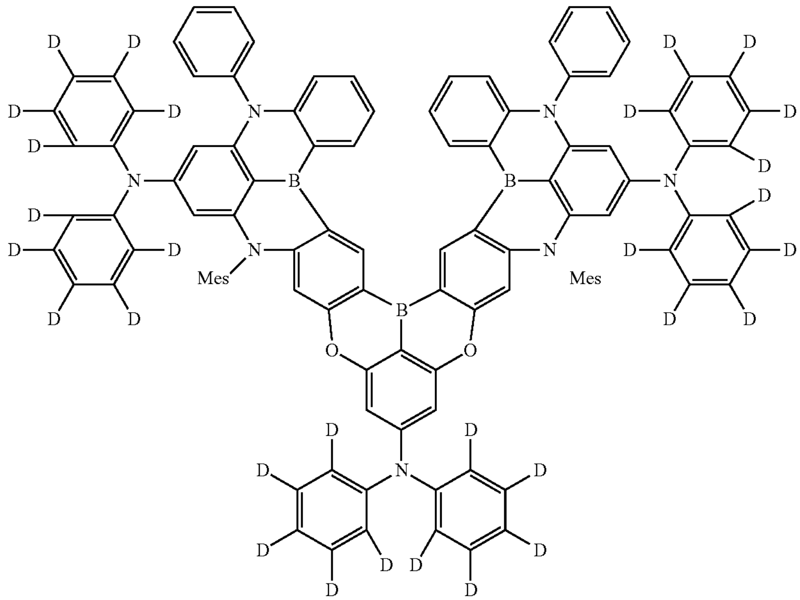
(1-7-25)
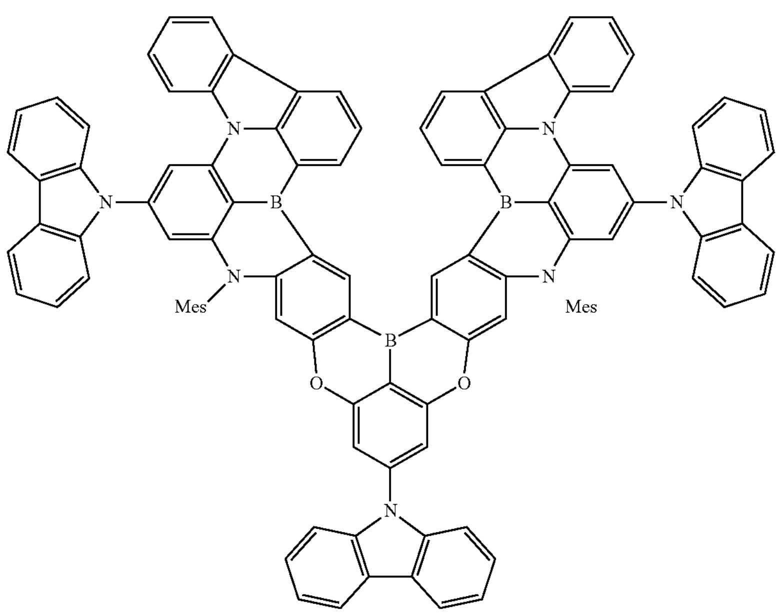

-continued
(1-7-26)
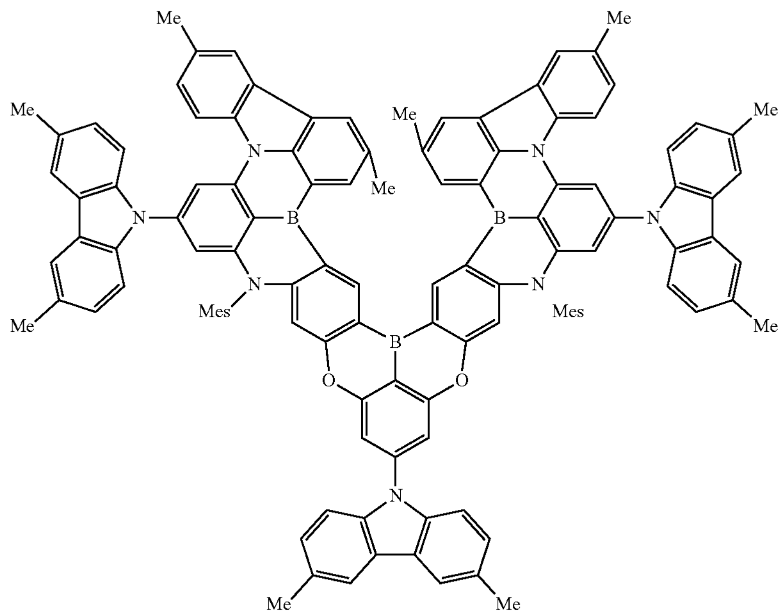
(1-7-27)
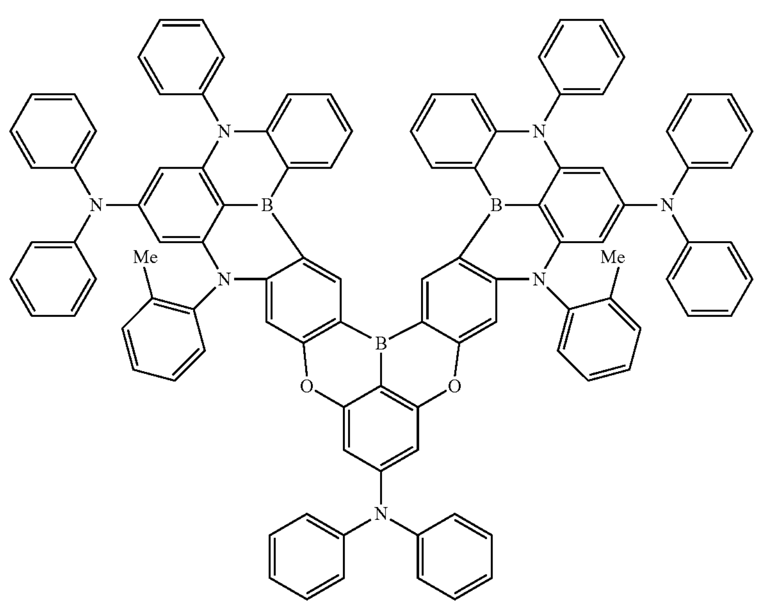

-continued
(1-7-28)
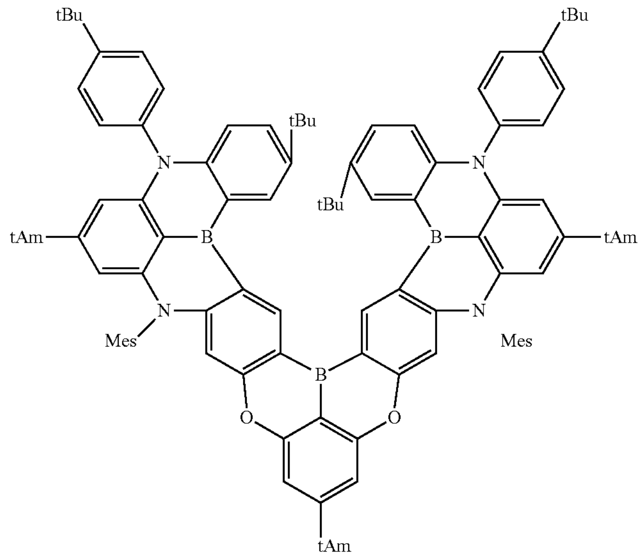
(1-7-29)
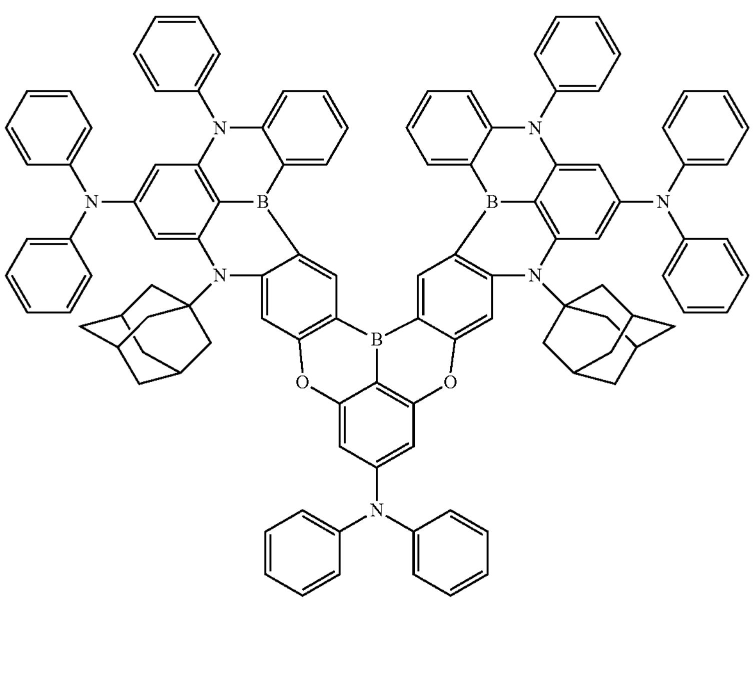

-continued
(1-7-30)
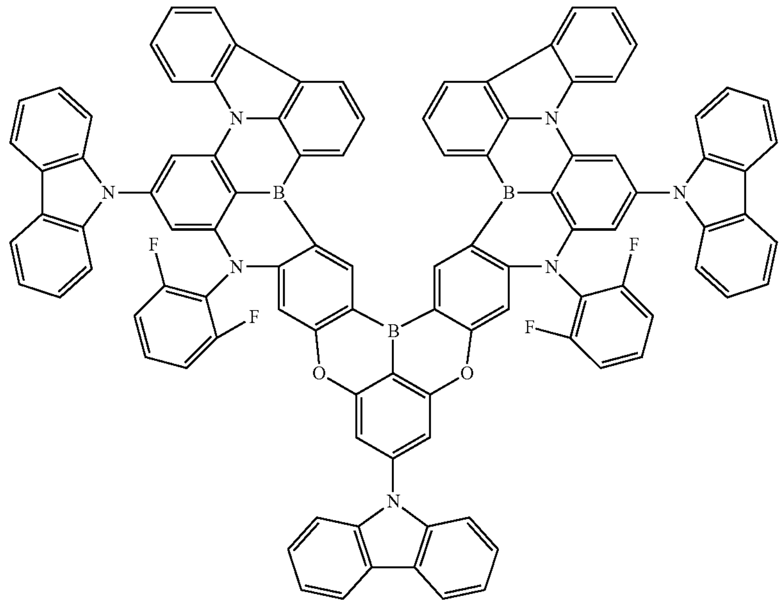
(1-7-41)
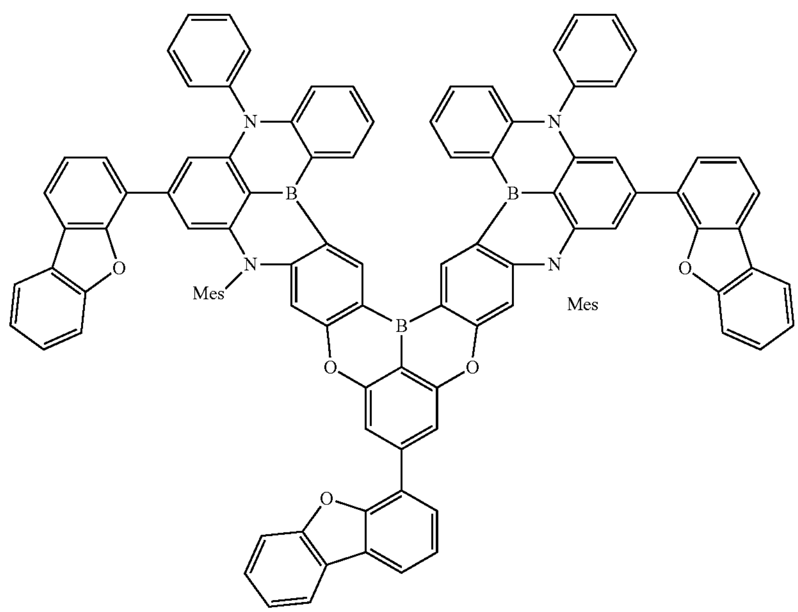

-continued
(1-7-42)
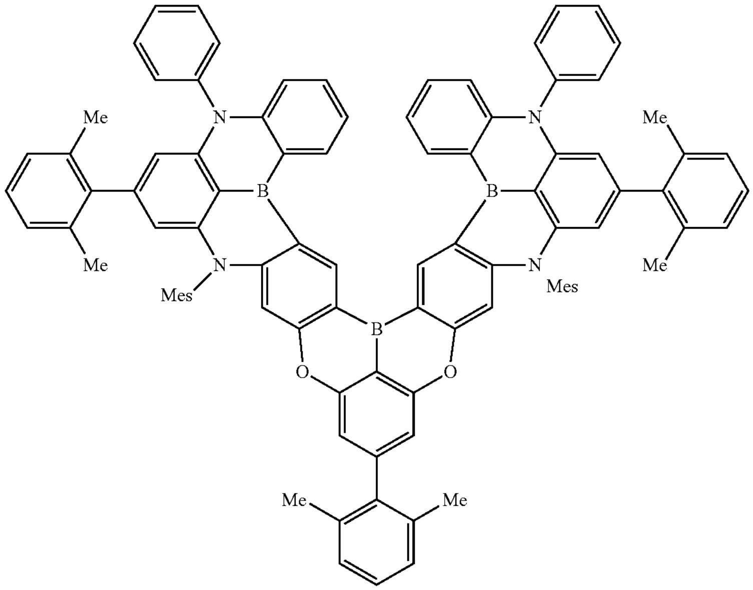
(1-7-43)
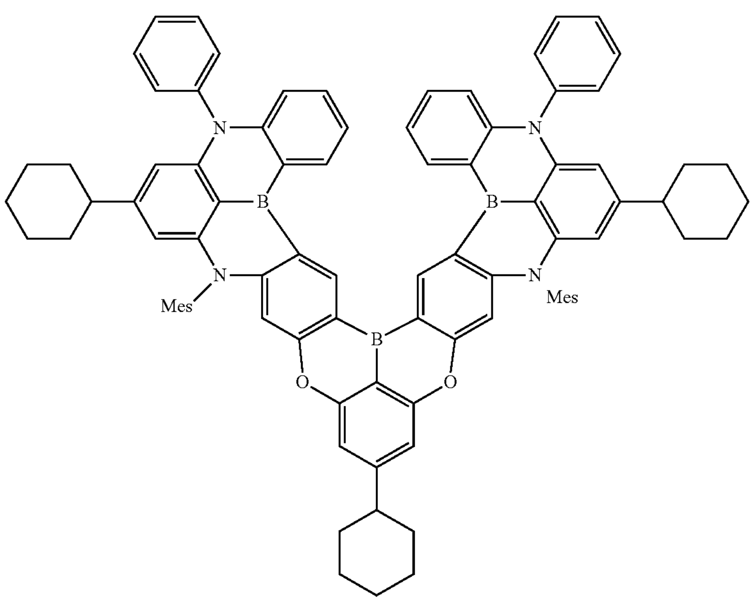

-continued
(1-7-44)
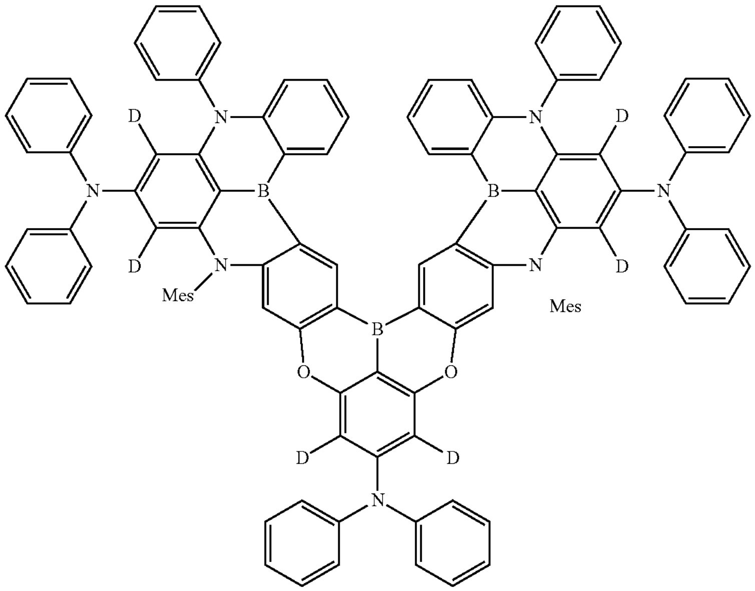
(1-7-45)
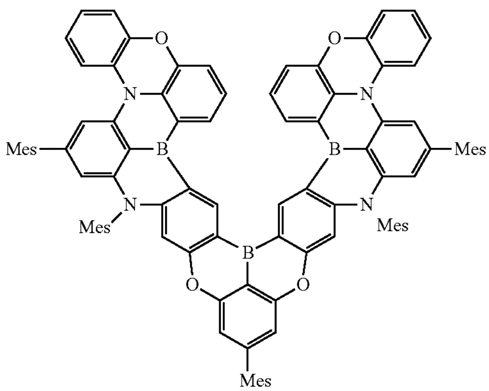
(1-7-46)
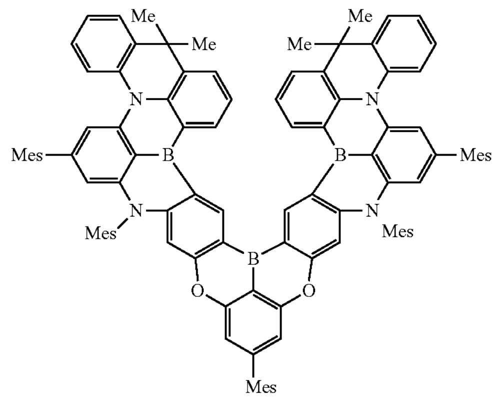
(1-7-47)
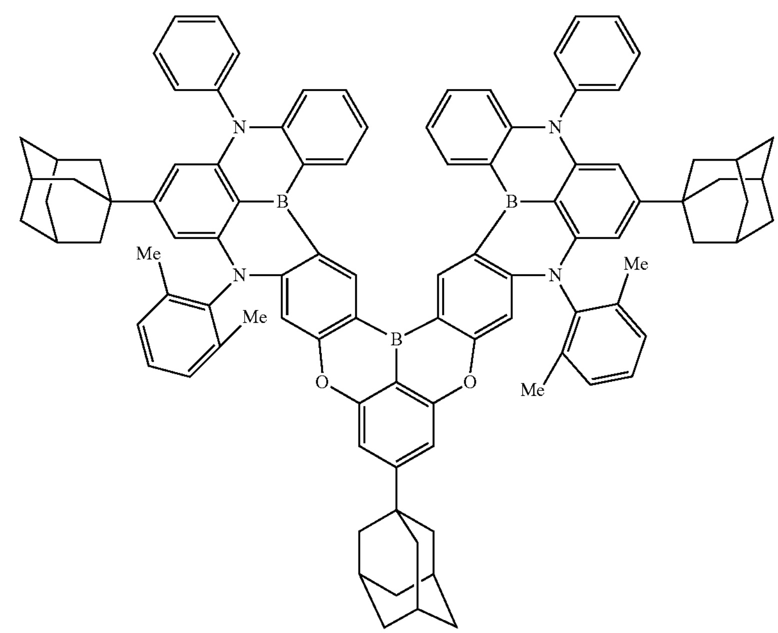

-continued
(1-7-48)
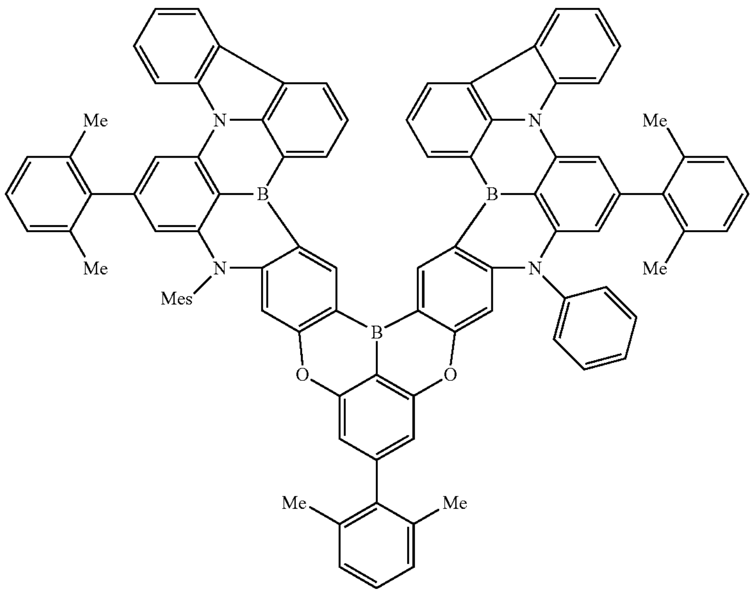
(1-7-49)
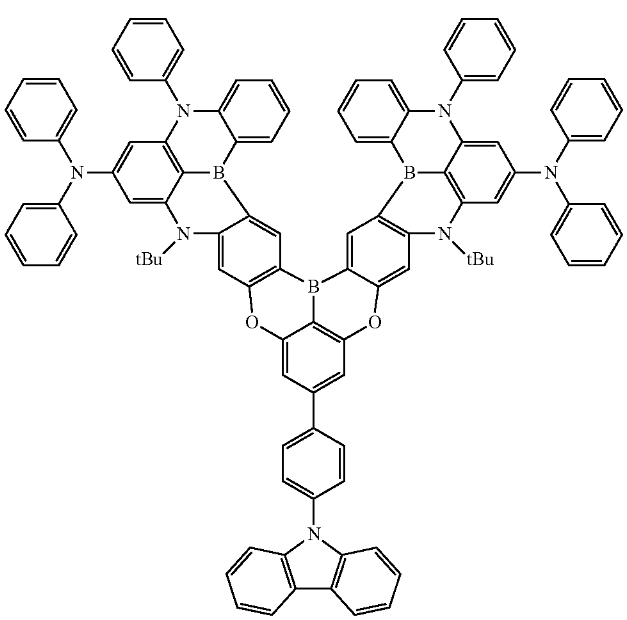

-continued
(1-7-50)
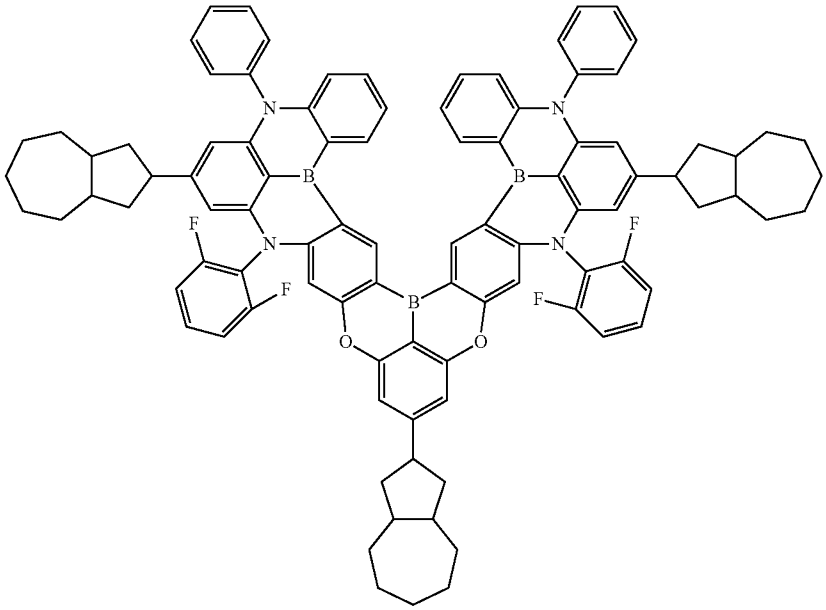
(1-7-101)
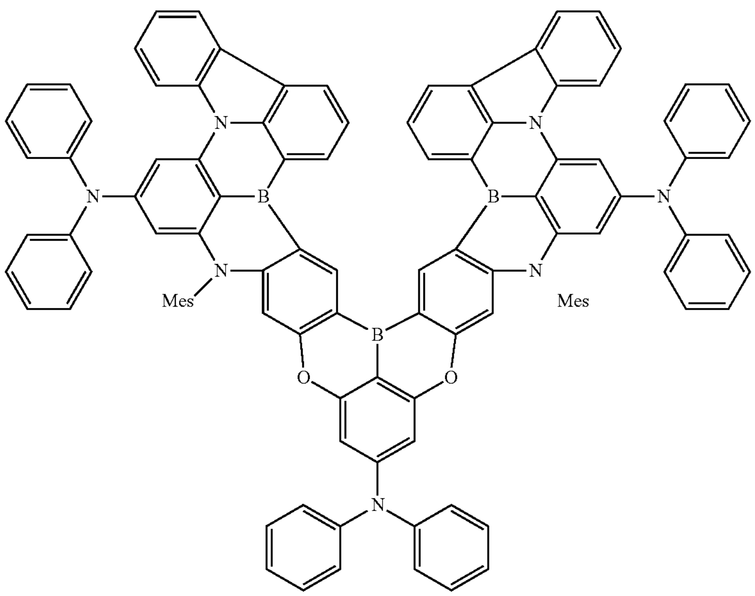
(1-7-102)
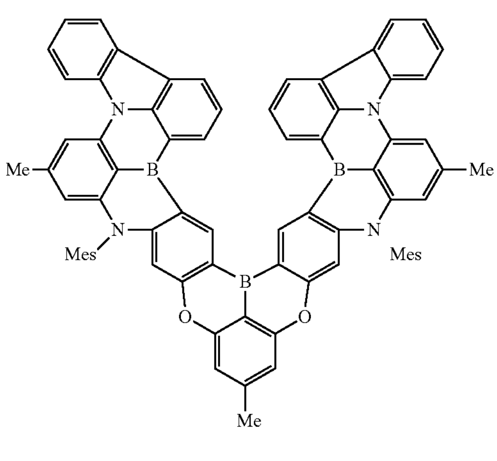
(1-7-103)
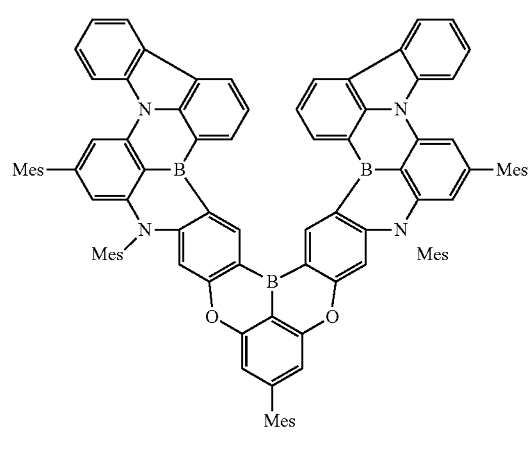

-continued
(1-7-104)
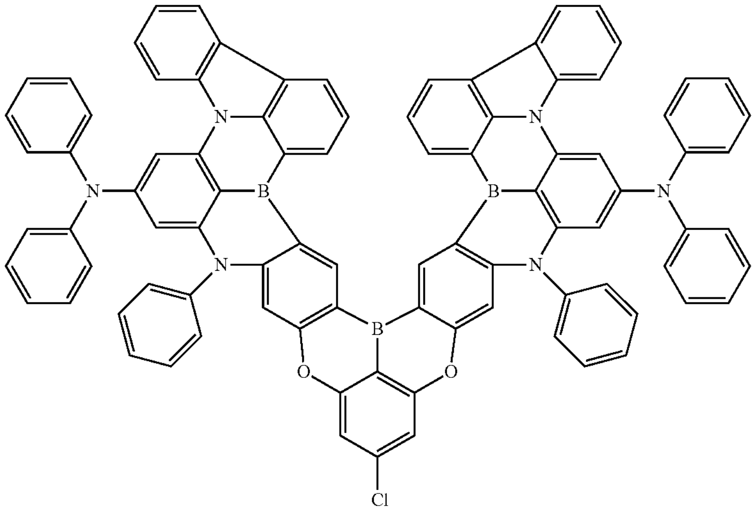
(1-7-105)
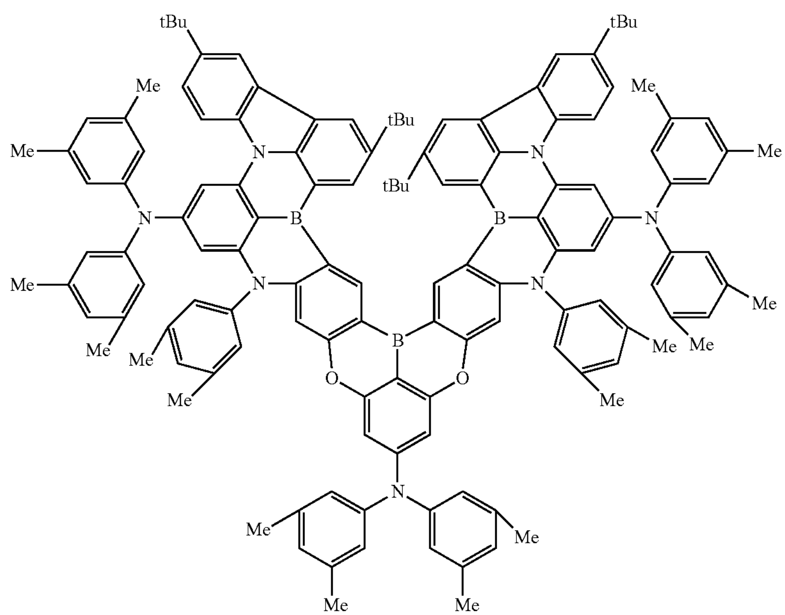
(1-7-106)
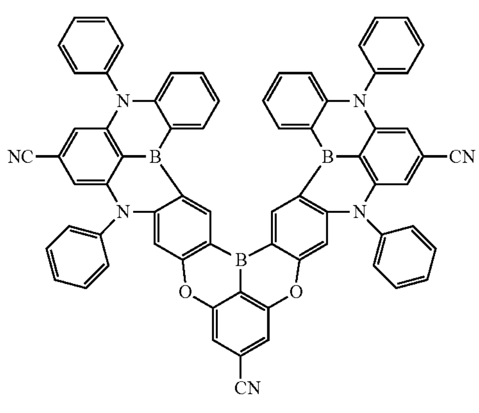
(1-7-107)
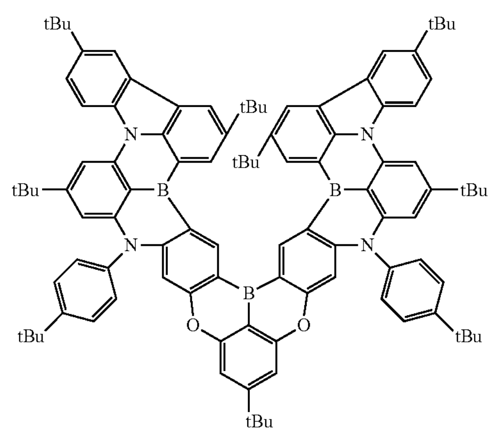

-continued
(1-7-108)
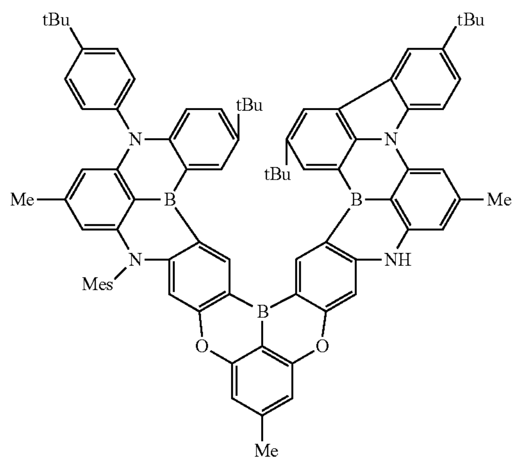
(1-7-109)
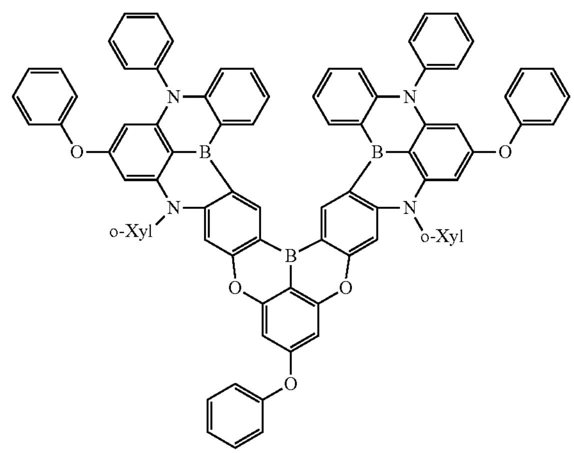
(1-7-110)
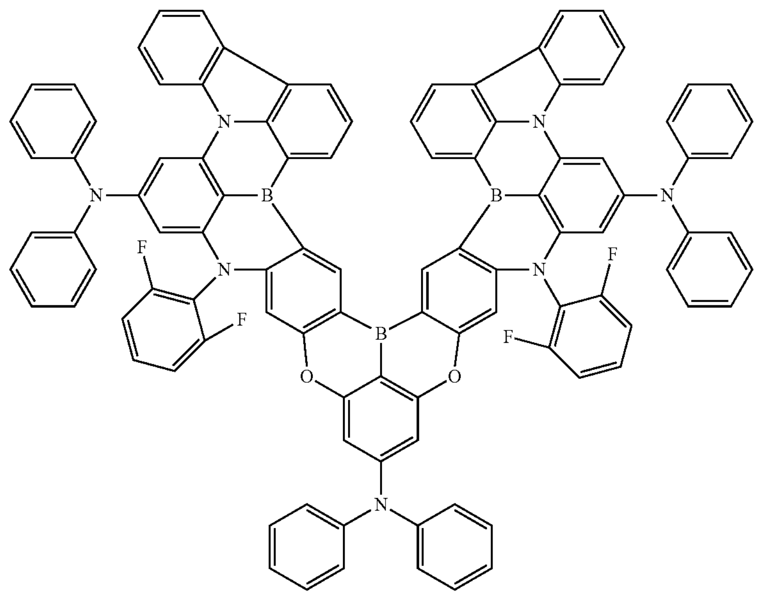
(1-7-121)
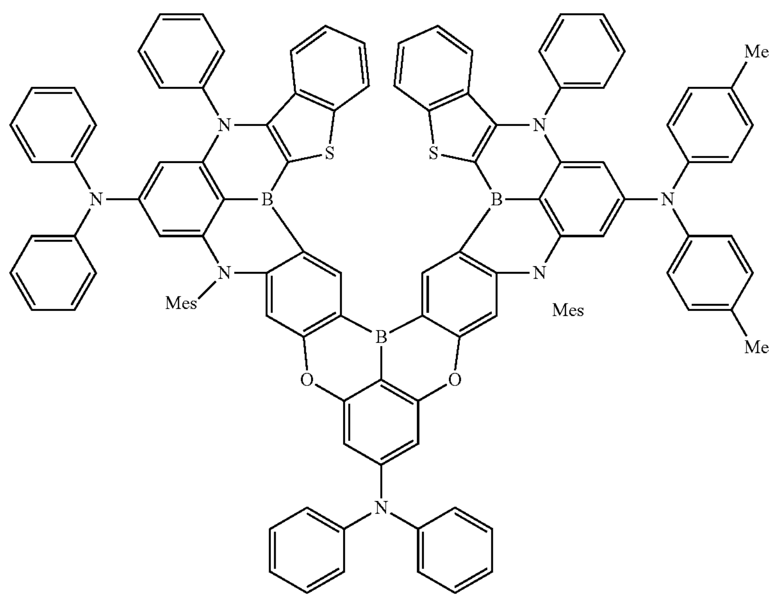

-continued
(1-7-122)
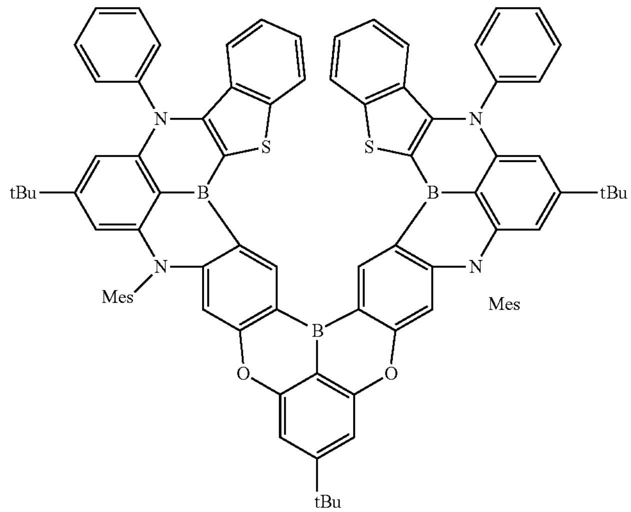
(1-7-123)
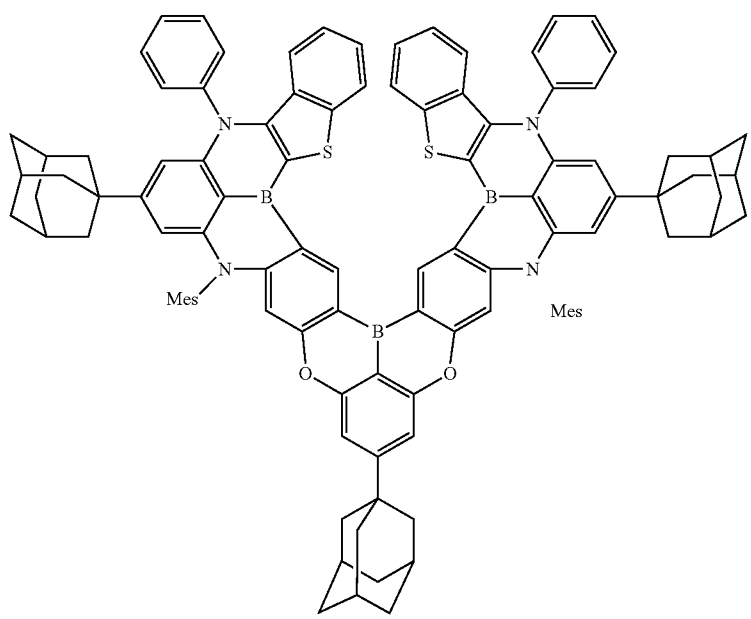

-continued
(1-7-124)
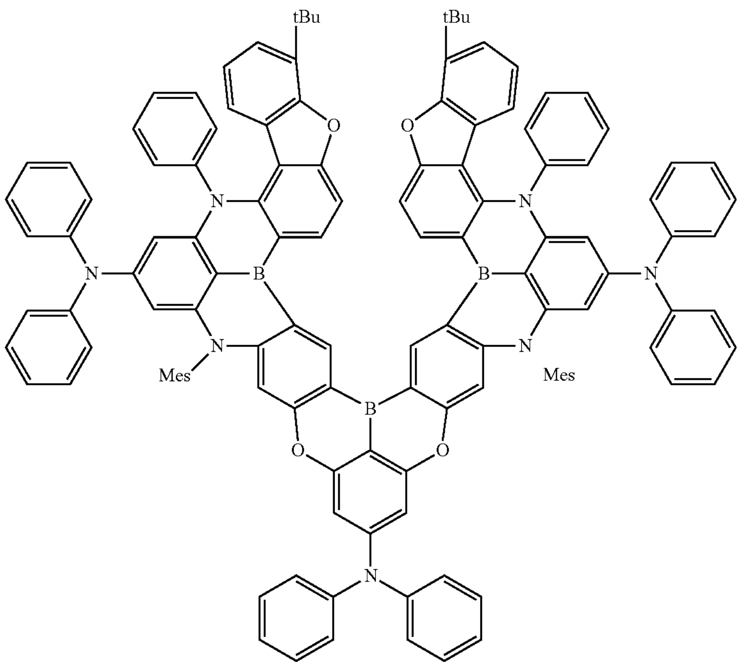
(1-7-125)
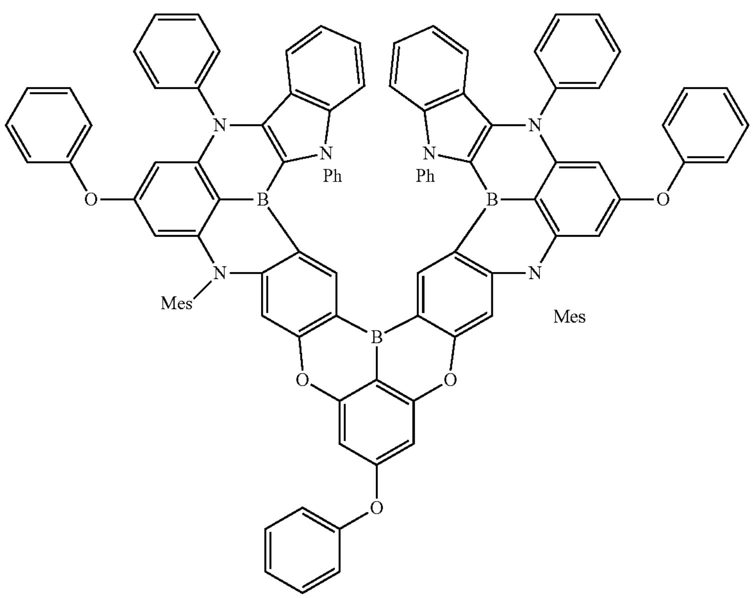

-continued
(1-7-126)
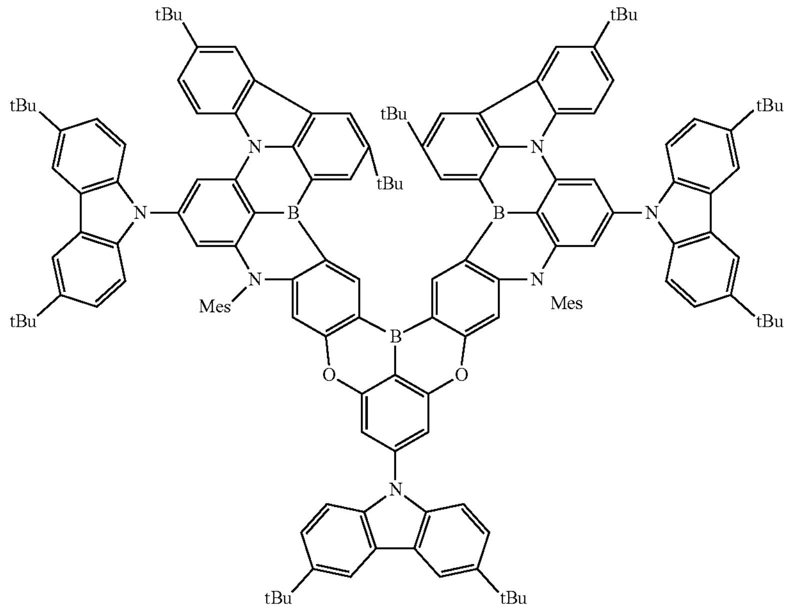
(1-7-127)
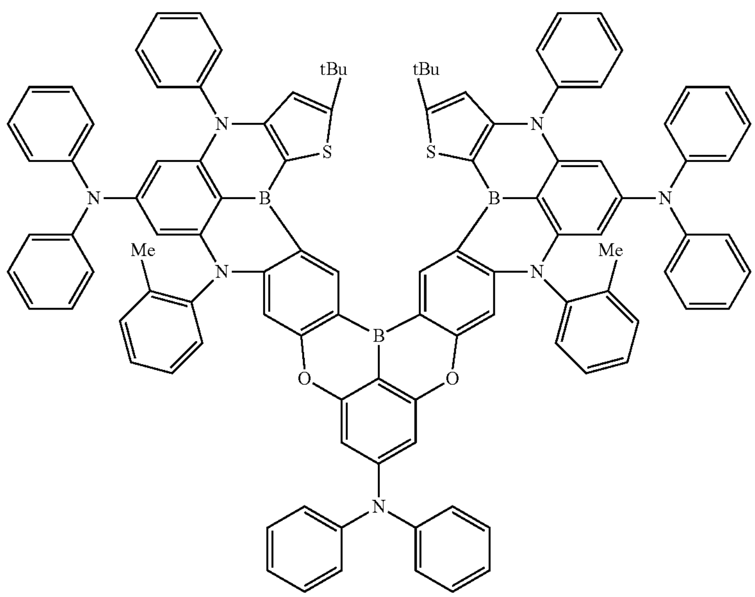
(1-7-128)
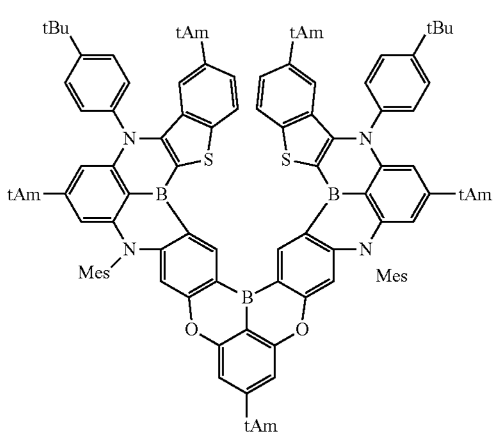
(1-7-129)
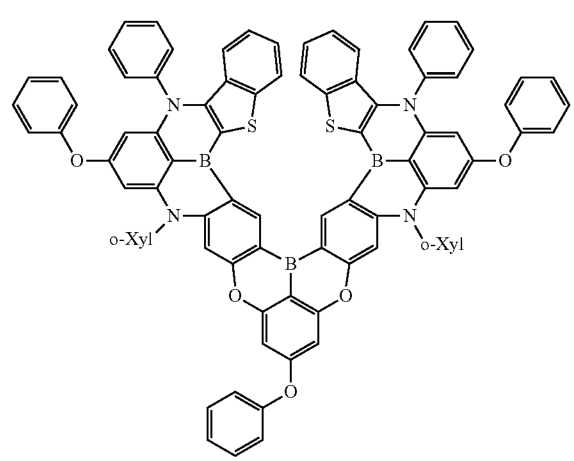

-continued
(1-7-130)
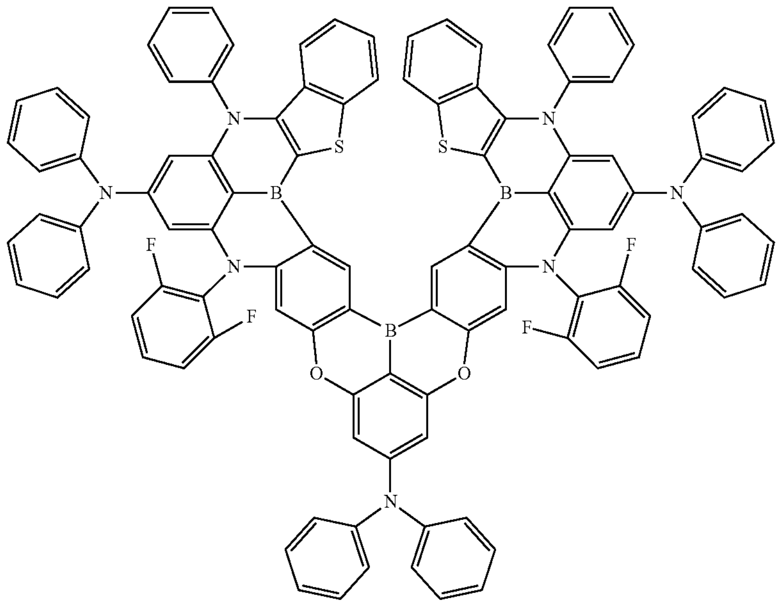
(1-7-141)
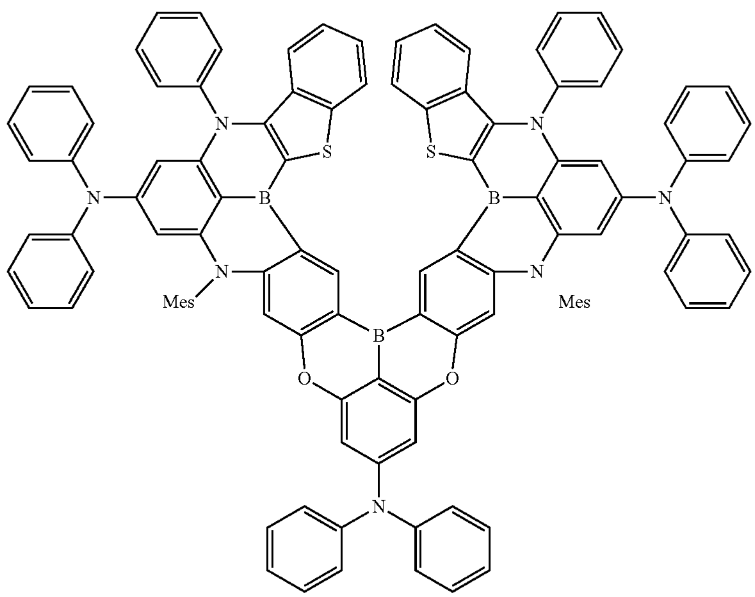
(1-7-142)
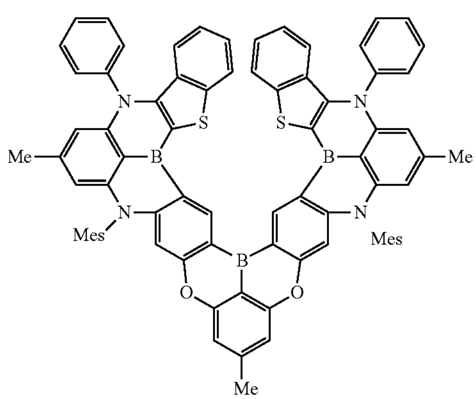
(1-7-143)
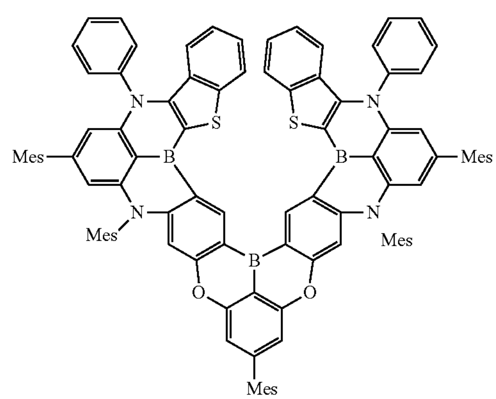

-continued
(1-7-144)
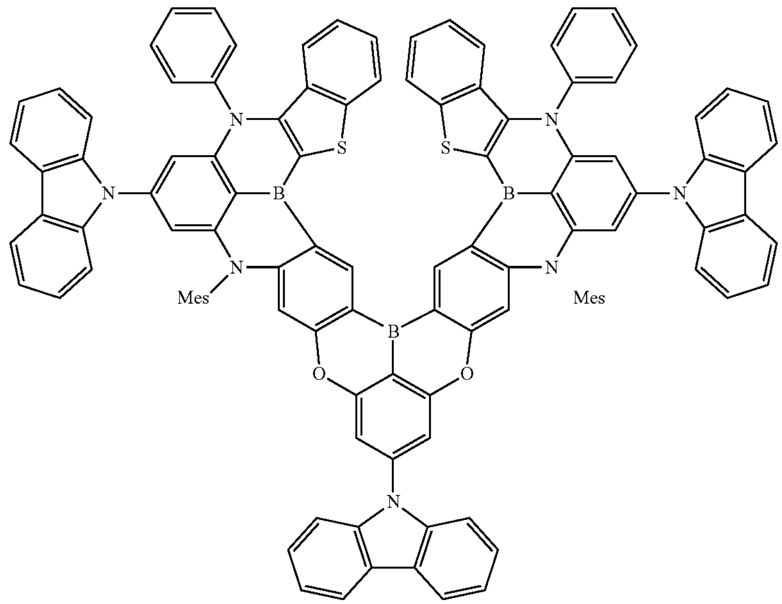
(1-7-145)
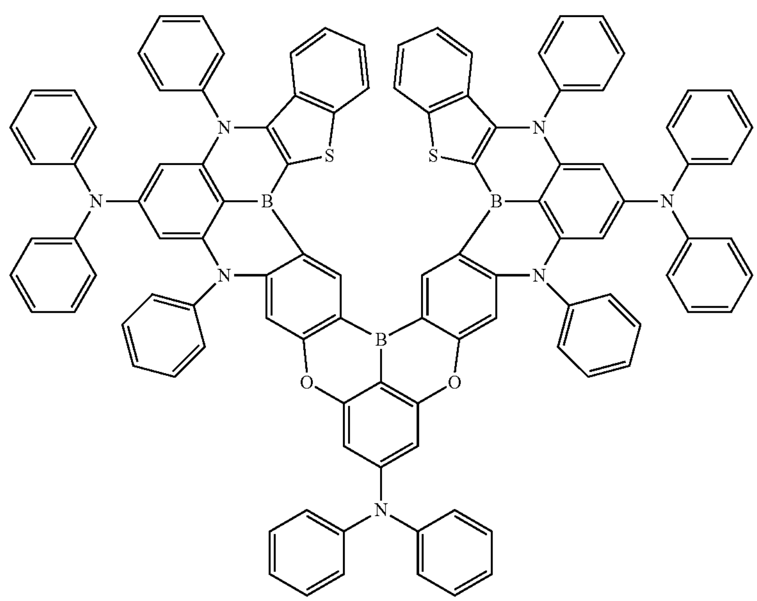
(1-7-146)
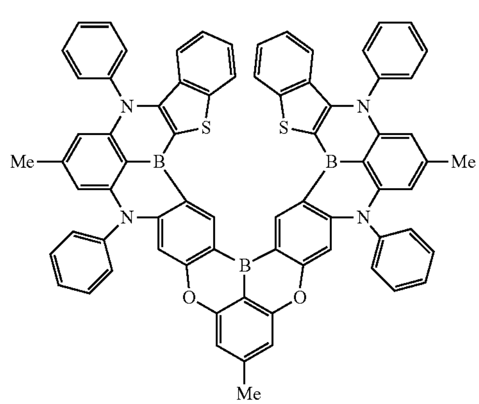
(1-7-147)
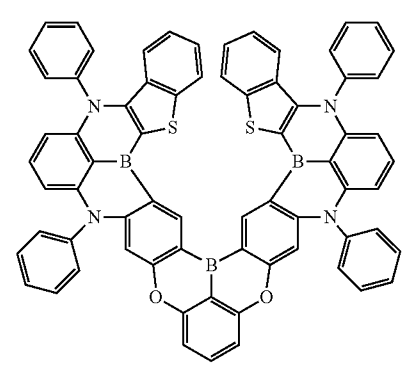

-continued
(1-7-148)
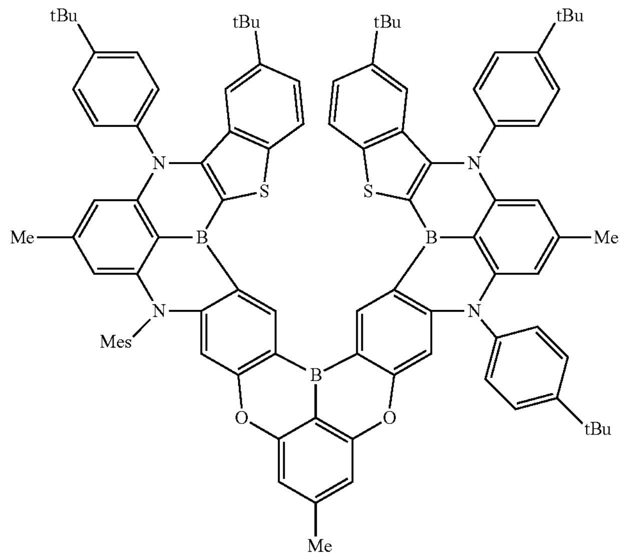
(1-7-149)
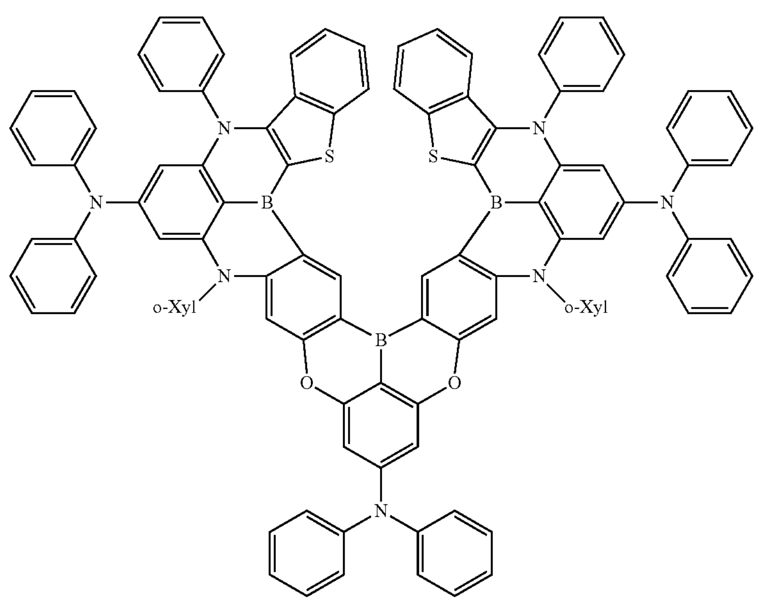

-continued
(1-7-150)
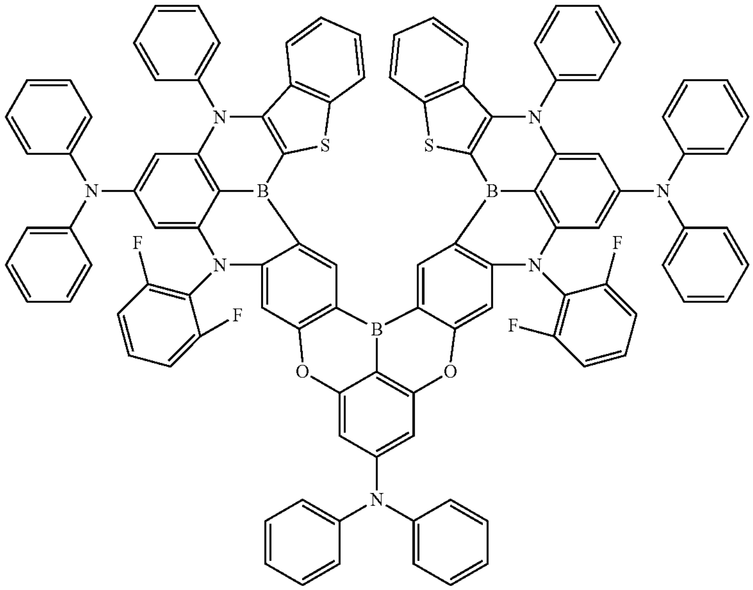
(1-7-161)
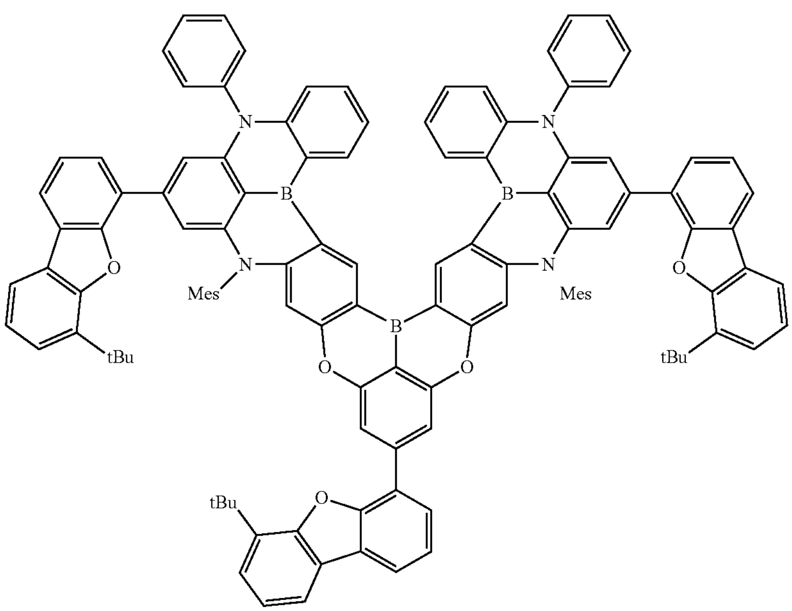

-continued
(1-7-162)
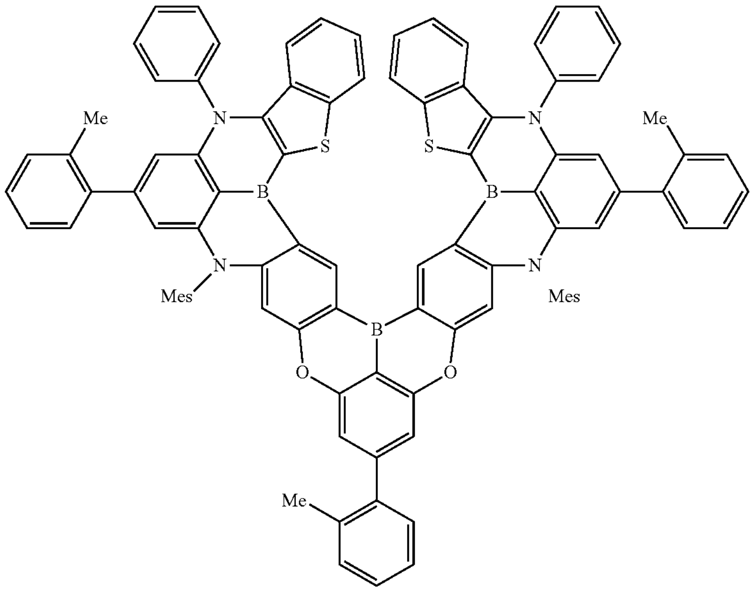
(1-7-163)
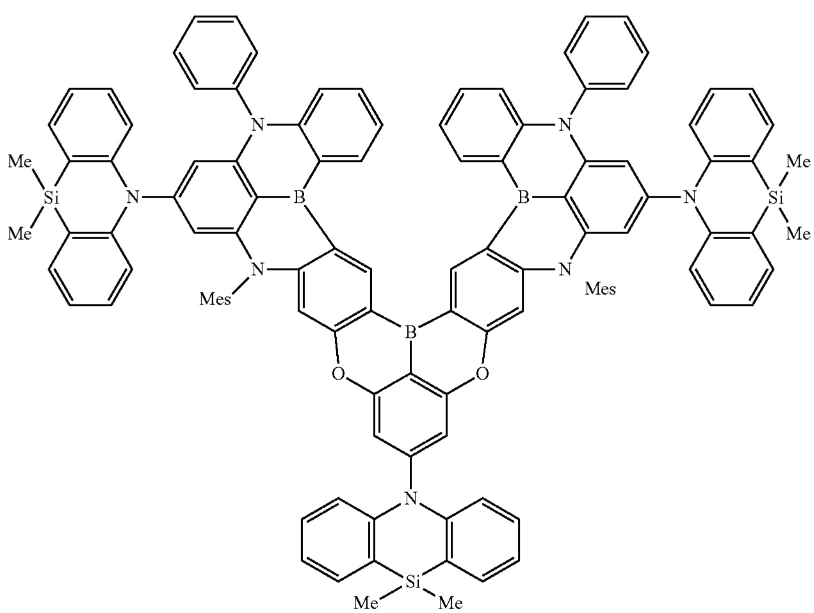

-continued
(1-7-164)
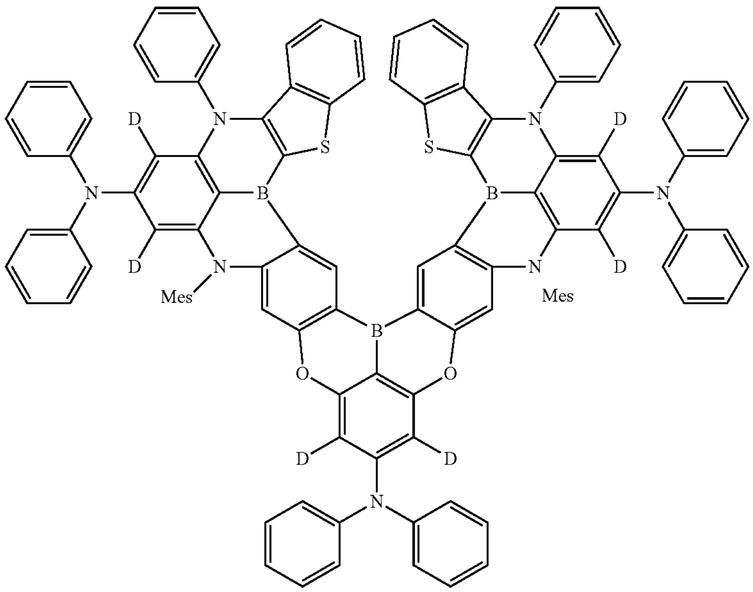
(1-7-165)
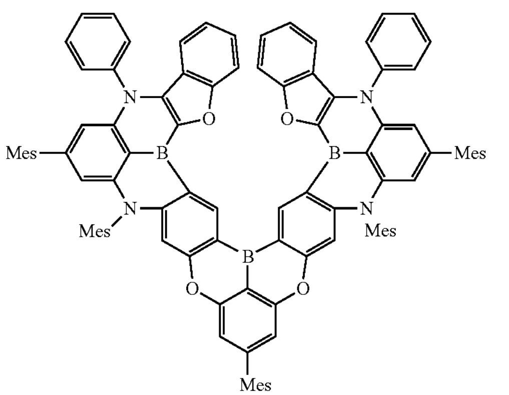
(1-7-166)
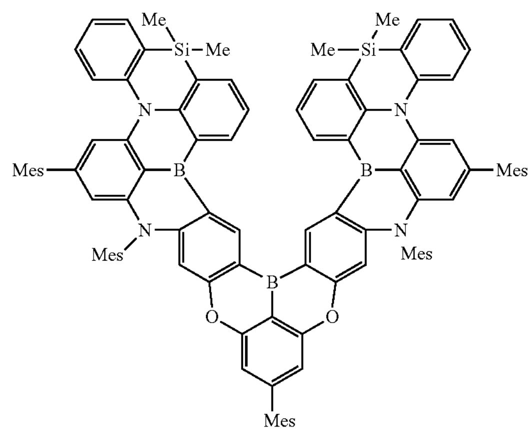
(1-7-167)
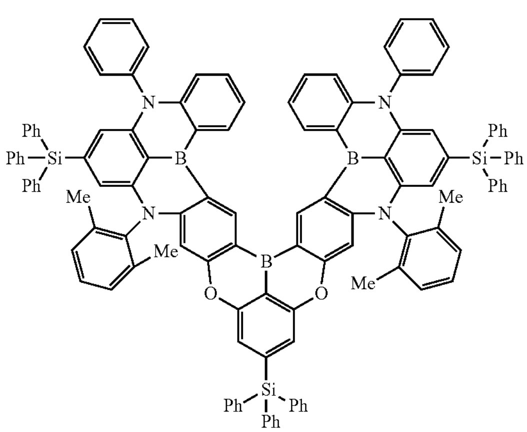
(1-7-168)
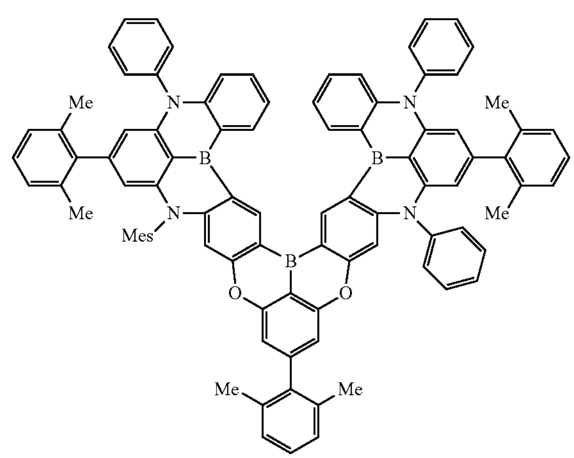

-continued
(1-7-169)
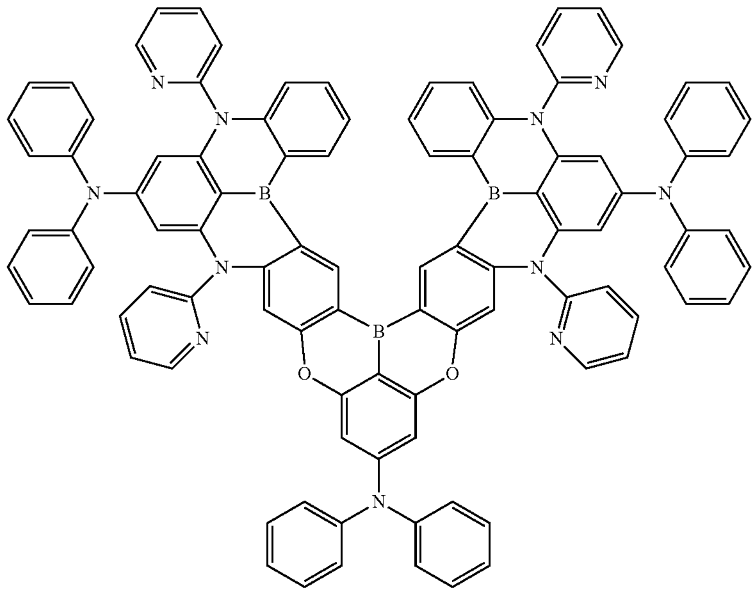
(1-7-170)
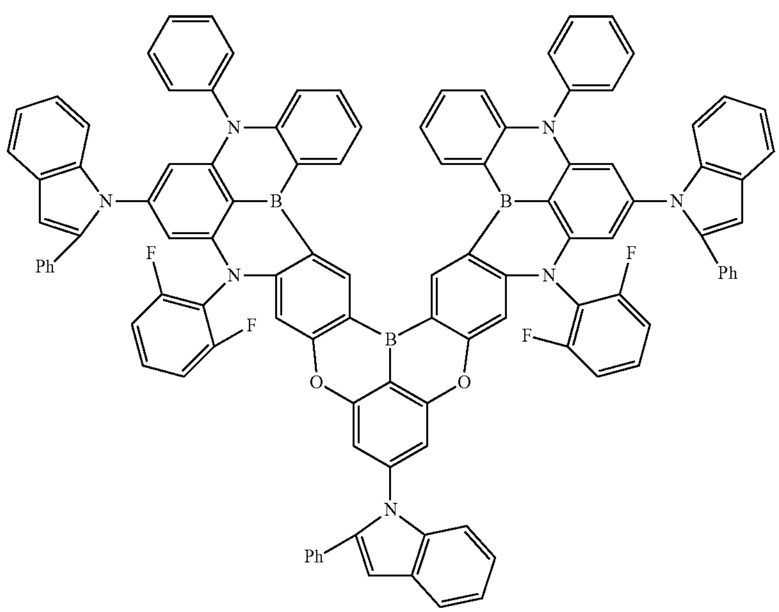

-continued
(1-7-191)
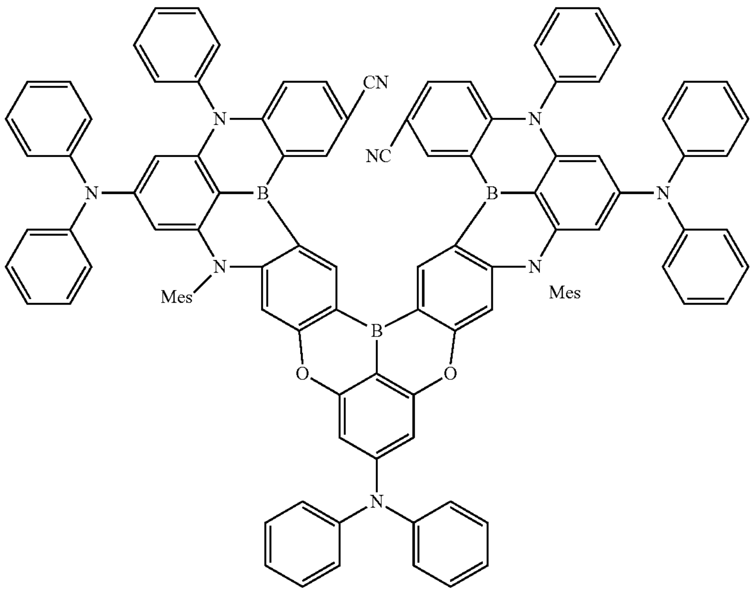
(1-7-192)
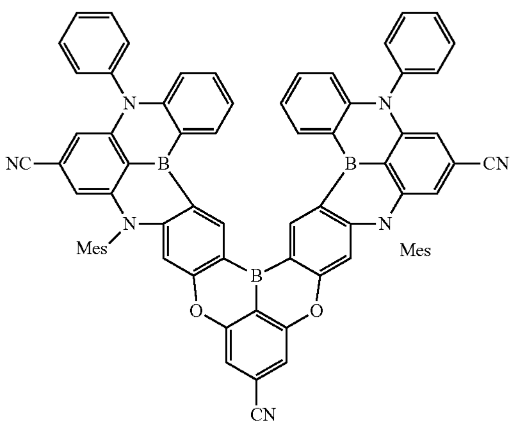
(1-7-193)
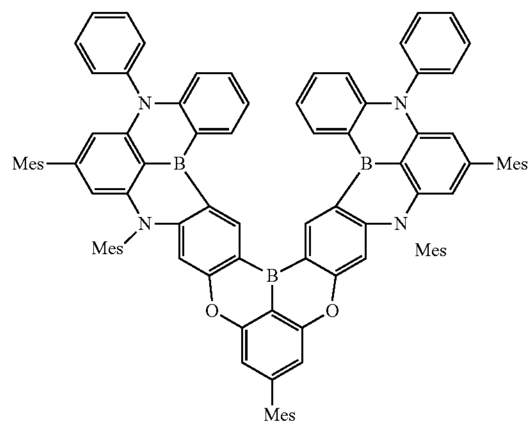
(1-7-194)
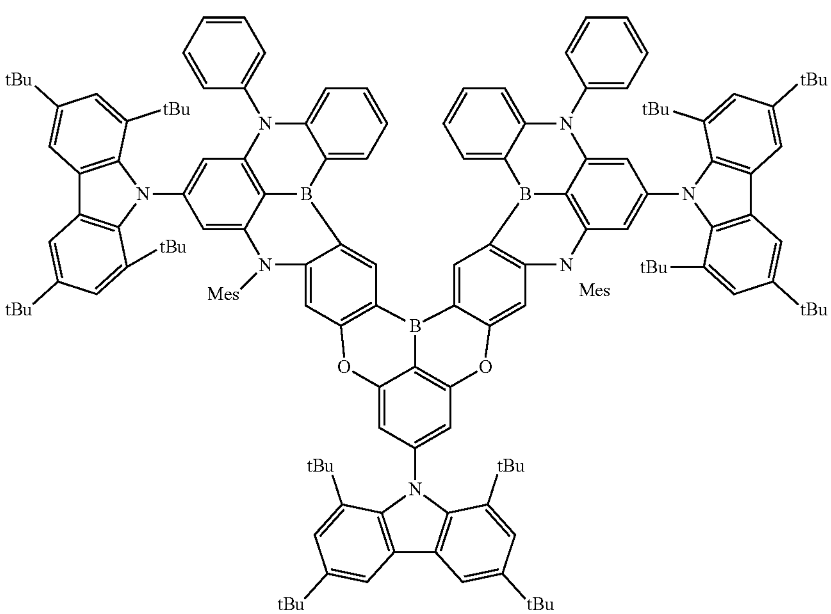

-continued
(1-7-195)
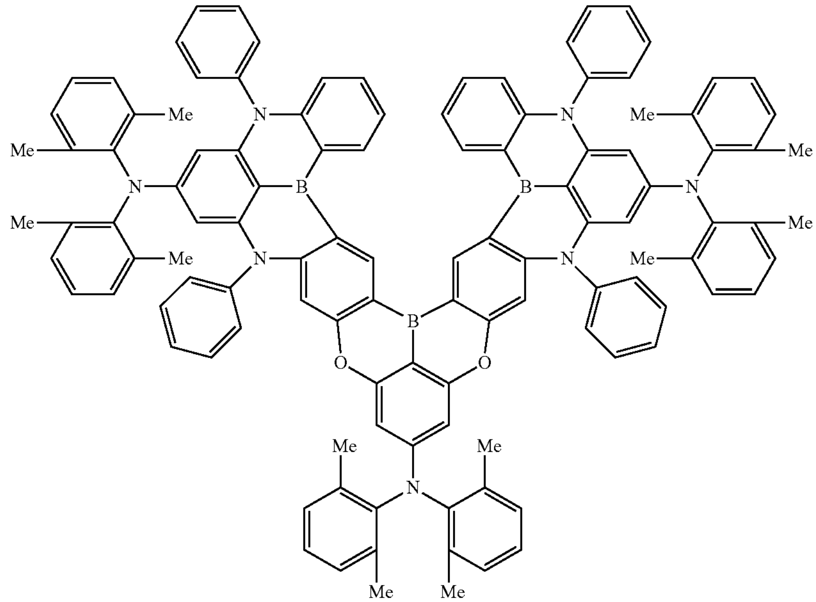
(1-7-196)
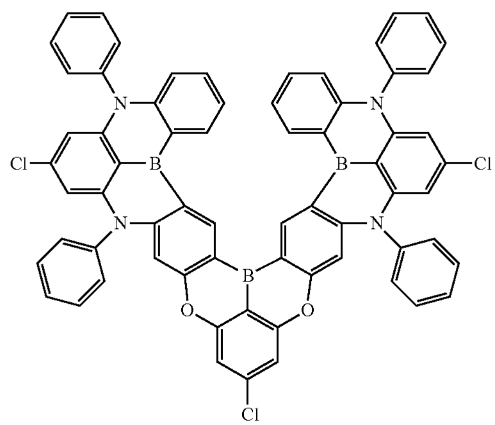
(1-7-197)
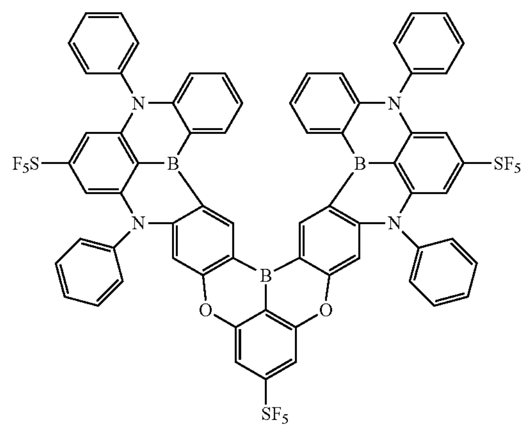
(1-7-198)
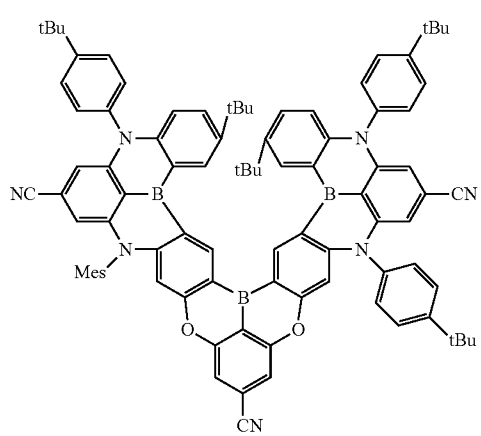
(1-7-199)
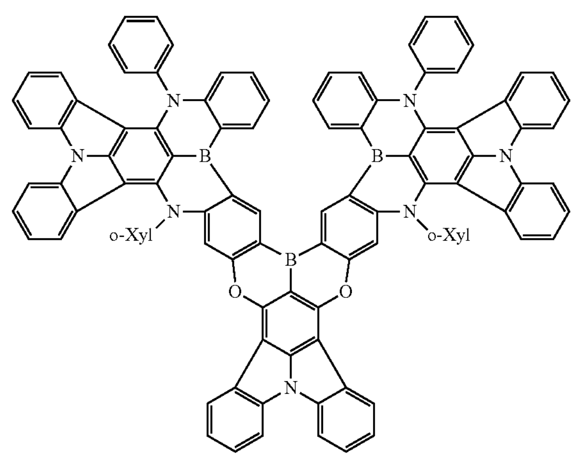

-continued
(1-7-200)
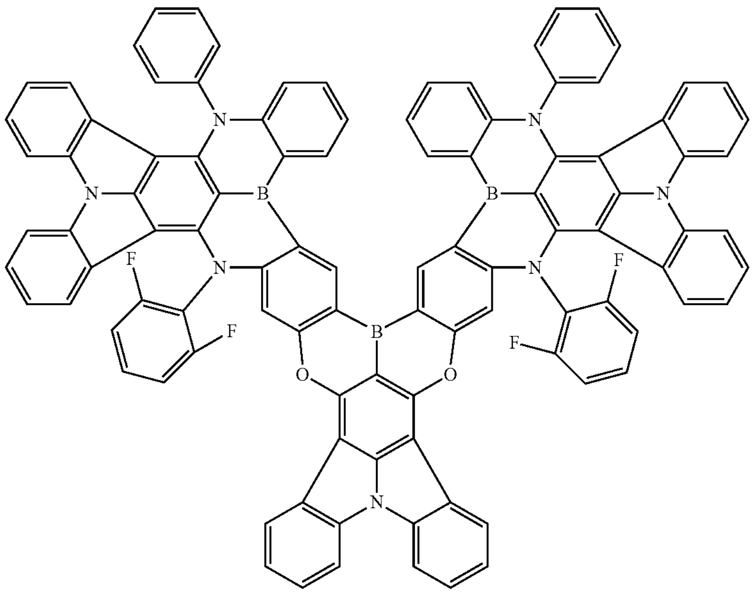
(1-7-221)
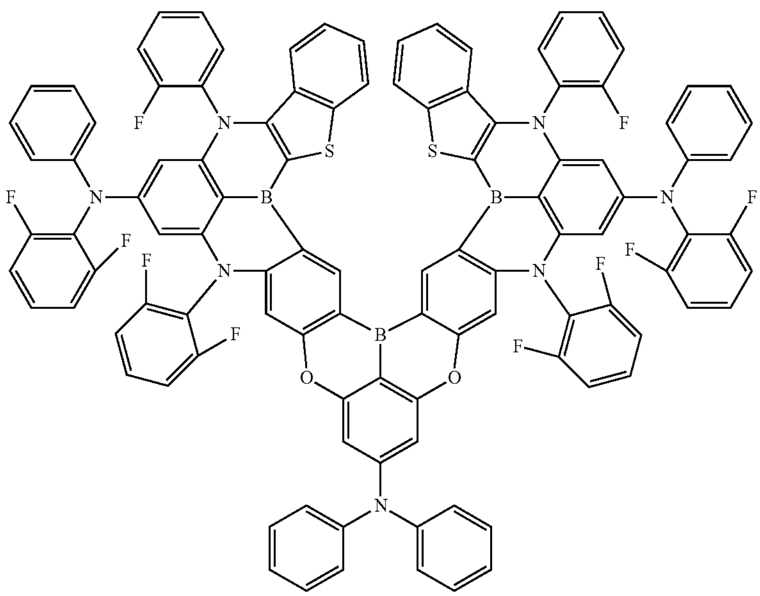
(1-7-222)
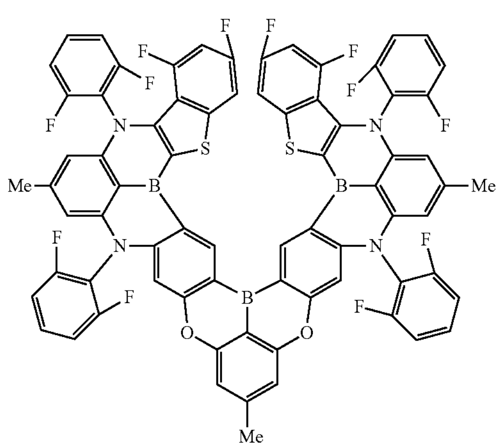
(1-7-223)
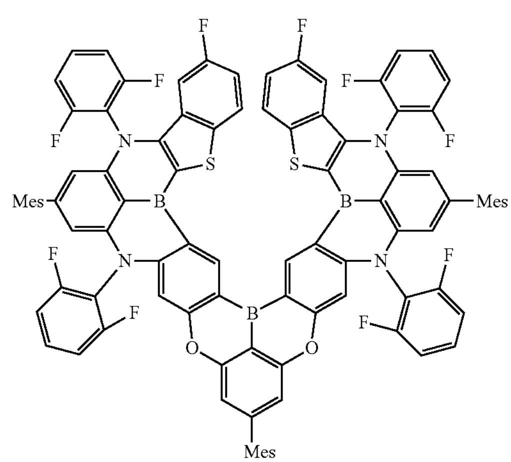

-continued
(1-7-224)
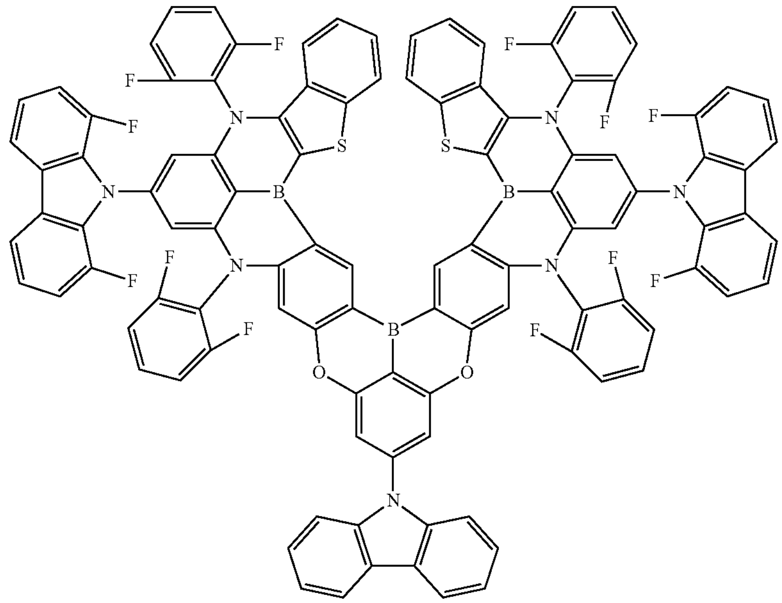
(1-7-225)
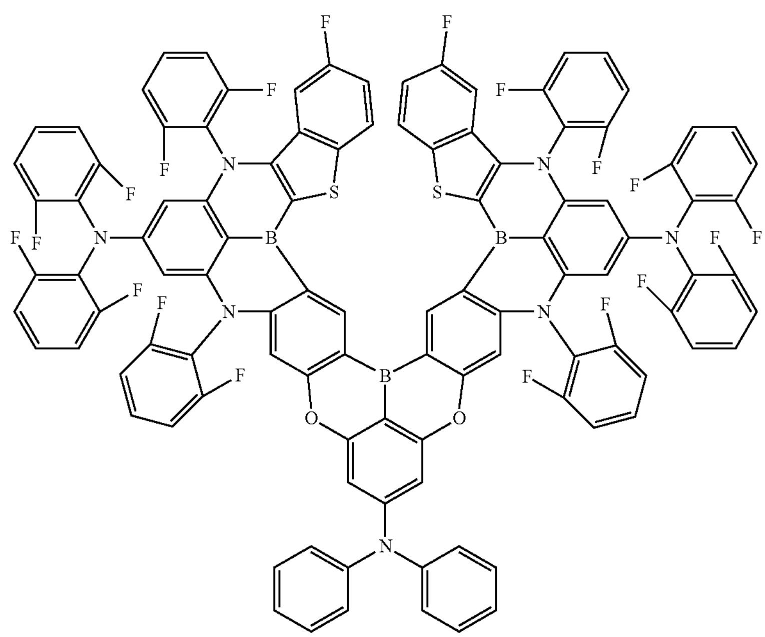

-continued
(1-7-226)
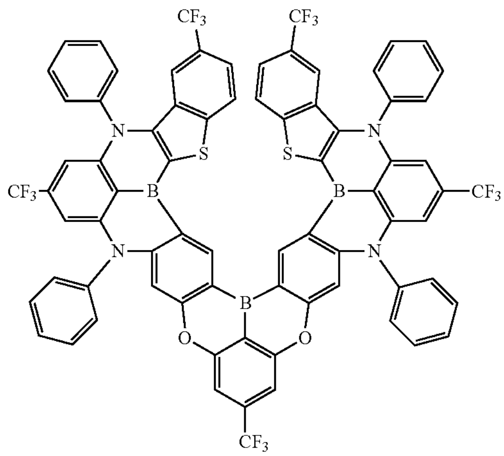
(1-7-227)
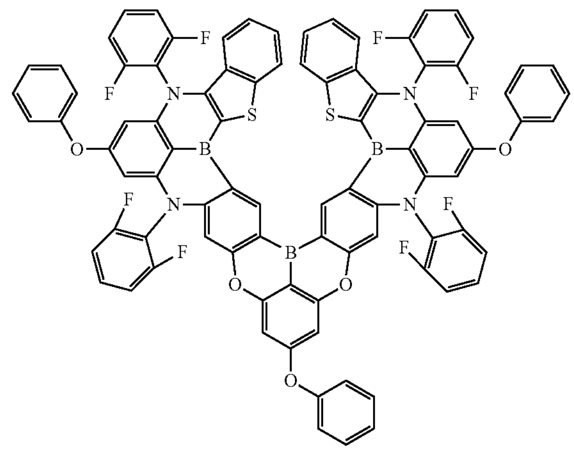
(1-7-228)
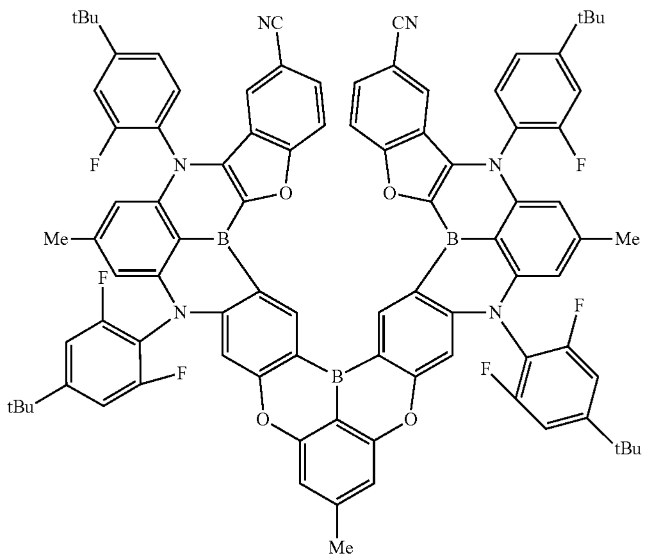
(1-7-229)
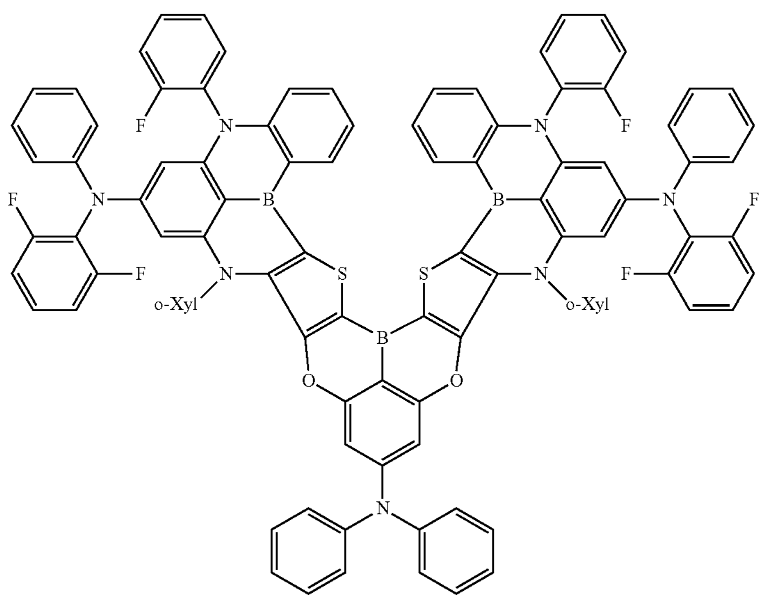

-continued
(1-7-230)
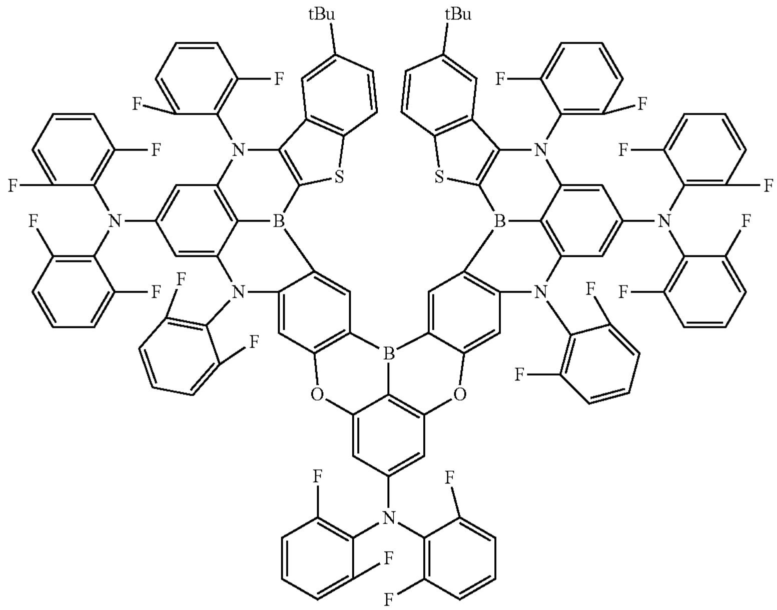
(1-8-1)
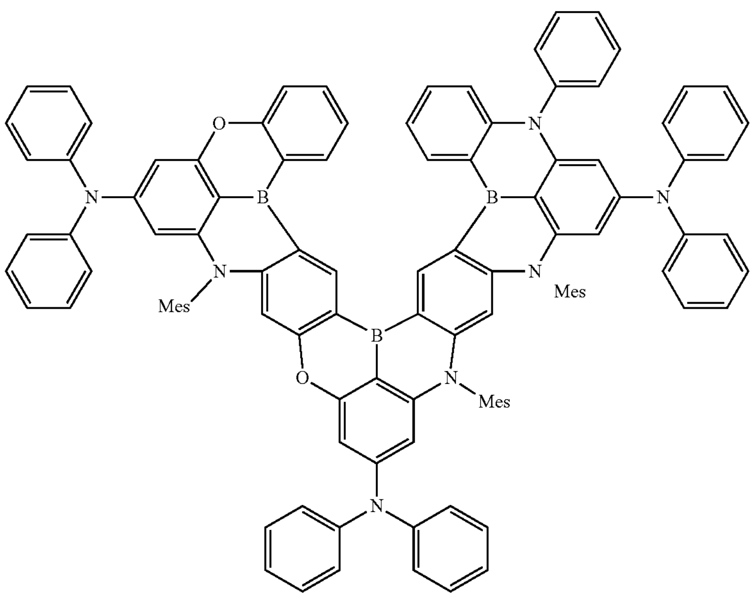
(1-8-2)
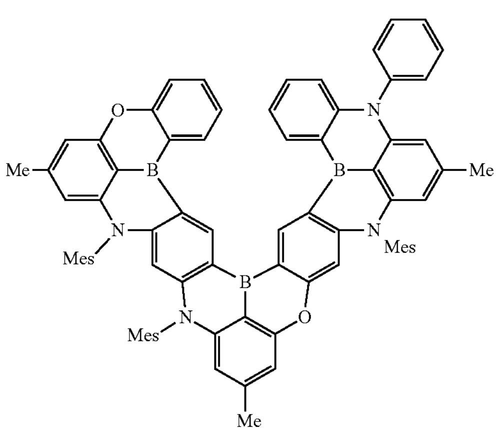
(1-8-3)
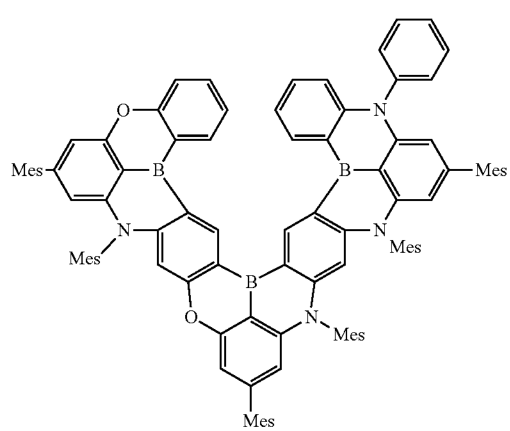

-continued
(1-8-4)
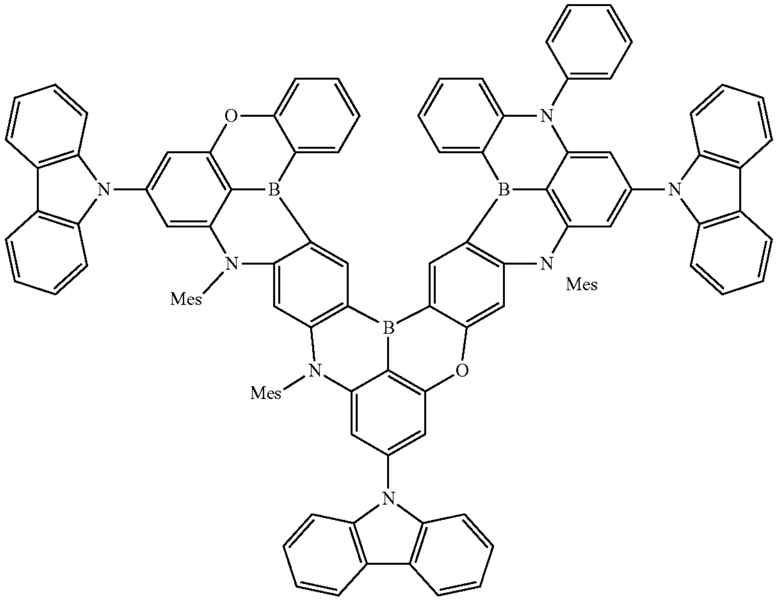
(1-8-5)
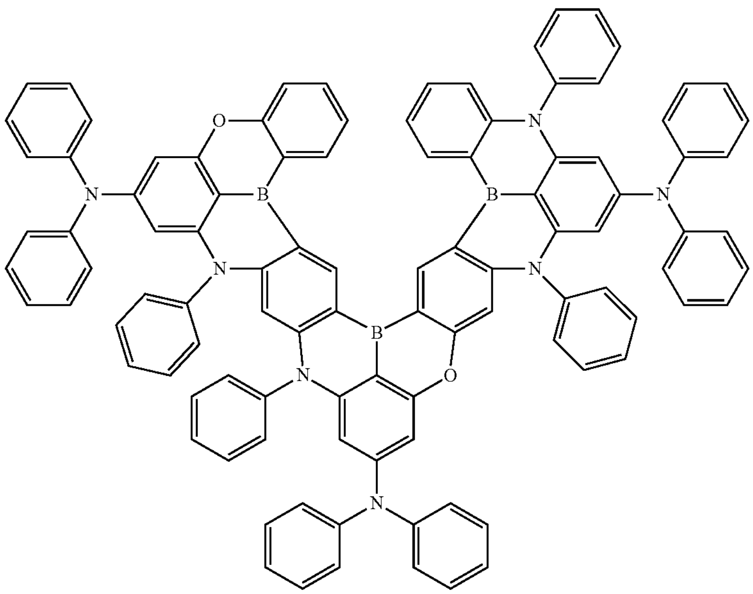
(1-8-6)
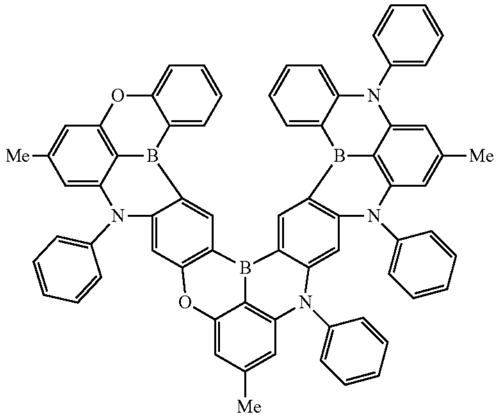
(1-8-7)
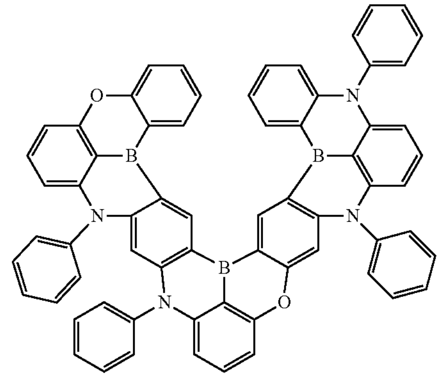

-continued
(1-8-8)
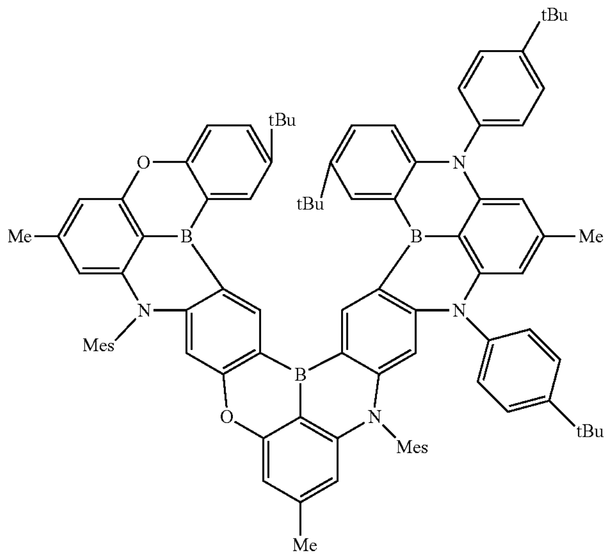
(1-8-9)
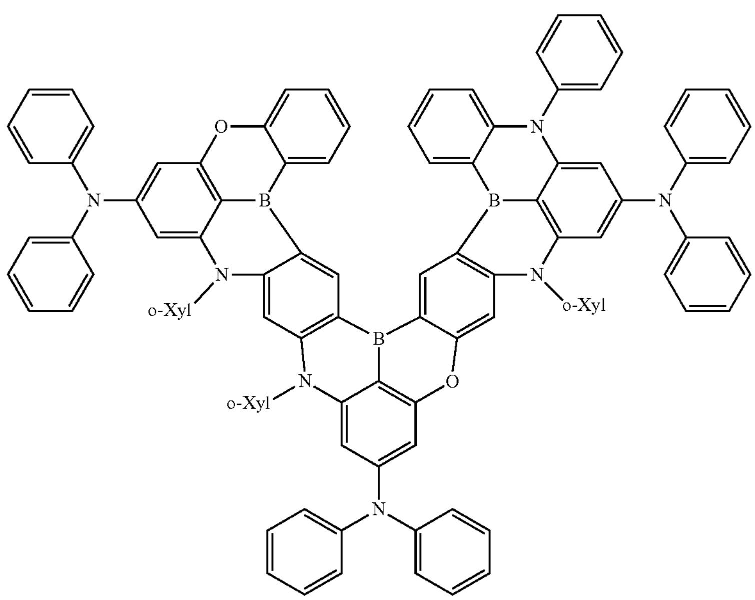

-continued
(1-8-10)
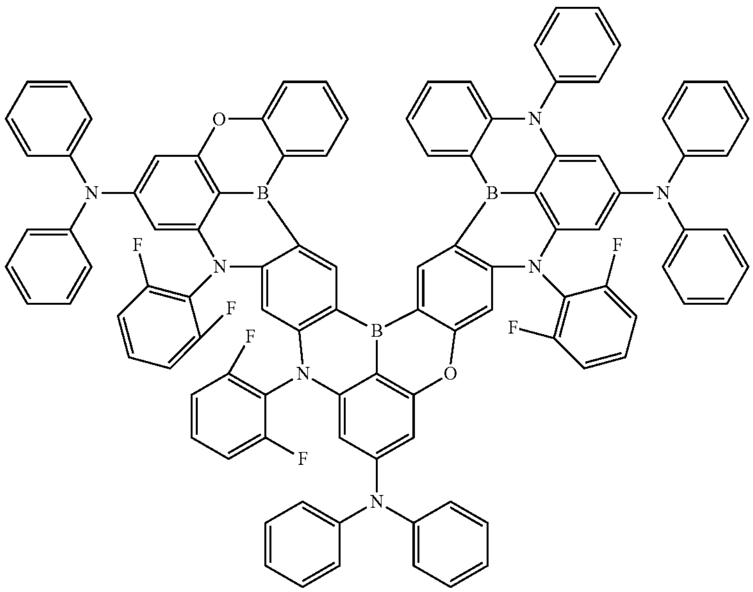
(1-8-21)
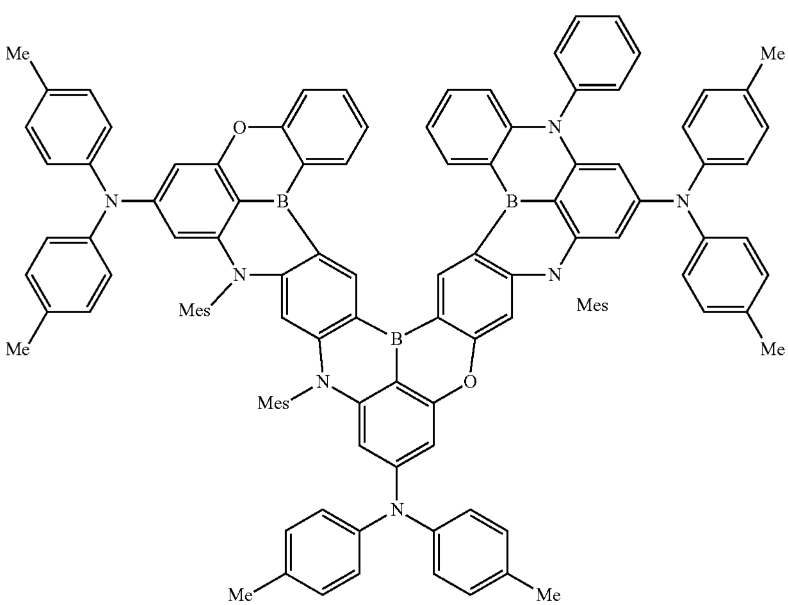

-continued
(1-8-22)
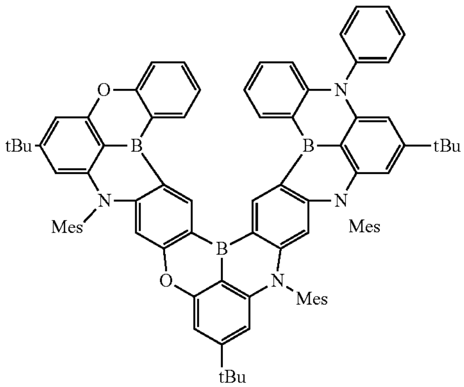
(1-8-23)
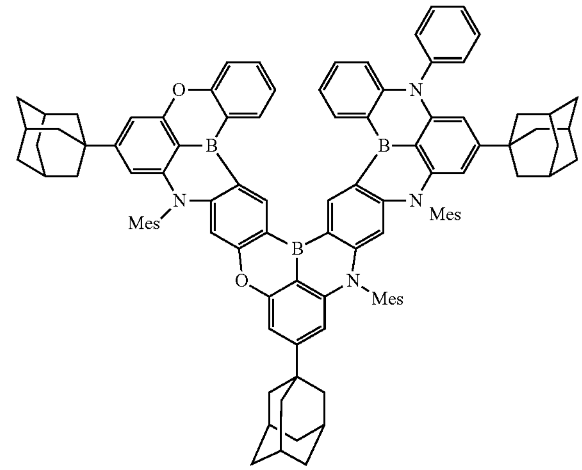
(1-8-24)
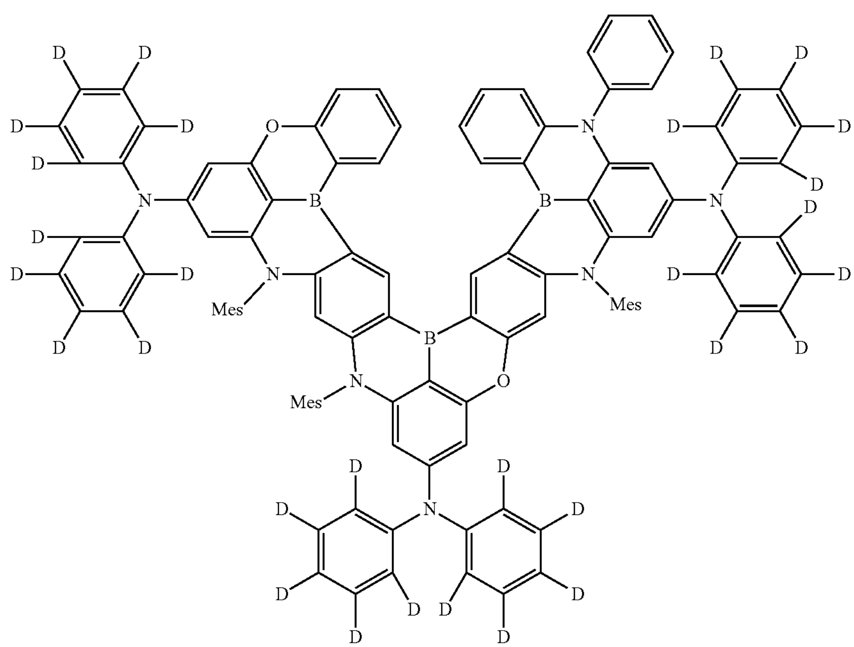

-continued
(1-8-25)
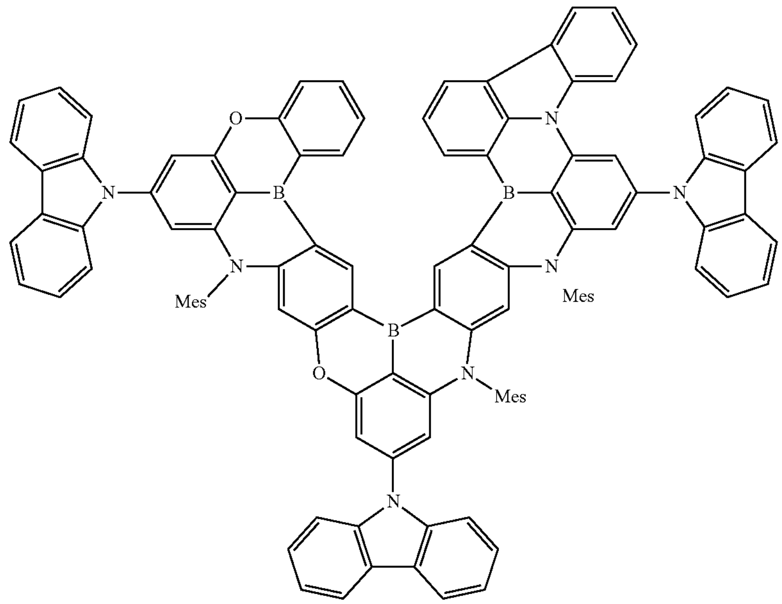
(1-8-26)
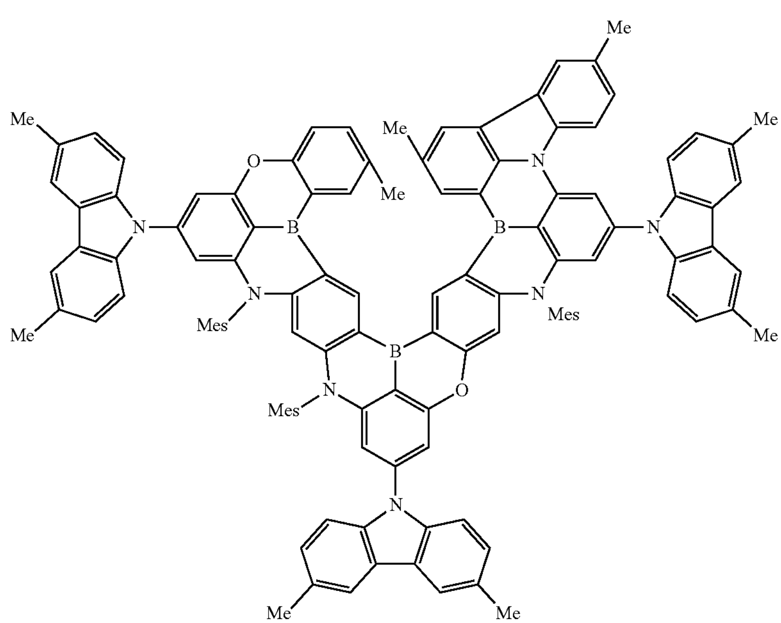

-continued
(1-8-27)
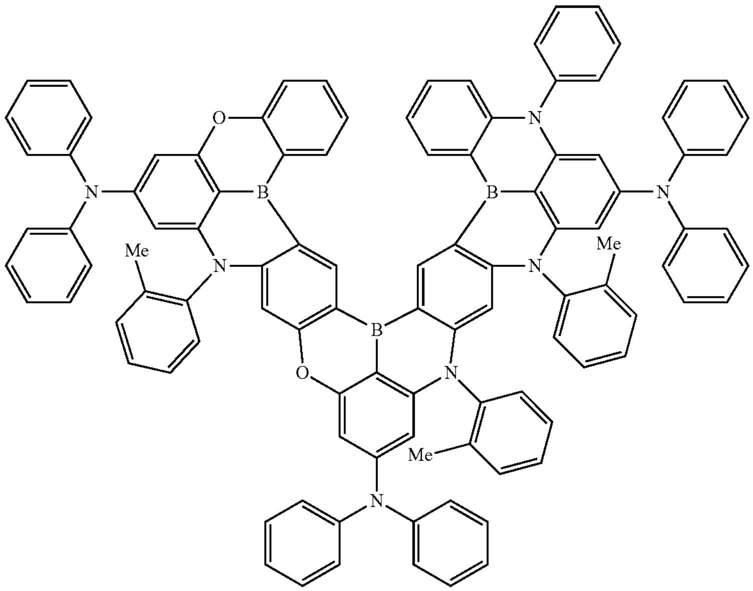
(1-8-28)
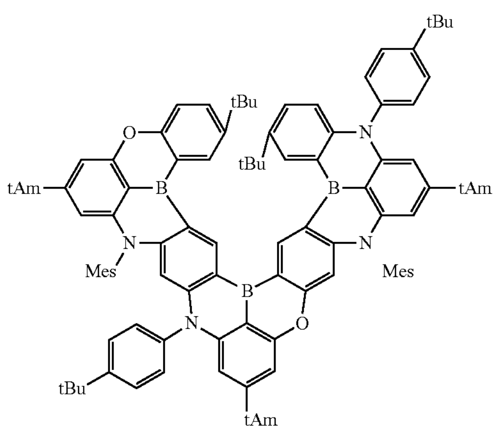
(1-8-29)
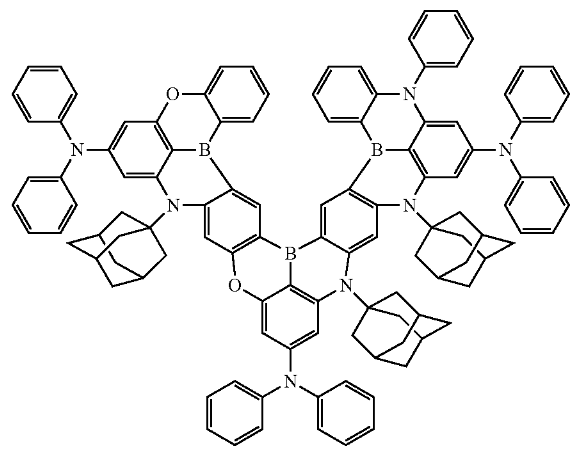
(1-8-30)
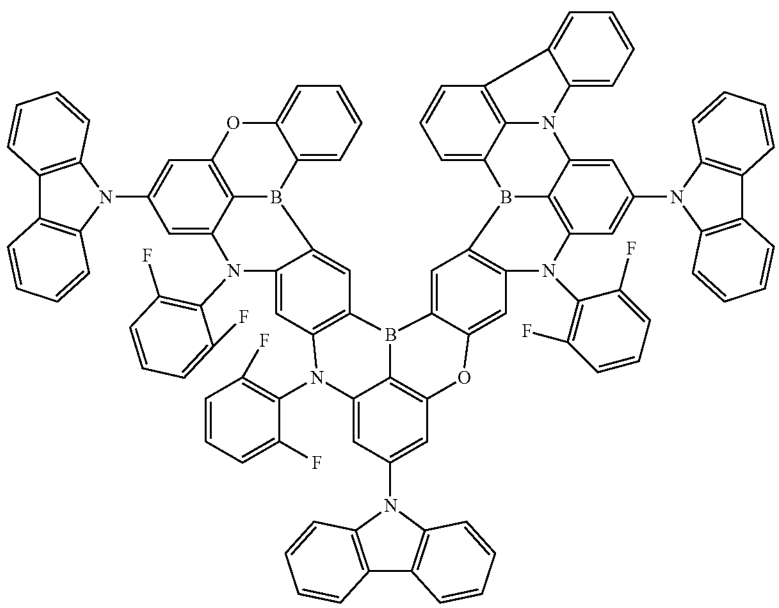

-continued
(1-8-41)
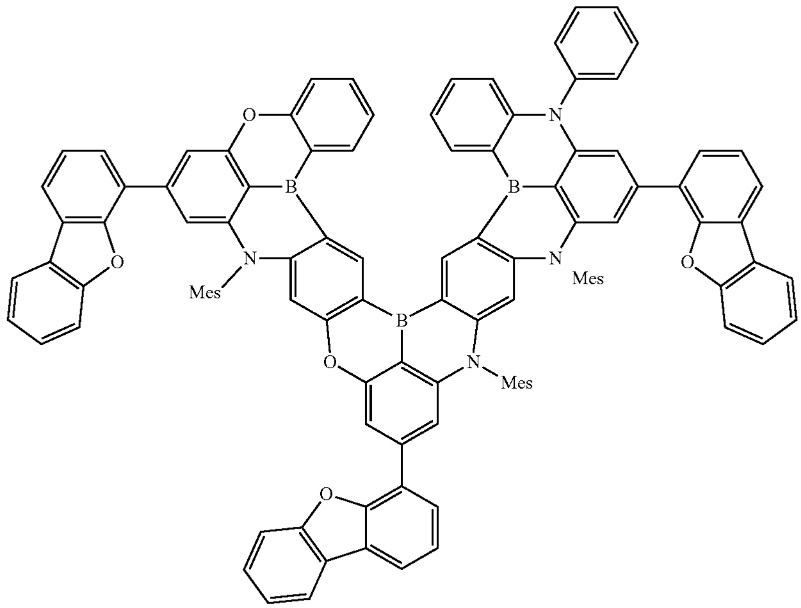
(1-8-42)
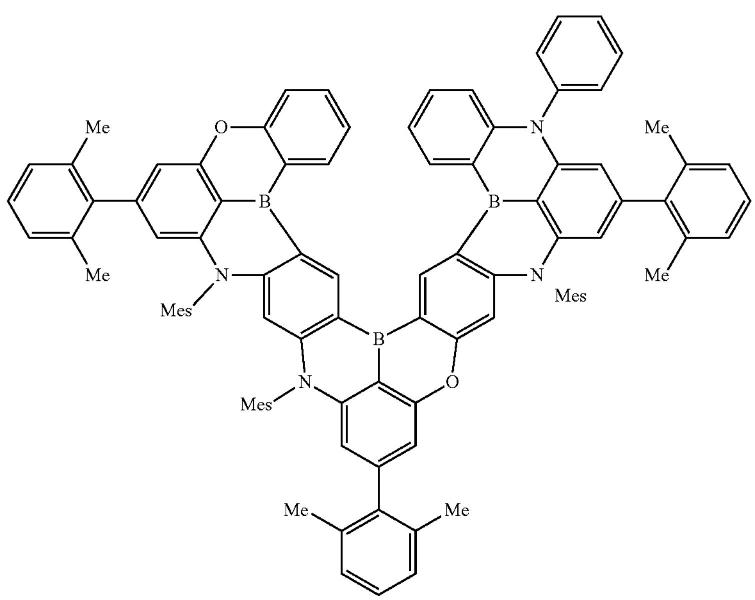

-continued
(1-8-43)
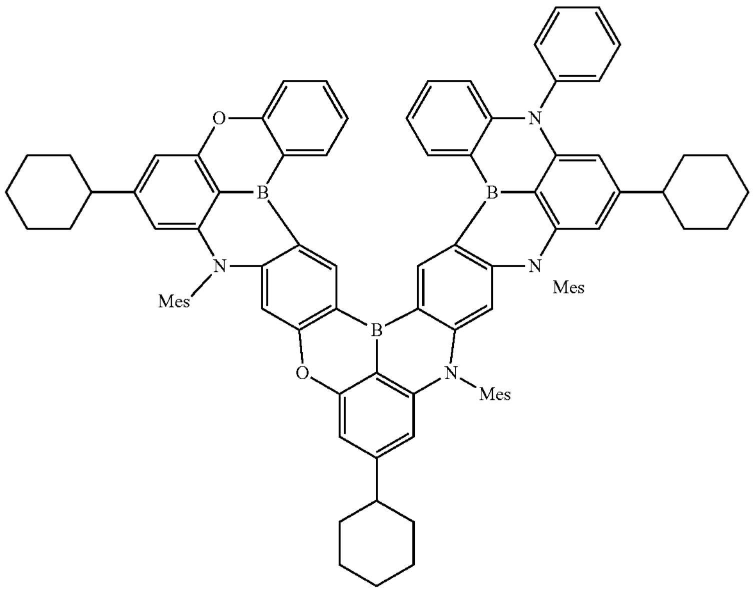
(1-8-44)
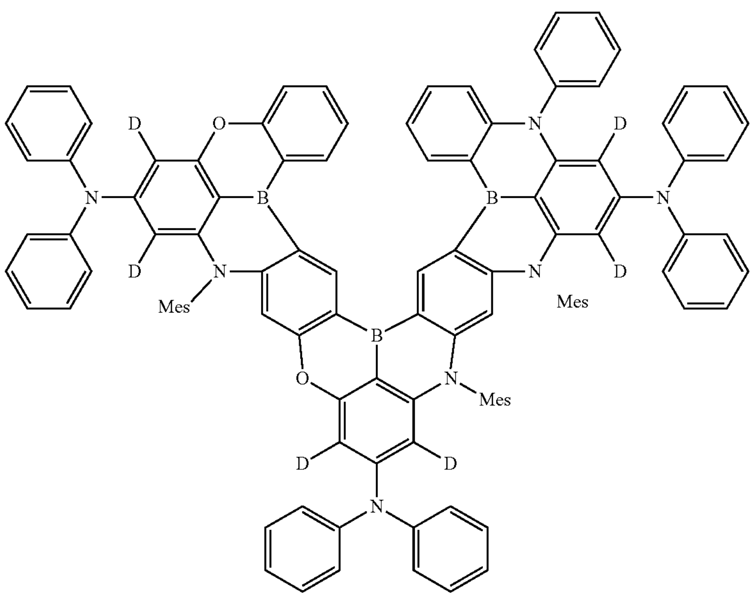
(1-8-45)
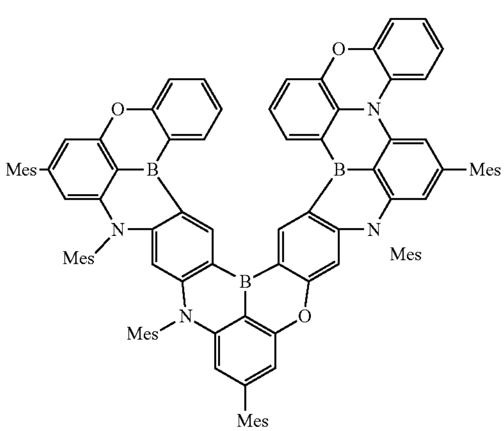
(1-8-46)
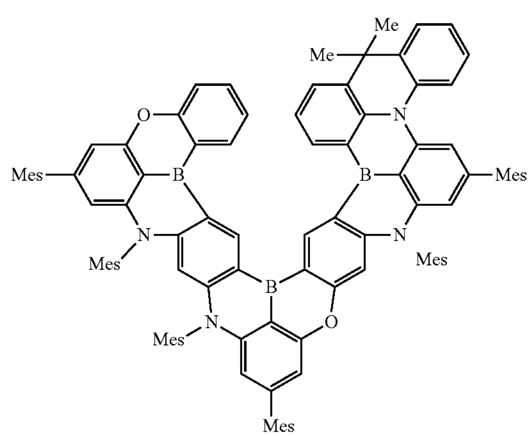

-continued
(1-8-47)
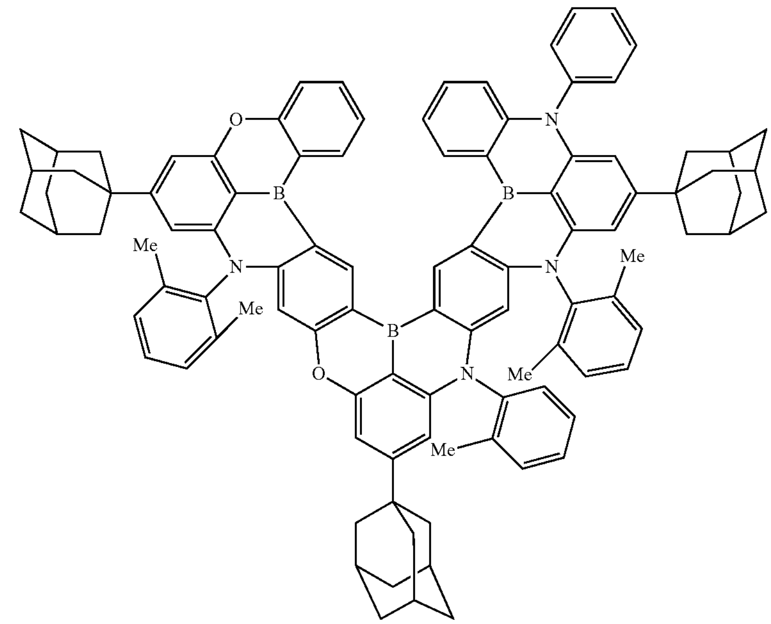
(1-8-48)
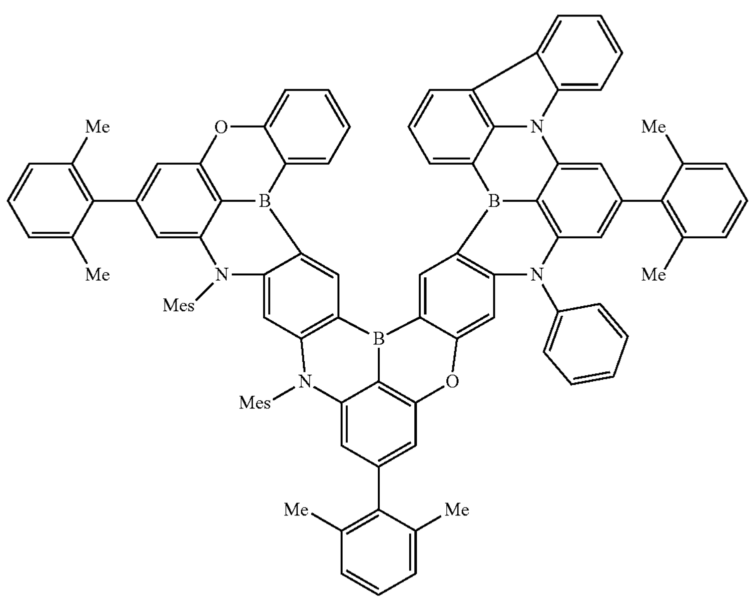

-continued
(1-8-49)
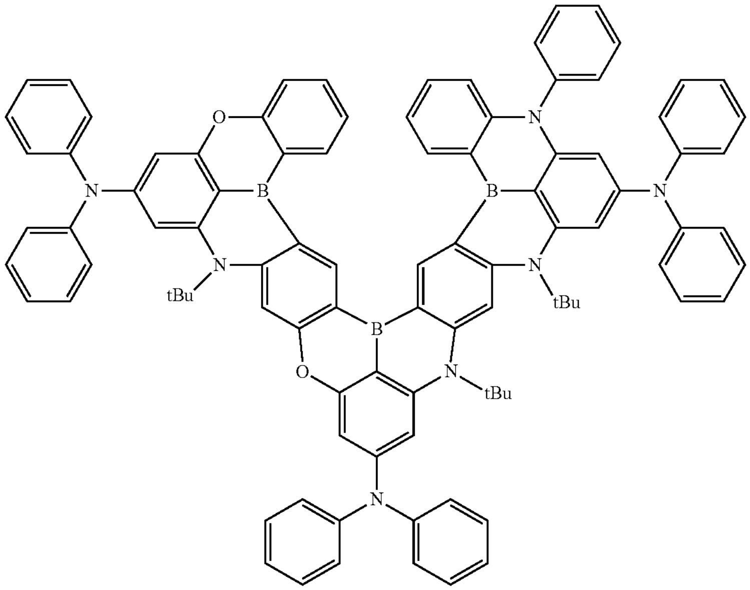
(1-8-50)
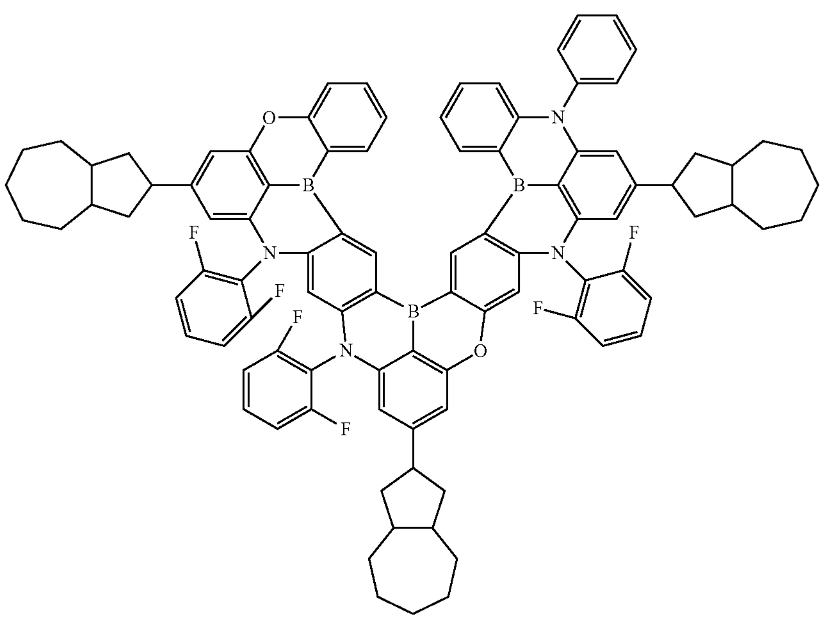

-continued
(1-8-101)
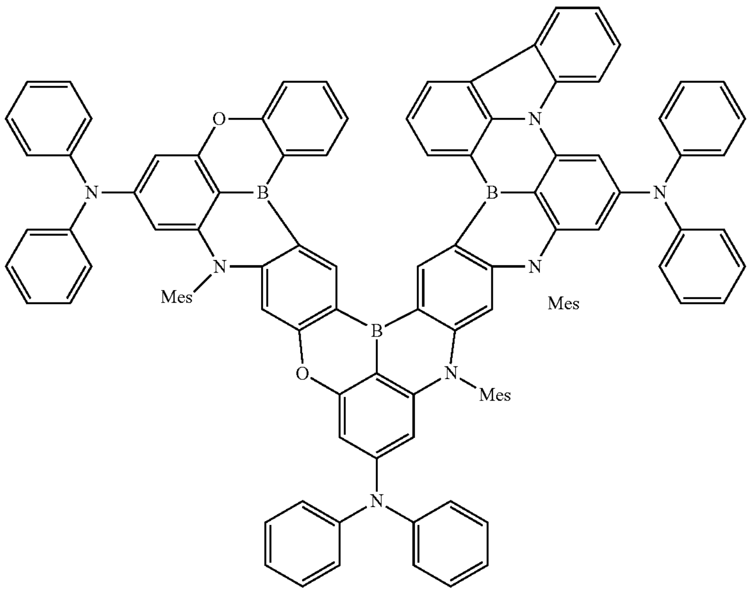
(1-8-102)
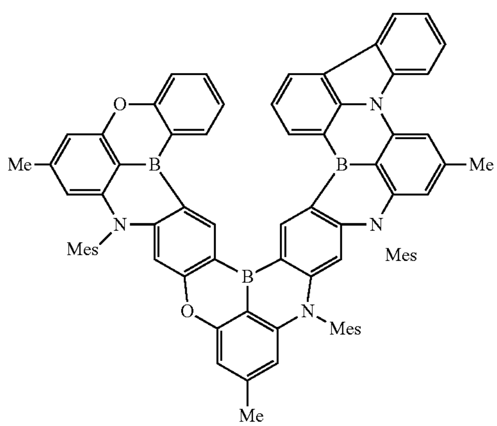
(1-8-103)
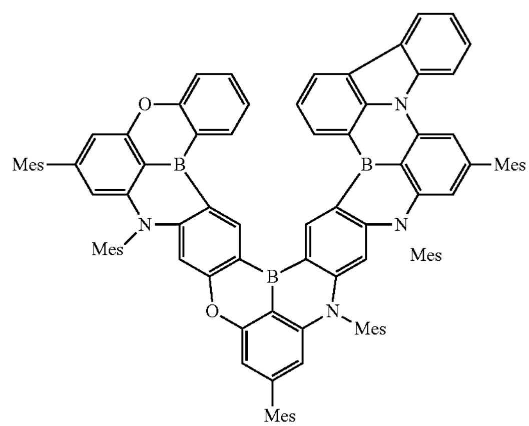
(1-8-104)
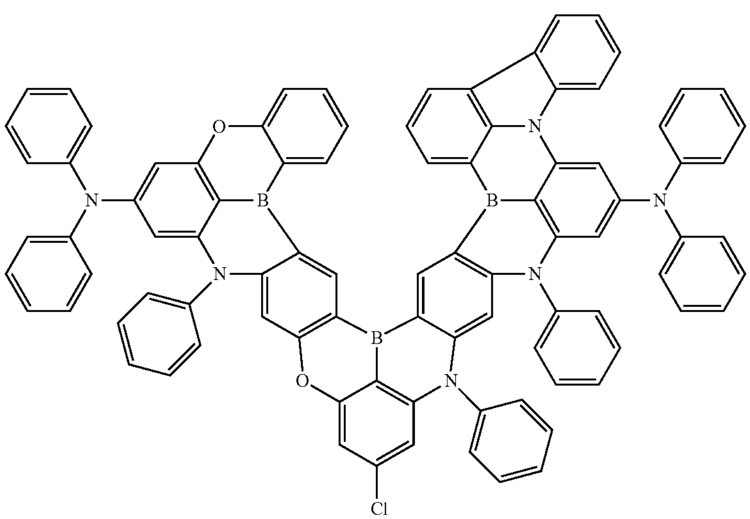

-continued
(1-8-105)
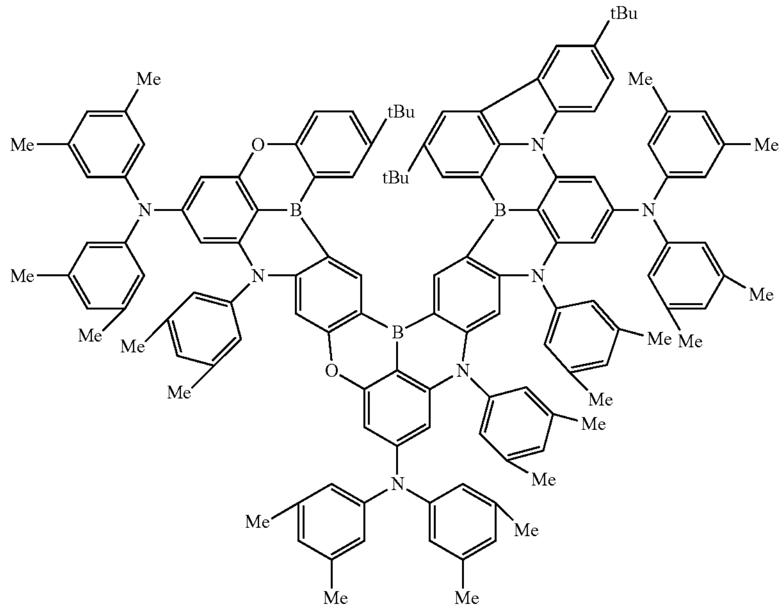
(1-8-106)
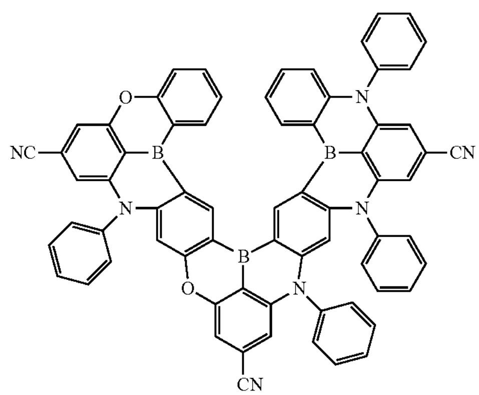
(1-8-107)
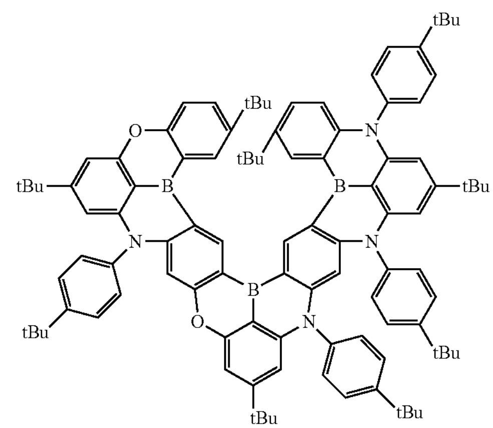
(1-8-108)
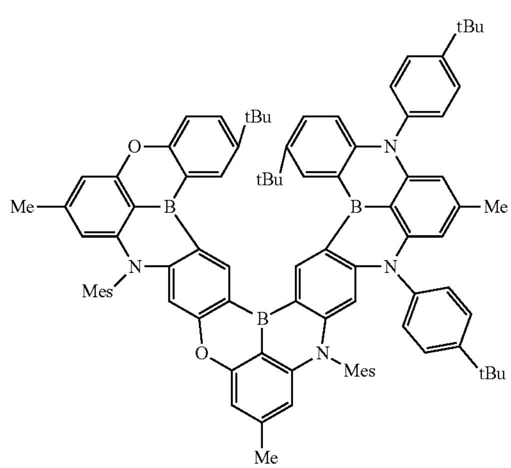
(1-8-109)
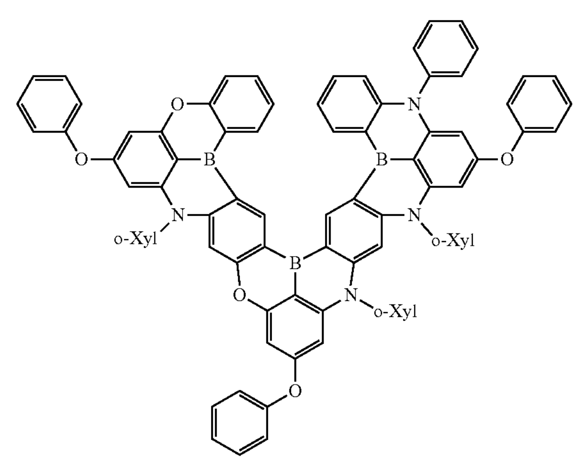

-continued
(1-8-110)
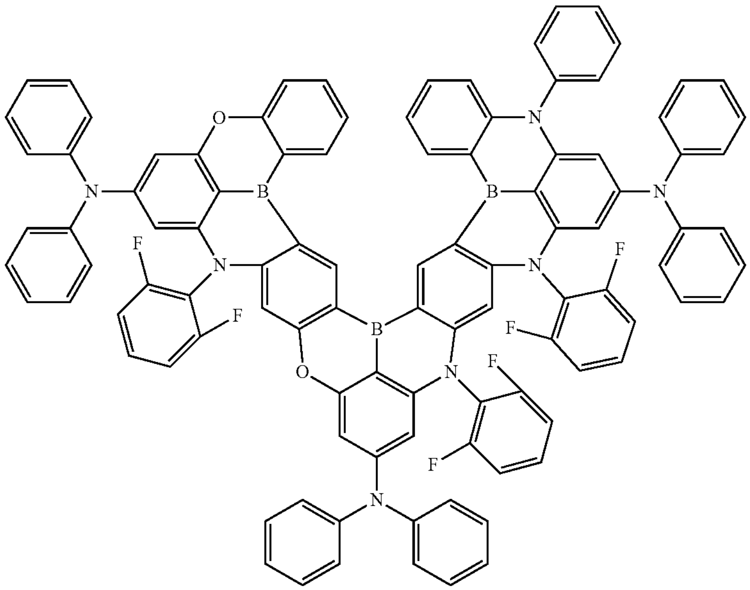
(1-8-121)
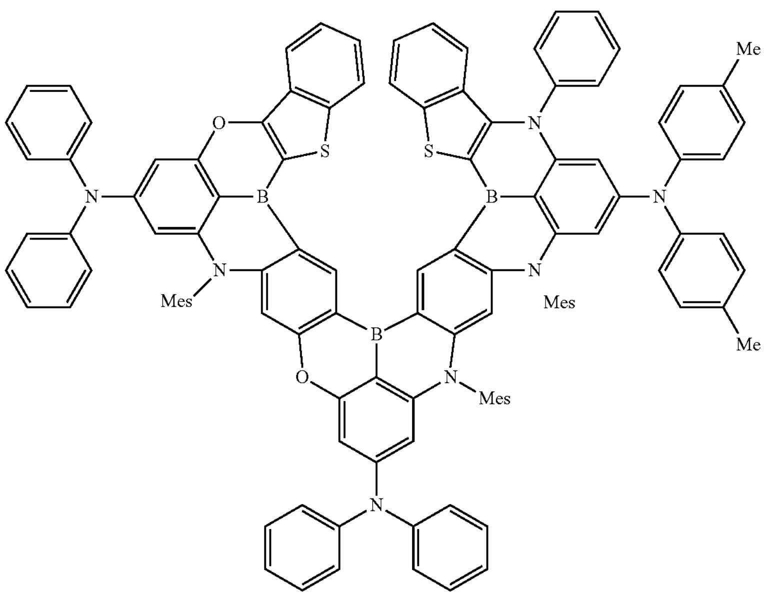
(1-8-122)
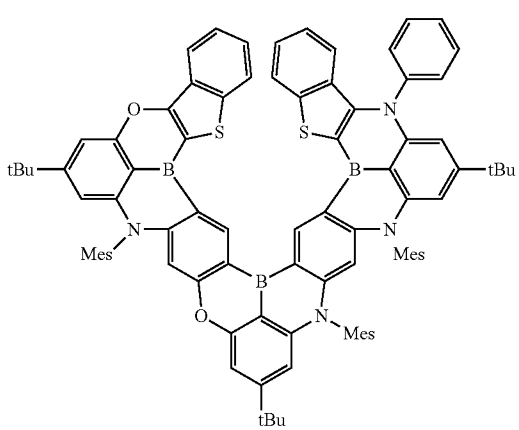
(1-8-123)
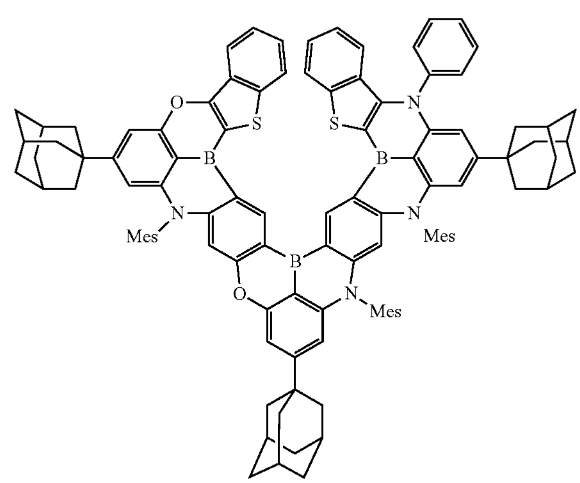

-continued
(1-8-124)
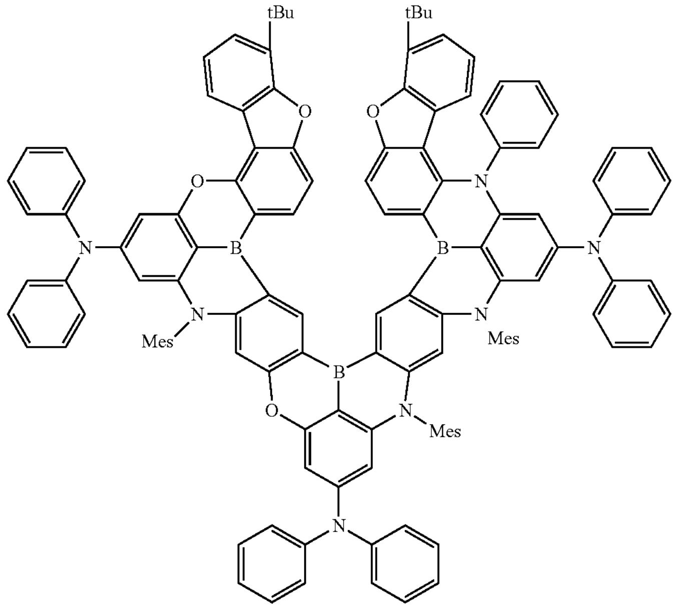
(1-8-125)
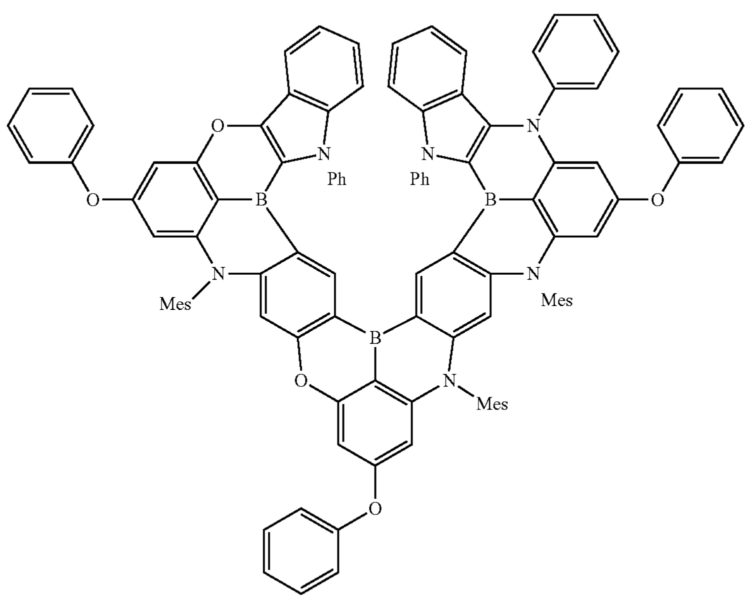

-continued
(1-8-126)
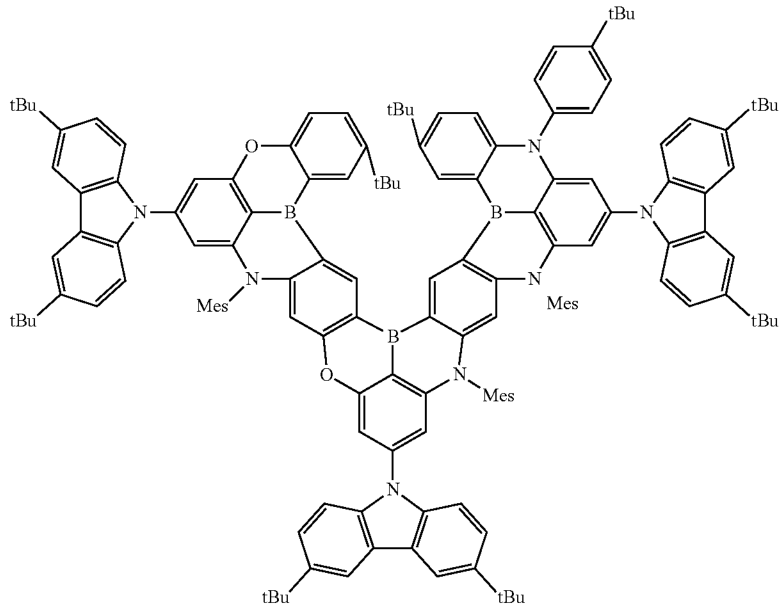
(1-8-127)
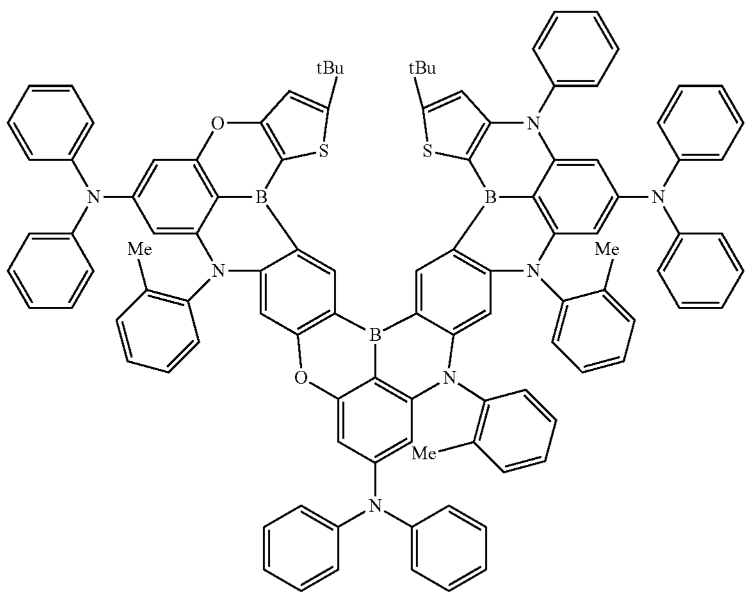
(1-8-128)
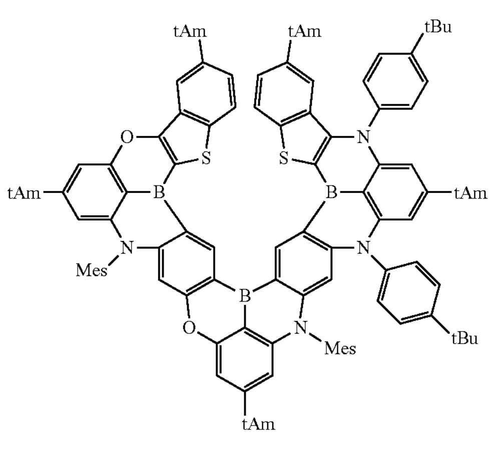
(1-8-129)
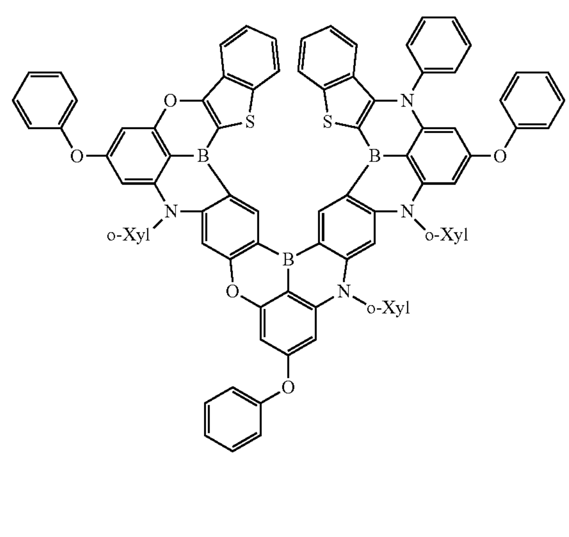

-continued
(1-8-130)
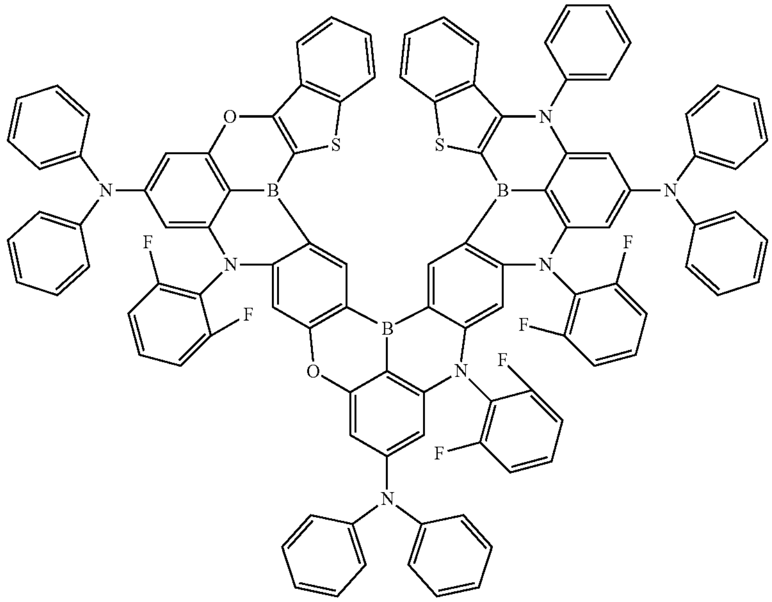
(1-8-141)
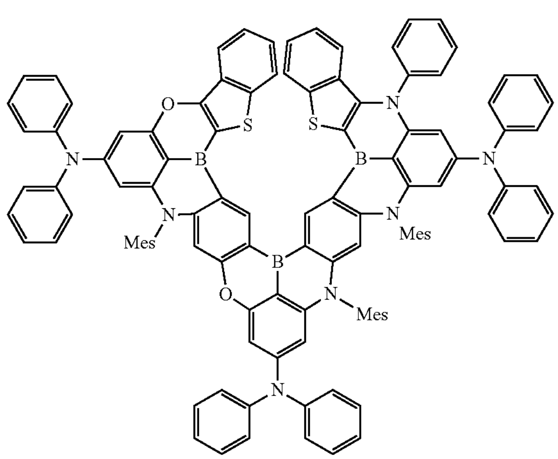
(1-8-142)
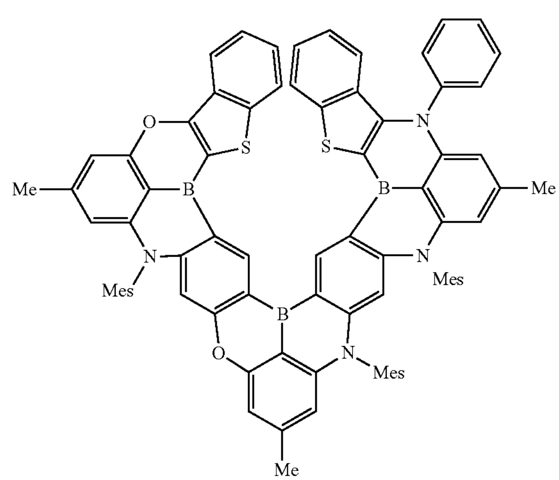

-continued
(1-8-143)
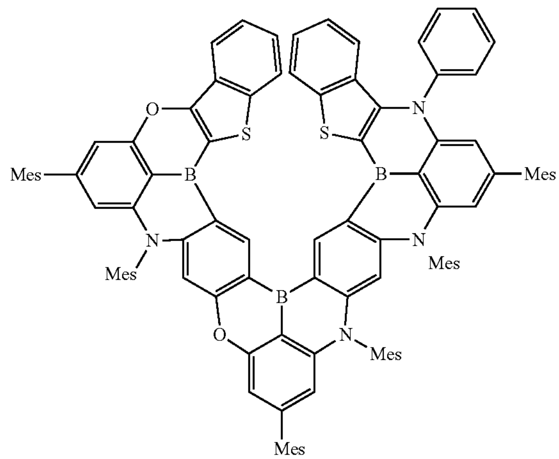
(1-8-144)
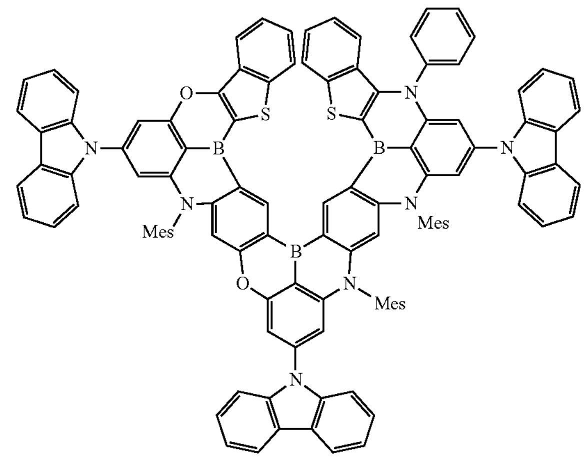
(1-8-145)
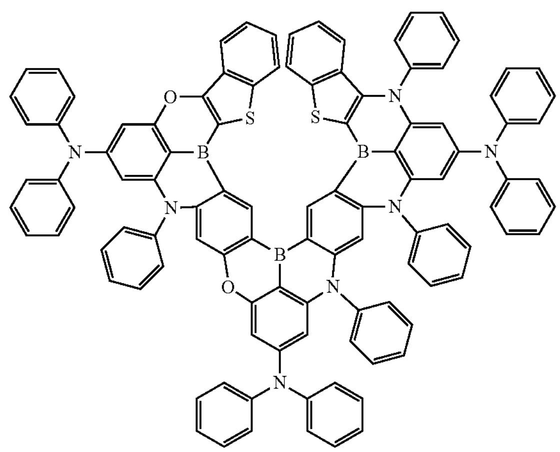
(1-8-146)
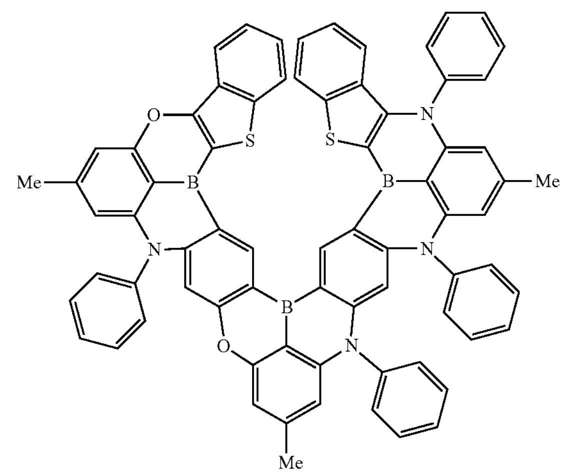
(1-8-147)
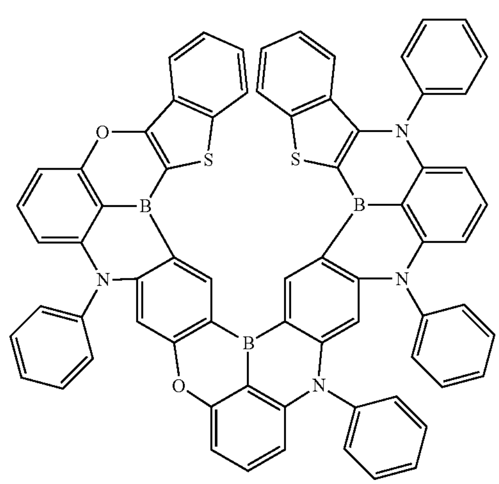
(1-8-148)
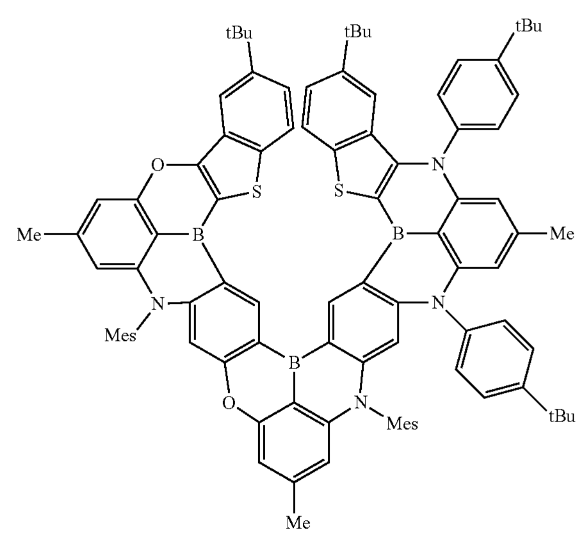

-continued
(1-8-149)
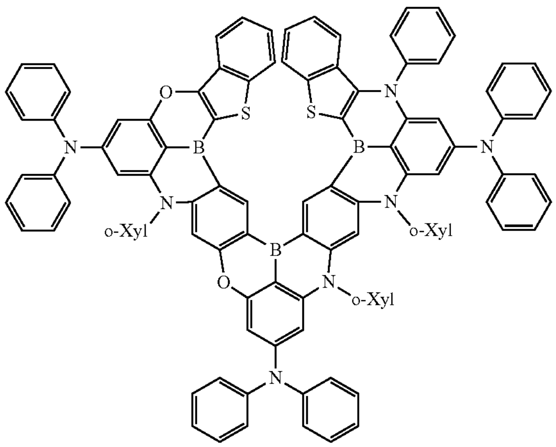
(1-8-150)
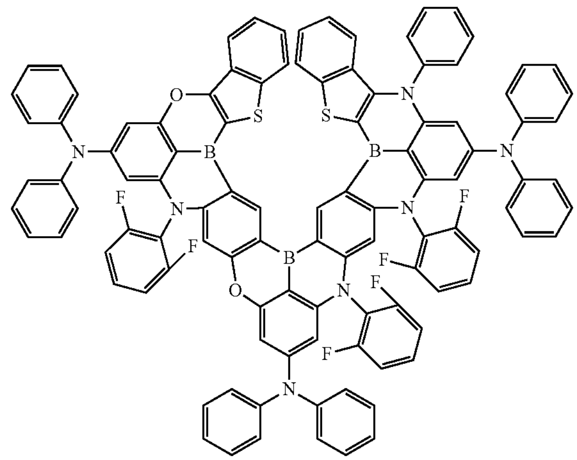
(1-8-161)
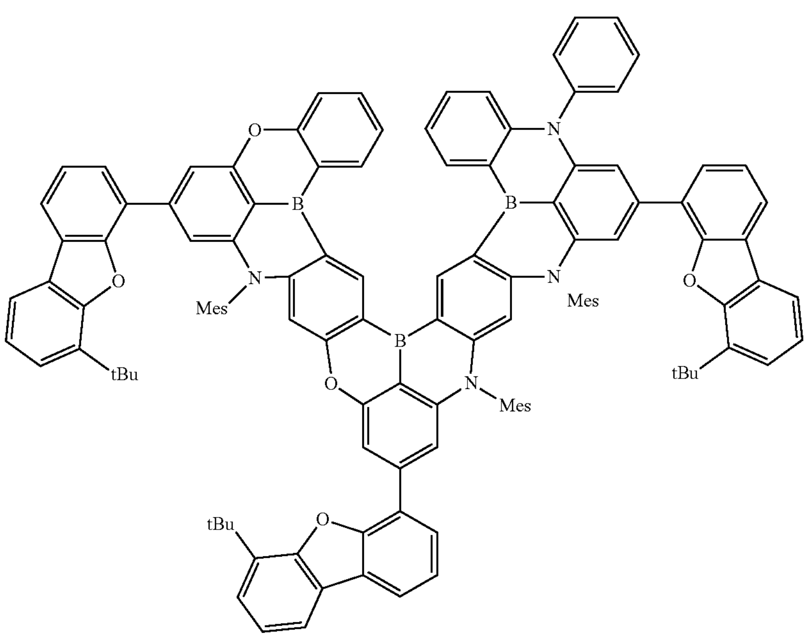

-continued
(1-8-162)
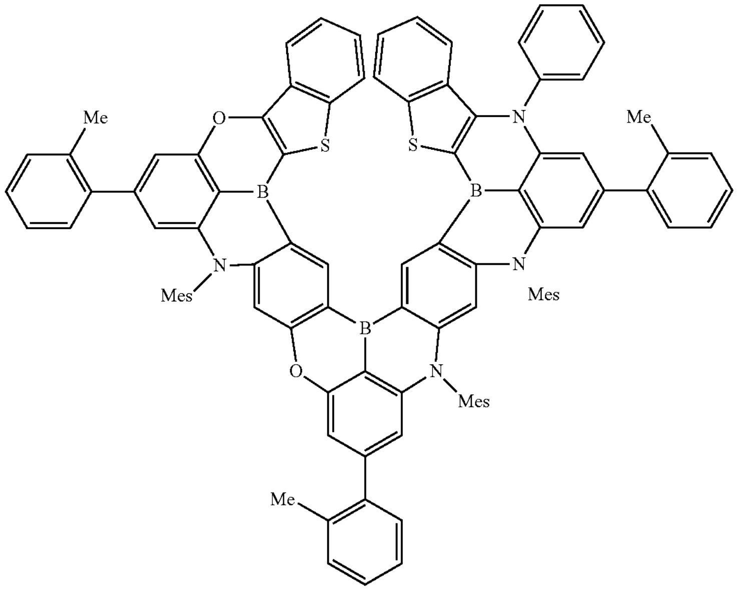
(1-8-163)
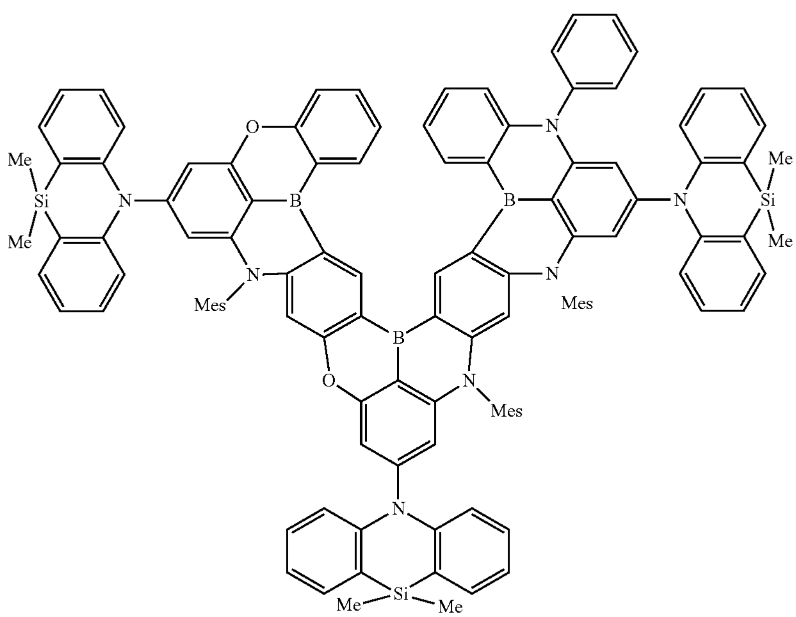

-continued
(1-8-164)
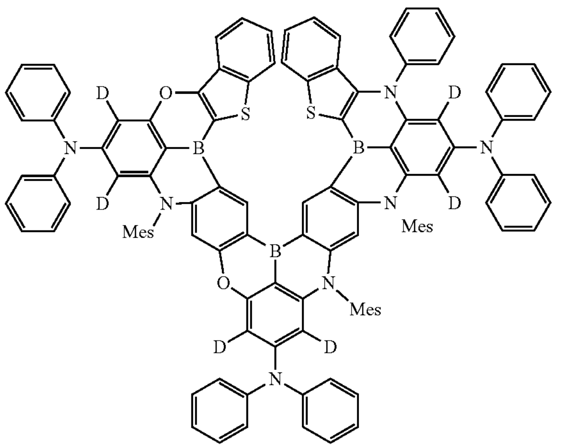
(1-8-165)
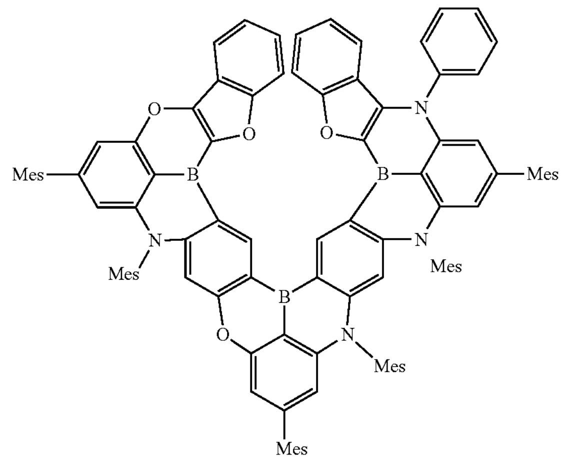
(1-8-166)
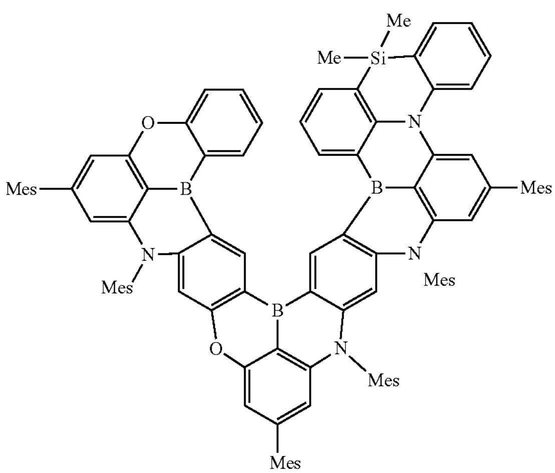
(1-8-167)
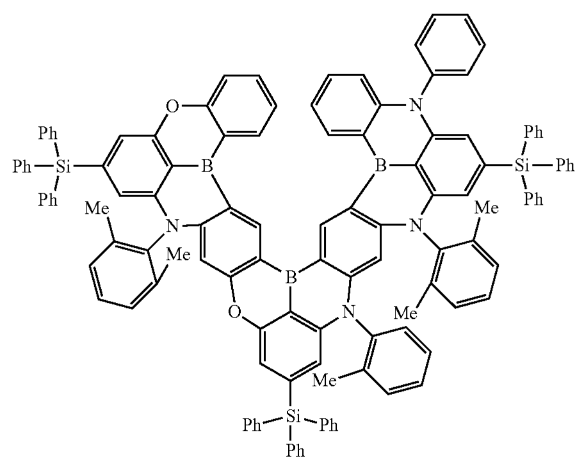
(1-8-168)
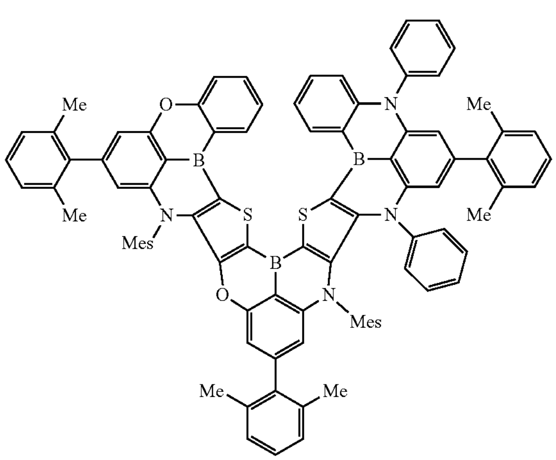
(1-8-169)
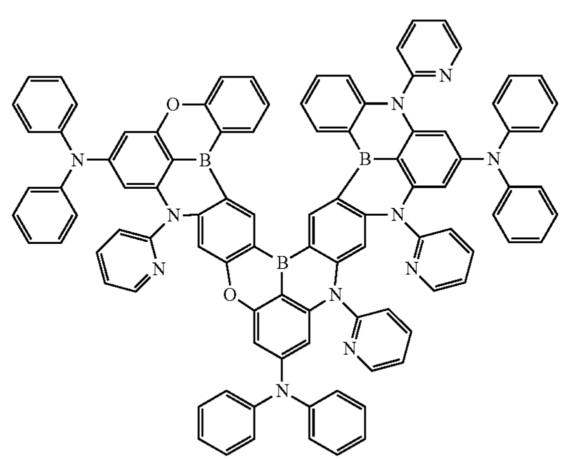

-continued
(1-8-170)
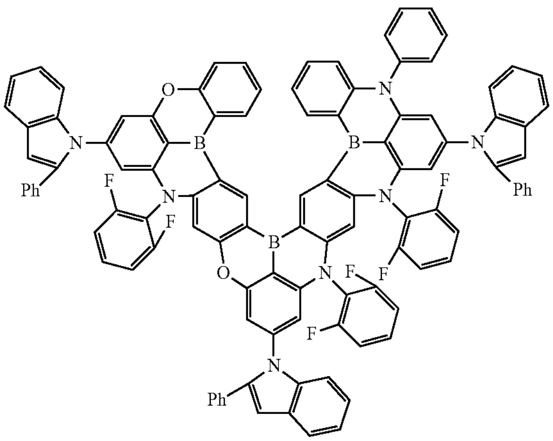
(1-8-191)
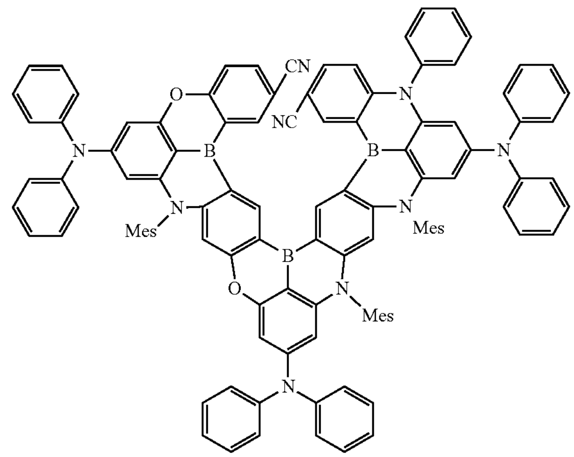
(1-8-192)
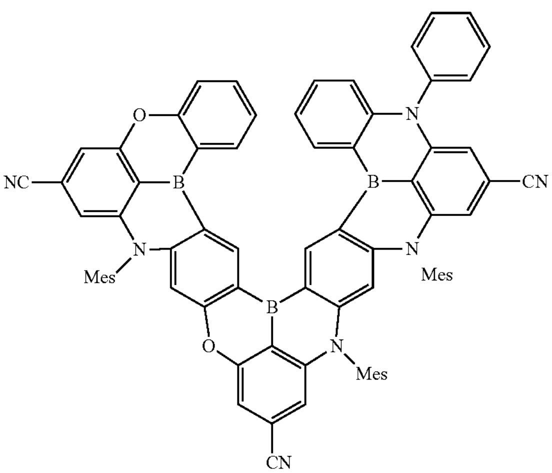
(1-8-193)
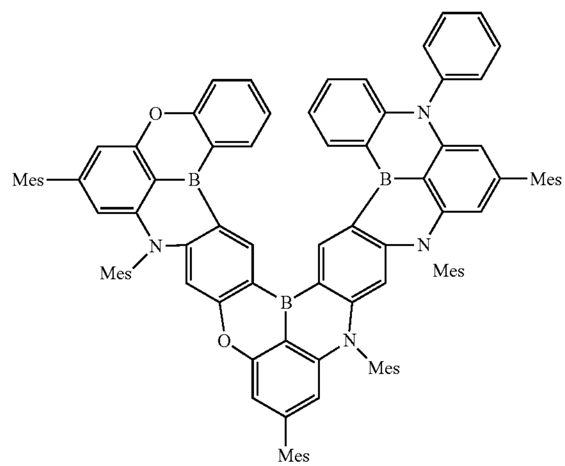
(1-8-194)
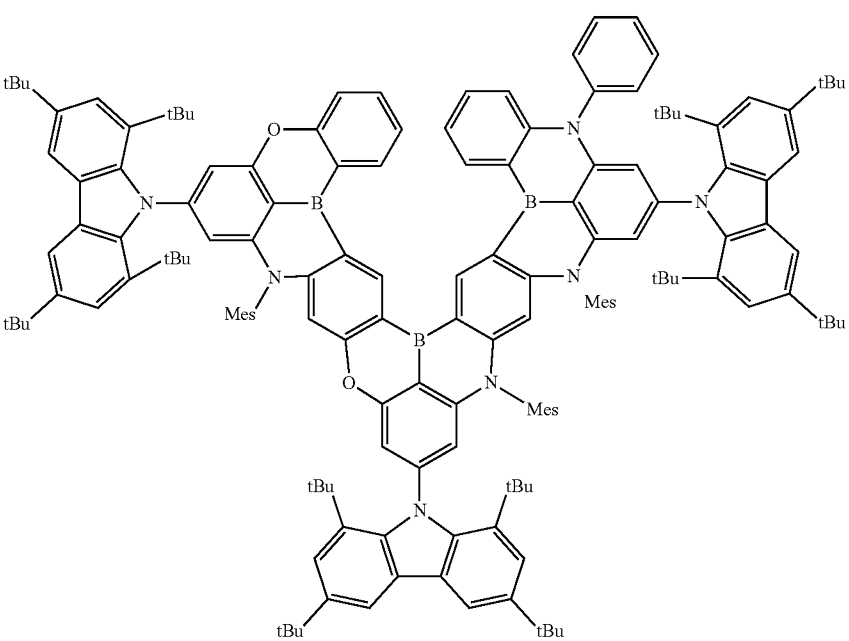

-continued
(1-8-195)
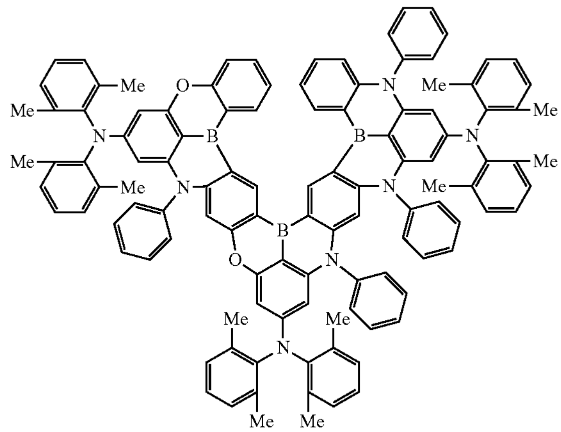
(1-8-196)
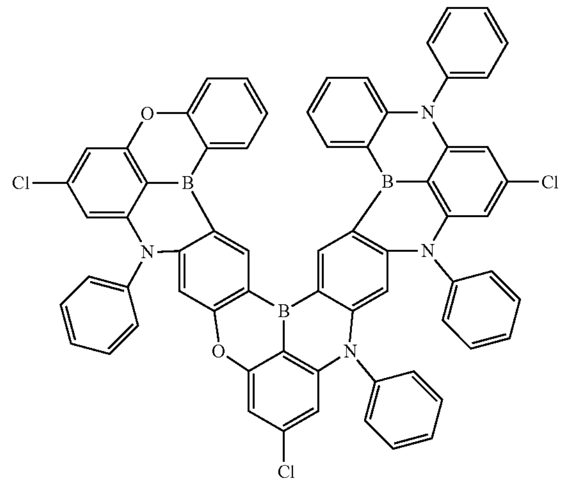
(1-8-197)
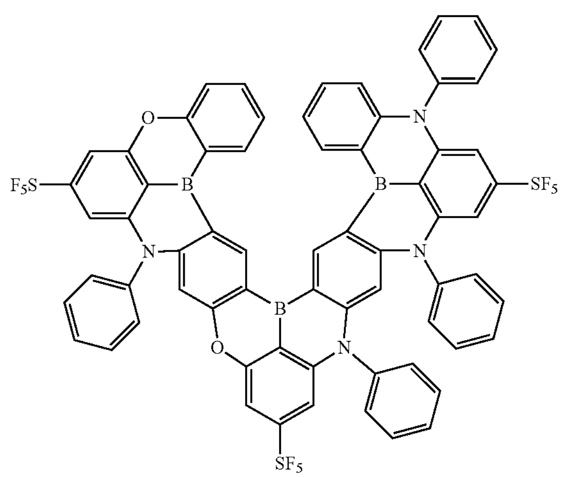
(1-8-198)
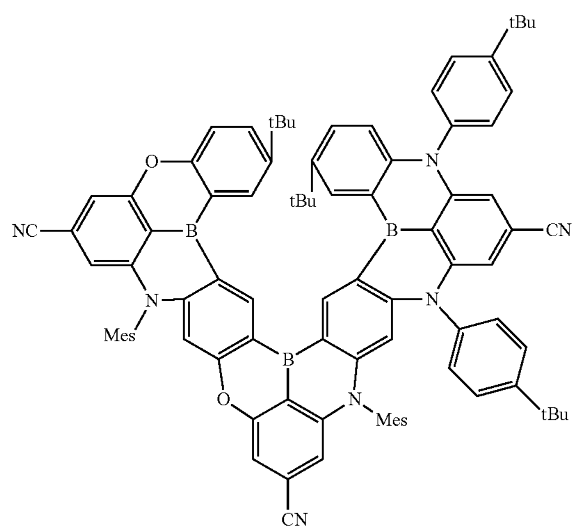
(1-8-199)
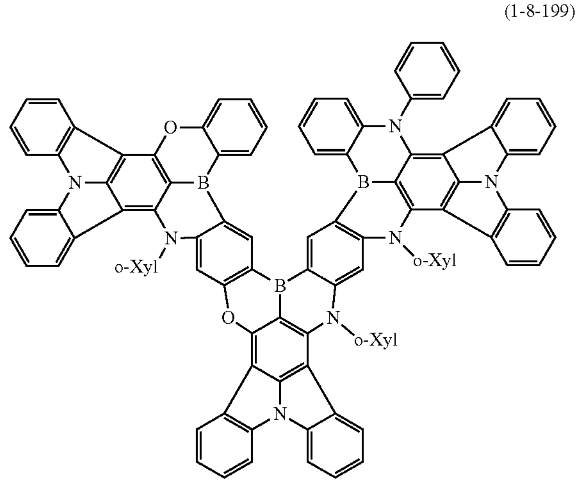
(1-8-200)
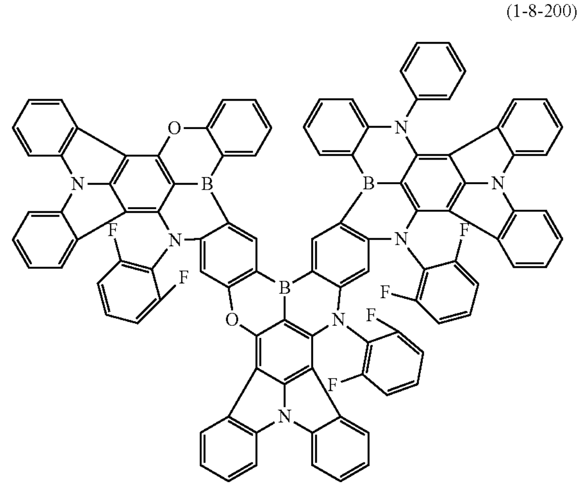

-continued
(1-8-221)
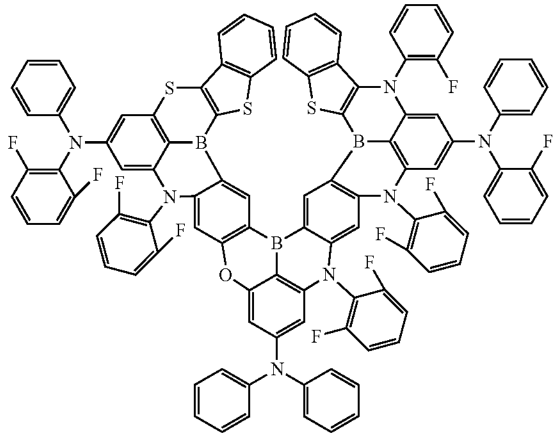
(1-8-222)
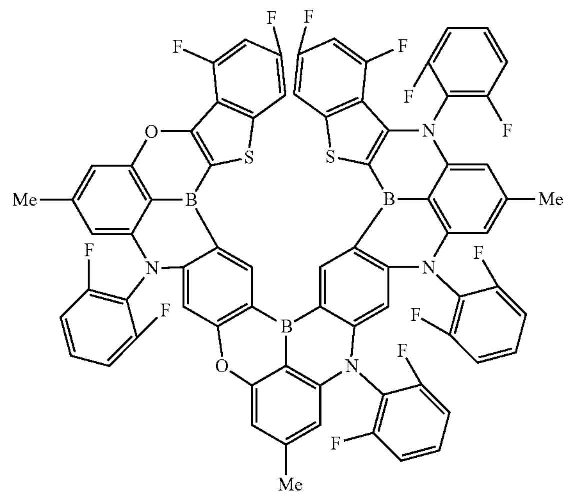
(1-8-223)
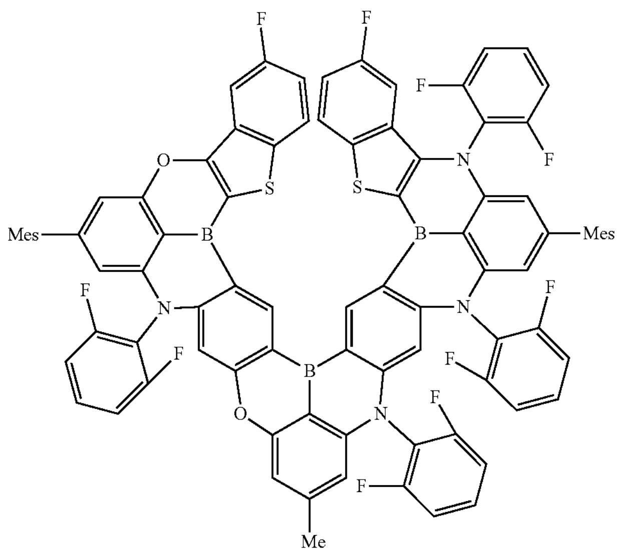
(1-8-224)
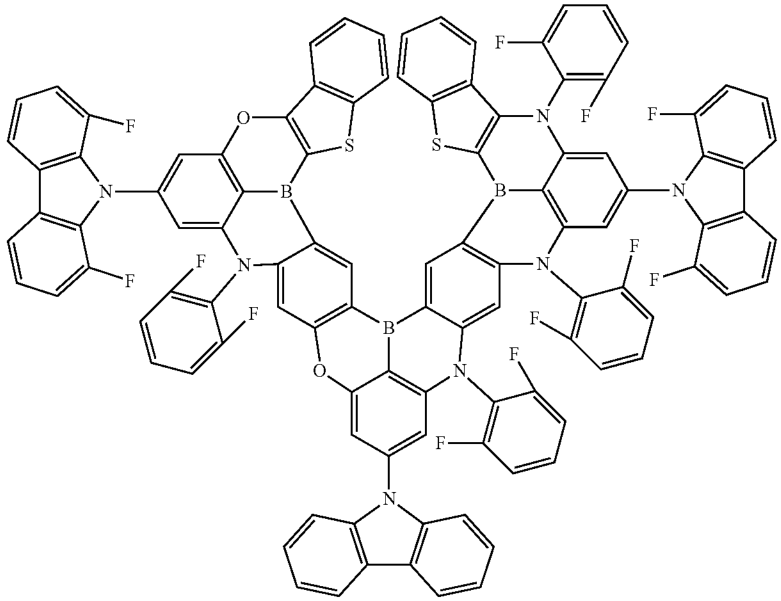

-continued
(1-8-225)
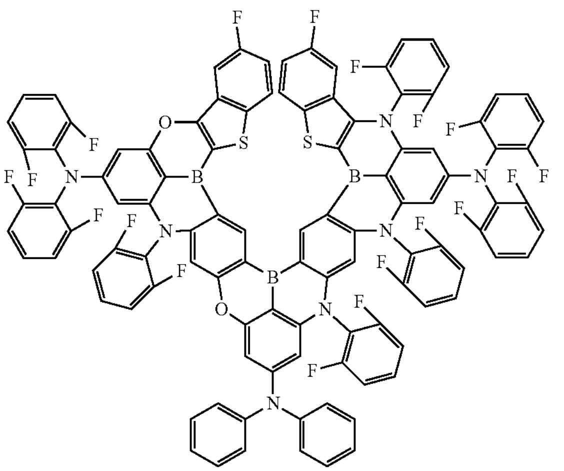
(1-8-226)
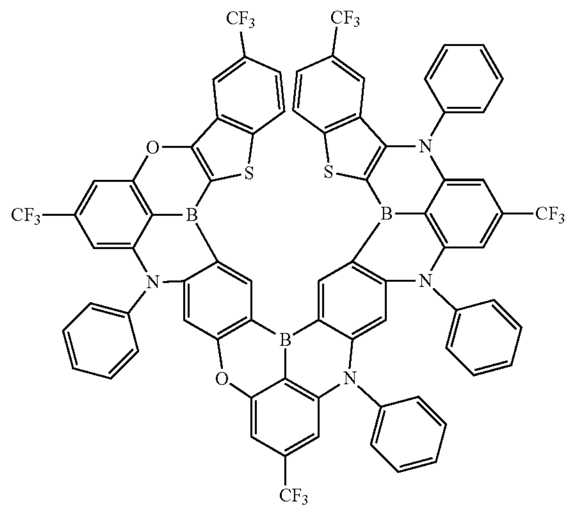
(1-8-227)
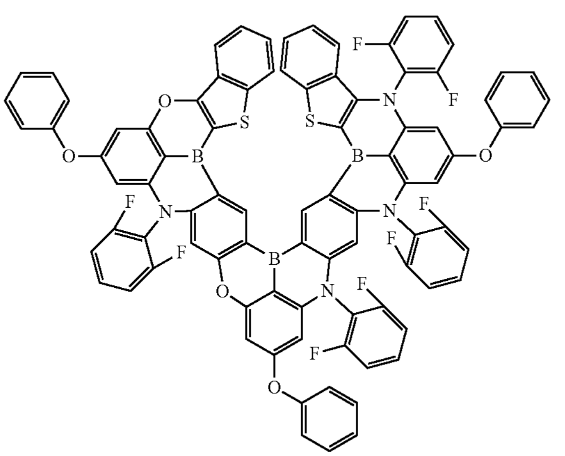
(1-8-228)
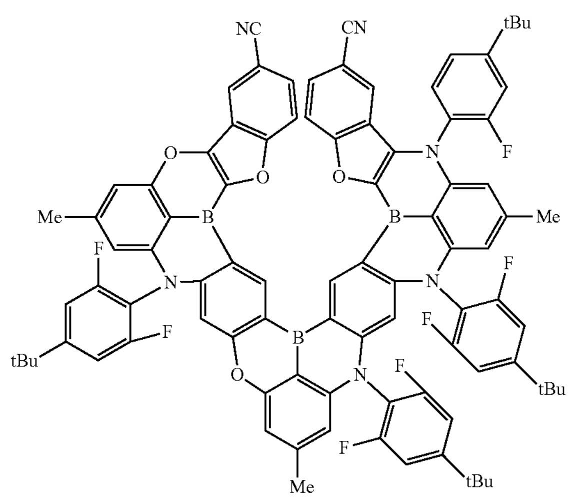
(1-8-229)
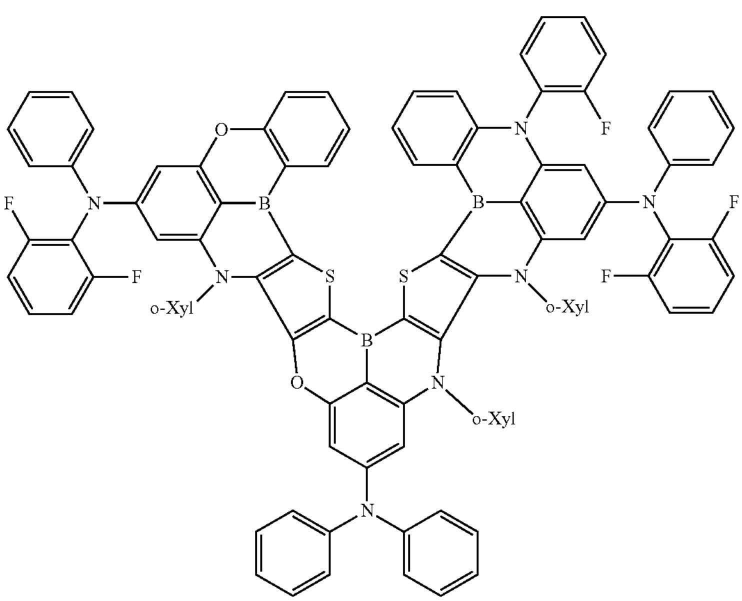

-continued
(1-8-230)
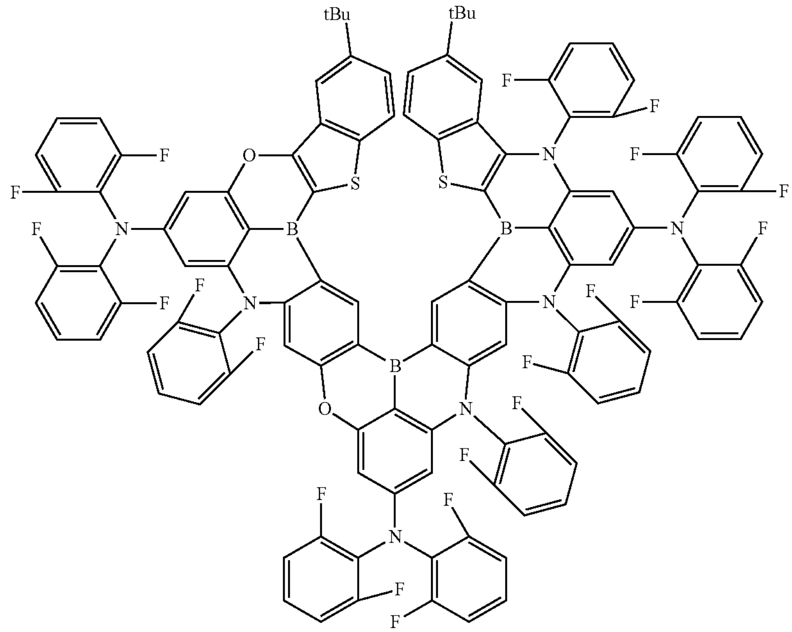
(1-9-1)
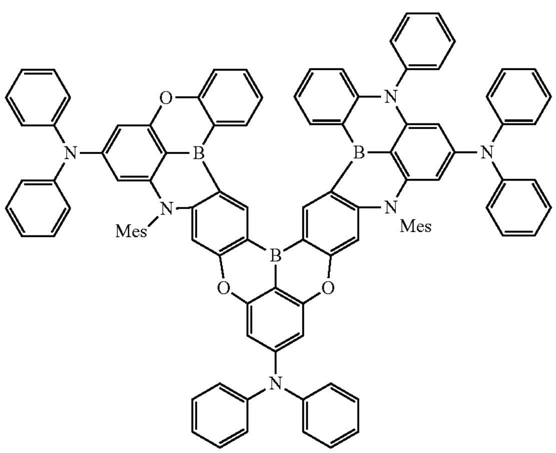
(1-9-2)
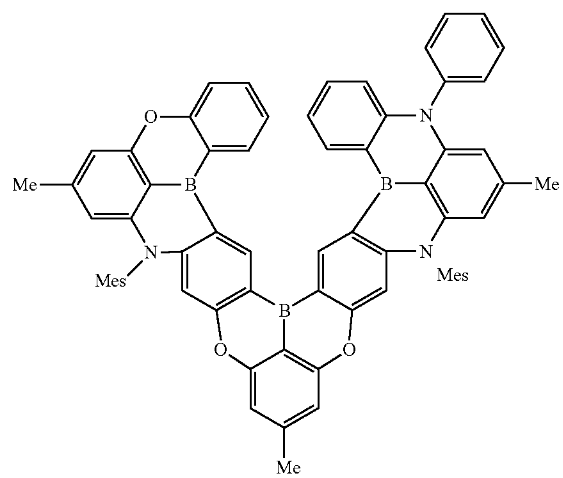
(1-9-3)
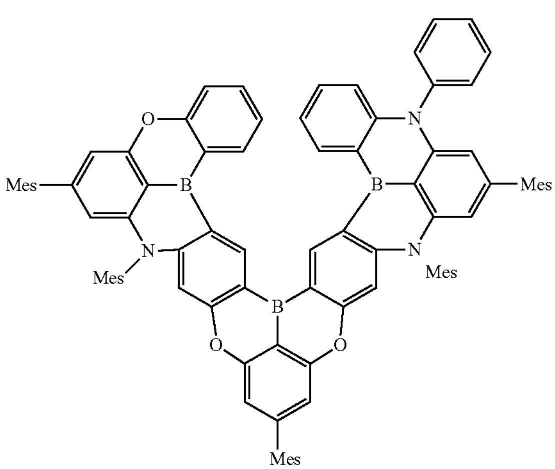
(1-9-4)
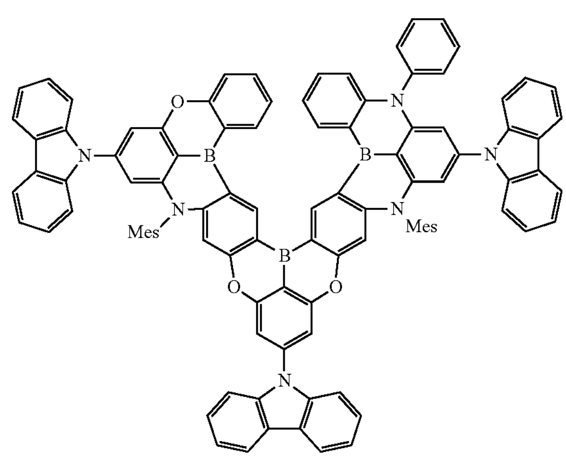

-continued
(1-9-5)
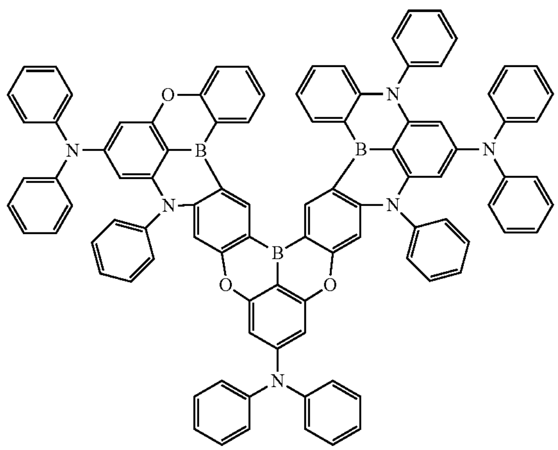
(1-9-6)
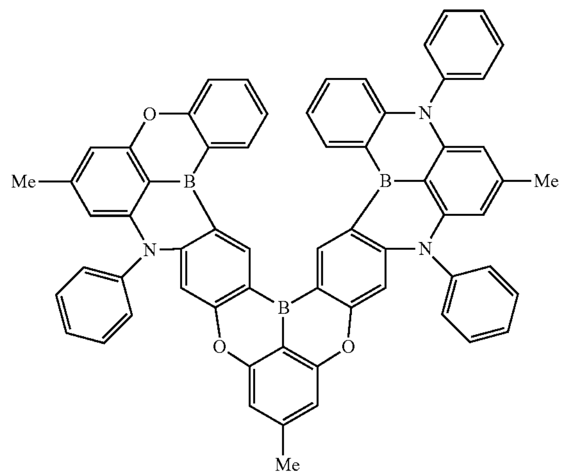
(1-9-7)
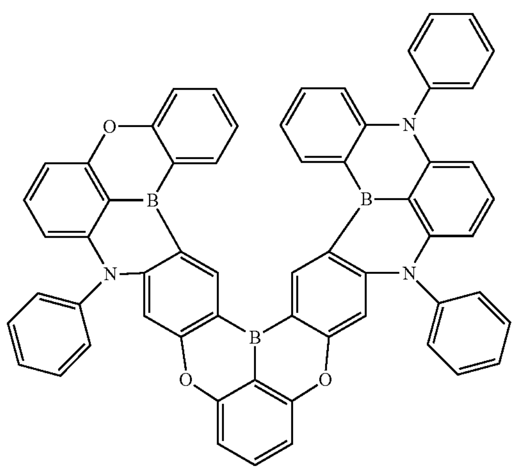
(1-9-8)
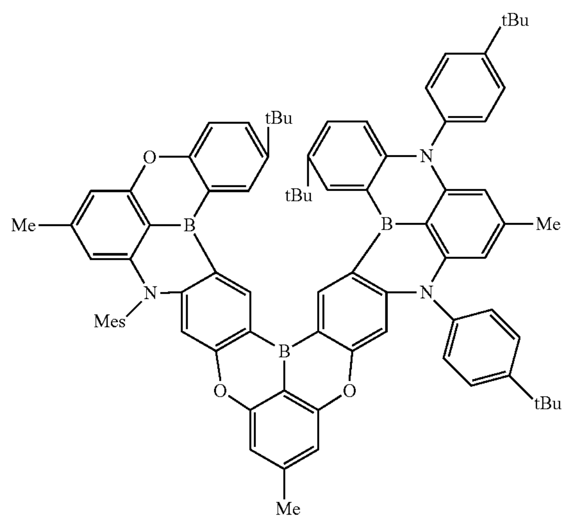
(1-9-9)
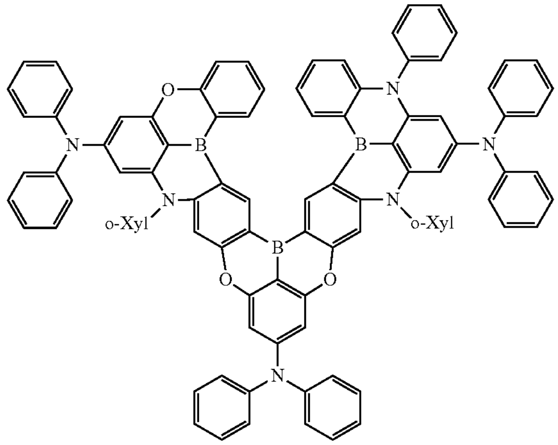
(1-9-10)
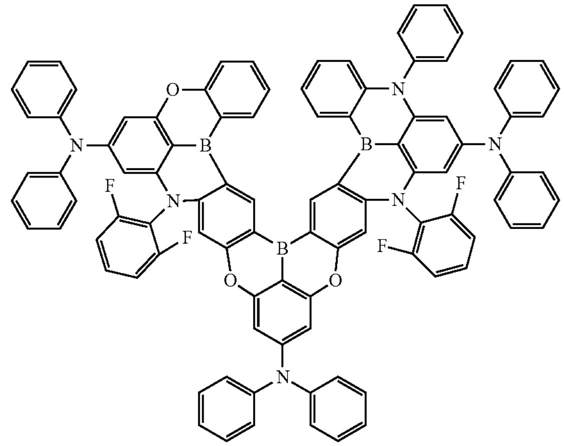

-continued
(1-9-21)
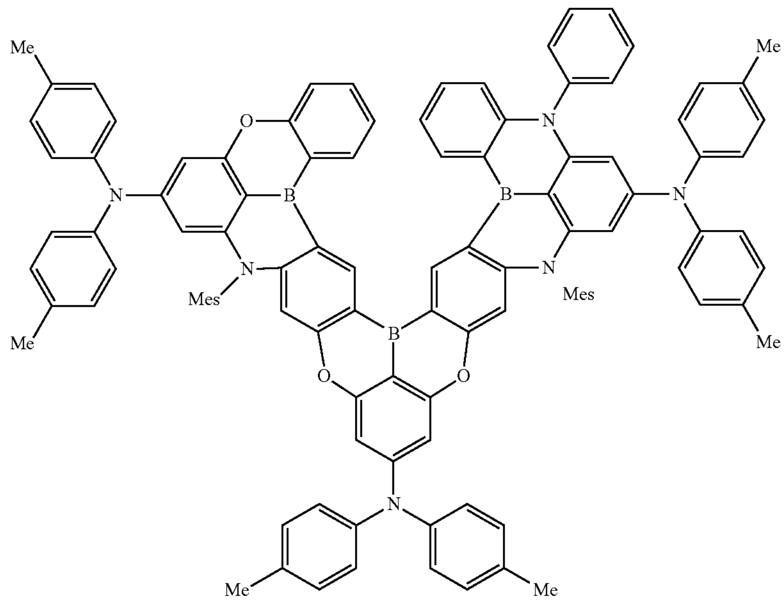
(1-9-22)
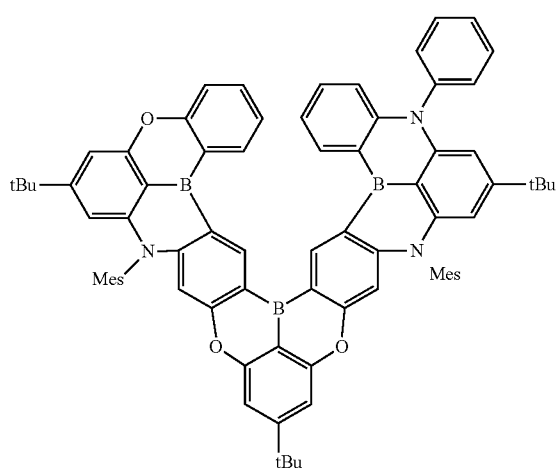
(1-9-23)
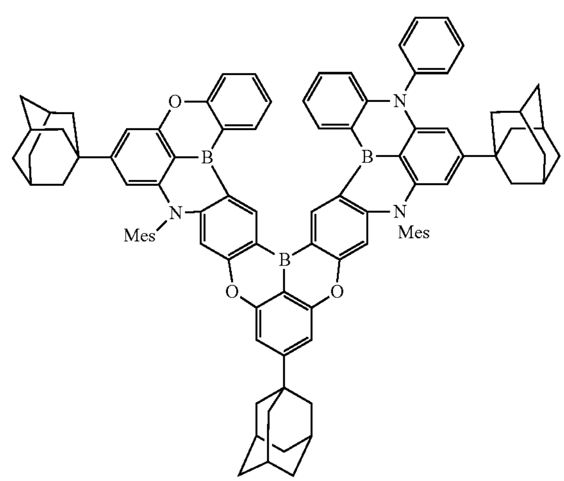

-continued
(1-9-24)
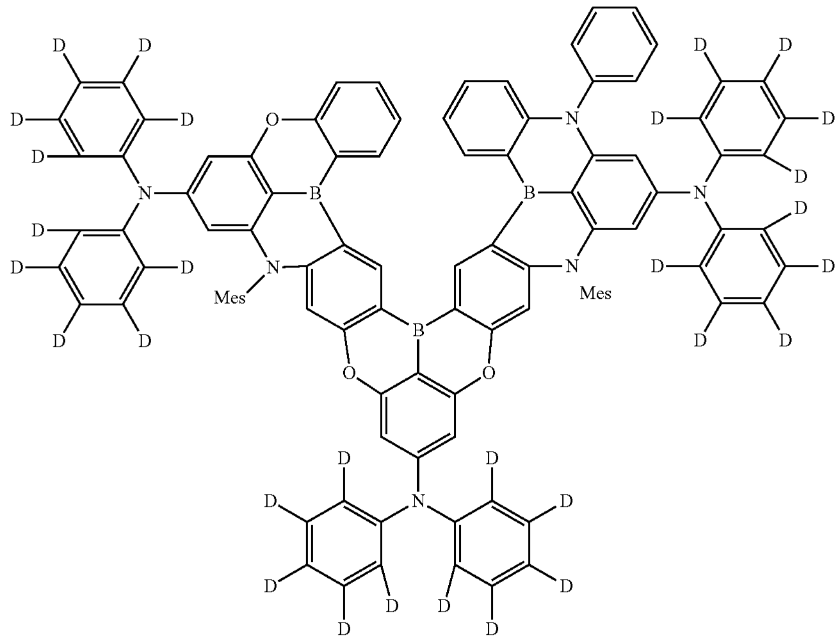
(1-9-25)
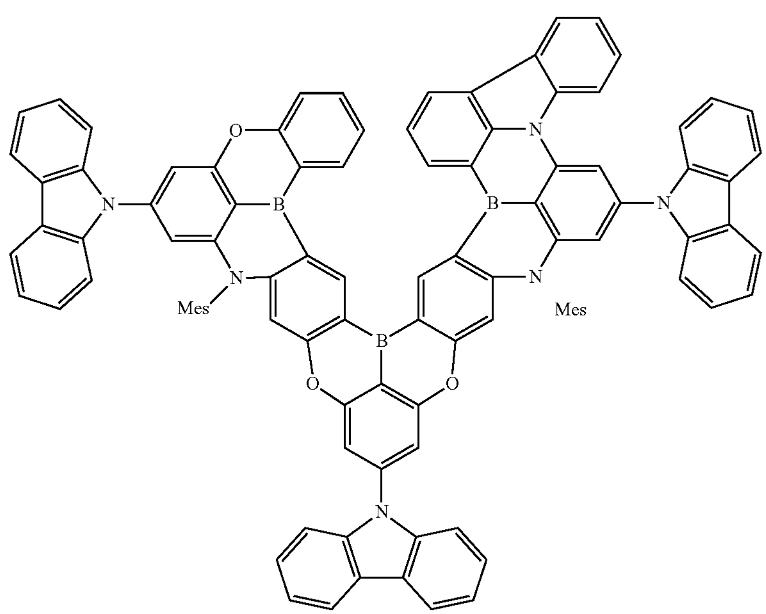

-continued
(1-9-26)
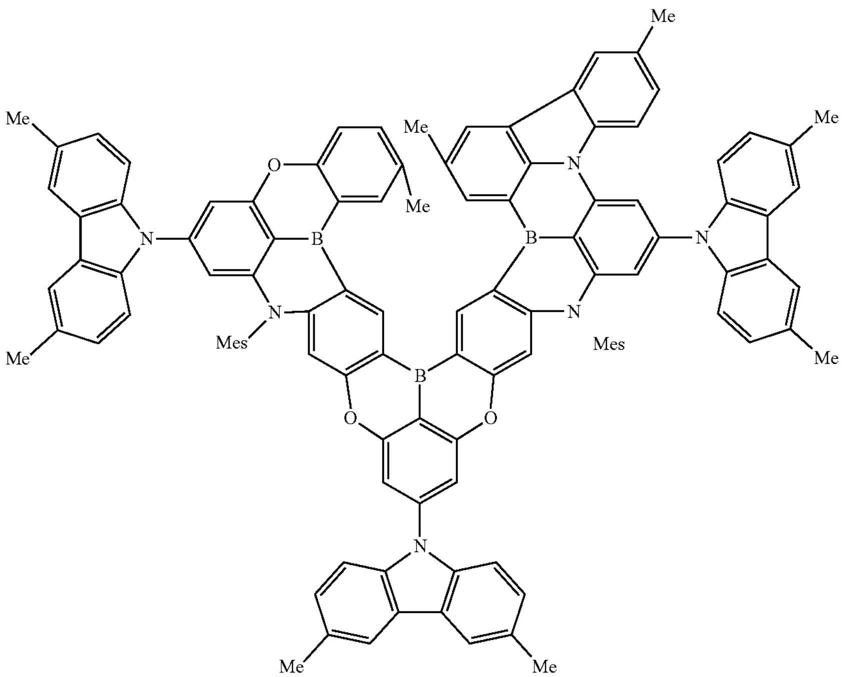
(1-9-27)
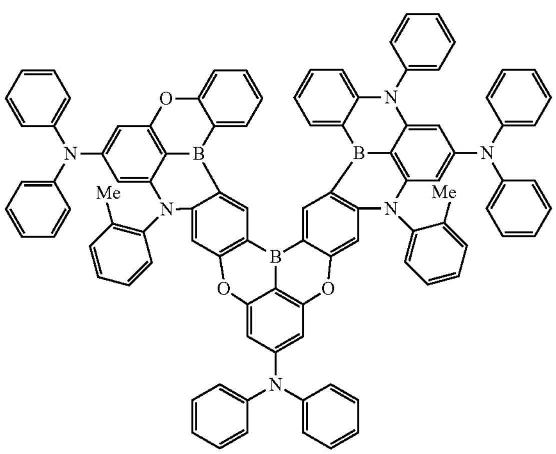
(1-9-28)
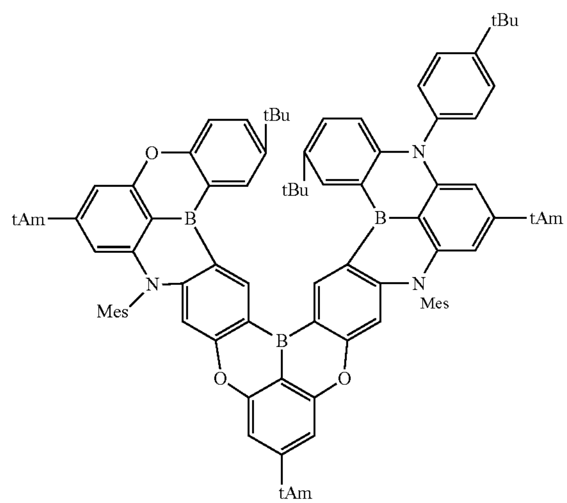
(1-9-29)
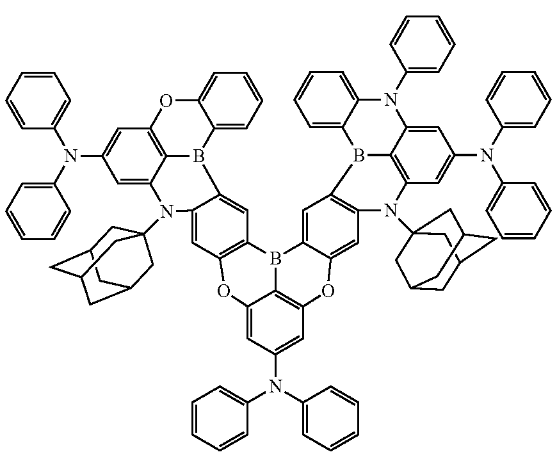
(1-9-30)
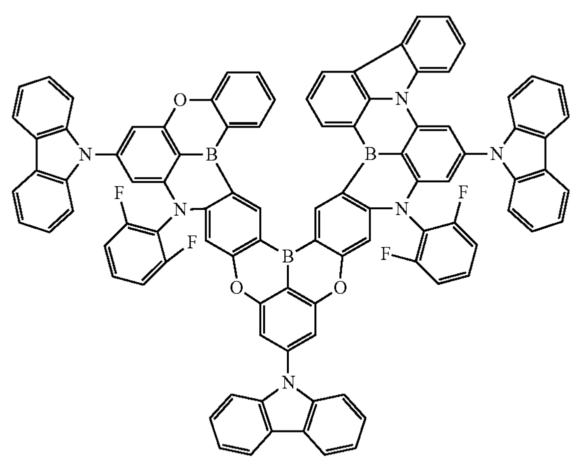

-continued
(1-9-41)
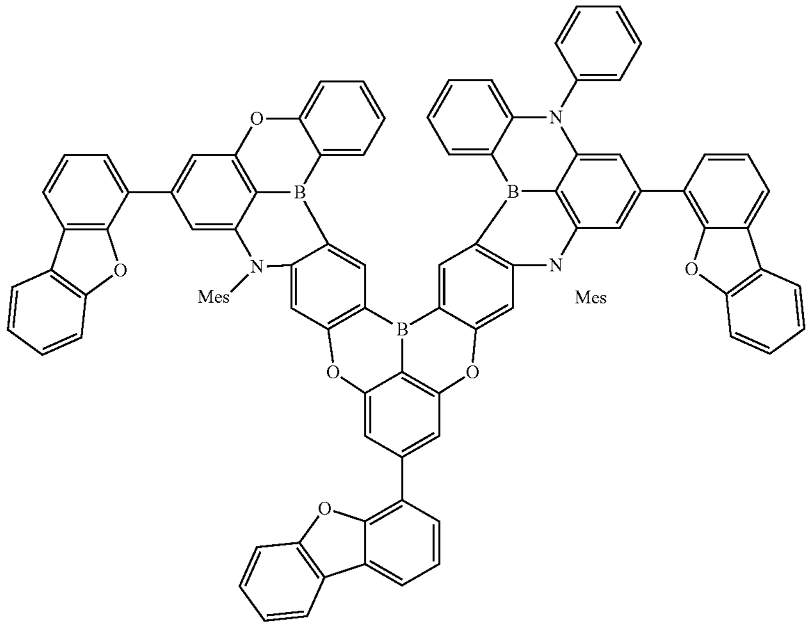
(1-9-42)
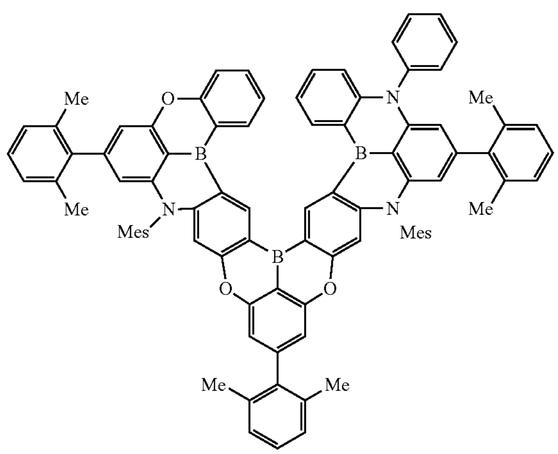
(1-9-43)
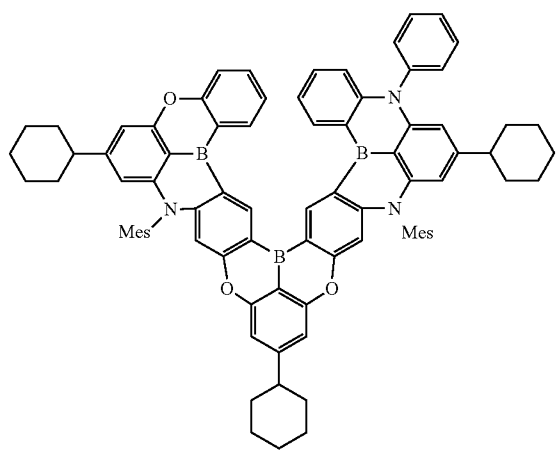
(1-9-44)
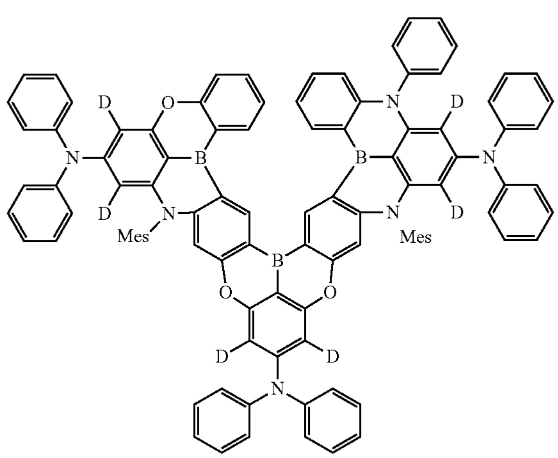
(1-9-45)
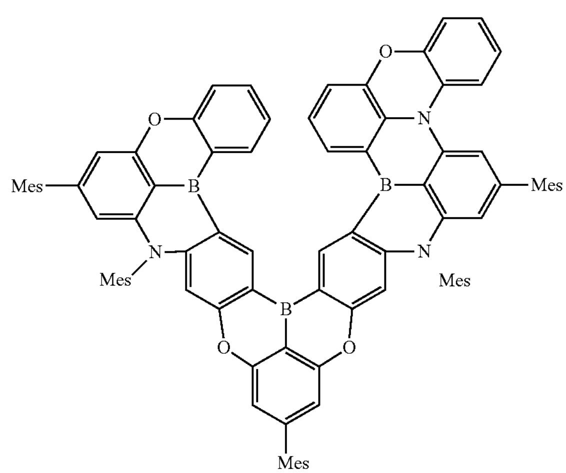

-continued
(1-9-46)
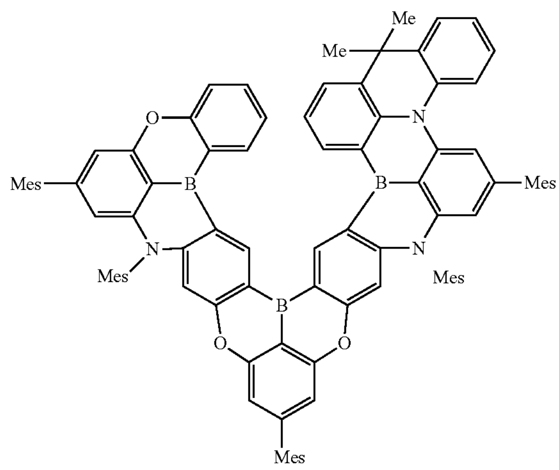
(1-9-47)
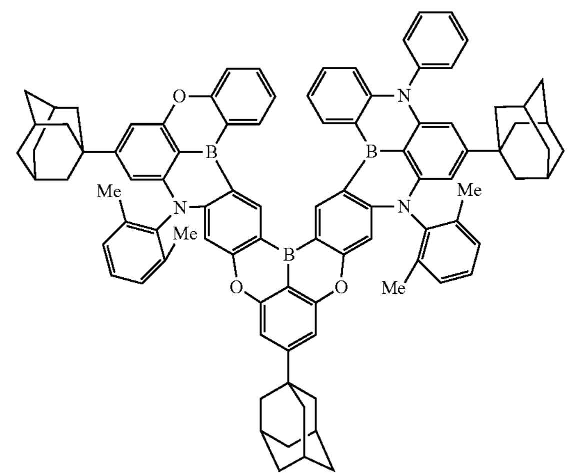
(1-9-48)
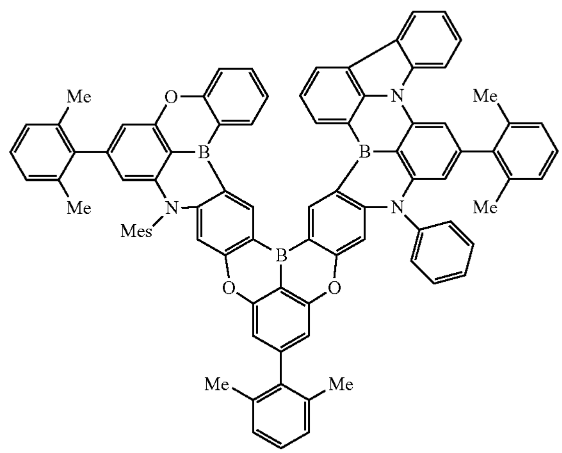
(1-9-49)
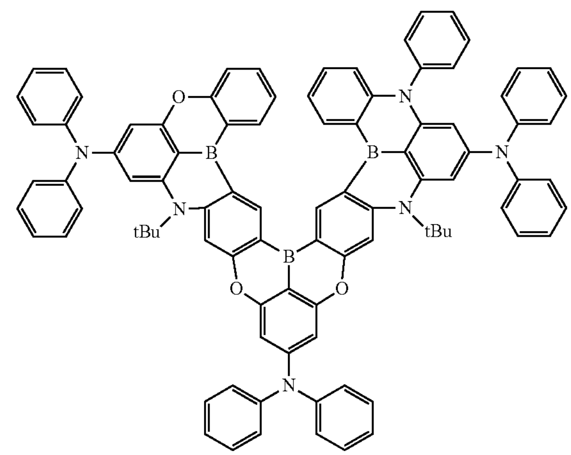
(1-9-50)
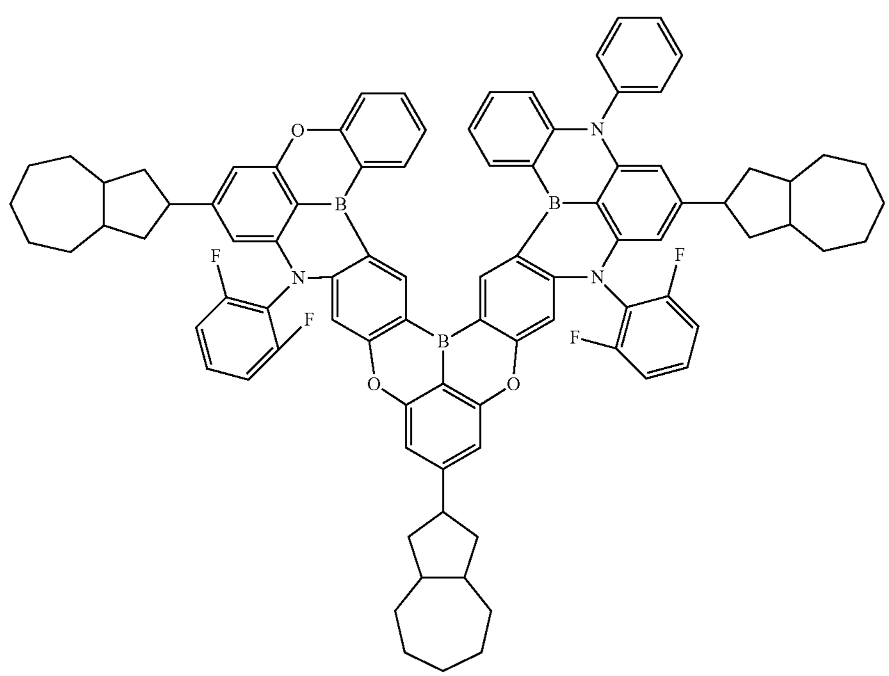

-continued
(1-9-101)
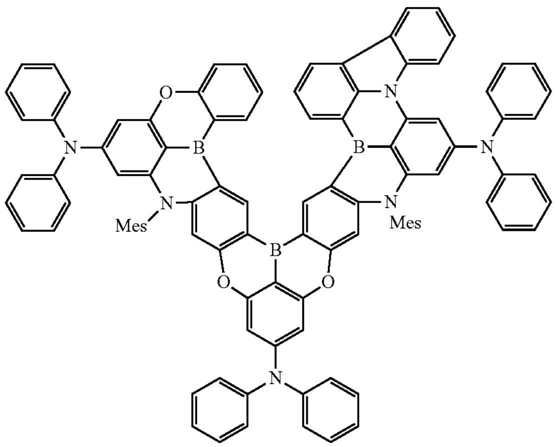
(1-9-102)
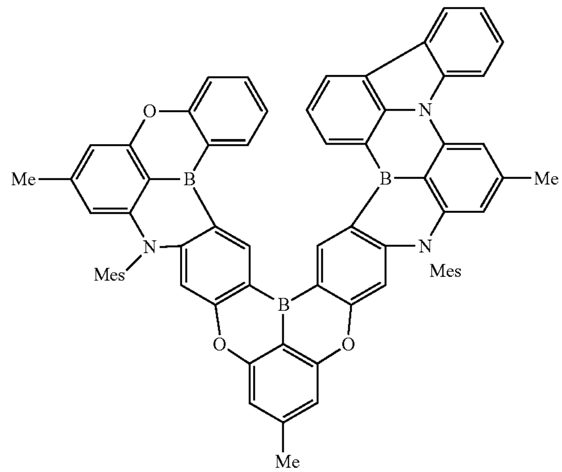
(1-9-103)
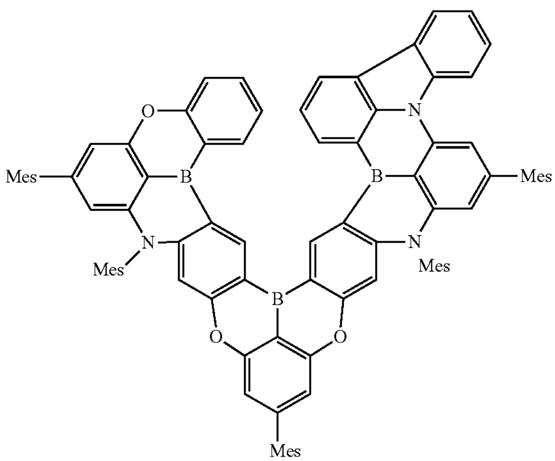
(1-9-104)
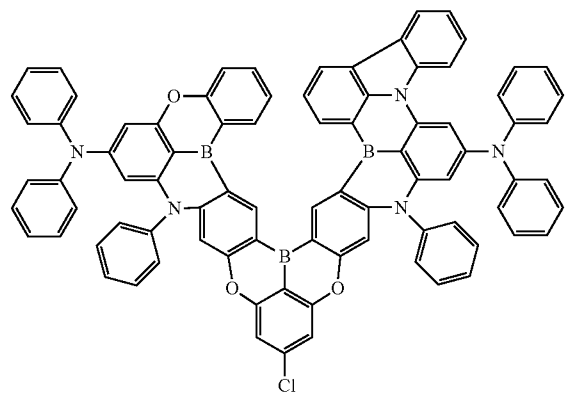
(1-9-105)
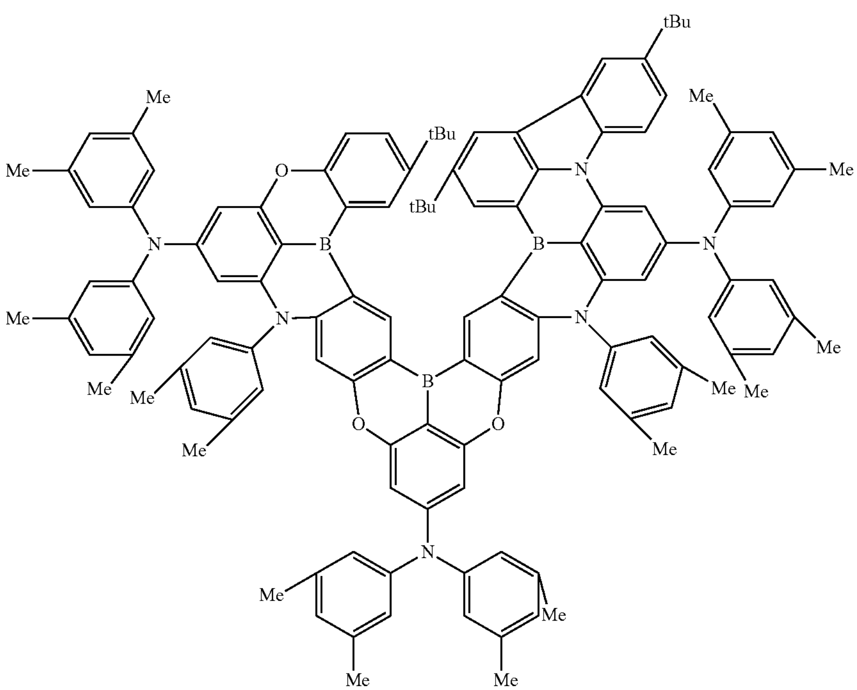

-continued
(1-9-106)
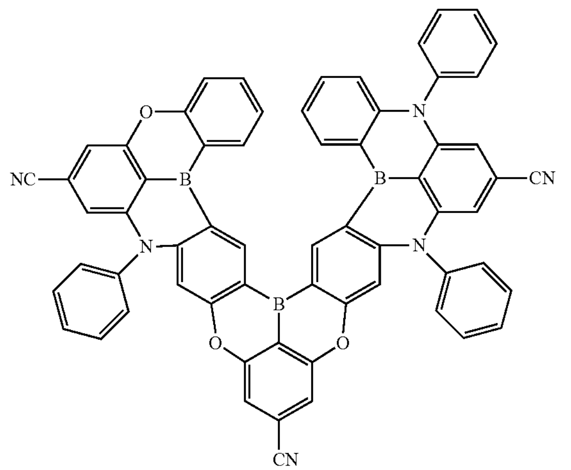
(1-9-107)
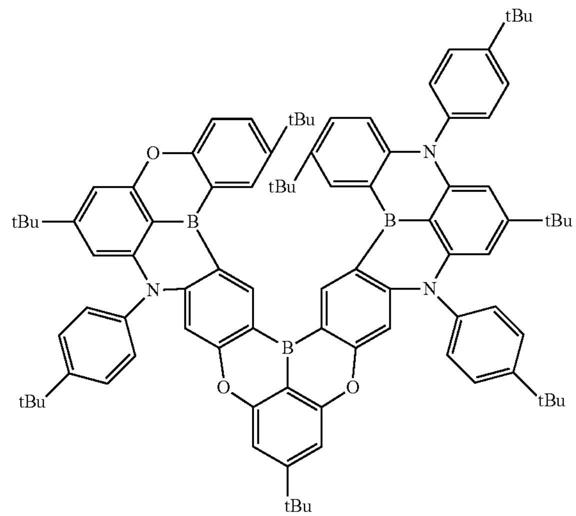
(1-9-108)
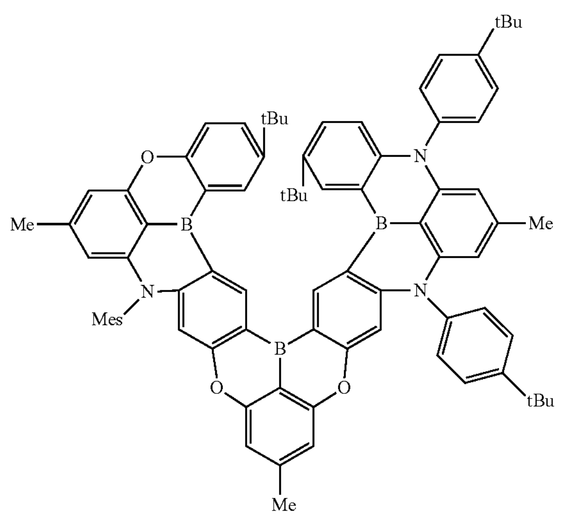
(1-9-109)
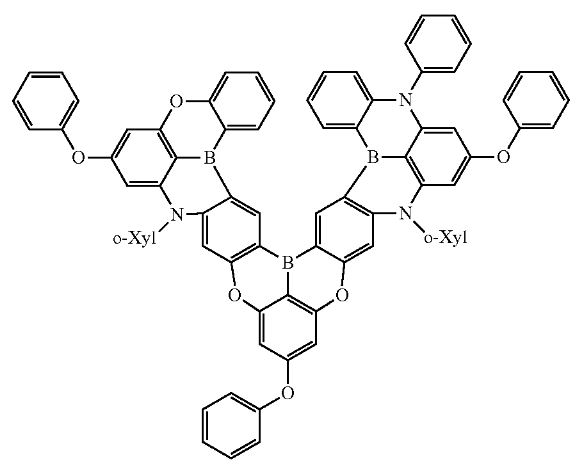
(1-9-110)
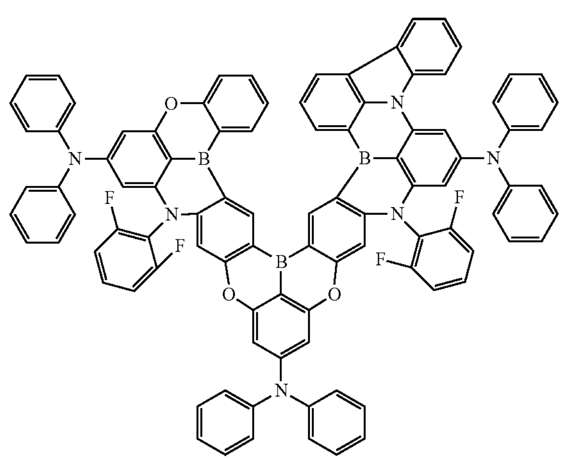
(1-9-121)
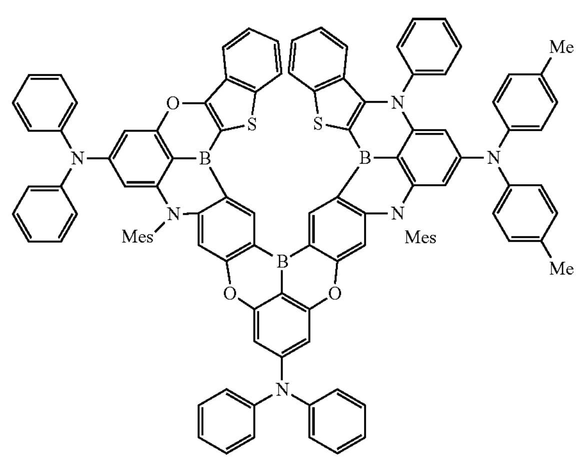

-continued
(1-9-122)
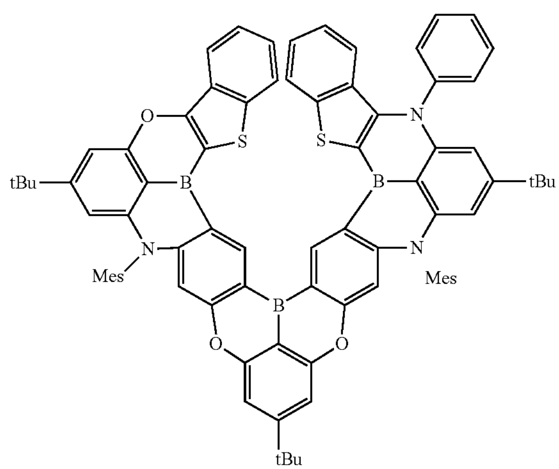
(1-9-123)
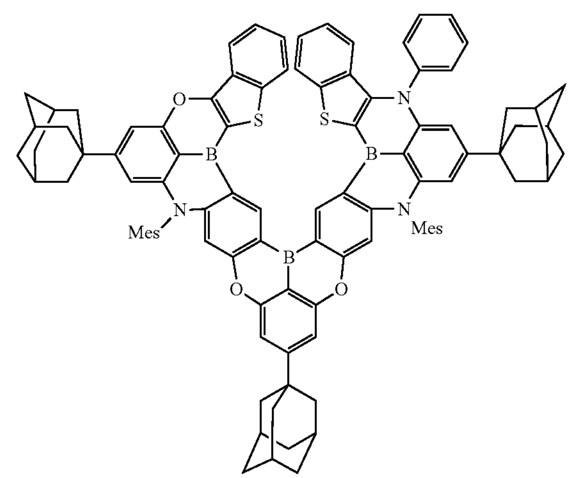
(1-9-124)
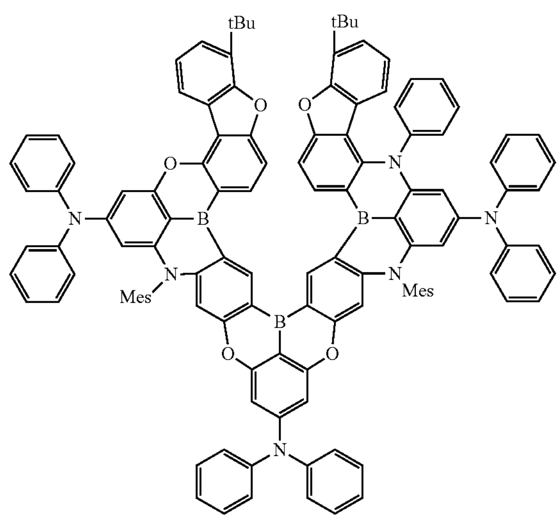
(1-9-125)
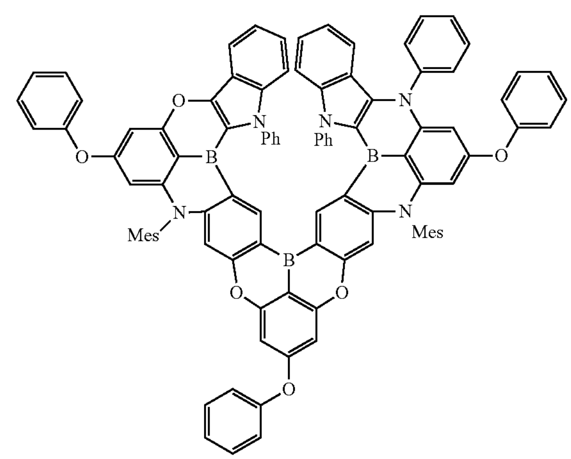
(1-9-126)
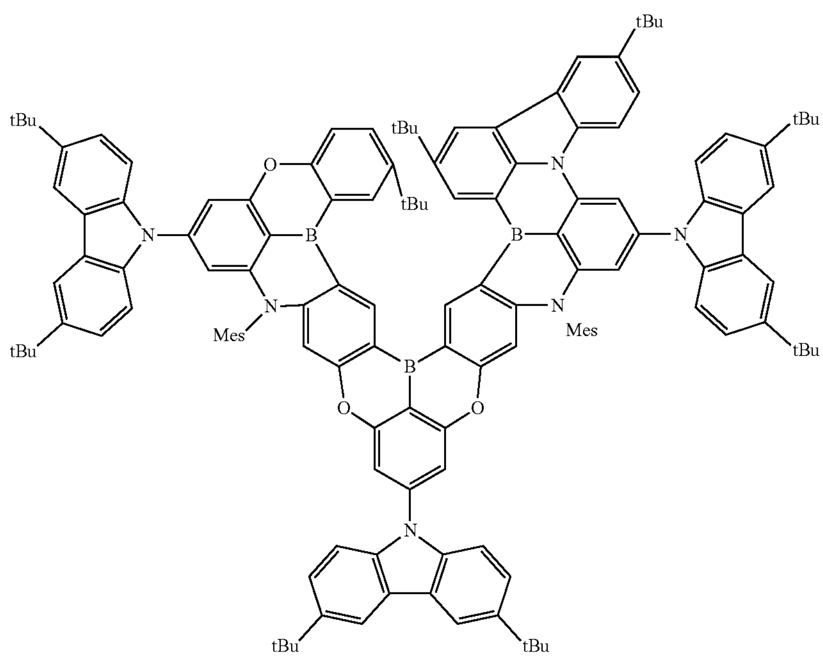

-continued
(1-9-127)
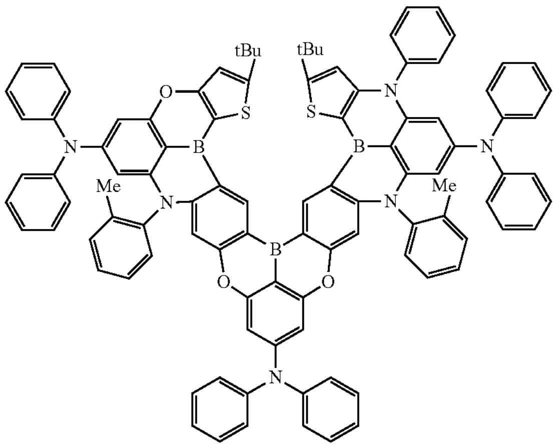
(1-9-128)
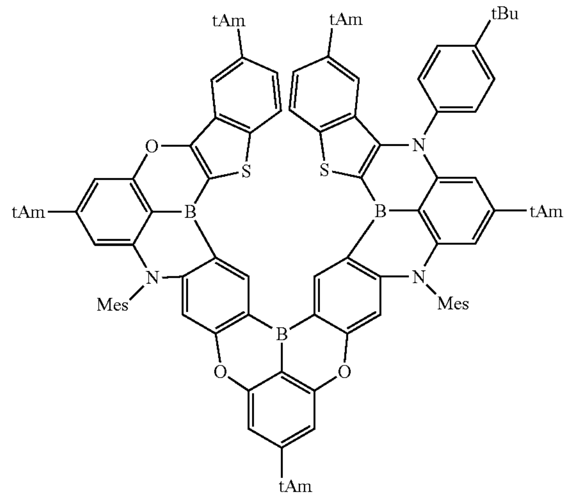
(1-9-129)
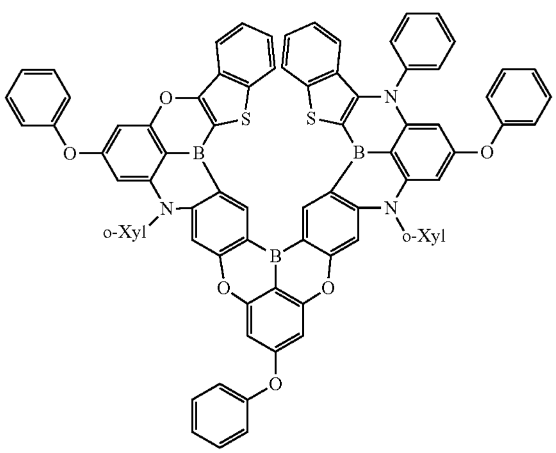
(1-9-130)
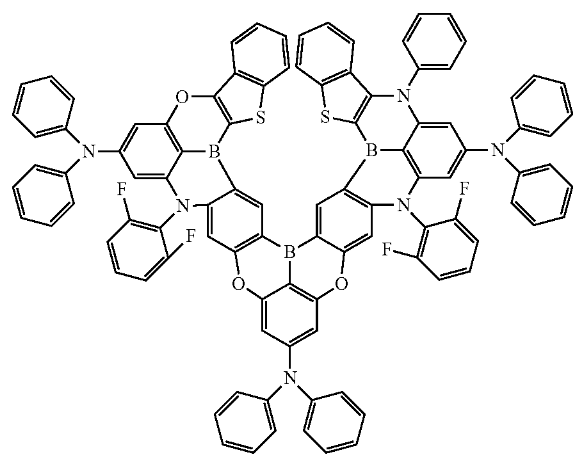
(1-9-141)
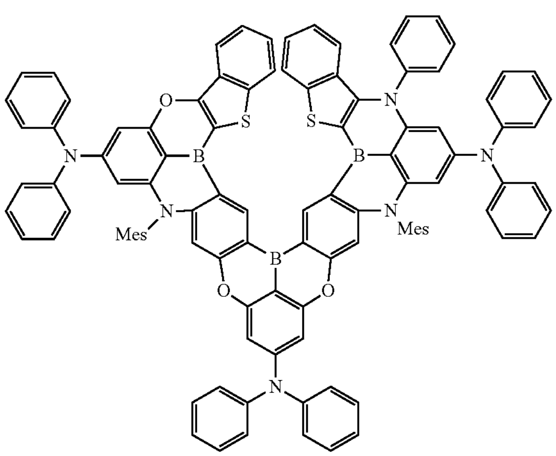
(1-9-142)
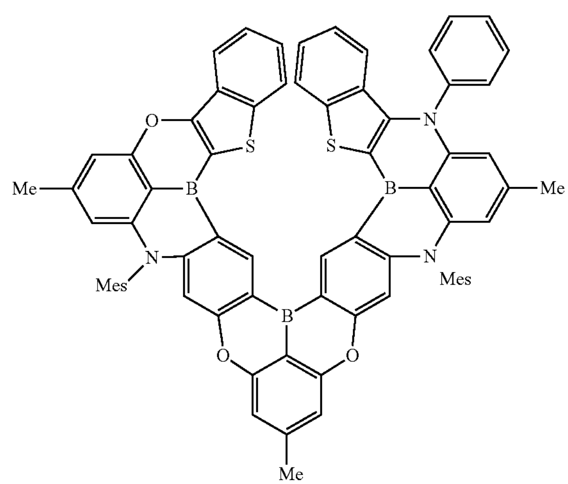

-continued
(1-9-143)
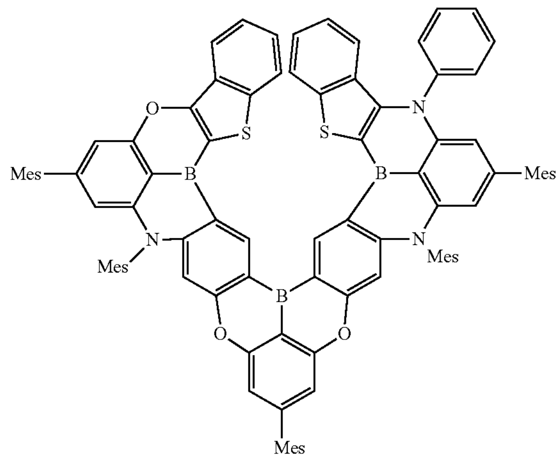
(1-9-144)
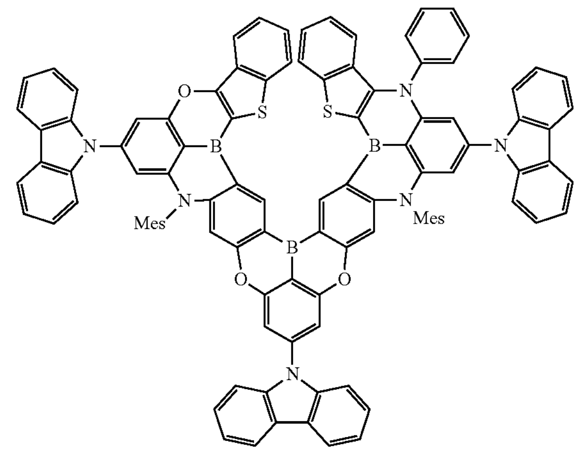
(1-9-145)
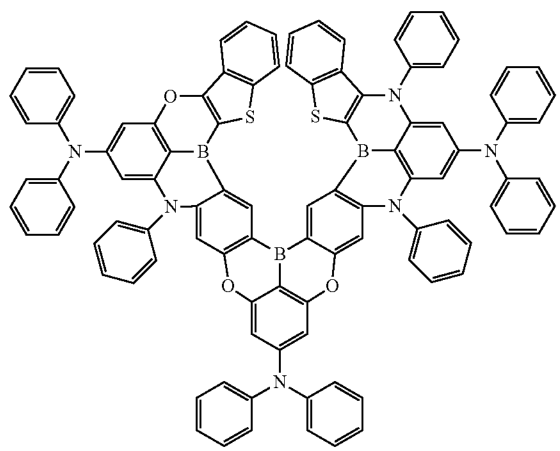
(1-9-146)
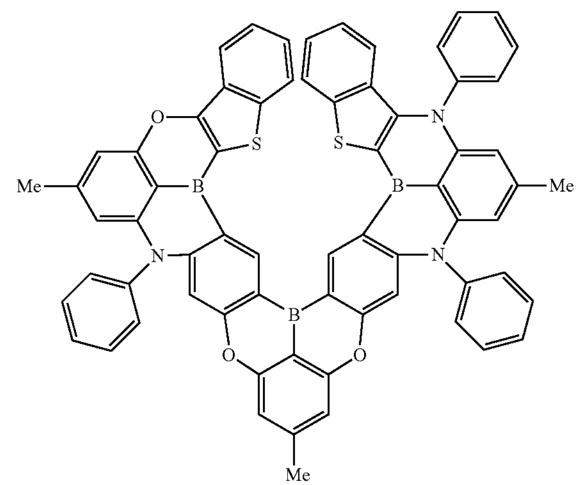
(1-9-147)
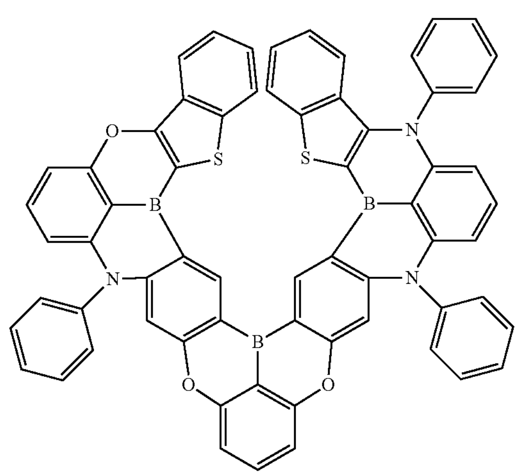
(1-9-148)
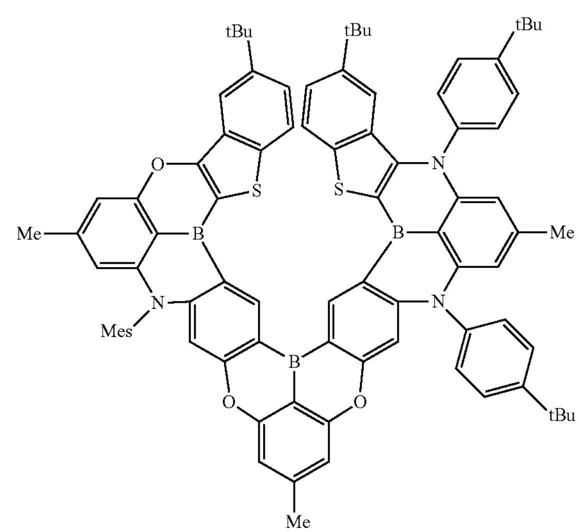

-continued
(1-9-149)
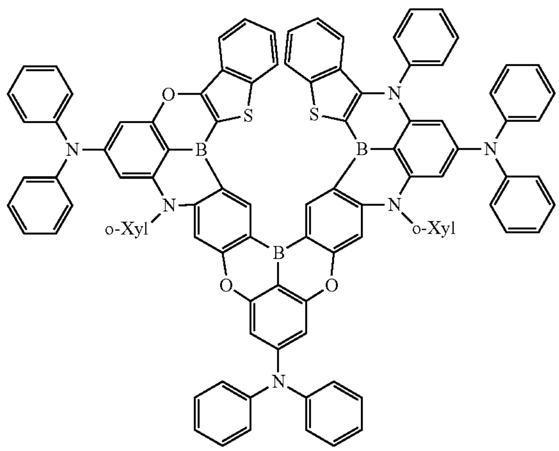
(1-9-150)
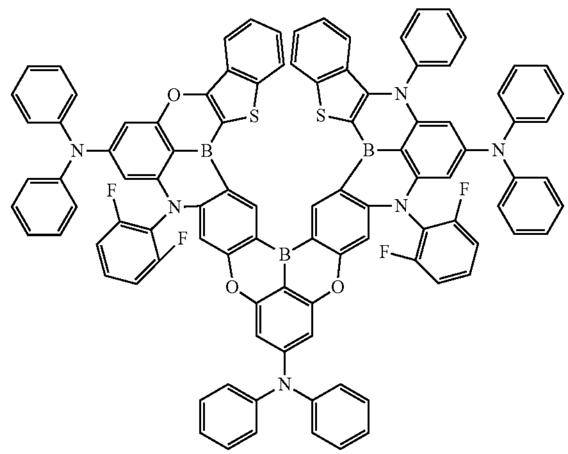
(1-9-161)
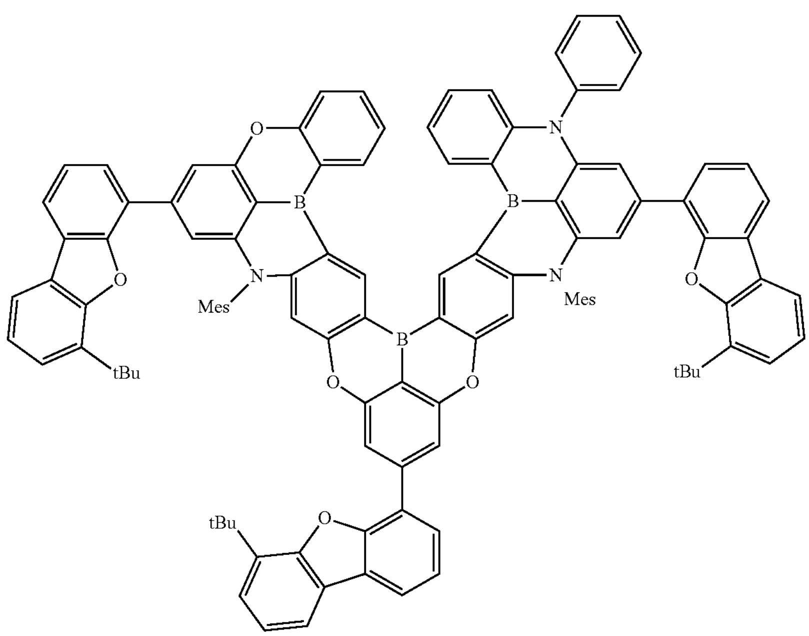

-continued
(1-9-162)
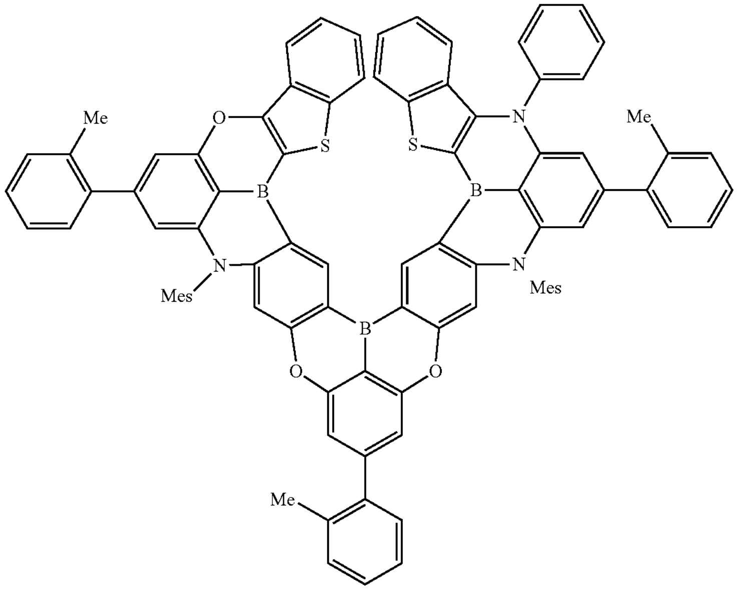
(1-9-163)
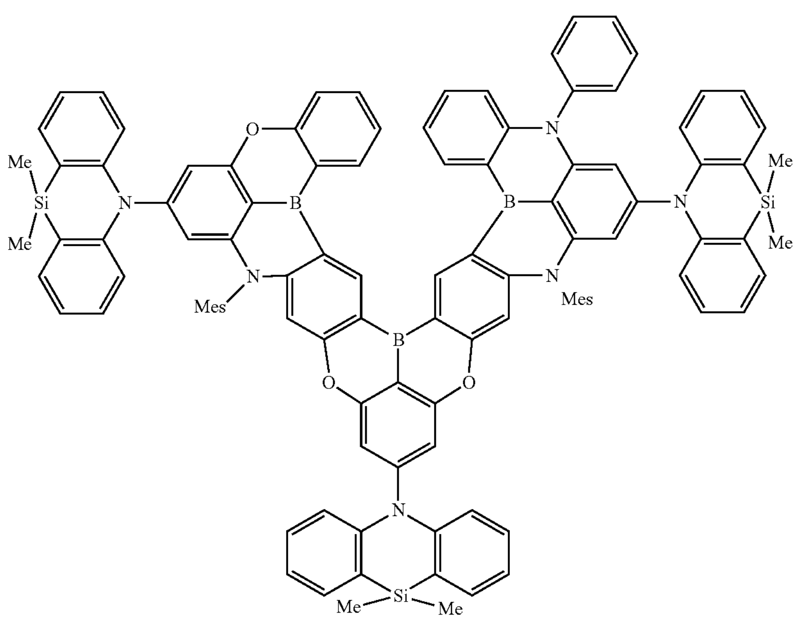

-continued
(1-9-164)
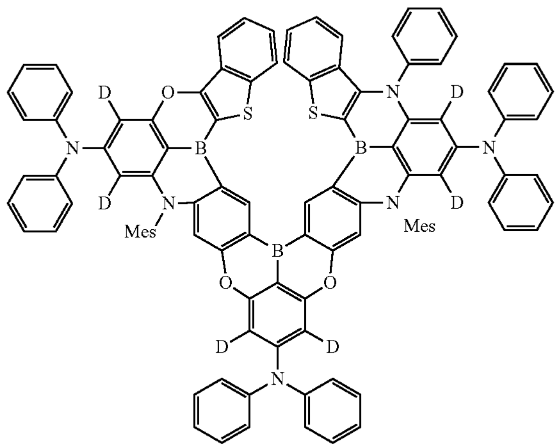
(1-9-165)
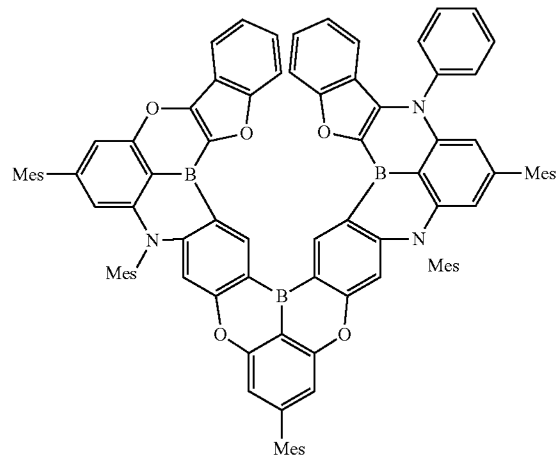
(1-9-166)
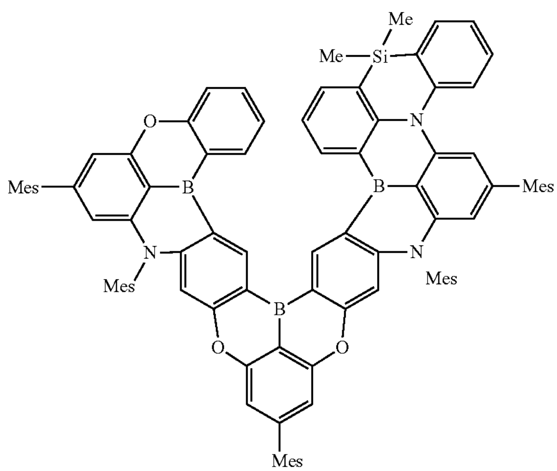
(1-9-167)
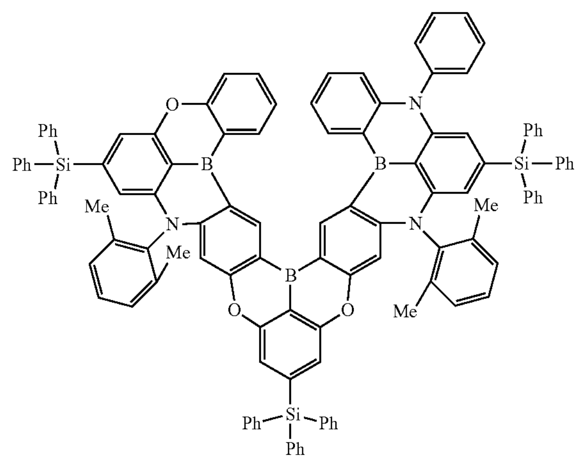
(1-9-168)
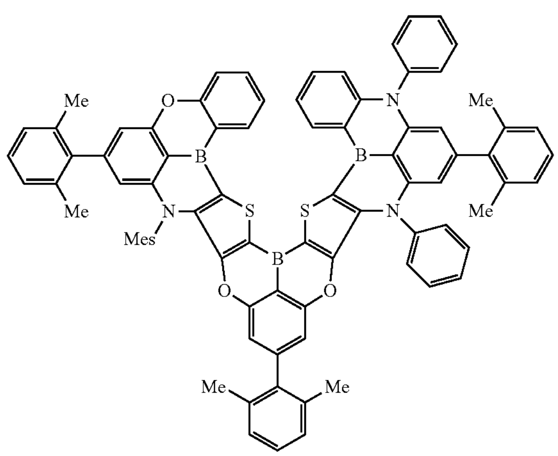
(1-9-169)
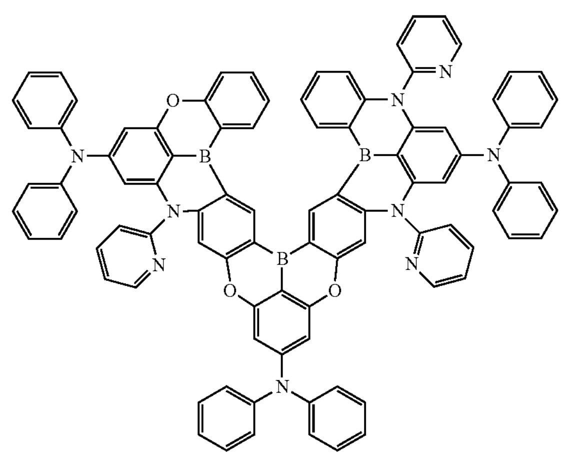

-continued
(1-9-170)
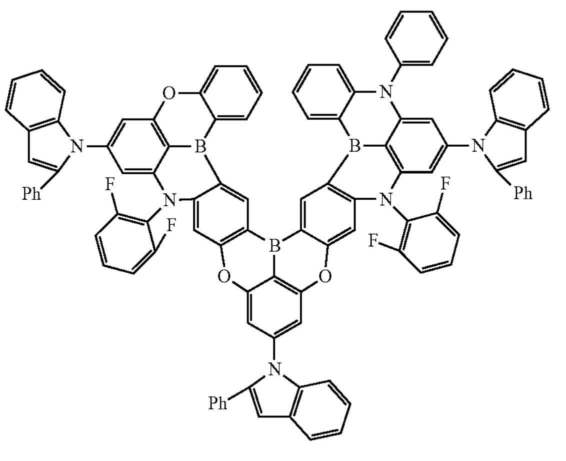
(1-9-191)
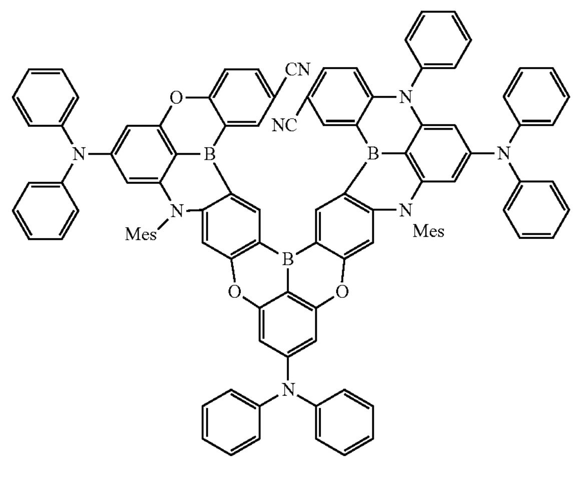
(1-9-192)
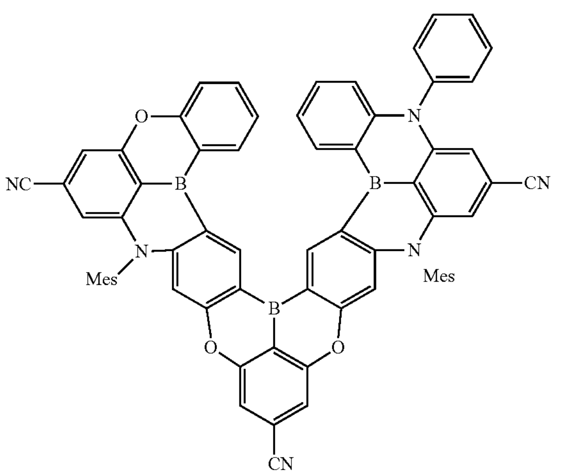
(1-9-193)
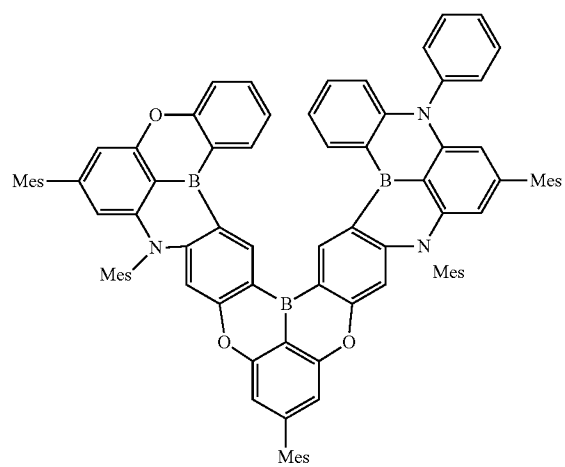
(1-9-194)
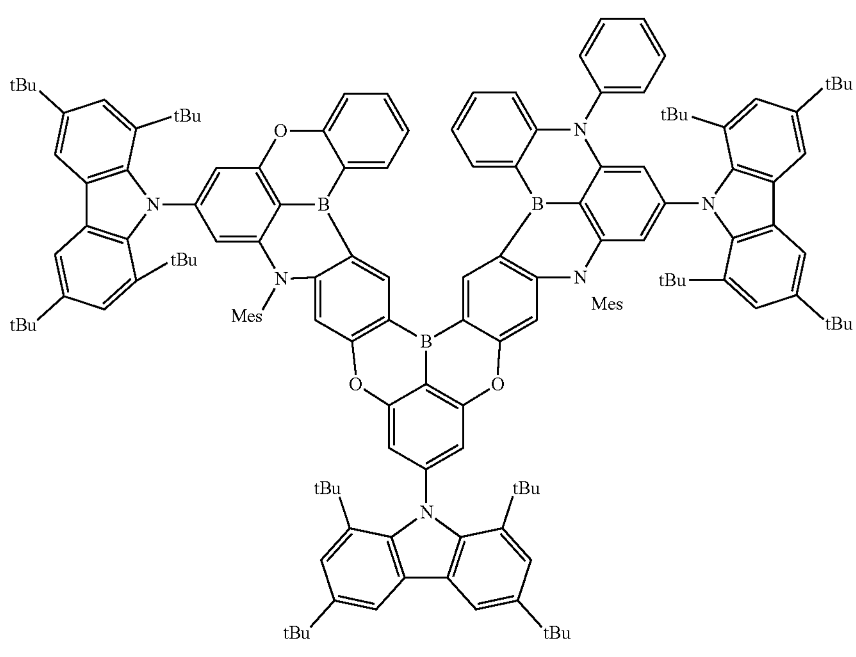

-continued
(1-9-195)
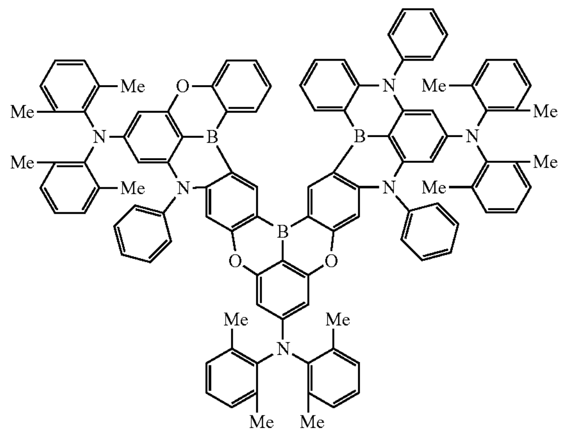
(1-9-196)
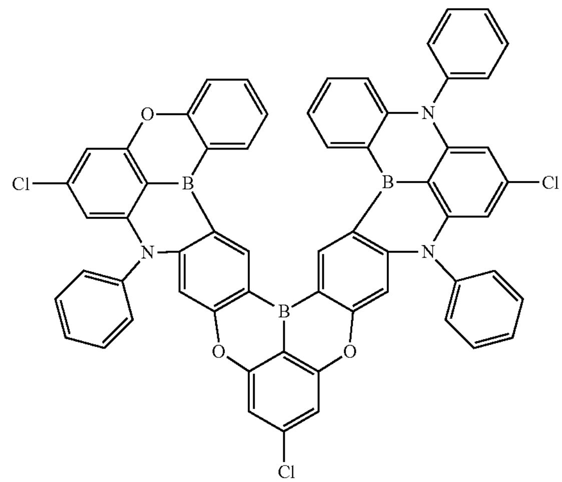
(1-9-197)
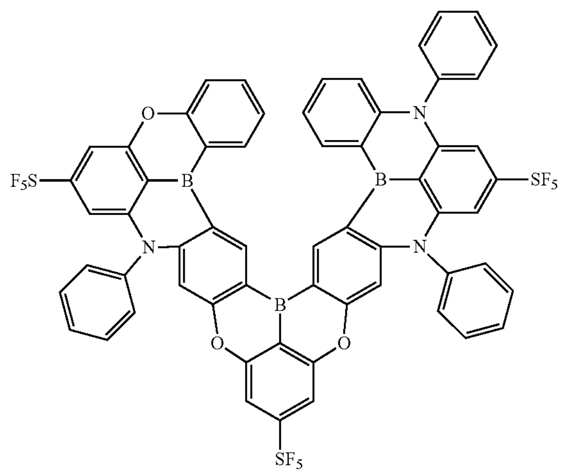
(1-9-198)
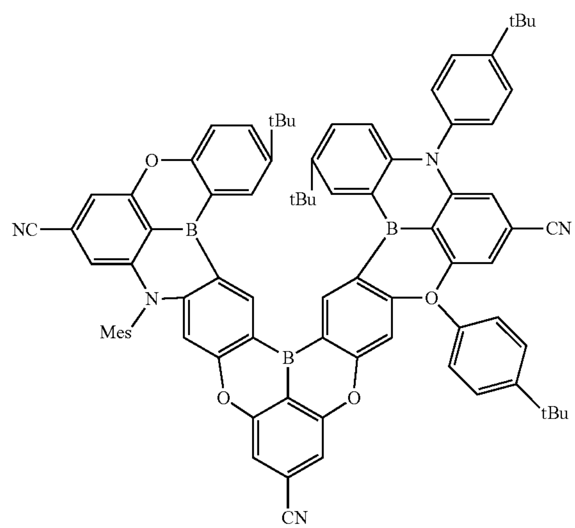
(1-9-199)
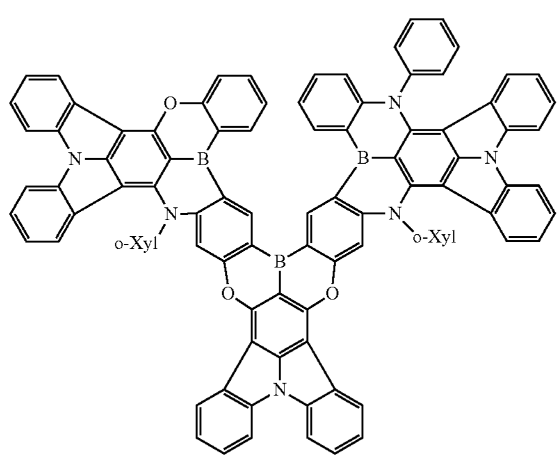
(1-9-200)
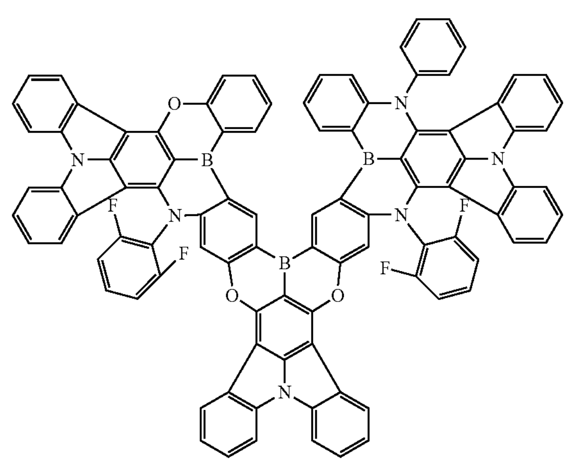

-continued
(1-9-221)
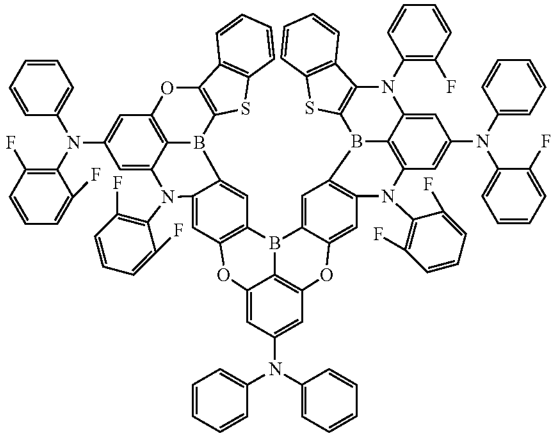
(1-9-222)
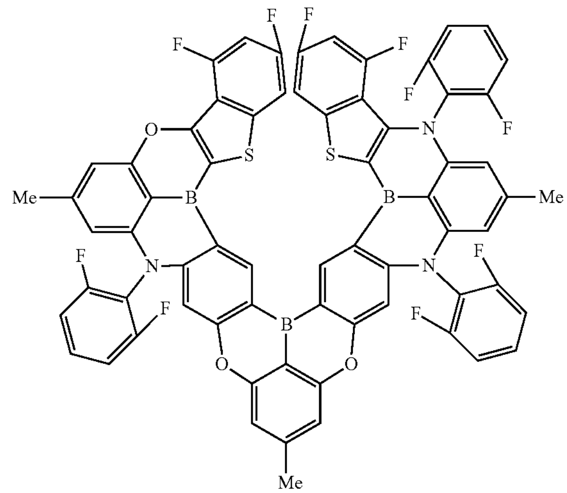
(1-9-223)
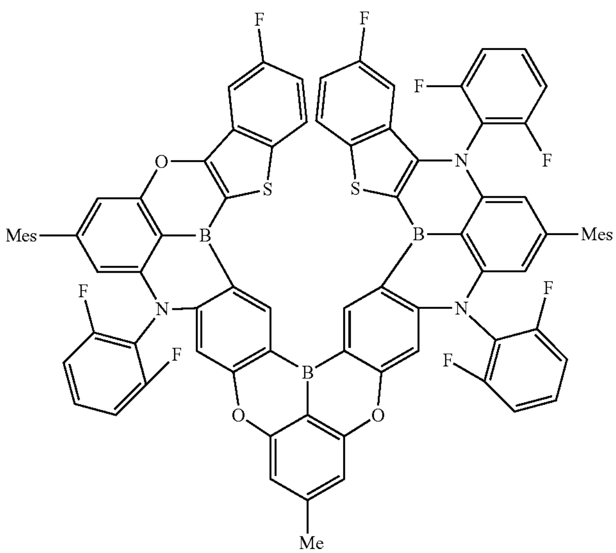
(1-9-224)
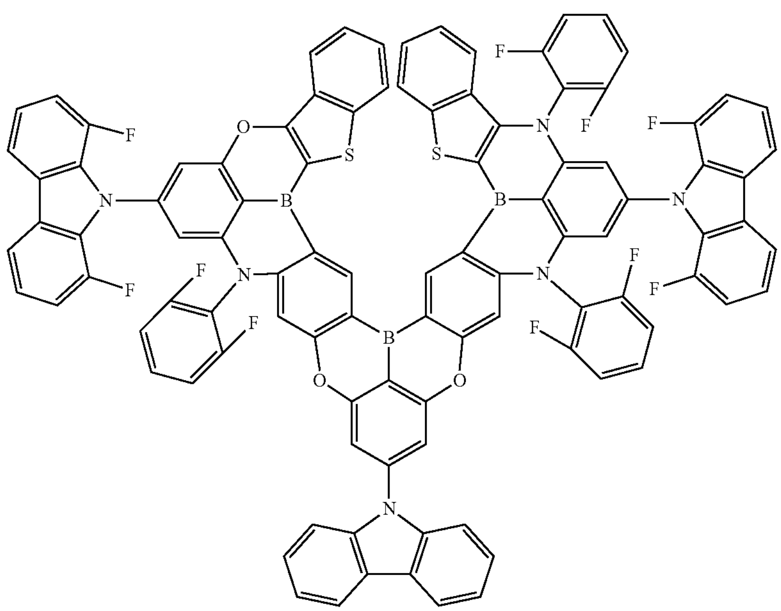

-continued
(1-9-225)
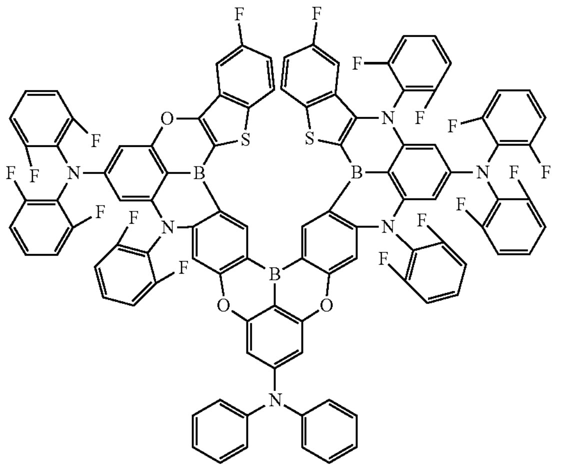
(1-9-226)
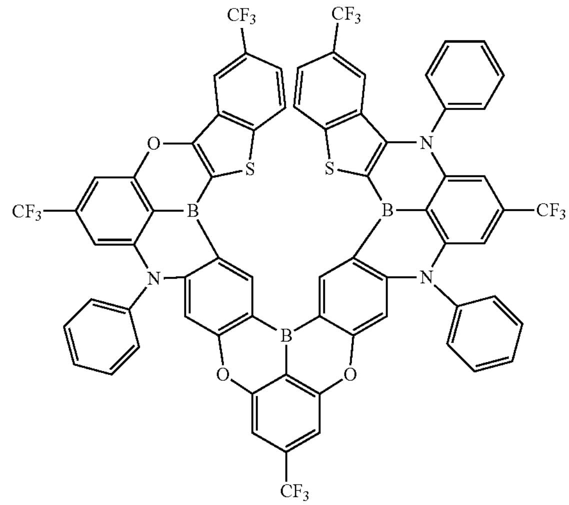
(1-9-227)
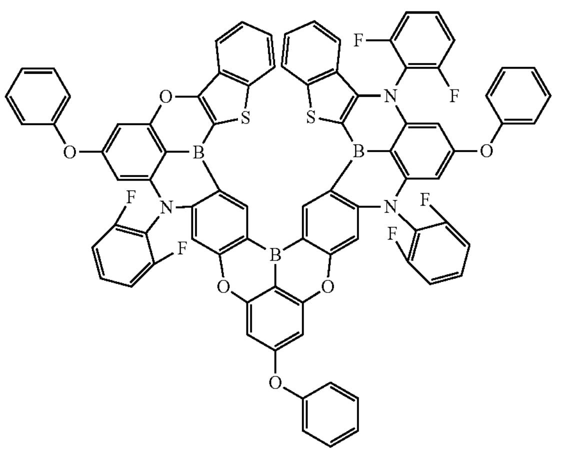
(1-9-228)
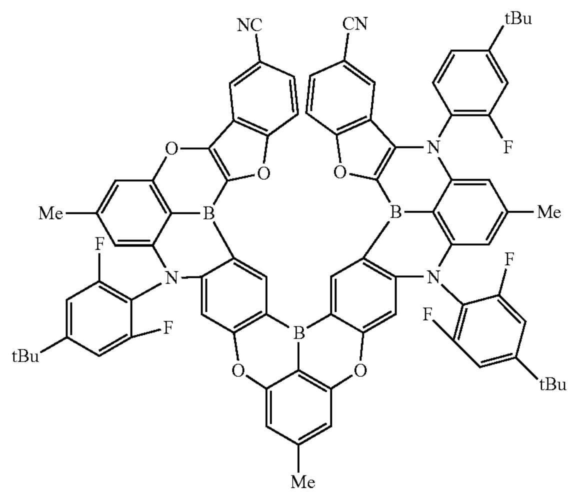
(1-9-229)
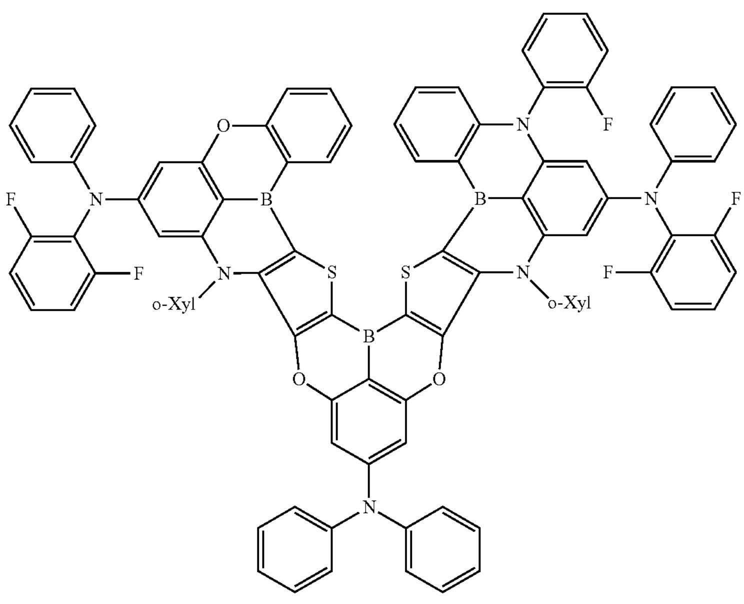

-continued
(1-9-230)
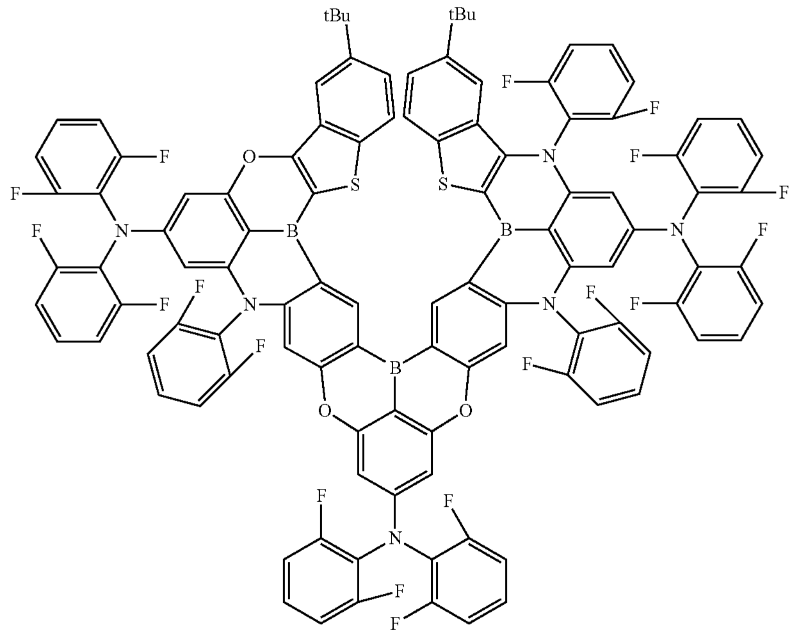
(1-10-1)
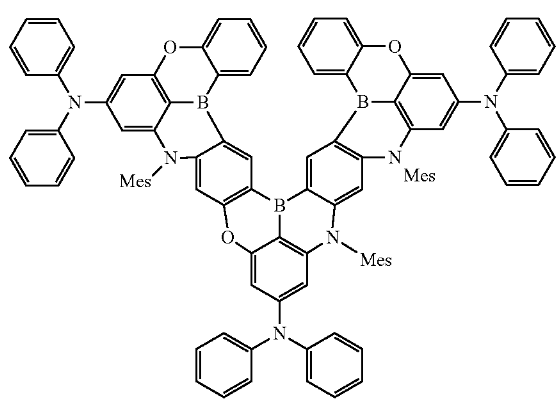
(1-10-2)
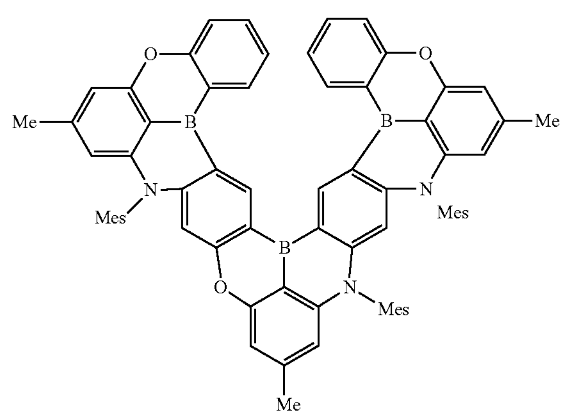
(1-10-3)
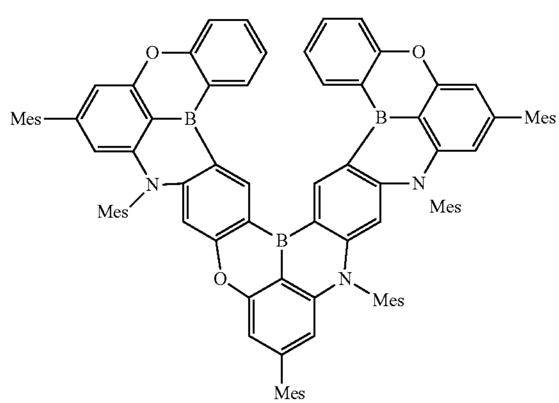
(1-10-4)
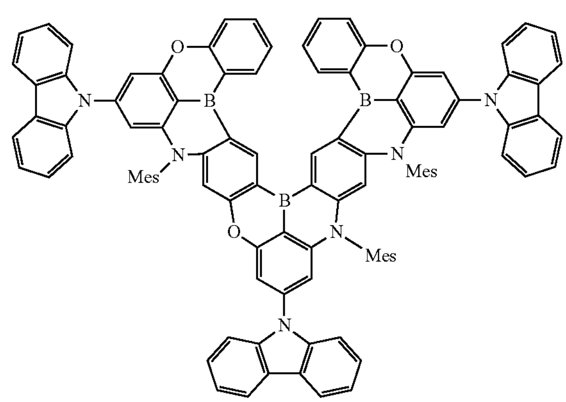

-continued
(1-10-5)
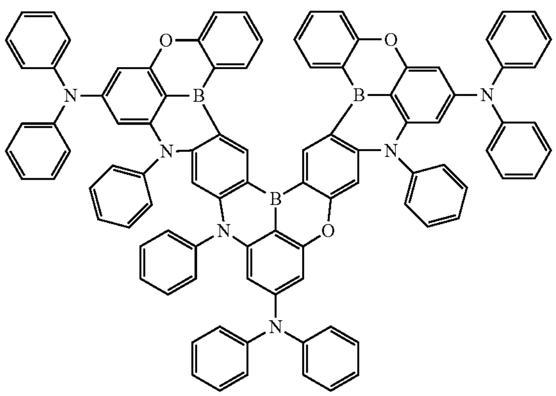
(1-10-6)
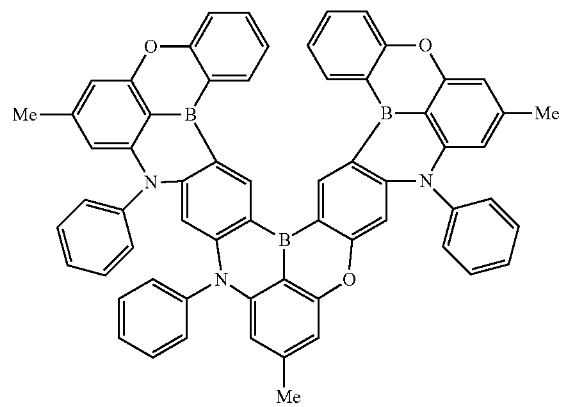
(1-10-7)
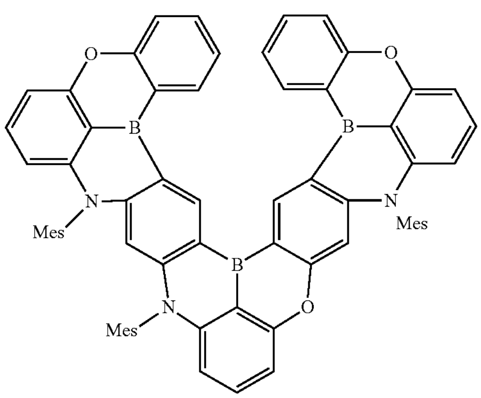
(1-10-8)
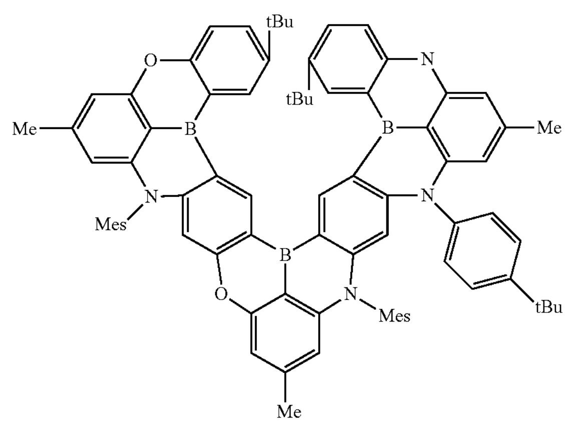
(1-10-9)
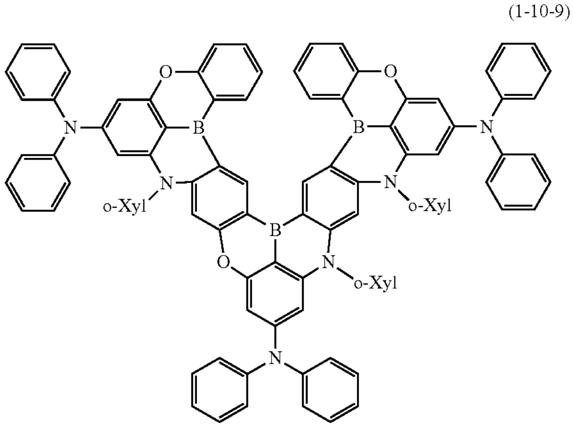
(1-10-10)
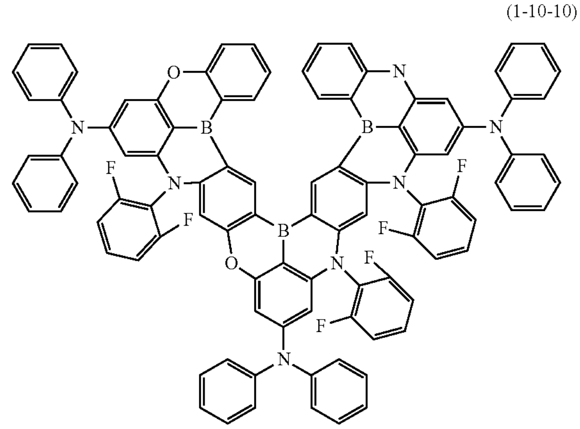

-continued
(1-10-21)
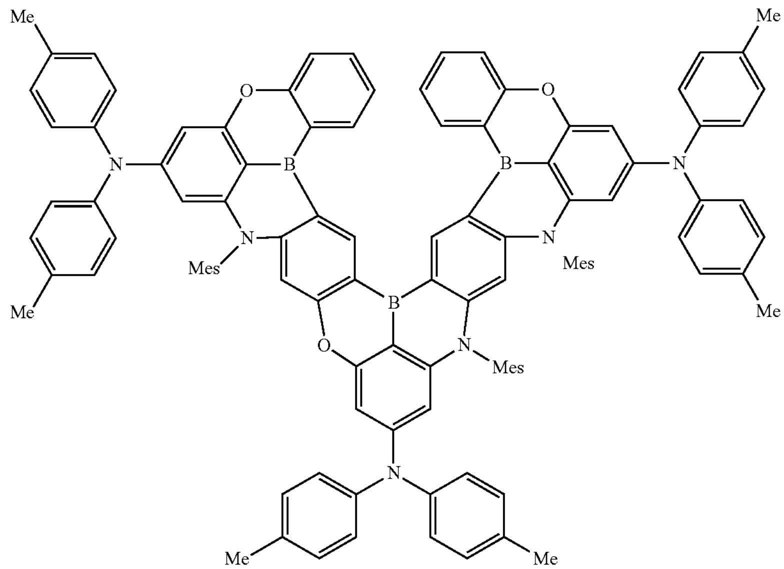
(1-10-22)
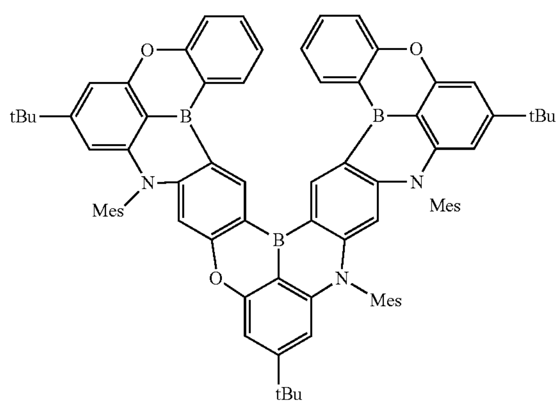
(1-10-23)
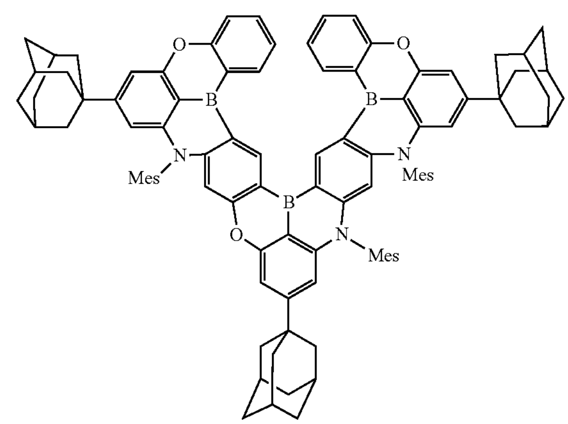
(1-10-24)
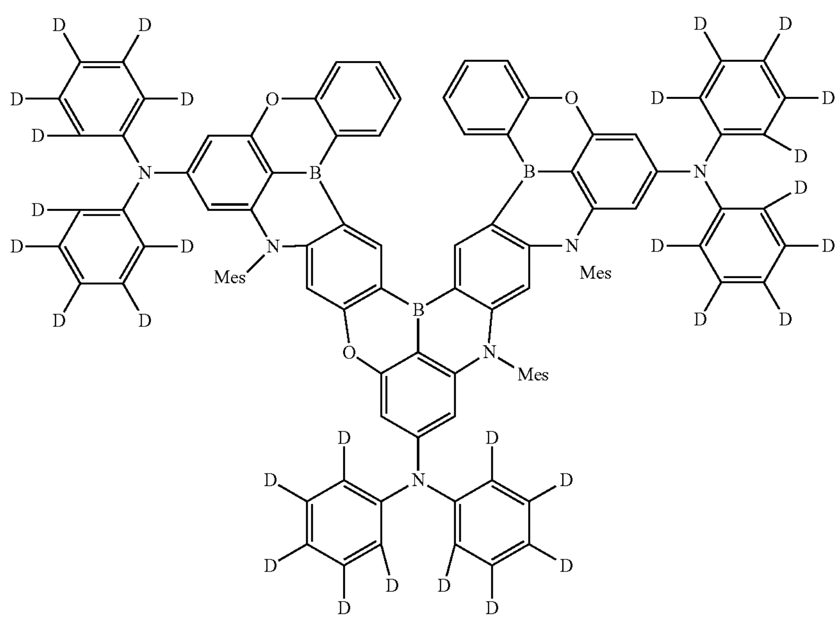

-continued
(1-10-25)
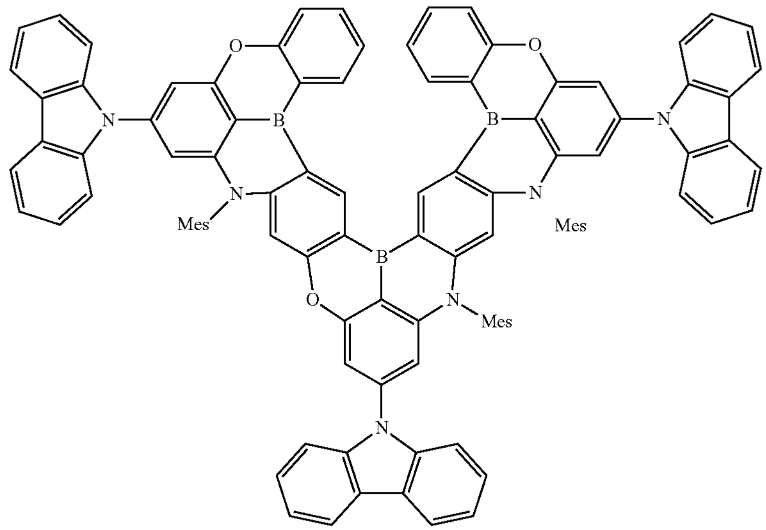
(1-10-26)
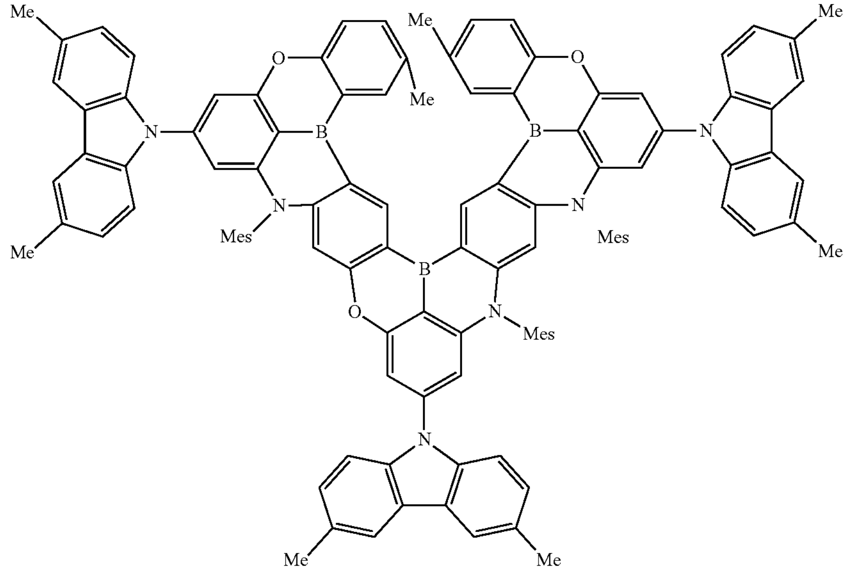
(1-10-27)
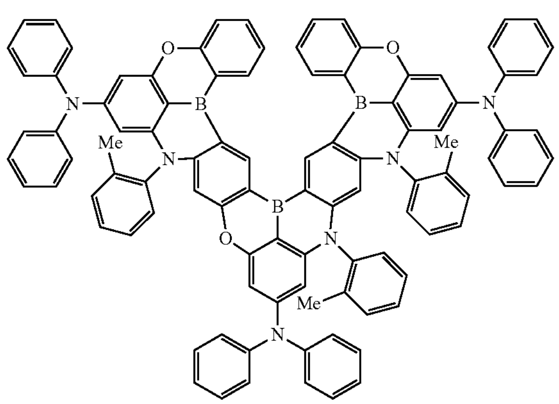
(1-10-28)
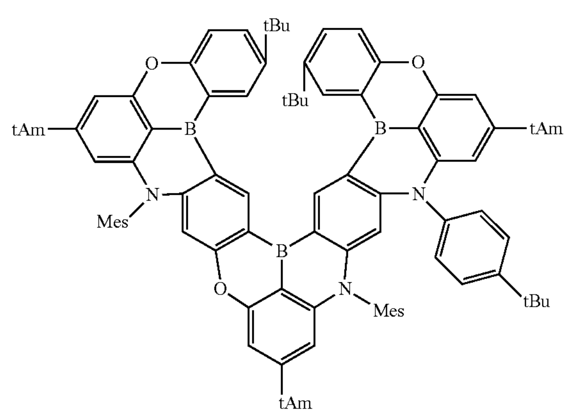

-continued
(1-10-29)
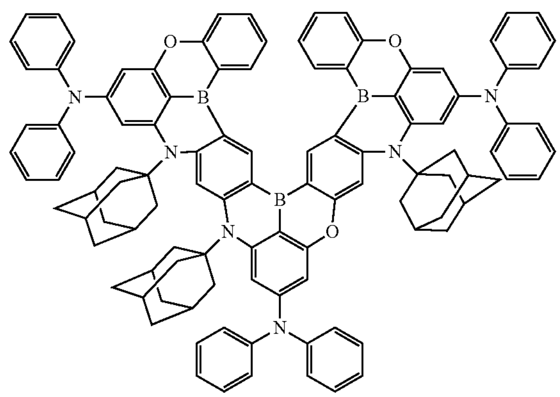
(1-10-30)
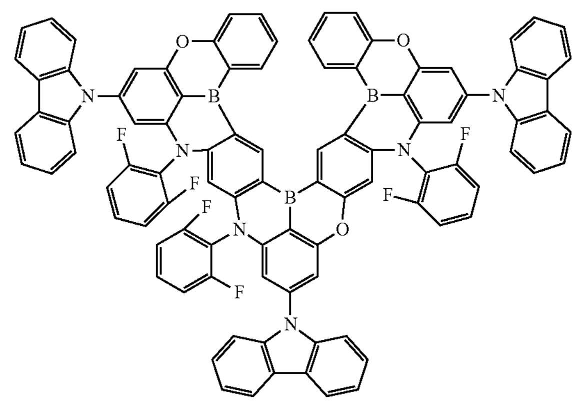
(1-10-41)
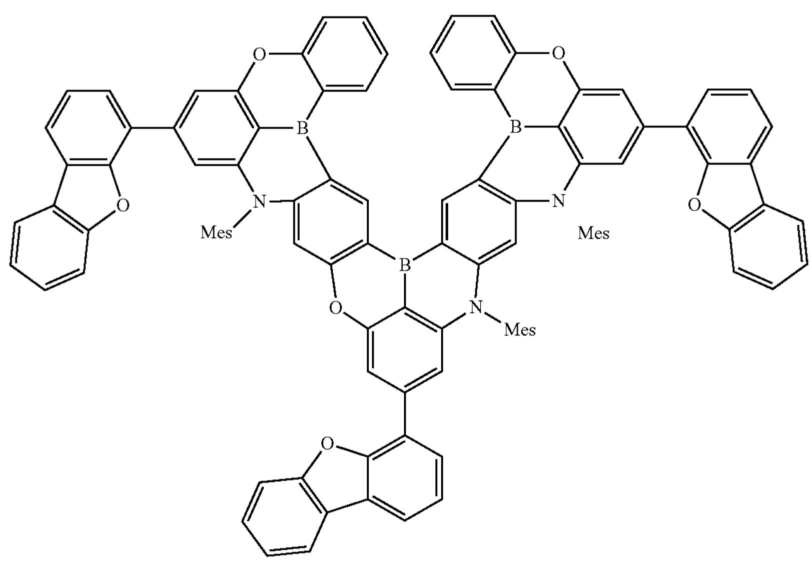
(1-10-42)
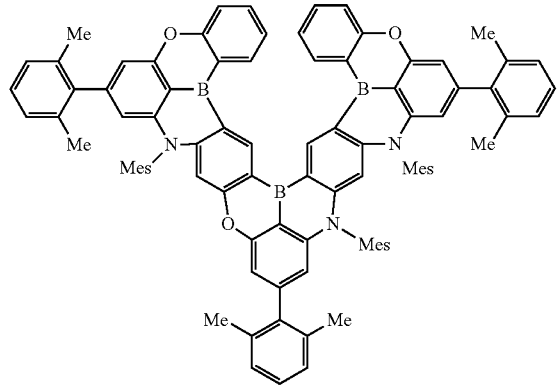
(1-10-43)
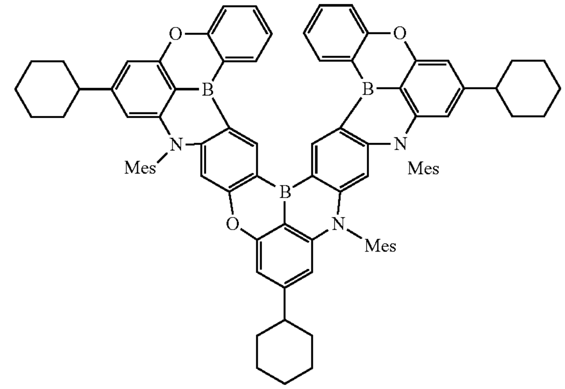

-continued
(1-10-44)
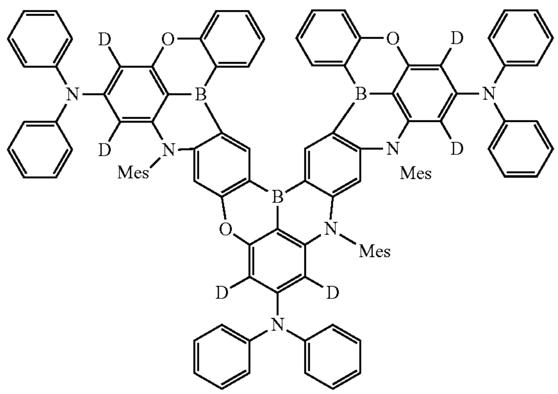
(1-10-45)
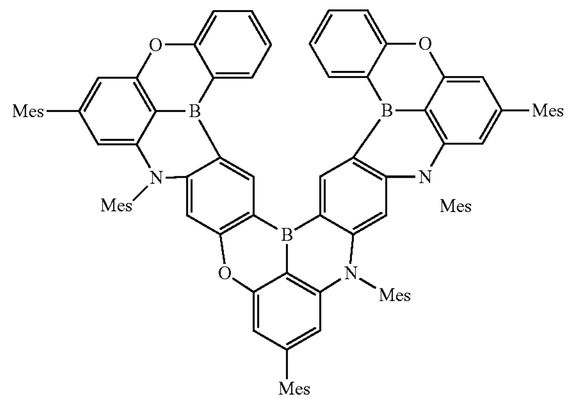
(1-10-46)
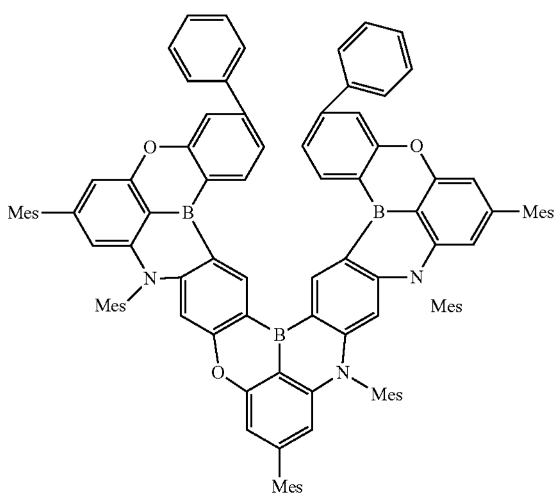
(1-10-47)
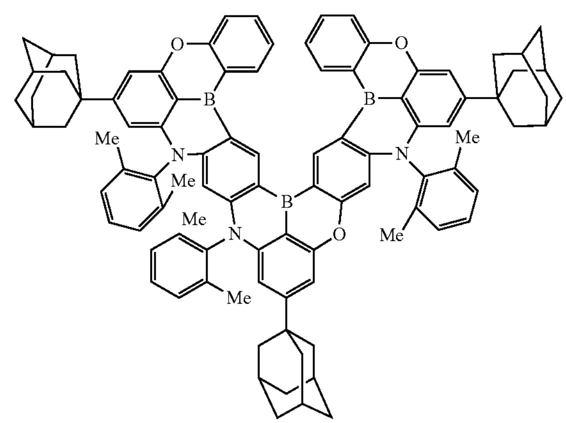
(1-10-48)
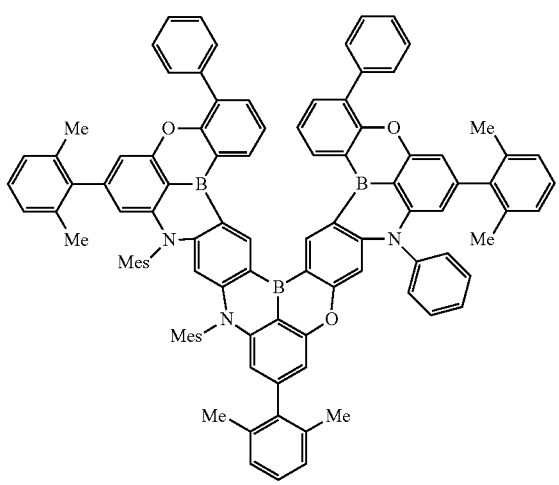
(1-10-49)
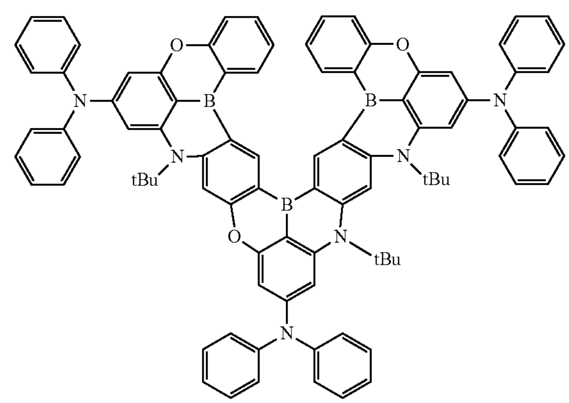

-continued
(1-10-50)
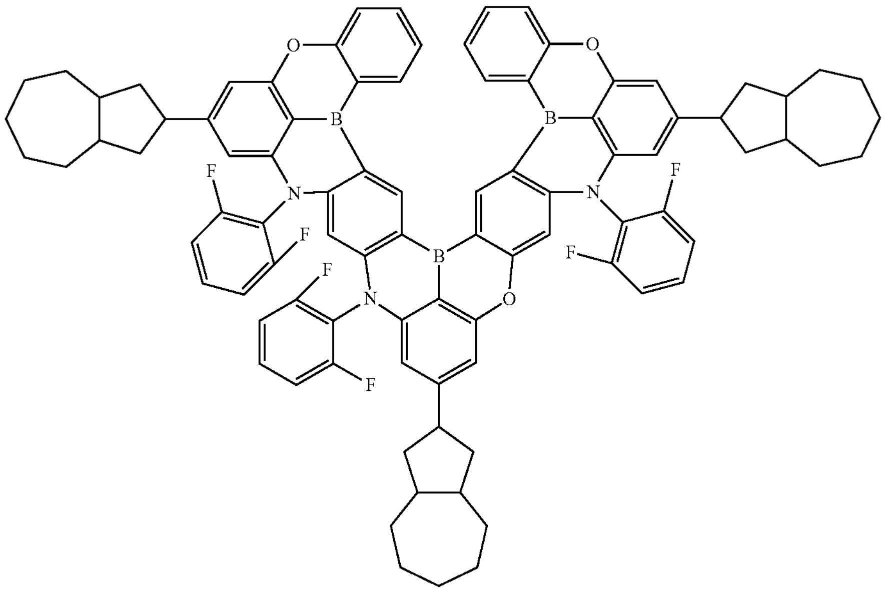
(1-10-101)
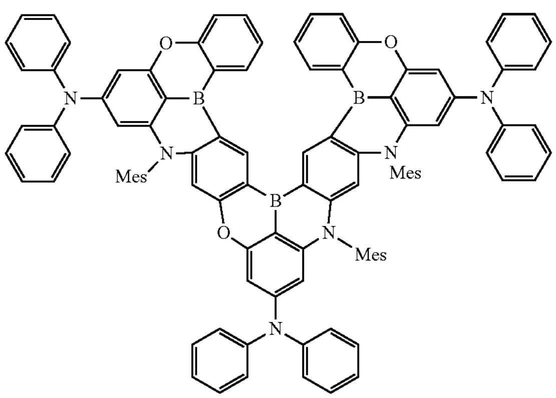
(1-10-102)
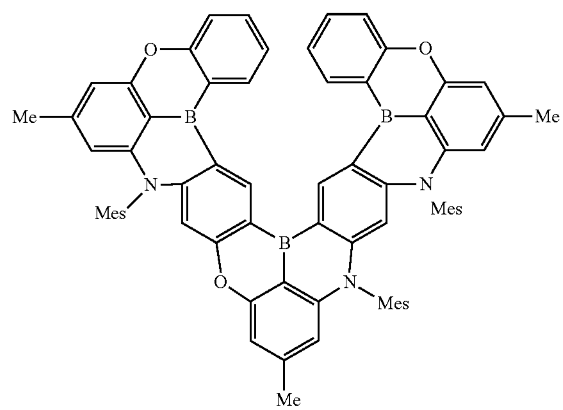
(1-10-103)
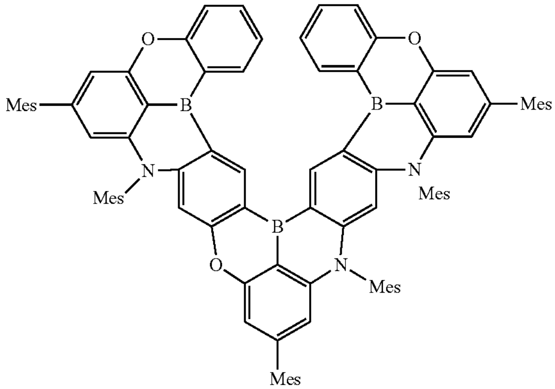
(1-10-104)
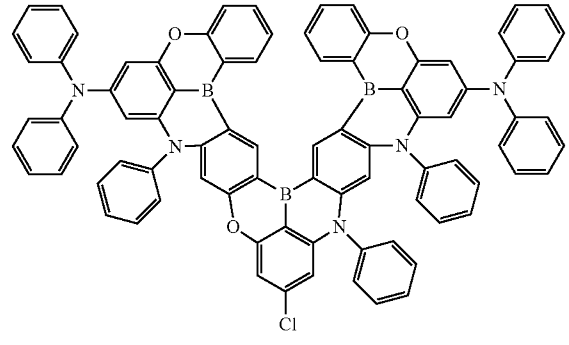

-continued
(1-10-105)
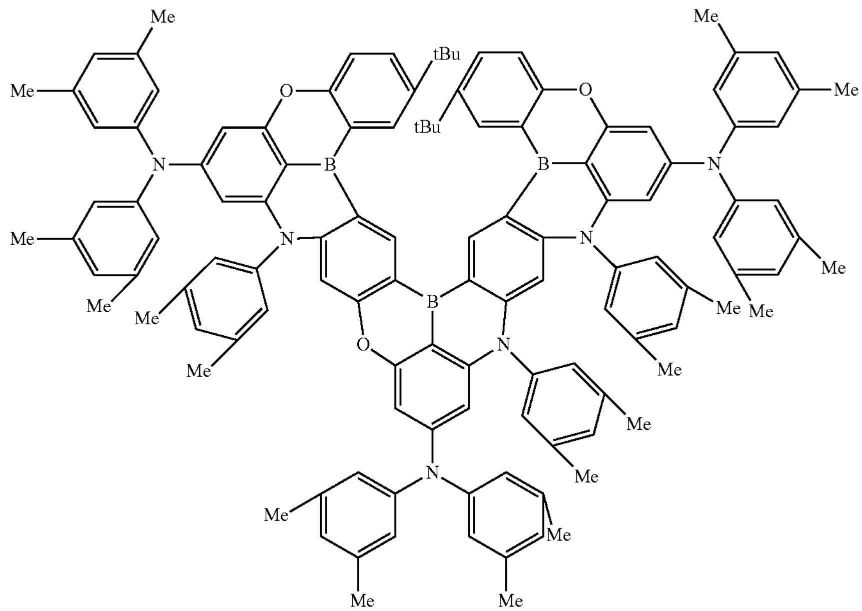
(1-10-106)
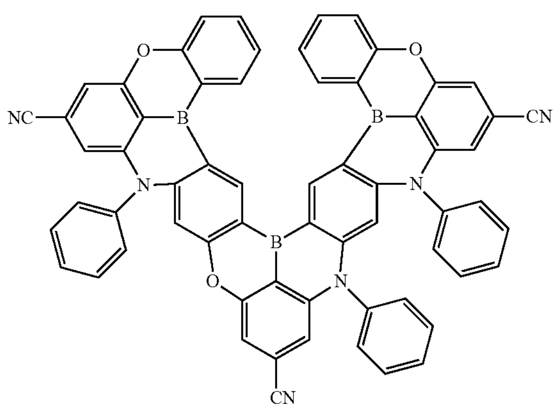
(1-10-107)
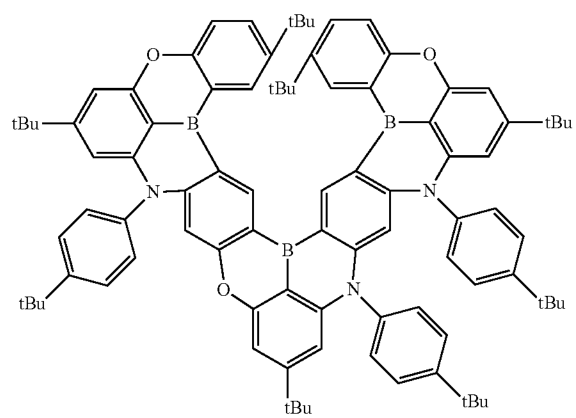
(1-10-108)
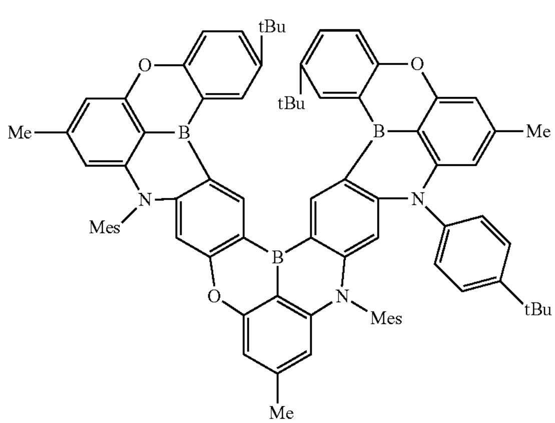
(1-10-109)
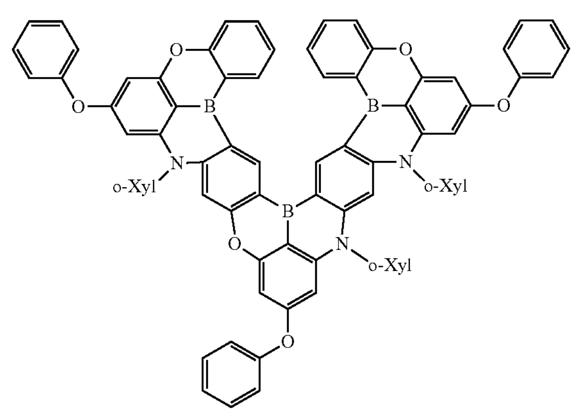

-continued
(1-10-110)
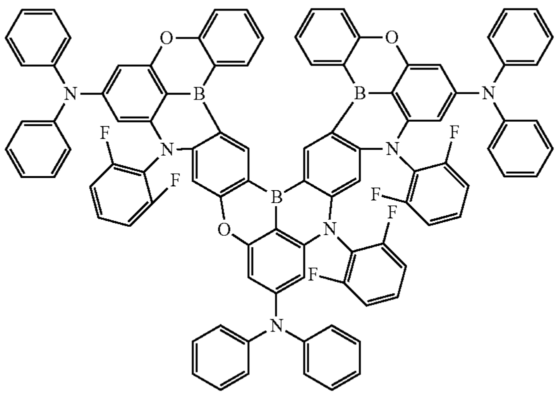
(1-10-121)
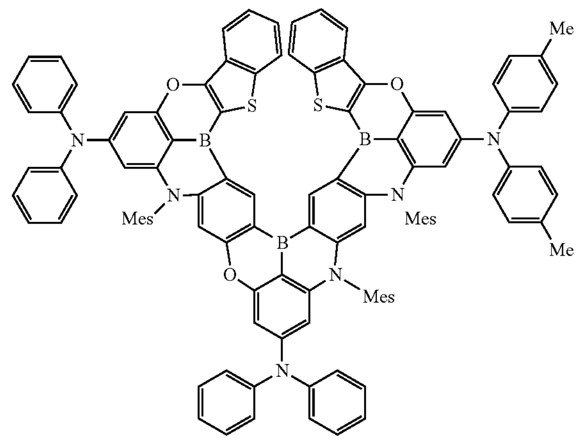
(1-10-122)
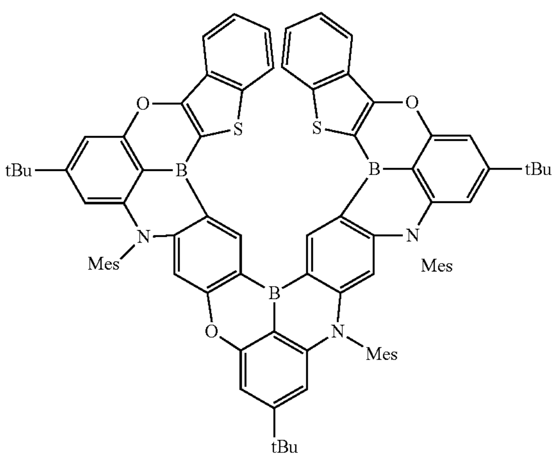
(1-10-123)
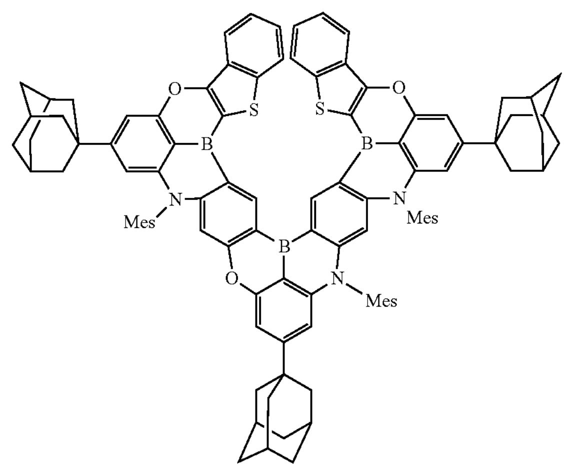
(1-10-124)
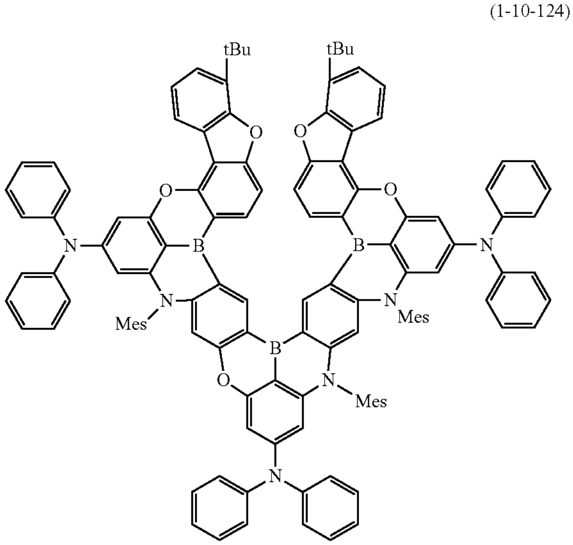
(1-10-125)
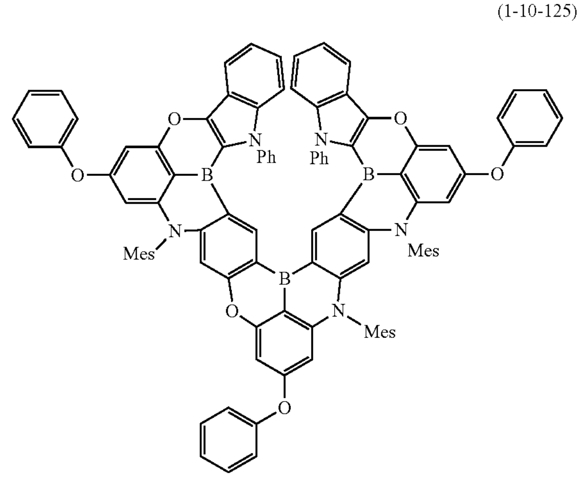

-continued
(1-10-126)
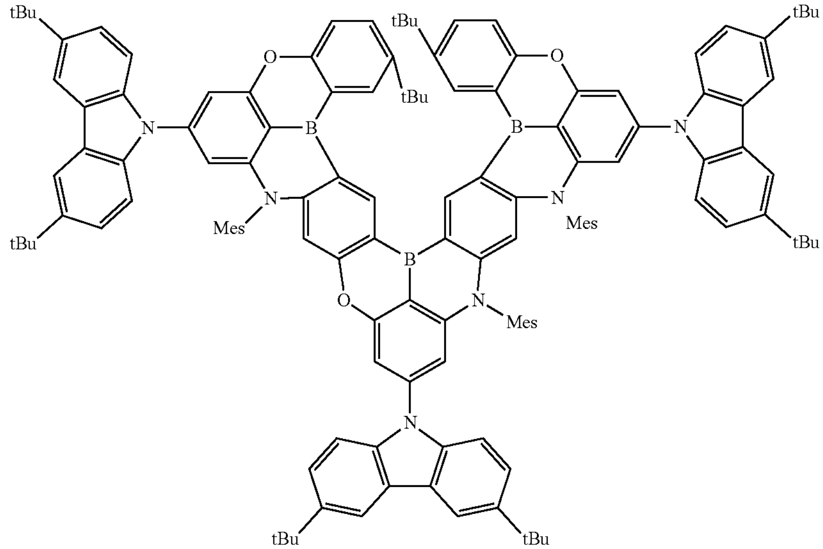
(1-10-127)
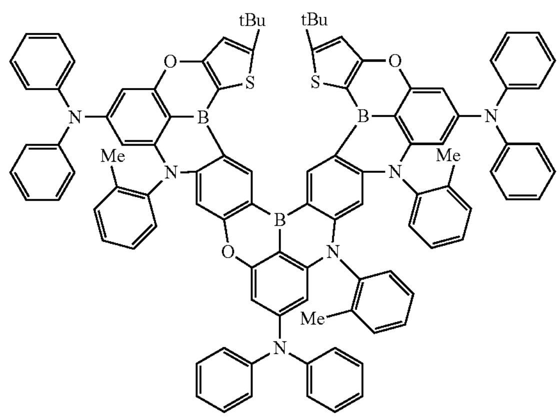
(1-10-128)
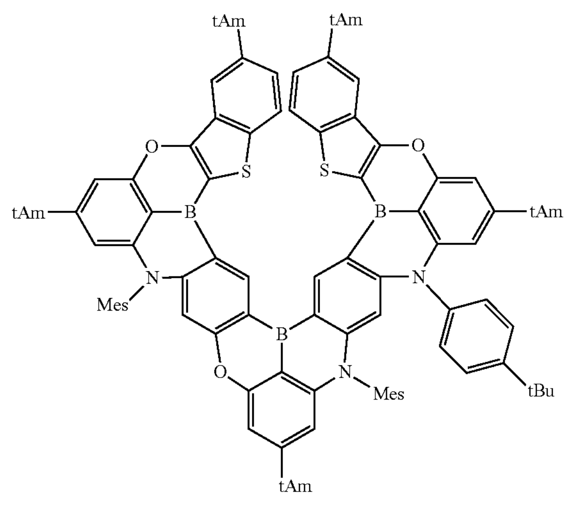
(1-10-129)
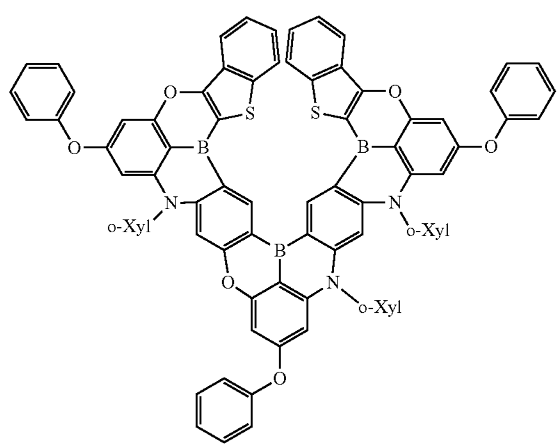
(1-10-130)
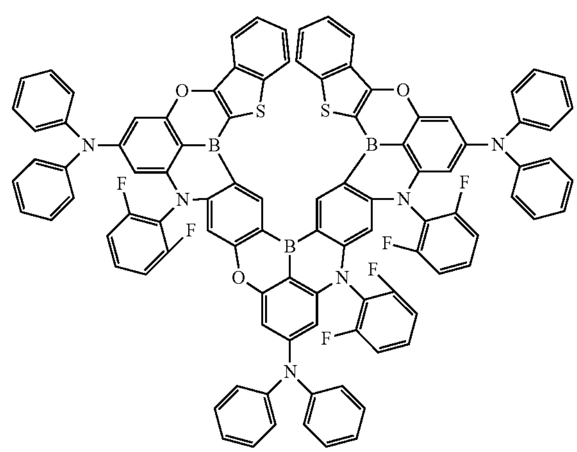

(1-10-141)
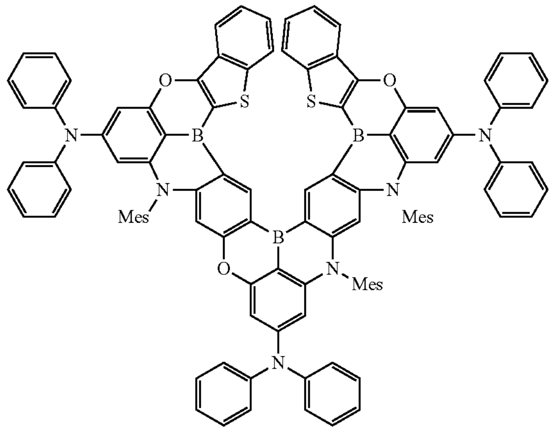
(1-10-142)
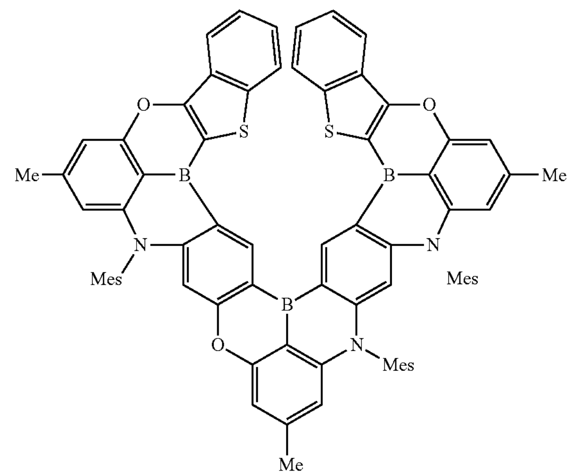
(1-10-143)
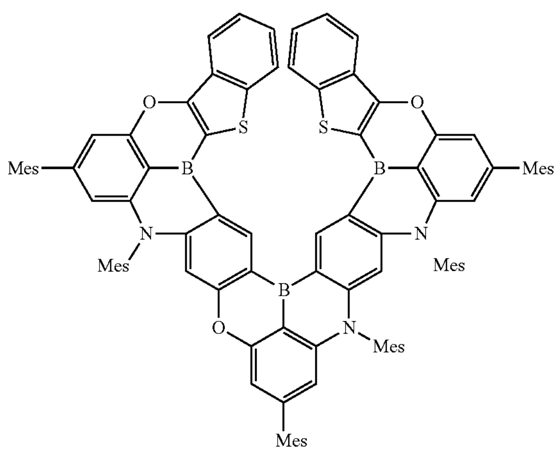
(1-10-144)
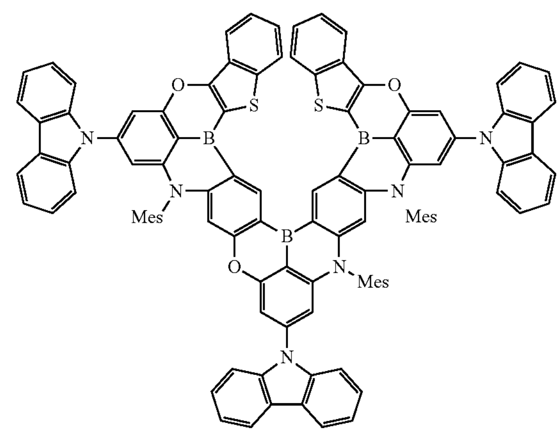
(1-10-145)
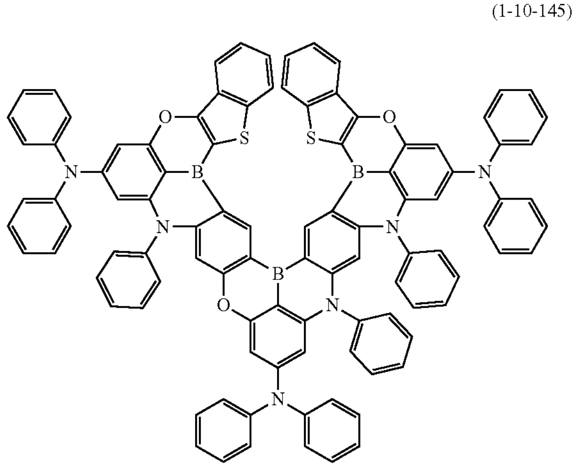
(1-10-146)
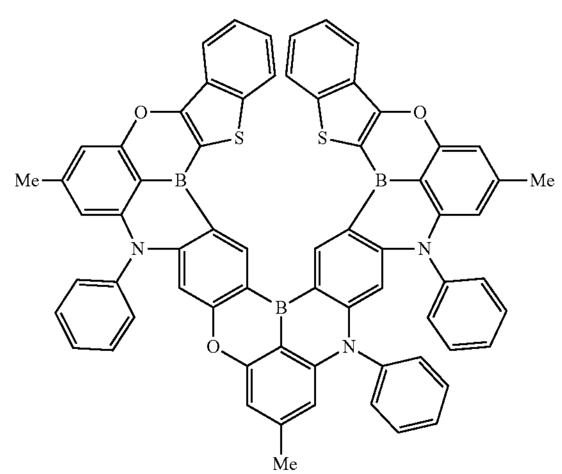

-continued
(1-10-147)
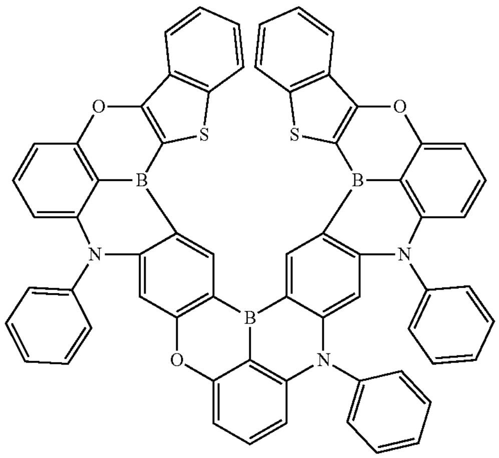
(1-10-148)
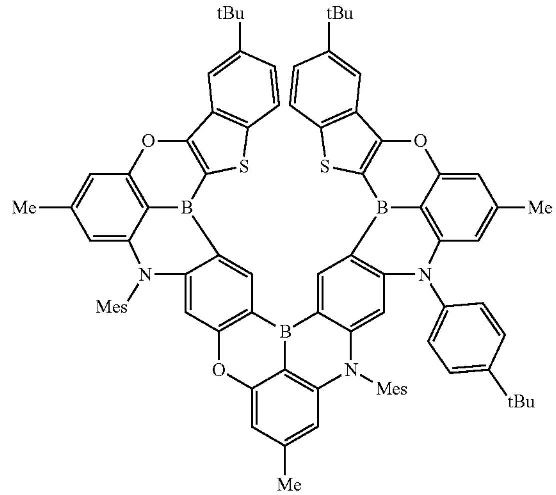
(1-10-149)
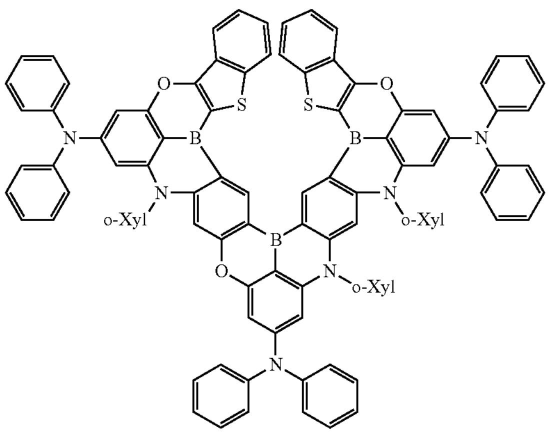
(1-10-150)
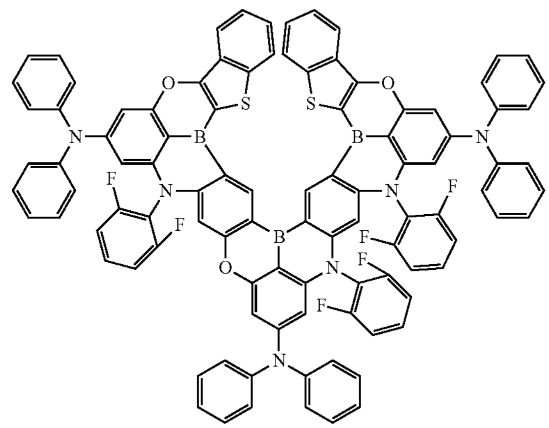
(1-10-161)
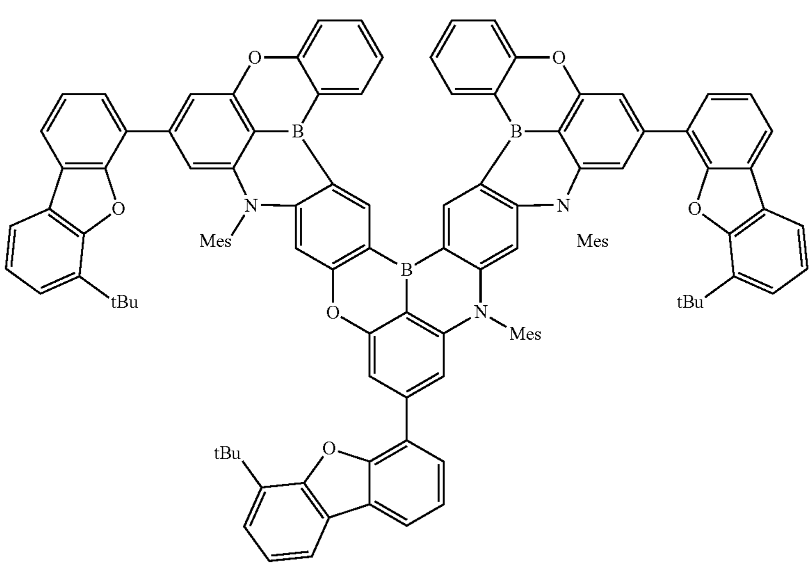

-continued
(1-10-162)
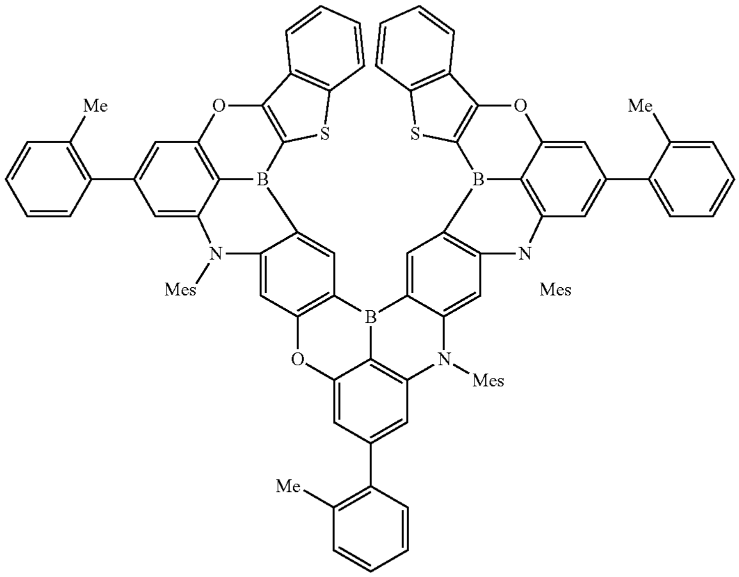
(1-10-163)
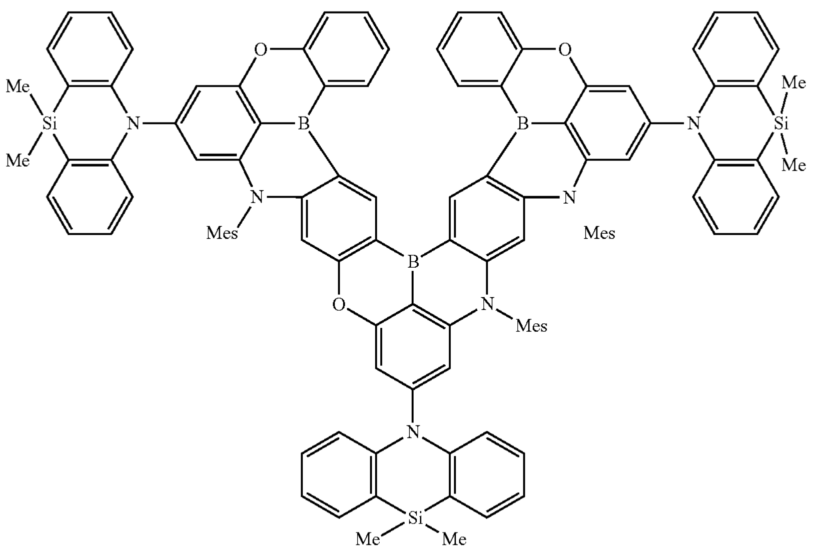
(1-10-164)
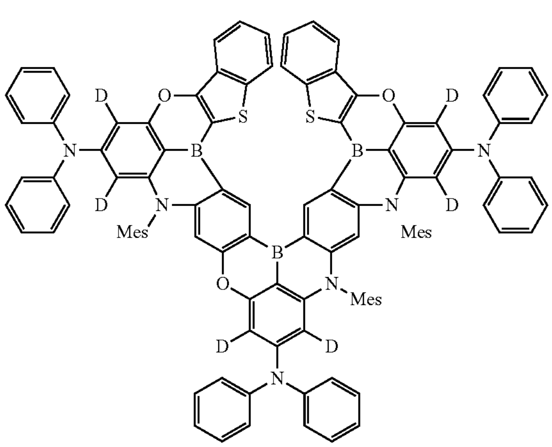
(1-10-165)
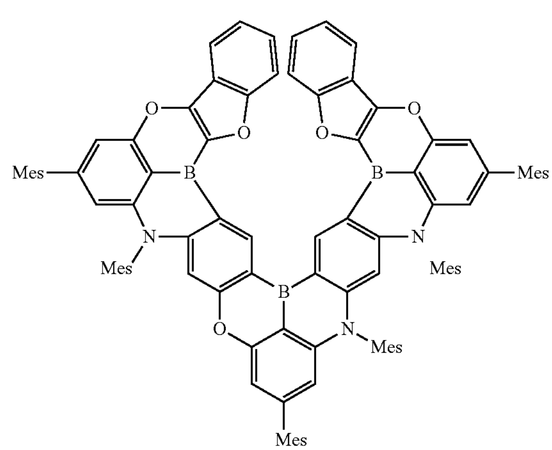

-continued
(1-10-166)
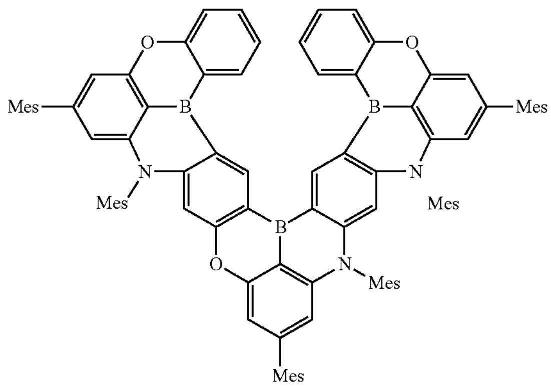
(1-10-167)
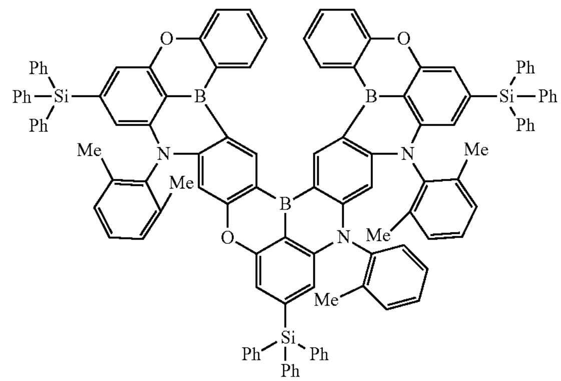
(1-10-168)
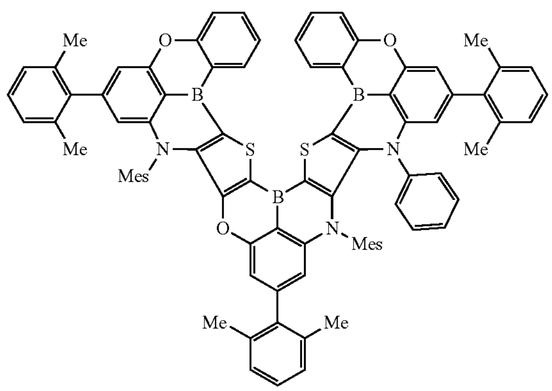
(1-10-169)
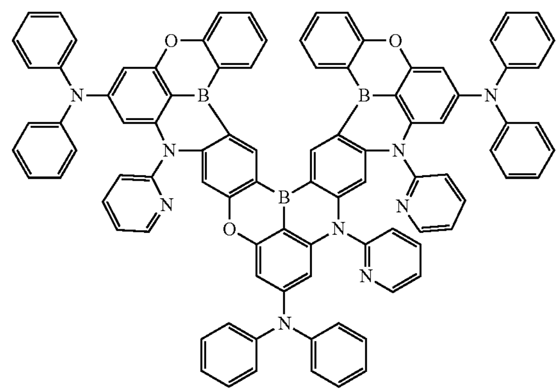
(1-10-170)
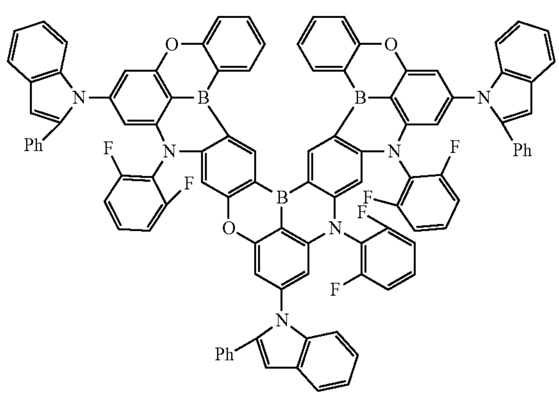
(1-10-191)
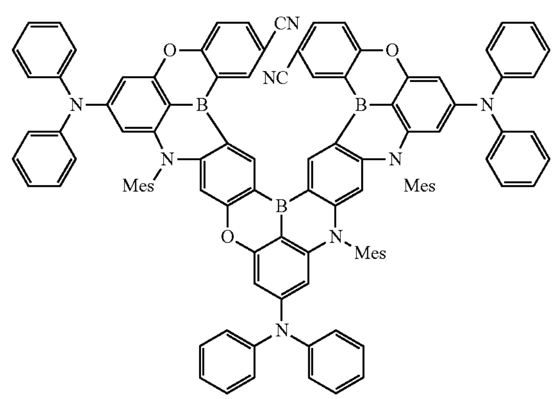
(1-10-192)
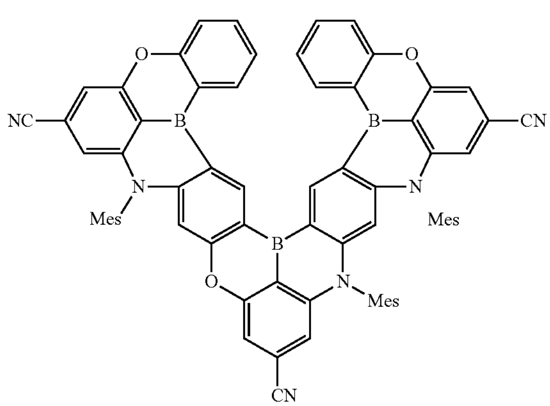
(1-10-193)
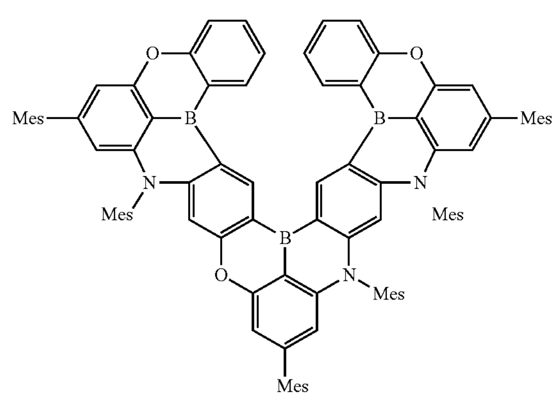

-continued
(1-10-194)
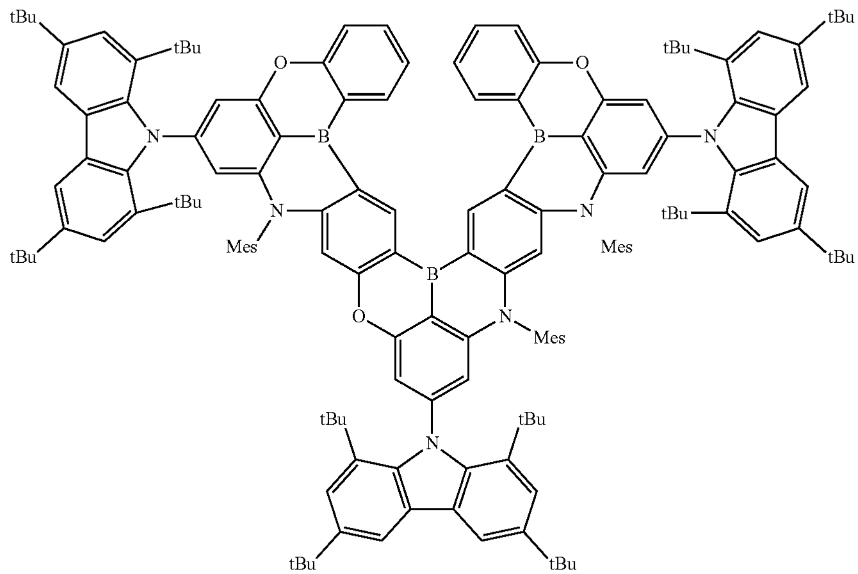
(1-10-195)
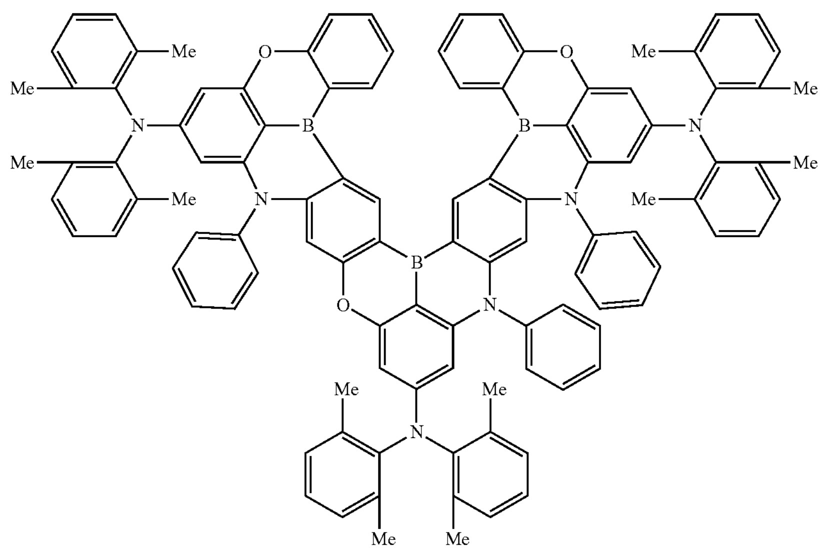
(1-10-196)
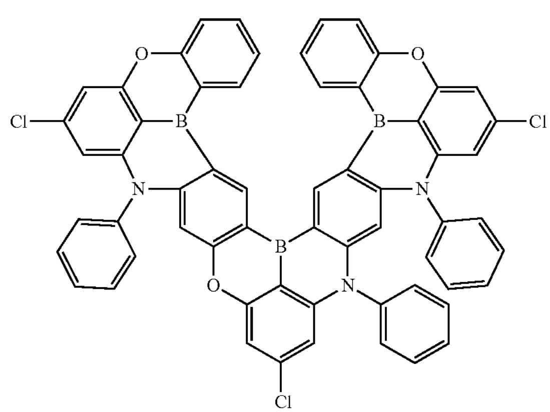
(1-10-197)
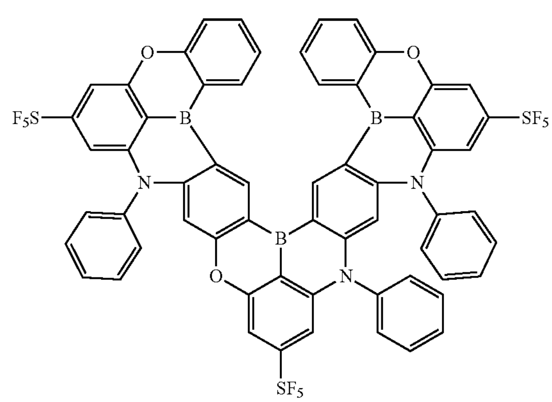

-continued
(1-10-198)
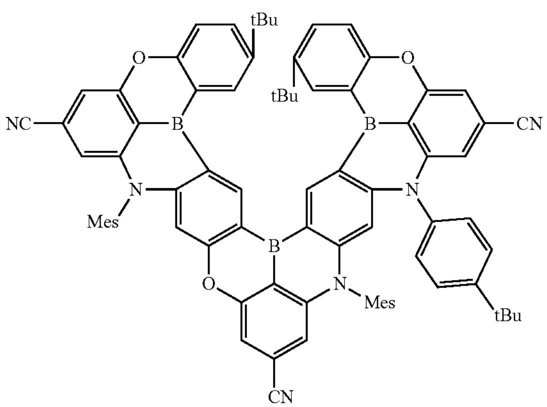
(1-10-199)
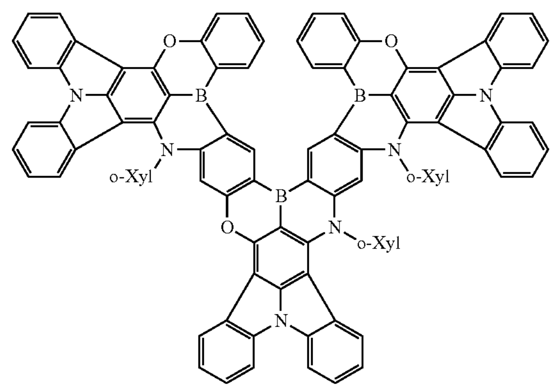
(1-10-200)
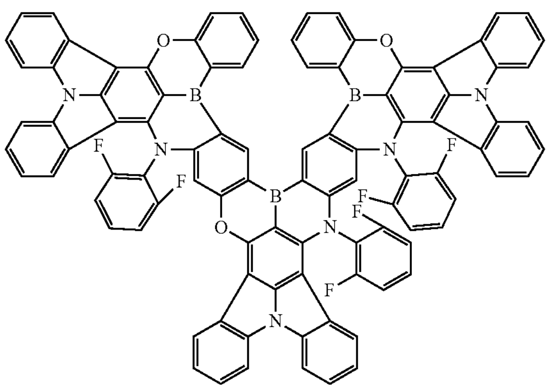
(1-10-221)
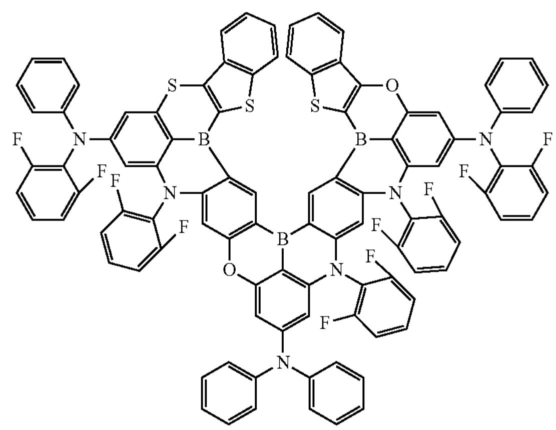
(1-10-222)
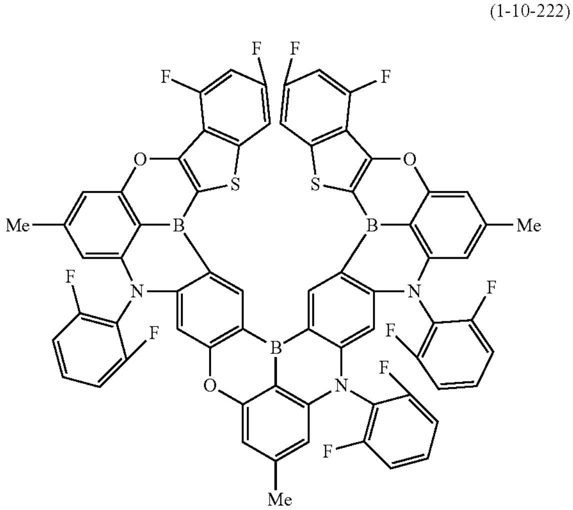
(1-10-223)
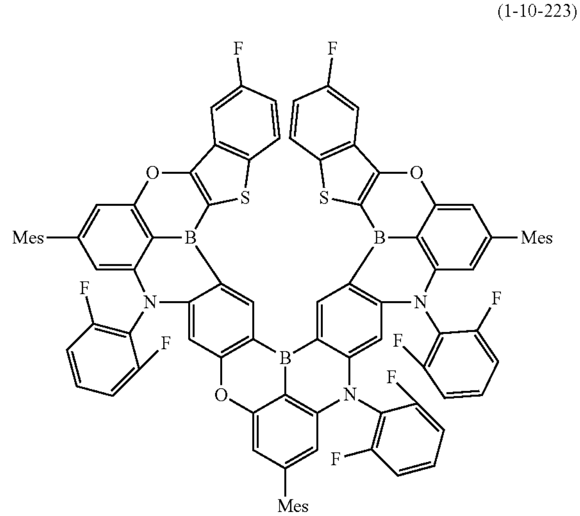

-continued
(1-10-224)
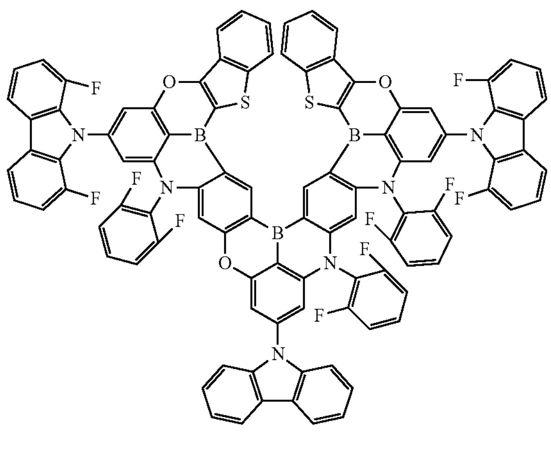
(1-10-225)
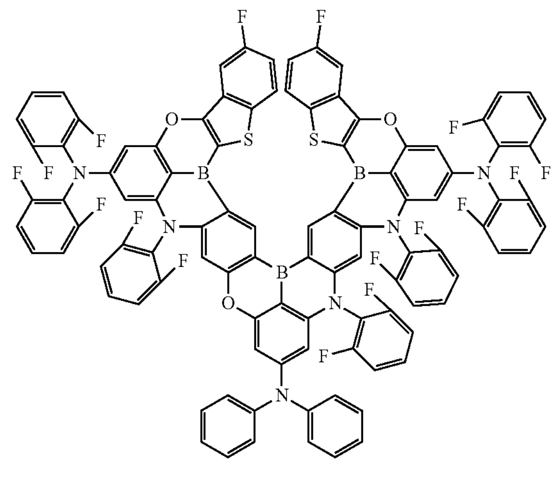
(1-10-226)
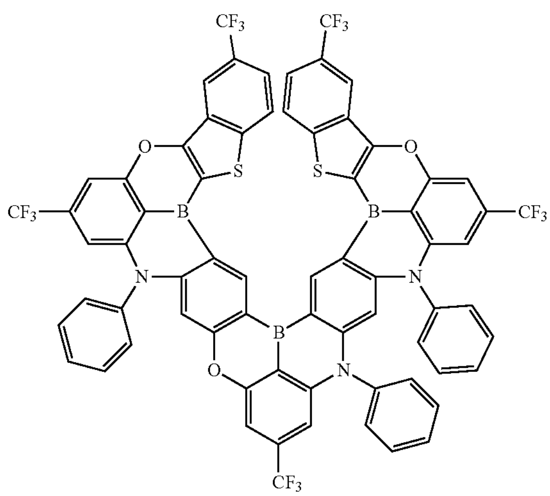
(1-10-227)
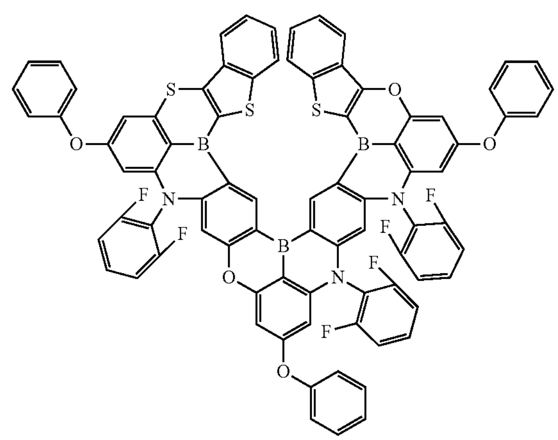
(1-10-228)
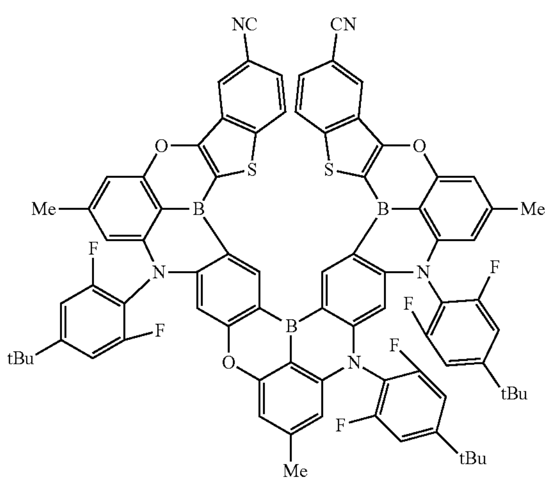
(1-10-229)
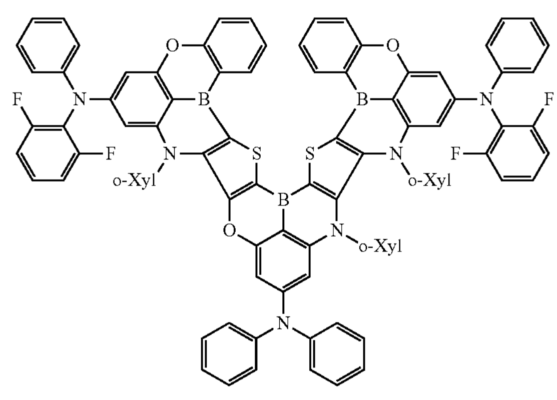

-continued
(1-10-230)
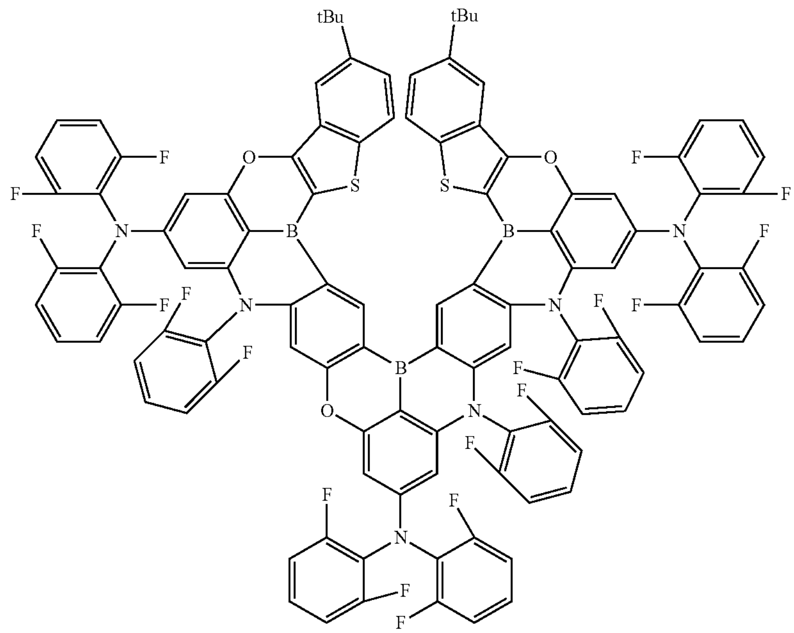
(1-11-1)
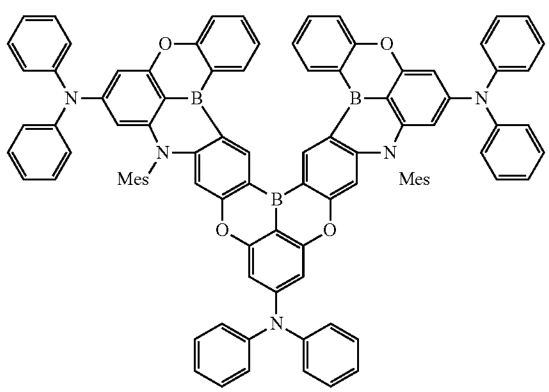
(1-11-2)
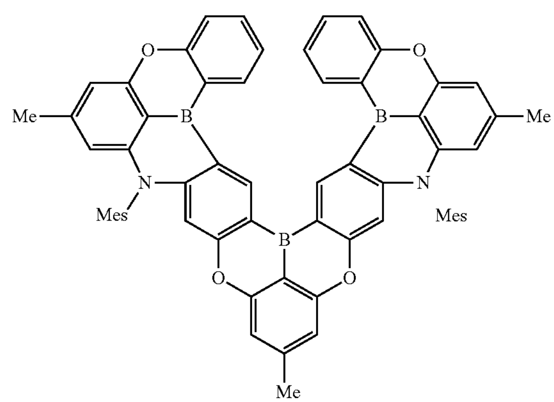
(1-11-3)
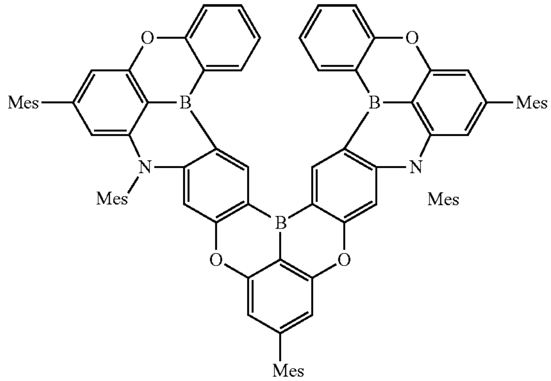
(1-11-4)
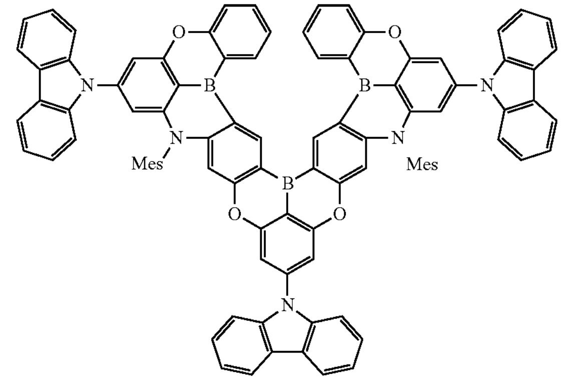

-continued
(1-11-5)
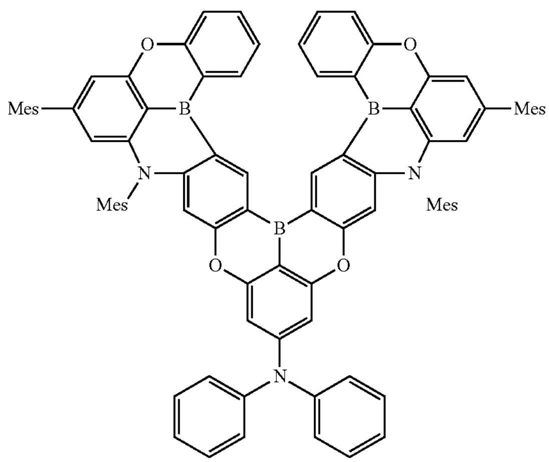
(1-11-6)
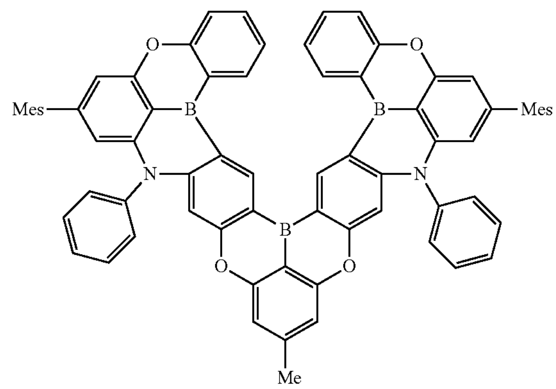
(1-11-7)
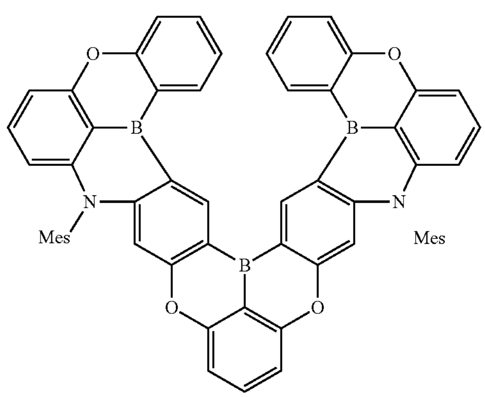
(1-11-8)
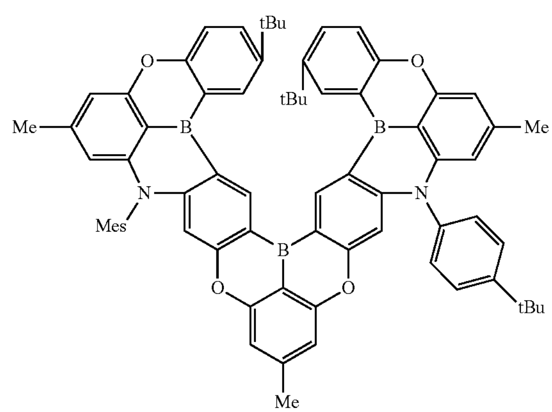
(1-11-9)
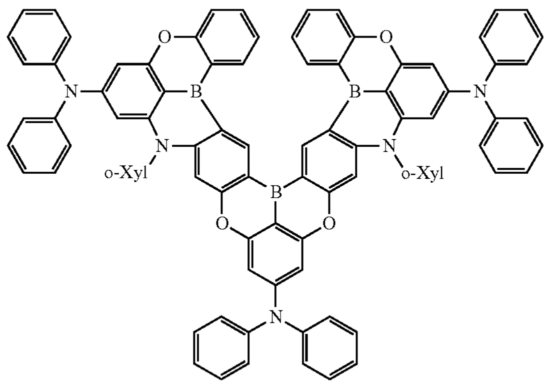
(1-11-10)
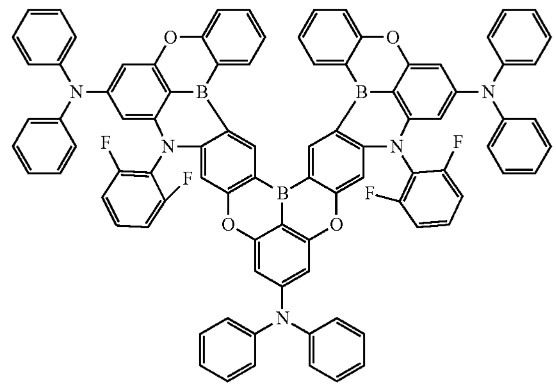

-continued
(1-11-21)
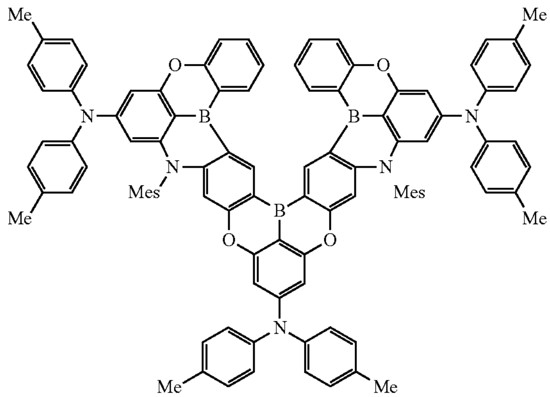
(1-11-22)
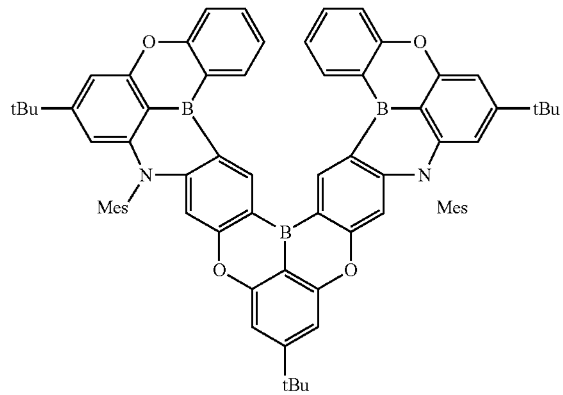
(1-11-23)
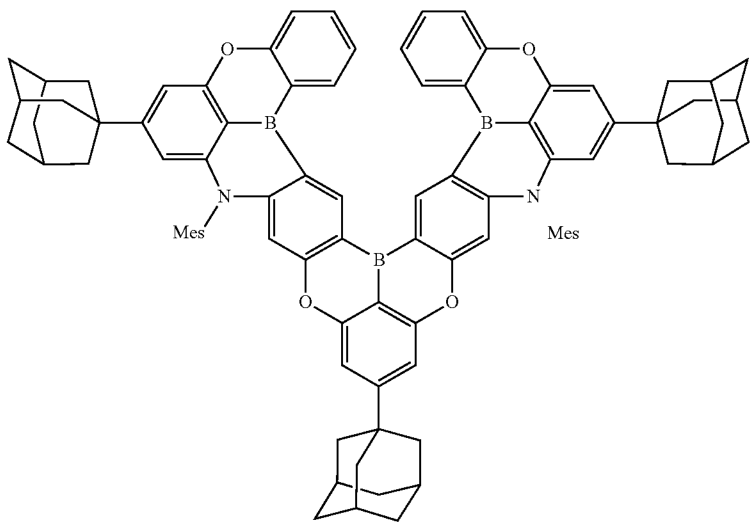
(1-11-24)
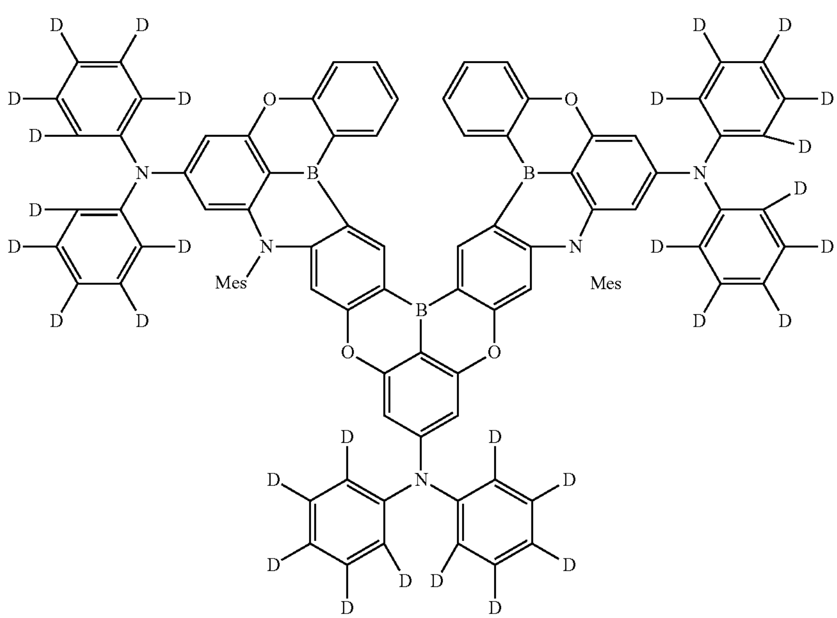

-continued
(1-11-25)
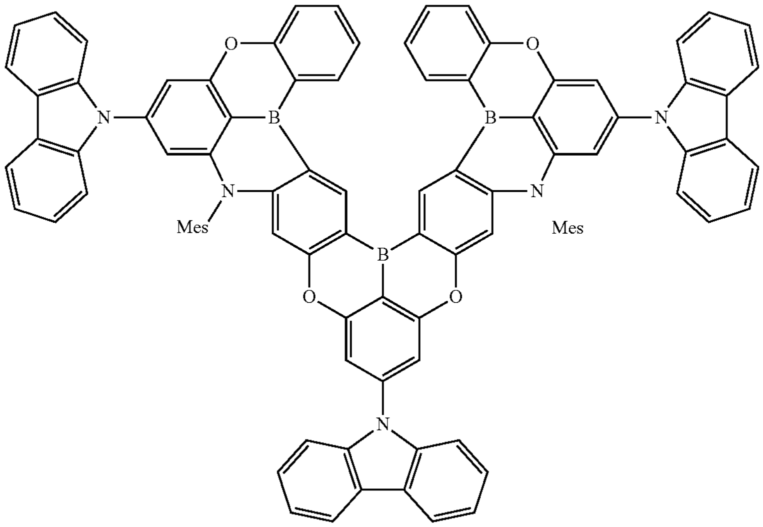
(1-11-26)
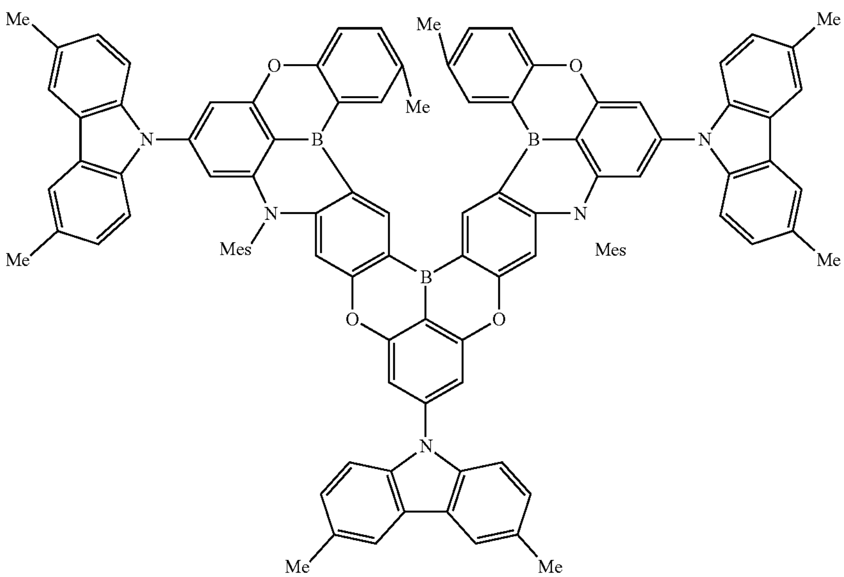
(1-11-27)
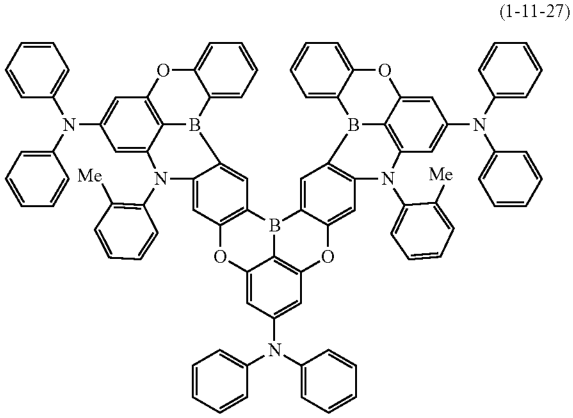
(1-11-28)
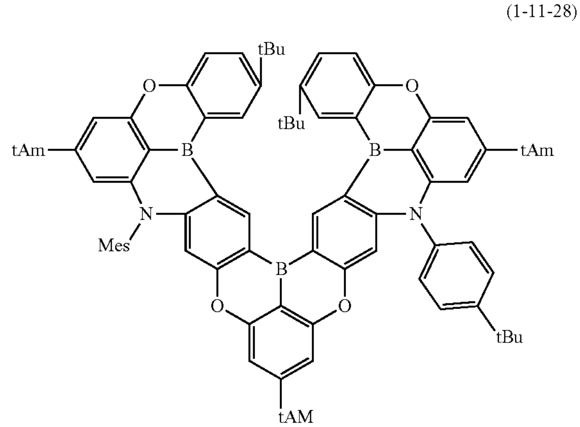

-continued
(1-11-29)
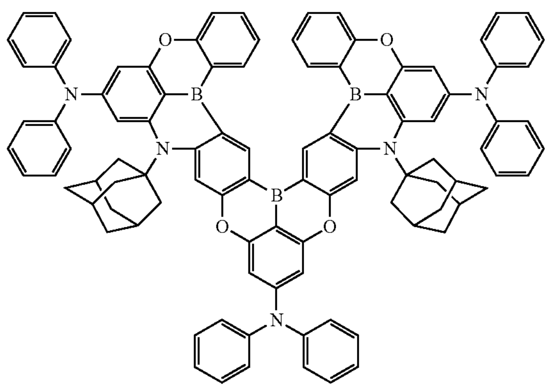
(1-11-30)
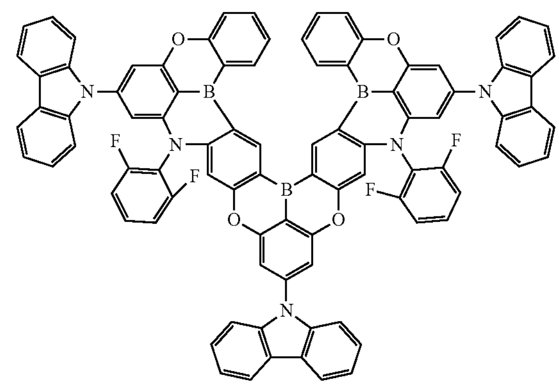
(1-11-41)
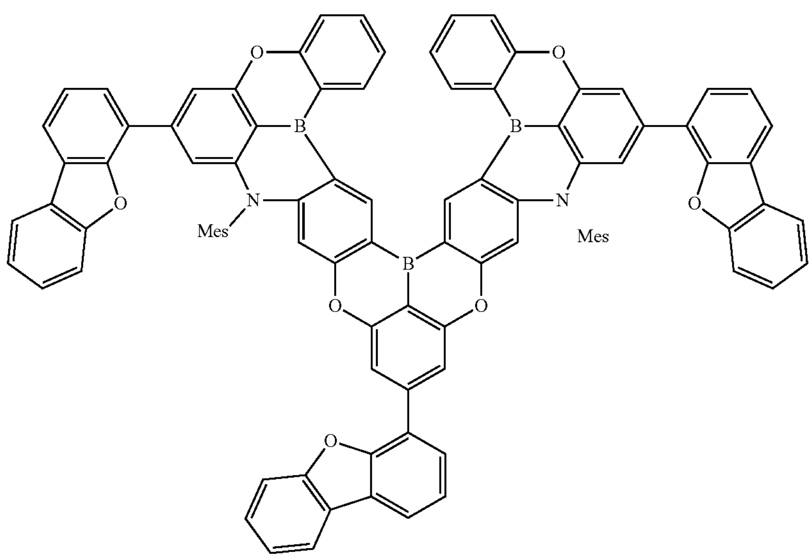
(1-11-42)
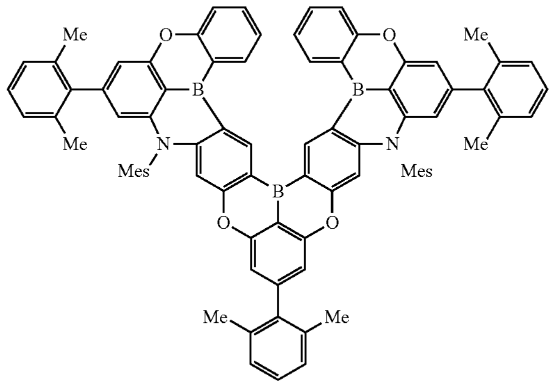
(1-11-43)
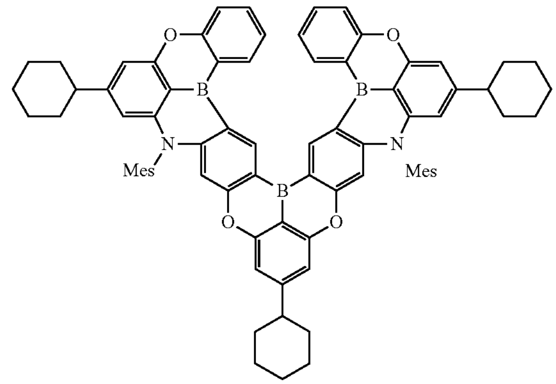

-continued
(1-11-44)
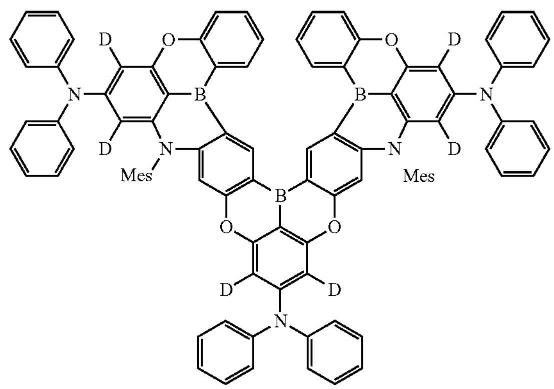
(1-11-45)
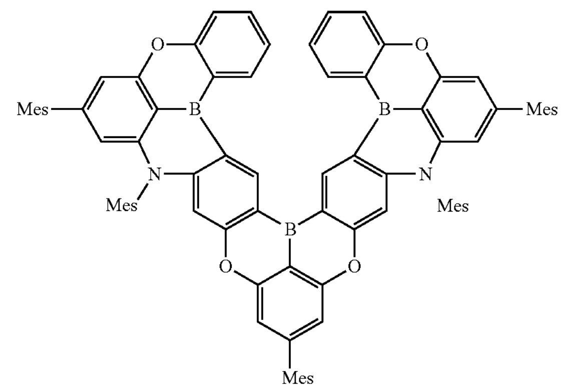
(1-11-46)
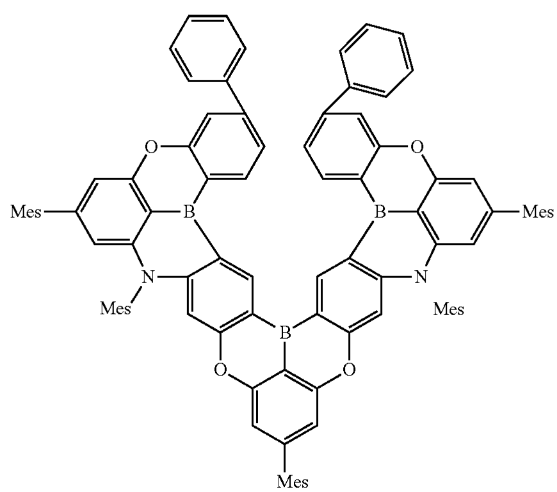
(1-11-47)
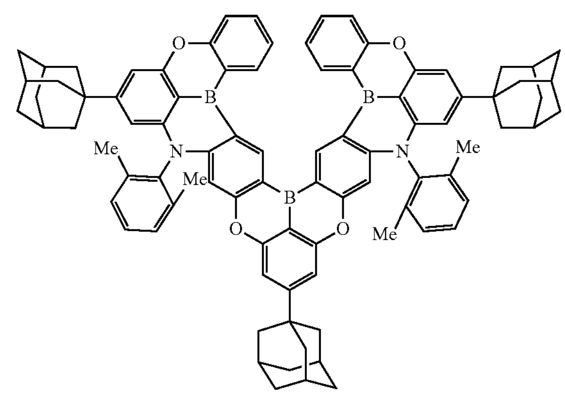
(1-11-48)
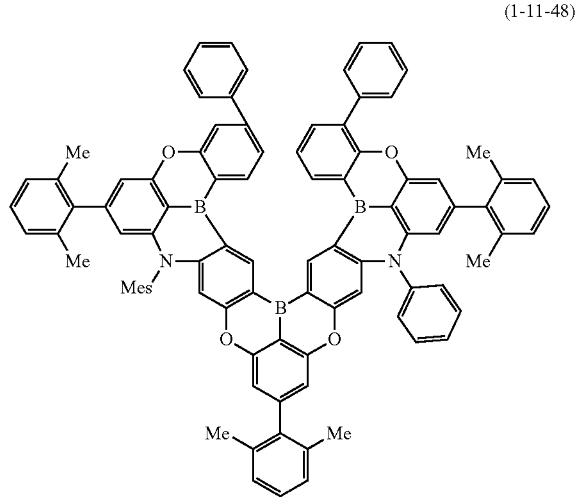
(1-11-49)
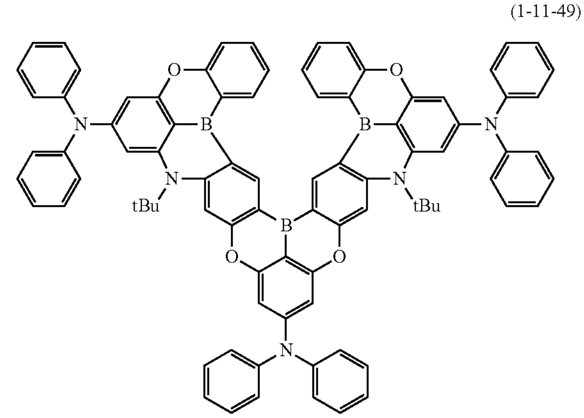

-continued
(1-11-50)
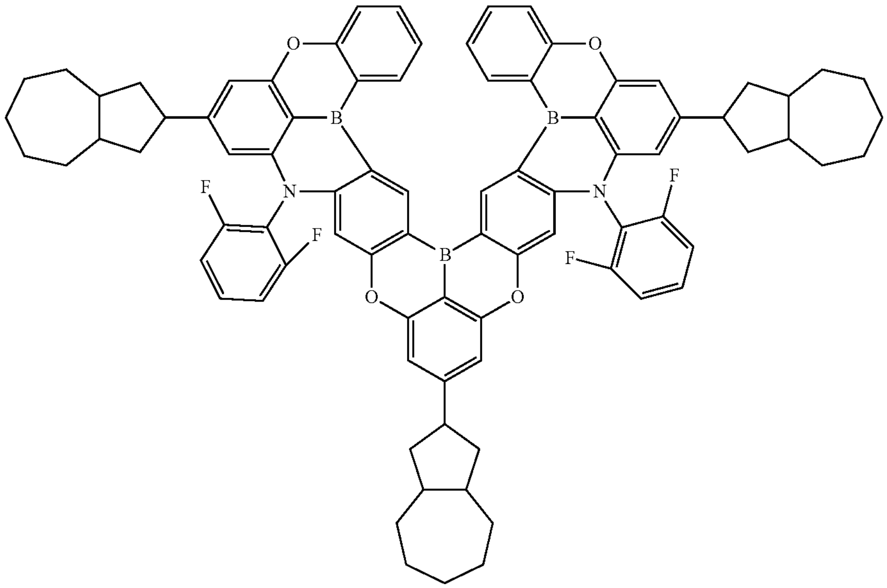
(1-11-101)
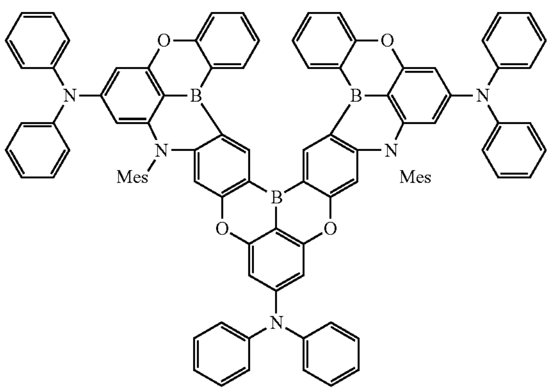
(1-11-102)
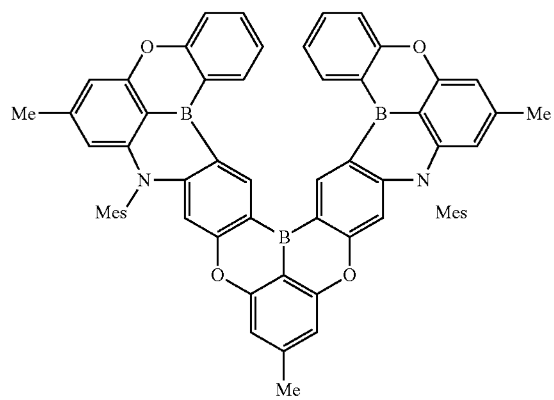
(1-11-103)
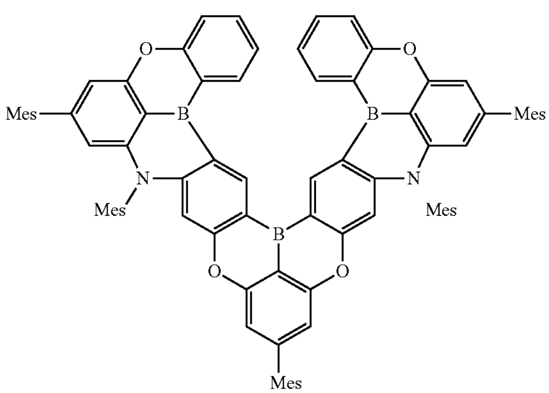
(1-11-104)
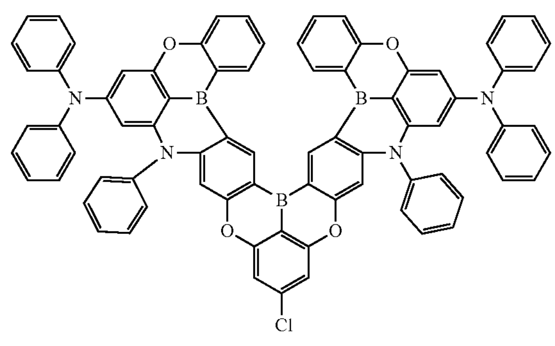

-continued
(1-11-105)
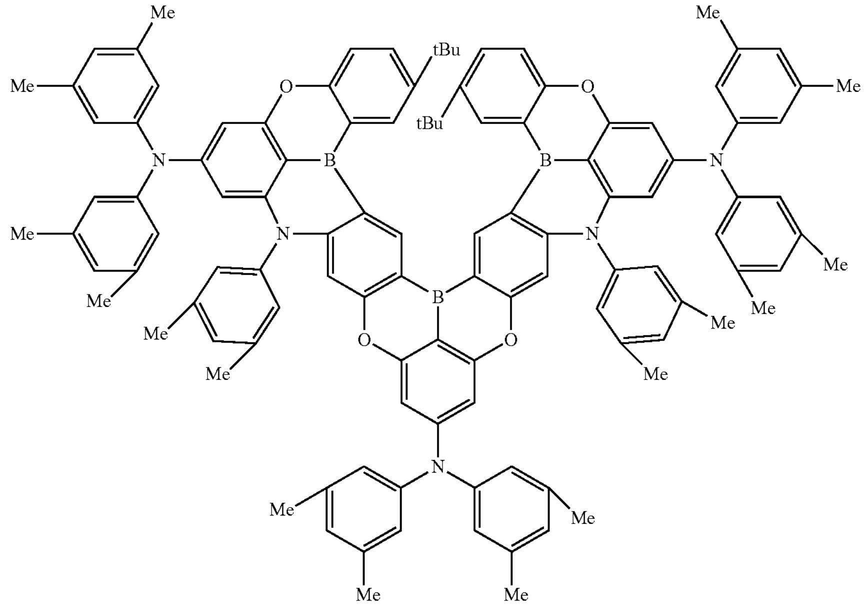
(1-11-106)
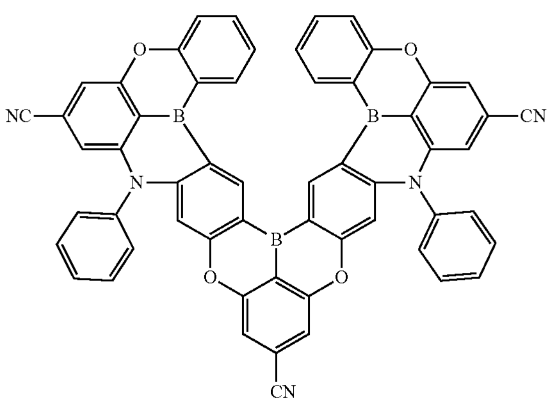
(1-11-107)
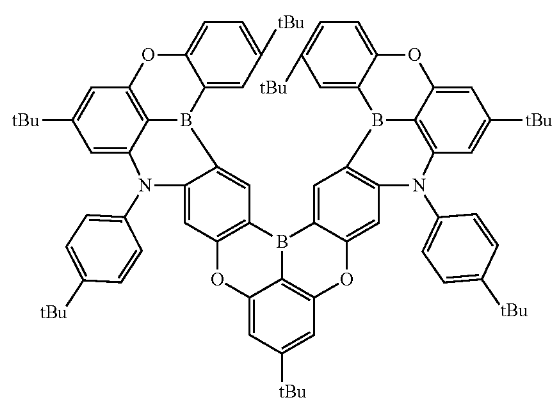
(1-11-108)
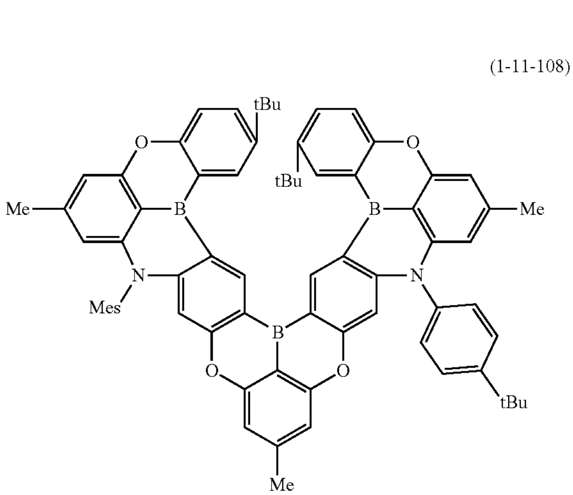
(1-11-109)
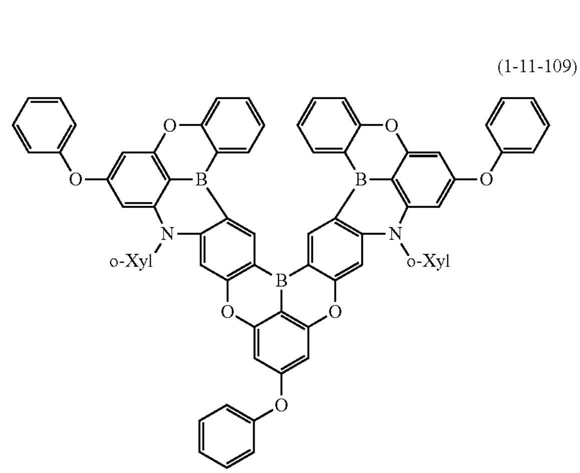

-continued
(1-11-110)
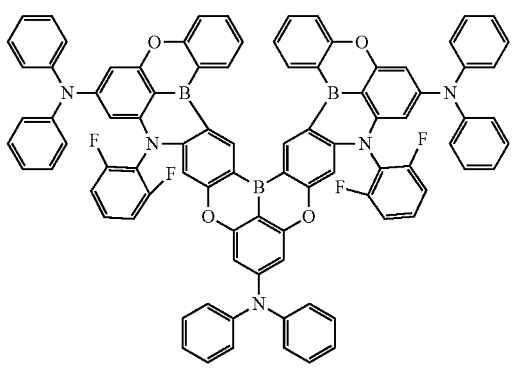
(1-11-121)
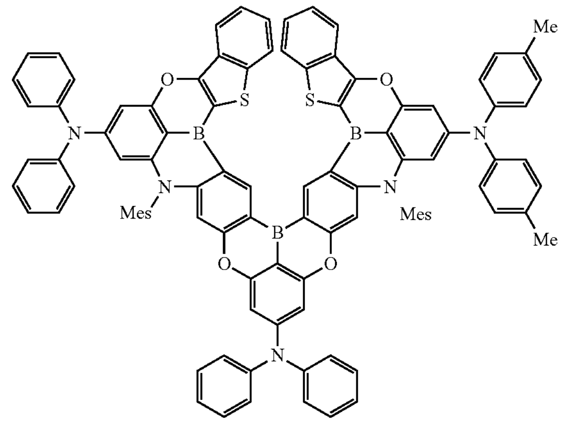
(1-11-122)
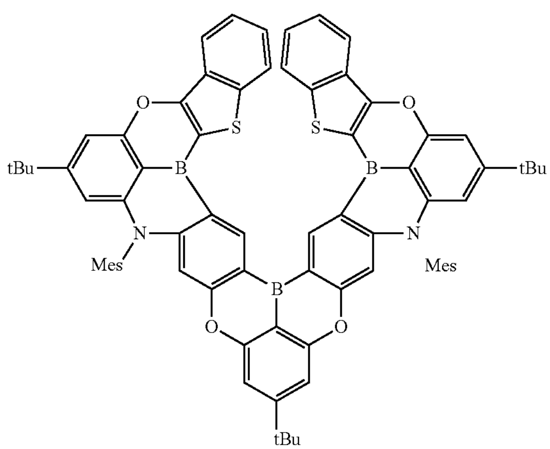
(1-11-123)
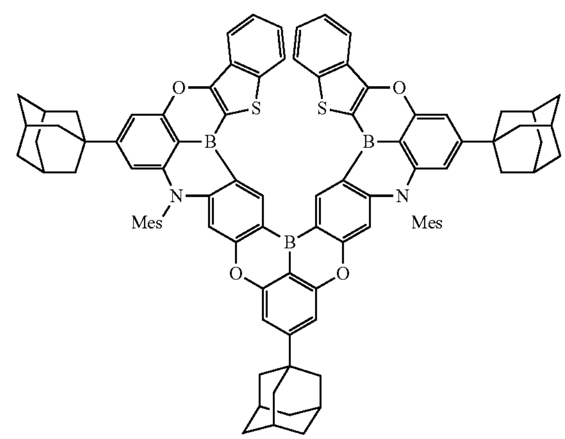
(1-11-124)
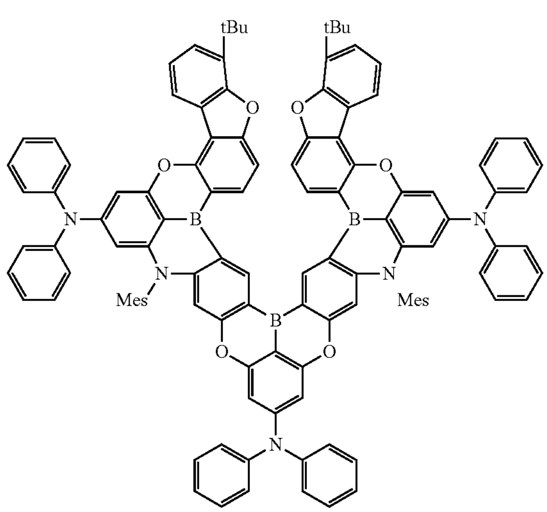
(1-11-125)
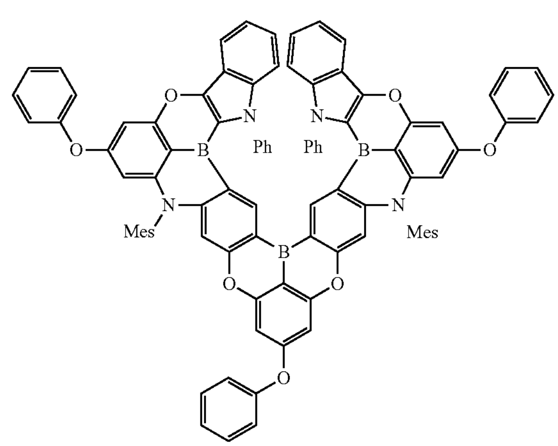

-continued
(1-11-126)
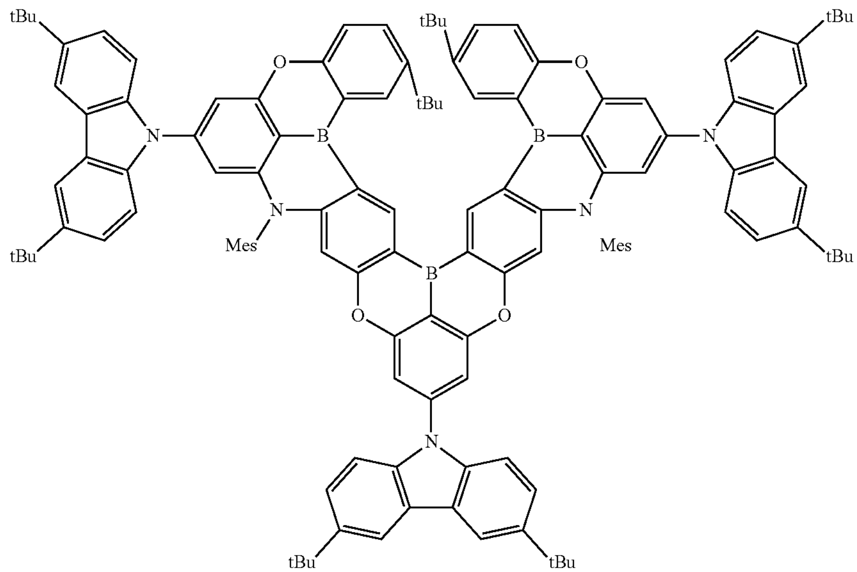
(1-11-127)
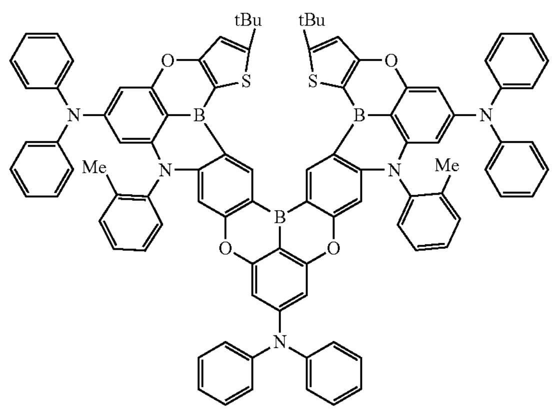
(1-11-128)
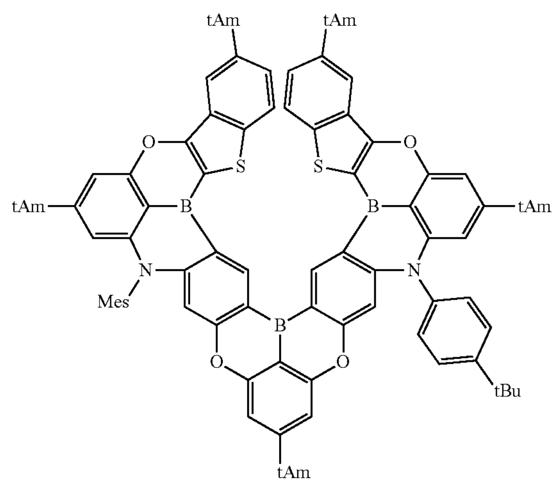
(1-11-129)
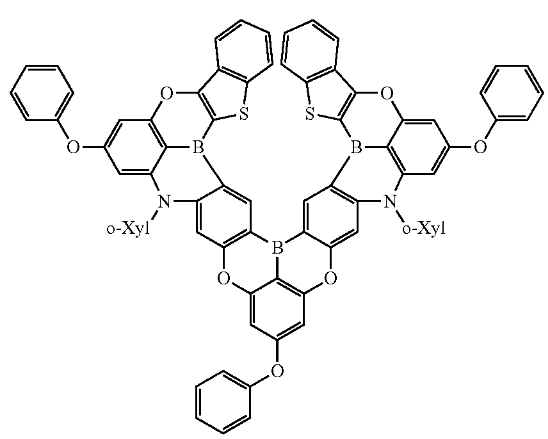
(1-11-130)
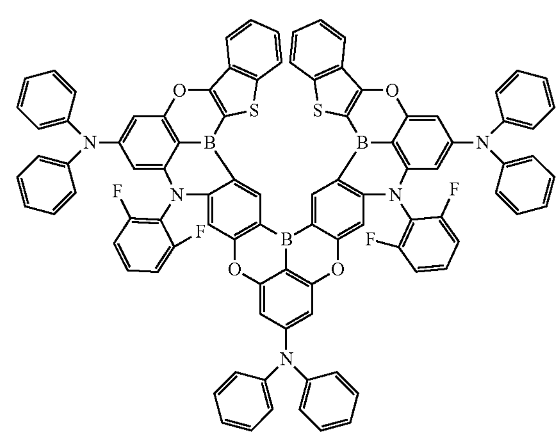

-continued
(1-11-141)
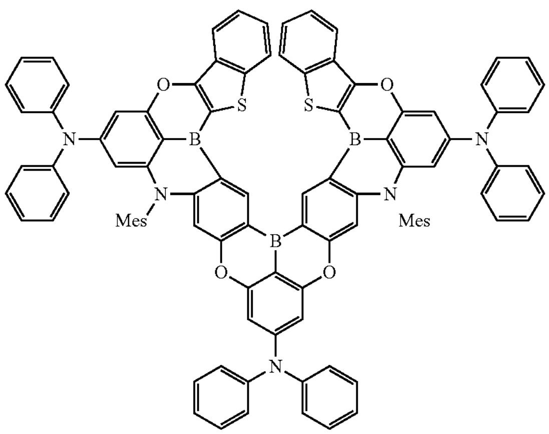
(1-11-142)
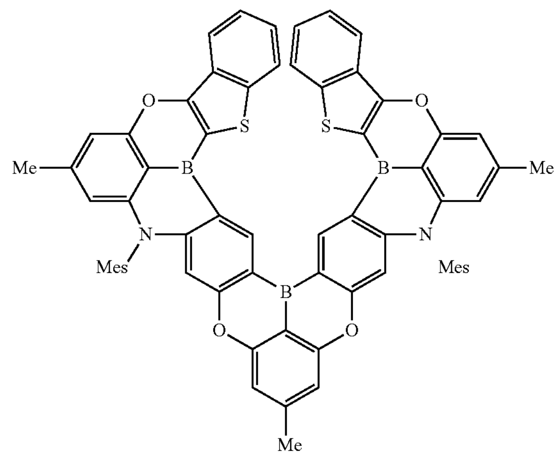
(1-11-143)
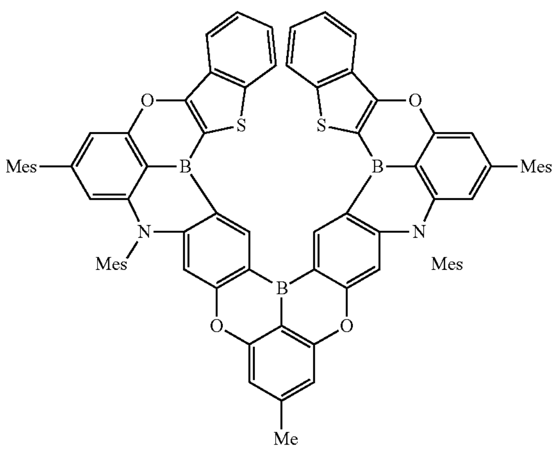
(1-11-144)
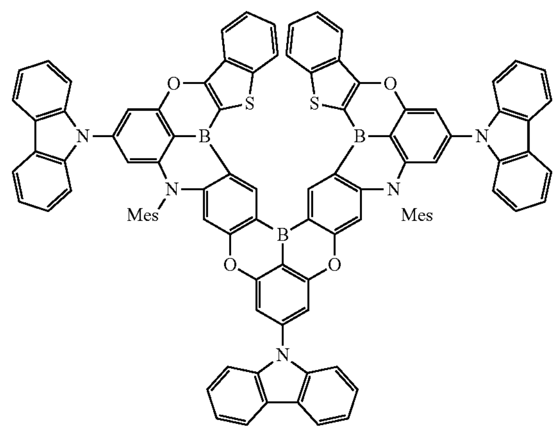
(1-11-145)
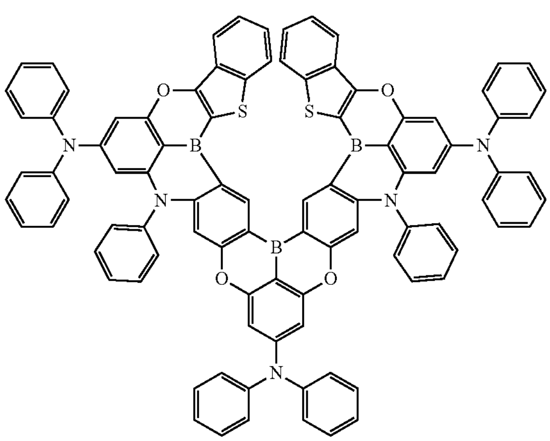
(1-11-146)
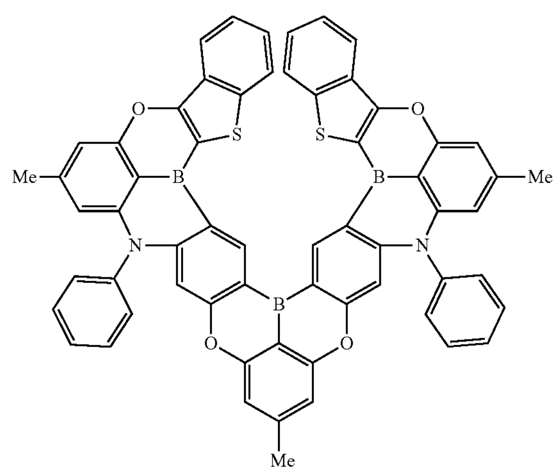

-continued
(1-11-147)
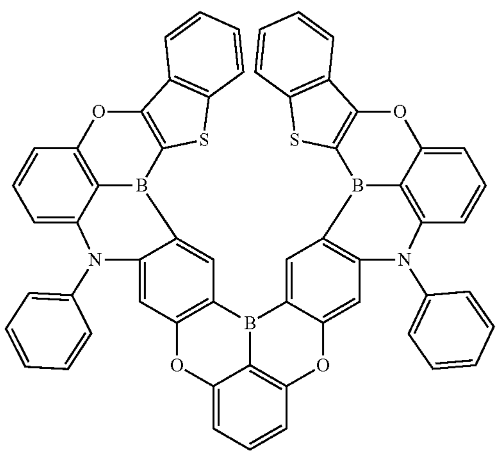
(1-11-148)
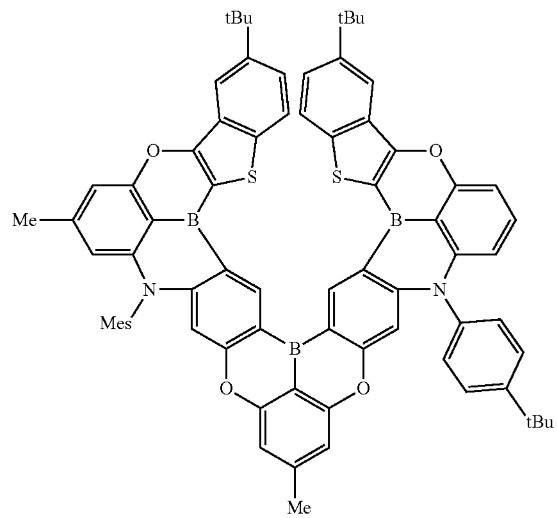
(1-11-149)
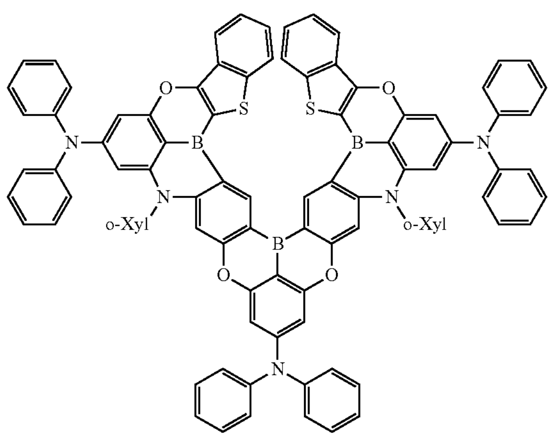
(1-11-150)
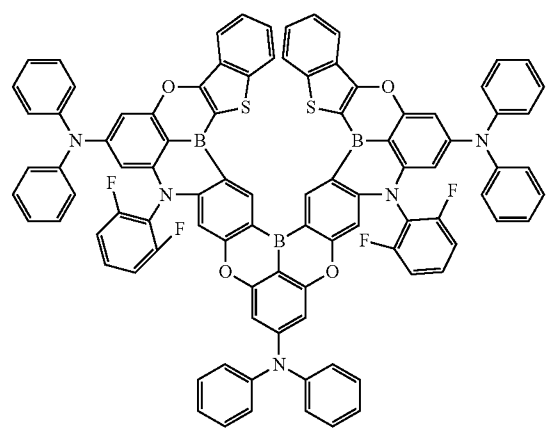
(1-11-161)
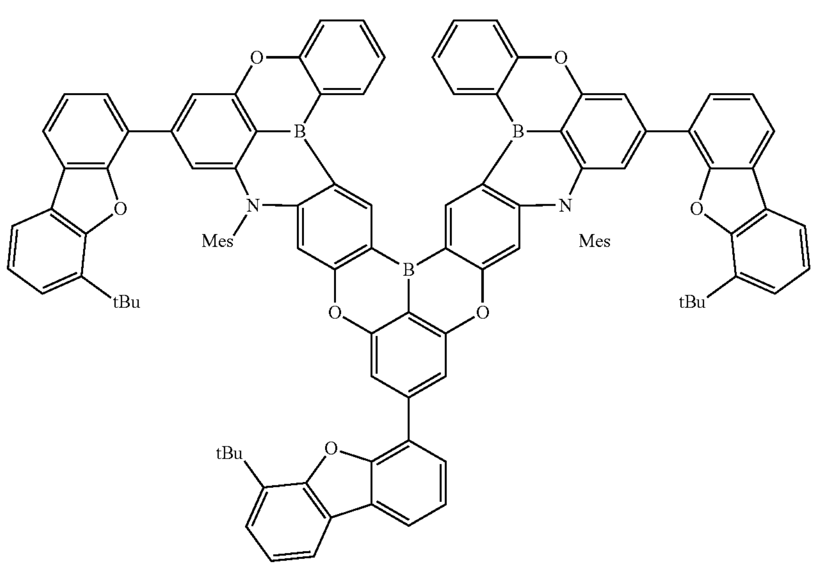

-continued
(1-11-162)
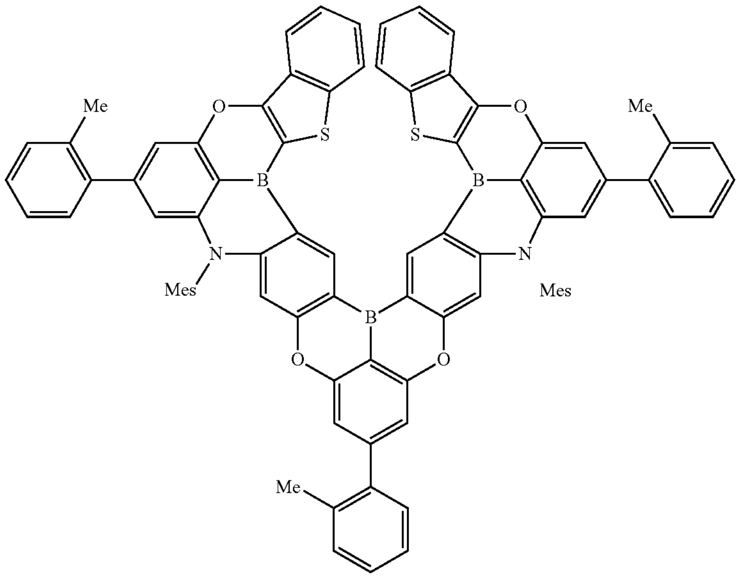
(1-11-163)
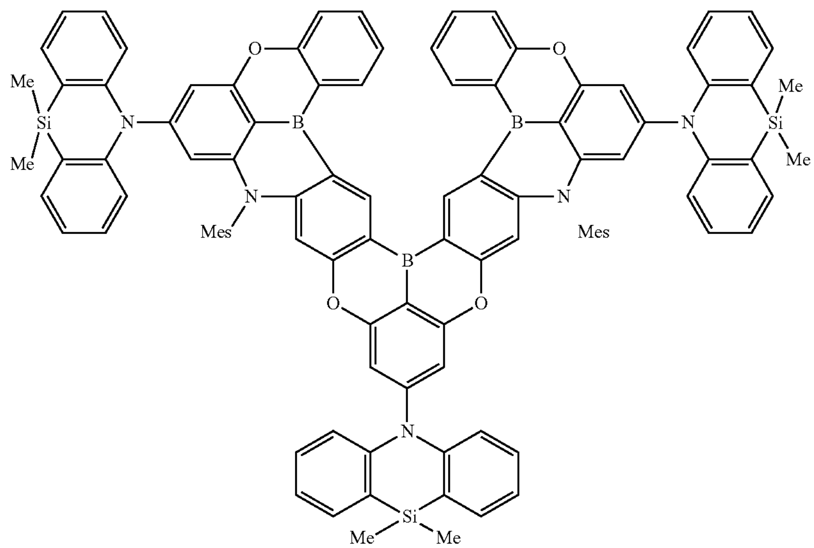
(1-11-164)
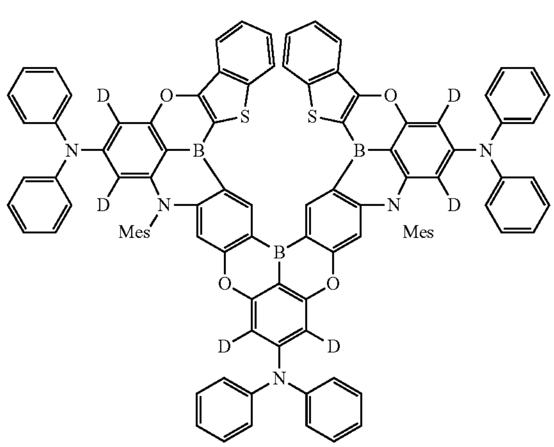
(1-11-165)
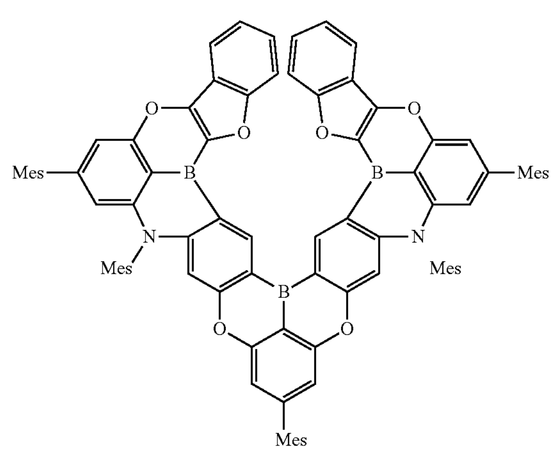

-continued
(1-11-166)
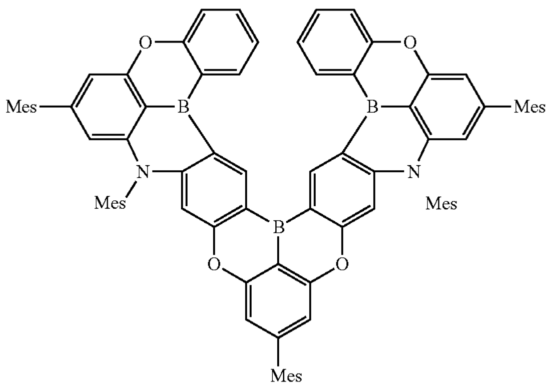
(1-11-167)
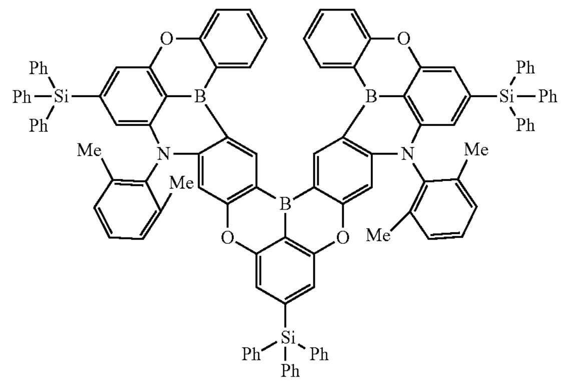
(1-11-168)
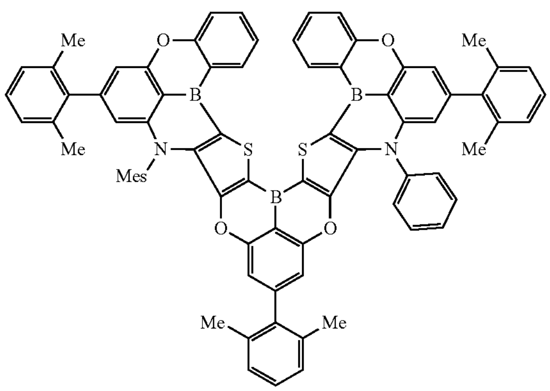
(1-11-169)
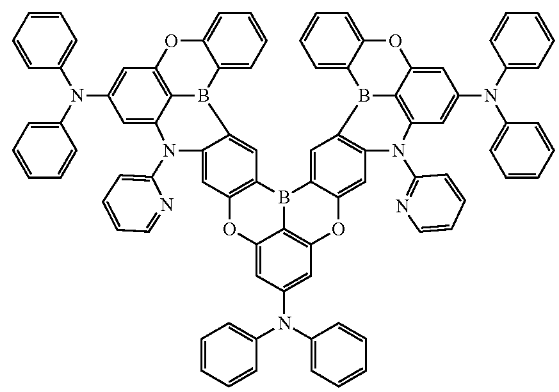
(1-11-170)
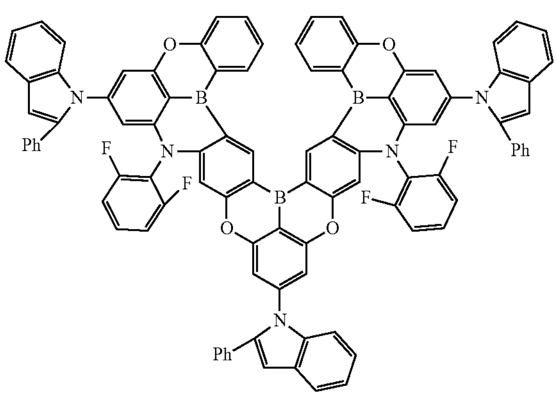
(1-11-191)
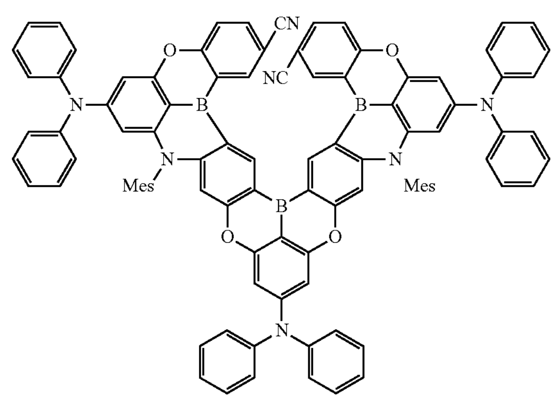
(1-11-192)
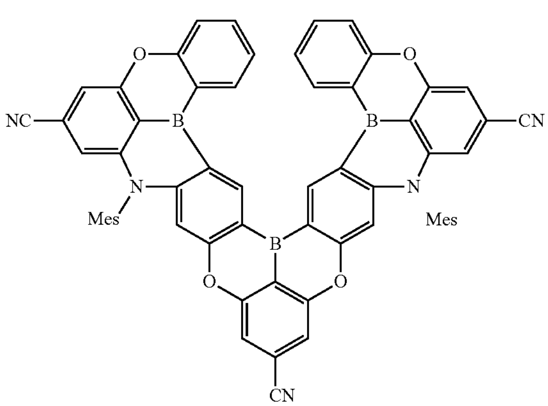
(1-11-193)
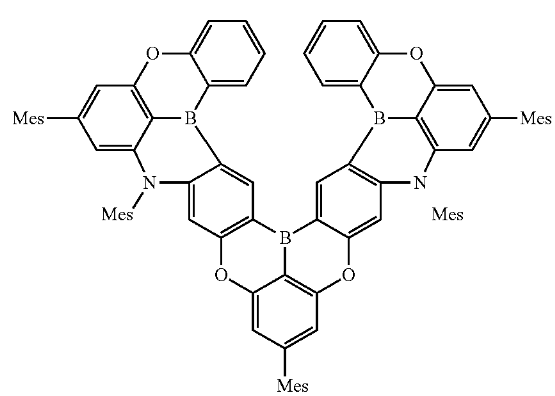

-continued
(1-11-194)
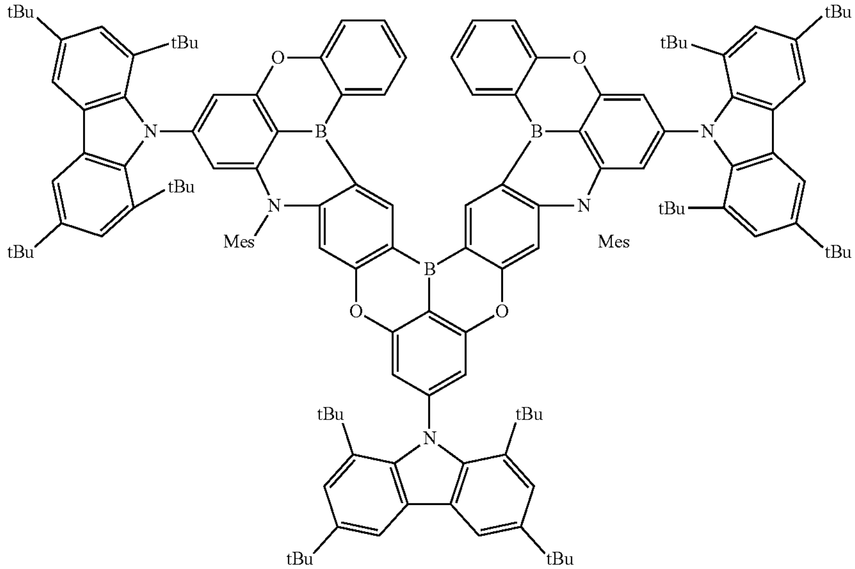
(1-11-195)
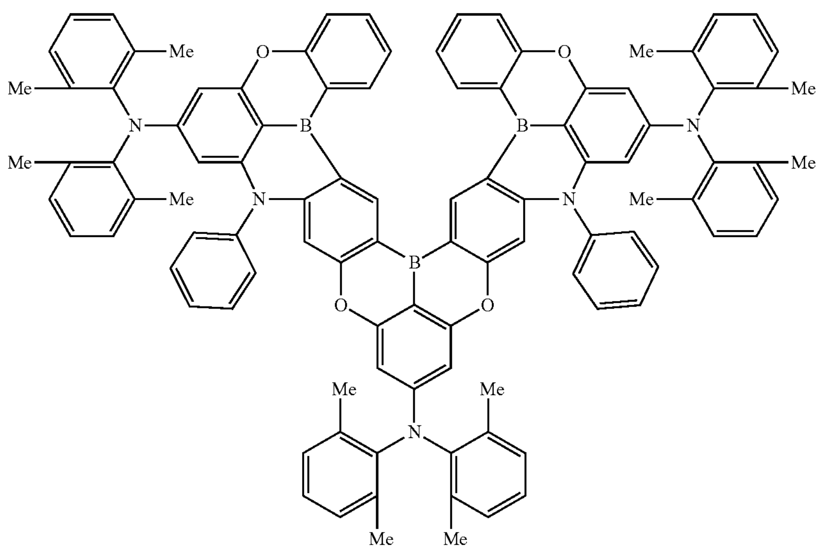
(1-11-196)
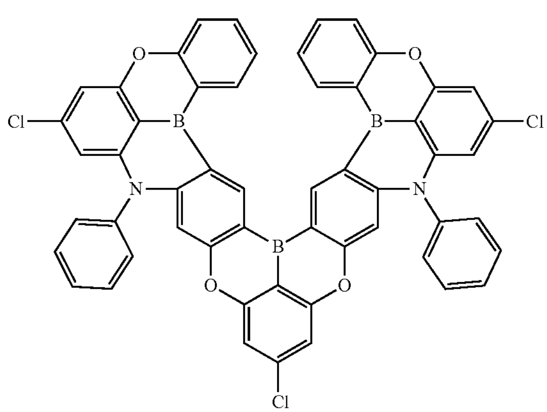
(1-11-197)
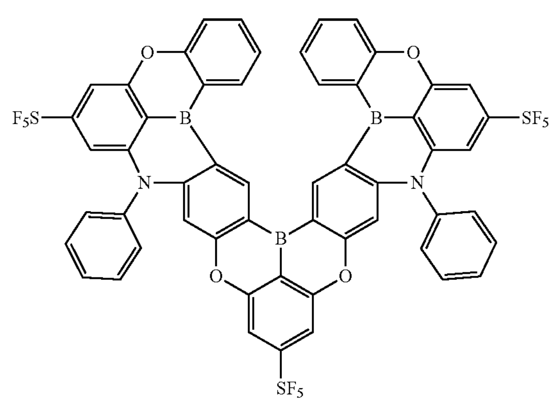

-continued
(1-11-198)
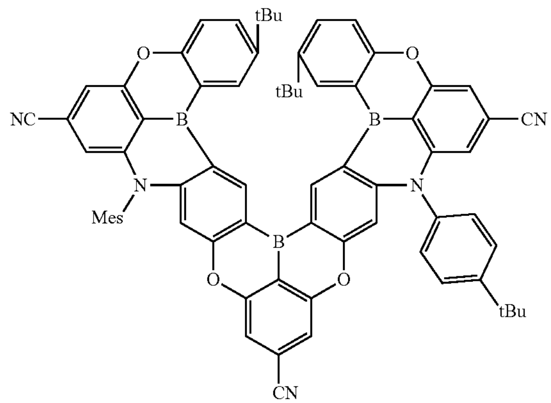
(1-11-199)
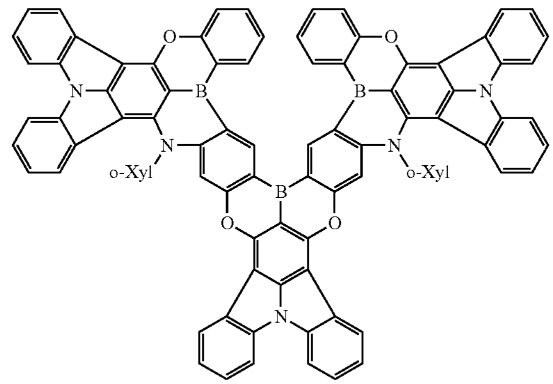
(1-11-200)
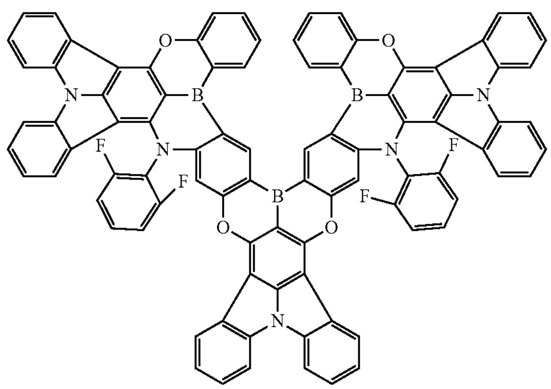
(1-11-221)
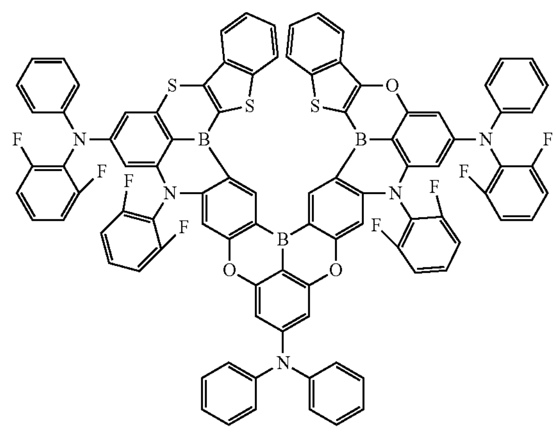
(1-11-222)
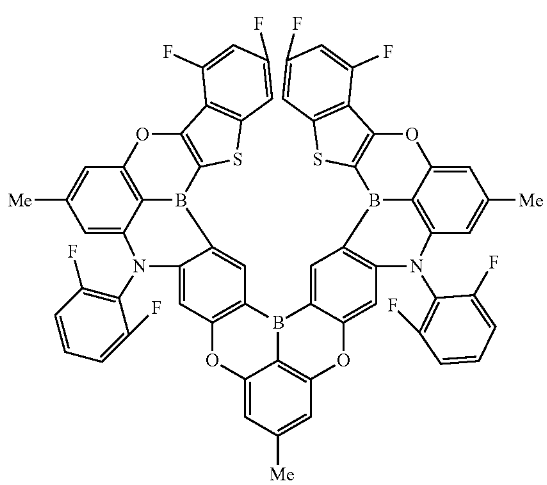
(1-11-223)
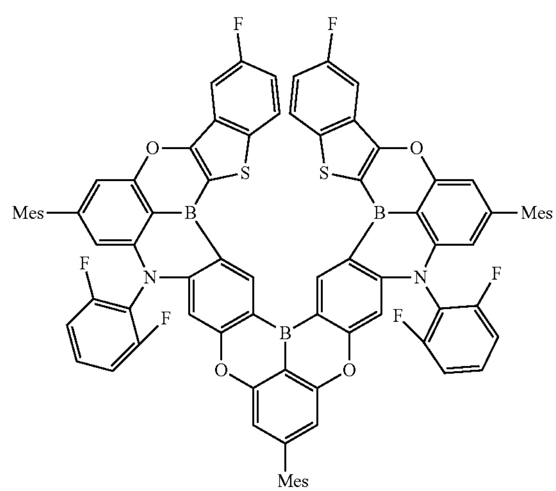

-continued
(1-11-224)
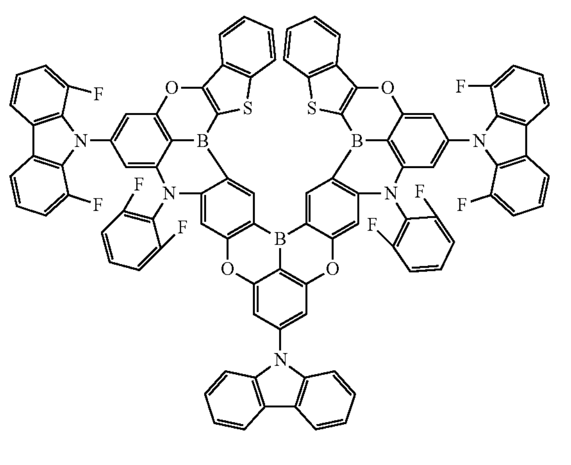
(1-11-225)
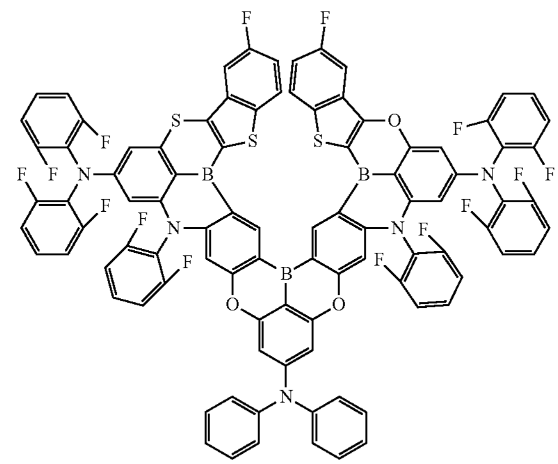
(1-11-226)
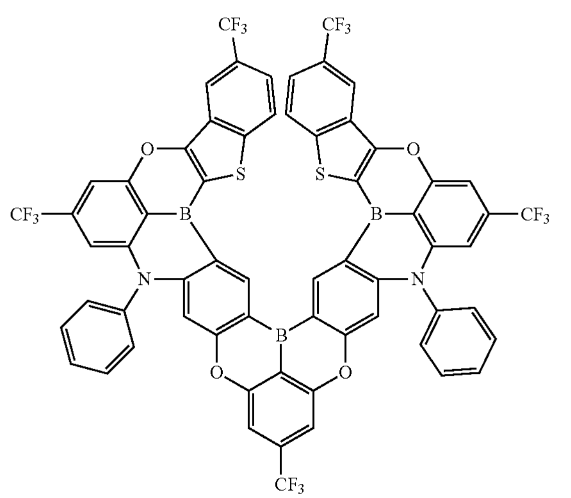
(1-11-227)
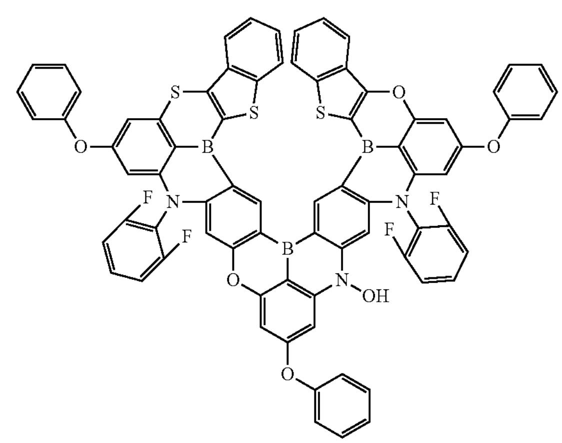
(1-11-228)
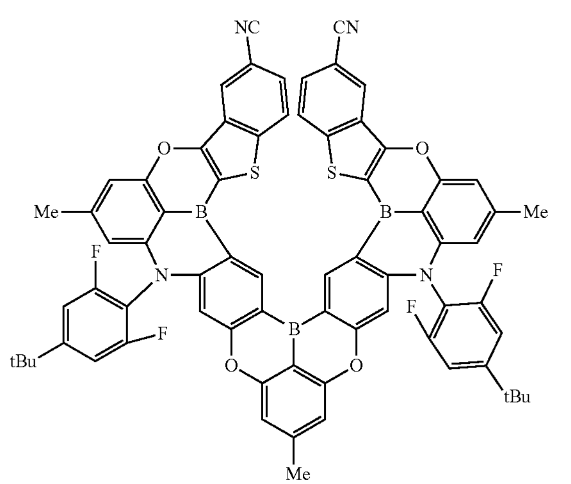
(1-11-229)
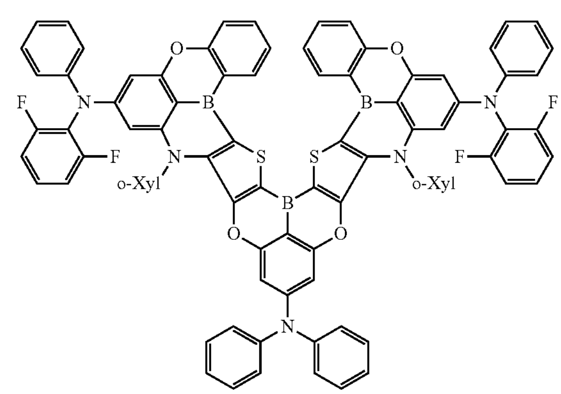

-continued
(1-11-230)
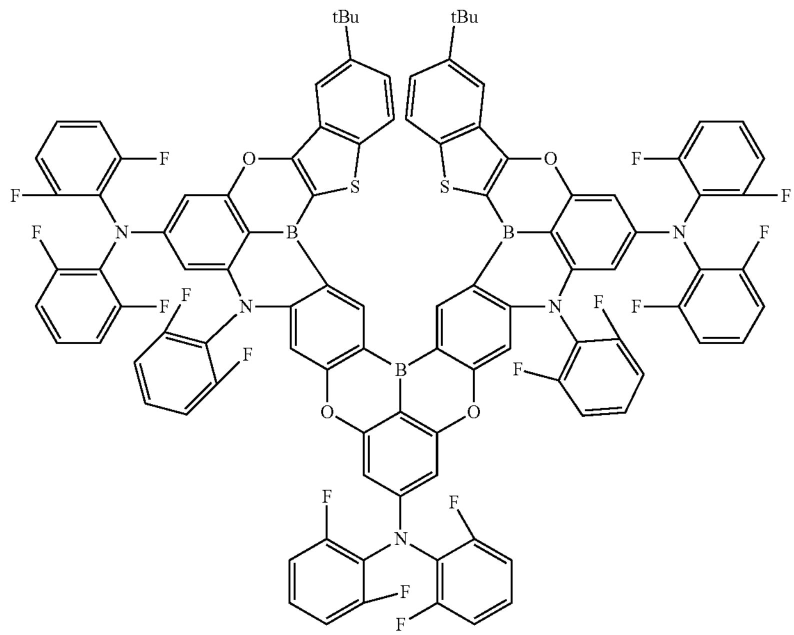
(1-12-1)
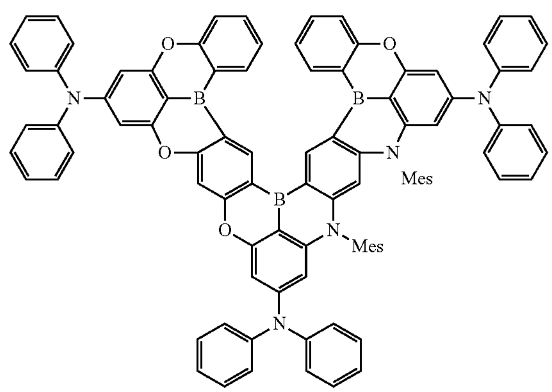
(1-12-2)
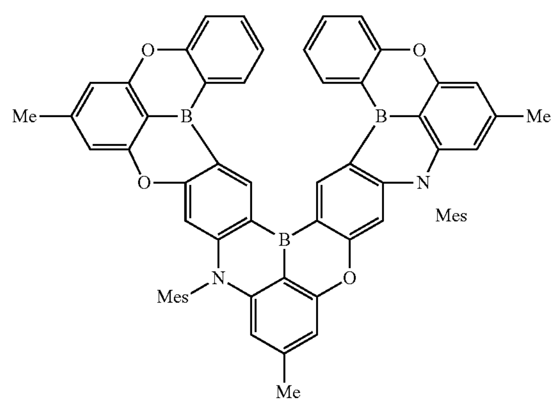
(1-12-3)
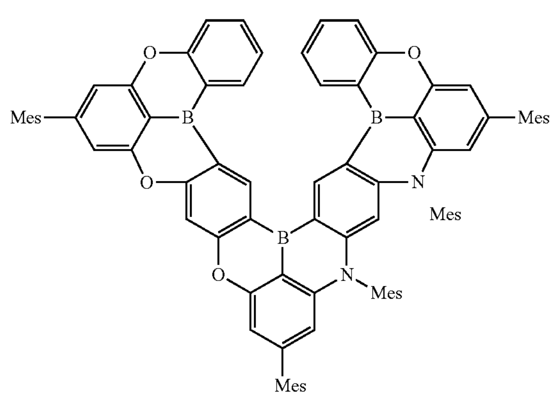
(1-12-4)
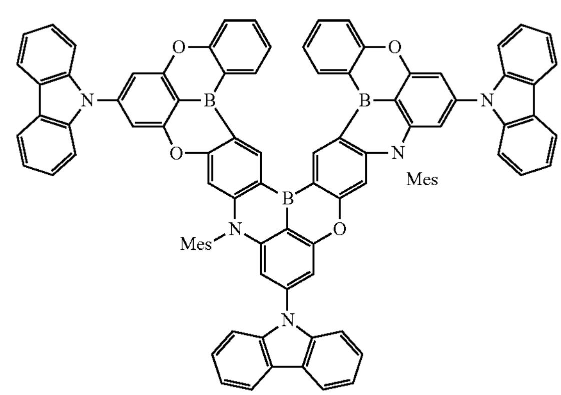

-continued
(1-12-5)
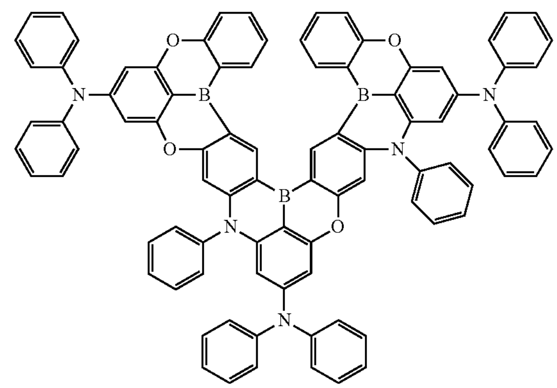
(1-12-6)
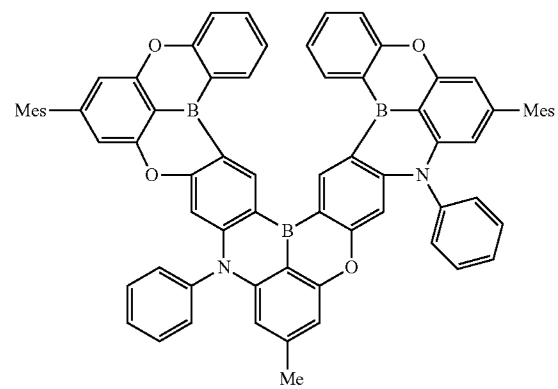
(1-12-7)
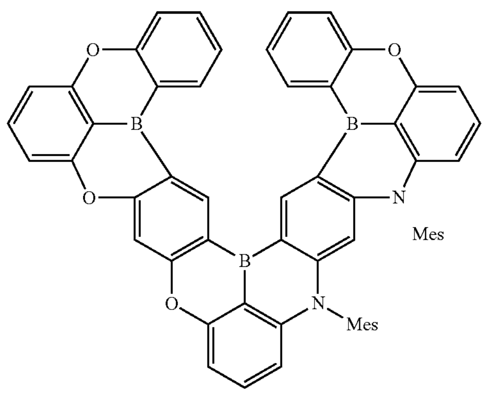
(1-12-8)
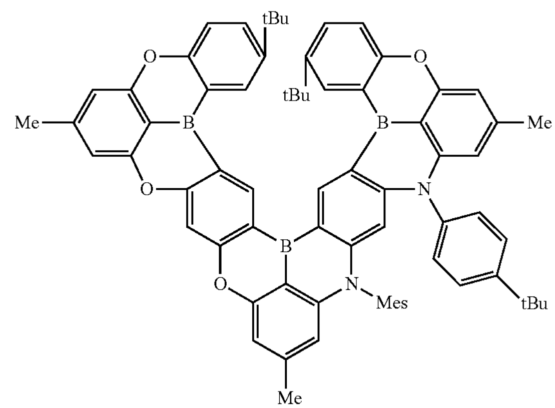
(1-12-9)
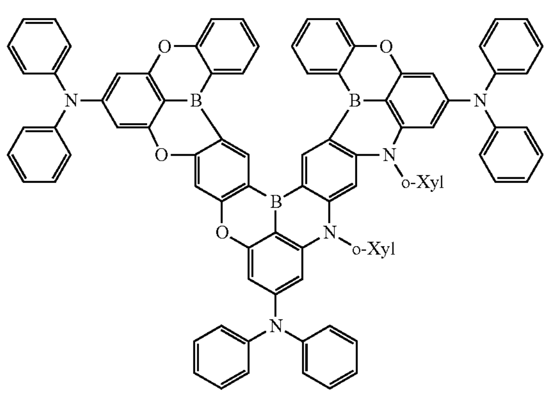
(1-12-10)
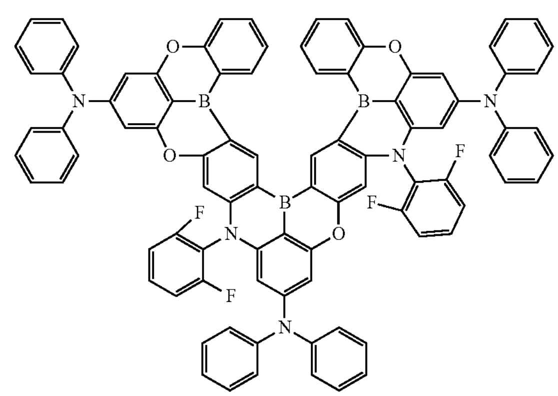
(1-12-21)
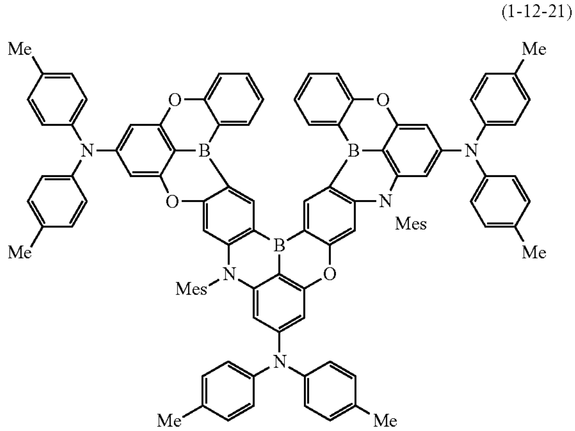
(1-12-22)
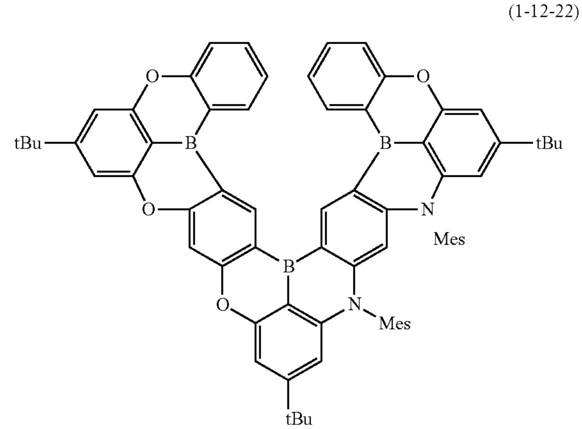

-continued
(1-12-23)
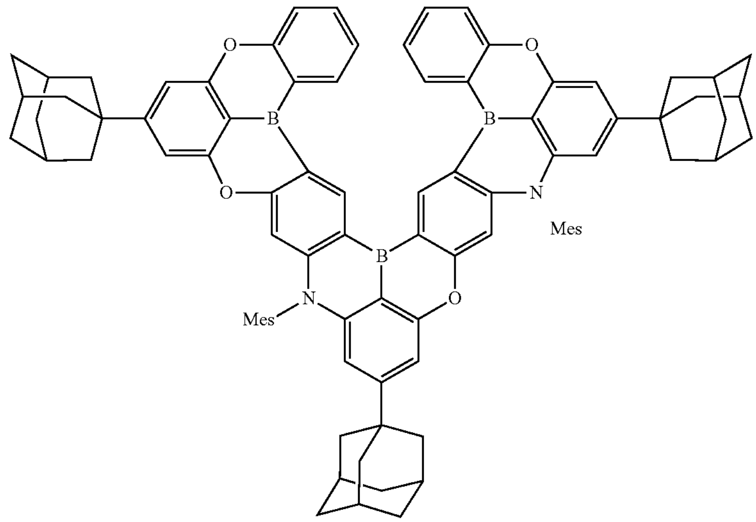
(1-12-24)
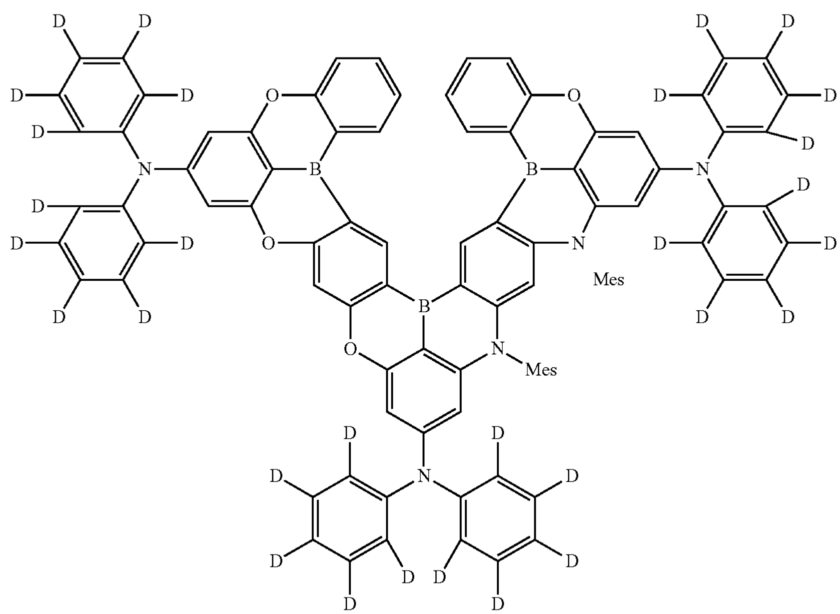
(1-12-25)
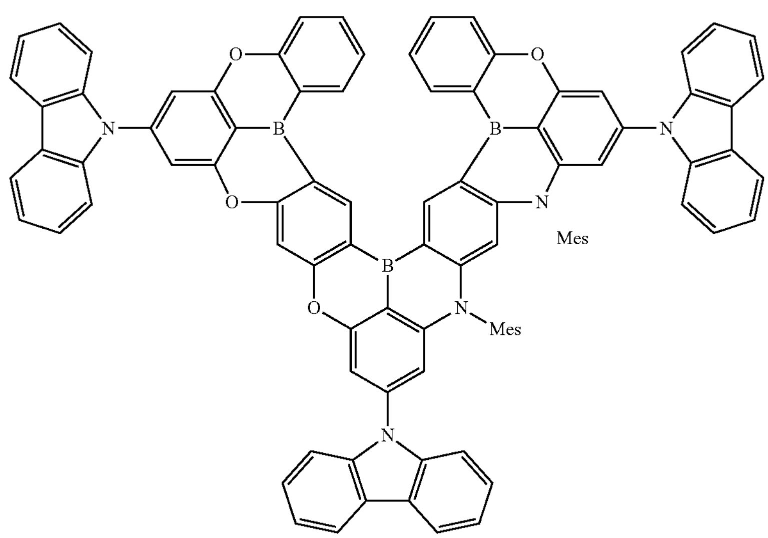

-continued
(1-12-26)
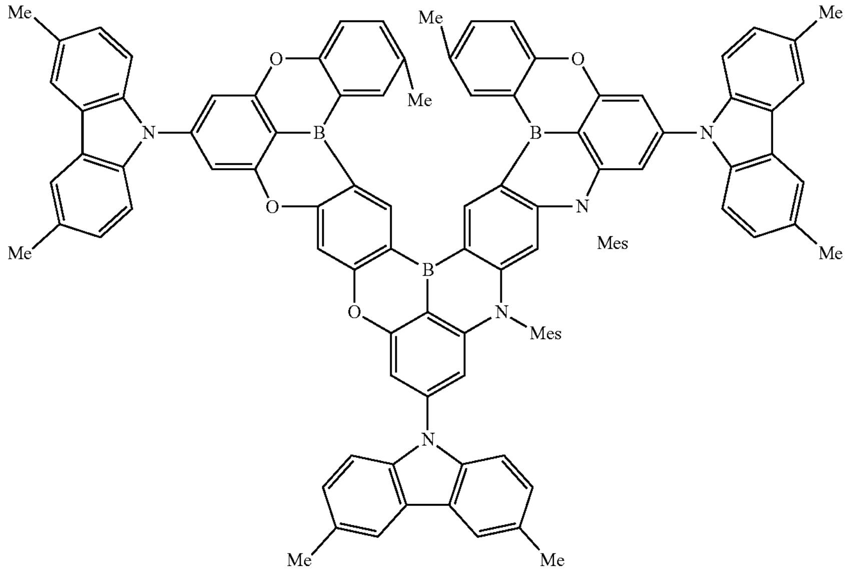
(1-12-27)
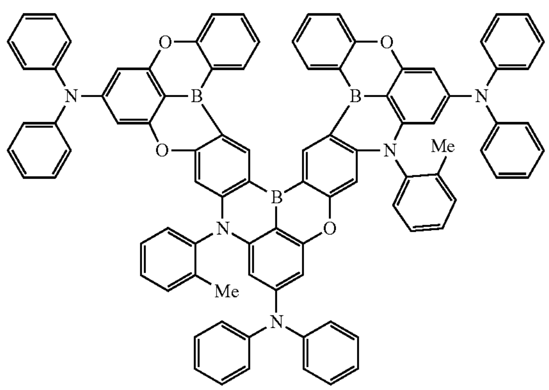
(1-12-28)
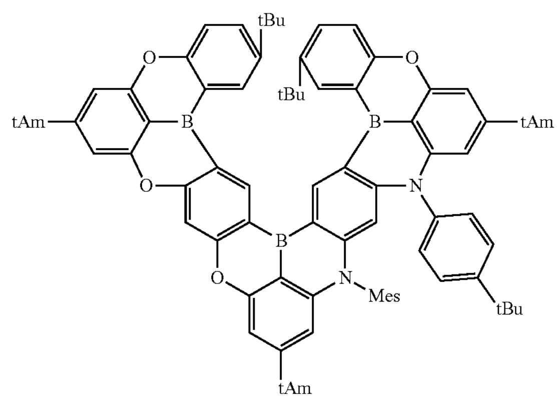
(1-12-29)
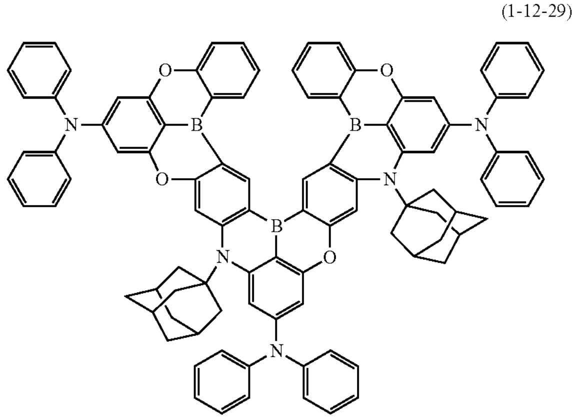
(1-12-30)
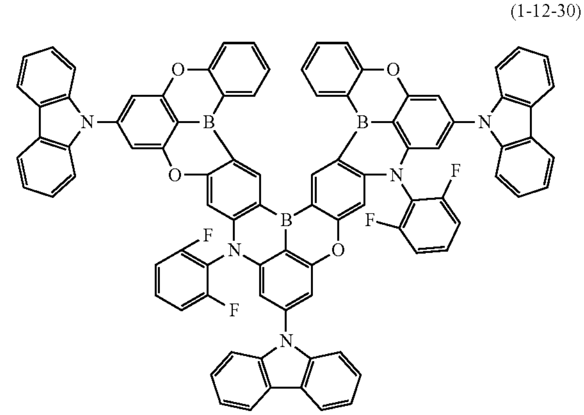

-continued
(1-12-41)
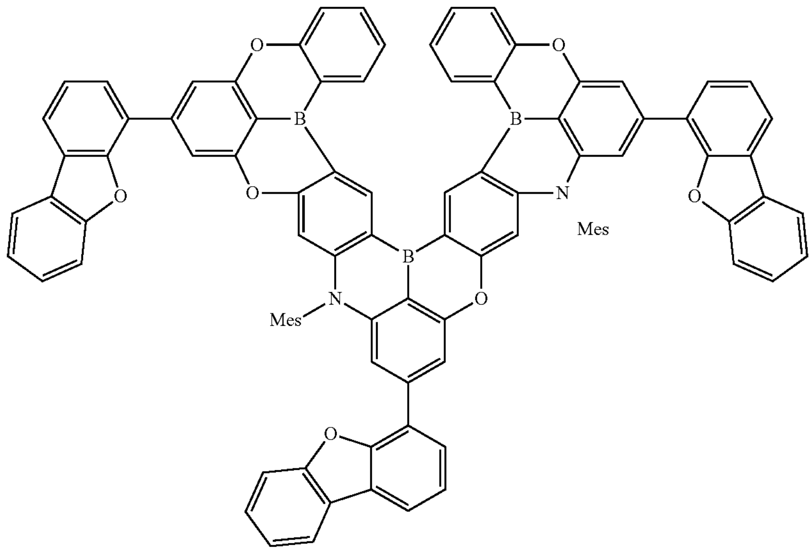
(1-12-42)
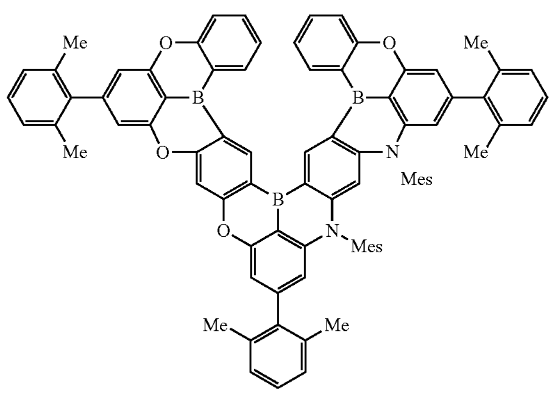
(1-12-43)
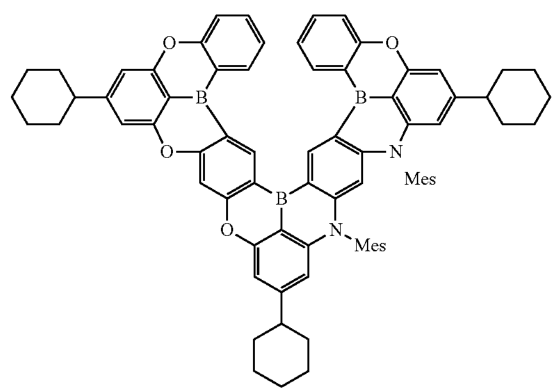
(1-12-44)
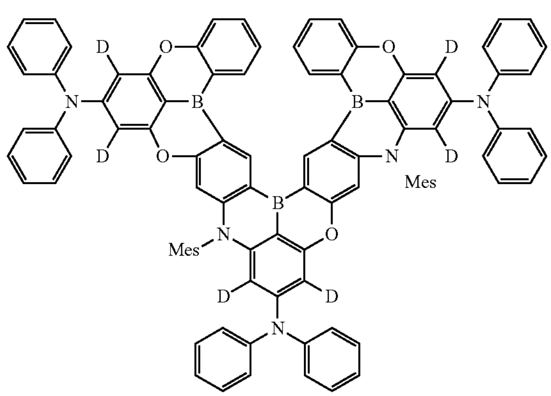
(1-12-45)
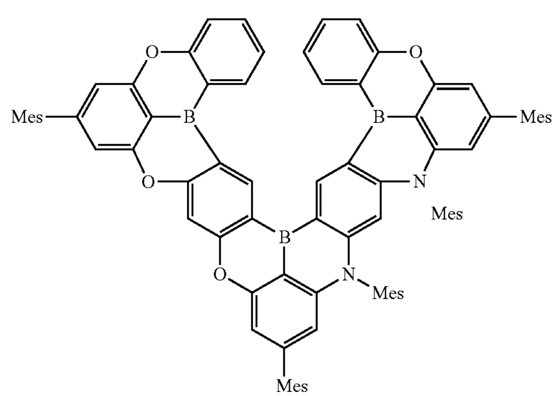

-continued
(1-12-46)
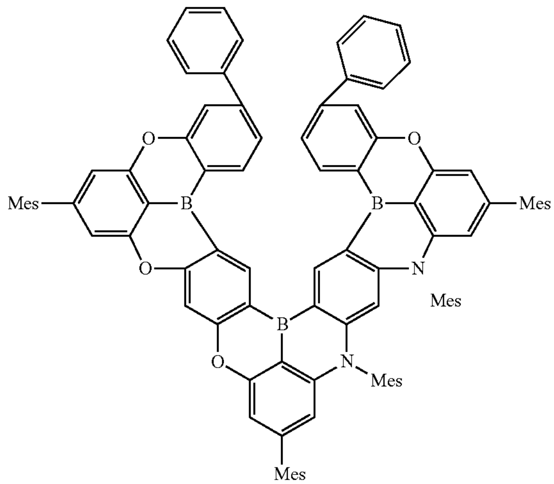
(1-12-47)
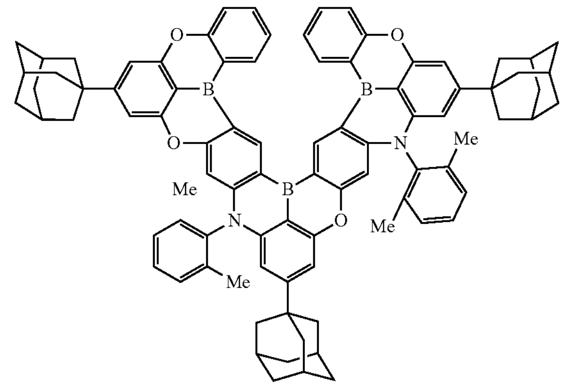
(1-12-48)
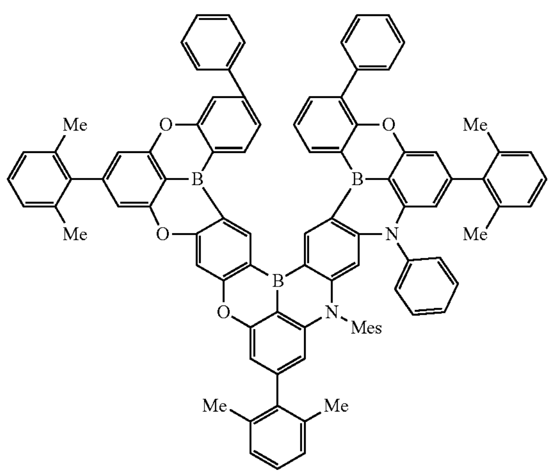
(1-12-49)
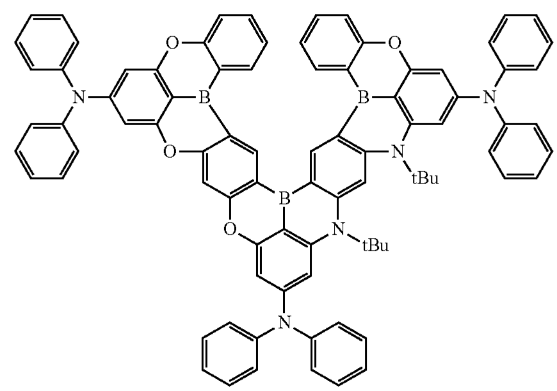
(1-12-50)
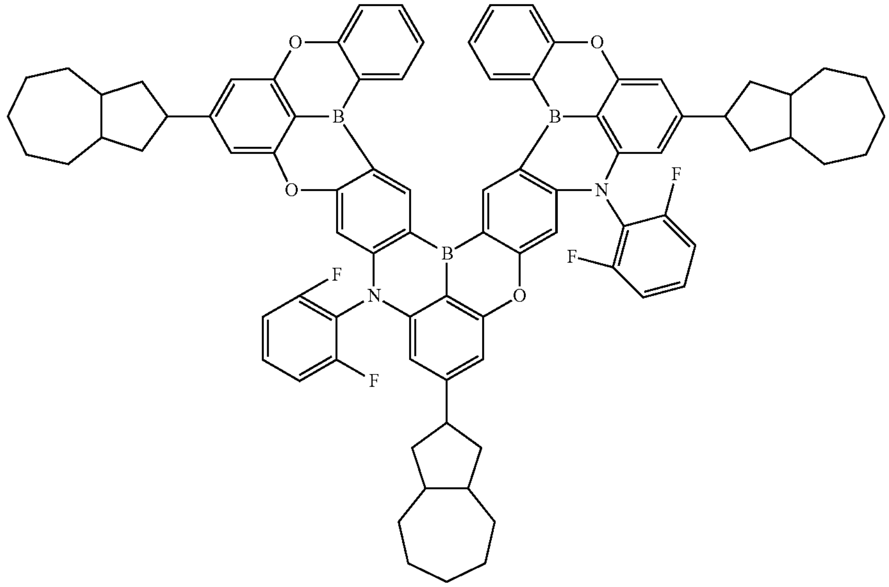

-continued
(1-12-101)
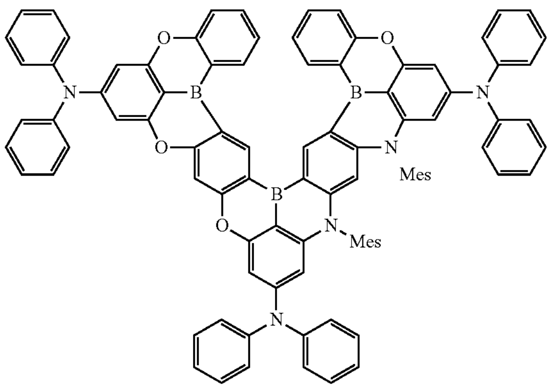
(1-12-102)
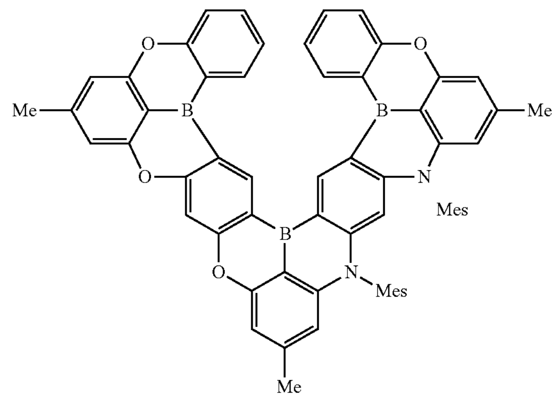
(1-12-103)
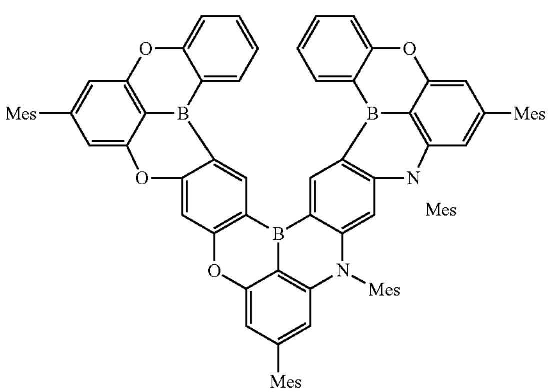
(1-12-104)
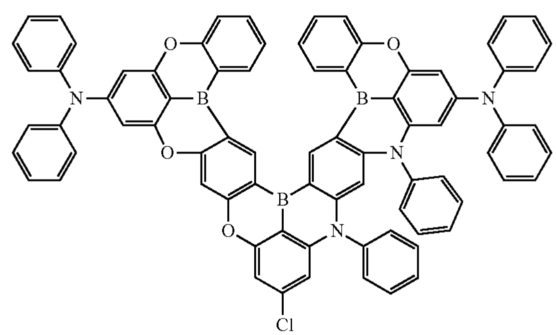
(1-12-105)
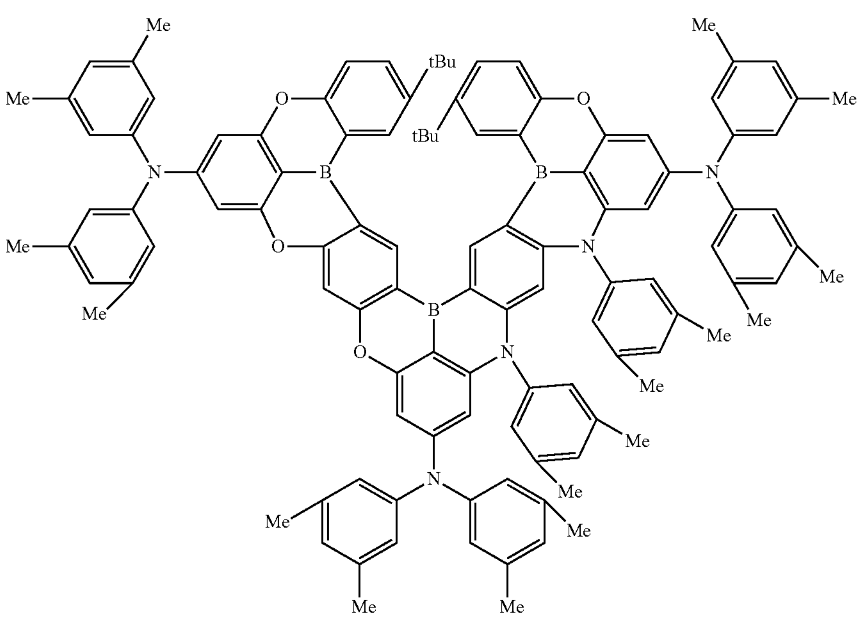

-continued
(1-12-106)
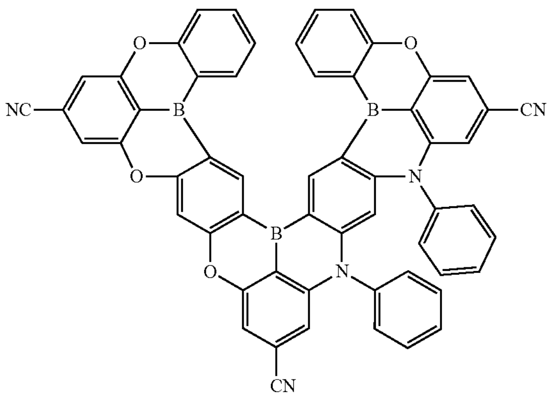
(1-12-107)
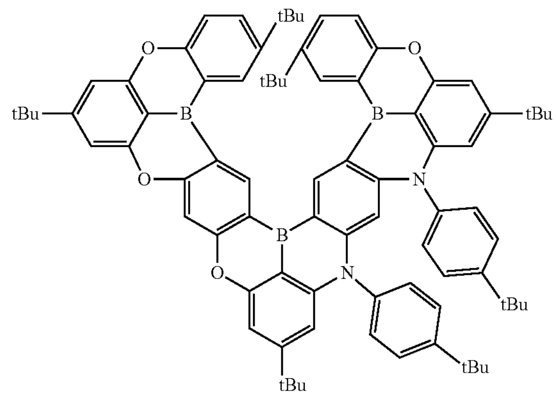
(1-12-108)
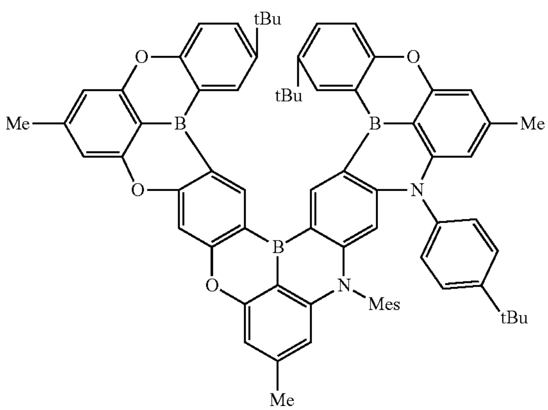
(1-12-109)
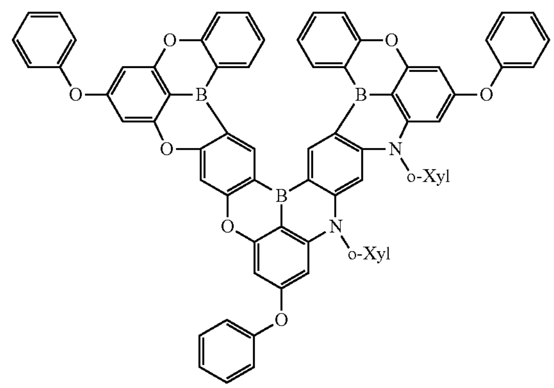
(1-12-110)
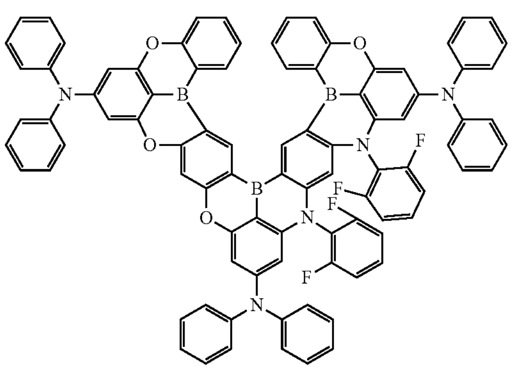
(1-12-121)
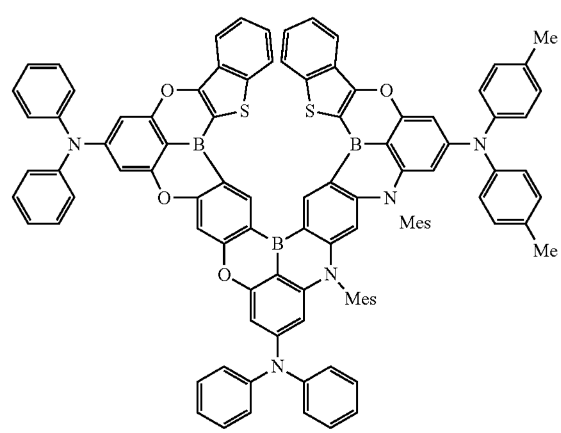

-continued
(1-12-122)
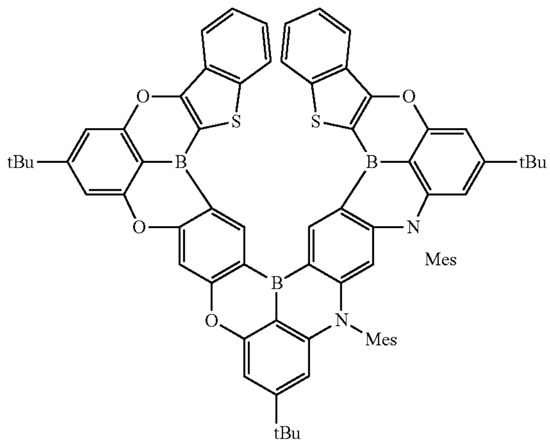
(1-12-123)
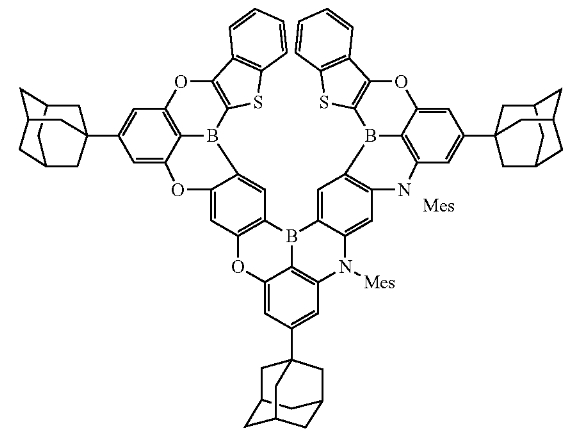
(1-12-124)
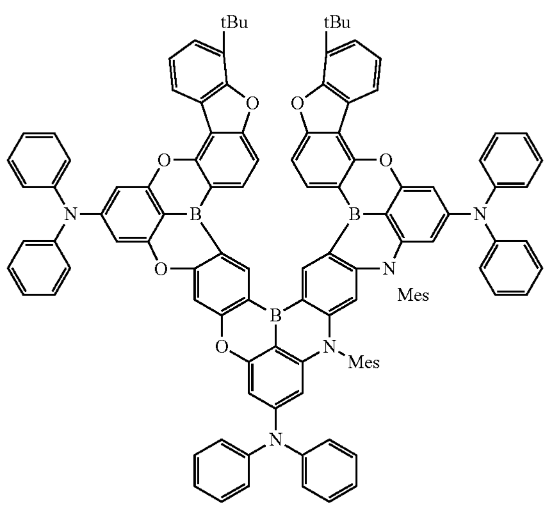
(1-12-125)
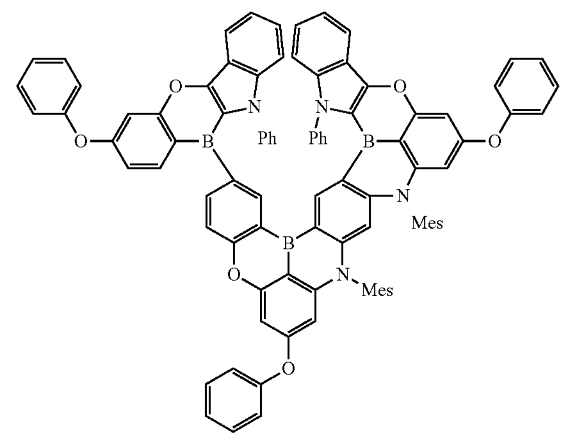
(1-12-126)
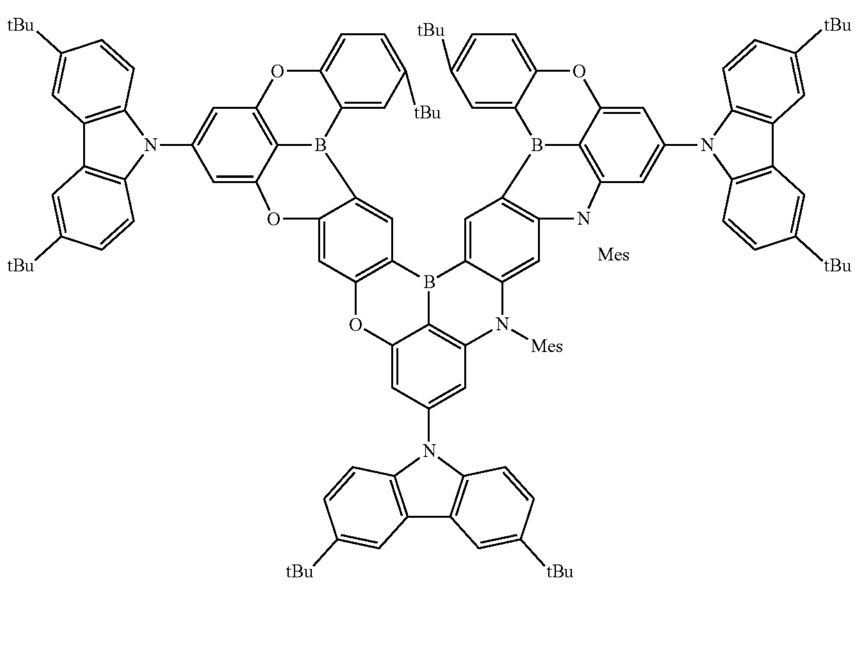

-continued
(1-12-127)
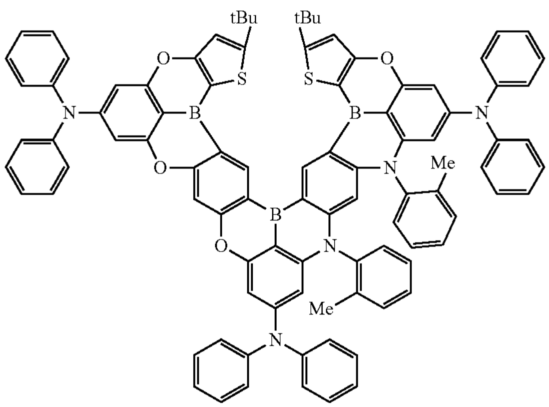
(1-12-128)
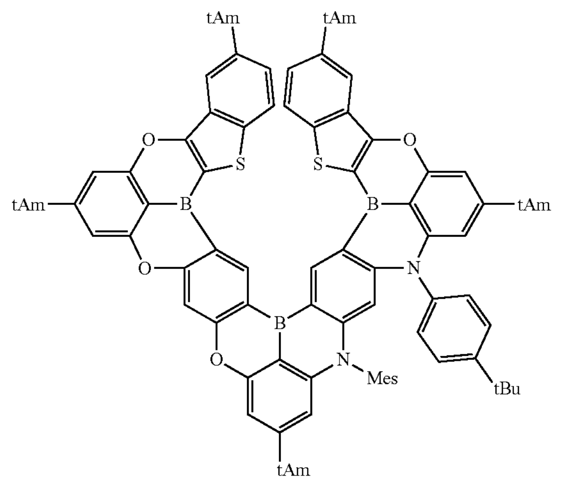
(1-12-129)
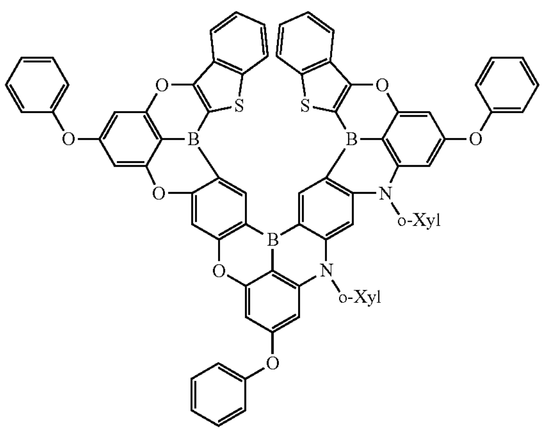
(1-12-130)
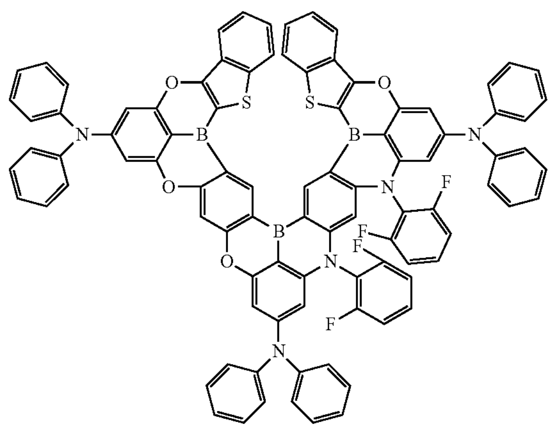
(1-12-141)
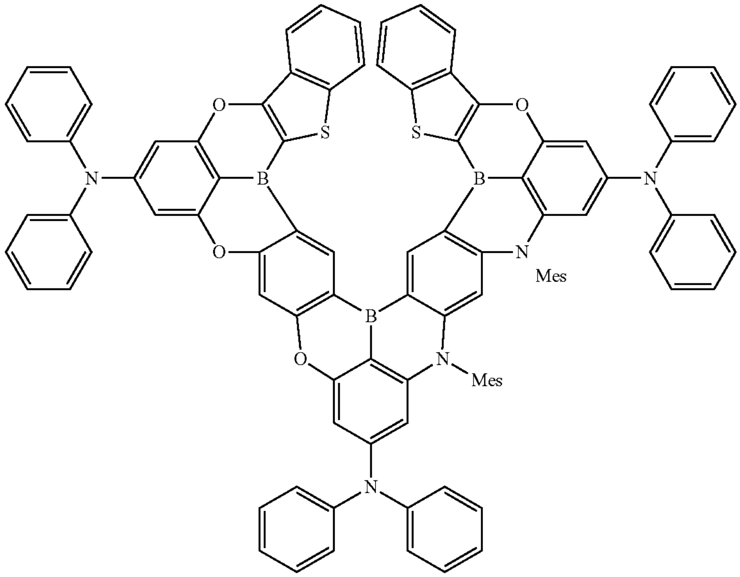

-continued
(1-12-142)
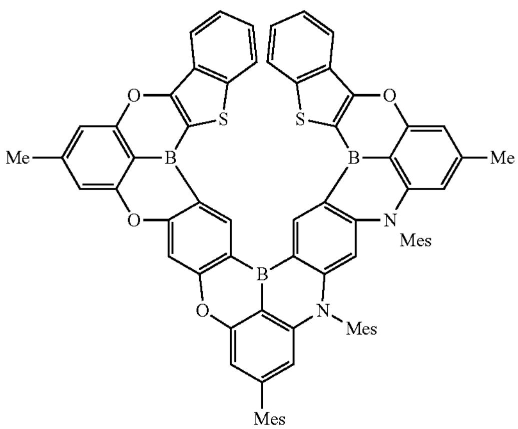
(1-12-143)
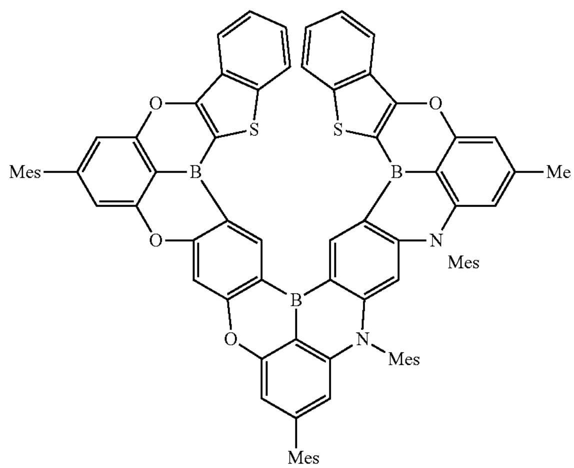
(1-12-144)
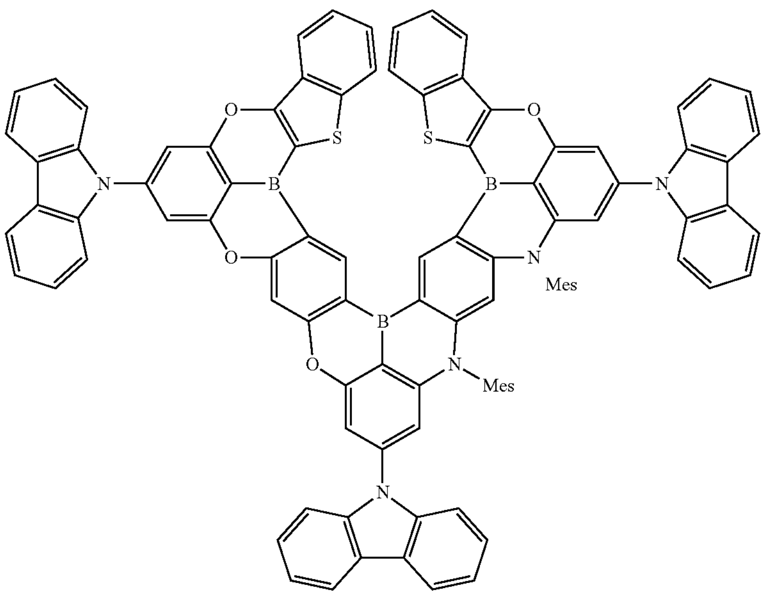
(1-12-145)
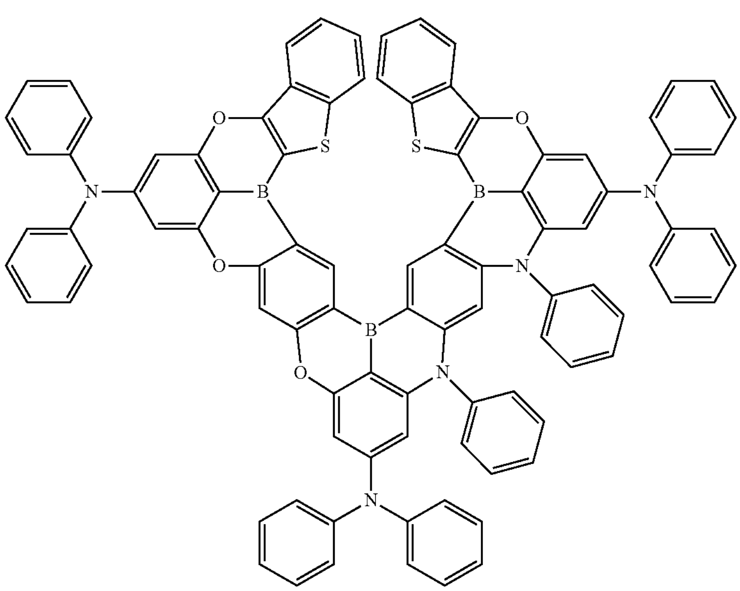

-continued
(1-12-146)
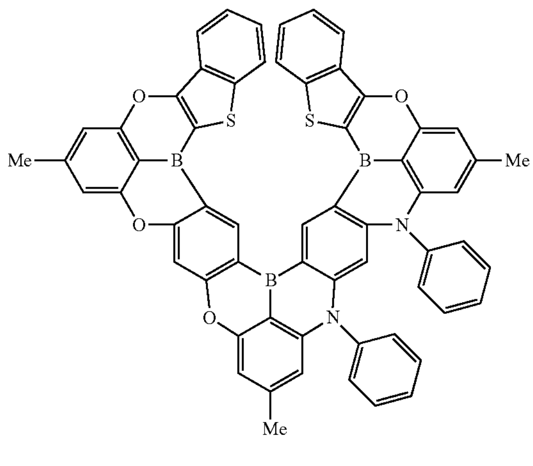
(1-12-147)
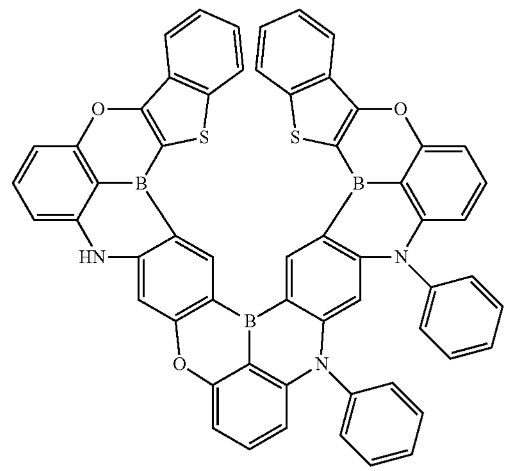
(1-12-148)
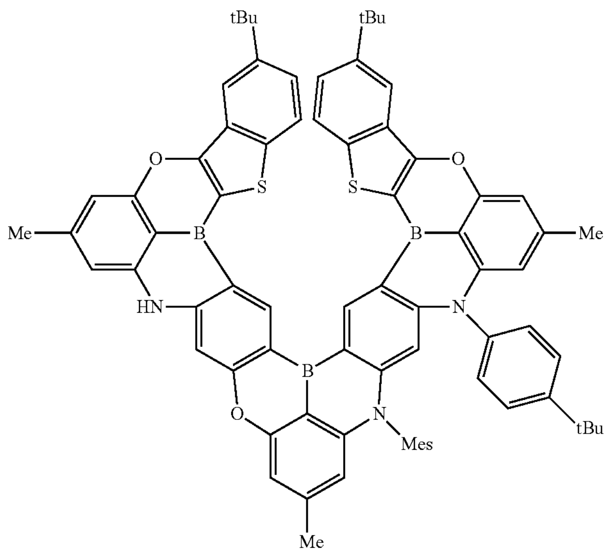
(1-12-149)
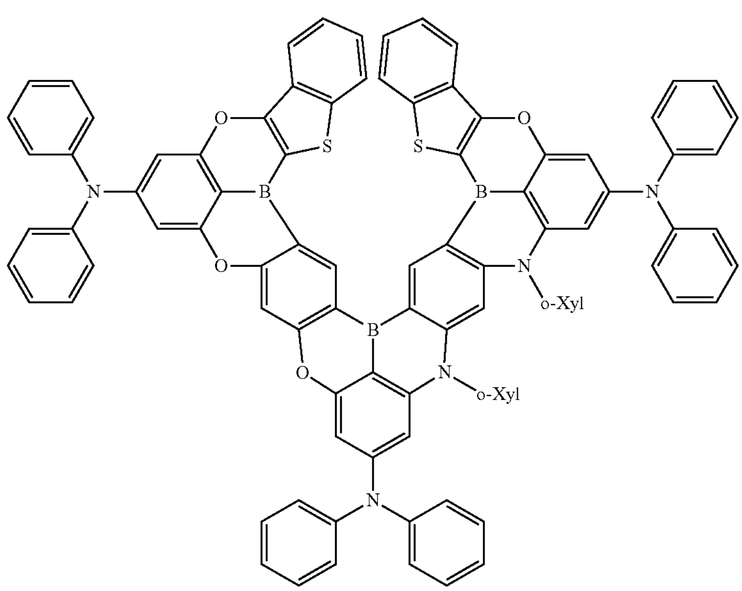

-continued
(1-12-150)
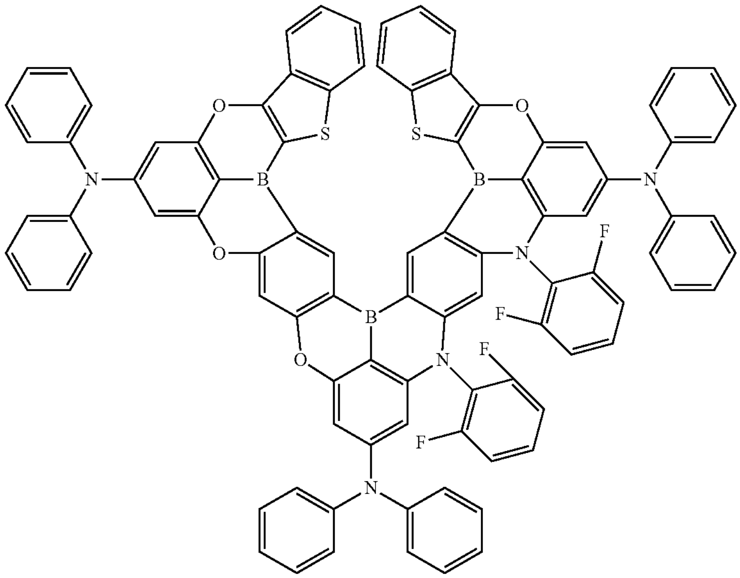
(1-12-161)
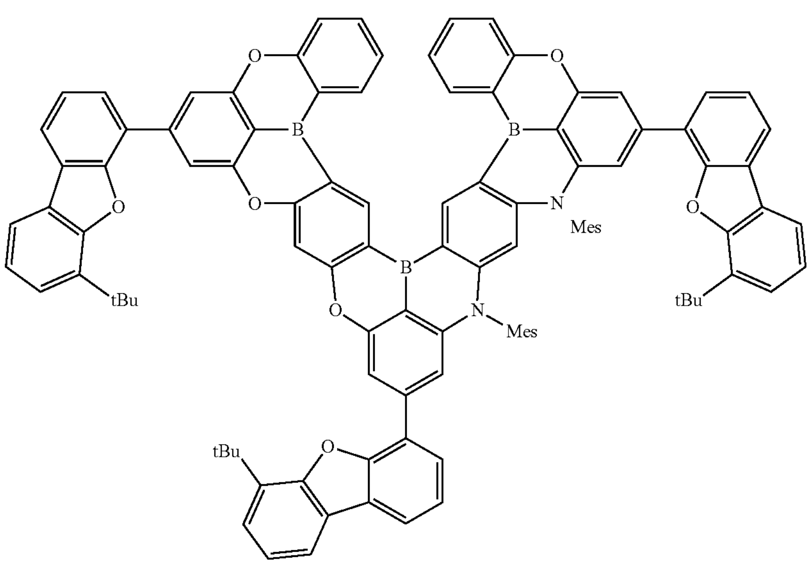

-continued
(1-12-162)
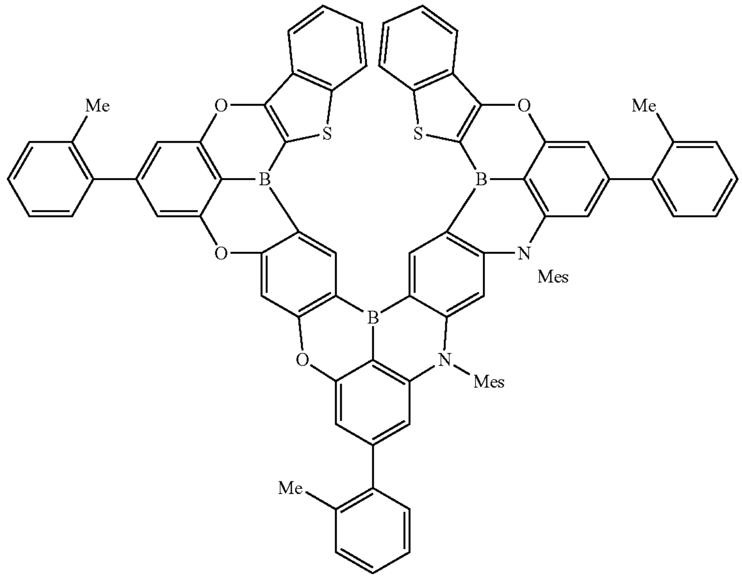
(1-12-163)
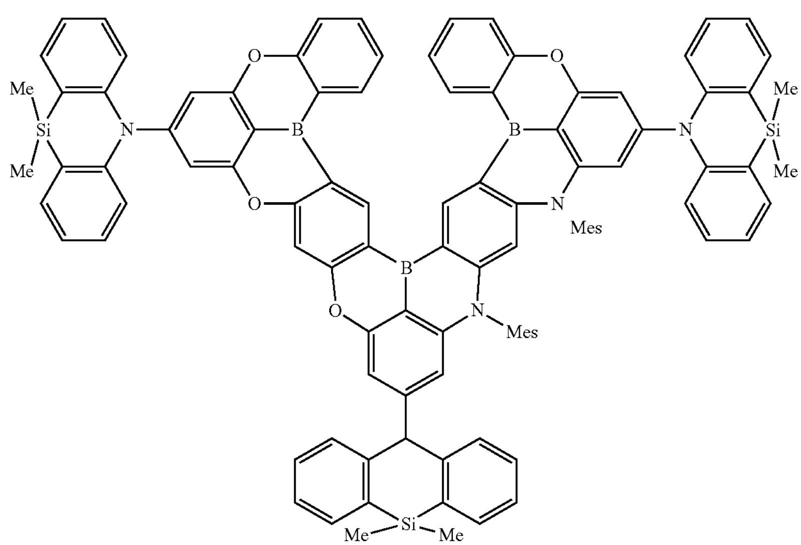

-continued
(1-12-164)
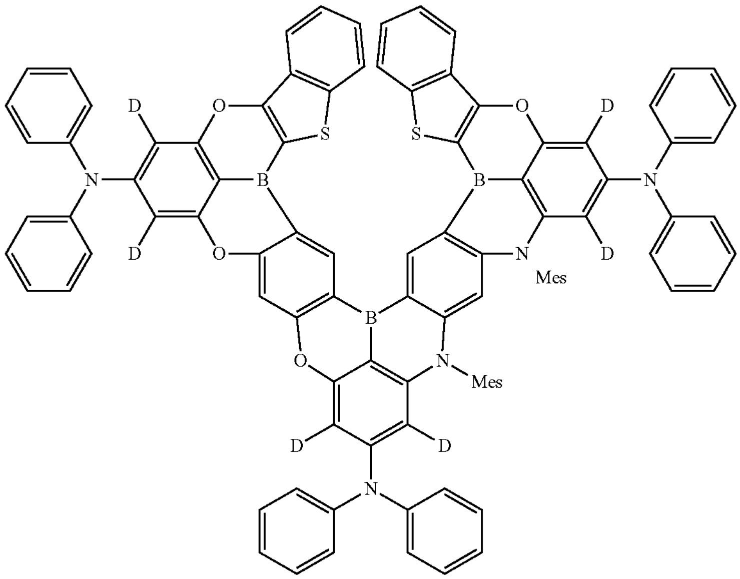
(1-12-165)
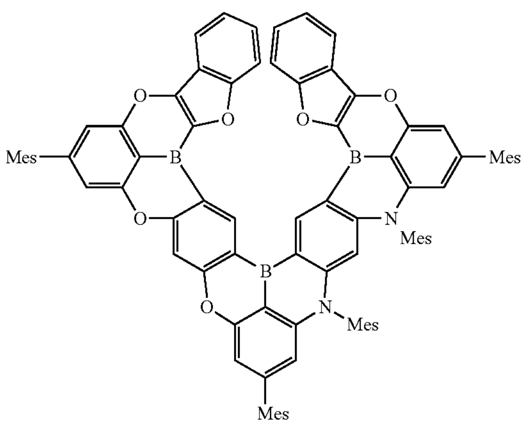
(1-12-166)
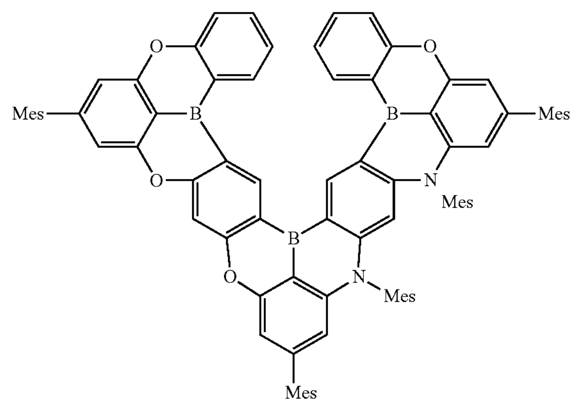
(1-12-167)
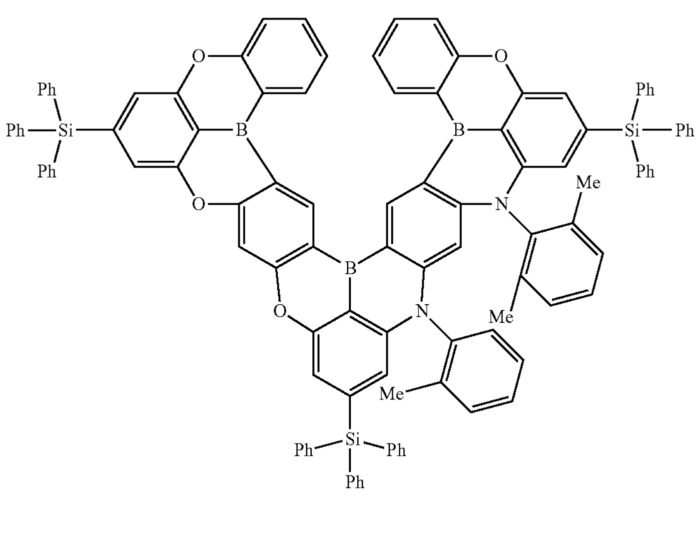

-continued
(1-12-168)
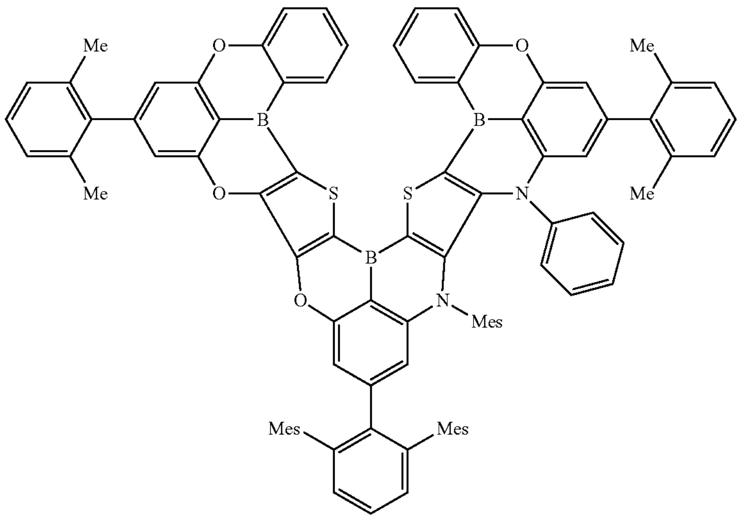
(1-12-169)
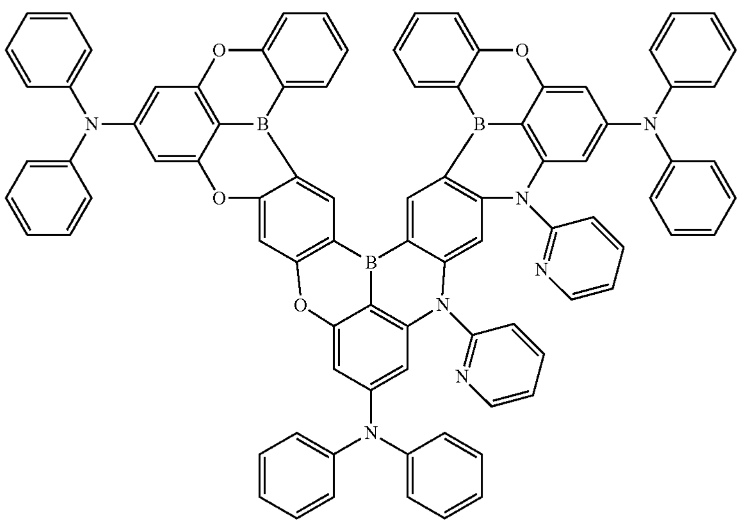
(1-12-170)
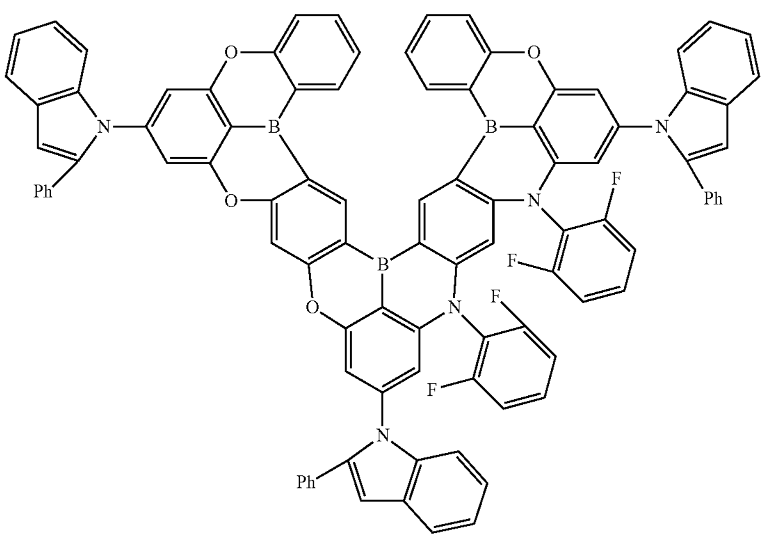

-continued
(1-12-191)
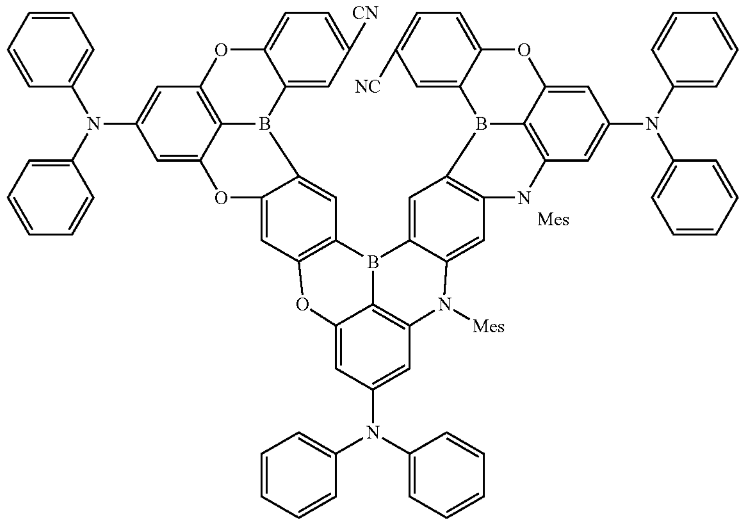
(1-12-192)
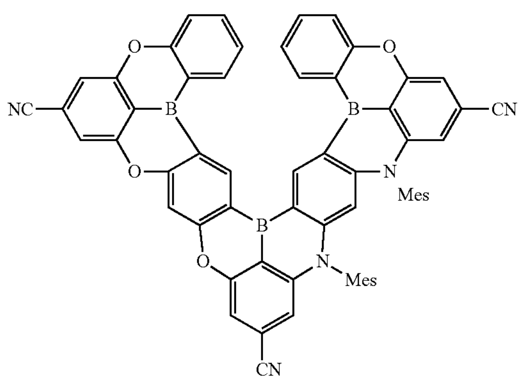
(1-12-193)
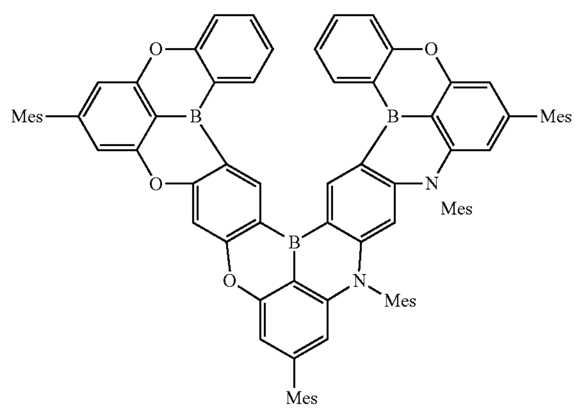
(1-12-194)
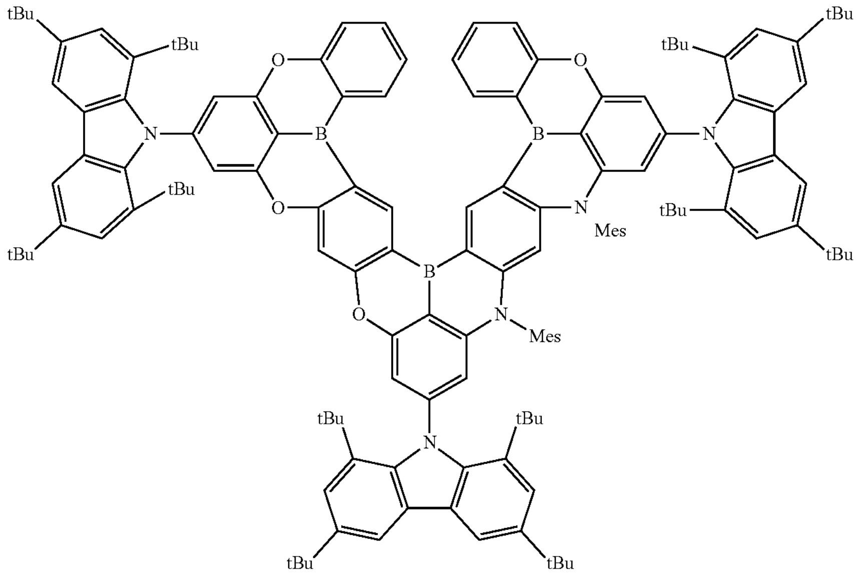

-continued
(1-12-195)
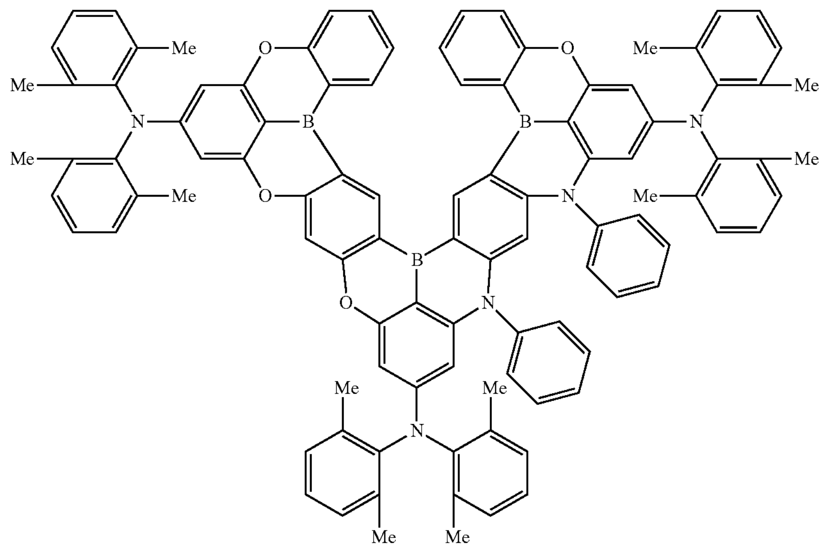
(1-12-196)
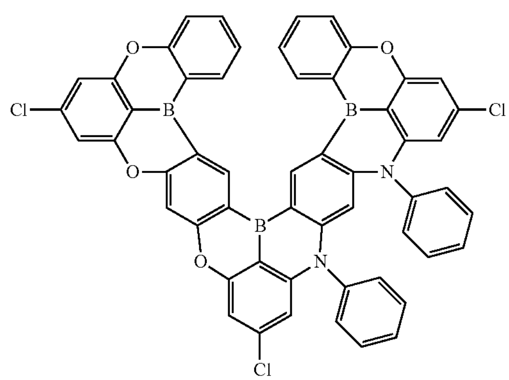
(1-12-197)
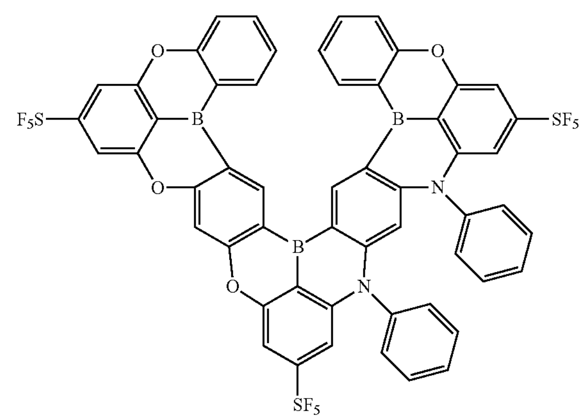
(1-12-198)
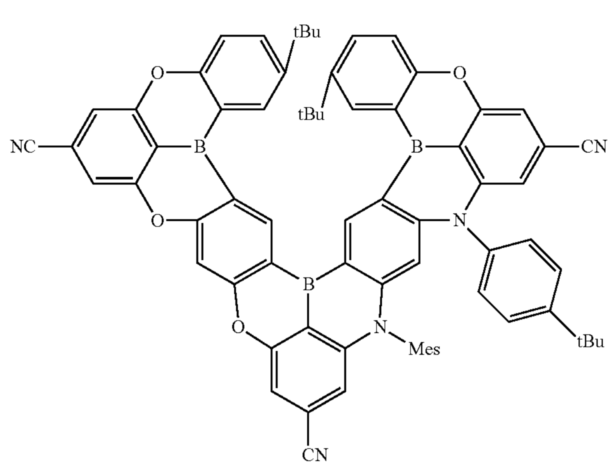

-continued
(1-12-199)
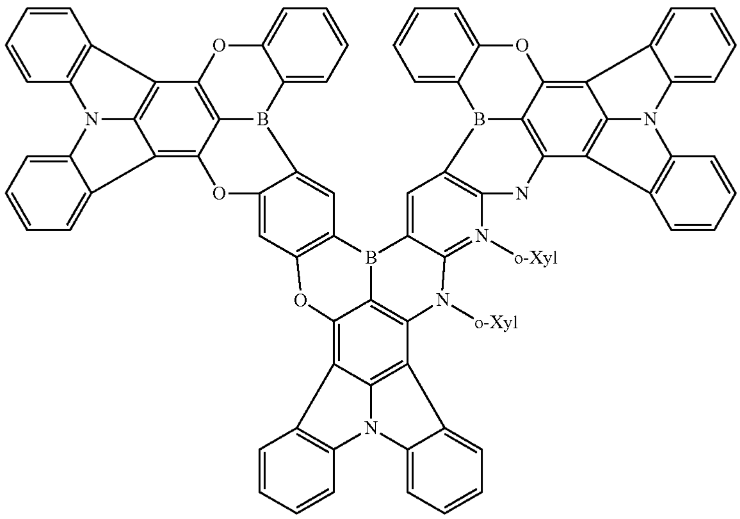
(1-12-200)
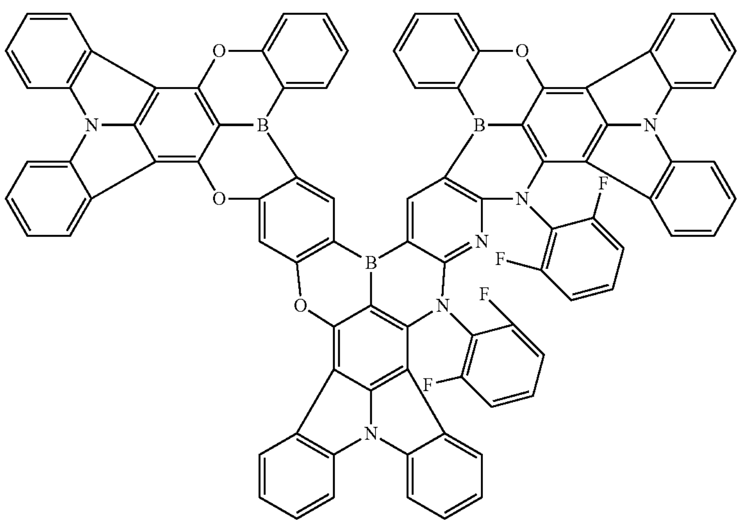
(1-12-221)
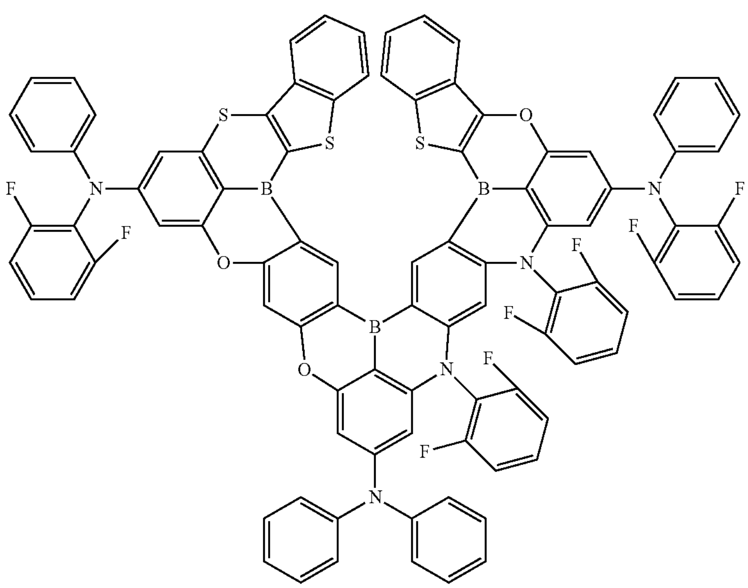

-continued
(1-12-222)
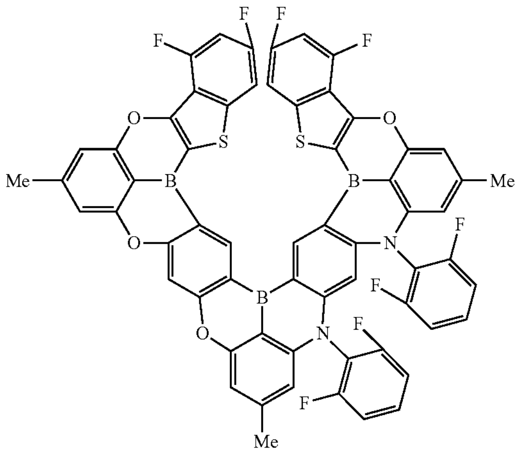
(1-12-223)
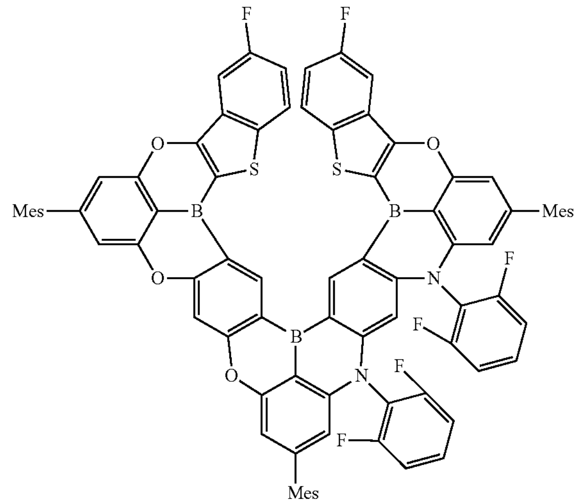
(1-12-224)
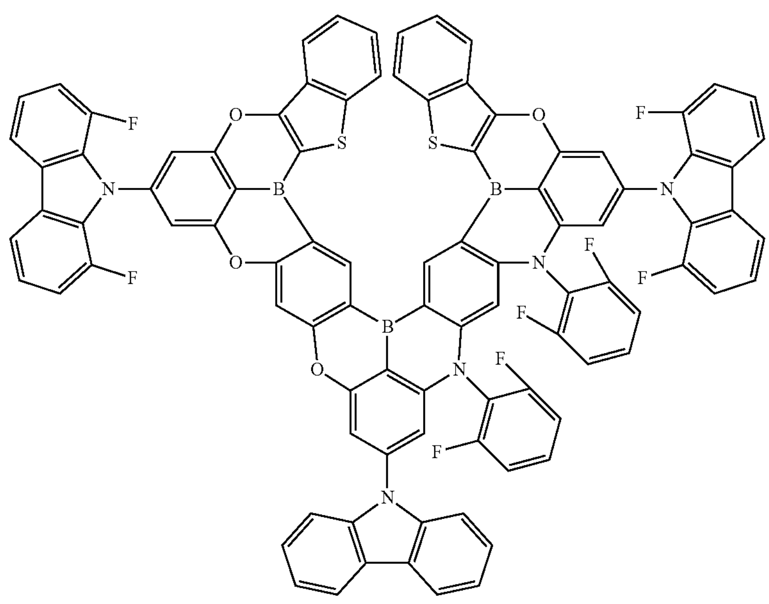

-continued
(1-12-225)
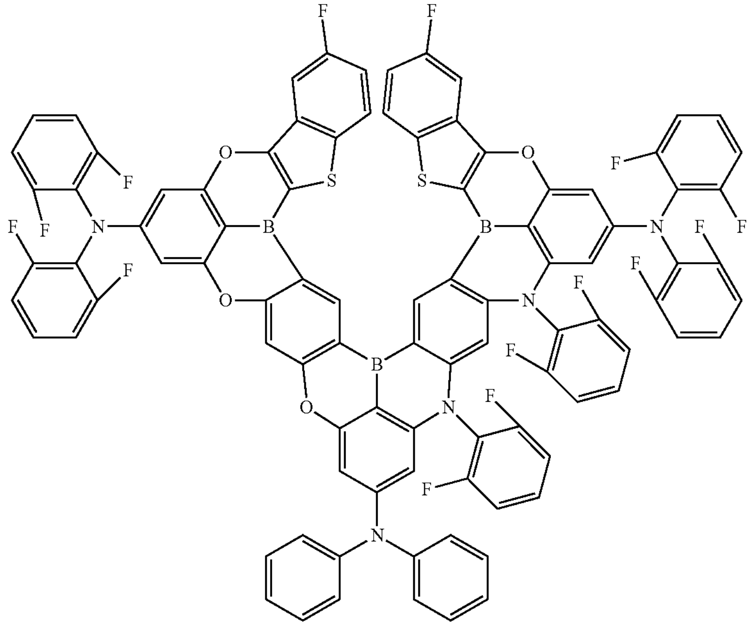
(1-12-226)
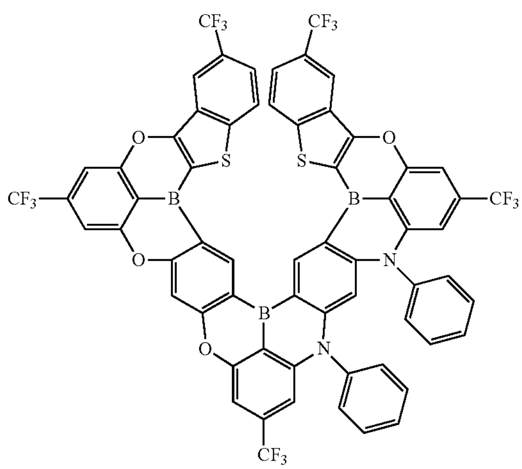
(1-12-227)
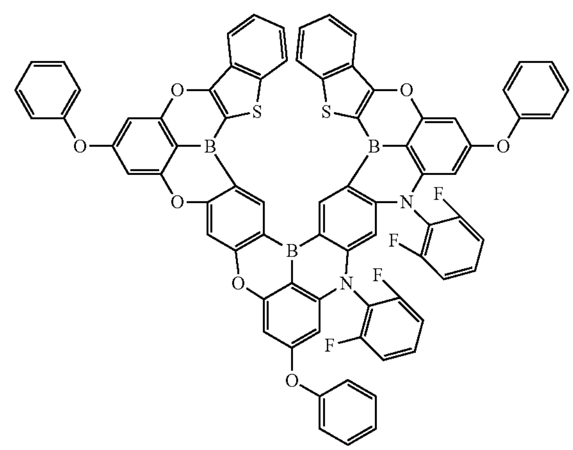
(1-12-228)
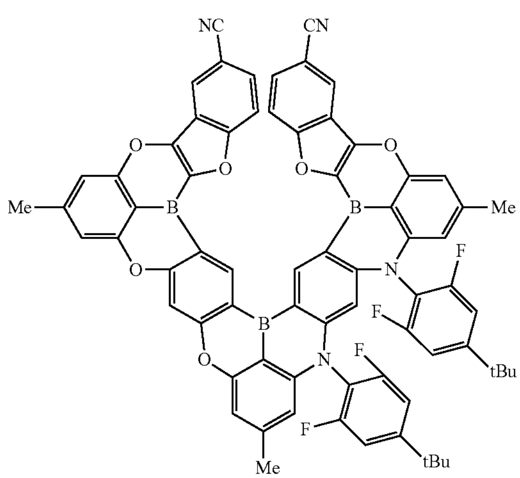
(1-12-229)
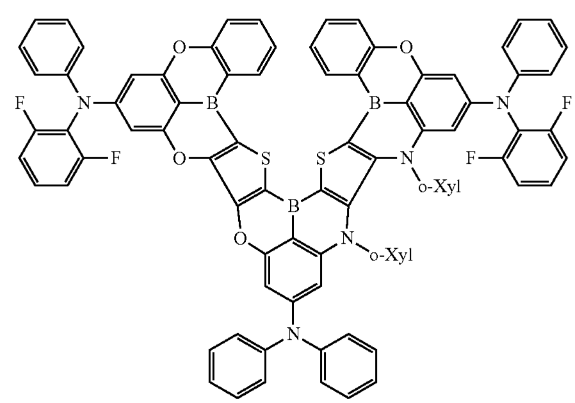

-continued
(1-12-230)
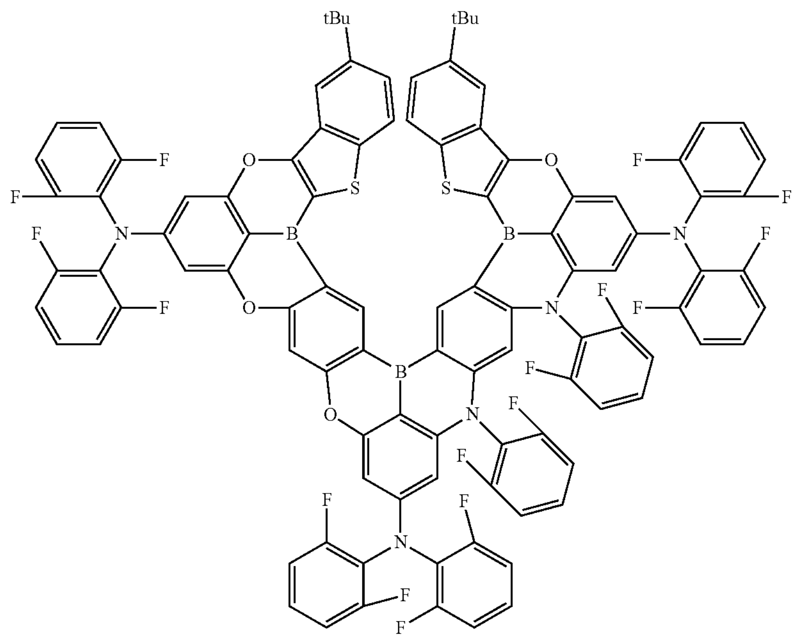
(1-13-1)
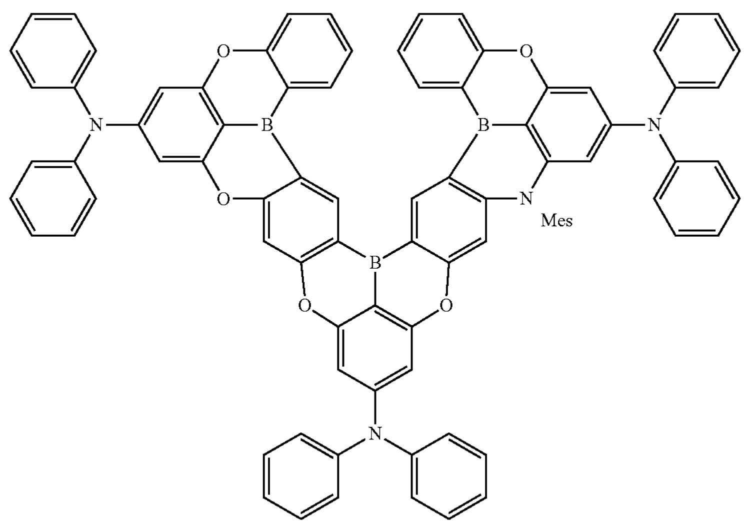
(1-13-2)
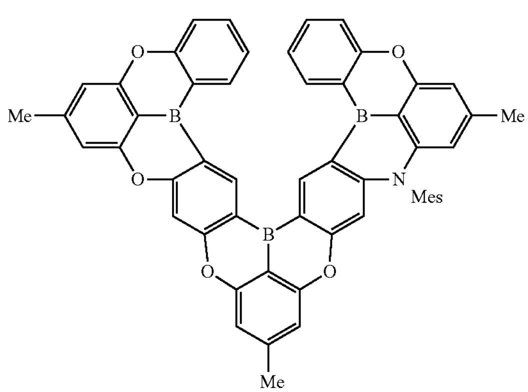
(1-13-3)
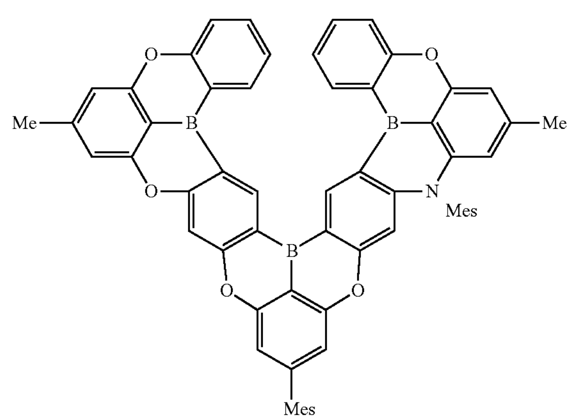

-continued
(1-13-4)
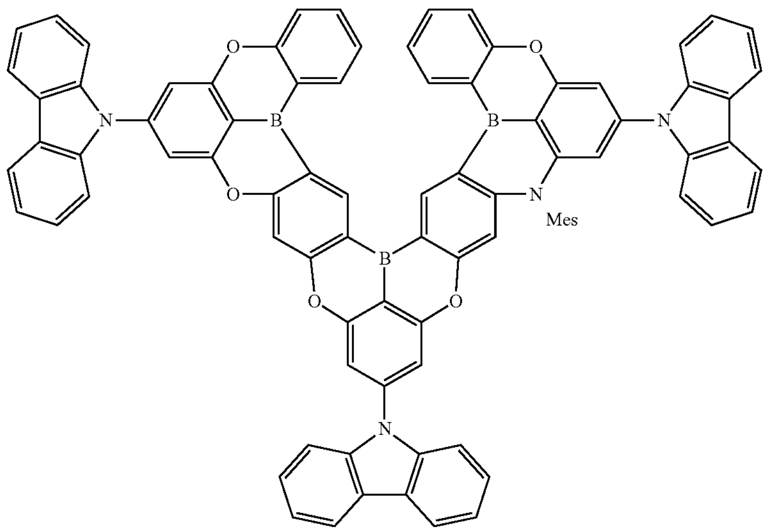
(1-13-5)
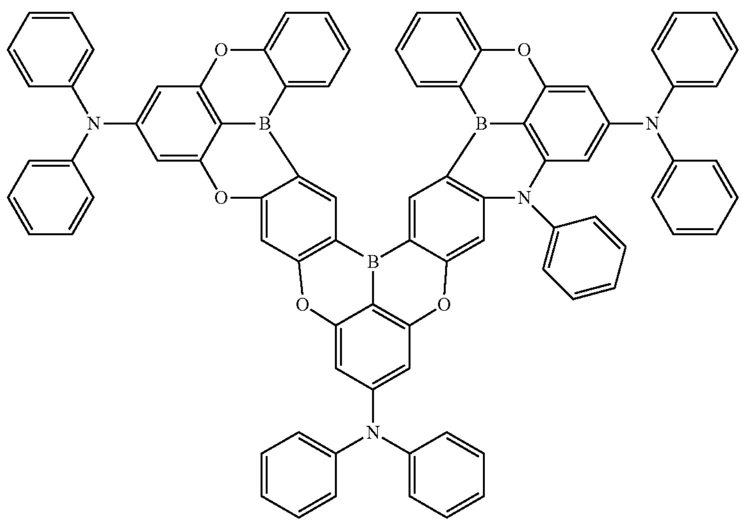
(1-13-6)
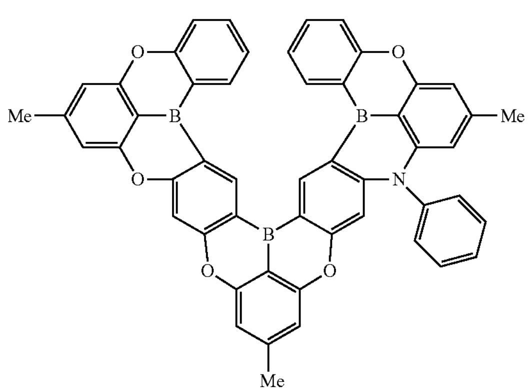
(1-13-7)
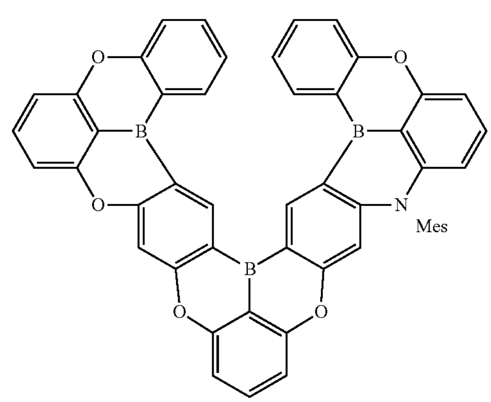

-continued
(1-13-8)
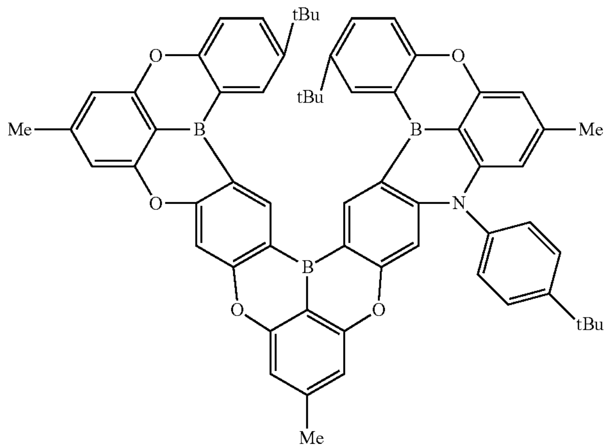
(1-13-9)
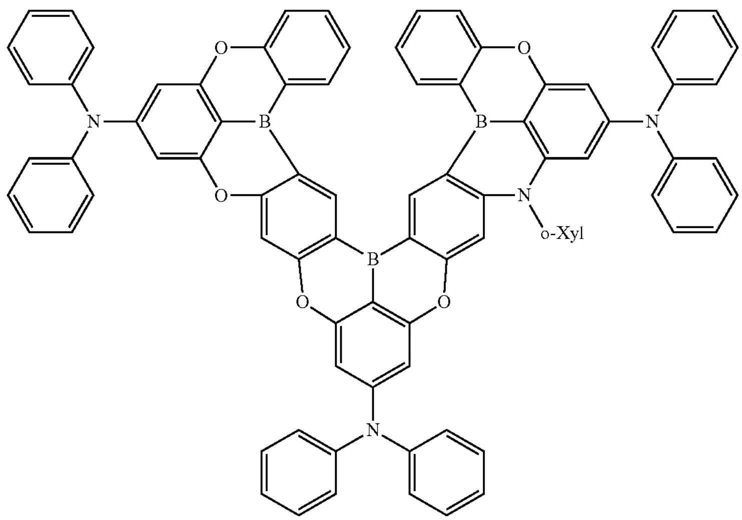
(1-13-10)
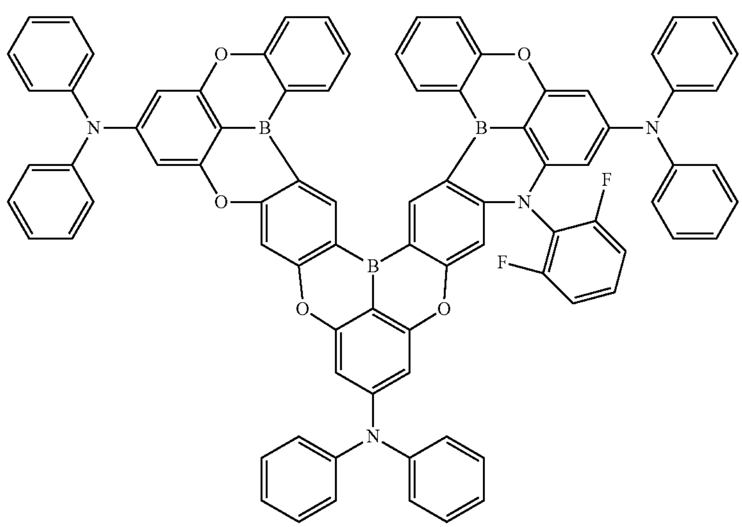

-continued
(1-13-21)
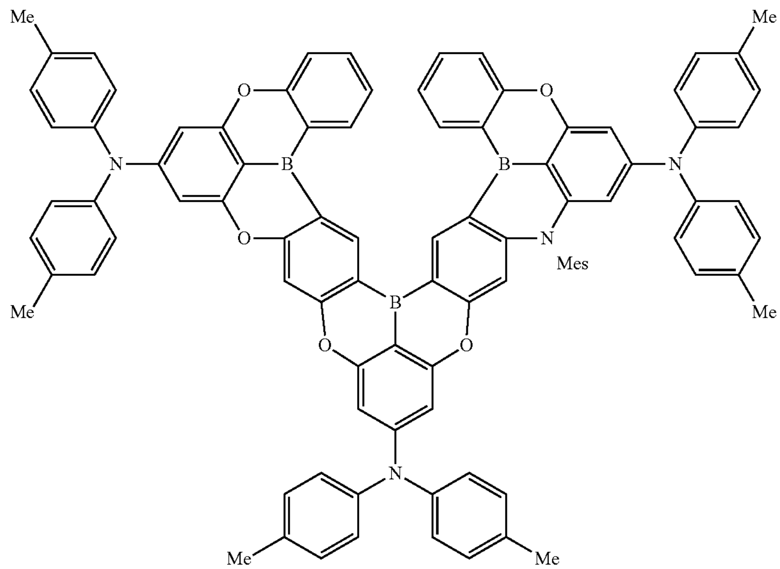
(1-13-22)
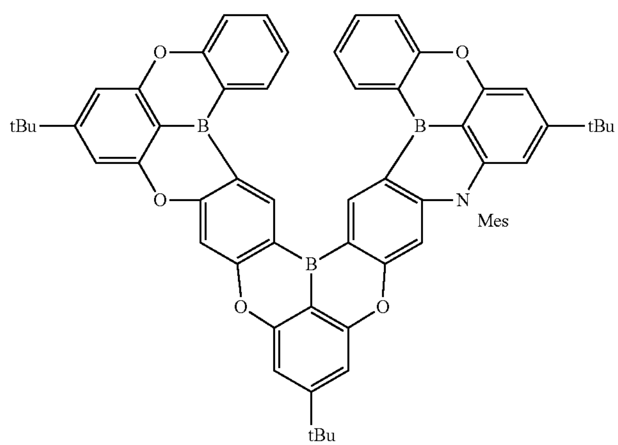
(1-13-23)
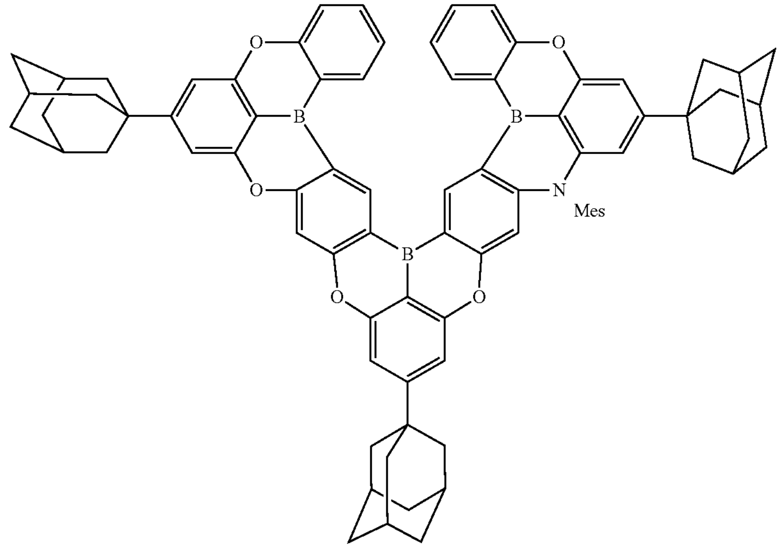

-continued
(1-13-24)
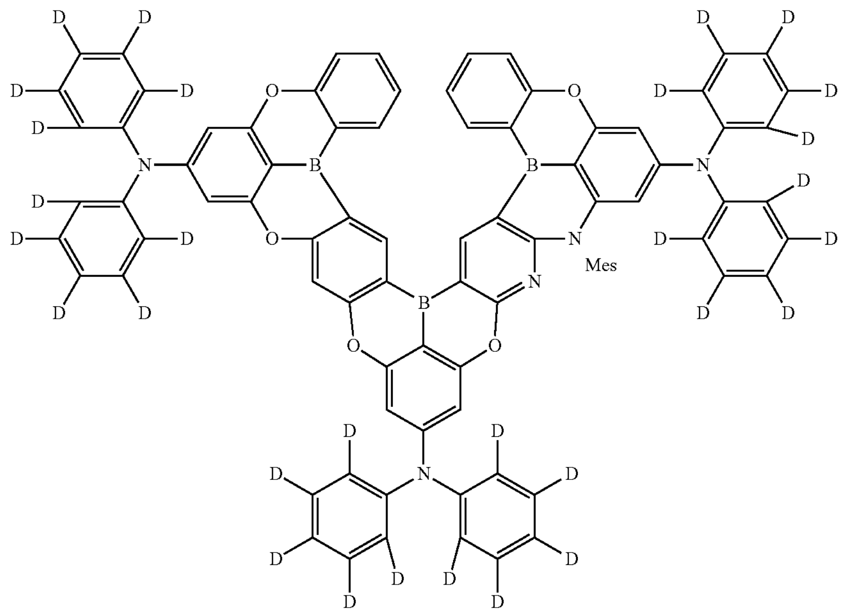
(1-13-25)
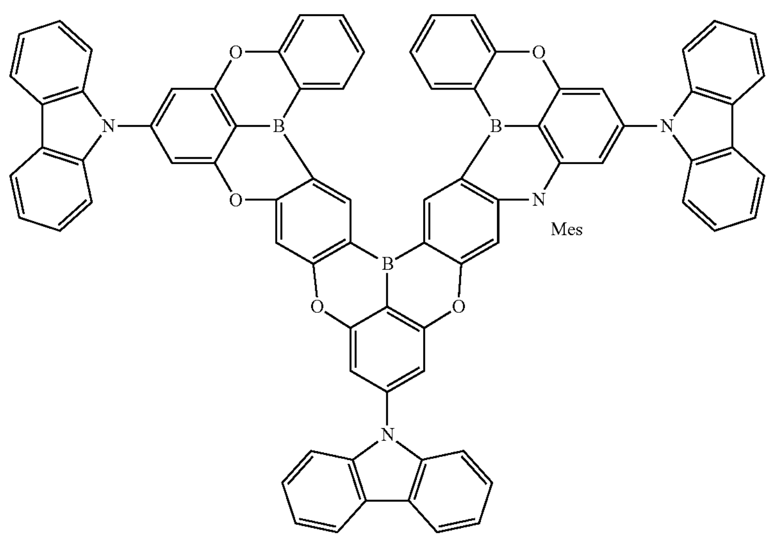

-continued
(1-13-26)
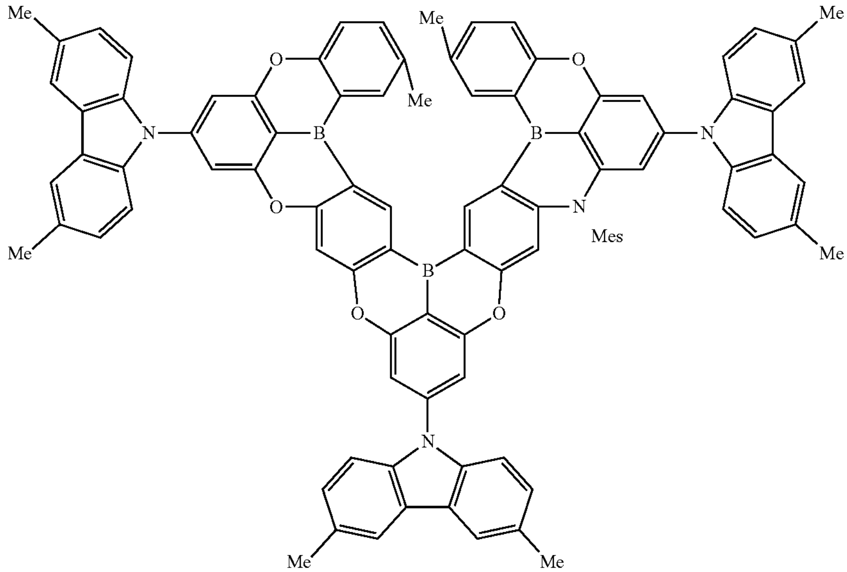
(1-13-27)
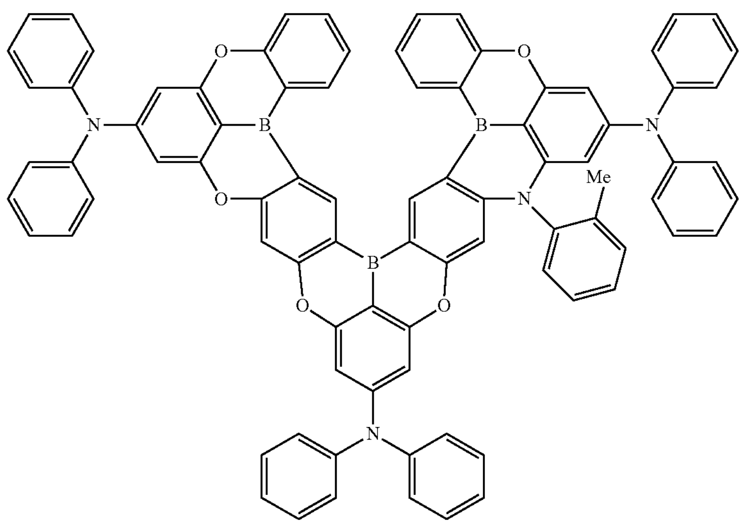
(1-13-28)
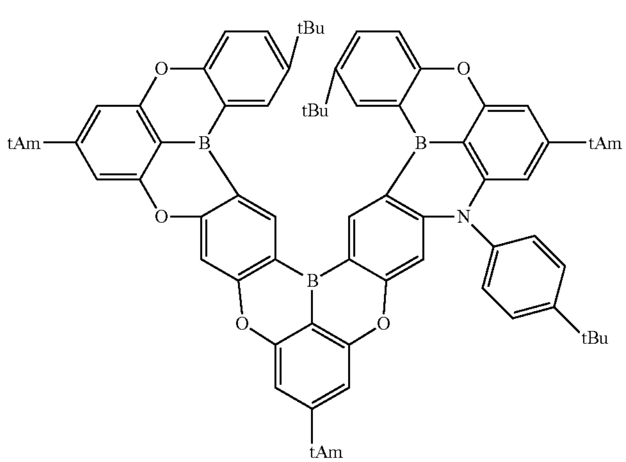

-continued
(1-13-29)
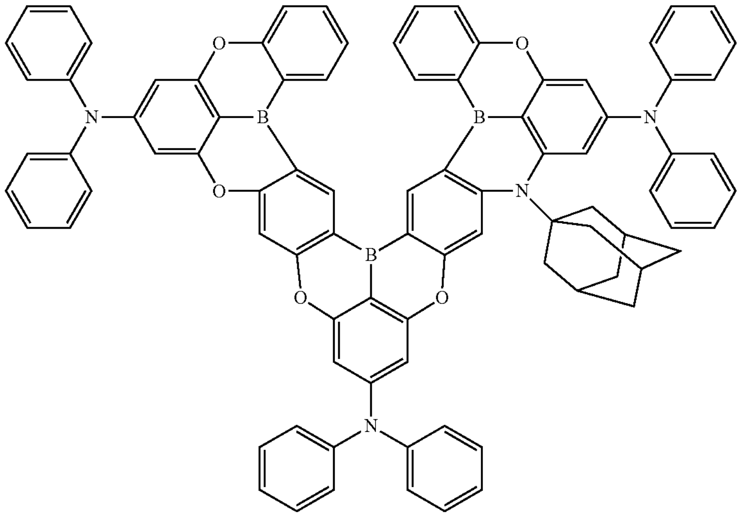
(1-13-30)
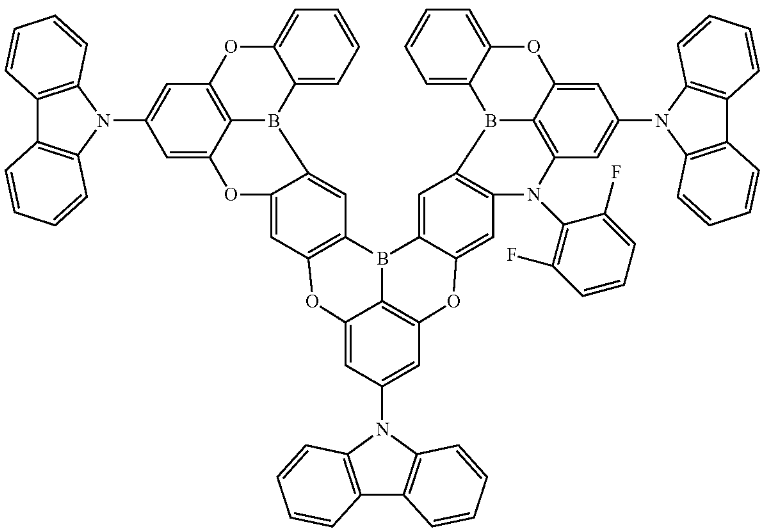
(1-13-41)
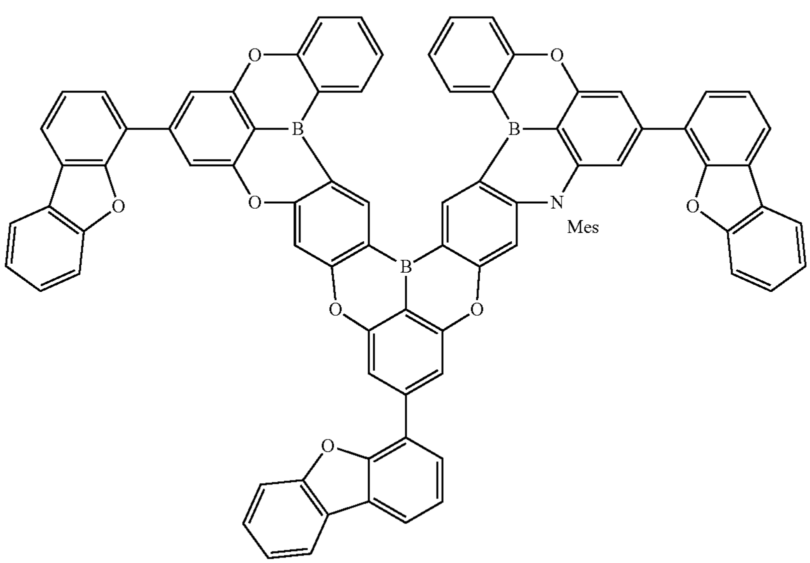

-continued
(1-13-42)
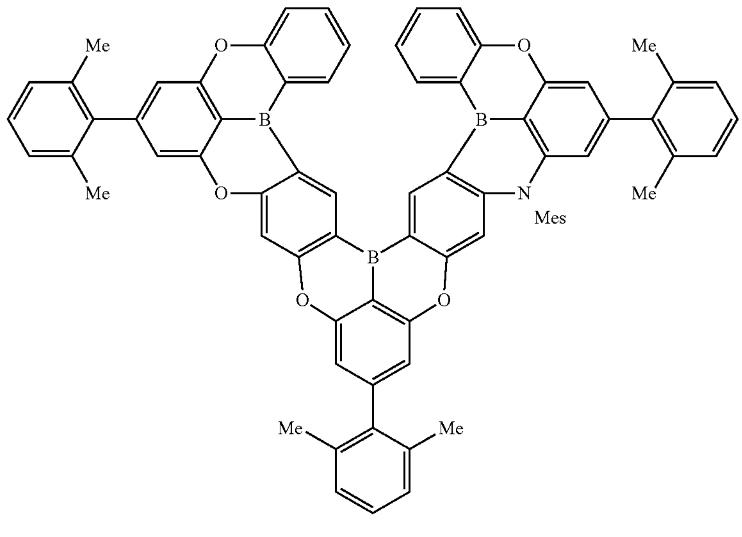
(1-13-43)
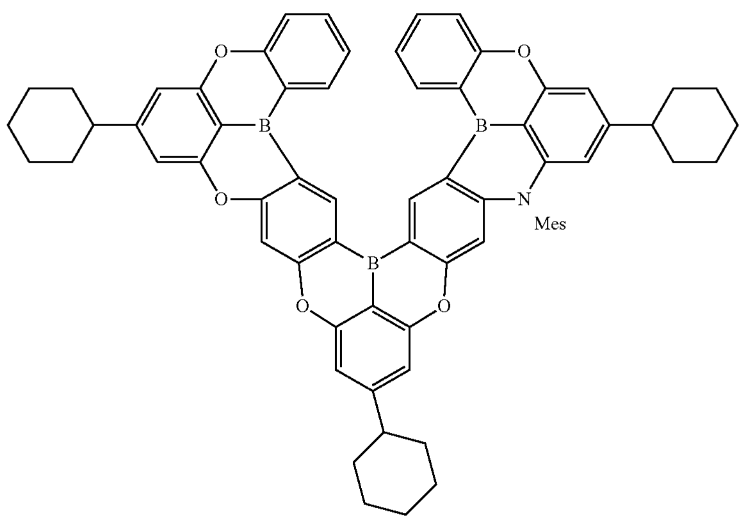
(1-13-44)
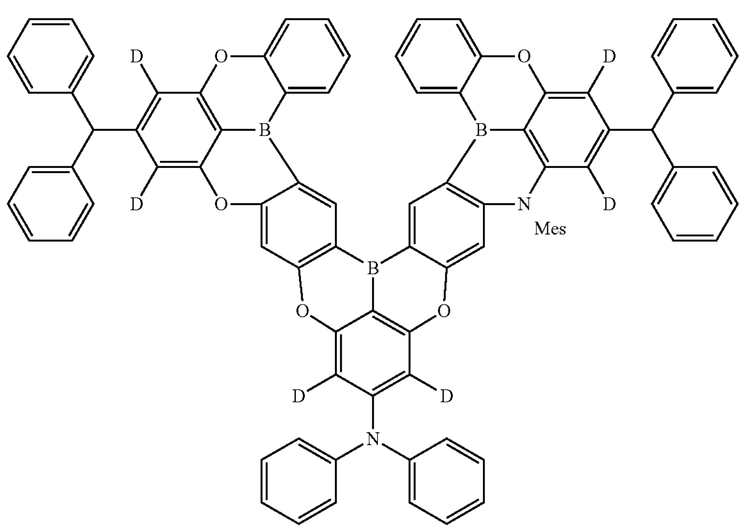

-continued
(1-13-45)
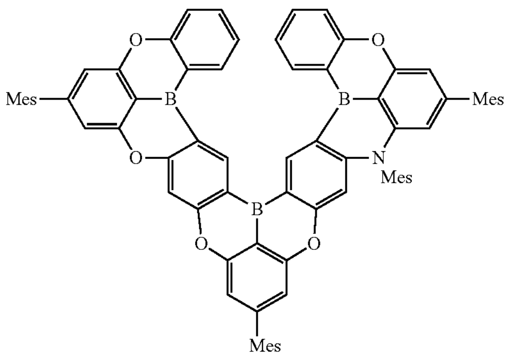
(1-13-46)
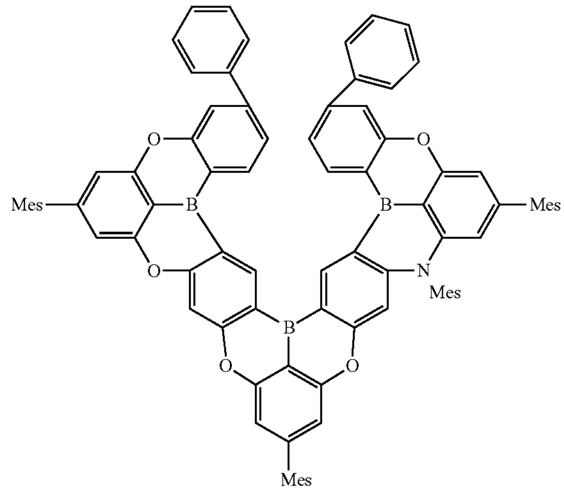
(1-13-47)
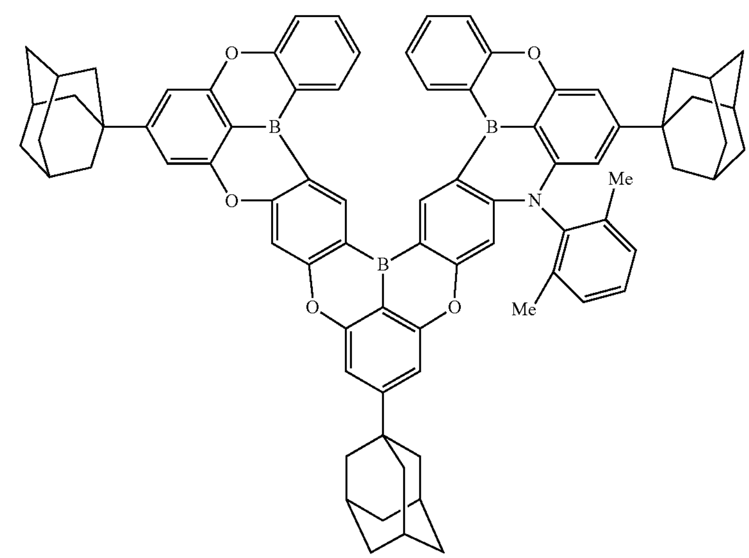

-continued
(1-13-48)
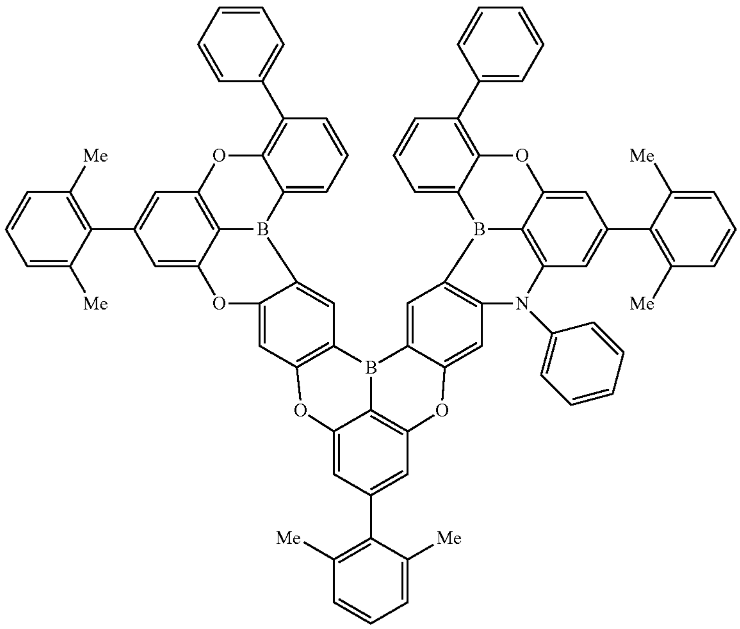
(1-13-49)
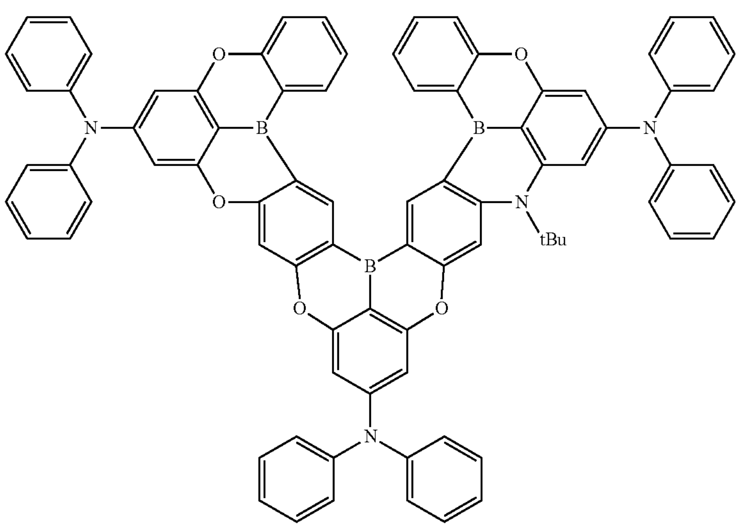

-continued
(1-13-50)
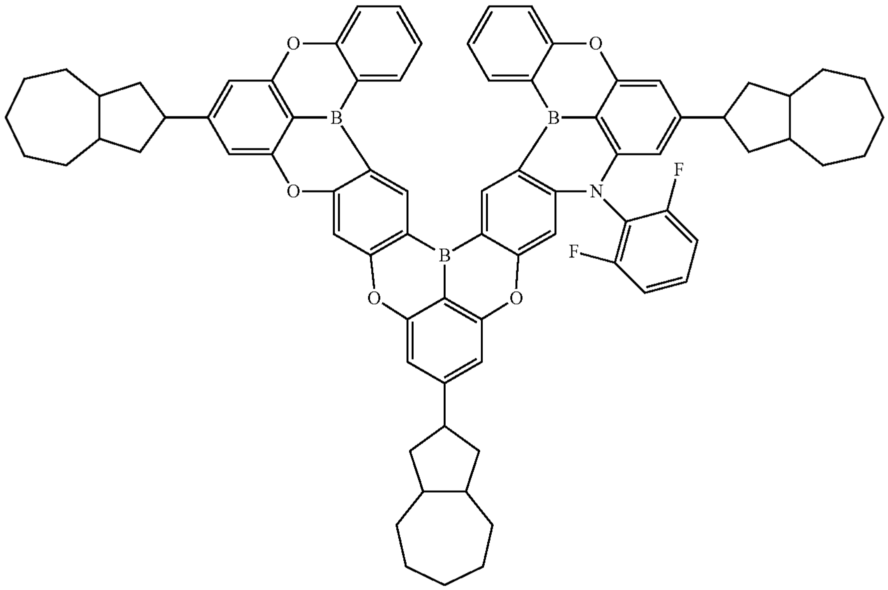
(1-13-101)
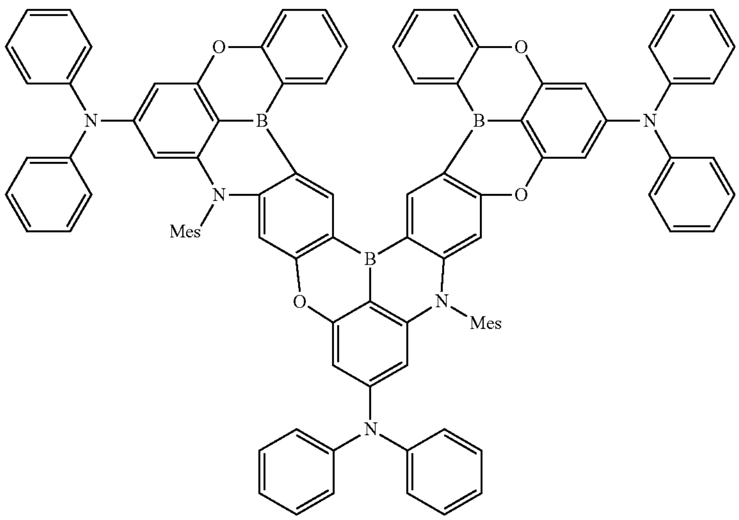
(1-13-102)
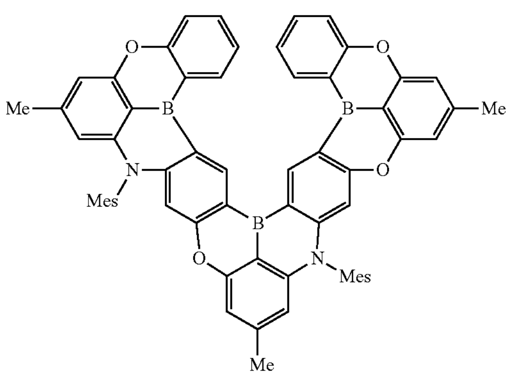
(1-13-103)
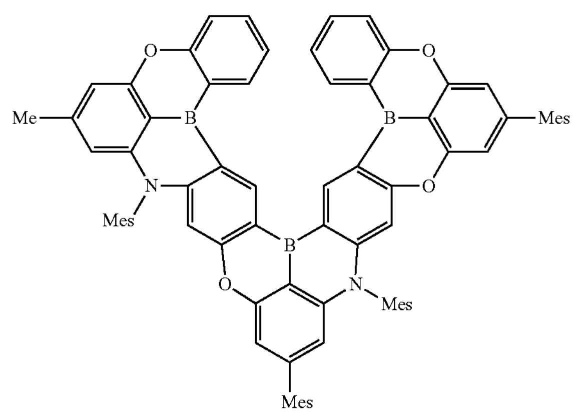

-continued
(1-13-104)
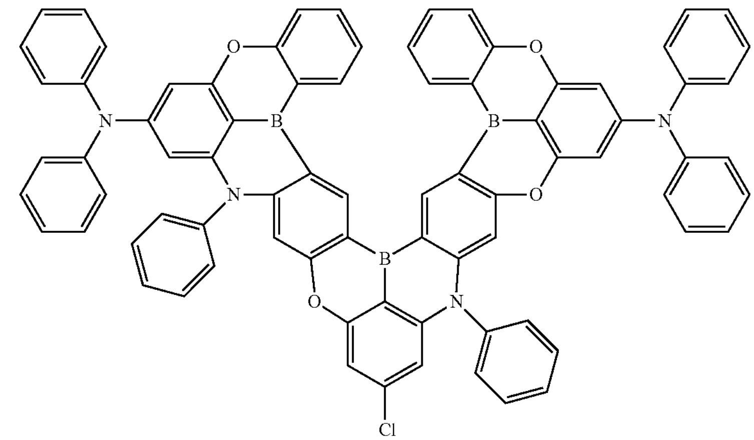
(1-13-105)
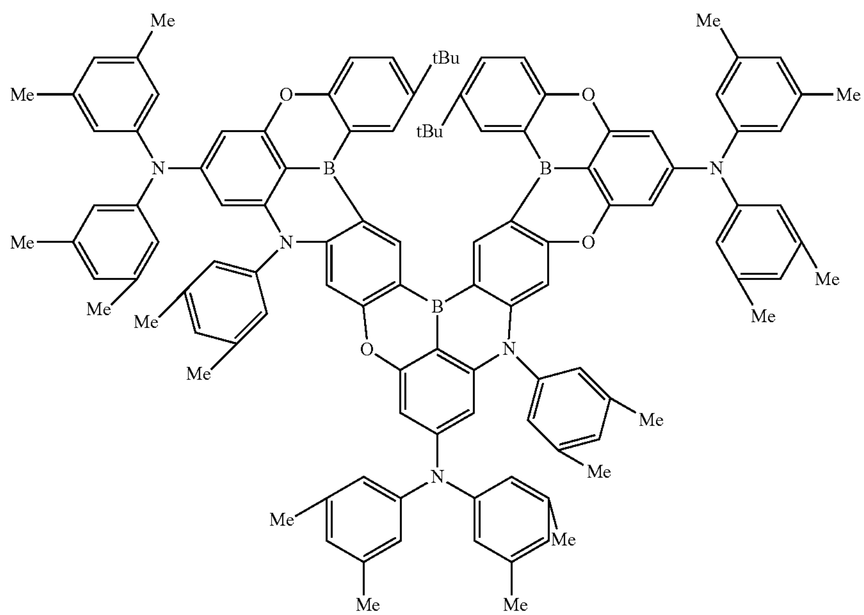
(1-13-106)
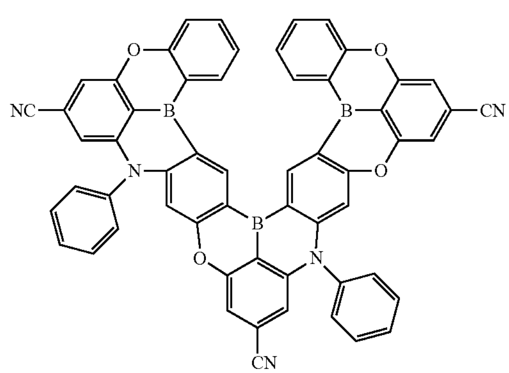
(1-13-107)
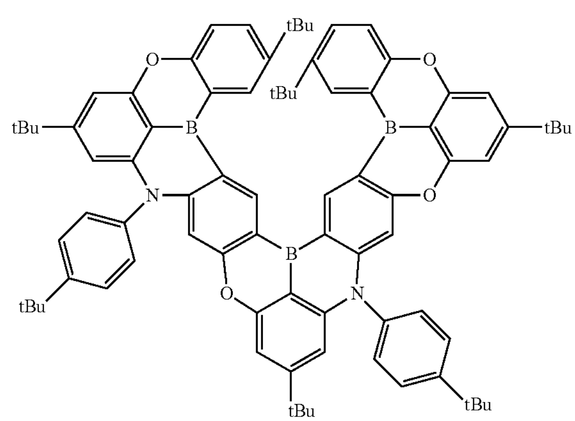

-continued
(1-13-108)
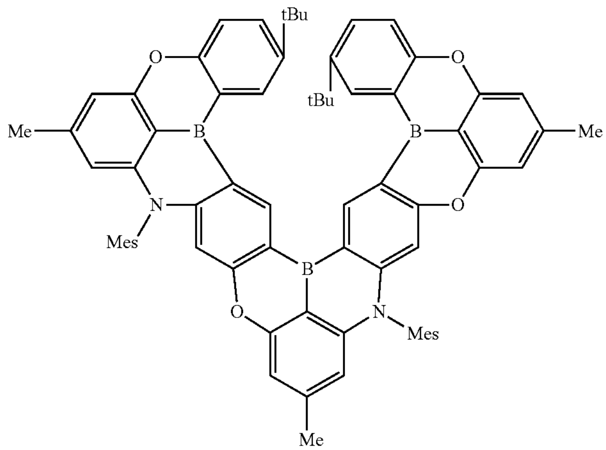
(1-13-109)
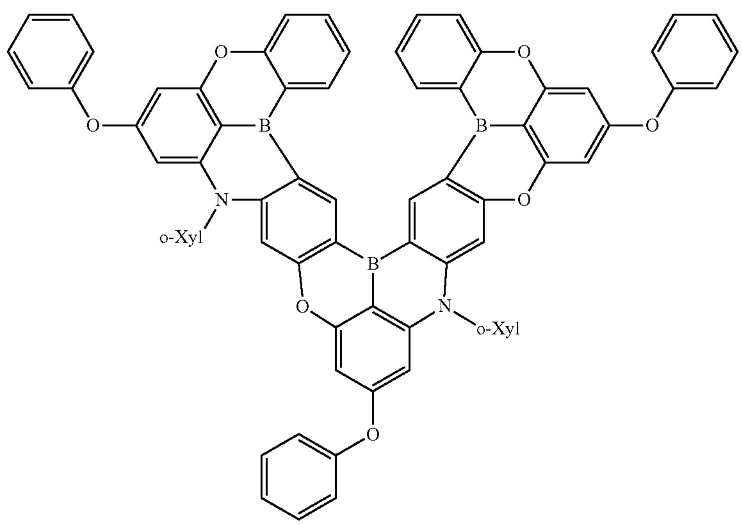
(1-13-110)
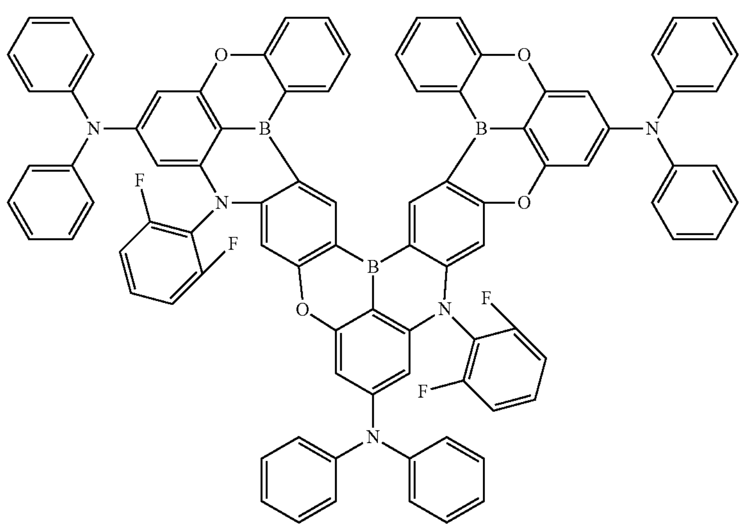

-continued
(1-13-121)
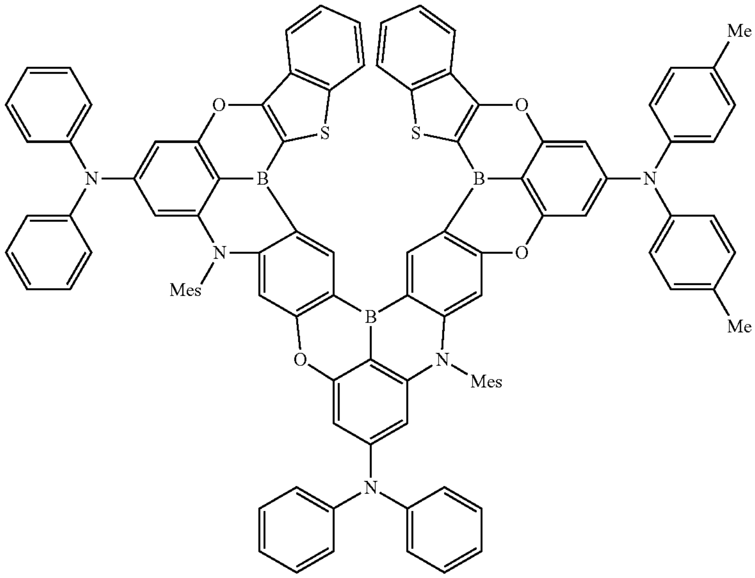
(1-13-122)
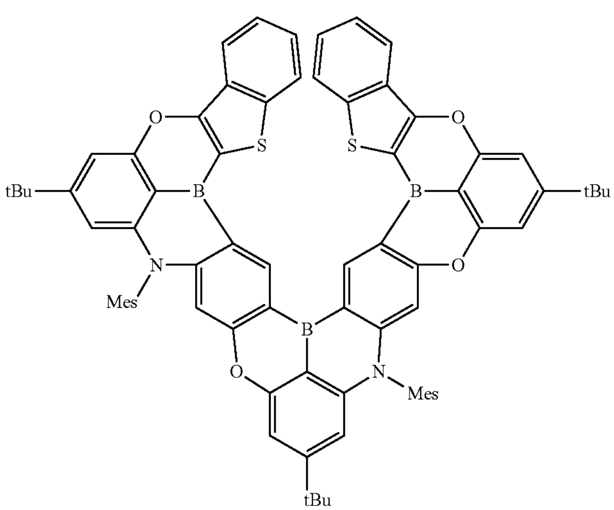

-continued
(1-13-123)
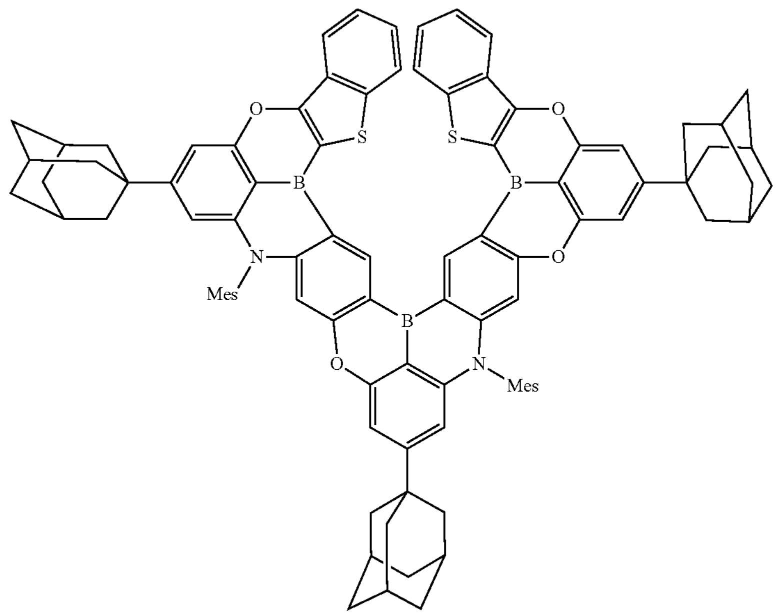
(1-13-124)
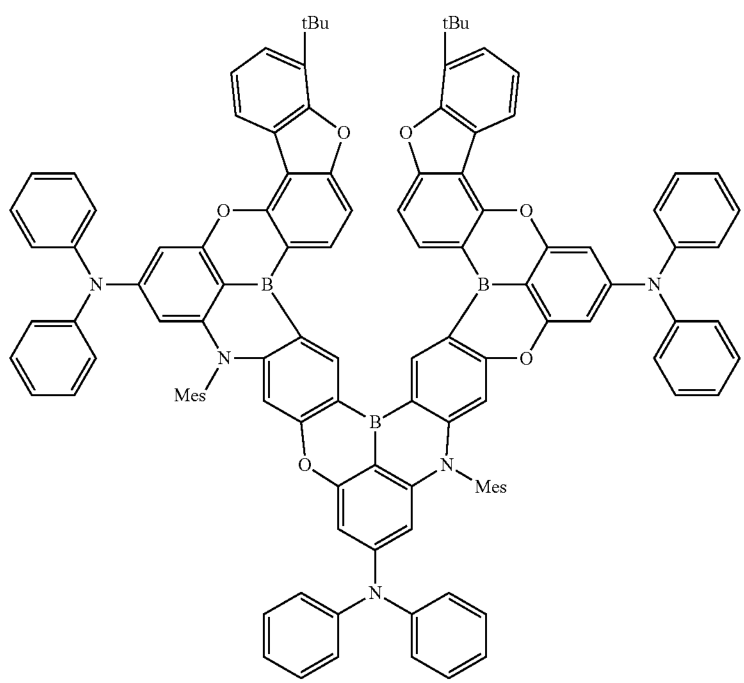

-continued
(1-13-125)
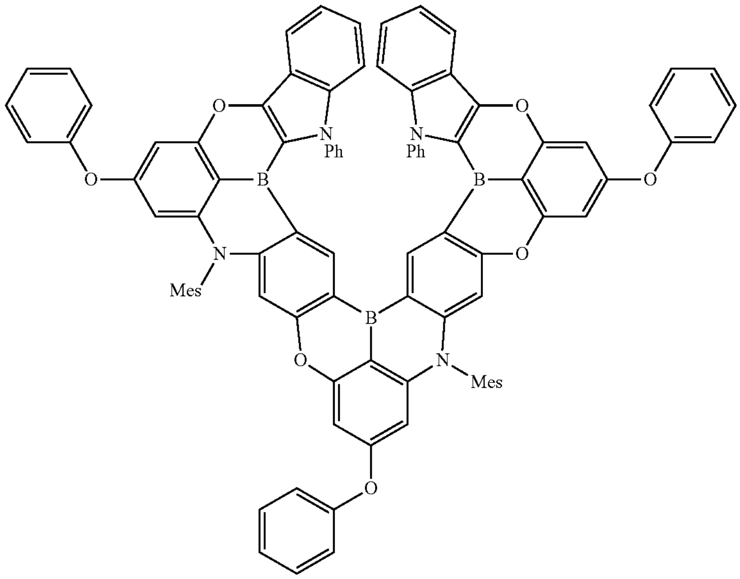
(1-13-126)
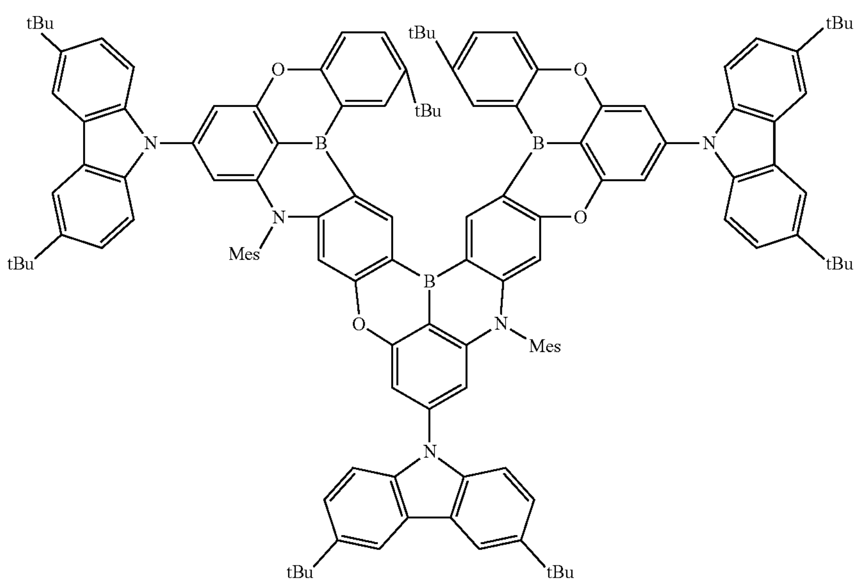

-continued
(1-13-127)
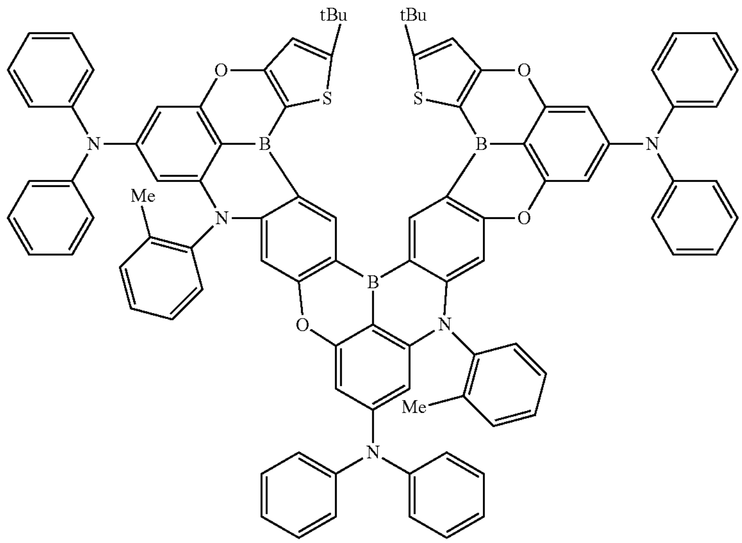
(1-13-128)
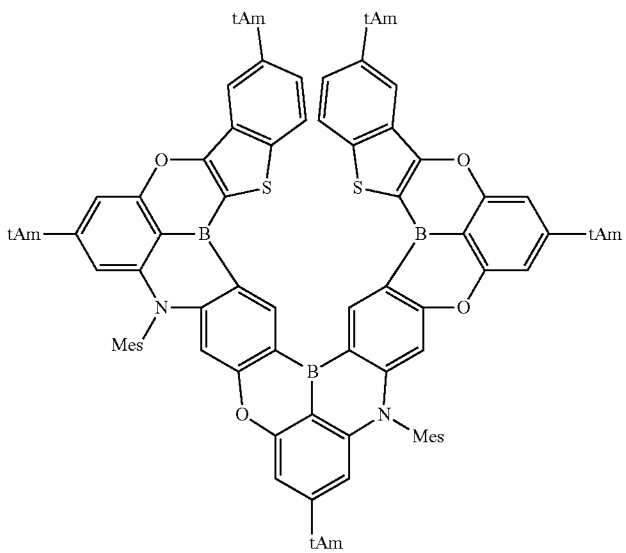
(1-13-129)
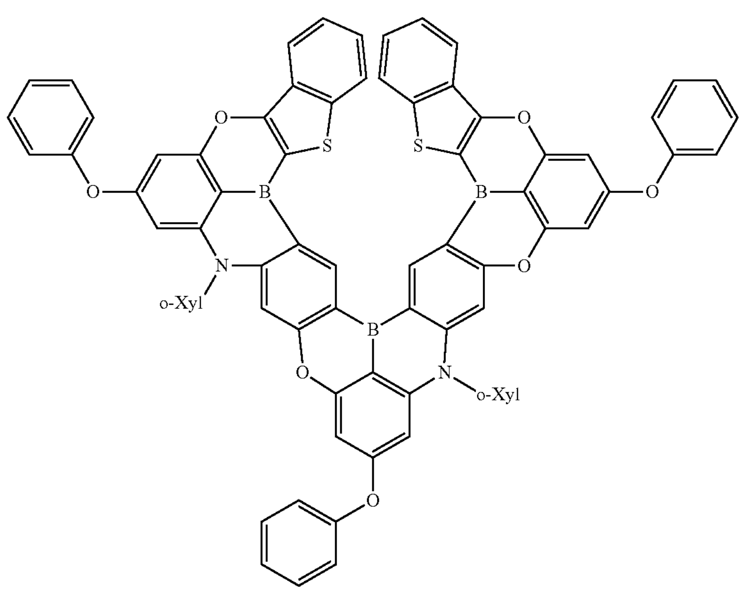

-continued
(1-13-130)
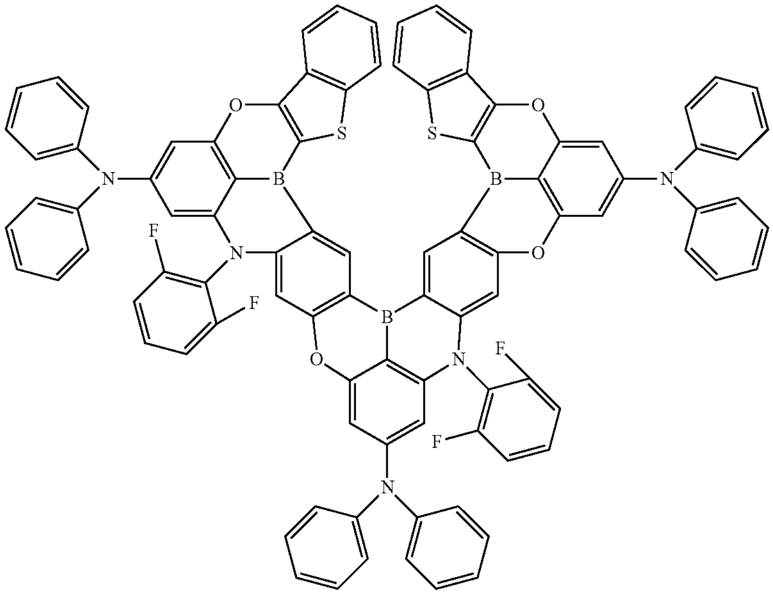
(1-13-141)
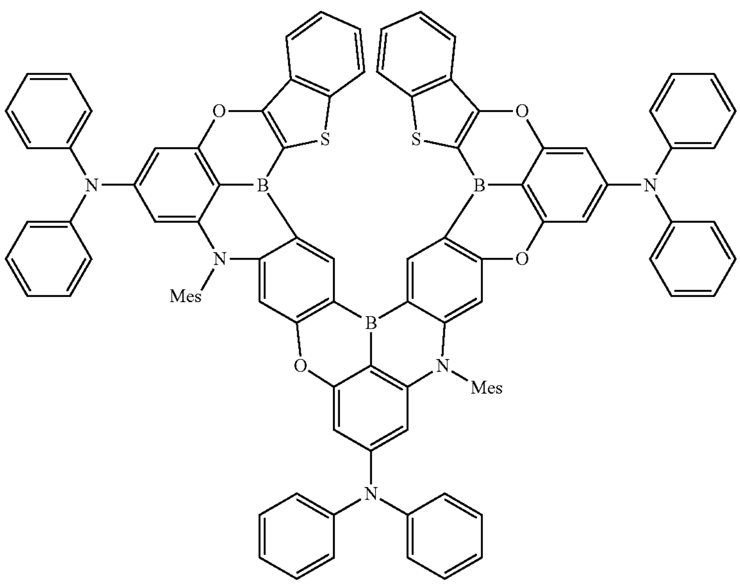
(1-13-142)
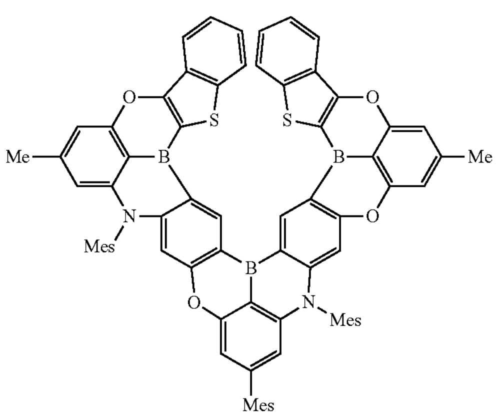
(1-13-143)
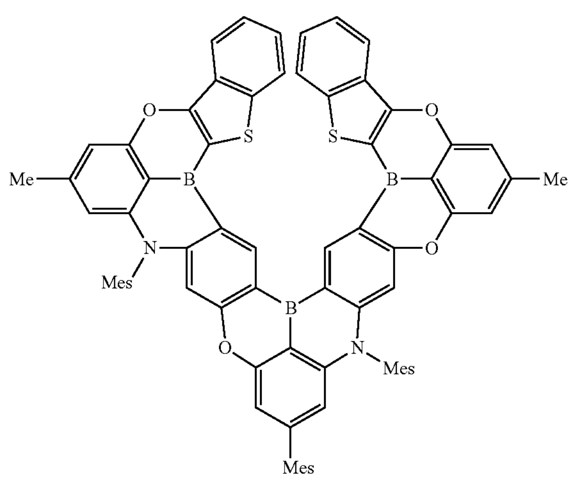

-continued
(1-13-144)
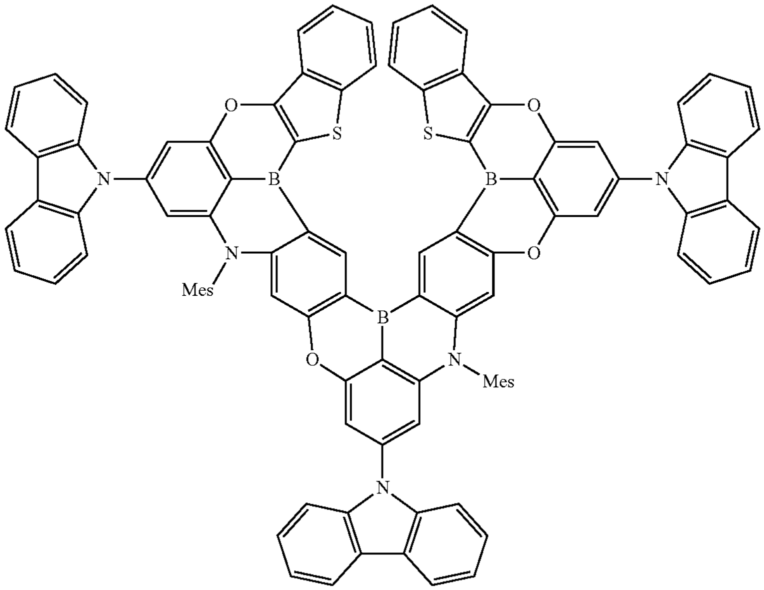
(1-13-145)
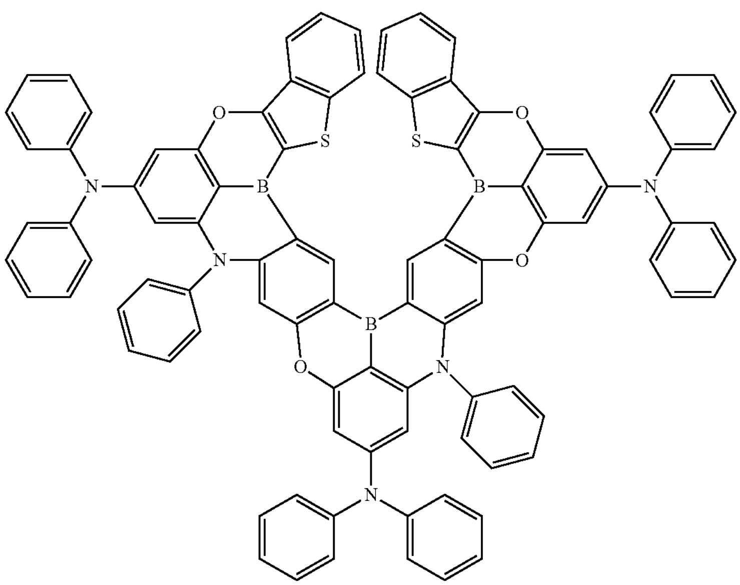
(1-13-146)
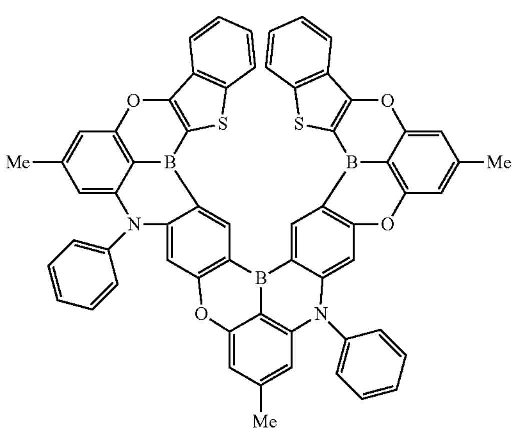
(1-13-147)
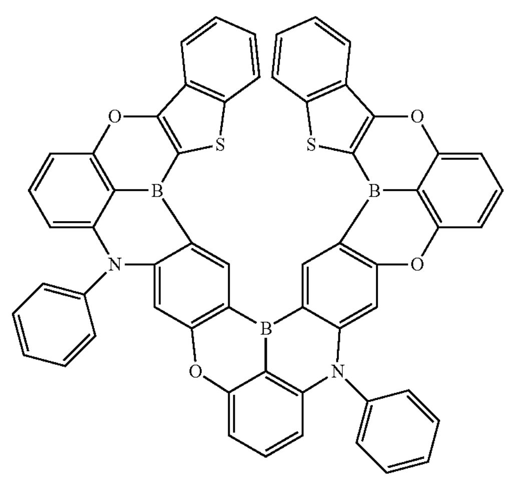

-continued
(1-13-148)
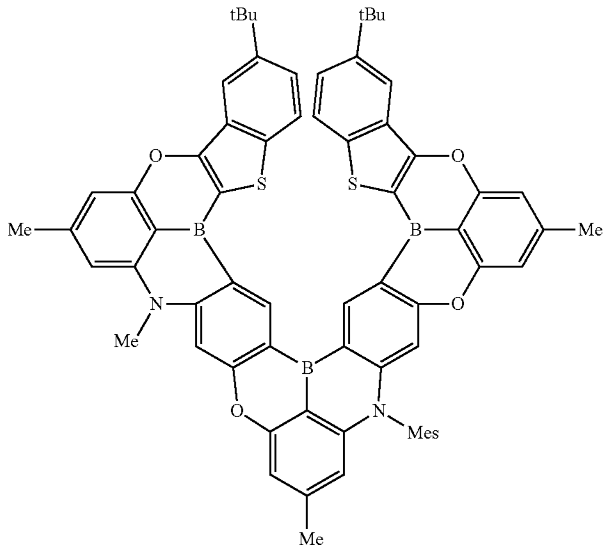
(1-13-149)
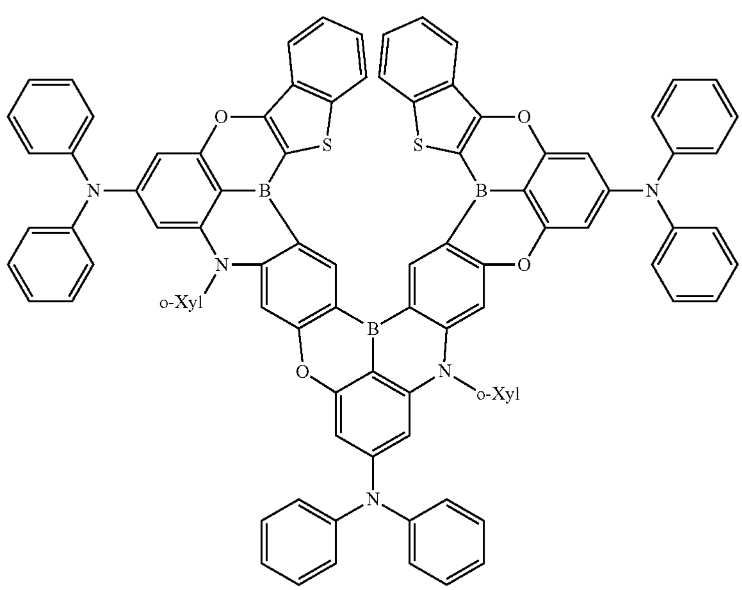

-continued
(1-13-150)
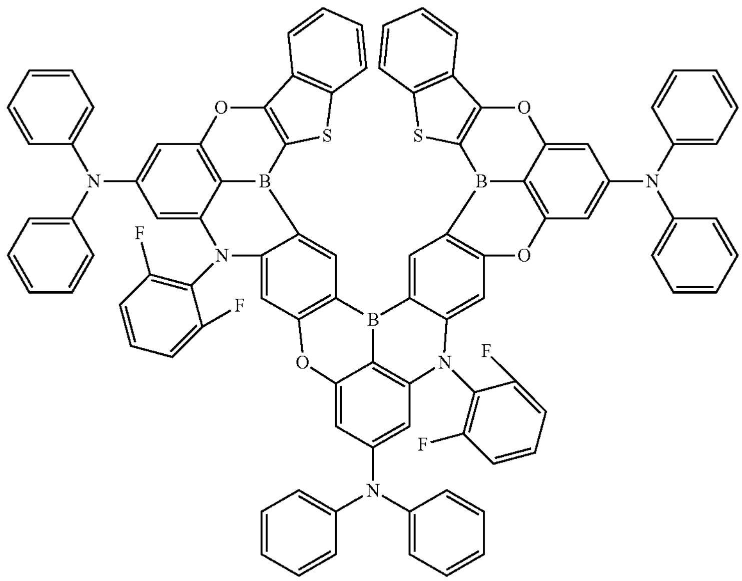
(1-13-161)
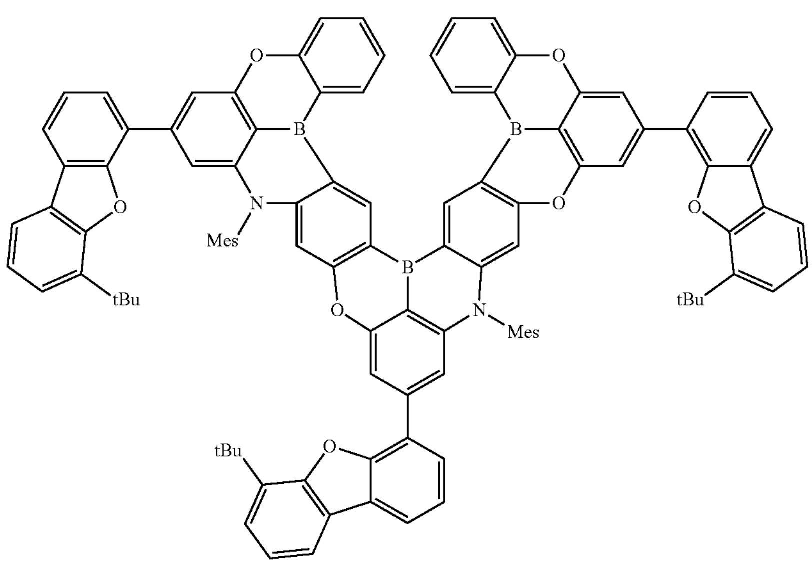

-continued
(1-13-162)
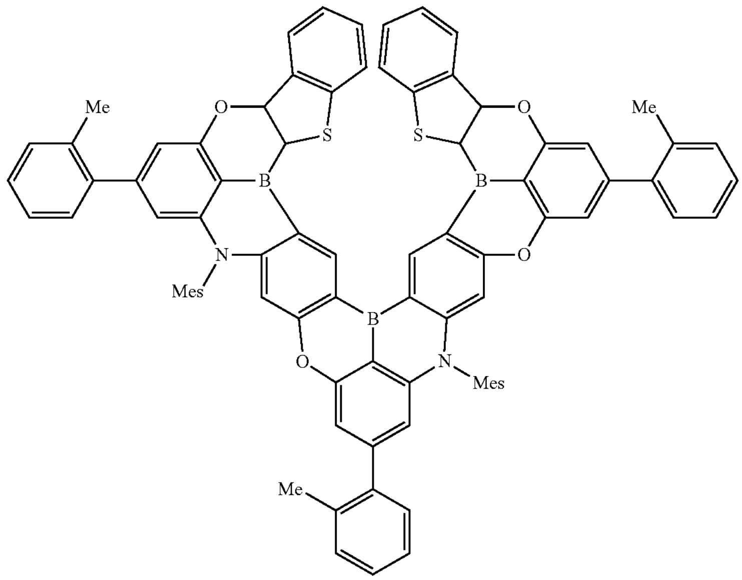
(1-13-163)
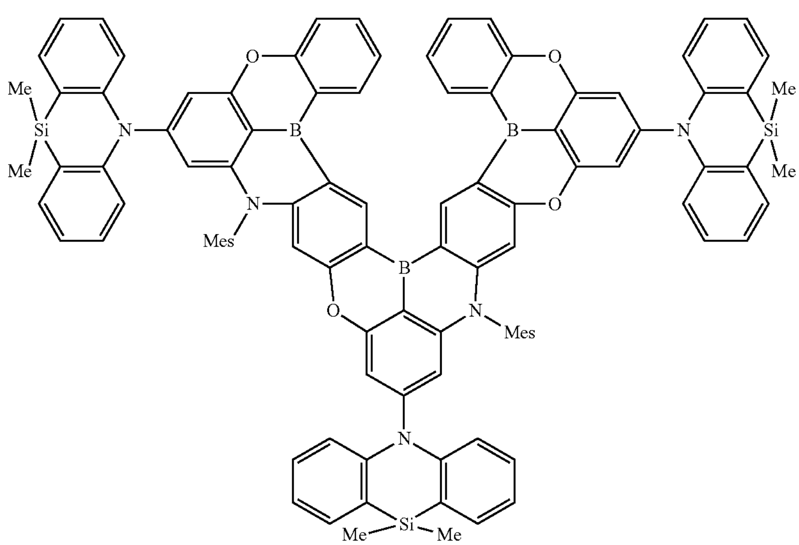

-continued
(1-13-164)
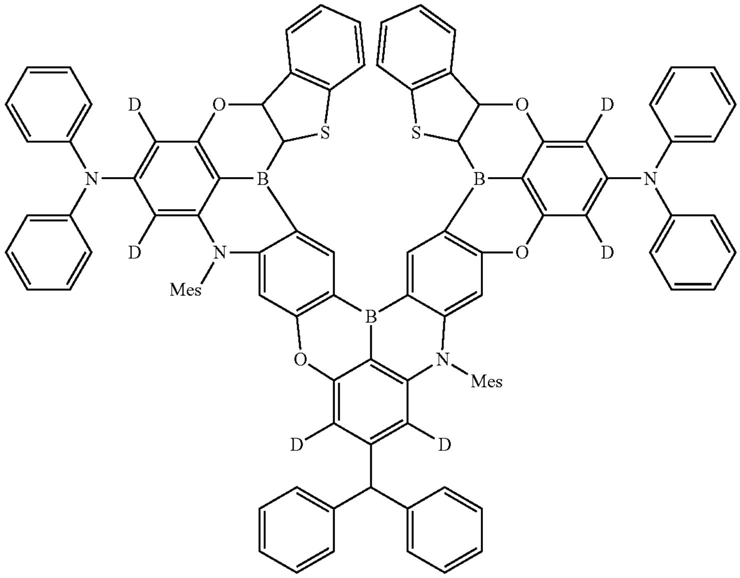
(1-13-165)
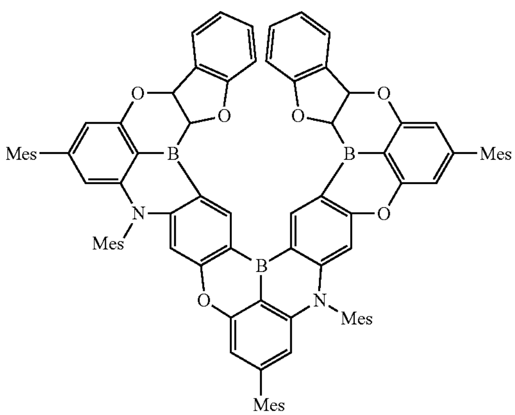
(1-13-166)
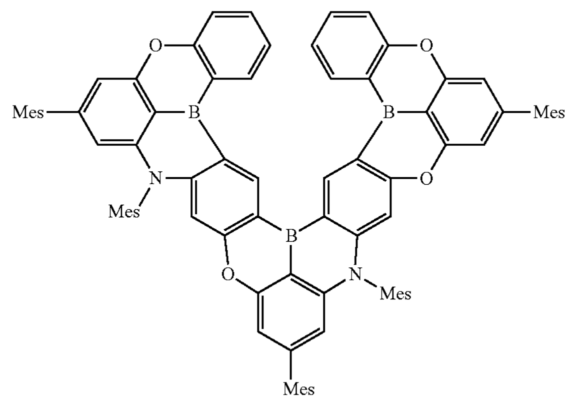
(1-13-167)
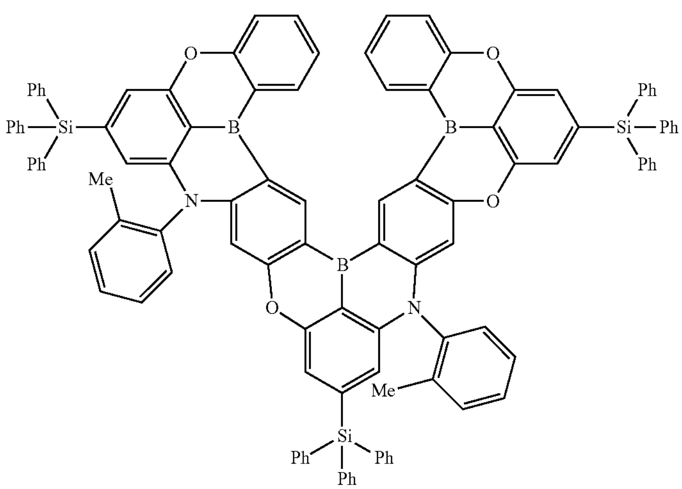

-continued
(1-13-168)
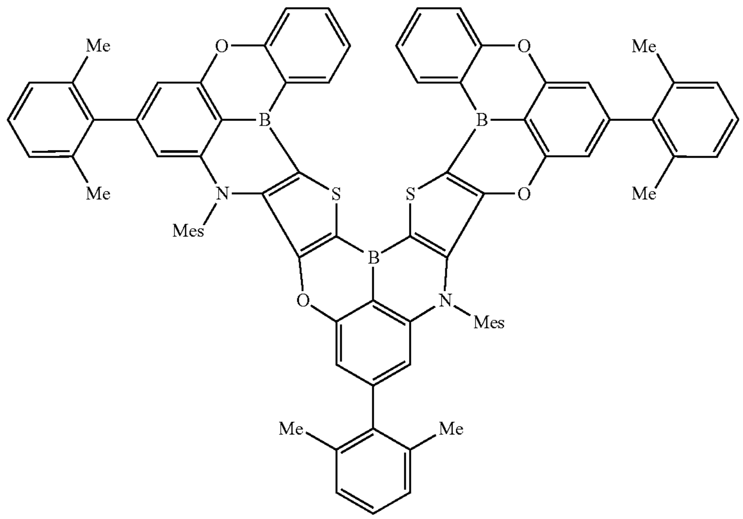
(1-13-169)
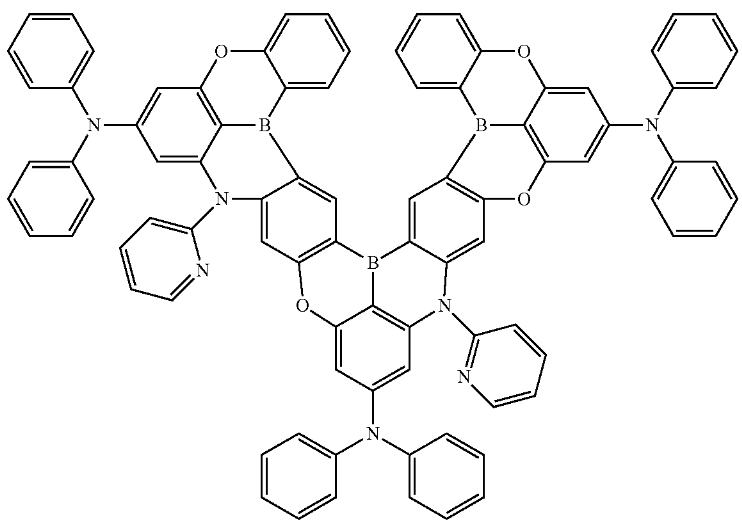
(1-13-170)
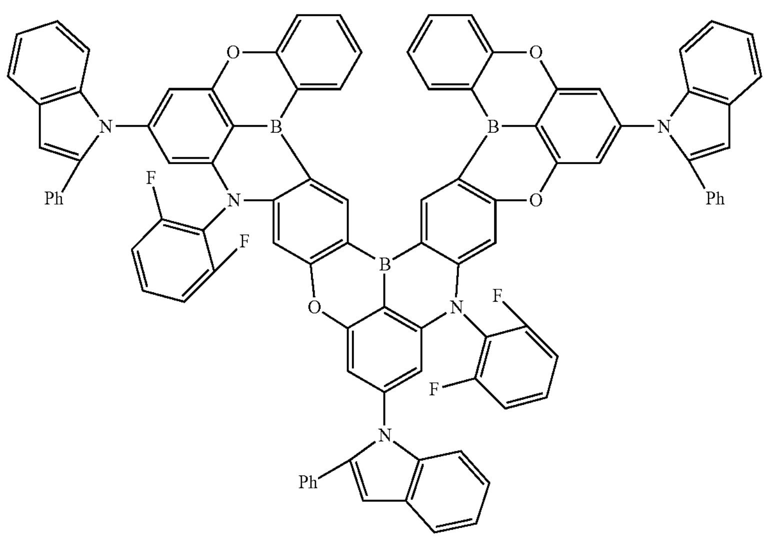

-continued
(1-13-191)
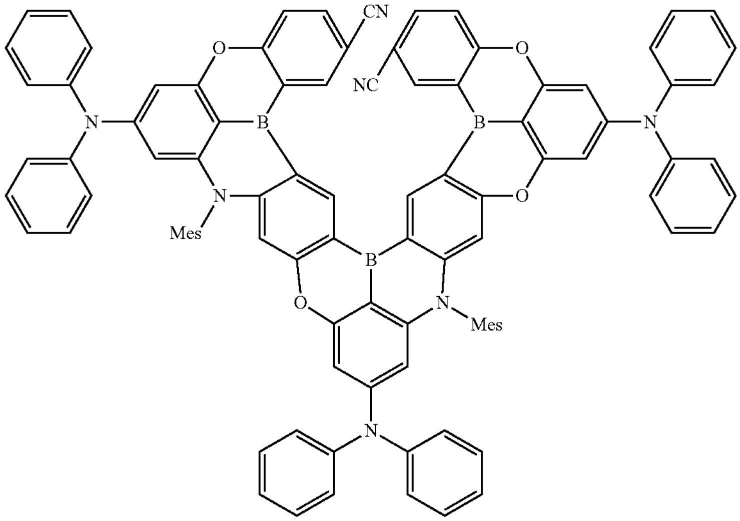
(1-13-192)
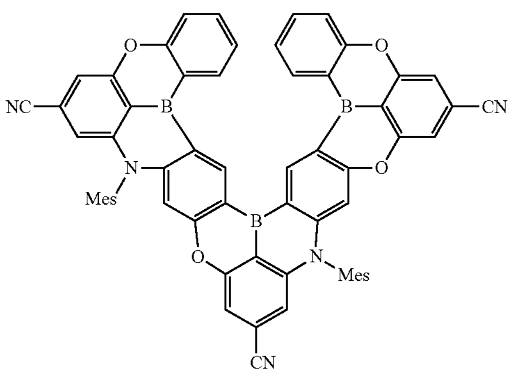
(1-13-193)
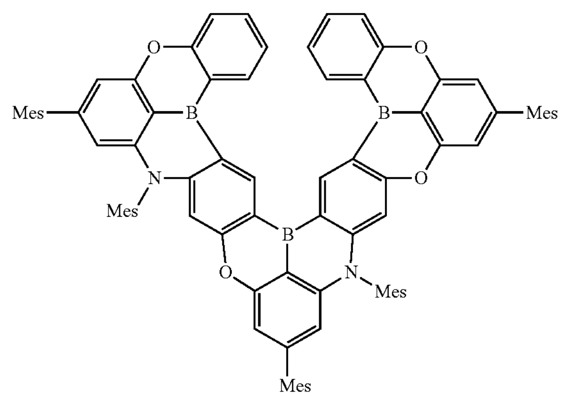
(1-13-194)
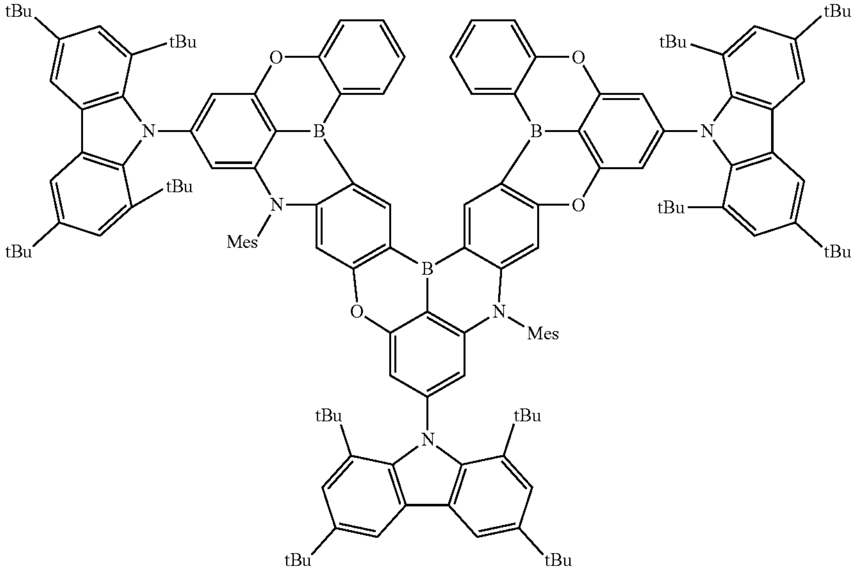

-continued
(1-13-195)
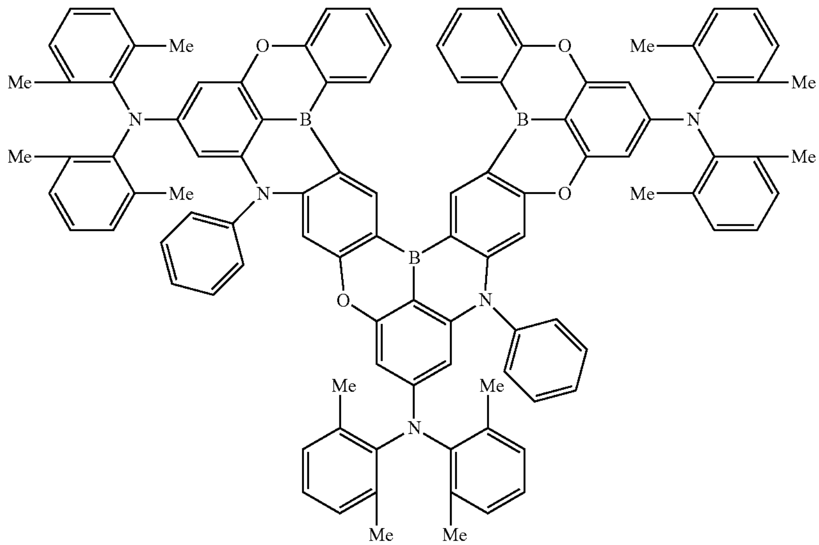
(1-13-196)
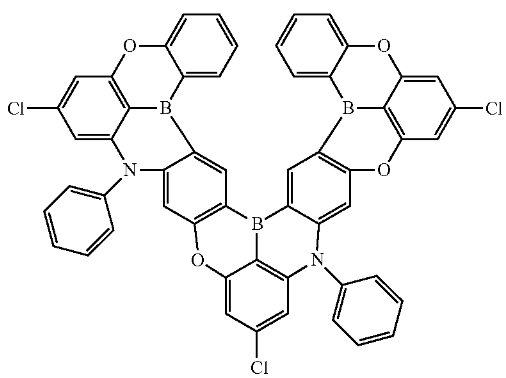
(1-13-197)
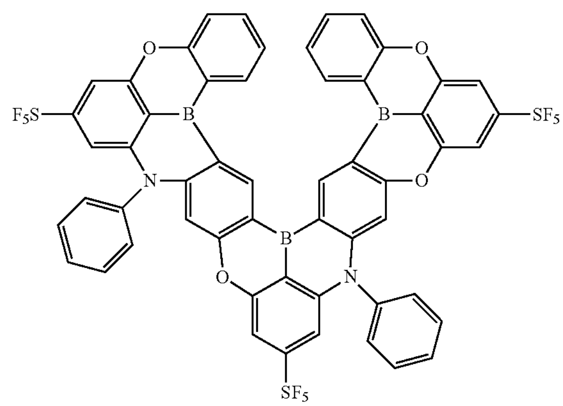
(1-13-198)
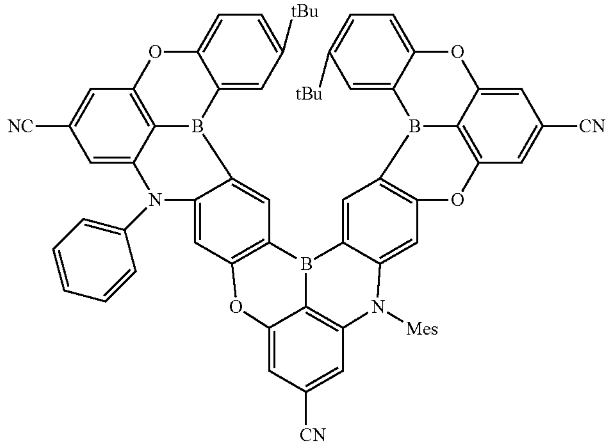

-continued
(1-13-199)
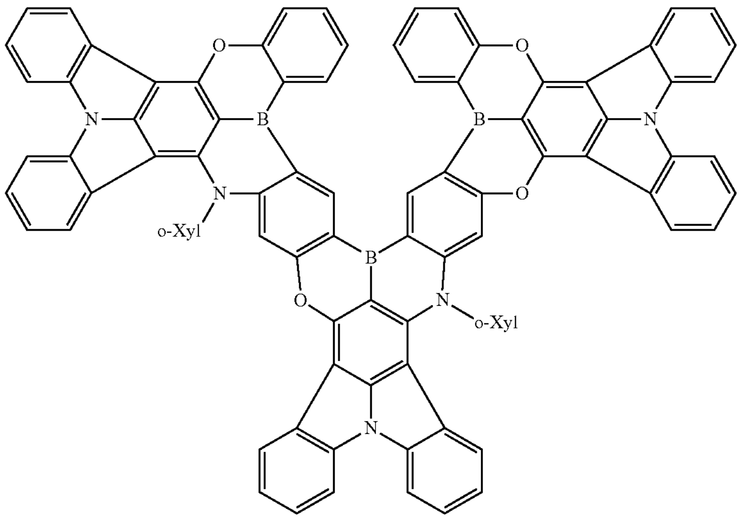
(1-13-200)
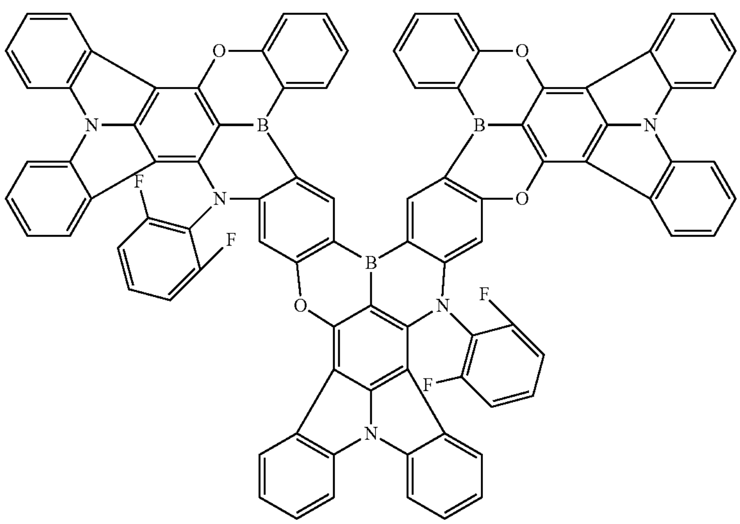
(1-13-221)
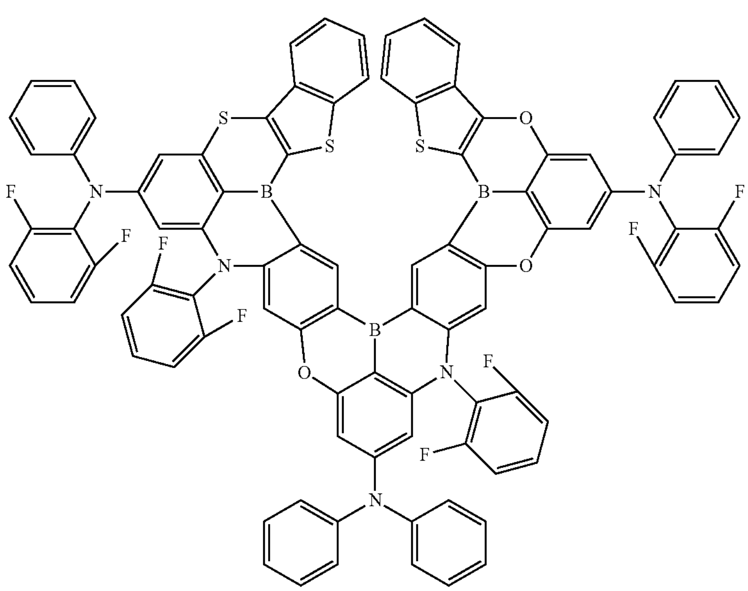

-continued
(1-13-222)
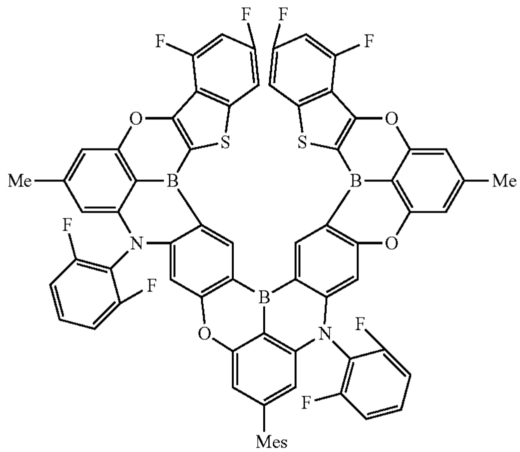
(1-13-223)
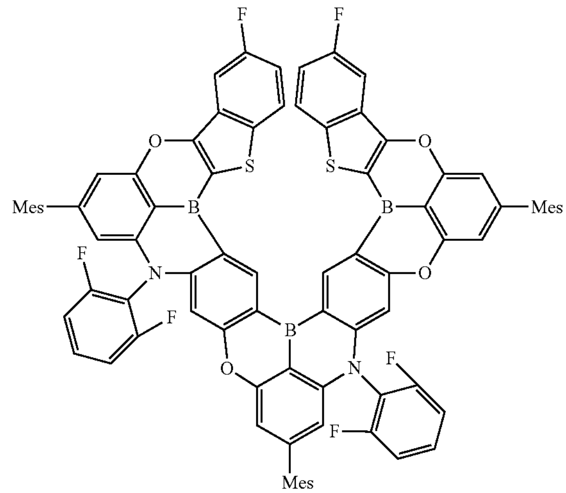
(1-13-224)
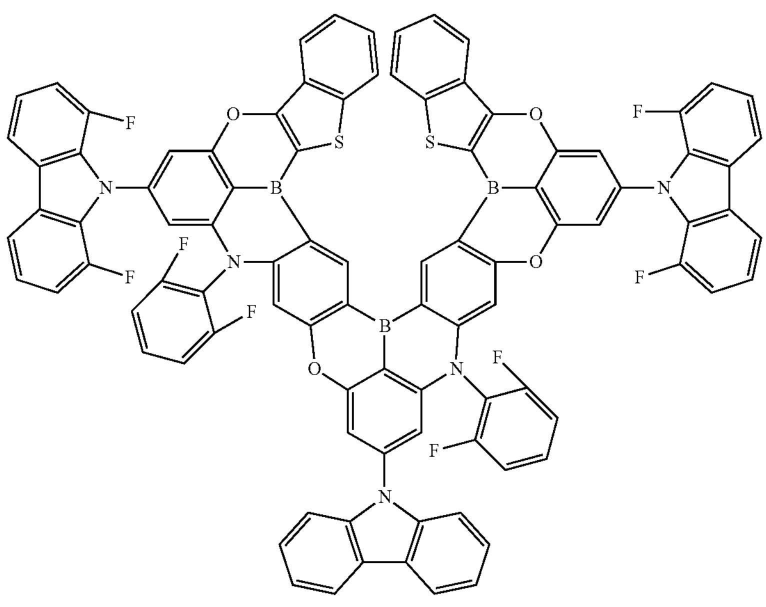

-continued
(1-13-225)
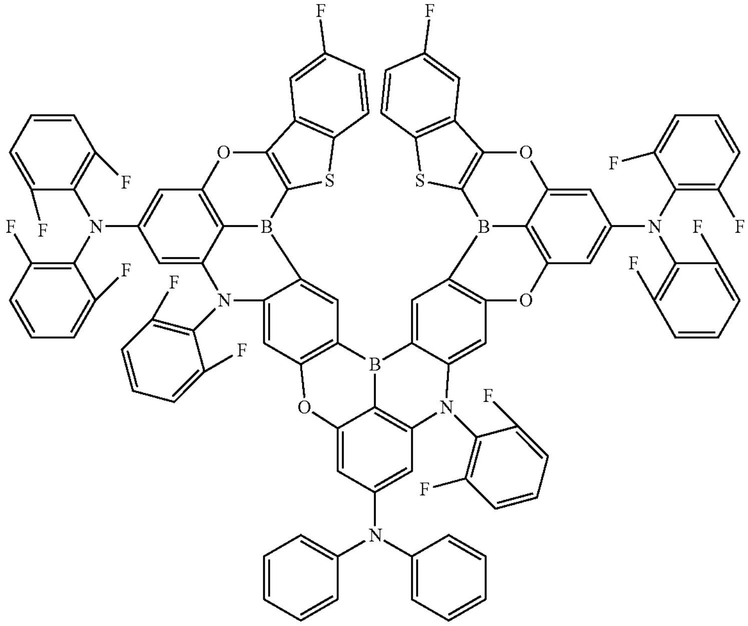
(1-13-226)
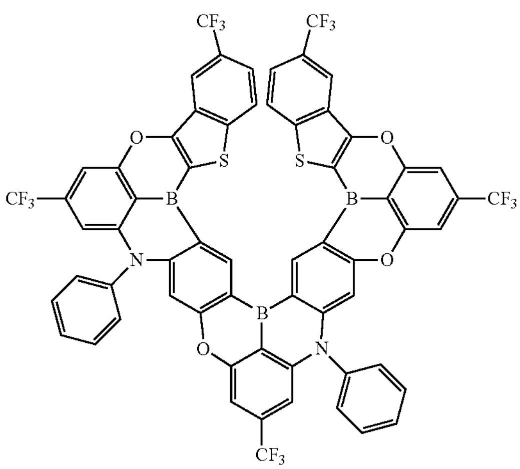
(1-13-227)
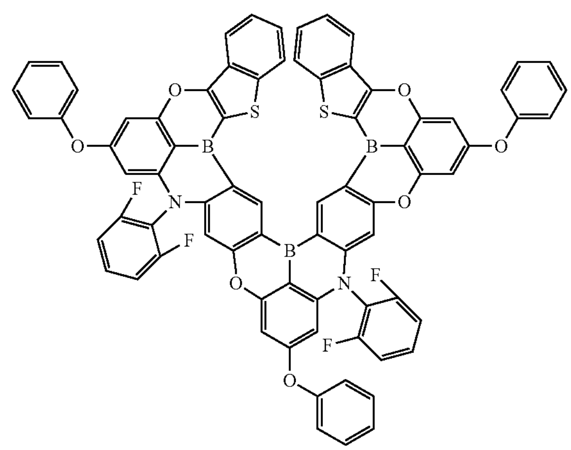
(1-13-228)
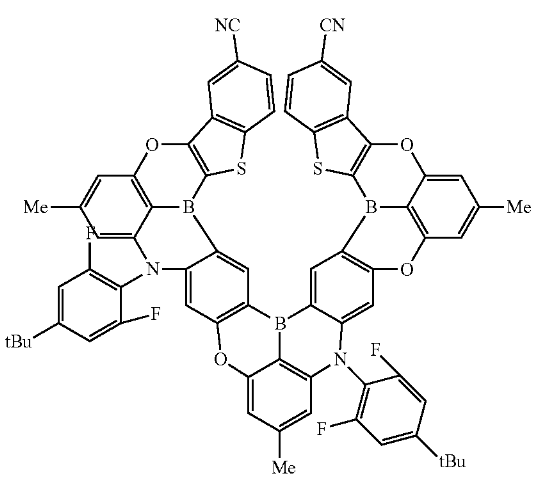
(1-13-229)
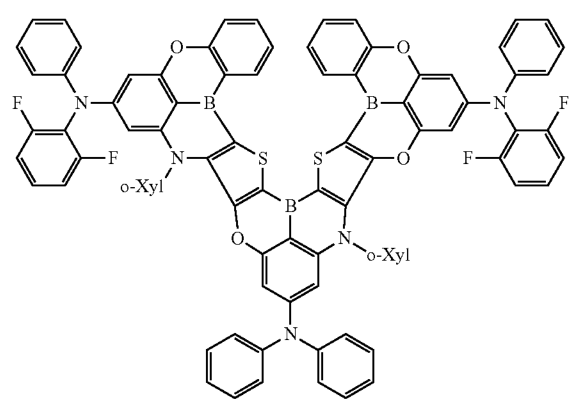

-continued
(1-13-230)
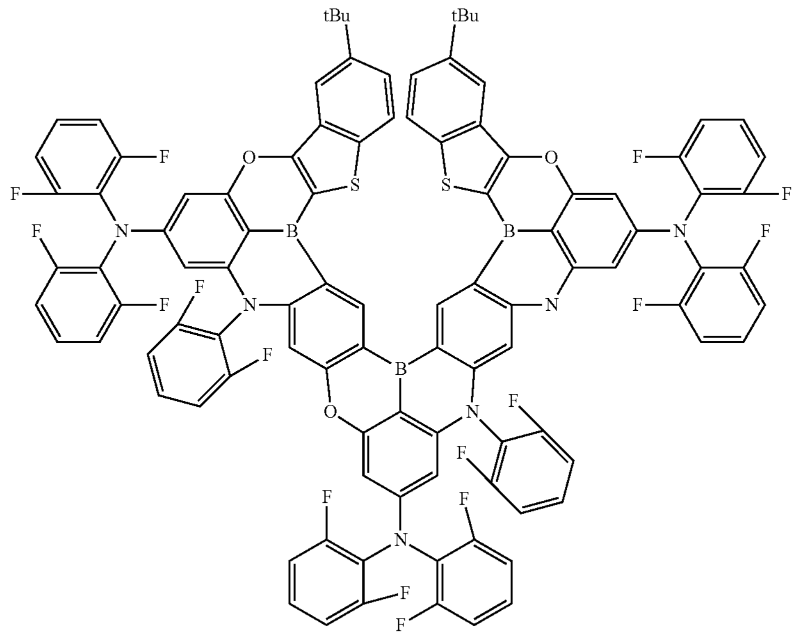
(1-14-1)
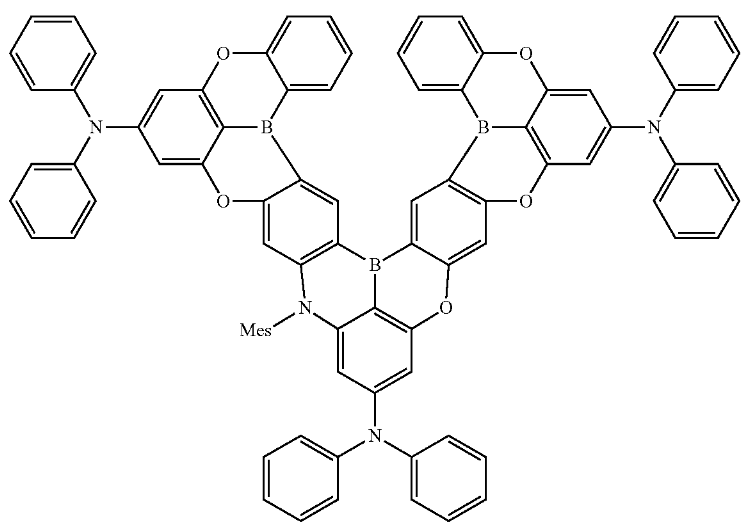
(1-14-2)
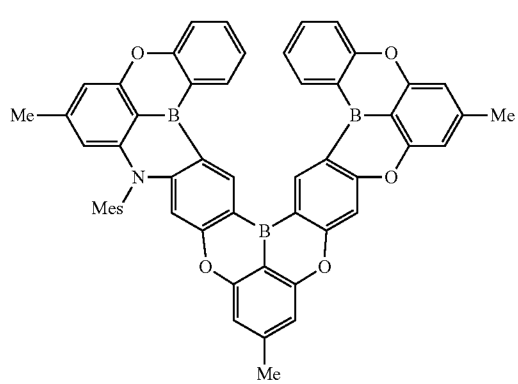
(1-14-3)
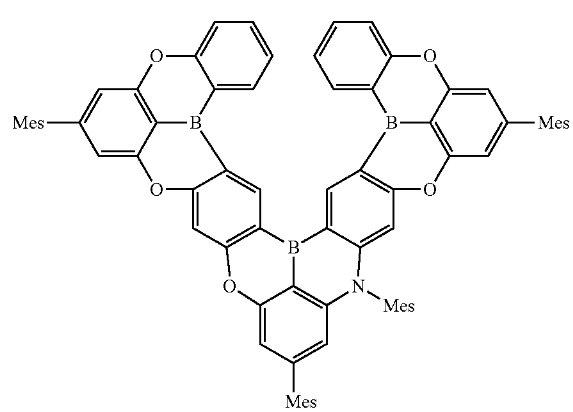

-continued
(1-14-4)
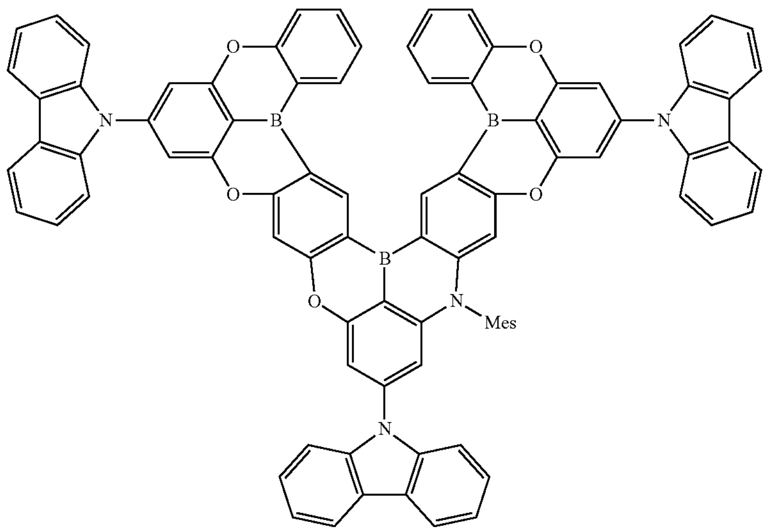
(1-14-5)
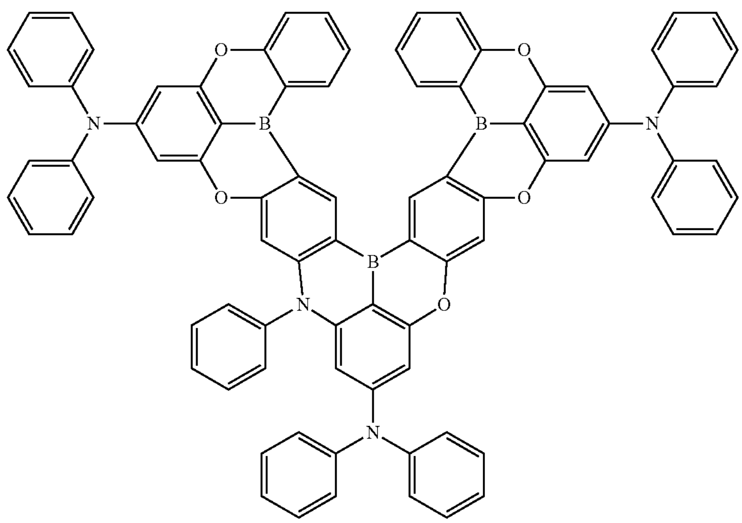
(1-14-6)
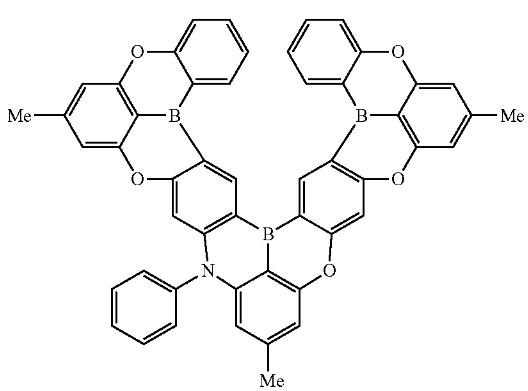
(1-14-7)
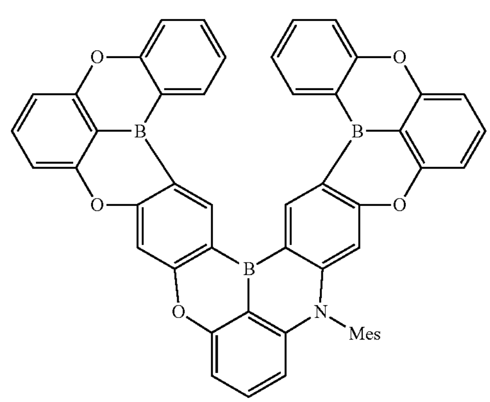

-continued
(1-14-8)
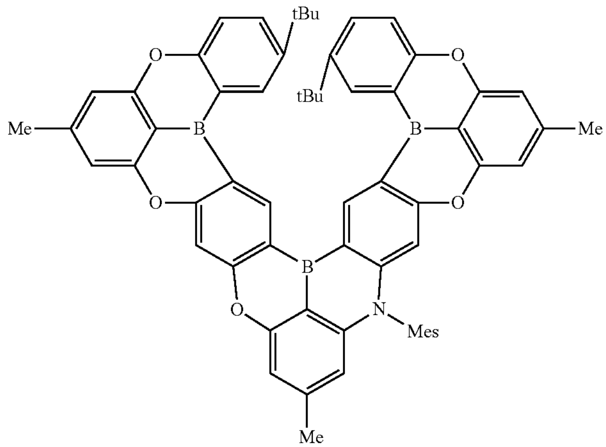
(1-14-9)
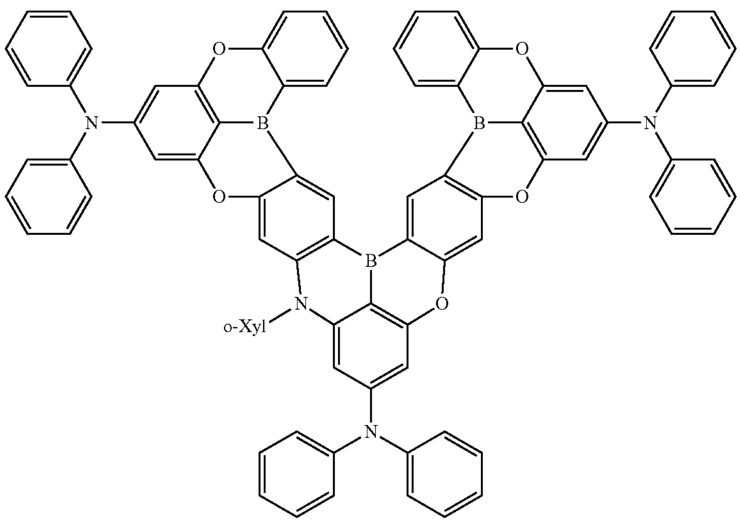
(1-14-10)
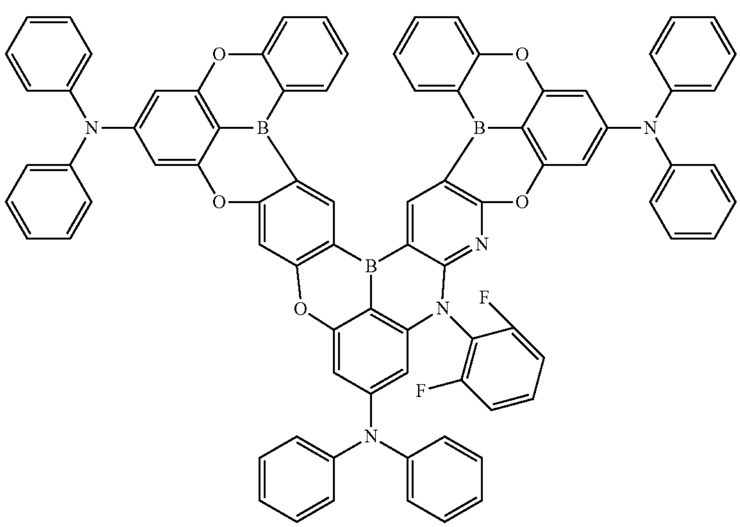

-continued
(1-14-21)
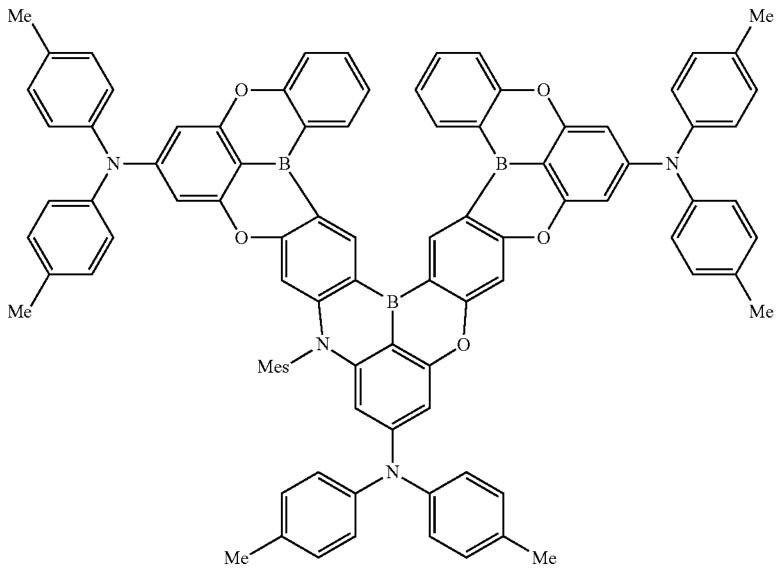
(1-14-22)
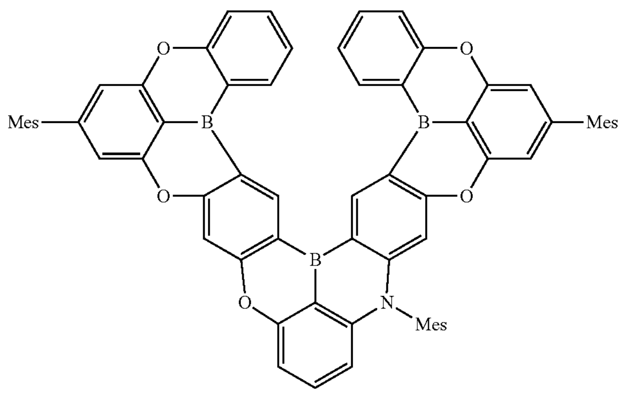
(1-14-23)
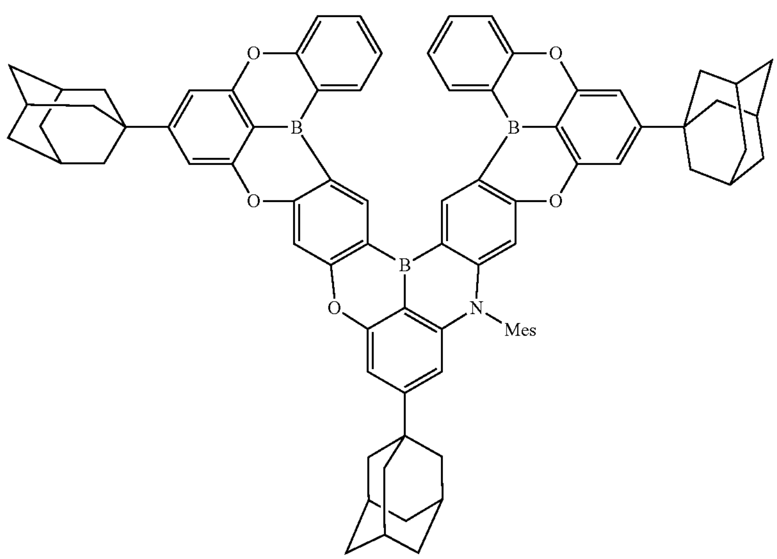

-continued
(1-14-24)
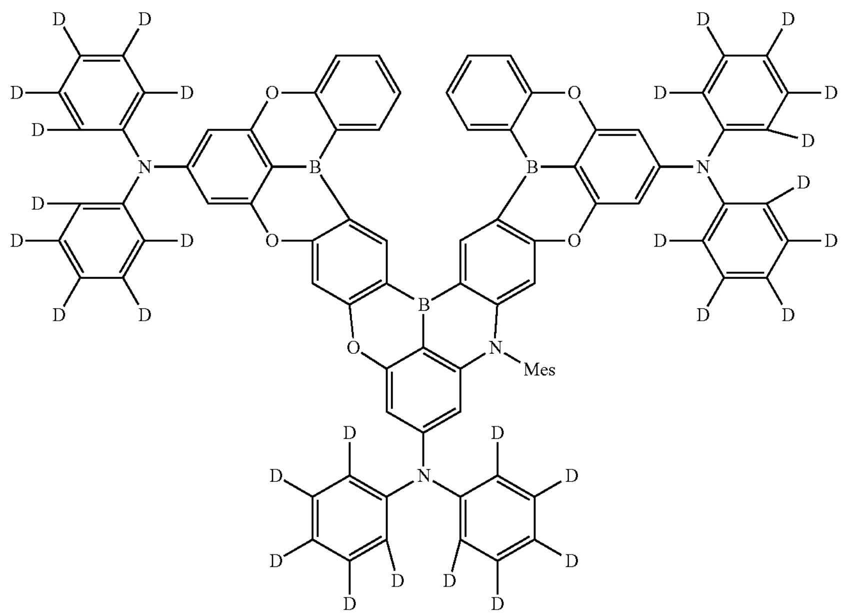
(1-14-25)
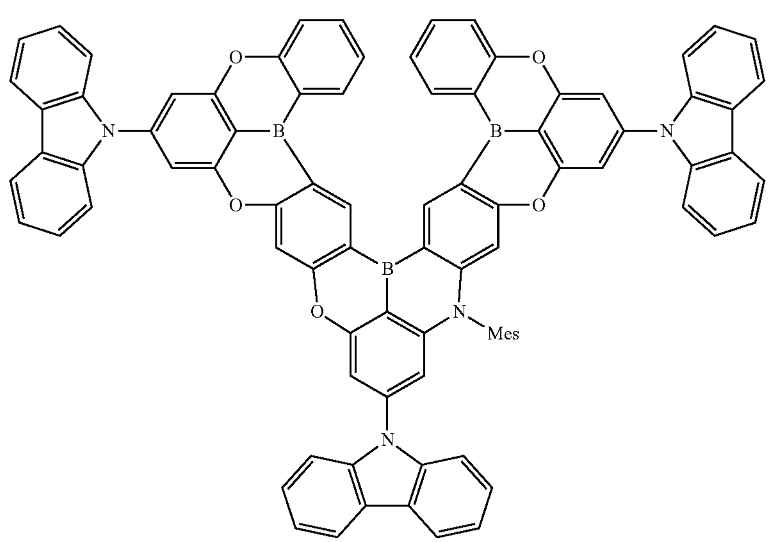

-continued
(1-14-26)
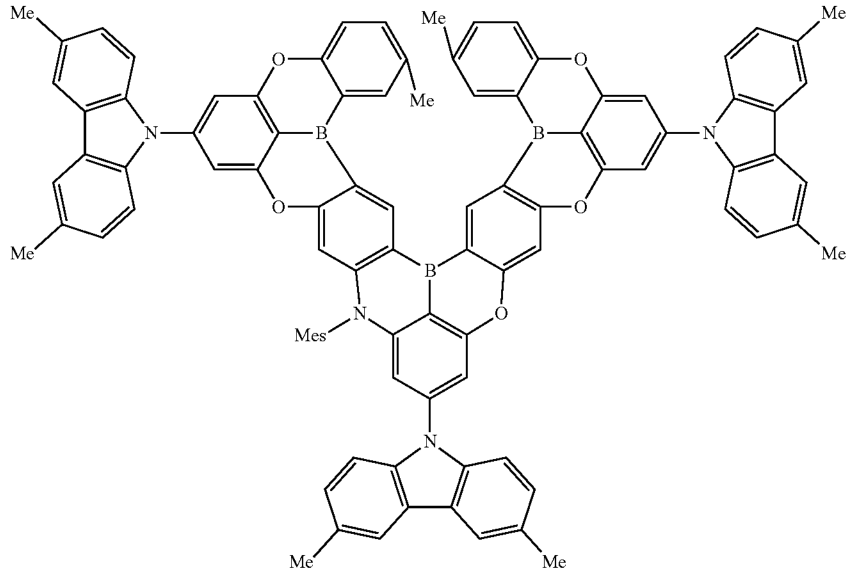
(1-14-27)
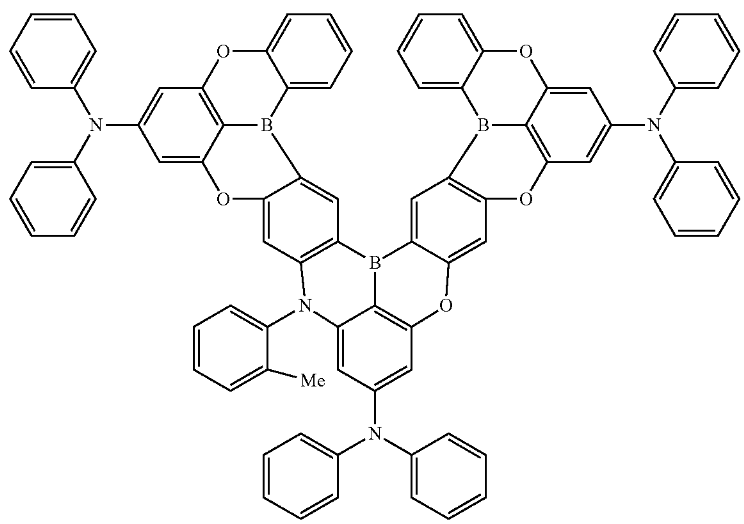
(1-14-28)
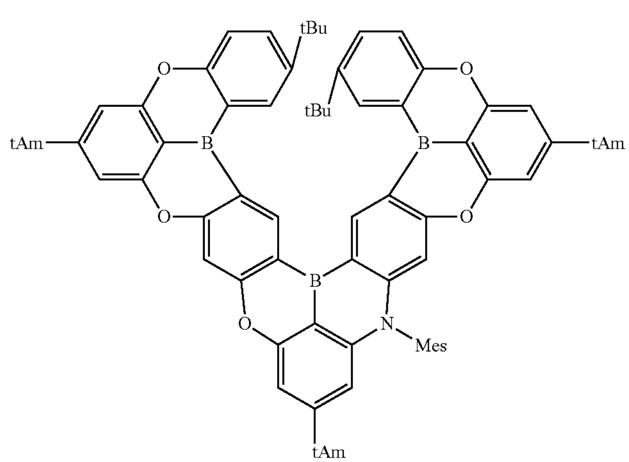

-continued
(1-14-29)
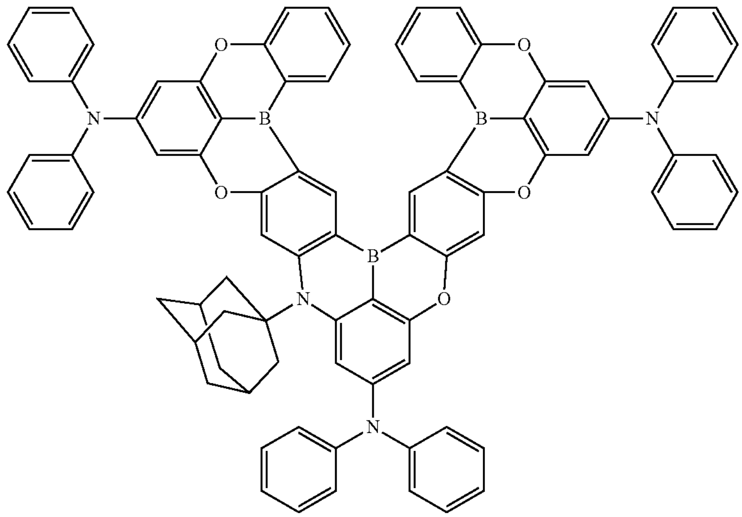
(1-14-30)
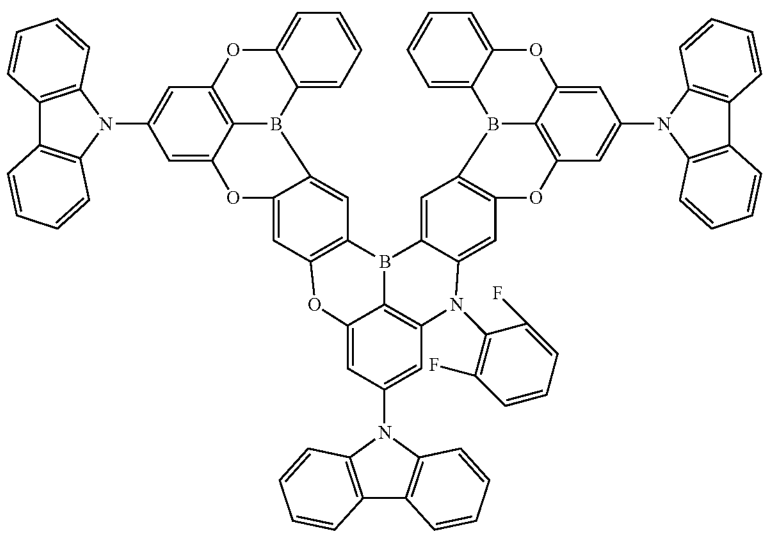
(1-14-41)
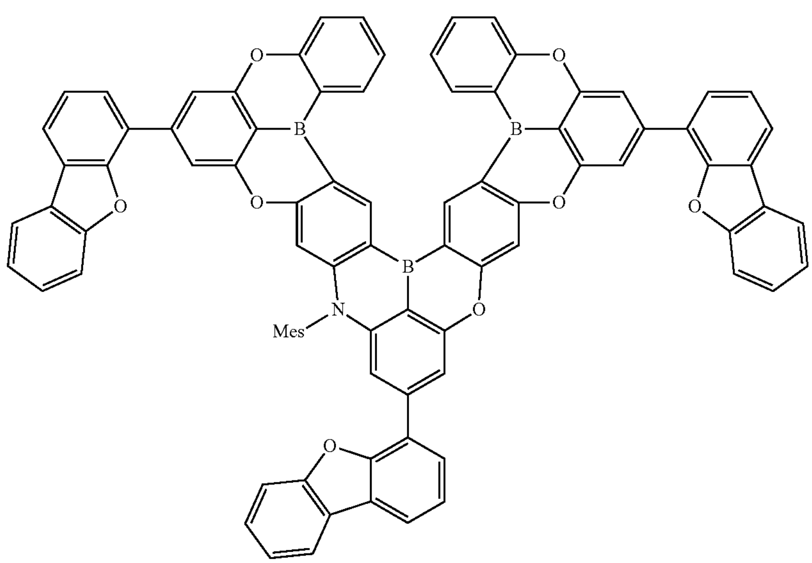

-continued
(1-14-42)
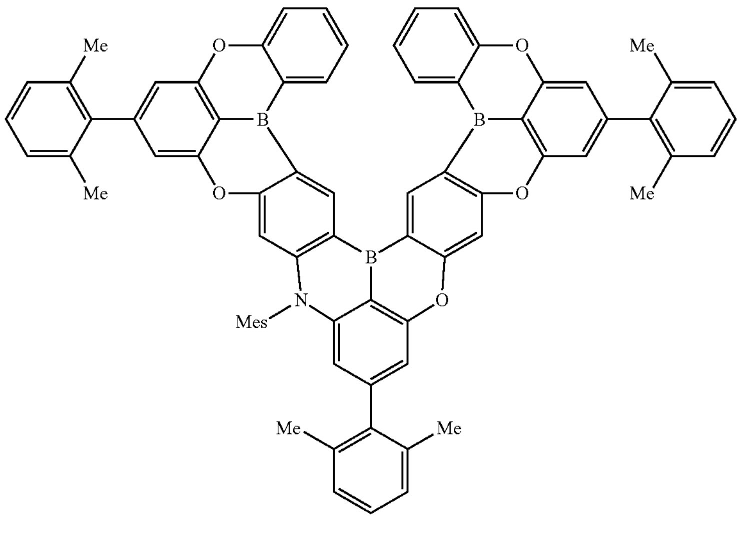
(1-14-43)
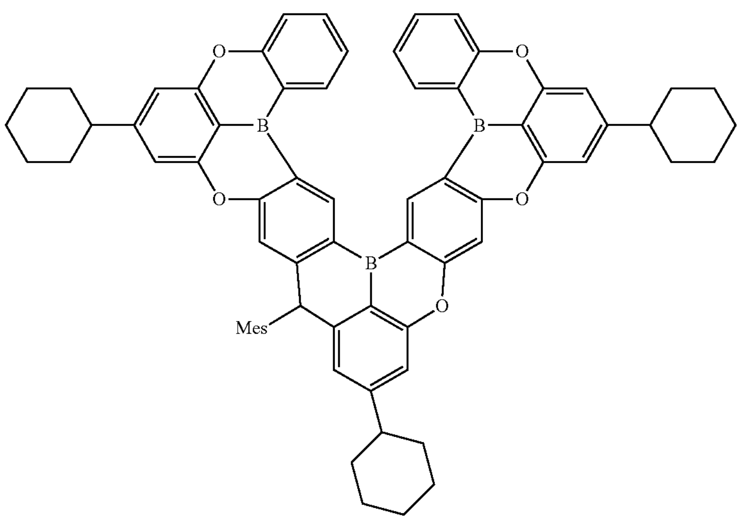
(1-14-44)
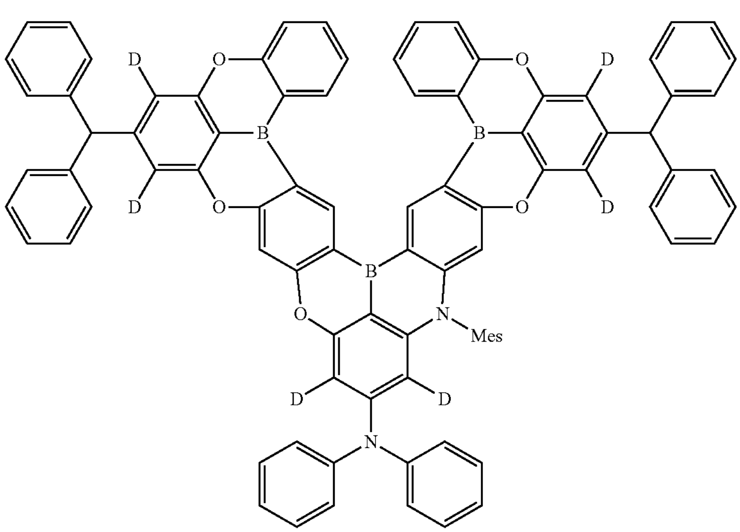

-continued
(1-14-45)
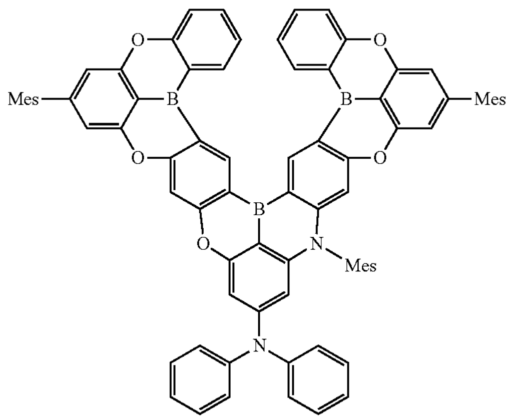
(1-14-46)
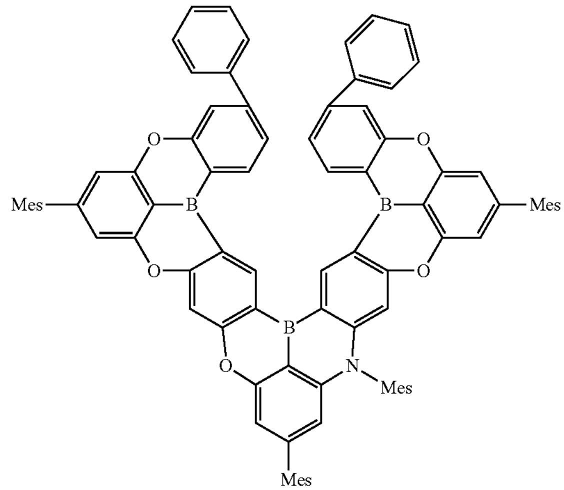
(1-14-47)
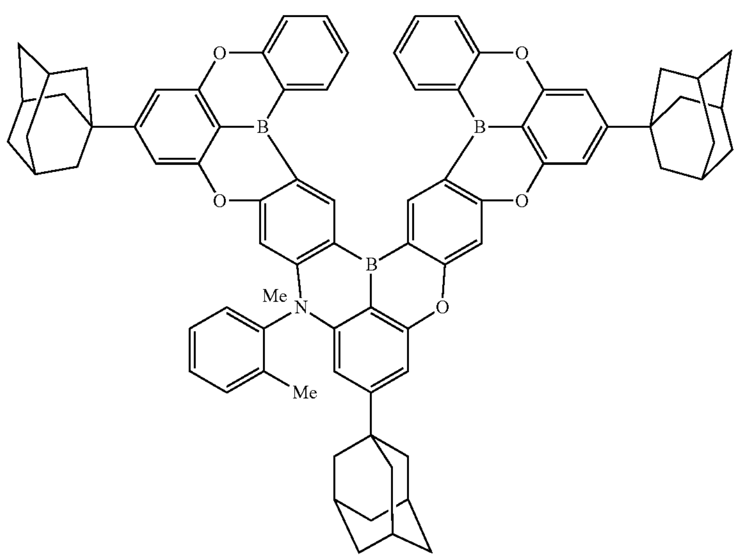

-continued
(1-14-48)
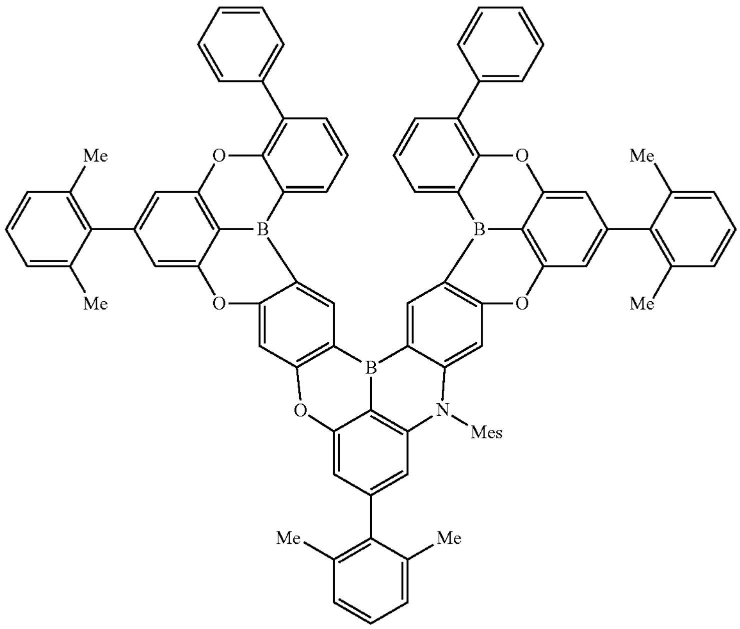
(1-14-49)
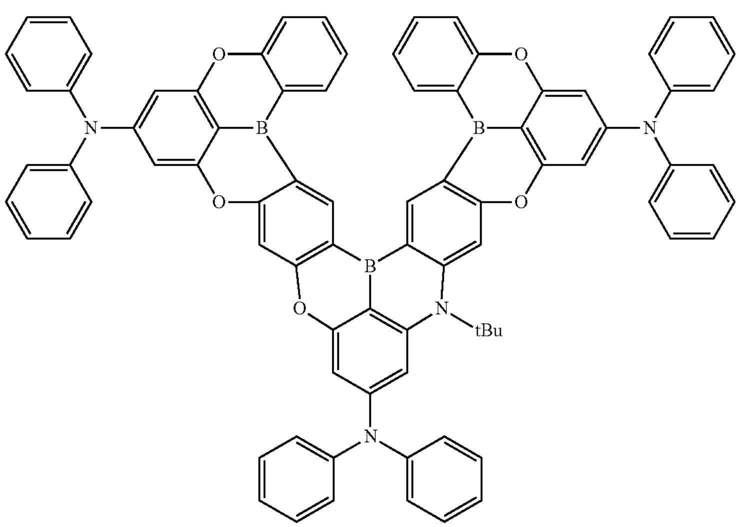

-continued
(1-14-50)
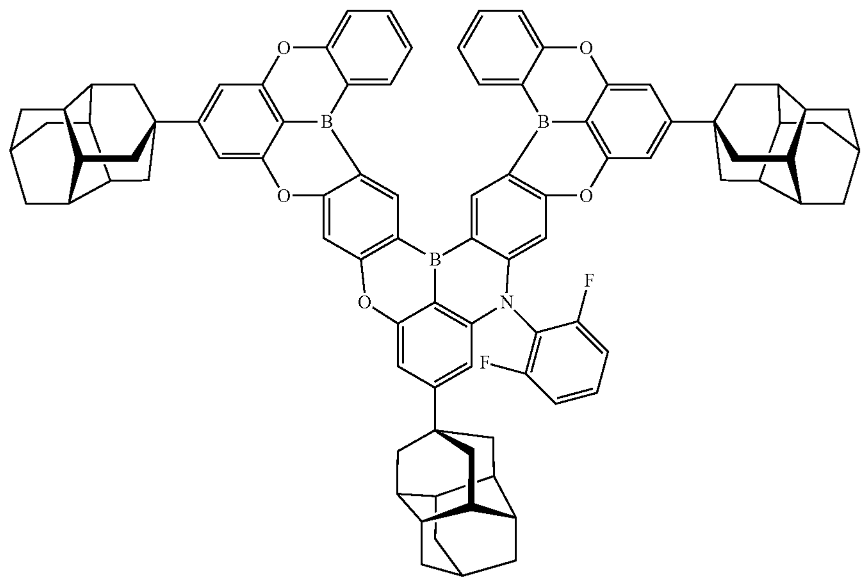
(1-14-101)
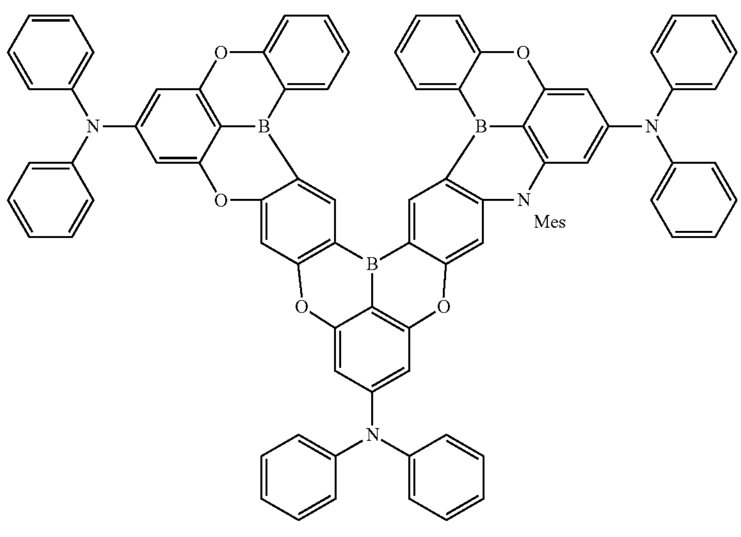
(1-14-102)
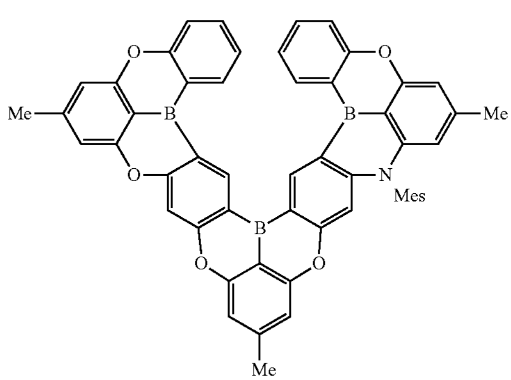
(1-14-103)
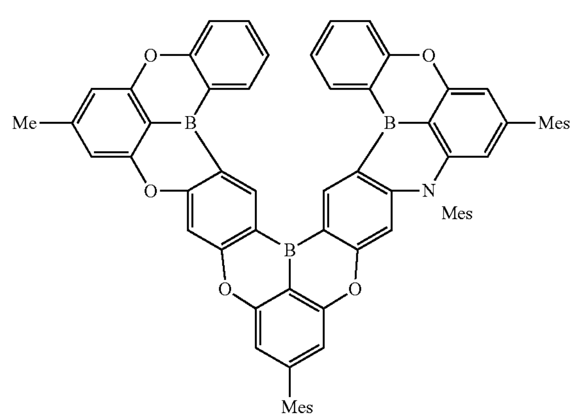

-continued
(1-14-104)
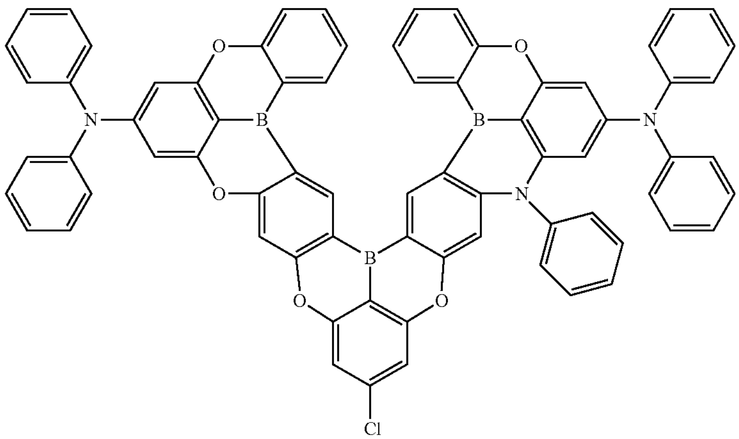
(1-14-105)
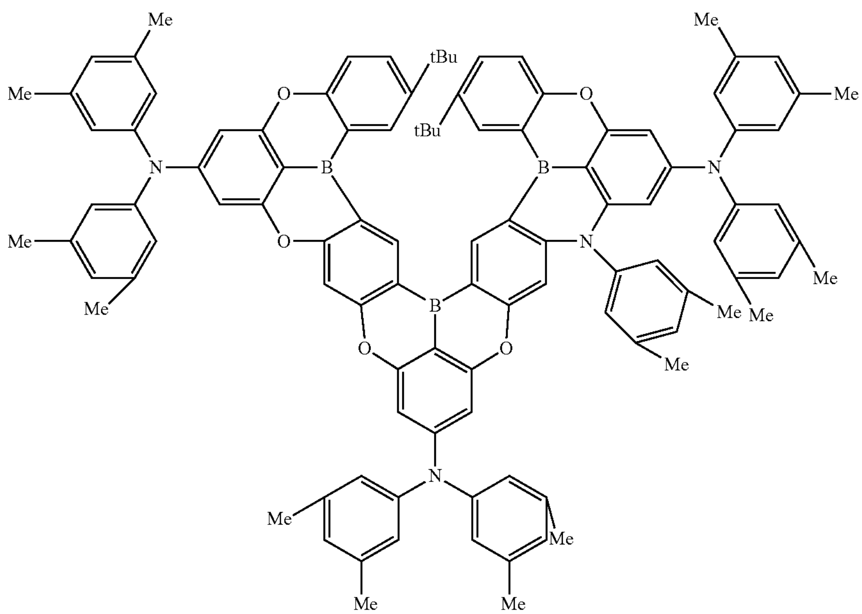
(1-14-106)
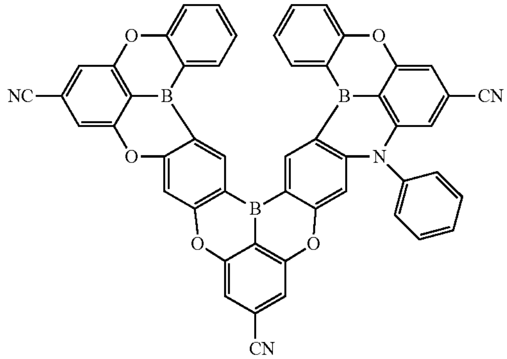
(1-14-107)
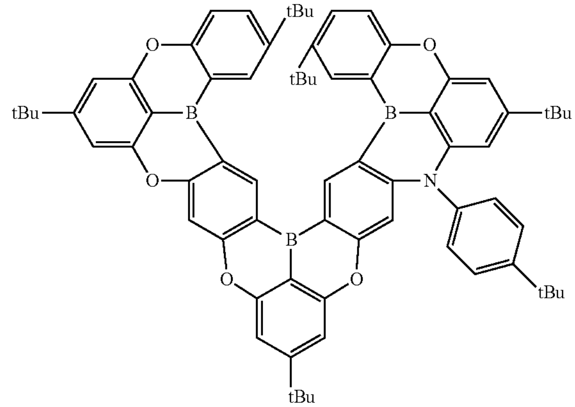

-continued
(1-14-108)
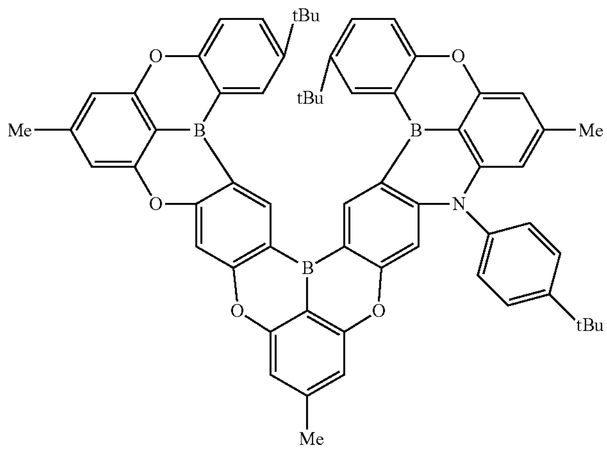
(1-14-109)
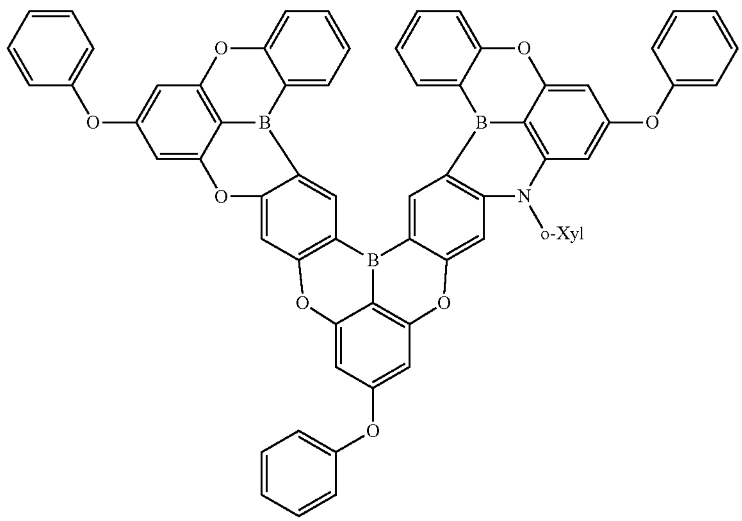
(1-14-110)
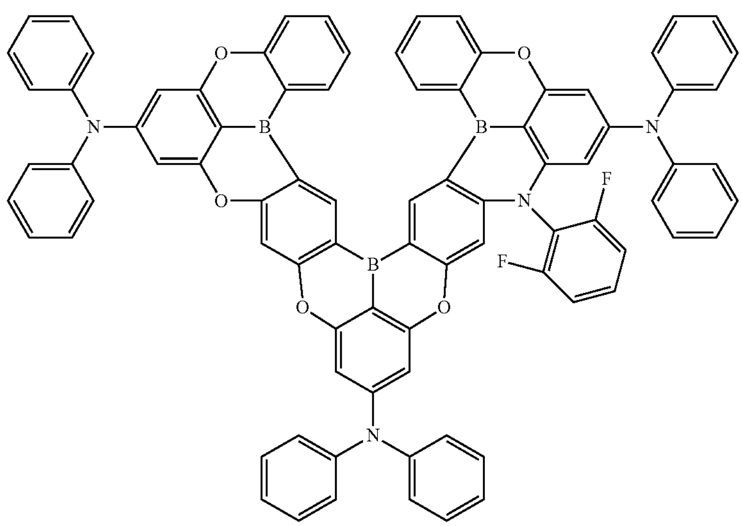

(1-14-121)
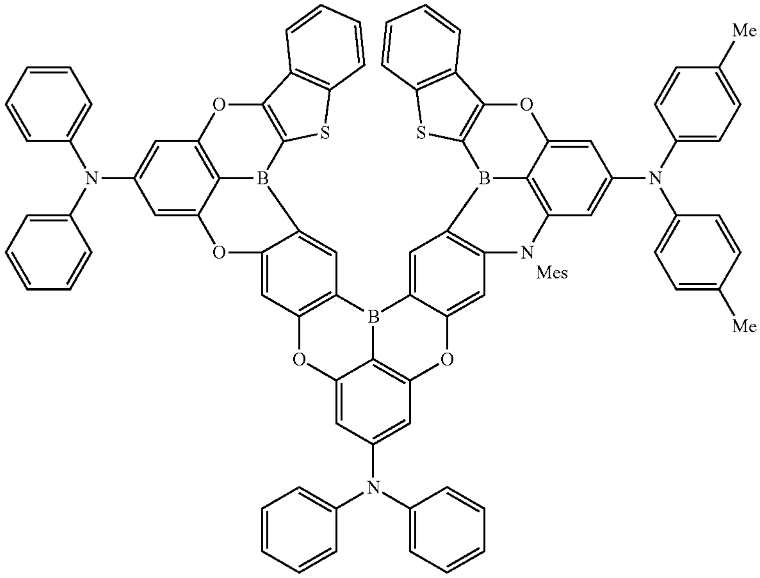
(1-14-122)
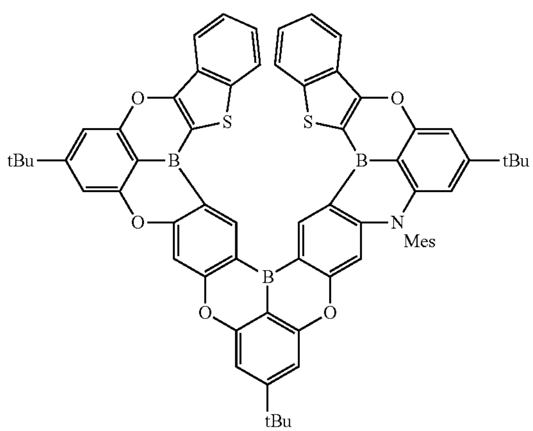
(1-14-123)
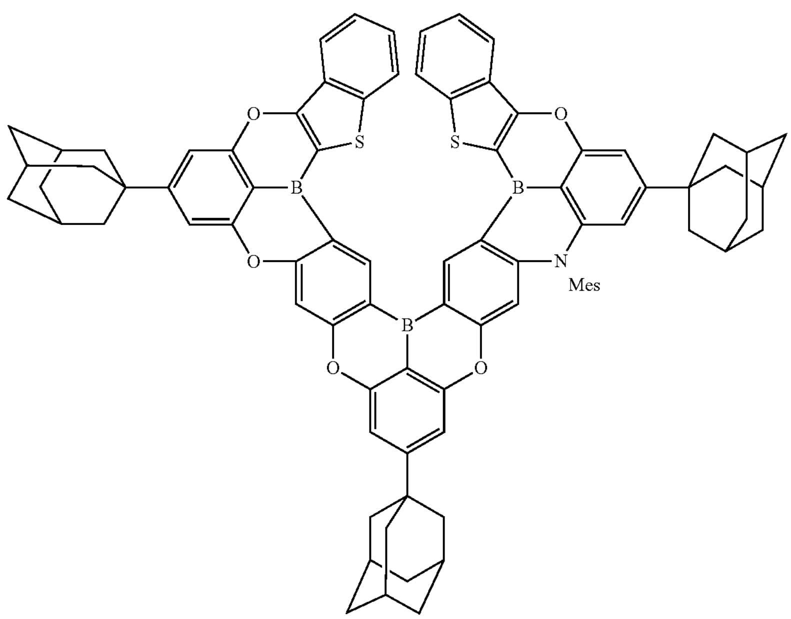

-continued
(1-14-124)
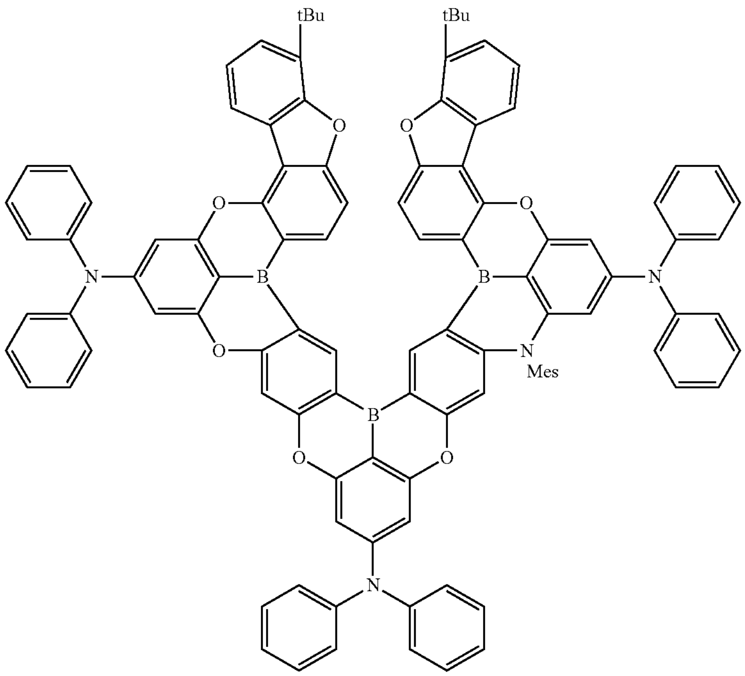
(1-14-125)
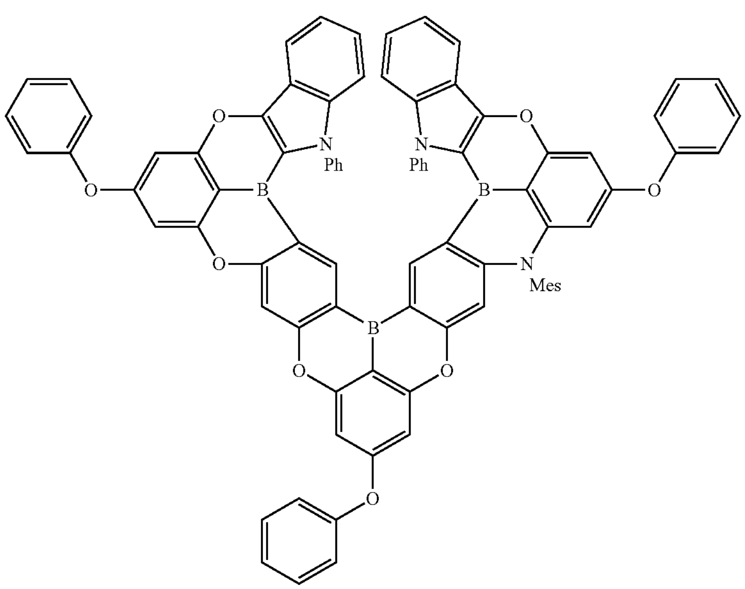

-continued
(1-14-126)
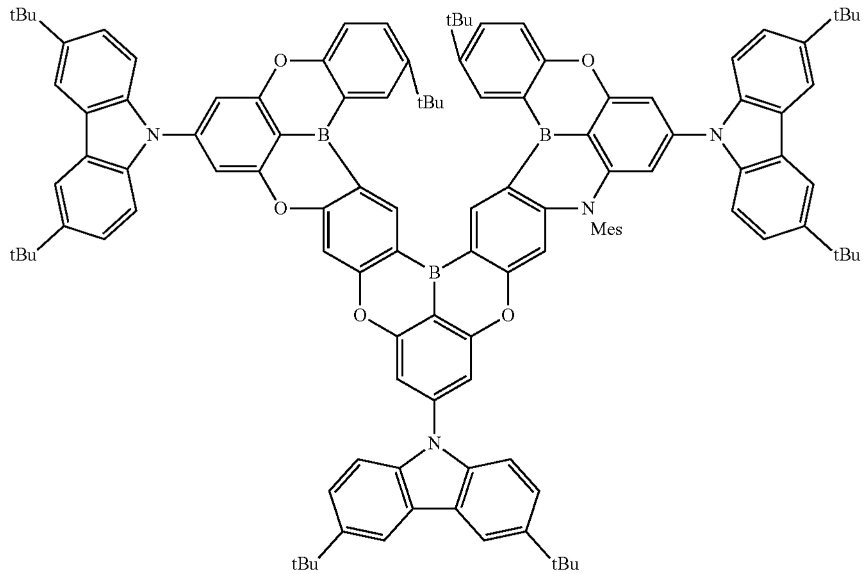
(1-14-127)
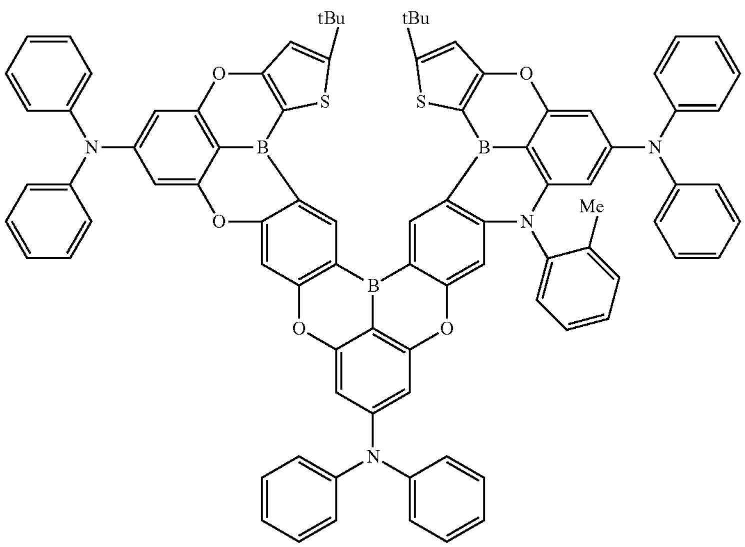
(1-14-128)
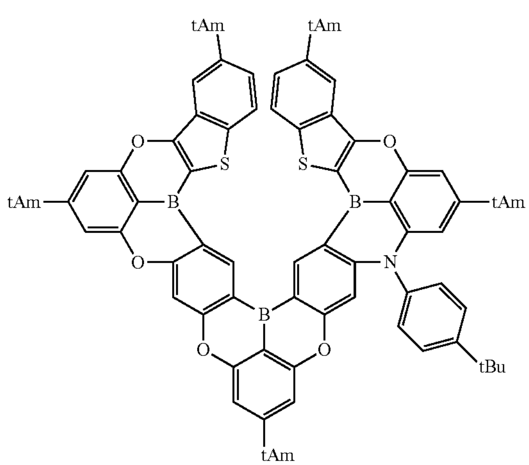

-continued
(1-14-129)
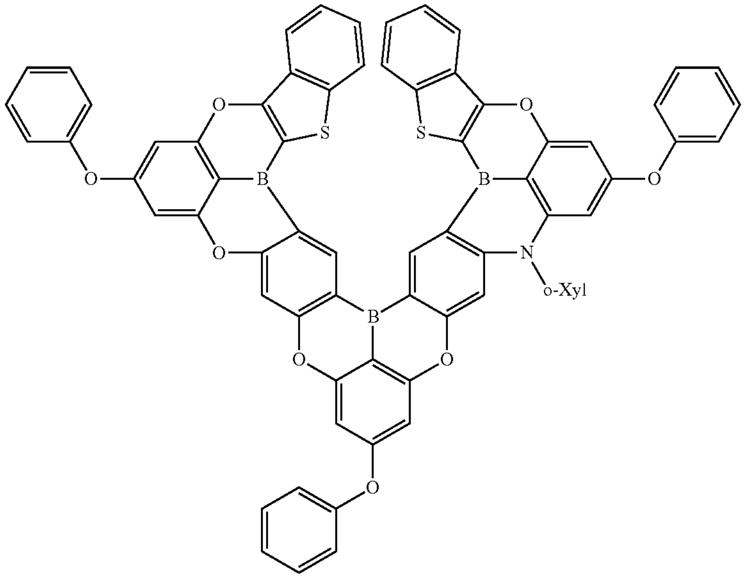
(1-14-130)
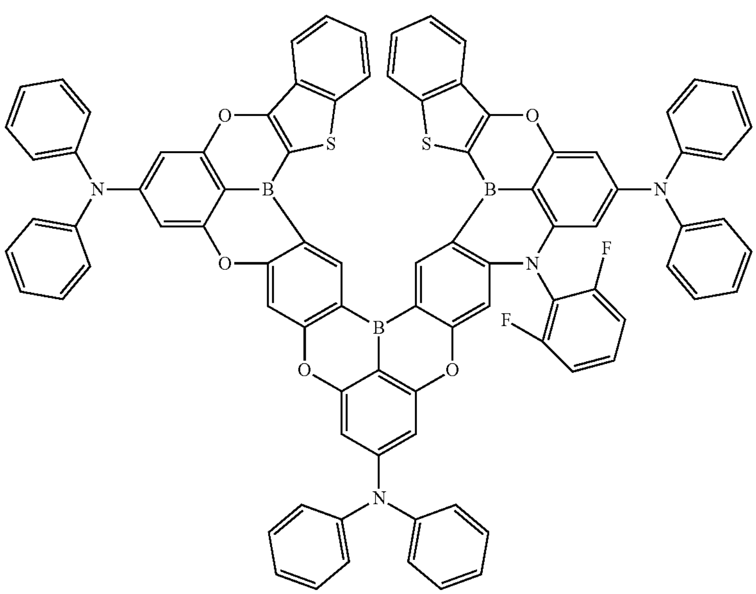

-continued
(1-14-141)
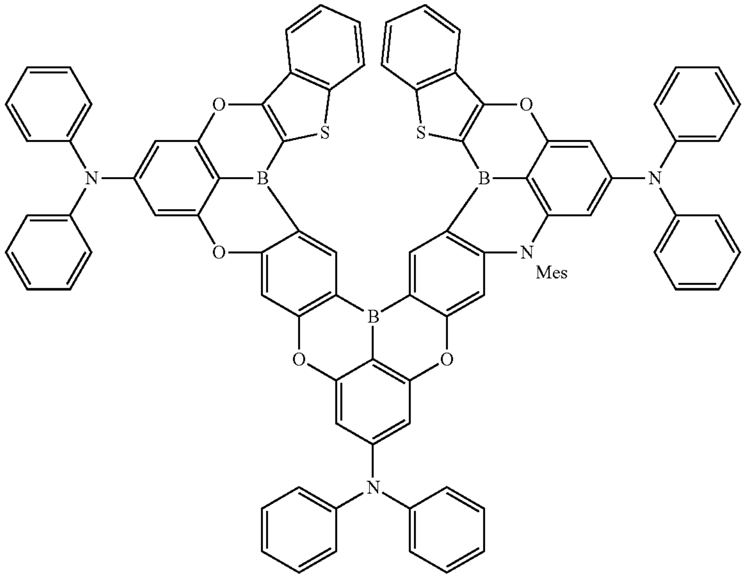
(1-14-142)
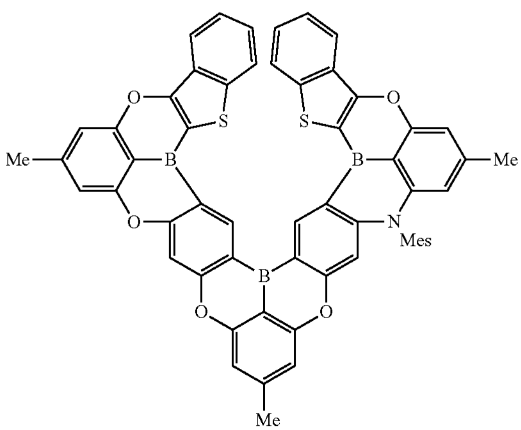
(1-14-143)
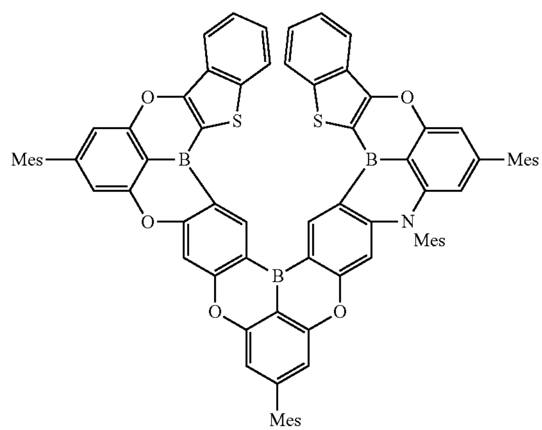
(1-14-144)
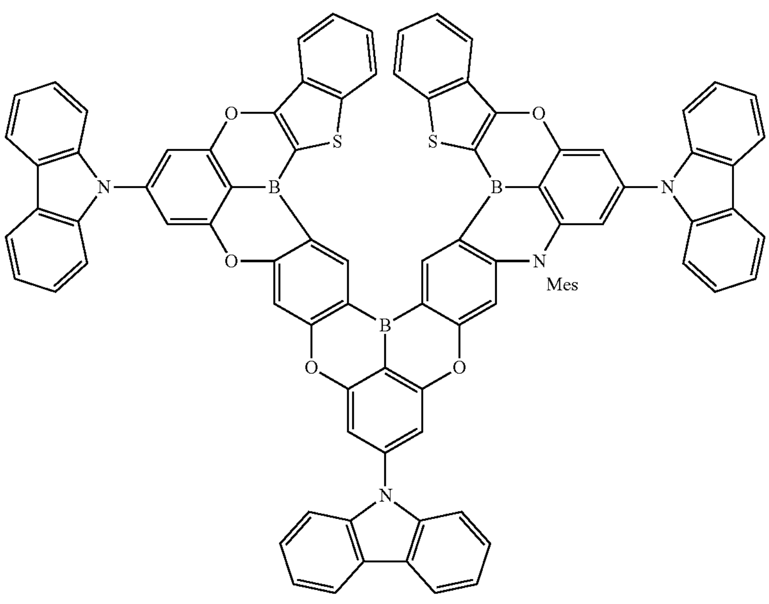

-continued
(1-14-145)
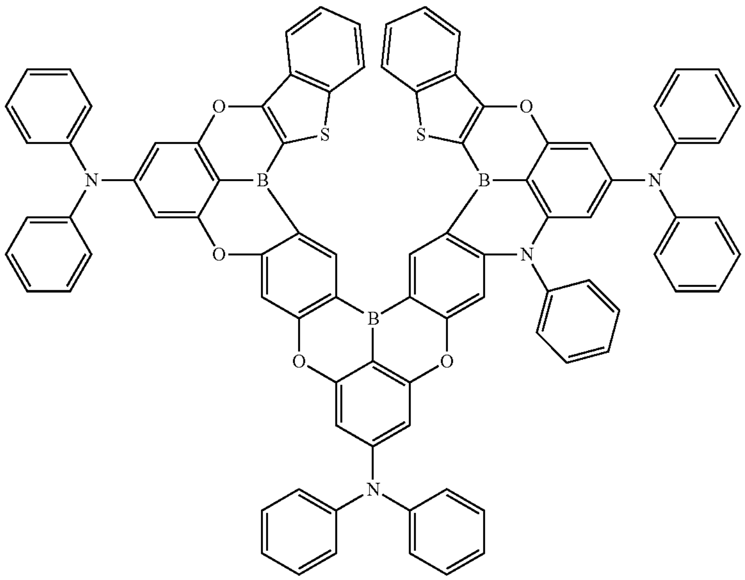
(1-14-146)
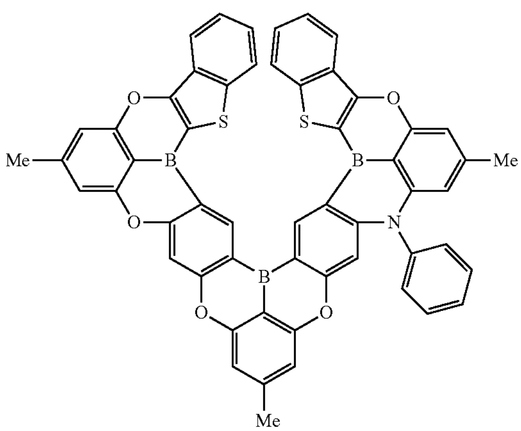
(1-14-147)
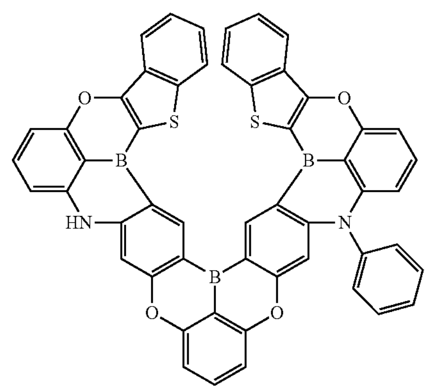
(1-14-148)
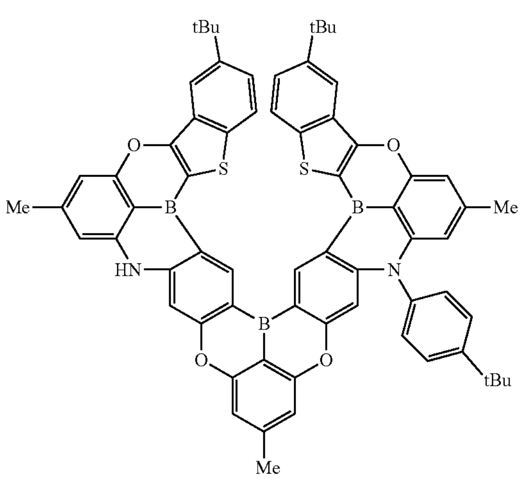

-continued
(1-14-149)
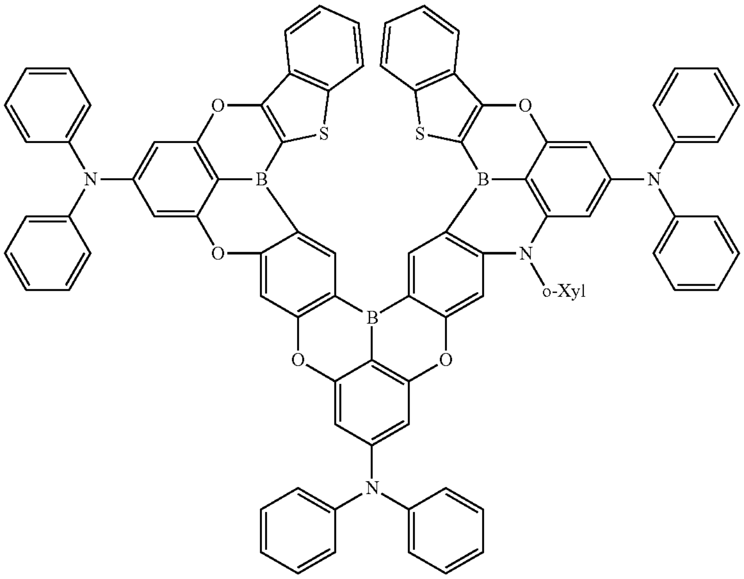
(1-14-150)
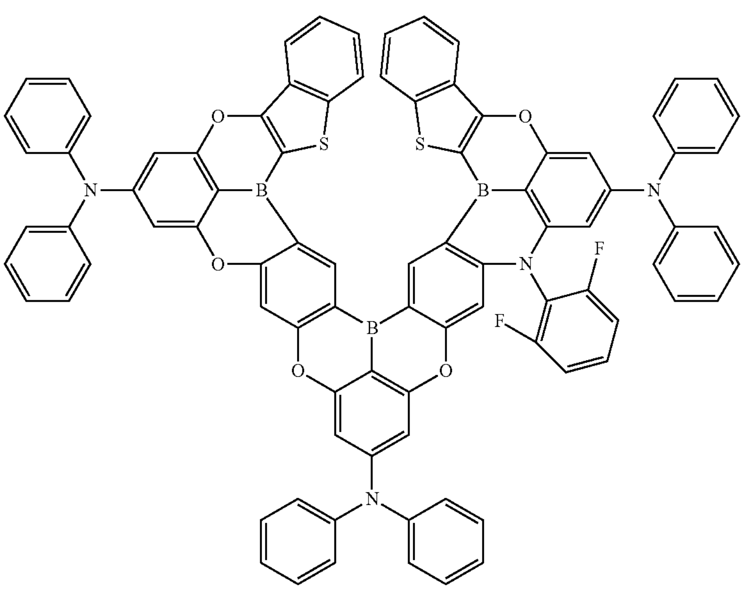

-continued
(1-14-161)
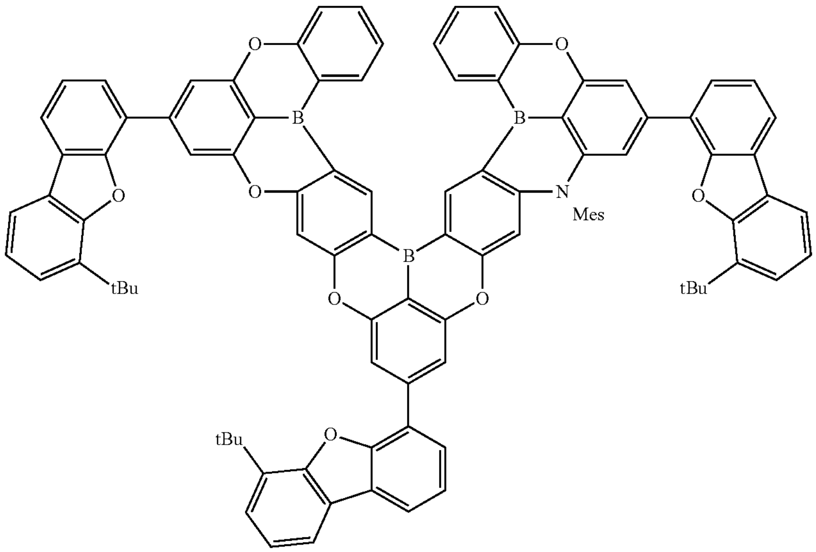
(1-14-162)
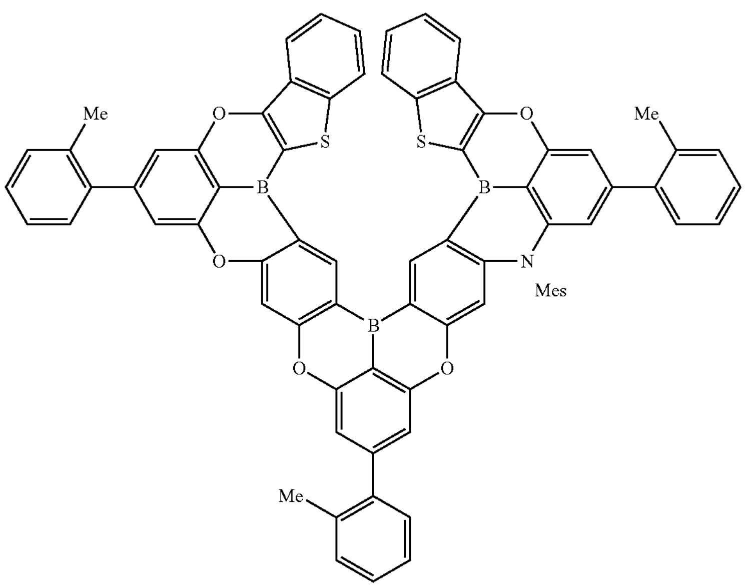
(1-14-163)
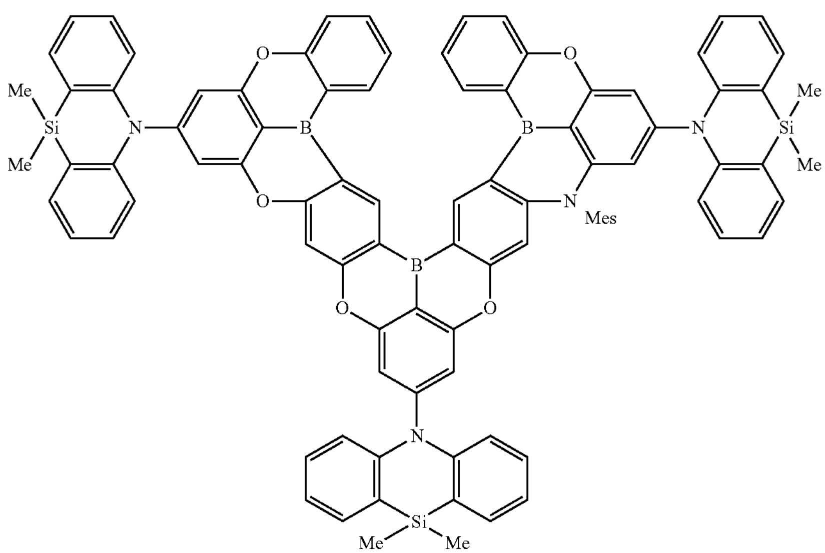

-continued
(1-14-164)
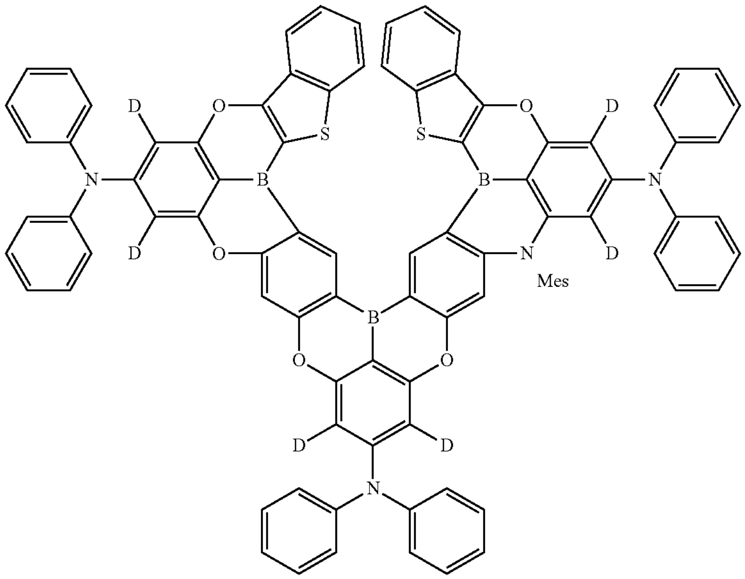
(1-14-165)
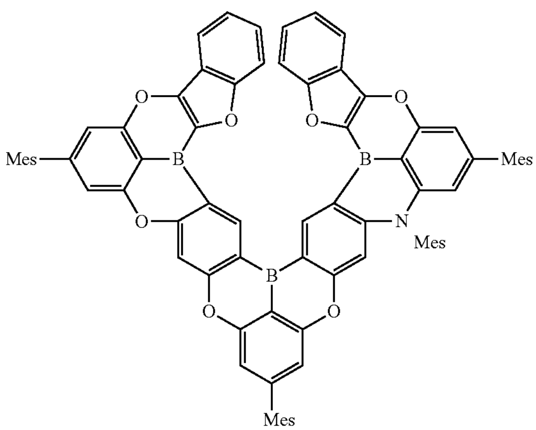
(1-14-166)
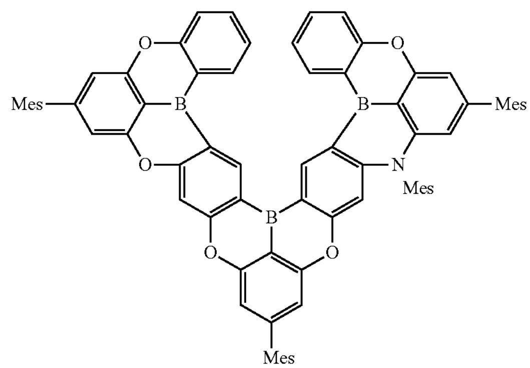
(1-14-167)
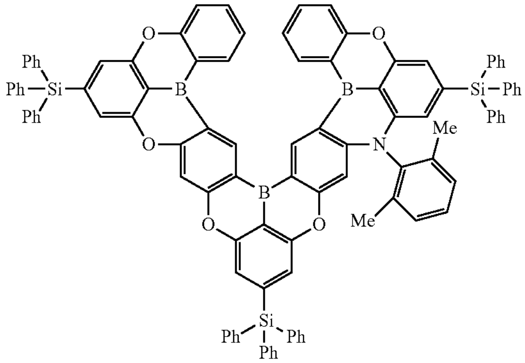

-continued
(1-14-168)
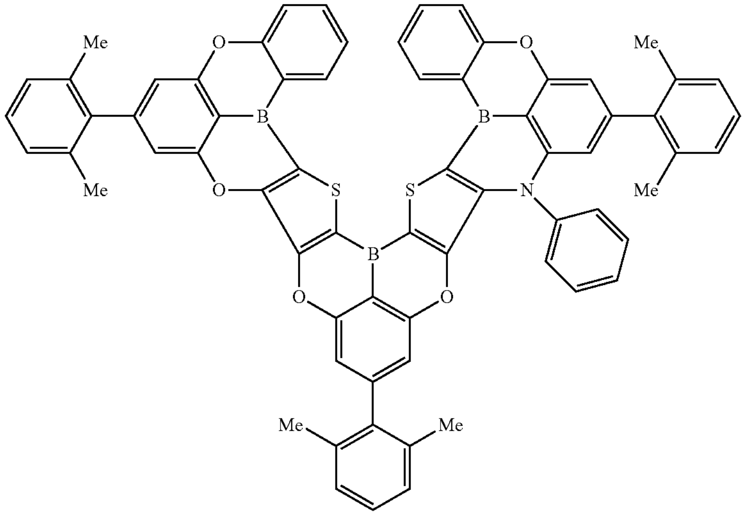
(1-14-169)
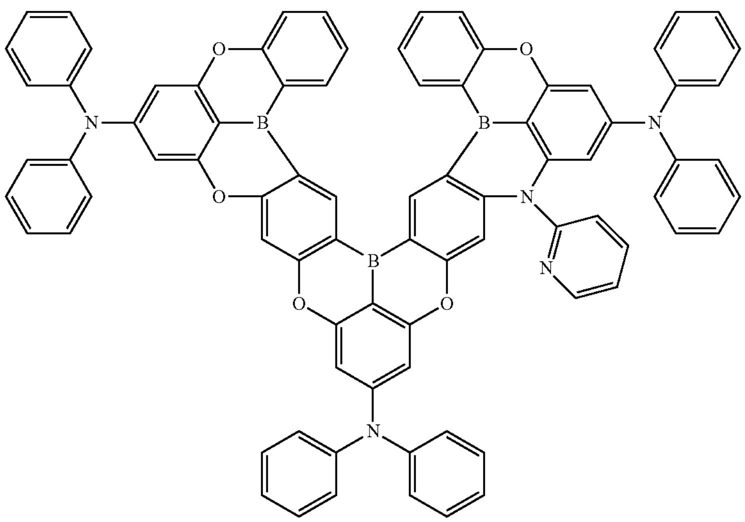
(1-14-170)
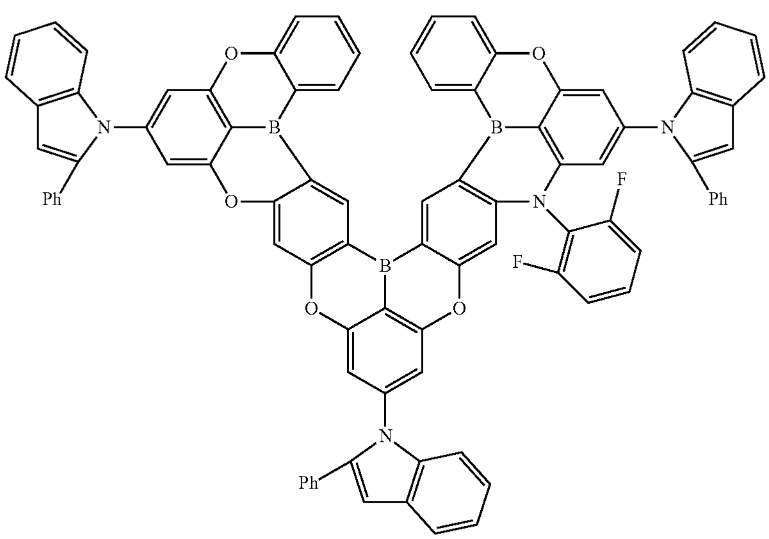

-continued
(1-14-191)
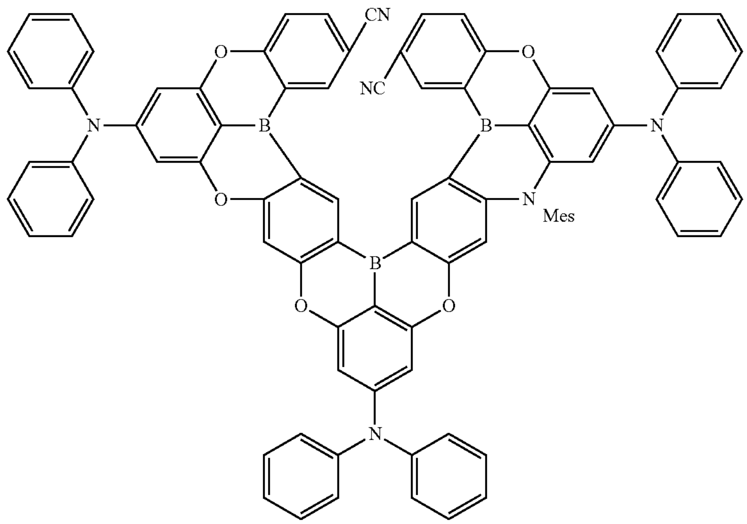
(1-14-192)
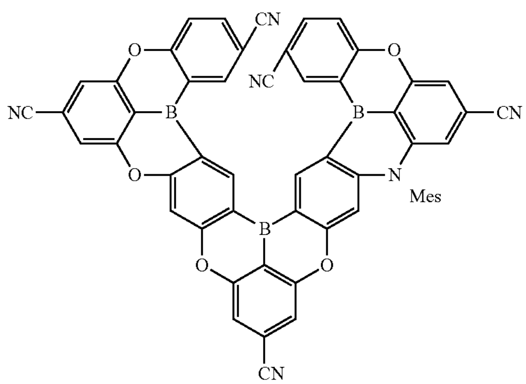
(1-14-193)
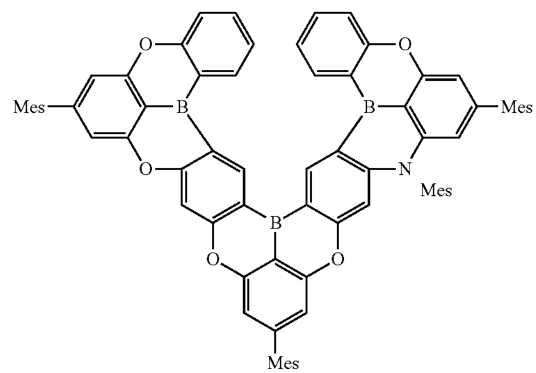
(1-14-194)
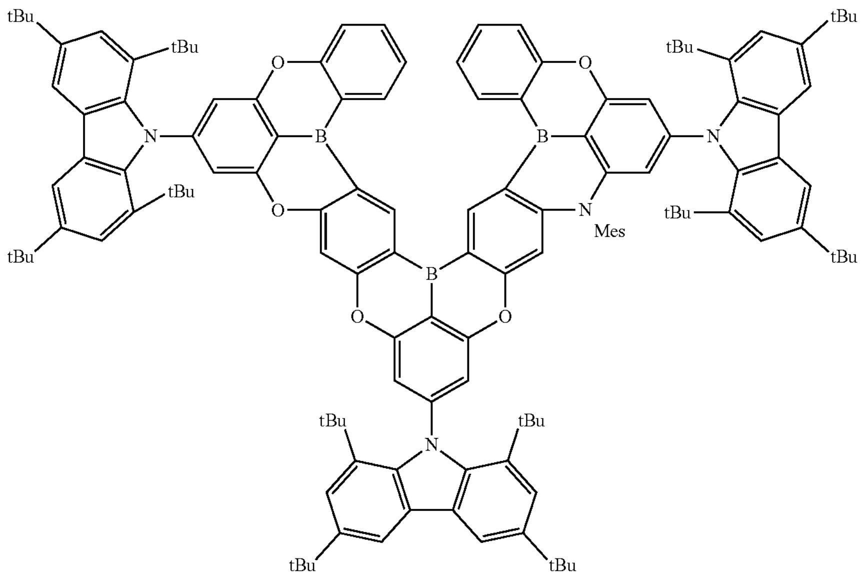

-continued
(1-14-195)
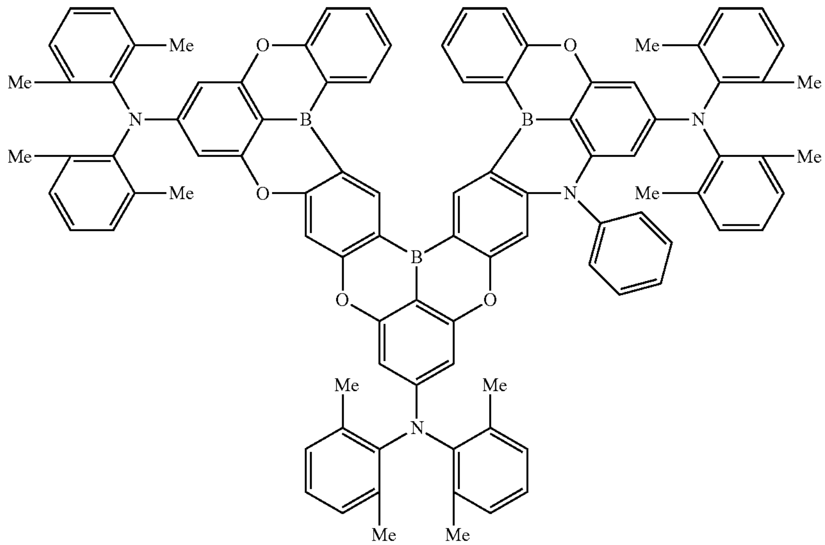
(1-14-196)
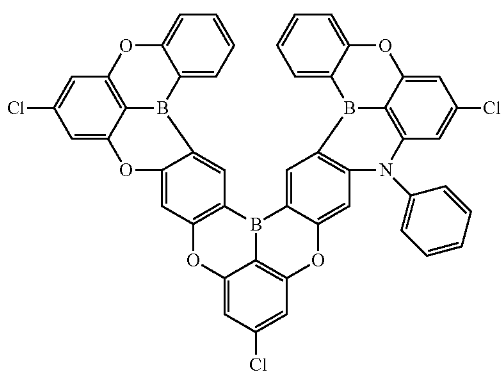
(1-14-197)
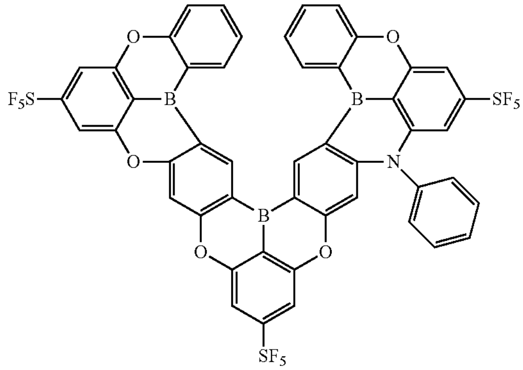
(1-14-198)
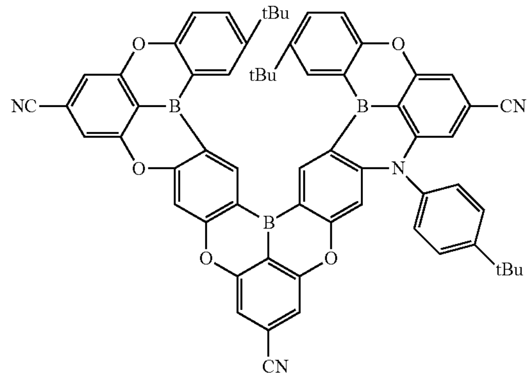

-continued
(1-14-199)
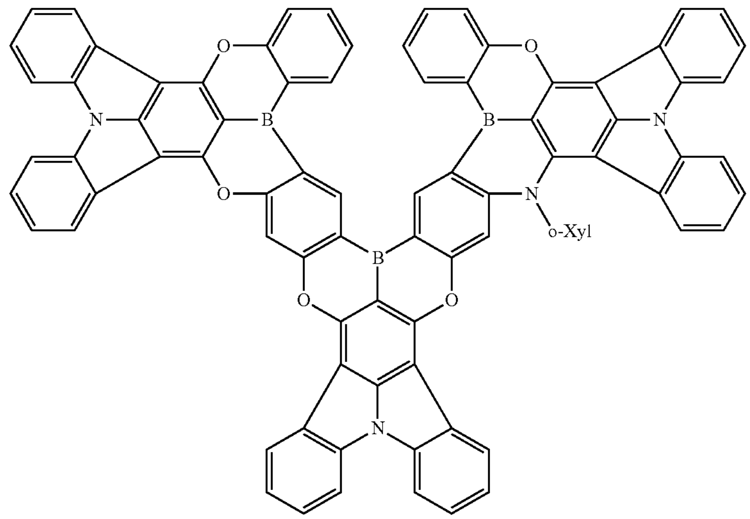
(1-14-200)
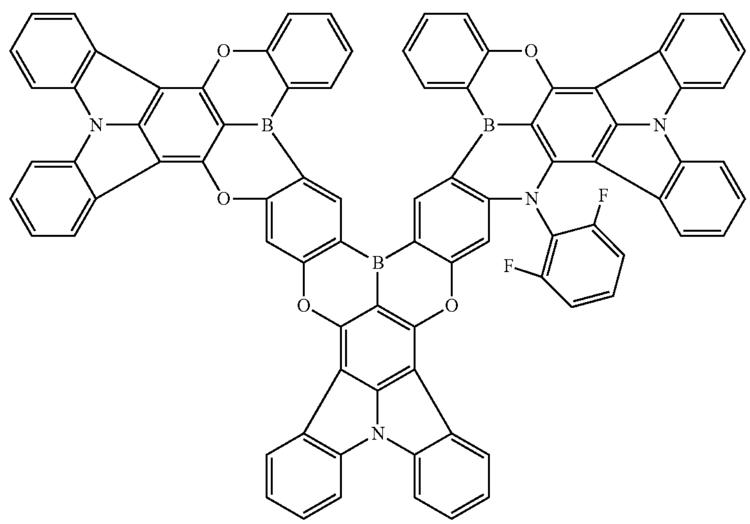
(1-14-221)
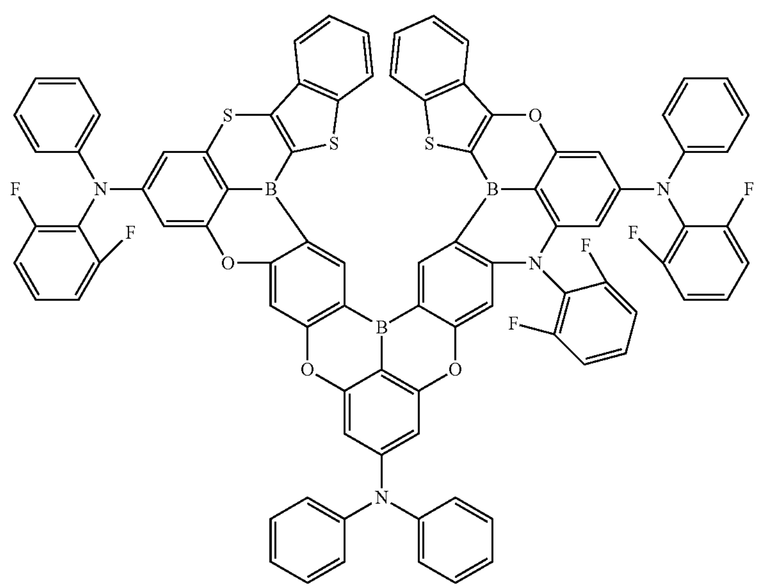

-continued
(1-14-222)
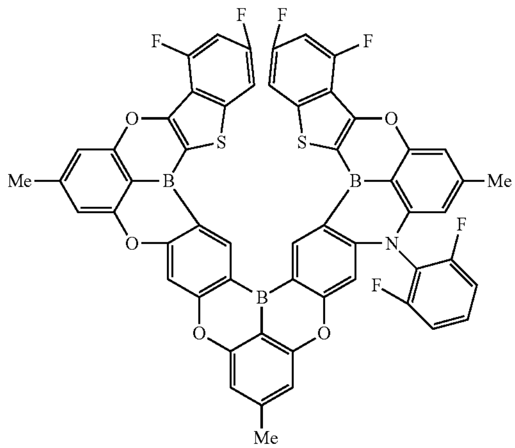
(1-14-223)
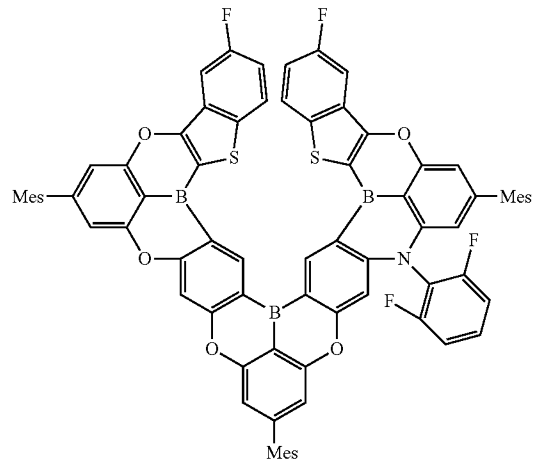
(1-14-224)
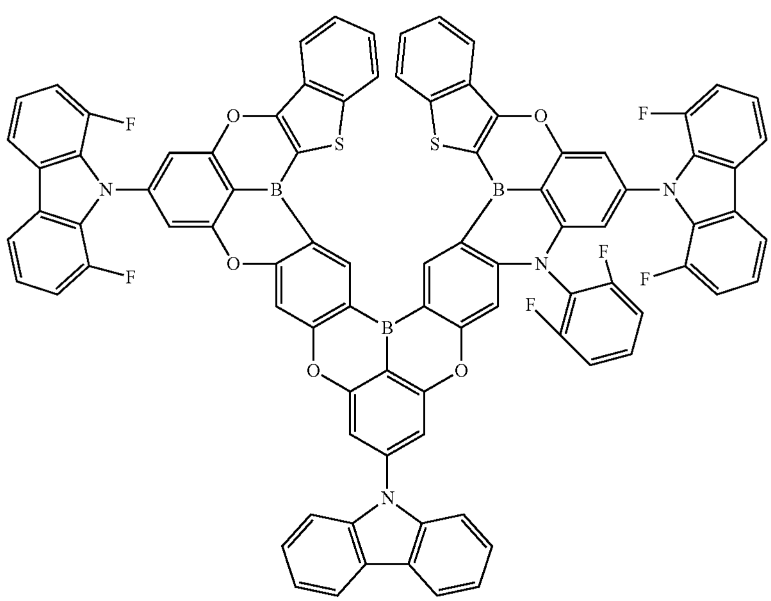

-continued
(1-14-225)
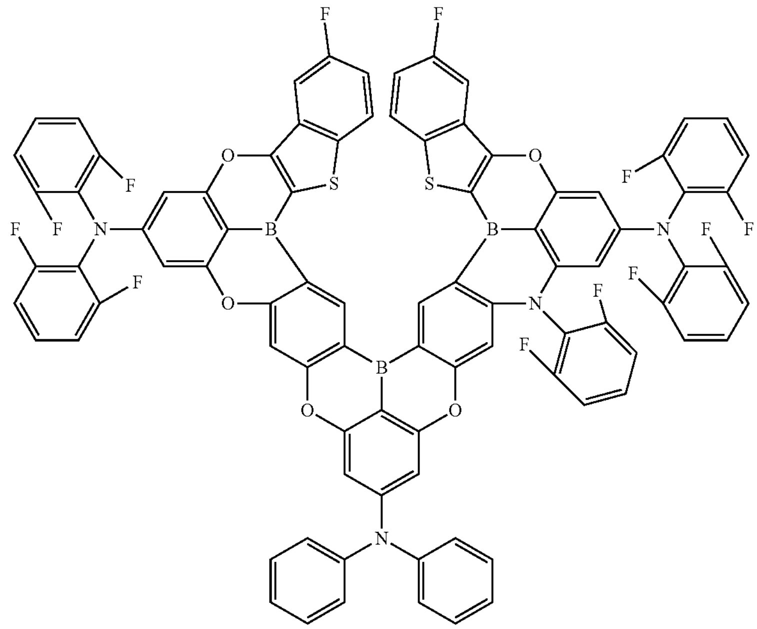
(1-14-226)
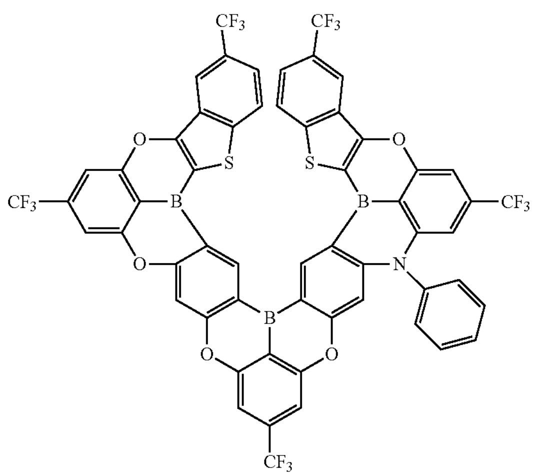
(1-14-227)
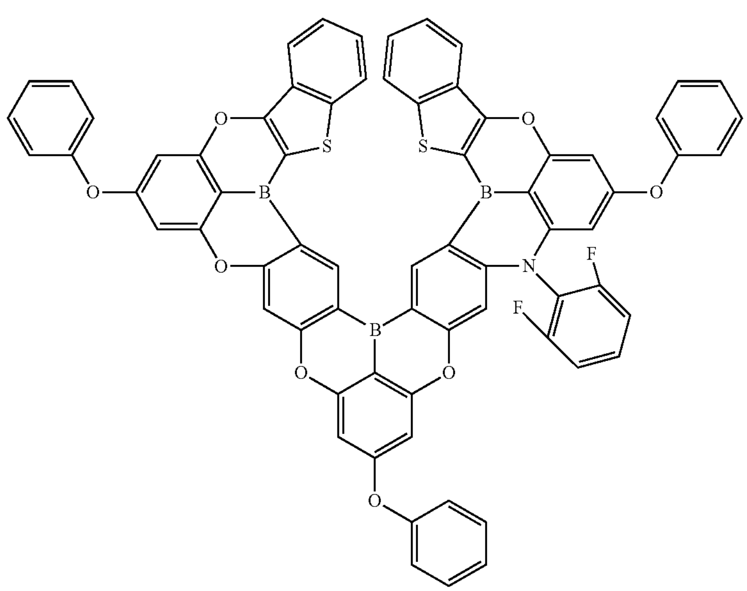

-continued
(1-14-228)
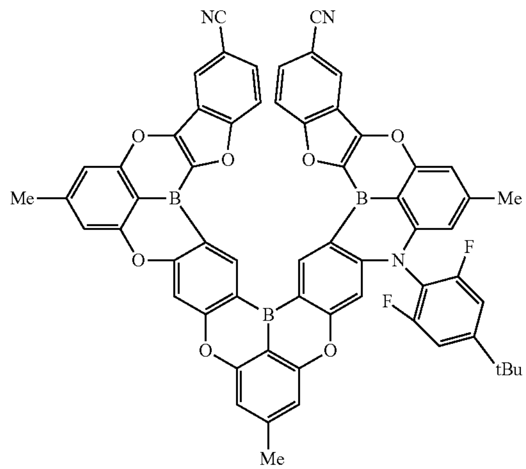
(1-14-229)
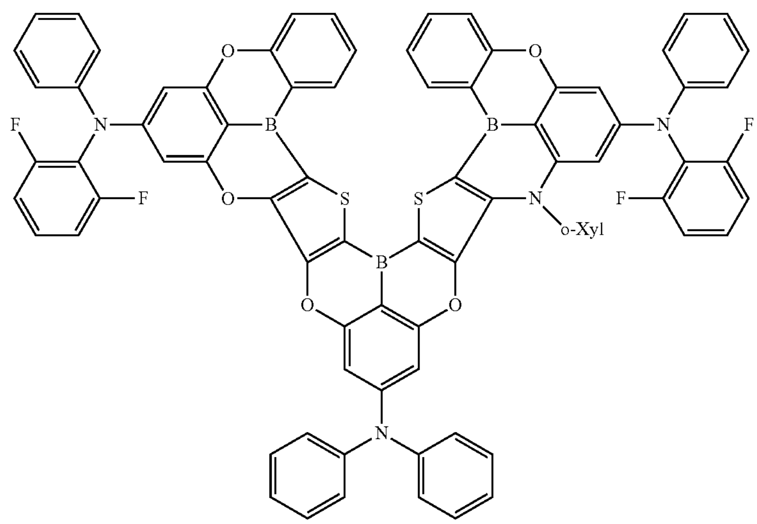
(1-14-230)
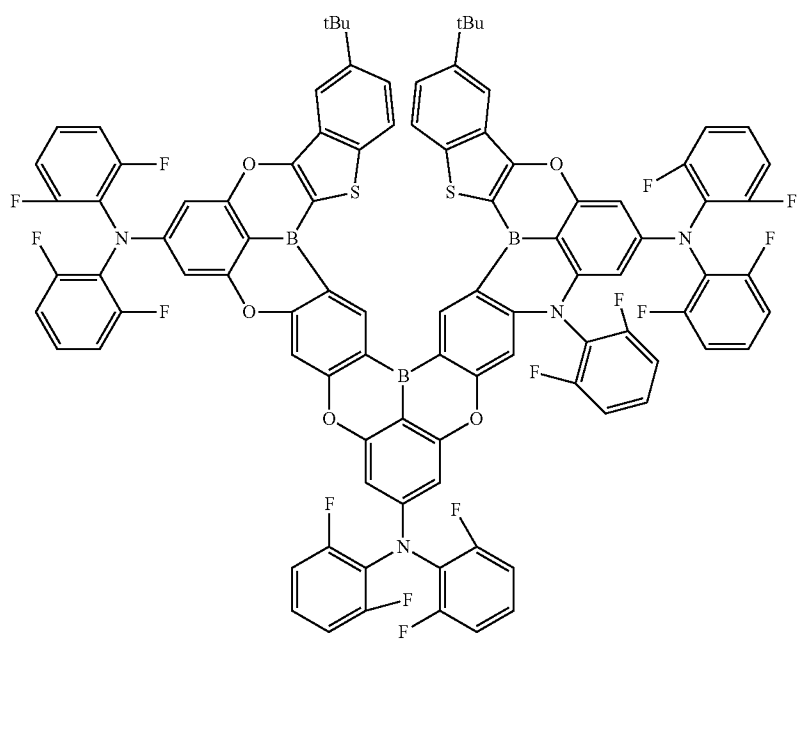

-continued
(1-15-1)
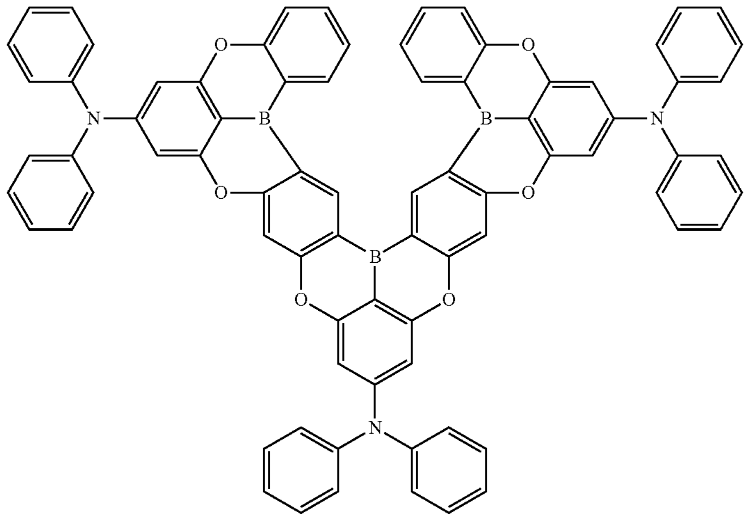
(1-15-2)
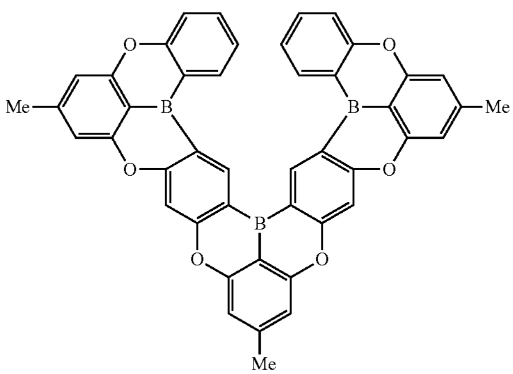
(1-15-3)
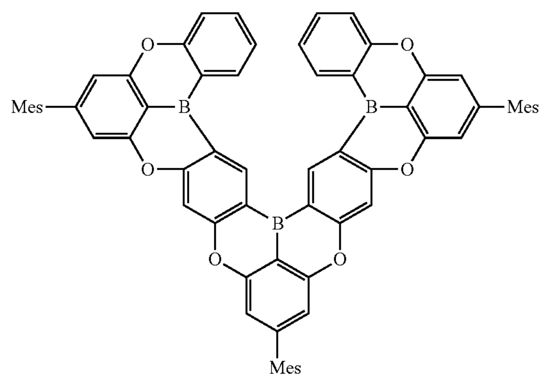
(1-15-4)
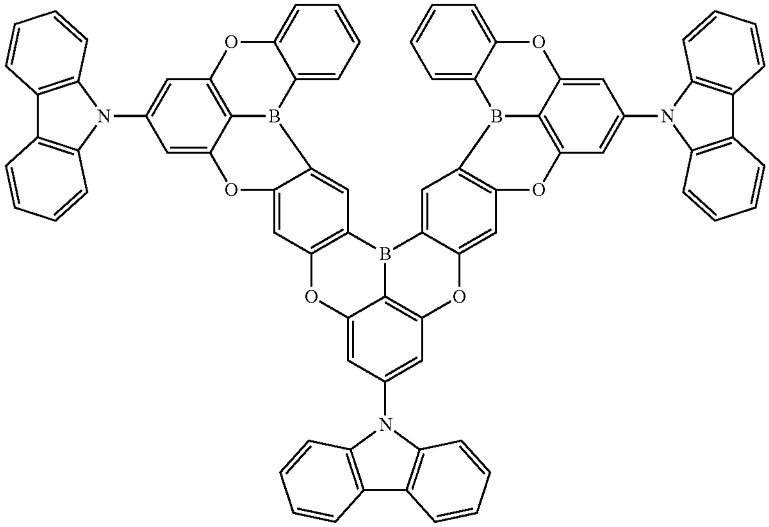

-continued
(1-15-5)
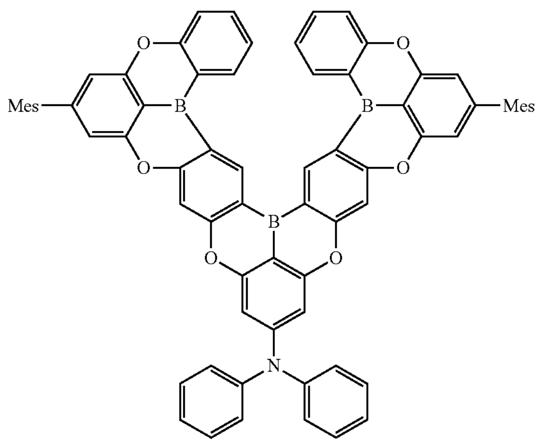
(1-15-6)
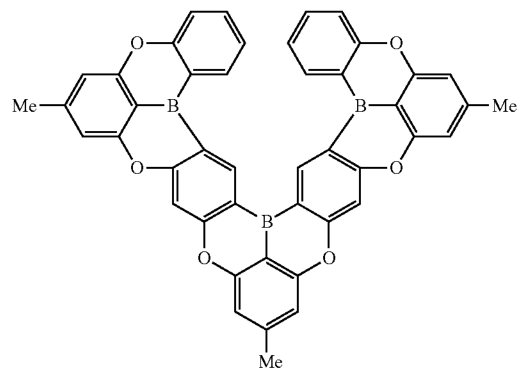
(1-15-7)
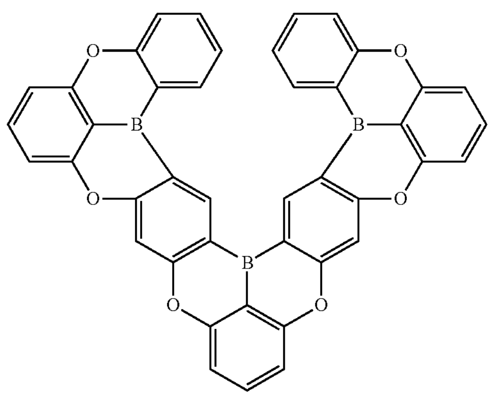
(1-15-8)
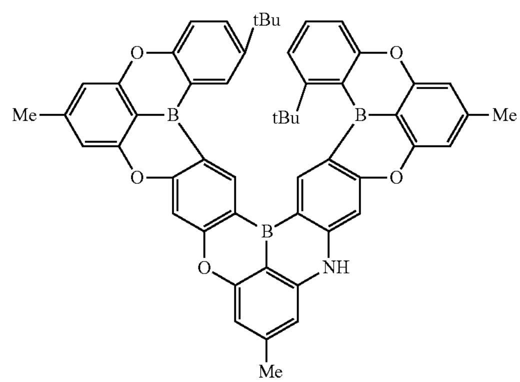
(1-15-9)
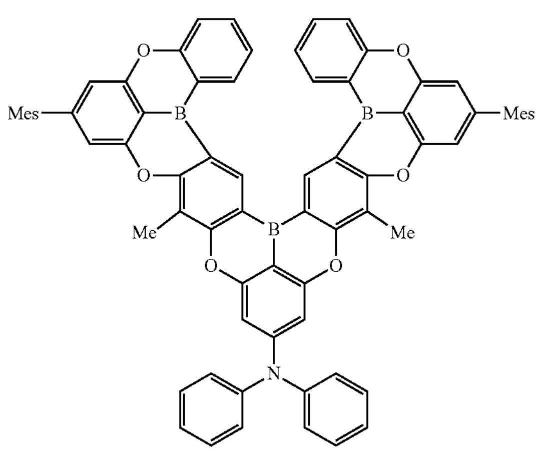
(1-15-10)
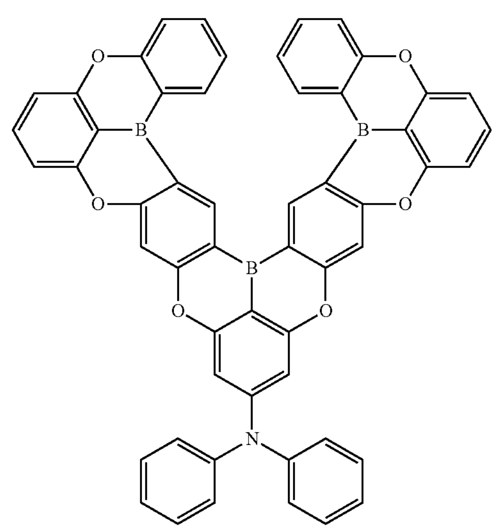

-continued
(1-15-21)
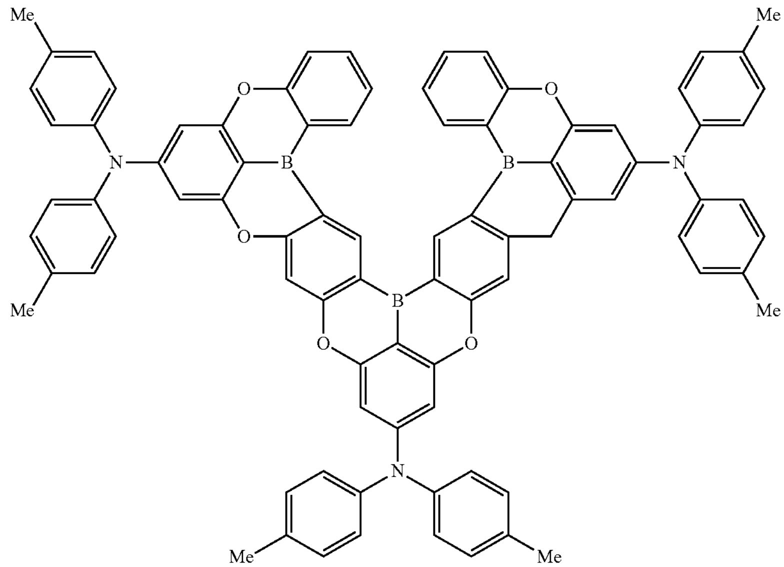
(1-15-22)
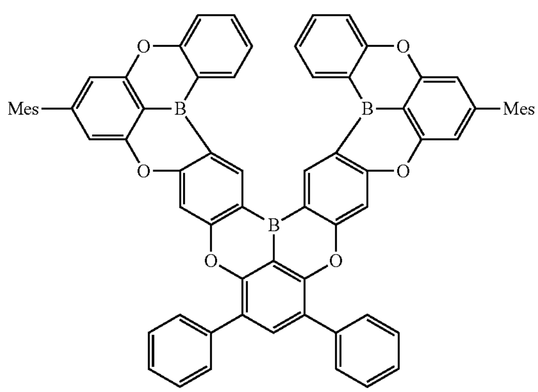
(1-15-23)
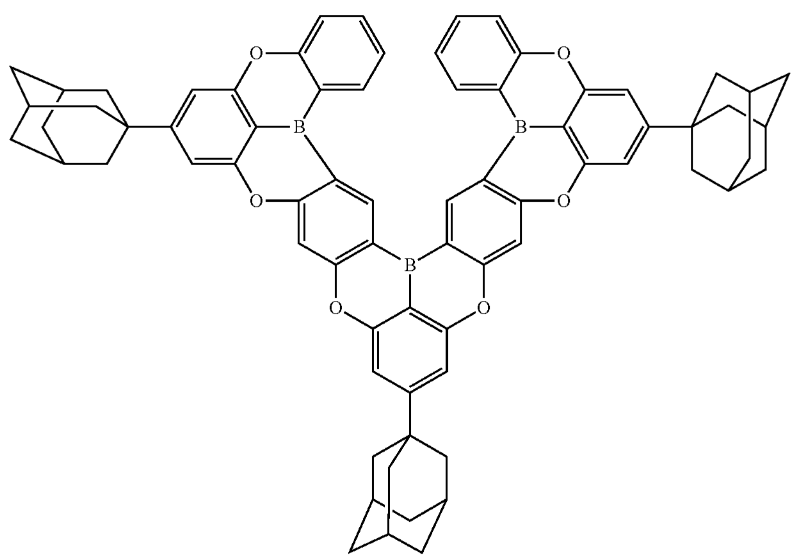

-continued
(1-15-24)
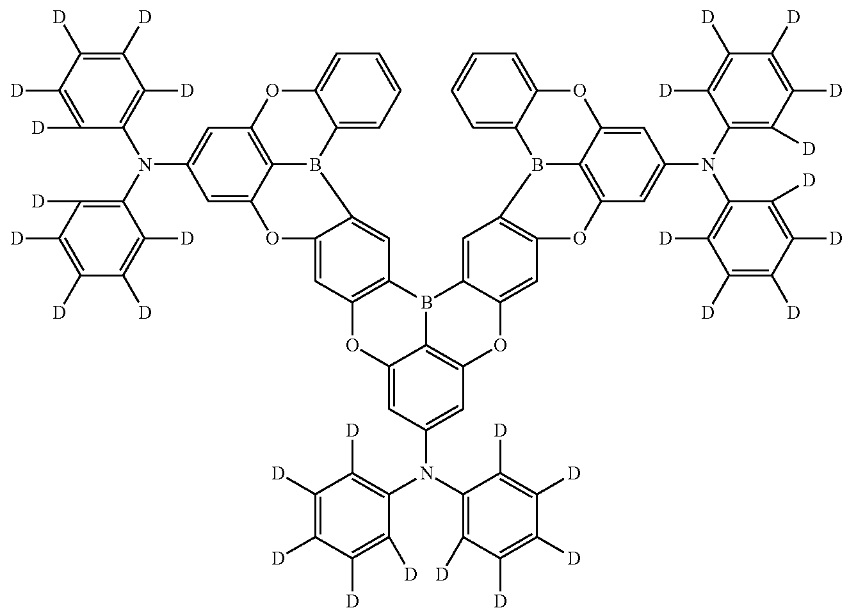
(1-15-25)
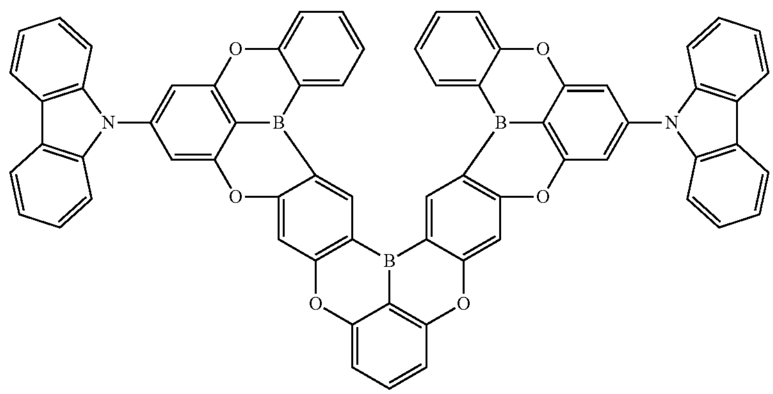
(1-15-26)
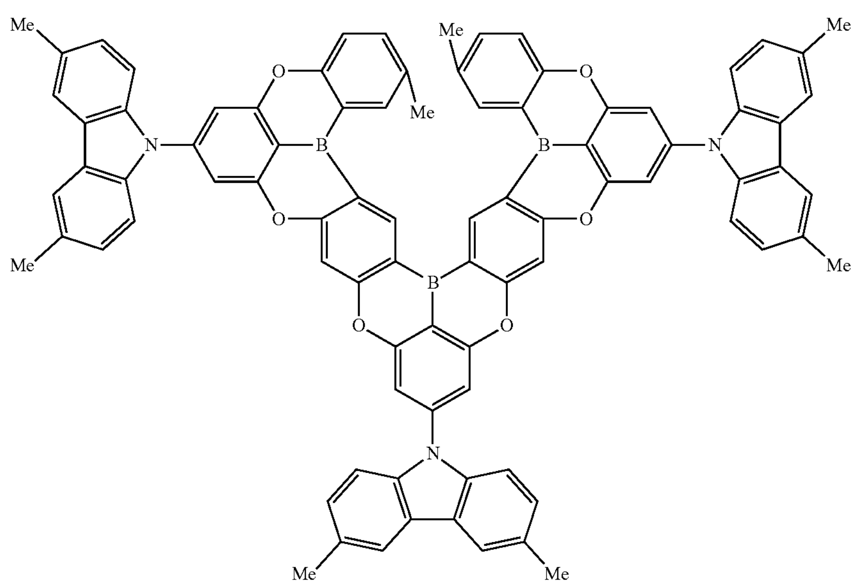

-continued
(1-15-27)
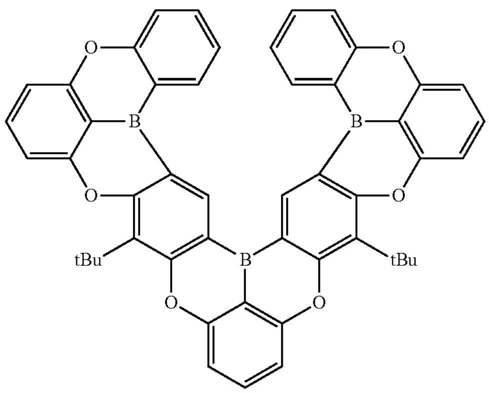
(1-15-28)
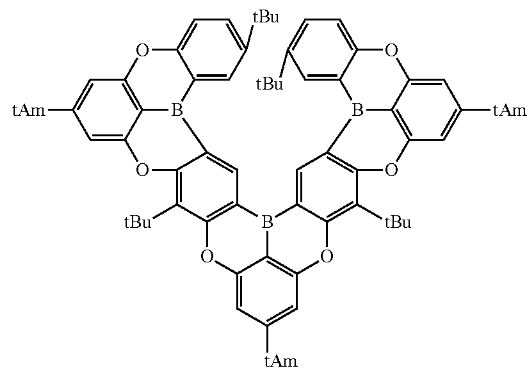
(1-15-29)
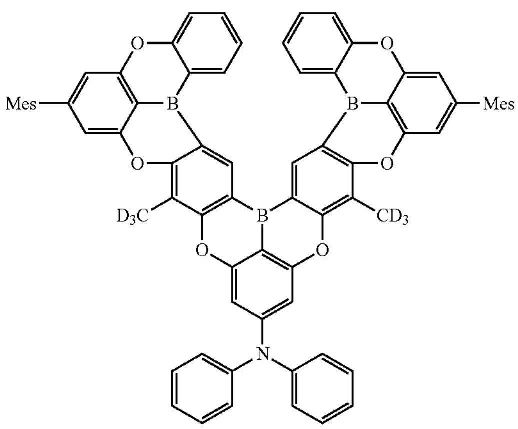
(1-15-30)
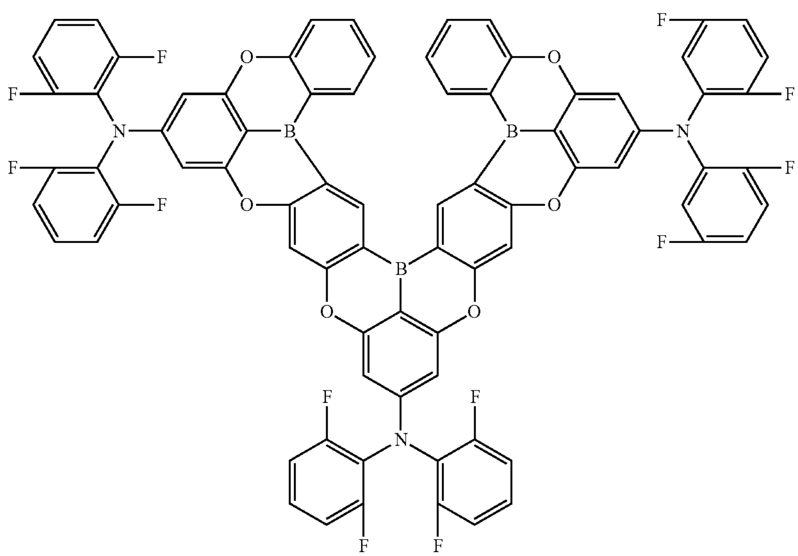

-continued
(1-15-41)
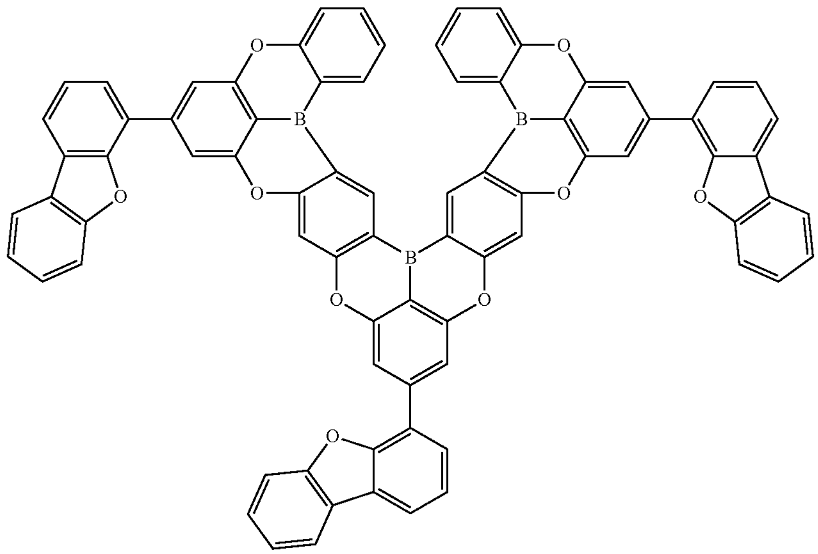
(1-15-42)
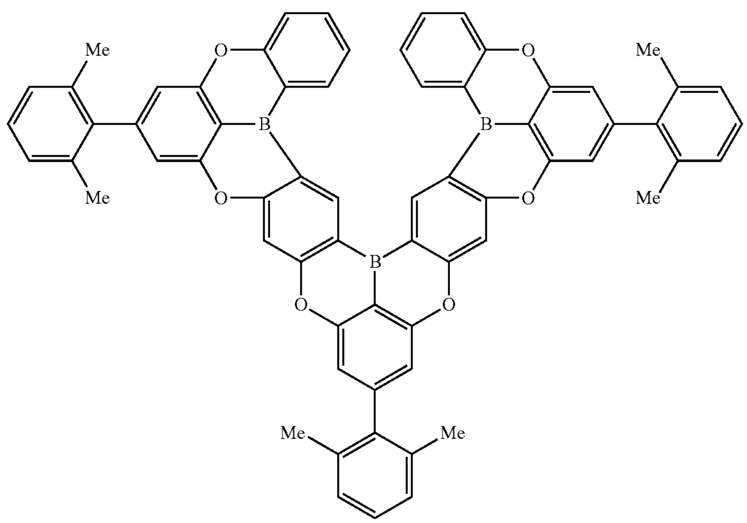
(1-15-43)
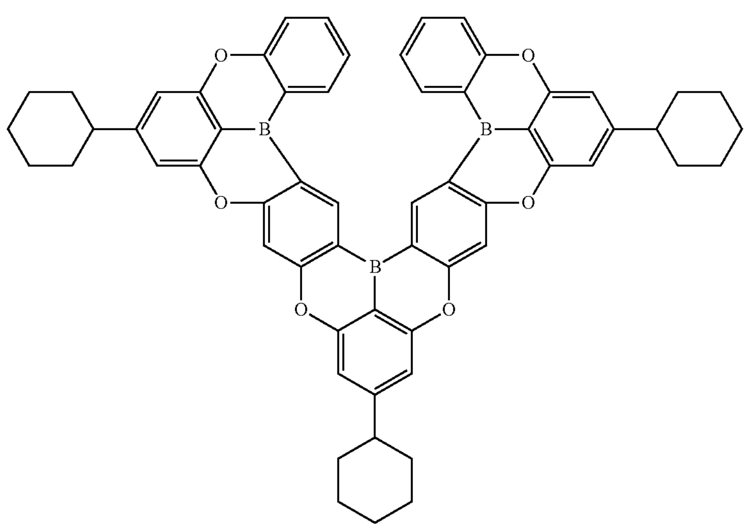

-continued
(1-15-44)
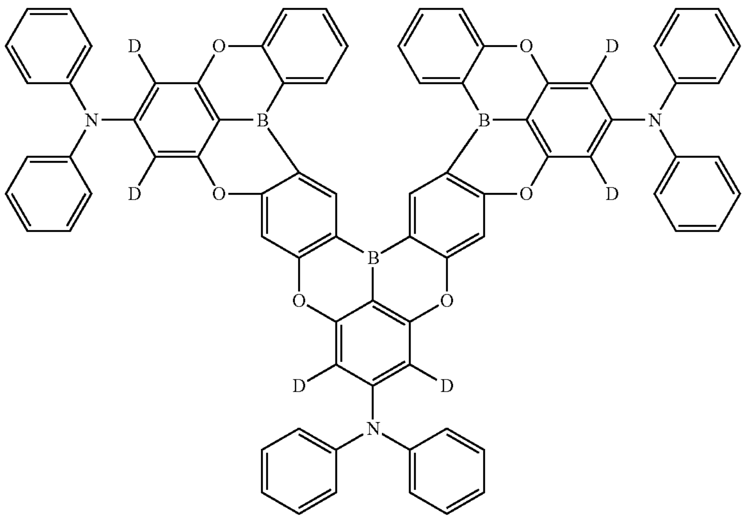
(1-15-45)
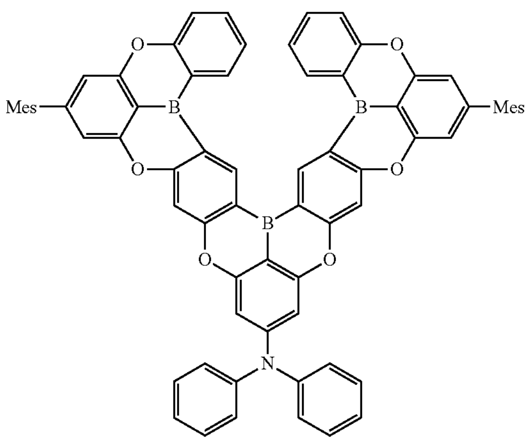
(1-15-46)
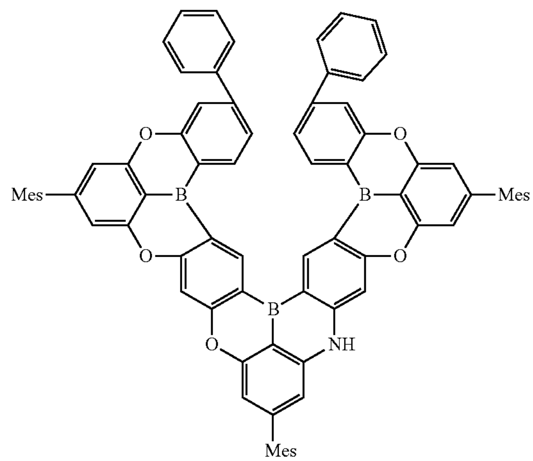
(1-15-47)
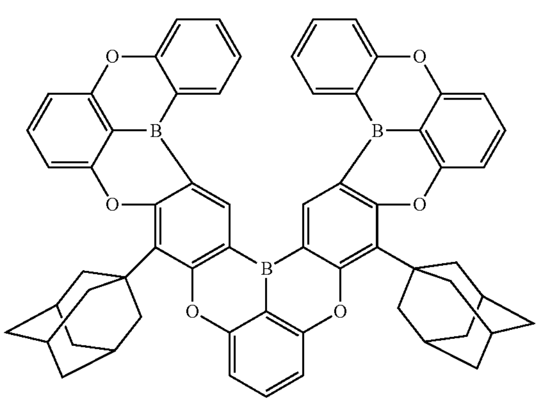

-continued
(1-15-48)
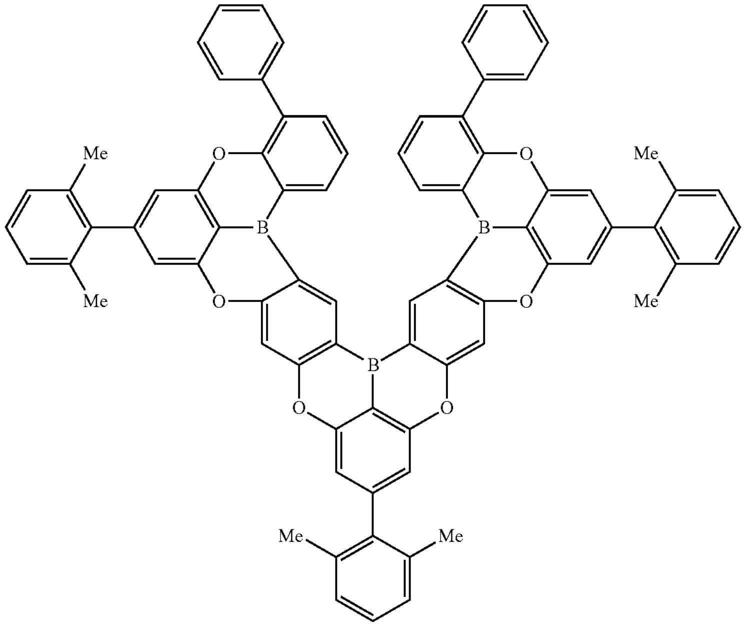
(1-15-49)
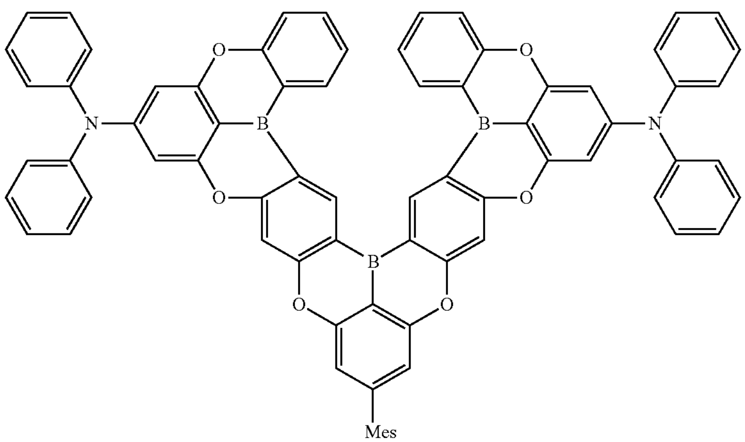
(1-15-50)
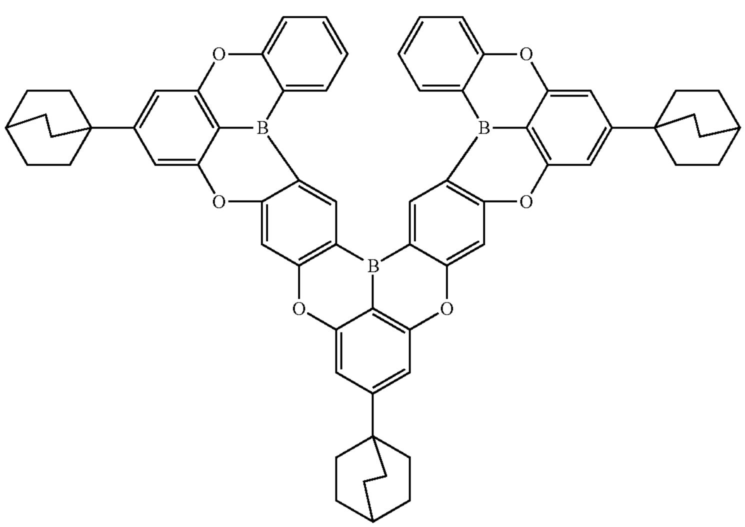

-continued
(1-15-101)
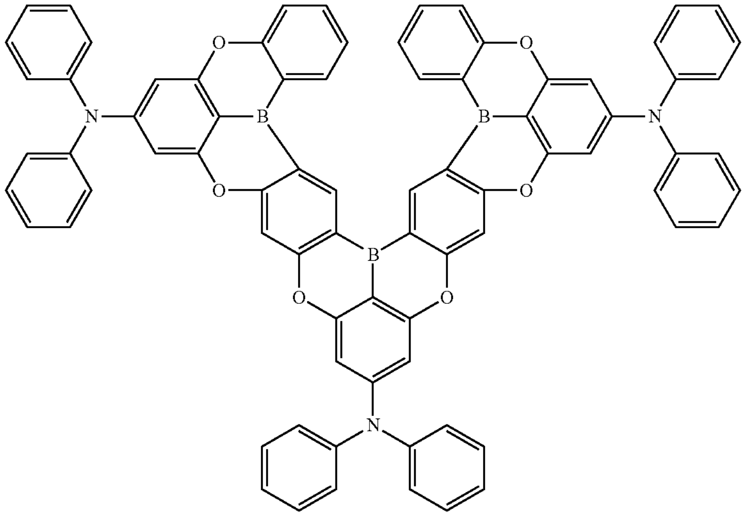
(1-15-102)
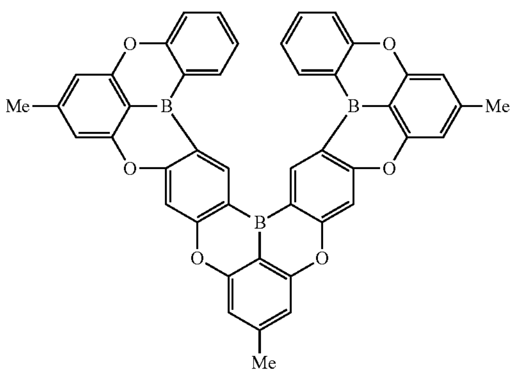
(1-15-103)
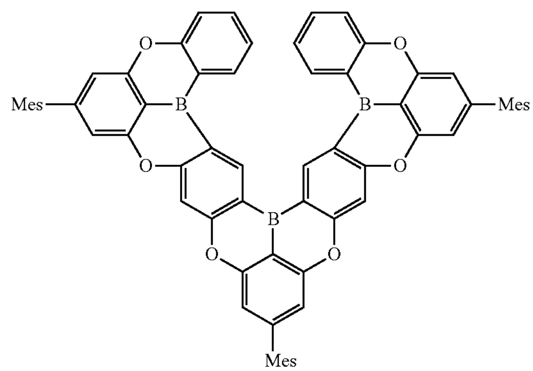
(1-15-104)
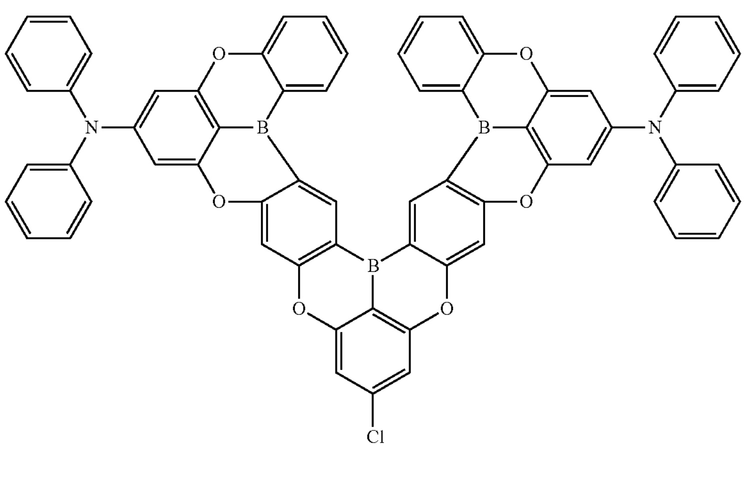

-continued
(1-15-105)
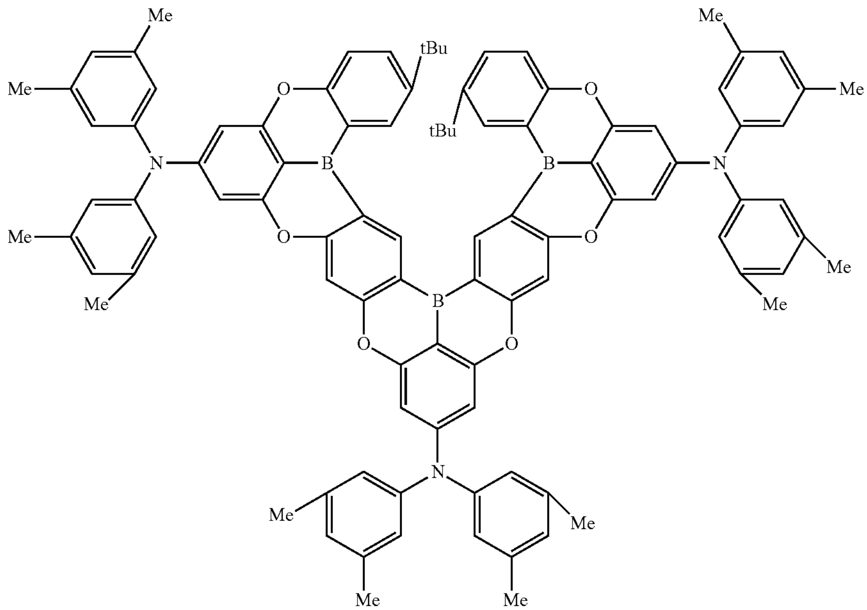
(1-15-106)
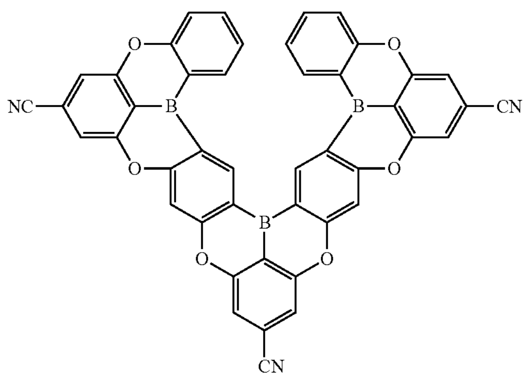
(1-15-107)
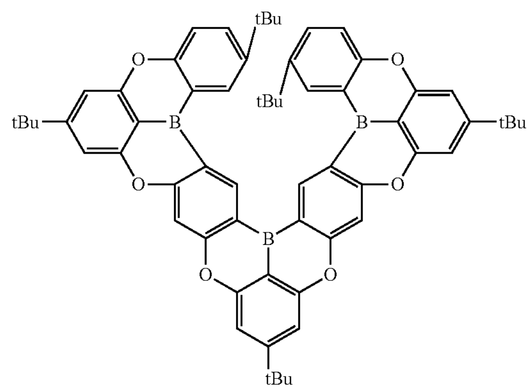
(1-15-108)
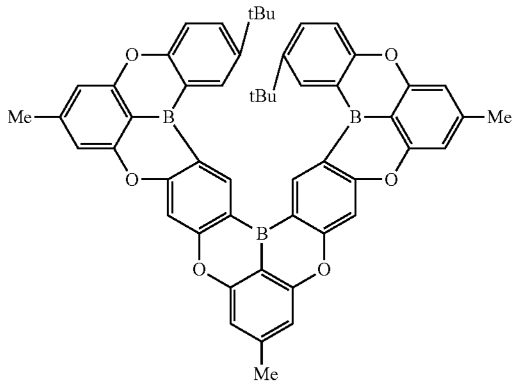

-continued
(1-15-109)
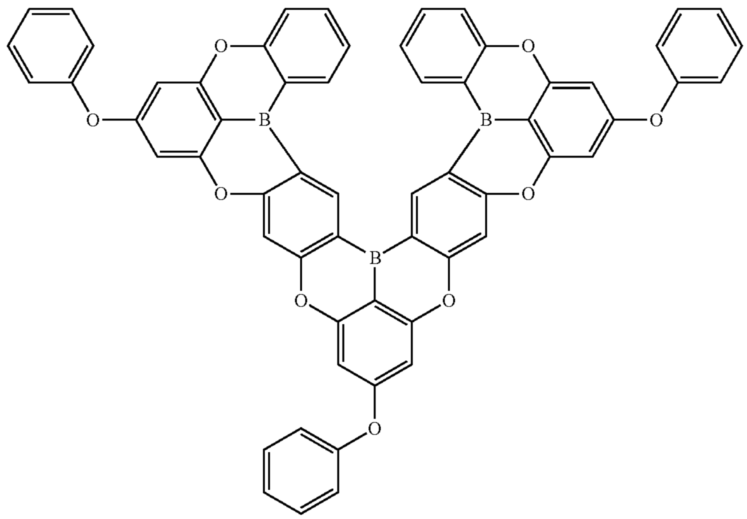
(1-15-110)
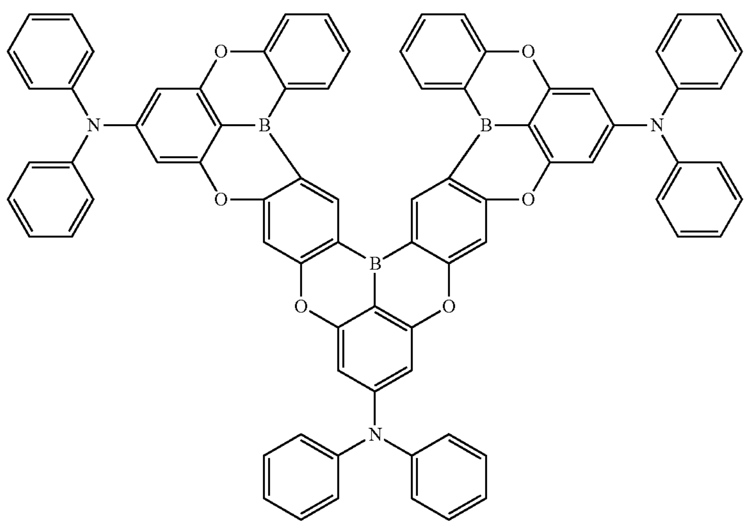
(1-15-121)
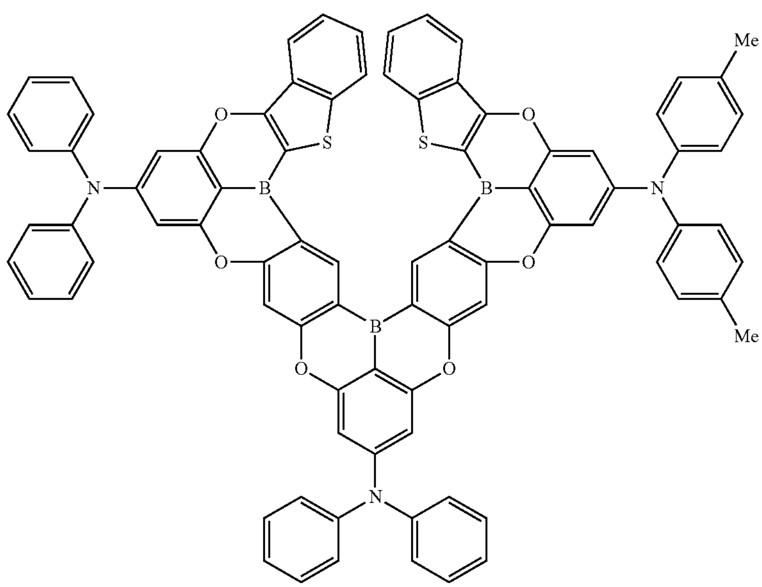

-continued
(1-15-122)
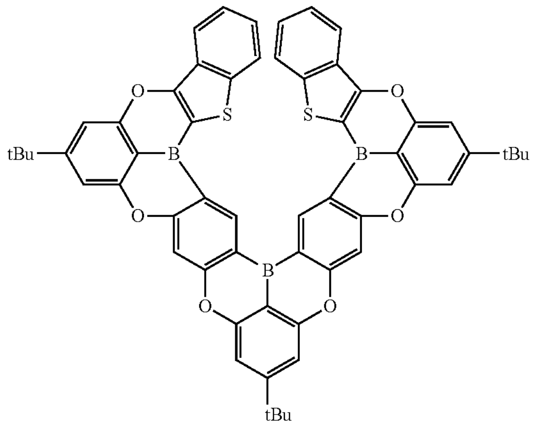
(1-15-123)
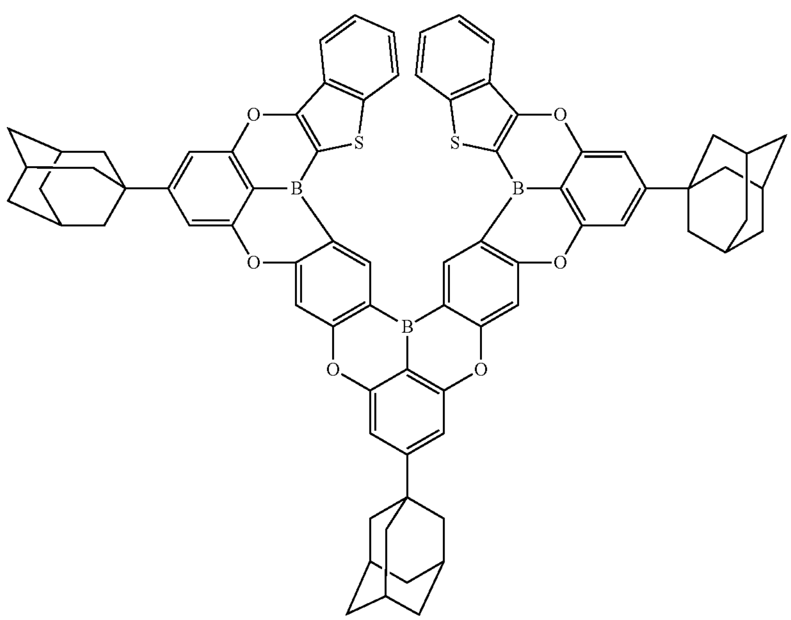

-continued
(1-15-124)
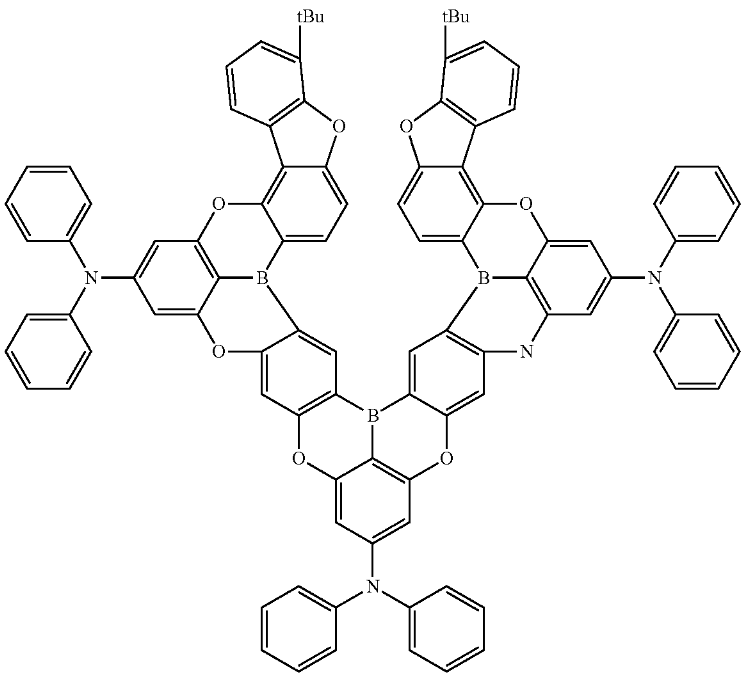
(1-15-125)
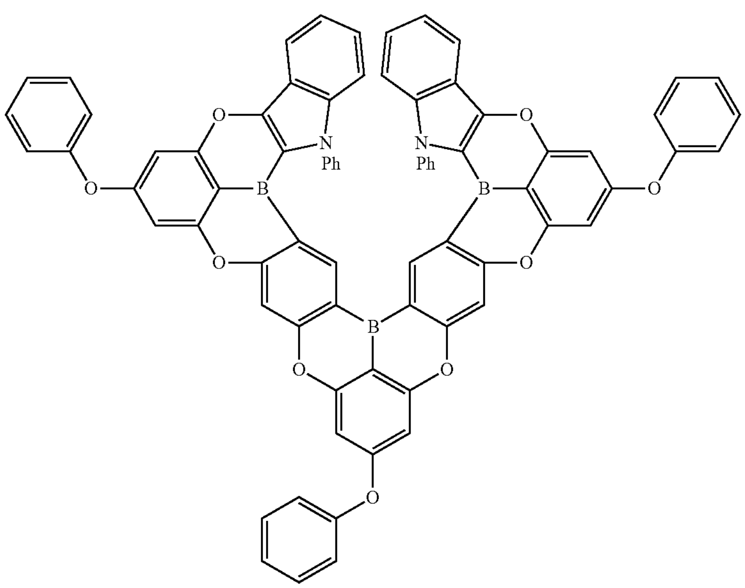

-continued
(1-15-126)
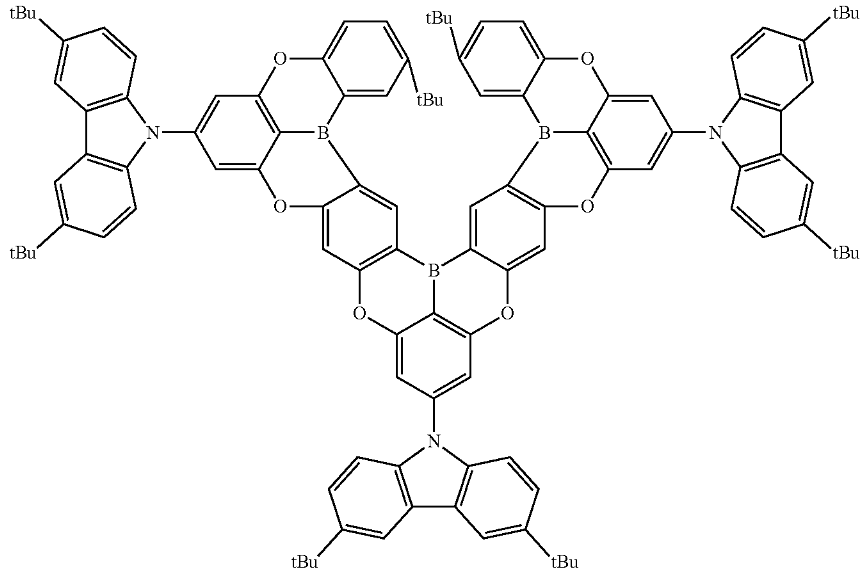
(1-15-127)
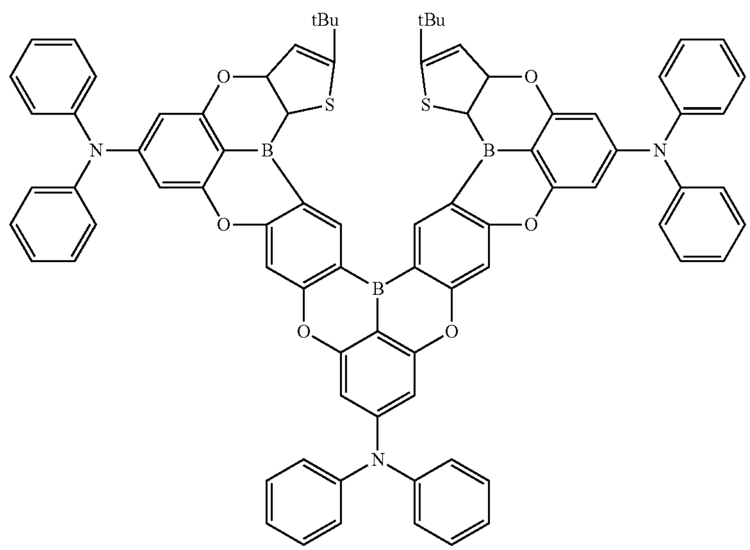
(1-15-128)
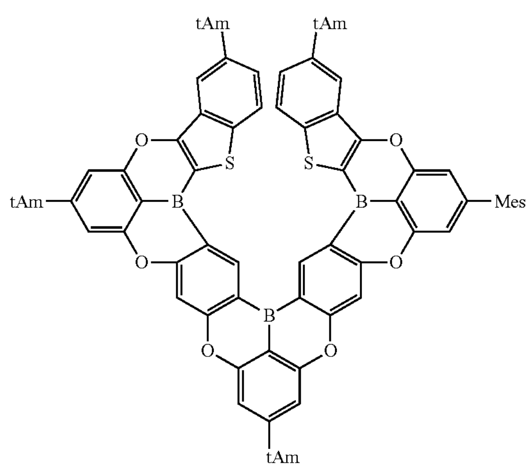

-continued
(1-15-129)
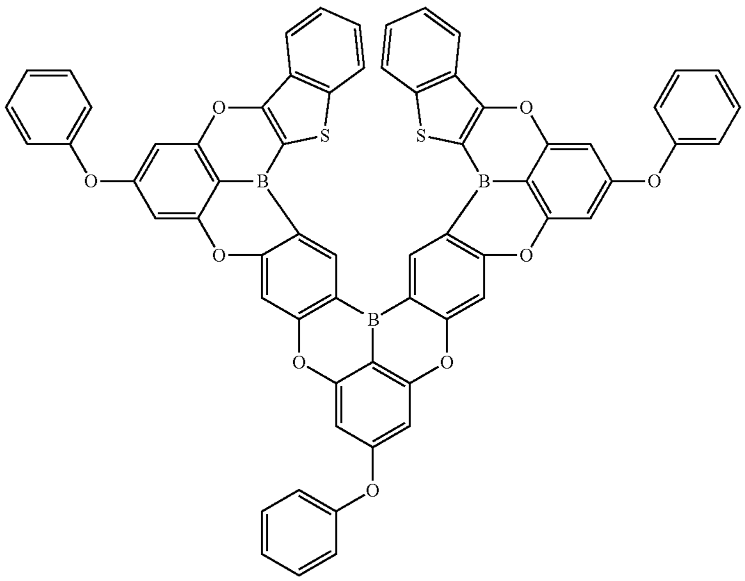
(1-15-130)
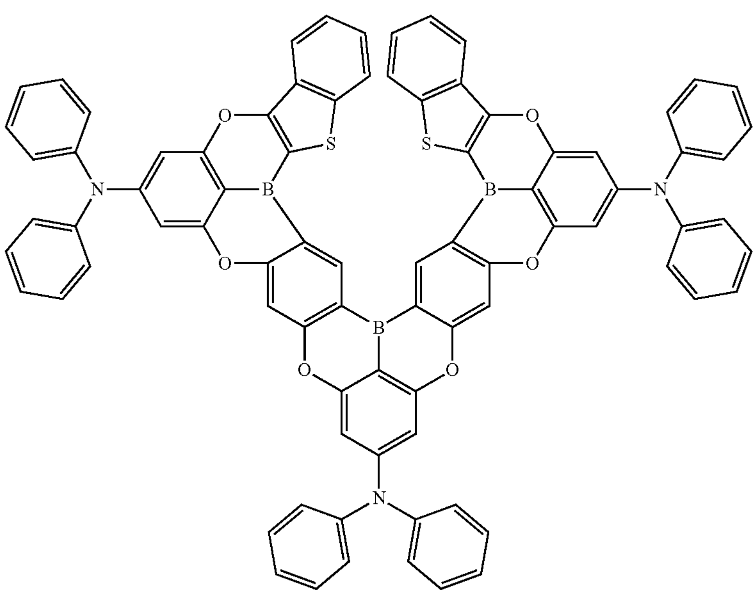

-continued
(1-15-141)
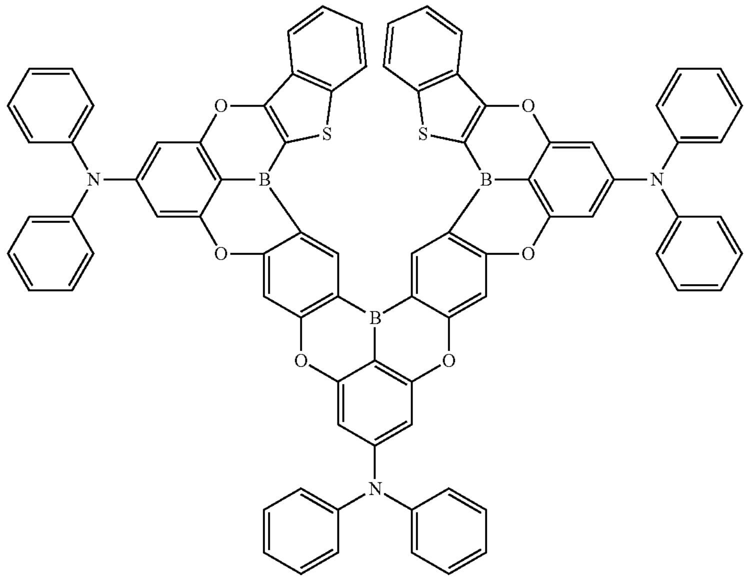
(1-15-142)
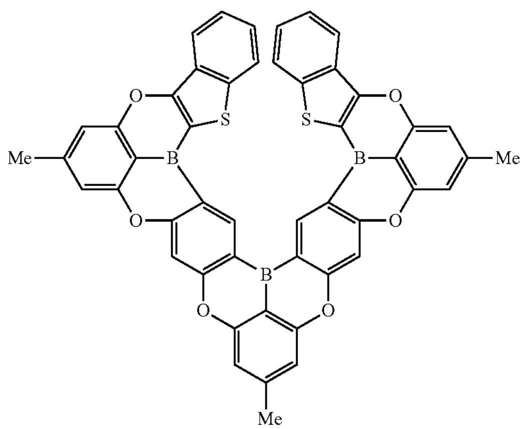
(1-15-143)
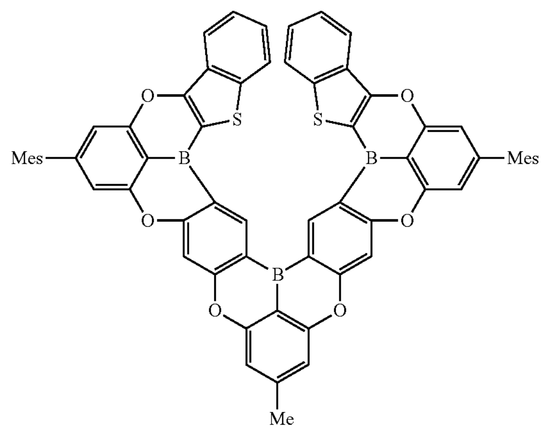
(1-15-144)
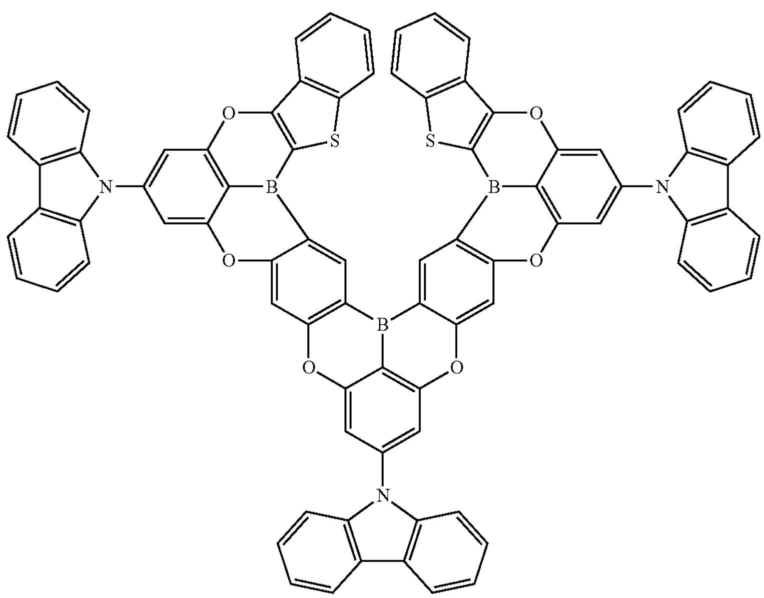

-continued
(1-15-145)
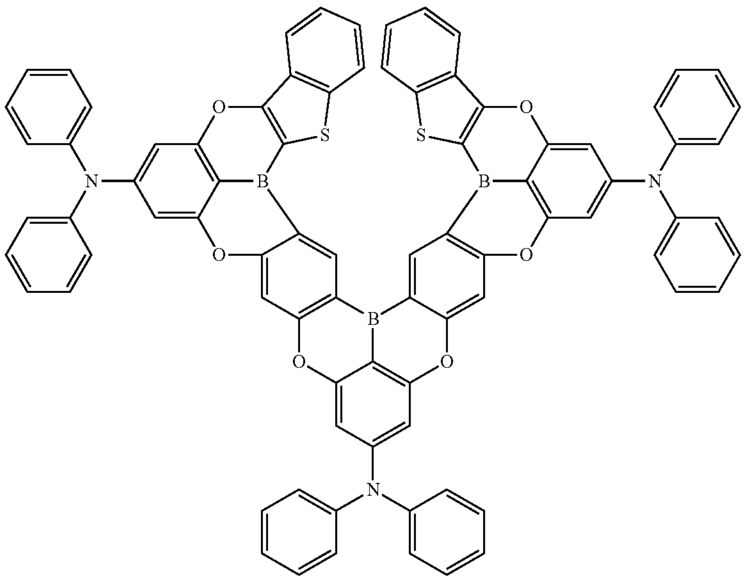
(1-15-146)
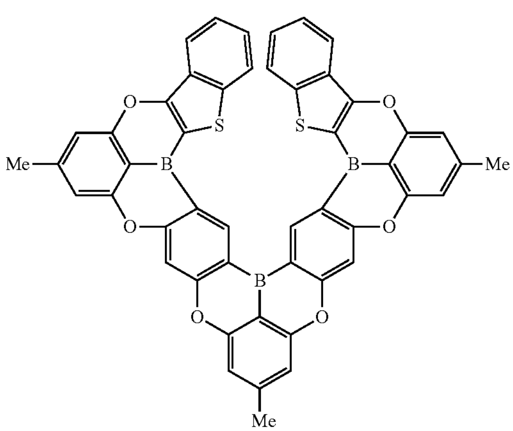
(1-15-147)
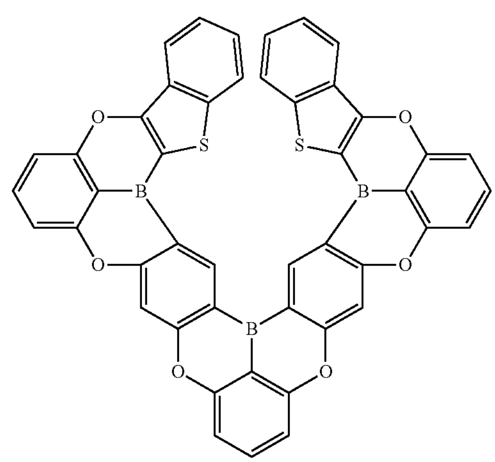
(1-15-148)
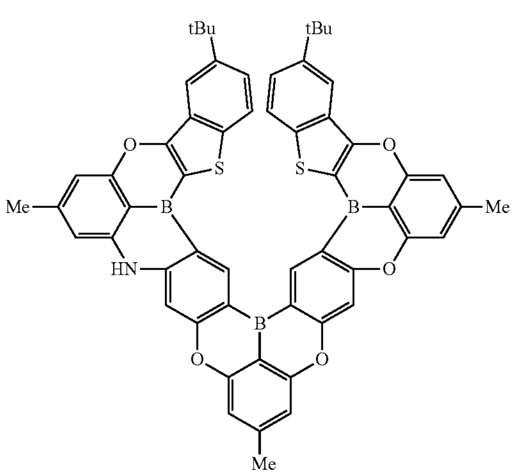

-continued
(1-15-149)
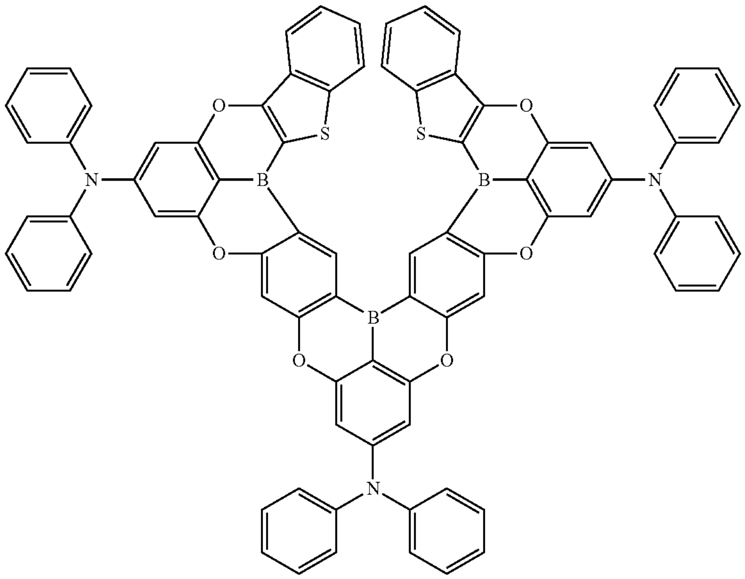
(1-15-150)
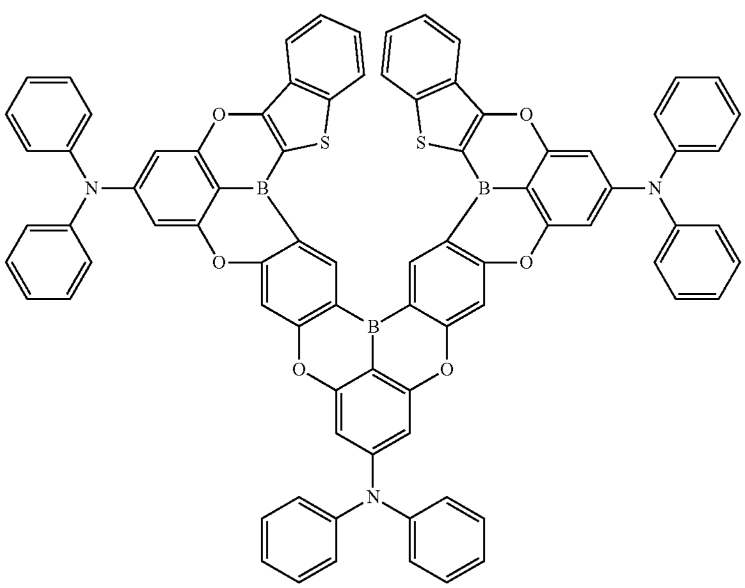

-continued
(1-15-161)
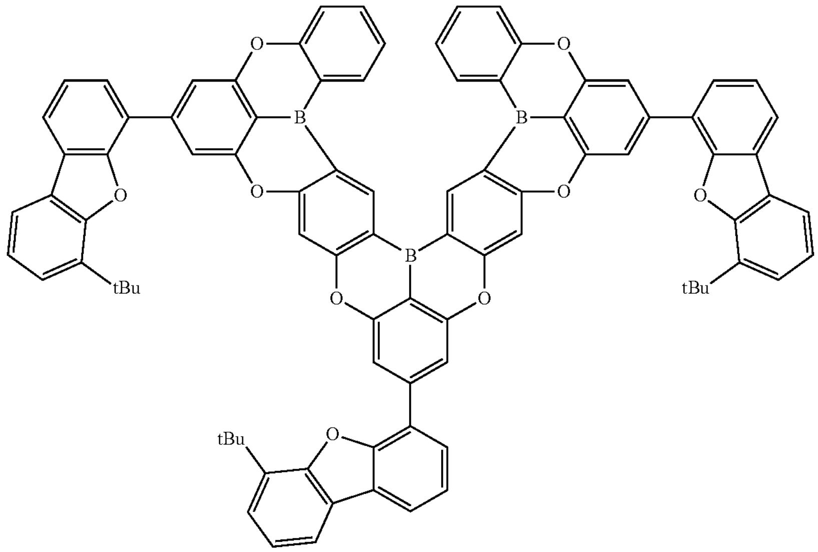
(1-15-162)
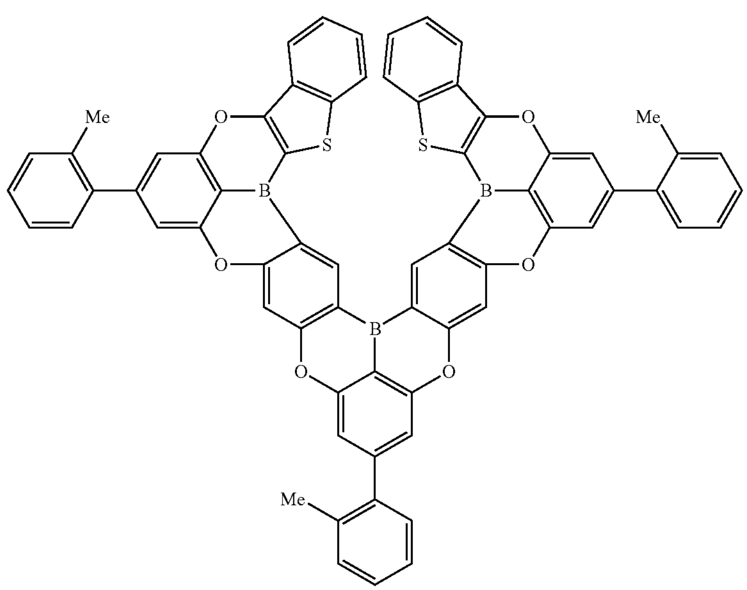

-continued
(1-15-163)
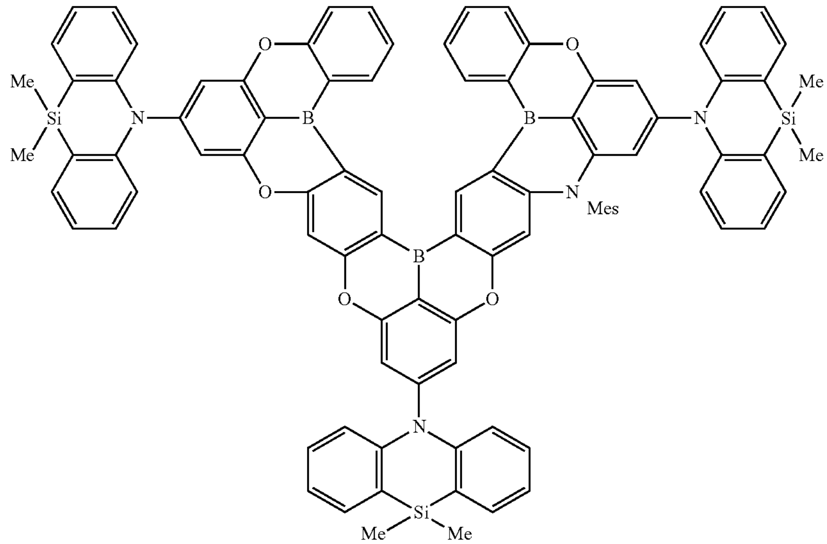
(1-15-164)
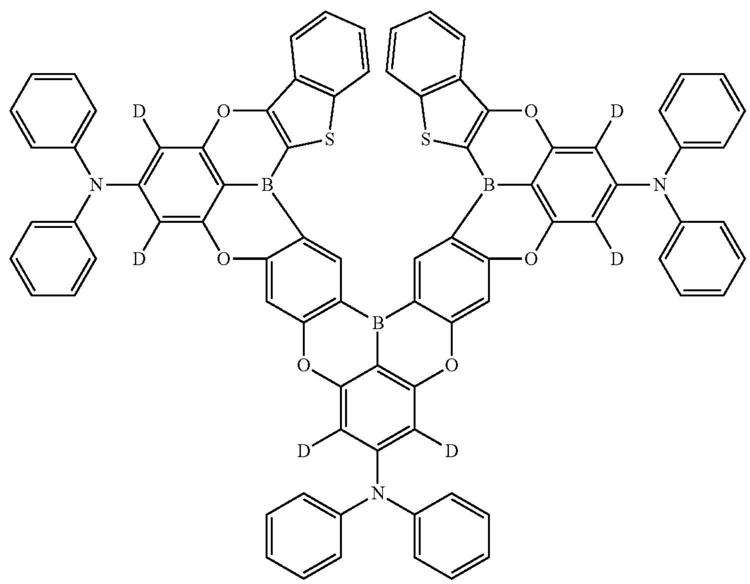
(1-15-165)
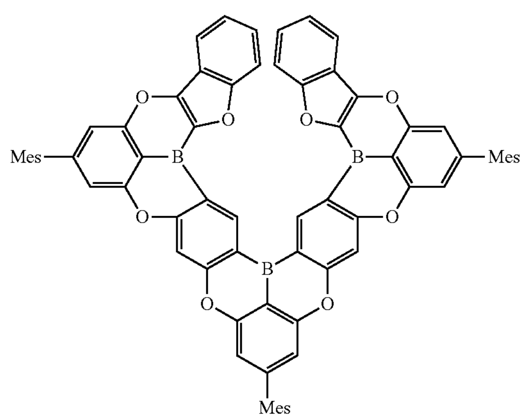
(1-15-166)
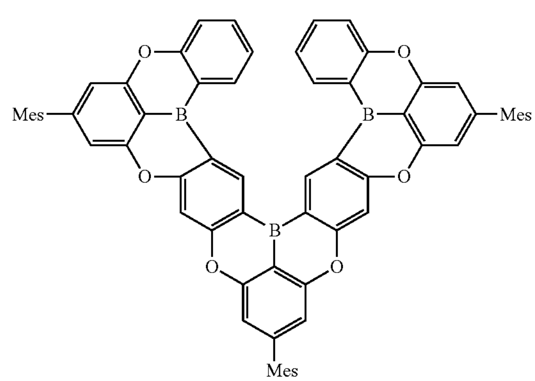

-continued
(1-15-167)
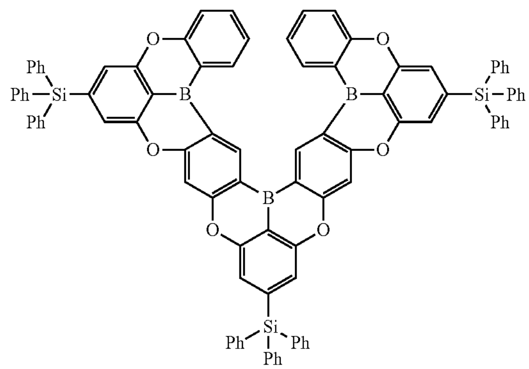
(1-15-168)
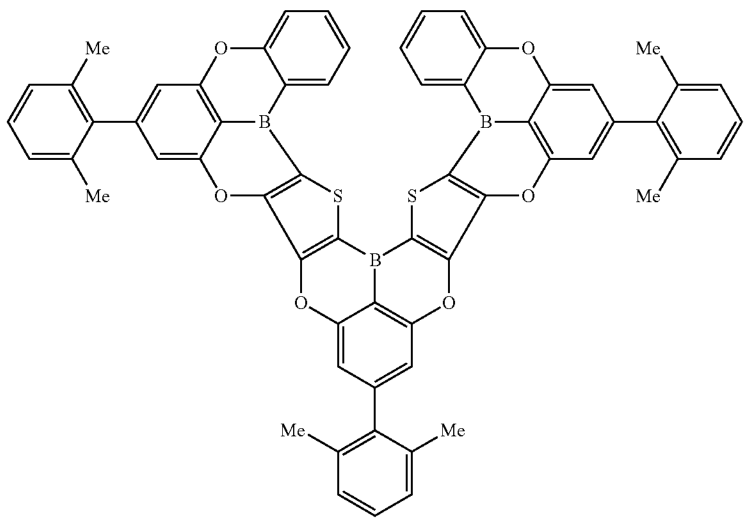
(1-15-169)
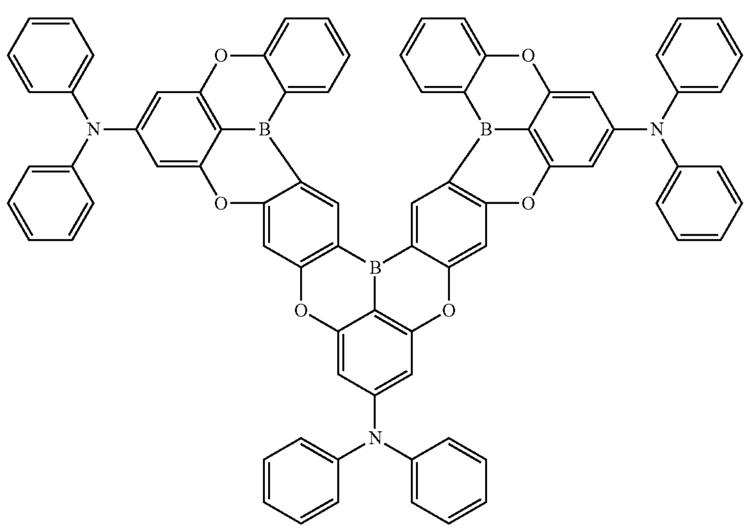

-continued
(1-15-170)
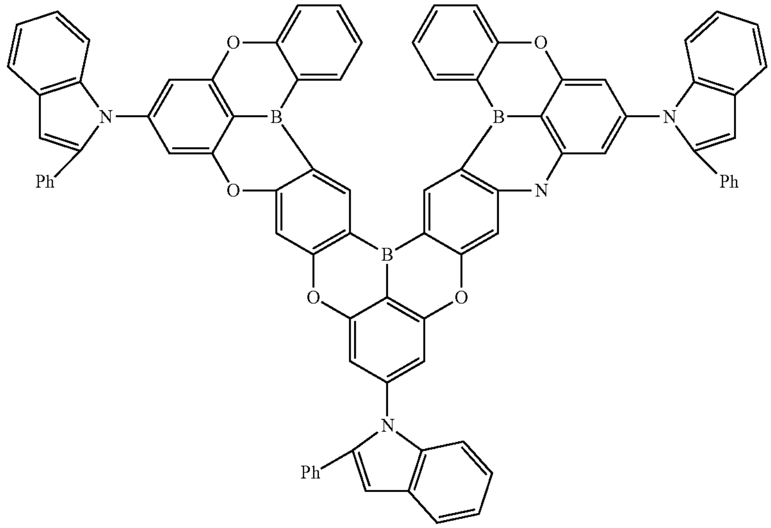
(1-15-191)
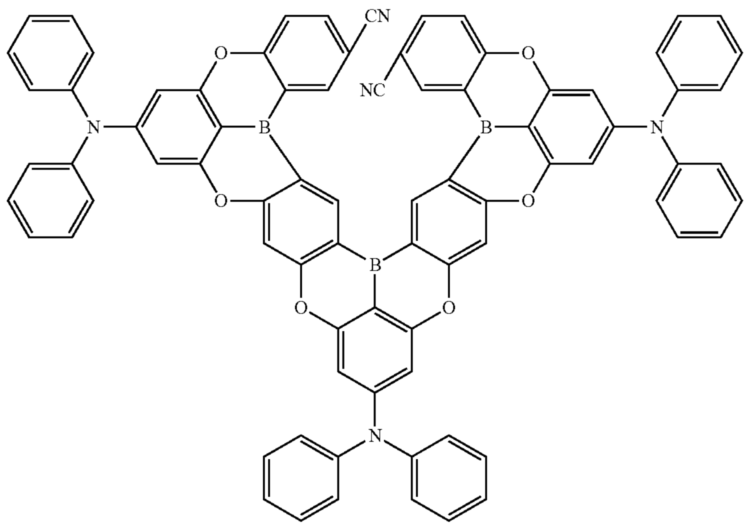
(1-15-192)
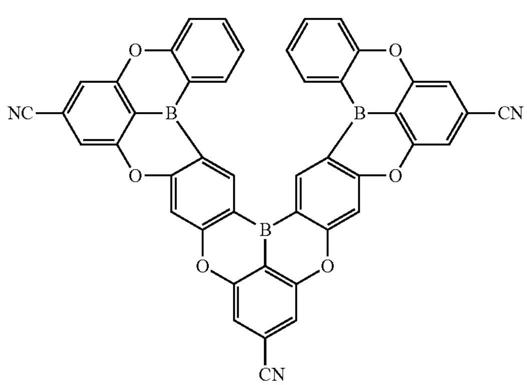
(1-15-193)
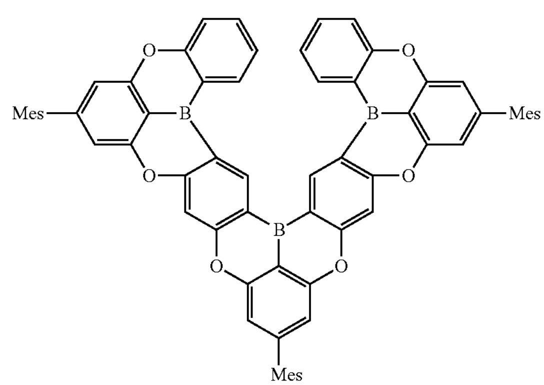

-continued
(1-15-194)
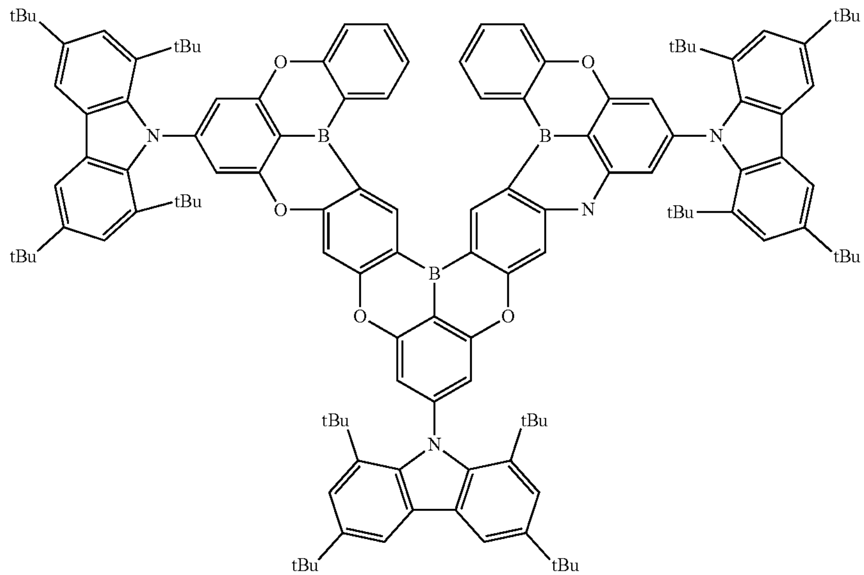
(1-15-195)
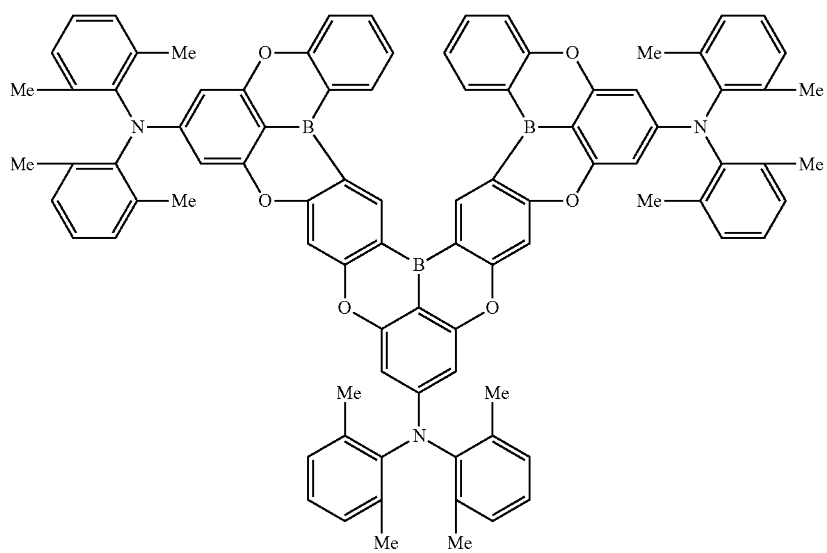
(1-15-196)
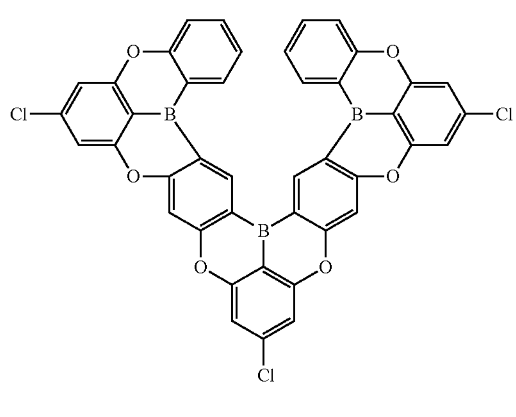
(1-15-197)
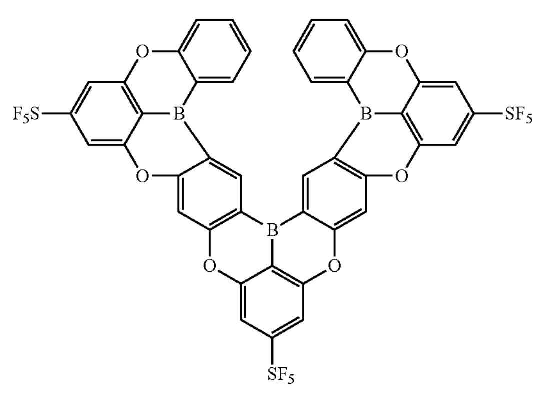

-continued
(1-15-198)
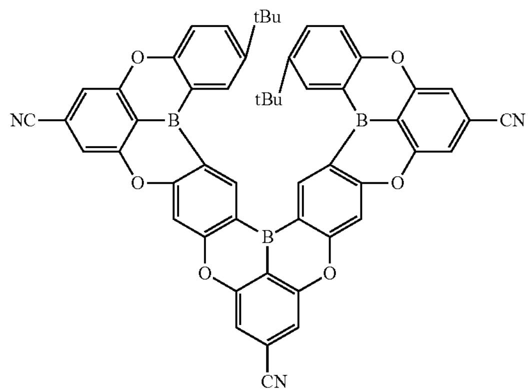
(1-15-199)
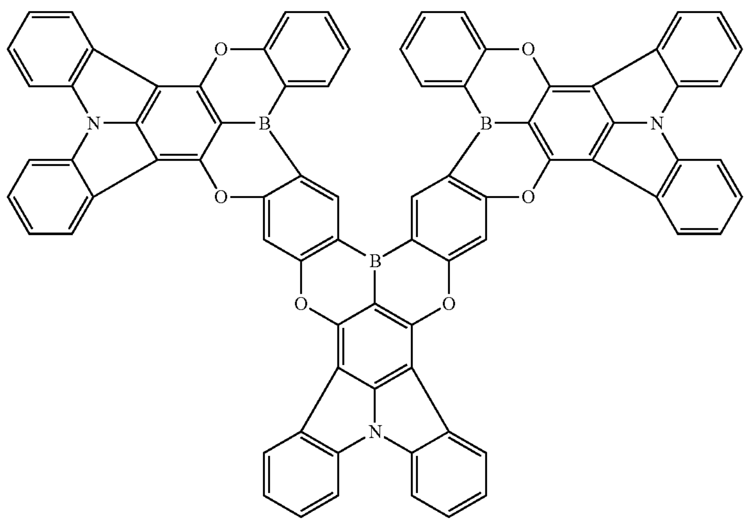
(1-15-200)
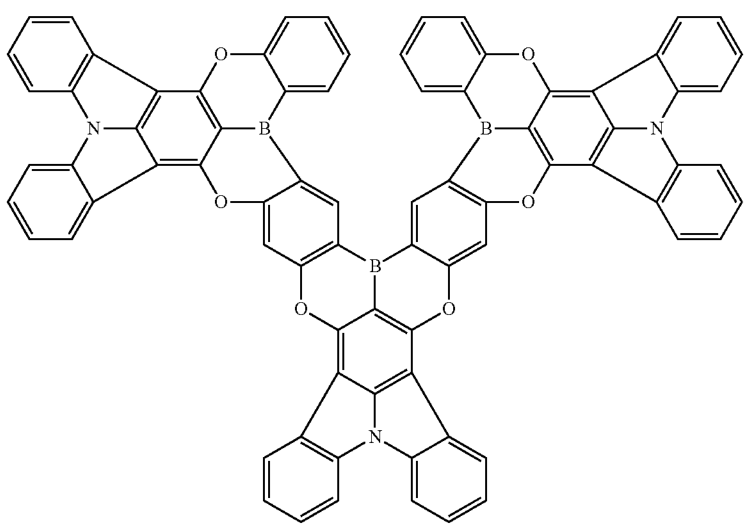

-continued
(1-15-221)
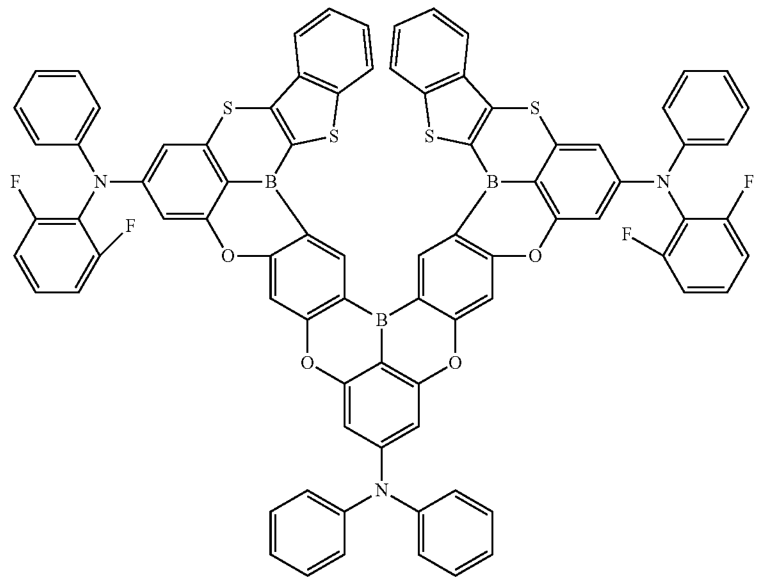
(1-15-222)
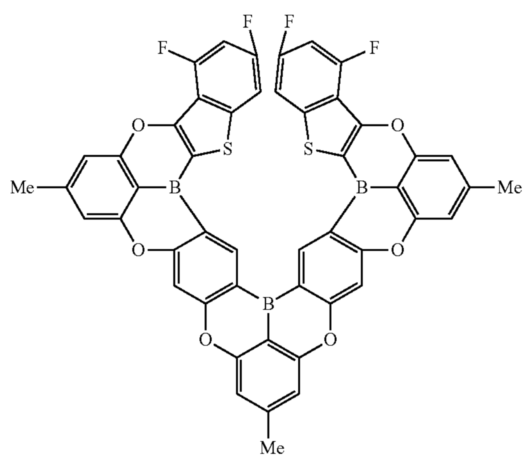
(1-15-223)
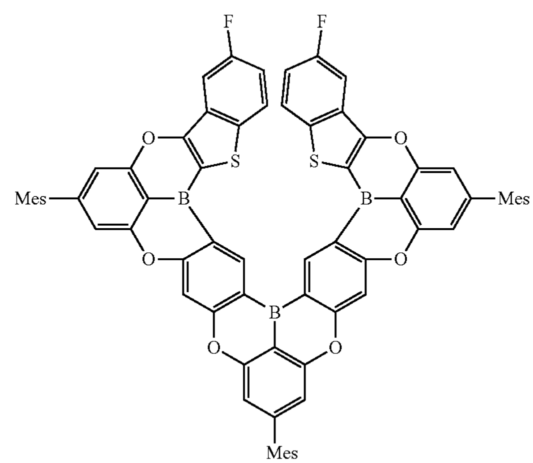
(1-15-224)
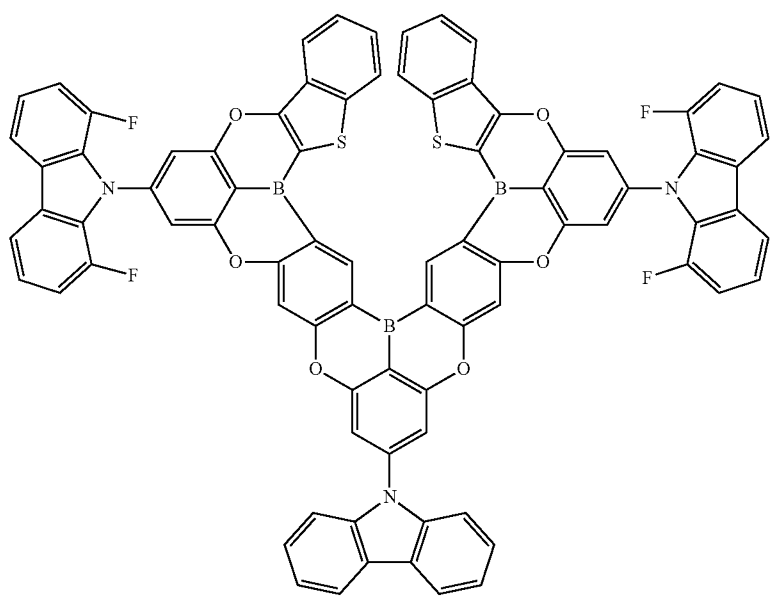

-continued
(1-15-225)
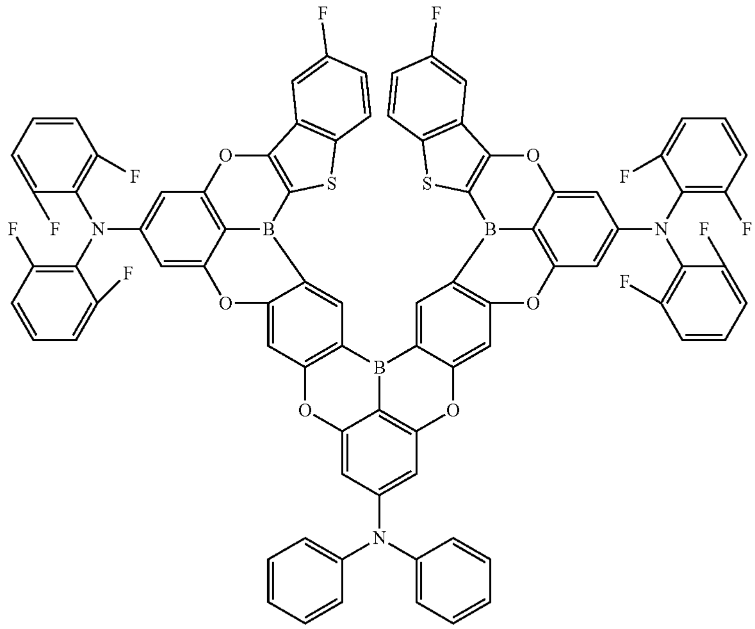
(1-15-226)
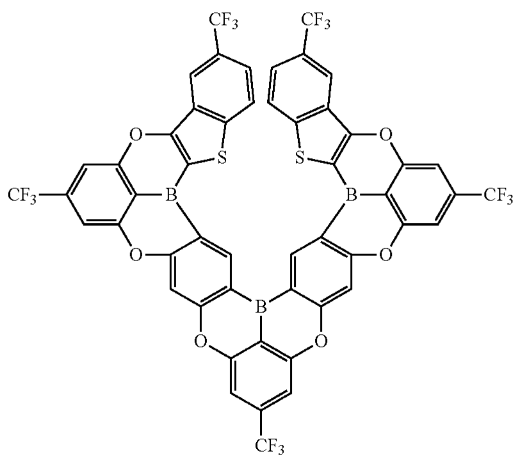
(1-15-227)
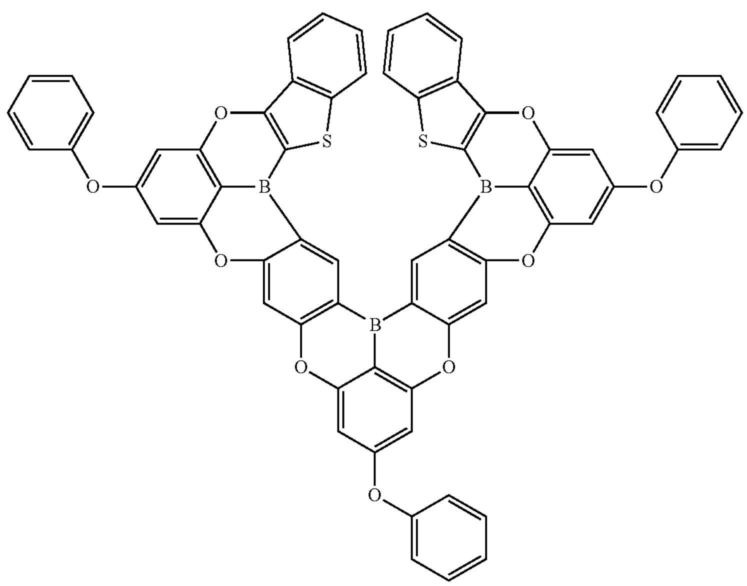

-continued
(1-15-228)
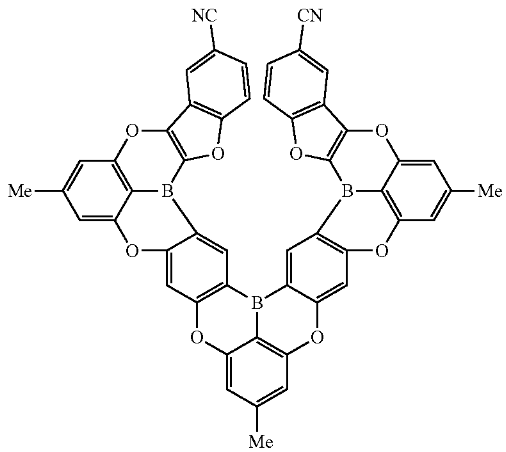
(1-15-229)
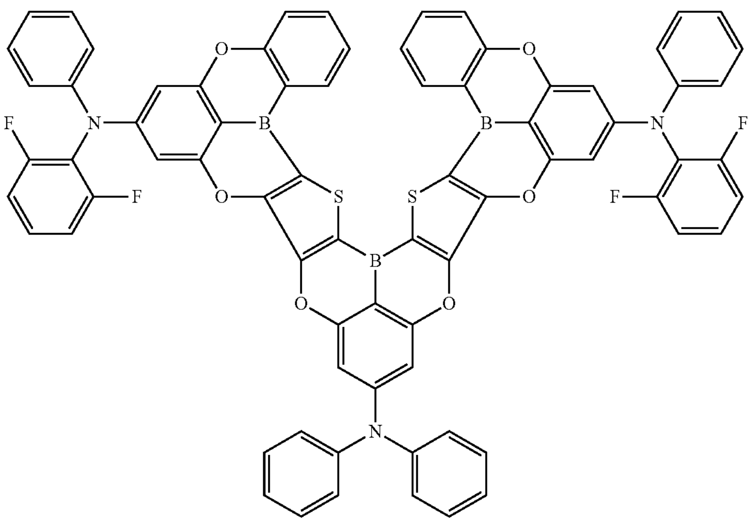
(1-15-230)
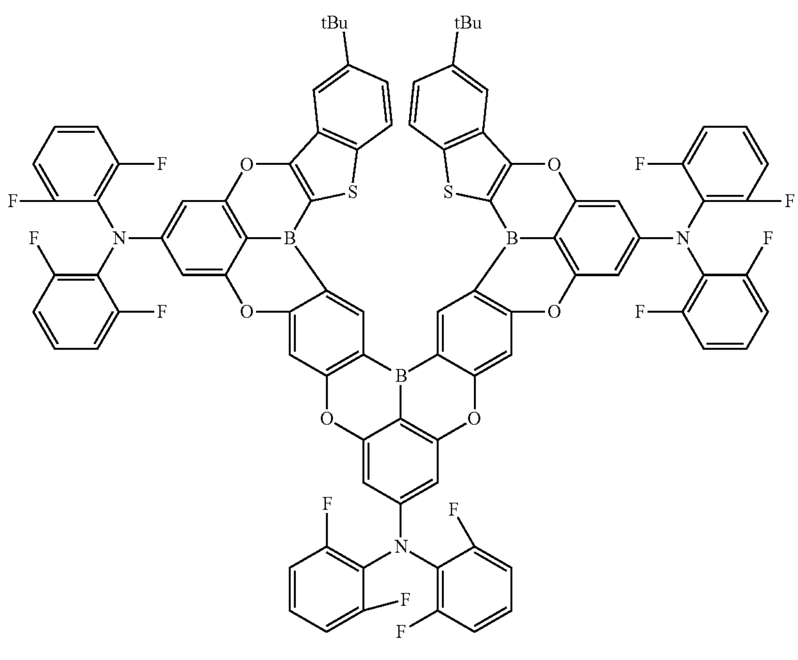

Of the above, as the compound represented by Formula (1), a compound represented by Formula (1-1-1), Formula (1-1-5), Formula (1-1-10), Formula (1-1-61), or Formula (1-1-105) is particularly preferred.
(1-1-1)
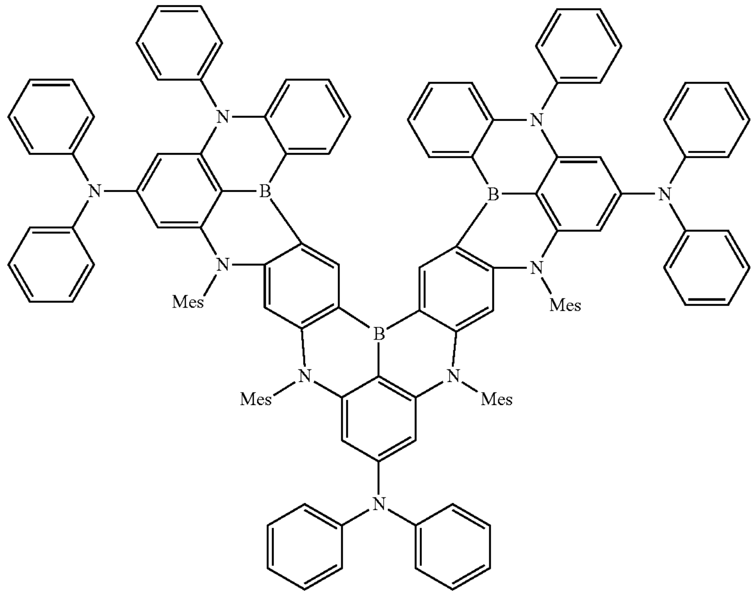
(1-1-5)
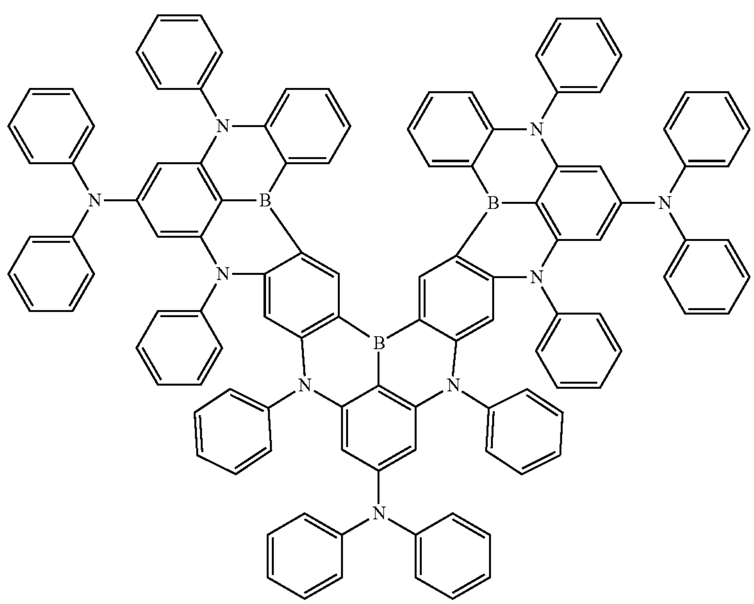

-continued
(1-1-10)
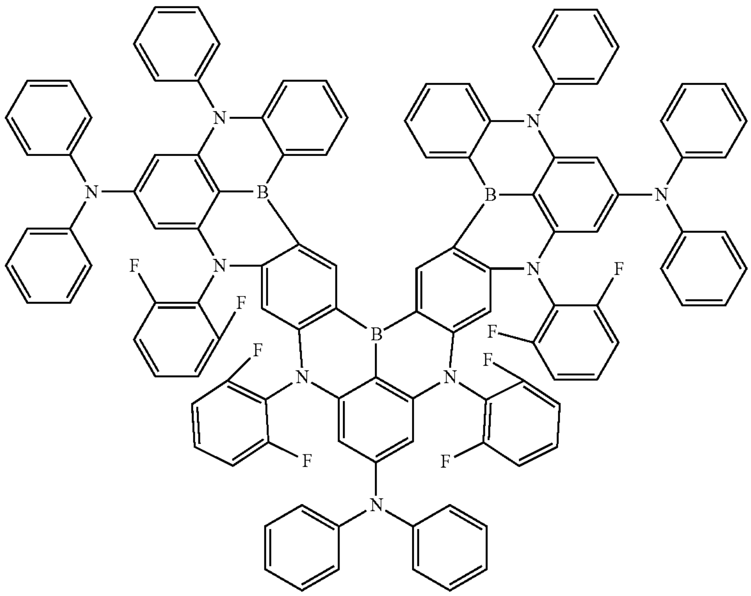
(1-1-61)
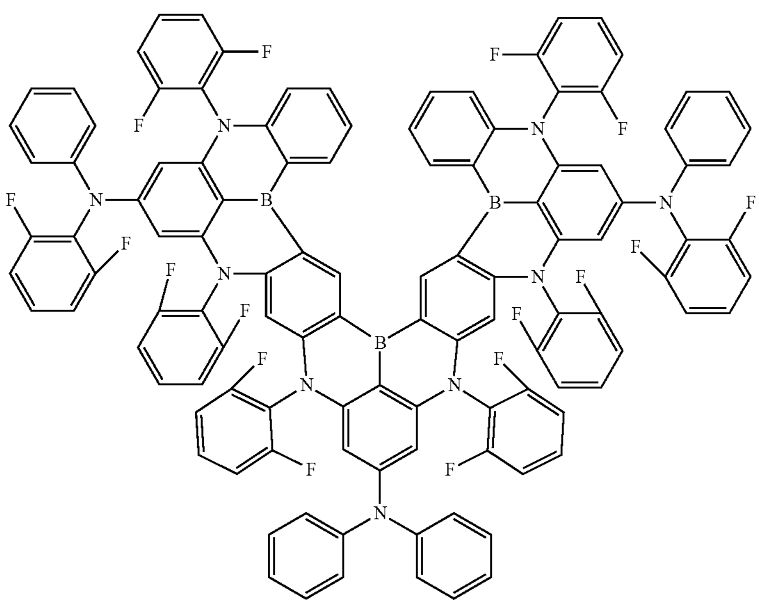

-continued (1-1-105)

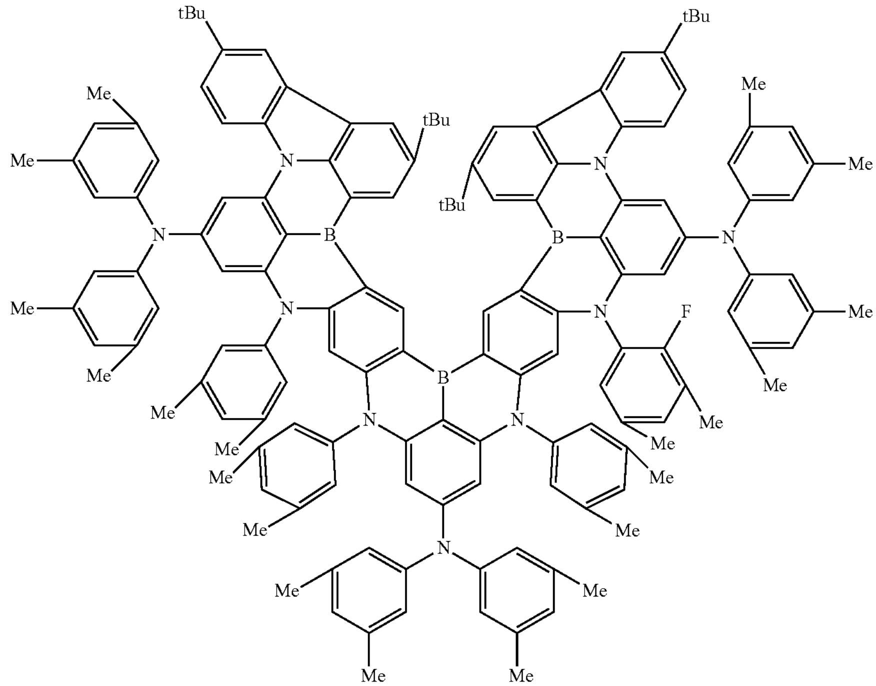

In addition to WO 2015/102118 described above, Japanese Patent Application Publication No. 2018-43984, WO 2018/212169, WO 2019/235402, WO 2019/240080, and the like disclose suitably combining three approaches of (i) introducing an element adjusting the multiple resonance effect in a suitable position, (ii) introducing a substituent in a suitable position in order to distort a molecule and reduce the flatness of the molecule, and (iii) introducing a highly flat structure, to achieve the adjustment of a light emission wavelength and the half width of a light emission spectrum, high light emission efficiency, and a small ΔE(ST) in a compound. In the present invention, an excellent thermally assisting delayed fluorescent material with a further smaller ΔE(ST) and a small delayed fluorescence lifetime tau (Delay) achieved by the above three approaches has been found.

A "thermally assisting delayed fluorescent material" means a compound that can cause an inverse intersystem crossing from a triplet excited state to a singlet excited state by absorbing thermal energy, then cause radiative deactivation from the singlet excited state, and radiate delayed fluorescence. In the present description, a "thermally assisting delayed fluorescent material" is also referred to as a TADF compound.

In a normal fluorescence emission, 75% triplet excitons generated by the current excitation cannot be taken out as fluorescence because the normal fluorescence emission passes the thermal deactivation route. Still, the use of the TADF compound enables all excitons to be used in fluorescence emission, and thus a highly efficient organic EL element can be achieved.

The "thermally assisting delayed fluorescent material" includes ones that undergo a higher triplet state in the course of the excitation from a triplet excited state to a singlet excited state. For example, a paper by Monkman et al., from the University of Durham (NATURE COMMUNICATIONS, 7:13680, DOI: 10.1038/ncomms13680), a paper by Hosokai et al., from the National Institute of Advanced Industrial Science and Technology (Hosokai et al., Sci. Adv. 2017; 3: e1603282), a paper by Sato et al., from Kyoto University (Scientific Reports, 7:4820, DOI: 10.1038/s41598-017-05007-7) and a conference presentation similarly by Sato et al., from Kyoto University (The 98th Annual Meeting of The Chemical Society of Japan, Presentation number: 2I4-15, titled "Mechanism of High Efficiency Light Emission in Organic EL using DABNA as Light Emitting Molecule", Graduate School of Engineering, Kyoto University), and the like are mentioned. In the present invention, a compound having a slow fluorescent component observed when the fluorescence lifetime is measured at 300 K for a sample containing the compound is determined as a "thermally assisting delayed fluorescent material". Here, a delayed fluorescent component refers to a component having a fluorescence lifetime of 0.1 μsec or longer. The fluorescence lifetime may be measured by, for example, a fluorescence lifetime measurement device (C11367-01; a product of Hamamatsu Photonics K.K.).

Among thermally assisting delayed fluorescent materials, a D-A-type TADF compound (D represents an electron-donating atomic group and A represents an electron-accepting atomic group) shows a high up-conversion rate, and a broad half width and a low color purity of light emission. Meanwhile, the polycyclic aromatic compound of the present invention is characterized by being a multiple resonance effect (MRE)-type TADF compound and showing a slow up-conversion rate, and a narrow half width and a high color purity of light emission. Furthermore, the polycyclic aromatic compound shows a high fluorescence quantum yield (PLQY) and a high emission rate.

That is, the polycyclic aromatic compound of the present invention is a thermally assisting delayed fluorescent material that provides a light emission with high efficiency and high color purity under electrical excitation and suitable as a light-emitting material of an organic EL element. The polycyclic aromatic compound of the present invention can provide, for example, a light emission having a maximum value within a range of 450 nm to 500 nm with a half width of 25 nm or less, further 20 nm or less.

The polycyclic aromatic compound of the present invention is useful as a fluorescent material that provides an emission with high color purity by excitation light. The polycyclic aromatic compound of the present invention can provide, for example, a light emission having a maximum value within a range of 450 nm to 500 nm with a half width of 25 nm or less, further 20 nm or less by excitation light having a wavelength of 300 nm to 449 nm.

Furthermore, the polycyclic aromatic compound of the present invention can provide, for example, a light emission having a maximum value within a range of 500 nm to 570 nm with a half width of 25 nm or less, further 20 nm or less by excitation light having a wavelength of 300 nm to 499 nm. That is, the polycyclic aromatic compound of the present invention may be used as a wavelength conversion material, and may be used as, for example, a wavelength conversion material for converting light with a wavelength of 300 nm to 430 nm to blue emission light having a maximum value within a range of 450 nm to 500 nm and a narrow half width or a wavelength conversion material for converting light with a wavelength 300 nm to 499 nm to a green emission light having a maximum value within a range of 500 nm to 570 nm and a narrow half width.

2, Method for Producing a Polycyclic Aromatic Compound

The polycyclic aromatic compound represented by Formula (1) and Formula (2) can generally be produced by producing an intermediate by bonding $A^{11}$ ring, $A^{21}$ ring, $A^{31}$ ring, $B^{11}$ ring, $B^{21}$ ring, $C^{11}$ ring, and $C^{31}$ ring with bonding groups (group containing $X^{11}$, $X^{12}$, $X^{21}$, $X^{22}$, $X^{31}$, $X^{32}$) (first reaction), then synthesizing the desired polycyclic aromatic compound or its polymer by bonding $A^{11}$ ring, $B^{11}$ ring, and $C^{11}$ ring, $A^{21}$ ring, $B^{11}$ ring, and $B^{21}$ ring, and $A^{31}$ ring, $C^{11}$ ring, and $C^{31}$ ring with bonding groups (group containing $Y^{11}$, $Y^{21}$, $Y^{31}$) respectively and cyclizing them (second reaction). In the following scheme, Z represents halogen or hydrogen, and the definition of other signs is the same as the definition described above.

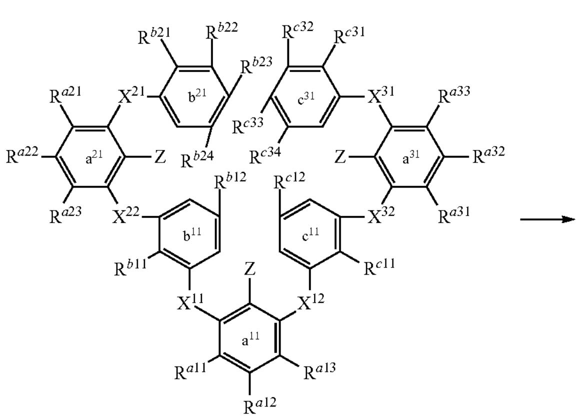

-continued

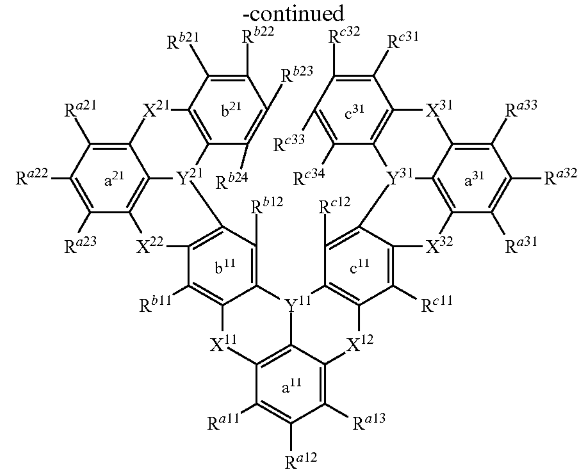

In the first reaction, for example, a general reaction such as a nucleophilic substitution reaction or a Ullmann reaction can be used, and in the case of an animation reaction, a general reaction such as a Buffalt-Hartwig reaction or a Suzuki-Miyaura coupling can be used. In the second reaction, a tandem hetero-Friedel-Crafts reaction (a sequential electrophilic aromatic substitution reaction; the same applies hereinafter) can be used in which an intermediate having hydrogen at Y is reacted with boron tribromide or boron triiodide to introduce boron atoms directly into $Y^{11}$, $Y^{21}$, $Y^{31}$.

Alternatively, hydrogen atoms between Z and O (oxygen) and N (nitrogen) are orthometalated using n-butyllithium, sec-butyllithium or t-butyllithium or the like. The target product can also be obtained by a tandem Borafriedel Crafts reaction, in which boron trichloride, boron tribromide, and the like are then added, and the metal interchange of lithium-boron is performed, and then a Brønsted base such as N,N-diisopropylethyiamine is added. Here, a Lewis acid such as aluminium trichloride may be added for promoting the reaction.

Further, in addition to a method of introducing lithium into a desired position by orthometalation, a halogen such as a bromine atom is introduced at a position where lithium is desired to be introduced, and lithium can be introduced into a desired position by halogen-metal exchange.

3. Materials for Organic Devices

The polycyclic aromatic compound of the present invention can be used as a material for an organic device. Examples of the organic device include an organic electroluminescent element, an organic field effect transistor, and an organic thin film solar cell.

The polycyclic aromatic compound of the present invention is preferably used as a material for an organic electroluminescent element. The polycyclic aromatic compound of the present invention is particularly preferably used as a material for forming a light-emitting layer of an organic electroluminescent element.

3-1 Organic Electroluminescent Element

The organic electroluminescent element has a pair of electrodes composed of an anode and a cathode, and a light-emitting layer disposed between the pair of electrodes. The organic electroluminescent element may have one or more organic layers in addition to the light-emitting layer. Examples of the organic layers include an electron transport layer, a hole transport layer, an electron injection layer and a hole injection layer. The organic electroluminescent element may have other organic layers.

FIG. 1 shows an example of a layer configuration of an organic electroluminescent element having such organic layers.

Organic EL element 100 shown in FIG. 1 has substrate 101, anode 102 provided on substrate 101, hole injection layer 103 provided on anode 102, hole transport layer 104 provided on hole injection layer 103, light-emitting layer 105 provided on hole transport layer 104, electron transport layer 106 provided on light-emitting layer 105, electron injection layer 107 provided on electron transport layer 106 and cathode 108 provided on electron injection layer 107.

In addition, with reversing preparation order, organic EL element 100 may be formed into a configuration having substrate 101, cathode 108 provided on substrate 101, electron injection layer 107 provided on cathode 108, electron transport layer 106 provided on electron injection layer 107, light-emitting layer 105 provided on electron transport layer 106, hole transport layer 104 provided on light-emitting layer 105, hole injection layer 103 provided on hole transport layer 104 and anode 102 provided on hole injection layer 103, for example.

All of the respective layers are not necessarily required, and a minimum constitutional unit may be formed into a configuration formed of anode 102, light-emitting layer 105 and cathode 108, and hole injection layer 103, hole transport layer 104, electron transport layer 106 and electron injection layer 107 are an arbitrarily provided layer. Moreover, each layer described above may be formed of a single layer, or may be formed of a plurality of layers.

A form of the layers constituting the organic EL element may be, in addition to the constitutional form of "substrate/anode/hole injection layer/hole transport layer/light-emitting layer/electron transport layer/electron injection layer/cathode" described above, in a constitutional form such as "substrate/anode/hole transport layer/light-emitting layer/electron transport layer/electron injection layer/cathode," "substrate/anode/hole injection layer/light-emitting layer/electron transport layer/electron injection layer/cathode," "substrate/anode/hole injection layer/hole transport layer/light-emitting layer/electron injection layer/cathode," "substrate/anode/hole injection layer/hole transport layer/light-emitting layer/electron transport layer/cathode," "substrate/anode/light-emitting layer/electron transport layer/electron injection layer/cathode," "substrate/anode-hole transport layer/light-emitting layer/electron injection layer/cathode," "substrate/anode/hole transport layer/light-emitting layer/electron transport layer/cathode," "substrate/anode/hole injection layer/light-emitting layer/electron injection layer/cathode," "substrate/anode/hole injection layer/light-emitting layer/electron transport layer/cathode," "substrate/anode/light-emitting layer/electron transport layer/cathode" and "substrate/anode/light-emitting layer/electron injection layer/cathode."

3-1-1. Light-Emitting Layer in Organic Electroluminescent Element

Light-emitting layer 105 is a layer which produces luminescence by allowing holes injected from anode 102 to recombine with electrons injected from cathode 108, between electrodes to which an electric field is applied. A material forming light-emitting layer 105 only needs be a compound (luminescent compound) which produces luminescence by being excited by recombination between the holes and the electrons, and is preferably a compound that can forms a stable thin film shape, and exhibits strong luminescence (fluorescence) efficiency in a solid state. The light-emitting layer may be formed of a single layer or a plurality of layers, and each layer is formed of a light-emitting layer material (the host material and the dopant material). The host material and the dopant material may be in one kind, or in combination of a plurality of kinds, respectively. The dopant material may be wholly contained in the host material or may be partly contained therein. As a doping method, the layer can be formed by vapor code position with the host material, or the dopant material is previously mixed with the host material, and then the resulting mixture may be simultaneously deposited. Further, as will be described later, the light emitting layer can also be formed by a wet film forming method using a light emitting layer forming composition containing a host material and a dopant material.

The polycyclic aromatic compound of the present invention can be preferably used as a material for forming a light emitting layer of an organic electroluminescent element. The polycyclic aromatic compound of the present invention may be contained in the light emitting layer as a host material or a dopant material. When the polycyclic aromatic compound of the present invention is used as a host material, the dopant material that can be used in combination is not specifically limited and may be any known compound. The dopant material can be selected from various materials depending on the desired emission color. Specific examples of the compound include a condensed ring derivative such as phenanthrene, anthracene, pyrene, tetracene, pentacene, perylene, naphthopyrene, dibenzopyrene, rubrene and chrysene, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetrapheny (butadiene derivative, a cyclopentadiene derivative, a bisstyiyl derivative (JP 1-245087 A) and a bisstyiylarylene derivative (JP 2-247278 A) such as a bisstyrvlanthracene derivative and a distyrylbenzene derivative, a diazaindacene derivative, a furan derivative, a benzofuran derivative, an isobenzofurane derivative such as phenylisobenzofuran, dimesitylisobenzofuran, di(2-methylphenyl)isobenzofuran, di(2-trifluoromethylphenyl)isobenzofuran and phenylisobenzofuran, a di benzofuran derivative, a coumarin derivative such as a 7-dialkylaminocoumarin derivative, a 7-piperidinocoumarin derivative, a 7-hydroxy coumarin derivative, a 7-methoxycoumarin derivative, a 7-acetoxycoumarin derivative, a 3-benzothiazolylcoumarin derivative, a 3-benzimidazolylcoumarin derivative and a 3-benzoxazolylcoumarin derivative, a dicyanomethylenepyran derivative, a dicyanomethylenethiopyran derivative, a polymethine derivative, a cy anine derivative, an oxobenzanthracene derivative, an xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, furopyridine derivative, a 1,2,5-thiadiazolopyrene derivative, a pyrromethene derivative, a perinone derivative, a pyrrolopyrrole derivative, squarylium derivative, a violanthrone derivative, a phenazine derivative, an acridone derivative, a deazaflavin derivative, a fluorene derivative and a benzofluorene derivative.

[Host Material]

The polycyclic aromatic compound of the present invention may be contained as a dopant material in the light-emitting layer. In particular, a polycyclic aromatic compound in which $Y^{11}$, $Y^{21}$, $Y^{31}$ of Formula (1) are B is preferably used as a dopant material, in particular as an emitting dopant.

When the polycyclic aromatic compounds of the present invention are used as a dopant material, the host material that can be used in combination include an anthracene derivative, a pyrene derivative, a bisstyryl derivative such as a bisstyryl anthracene derivative and a disstyrylbenzene derivative, a dibenzofuran derivative, a carba/ole derivative, a triazine derivative, a tetraphenyl butadiene derivative, a cyclopeniadiene derivative, a fluorene derivative, a benzofluorene derivative, and a fluorene or triarylamine-based polymeric compound.

As will be described later, a known one can be used as a host material when the polycyclic aromatic compound of the present invention (particularly, one having a boron atom in a molecule; an emitting dopant) is used, and further, an assisting dopant is used. Examples of the host material in this case include a compound having at least one of a carbazole ring and a furan ring, and among them, a compound in winch at least one of furanyl and carbazolyl and at least one of arylene and heteroarylene are bonded is preferably used.

The excited triplet energy level E(1, T, Sh) obtained from the shoulder on the short wavelength side of the peak of the phosphorescence spectrum of the compound used as the host material is preferably higher than the excited triplet energy level E(2, T, Sh), E(3, T, Sh) of the emitting dopant or assisting dopant having the highest excited triplet energy level in the light emitting layer from the viewpoint of promoting without inhibiting the generation of TADF in the light emitting layer, and specifically, the excited triplet energy level E(1, T, Sh) of the host material is preferably 0.01 eV or more, more preferably 0.03 eV or more, further preferably 0.1 eV or more than E(2, T, Sh), E(3, T, Sh). Further, a TADF active compound may be used for the host material.

For example, a compound represented by any of the following formulas (H1), (H2) and (H3) can be used.

(H1)

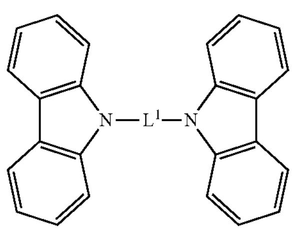

(H2)

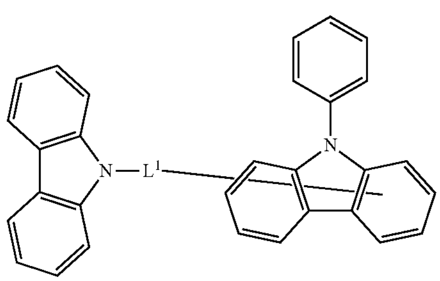

-continued (H3)

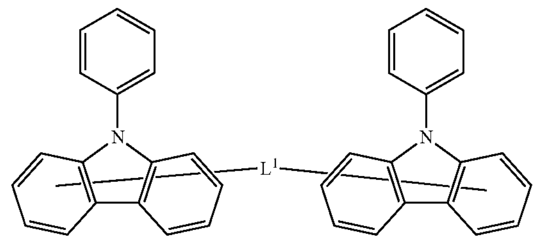

In the above formulas (H1), (H2) and (H3), L1 is an arylene having 6 to 24 carbons, a heteroarylene having 2 to 24 carbons, a heteroarylene allylene having 6 to 24 carbons, preferably is an arylene having 6 to 24 carbons, more preferably is an arylene having 6 to 12 carbons, particularly preferably is an arylene having 6 to 10 carbons. Specific examples include divalent groups of a benzene ring, a biphenyl ring, a terphenyl ring, a fluorene ring or the like. As the heteroarylene, a heteroarylene having 2 to 24 carbons is preferable, a heteroarylene having 2 to 20 carbons is more preferable, a heteroarylene having 2 to 15 carbons is further preferable, and a heteroarylene having 2 to 10 carbons is particularly preferable. Specific examples include divalent groups of a pyrrole ring, an oxazole ring, an isoxazol ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzooxazole ring, a benzothiazole ring, a 1H-benzotriazol ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazan ring, an oxadiazole ring or a thianthrene ring.

At least one hydrogen in the compound represented by each of the above formulas may be replaced with an alkyl having 1 to 6 carbons, cyano, a halogen, or deuterium.

Preferred specific examples include compounds represented by any of the structural formulas listed below. In the following structural formula, Me is methyl. In the structural formulas listed below; at least one hydrogen may be replaced with a halogen, cyano, an alkyl having 1 to 4 carbons (for example, methyl or t-butyl), phenyl or naphthyl.

(H1-1201)

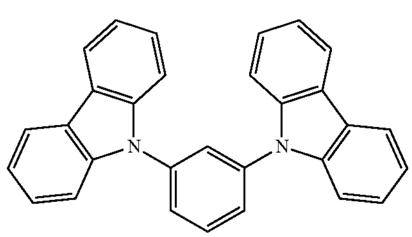

(mCP)

(H1-1202)

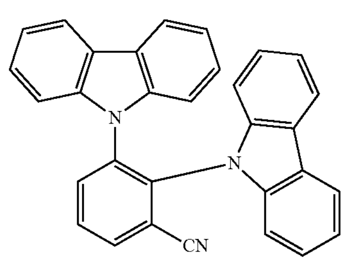

-continued
(H1-1203)
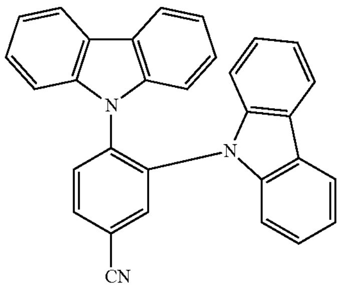
(H1-2201)
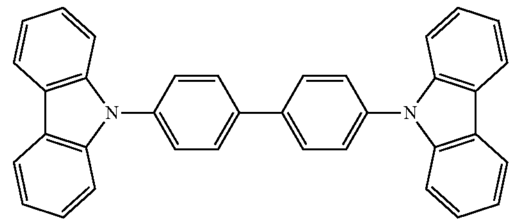
(H1-2202)
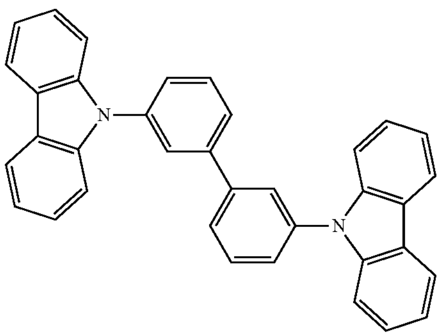
(mCBP)
(H1-2203)
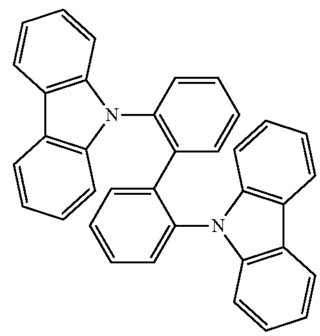
(H1-2203)
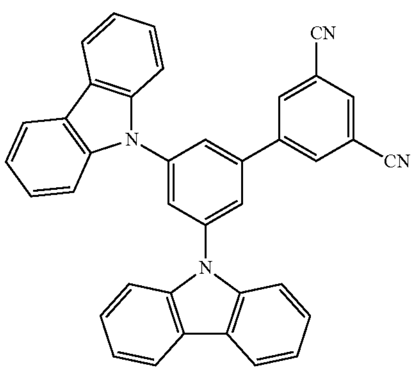
(H1-2204)
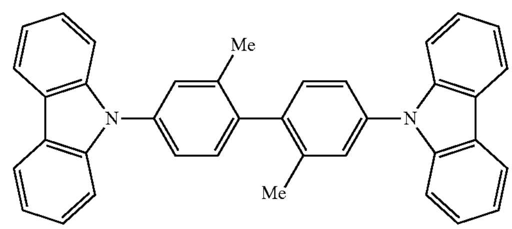
(H1-2205)
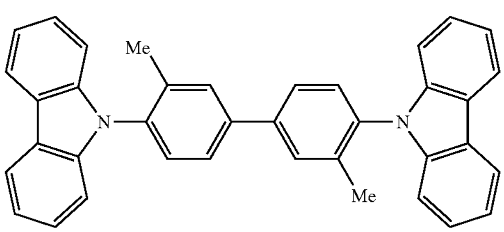
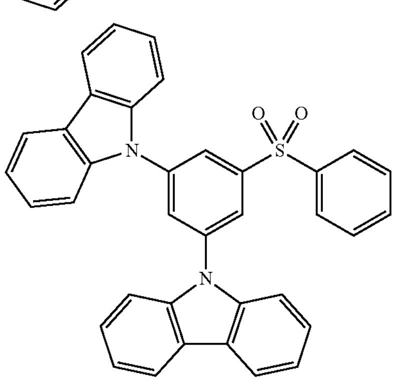
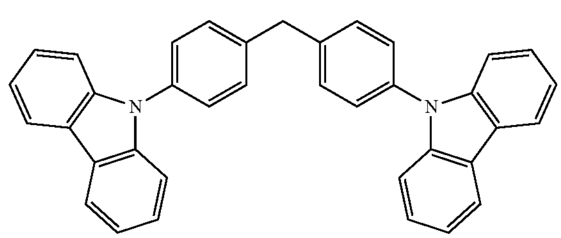

-continued
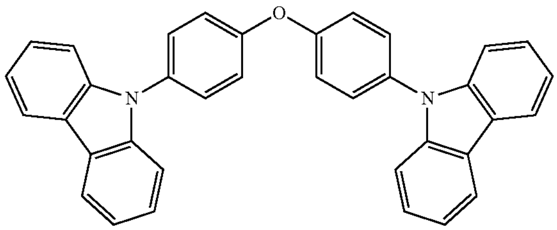
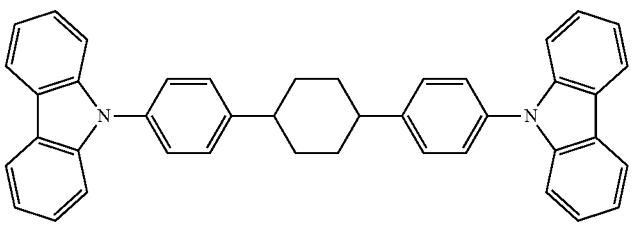
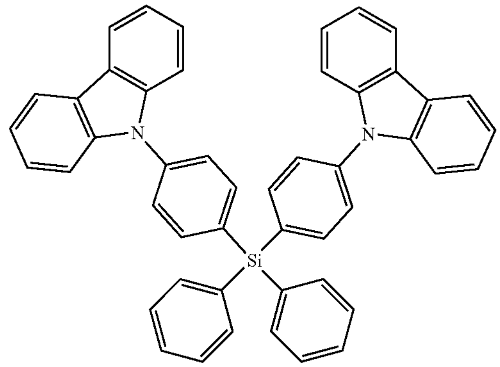
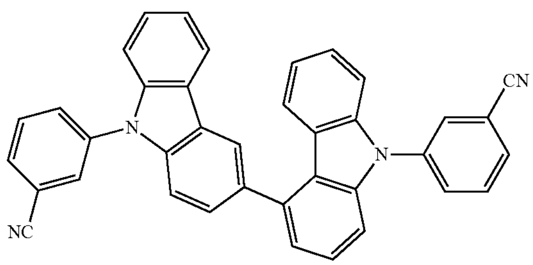
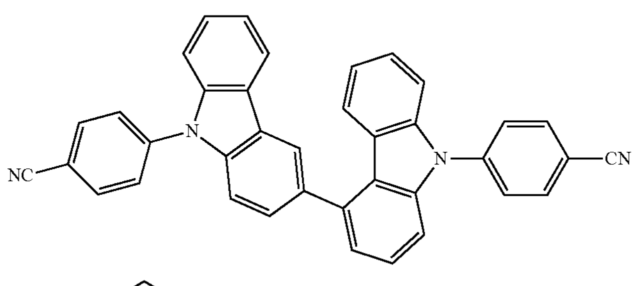
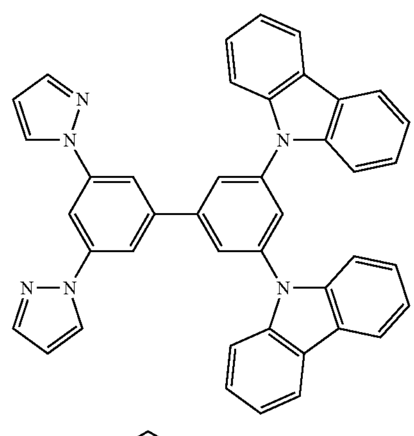
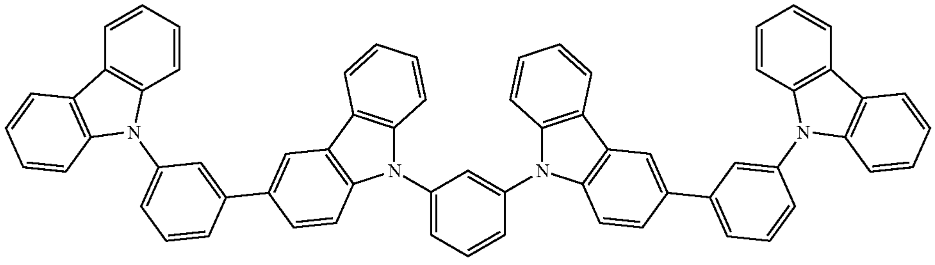

-continued
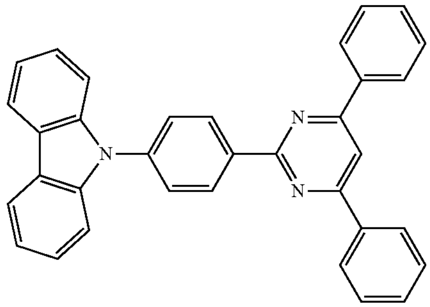
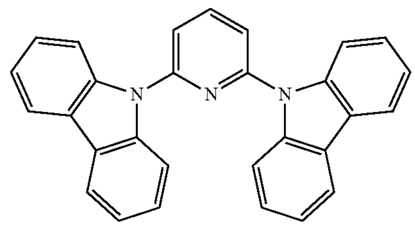
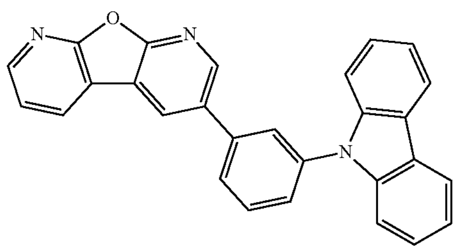
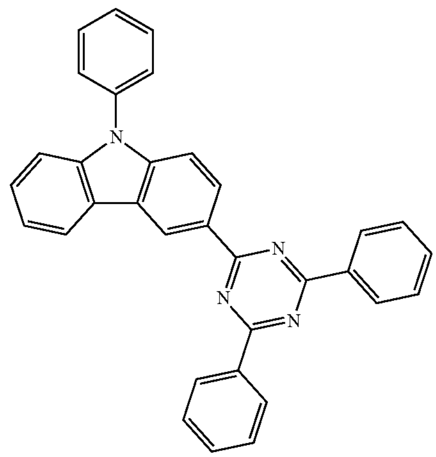
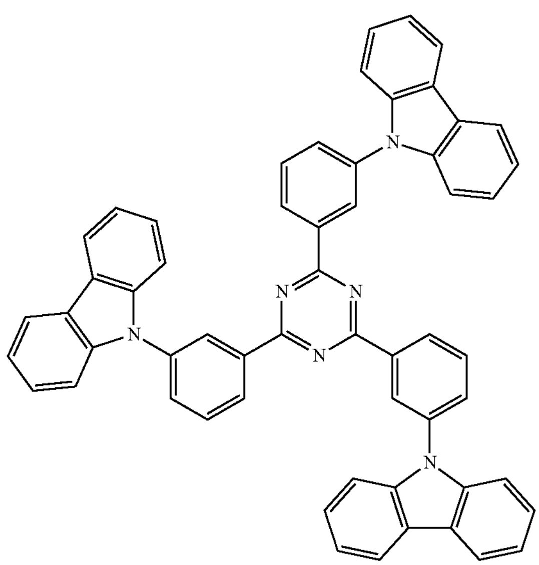
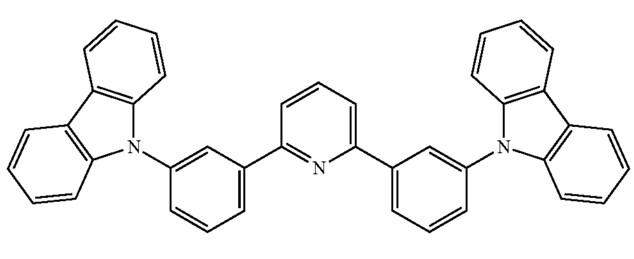

-continued

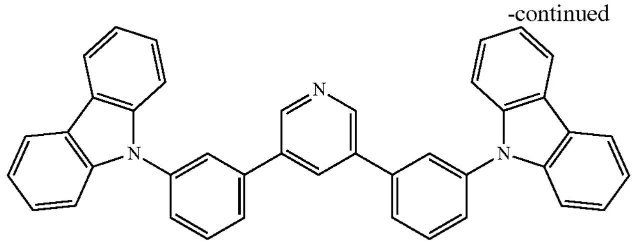

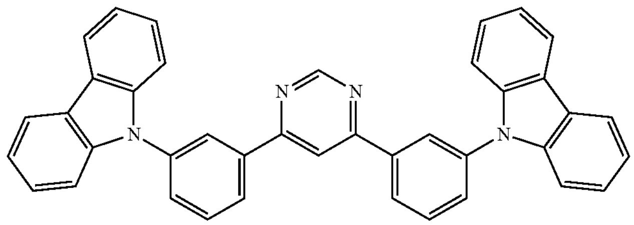

Polymer Host Material: Compound Represented by Formula (SPH-1)

As the host material, a compound represented by the following Formula (SPH-1) is also preferable. Particularly, when the light emitting layer is formed by a wet film formation method of the light emitting layer forming composition, the light emitting layer forming composition preferably contains a compound represented by Formula (SPH-1) as the host material.

$$EC \leftarrow\!\!\left( MU \right)_k\!\!\rightarrow EC \qquad \text{(SPH-1)}$$

In Formula (SPH-1),

MUs are each independently a divalent group obtained by removing any two hydrogens from an aromatic compound, ECs are each independently a monovalent group obtained by removing any one hydrogen from an aromatic compound and k is an integer of 2 to 50000.

More specifically, MUs are each independently, arylene, heteroarylene, diaryleneaarylamino, diaryleneaarylboryl, oxaborin-diyl, azaborine-diyl, or the like. ECs are each independently, aryl, heteroaryl, diarylamino, diheteroarylamino, arylheteroarylamino, aryloxy or the like. At least one hydrogen in these groups may further be replaced with one or more substituent selected from the group consisting of aryl, heteroaryl, diarylamino, alkyl, and cycloalkyl, k is an integer of 2 to 50000.

k is preferably an integer of 20 to 50000, and more preferably an integer of 100 to 50000. When k MUs are constituted of two or more types of divalent groups, the groups may be bonded at random or may constitute a block of the same type of divalent groups, provided that the latter is preferred.

At least one hydrogen in MU and EC in Formula (SPH-1) may be replaced with an alkyl having 1 to 24 carbons, a cycloalkyl having 3 to 24 carbons. Further, any —$CH_2$— in the above alkyl may be replaced with —O— or —$Si(CH_3)_2$—, any —$CH_2$— except —$CH_2$— directly linked to EC in Formula (SPH-1) in the above alkyl may be replaced with an arylene having 6 to 24 carbons, and any hydrogen in the above alkyl may be replaced with fluorine.

Examples of the aromatic compound forming MU or EC by removing one or two hydrogens include the following aromatic compounds and an aromatic compound in which any two or more of the following aromatic compounds are directly bonded.

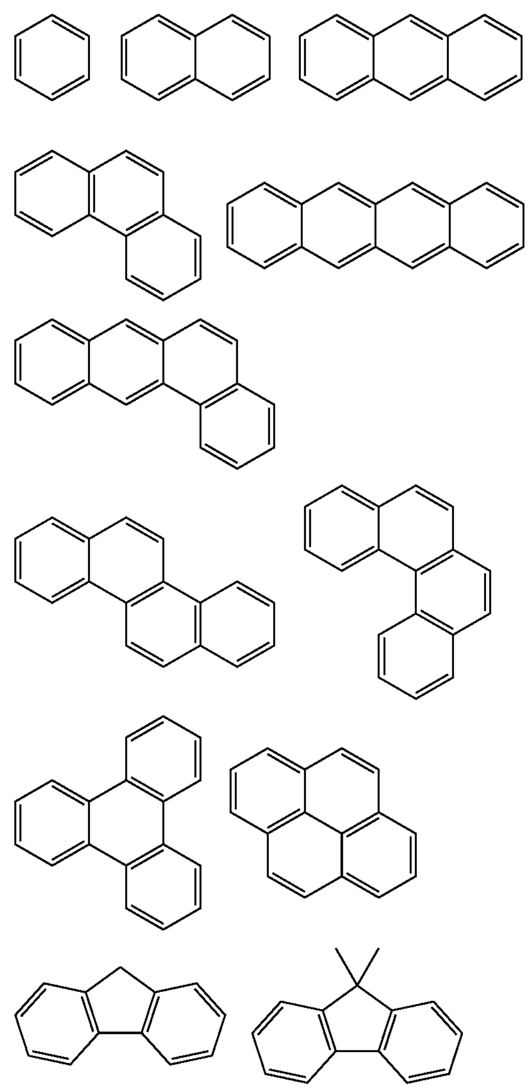

-continued
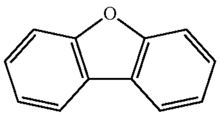
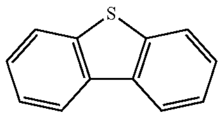
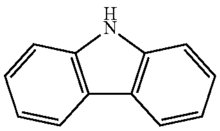
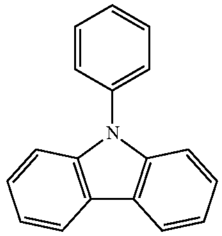
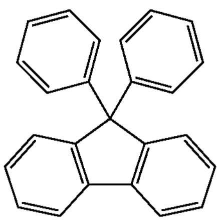
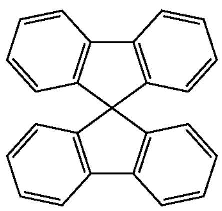
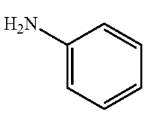
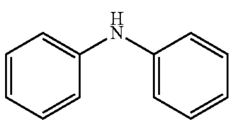
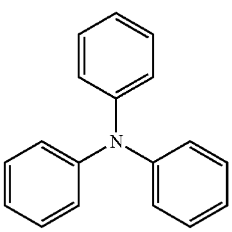
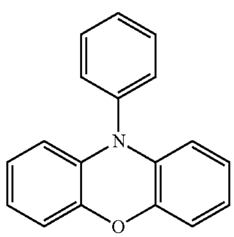
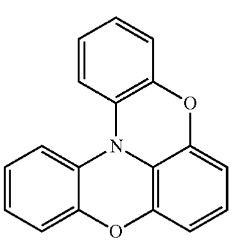
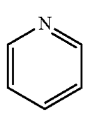
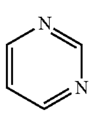
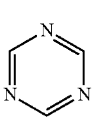
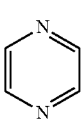
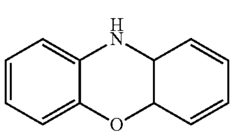
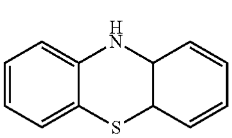
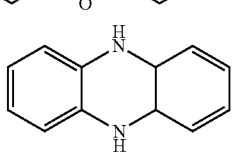
-continued
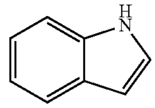
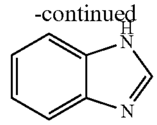
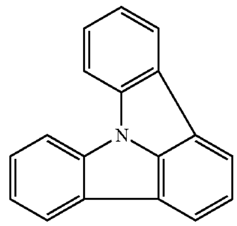
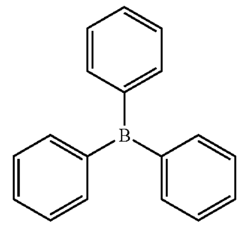
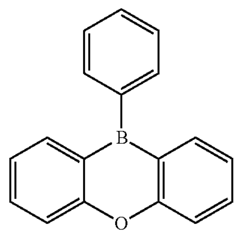
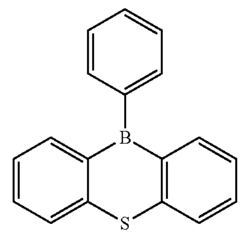
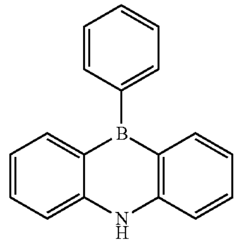
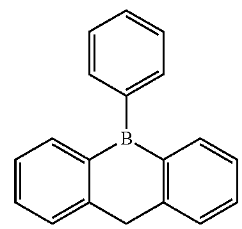
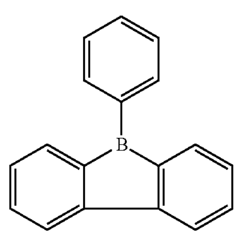
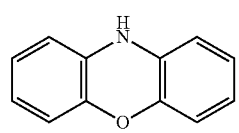
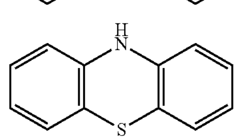
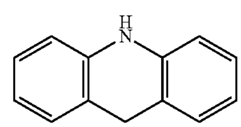
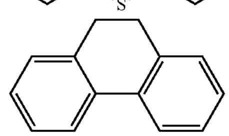
More specifically, examples of MU include divalent groups represented by any one of the following formulas (MU-1-1) to (MU-1-12), (MU-2-1) to (MU-2-202), (MU-3-1) to (MU-3-201), (MU-4-1) to (MU-4-122), (MU-5-1) to (MU-5-12), (MU-6-1) to (MU-6-4), (MU-7-1) to (MU-7-4), (MU-7-31) to (MU-7-38), (MU-8-1) to (MU-8-2), and (MU-9-1) to (MU-9-4).

(MU-1-1)
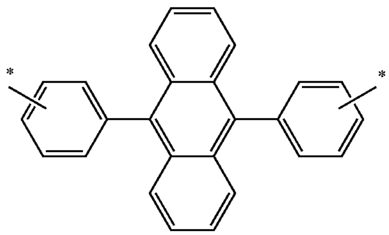
(MU-1-2)
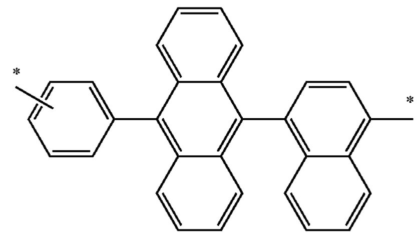
(MU-1-3)
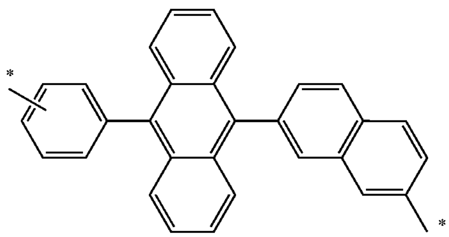
(MU-1-4)
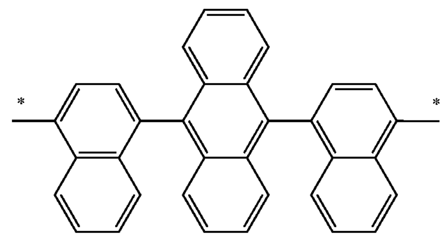
(MU-1-5)
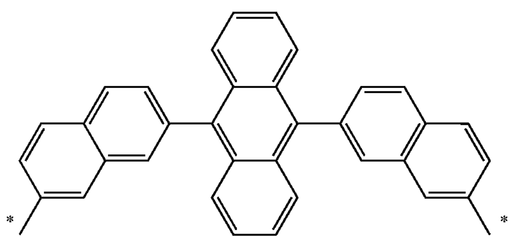
(MU-1-6)
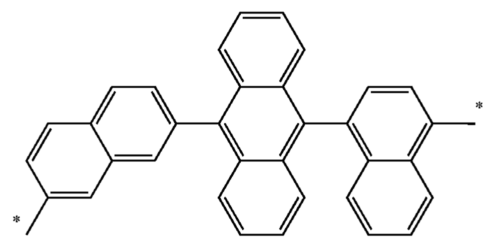
(MU-1-11)
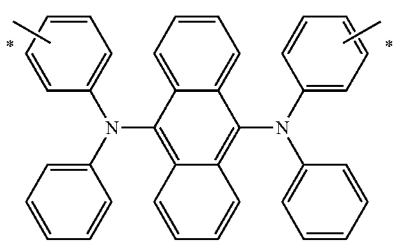
(MU-1-12)
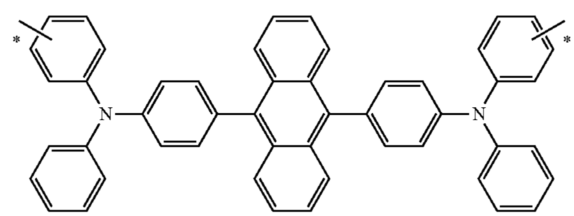
(MU-2-1)
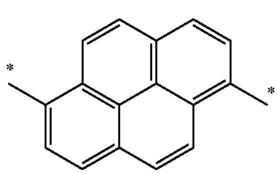
(MU-2-2)
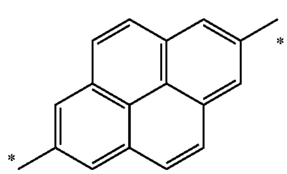
(MU-2-3)
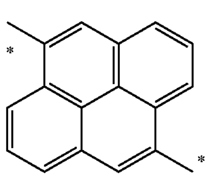
(MU-2-4)
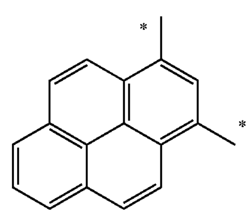

-continued
(MU-2-5)
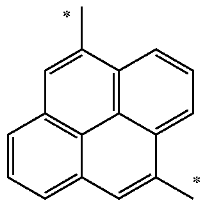
(MU-2-11)
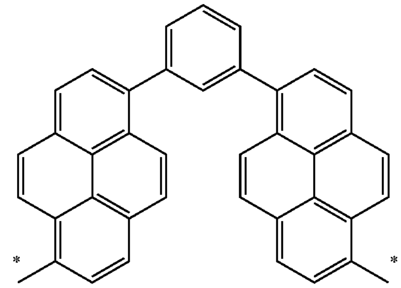
(MU-2-12)
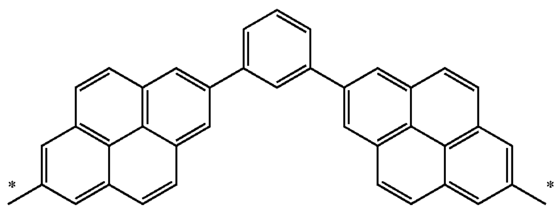
(MU-2-101)
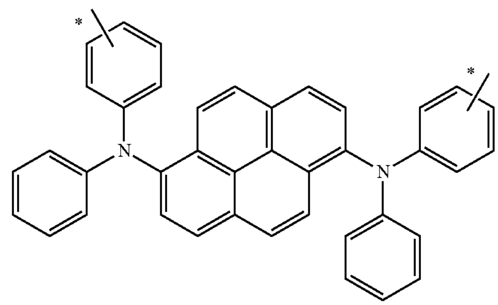
(MU-2-102)
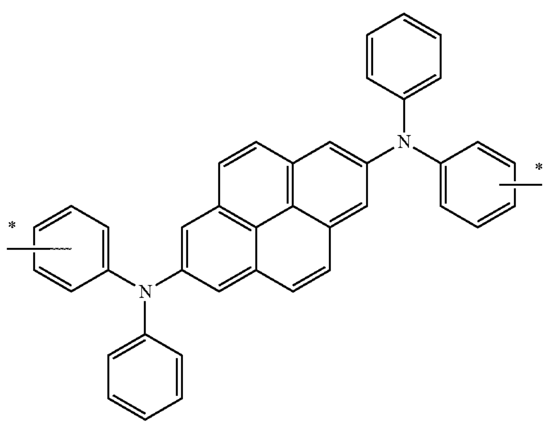
(MU-2-201)
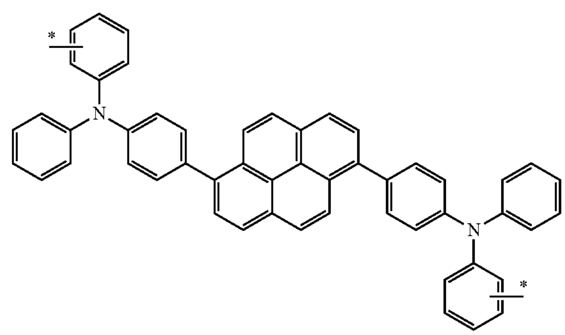
(MU-2-202)
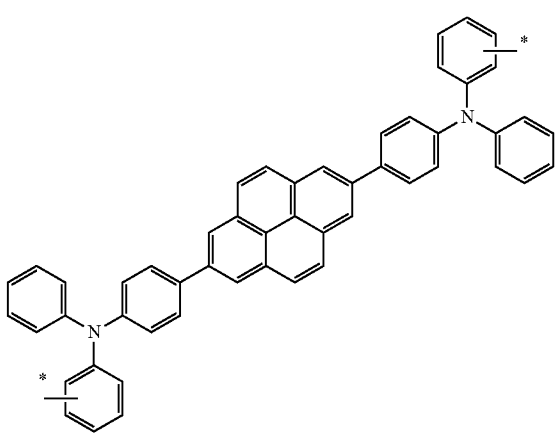
(MU-3-1)
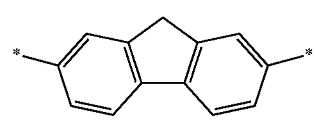

-continued
(MU-3-2)
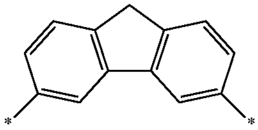
(MU-3-11)
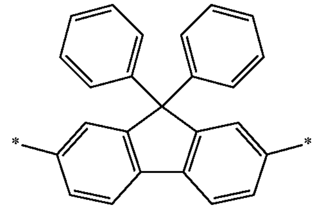
(MU-3-12)
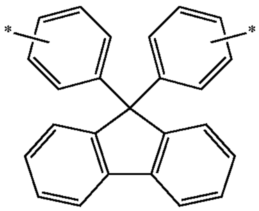
(MU-3-21)
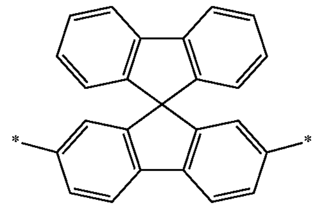
(MU-3-22)
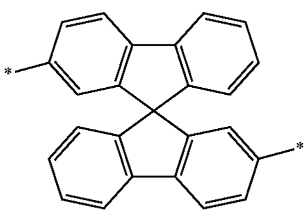
(MU-3-101)
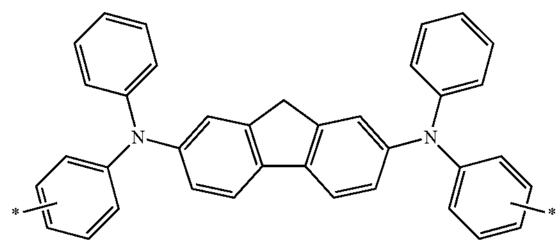
(MU-3-102)
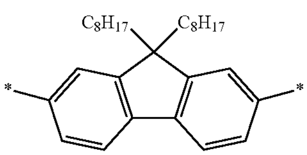
(MU-3-111)
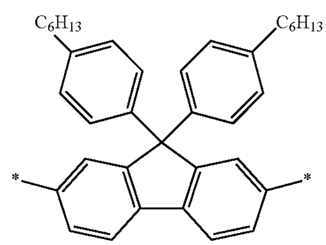
(MU-3-112)
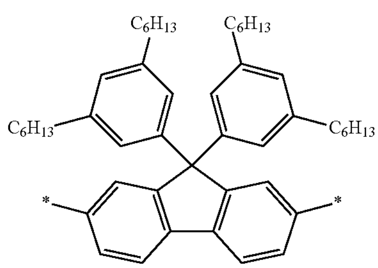
(MU-3-201)
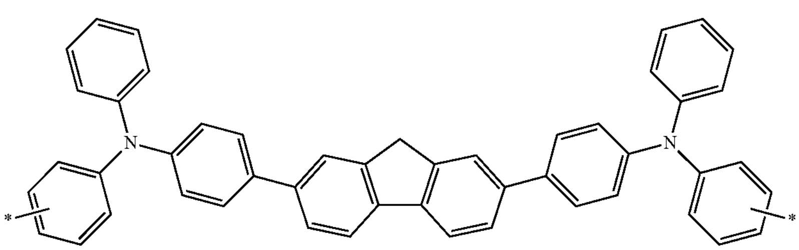

-continued
(MU-4-1)
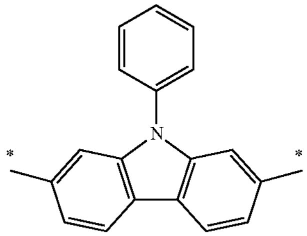
(MU-4-2)
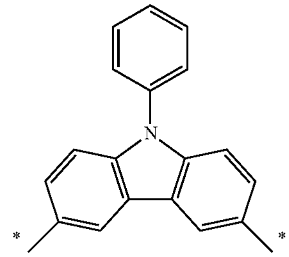
(MU-4-11)
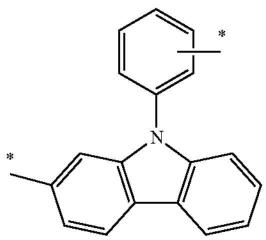
(MU-4-12)
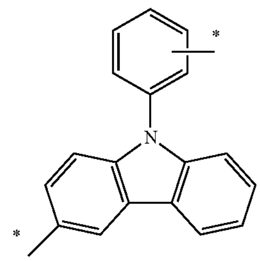
(MU-4-101)
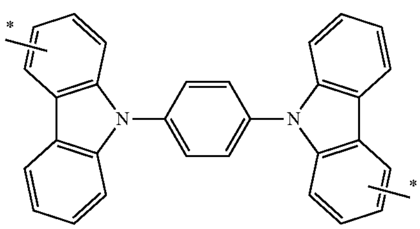
(MU-4-102)
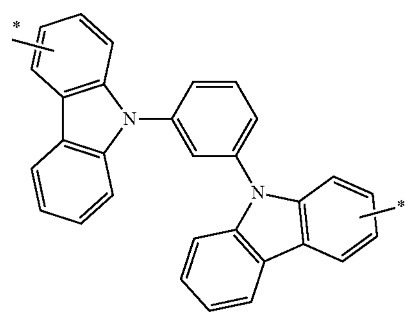
(MU-4-121)
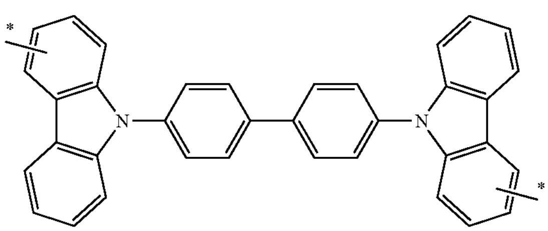
(MU-4-122)
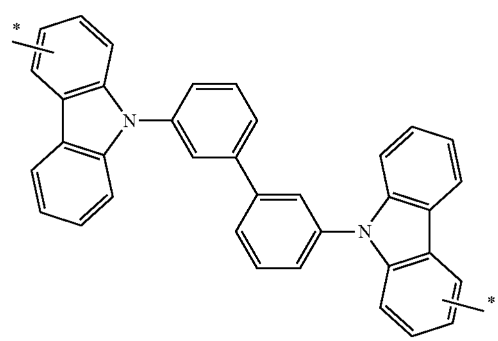
(MU-5-1)
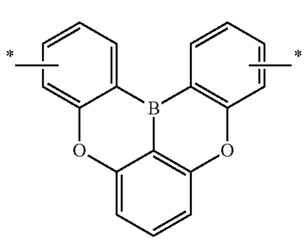
(MU-5-2)
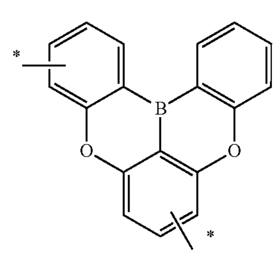

-continued
(MU-5-11)
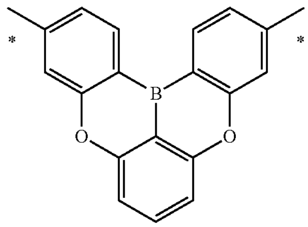
(MU-5-12)
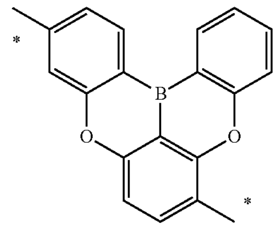
(MU-6-1)
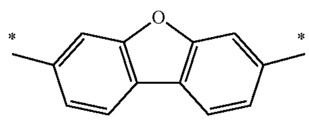
(MU-6-2)
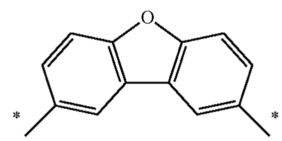
(MU-6-3)
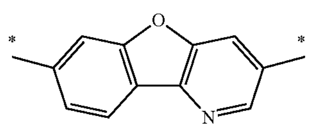
(MU-6-4)
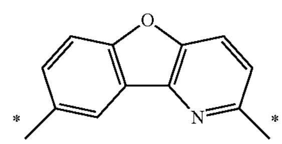
(MU-7-1)
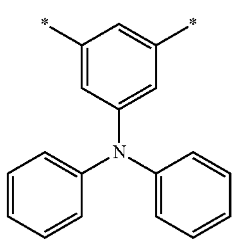
(MU-7-2)
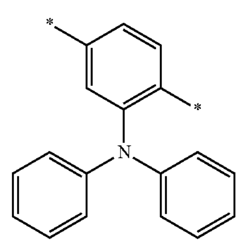
(MU-7-3)
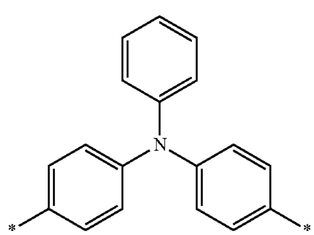
(MU-7-4)
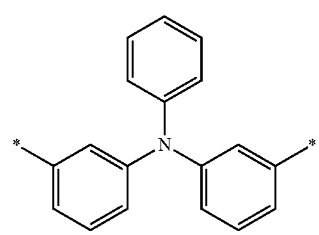
(MU-7-31)
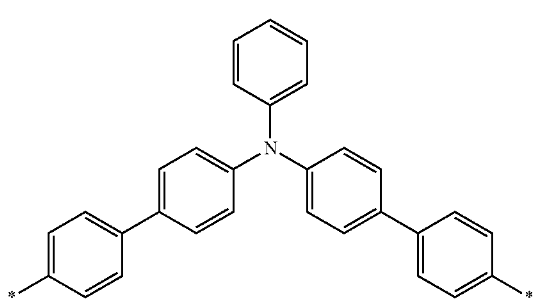
(MU-7-32)
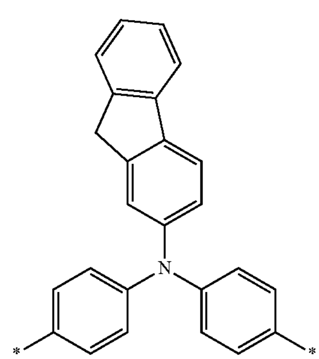

-continued
(MU-7-33)
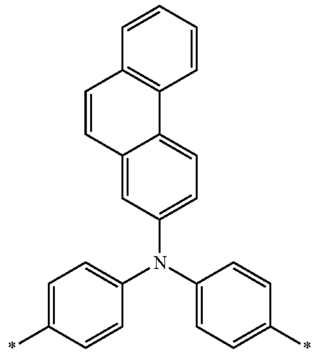
(MU-7-34)
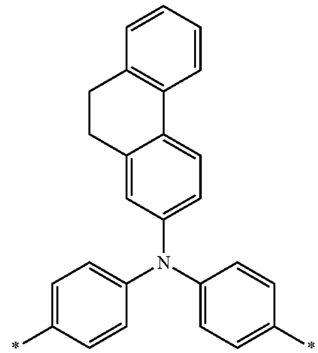
(MU-7-35)
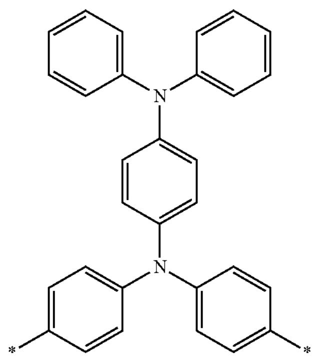
(MU-7-36)
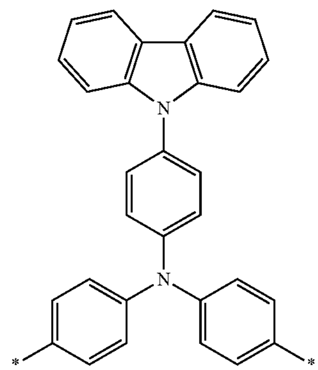
(MU-7-37)
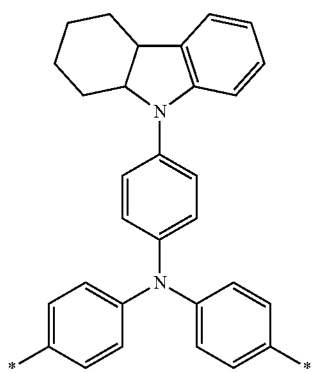
(MU-7-38)
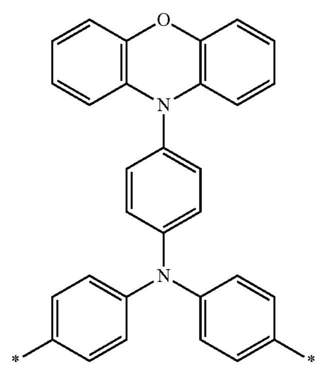
(MU-8-1)
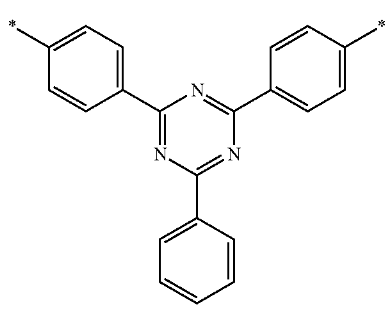
(MU-8-2)
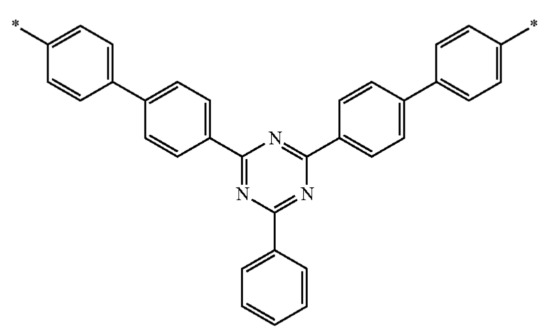

-continued
(MU-8-3)
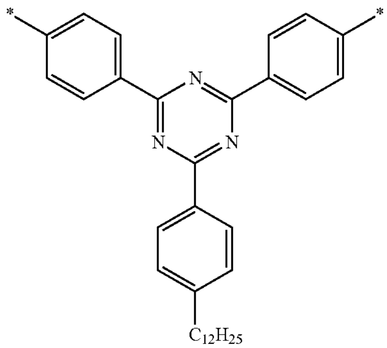
(MU-9-1)
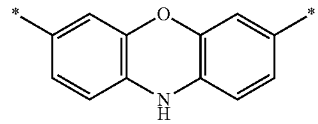
(MU-9-2)
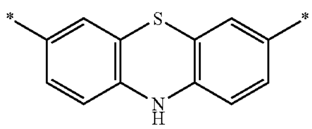
(MU-9-3)
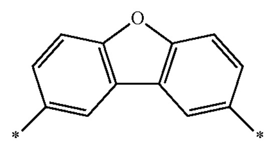
(MU-9-4)
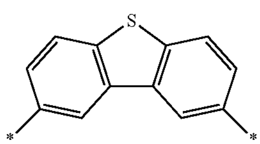
Further, examples of EC include groups represented by the following formulas (EC-1) to (EC-29). In formulas (EC-1) to (EC-29), MU binds to MU or EC at * and EC binds to MU at *.
(EC-1)
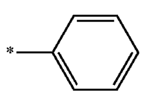
(EC-2)
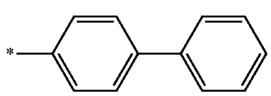
(EC-3)
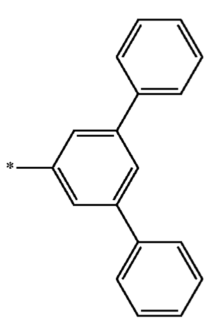
(EC-4)
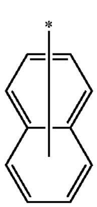
-continued
(EC-5)
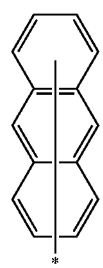
(EC-6)
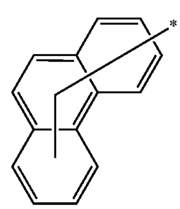
(EC-7)
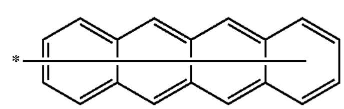
(EC-8)
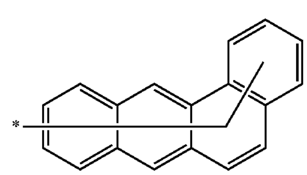

-continued (EC-9)

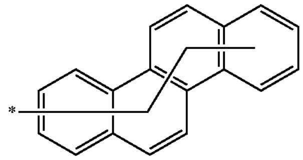

(EC-10)

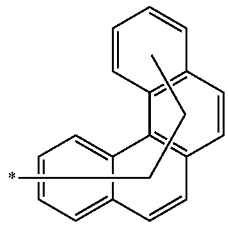

(EC-11)

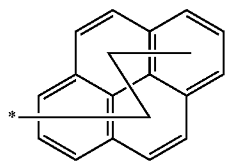

(EC-21)

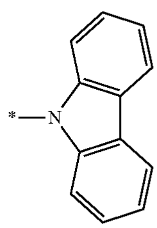

(EC-22)

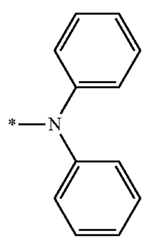

(EC-23)

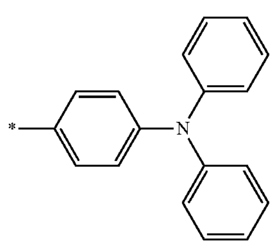

(EC-24)

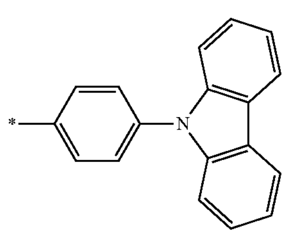

-continued (EC-25)

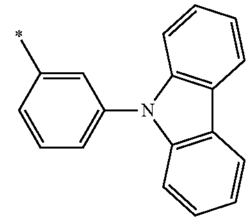

(EC-26)

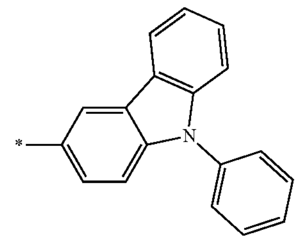

(EC-27)

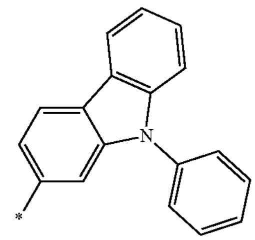

(EC-28)

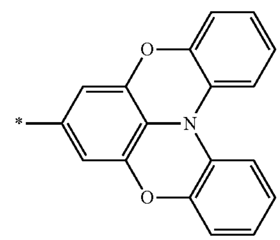

(EC-29)

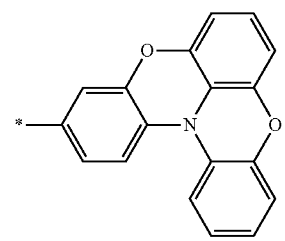

From the viewpoint of solubility and the application film formability, the compound represented by Formula (SPH-1) preferably contains 10% to 100%, with respect to the total number (n) of the MUs in a molecule, MUs having $C_{1-24}$ alkyl, more preferably contains 30% to 100%, with respect to the total number (n) of the MUs in a molecule, MUs having $C_{1-18}$ alkyl ($C_{3-18}$ branched alkyl), and still more preferably contains 50% to 100%, with respect to the total number (n) of the MUs in a molecule, MUs having $C_{1-12}$ alkyl ($C_{3-12}$ branched alkyl). Meanwhile, from the viewpoint of the in-plane orientation and the charge transfer, the compound represented by Formula (SPH-1) preferably contains 10% to 100%, with respect to the total number (n) of the MUs in a molecule. MUs having $C_{7-24}$ alkyl and more preferably contains 30% to 100%, with respect to the total number (n) of the MUs in a molecule, MUs having $C_{7-24}$ alkyl ($C_{7-24}$ branched alkyl).

Method for Producing Compound Represented by Formula (SPH-1) or Formula (XLP-1)

A compound represented by Formula (SPH-1) and a compound represented by Formula (XLP-1) as described below may be synthesized by suitably combining some known production methods.

Examples of solvents that may be used in the reaction include aromatic solvents, saturated/unsaturated hydrocarbon solvents, alcohol solvents, ether solvents, and the like. For example, dimethoxyethane, 2-(2-methoxyethoxy)ethane, 2-(2-ethoxyethoxy)ethane, or the like may be mentioned as examples thereof.

The reaction may be performed in a two-phase system. When the reaction is performed in a two-phase system, a phase-transfer catalyst such as a quaternary ammonium salt may be optionally added.

The compounds represented by Formula (SPH-1) and Formula (XLP-1) each may be produced in a single step or may be produced through multi-steps. In addition, the production may be performed by a batch polymerization method in which a reaction is started after all raw materials are charged in a reaction vessel, or may be performed by a dropping polymerization method in which a raw material is added dropwise in a reaction vessel, or may be performed by a precipitation polymerization method in which a product precipitates as the reaction proceeds, or may be performed by appropriately combining these polymerization methods. For example, when a compound represented by Formula (SPH-1) is synthesized in a single step, the reaction is performed in a state where a monomer unit (MU) and an end-capping unit (EC) are put in a reaction vessel, thereby obtaining an object product. Alternatively, when a compound represented by Formula (SPH-1) is synthesized in multi-steps, a monomer unit (MU) is first polymerized to a target molecular weight, and then an end-capping unit (EC) is added thereto to cause a reaction, thereby obtaining an object product. When different types of monomer units (MUs) are added, and reactions are performed in multi-steps, a polymer having a concentration gradient with respect to monomer unit structures may be obtained. Alternatively, an object product may be obtained by first preparing a precursor polymer and then performing a subsequent reaction.

The primary structure or a polymer may be controlled by selecting a polymerizable group in the monomer unit (MU). For example, a polymer having a random primary structure (1 in Synthetic Scheme (20)) and a polymer having a regular primary structure (2 and 3 in Synthetic Scheme (20)) can be synthesized as illustrated in 1 to 3 of Synthetic Scheme (20), which may be used in an appropriate combination according to the object product.

Synthetic Scheme (20)

MU = a, b
Polymerizable group = x, y (x and y respectively couple)

1) A polymer synthesized by using two types of monomers (x-a-y) and (x-b-y)

n x—a—y + n x—b—y ⟶ ----a—b—a—a—b—b----

A polymer in which a and b are randomly linked is synthesized.

2) A polymer synthesized by using two types of monomers (x-a-x) and (y-b-y)

n x—a—x + n y—b—y ⟶ ----a—b—a—b—a—b----

A polymer in which a and b are alternately linked is synthesized.

-continued

3) A polymer synthesized by using two types of monomers (x-a-y) and (x-b-y)

n x—a—y + n y—b—y ⟶ ----a—a—b—a—b—a----

A polymer in which bs are not adjacent to each other is synthesized.

A monomer unit usable in the present invention may be synthesized by a method disclosed in Japanese Patent Application Publication No. 2010-189630, WO 2012/086671, WO 2013/191088, WO 2002/045184, WO 2011/049241, WO 2013/146806, WO 2005/049546, WO 2015/145871, Japanese Patent Application Publication No. 2010-215886, Japanese Patent Application Publication No. 2008-106241, Japanese Patent Application Publication No. 2010-215886, WO 2016/031639, Japanese Patent Application Publication No. 2011-174062, WO 2016/031639, WO 2016/031639, or WO 2002/045184.

Specific procedures of polymer synthesis may include synthesis conforming to a method disclosed in Japanese Patent Application Publication No. 2012-036388, WO 2015/008851, Japanese Patent Application Publication No. 2012-36381, Japanese Patent Application Publication No. 2012-144722, WO 2015/194448, WO 2013/146806, WO 2015/145871, WO 2016/031639, WO 2016/125560, WO 2016/031639, WO 2016/031639, WO 2016/125560, WO 2015/145871, WO 2011/049241, or Japanese Patent Application Publication No. 2012-144722

[Assisting Dopant]

The light-emitting layer may contain an assisting dopant that assists light emission. Particularly, it is preferred that the polycyclic aromatic compound of the present invention containing a boron atom in a molecule is made to function as an emitting dopant in a light-emitting layer, and an assisting dopant is used together.

As the assisting dopant, "thermally assisting delayed fluorescent material" (TADF compound) may be preferably used.

A preferable TADF compound used as the assisting dopant has an energy difference (ΔE(ST)) between the singlet energy ($S^1$) and the triplet energy ($T^1$) of 0.2 eV or less (Hiroki Uoyama, Kenichi Goushi, Katsuyuki Shizu, Hiroko Nomura, Chihaya Adachi, Nature, 492, 234-238 (2012)). The energy difference (ΔE(ST)) is more preferably 0.15 eV or less, more preferably 0.10 eV or less, and particularly preferably 0.08 eV or less.

As the TADF compound used as the assisting dopant, a D-A type TADF compound is preferred. A D-A type TADF compound is a TADF compound designed such that the HOMO (Highest Occupied Molecular Orbital) and the LUMO (Lowest Unoccupied Molecular Orbital) in a molecule are localized using an electron-donating substituent, which is called a donor, and an electron-accepting substituent, which is called an acceptor, and efficient reverse intersystem crossing is caused.

Here, in the present description, the "electron-donating substituent" (donor) means a substituent and a partial structure in which a LUMO orbital in a TADF compound molecule is localized, and the "electronic-accepting substituent" (acceptor) means a substituent and a partial structure in which a HOMO orbital in a TADF compound molecule is localized.

Generally, a D-A type TADF compound has a large spin orbital bond (SOC: Spin Orbit Coupling) due to the structure thereof, shows low exchange interaction between the HOMO and the LUMO, and has a small ΔE(ST) Thus, a very large inverse intersystem crossing rate can be achieved. Meanwhile, a D-A type TADF compound shows large structural relaxation in an excited state (since a stable structure in a ground state differs from that in an excited state in a certain molecule, when a conversion from a ground state to an excited state by stimulation from the exterior occurs, the structure thereafter changes into a stable structure in an excited state) and shows a wide light emission spectrum Thus, a D-A type TADF compound may deteriorate the color purity when used as a light-emitting material. However, by using a D-A type TADF compound as an assisting dopant, and under the presence of this D-A type TADF compound, using the polycyclic aromatic compound of the present invention as an emitting dopant, a high energy transfer efficiency from the assisting dopant to the emitting dopant, an appropriate light-emission wavelength and an appropriate half width of a light emission spectrum (a spectrum with a narrow half width and good color), a high color purity, a high element efficiency and a small roll-off, and a long lifetime can be achieved.

As the D-A type TADF compound, a compound in which a donor and an acceptor bind to each other directly or via a spacer can be used, for example. As the donor-type structure and the acceptor-like structure for use in the thermally assisting delayed fluorescent material in the present invention, for example, the structures described in Chemistry of Materials, 2017, 29, 1946-1963 are also usable. The donor-type structure includes carbazole, dimethylcarbazole, di-tert-butylcarbazole, dimethoxycarbazole, tetramethylcarbazole, benzofluorocarbazole, benzothienocarbazole, phenyldihvdroindolocarbazole, phenylbicarbazole, bicarbazole, tercarbazole, diphenylcarbazolylamine, tetraphenylcarbazolyldiamine, phenoxazine, dihydrophenazine, phenothiazine, dimethyldihydroacridine, diphenylamine, bis(tert-butylphenyl)amine, (diphenylamino)phenyl)diphenylbenzenediamine, dimethyltetraphenyldihydroacridinediamine, tetramethyl-dihydro-indenoacridine and diphenyl-dihydrodibenzazaserine. The acceptor-type structure includes sulfonyldibenzene, benzophenone, phenylenebis(phenylmethanone), benzonitrile, isonicotinonitrile, phthalonitrile, isophthalonitrile, paraphthalonitrile, benzenetricarbonitrile, triazole, oxazole, thiadiazole, benzothiazole, benzobis(thiazole), benzoxazole, benzobis(oxazole), quinoline, benzimidazole, dibenzoquinoxaline, heptaazaphenalene, thioxanthone dioxide, dimethylanthrazene, anthracenedione, cycloheptabipyridine, fluorenedicarbonitrile, triphenyltriazine, pyrazinecarbonitrile, pyrimidine, phenylpyrimidine, methylpyrimidine, pyridinedicarbonitrile, dibenzoquinoxalinedicarbonitrile, bis(phenylsulfonyl)benzene, dimethylthioxanthone dioxide, thianthrene tetroxide and tris(dimethylphenyl)borane. In particular, the thermally assisting delayed fluorescent compound is preferably a compound having, as a partial structure, at least one of carbazole, phenoxazine, acridine, triazine, pyrimidine, pyrazine, thioxanthene, benzonitrile, phthalonitrile, isophthalonitrile, diphenyl sulfone, triazole, oxadiazole, thiadiazole and benzophenone.

The compound for use as the assisting dopant in the light-emitting layer is preferably a compound whose emission spectrum overlaps at least partly with the absorption peak of an emitting dopant. Hereinafter, compounds that can be used as an assisting dopant will be exemplified. However, the compounds that can be used as assisting dopants in the present invention are not limitedly interpreted by the following exemplary compounds. In the following formulae, Me represents a methyl, tBu represents a t-butyl, Ph represents a phenyl, and the wavy line indicates a bonding position.

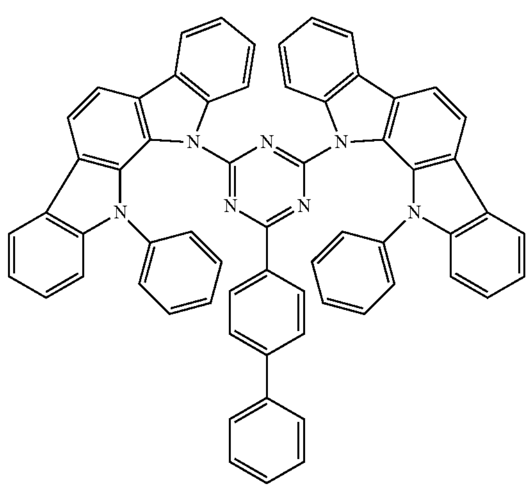

PIC-TRZ

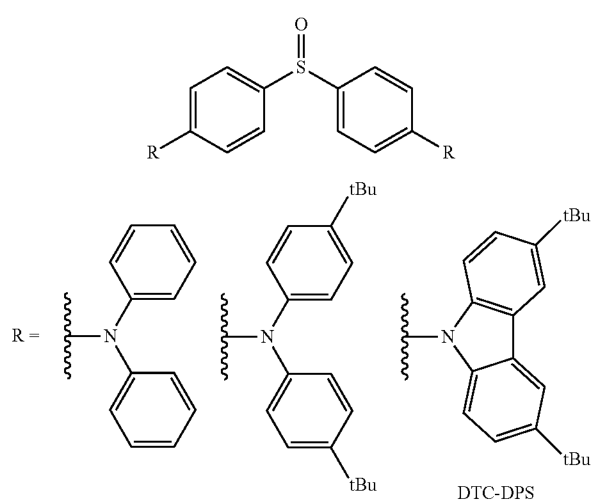

DTC-DPS

-continued
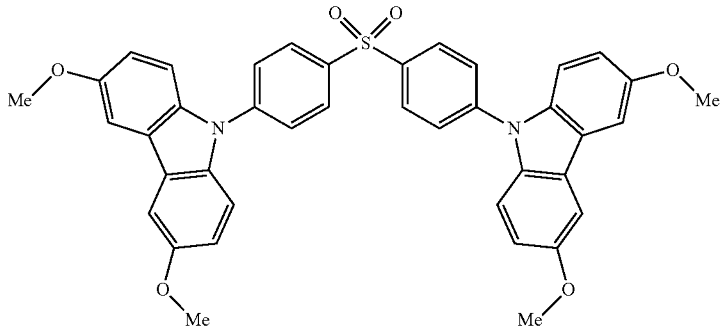
DMOC-DPS
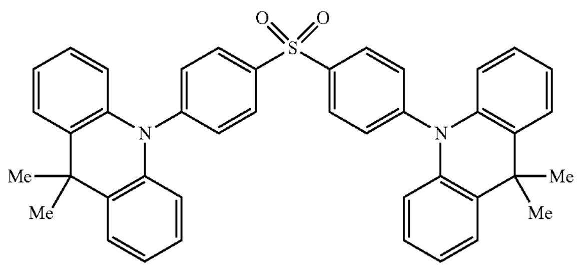
DMAC-DPS
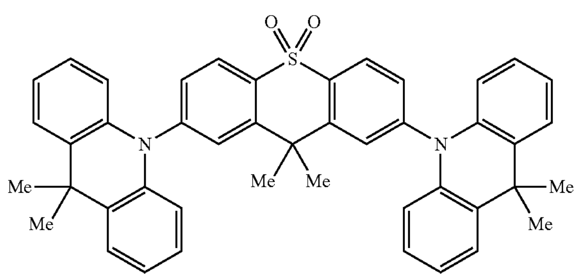
DMTDAc
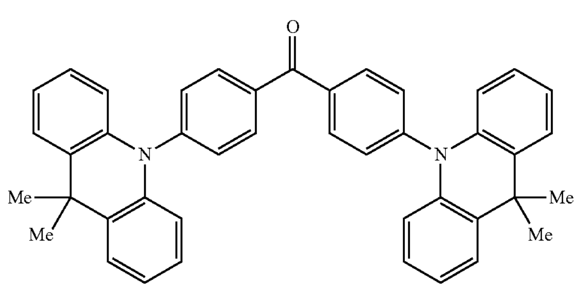
DMAC-BP -continued
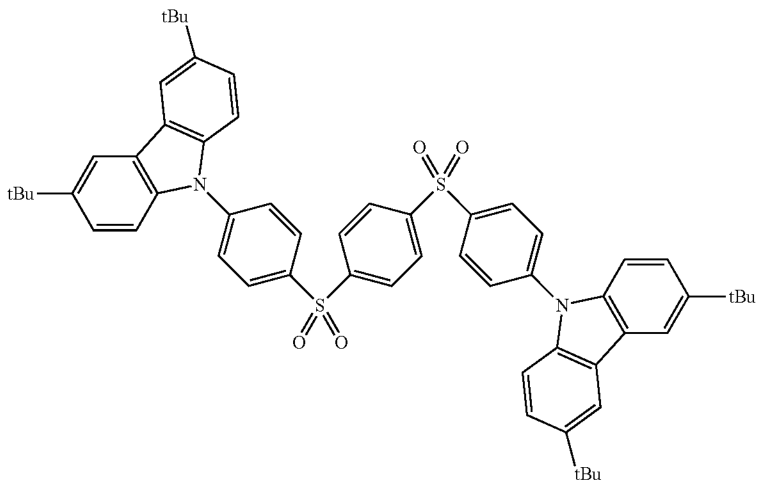
DTC-pBPSB
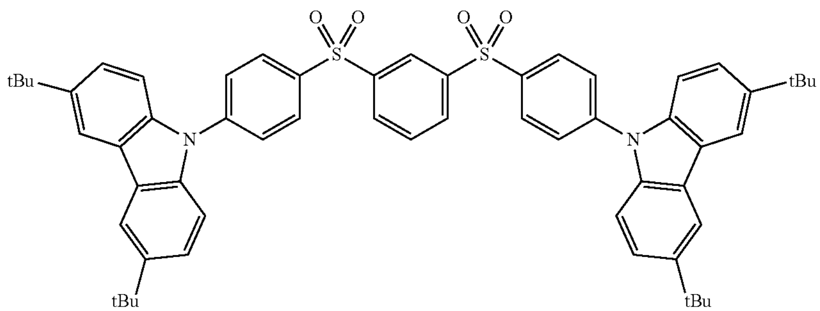
DTC-mBPSB
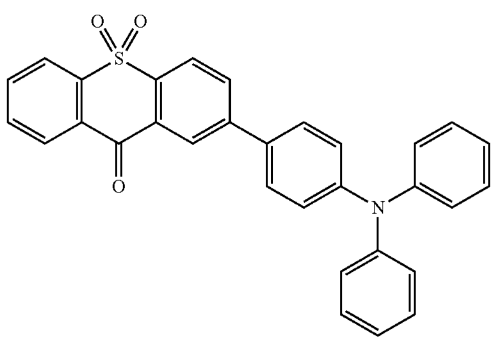
TXO-TPA
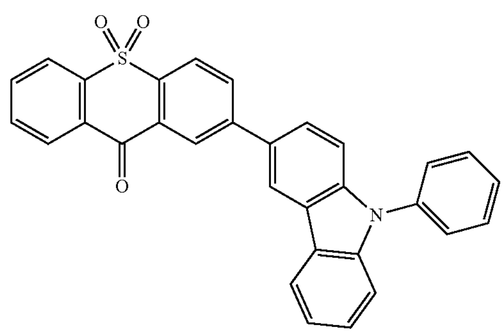
TXO-PhCz
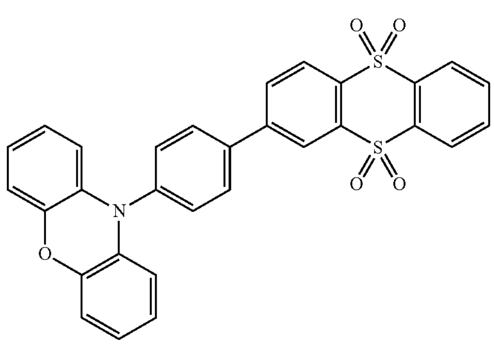
PXZD SO2
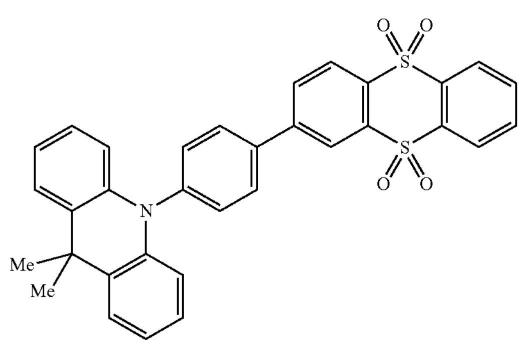
ACRD SO2

-continued
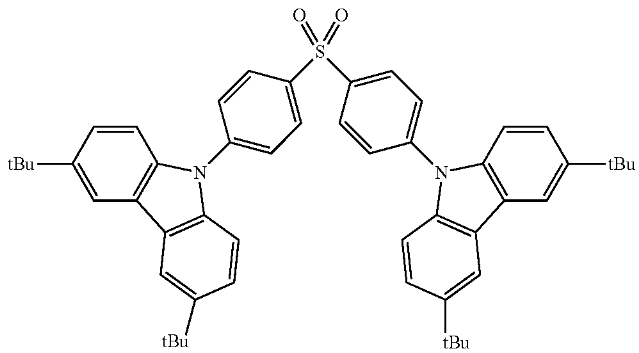
DTC-DBT
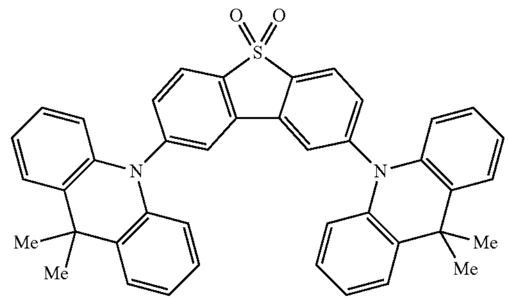
DTAO
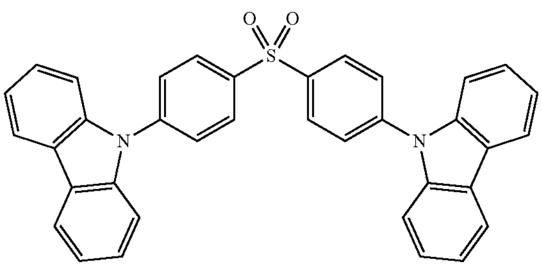
Cz2BP
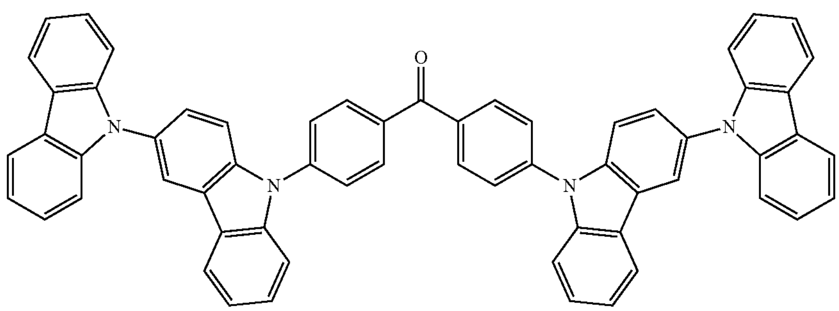
CC2BP
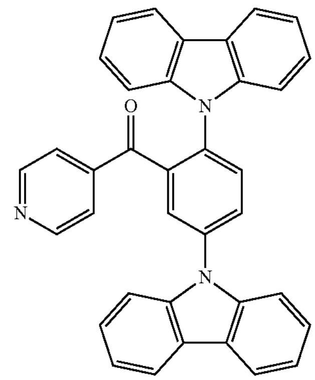
DCBPy
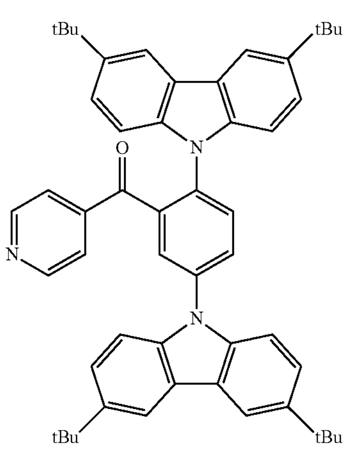
DTCBPy
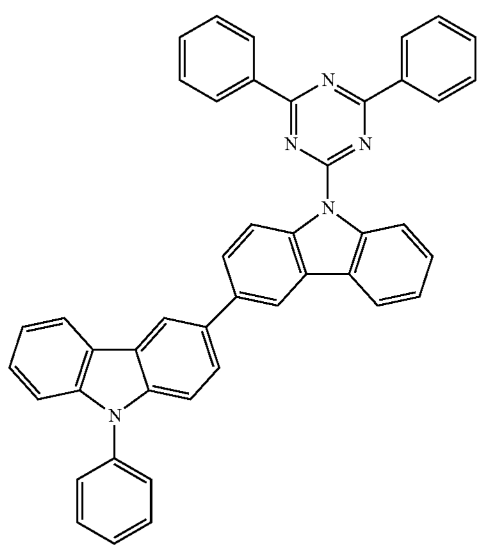
CzT -continued
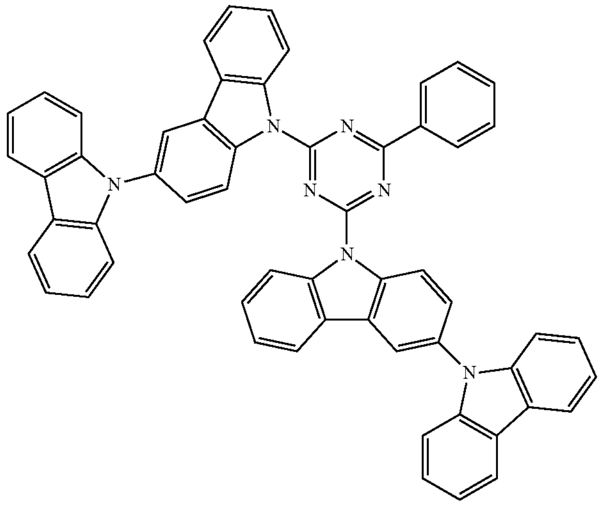
CC2TA
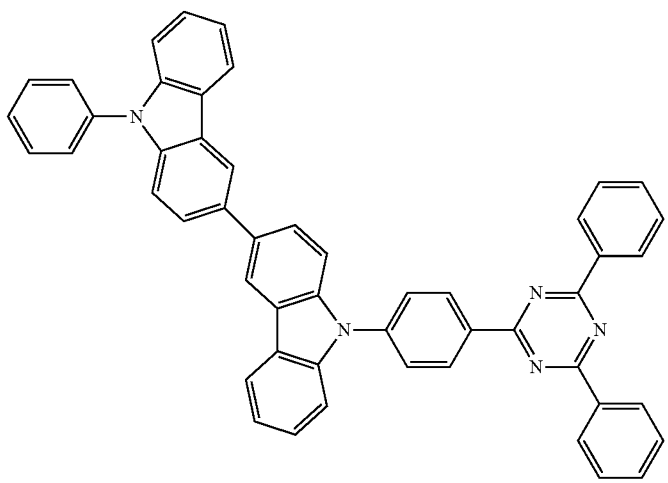
BCzT
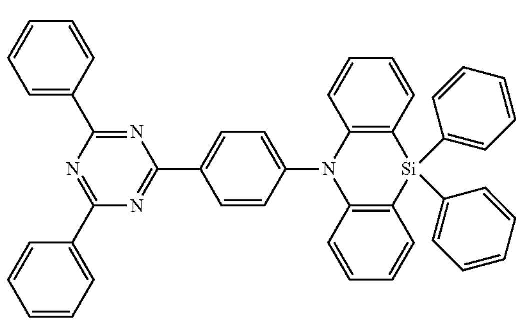
DTPDDA
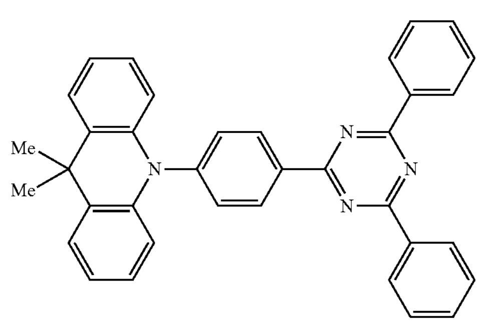
DMAC-TRZ -continued
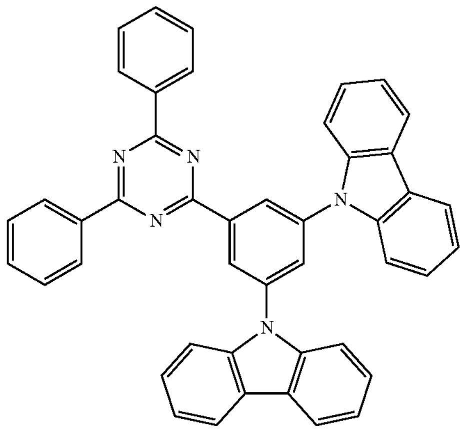
DCzTrz
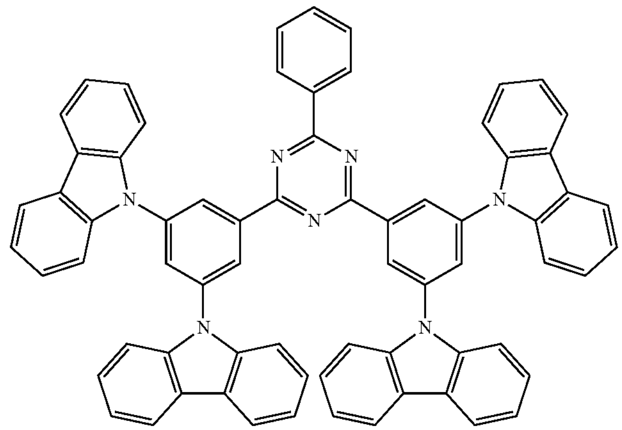
DDCzTrz
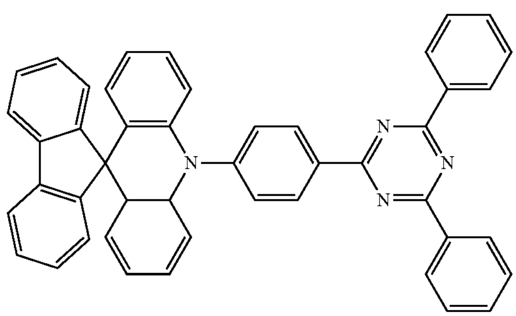
spiroAC-TRZ
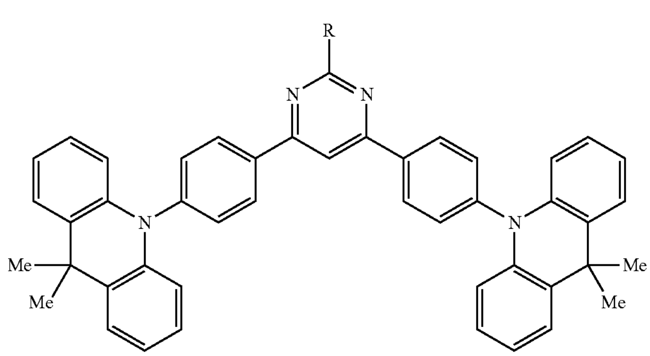
R = H, Ac-HPM
R = Ph, Ac-PPM
R = Me Ac-MPM -continued
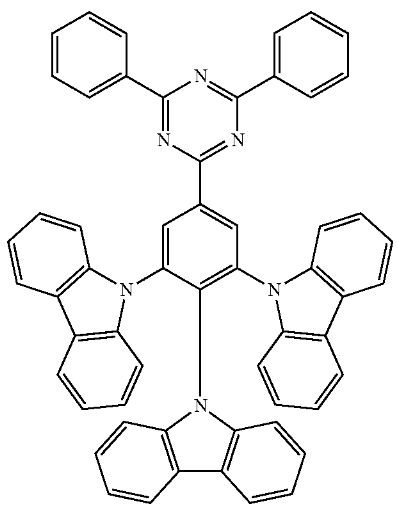
TCzTrz
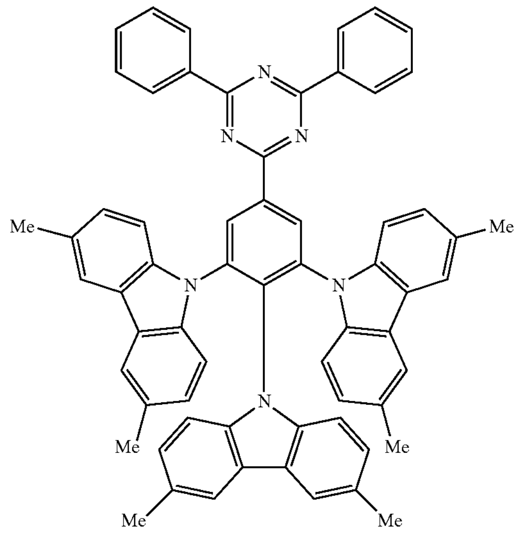
TmCzTrz
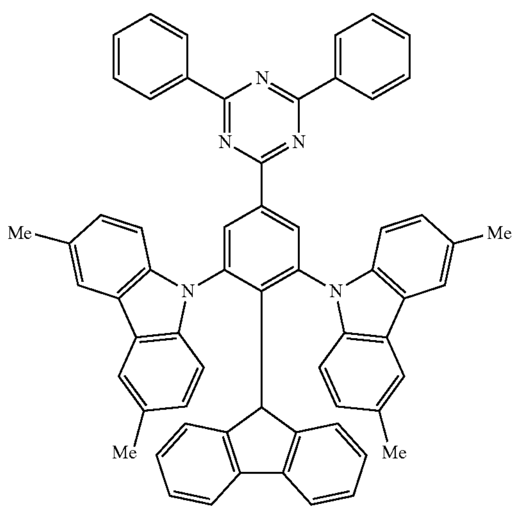
DCzmCzTrz
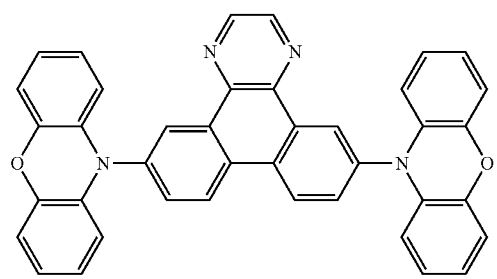
ATP-PXZ
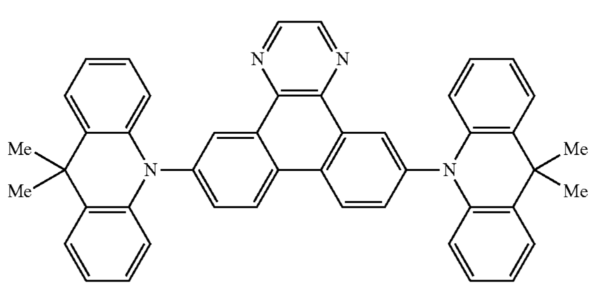
ATP-ACR
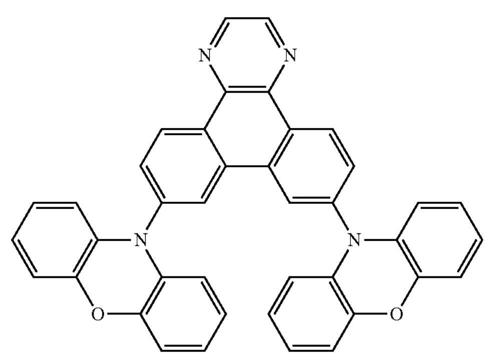
m-ATP-PXZ -continued
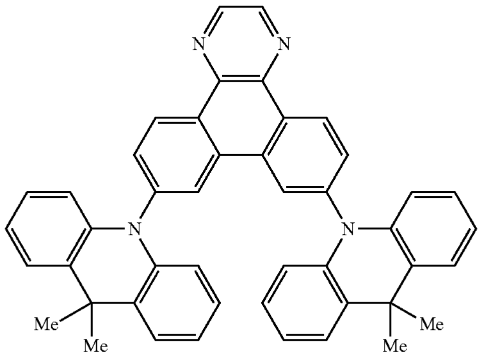
m-ATP-ACR
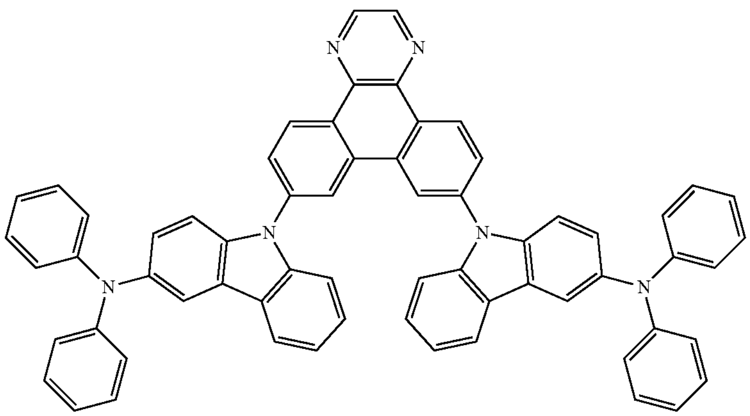
m-ATP-CDP
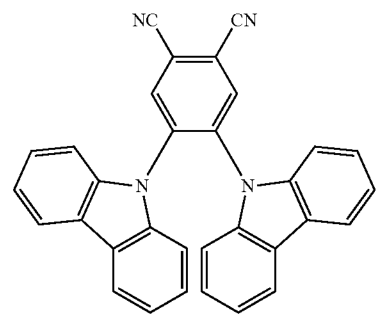
2CzPN
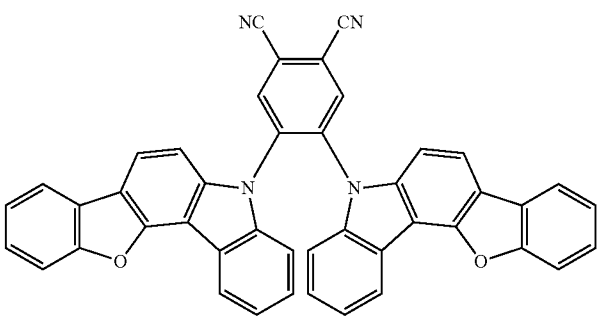
BFCz-2CN
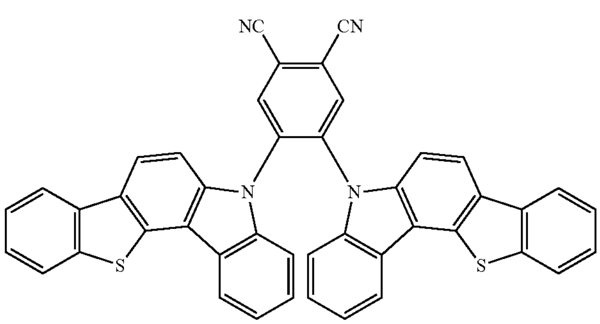
BTCz-2CN -continued
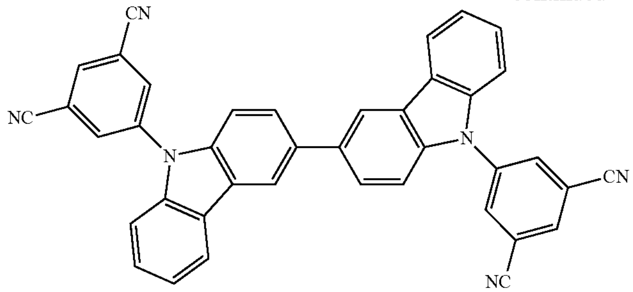
35IPNDCz
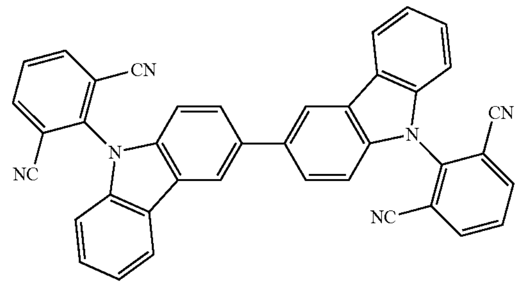
26IPNDCz
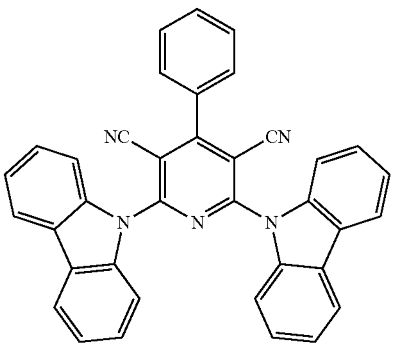
CPC
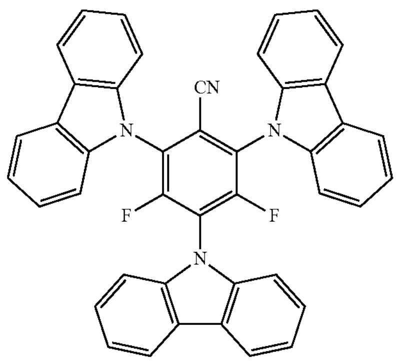
3CzFCN
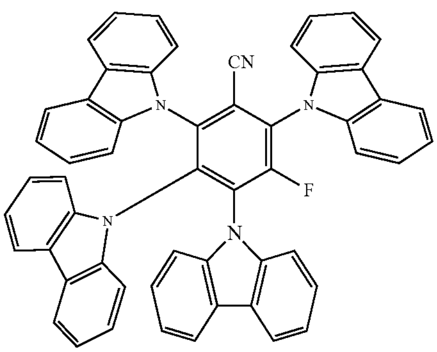
4CzFCN
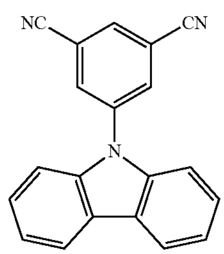
DCN1
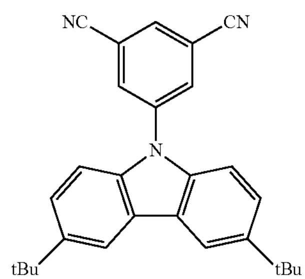
DCN2
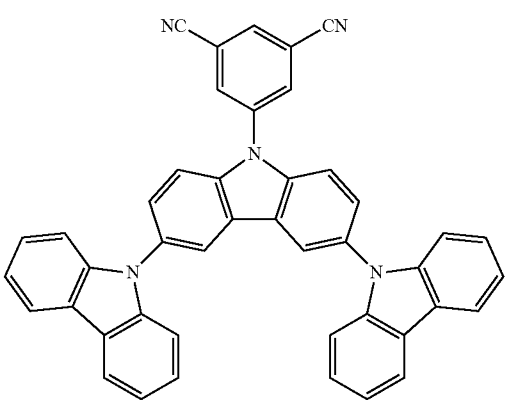
DCN3
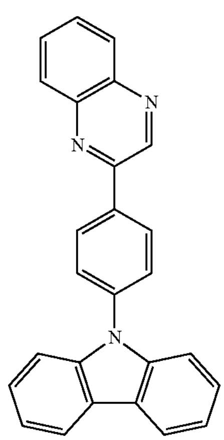
CZQ -continued
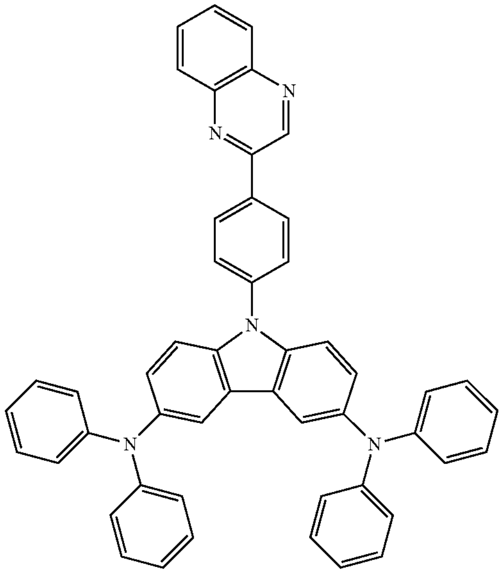
DACQ
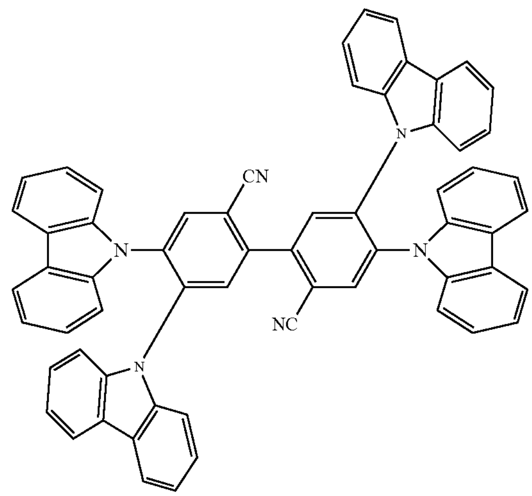
CNBPCz
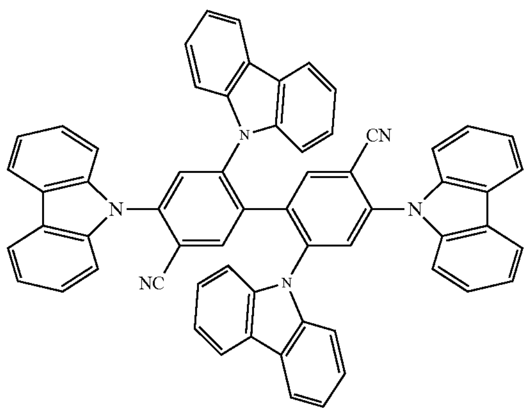
CzBPCN
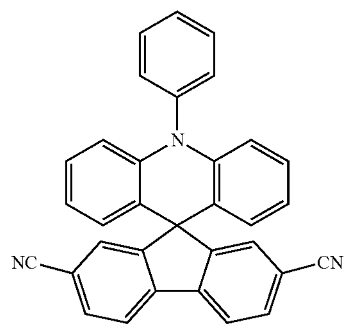
ACRFLCN
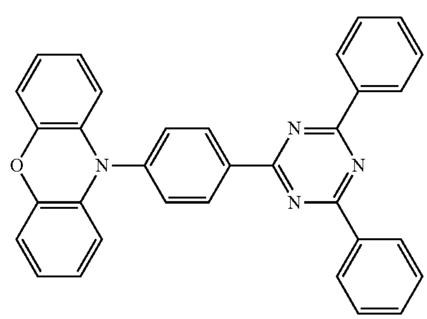
PXZ-TRZ
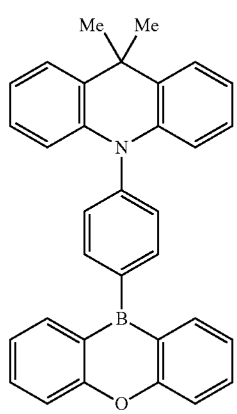
DMAC-PXB
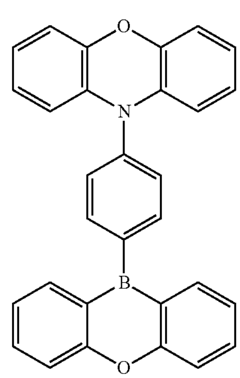
PXZ-PXB -continued
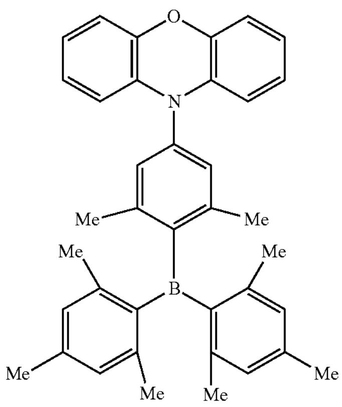
PXZ-Mes$_3$B
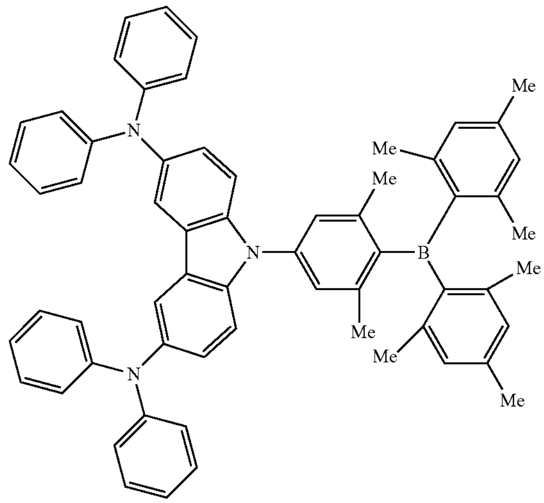
2DAC-Mes$_3$B
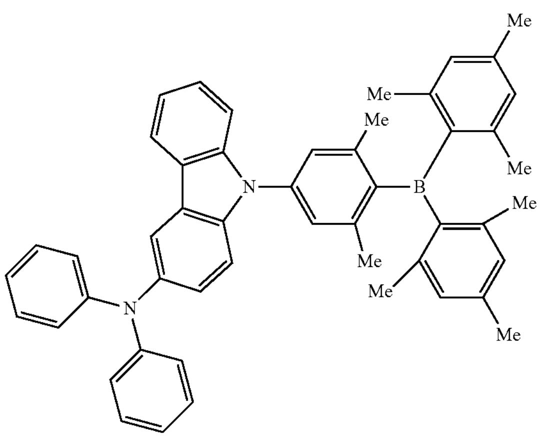
DAC-Mes$_3$B
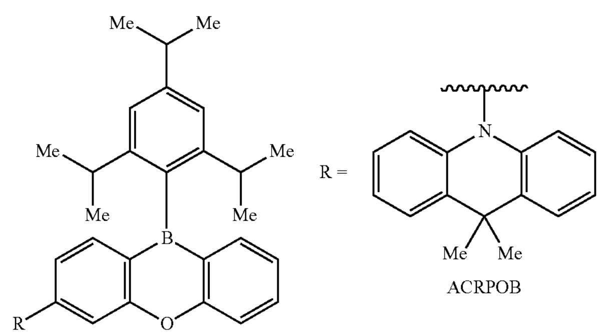
ACRPOB
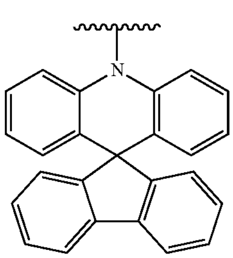
SFDPAPOB
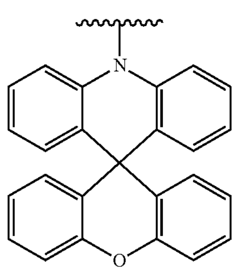
SXDPAPOB
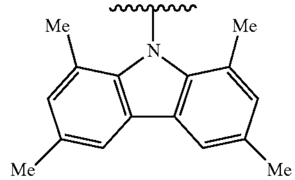
TMCPOB
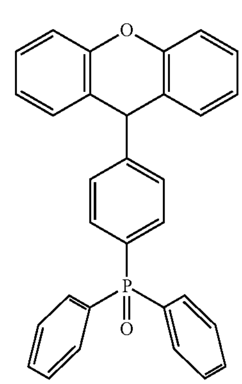
PXZPO -continued
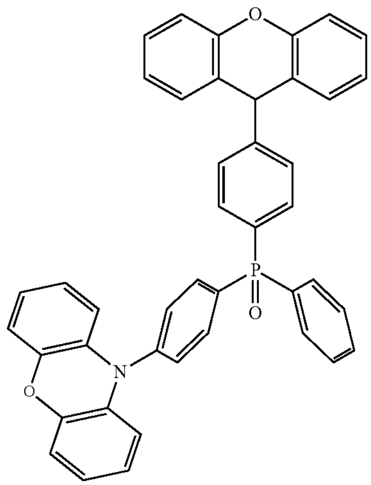
DPXZPO
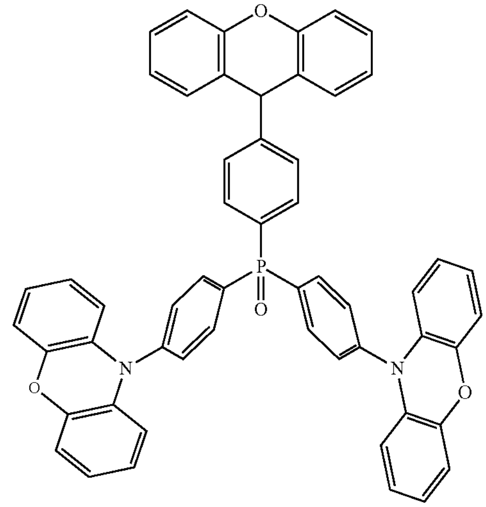
TPXZPO
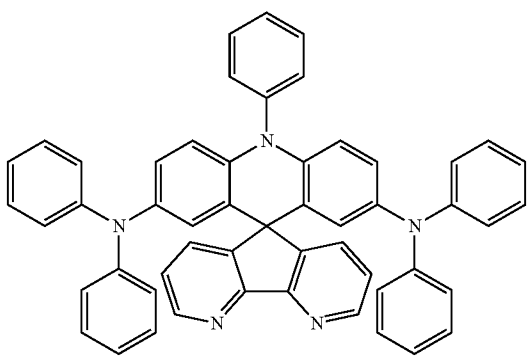
DPAA-AF
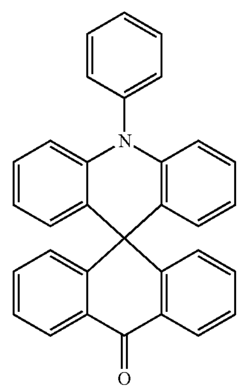
ACRSA
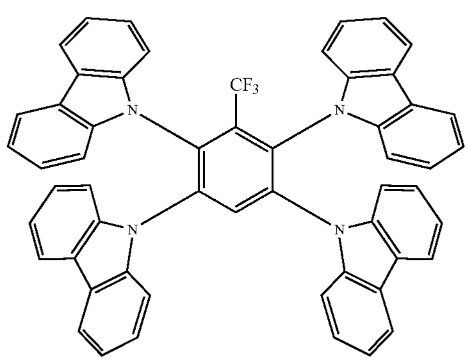
$4CzCF_3Ph$
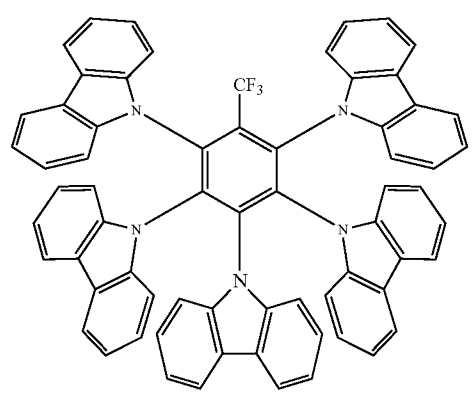
$5CzCF_3Ph$ -continued
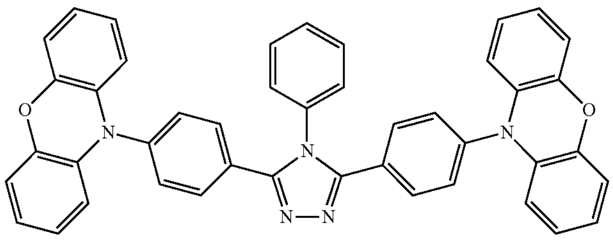
2PXZ-TAZ
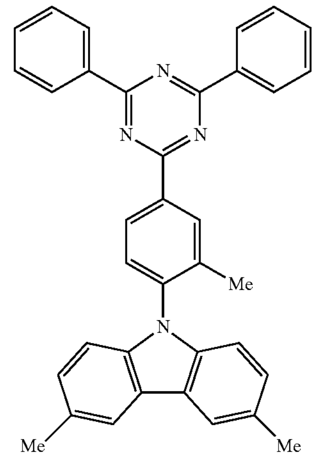
Cz-TRZ3
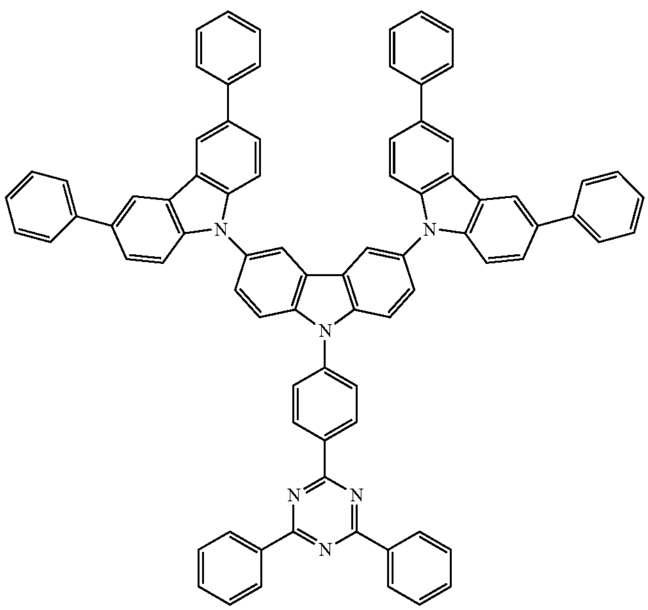
BDPCC-TPTA
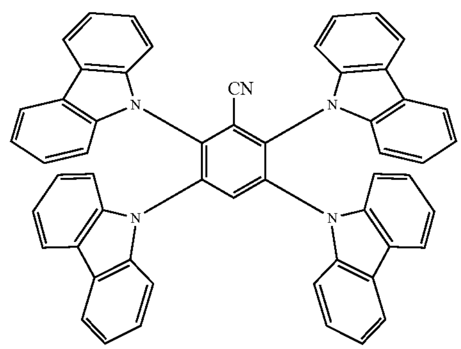
4CzBN
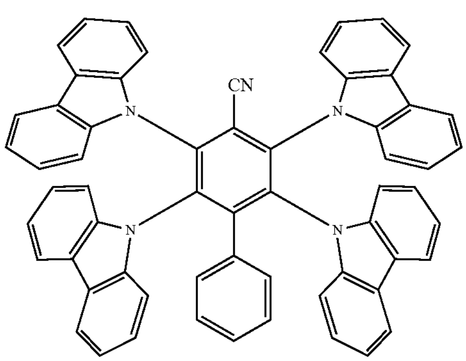
4CzBN-Ph
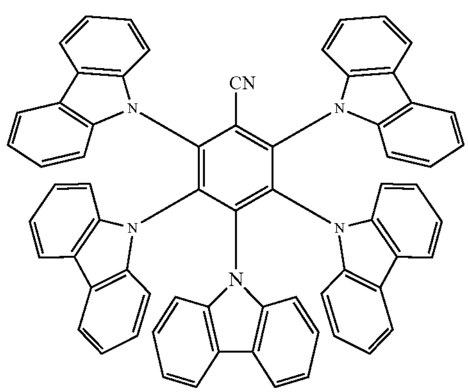
5CzBN -continued
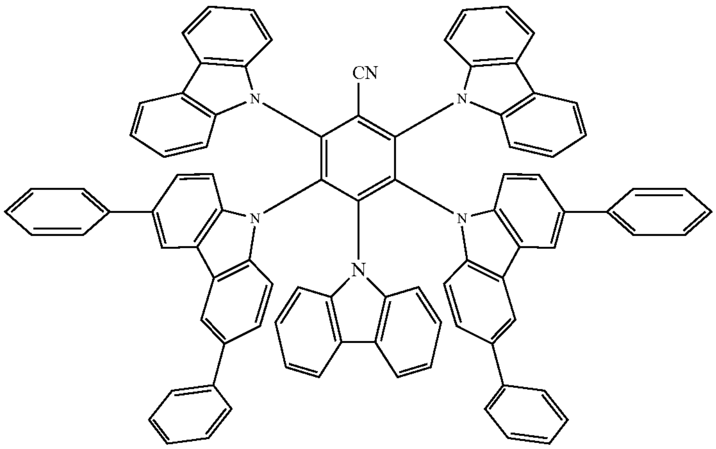
3Cz2DOhCzBN
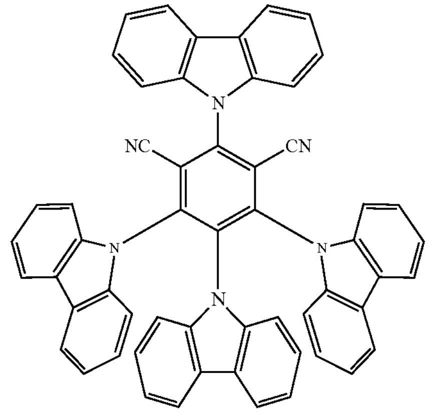
4CzIPN
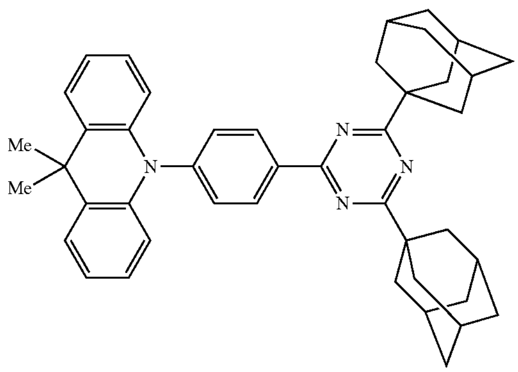
MA-TA
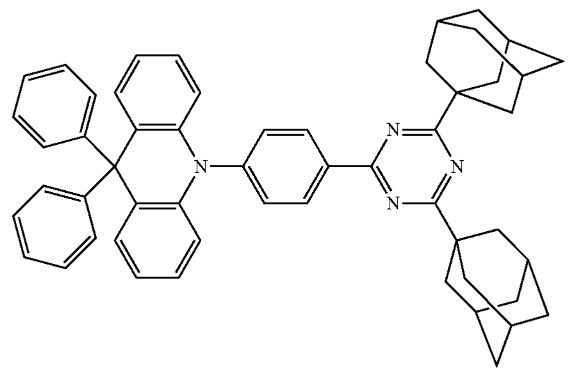
PA-TA
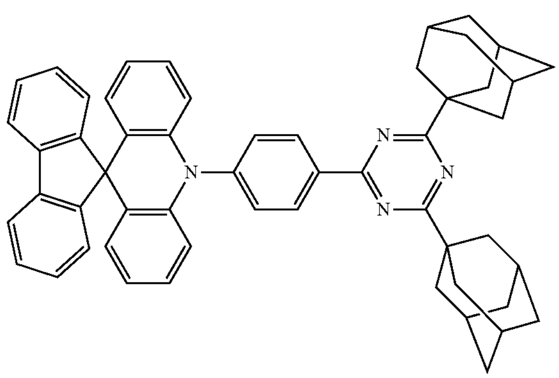
FA-TA Further, as the assisting dopant, compounds represented by any of the following formulae (AD1), (AD2) and (AD3) are also usable.

(AD1)

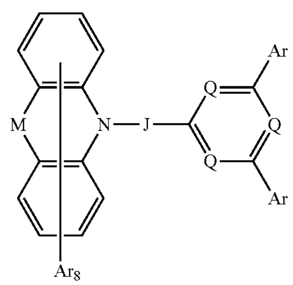

(AD2)

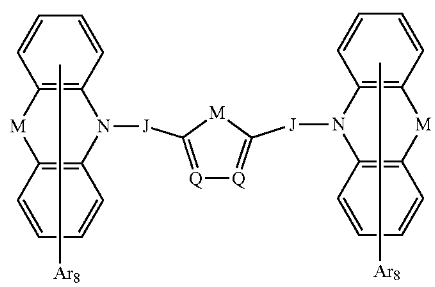

(AD3)

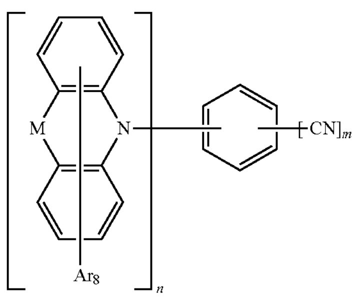

In the formulae (AD-1), (AD-2) and (AD-3):

M are each independently a single bond, —O—, >N—Ar or $>CAr_2$, and is, from the viewpoint of the depth of HOMO of the formed partial structure and the height of the excited singlet energy level and the excited triplet energy level thereof, preferably a single bond, —O— or >N—Ar. J is a spacer structure to space the donor-type partial structure and the acceptor-type partial structure from each other, and each is independently an arylene having a carbon number of 6 to 18, and is, from the viewpoint of the size of the conjugation to run out from the donor-type partial structure and the acceptor-type partial structure, preferably an arylene having a carbon number of 6 to 12. More specifically, J includes a phenylene, a methylphenylene and a dimethylphenylene. Q are each independently ═C(—H)— or ═N—, and is, from the viewpoint of the shallowness of LUMO of the formed partial structure and the height of the excited singlet energy level and the excited triplet energy level thereof, preferably ═N—. Ar are each independently a hydrogen, an aryl having a carbon number of 6 to 24, a heteroaryl having a carbon number of 2 to 24, an alkyl having a carbon number of 1 to 12, or a cycloalkyl having a carbon number of 3 to 18, and is, from the viewpoint of the depth of HOMO of the formed structure and the height of the excited singlet energy level and the excited triplet energy level thereof, preferably a hydrogen, an aryl having a carbon number of 6 to 12, a heteroaryl having a carbon number of 2 to 14, an alkyl having a carbon number of 1 to 4, or a cycloalkyl having a carbon number of 6 to 10, more preferably a hydrogen, a phenyl, a tolyl, a xylyl, a mesityl, a biphenyl, a pyridyl, a bipyridyl, a triazyl, a carbazolyl, a dimethylcarbazolyl, a di-tert-butylcarbazolyl, a benzimidazole or a phenylbenzimidazole, even more preferably a hydrogen, a phenyl or a carbazolyl. In the formulae (AD-1), (AD-2) and (AD-3), Ar, whose bonding hand hangs on a benzene ring, represents a group that bonds to each carbon of the benzene ring, m is 1 or 2. n is an integer of 2 to (6−m), and is, from the viewpoint of steric hindrance, preferably a number of 4 to (6−m). At least one hydrogen in the compounds represented by any of the above formulae may be substituted with a halogen or deuterium.

More specifically speaking, the compound for use as the assisting dopant in the light-emitting layer in the present invention is preferably any of 4CzBN, 4CzBN-Ph, 5CzBN, 3Cz2DPhCzBN, 4CzIPN, 2PXZ-TAZ, Cz-TRZ3, BDPCC-TPTA, MA-TA, PA-TA, FA-TA, PXZ-TRZ, DMAC-TRZ, BCzT, DCzTrz, DDCzTRz, spiro-AC-TRZ, Ac-HPM, Ac-PPM, Ac-MPM, TCzTrz, TmCzTrz and DCzmCzTrz.

[Light-Emitting Layer Configuration]

The light-emitting layer may be formed of a single layer or multiple layers. Further, a plurality of components such as a dopant material and a host material may be contained in the same layer, or at least one component may be contained in each of the plurality of layers. For example, a dopant material (an emitting dopant, a polycyclic aromatic compound of the present invention), a host material, and an assisting dopant may be contained in the same layer, and may be contained in a plurality of layers by at least one components. The emitting dopant (the poly cyclic aromatic compound of the present invention), the host material, and the assisting dopant contained in the light emitting layer may respectively be one type or a combination of multiple materials. When an assisting dopant and an emitting dopant are used, they may be wholly or partially included in the host material as a matrix.

As described later, the light emitting layer can be formed by a vapor deposition method, a wet film formation method, or the like. For example, the light emitting layer doped with an assisting dopant and an emitting dopant can be formed by a method of depositing a host material, an assisting dopant and an emitting dopant by a ternary co-vapor deposition method, a method of depositing a host material, an assisting dopant, and an emitting dopant simultaneously after mixing them in advance, or a wet film deposition method of applying a coating material prepared by dissolving a host material, an assisting dopant, and tan emitting dopant in an organic solvent (light-emitting layer forming composition).

When the polycyclic aromatic compound of the present invention is used as a dopant material (emitting dopant), the amount thereof to be used is not particularly limited, but is preferably 0.001 to 30% by mass, more preferably 0.01 to 20% by mass, and still more preferably 0.1 to 10% by mass, of the total material for the light-emitting layer. The amount within the above-described range is preferred in view of capability of preventing a concentration quenching phenomenon, for example.

The amount of the host material used varies depending on the type of the host material, and may be determined in accordance with the characteristics of the host material. The amount of the host material to be used is preferably 40 to 99.999% by mass, more preferably 50 to 99.99% by mass, and still more preferably 60 to 99.9% by mass, of the total material for the light-emitting layer. The range is preferred from the viewpoint of efficient charge transportation and efficient energy transfer to dopant.

The amount of the assisting dopant used varies depending on the type of the assisting dopant, and may be determined according to the properties of the assisting dopant. The amount of the assisting dopant to be used is preferably 1 to 60% by mass, more preferably 2 to 50% by mass, and still more preferably 5 to 30% by mass, of the total material for the light emitting layer. The above range is preferable, for example, in that energy can be efficiently transferred to the emitting dopant.

It is preferable that the amount of the emitting dopant used is low in terms of preventing concentration quenching phenomenon. A high concentration of the assisting dopant is preferable from the viewpoint of the efficiency of the thermally assisting delayed fluorescence mechanism. Furthermore, from the viewpoint of the efficiency of the thermally assisting delayed fluorescence mechanism of the assisting dopant, it is preferable that the amount of the emitting dopant used is lower than the amount of the assisting dopant used.

3-1-2. Electron Injection Layer and an Electron Transport Layer in Organic Electroluminescent Element Electron injection layer 107 plays a role of efficiently injecting electrons moved from cathode 108 into light-emitting layer 105 or electron transport layer 106. Electron transport layer 106 plays a role of efficiently transport the electrons injected from cathode 108 or the electrons injected from cathode 108 through electron injection layer 107 to light-emitting layer 105. Electron injection layer 107 and electron transport layer 106 are formed by lamination and mixing one kind or two or more kinds of electron injection/transport materials.

An electron injection/transport layer means a layer that manages injection of the electrons from the cathode and transportation of the electrons, and desirably has high electron injection efficiency and efficiently transports the electrons injected. Accordingly, a material having large electron affinity, large electron mobility and excellent stability, and hard to generate impurities to be a trap during production and use is preferred. However, in consideration of a transport balance between the holes and the electrons, when the material mainly play's a role of being able to efficiently inhibit the holes from the anode from flowing to a cathode side without recombination, even if the material has a comparatively low electron transport capability, the material has an effect on improving luminescent efficiency as high as a material having high electron transport capability. Accordingly, the electron injection/transport layer in the present embodiment may also include a function of a layer that can efficiently inhibit movement of the holes.

A material (electron transport material) that forms electron transport layer 106 or electron injection layer 107 can be selected and used from a compound which has been commonly used so far as an electron transfer compound in a photoconductive material, and a publicly-known compound used for a hole injection layer and a hole transport layer of an organic EL element.

A material used for the electron transport layer or the electron injection layer preferably contains at least one kind selected from a compound formed of an aromatic ring or a complex aromatic ring composed of one or more atoms selected from carbon, hydrogen, oxy gen, sulfur, silicon and phosphorus, a pyrrole derivative and a fused ring derivative thereof and a metal complex having electron accepting nitrogen. Specific examples thereof include a fused ring-based aromatic ring derivative such as naphthalene and anthracene, a styryl-based aromatic ring derivative typified by 4,4'-bis(diphenylethenyl)biphenyl, a perinon derivative, a coumarin derivative, a naphthalimide derivative, a quinone derivative such as anthraquinone and diphenoquinone, a phosphine oxide derivative, an aryl nitrile derivative and an indole derivative. Specific examples of the metal complex having electron accepting nitrogen include a hydroxy azole complex such as a hydroxyphenyl oxazole complex, an azomethine complex, a tropolone metal complex, a flavonol metal complex and a benzoquinoline metal complex. The above materials may be used alone, or in combination of a different material.

Specific examples of other electron transport compounds include a borane derivative, a pyridine derivative, a naphthalene derivative, a fluoranthene derivative, a BO-based derivative, an anthracene derivative, a benzofluorene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (such as 1,3-bis[(4-t-butylphenyl)1,3,4-oxadiazolyl]phenylene), a thiophene derivative, a triazole derivative (such as N-naphthyl-2,5-diphenyl-1,3,4-triazole), a thiadiazole derivative, a metal complex of an oxime derivative, a quinolinol metal complex, a quinoxaline derivative, a polymer of a quinoxaline derivative, a benzazole compound, a gallium complex, a pyrazol derivative, a perfluorophenylene derivative, a triazine derivative, a pyrazine derivative, a benzoquinoline derivative (such as 2,2'-bis(benzo[h]quinolin-2-yl)-9,9'-spirobifluorene), an imidazopyridine derivative, a borane derivative, a benzimidazole derivative (such as tris(N-phenylbenzimidazole-2-yl)benzene), a benzooxazol derivative, a thiazole derivative, a benzothiazole derivative, a quinoline derivative, an oligo pyridine derivative such as terpyridine, a bipyridine derivative, a terpyridine derivative (such as 1,3-bis(4'-(2,2':6',2"-terpyridinyl))benzene), a naphthyridine derivative (such as bis(1-naphthyl)-4-(1,8-naphthyridine-2-yl)phenyl phosphine oxide), an aldazine derivative, a pyrimidine derivative, an aryl nitrile derivative, an indole derivative, a phosphorus oxide derivative, a bis-styiyl derivative, a silole derivative and an azoline derivative.

Moreover, a metal complex having electron accepting nitrogen can also be used, and specific examples thereof include a quinolinol-based metal complex, a hydroxyazole complex such as a hydroxyphenyloxazole complex, an azomethine complex, a tropolone metal complex, a flavonol metal complex and a benzoquinoline metal complex.

The above materials may be used alone, or in combination of a different material.

Among the above-mentioned materials, a borane derivative, a pyridine derivative, a fluoranthene derivative, a BO-based derivative, an anthracene derivative, a benzofluorene derivative, a phosphine oxide derivative, a pyrimidine derivative, an aryl nitrile derivative, a triazine derivative, a benzimidazole derivative, a phenanthroline derivative, a quinolinol metal complex, a thiazole derivative, a benzothiazole derivative, a silole derivative and an azoline derivative are preferred.

<Borane Derivative>

The borane derivative is a compound represented by Formula (ETM-1), for example, and is disclosed in detail in JP 2007-27587 A.

(ETM-1)

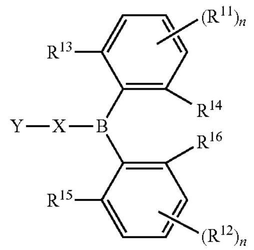

In Formula (ETM-1), $R^{11}$ and $R^{12}$ are independently at least one of hydrogen, an alkyl, a cycloalkyl, an aryl which may be substituted, a silyl which is subjected to substitution, a nitrogen-containing heterocyclic ring which may be substituted, or cyano, and $R^{13}$ to $R^{16}$ are independently an alkyl which may be substituted, a cycloalkyl which may be substituted or an aryl which may be substituted, and X is an arylene which may be substituted, and Y is an aryl having 16 or less carbons which may be substituted, a boryl which is subjected to substitution, or a carbazolyl which may be substituted, and n is independently an integer from 0 to 3. Moreover, specific examples of the substituent in the case of "which may be substituted" or "which is subjected to substitution" include an aryl, a heteroaryl, an alkyl or a cycloalkyl.

Among the compounds represented by Formula (ETM-1), a compound represented by (ETM-1-1) and a compound represented by Formula (ETM-1-2) are preferred.

(ETM-1-1)

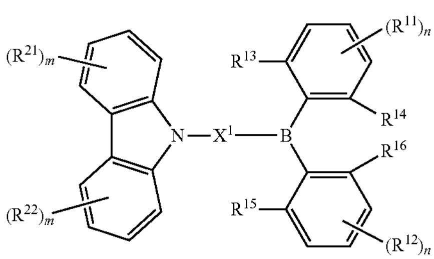

In Formula (ETM-1-1), $R^{11}$ and $R^{12}$ are independently at least one of hydrogen, an alkyl, a cycloalkyl, an aryl which may be substituted, a silyl which is subjected to substitution, a nitrogen-containing heterocyclic ring which may be substituted or cyano, and $R^{13}$ to $R^{16}$ are independently an alkyl which may be substituted, a cycloalkyl which may be substituted or an aryl which may be substituted, and $R^{21}$ and $R^{22}$ are independently at least one of hydrogen, an alkyl, a cycloalkyl, an aryl which may be substituted, a silyl which is subjected to substitution, a nitrogen-containing heterocyclic ring which may be substituted or cyano, and $X^1$ is an arylene having 20 or less carbons which may be substituted, and n is independently an integer from 0 to 3, and m is independently an integer from 0 to 4. Moreover, specific examples of the substituent in the case of "which may be substituted" or "which is subjected to substitution" include an aryl, a heteroaryl, an alkyl or a cycloalkyl.

(ETM-1-2)

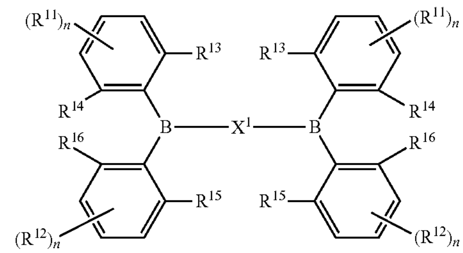

In Formula (ETM-1-2), $R^{11}$ and $R^{12}$ are independently at least one of hydrogen, an alkyl, a cycloalkyl, an aryl which may be substituted, a silyl which is subjected to substitution, a nitrogen-containing heterocyclic ring which may be substituted or cyano, and $R^{13}$ to $R^{16}$ are independently an alkyl which may be substituted, a cycloalkyl which may be substituted or an aryl which may be substituted, and $X^1$ is an arylene having 20 or less carbons which may be substituted, and n is independently an integer from 0 to 3. Moreover, specific examples of the substituent in the case of "which may be substituted" or "which is subjected to substitution" include an aryl, a heteroaryl, an alkyl or a cycloalkyl.

Specific examples of $X^1$ include divalent groups represented by any of formulas (X-1) to (X-9).

(X-1)

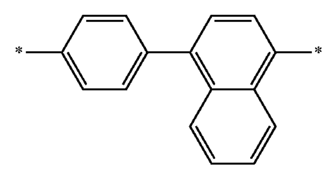

(X-2)

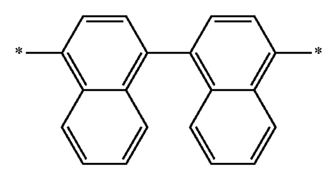

(X-3)

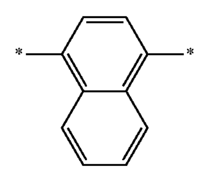

(X-4)

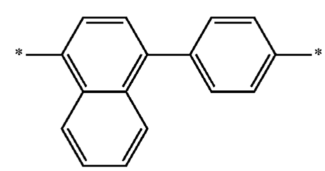

(X-5)

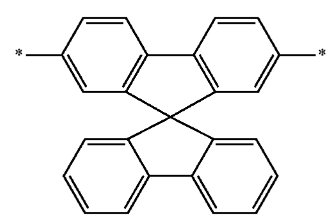

-continued (X-6)

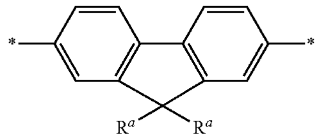

(X-7)

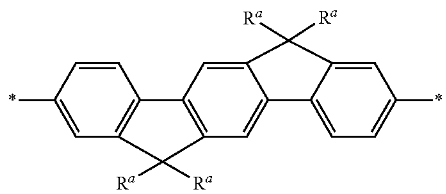

(X-8)

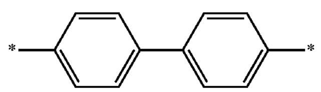

(X-9)

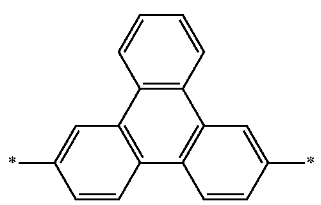

In each formula, $R^a$ is independently an alkyl, a cycloalkyl or a phenyl which may be substituted, and a position "*" represents a bonding position.

Specific examples of the borane derivative include compounds described below.

ET-1

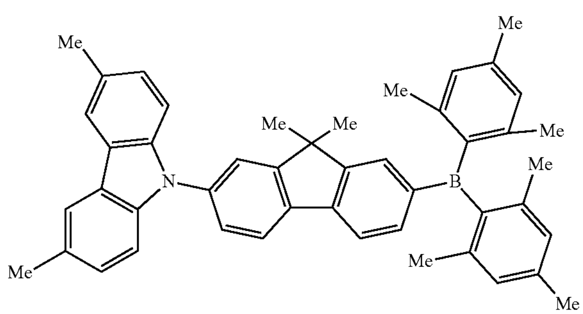

The borane derivative can be produced by using a publicly-known raw material and a publicly-known synthesis method.

<Pyridine Derivative>

The pyridine derivative is a compound represented by Formula (ETM-2), for example, and is preferably a compound represented by Formula (ETM-2-1) or Formula (ETM-2-2)

(ETM-2)

Ø—(Pyridine-based substituent)*n*

(ETM-2-1)

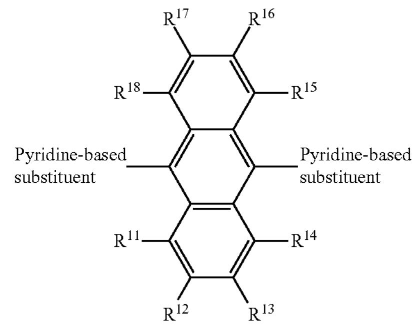

(ETM2-2)

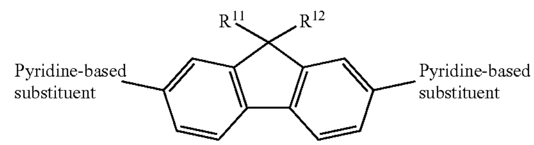

φ p is an n-valent aryl ring (preferably, an n-valent benzene ring, naphthalene ring, anthracene ring, fluorene ring, benzofluorene ring, phenalene ring, phenanthrene ring or triphenylene ring), and n is an integer from 1 to 4.

In Formula (ETM-2-1). $R^{11}$ to $R^{18}$ are independently hydrogen, an alkyl (preferably an alkyl having 1 to 24 carbons), a cycloalkyl (preferably a cycloalkyl having 3 to 12 carbons) or an aryl (preferably an aryl having 6 to 30 carbons).

In Formula (ETM-2-2), $R^{11}$ and $R^{12}$ are independently hydrogen, an alkyl (preferably an alkyl having 1 to 24 carbons), a cycloalkyl (preferably cycloalkyl having 3 to 12 carbons), or an aryl (preferably aryl having 6 to 30 carbons), and $R^{11}$ and $R^{12}$ may be bonded to each other to form a ring.

In each formula, the "pyridine-based substituents" is represented by any of formulas (Py-1) to (Py-15), and the pyridine-based substituent may be independently subjected substitution for alkyl having 1 to 4 carbons or cycloalkyl having 5 to 10 carbons. Specific examples include methyl, ethyl, n-propyl, isopropyl, n-butyl, isobutyl, s-butyl, t-butyl and the like, with methyl being preferred. Moreover, the pyridine-based substituent may be bonded to φ, an anthracene ring or a fluorene ring in each formula through a phenylene or a naphthylene.

(Py-1)

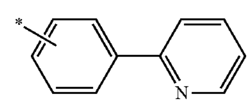

(Py-2)

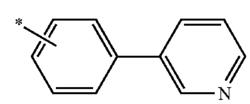

(Py-3)

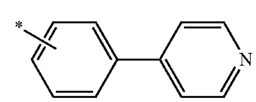

(Py-4)

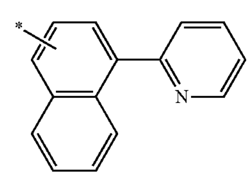

-continued
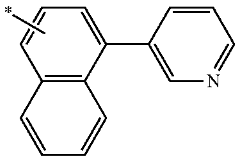
(Py-5)
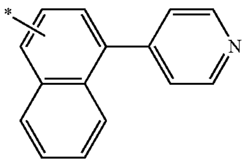
(Py-6)
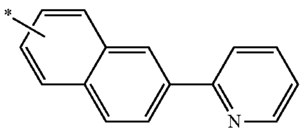
(Py-7)
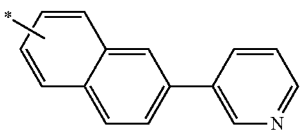
(Py-8)
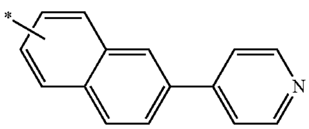
(Py-9)
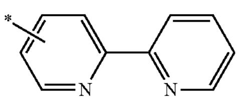
(Py-10)
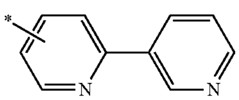
(Py-11)
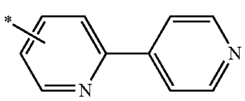
(Py-12)
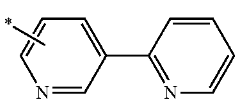
(Py-13)
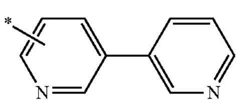
(Py-14)
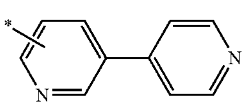
(Py-15)
The pyridine-based substituents is represented by any of formulas (Py-1) to (Py-15), and is preferably represented by any of formulas (Py-21) to (Py-44) among the formulas (a position "*" in the formula represents a bonding position).
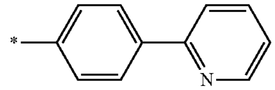
(Py-21)
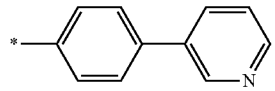
(Py-22)
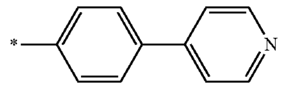
(Py-23)
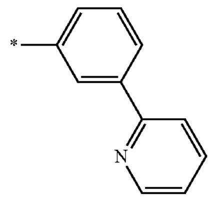
(Py-24)
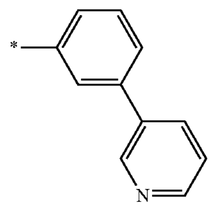
(Py-25)
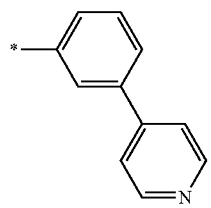
(Py-26)
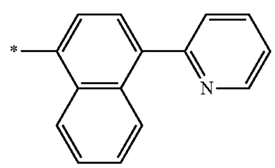
(Py-27)
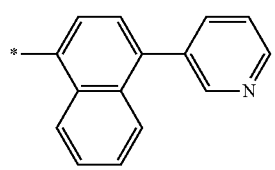
(Py-28)
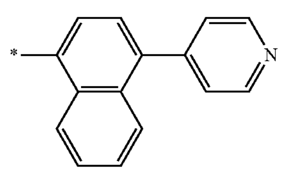
(Py-29)
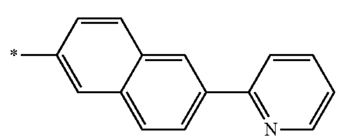
(Py-30)

-continued (Py-31)

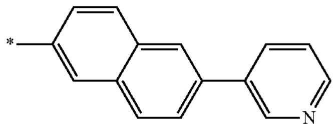

(Py-32)

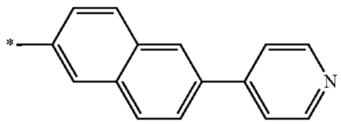

(Py-33)

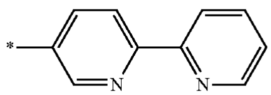

(Py-34)

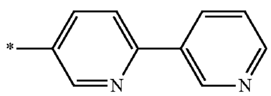

(Py-35)

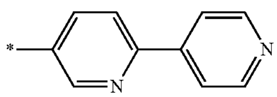

(Py-36)

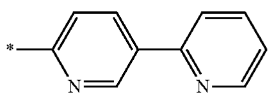

(Py-37)

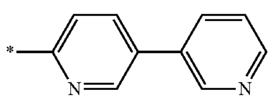

(Py-38)

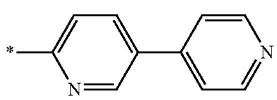

(Py-39)

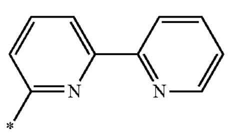

(Py-40)

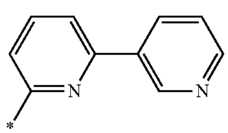

(Py-41)

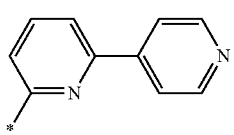

(Py-42)

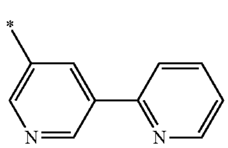

(Py-43)

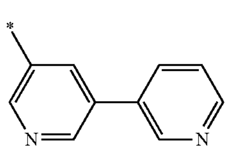

-continued (Py-44)

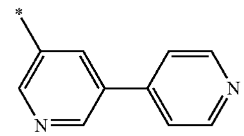

At least one hydrogen in each pyridine derivative may be replaced with deuterium, and one of two "pyridine-based substituents" in Formula (ETM-2-1) and Formula (ETM-2-2) may be subjected to substitution for aryl.

The "alkyl" in $R^{11}$ to $R^{18}$ may be any of a straight-chain alkyl and a branched-chain alkyl, and specific examples thereof include a straight-chain alkyl having 1 to 24 carbons or a branched-chain alkyl having 3 to 24 carbons. Preferred "alkyl" is alkyl having 1 to 18 carbons (branched-chain alkyl having 3 to 18 carbons) Further preferred "alkyl" is alkyl having 1 to 12 carbons (branched-chain alkyl having 3 to 12 carbons). Still further preferred "alkyl" is an alkyl having 1 to 6 carbons (branched-chain alkyl having 3 to 6 carbons). Particularly preferred "alkyl" is an alkyl having 1 to 4 carbons (branched-chain alkyl having 3 to 4 carbons).

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl and n-eicosyl.

As the alkyl having 1 to 4 carbons by which a pyridine-based substituent is replaced, the above-mentioned description for the alkyl can be quoted.

Specific examples of the "cycloalkyl" in $R^{11}$ to $R^{18}$ include a cycloalkyl having 3 to 12 carbons. Preferred "cycloalkyl" is a cycloalkyl having 3 to 10 carbons. Further preferred "cycloalkyl" is a cycloalkyl having 3 to 8 carbons. Still further preferred "cycloalkyl" is a cycloalkyl having 3 to 6 carbons Specific examples of the "cycloalkyl" include cyclopropyl, cyclobutyl, cyclopentyl, cyclohexyl, methyl cyclopentyl, cycloheptyl, methylcyclohexyl, cyclooctyl or dimethylcyclohexyl.

The "aryl" in $R^{11}$ to $R^{18}$ is preferably an aryl having 6 to 30 carbons, further preferably an aryl having 6 to 18 carbons, still further preferably an aryl having 6 to 14 carbons, and particularly preferably an aryl having 6 to 12 carbons.

Specific examples of the "aryl having 6 to 30 carbons" include phenyl as monocyclic aryl, (1-,2-)naphthyl as fused bicyclic aryl, acenaphthylene(1-,3-,4-,5-)yl, fluorene-(1-,2-,3-,4-,9-)yl, phenalene(1-,2-)yl, and (1-,2-,3-,4-,9-)phenanthryl as fused tricyclic aryl, triphenylene(1-,2-)yl, pyrene(1-,2-,4-)yl, and naphthacene(1-,2-,5-)yl as fused tetracyclic aryl, perylene(1-,2-,3-)yl and pentacene(1-,2-,5-,6-)yl as fused pentacyclic aryl.

Preferred examples of the "aryl having 6 to 30 carbons" include phenyl, naphthyl, phenanthryl, chrysenyl or triphenylenyl, and further preferred examples thereof include phenyl, 1-naphthyl, 2-naphthyl or phenanthryl, and particularly preferred examples thereof include phenyl, 1-naphthyl or 2-naphthyl.

$R^{11}$ and $R^{12}$ in Formula (ETM-2-2) may be bonded to each other to form a ring, and as a result, cyclobutane, cyclopentane, cyclopentane, cyclopentadiene, cyclohexane, fluorene, indene or the like may be spiro-bonded to a 5-membered ring of a fluorene skeleton.

Specific examples of the pyridine derivative include compounds described below.

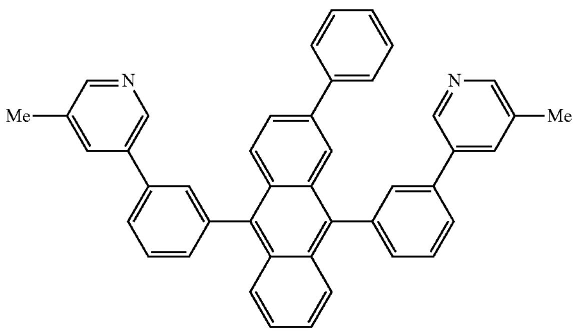

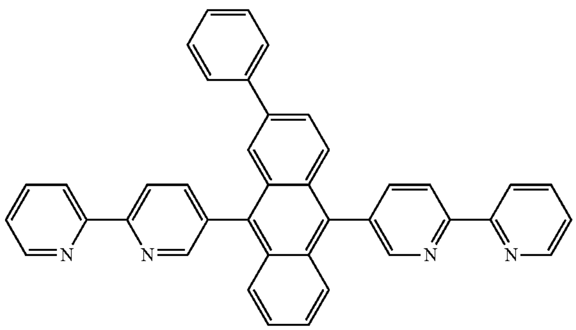

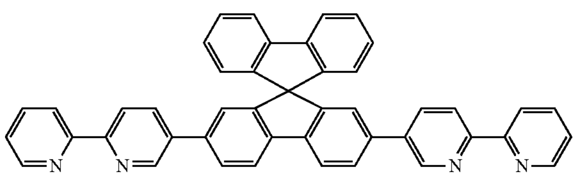

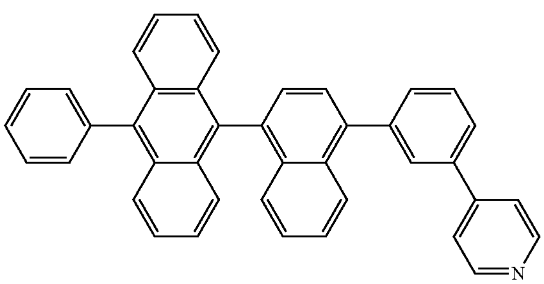

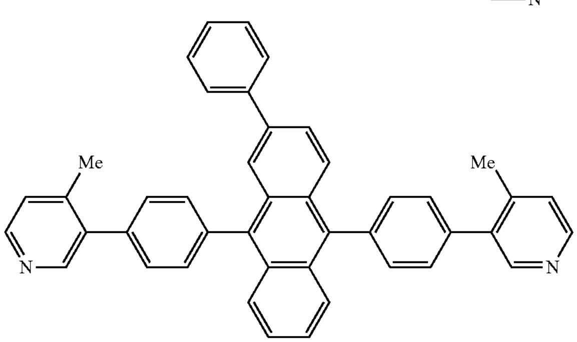

The pyridine derivative can be produced by using a publicly-known raw material and a publicly-known synthesis method.

<Fluoranthene Derivative>

The fluoranthene derivative is a compound represented by Formula (ETM-3), for example, and is disclosed in detail in WO 2010/134352 A.

(ETM-3)

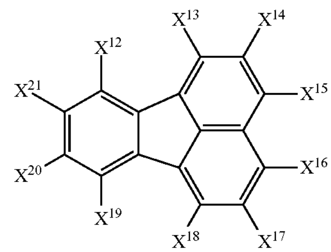

In Formula (ETM-3), $X^{12}$ to $X^{21}$ represent hydrogen, a halogen, a straight-chain, a branched-chain or cyclic alkyl, a straight-chain, branched-chain or cyclic alkoxy, a substituted or unsubstituted aryl or a substituted or unsubstituted heteroaryl. Here, specific examples of a substituent in the case of being subjected to substitution include an aryl, a heteroaryl, an alkyl or a cycloalkyl.

Specific examples of the fluoranthene derivative include compounds described below.

(ETM-3-1)

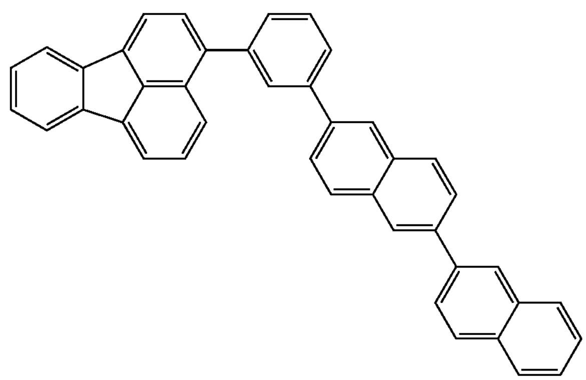

(ETM-3-2)

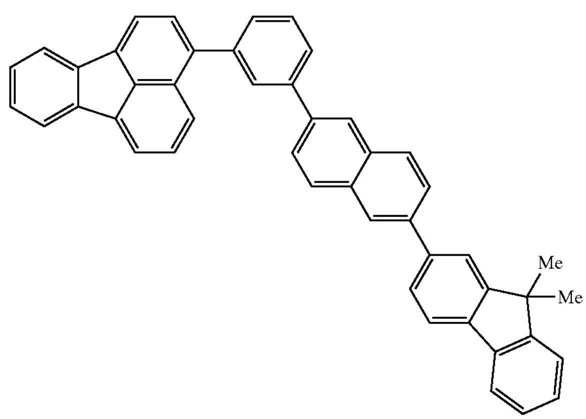

-continued (ETM-3-3)

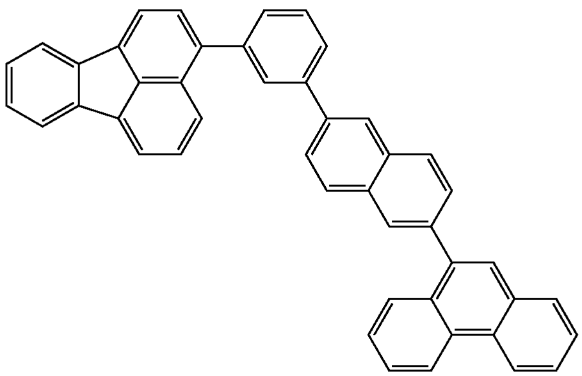

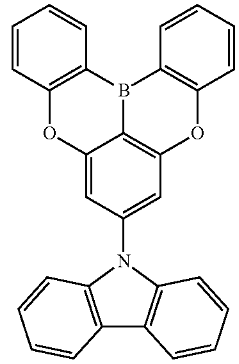

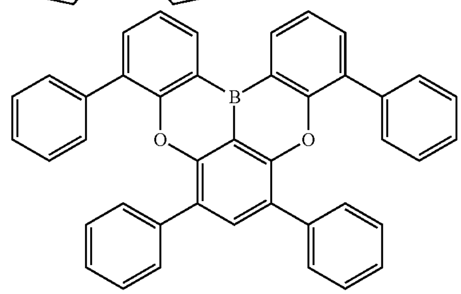

<BO-Based Derivative>

The BO-based derivative is a polycyclic aromatic compound represented by Formula (ETM-4) or a multimer of a polycyclic aromatic compound having a plurality of structures represented by Formula (ETM-4), for example.

(ETM-4)

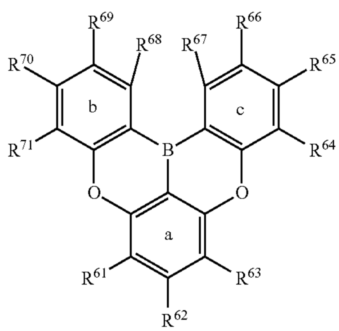

$R^{61}$ to $R^{71}$ are independently hydrogen, an aryl, a heteroaryl, a diarylamino, a diheteroarylamino, an arylheteroarylamino, an alkyl, a cycloalkyl, an alkoxy or an aryloxy, and at least one hydrogen in the groups may be replaced with an aryl, a heteroaryl, ah alkyl or a cycloalkyl.

Moreover, adjacent groups of $R^{61}$ to $R^{71}$ may be bonded to form an aryl ring or a heteroaryl ring together with an a ring, a b ring or a c ring, and at least one hydrogen in the ring formed may be replaced with an aryl, a heteroaryl, a diarylamino, a diheteroarylamino, an arylheteroarylamino, an alkyl, a cycloalkyl, an alkoxy or an aryloxy, and at least one hydrogen in the groups may be replaced with an aryl, a heteroaryl, an alkyl or a cycloalkyl.

Moreover, at least one hydrogen in the compound or the structure represented by Formula (ETM-4) may be replaced with a halogen or deuterium.

For description of a substituent or a form of ring formation in Formula (ETM-4), the above-mentioned description for the polycyclic aromatic compound represented by Formula (1) or (2) can be quoted.

Specific examples of the BO-based derivative include compounds described below.

The BO-based derivative can be produced by using a publicly-known raw material and a publicly-known synthesis method.

<Anthracene Derivative>

One of the anthracene derivatives is a compound represented by Formula (ETM-5), for example.

(ETM-5)

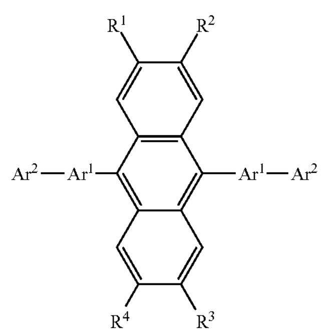

$Ar^1$ is independently a single bond, divalent benzene, naphthalene, anthracene, fluorene or phenalene.

$Ar^2$ is independently an aryl having 6 to 20 carbons, and an aryl having 6 to 16 carbons is preferred. Specific examples of the "aryl having 6 to 20 carbons" include phenyl, (o-,m-,p-)tolyl, (2,3-, 2,4-, 2,5-, 2,6-, 3,4-, 3,5-) xylyl, mesityl(2,4,6-trimethylphenyl) and (o-,m-,p-)cumenyl as monocyclic aryl, (2-,3-,4-)biphenylyl as bicyclic aryl, (1-,2-)naphthyl as fused bicyclic aryl, terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, and p-terphenyl-4-yl) as tricyclic aryl, anthracene-(1-,2-,9-)yl, acenaphthylene(1-,3-,4-,5-)yl, fluorene-(1-,2-,3-,4-,9-)yl, phenalene (1-,2-)yl, and (1-,2-,3-,4-,9-) phenanthryl as fused tricyclic aryl, triphenylene(1-,2-)yl, pyrene(1-,2-,4-)yl, and tetracene (1-,2-,5-)yl as fused tetracyclic aryl, and perylene-(1-,2-,3-)yl as fused pentacyclic aryl. Specific examples of aryl having 6 to 16 carbons include phenyl, biphenylyl, naphthyl, terphenylyl, anthracenyl, acenaphthylenyl, fluorenyl, phenalenyl, phenanthryl, triphenylenyl, pyrenyl, tetracenyl and perylenyl.

$R^1$ to $R^4$ are independently hydrogen, an alkyl having 1 to 6 carbons, a cycloalkyl having 3 to 6 carbons or an aryl having 6 to 20 carbons.

Alkyl having 1 to 6 carbons in $R^1$ to $R^4$ may be any of a straight-chain alkyl and a branched-chain alkyl. More specifically, a straight-chain alkyl having 1 to 6 carbons or a branched-chain alkyl having 3 to 6 carbons is preferred. An alkyl having 1 to 4 carbons (branched-chain alkyl having 3 to 4 carbons) is further preferred. Specific examples thereof include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl or 2-ethylbutyl, and methyl, ethyl, n-propyl, isopropyl, n-butyl, isobutyl, s-butyl or t-butyl is preferred, and methyl, ethyl or t-butyl is further preferred.

Specific examples of the cycloalkyl having 3 to 6 carbons in $R^1$ to $R^4$ include cyclopropyl, cyclobutyl, cyclopentyl, cyclohexyl, methylcyclopentyl, cycloheptyl, methylcyclohexyl, cyclooctyl or dimethylcyclohexyl.

As the aryl having 6 to 20 carbons in $R^1$ to $R^4$, an aryl having 6 to 16 carbons is preferred, an aryl having 6 to 12 carbons is further preferred, and an aryl having 6 to 10 carbons is particularly preferred. As specific examples of the "aryl having 6 to 20 carbons," the same specific examples of the "aryl having 6 to 20 carbons," in $Ar^2$ can be quoted. As the "aryl having 6 to 20 carbons," phenyl, biphenylyl, terphenylyl or naphthyl is preferred, phenyl, biphenylyl, 1-naphthyl, 2-naphthyl or m-terphenyl-5'-yl is further preferred, phenyl, biphenylyl, 1-naphthyl or 2-naphthyl is still further preferred, and phenyl is most preferred.

Specific examples of the above anthracene derivatives include compounds described below.

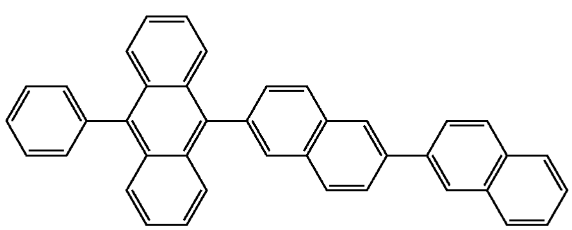 [SMILES: c1ccc(-c2c3ccccc3c(-c3ccc4cc(-c5ccc6ccccc6c5)ccc4c3)c3ccccc23)cc1]

The above anthracene derivatives can be produced by using a publicly-known raw material and a publicly-known synthesis method.

<Benzofluorene Derivative>

The benzofluorene derivative is a compound represented by Formula (ETM-6), for example.

(ETM-6)

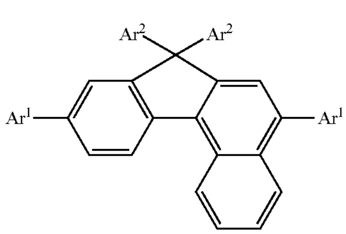

$Ar^1$ are independently an aryl having 6 to 20 carbons, and the same description as the "aryl having 6 to 20 carbons" for $Ar^2$ in Formula (ETM-5) can be quoted. An aryl having 6 to 16 carbons is preferred, and having 6 to 12 carbons is further preferred, and an and having 6 to 10 carbons is particularly preferred. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl and perylenyl.

$Ar^2$ is independently hydrogen, an alkyl (preferably alkyl having 1 to 24 carbons), a cycloalkyl (preferably cycloalkyl having 3 to 12 carbons), or an and (preferably and having 6 to 30 carbons), and two $Ar^2$'s may be bonded to form a ring.

The "alkyl" in $Ar^2$ may be any of a straight-chain alkyl and a branched-chain alkyl, and specific examples thereof include a straight-chain alkyl having 1 to 24 carbons or a branched-chain alkyl having 3 to 24 carbons. Preferred "alkyl" is an alkyl having 1 to 18 carbons (branched-chain alkyl having 3 to 18 carbons). Further preferred "alkyl" is an alkyl having 1 to 12 carbons (branched-chain alkyl having 3 to 12 carbons). Still further preferred "alkyl" is an alkyl having 1 to 6 carbons (branched-chain alkyl having 3 to 6 carbons). Particularly preferred "alkyl" is an alkyl having 1 to 4 carbons (branched-chain alkyl having 3 to 4 carbons). Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl and 1-methylhexyl.

Specific examples of the "cycloalkyl" in $Ar^2$ include cycloalkyl having 3 to 12 carbons. Preferred "cycloalkyl" is cycloalkyl having 3 to 10 carbons. Further preferred "cycloalkyl" is cycloalkyl having 3 to 8 carbons. Still further preferred "cycloalkyl" is cycloalkyl having 3 to 6 carbons. Specific examples of the "cycloalkyl" include cyclopropyl, cyclobutyl, cyclopentyl, cyclohexyl, methyl cyclopentyl, cycloheptyl, methylcyclohexyl, cyclooctyl or dimethylcyclohexyl.

As the "aryl" in $Ar^2$, aryl having 6 to 30 carbons is preferred, aryl having 6 to 18 carbons is further preferred, aryl having 6 to 14 carbons is still further preferred, and aryl having 6 to 12 carbons is particularly preferred.

Specific examples of the "aryl having 6 to 30 carbons" include phenyl, naphthyl, acenaphthylenyl, fluorenyl, phenalenyl, phenanthryl, triphenylenyl, pyrenyl, naphthacenyl, perylenyl and pentacenyl.

Two $Ar^2$'s may be bonded to form a ring, and as a result, cyclobutane, cyclopentane, cyclopentane, cyclopentadiene, cyclohexane, fluorene, indene or the like may be spiro-bonded to a 5-membered ring of a fluorene skeleton.

Specific examples of the benzofluorene derivative include compounds described below.

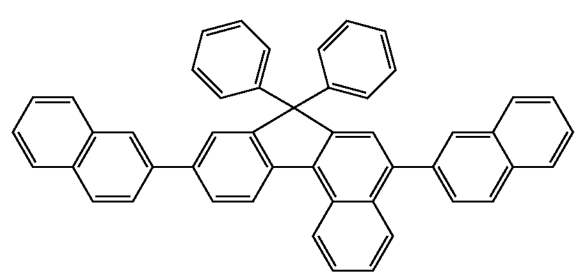

-continued

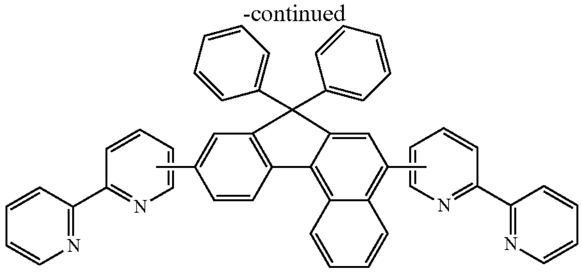

The benzofluorene derivative can be produced by using a publicly-known raw material and a publicly-known synthesis method.

<Phosphine Oxide Derivative>

The phosphine oxide derivative is a compound represented by Formula (ETM-7-1), for example. The detail is also described in WO 2013/079217 A and WO 2013/079678 A.

(ETM-7-1)

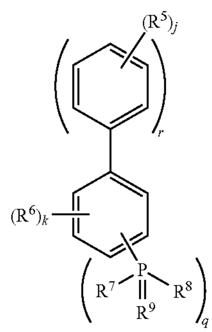

$R^5$ is substituted or unsubstituted, an alkyl having 1 to 20 carbons, a cycloalkyl having 3 to 16 carbons, an aryl having 6 to 20 carbons or heteroaryl having 5 to 20 carbons, $R^6$ is CN, substituted or unsubstituted, an alkyl having 1 to 20 carbons, a cycloalkyl having 3 to 16 carbons, a heteroalkyl having 1 to 20 carbons, an aryl having 6 to 20 carbons, a heteroaryl having 5 to 20 carbons, an alkoxy having 1 to 20 carbons or an aryloxy having 5 to 20 carbons, $R^7$ and $R^8$ are independently substituted or unsubstituted, an aryl having 6 to 20 carbons or a heteroaryl having 5 to 20 carbons, and R9 is oxygen or sulfur, and j is 0 or 1, k is 0 or 1, r is an integer from 0 to 4, and q is an integer from 1 to 3.

Here, specific examples of the substituent in the case of being subjected to substitution include aryl, heteroaryl, alkyl or cycloalkyl.

The phosphine oxide derivative may be a compound represented by Formula (ETM-7-2), for example (ETM-7-2)

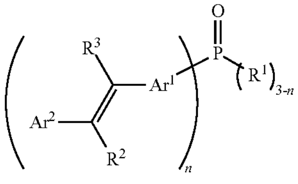

$R^1$ to $R^3$ may be identical to or different from each other, and is selected from hydrogen, an alkyl, a cycloalkyl, an aralkyl, an alkenyl, a cycloalkenyl, an alkynyl, an alkoxy, an alkylthio, a cycloalkylthio, an aryl ether group, an aryl thioether group, an aryl, a heterocyclic group, a halogen, cyano, an aldehyde, a carbonyl, carboxyl, amino, nitro, silyl and a fused ring formed between an adjacent substituent and one of $R^1$ to $R^3$.

$Ar^1$ may be identical to or different from each other and is an allylene or a heteroallylene. $Ar^2$ may be identical to or different from each other, and is an aryl or a heteroaryl, in which, at least one of $Ar^1$ and $Ar^2$ has a substituent, or forms a fused ring between an adjacent substituent and one of $Ar^1$ and $Ar^2$. Then, n is an integer from 0 to 3, and when n is 0, an unsaturated structure part does not exist, and when n is 3, $R^1$ does not exist.

Among the above substituents, the alkyl represents a saturated aliphatic hydrocarbon group such as methyl, ethyl, propyl and butyl, which may be unsubstituted or substituted. The substituent in the case of being subjected to substitution is not particularly limited, and specific examples thereof include alkyl, aryl and a heterocycle group, and the above point is common also in the following description. Moreover, the number of carbons of the alkyl is not particularly limited and is ordinarily in the range of 1 to 20 in view of ease of availability or cost.

Moreover, the cycloalkyl represents a saturated alicyclic hydrocarbon group such as cyclopropyl, cyclohexyl, norbornyl and adamanthyl, which may be unsubstituted or substituted. The number of carbons in an alkyl part is not particularly limited and is ordinarily in the range of 3 to 20.

Moreover, the aralkyl represents an aromatic hydrocarbon group through aliphatic hydrocarbon such as benzyl and phenylethyl, for example, and both of the aliphatic hydrocarbon and the aromatic hydrocarbon may be unsubstituted or substituted. The number of carbons on an aliphatic part is not particularly limited and is ordinarily in the range of 1 to 20.

Moreover, the alkenyl represents an unsaturated aliphatic hydrocarbon group containing a double bond such, as vinyl, allyl and butadienyl, for example, which may be unsubstituted or substituted. The number of carbons in the alkenyl is not particularly limited and is ordinarily in the range of 2 to 20.

Moreover, the cycloalkenyl represents an unsaturated alicyclic hydrocarbon group containing a double bond, such as cyclopentenyl, cyclopentadienyl and cyclohexene, for example, which may be unsubstituted or substituted.

Moreover, the alkynyl represents an unsaturated aliphatic hydrocarbon group containing a triple bond, such as acetylenyl, for example, which may be unsubstituted or substituted. The number of carbons in the alkynyl is not particularly limited and is ordinarily in the range of 2 to 20.

Moreover, the alkoxy represents an aliphatic hydrocarbon group through an ether bond, such as methoxy, for example, which may be unsubstituted or substituted. The number of carbons in the alkoxy is not particularly limited and is ordinarily in the range of 1 to 20.

Moreover, the alkylthio is a group in which an oxygen atom of an ether bond in the alkoxy is replaced with a sulfur atom.

Moreover, the cycloalkylthio is a group in which an oxygen atom of an ether bond in the cycloalkoxy is replaced with a sulfur atom.

Moreover, the aryl ether group represents an aromatic hydrocarbon group through an ether bond such as phenoxy, for example, which may be unsubstituted or substituted. The number of carbons in the aryl ether group is not particularly limited and is ordinarily in the range of 6 to 40.

Moreover, the aryl thioether group is a group in which an oxygen atom of an ether bond in the aryl ether is replaced with a sulfur atom.

Moreover, the aryl represents an aromatic hydrocarbon group such as phenyl, naphthyl, biphenyl, phenanthryl, terphenyl and pyrenyl, for example. The aryl may be unsubstituted or substituted. The number of carbons in the aryl is not particularly limited and is ordinarily in the range of 6 to 40.

Moreover, the heterocycle group represents a cyclic structure group having an atom other than carbon, such as furanyl, thiophenyl, oxazolyl, pyridyl, quinolinyl and carbazolyl, for example, which may be unsubstituted or substituted. The number of carbons in the heterocycle group is not particularly limited and is ordinarily in the range of 2 to 30.

The halogen represents fluorine, chlorine, bromine and iodine.

The aldehyde, the carbonyl and the amino can also include a group replaced with aliphatic hydrocarbon, alicyclic hydrocarbon, aromatic hydrocarbon, a heterocyclic ring or the like.

Moreover, the aliphatic hydrocarbon, the alicyclic hydrocarbon, the aromatic hydrocarbon and the heterocyclic ring may be unsubstituted or substituted.

The silyl represents a silicon compound group such as trimethylsilyl, for example, which may be unsubstituted or substituted. The number of carbons in the silyl is not particularly limited and is ordinarily in the range of 3 to 20. Moreover, the number of silicon is ordinarily 1 to 6.

The fused ring formed between the adjacent substituent and one of substituents is a conjugated or unconjugated fused ring formed between $Ar^1$ and $R^2$, $Ar^1$ and $R^3$, $Ar^2$ and $R^2$, $Ar^2$ and $R^3$, $R^2$ and $R^3$, $Ar^1$ and $Ar^2$ and the like, for example. Here, when n is 1, two $R^1$'s may form a conjugated or unconjugated fused ring. The above fused rings may contain nitrogen, oxygen and sulfur atoms in an endocyclic structure, and may be fused to another ring.

Specific examples of the phosphine oxide derivative include compounds described below, for example.

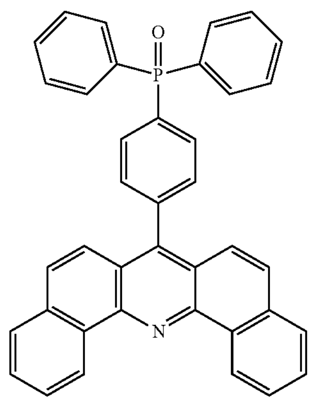

-continued

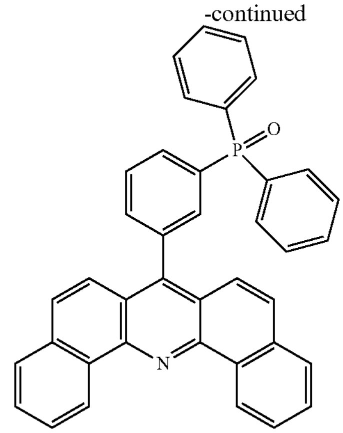

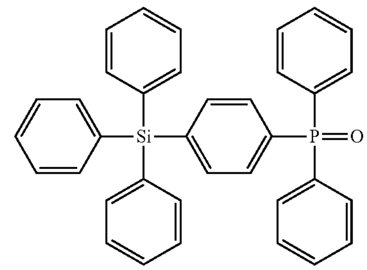

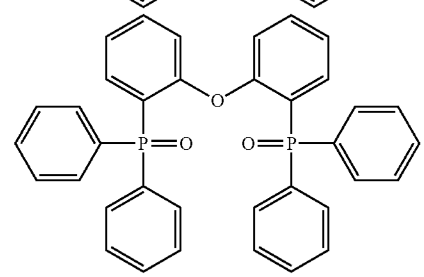

The phosphine oxide derivative can be produced by using a publicly known raw material and a publicly-known synthesis method.

<Pyrimidine Derivative>

The pyrimidine derivative is a compound represented by Formula (ETM-8), for example, and is preferably a compound represented by Formula (ETM-8-1). The detail is described also in WO 2011/021689 A.

(ETM-8)

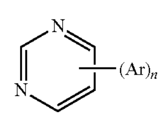

(ETM-8-1)

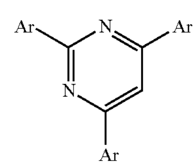

Ar is independently an and which may be substituted, or a heteroaryl which may be substituted. Then, n is an integer from 1 to 4, is preferably an integer from 1 to 3, and is further preferably 2 or 3.

Specific examples of the "aryl" of the "aryl which may be substituted" include an aryl having 6 to 30 carbons, and an aryl having 6 to 24 carbons is preferred, an aryl having 6 to 20 carbons is further preferred, and an aryl having 6 to 12 carbons is still further preferred.

Specific examples of the "aryl" include phenyl as monocyclic aryl, (2-, 3-, 4-)biphenylyl as bicyclic aryl, (1-, 2-)naphthyl as fused bicyclic aryl, terphenylyl(m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl), which are tricyclic aryl, acenaphthylene(1-,3-,4-,5-)yl, fluorene-(1-,2-,3-,4-,9-)yl, phenalene-(1-,2-)yl, and (1-,2-,3-,4-,9-)phenanthryl as fused tricyclic aryl, quaterphenylyl(5'-phenyl-m-terphenyl-2-yl, 5'-phenyl-m-terphenyl-3-yl, 5'-phenyl-m-terphenyl-4 yl, and m-quaterphenylyl) as tetracyclic aryl, triphenylene (1-, 2-)yl, pyrene(1-, 2-, 4-)yl, and naphthacene-(1-,2-,5-)yl as fused tetracyclic aryl, and perylene(1-,2-,3-)yl and pentacene(1-,2-,5-,6-)yl as fused pentacyclic aryl.

Specific examples of the "heteroaryl" of the "heteroaryl which may be substituted" include heteroaryl having 2 to 30 carbons or heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of the heteroaryl include a heterocyclic ring containing, in addition to carbon, 1 to 5 hetero atoms selected from oxy gen, sulfur and nitrogen as a ring-forming atom.

Specific examples of the heteroaryl include furyl, thienyl, pyrrolyl, oxazolyl, isoxazolyl, thiazolyl, isothiazolyl, imidazolyl, pyrazolyl, oxadiazolyl, furazanyl, thiadiazolyl, triazoryl, tetrazolyl, pyridyl, pyrimidinyl, pyridazinyl, pyrazinyl, triazinyl, benzofuranyl, isobenzofuranyl, benzo[b] thienyl, indolyl, isoindolyl, 1H-indazolyl, benzimidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl and indrizinyl.

Moreover, the aryl and the heteroaryl may each have a substituent, which may be the aryl and the heteroaryl, for example, respectively.

Specific examples of the pyrimidine derivative include compounds described below.

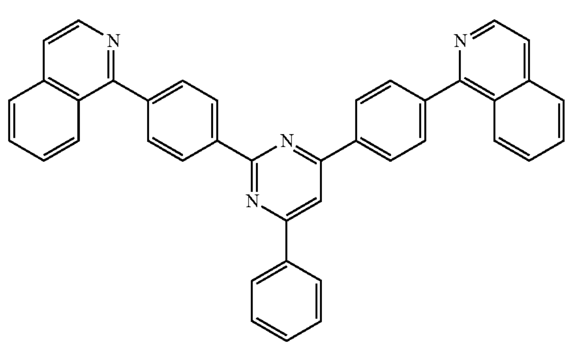 [SMILES: c1ccc(-c2cc(-c3ccc(-c4nccc5ccccc45)cc3)nc(-c3ccc(-c4nccc5ccccc45)cc3)n2)cc1]

The pyrimidine derivative can be produced by using a publicly known raw material and a publicly-known synthesis method.

<Aryl Nitrile Derivative>

The aryl nitrile derivative is a compound represented by Formula (ETM-9), or a multimer formed by bonding a plurality of compounds by a single bond or the like, for example. The detail is described in US 2014/0197386 A.

$$(Ar)_m Ar_{ni} (CN)_n \quad \text{(ETM-9)}$$

$Ar_{ni}$ preferably has a large number of carbon atoms from the view point of fast electron transportability, and preferably has a small number of carbon atoms from the viewpoint of high T1. Specifically, $Ar_{ni}$ preferably has a high T1 for use in a layer adjacent to the light emitting layer, and is an aryl having 6 to 20 carbon atoms, preferably an aryl having 6 to 14 carbons, and more preferably an aryl having 6 to 10 carbons. Further, the number of substitutions n of the nitrile groups is preferably large from the viewpoint of high T1 and preferably small from the viewpoint of high S1. Specifically, the number of substitutions n of the nitrile group is an integer of 1 to 4, preferably an integer of 1 to 3, more preferably an integer of 1 to 2, and even more preferably 1.

Ar are each independently an aryl which may be substituted or a heteroaryl which may be substituted. From the viewpoint of high S1 and high T1, a donor type heteroaryl is preferable, and since it is used in an electron transport layer, a number of a donor type heteroaryl is preferably small From the viewpoint of charge transportability, aryl or heteroaryl having a larger number of carbon atoms is preferable, and it is preferable to have a large number of substituents. Specifically, the number of substitutions m of Ar is an integer of 1 to 4, preferably an integer of 1 to 3, and more preferably 1 to 2.

Specific examples of the "aryl" of the "aryl which may be substituted" include aryl having 6 to 30 carbons, and aryl having 6 to 24 carbons is preferred, aryl having 6 to 20 carbons is further preferred, and aryl having 6 to 12 carbons is still further preferred.

Specific examples of the "aryl" include phenyl as monocyclic aryl, (2-, 3-, 4-)biphenylyl as bicyclic aryl, (1-, 2-)naphthyl as fused bicyclic aryl, terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl), which are tricyclic aryl, acenaphthylene(1-,3-,4-,5-)yl, fluorene-(1-,2-,3-,4-,9-)yl, phenalene-(1-,2-)yl, and (1-,2-,3-,4-,9-)phenanthryl as fused tricyclic aryl, quaterphenylyl(5'-phenyl-m-terphenyl-2-yl, 5'-phenyl-m-terphenyl-3-yl, 5'-phenyl-m-terphenyl-4 yl, and m-quaterphenylyl) as tetracyclic aryl, triphenylene (1-, 2-)yl, pyrene(1-,2-,4-)yl, and naphthacene-(1-,2-,5-)yl as fused tetracyclic aryl, and perylene(1-,2-,3-)yl and pentacene(1-,2-,5-,6-)yl as fused pentacyclic aryl.

Specific examples of the "heteroaryl" of the "heteroaryl which may be substituted" include heteroaryl having 2 to 30 carbons or heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of the heteroaryl include a heterocyclic ring containing, in addition to carbon, 1 to 5 hetero atoms selected from oxy gen, sulfur and nitrogen as a ring-forming atom.

Specific examples of the heteroaryl include fund, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzimidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl and indrizinyl.

Moreover, the aryl and the heteroaryl may each have one or more substituents which may be the aryl and the heteroaryl, for example.

The aryl nitrile derivative may be the multimer formed by bonding the plurality of compounds represented by Formula (ETM-9) by a single bond or the like. In the above case, the compounds may be bonded by, in addition to the single bond, an aryl ring (preferably a poly valent benzene ring, a naphthalene ring, an anthracene ring, a fluorene ring, a benzofluorene ring, a phenalene ring, a phenanthrene ring or a triphenylene ring).

Specific examples of the aryl nitrile derivative include compounds described below.

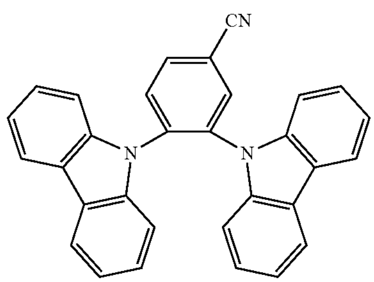

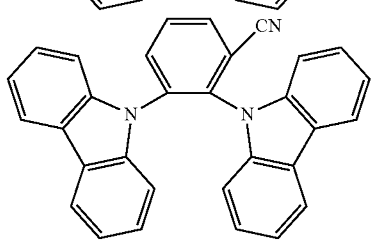

The aryl nitrile derivative can be produced by using a publicly-known raw material and a publicly-known synthesis method.

<Triazine Derivative>

The triazine derivative is a compound represented by Formula (ETM-10), for example, and is preferably a compound represented by Formula (ETM-10-1). The detail is described in US 2011/0156013 A.

(ETM-10)

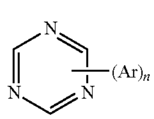

(ETM-10-1)

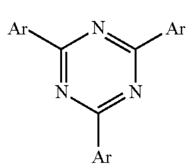

Ar is independently and which may be substituted, or heteroaryl which may be substituted. Then, n is an integer from 1 to 3, and is preferably 2 or 3.

Specific examples of the "aryl" of the "aryl which may be substituted" include and having 6 to 30 carbons, and aryl having 6 to 24 carbons is preferred, aryl having 6 to 20 carbons is further preferred, and aryl having 6 to 12 carbons is still further preferred.

Specific examples of the "aryl" include phenyl as monocyclic and, (2-,3-,4-)biphenylyl as bicyclic aryl, (1-,2-)naphthyl as fused bicyclic aryl, terphenylyl(m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl), which are tricyclic aryl, acenaphthylene-(1-,3-,4-,-)yl, fluorene-(1-,2-,3-,4-,9-)yl, phenalene-(1-,2-)yl, and (1-,2-,3-,4-,9-)phenanthryl as fused tricyclic aryl, quaterphenylyl(5'-phenyl-m-terphenyl-2-yl, 5'-phenyl-m-terphenyl-3-yl, 5'-phenyl-m-terphenyl-4yl, m-quaterphenylyl), which are tetracyclic aryl, triphenylene-(1-,2-)yl, pyrene-(1-,2-,4-)yl, naphthacene-(1-,2-,5-)yl, which are fused tetracyclic aryl, and perylene-(1-,2-,3-)yl and pentacene-(1-,2-,5-,6-)yl as fused pantacyclic aryl.

Specific examples of the "heteroaryl" of the "heteroaryl which may be substituted" include heteroaryl having 2 to 30 carbons or heteroaryl having 2 to 25 carbons is preferred, heteroaryl having 2 to 20 carbons is further preferred, heteroaryl having 2 to 15 carbons is still further preferred, and heteroaryl having 2 to 10 carbons is particularly preferred. Moreover, specific examples of the heteroaryl include a heterocyclic ring containing, in addition to carbon, 1 to 5 hetero atoms selected from oxy gen, sulfur and nitrogen as a ring-forming atom.

Specific examples of the heteroaryl include fund, thienyl, pyrrolyl, oxazolyl, isoxazolyl, thiazolyl, isothiazolyl, imidazolyl, pyrazolyl, oxadiazolyl, furazanyl, thiadiazolyl, triazoryl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzimidazolyl, benzoxazolyl, benzothiazolyl, 1H-benzotriazoryl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl and indrizinyl.

Moreover, the aryl and the heteroaryl may each have one or more substituents, which may be the aryl and the heteroaryl, for example.

Specific examples of the triazine derivative include compounds described below.

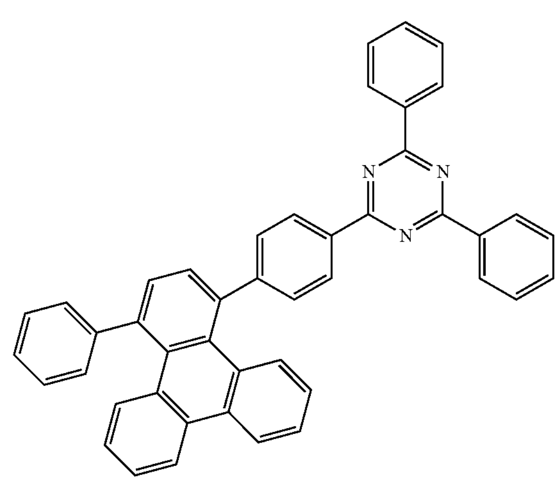

-continued

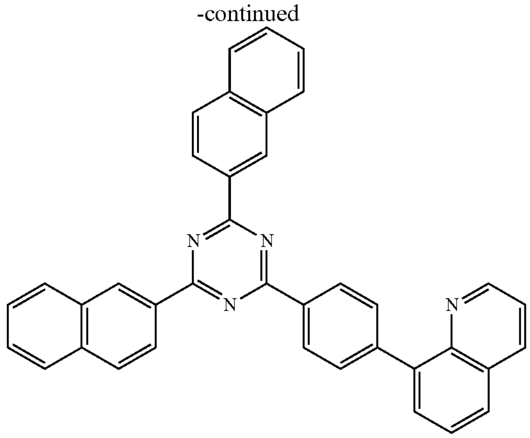

The triazine derivative can be produced by using a publicly-known raw material and a publicly-known synthesis method.

<Benzimidazole Derivative>

The benzimidazole derivative is a compound represented by Formula (ETM-11), for example.

$\phi$-(benzimidazole-based substituent)n (ETM-11)

Then, $\varphi$ is an n-valent aryl ring (preferably an n-valent benzene ring, naphthalene ring, anthracene ring, fluorene ring, benzofluorene ring, phenalene ring, phenanthrene ring or triphenylene ring), and n is an integer from 1 to 4, and a "benzimidazole-based substituent" is a substituent in which a pyridyl in the "pyridine-based substituent" in Formula (ETM-2), Formula (ETM-2-1) and Formula (ETM-2-2) is replaced with a benzimidazolyl, and at least one hydrogen in the benzimidazole derivative may be replaced with deuterium.

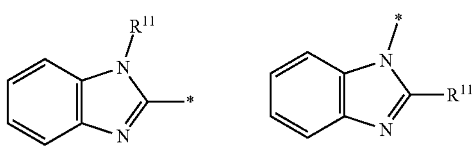

Benzimidazolyl

* represents a bonding position $R^{11}$ in the benzimidazole group is hydrogen, an alkyl having 1 to 24 carbons, a cycloalkyl having 3 to 12 carbons or an aryl having 6 to 30 carbons, and the description for $R^{11}$ in Formula (ETM-2-1) and Formula (ETM-2-2) can be quoted. Moreover, a position in the formulas represents a bonding position.

Then, $\varphi$ is preferably an anthracene ring or a fluorene ring, and for the structure in the above case, the description in Formula (ETM-2-1) or Formula (ETM-2-2) can be quoted, and for $R^{11}$ to $R^{18}$ in each formula, the description in Formula (ETM-2-1) or Formula (ETM-2-2) can be quoted. Moreover, in Formula (ETM-2-1) or Formula (ETM-2-2), described in a form in which the two pyridine-based substituents are bonded, and when the substituent is replaced with the benzimidazole-based substituent, both of the pyridine-based substituents may be replaced with the benzimidazole-based substituent (namely, n=2), or one of the pyridine-based substituents may be replaced with the benzimidazole-based substituent, and the other of the pyridine-based substituents may be replaced with $R^{11}$ to $R^{18}$ (namely, n=1). Further, for example, at least one of $R^{11}$ to $R^{18}$ in Formula (ETM-2-1) may be replaced with the benzimidazole-based substituent, and the "pyridine-based substituent" may be replaced with $R^{11}$ to $R^{18}$.

Specific examples of the benzimidazole derivative include 1-phenyl-2-(4-(10-phenylanthracen-9-yl)phenyl)-1H-benzo[d]imidazole, 2-(4-(10-(naphthalene-2-yl)anthracene-9-yl)phenyl)-1-phenyl-1H-benzo[d]imidazole, 2-(3-(10-(naphthalene-2-yl)anthracene-9-yl)phenyl)-1-phenyl-1H-benzo[d]imidazole, 5-(10-(naphthalene-2-yl)anthracene-9-yl)-1,2-diphenyl-1H-benzo[d]imidazole, 1-(4-(10-(naphthalene-2-yl)anthracene-9-yl)phenyl)-2-phenyl-1H-benzo[d]imidazole, 2-(4-(9,10-di(naphthalene-2-yl)anthracene-2-yl)phenyl-1-phenyl-1H-benzo[d]imidazole, 1-(4-(9,10-di(naphthalene-2-yl)anthracene-2-yl)phenyl-2-phenyl-1H-benzo[d]imidazole and 5-(9,10-di(naphthalene-2-yl)anthracene-2-yl-1,2-diphenyl-1H-benzo[d]imidazole.

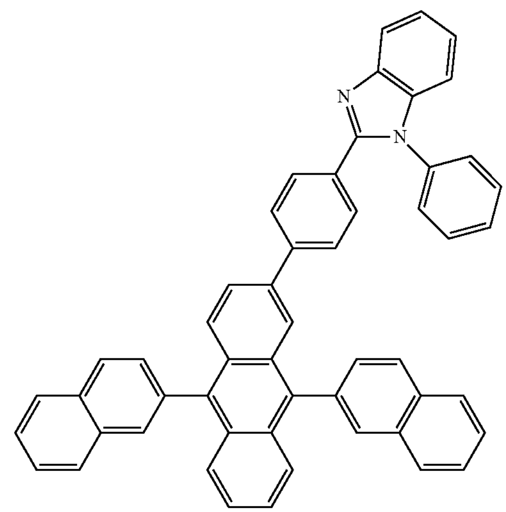

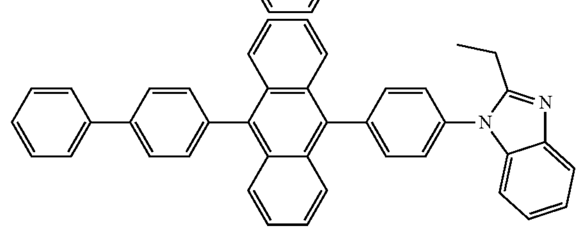

The benzimidazole derivative can be produced by using a publicly known raw material and a publicly-known synthesis method.

<Phenanthroline Derivative>

The phenanthroline derivative is a compound represented by Formula (ETM-12) or Formula (ETM-12-1), for example. The detail is described in WO 2006/021982 A.

(ETM-12)

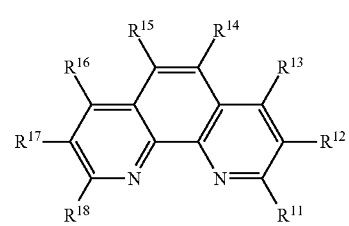

-continued (ETM-12-1)

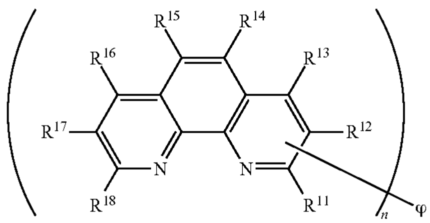

Then, φ is an n-valent aryl ring (preferably, an n-valent benzene ring, naphthalene ring, anthracene ring, fluorene ring, benzofluorene ring, phenalene ring, phenanthrene ring or triphenylene ring), and n is an integer from 1 to 4.

$R^{11}$ to $R^{18}$ in each formula are independently hydrogen, an alkyl (preferably alkyl having 1 to 24 carbons), a cycloalkyl (preferably cycloalkyl having 3 to 12 carbons) or an aryl (preferably aryl having 6 to 30 carbons). In Formula (ETM-12-1), any one of $R^{11}$ to $R^{18}$ is bonded to φ being an aryl ring.

At least one hydrogen in each phenanthroline derivative may be replaced with deuterium.

As the alkyl, the cycloalkyl and the aryl in $R^{11}$ to $R^{18}$, the description for $R^{11}$ to $R^{18}$ in Formula (ETM-2) can be quoted. Moreover, specific examples of 9 include the following structural formula in addition to the above examples. In addition, R in the structural formulas described below is independently hydrogen, methyl, ethyl, isopropyl, cyclohexyl, phenyl, 1-naphthyl, 2-naphthyl, biphenylyl or terphenylyl, and a position represents a bonding position.

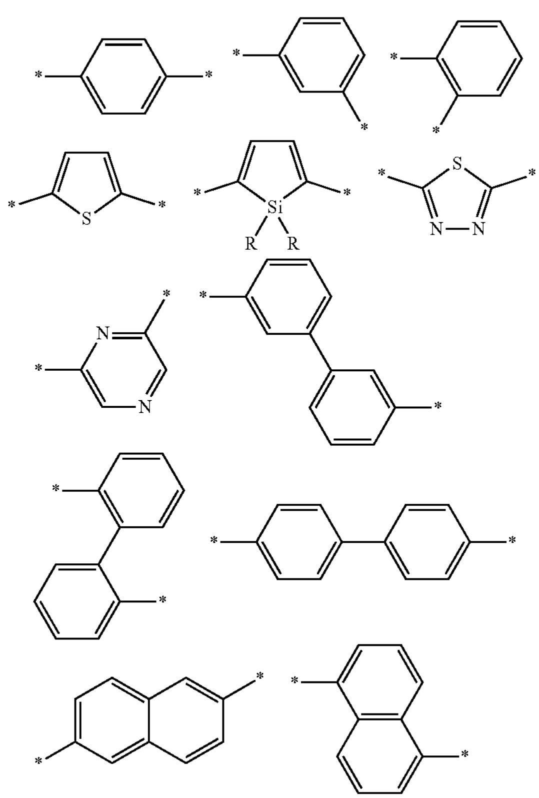

-continued

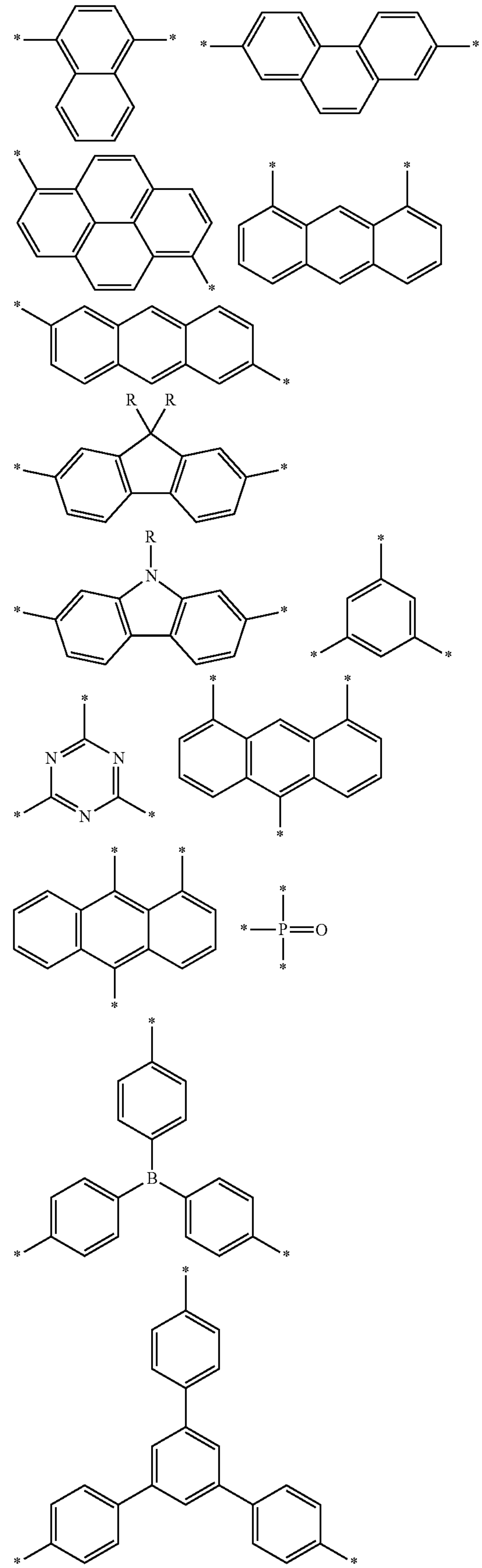

-continued

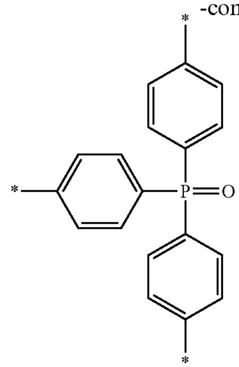

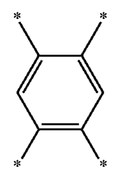

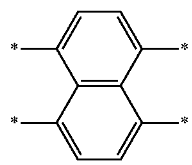

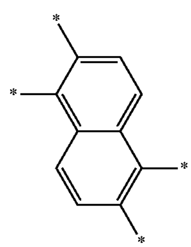

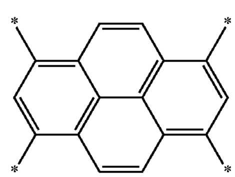

Specific examples of the phenanthroline derivative include 4,7-diphenyl-1,10-phenanthroline, 2,9-dimethyl-4,7-diphenyl-1,10-phenanthroline, 9,10-di(1,10-phenanthroline-2-yl)anthracene, 2,6-di(1,10-phenanthroline-5-yl)pyridine, 1,3,5-tri(1,10-phenanthroline-5-yl)benzene, 9,9'-difluoro-bi(1,10-phenanthroline-5-yl, bathocuproine, 1,3-bis(2-phenyl-1,10-phenanthroline-9-yl)benzene, and a compound represented by the following structural formula

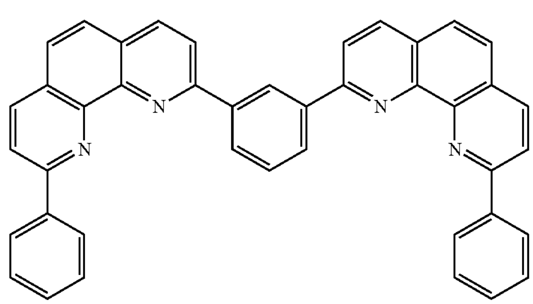 [SMILES: c1ccc(-c2ccc3ccc4ccc(-c5cccc(-c6ccc7ccc8ccc(-c9ccccc9)nc8c7n6)c5)nc4c3n2)cc1]

The phenanthroline derivative can be produced by using a publicly known raw material and a publicly-known synthesis method.

<Quinolinol Metal Complex>

The quinolinol metal complex is a compound represented by Formula (ETM-13), for example.

(ETM-13)

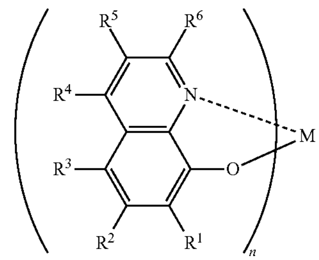

In the formula, R$^1$ to R$^6$ are independently hydrogen, fluorine, alkyl, cycloalkyl, aralkyl, alkenyl, cyano, alkoxy or and, and M is Li, Al, Ga, Be or Zn, and n is an integer from 1 to 3.

Specific examples of the quinolinol metal complex include 8-quinolinol lithium, tris(8-quinolate)aluminum, tris(4-methyl-8-quinolate)aluminum, tris(5-methyl-8-quinolate)aluminum, tris(3,4-dimethyl-8-quinolate)aluminum, tris(4,5-dimethyl-8-quinolate)aluminum, tris(4,6-dimethyl-8-quinolate)aluminum, bis(2-methyl-8-quinolate(phenolate) aluminum, bis(2-methyl-8-quinolate(2-methylphenolate) aluminum, bis(2-methyl-8-quinolate(3-methylphenolate) aluminum, bis(2-methyl-8-quinolate(4-methylphenolate) aluminum, bis(2-methyl-8-quinolate(2-phenylphenolate) aluminum, bis(2-methyl-8-quinolate(3-phenylphenolate) aluminum, bis(2-methyl-8-quinolate(4-phenylphenolate) aluminum, bis(2-methyl-8-quinolate(2,3-dimethylphenolate)aluminum, bis(2-methyl-8-quinolate(2,6-dimethylphenolate)aluminum, bis(2-methyl-8-quinolate (3,4-dimethylphenolate)aluminum, bis(2-methyl-8-quinolate(3,5-dimethylphenolate)aluminum, bis(2-methyl-8-quinolate(3,5-di-t-butylphenolate)aluminum, bis(2-methyl-8-quinolate(2,6-diphenylphenolate)aluminum, bis (2-methyl-8-quinolate(2,4,6-triphenylphenolate)aluminum, bis(2-methyl-8-quinolate(2,4,6-trimethylphenolate)aluminum, bis(2-methyl-8-quinolate(2,4,5,6-tetramethylphenolate)aluminum, bis(2-methyl-8-quinolate(1-naphtholate)aluminum, bis(2-methyl-8-quinolate(2-naphtholate)aluminum, bis(2,4-dimethyl-8-quinolate(2-phenylphenolate)aluminum, bis(2,4-dimethyl-8-quinolate(3-phenylphenolate)aluminum, bis(2,4-dimethyl-8-quinolate(4-phenylphenolate)aluminum, bis(2,4-dimethyl-8-quinolate(3,5-dimethylphenolate)aluminum, bis(2,4-dimethyl-8-quinolate(3,5-di-t-butylphenolate) aluminum, bis(2-methyl-8-quinolate)aluminum-μ-oxo-bis (2-methyl-8-quinolate)aluminum, bis(2,4-dimethyl-8-quinolate)aluminum-μ-oxo-bis(2,4-dimethyl-8-quinolate) aluminum, bis(2-methyl-4-ethyl-8-quinolate)aluminum-μ-oxo-bis(2-methyl-4-ethyl-8-quinolate)aluminum, bis(2-methyl-4-methyl-8-quinolate)aluminum-μ-oxo-bis(2-methyl-4-methoxy-8-quinolate)aluminum, bis(2-methyl-5-cyano-8-quinolate)aluminum-μ-oxo-bis(2-methyl-5-cyano-8-quinolate)aluminum, bis(2-methyl-5-trifluoromethyl-8-quinolate)aluminum-μ-oxo-bis(2-methyl-5-trifluoromethyl-8-quinolate)aluminum and bis(10-hydroxybenzo[h] quinoline)beryllium.

The quinolinol metal complex can be produced by using a publicly known raw material and a publicly-known synthesis method.

<Thiazole Derivative and a Benzothiazole Derivative>

The thiazole derivative is a compound represented by Formula (ETM-14-1), for example.

$\phi$-(thiazole-based substituent)n (ETM-14-1)

The benzothiazole derivative is a compound represented by Formula (ETM-14-2), for example.

φ-(benzothiazole-based substituent)n (ETM-14-2)

Then, φ in each formula is an n-valent aryl ring (preferably an n-valent benzene ring, naphthalene ring, anthracene ring, fluorene ring, benzofluorene ring, phenalene ring, phenanthrene ring or triphenylene ring), and n is an integer from 1 to 4, and the "thiazole-based substituent" or the "benzothiazole-based substituent" are a substituent in which the pyridyl group in the "pyridine-based substituent" in Formula (ETM-2), Formula (ETM-2-1) and Formula (ETM-2-2) is replaced with a thiazolyl or a benzothiazolyl described below (a position in the formulas represents a bonding position.), and at least one hydrogen in the thiazole derivative and the benzothiazole derivative may be replaced with deuterium

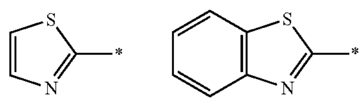

* represents a bonding position

Then, φ is preferably an anthracene ring or a fluorene ring, and for the structure in the above case, the description in Formula (ETM-2-1) or Formula (ETM-2-2) can be quoted, and for $R^{11}$ to $R^{18}$ in each formula, the description in Formula (ETM-2-1) or Formula (ETM-2-2) can be quoted. Moreover, in Formula (ETM-2-1) or Formula (ETM-2-2), described in a form in which the two pyridine-based substituents are bonded, and when the substituent is replaced with the thiazole-based substituent (or benzothiazole-based substituent), both of the pyridine-based substituents may be replaced with the thiazole-based substituent (or benzothiazole-based substituent) (namely, n=2), or one of the pyridine-based substituents may be replaced with the thiazole-based substituent (or benzothiazole-based substituent), and the other of the pyridine-based substituents may be replaced with $R^{11}$ to $R^{18}$ (namely, n=1). Further, for example, at least one of $R^{11}$ to $R^{18}$ in Formula (ETM-2-1) may be replaced with the thiazole-based substituent (or benzothiazole-based substituent), and the "pyridine-based substituent" may be replaced with $R^{11}$ to $R^{18}$.

The above thiazole derivative or benzothiazole derivative can be produced by using a publicly-known raw material and a publicly-known synthesis method.

<Silol Derivatives>

The silole derivative is a compound represented by Formula (ETM-15), for example. The details are described in JP 9-194487 A.

(ETM-15)

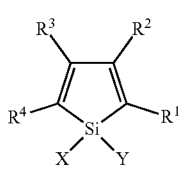

X and Y are each independently an alkyl, a cycloalkyl, an alkenyl, an alkynyl, an alkoxy, an alkenyloxy, an alkynyloxy, an aryl, a heteroaryl, each of which may be substituted. For a detailed description of these groups, the description in Formulae (1) and (2), as well as the description in Formula (ETM-7-2), can be quoted. In addition, an alkenyloxy and an alkynyloxy are groups in which an alkyl moiety in an alkoxy is replaced with an alkenyl or an alkynyl, respectively, thus for details, the description of the alkenyl and alkynyl in Formula (ETM-7-2) can be quoted.

Further, X and Y may be bonded to form a cycloalkyl ring (and a ring in which a part thereof becomes unsaturated), and for details of this cycloalkyl ring, the description of cycloalkyl in Formula (1) and Formula (2) can be referred to.

$R^1$ to $R^4$ are, each independently, hydrogen, a halogen, an alkyl, a cycloalkyl, an alkoxy, an aryloxy, amino, an alkylcarbonyl, an arylcarbonyl, an alkoxycarbonyl, an aryloxycarbonyl, azo group, an alkylcarbonyloxy, an arylcarbonyloxy, an alkoxycarbonyloxy, an aryloxycarbonyloxy, sulfinyl, sulfonyl, sulfanyl, silyl, carbamoyl, an aryl, a heteroaryl, an alkenyl, an alkynyl, nitro, formyl, nitroso, formyloxy, isocyano, cyanate, isocyanate, thiocyanate, isothiocyanate, or cyano, each of which may be substituted with an alkyl, a cycloalkyl, an aryl or a halogen, and may form a fused ring between the adjacent substituents.

For details of the halogen, alkyl, cycloalkyl, alkoxy, aryloxy, amino, aryl, heteroaryl, alkenyl and alkynyl in $R^1$ to $R^4$, the description in Formulae (1) and (2) can be quoted.

Also for details of the alkyl, aryl and alkoxy in alkylcarbonyl, arylcarbonyl, alkoxycarbonyl, aryloxycarbonyl, alkylcarbonyloxy, arylcarbonyloxy, alkoxycarbonyloxy and aryloxycarbonyloxy in $R^1$~$R^4$, the description in Formulae (1) and (2) can be quoted.

Examples of silyl include an unsubstituted silyl and a group in which at least one of 3 hydrogens in silyl are each independently replaced with an aryl, alkyl or cycloalkyl, and trisubstituted silyl is preferred, and examples thereof include a triarylsilyl, a trialkylsilyl, a tricycloalkylsilyl, a dialkylcycloalkylsilyl an alkyldicycloalkylsilyl, and the like. For the details of the aryl, alkyl and cycloalkyl in these, the description in Formula (1) and Formula (2) can be quoted.

The fused ring formed between adjacent substituents is, for example, a conjugated or unconjugated fused ring formed between $R^1$ and $R^2$, $R^2$ and between $R^3$, $R^3$ and $R^4$, and the like. The above fused rings may contain nitrogen, oxygen or sulfur atoms in an endocyclic structure, and may be fused to another ring.

Preferably, however, when $R^1$ and $R^4$ are phenyl, X and Y are not alkyl or phenyl. Also preferably, when $R^1$ and $R^4$ are thienyl, it is not simultaneously satisfied that X and Y are alkyls and $R^2$ and $R^3$ are any of an alkyl, an aryl and an alkenyl, or $R^2$ and $R^3$ are coupled to each other to form a ring, Also preferably, when $R^1$ and $R^4$ are silyl, $R^2$, $R^3$, X and Y are each independently, not hydrogen or an alkyl having 1 to 6 carbons. Also preferably, when the benzene ring is fused at $R^1$ and $R^2$, X and Y are not an alkyl and phenyl.

The above silole derivatives can be produced by using a publicly known raw material and a publicly-known synthesis method.

<Azoline Derivatives>

The azoline derivative is a compound represented by Formula (ETM-16), for example Details are described in WO 2017/014226.

(ETM-16)

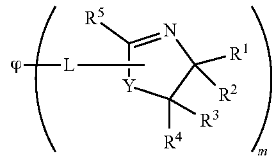

In Formula (ETM-16),

φ is an m-valent group derived from an aromatic hydrocarbon having 6 to 40 carbons or an m-valent group derived from an aromatic heterocycle having 2 to 40 carbons, and at least one hydrogen in φ may be replaced with an alkyl having 1 to 6 carbons, a cycloalkyl having 3 to 14 carbons, an aryl having 6 to 18 carbons or a heteroaryl having 2 to 18 carbons.

Y are each independently —O—, —S— or >N—Ar, wherein Ar is an aryl having 6 to 12 carbons or a heteroaryl having 2 to 12 carbons, and at least one hydrogen in Ar may be replaced with an alkyl having 1 to 4 carbons, a cycloalkyl having 5 to 10 carbons, an aryl having 6 to 12 carbons or a heteroaryl having 2 to 12 carbons. $R^1$ to $R^5$ are each independently hydrogen, an alkyl having 1 to 4 carbons or a cycloalkyl having 5 to 10 carbons, provided that any one of Ar in the above >N—Ar and the above $R^1$ to $R^5$ is the site that binds to L, L are each independently selected from the group consisting of a divalent group represented by the following formula (L-1) and a divalent group represented by the following formula (L-2), (L-1)

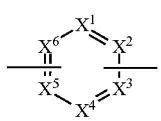

(L-2)

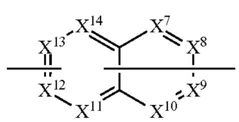

In Formula (L-1), $X^1$ to $X^6$ are each independently =CR$^6$— or =N—, at least two of $X^1$ to $X^6$ are =CR$^6$—, $R^6$ in CR$^6$— of two of $X^1$ to $X^6$ is the site that binds to φ or azoline ring, and $R^6$ in the other =CR$^6$— is hydrogen.

In Formula (L-2), $X^7$ to $X^{14}$ are each independently =CR$^6$— or =N—, at least two of $X^7$ to $X^{14}$ are =CR$^6$—, $R^6$ in CR$^6$— of two of $X^7$ to $X^{14}$ is the site that binds to φ or azoline ring, and $R^6$ in the other =CR$^6$— is hydrogen, at least one hydrogen in L may be replaced with an alkyl having 1 to 4 carbons, a cycloalkyl having 5 to 10 carbons, an aryl having 6 to 10 carbons or a heteroaryl having 2 to 10 carbons, m is an integer from 1 to 4, and when m is 2 to 4, the groups formed between the azoline ring and L may be the same or different, and at least one hydrogen in the compound represented by Formula (ETM-16) may be replaced with deuterium.

Specific azoline derivatives are compounds represented by the following formula (ETM-16-1) or formula (ETM-16-2).

(ETM-16-1)

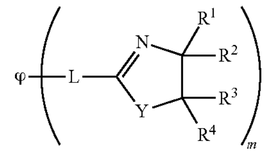

(ETM-16-2)

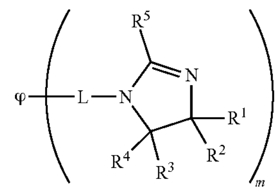

In Formula (ETM-16-1) and Formula (ETM-16-2),

φ is an m-valent group derived from an aromatic hydrocarbon having 6 to 40 carbons or an m-valent group derived from an aromatic heterocycle having 2 to 40 carbons, and at least one hydrogen of φ may be replaced with an alkyl having 1 to 6 carbons, a cycloalkyl having 3 to 14 carbons, an aryl having 6 to 18 carbons or a heteroaryl having 2 to 18 carbons.

In Formula (ETM-16-1), Y are each independently —O—, —S— or >N—Ar. Ar is an aryl having 6 to 12 carbons or a heteroaryl having 2 to 12 carbons, and at least one hydrogen in Ar may be replaced with an alkyl having 1 to 4 carbons, a cycloalkyl having 5 to 10 carbons, an aryl having 6 to 12 carbons or a heteroaryl having 2 to 12 carbons.

In Formula (ETM-16-1), $R^1$ to $R^4$ are each independently hydrogen, alkyl having 1 to 4 carbons, cycloalkyl having 5 to 10 carbons, provided that $R^1$ and $R^2$ are identical, and $R^3$ and $R^4$ are identical.

In Formula (ETM-16-2), $R^1$ to $R^5$ are each independently hydrogen, alkyl having 1 to 4 carbons, cycloalkyl having 5 to 10 carbons, provided that $R^1$ and $R^2$ are identical, and $R^3$ and $R^4$ are identical.

In Formula (ETM-16-1) and Formula (ETM-16-2), L are each independently selected from the group consisting of a divalent group represented by the following formula (L-1) and a divalent group represented by the following formula (L-2).

(L-1)

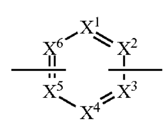

(L-2)

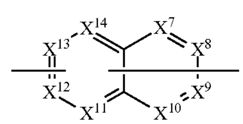

In Formula (L-1), $X^1$ to $X^6$ are each independently =CR$^6$— or =N—, at least two of $X^1$ to $X^6$ are =CR$^6$—, $R^6$ in CR$^6$— of two of $X^1$ to $X^6$ is the site that binds to φ or azoline ring, and $R^6$ in the other =CR$^6$— is hydrogen, In Formula (L-2), $X^7$ to $X^{14}$ are each independently =CR$^6$— or =N—, at least two of $X^7$ to $X^{14}$ are =CR$^6$—, $R^6$ in CR$^6$— of two of $X^7$ to $X^{14}$ is the site that binds to φ or azoline ring, and $R^6$ in the other =CR$^6$— is hydrogen, at least one hydrogen of L may be replaced with an alkyl having 1 to 4 carbons, a cycloalkyl having 5 to 10 carbons, an aryl having 6 to 10 carbons or a heteroaryl having 2 to 10 carbons m is an integer from 1 to 4, and when m is 2 to 4, the groups formed between the azoline ring and L may be the same or different, and at least one hydrogen in the compound represented by Formula (ETM-16-1) or Formula (ETM-16-2) may be replaced with deuterium.

More preferably, φ is selected from the group consisting of a monovalent group represented by the following formulas (φ 1-1) to (φ 1-18), a divalent group represented by the following formulas (φ 2-1) to (φ 2-34), a trivalent group represented by the following formulas (φ 3-1) to (φ 3-3), and a tetravalent group represented by the following formulas (φ 4-1) to (φ 4-2), at least one of hydrogens of φ may be replaced with an alkyl having 1 to 6 carbons, a cycloalkyl having 3 to 14 carbons, an aryl having 6 to 18 carbons, a heteroaryl having 2 to 18 carbons.

(∅1-1)

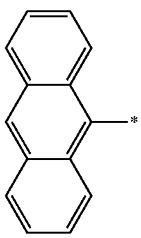

(∅1-2)

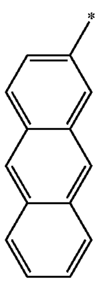

(∅1-3)

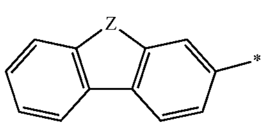

(∅1-4)

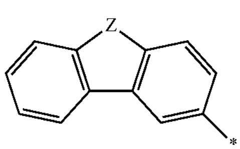

(∅1-5)

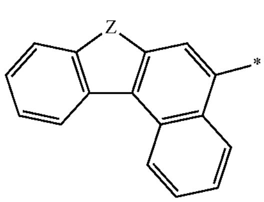

-continued (∅1-6)

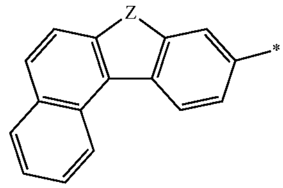

(∅1-7)

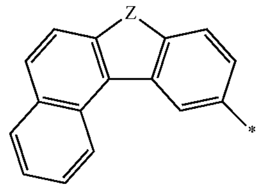

(∅1-8)

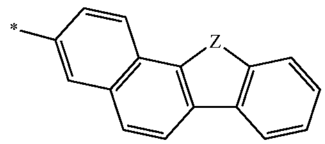

(∅1-9)

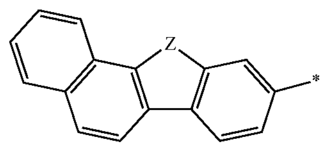

(∅1-10)

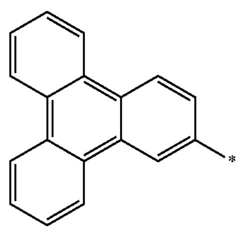

(∅1-11)

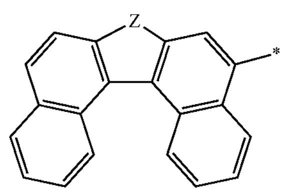

(∅1-12)

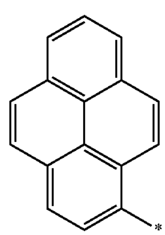

(∅1-13)

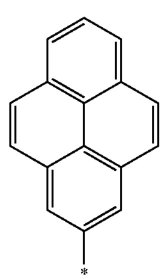

-continued
(∅1-14)
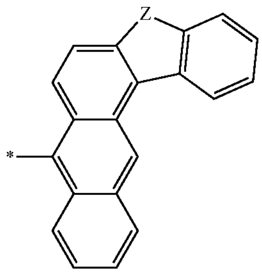
(∅1-15)
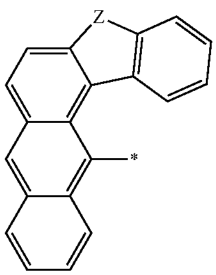
(∅1-16)
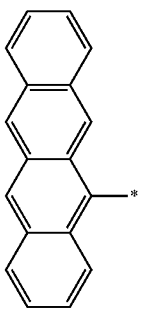
(∅1-17)
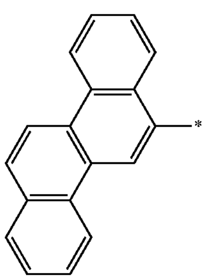
(∅1-18)
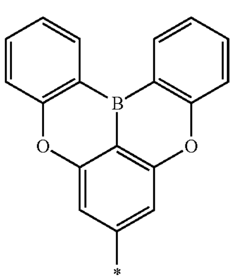
(∅2-1)
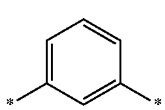
-continued
(∅2-2)
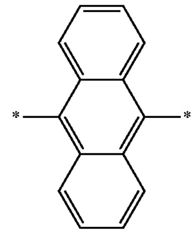
(∅2-3)
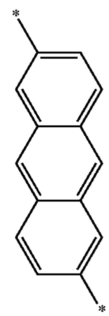
(∅2-4)
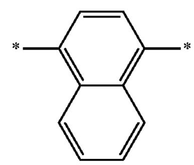
(∅2-5)
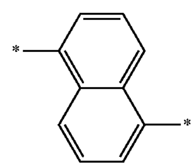
(∅2-5)
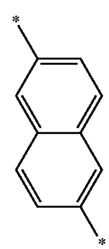
(∅2-7)
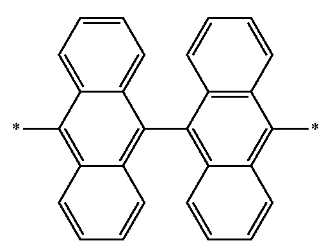
(∅2-8)
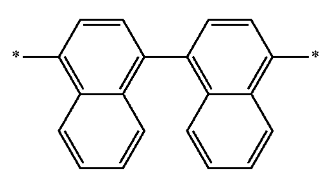

-continued
(∅2-9)
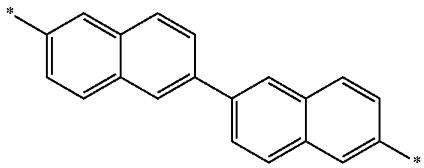
(∅2-10)
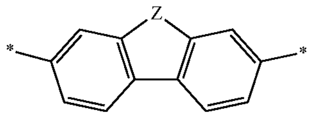
(∅2-11)
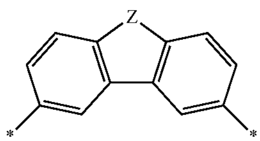
(∅2-12)
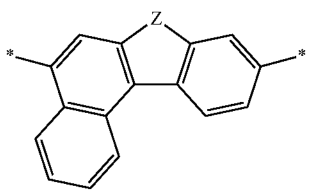
(∅2-13)
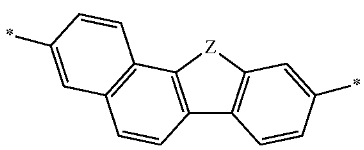
(∅2-14)
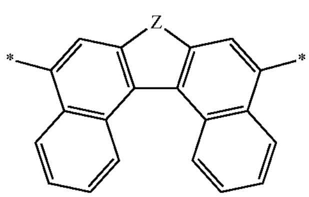
(∅2-15)
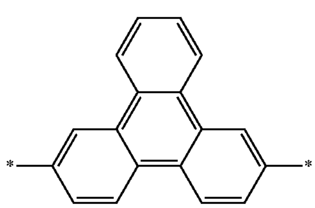
(∅2-16)
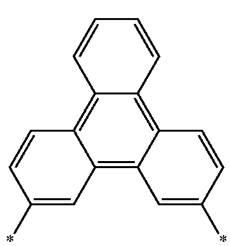
-continued
(∅2-17)
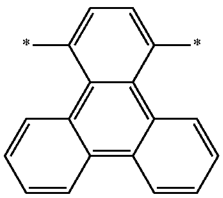
(∅2-18)
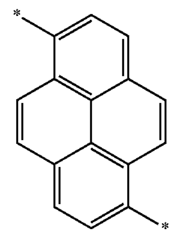
(∅2-19)
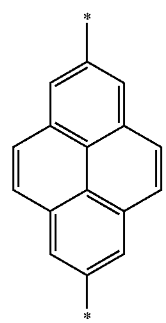
(∅2-20)
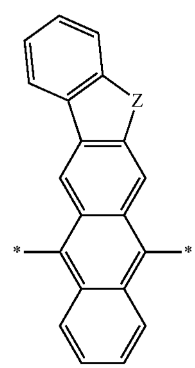
(∅2-21)
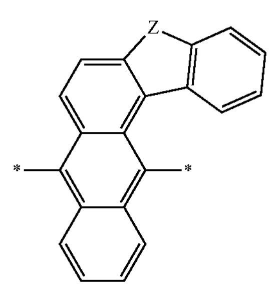

-continued
(∅2-22)
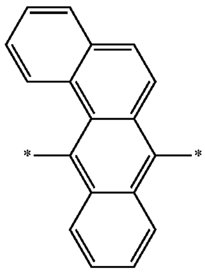
(∅2-23)
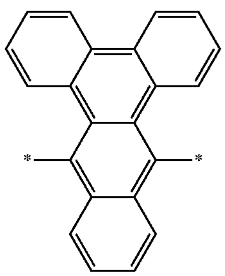
(∅2-24)
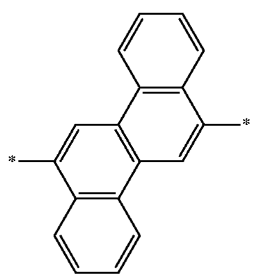
(∅2-25)
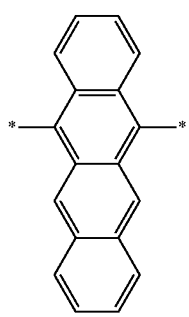
(∅2-26)
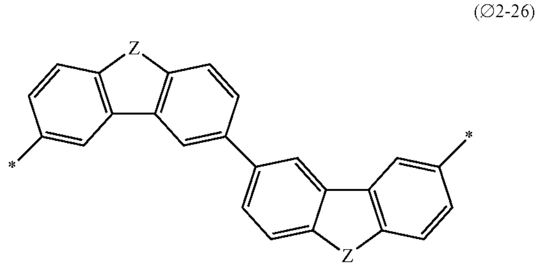
-continued
(∅2-27)
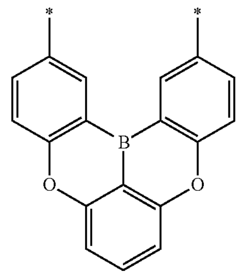
(∅2-28)
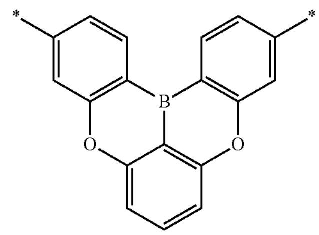
(∅2-29)
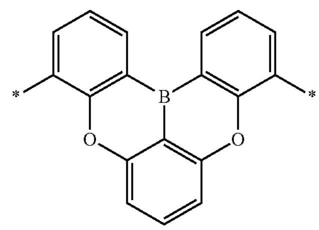
(∅2-30)
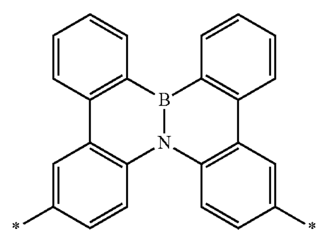
(∅2-31)
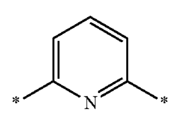
(∅2-32)
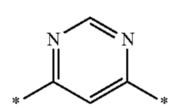
(∅2-33)
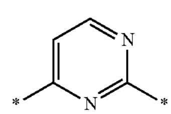
(∅2-34)
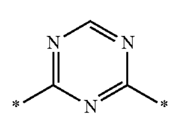
(∅3-1)
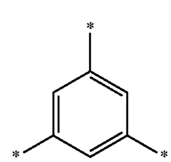

-continued (∅3-2)

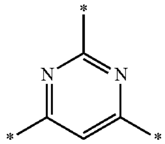

(∅3-3)

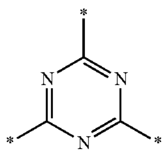

(∅4-1)

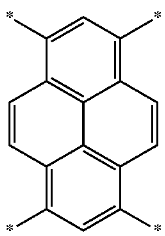

(∅4-2)

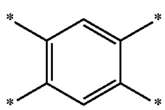

Z in the formula is >$CR_2$, >N—Ar, >N-L, —O— or —S—, R in >$CR_2$ are each independently an alkyl having 1 to 4 carbons, a cycloalkyl having 5 to 10 carbons, an aryl having 6 to 12 carbons, or a heteroaryl having 2 to 12 carbons, R may be bonded to each other to form a ring, Ar in >N—Ar is an aryl having 6 to 12 carbons or a heteroaryl having 2 to 12 carbons, and L in >N-L is L in Formula (ETM-16), Formula (ETM-16-1), or Formula (ETM-16-2). In the formula, * represents a binding position.

Preferably, L is a divalent group of a ring selected from the group consisting of benzene, naphthalene, pyridine, pyrazine, pyrimidine, pyridazine, triazine, quinoline, isoquinoline, naphthyridine, phthalazine, quinoxaline, quinazoline, cinnoline, and pteridine, wherein at least one hydrogen in L may be replaced with an alkyl having 1 to 4 carbons, a cycloalkyl having 5 to 10 carbons, an aryl having 6 to 10 carbons or a heteroaryl having 2 to 10 carbons.

Preferably, Ar in >N—Ar as Y or Z is selected from the group consisting of phenyl, naphthyl, pyridinyl, pyrazinyl, pyrimidinyl, pyridazinyl, triazinyl, quinolinyl, isoquinolinyl, naphthyridinyl, phthalazinyl, quinoxalinyl, quinazolinyl, cinnolinyl, and pteridinyl, wherein at least one hydrogen in Ar in >N—Ar as Y may be replaced with an alkyl having 1 to 4 carbons, a cycloalkyl having 5 to 10 carbons or an aryl having 6 to 10 carbons.

Preferably, $R^1$ to $R^4$ are each independently hydrogen, an alkyl having 1 to 4 carbons or a cycloalkyl having 5 to 10 carbons, wherein $R^1$ and $R^2$ are identical, $R^5$ and $R^4$ are identical, and not all of $R^1$ to $R^4$ are simultaneously hydrogen, and when m is 1 or 2 and m is 2, the groups formed by the azoline ring and L are identical.

Specific examples of azoline derivative include compounds described below. "Me" in the structural formula represents methyl

ETM-16-(1)

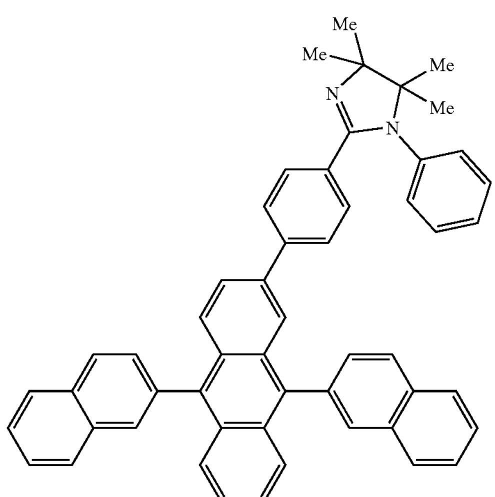

ETM-16-(2)

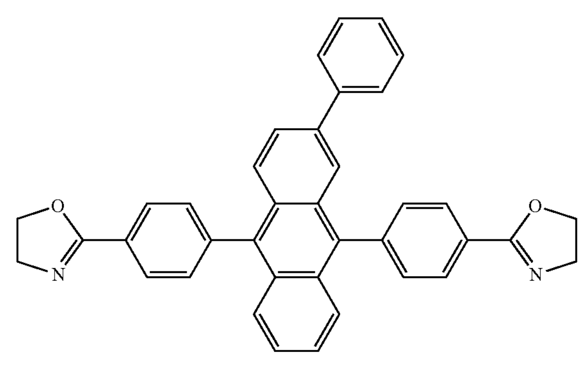

ETM-16-(3)

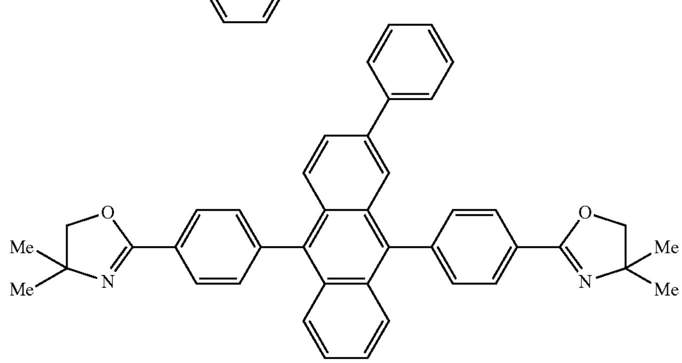

-continued
ETM-16-(4)
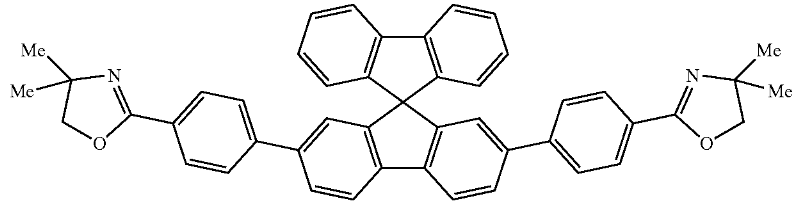
ETM-16-(5)
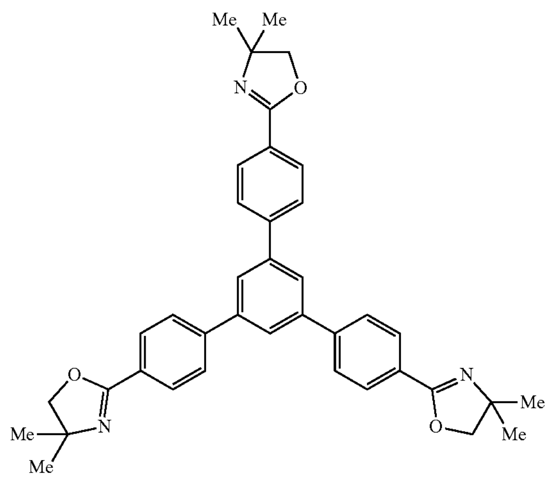
ETM-16-(6)
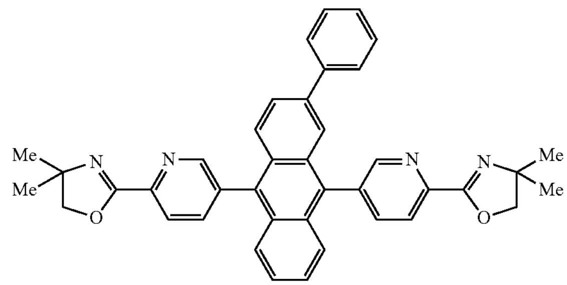
ETM-16-(7)
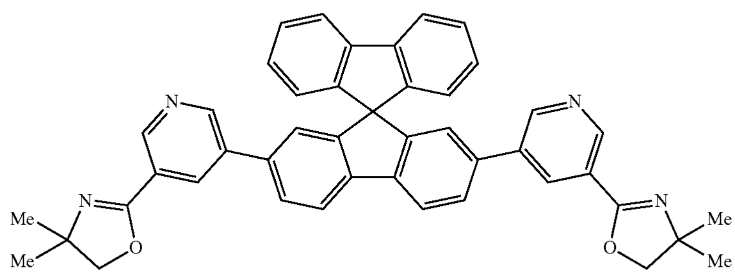
ETM-16-(8)
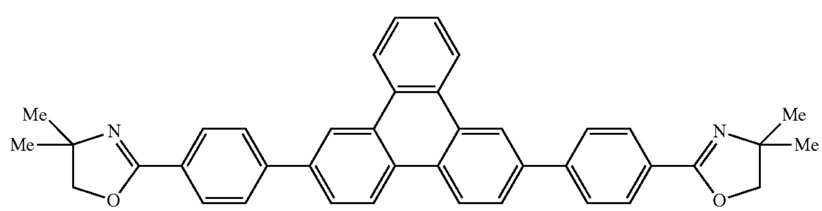
ETM-16-(9)
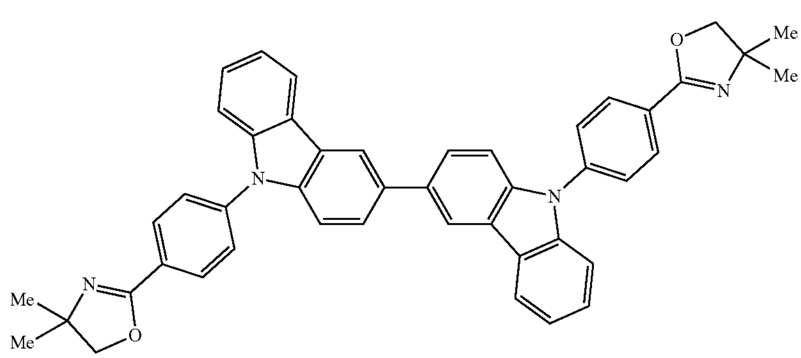

-continued

ETM-16-(10)

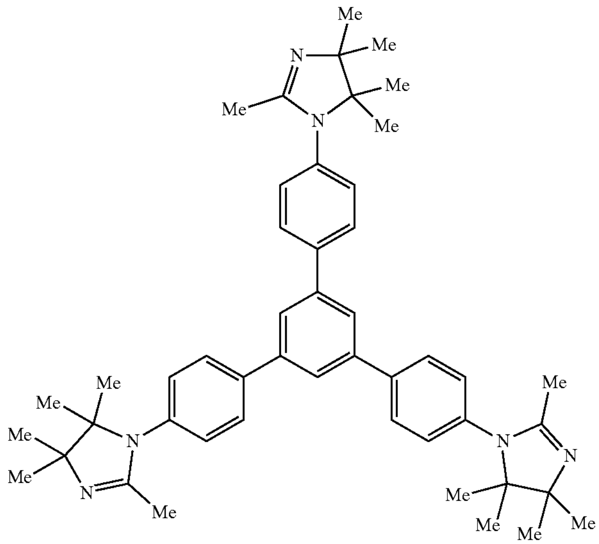

More preferably, φ is selected from the group consisting of divalent groups represented by formulae (φ 2-1), (φ 2-31), (φ 2-32), (φ 2-33) and (φ 2-34) below, wherein at least one hydrogen in φ may be replaced with an aryl having 6 to 18 carbons, (φ2-1)

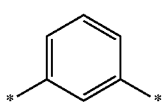

(φ2-31)

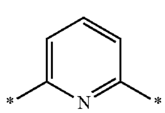

(φ2-32)

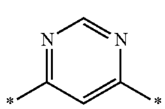

(φ2-33)

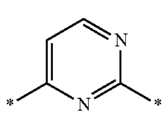

(φ2-34)

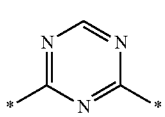

(* indicates the binding position)

L is a divalent group of a ring selected from the group consisting of benzene, pyridine, pyrazine, pyrimidine, pyridazine, and triazine, wherein at least one hydrogen of L may be replaced with an alkyl having 1 to 4 carbons, a cycloalkyl having 5 to 10 carbons, an aryl having 6 to 10 carbons or a heteroaryl having 2 to 14 carbons, Ar in >N—Ar as Y is selected from the group consisting of phenyl, pyridinyl, pyrazinyl, pyrimidinyl, pyridazinyl, and triazinyl, wherein at least one hydrogen in Ar may be replaced with an alkyl having 1 to 4 carbons, a cycloalkyl having 5 to 10 carbons or an aryl having 6 to 10 carbons, $R^1$ to $R^4$ are each independently hydrogen, alkyl with 1 to 4 carbons, or cycloalkyl with 5 to 10 carbons, provided that $R^1$ and $R^2$ are identical, $R^2$ and $R^4$ are identical, and not all of $R^1$ to $R^4$ are simultaneously hydrogen, m is 2, and the group formed by the azoline ring and L are identical.

Specific example of the azoline derivative include compounds described below. "Me" in the structural formula represents methyl.

ETM-16-(11)

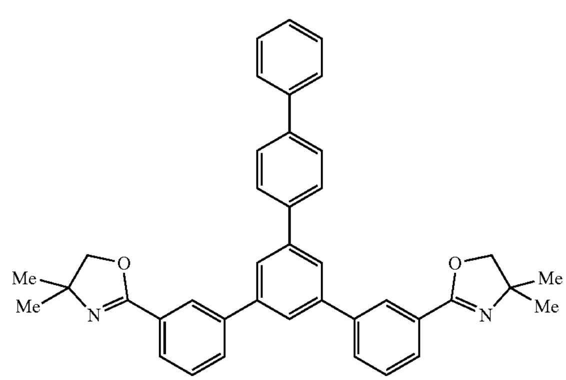

-continued

ETM-16-(12)

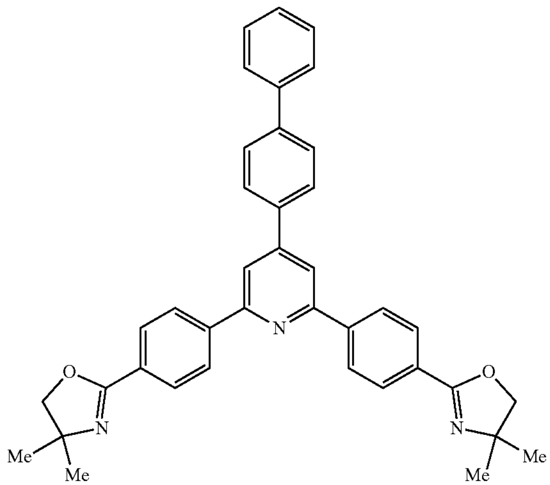

ETM-16-(13)

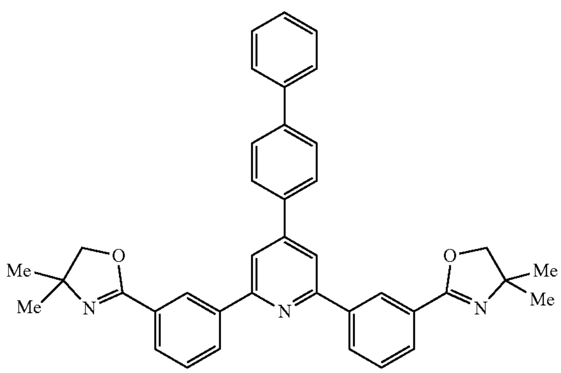

ETM-16-(14)

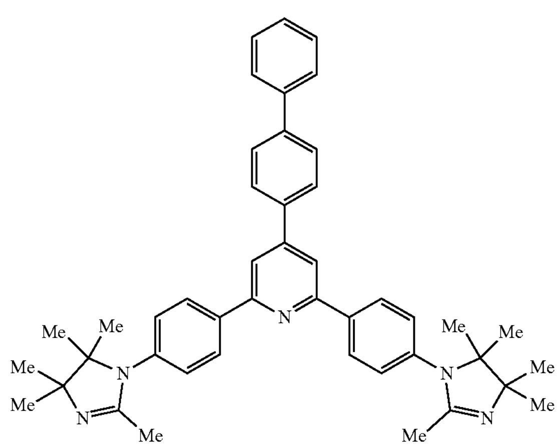

-continued

ETM-16-(15)

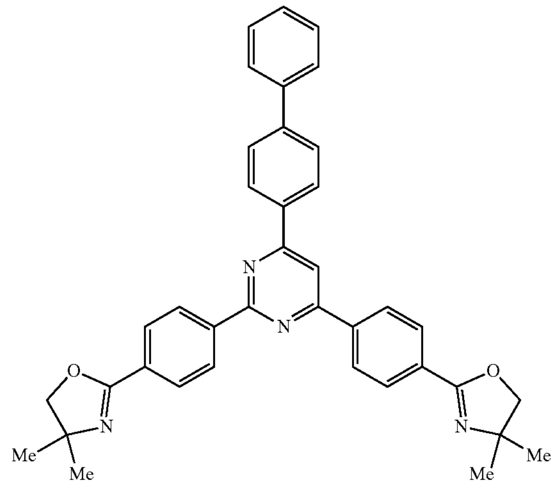

ETM-16-(16)

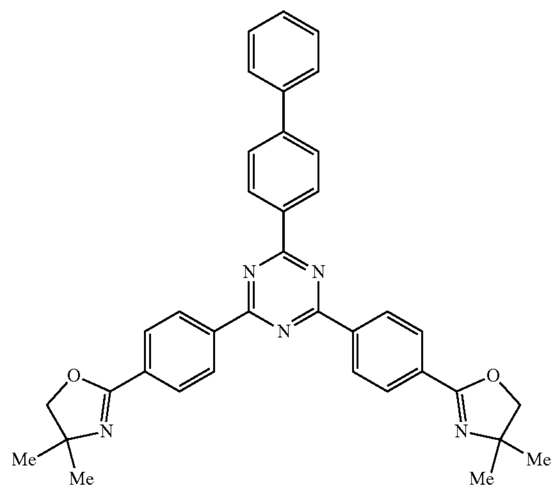

For details of the alkyl, cycloalkyl, aryl or heteroaryl in each of the above formulas defining the azoline derivative, the description in Formula (1) and Formula (2) can be quoted.

The azoline derivative can be produced by using a publicly-known raw material and a publicly-known synthesis method.

<Reducing Substance>

The electron transport layer and/or the electron injection layer further includes a substance that can reduce a material forming the electron transport layer or the electron injection layer. Various substances are used as the reducing substance if the substance has predetermined reducing properties. For example, at least one selected from the group of alkali metal, alkaline earth metal, rare earth metal, an oxide of alkali metal, a halide of alkali metal, an oxide of alkaline earth metal, a halide of alkaline earth metal, an oxide of rare earth metal, a halide of rare earth metal, an organic complex of alkali metal, an organic complex of alkaline earth metal and an organic complex of rare earth metal can be preferably used.

Specific examples of the preferred reducing substance include alkali metal such as Na (work function: 2.36 eV), K (work function: 2.28 eV), Rb (work function: 2.16 eV) or Cs (work function 1.95 eV), and alkaline earth metal such as Ca (work function: 2.9 eV), Sr (work function: 2.0 to 2.5 eV) or Ba (work function: 2.52 eV), and a substance having a work-function of 2.9 eV or less is particularly preferred. Among the above substances, as the reducing substance, alkali metal of K, Rb or Cs is preferred, Rb or Cs is further preferred, and Cs is most preferred. The above alkali metals have particularly high reduction capability, and improvement in luminance and extension of a service life in the organic EL element can be achieved by adding a relatively small amount thereof to the material forming the electron transport layer or the electron injection layer. Moreover, as the reducing substance having a work function of 2.9 eV or less, a combination of two or more kinds of alkali metals is preferred, and a combination including Cs, for example, a combination of Cs and Na, Cs and K, Cs and Rb, or Cs and Na and K, is particularly preferred. The reduction capability can be efficiently exhibited by containing Cs, and improvement in luminance and extension of a service life in the organic EL element can be achieved by adding Cs to the material forming the electron transport layer or the electron injection layer.

3-1-3. Hole Injection Layer, and Hole Transport Layer in Organic Electroluminescent Element The hole injection layer 103 play s a role of efficiently injecting the holes having transferred from the anode 102, into the light-emitting layer 105 or the hole transport layer 104. The hole transport layer 104 play s a role of efficiently transporting the holes injected from the anode 102 or the holes injected from the anode 102 via the hole injection layer 103, into the light-emitting layer 105. The hole injection layer 103 and the hole transport layer 104 each are formed by laminating or mixing one or more of hole injection/transport materials or are formed from a mixture of a hole injection/transport material and a polymer binder. An inorganic salt such as iron (III) chloride may be added to the hole injection/transport material to form a layer.

The hole injection/transport material needs to efficiently inject and transport the holes from the positive electrode between electrodes given an electric field and is one having a high hole injection efficiency and capable of efficiently transporting the injected holes. For that purpose, preferably, the substance has a small ionization potential and has a large hole mobility and is excellent in stability and hardly generates impurities to be traps in production and during use.

The material to form the hole injection layer 103 and the hole transport layer 104 can be arbitrarily selected from compounds heretofore generally used as a charge transport material for holes in a photoconductive material, as well as p-type semiconductors and other known compounds that are used in a hole injection layer and a hole transport layer in an organic electroluminescent element. Specific examples thereof include a carbazole derivative (e.g., N-phenylcarbazole, polyvinylcarbazole), a biscarbazole derivative such as bis(N-arylcarbazole) or bis(N-alkylcarbazole), a triarylamine derivative (e.g., a polymer having an aromatic tertiary amino group in the main chain or the side chain, a triphenylamine derivative such as 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine, $N^4$,$N^4$-diphenyl-$N^4$,$N^4$-bis(9-phenyl-9H-carbazol-3-yl)-[1,1'-biphenyl]-4,4'-diamine, $N^4$,$N^4$,$N^{4'}$,$N^{4'}$-tetra[1,1'-biphenyl]-4-yl)-[1,1'-biphenyl]-4,4'-diamine, 4,4',4"-tris(3-methylphenyl(phenyl)amino)triphenylamine, a starburst amine derivative), a stilbene derivative, a phthalocyanine derivative (e.g., metal-free, or copper phthalocyanine), a pyrazoline derivative, a hydrazone compound, a benzofuran derivative, a thiophene derivative, an oxadiazole derivative, a quinoxaline derivative (e.g., 1,4,5,8,9,12-hexaazatriphenylene-2,3,6,7,10,11-hexacarbonitrile), a heterocyclic compound such as a porphyrin derivative, and a polysilane. Regarding the polymer-type substances, a polycarbonate, a styrene derivative, a polyvinyl carbazole and a polysilane having the above-mentioned monomer in the side drain are preferred but are not specifically limited so far as the compounds can form a thin film necessary for production of light-emitting devices and can inject holes from an anode and further can transport holes.

It is known that electric conductivity of organic semiconductors is strongly influenced by doping. Such organic semiconductor matrix substances are formed of compounds having good electron donating performance, or compounds having good electron acceptability. For doping with an electron-donating substance, an electron acceptor such as tetracyanoquinonedimethane (TCNQ) or 2,3,5,6-tetrafluorotetracyano-1,4-benzoquinonedimethane (F4TCNQ) is known (for example, see literature of M. Pfeiffer, A Beyer, T. Fritz, K. Leo, Appl. Phys. Lett., 73(22), 3202-3204 (1998), and literature of J. Blochwitz, M. Pfeiffer, T. Fritz, K. Leo, Appl. Phys. Lett., 73(6), 729-731 (1998)). These form so-called holes by an electron transfer process in an electron-donating base substance (hole transport substance) Depending on the number of holes and the mobility thereof, the conductivity of the base substance greatly varies. As the matrix substance having a hole transporting property, for example, there are known a benzidine compound (e.g., TPD), and a starburst amine derivative (e.g., TDATA), or a specific metal phthalocyanine (especially, zinc phthalocyanine ZnPc) (see JP 2005-167175 A). Further, as the hole injection/transport material, a conductive polymer known as PEDPT/PSS shown in Examples may be used.

Crosslinking Polymer Material: Compound Represented by Formula (XLP-1)

A hole injection layer and a hole transport layer preferably contain a compound represented by Formula (XLP-1) The compound represented by Formula (XLP-1) may be contained in another layer in an organic electroluminescent element Particularly, when an organic layer is formed by a wet film formation method of an organic layer forming composition, the organic layer forming composition preferably contains a compound represented by Formula (XLP-1).

$$\mathrm{ECx}\!-\!\left(\mathrm{MUx}\right)_{k}\!-\!\mathrm{ECx} \qquad \text{(XLP-1)}$$

In Formula (XLP-1),

MUxs are each independently the above MU or a divalent group obtained by removing any two hydrogens from an aromatic compound having a crosslinking substituent (PG), and ECxs are each independently the above EC or a monovalent group obtained by removing any-one hydrogen from an aromatic compound having a crosslinking substituent (PG), provided that the content of monovalent and divalent aromatic compounds having crosslinking substituents (PGs) is 0.1 to 80 wt % in a molecule, and k is an integer of 2 to 50000.

More specifically, the divalent groups obtained by removing any two hydrogens from an aromatic compound having a crosslinking substituent (PG) in a MUx are each independently, an arylene, a heteroarylene, a diarylenearylamino, a diarylenearylboryl, oxaborin-diyl, azaborine-diyl, or the like. At least one hydrogen in these divalent groups is replaced with a crosslinking substituent (PG), and at least one hydrogen in these divalent groups may further be replaced with one or more substituent selected from the group consisting of and, heteroaryl, diarylamino, alkyl, and cycloalkyl. When two crosslinking substituents (PGs) are present in an MUx, the crosslinking substituents (PGs) may be identical to or different from one another and are preferably identical.

The monovalent groups obtained by removing any one hydrogen from an aromatic compound having a crosslinking substituent (PG) in an ECx are each independently, an aryl, a heteroaryl, a diarylamino, a diheteroarylamino, an arylheteroarylamino, or an aryloxy. At least one hydrogen in these monovalent groups is replaced with a crosslinking substituent (PG), and at least one hydrogen in these monovalent groups may further be replaced with one or more substituent selected from the group consisting of an aryl, a heteroaryl, a diarylamino, an alkyl, and a cycloalkyl. When two crosslinking substituents (PGs) are present in an ECx, the crosslinking substituents (PGs) may be identical to or different from one another and are preferably identical.

The content of a divalent group obtained by removing any two hydrogens from an aromatic compound having a crosslinking substituent (PG) and a monovalent group obtained by removing any one hydrogen from an aromatic compound having a crosslinking substituent (PG) is 0.1 to 80 wt %, preferably 0.5 to 50 wt %, and more preferably 1 to 20 wt % in a molecule.

k is an integer of 2 to 50000, preferably an integer of 20 to 50000, and more preferably an integer of 100 to 50000. When k MUxs are constituted of two or more divalent groups, the groups may be bonded at random or may constitute a block of the same type of divalent groups, provided that the latter is preferred.

Examples of the crosslinking substituent (PG) include a monovalent group in winch a monovalent crosslinking partial structure represented by any one of the following formulas (PG-1) to (PG-18) is bonded to L in a divalent partial structure (PG-1)

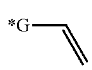

(PG-2)

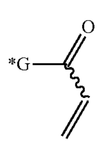

(PG-3)

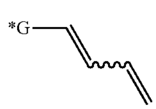

(PG-4)

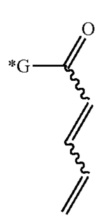

(PG-5)

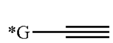

-continued (PG-6)

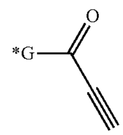

(PG-7)

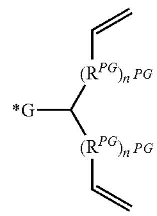

(PG-8)

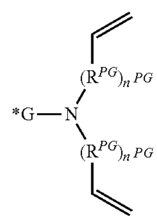

(PG-9)

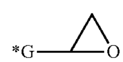

(PG-10)

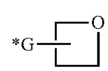

(PG-11)

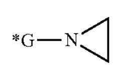

(PG-12)

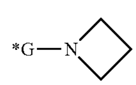

(PG-13)

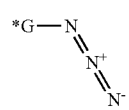

(PG-14)

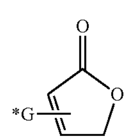

(PG-15)

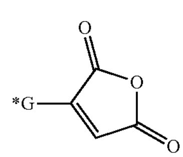

(PG-16)

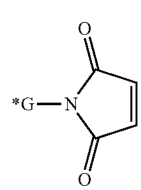

-continued (PG-17)

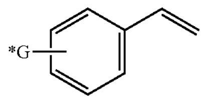

(PG-18)

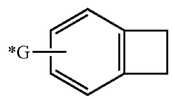

In the formulas (PG-1) to (PG-18), $R^{PG}$ represents methylene, an oxygen atom, or a sulfur atom and $n^{PG}$ represents an integer of 0 to 5, and when a plurality of $R^{PG}$s are present, those may be identical to or different from one another, and when a plurality of $n^{PG}$s are presort, those may be identical to or different from one another; *G represents a bonding position (bonding position with L), and the crosslinking groups represented by the formulas may each have one or more substituent.

Examples of the L in a divalent partial structure in the crosslinking substituent (PG) include a single bond, —O—, >C═O, —O—C(═O)—, a $C_{1-12}$ alkylene, a $C_{1-12}$ oxyalkylene, and a $C_{1-12}$ polyoxyalkylene. As the crosslinking substituent (PG), Formula (PG-1), Formula (PG-2), Formula (PG-3), Formula (PG-9), Formula (PG-10), Formula (PG-10), or Formula (PG-18) is preferred, and Formula (PG-1), Formula (PG-3) or Formula (PG-18) is more preferred.

When a plurality of crosslinking substituents (PGs) are present in Formula (XLP-1), those may be identical to or different from one another.

Examples of the divalent group obtained by removing any two hydrogens from an aromatic compound having a crosslinking substituent (PG) include the following divalent groups.

(MUx-1-1)

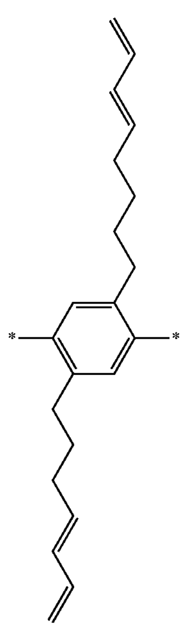

-continued (MUx-1-2)

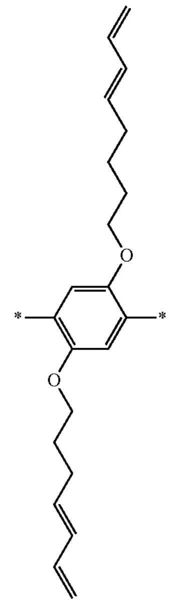

(MUx-1-3)

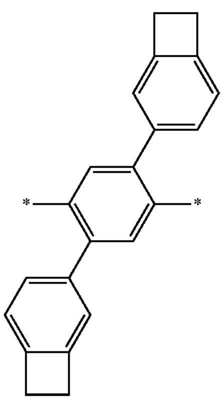

(MUx-1-4)

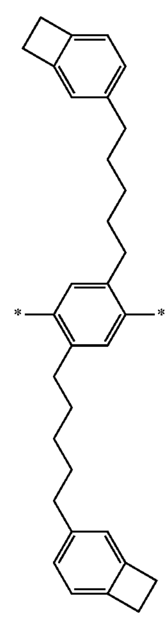

-continued
(MUx-2-1)
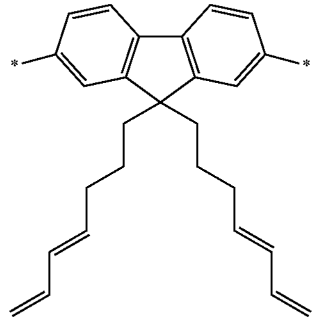
(MUx-2-2)
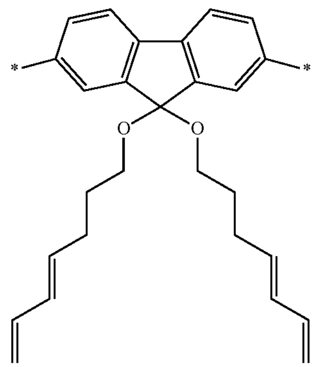
(MUx-2-3)
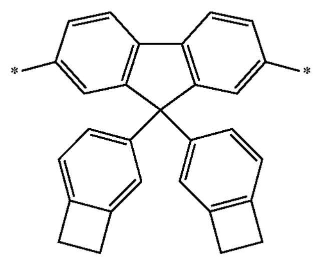
(MUx-2-4)
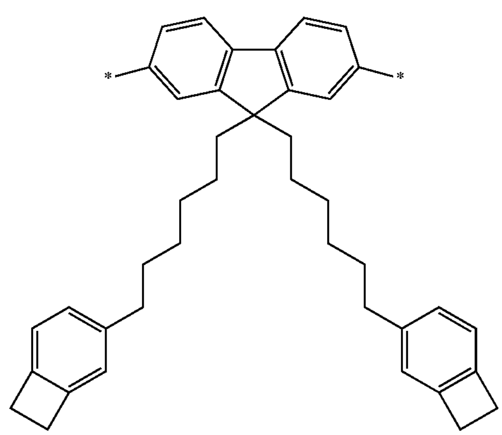
-continued
(MUx-2-5)
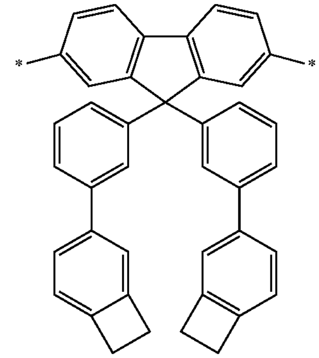
(MUx-3-1)
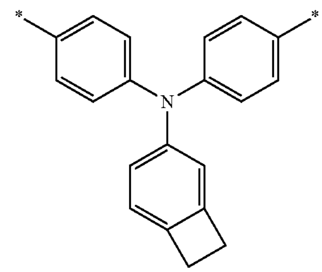
(MUx-3-2)
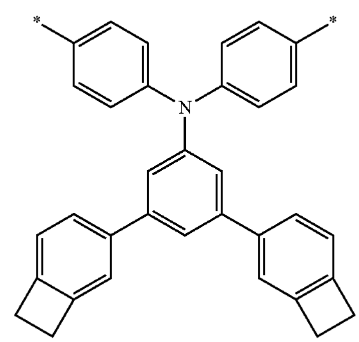
(MUx-3-3)
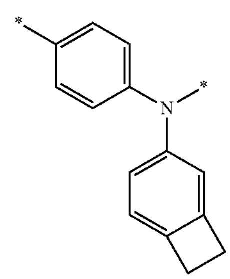
(MUx-4-1)
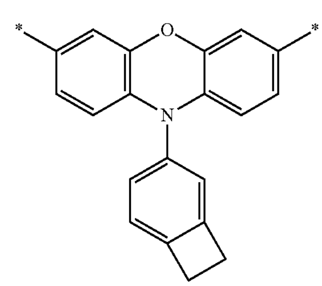

-continued (MUx-4-2)

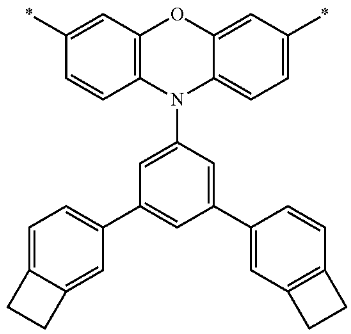

(MUx-4-3)

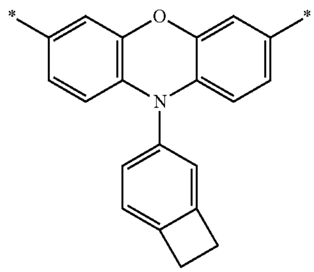

(MUx-4-4)

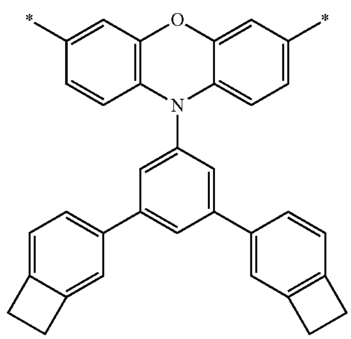

3-1-4. Cathode in Organic Electroluminescent Element

Cathode 108 plays a role of injecting electrons into light-emitting layer 105 through electron injection layer 107 and electron transport layer 106.

A material forming cathode 108 is not particularly limited, as long as the material can efficiently inject electrons into an organic layer, and a material similar to the material forming anode 102 can be used. Particularly, metal such as tin, indium, calcium, aluminum, silver, copper, nickel, chromium, gold, platinum, iron, zinc, lithium, sodium, potassium, cesium and magnesium, or alloy thereof (such as magnesium-silver alloy, magnesium-indium alloy and aluminum-lithium alloy such as lithium fluoride/aluminum), or the like is preferred. In order to enhance electron injection efficiency to improve device characteristics, lithium, sodium, potassium, cesium, calcium, magnesium, or alloy containing the above low-work-function metals is effective. However, the above low-work-function metals are generally unstable in atmospheric air in many cases. In order to improve the above point, a method of doping a small amount of lithium, cesium and magnesium to an organic layer, and using an electrode having high stability is known, for example. As other dopants, inorganic salt such as lithium fluoride, cesium fluoride, lithium oxide and cesium oxide can also be used, but not limited thereto.

Further, preferred examples for protecting the electrode include lamination of metals such as platinum, gold, silver, copper, iron, tin, aluminum and indium, alloy using the above metals, inorganic substances such as silica, titania and silicon nitride, polyvinyl alcohol, polyvinyl chloride, a hydrocarbon-based polymer compound, or the like. A method of preparing the above electrodes is not particularly limited, as long as conduction, such as resistance healing, electron beam vapor deposition, sputtering, ion plating and coating, can be achieved.

3-1-5. Anode in Organic Electroluminescent Element

The anode 102 plays a role of injecting holes into the light-emitting layer 105. In the case where the hole injection layer 103 and/or the hole transport layer 104 are/is arranged between the anode 102 and the light-emitting layer 105, holes are injected into the light-emitting layer 105 via these.

The material to form the anode 102 includes an inorganic compound and an organic compound. Examples of the inorganic compound include metals (e.g., aluminum, gold, silver, nickel, palladium, chromium), metal oxides (e.g., indium oxide, tin oxide, indium-tin oxide (ITO), indium-zinc oxide (IZO)), metal halides (e.g., copper iodide), copper sulfide, carbon black, ITO glass and NESA glass. Examples of the organic compound include polythiophenes such as poly(3-methylthiophene, and conductive polymers such as polypyrrole and polyaniline. In addition, the material for use herein can be appropriately selected from substances that are used as an anode of an organic electroluminescent element.

The resistance of the transparent electrode is not limited so far as sufficient current for light emission from light-emitting devices can be supplied, but from the view point of power consumption by light-emitting devices, the resistance is preferably low. For example, an ITO substrate with 300 Ω/square or less can function as a device electrode, but at present, a substrate with 10 Ω/square or so is available, and therefore, low-resistance substrates with, for example, 100 to 5 Ω/square, preferably 50 to 5 Ω/square are especially preferably used. The thickness of ITO can be arbitrarily selected in accordance with the resistance value thereof and is generally within a range of 50 to 300 nm in many cases.

3-1-6, Substrate in Organic Electroluminescent Element

The substrate 101 is to be a support of the organic electroluminescent element, for which generally used are quartz, glass, metals plastics, etc. The substrate 101 is shaped in a tabular form, a filmy form or a sheet form depending on the intended use, and for example, glass plates, metal plates, metal foils, plastic films and plastic sheets are used. Above all, glass plates, and transparent synthetic resin plates of poly ester, poly methacrylate, polycarbonate or polysulfone are preferred. For glass substrates, soda lime glass and alkali-free glass are usable, and the thickness may be one that is enough for securing mechanical strength, and is, for example, 0.2 mm or more. The upper limit of the thickness is, for example, 2 mm or less, preferably 1 mm or less. Regarding the glass material, alkali-free glass is preferred as releasing fewer ions. How ever, soda lime glass coated with a barrier coat of $SiO_2$ or the like is available on the market and can be used here. For increasing gas barrier performance, the substrate 101 may be provided with a gas barrier film of a dense silicon oxide film or the like on at least one surface thereof, and in particular, in the case where a synthetic resin plate, film or sheet having low gas barrier performance is used as the substrate 101, such a gas barrier film is preferably provided 3-1-7. Binding Agent that May be Used in Each Layer The above materials used for the hole injection layer, the hole transport layer, the light-emitting layer, the electron transport layer and the electron injection layer can form each layer alone, but can also be dispersed and used, as a polymer binding agent, in a solvent-soluble resin such as polyvinyl chloride, polycarbonate, polystyrene, poly(N-vinylcarbazole), polymethylmethacrylate, polybutylmethacrylate, polyester, poly sulfone, polyphenylene oxide, polybutadiene, a hydrocarbon resin, a ketone resin, a phenoxy resin, polyamide, ethyl cellulose, a vinyl acetate resin, an ABS resin and a polyurethane resin; or a curable resin such as a phenolic resin, a xylene resin, a petroleum resin, a urea resin, a melamine resin, an unsaturated poly ester resin, an alkyd resin, an epoxy resin and a silicone resin.

3-1-8. Production Method for Organic Electroluminescent Element

The layers constituting the organic electroluminescent element can be formed each as a thin film of a material to constitute each layer, according to a vapor deposition method, a low resistance vapor deposition method, an electron beam vapor deposition method, a sputtering method, a molecular lamination method, a printing method, a spin coating method, a casting method or a coating method. The thickness of each layer thus formed in the manner is not specifically limited and can be appropriately set depending on the properties of the material. In general, the thickness falls within a range of 2 nm to 5000 nm. The film thickness can be measured generally according to a crystal oscillation-type thickness meter. In the case where a thin film is formed according to a vapor deposition method, the deposition condition varies depending on the kind of the material, and the crystal structure and the association structure intended for the film. In general, it is preferable to appropriately set the vapor deposition conditions in the ranges of a heating temperature for the crucible for deposition of +50 to +400° C., a degree of vacuum of $10^{-6}$ to $10^{-3}$ Pa, a rate of deposition of 0.01 to 50 nm/sec, a substrate temperature of −150 to +300° C., and a film thickness of 2 nm to 5 μm.

Next, as one example of a method for producing an organic electroluminescent element, a production method for an organic electroluminescent element having a layer configuration of an anode/a hole injection laver/a hole transport layer/a light-emitting layer containing the polycyclic aromatic compound of the present invention, a host material and an assisting dopant/an electron transport layer/an electron injection layer/a cathode is described.

Vapor Deposition Method

On an appropriate substrate, a thin film of an anode material is formed according to a vapor deposition method to be an anode, and on the anode, thin films of a hole injection layer and a hole transport layer are formed. On this, the polycyclic aromatic compound of the present invention, a host material and an assisting dopant are co-deposited to form a thin film to be a light-emitting layer, then on the light-emitting layer, an electron transport layer and an electron injection layer are formed, and further a thin film of a cathode substance is formed according to a vapor deposition method to be a cathode, thereby providing an intended organic electroluminescent element. In production of the organic electroluminescent element, the process order may be reversed to form the layers in reverse order of a cathode, an electron injection layer, an electron transport layer, a light-emitting layer, a hole transport layer, a hole injection layer and an anode.

Wet Film Formation Method

In the case of a light-emitting layer forming composition, the layer is formed according to a wet film formation method.

In general, the wet film formation method is to form a coating film via a coating step of applying a light-emitting layer forming composition onto a support, and a drying step of removing the solvent from the applied light-emitting layer forming composition. Depending on the difference in the coating step, a method of using a spin coaler is called a spin coating method, a method of using a slit coater is called a slit coating method, a method of using a printing plate is called a gravure coating method, an offset coating method, a reverse offset coating method or a flexographic printing method, a method of using an inkjet printer is called an inkjet method, and a method of spraying a composition is called a spraying method. The drying step includes a step of air drying, a step of heating, or a step drying under reduced pressure. The drying step may be carried out only once, or may be carried out more than once according to different methods under different conditions. For example, different methods may be combined, such as firing under reduced pressure.

The wet film formation method is a film formation method using a solution, and includes, for example, a certain type of a printing method (inkjet method), a spin coating method, a casting method, or a coating method Different from a vacuum deposition method, the wet film formation method need not to use an expensive vacuum deposition apparatus, and can form a film in air. In addition, the wet film formation method enables continuous production of large area films, and therefore can reduce production cost.

On the other hand, as compared with a vacuum deposition method, lamination is difficult in the wet film formation method. In the case where a laminate film is produced according to the wet film formation method, the under layer needs to be prevented from being dissolved by the composition of the upper layer, and therefore, in the case, a solubility-controlled composition, as well as underlayer crosslinking and orthogonal solvents (solvents not dissolving each other) are used appropriately. However, even though such techniques are used, the wet film formation method will be still difficult in formation of all films by coating in some cases.

Accordingly, in general, an organic EL element is produced according to a method of forming some layers in a wet film formation method, and forming the remaining layers in a vacuum deposition method.

For example, a process of producing an organic EL element partly using a wet film formation method is described below.

(Step 1) Film formation for an anode by a vacuum deposition method (Step 2) Film formation for a hole injection layer by a wet film formation method (Step 3) Film formation for a hole transport layer by a wet film formation method (Step 4) Film formation by a wet film formation method using a light-emitting layer forming composition containing the polycyclic aromatic compound of the present invention, a host material and an assisting dopant (Step 5) Film formation for an electron transport layer by a vacuum deposition method (Step 6) Film formation for an electron injection layer by a vacuum deposition method (Step 7) Film formation for a cathode by a vacuum deposition method According to the process, an organic EL element composed of an anode/a hole injection layer/a hole transport layer/a light-emitting layer formed of a host material and a dopant material/an electron transport layer/an electron injection layer/cathode is produced.

Organic Solvent

When the light-emitting layer or another organic layer is formed by a wet film formation method, it is preferred to produce an organic layer forming composition (for example, a light-emitting layer forming composition) containing at least one organic solvent. Controlling the evaporation rate of an organic solvent upon film formation can control and improve film form ability, presence or absence of defects in a coated film, surface roughness, and smoothness. When a film is formed by an inkjet method, the meniscus stability at a pinhole of an inkjet head is controlled, and the discharging performance can be controlled and improved. Performing a wet film formation method using a light-emitting layer forming composition and controlling the film drying rate and the orientation of derivative molecules upon formation of the light-emitting layer can improve the electric properties, the light emission properties, the efficiency, and the lifetime of the organic EL element having a light-emitting layer obtained from the light-emitting layer forming composition.

Properties of Organic Solvent

The boiling point of at least one organic solvent is preferably 130° C. to 300° C., more preferably 140° C. to 270° C., and still more preferably 150° C. to 250° C. A boiling point higher than 130° C. is preferred in view of an inkjet discharging performance. On the other hand, a boiling point lower than 300° C. is preferred in view of defects of a coated film, surface roughness, residual solvent, and smoothness. The more preferable third component has a constitution containing two or more organic solvents in view of good inkjet discharging performance, film formability, smoothness, and low residual solvent amount. Meanwhile, in some cases, the composition may be a solid-state composition obtained by removing solvents from a light-emitting layer forming composition considering transportability or the like.

Furthermore, a particularly preferred organic solvent has a constitution containing a good solvent (GS) and a poor solvent (PS) in relation to at least one solute, wherein the boiling point ($BP_{GS}$) of the good solvent (GS) is lower than the boiling point ($BP_{PS}$) of the poor solvent (PS).

By adding a poor solvent with a high boiling point, a good solvent with a lower boiling point first volatiles upon film formation, and the concentration of the content in the composition and the concentration of the poor solvent increase, resulting in rapid film formation. Due to constitution, a coated film with fewer defects, a low surface roughness, and a high smoothness can be obtained.

The solubility difference ($S_{GS}-S_{PS}$) is preferably 1% or more, more preferably 3% or more, and still more preferably 5% or more. The boiling point difference ($BP_{PS}-BP_{GS}$) is preferably 10° C., or higher, more preferably 30° C., or higher, and still more preferably 50° C., or higher.

The organic solvent is removed after film formation by drying steps such as vacuum drying, reduced pressure drying, heating drying, or the like. When heated, the heating is preferably performed at a temperature within the range of [the glass transition temperature (Tg) of the first component+30° C.] or lower in view of improvement of the coated film formation performance. From the viewpoint of reducing residual solvents, heating at a temperature within the range of [the glass transition temperature (Tg) of the first component−30° C.] or higher is preferred. Even if the heating temperature is lower than the boiling point of the organic solvent, organic solvents are sufficiently removed because the film is thin. The drying step may be repeated a plurality of times or may use a plurality of drying methods in combination.

Specific Examples of Organic Solvent

Examples of the organic solvent that may be used in the light-emitting layer forming composition include, but are not limited to, alkyl benzene-based solvents, phenyl ether-based solvents, alkyl ether-based solvents, cyclic ketone-based solvents, aliphatic ketone-based solvents, monocyclic ketone-based solvents, solvents having diester skeletons, and fluorine-containing solvents. Specific examples thereof include, but are not limited to, pentanol, hexanol, heptanol, octanol, nonanol, decanol, undecanol, dodecanol, tetradecanol, hexan-2-ol, heptan-2-ol, octan-2-ol, decan-2-ol, dodecan-2-ol, cyclohexanol, α-terpineol, β-terpineol, γ-terpineol, 5-terpineol, terpineol (mixture), ethylene glycol monomethyl ether acetate, propylene glycol monomethyl ether acetate, diethylene glycol dimethyl ether, dipropylene glycol dimethyl ether, diethylene glycol ethyl methyl ether, diethylene glycol isopropyl methyl ether, dipropylene glycol monomethyl ether, diethylene glycol diethyl ether, diethylene glycol monomethyl ether, diethylene glycol butyl methyl ether, tripropylene glycol dimethyl ether, triethylene glycol dimethyl ether, diethylene glycol monobutyl ether, ethylene glycol monophenyl ether, triethylene glycol monomethyl ether, diethylene glycol dibutyl ether, triethylene glycol butyl methyl ether, polyethylene glycol dimethyl ether, tetraethylene glycol dimethyl ether, p-xylene, m-xylene, o-xylene, 2,6-lutidine, 2-fluoro-m-xylene, 3-fluoro-o-xylene, 2-chlorobenzotrifluoride, cumene, toluene, 2-chloro-6-fluorotoluene, 2-fluoroanisol, anisol, 2,3-dimethyipyrazine, bromobenzene, 4-fluoroanisol, 3-fluoroanisol, 3-trifluoromethylanisol, mesitylene, 1,2,4-trimethylbenzene, t-butylbenzene, 2-methylanisol, phenetole, benzodioxole, 4-methylanisol, s-butylbenzene, 3-methylanisol, 4-fluoro-3-methyl anisol, cymene, 1,2,3-trimethylbenzene, 1,2-dichlorobenzene, 2-fluorobenzonitrile, 4-fluoroveratrol, 2,6-dimethylanisol, n-butylbenzene, 3-fluorobenzonitrile, decalin (decahydronaphthalene), neopentylbenzene, 2,5-dimethylanisol, 2,4-dimethylanisol, benzonitrile, 3,5-dimethylanisol, diphenyl ether, 1-fluoro-3,5-dimethoxy benzene, methyl benzoate, isopentylbenzene, 3,4-dimethylanisol, o-tolunitrile, n-amylbenzene, veratrol, 1,2,3,4-tetrahydronaphthalene, ethyl benzoate, n-hexylbenzene, propyl benzoate, cyclohexylbenzene, 1-methylnaphthalene, butyl benzoate, 2-methylbiphenyl, 3-phenoxy toluene, 2,2'-bitolyl, dodecylbenzene, dipentylbenzene, tetramethylbenzene, trimethoxybenzene, trimethoxytoluene, 2,3-dihydrobenzofuran, 1-methyl-4-(propoxymethyl)benzene, 1-methyl-4-(butyloxymethyl)benzene, 1-methyl-4-(pentyloxymethyl)benzene, 1-methyl-4-(hexyloxymethyl) benzene, 1-methyl-4-(heptyloxymethyl)benzene benzyl butyl ether, benzyl pentyl ether, benzyl hexylethyl, benzyl heptyl ether, benzyl octyl ether, and the like. The solvent may be used singly or may be used as a mixture.

Light-Emitting Laver Forming Composition

The light-emitting layer forming composition is a composition for applying and forming a light-emitting layer of an organic EL element. The composition contains at least the polycyclic aromatic compound of the present invention and preferably further contains an organic solvent. As the organic solvent, the organic solvents explained in the above section for the wet film formation method can be appropriately used. The light-emitting layer forming composition preferably contains the polycyclic aromatic compound of the present invention, an organic solvent, and a host material and more preferably contains the polycyclic aromatic compound, an organic solvent, a host material, and an assisting dopant.

A film can be formed from the light-emitting layer forming composition by the above wet film formation method and a laser heating imaging method (LITI). The LITI is a method for heating and depositing a compound attached to a substrate with laser, and the light-emitting layer forming composition may be used as a material applied to a substrate.

Optional Step

An appropriate treatment step, a washing step, and a drying step may be performed before or after each step for film formation Examples of such a treatment step include exposure treatments, plasma surface treatments, ultrasonic treatments, ozone treatments, washing treatments with appropriate solvents, heating treatments, and the like. Furthermore, a series of steps for constructing a bank may be mentioned.

Bank (Partition Wall Material)

A photolithography technique may be used for constructing a bank. As a bank material usable in photolithography, inorganic materials and organic materials may be used. As the inorganic material, for example, SiNx, SiOx and the mixture thereof may be used. As the organic material, for example, a positive-type resist material and a negative-type resist material may be used. A printing method capable of patterning, such as a sputtering method, an inkjet method, a gravure offset printing, reverse offset printing, and screen printing may be used. In such a case, a permanent resist material may also be used. The bank may have a multi-layered structure, or different types of materials may be used.

Examples of an organic material used in the bank include, but are not limited to, polysaccharides and derivatives thereof, a homopolymer and copolymers of hydroxyl-containing ethylenic monomers, biopolymer compounds, polyacryloyl compounds, polyesters, polystyrene, polyimides, polyamideimides, polyetherimides, poly sulfides, polysulfones, polyphenylenes, poly phenyl ethers, polyurethanes, epoxy (meth)acrylates, melamine (meth)acrylates, polyolefins, cyclic polyolefins, acrylonitrile-butadiene-styrene copolymers (ABS), silicone resins, polyvinyl chloride, chlorinated polyethylene, chlorinated polypropylene, polyacetates, polynorbornene, synthetic rubbers, fluorinated polymers such as polyfluorovinylidene, polytetrafluoroethylene, and polyhexafluoropropylene, fluoroolefin-hydrocarbon olefin copolymers, and fluorocarbon polymers.

An example of a bank forming method using organic materials by a photolithography technique will be described below. A material showing liquid repellency to a functional layer forming composition such as a light-emitting layer forming composition is applied to an element substrate on which electrodes have been formed and then dried to form a resin layer. A bank can be formed on an element substrate, on which electrodes have been formed, by subjecting the resin layer to an exposure step and a developing step with an exposure mask. Thereafter, some steps for removing impurities on the bank surface, such as a washing/drying step with a solvent or a UV treatment, may optionally be performed for evenly spreading a functional layer forming composition.

Figure 2:
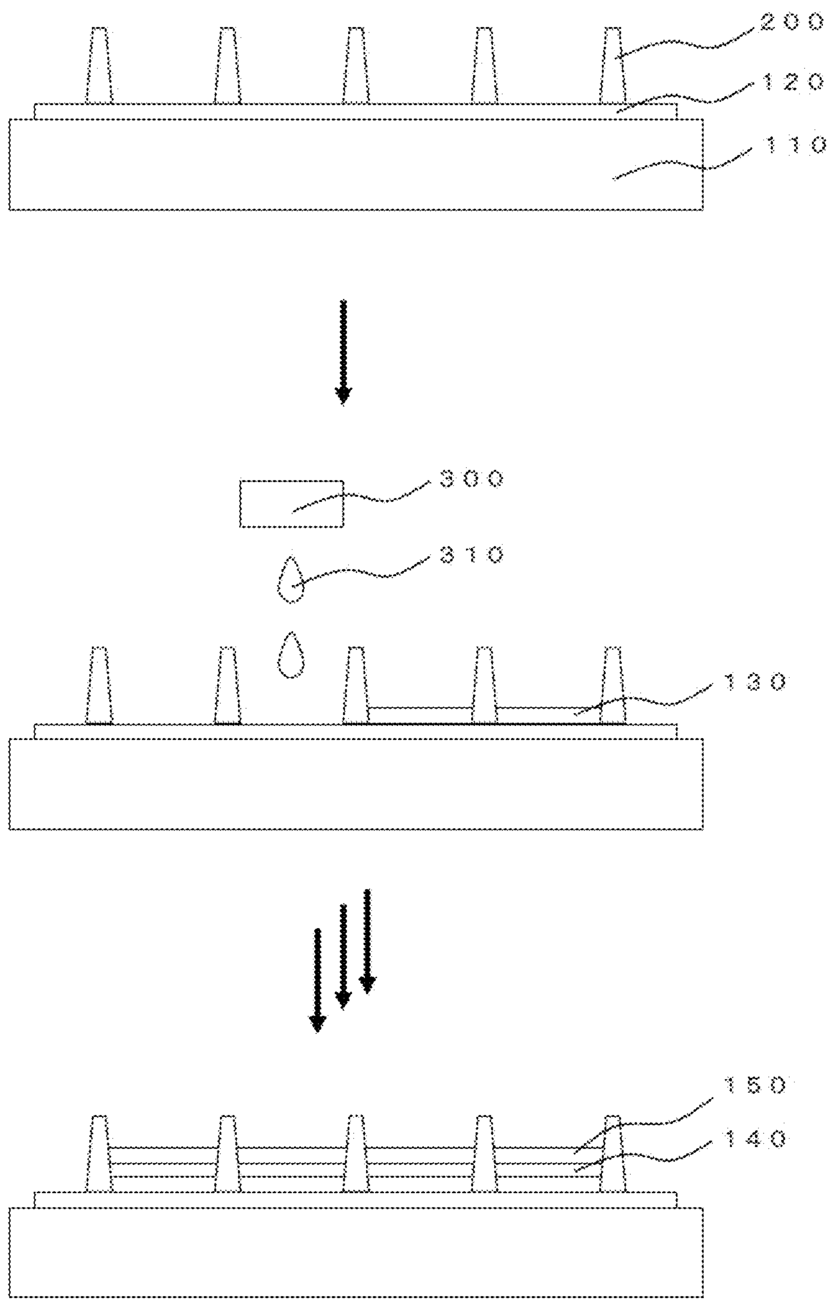
FIG. 2 This is a figure explaining the method of manufacturing the organic EL element by the inkjet method on the substrate that has a bank.

Referring to FIG. 2, a method for constructing an organic EL element on a substrate with a bank using an inkjet method will be described. First, banks (200) are disposed on an electrode (120) on a substrate (110). In this case, ink droplets (310) are dropped between banks (200) from an inkjet head (300) and dried, thereby constructing a coaled film (130). These steps are repeated until a next coated film (140) and further a light-emitting layer (150) are constructed, and then an electron transport layer, an electron injection layer, and electrodes are formed by a vacuum deposition method, thereby constructing an organic EL element in which a bank material partitions a light-emitting site.

An organic EL element thus obtained is preferably covered with a sealing layer (not illustrated) for protection from moisture or oxygen. For example, when moisture or oxy gen invades from the exterior, the light-emitting function is inhibited, which results in deterioration of the light emission efficiency and occurrence of dark spots that do not emit light. The lifetime of light emission may be shorter in some cases. As the sealing layer, for example, an inorganic insulating material with low permeability of moisture or oxy gen, such as silicon oxynitride (SiON), may be used. An organic EL element may be sealed by sticking a sealing substrate such as transparent glass or an opaque ceramic on an element substrate, on which the organic EL element has been formed, via an adhesive.

3-1-9. Application for Organic Electroluminescent Element

The present invention is also applicable to a display device equipped with an organic electroluminescent element or a lighting device equipped with an organic electroluminescent element.

The display device and the lighting device equipped with an organic electroluminescent element can be produced by connecting the organic electroluminescent element of the present embodiment and a known driving device, according to a known method, and can be driven appropriately using a known driving method of direct current driving, pulse driving or alternate current driving.

Examples of the lighting device include panel displays such as color flat panel displays, and flexible displays such as flexible color organic electroluminescent (EL) displays (for example, see JP 10-335066 A, JP 2003-321546 A, JP 2004-281086 A). Examples of the display system include a matrix and/or segment system. A matrix display and a segment display may co-exist in the same panel.

In a matrix, pixels for display are two-dimensionally arranged such as in a lattice-like or mosaic-like form, and pixel aggregation displays a letter and an image. The shape and the size of pixels are determined depending on the intended use. For example, for image and letter display on personal computers, monitors and televisions, square pixels of 300 μm or less on each side are generally used, while in the case of a large-size display such as a display-panel, pixels of mm order on each side are used. In the case of monochromatic display, pixels of the same color may be aligned, but in the case of color display, pixels of red, green and blue are aligned and display ed. In this case, typically, there is known a delta type and a stripe type. Regarding the driving method for the matrix, any of a line-sequential drive method or an active-matrix method may be employed. A line-sequential drive method has an advantage that the structure is simple, but in consideration of operation characteristics, an active matrix may often be superior to it, as the case may be. Accordingly, the two need to be used individually depending on the intended use.

In a segment type, patterns are formed so as to display previously determined information, and a determined region is made to emit light. Examples thereof include time and temperature display in digital watches and thermometers, operating state display in audio instruments and induction cookers, and pane) display in automobiles.

Examples of the lighting device include a lighting device for in-room lighting, and a backlight in liquid-crystal display devices (for example, see JP 2003-257621 A, JP 2003-277741 A, and JP 2004-119211 A). A backlight is used mainly for the purpose of improving the visibility in nonluminescent devices, and is used, for example, in liquid-crystal display devices, watches, audio instruments, automobile panels, display boards and sign boards. In particular, regarding a backlight for liquid-crystal displays, especially for personal computers whose issue is to be thinned, a conventional system uses a fluorescent lamp or a light guide plate and is therefore difficult to thin, and taking this into consideration, a backlight using the light-emitting device of the present embodiment is characterized in that it is thin and light.

3-2. Other Organic Devices

The poly cyclic aromatic compound according to the present invention can be used for manufacturing an organic field effect transistor, an organic thin film solar cell, or the like, in addition to the organic electroluminescent element described above.

The organic field effect transistor is a transistor that controls a current by means of an electric field generated by voltage input, and is provided with a source electrode, a drain electrode, and a gate electrode. When a voltage is applied to the gate electrode, an electric field is generated, and the organic field effect transistor can control a current by arbitrarily damming a flow of electrons (or holes) flowing between the source electrode and the drain electrode. The field effect transistor can be easily miniaturized compared with a simple transistor (bipolar transistor) and is often used as an element constituting an integrated circuit or the like.

The structure of the organic field effect transistor is usually as follows. That is, a source electrode and a drain electrode are provided in contact with an organic semiconductor active layer formed using the polycyclic aromatic compound according to the present invention, and it is only required to further provide a gate electrode so as to interpose an insulating layer (dielectric layer) in contact with the organic semiconductor active layer. Examples of the element structure include the following structures.

(1) Substrate/gate electrode/insulator laver/source electrode and drain electrode/organic semiconductor active layer.

(2) Substrate/gate electrode/insulator layer/organic semiconductor active layer/source electrode and drain electrode.

(3) Substrate/organic semiconductor active layer/source electrode and drain electrode/insulator layer/gate electrode.

(4) Substrate/source electrode and drain electrode/organic semiconductor active layer/insulator layer/gate electrode.

An organic field effect transistor thus configured can be applied as a pixel driving switching element of an active matrix driving type liquid crystal display or an organic electroluminescent display, or the like.

An organic thin film solar cell has a structure in which a positive electrode such as ITO, a hole transport layer, a photoelectric conversion layer, an electron transport layer, and a negative electrode are laminated on a transparent substrate of glass or the like. The photoelectric conversion layer has a p-type semiconductor layer on the positive electrode side and has an n-type semiconductor layer on the negative electrode side. The polycyclic aromatic compound according to the present invention can be used as a material for a hole transport layer, a p-type semiconductor layer, an n-type semiconductor layer, or an electron transport layer depending on physical properties thereof. The polycyclic aromatic compound according to the present invention can function as a hole transport material or an electron transport material in an organic thin film solar cell. The organic thin film solar cell may appropriately include a hole blocking layer, an electron blocking layer, an electron injection layer, a hole injection layer, a smoothing layer, and the like, in addition to the members described above. For the organic thin film solar cell, known materials used for an organic thin film solar cell can be appropriately selected and used in combination.

4. Wavelength Conversion Material

The polycyclic aromatic compound of the present invention may be used as a wavelength conversion material.

Currently, the application of a multicoloring technique by a color conversion method to a liquid crystal display, an organic EL display, illumination, and the like has been energetically studied. Color conversion refers to a wavelength conversion of emitted light from a light-emitting substance into light with a longer wavelength and includes, for example, conversion of UV light or blue light into green light or red emitted light. By molding a wavelength conversion material having this color conversion function into a film and then combining the film with a blue light source, three primary colors of blue, green, and red can be taken out; that is, white light can be taken out from a blue light source. A full-color display can be constructed using such a white light source, in which a blue light source is combined with a wavelength conversion film having a color conversion function, as a light source unit and combining the white light source with a liquid crystal-driving part and a color filter. When a liquid crystal-driving part is omitted, such a white light source is used as a white light source as it is and can be applied to a white light source for, for example, an LED illumination. A full-col or organic EL display can be constructed without a metal mask using a combination of a blue organic EL element as a light source and a wavelength conversion film that converts blue light into green light and red light. A low-cost full-color organic micro-LED display can be constructed by using a combination of a blue micro-LED as a light source and a wavelength conversion film that converts blue light into green light and red light.

The polycyclic aromatic compound of the present invention may be used as this wavelength conversion material By using a wavelength conversion material containing a polycyclic aromatic compound of the present invention, light from a light source or a light-emitting element that generates UV light or blue light with a shorter wavelength into blue light or green light with high color purity, suitable for the use in a display device (a display device using an organic EL element or a liquid crystal display device). The color to be converted may be adjusted by appropriately selecting the substituent of the polycyclic aromatic compound of the present invention, a binder resin used in a wavelength-converting composition that will be described below, or the like. The wavelength conversion material may be prepared as a wavelength-converting composition containing a polycyclic aromatic compound of the present invention. A wavelength conversion film may be formed by using this wavelength-converting composition.

The wavelength-converting composition may contain a binder resin, another additive, and a solvent in addition to the polycyclic aromatic compound of the present invention. As the binder resin, for example, those disclosed in paragraphs [0173]-[0176] of WO 2016/190283 may be used. As the other additive, for example, those disclosed in paragraphs [0177]-[0181] of WO 2016/190283 may be used. As the solvent, the description about the solvents contained in the light-emitting layer forming composition may be referred to.

The wavelength conversion film includes a wavelength conversion layer formed by curing a wavelength-converting composition. A known film formation method may be referred to as a method for constructing a wavelength conversion layer from a wavelength-converting composition. The wavelength conversion film may consist only of wavelength conversion layers formed from a composition containing a polycyclic aromatic compound of the present invention and may include other wavelength conversion layers (for example, a wavelength conversion layer converting blue light into green light or red light, or a wavelength conversion layer converting blue light into green light or red light). Furthermore, the wavelength conversion film may include a substrate layer or a barrier layer for preventing deterioration of a color conversion layer due to oxygen, moisture, or heat.

EXAMPLES

Hereinunder the present invention is described specifically with reference to Examples, but the present invention is not whatsoever restricted by these Examples.

Synthesis Examples for the polycyclic aromatic compounds are first shown below.

Synthesis Example (1): Synthesis of 9,11,15,17-Tetramesityl-$N^7$,$N^7$,$N^{13}$,$N^{13}$,$N^{19}$,$N^{19}$,5,21-octaphenyl-5,9,11,15,17,21-hexahydro-5,9,11,15,17,21-hexaaza-25b, 26b, 27b-triboranaphtho[3,2,1-de]naphtho[3',2',1:10,11]tetraceno[1,2,3-jk]pentacene-7,13,19-triamine (Compound 1-1-1))

(1-1-1)

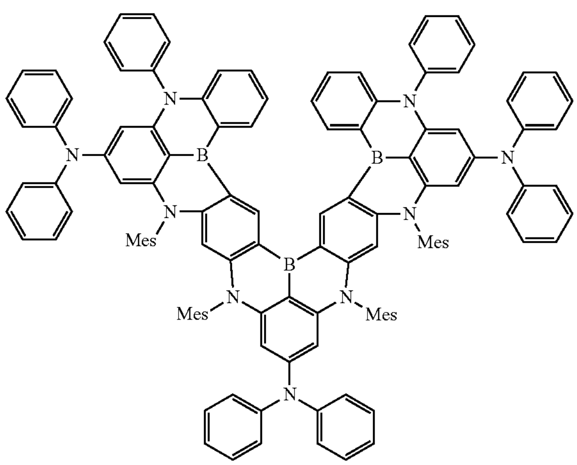

In a nitrogen atmosphere, 3,5-dichlorobromobenzene (22.6 g, 0.10 mol), diphenylamine (16.9 g, 0.10 mol), $Pd_2(dba)_3$(Tris(dibenzylideneacetone)dipalladium(0)) (916 mg, 1.0 mmol), 2,2'-bisdiphenylphosphino-1,1-binaphthyl (BINAAP; 1.25 g, 2.0 mmol, $^t$BuONa (sodium t-butoxide) (11.5 g, 0.12 mol), and toluene (500 ml) in a flask were heated to 90° C., and stirred for 12 hours. The reaction liquid was cooled to room temperature. After toluene was evaporated under reduced pressure, extraction with dichloromethane was performed three times. Then the solvent was evaporated under reduced pressure to obtain a crude product. The crude product obtained was purified by silica gel column chromatography (eluent, hexane) to obtain 3,5-dichloro-N,N-diphenylaniline (Compound(i-1)) as a white solid (25.2 g yield 80%).

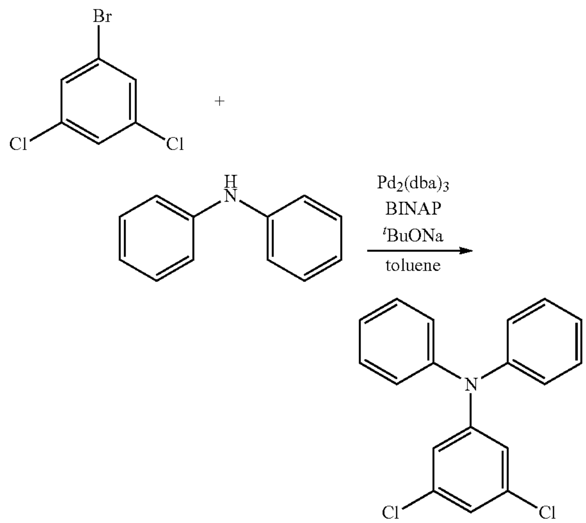

(i-1)

Structure of the compound obtained was identified by NMR measurement. $^1$H-NMR (400 MHz, $CDCl_3$), δ=6.85 (d, 2H), 6.89 (s, 1H), 7.08-7.13 (m, 6H), 7.30 (t, 4H)

In a nitrogen atmosphere, Compound(i-1) (12.6 g, 40 mmol), 2,4,6-trimethylaniline (16.8 ml, 0.12 mol), $Pd_2(dba)_3$ (1.47 g, 1.6 mmol), 2-Dicyclohexylphosphino-2',6'-dimethoxybiphenyl (SPhos; 1.31 g, 3.2 mmol), $^t$BuONa (19.2 g, 0.20 mmol), and o-xylene (400 ml) in a flask were heated to 110° C., and stirred for 12 hours. The reaction liquid was cooled to room temperature and extracted with dichloromethane three times. Then the solvent was evaporated under reduced pressure to obtain a crude product. The crude product obtained was purified by silica gel column chromatography (eluent: hexane:ethyl acetate=25:1) to obtain Compound(i-2) as a white solid (12.5 g, yield 61%)

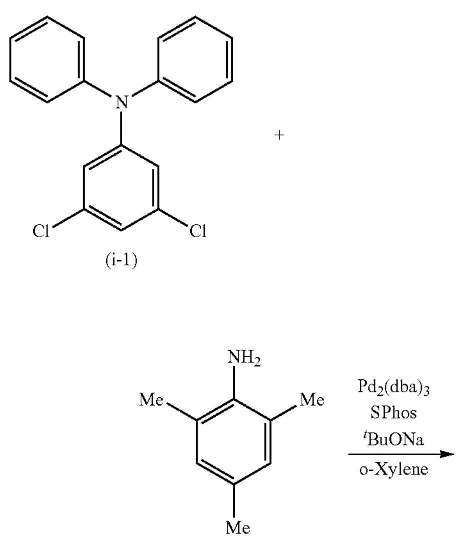

-continued

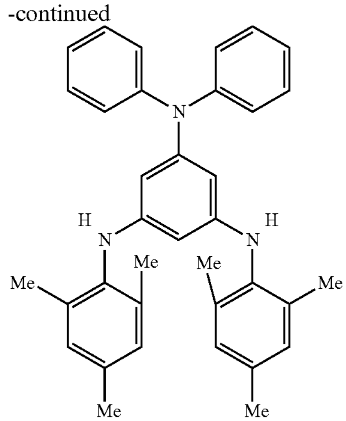

(i-2)

Structure of the compound obtained was identified by NMR measurement. $^{1}$H-NMR (400 MHz, $CDCl_3$): δ=2.26 (s, 12H), 2.36 (s, 6H), 4.90 (s, 2H), 5.51 (t, 1H), 5.76 (d, 2H) 6.95 (s, 4H), 7.04 (t, 2H), 7.19 (d, 4H), 7.29 (t, 4H)

In a nitrogen atmosphere, Compound(i-2) (11.3 g, 22 mmol), 1-chloro-3-iodobenzene (5.47 ml, 44 mmol), $Pd_2(dba)_3$ (0.604 g, 0.66 mmol), tri-tert-butylphosphonium tetrafluoroborate ($P^tBu_3HBF_4$; 0.386 g, 1.3 mmol), $^t$BuONa (6.39 g, 67 mmol), and toluene (222 ml) in a flask were heated to 80° C., and stirred for 14 hours. The reaction liquid was cooled to room temperature. Filtration was performed using Florisil short pass column (developing liquid, toluene). The solvent was evaporated under reduced pressure to obtain a crude product. The crude product obtained was purified by silica gel column chromatography (eluent: hexane:dichloromethane=8:1) to obtain Compound(i-3) as a white solid (9.90 g. yield 61%).

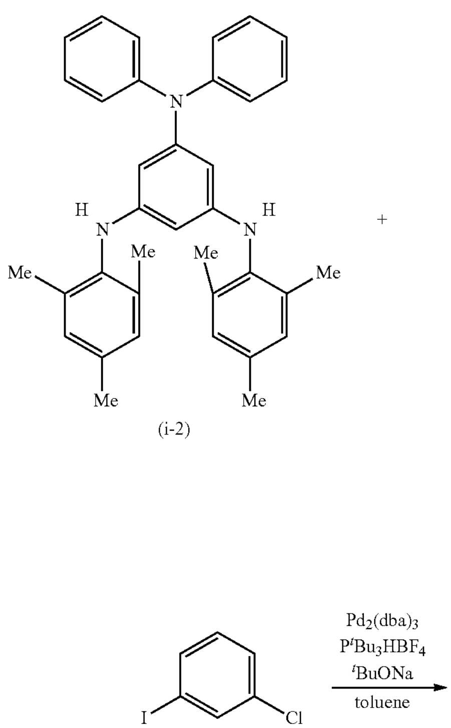

-continued

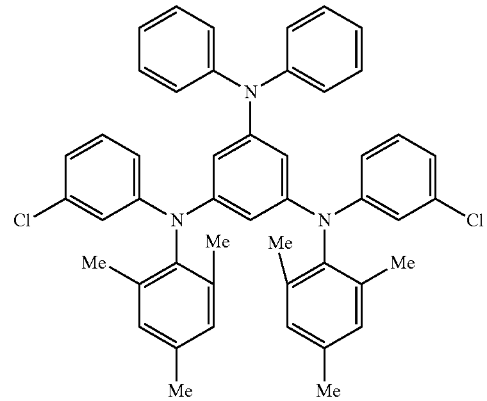

(i-3)

Structure of the compound obtained was identified by NMR measurement. $^{1}$H-NMR (400 MHz, $CDCl_3$): δ=1.90 (s, 12H), 2.27 (s, 6H), 6.15 (t, 1H), 6.24 (d, 2H), 6.65 (dd, 2H), 6.72 (dd, 2H), 6.81 (s, 4H), 6.83 (t, 2H), 6.92-7.03 (m, 8H), 7.18 (t, 4H)

In a nitrogen atmosphere, Compound(i-3) (7.34 g, 10 mmol), 2,4,6-trimethylaniline (4.21 ml, 30 mmol), $Pd_2(dba)_3$ (0.366 g, 0.40 mmol), 2-Dicyclohexylphosphino-2',6'-dimethoxybiphenyl (SPhos; 0.328 g, 0.80 mmol), $^t$BuONa (4.81 g, 50 mmol), and o-xylene (100 ml) in a flask were heated to 120° C., and stirred for 8 hours. The reaction liquid was cooled to room temperature. Extraction with dichloromethane was performed three times. Then the solvent was evaporated under reduced pressure to obtain a crude product. The crude product obtained was purified by silica gel column chromatography (eluent, hexane:ethyl acetate=20:1) to obtain $N^1$,$N^3$-dimesityl-$N^1$,$N^3$-bis(3-(mesitylamino)phenyl)-$N^5$,$N^5$-diphenylbenzene-1,3,5-triamine (Compound(i-4)) as an orange solid (8.01 g, yield 86%).

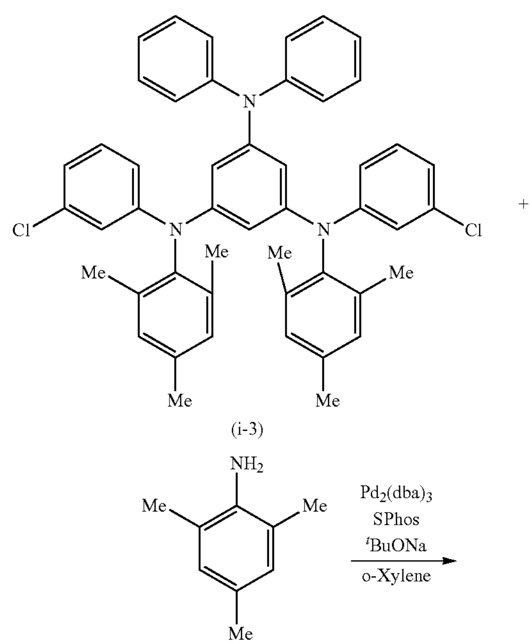

-continued

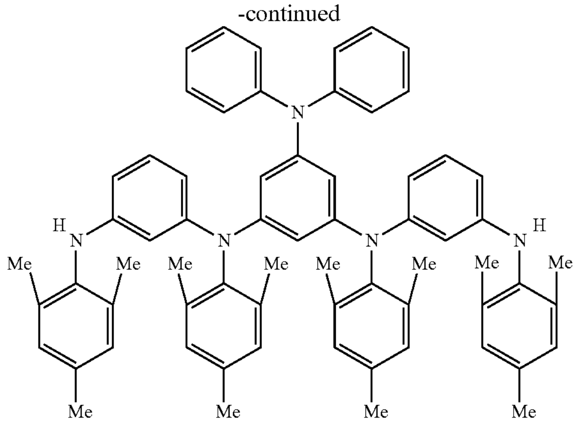

(i-4)

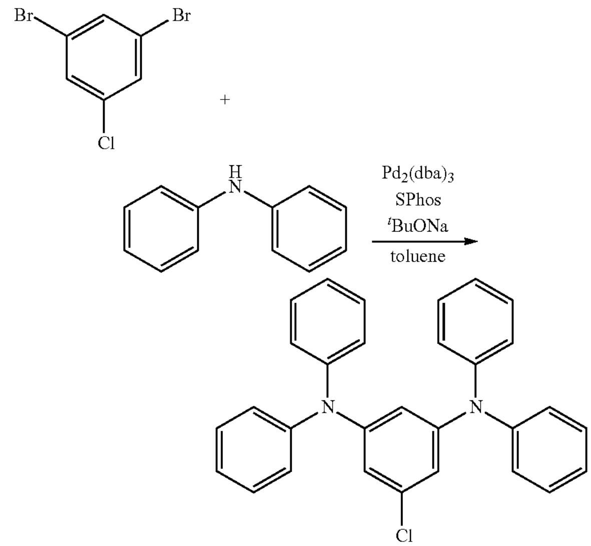

(i-5)

Structure of the compound obtained was identified by NMR measurement. $^1$H-NMR (400MHZ, $CDCl_3$): δ=1.89 (s, 12H), 2.09 (s, 12H), 2.26 (s, 6H), 2.29 (s, 6H), 4.81 (s, 2H), 5.75 (dd, 2H), 5.91 (t, 1H), 6.10 (dd, 2H), 6.25 (t, 2H), 6.44 (d, 2H), 6.75-6.80 (m, 6H), 6.88-6.92 (m, 6H), 7.05 (d, 4H), 7.18 (t, 4H)

In a nitrogen atmosphere, 1,3-dibromo-5-chlorobenzene (10.8 g, 40 mmol), diphenylamine (13.5 g, 80 mol), $Pd_2(dba)_3$ (0.733 g, 0.80 mmol), 2-Dicyclohexylphosphino-2',6'-dimethoxybiphenyl (SPhos; 0.657 g, 1.6 mmol), $^t$BuONa (11.5 g, 0.12 mol), and toluene (400 ml) in a flask were heated to SOX and stirred for 18 hours. Filtration was performed using Florisil short pass column (developing liquid, toluene). The solvent was evaporated under reduced pressure to obtain a crude product. The crude product obtained was purified by silica gel column chromatography (eluent: hexane) to obtain Compound(i-5) as a white solid (12.7 g. yield 71%).

Structure of the compound obtained was identified by NMR measurement. $^1$H-NMR (400 MHz, $CDCl_3$): δ=6.56 (d, 2H), 6.64 (t, 1H), 7.00 (t, 4H), 7.05 (d, 8H), 7.22 (t, 8H)

In a nitrogen atmosphere, Compound(i-4) (2.29 g, 2.5 mmol), Compound(i-5) (3.35 g, 7.5 mmol), $Pd_2(dba)_3$ (0.114 g, 0.13 mmol), 2-Dicyclohexylphosphino-2',6'-dimethoxybiphenyl (SPhos; 0.103 g, 0.25 mmol), $^t$BuONa (0.771 g, 7.5 mmol), and tert-butylbenzene (25 ml) in a flask were heated to 160° C., and stirred for 16 hours. The reaction liquid was cooled to room temperature Extraction with dichloromethane was performed three times. The solvent was then evaporated under reduced pressure to obtain a crude product. The crude product obtained was purified by silica gel column chromatography (eluent, hexane:ethyl acetate=20:1). Then further purification by silica gel column chromatography (eluent: hexane:dichloromethane=1:1) was performed to obtain Compound(i-6) as a white solid (1.21 g, yield 28%).

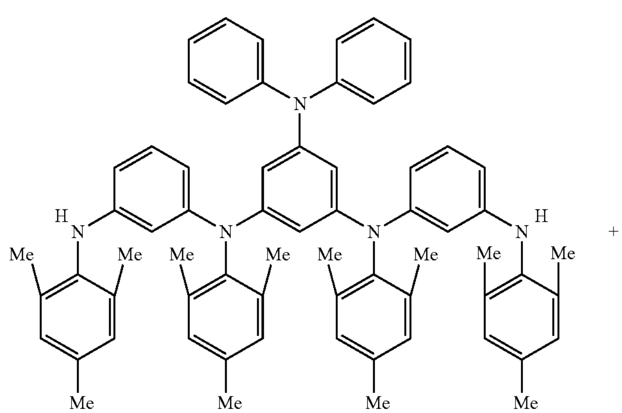

(i-4)

-continued

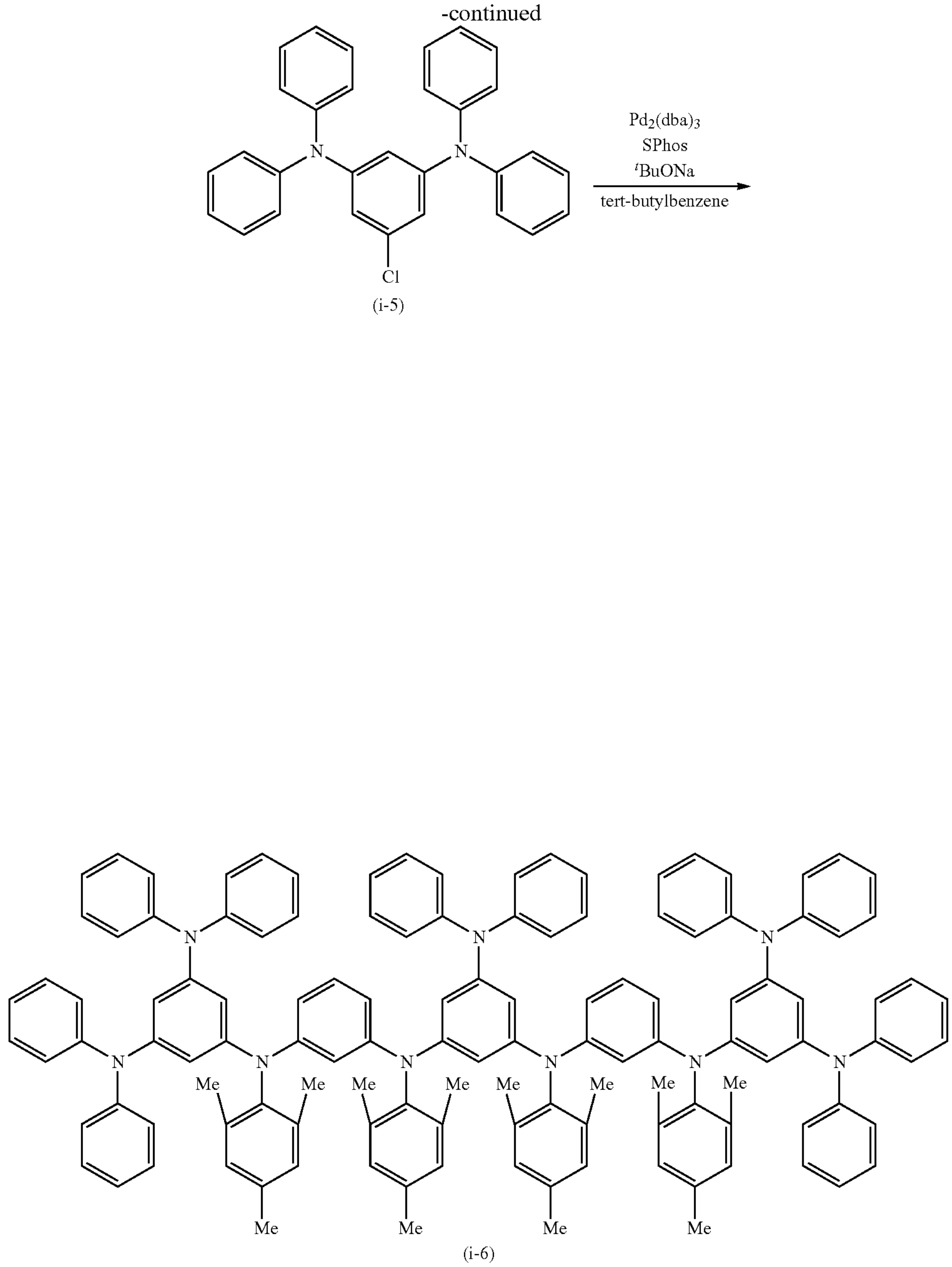

Structure of the compound obtained was identified by NMR measurement. $^1$H-NMR (400 MHz, $CDCl_3$): δ=1.65 (s, 12H), 1.72 (s, 12H), 2.17 (s, 6H), 2.19 (s, 6H), 5.82 (t, 1H), 6.18-6.20 (m, 10H), 6.25 (t, 2H), 6.36 (t, 2H), 6.61 (s, 4H), 6.63 (s, 4H), 6.69 (t, 2H), 6.82-6.87 (m, 10H), 6.92-6.95 (m, 20H), 7.06-7.11 (m, 20H)

To a flask containing $N^1$,$N^{1'}$-(((5-(diphenylamino)-1,3-phenylene)bis(mesitylazanediyl))bis(3,1-phenylene))bis ($N^1$-mesityl-$N^3$,$N^3$,$N^5$,$N^5$-tetraphenylbenzene-1,3,5-triamine) (Compound(i-6)) (0.350 g, 0.20 mmol) and o-dichlorobenzene(40 ml) was added boron tribromide (1.22 ml, 13 mmol) in a nitrogen atmosphere at room temperature. After completion of the dropping, the temperature was raised to 160° C., and the reaction liquid was stirred for 12 hours. Then, the temperature was further raised to 180° C., and the reaction liquid was stirred for 12 hours. The reaction liquid was cooled to room temperature and hydrogen bromide in the reaction liquid was evaporated under reduced pressure. After diluting the reaction liquid by adding dichloromethane (5.0 ml), a phosphate buffer solution (pH=7, 5.0 ml) was added at 0° C. After three-time extraction of the aqueous layer with dichloromethane, the solvent was evaporated under reduced pressure. The crude product obtained was purified by silica gel column chromatography (eluent: hexane:dichloromethane=2:3) to obtain 9,11,15,17-tetramesityl-$N^7$,$N^7$,$N^{13}$,$N^{13}$,$N^{19}$,$N^{19}$,5,21-octaphenyl-5,9,11,15,17,21-hexahydro-5,9,11,15,17,21-hexaaza-25b,26b,27b-triboranaphtho[3,2,1-de]naphtho[3',2',1':10,11]tetraceno[1,2,3-jk]pentacene-7,13,19-triamine (Compound(1-1-1)) as a green solid (97.2 mg, yield 27%).

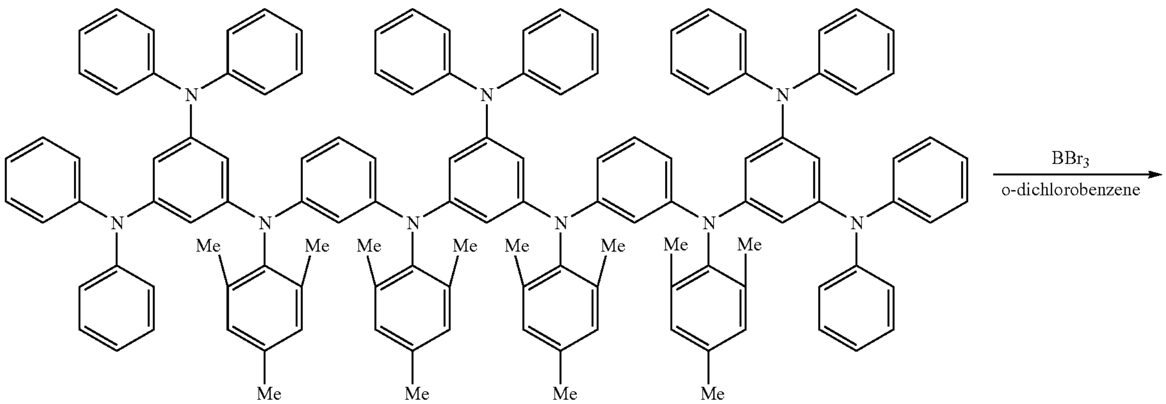
(i-6)
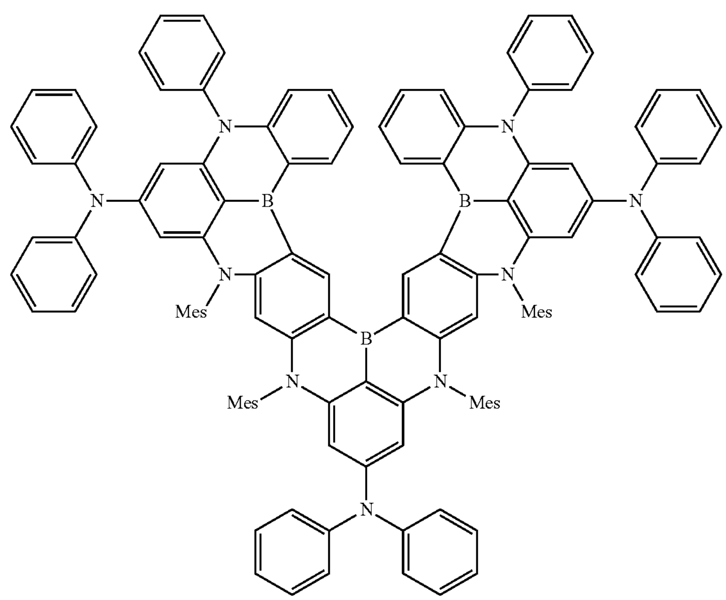
(1-1-1)
Structure of the compound obtained was identified by NMR measurement.
$^1$H-NMR (400 MHz, $CDCl_3$): δ=1.73 (s, 24H), 2.23 (s, 12H), 5.67-5.68 (m, 6H), 5.72 (s, 2H), 6.36 (t, 2H), 6.49 (d, 2H), 6.67 (s, 8H), 6.84-6.94 (m, 20H), 7.03-7.08 (m, 12H), 7.27 (d, 4H), 7.34 (t, 2H), 7.45 (t, 4H), 9.08 (d, 2H), 10.7 (s, 2H)
$^{13}$C-NMR (126 MHz, ($CDCl_3$): 17.2 (4C), 17.3 (4C), 21.0 (4C), 98.3 (2C), 99.3 (2C), 99.5 (2C), 100.1 (2C), 115.9 (2C), 120.1 (2C), 122.5 (2C), 122.8 (4C), 124.4 (4C), 124.8 (8C), 128.0 (2C), 128.5 (4C), 128.6 (8C), 129.1 (4C), 129.2 (4C), 130.2 (2C), 130.3 (4C), 130.5 (4C), 135.7 (2C), 136.2 (2C+2C), 136.3 (4C+4C), 137.0 (2C+2C), 142.5 (2C), 144.3 (2C), 146.2 (2C), 146.4 (2C), 147.0 (4C), 147.1 (2C), 147.4 (2C), 148.1 (2C), 148.8 (2C+2C), 151.3 (2C), 151.6 (1C). The α-position carbons to which borons are bonded were not observed.

Synthesis Example (2): Synthesis of N[7],N[19],5,9,11,15,17,21-Octakis(2,6-difluorophenyl)-N[7],N[13],N[13],N[19]-tetraphenyl-5,9,11,15,17,21-hexahydro-5,9,11,15,17,21-hexaaza-25b,26b,27b-triboranaphtho[3,2,1-de]naphtho[3',2',1',10,11]tetraceno[1,2,3-jk]pentacene-7,13,19-triamine (Compound(1-1-61))

(1-1-61)

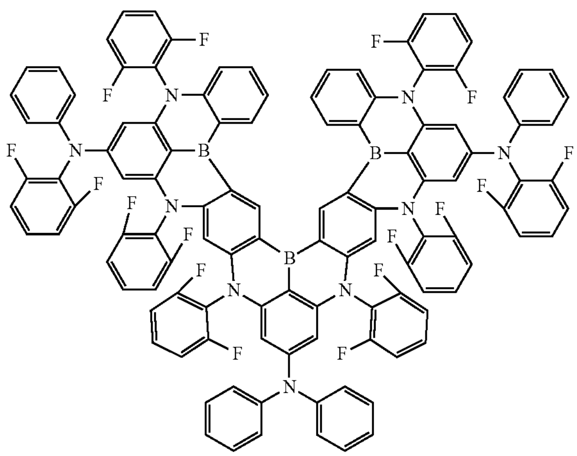

To a flask containing N[1],N[1']-(((5-(Diphenylamino)-1,3-phenylene)bis((2,6-difluorophenyl)azanediyl))bis(3,1-phenylene))bis(N[1],N[3],N[5]-tris(2,6-difluorophenyl)-N[3],N[5]-diphenylbenzene-1,3,5-triamine) (Compoundi-7) (93.5 mg, 0.050 mmol), and o-dichlorobenzene (1.0 ml) was added boron tribromide (0.304 ml, 3.2 mmol) in a nitrogen atmosphere at room temperature. After completion of the dropping, the temperature was raised to 180° C., and the reaction liquid was stirred for 18 hours. The reaction liquid was cooled to room temperature and hydrogen bromide in the reaction liquid was evaporated under reduced pressure. After diluting the reaction liquid by adding dichloromethane (5.0 ml), a phosphate buffer solution (pH=7, 5.0 ml) was added at 0° C. After three-time extraction of the aqueous layer with dichloromethane, the solvent was evaporated under reduced pressure. The crude product obtained was purified by silica gel column chromatography (eluent: hexane:dichloromethane=2:3 (volume ratio)) to obtain N[7],N[19],5,9,11,15,17,21-octakis(2,6-difluorophenyl)-N[7],N[13],N[13],N[19]-tetraphenyl-5,9,11,15,17,21-hexahydro-5,9,11,15,17,21-hexaaza-25b,26b,27b-triboranaphtho[3,2,1-de]naphtho[3',2',1':10,11]tetraceno[1,2,3-jk]pentacene-7,13,19-triamine(Compound 1-1-61) as a yellow solid (12.3 mg, yield 13%).

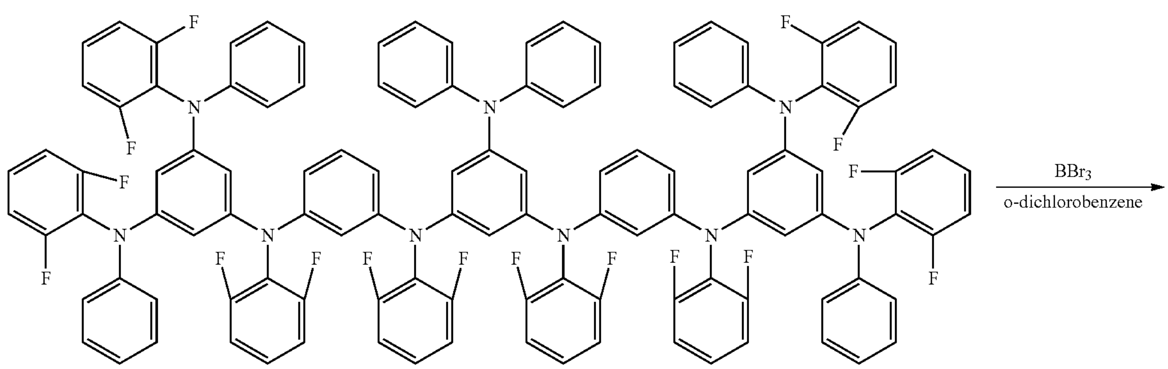

(i-7)

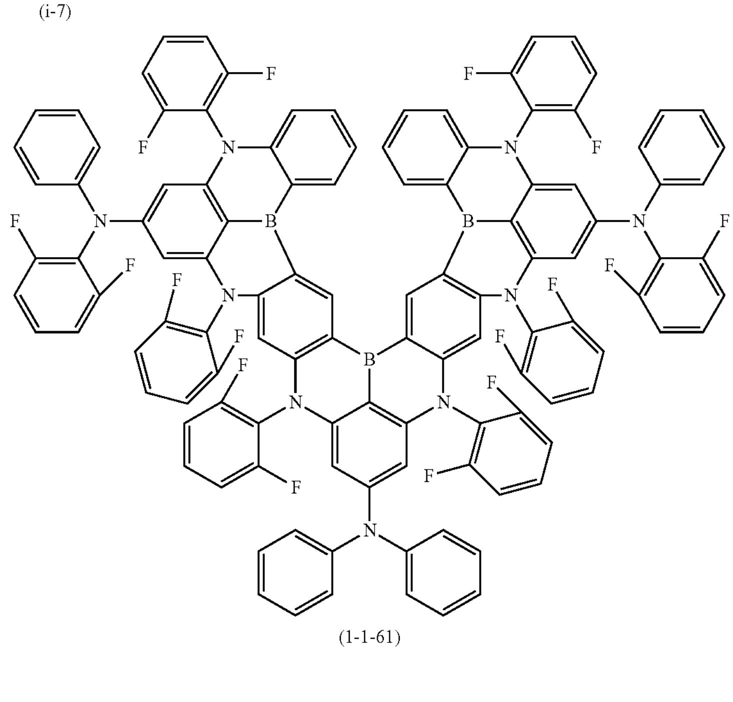

(1-1-61)

Structure of the compound obtained was identified by NMR measurement.

$^{1}$H-NMR (400 MHz, $CDCl_3$): δ=5.70 (s, 2H), 5.74 (s, 2H), 5.86 (s, 2H), 5.97 (s, 2H), 6.49 (t, 2H), 6.66 (d, 2H), 7.00-7.14 (m, 20H), 7.19-7.41 (m, 18H), 7.45-7.68 (m, 8H), 8.99 (d, 2H), 10.7 (s, 2H) MALDI m/z $[M]^+$ calcd for $C_{114}H_{62}B_3F_{16}N_9$ 1893.5187, observed 1893.5349

Synthesis Example (3): Synthesis of $N^7$,$N^7$,$N^{13}$,$N^{13}$,$N^{19}$,$N^{19}$,5,9,11,15,17,21-Dodecaphenyl-5,9,11,15,17,21-hexahydro-5,9,11,15,17,21-hexaaza-25b,26b,27b-triboranaphtho[3,2,1-de]naphtho[3',2',1';10,11]tetraceno[1,2,3-jk]pentacene-7,13,19-triamine (Compound(1-1-5))

(1-1-5)

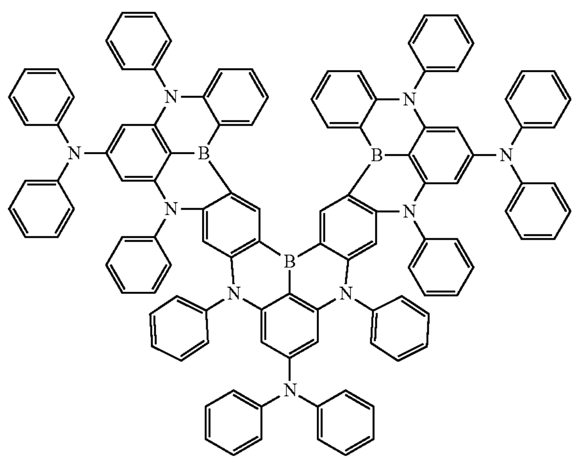

To a flask containing $N^1$,$N^{1'}$-(((5-(Diphenylamino)-1,3-phenylene)bis(phenylazanediyl))bis(3,1-phenylene))bis($N^1$,$N^3N^3$,$N^5$,$N^5$-pentaphenylbenzene-1,3,5-triamine) (Compound i-8) (0.135 g, 0.085 mmol), and 2,4-dichlorotoluene (1.3 ml) was added boron tribromide (0.129 ml, 1.4 mmol) in a nitrogen atmosphere at room temperature. After completion of the dropping, the temperature was raised to 200° C., and the reaction liquid was stirred for 18 hours. The reaction liquid was cooled to room temperature and hydrogen bromide in the reaction liquid was evaporated under reduced pressure. After diluting the reaction liquid by adding dichloromethane (5.0 ml), a phosphate buffer solution (pH=7, 5.0 ml) was added at 0° C. After three-time extraction of the aqueous laser with dichloromethane, the solvent was evaporated under reduced pressure. The crude product obtained was purified by silica gel column chromatography (eluent, hexane:dichloromethane=3:2 (volume ratio)) to obtain $N^7$,$N^7$,$N^{13}$,$N^{13}N^{19}$,$N^{19}$,5,9,11,15,17,21-Dodecaphenyl-5,9,11,15,17,21-hexahydro-5,9,11,15,17,21-hexaaza-25b,26b,27b-triboranaphtho[3,2,1-de]naphtho[3',2',1':10,11]tetraceno[1,2,3-jk]pentacene-7,13,19-triamine(Compound 1-1-5) as a yellow solid (15.1 mg, yield 11%).

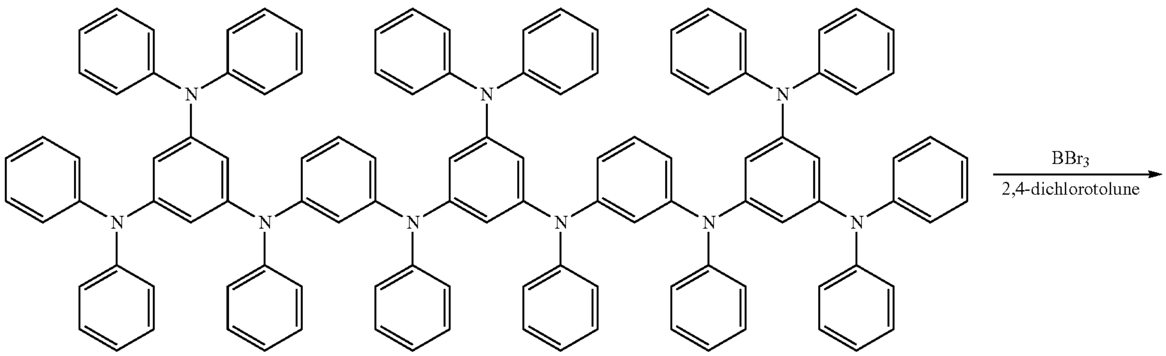
(i-8)
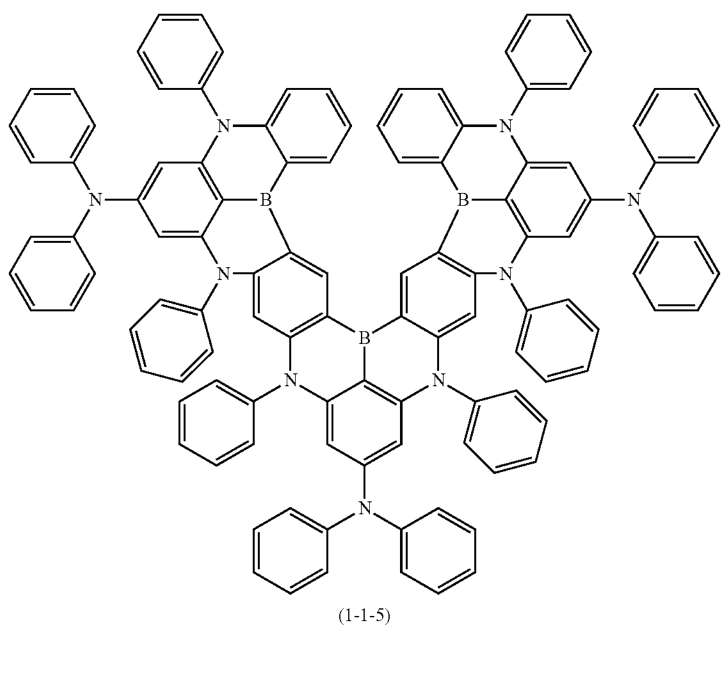
(1-1-5)
Structure of the compound obtained was identified by NMR measurement.
$^{1}$H-NMR (400 MHz, $CDCl_3$), δ=5.64-5.65 (m, 6H), 5.74 (s, 2H), 6.35 (t, 2H), 6.48 (d, 2H), 6.85-6.93 (m, 20H), 7.00-7.07 (m, 20H), 7.10-7.26 (m, 16H), 7.33 (t, 2H), 7.45 (t, 4H), 9.00 (d, 2H), 10.6 (s, 2H)
MALDI m/z $[M]^+$ calcd. for $C_{114}H_{78}B_3N_9$ 1605.6695, observed 1605.6753

Synthesis Example (4): Synthesis of 9,11,15,17-Tetrakis(2,6-difluorophenyl)-$N^7$,$N^7$,$N^{13}$,$N^{13}$,$N^{19}$,$N^{19}$,5,21-octaphenyl-5,9,11,15,17,21-hexahydro-5,9,11,15,17,21-hexaaza-25b,26b,27b-triboranaphtho[3,2,1-de]naphtho[3',2',1':10,11]tetraceno[1,2,3-jk]pentacene-7,13,19-triamine (Compound 1-1-10)

(1-1-10)

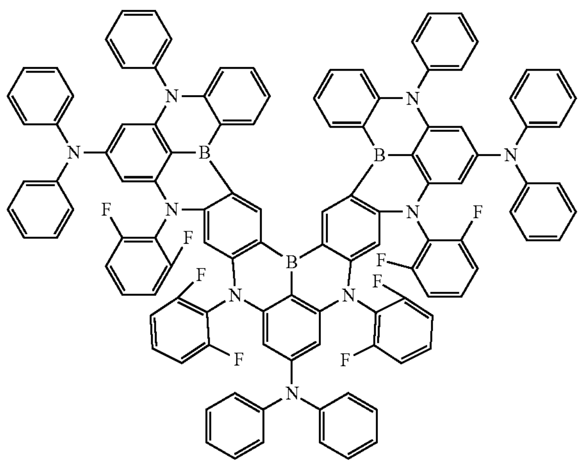

To a flask containing $N^1$,$N^{1'}$-(((5-(Diphenylamino)-1,3-phenylene)bis((2,6-difluorophenyl)azanediyl))bis(3,1-phenylene))bis($N^1$-(2,6-difluorophenyl)-$N^3$,$N^3$,$N^5$,$N^5$-tetraphenylbenzene-1,3,5-triamine) (Compound(i-9); 86.4 mg, 0.050 mmol), and o-dichlorobenzene (1.0 ml) was added boron tribromide (76.0 μL, 0.80 mmol) in a nitrogen atmosphere at room temperature After completion of the dropping, the temperature was raised to 200° C., and the reaction liquid was stirred for 18 hours. The reaction liquid was cooled to room temperature and hydrogen bromide in the reaction liquid was evaporated under reduced pressure. After diluting the reaction liquid by adding dichloromethane (5.0 ml), a phosphate buffer solution (pH=7, 5.0 ml) was added at 0° C. After three-time extraction of the aqueous layer with dichloromethane, the solvent was evaporated under reduced pressure. The crude product obtained was purified by silica gel column chromatography (eluent: hexane:dichloromethane=1:1) to obtain 9,11,15,17-Tetrakis(2,6-difluorophenyl)-$N^7$,$N^7$,$N^{13}$,$N^{13}$,$N^{19}$,$N^{19}$,5,21-octaphenyl-5,9,11,15,17,21-hexahydro-5,9,11,15,17,21-hexaaza-25b,26b,27b-triboranaphtho[3,2,1-de]naphtho[3',2',1':10,11]tetraceno[1,2,3-jk]pentacene-7,13,19-triamine (Compound(1-1-10)) as a yellow solid (0.2 mg, yield 35%).

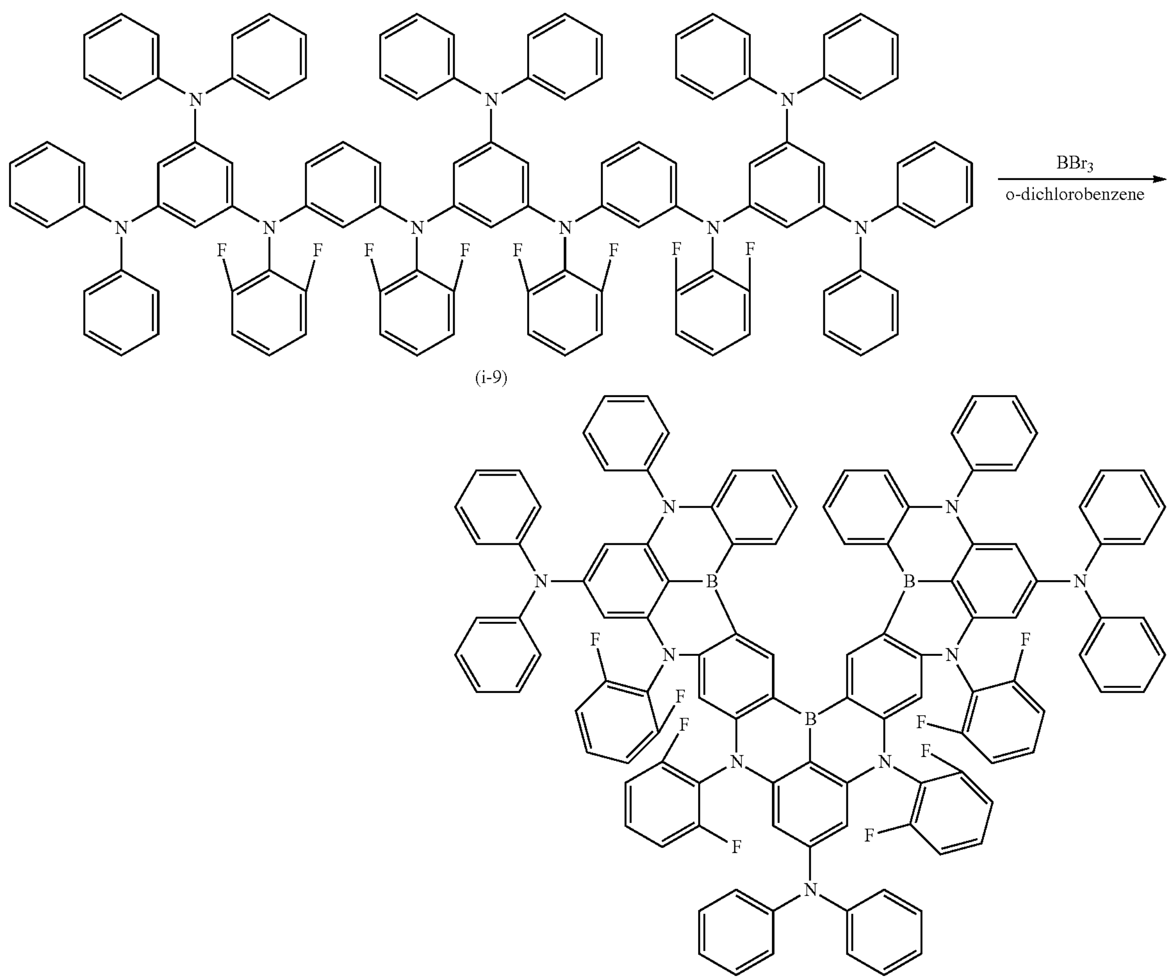

(i-9)

(1-1-10)

Structure of the compound obtained was identified by NMR measurement.

$^1$H-NMR (400 MHz, $CDCl_3$): δ=5.71 (s, 2H), 5.75 (s, 2H), 5.79 (s, 2H), 5.85 (s, 2H), 6.36 (t, 2H), 6.51 (d, 2H), 6.78 (t, 8H), 6.90 (t, 8H), 6.96-7.17 (m, 28H), 7.24 (d, 4H), 7.33 (t, 2H), 7.45 (t, 4H), 8.99 (d, 2H), 10.6 (s, 2H)

MALDI m/z $[M]^+$ calcd. for $C_{114}H_{70}B_3F_8N_9$ 1749.5941, observed 1749.5962

Synthesis Example (5): Synthesis of 2,22,25,30-Tetra-tert-butyl-$N^6$,$N^6$,$N^{12}$,$N^{12}$,$N^{18}$,$N^{18}$,10,14,16-decakis(3,5-dimethylphenyl)-8,10,14,16-tetrahydro-4b,8,10,14,16,19b-hexaaza-26b,27b,28b-triboranaphtho[1,2,3-de]fluorantheno[1',2',3':10,11]tetraceno[1,2,3-jk]pentacene-6,12,18-triamine (Compound(1-1-105))

(1-1-105)

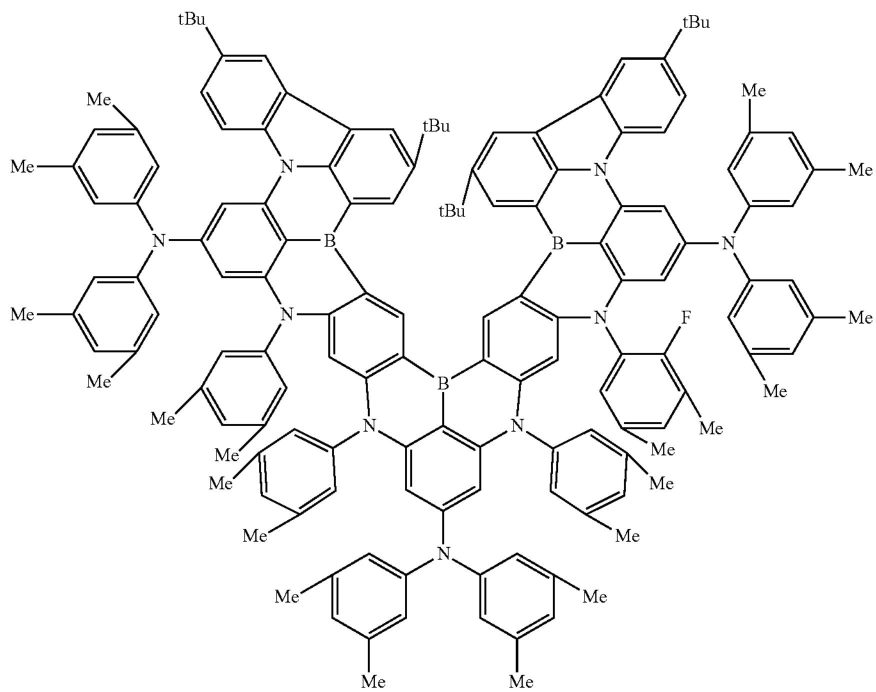

To a flask containing $N^1$,$N^3$-bis(3-((3-(bis(3,5-dimethylphenyl)amino)-5-(3,6-di-tert-butyl-9H-carbazol-9-yl)phenyl)(3,5-dimethylphenyl)amino)phenyl)-$N^1$,$N^3$,$N^5$,$N^5$-tetrakis(3,5-dimethylphenyl)benzene-1,3,5-triamine (Compound (i-10): 0.625 g, 0.30 mmol), and chlorobenzene (6.0 ml) was added boron tribromide (0.455 ml, 1.6 mmol) in a nitrogen atmosphere at room temperature. After completion of the dropping, the temperature was raised to 150° C., and the reaction liquid was stirred for 20 hours. The reaction liquid was cooled to room temperature and hydrogen bromide in the reaction liquid was evaporated under reduced pressure. After diluting the reaction liquid by adding dichloromethane (10 ml), a phosphate buffer solution (pH=7, 10 ml) was added at 0° C. After three-time extraction of the aqueous layer with dichloromethane, the solvent was evaporated under reduced pressure. The crude product obtained was purified by GPC (eluent: hexane, 1,2-dichloroethane) to obtain 2,22,25,30-tetra-tert-butyl-$N^6$,$N^6$,$N^{12}$,$N^{12}$,$N^{18}$,$N^{18}$,8,10,14,16-decakis(3,5-dimethylphenyl)-8,10,14,16-tetrahydro-4b,8,10,14,16,19b-hexaaza-26b,27b,28b-triboranaphtho[1,2,3-de]fluorantheno[1',2',3',10,11]tetraceno[1,2,3-jk]pentacene-6,12,18-triamine (Compound(1-1-105)) as a yellow solid (97.2 mg, yield 15%)

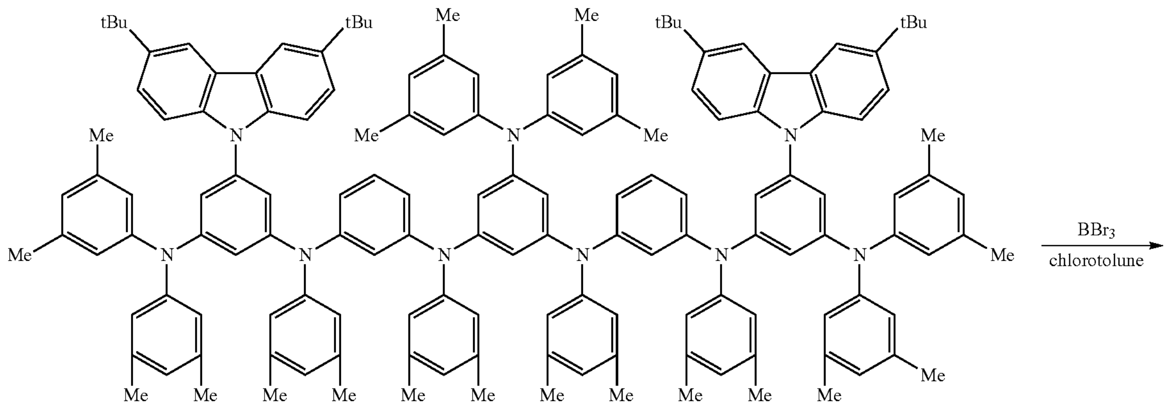

(i-10)

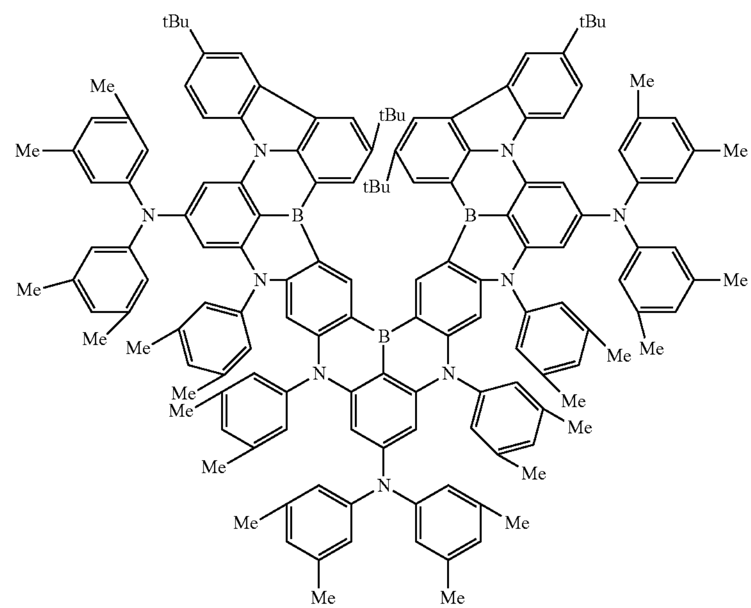

(1-1-105)

Structure of the compound obtained was identified by NMR measurement.

$^1$H-NMR (400 MHz, $CDCl_3$): δ=1.44 (s, 18H), 1.54 (s, 18H, 2.11-2.27 (m, 60H), 5.71 (s, 2H), 5.73 (s, 2H), 5.83 (d, 2H), 6.55-6.56 (m, 10H), 6.73-6.89 (m, 20H), 7.31 (dd, 2H), 7.62 (d, 2H), 7.68 (d, 2H), 7.85 (d, 2H), 8.02 (d, 2H), 8.83 (d, 2H), 10.4 (s, 2H).

Example 1

An organic EL element obtained by laminating each layer of the forming material and the film thickness shown in Table 1 can be produced by the following procedure

TABLE 1

| | Hole injection layer (40 nm) | Hole transport layer (15 nm) | Electron blocking layer (15 nm) | Light-emitting layer (20 nm) | | Electron transport layer (30 nm) | Cathode (1 nm/100 nm) |
|---|---|---|---|---|---|---|---|
| | | | | Host | Dopant | | |
| Example 1 | NPD | TcTa | mCP | mCBP | 1-1-1 | TSPO1 | LiF/Al |

In Table 1, "NPD" is N,N'-diphenyl-N,N'-dinaphthyl-4,4'-diaminobiphenyl,

"TcTa" is tris(4-carbazol-9-ylphenyl)amine,

"CBP" is 4,4'-di(9H-carbazol-9-yl)-1,1'-biphenyl,

"mCP" is 1,3-bis(carbazol-9-yl)benzene,

"mCBP" is 3,3'-di(9H-carbazol-9-yl)-1,1'-biphenyl, and

"TSPO1" is diphenyl-4-triphenylsilylphenylphosphine oxide.

The chemical structures are shown below.

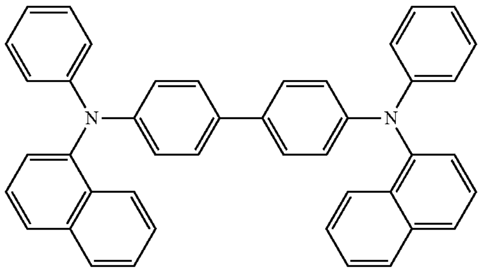

NPD

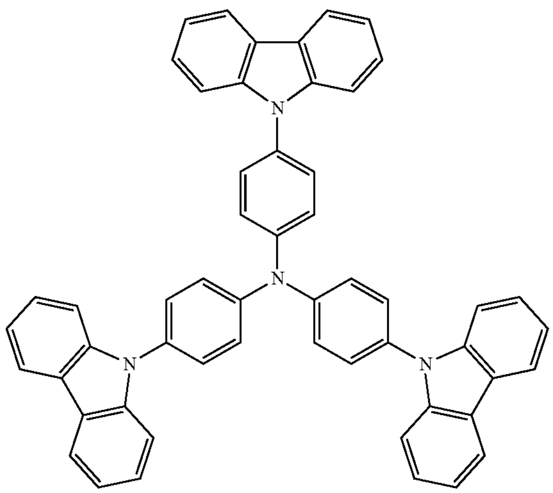

TcTa

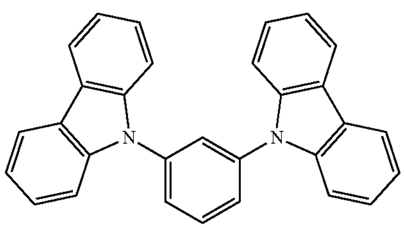

mCP

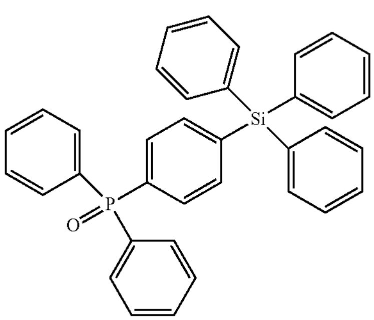

TSPO1

-continued

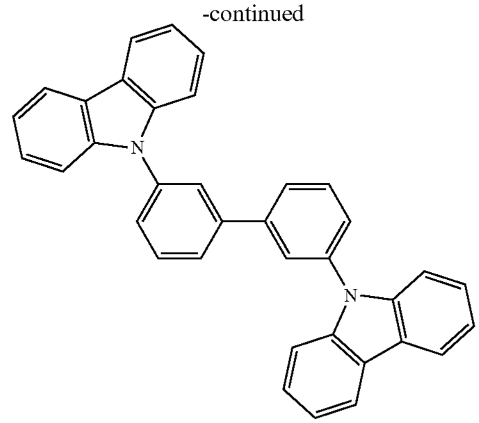

mCBP

A glass substrate having a size of 26 mm×28 mm×0.7 mm prepared by forming a film of ITO having a thickness of 200 nm by sputtering and polishing the ITO film to 50 nm (manufactured by Opto Science, Inc) is used as a transparent supporting substrate. The transparent supporting substrate is fixed on a substrate holder of a commercially available vapor deposition apparatus (manufactured by Choshu Industry Co., Ltd.) A deposition boat made of tantalum and containing each of NPD, TcTa, mCP, mCBP, Compound(1-1-1), and TSPO1, and a deposition boat made of aluminum nitride and containing each of LiF and aluminum are mounted in the apparatus.

Each layer as described below is formed sequentially on the ITO film of the transparent supporting substrate. A pressure in a vacuum chamber is reduced to $5\times10^{-4}$ Pa. First, NPD is heated, and thereby vapor deposition is performed so as to obtain a film thickness of 40 nm. Subsequently, TcTa is heated, and thereby vapor deposition is performed so as to obtain a film thickness of 15 nm. Thus, a hole injection layer and a hole transport layer are formed. Subsequently, mCP is heated, and thereby vapor deposition is performed so as to obtain a film thickness of 15 nm to form an electron blocking layer. Next, mCBP and Compound (1-1-1) are simultaneously heated, and deposition is performed so as to obtain a film thickness of 20 nm to form a light-emitting layer. A vapor deposition rate is adjusted to be approximately 99:1 in a mass ratio of mCBP and Compound (1-1-1). Next, TSPO1 is heated, and deposition is performed so as to obtain a film thickness of 30 nm to form electron transport Layla. The vapor deposition rate of each layer is in the range between 0.01 to 0.1 nm/sec. Thereafter, LiF is heated, and deposition is performed at a vapor deposition rate of 0.01 to 0.1 nm/sec so as to obtain a film thickness of 1 nm. Subsequently, aluminum is heated, and deposition is performed so as to obtain a film thickness of 100 nm to form a cathode to obtain an organic EL element. At this time, the vapor deposition rate of aluminum is adjusted from 0.1 nm to 10 nm/sec.

When a direct current voltage is applied to the ITO electrode as a positive electrode and the aluminum electrode as a negative electrode, deep blue light emission having narrow half width is obtained.

Synthesis Example: Synthesis of High Molecular Host Compound: SPH-101

SPH-101 was synthesized according to the method described in WO2015/008851. A copolymer in which M2 or M3 is bonded next to M1 was obtained. From the charging ratio, each unit is 50:26:24 (molar ratio).

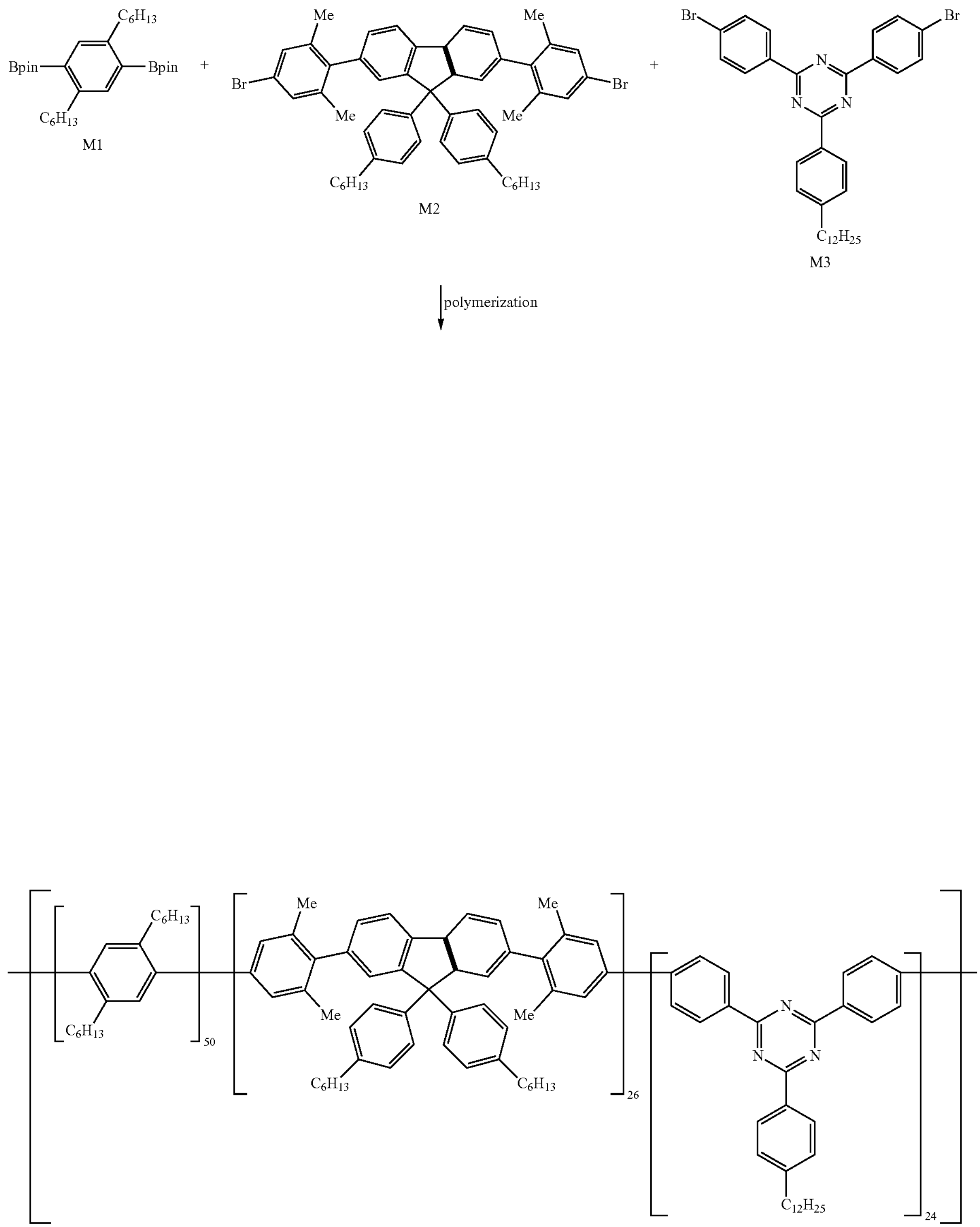
In the formula, Me is methyl, and Bpin is pinacolatoboryl.
Synthesis Example: Synthesis of High Molecular Hole Transport Compound: XLP-101
XLP-101 was synthesized according to the method described in JP 2018-61028 A. A copolymer in which M4, M5 and M6 were bonded was obtained. From the charging ratio, each unit is 40:10:50 (molar ratio).

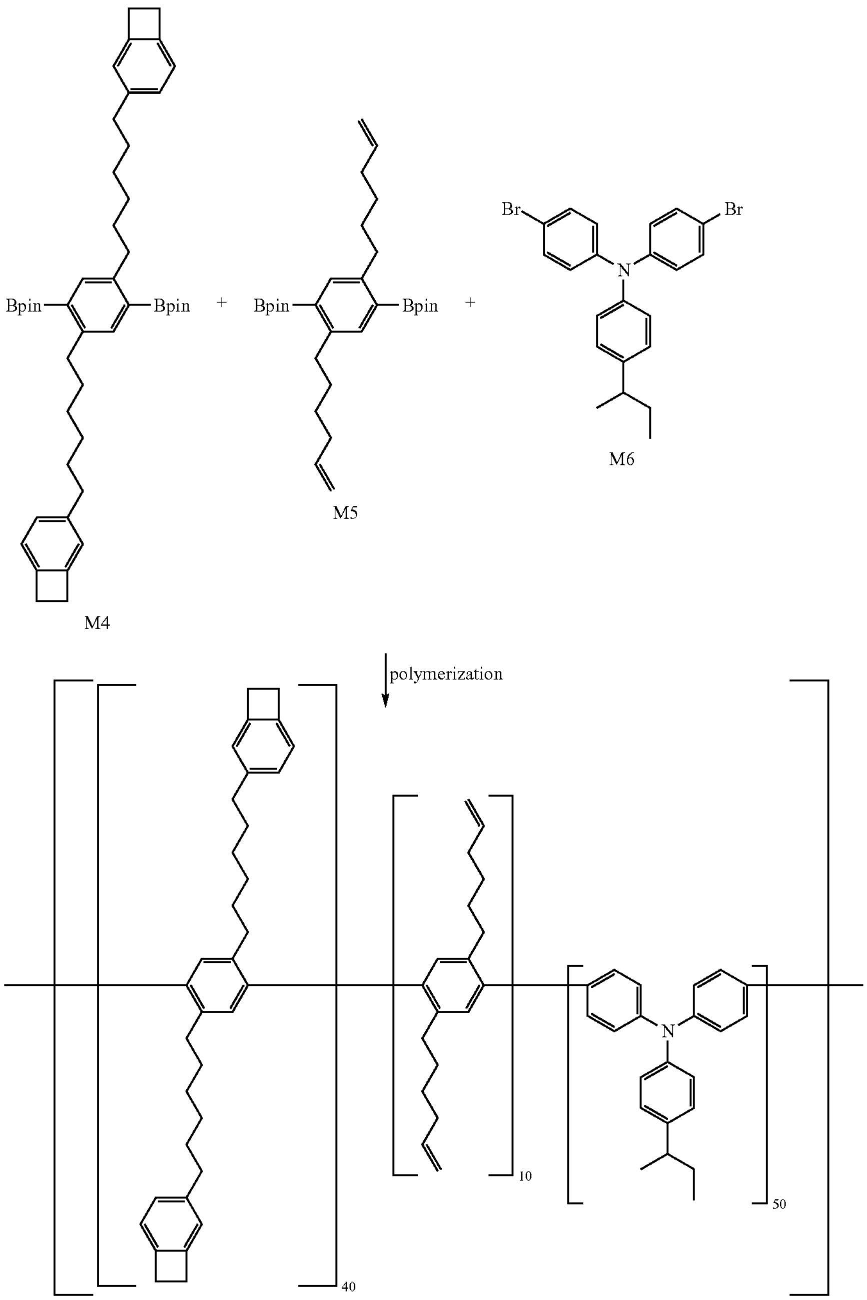

In the formula, Bpin is pinacolatoboryl.

<Preparation of XLP-101 Solution>

A 0.6 wt % XLP-101 Solution was prepared by dissolving XLP-101 in xylen.

<Preparation of Light-Emitting Layer Forming Composition>

A light-emitting layer forming composition of Example 2 can be prepared. The compounds used for the preparation of the composition are shown below.

Example 2

A light-emitting layer forming composition is prepared by stirring the following components until a uniform solution is obtained.

| | |
|---|---|
| Compound (1-1-1) | 0.04% by mass |
| SPH-101 | 1.96% by mass |
| xylene | 69.00% by mass |
| Decalin | 29.00% by mass |

By spin-coating the prepared light-emitting layer forming composition on a glass substrate and heating and diving under reduced pressure, a coating film having no film defects and excellent smoothness is obtained.

<Production of Organic EL Element>

Examples 3 and 4 show a method of manufacturing an organic EL element using a crosslinkable hole transport material, and Example 5 shows a method of manufacturing an organic EL element using an orthogonal solvent system. The material composition of each layer in the organic EL element to be manufactured is shown in Table 2.

TABLE 2

| | Hole injection layer (40 nm) | Hole transport layer (30 nm) | Light-emitting layer (20 nm) Host | Dopant | Composition | Electron transport layer (30 nm) | Cathode (1 nm/100 nm) |
|---|---|---|---|---|---|---|---|
| Example 3 | PEDOT:PSS | OTDP | SPH-101 | 1-1-1 | Example 2 | ET1 | LiF/Al |
| Example 4 | PEDOT:PSS | XLP-101 | SPH-101 | 1-1-1 | Example 2 | ET1 | LiF/Al |
| Example 5 | PEDOT:PSS | PCz | SPH-101 | 1-1-1 | Example 2 | ET1 | LiF/Al |

The structures of "PEDOT:PSS", "OTPD", "PCz", "ET1" in Table 2 are shown below.

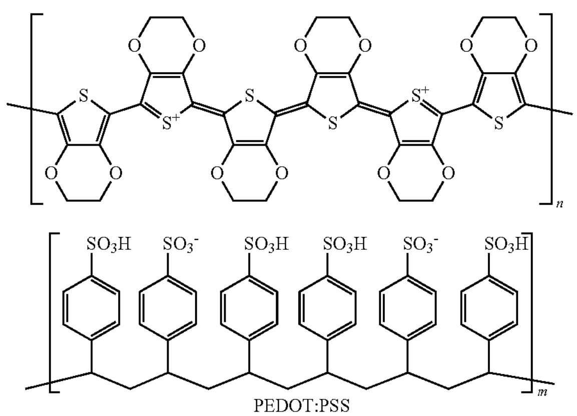

PEDOT:PSS

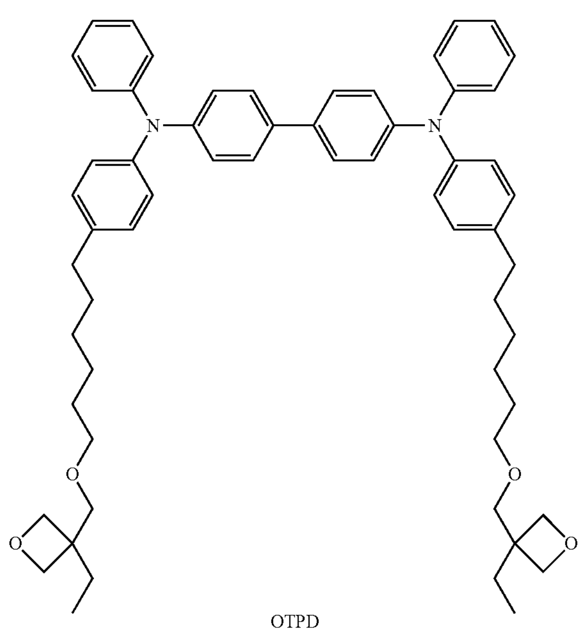

OTPD

-continued

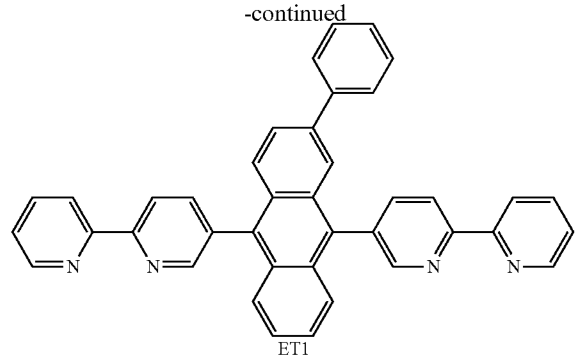

ET1

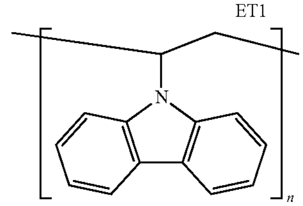

PCz

<PEDOT:PSS Solution>

A commercially-available PEDOT:PSS solution (Clevios™ P VP AI4083, a water dispersion of PEDOT:PSS, manufactured by Heraeus Holdings) is used.

Preparation of OTPD Solution>

By dissolving OTPD (LT-N159, manufactured by Luminescence Technology Corp.) and IK-2 (a photocationic polymerization initiator, manufactured by San-Apro Ltd.) in toluene, an OTPD solution of OTPD concentration of 0.7 wt % and IK-2 concentration of 0.007 wt % is prepared.

Preparation of PCz Solution>

By dissolving PCz(polyvinylcarbazole) in dichlorobenzene, PCz solution of 0.7 wt % was prepared.

Example 3

A PEDOT:PSS solution is spin-coated on a glass substrate on which ITO is deposited to a thickness of 150 nm, and the glass substrate is baked on a hot plate at 200° C. for 1 hour to form a PEDOT:PSS film having a film thickness of 40 nm (hole injection layer). OTPD solutions are then spin-coated and dried on 80° C. hot plates for 10 minutes. A 30 nm-thick OTPD film insoluble in the solution is formed by exposing to light in an exposure 100 mJ/cm$^2$ and baking on a hot plate at 100° C. for 1 hour (hole transport layer). Then, the light-emitting layer forming composition of Example 2 is spin-coated and baked on a hot plate at 120° C. for 1 hour to form a light-emitting layer having a film thickness of 20 nm.

The prepared multilayer film is fixed on a substrate holder of a commercially available vapor deposition apparatus (manufactured by Showa Vacuum Co., Ltd.). A molybdenum vapor deposition boat containing ET1, a molybdenum vapor deposition boat containing LiF, and a tungsten vapor deposition boat containing aluminum are mounted in the apparatus. After the vacuum chamber is depressurized to $5\times10^{-4}$ Pa, vapor deposition is performed so as to obtain a film thickness of 30 nm by heating the deposition boat containing ET1 to form an electron transport layer. The deposition rate when forming the electron transport layer is 1 nm/sec. Thereafter, vapor deposition is performed so as to obtain a film thickness of 1 nm by heating the deposition boat containing LiF at a deposition rate of 0.01 to 0.1 nm/sec. Next, vapor deposition is performed so as to obtain a film thickness of 100 nm by heating the deposition boat containing aluminum to form a cathode. In this manner, an organic EL element is obtained.

Example 4

A PEDOT:PSS solution is spin-coated on a glass substrate on which ITO is deposited to a thickness of 150 nm, and the glass substrate is baked on a hot plate at 200° C. for 1 hour to form a PEDOT:PSS film having a film thickness of 40 nm (hole injection layer). Then, XLP-101 solution is spin-coated and baked on a hot plate at 200° C. for 1 hour to form an XLP-101 film having a film thickness of 30 nm (hole transport layer). Then, the light-emitting layer forming composition of Example 2 is spin-coated and baked on a hot plate at 120° C. for 1 hour to form a light-emitting layer having a film thickness of 20 nm. Next, an electron transport layer and a cathode are deposited in the same manner as in Example 3 to obtain an organic EL element.

Example 5

A PEDOT:PSS solution is spin-coated on a glass substrate on which ITO is deposited to a thickness of 150 nm, and the glass substrate is baked on a hot plate at 200° C. for 1 hour to form a PEDOT:PSS film having a film thickness of 40 nm (hole injection layer). Then, the PCz solution is spin-coated and baked on a hot plate at 120° C. for 1 hour to form a PCz film having a film thickness of 30 nm (hole transport layer). Thai, the light-emitting layer forming composition of Example 2 is spin-coated and baked on a hot plate at 120° C. for 1 hour to form a light-emitting layer having a film thickness of 20 nm. Then, the electron transport layer and the cathode are deposited in the same manner as in Example 3 to obtain an organic EL element.

Example 6

A light-emitting layer forming composition is prepared by stirring the following components until a uniform solution is obtained.

| | |
|---|---|
| Compound 1-1-1 | 0.02% by mass |
| mCBP | 1.98% by mass |
| toluene | 98.00% by mass |

Example 7

A light-emitting layer forming composition is prepared by stirring the following components until a uniform solution is obtained.

| | |
|---|---|
| Compound 1-1-1 | 0.02% by mass |
| SPH-101 | 1.98% by mass |
| xylene | 98.00% by mass |

Example 8

A light-emitting layer forming composition is prepared by stirring the following components until a uniform solution is obtained.

| | |
|---|---|
| Compound 1-1-1 | 0.02% by mass |
| DOBNA | 1.98% by mass |
| toluene | 98.00% by mass |

<Production and Evaluation of Organic EL Element>

Examples 9 to 11 show methods for manufacturing organic EL elements using different hosts. Table 3 show s the material composition of each layer in the organic EL element to be manufactured

TABLE 3

| | Hole injection layer (50 nm) | Hole transport layer (20 nm) | Light-emitting layer (20 nm) Host | Dopant | Composition | Electron transport layer (30 nm) | Cathode (1 nm/ 100 nm) |
|---|---|---|---|---|---|---|---|
| Example 9 | ND-3202 | XLP-101 | mCBP | 1-1-1 | Example 6 | TSPO1 | LiF/Al |
| Example 10 | ND-3202 | XLP401 | SPH-101 | 1-1-1 | Example 7 | TSPO1 | LiF/Al |
| Example 11 | ND-3202 | XLP-101 | DOBNA | 1-1-1 | Example 8 | TSPO1 | LiF/Al |

In Table 3, "DOBNA" is 3,11-di-o-tolyl-5,9-dioxa-13b-boranaphtho[3,2,1-de]anthracene.

The chemical structures are shown below.

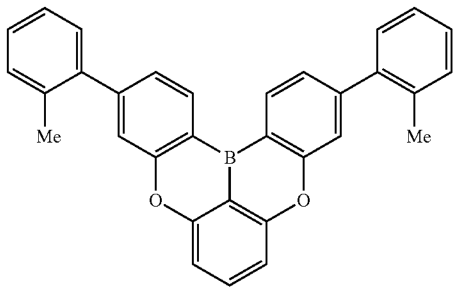

DOBNA

Example 9

A ND-3202 (manufactured by Nissan Chemical Co., Ltd.) is spin-coated on a glass substrate on which ITO is deposited to a thickness of 45 nm. Next, a hole injection layer having a film thickness of 50 nm is formed by heating at 50° C. in an atmosphere for 3 minutes, and then further heating at 230° C. for 15 minutes. XLP-101 solution is spin-coated onto the hole-injected layer. Then, under a nitrogen gas atmosphere, a hole transport layer having a film thickness of 20 nm is formed by heating on a hot plate at 200° C. for 30 minutes. The light-emitting layer forming composition prepared in Example 6 is spin-coated and heated under a nitrogen gas atmosphere at 130° C. for 10 minutes to form a light-emitting layer having a film thickness of 20 nm.

The prepared multilayer film is fixed on a substrate holder of a commercially available vapor deposition apparatus (manufactured by Showa Vacuum Co., Ltd). A molybdenum vapor deposition boat containing TSPO1, a molybdenum vapor deposition boat containing LiF, and a tungsten vapor deposition boat containing aluminum are mounted in the apparatus. After the vacuum chamber is depressurized to $5\times10^{-4}$ Pa, vapor deposition is performed so as to obtain a film thickness of 30 nm by heating the deposition boat containing TSPO1 to form an electron transport layer. The deposition rate when forming the electron transport layer is 1 nm/sec Thereafter, vapor deposition is performed so as to obtain a film thickness of 1 nm by heating the deposition boat containing LiF at a deposition rate of 0.01 to 0.1 nm/sec. Next, vapor deposition is performed so as to obtain a film thickness of 100 nm by heating a boat containing aluminum to form a cathode. In this manner, an organic EL element is obtained.

Example 10

An organic EL element is obtained by using the light-emitting layer forming composition prepared in Example 7 instead of the light-emitting layer forming composition prepared in Example 6, and by performing the vapor deposition in the same manner as in Example 9.

Example 11

An organic EL element is obtained by using the light-emitting layer forming composition prepared in Example 8 instead of the light-emitting layer forming composition prepared in Example 6, and by performing the vapor deposition in the same manner as in Example 11.

Example 12

A light-emitting layer forming composition is prepared by stirring the following components until a uniform solution is obtained.

| | |
|---|---|
| Compound (1-1-1) | 0.02% by mass |
| 2PXZ-TAZ | 0.18% by mass |
| mCBP | 1.80% by mass |
| toluene | 98.00% by mass |

Example 13

A light-emitting layer forming composition is prepared by stirring the following components until a uniform solution is obtained

| | |
|---|---|
| Compound (1-1-1) | 0.02% by mass |
| 2PX2-TAZ | 0.18% by mass |
| SPH-101 | 1.80% by mass |
| xylene | 98.00% by mass |

Example 14

A light-emitting layer forming composition is prepared by stirring the following components until a uniform solution is obtained.

| | |
|---|---|
| Compound (1-1-1) | 0.02% by mass |
| 2PXZ-TAZ | 0.18% by mass |
| DOBNA | 1.80% by mass |
| toluene | 98.00% by mass |

<Production and Evaluation of Organic EL Element>

Examples 15 to 17 show methods for producing an organic EL element in which an assisting dopant is added. Table 4 shows the material composition of each layer in the organic EL element to be manufactured.

TABLE 4

| | Hole injection layer (50 nm) | Hole transport layer (20 nm) | Light-emitting layer (20 nm) Host | Assisting Dopant | Dopant | Composition | Electron transport layer (30 nm) | Cathode (1 nm/ 100 nm) |
|---|---|---|---|---|---|---|---|---|
| Example 15 | ND-3202 | XLP-101 | mCBP | 2PXZ-TAZ | 1-1-1 | Example 12 | TSPO1 | LiF/Al |
| Example 16 | ND-3202 | XLP-101 | SPH-101 | 2PXZ-TAZ | 1-1-1 | Example 13 | TSPO1 | LiF/Al |
| Example 17 | ND-3202 | XLP-101 | DOBNA | 2PXZ-TAZ | 1-1-1 | Example 14 | TSPO1 | LiF/Al |

In Table 4, "2PXZ-TAZ" is 10,10'-((4-phenyl-4H-1,2,4-triazole-3,5-diyl)bis(4,1-phenyl))bis(10H-phenoxazine).

The chemical structure is shown below.

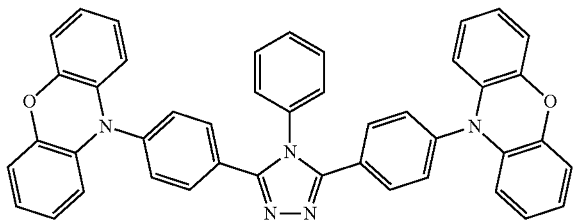

(2PXZ-TAZ)

Example 15

AND-3202 (manufactured by Nissan Chemical Co., Ltd.) is spin-coated on a glass substrate on which ITO is deposited to a thickness of 45 nm. Next, a hole injection layer having a film thickness of 50 nm is formed by heating at 50° C. in an atmosphere for 3 minutes, and then further heating at 230° C. for 15 minutes. XLP-101 solutions are spin-coated onto the hole-injected layers. Then, under a nitrogen gas atmosphere, a hole transport layer having a film thickness of 20 nm is formed by heating on a hot plate at 200° C. for 30 minutes. The composition for forming a light-emitting layer prepared in Example 12 is spin-coated, and a 20 nm light-emitting layer is formed by heating under a nitrogen gas atmosphere at 130° C. for 10 minutes.

The prepared multilayer film is fixed to the substrate holder of a commercially available vapor deposition apparatus (manufactured by Showa Vacuum Co., Ltd), a molybdenum vapor deposition boat containing TSPO1, a molybdenum vapor deposition boat containing LiF, a tungsten vapor deposition boat containing aluminum. After the vacuum chamber is depressurized to $5\times10^{-4}$ Pa, vapor deposition is performed so as to obtain a film thickness of 30 nm by heating the deposition boat containing TSPO1 to form an electron transport layer. The deposition rate when forming the electron transport layer is 1 nm/sec. Thereafter, vapor deposition is performed so as to obtain a film thickness of 1 nm by heating the deposition boat containing LiF at a deposition rate of 0.01 to 0.1 nm/sec. Next, vapor deposition is performed so as to obtain a film thickness of 100 nm by heating the deposition boat containing aluminum to form a cathode. In this manner, an organic EL element is obtained.

Example 16

An organic EL element is obtained by using the light-emitting layer forming composition prepared in Example 13 instead of the light-emitting layer forming composition prepared in Example 12, and by performing the vapor deposition in the same manner as in Example 15.

Example 17

An organic EL element is obtained by using the light-emitting layer forming composition prepared in Example 14 instead of the light-emitting layer forming composition prepared in Example 12, and by performing the vapor deposition in the same manner as in Example 15.

<Evaluation of Fundamental Properties>

Preparation of Samples

Where absorption characteristics and light emission characteristics (fluorescence and phosphorescence) of target compounds are evaluated, a target compound for evaluation is dissolved in a solvent and evaluated in the resultant solution in one case, or a target compound is evaluated in the form of a thin film in another case. Further, in evaluation in the form of a thin film, two cases may be employed depending on the mode of using a target compound in an organic EL element, that is, a target compound alone is formed into a thin film in one case, or a target compound is dispersed in an appropriate matrix material to form a thin film in another case.

As a matrix material, commercially available PMMA (polymethyl methacrylate) can be used. In the present Examples, PMMA and a target compound were dissolved in toluene, and then applied to a transparent supporting substrate of quartz (10 mm×10 mm) according to a spin coating method to prepare a sample.

In the case where the matrix material is a host compound, a thin film sample was prepared as follows.

A transparent supporting substrate of quartz (10 mm×10 mm×1.0 mm) was fixed on a substrate holder of a commercially available vapor deposition device (by Choshu Industry Co., Ltd), then a molybdenum-made deposition boat containing a host compound put therein and a molybdenum-made deposition boat containing a dopant material put therein were set in the device, and the vacuum chamber was depressurized down to $5\times10^{-4}$ Pa. Next, both the deposition boat with a host compound therein and the deposition boat with a dopant material therein were heated at the same time and co-deposited to form a film having an appropriate thickness, thereby providing a mixed thin film (sample) of the host compound and the dopant material. Here, depending on the preset ratio by mass of the host compound to the dopant material, the rate of deposition was controlled.

Evaluation of Absorption Characteristics and Emission Characteristics

Using a UV-visible light-IR spectrophotometer (UV-2600, by Shimadzu Corporation), the absorption spectrum of the sample was measured. For measurement of the fluorescent spectrum or the phosphorescent spectrum of the sample, a fluorospectrophotometer (F-7000, by Hitachi High-Tech Corporation) was used.

In measurement of the fluorescent spectrum, the sample was excited at an appropriate excitation wavelength at room temperature to measure the photoluminescence thereof. In measurement of the phosphorescent spectrum, the sample was immersed in a liquid nitrogen (temperature 77 K) using the accompanying cooling unit. For observing the phosphorescent spectrum, the lag time from excitation light irradiation to measurement start was regulated using an optical chopper. The sample was excited at an appropriate excitation wavelength to measure the photoluminescence thereof.

Further, using an absolute PL quantum yield measuring device (C9920-02G, by Hamamatsu Photonics KK), the photoluminescence quantum yield (PLQY) was measured Evaluation of Fluorescence Lifetime (Delayed Fluorescence)

Using a fluorescence lifetime measuring device (C11367-01, by Hamamatsu Photonics KK), the fluorescence lifetime was measured at 300 K. Specifically, a light-emitting component having a fast fluorescence lifetime and a light-emitting component having a slow fluorescence lifetime were observed at a maximum light emission wavelength to be measured at a suitable excitation wavelength. In fluorescence lifetime measurement at room temperature for an ordinary organic EL material that emits fluorescence, a slow light emission component in which a phosphorescence-derived triplet component may participate owing to deactivation of the triplet component by heat is observed little. In the case where a slow light emission component is observed in a target compound, this indicates that the delayed fluorescence was observed by transfer of triplet energy having a long excitation lifetime to singlet energy by thermal activation.

Calculation of Energy Gao (Eg)

From the long wavelength end A (nm) of the absorption spectrum obtained according to the above-mentioned method. Eg=1240/A was calculated.

Calculation of E(S,Sh), E(T,Sh), E(S,PT), E(T,PT), and ΔE(ST)

The singlet excitation energy level E(S,Sh) was calculated using an equation $E(S,Sh)=1240/B_{Sh}$ from a wavelength $B_{Sh}$ (nm) at an intersection between a tangent passing an inflection point on the peak short wavelength side of a fluorescence spectrum and the baseline. The triplet excitation energy level E(T,Sh) was calculated using an equation $E(T,Sh)=1240/C_{Sh}$ from a wavelength $C_{Sh}$ (nm) at an intersection between a tangent passing an inflection point on the peak short wavelength side of a phosphorescence spectrum and the baseline.

The singlet excitation energy level E(S,PT) was calculated using an equation $E(S,PT)=1240/B_{PT}$ from the maximum light emission wavelength $B_{PT}$ (nm) of a fluorescence spectrum. The triplet excitation energy level E(T,PT) was calculated using an equation $E(T,PT)=1240/C_{PT}$ from the maximum light emission wavelength $C_{PT}$ (nm) of a phosphorescence spectrum.

ΔE(ST) is defined as ΔE(ST)=E(S,PT)−E(T,PT), which means the energy difference between E(S,PT) and E(T,PT). ΔE(ST) may also be calculated, for example, by a method disclosed in "Purely organic electroluminescent material realizing 100% conversion from electricity to light", H. Kaji, H. Suzuki, T. Fukushima, K. Shizu, K. Katsuaki, S. Kubo, T. Komino, H. Oiwa, F. Suzuki, A. Wakamiya, Y. Murata, C. Adachi, Nat. Commun. 2015, 6, 8476.

Example 18

Evaluation on Basic Properties of Compound (1-1-1)

[Absorption Properties]

Figure 3:
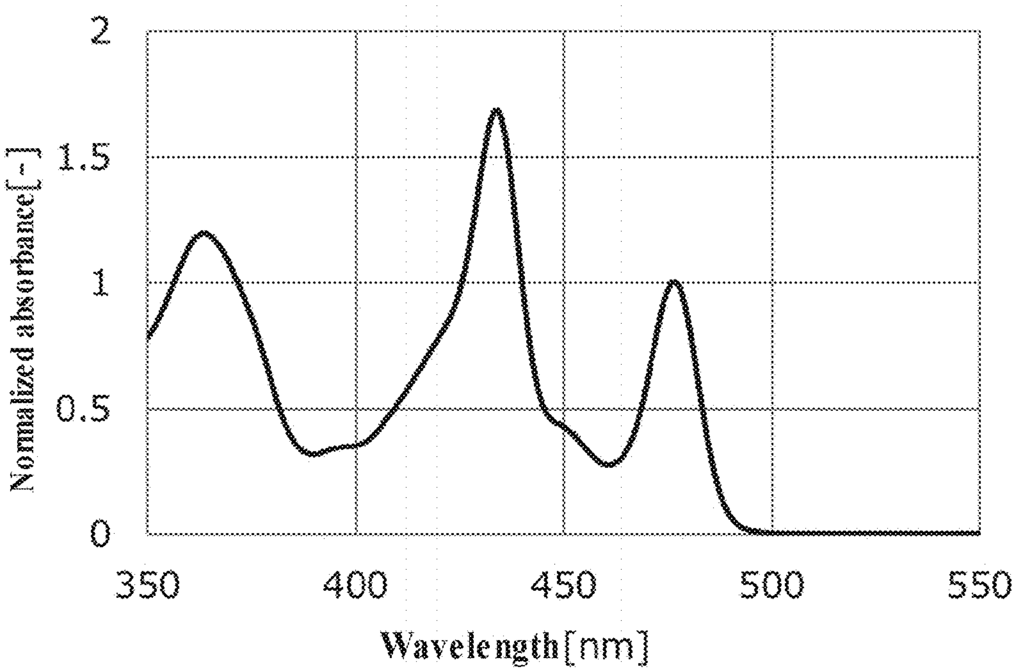
FIG. 3 This is a figure showing an absorption spectrum of a toluene solution of Compound (1-1-1).

An absorption spectrum was measured by preparing a $2.0\times10^{-5}$ mol/L toluene solution of a compound (1-1-1) and measuring the absorption spectrum of the solution. As a result, the maximum absorption wavelength in a visible light region was 477 nm (FIG. 3).

[Light Emission Properties]

Figure 4:
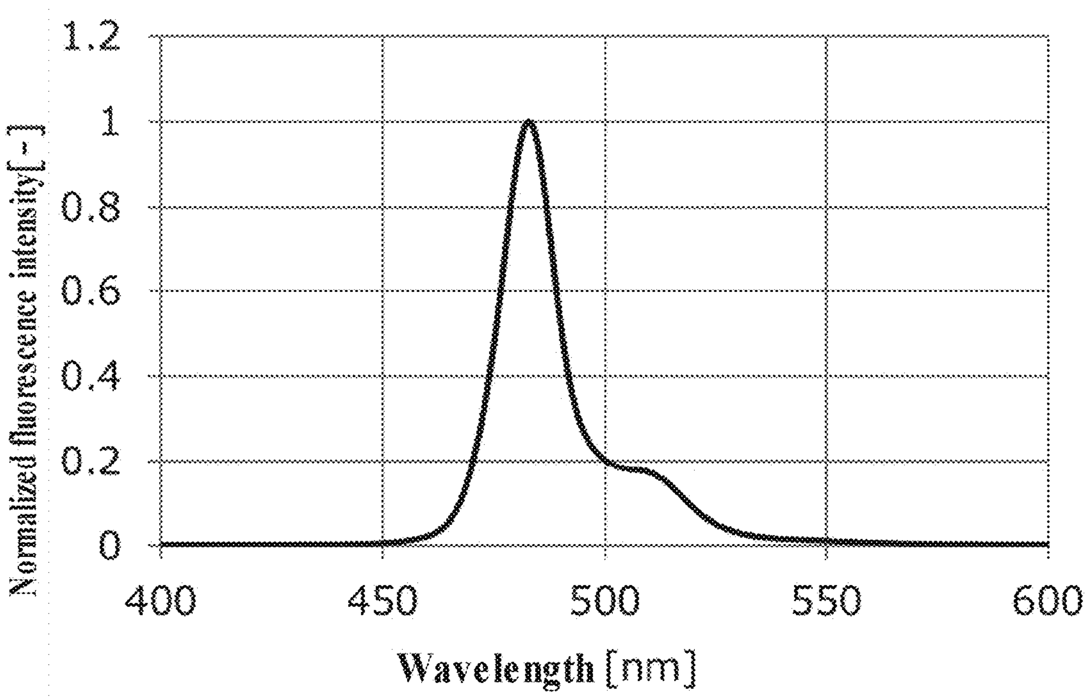
FIG. 4 This is a figure showing a fluorescence spectrum of a toluene solution of Compound (1-1-1).
Figure 5:
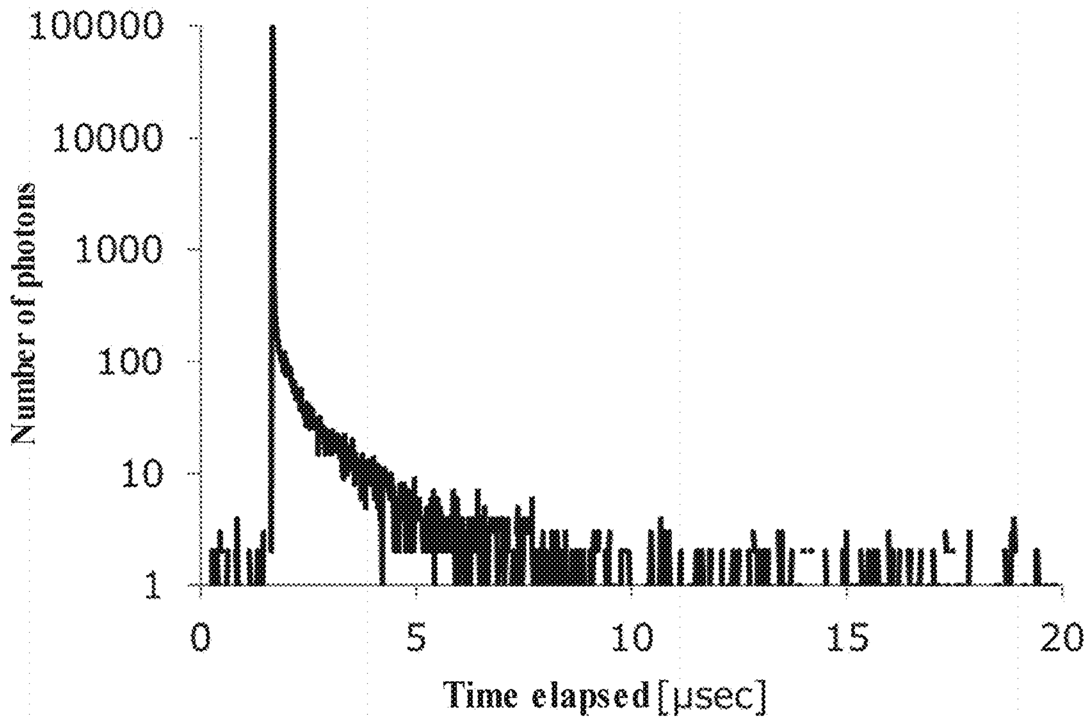
FIG. 5 This is a figure showing the result of the measurement of the lifetime of a delayed fluorescence component with respect to a toluene solution of Compound (1-1-1).

The fluorescence spectrum was measured by preparing a $2.0\times10^{-5}$ mol/L toluene solution of a compound (1-1-1), which was used in the absorption spectrum, exciting the solution at an excitation wavelength of 365 nm at room temperature, and observing a fluorescence spectrum thereof. As a result, the maximum light emission wavelength was 483 nm, and the half width was 13 nm (FIG. 4). The fluorescence quantum yield in this example was 100%. Furthermore, the lifetime of a delayed fluorescence component was measured using a fluorescence lifetime measurement device and found to be 1.0 μsec. Note that, in the fluorescence lifetime measurement, fluorescence having a light emission lifetime of 100 ns or shorter was determined as instant fluorescence and fluorescence having a lifetime of 0.1 μs or longer was determined as delayed fluorescence, and data of 3.0 to 6.2 μsec was used for calculation of a fluorescence lifetime (FIG. 5).

Example 19

Evaluation on Basic Properties of Compound (1-1-61)

[Absorption Properties]

Figure 6:
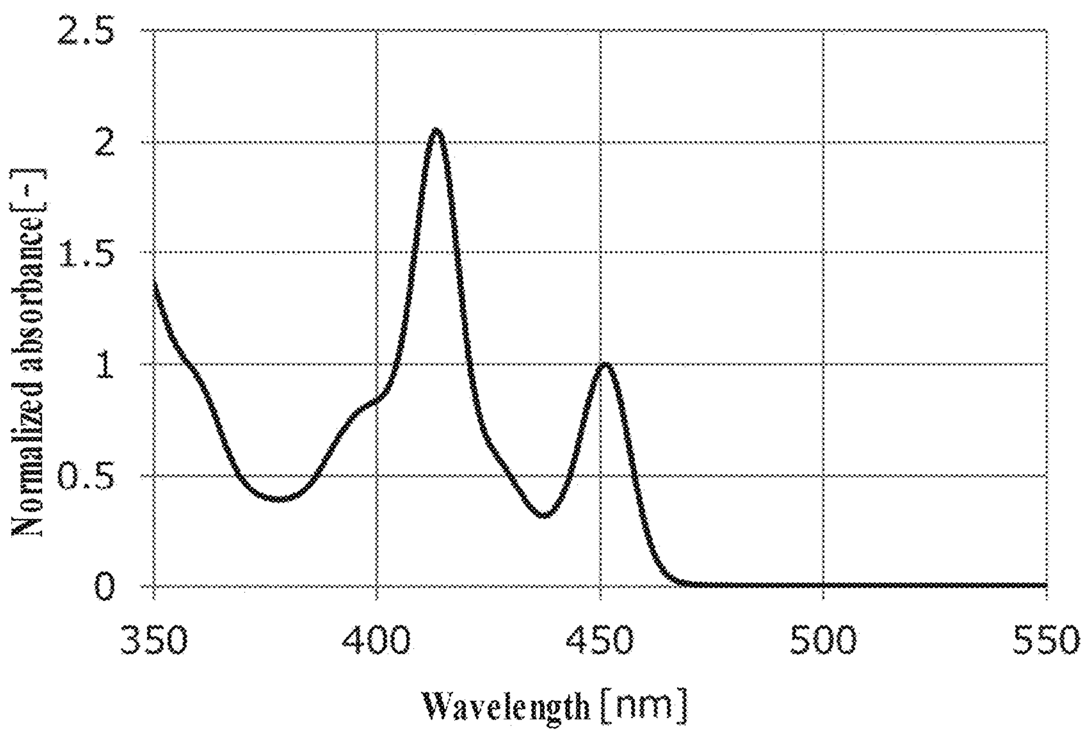
FIG. 6 This is a figure showing an absorption spectrum of a toluene solution of Compound (1-1-61).

An absorption spectrum was measured by preparing a $2.0\times10^{-5}$ mol/L toluene solution of a compound (1-1-61) and measuring the absorption spectrum of the solution. As a result, the maximum absorption wavelength in a visible light region was 451 nm (FIG. 6).

Figure 7:
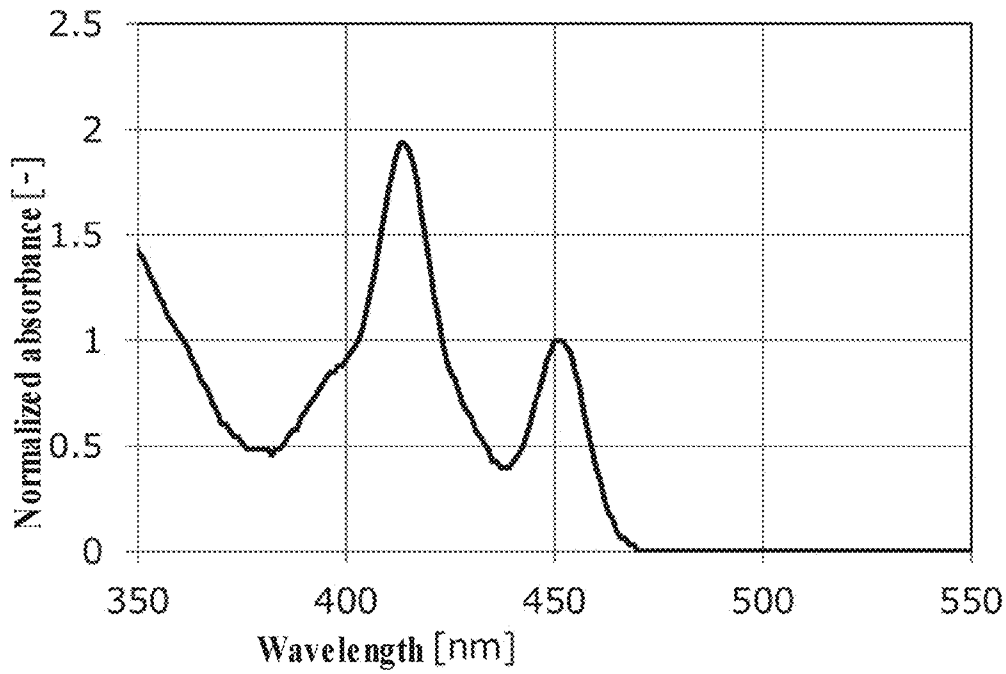
FIG. 7 This is a figure showing an absorption spectrum of a thin film-formed substrate in which Compound (1-1-61) is dispersed in PMMA.

Additionally, a thin film-formed substrate (made of glass) in which the compound (1-1-61) was dispersed in PMMA at a concentration of 1% by mass was prepared, and the absorption spectrum thereof was measured. As a result, the maximum absorption wavelength in a visible light region was 451 nm (FIG. 7).

[Light Emission Properties]

Figure 8:
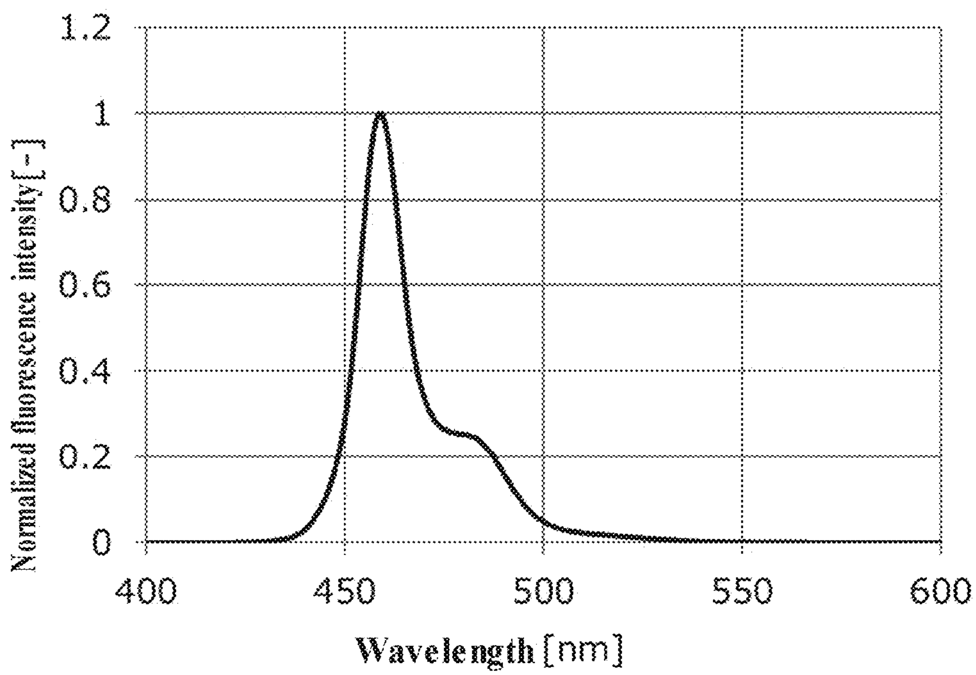
FIG. 8 This is a figure showing a fluorescence spectrum of a toluene solution of Compound (1-1-61).
Figure 9:
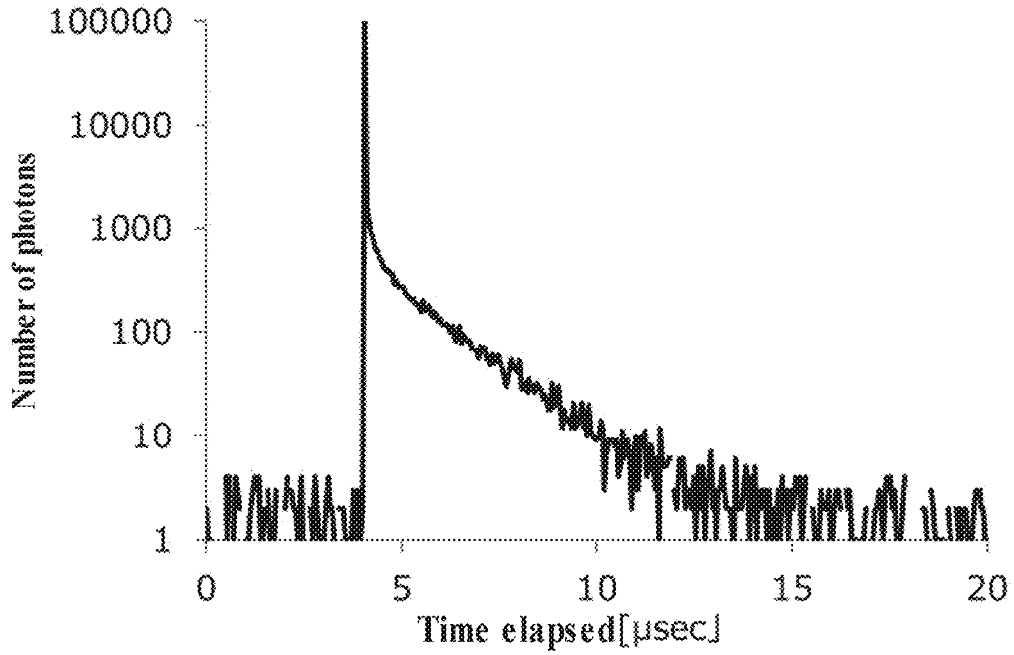
FIG. 9 This is a figure showing the result of the measurement of the lifetime of a delayed fluorescence component with respect to a toluene solution of Compound (1-1-61).

The fluorescence spectrum was measured by preparing a $2.0\times10^{-5}$ mol/L toluene solution of a compound (1-1-61), which was used in the absorption spectrum, exciting the solution at an excitation wavelength of 365 nm at room temperature, and observing a fluorescence spectrum thereof. As a result, the maximum light emission wavelength was 459 nm, and the half width was 13 nm (FIG. 8). The fluorescence quantum yield in this example was 99%. Furthermore, the lifetime of a delayed fluorescence component was measured using a fluorescence lifetime measurement device and found to be 1.4 μsec. Note that, in the fluorescence lifetime measurement, fluorescence having a light emission lifetime of 100 ns or shorter was determined as instant fluorescence and fluorescence having a lifetime of 0.1 μs or longer was determined as delayed fluorescence, and data of 4.5 to 22 μsec was used for calculation of a fluorescence lifetime (FIG. 9).

Figure 10:
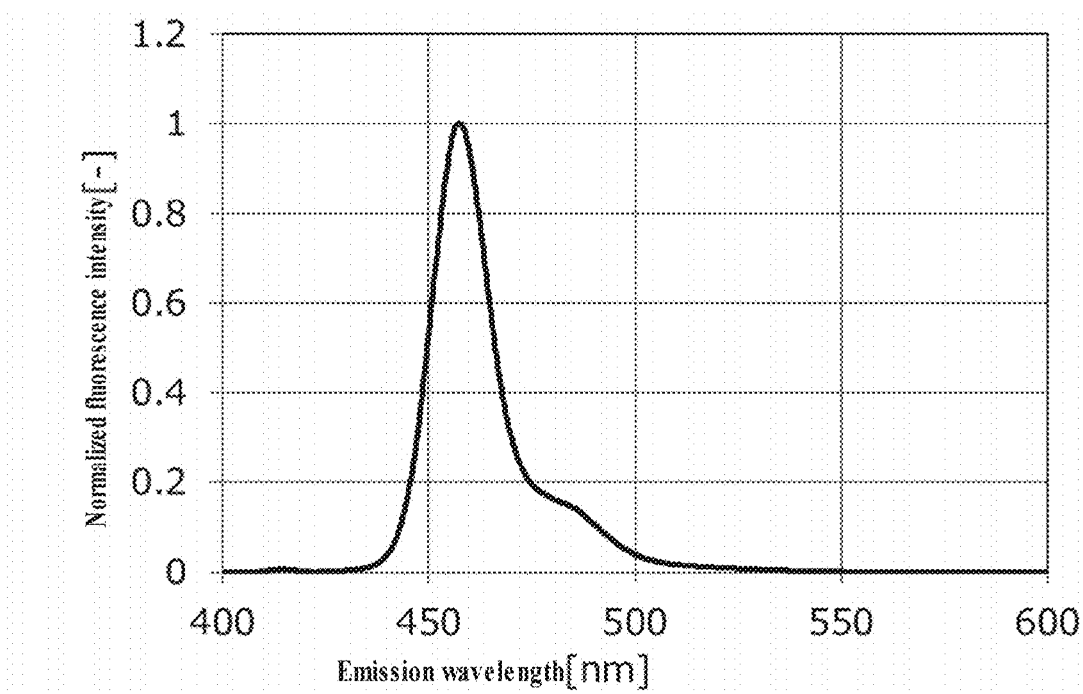
FIG. 10 This is a figure showing a fluorescence spectrum (room temperature) of a thin film-formed substrate in which Compound (1-1-61) is dispersed in PMMA.
Figure 11:
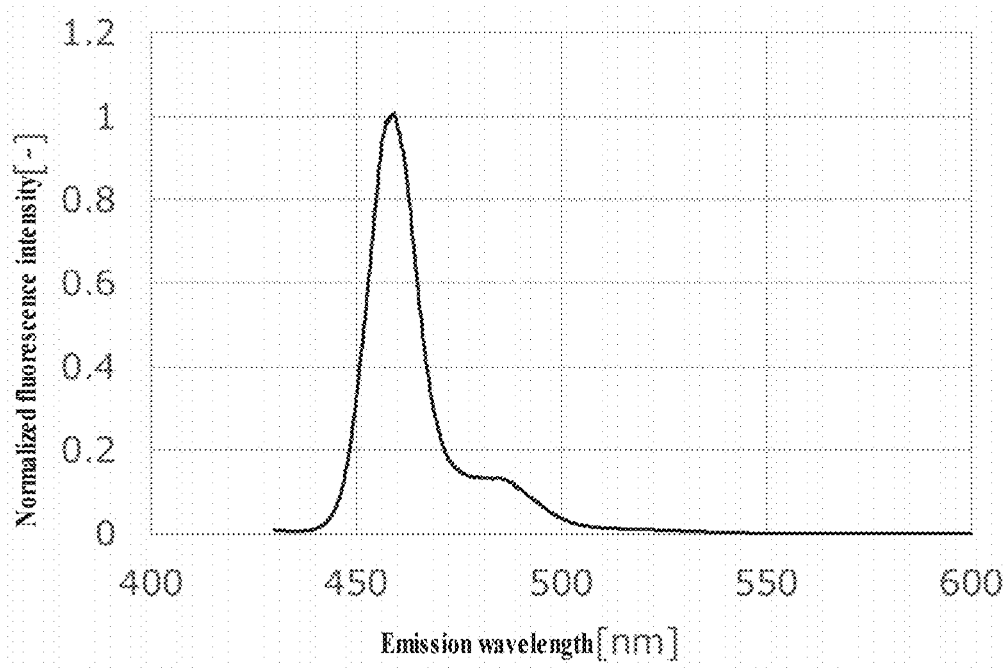
FIG. 11 This is a figure showing a fluorescence spectrum (77K) of a thin film-formed substrate in which Compound (1-1-61) is dispersed in PMMA.

Additionally, a thin film-formed substrate (made of glass) in which the compound (1-1-61) was dispersed in PMMA at a concentration of 1% by mass was prepared, the substrate was then excited at an excitation wavelength of 414 nm at room temperature and at 77 K, and fluorescence spectra thereof were measured. As a result, the maximum light emission wavelength was 457 nm, and the half width was 16 nm at room temperature (FIG. 10) and the maximum light emission wavelength was 459 nm, and the half width was 16 nm at 77 K (FIG. 11). E(S,PT) calculated from the maximum light emission wavelength at 77 K was 2.70 eV. E(S,Sh) determined on the basis of an intersection between a tangent passing an inflection point on the short wavelength side of the fluorescence peak, and the baseline was 2.77 eV. Additionally, a thin film-formed substrate (made of quartz) in which the compound (1-1-61) was dispersed in PMMA at a concentration of 1% by mass was prepared, the substrate was then excited at an excitation wavelength of 410 nm, and fluorescence quantum yield was measured. As a result, the fluorescence quantum yield was as high as 89%.

Figure 12:
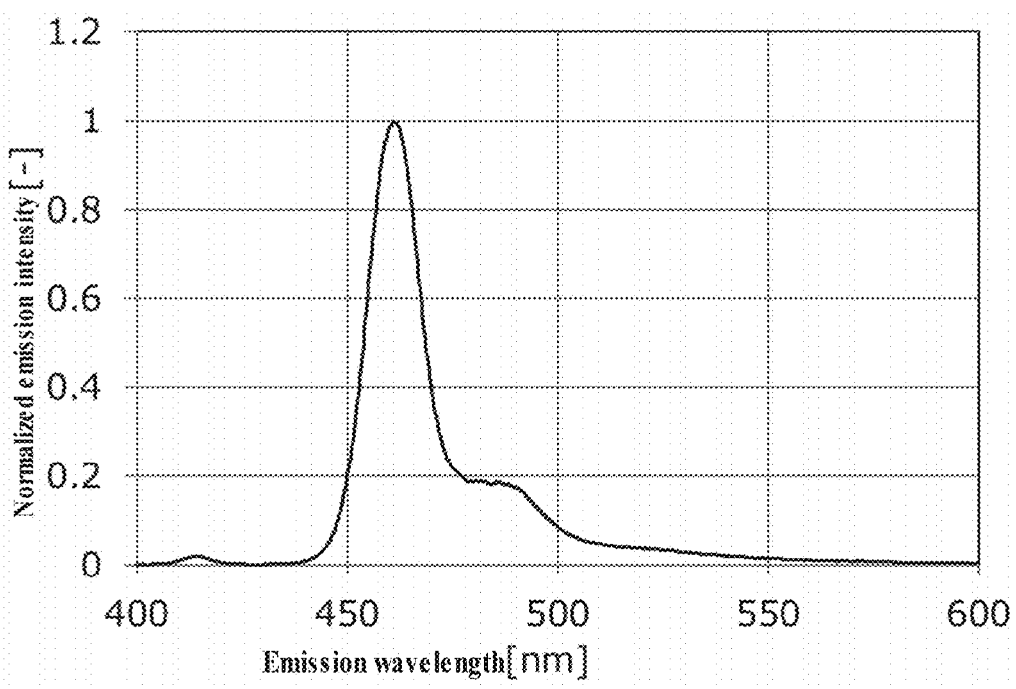
FIG. 12 This is a figure showing a phosphorescence spectrum (77K) of a thin film-formed substrate in which Compound (1-1-61) is dispersed in PMMA.

Furthermore, the measurement of a phosphorescence spectrum was performed by preparing a thin film-formed substrate (made of glass) in which the compound (1-1-61) was dispersed in PMMA at a concentration of 1% by mass, exciting the substrate at an excitation wavelength of 414 nm at 77 K, and measuring a phosphorescence spectrum thereof. As a result, the maximum light emission wavelength was 461 nm (FIG. 12). E(T,PT) calculated from this maximum light emission wavelength was 2.69 eV, showing a high value. E(T,Sh) determined on the basis of an intersection between a tangent passing an inflection point on the short wavelength side of the phosphorescence peak and the baseline was 2.77 eV.

ΔE(ST,PT) was calculated and found to be 0.01 eV.

Figure 13:
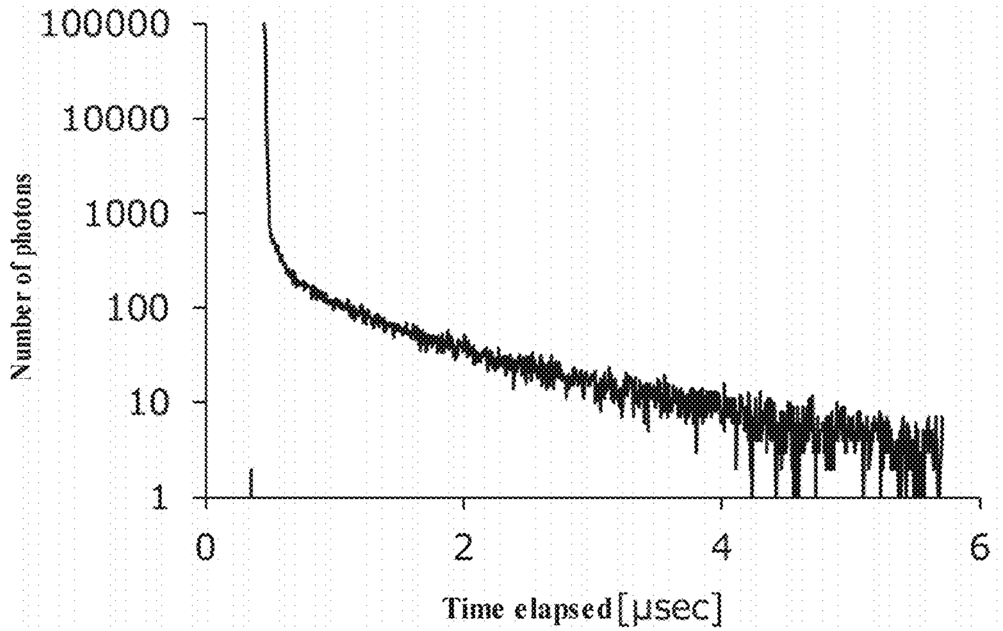
FIG. 13 This is a figure showing the result of the measurement of the lifetime of a delayed fluorescence component with respect to a thin film-formed substrate in which Compound (1-1-61) is dispersed in PMMA.

The lifetime of a delayed fluorescence component of a thin film-formed substrate (made of quartz) in which the compound (1-1-61) was dispersed in PMMA at a concentration of 1% by mass was measured using a fluorescence lifetime measurement device and found to be 0.8 μsec. Note that, in the fluorescence lifetime measurement, fluorescence having a light emission lifetime of 100 ns or shorter was determined as instant fluorescence and fluorescence having a lifetime of 0.1 μs or longer was determined as delayed fluorescence, and data of 0.4 to 5.6 μsec was used for calculation of a fluorescence lifetime (FIG. 13).

Example 20

Evaluation on Basic Properties of Compound (1-1-5)

[Absorption Properties]

Figure 14:
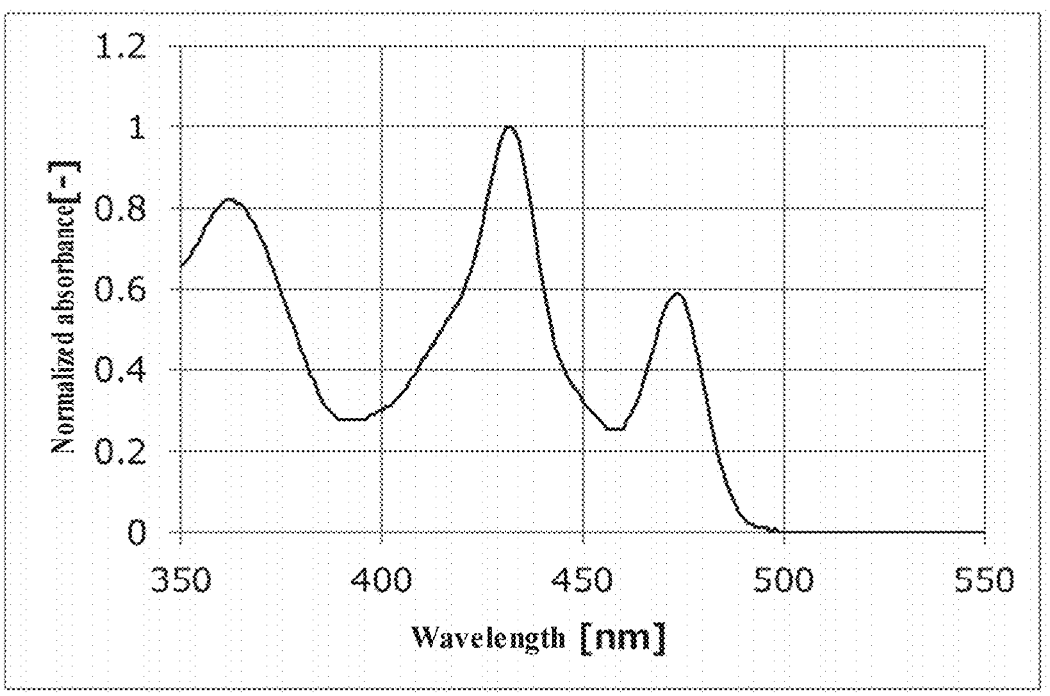
FIG. 14 This is a figure showing an absorption spectrum of a thin film-formed substrate in which Compound (1-1-5) is dispersed in PMMA.

A thin film-formed substrate (made of glass) in which the compound (1-1-5) was dispersed in PMMA at a concentration of 1% by mass was prepared, and the absorption spectrum thereof was measured. As a result, the maximum absorption wavelength in a visible light region was 473 nm (FIG. 14).

[Light Emission Properties]

Figure 15:
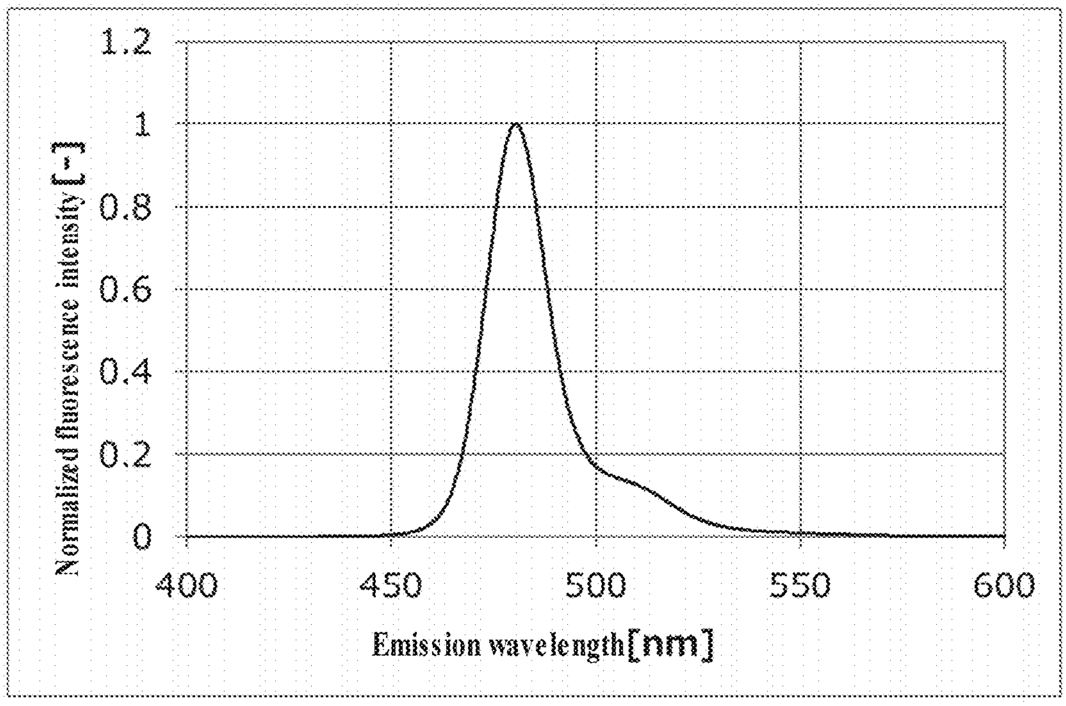
FIG. 15 This is a figure showing a fluorescence spectrum (room temperature) of a thin film-formed substrate in which Compound (1-1-5) is dispersed in PMMA.
Figure 16:
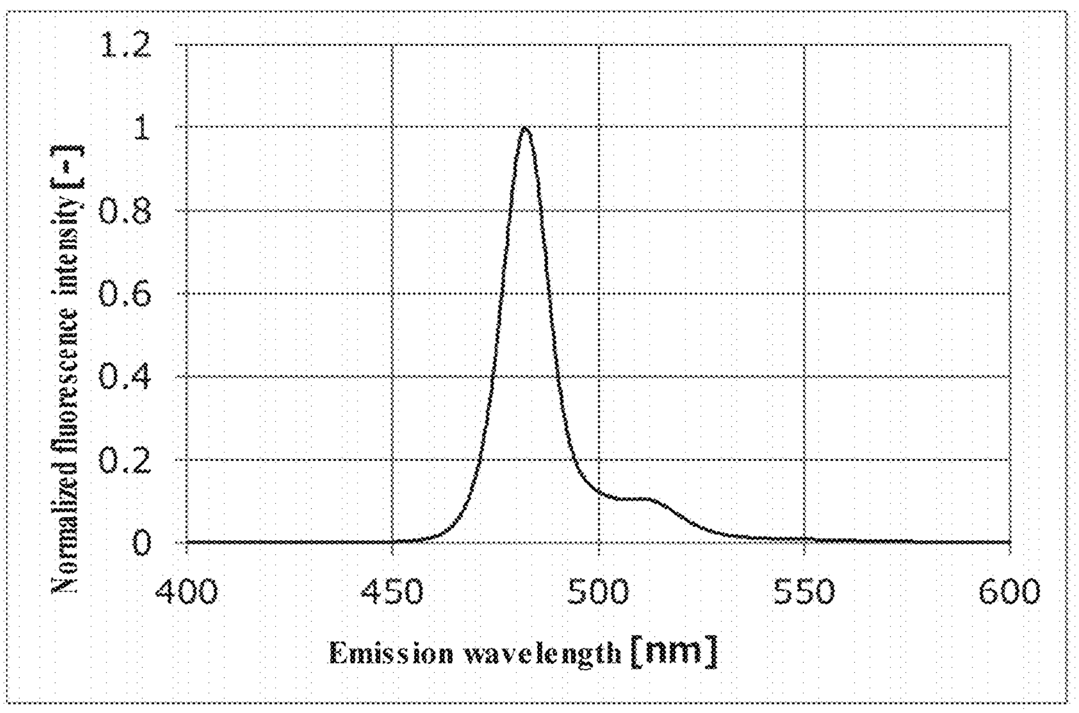
FIG. 16 This is a figure showing a fluorescence spectrum (77K) of a thin film-formed substrate in which Compound (1-1-5) is dispersed in PMMA.

A thin film-formed substrate (made of glass) in which the compound (1-1-5) was dispersed in PMMA at a concentration of 1% by mass was prepared, the substrate was then excited at an excitation wavelength of 414 nm at room temperature and at 77 K, and fluorescence spectra thereof w ere measured. As a result, the maximum light emission wavelength was 480 nm, and the half width was 18 nm at room temperature (FIG. 15) and the maximum light emission wavelength was 482 nm, and the half width was 14 nm at 77 K (FIG. 16). E(S,PT) calculated from the maximum light emission wavelength at 77 K, was 2.57 eV. E(S,Sh) determined on the basis of an intersection between a tangent passing an inflection point on the short wavelength side of the fluorescence peak, and the baseline was 2.63 eV. Additionally, a thin film-formed substrate (made of quartz) in which the compound (1-1-5) was dispersed in PMMA at a concentration of 1% by mass was prepared, the substrate was then excited at an excitation wavelength of 360 nm, and fluorescence quantum yield was measured. As a result, the fluorescence quantum yield was as high as 90%.

Figure 17:
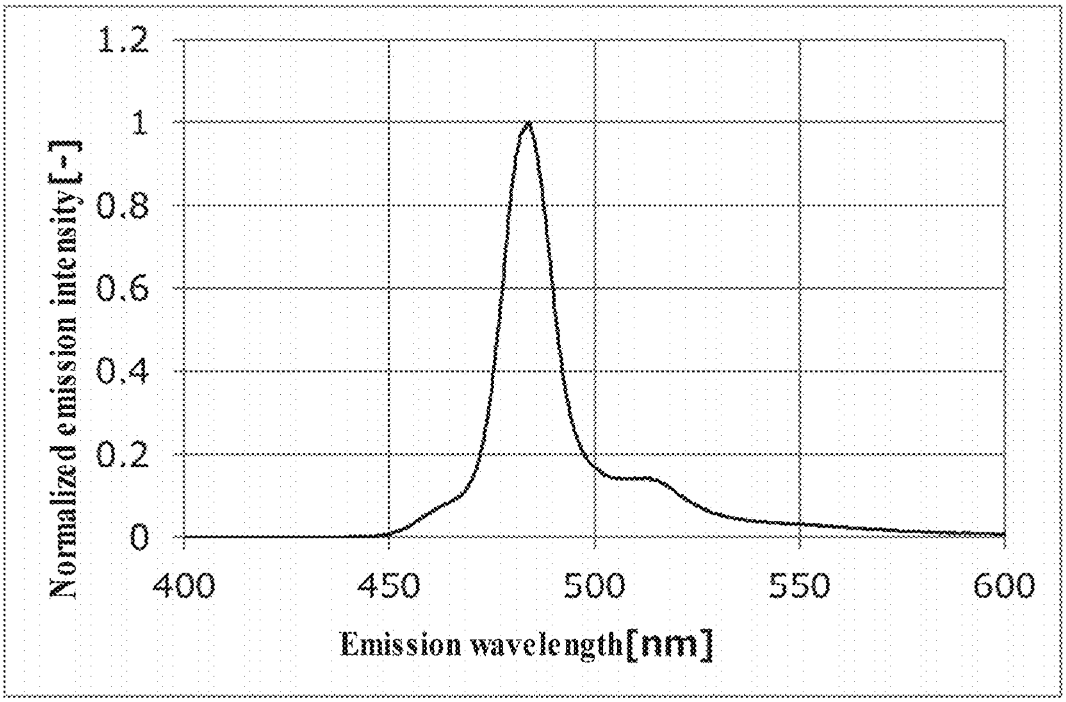
FIG. 17 This is a figure showing a phosphorescence spectrum (77K) of a thin film-formed substrate in which Compound (1-1-5) is dispersed in PMMA FIG. 18 This is a figure showing the result of the measurement of the lifetime of a delayed fluorescence component with respect to a thin film-formed substrate in which Compound (1-1-5) is dispersed in PMMA.

Furthermore, the measurement of a phosphorescence spectrum was performed by preparing a thin film-formed substrate (made of glass) in which the compound (1-1-5) was dispersed in PMMA at a concentration of 1% by mass, exciting the substrate at an excitation wavelength of 362 nm at 77 K, and measuring a phosphorescence spectrum thereof. As a result, the maximum light emission wavelength was 484 nm (FIG. 17). E(T,PT) calculated from this maximum light emission wavelength was 2.56 eV, showing a high value. E(T,Sh) determined on the basis of an intersection between a tangent passing an inflection point on the short wavelength side of the phosphorescence peak and the baseline was 2.63 eV.

ΔE(ST,PT) was calculated and found to be 0.01 eV.

Figure 18:
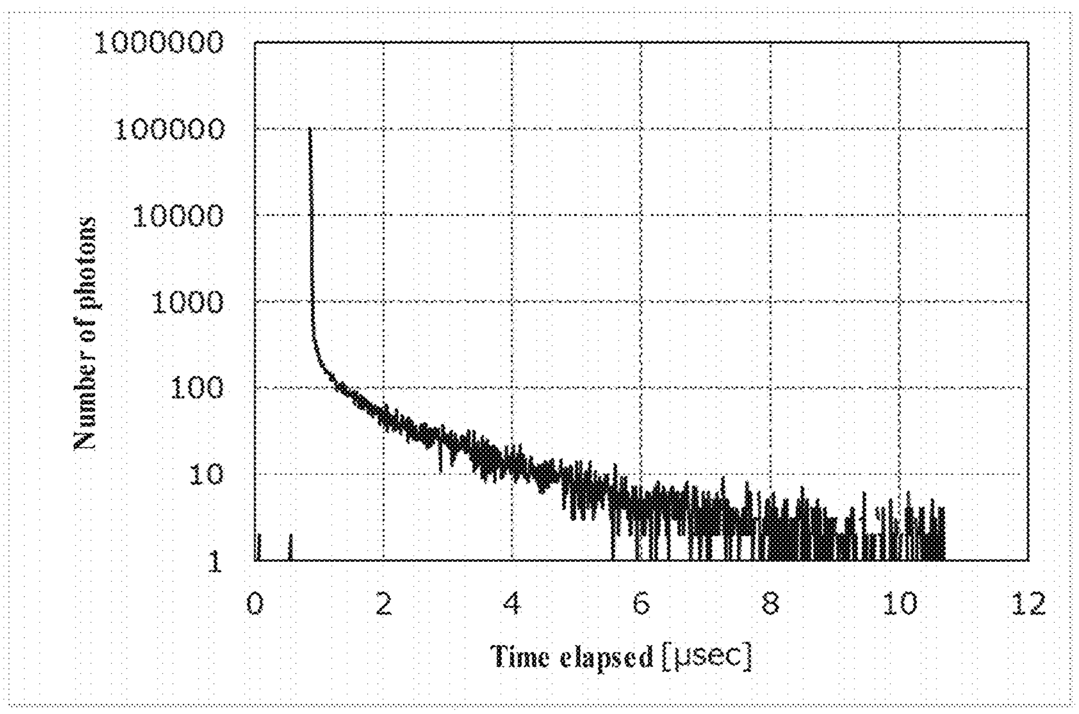

The lifetime of a delayed fluorescence component of a thin film-formed substrate (made of quartz) in which the compound (1-1-5) was dispersed in PMMA at a concentration of 1% by mass was measured using a fluorescence lifetime measurement device and found to be 1.1 μsec. Note that, in the fluorescence lifetime measurement, fluorescence having a light emission lifetime of 100 ns or shorter was determined as instant fluorescence and fluorescence having a lifetime of 0.1 μs or longer was determined as delayed fluorescence, and data of 0.4 to 5.6 ρsec was used for calculation of a fluorescence lifetime (FIG. 18).

Example 21

Evaluation on Basic Properties of Compound (1-1-10)

[Absorption Properties]

Figure 19:
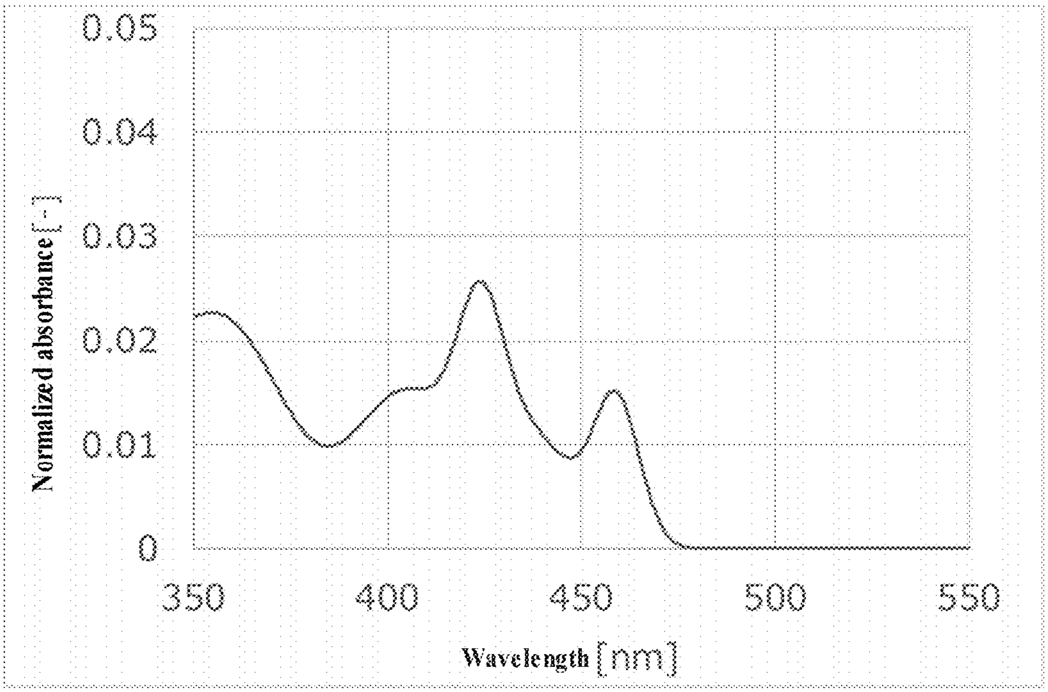
FIG. 19 This is a figure showing an absorption spectrum of a thin film-formed substrate in which Compound (1-1-10) is dispersed in PMMA.

A thin film-formed substrate (made of glass) in which the compound (1-1-10) was dispersed in PMMA at a concentration of 1% by mass was prepared, and the absorption spectrum thereof was measured. As a result, the maximum absorption wavelength in a visible light region was 458 nm (FIG. 19).

[Light Emission Properties]

Figure 20:
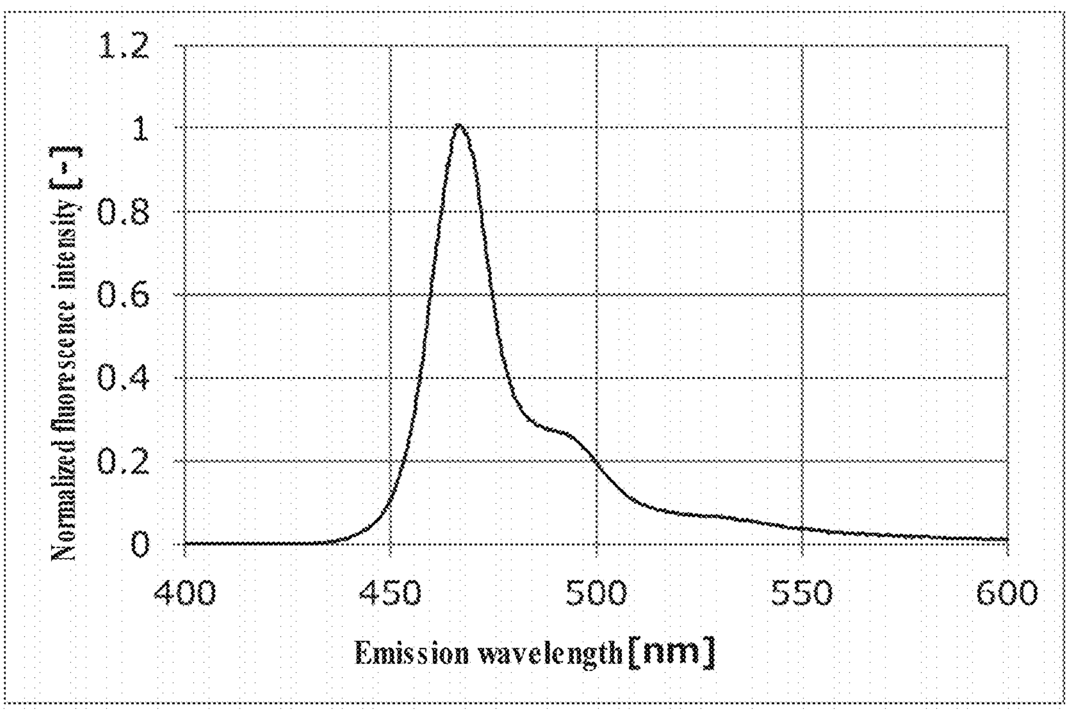
FIG. 20 This is a figure showing a fluorescence spectrum (room temperature) of a thin film-formed substrate in which Compound (1-1-10) is dispersed in PMMA.
Figure 21:
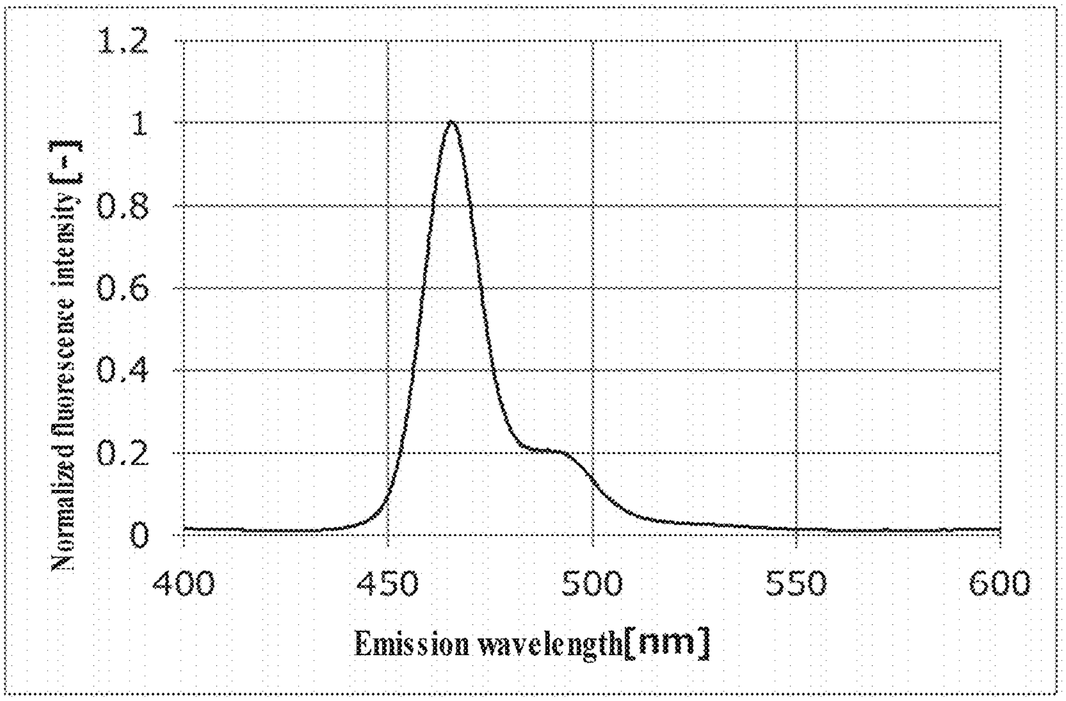
FIG. 21 This is a figure showing a fluorescence spectrum (77K) of a thin film-formed substrate in which Compound (1-1-10) is dispersed in PMMA.

A thin film-formed substrate (made of glass) in which the compound (1-1-10) was dispersed in PMMA at a concentration of 1% by mass was prepared, the substrate was then excited at an excitation wavelength of 424 nm at room temperature and at 77 K, and fluorescence spectra thereof were measured. As a result, the maximum light emission wavelength was 464 nm, and the half width was 16 nm at room temperature (FIG. 20) and the maximum light emission wavelength was 465 nm, and the half width was 16 nm at 77 K. (FIG. 21). E(S,PT) calculated from the maximum light emission wavelength at 77 K was 2.66 eV. E(S,Sh) determined on the basis of an intersection between a tangent passing an inflection point on the short wavelength side of the fluorescence peak, and the baseline was 2.76 eV. Additionally, a thin film-formed substrate (made of quartz) in which the compound (1-1-10) was dispersed in PMMA at a concentration of 1% by mass was prepared, the substrate was then excited at an excitation wavelength of 360 nm, and fluorescence quantum yield was measured. As a result, the fluorescence quantum yield was as high as 76%.

Figure 22:
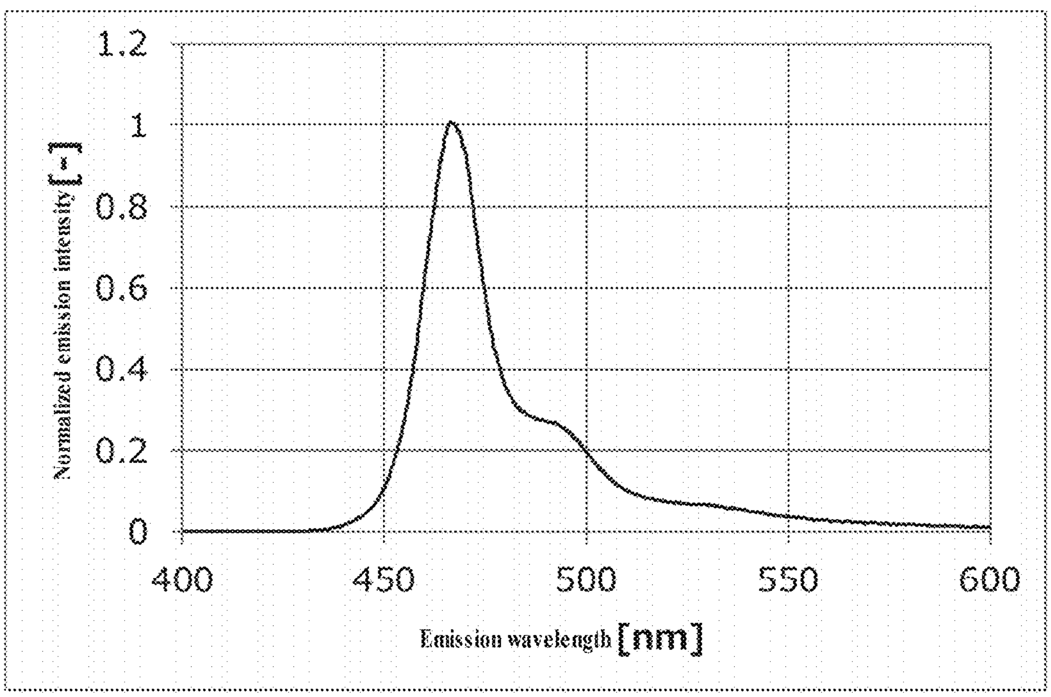
FIG. 22 This is a figure showing a phosphorescence spectrum (77K) of a thin film-formed substrate in which Compound (1-1-10) is dispersed in PMMA.

Furthermore, the measurement of a phosphorescence spectrum was performed by preparing a thin film-formed substrate (made of glass) in which the compound (1-1-10) was dispersed in PMMA at a concentration of 1% by mass, exciting the substrate at an excitation wavelength of 424 nm at 77 K, and measuring a phosphorescence spectrum thereof. As a result, the maximum light emission wavelength was 466 nm (FIG. 22). E(T,PT) calculated from this maximum light emission wavelength was 2.66 eV, showing a high value. E(T,Sh) determined on the basis of an intersection between a tangent passing an inflection point on the short wavelength side of the phosphorescence peak and the baseline was 2.73 eV.

ΔE(ST,PT) was calculated and found to be 0.01 eV.

Figure 23:
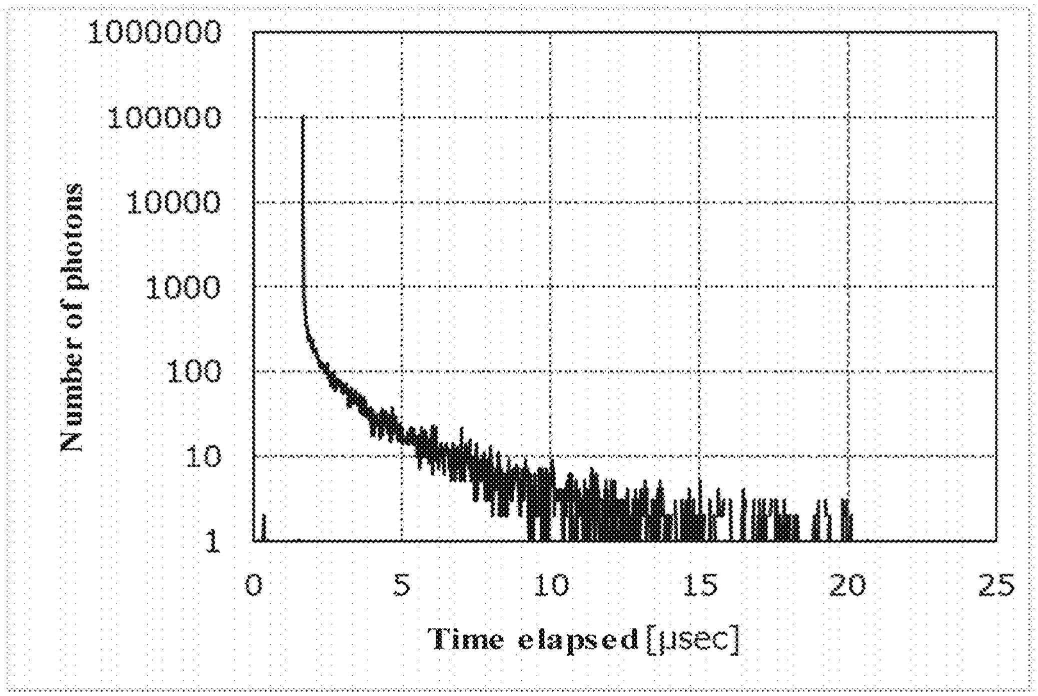
FIG. 23 This is a figure showing the result of the measurement of the lifetime of a delayed fluorescence component with respect to a thin film-formed substrate in which Compound (1-1-10) is dispersed in PMMA.

The lifetime of a delayed fluorescence component of a thin film-formed substrate (made of quartz) in which the compound (1-1-10) was dispersed in PMMA at a concentration of 1% by mass was measured using a fluorescence lifetime measurement device and found to be 1.6 μsec. Note that, in the fluorescence lifetime measurement, fluorescence having a light emission lifetime of 100 ns or shorter was determined as instant fluorescence and fluorescence having a lifetime of 0.1 μs or longer was determined as delayed fluorescence, and data of 0.4 to 5.6 μsec was used for calculation of a fluorescence lifetime (FIG. 23).

Example 22

Evaluation on Basic Properties of Compound (1-1-105)

[Absorption Properties]

Figure 24:
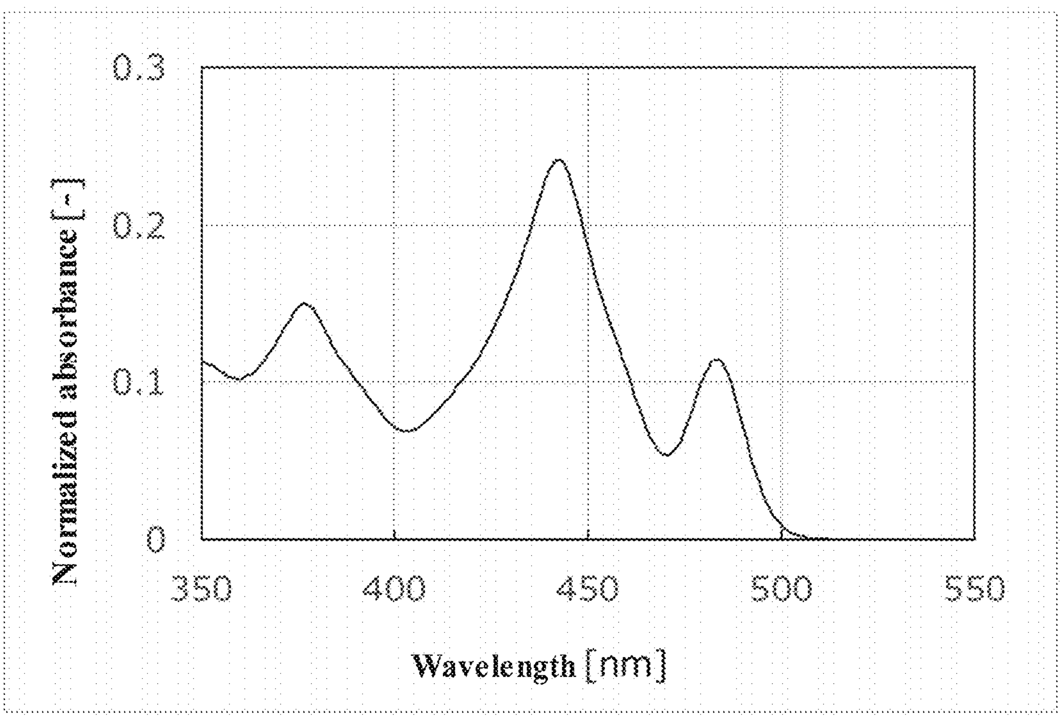
FIG. 24 This is a figure showing an absorption spectrum of a thin film-formed substrate in which Compound (1-1-105) is dispersed in PMMA.

A thin film-formed substrate (made of glass) in which the compound (1-1-105) was dispersed in PMMA at a concentration of 1% by mass was prepared, and the absorption spectrum thereof was measured. As a result, the maximum absorption wavelength in a visible light region was 483 nm (FIG. 24).

[Light Emission Properties]

Figure 25:
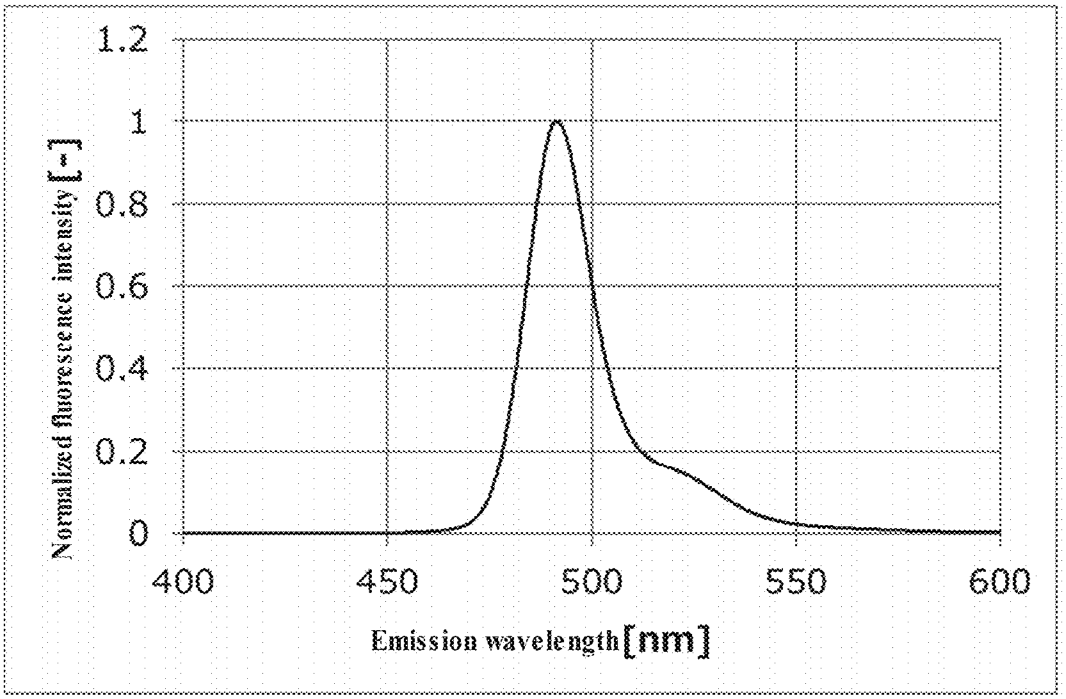
FIG. 25 This is a figure showing a fluorescence spectrum (room temperature) of a thin film-formed substrate in which Compound (1-1-105) is dispersed in PMMA.
Figure 26:
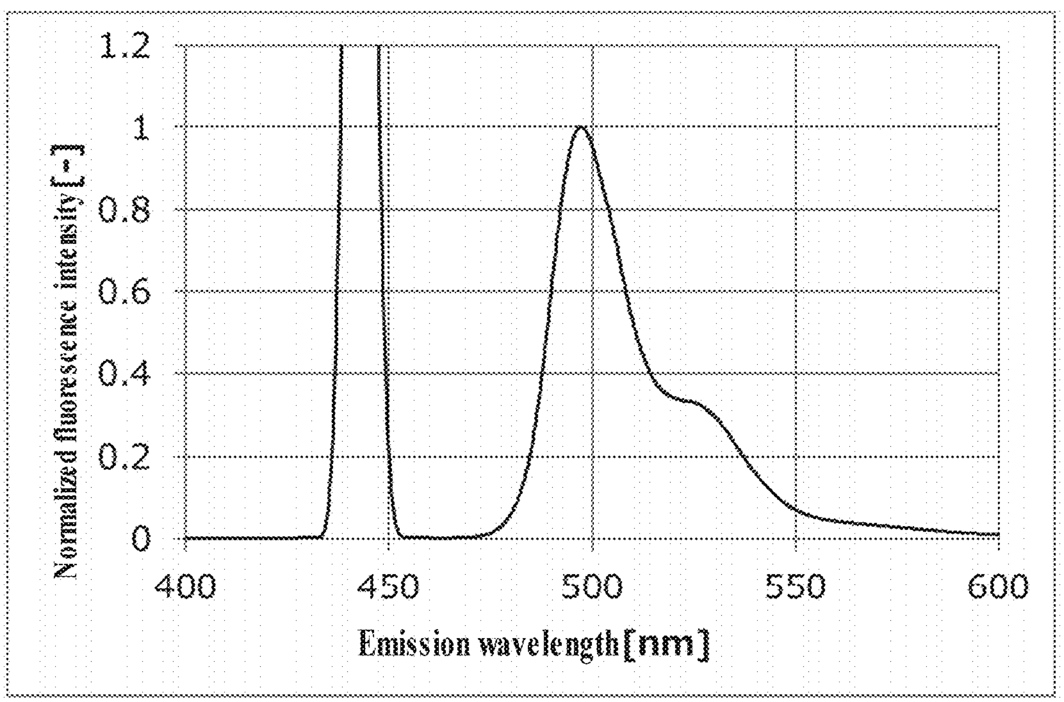
FIG. 26 This is a figure showing a fluorescence spectrum (77K) of a thin film-formed substrate in which Compound (1-1-105) is dispersed in PMMA.

Aa thin film-formed substrate (made of glass) in which the compound (1-1-105) was dispersed in PMMA at a concentration of 1% by mass was prepared, the substrate was then excited at an excitation wavelength of 442 nm at room temperature and at 77 K, and fluorescence spectra thereof were measured. As a result, the maximum light emission wavelength was 492 nm, and the half width was 18 nm at room temperature (FIG. 25) and the maximum light emission wavelength was 497 nm, and the half width was 21 nm at 77 K (FIG. 26). E(S,PT) calculated from the maximum light emission wavelength at 77 K was 2.49 eV. E(S,Sh) determined on the basis of an intersection between a tangent passing an inflection point on the short wavelength side of the fluorescence peak, and the baseline was 2.56 eV. Additionally, a thin film-formed substrate (made of quartz) in which the compound (1-1-105) was dispersed in PMMA at a concentration of 1% by mass was prepared, the substrate was then excited at an excitation wavelength of 360 nm, and fluorescence quantum yield was measured. As a result, the fluorescence quantum yield was as high as 89%.

Figure 27:
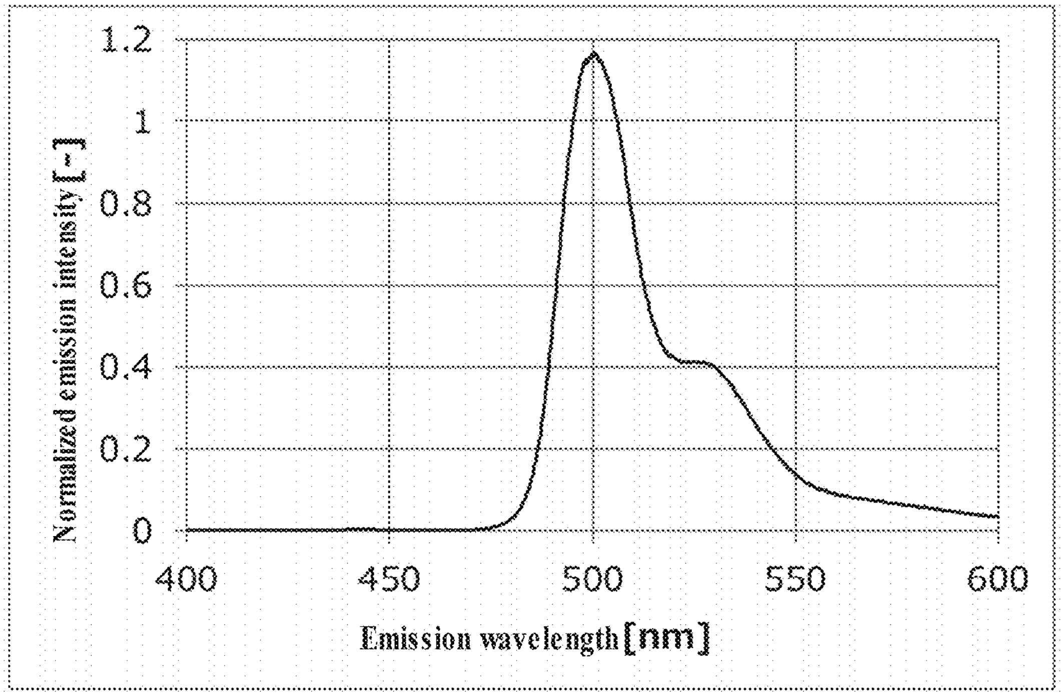
FIG. 27 This is a figure showing a phosphorescence spectrum (77K) of a thin film-formed substrate in which Compound (1-1-105) is dispersed in PMMA.

Furthermore, the measurement of a phosphorescence spectrum was performed by preparing a thin film-formed substrate (made of glass) in which the compound (1-1-105) was dispersed in PMMA at a concentration of 1% by mass, exciting the substrate at an excitation wavelength of 442 nm at 77 K, and measuring a phosphorescence spectrum thereof. As a result, the maximum light emission wavelength was 501 nm (FIG. 27). E(T,PT) calculated from this maximum light emission wavelength was 2.48 eV, showing a high value. E(T,Sh) determined on the basis of an intersection between a tangent passing an inflection point on the short wavelength side of the phosphorescence peak and the baseline was 2.55 eV.

ΔE(ST,PT) was calculated and found to be 0.01 eV.

Figure 28:
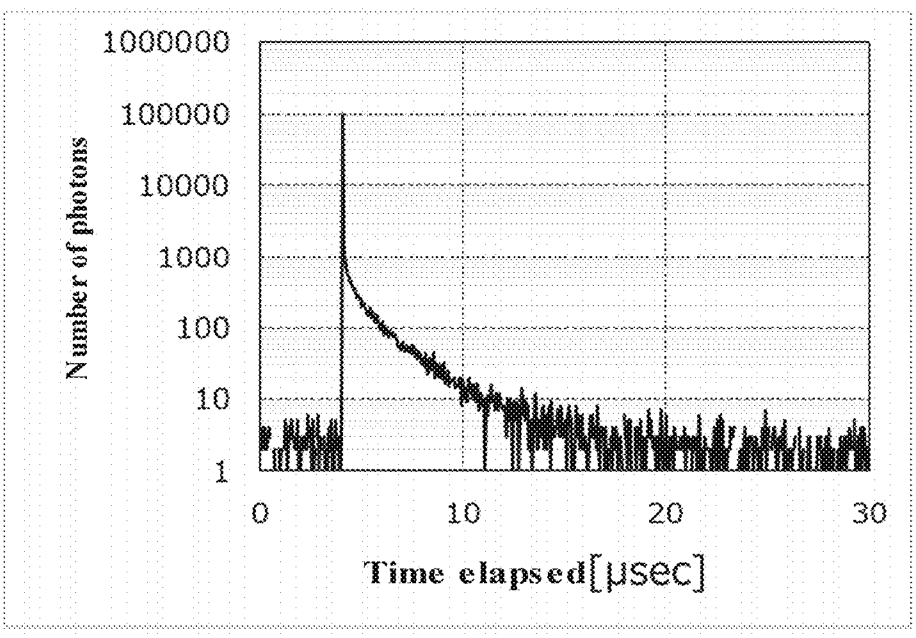
FIG. 28 This is a figure showing the result of the measurement of the lifetime of a delayed fluorescence component with respect to a thin film-formed substrate in which Compound (1-1-105) is dispersed in PMMA.

The lifetime of a delayed fluorescence component of a thin film-formed substrate (made of quartz) in which the compound (1-1-105) was dispersed in PMMA at a concentration of 1% by mass was measured using a fluorescence lifetime measurement device and found to be 1.6 μsec. Note that, in the fluorescence lifetime measurement, fluorescence having a light emission lifetime of 100 ns or shorter was determined as instant fluorescence and fluorescence having a lifetime of 0.1 μs or longer was determined as delayed fluorescence, and data of 5.6 to 10.5 μsec was used for calculation of a fluorescence lifetime (FIG. 28).

REFERENCE SIGNS LIST

100 Organic electroluminescent element
101 Substrate
102 Anode
103 Hole Injection Layer
104 Hoi e Transport Layer
105 Light-Emitting Layer
106 Electron Transport Layer
107 Electron Injection Layer
108 Cathode

The invention claimed is:

1. A polycyclic aromatic compound represented by Formula (1):

(1)

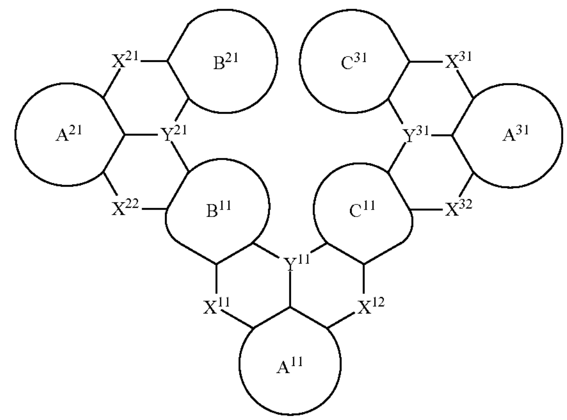

wherein:

$A^{11}$ ring, $A^{21}$ ring, $A^{31}$ ring, $B^{11}$ ring, $B^{21}$ ring, $C^{11}$ ring, and $C^{31}$ ring are each independently an aryl ring or a heteroaryl ring, and at least one hydrogen in these rings may be replaced;

$Y^{11}$, $Y^{21}$, $Y^{31}$ are each independently B, P, P═O, P═S, Al, Ga, As, Si—R, or Ge—R, and R in the above Si—R and Ge—R is an aryl, an alkyl, or a cycloalkyl;

$X^{11}$, $X^{12}$, $X^{21}$, $X^{22}$, $X^{31}$, $X^{32}$ are each independently O, N—R, $C(—R)_2$, S or Se, wherein R in the above N—R is an aryl which may be substituted, a heteroaryl which may be substituted, an alkyl which may be substituted, or a cycloalkyl which may be substituted, R in the above $C(—R)_2$ is hydrogen, an aryl which may be substituted, an alkyl which may be substituted, or a cycloalkyl which may be substituted, and R in the above N—R and/or in the above $C(—R)_2$ may be bonded to $A^{11}$ ring, $A^{21}$ ring, $A^{31}$ ring, $B^{11}$ ring, $B^{21}$ ring, $C^{11}$ ring, and/or $C^{31}$ ring by a linking group or a single bond; and at least one hydrogen in the compound represented by Formula (1) may be replaced with deuterium, cyano, or a halogen.

2. The polycyclic aromatic compound according to claim 1, wherein:

$A^{11}$ ring, $A^{21}$ ring, $A^{31}$ ring, $B^{11}$ ring, $B^{21}$ ring, $C^{11}$ ring, and $C^{31}$ ring are each independently an aryl ring or a heteroaryl ring, and at least one hydrogen in these rings may be replaced with a substituted or unsubstituted aryl, a substituted or unsubstituted heteroaryl, a substituted or unsubstituted diarylamino (the two aryls may be bonded to each other by a single bond or a linking group), a substituted or unsubstituted diheteroarylamino, a substituted or unsubstituted arylheteroarylamino, a substituted or unsubstituted diarylboryl, a substituted or unsubstituted alkyl, a substituted or unsubstituted cycloalkyl, a substituted or unsubstituted alkoxy, a substituted or unsubstituted aryloxy, a substituted silyl, or $SF_5$;

$X^{11}$, $X^{12}$, $X^{21}$, $X^{22}$, $X^{31}$, $X^{32}$ are each independently O, N—R, $C(—R)_2$, S or Se, wherein R in the above N—R is an aryl which may be substituted by an alkyl or a cycloalkyl, a heteroaryl which may be substituted by an alkyl or a cycloalkyl, an alkyl, or a cycloalkyl, R in the above $C(—R)_2$ is hydrogen, an alkyl, a cycloalkyl, or an aryl which may be substituted by an alkyl or a cycloalkyl, and R in the above N—R and/or above $C(—R)_2$ may be bonded to $A^{11}$ ring, $A^{21}$ ring, $A^{31}$ ring, $B^{11}$ ring, $B^{21}$ ring, $C^{11}$ ring, and/or $C^{31}$ ring by O, S, $—C(—R)_2—$, $—Si(—R)_2—$ or a single bond, and R in the above $—C(—R)_2—$ and $—Si(—R)_2—$ is hydrogen, an alkyl or a cycloalkyl.

3. The polycyclic aromatic compound according to claim 1, which is represented by Formula (2):

(2)

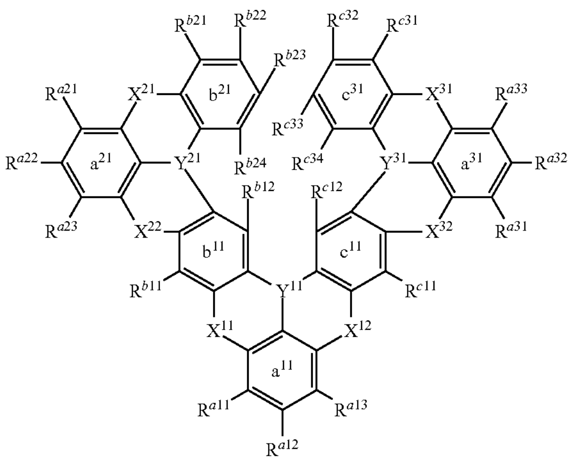

wherein:

$R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl, a heteroaryl, a diarylamino (the two aryls may be bonded to each other by a single bond or a linking group), a diheteroarylamino, an arylheteroarylamino, a diarylboryl, an alkyl, a cycloalkyl, an alkoxy, an aryloxy, or a substituted silyl, wherein at least one hydrogen in these may be replaced with an aryl, a heteroaryl, an alkyl, or a cycloalkyl, and any adjacent groups of $R^{a11}$, $R^{a12}$, $R^{a13}$ may be bonded to form an aryl or heteroaryl ring with $a^{11}$ ring, any adjacent groups of $R^{a21}$, $R^{a22}$, $R^{a23}$ may be bonded to form an aryl or heteroaryl ring with $a^{21}$ ring, any adjacent groups of $R^{a31}$, $R^{a32}$, $R^{a33}$ may be bonded to form an aryl or heteroaryl ring with $a^{31}$ ring, any adjacent groups of $R^{b21}$, $R^{b22}$, $R^{b23}$, $R^{b24}$ may be bonded to form an aryl or heteroaryl ring with $b^{21}$ ring, and/or any adjacent groups of $R^{c31}$, $R^{c32}$, $R^{c33}$, $R^{c34}$ may be bonded to form an aryl or heteroaryl ring with $c^{31}$ ring, in any of the aryl rings or heteroaryl rings formed, at least one hydrogen may be replaced with an aryl, a heteroaryl, a diarylamino (the two aryls may be bonded to each other by a single bond or a linking group), a diheteroarylamino, an arylheteroarylamino, a diarylboryl, an alkyl, a cycloalkyl, an alkoxy, an aryloxy or a substituted silyl, and at least one hydrogen in these may be replaced with an aryl, a heteroaryl, an alkyl or a cycloalkyl;

$Y^{11}$, $Y^{21}$, $Y^{31}$ are each independently B, P, P═O, P═S, Al, Ga, As, Si—R, or Ge—R, wherein R in the above Si—R and Ge—R is an aryl having 6 to 12 carbons, an alkyl having 1 to 6 carbons, or a cycloalkyl having 3 to 14 carbons;

$X^{11}$, $X^{12}$, $X^{21}$, $X^{22}$, $X^{31}$, $X^{32}$ are each independently O, N—R, $C(—R)_2$, S or Se, wherein R in the above N—R is an aryl having 6 to 12 carbons, a heteroaryl having 2 to 15 carbons, an alkyl having 1 to 6 carbons, or a cycloalkyl having 3 to 14 carbons; and the above aryl or heteroaryl may have an alkyl having 1 to 6 carbons or a cycloalkyl having 3 to 14 carbons as a substituent, R in the above $C(—R)_2$ is hydrogen, an aryl having 6 to 12 carbons, an alkyl having 1 to 6 carbons, or a cycloalkyl having 3 to 14 carbons; and the above aryl may have an alkyl having 1 to 6 carbons or a cycloalkyl having 3 to 14 carbons as a substituent, R in the above N—R and/or $C(—R)_2$ may be bonded to $a^{11}$ ring, $a^{21}$ ring, $a^{31}$ ring, $b^{11}$ ring, $b^{21}$ ring, $c^{11}$ ring, and/or $c^{31}$ ring by —O—, —S—, $—C(—R)_2—$, $—Si(—R)_2—$, or a single bond, and the R in the above $—C(—R)_2—$ and $—Si(—R)_2—$ is hydrogen, an alkyl having 1 to 6 carbons, or a cycloalkyl having 3 to 14 carbons; and at least one hydrogen in the compound represented by Formula (2) may be replaced with deuterium, cyano, or a halogen.

4. The polycyclic aromatic compound according to claim 3, wherein:

$R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl having 6 to 30 carbons, a heteroaryl having 2 to 30 carbons, a diarylamino (provided that the aryl is an aryl having 6 to 12 carbons), an alkyl having 1 to 24 carbons or a cycloalkyl having 3 to 24 carbons, wherein the aryl or the heteroaryl may have an alkyl having 1 to 6 carbons or a cycloalkyl having 3 to 14 carbons as a substituent, wherein at least one hydrogen in these may be replaced with an aryl, a heteroaryl, an alkyl, or a cycloalkyl, and any adjacent groups of $R^{a11}$, $R^{a12}$, $R^{a13}$ may be bonded to form an aryl having 9 to 16 carbons or a heteroaryl ring having 6 to 15 carbons with $a^{11}$ ring, any adjacent groups of $R^{a21}$, $R^{a22}$, $R^{a23}$ may be bonded to form an aryl having 9 to 16 carbons or a heteroaryl ring having 6 to 15 carbons with $a^{21}$ ring, any adjacent groups of $R^{a31}$, $R^{a32}$, $R^{a33}$ may be bonded to form an aryl having 9 to 16 carbons or a heteroaryl ring having 6 to 15 carbons with $a^{31}$ ring, any adjacent groups of $R^{b21}$, $R^{b22}$, $R^{b23}$, $R^{b24}$ may be bonded to form an aryl having 9 to 16 carbons or a heteroaryl ring having 6 to 15 carbons with $b^{21}$ ring, and/or any adjacent groups of $R^{c31}$, $R^{c32}$, $R^{c33}$, may be bonded to form an aryl having 9 to 16 carbons or a heteroaryl ring having 6 to 15 carbons with $c^{31}$ ring, in any of the aryl rings or heteroaryl rings formed, at least one hydrogen may be replaced with an aryl having 6 to 30 carbons, a heteroaryl having 2 to 30 carbons, a diarylamino (provided that the aryl is an aryl having 6 to 12 carbons), an alkyl having 1 to 24 carbons or a cycloalkyl having 3 to 24 carbons, and the above aryl or heteroaryl may have an alkyl having 1 to 6 carbons or a cycloalkyl having 3 to 14 carbons as a substituent;

$Y^{11}$, $Y^{21}$, $Y^{31}$ are each independently B, P, P═O, P═S, or Si—R, and R in the above Si—R is an aryl having 6 to 10 carbons, an alkyl having 1 to 4 carbons, or a cycloalkyl having 5 to 10 carbons; and $X^{11}$, $X^{12}$, $X^{21}$, $X^{22}$, $X^{31}$, $X^{32}$ are each independently O, N—R, $C(—R)_2$, or S, wherein R in the above N—R is an aryl having 6 to 10 carbons, an alkyl having 1 to 4 carbons, or a cycloalkyl having 5 to 10 carbons, and the above aryl may have an alkyl having 1 to 4 carbons or a cycloalkyl having 5 to 10 carbons as a substituent, R in the above $C(—R)_2$ is hydrogen, an aryl having 6 to 10 carbons, an alkyl having 1 to 4 carbons, or a cycloalkyl having 5 to 10 carbons and the above aryl may have an alkyl having 1 to 4 carbons or a cycloalkyl having 5 to 10 carbons as a substituent.

5. The polycyclic aromatic compound according to claim 3, wherein:

$R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c11}$, $R^{c12}$, $R^{c31}$, $R^{c32}$, $R^{c33}$, $R^{c34}$ are each independently hydrogen, an aryl having 6 to 16 carbons, a heteroaryl having 2 to 20 carbons, a diarylamino (provided that the aryl is an aryl having 6 to 10 carbons), an alkyl having 1 to 12 carbons or a cycloalkyl having 3 to 16 carbons, wherein the aryl or the heteroaryl may have an alkyl having 1 to 6 carbons or a cycloalkyl having 3 to 14 carbons as a substituent;

$Y^{11}$, $Y^{21}$, $Y^{31}$ are each independently B, P, P═O, or P═S; and $X^{11}$, $X^{12}$, $X^{21}$, $X^{22}$, $X^{31}$, $X^{32}$ are each independently O, N—R, or $C(—R)^2$, wherein R in the above N—R is an aryl having 6 to 10 carbons, an alkyl having 1 to 4 carbons, or a cycloalkyl having 5 to 10 carbons, and the above aryl may have an alkyl having 1 to 4 carbons or a cycloalkyl having 5 to 10 carbons as a substituent, R in the above $C(—R)_2$ is hydrogen, an aryl having 6 to 10 carbons, an alkyl having 1 to 4 carbons, or a cycloalkyl having 5 to 10 carbons and the above aryl may have an alkyl having 1 to 4 carbons or a cycloalkyl having 5 to 10 carbons as a substituent.

6. The polycyclic aromatic compound according to claim 3, wherein:

$R^{a11}$, $R^{a12}$, $R^{a13}$, $R^{a21}$, $R^{a22}$, $R^{a23}$, $R^{a31}$, $R^{a32}$, $R^{a33}$, $R^{b11}$, $R^{b12}$, $R^{b21}$, $R^{b22}$, $R^{b23}$, $R^{b24}$, $R^{c12}$, $R^{c31}$, $R^{c32}$, $R^{c33}$, $R^{c34}$ are each independently hydrogen, an aryl having 6 to 16 carbons, a heteroaryl having 2 to 20 carbons, a diarylamino (provided that the aryl is an aryl having 6 to 10 carbons), an alkyl having 1 to 12 carbons or a cycloalkyl having 3 to 16 carbons, wherein the aryl or the heteroaryl may have an alkyl having 1 to 4 carbons or a cycloalkyl having 5 to 10 carbons as a substituent;

$Y^{11}$, $Y^{21}$, $Y^{31}$ are each B; and $X^{11}$, $X^{12}$, $X^{21}$, $X^{22}$, $X^{31}$, $X^{32}$ are each independently O or N—R, wherein R in the above N—R is an aryl having 6 to 10 carbons, an alkyl having 1 to 4 carbons, or a cycloalkyl having 5 to 10 carbons, and the above aryl may have an alkyl having 1 to 4 carbons or a cycloalkyl having 5 to 10 carbons as a substituent.

7. The polycyclic aromatic compound according to claim 1, which is represented by Formula (1-1-1), Formula (1-1-5), Formula (1-1-10), Formula (1-1-61), or Formula (1-1-105):

(1-1-1)

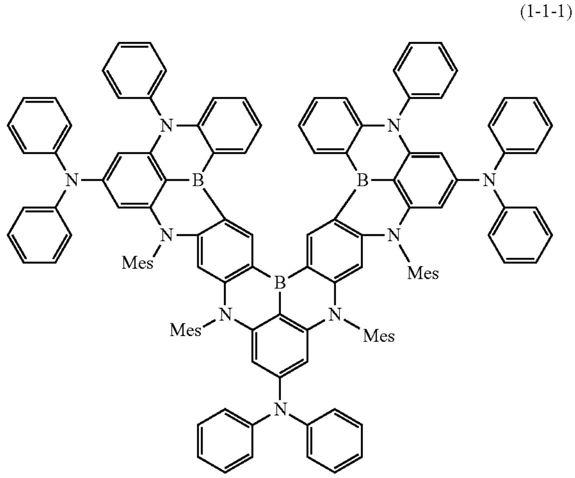

(1-1-5)

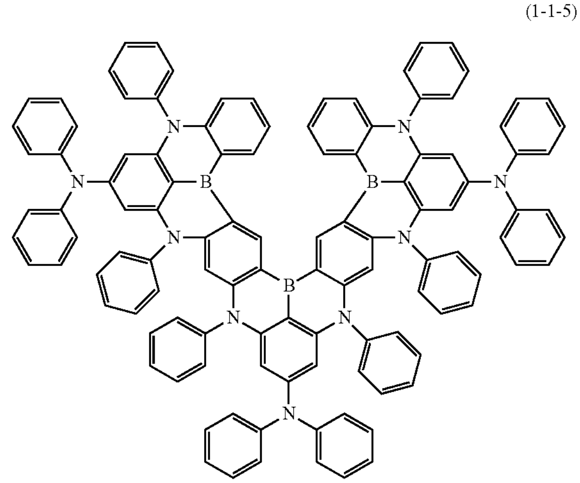

(1-1-10)

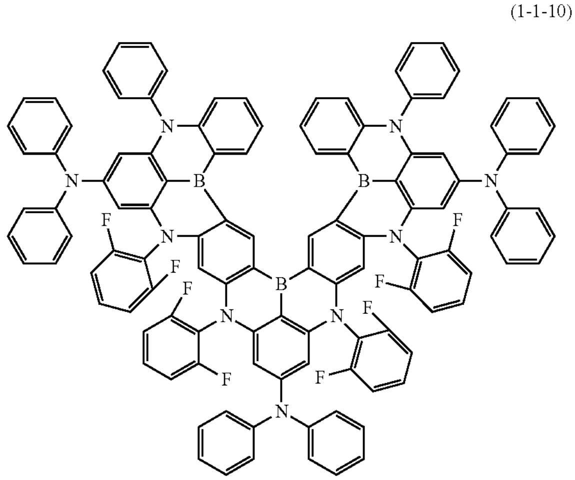

(1-1-61)

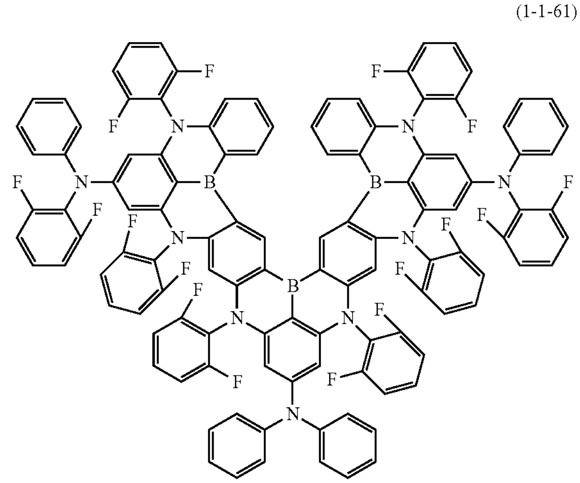

-continued (1-1-105)

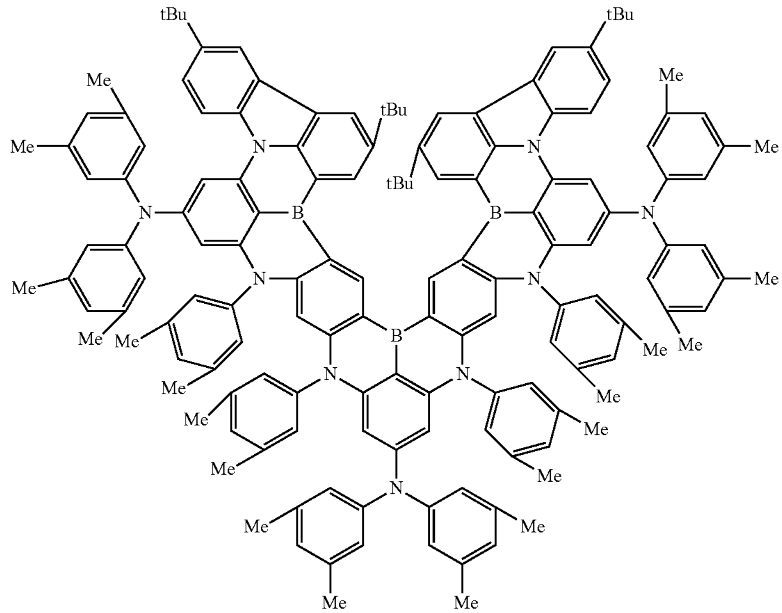

wherein, Me represents methyl, tBu represents t-butyl, Mes represents mesityl.

8. A material for an organic device, comprising at least one polycyclic aromatic compound according to claim 1.

9. The material for an organic device according to claim 8, which is a material for an organic electroluminescent element, a material for an organic field effect transistor, or a material for an organic thin film solar cell.

10. An organic electroluminescent element comprising a pair of electrodes composed of an anode and a cathode, and a light-emitting layer disposed between the pair of electrodes, wherein the light-emitting layer comprises at least one polycyclic aromatic compound according to claim 1.

11. The organic electroluminescent element according to claim 10, wherein the light-emitting layer comprises the polycyclic aromatic compound as a dopant, and further comprises at least one host material.

12. The organic electroluminescent element according to claim 11, wherein the host material is one or more compounds selected from the group consisting of an anthracene derivative, a boron derivative, a dibenzofuran derivative, a carbazole derivative, a triazine derivative, and a fluorene or triarylamine-based polymeric compound.

13. The organic electroluminescent element according to claim 11, wherein the host material is a compound represented by Formula (SPH-1):

(SPH-1)

$$EC-(MU)_k-EC$$

wherein:

each MU is independently a divalent group obtained by removing any two hydrogens from an aromatic compound, each EC is independently a monovalent group obtained by removing any one hydrogen from an aromatic compound, and k is an integer of 2 to 50000.

14. The organic electroluminescent element according to claim 10, wherein the light-emitting layer comprises at least one assisting dopant, the assisting dopant is a thermally assisting delayed fluorescent material that has an electron-donating substituent and an electron-accepting substituent, and the assisting dopant has an energy difference (ΔE(ST)) between the singlet energy ($S^1$) and the triplet energy ($T^1$) o 0.2 eV or less.

15. The organic electroluminescent element according to claim 10, comprising an organic layer which comprises a crosslinked product of a polymer compound containing a structural unit having a crosslinking group represented by any of the following structures:

(PG-1)

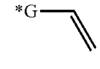

(PG-2)

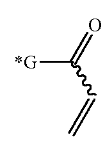

(PG-3)

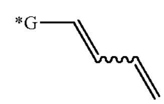

(PG-4)

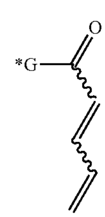

(PG-5)

-continued (PG-6)

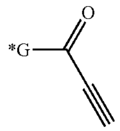

(PG-7)

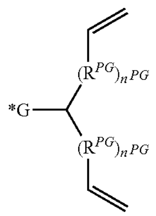

(PG-8)

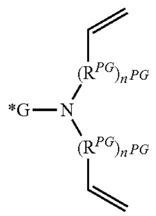

(PG-9)

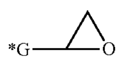

(PG-10)

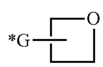

(PG-11)

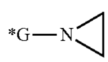

(PG-12)

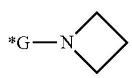

(PG-13)

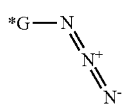

(PG-14)

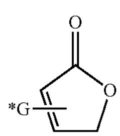

(PG-15)

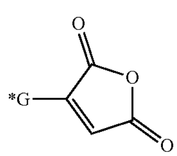

(PG-16)

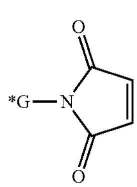

(PG-17)

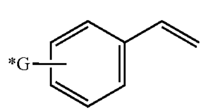

-continued (PG-18)

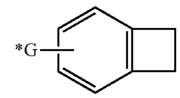

wherein:

$R^{PG}$ represents methylene, an oxygen atom, or a sulfur atom, $n^{PG}$ represents an integer of 0 to 5, when a plurality of $R^{PG}$s are present, those may be identical to or different from one another, and when a plurality of $n^{PG}$s are present, those may be identical to or different from one another; and

*G represents a bonding position, and a crosslinking group represented by each formula may have one or more substituents.

16. The organic electroluminescent element according to claim 10, comprising an electron transport layer and/or electron injection layer disposed between the cathode and the light-emitting layer, wherein at least one electron transport layer and/or electron injection layer comprises at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, an aryl nitrile derivative, a triazine derivative, a benzimidazole derivative, a phenanthroline derivative, a quinolinol metal complex, a thiazole derivative, a benzothiazole derivative, a silole derivative and an azoline derivative.

17. The organic electroluminescent element according to claim 16, wherein the electron transport layer and/or the electron injection layer further comprises at least one selected from the group consisting of an alkali metal, an alkaline earth metal, a rare earth metal, an oxide of alkali metal, a halide of alkali metal, an oxide of alkaline earth metal, a halide of alkaline earth metal, an oxide of rare earth metal, a halide of rare earth metal, an organic complex of alkali metal, an organic complex of alkaline earth metal and an organic complex of rare earth metal.

18. A display device equipped with the organic electroluminescent element according to claim 10.

19. A light-emitting layer forming composition for forming a light-emitting layer in an organic electroluminescent element, which comprises at least one the polycyclic aromatic compound according to claim 1 as a dopant material, at least one host material, and an organic solvent.

20. The light-emitting layer forming composition according to claim 19, wherein the host material is one or more compounds selected from the group consisting of an anthracene derivative, a boron derivative, a dibenzofuran derivative, a carbazole derivative, a triazine derivative, and a fluorene or triarylamine-based polymeric compound.

21. The light-emitting layer forming composition according to claim 19, wherein the host material is a compound represented by Formula (SPH-1):

$$EC - (MU)_k - EC \quad \text{(SPH-1)}$$

wherein:

each MU is independently a divalent group obtained by removing any two hydrogens from an aromatic compound, each EC is independently a monovalent group obtained by removing any one hydrogen from an aromatic compound, and k is an integer of 2 to 50000.

22. The light-emitting layer forming composition according to claim 19, comprising at least one assisting dopant, wherein the assisting dopant is a thermally assisting delayed fluorescent material that has an electron-donating substituent and an electron-accepting substituent, and the assisting dopant has an energy difference (ΔE(ST)) between the singlet energy ($S^1$) and the triplet energy ($T^1$) of 0.2 eV or less.

23. A wavelength conversion material, comprising at least one polycyclic aromatic compound according to claim 1.

* * * * *